US011522103B1

(12) United States Patent
Atanackovic

(10) Patent No.: US 11,522,103 B1
(45) Date of Patent: Dec. 6, 2022

(54) EPITAXIAL OXIDE MATERIALS, STRUCTURES, AND DEVICES

(71) Applicant: Silanna UV Technologies Pte Ltd, Singapore (SG)

(72) Inventor: Petar Atanackovic, Henley Beach South (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 0 days.

(21) Appl. No.: 17/652,028

(22) Filed: Feb. 22, 2022

Related U.S. Application Data

(63) Continuation of application No. PCT/IB2021/060466, filed on Nov. 11, 2021, which
(Continued)

(51) Int. Cl.
*H01L 33/06* (2010.01)
*H01L 27/15* (2006.01)
(Continued)

(52) U.S. Cl.
CPC .............. *H01L 33/16* (2013.01); *H01L 27/15* (2013.01); *H01L 33/007* (2013.01); *H01L 33/06* (2013.01); *H01L 33/18* (2013.01); *H01L 33/26* (2013.01)

(58) Field of Classification Search
CPC ......... H01L 33/16; H01L 33/18; H01L 33/26; H01L 33/06; H01L 27/15
See application file for complete search history.

(56) References Cited

U.S. PATENT DOCUMENTS

| | | | |
|---|---|---|---|
| 5,450,812 A | 9/1995 | McKee et al. | |
| 5,625,202 A | 4/1997 | Chai | |

(Continued)

FOREIGN PATENT DOCUMENTS

| | | | |
|---|---|---|---|
| EP | 1081256 B1 | 8/2011 | |
| KR | 1020060024421 A | 3/2006 | |

(Continued)

OTHER PUBLICATIONS

Anhar Uddin Bhuiyan et al., MOCVD epitaxy of β-(AlxGa1—x)2O3 thin films on (010) Ga2O3 substrates and N-type doping, Appl. Phys. Lett. 115, Sep. 2019, pp. 120602-1-120602-5.

(Continued)

*Primary Examiner* — Savitri Mulpuri
(74) *Attorney, Agent, or Firm* — MLO, a professional corp.

(57) ABSTRACT

The present disclosure provides techniques for epitaxial oxide materials, structures and devices. In some embodiments, a semiconductor structure includes an epitaxial oxide heterostructure, comprising: a substrate; a first epitaxial oxide layer comprising $(Ni_{x1}Mg_{y1}Zn_{1-x1-y1})_2GeO_4$ wherein $0 \leq x1 \leq 1$ and $0 \leq y1 \leq 1$; and a second epitaxial oxide layer comprising $(Ni_{x2}Mg_{y2}Zn_{1-x2-y2})_2GeO_4$ wherein $0 \leq x2 \leq 1$ and $0 \leq y2 \leq 1$. In some cases, either: $x1 \neq x2$ and $y1 = y2$; $x1 = x2$ and $y1 \neq y2$; or $x1 \neq x2$ and $y1 \neq y2$. In some embodiments, a semiconductor structure includes an epitaxial oxide heterostructure, comprising: a substrate; a first epitaxial oxide layer comprising $(Mg_{x1}Zn_{1-x1})(Al_{y1}Ga_{1-y1})_2O_4$ wherein $0 \leq x1 \leq 1$ and $0 \leq y1 \leq 1$; and a second epitaxial oxide layer comprising $(Ni_{x2}Mg_{y2}Zn_{1-x2-y2})_2GeO_4$ wherein $0 \leq x2 \leq 1$ and $0 \leq y2 \leq 1$.

40 Claims, 360 Drawing Sheets

Related U.S. Application Data is a continuation-in-part of application No. PCT/IB2021/060414, filed on Nov. 10, 2021, and a continuation of application No. PCT/IB2021/060427, filed on Nov. 10, 2021, and a continuation-in-part of application No. PCT/IB2021/060413, filed on Nov. 10, 2021.

(51) Int. Cl.

| | |
|---|---|
| ***H01L 33/16*** | (2010.01) |
| ***H01L 33/00*** | (2010.01) |
| ***H01L 33/26*** | (2010.01) |
| ***H01L 33/18*** | (2010.01) |

(56) References Cited

U.S. PATENT DOCUMENTS

| | | | |
|---|---|---|---|
| 5,879,811 A | 3/1999 | Tanaka et al. | |
| 6,914,268 B2 | 7/2005 | Shei et al. | |
| 6,977,397 B2 | 12/2005 | Ichinose et al. | |
| 7,359,415 B1 * | 4/2008 | Alfano | H01S 3/0627 372/39 |
| 7,393,411 B2 | 7/2008 | Ichinose et al. | |
| 7,727,865 B2 | 6/2010 | Ichinose et al. | |
| 7,824,955 B2 | 11/2010 | White et al. | |
| 9,105,473 B2 * | 8/2015 | Ueda | H01L 21/02576 |
| 9,246,311 B1 | 1/2016 | Raring et al. | |
| 9,412,911 B2 | 8/2016 | Atanackovic | |
| 9,548,678 B2 * | 1/2017 | Schuh | C04B 35/46 |
| 9,691,938 B2 | 6/2017 | Atanackovic et al. | |
| 10,475,956 B2 | 11/2019 | Atanackovic | |
| 10,636,916 B2 | 4/2020 | Shih et al. | |
| 11,175,447 B1 | 11/2021 | Pynn et al. | |
| 2001/0011743 A1 | 8/2001 | Arita et al. | |
| 2002/0025594 A1 | 2/2002 | Iwata et al. | |
| 2004/0079285 A1 | 4/2004 | Li et al. | |
| 2005/0122005 A1 | 6/2005 | Higuchi et al. | |
| 2005/0223983 A1 | 10/2005 | Selvamanickam et al. | |
| 2006/0150891 A1 * | 7/2006 | Ichinose | H01L 33/26 117/2 |
| 2006/0220029 A1 | 10/2006 | Ishikazi | |
| 2007/0166967 A1 | 7/2007 | Ichinose et al. | |
| 2008/0008964 A1 | 1/2008 | Chan et al. | |
| 2008/0083905 A1 | 4/2008 | Alfano et al. | |
| 2008/0233671 A1 | 9/2008 | Chou et al. | |
| 2009/0137099 A1 | 5/2009 | Schonherr et al. | |
| 2010/0140642 A1 | 6/2010 | Arai et al. | |
| 2011/0062440 A1 | 3/2011 | Adekore et al. | |
| 2012/0045661 A1 | 2/2012 | Kumaran et al. | |
| 2012/0091548 A1 | 4/2012 | Sukegawa et al. | |
| 2012/0112158 A1 | 5/2012 | Chyan et al. | |
| 2012/0306834 A1 | 12/2012 | Ueda et al. | |
| 2013/0233240 A1 | 9/2013 | Cody et al. | |
| 2013/0240874 A1 | 9/2013 | Maekawa et al. | |
| 2014/0061486 A1 | 3/2014 | Bao et al. | |
| 2014/0331919 A1 | 11/2014 | Sasaki | |
| 2015/0001467 A1 | 1/2015 | Cho et al. | |
| 2015/0171222 A1 | 6/2015 | Sasagawa et al. | |
| 2015/0179445 A1 | 6/2015 | Sasaki et al. | |
| 2016/0149074 A1 | 5/2016 | Atanackovic et al. | |
| 2016/0149075 A1 * | 5/2016 | Atanackovic | H01L 33/105 257/13 |
| 2017/0288024 A1 | 10/2017 | Reznicek | |
| 2018/0315886 A1 | 11/2018 | Gaevski et al. | |
| 2019/0028081 A1 | 1/2019 | Pelzel et al. | |
| 2020/0075799 A1 | 3/2020 | Atanackovic et al. | |
| 2020/0168454 A1 | 5/2020 | Dargis et al. | |
| 2020/0194560 A1 | 6/2020 | Takizawa et al. | |
| 2020/0411648 A1 | 12/2020 | Yamazaki | |
| 2021/0126091 A1 | 4/2021 | Chang et al. | |
| 2021/0351321 A1 | 11/2021 | Atanackovic | |
| 2021/0388526 A1 | 12/2021 | Zhao et al. | |
| 2022/0115544 A1 | 4/2022 | Miyake | |

FOREIGN PATENT DOCUMENTS

| | | |
|---|---|---|
| WO | 2004074556 A2 | 9/2004 |
| WO | 2009152207 A2 | 12/2009 |
| WO | 2016052929 A1 | 4/2016 |
| WO | 2019155444 A1 | 8/2019 |

OTHER PUBLICATIONS

Anhar Uddin Bhuiyan et al., Phase transformation in MOCVD growth of (AlxGa1—x)2O3 thin films, APL Mater. 8, 031104 (2020)—Published Online: Mar. 2, 2020.

Bosi et al., Ga2O3 polymorphs: tailoring the epitaxial growth conditions, J. Mater. Chem. C, 2020, 8, 10975, Jul. 2020.

Cheng et al., Phase formation and strain relaxation of Ga2O3 on c-plane and a-plane sapphire substrates as studied by synchrotron-based x-ray diffraction, Applied Physics Letters 111, 162104, Oct. 2017.

Dang et al., α-(AlxGa1—x)2O3 single-layer and heterostructure buffers for the growth of conductive Sn-doped α-Ga2O3 thin films via mist chemical vapor deposition, APL Mater. 8, 101101 (2020)—Published Online: Oct. 1, 2020.

Hilfiker et al., Dielectric function tensor (1.5 eV to 9.0 eV), anisotropy, and band to band transitions of monoclinic β-(Al x Ga 1—x) 2 O 3 ( x≤0.21) films, Applied Physics Letters 114(23):231901, Jun. 2019.

International Search Report and Written Opinion dated Aug. 6, 2021 for PCT Patent Application No. PCT/IB2021/053652.

Jiao et al., The Structural and Photoelectrical Properties of Gallium Oxide Thin Film Grown by Radio Frequency Magnetron Sputtering, ECS Journal of Solid State Science and Technology, 8 (7) Q3086-Q3090 (Year: 2019).

Kato et al., Fabrication of coherent γ-Al2O3/Ga2O3 superlattices on MgAl2O4 substrates, Appl. Phys. Express 12 065503, May 2019.

Kaun et al., β-(AlxGa1—x)2O3/Ga2O3 (010) heterostructures grown on β-Ga2O3 (010) substrates by plasma-assisted molecular beam epitaxy, Journal of Vacuum Science & Technology A Vacuum Surfaces and Films 33(4):041508 Jul. 2015.

Kneiss et al., Growth, structural and optical properties of coherent κ-(AlxGa1—x )2O3/κ-Ga2O3 quantum well superlattice heterostructures, APL Mater. 8, 051112 (2020).—Published Online: May 19, 2020.

Krueger et al., Variation of Band Gap and Lattice Parameters of B-(AlxGa1—x)2O3 Powder Produced by Solution, J. Am. Ceram. Soc., 99 [7], pp. 2467-2473. (Year: 2016).

Lin and Lee, Ga2O3-based solar-blind deep ultraviolet light-emitting diodes, Journal of Luminescence vol. 224, 2020 117326, Apr. 2020, 4 pages.

Masataka Higashiwaki, Shizuo Fujita, Gallium Oxide: Materials Properties, Crystal Growth, and Devices, Springer International Publishing, Apr. 25, 2021—Technology & Engineering—764 pages, Section 8.4.1 B-(AlxGa1—x)2O3/B-Ga2O3 Heterostructures ( Year: 2021).

Office Action dated Aug. 27, 2021 for U.S. Appl. No. 16/990,349.

Office Action dated Feb. 18, 2022 for U.S. Appl. No. 16/990,349.

Office Action dated Oct. 20, 2020 for U.S. Appl. No. 16/990,349.

Oshima et al., Epitaxial growth of γ-(AlxGa1—x)O3 alloy films for band-gap engineering, Appl. Phys. Express 10 051104, Apr. 2017.

Oshima et al., α-Al2O3/Ga2O3 superlattices coherently grown on r-plane sapphire, Applied Physics Express, 11, 065501, Apr. 2018.

Oshima, Coherent gamma-Al2O3/Ga2O3 superlattices grown on MgAl2O4, (Conference Presentation), Proceedings vol. 10919, Oxide-based Materials and Devices X; 109190G (2019), Event: SPIE OPTO, Mar. 2019, San Francisco, California, United States. Abstract Only.

Pearton et al., A review of Ga2O3 materials, and devices, Applied Physics Reviews, 5, 011301 (Year: 2018).

Peelaers and Van De Walle, Brillouin zone and band structure of β-Ga2O3, Phys. Status Solidi B 252, No. 4, 828-832, Jan. 2015.

Swallow et al., Indium Gallium Oxide Alloys: Electronic Structure, Optical Gap, Surface Space Charge, and Chemical Trends within

(56) References Cited

OTHER PUBLICATIONS

Common-Cation Semiconductors, ACS Appl. Mater. Interfaces 2021, 13, 2807-2819 (Year: 2021).
Wang et al., Band gap and band offset of Ga2O3 and (AlxGa1—x)2O3 alloys, arXiv: 1806.03360v2 [cond-mat.mtrl-sci] Jul. 31, 2018 ( Year: 2018).
Wang et al., Band gap and band offset of Ga2O3 and (AlxGa1—x)2O3 alloys, Physical Review Applied 10, 011003-1 (Year: 2018).
Zhang et al., Recent progress on the electronic structure, defect, and doping properties of Ga2O3, APL Mater. 8, 020906 (2020)—Published Online: Feb. 21, 2020.
Office Action dated Jul. 22, 2022 for U.S. Appl. No. 17/653,828.
Office Action dated Jul. 25, 2022 for U.S. Appl. No. 17/658,506.
Office Action dated Jul. 26, 2022 for U.S. Appl. No. 17/651,713.
Bhuiyan et al., "MOCVD epitaxy of b-(AlxGa 1—x)2O3 thin films on (010) Ga2O3 substrates and N-type doping," Applied Physics Letters 115 (2019) 120602.
Bhuiyan et al., "MOCVD Epitaxy of Ultrawide Bandgap f3 (AlxGa1—x)2O3 with High-Al Composition on (100) f3 Ga2O3 Substrates," Crystal Growth & Design 20 (2020) pp. 6722-6730.
Notice of Allowance and Fees dated Apr. 8, 2022 for U.S. Appl. No. 16/990,349.
Notice of Allowance and Fees dated Jun. 15, 2022 for U.S. Appl. No. 17/658,501.
Office Action dated Jun. 13, 2022 for U.S. Appl. No. 17/658,510.
Office Action dated Jun. 22, 2022 for U.S. Appl. No. 17/651,713.
Office Action dated Jun. 6, 2022 for U.S. Appl. No. 17/651,712.
Office Action dated Jun. 9, 2022 for U.S. Appl. No. 17/652,031.
Office Action dated Jun. 9, 2022 for U.S. Appl. No. 17/653,824.
Petricevic et. al. "Room-temperature near-infrared tunable laser operation of Cr4+:Ca2GeO4", Optics Letters vol. 21, Issue 21, pp. 1750-1752 (1996), Optica Publishing (Year: 1996).
Ranga et al., "MOVPE-grown Si-doped f3-(Al0.26Ga0.74)2O3 thin films and heterostructures," Template for Apex (2014).
Shuo-Huang Yuan et al 2018 Jpn. J. Appl. Phys. 57 070301 (Year: 2018).
Vaidya et al., "Enhancement Mode f3-(AlxGa1—x)2O3/Ga2O3 Heterostructure FET (HFET) With High Transconductance and Cutoff Frequency," IEEE Electron Device Letters 42 (2021) pp. 1444-1447.
International Search Report and Written Opinion dated Jul. 18, 2022 for PCT Patent Application No. PCT/IB2021/059945.
Office Action dated Sep. 2, 2022 for U.S. Appl. No. 17/653,832.
International Search Report and Written Opinion dated Aug. 9, 2022 for PCT Patent Application No. PCT/IB2021/060414.
Peng Lingling et al., 'Enhanced Photoluminescence and Thermal Properties of Size Mismatch inMg2TixGe1-xO4: Mn4+ Deep-Red Phosphors', Journal of Materials Chemistry C, Issue 8, Jan. 28, 2019, abstract; and p. 2. https://pubs.rsc.org/en/content/articlelanding/2019/tc/c8tc05743e).
St. Senz et al., 'The effect of stress on cubic-to-tetragonal phase transitions in Mg2TiO4 and Mg2GeO4spinel films', Philosophical Magazine A, 2001, vol. 81, No. 1, 109-124, Aug. 5, 2009, abstract; pp. 110-111; and figures 1(d)-1(e), 3.(https://www.tandfonline.com/doi/abs/10.1080/01418610108216621?cookieSet=1).

* cited by examiner

2800

| x | $Ga_2O_3$ | $Al_2O_3$ | MgO | NiO | ZnO | $Bi_2O_3$ | r-$GeO_2$ | $Ir_2O_3$ | $RE_2O_3$ | $Li_2O$ |
|---|---|---|---|---|---|---|---|---|---|---|
| Ga | $Ga_{2x}O_3$ | $(Ga_xAl_{1-x})_2O_3$ | $(Ga_{2x}Mg_{1-x})O_{2x+1}$ | $(Ga_{2x}Ni_{1-x})O_{2x+1}$ | $(Ga_{2x}Zn_{1-x})O_{2x+1}$ | $(Ga_xBi_{1-x})_2O_3$ | $(Ga_{2x}Ge_{1-x})O_{2+x}$ | $(Ga_xIr_{1-x})_2O_3$ | $(Ga_xRE_{1-x})O_3$ | $(Ga_{2x}Li_{2(1-x)})O_{2x+1}$ |
| Al | | $Al_{2x}O_3$ | $(Al_{2x}Mg_{1-x})O_{2x+1}$ | $(Al_{2x}Ni_{1-x})O_{2x+1}$ | $(Al_{2x}Zn_{1-x})O_{2x+1}$ | $(Al_xBi_{1-x})_2O_3$ | $(Al_{2x}Ge_{1-x})O_{2+x}$ | $(Al_xIr_{1-x})_2O_3$ | $(Al_xRE_{1-x})O_3$ | $(Al_{2x}Li_{2(1-x)})O_{2x+1}$ |
| Mg | | | $Mg_xO$ | $(Mg_xNi_{1-x})O_1$ | $(Mg_xZn_{1-x})O_1$ | $(Mg_{1-x}Bi_{2x})O_{2x+1}$ | $(Mg_xGe_{1-x})O_{2-x}$ | $(Mg_{1-x}Ir_{2x})O_{2x+1}$ | $(Mg_{1-x}RE_{2x})O_{2x+1}$ | $(Mg_xLi_{2(1-x)})O_1$ |
| Ni | | | | $Ni_xO$ | $(Ni_xZn_{1-x})O_1$ | $(Ni_{1-x}Bi_{2x})O_{2x+1}$ | $(Ni_xGe_{1-x})O_{2-x}$ | $(Ni_{1-x}Ir_{2x})O_{2x+1}$ | $(Ni_{1-x}RE_{2x})O_{2x+1}$ | $(Ni_xLi_{2(1-x)})O_1$ |
| Zn | | | | | $Zn_xO$ | $(Zn_{1-x}Bi_{2x})O_{2x+1}$ | $(Zn_xGe_{1-x})O_{2-x}$ | $(Zn_{1-x}Ir_{2x})O_{2x+1}$ | $(Zn_{1-x}RE_{2x})O_{2x+1}$ | $(Zn_xLi_{2(1-x)})O_1$ |
| Bi | | | | | | $Bi_{2x}O_3$ | $(Bi_{2x}Ge_{1-x})O_{2+x}$ | $(Bi_xIr_{1-x})O_3$ | $(Bi_xRE_{1-x})_2O_3$ | $(Bi_{2x}Li_{2(1-x)})O_{2x+1}$ |
| Ge | | | | | | | $Ge_xO_2$ | $(Ge_{1-x}Ir_{2x})O_{2+x}$ | $(Ge_{1-x}RE_{2x})O_{2+x}$ | $(Ge_xLi_{2(1-x)})O_{x+1}$ |
| Ir | | | | | | | | $Ir_{2x}O_3$ | $(Ir_xRE_{1-x})_2O_3$ | $(Ir_{2x}Li_{2(1-x)})O_{2x+1}$ |
| RE | | | | | | | | | $RE_{2x}O_3$ | $(RE_{2x}Li_{2(1-x)})O_{2x+1}$ |
| Li | | | | | | | | | | $Li_{2x}O_1$ |

*FIG. 28*

$Al_2O_3$ -trigonal (Corundum)

At

1075

$Ga_2O_3$ -trigonal (Corundum)

TABLE I

| Substrate Type | Crystal Symmetry Type | Hgh Resistivity | N-type | P-type | Transparent UVC | Epitaxial Crystal Surface |
|---|---|---|---|---|---|---|
| **Gallium-Oxide**<br>**$Ga_2O_3$** | Monoclinic | Insulating<br>Compensated | Si, Ge, Sn<br>RE<br>Ga-rich/O-vac | Mg, Zn, Ni<br>Bi, N, Li<br>O-rich/Ga-vac | $l_{min}$ > 250nm<br>$l_{min}$ > 250nm | (001), (-201), (110), (010) |
| **Gallium-Oxide**<br>**$Ga_2O_3$** | Trigonal, Hexagonal<br>Corundum | Insulating<br>Compensated | Si, Ge, Sn<br>RE<br>Ga-rich/O-vac | Mg, Zn, Ni<br>Bi, N, Li<br>O-rich/Ga-vac | $l_{min}$ > 250nm<br>$l_{min}$ > 250nm | R-plane, M-plane<br>A-plane, C-plane |
| **Aluminum-Gallium-Oxide**<br>**$(Ga_xAl_{1-x})_2O_3$** | Monoclinic: Al% < 50%<br>Corundum: Al > 50% | Insulating<br>Compensated | Si, Ge, Sn<br>RE | Mg, Zn, Ni<br>Bi, N, Li | $l_{min}$ > 200nm<br>$l_{min}$ > 200nm | (001), (-201), (110), (010)<br>A-, R-, M-, C-plane |
| **Aluminum-Oxide**<br>**$Al_2O_3$** | Trigonal, Hexagonal<br>Corundum | Insulating<br>Compensated | F | /<br>/ | $l_{min}$ > 172nm<br>$l_{min}$ > 172nm | R-plane, M-plane<br>A-plane, C-plane |

*FIG. 43A*

TABLE II

| Oxide | Crystal Symmetry | a (Å) | unit cells parameters b (Å) | c(Å) | α | β | γ |
|---|---|---|---|---|---|---|---|
| $Ga_2O_3$ | C2/m | 12.452 | 3.083 | 5.876 | 90 | 103.68 | 90 |
| $Ga_2O_3$ | R3c | 5.059 | 5.059 | 13.625 | 90 | 90 | 120 |
| $Al_2O_3$ | C2/m | 11.926 | 2.941 | 5.671 | 90 | 104.03 | 90 |
| $Al_2O_3$ | R3c | 4.805 | 4.805 | 13.116 | 90 | 90 | 120 |

*FIG. 43B*

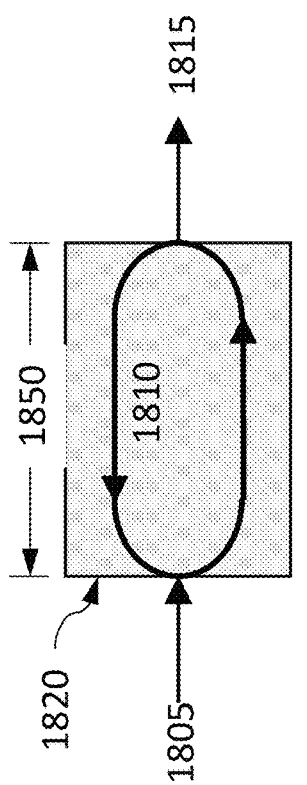
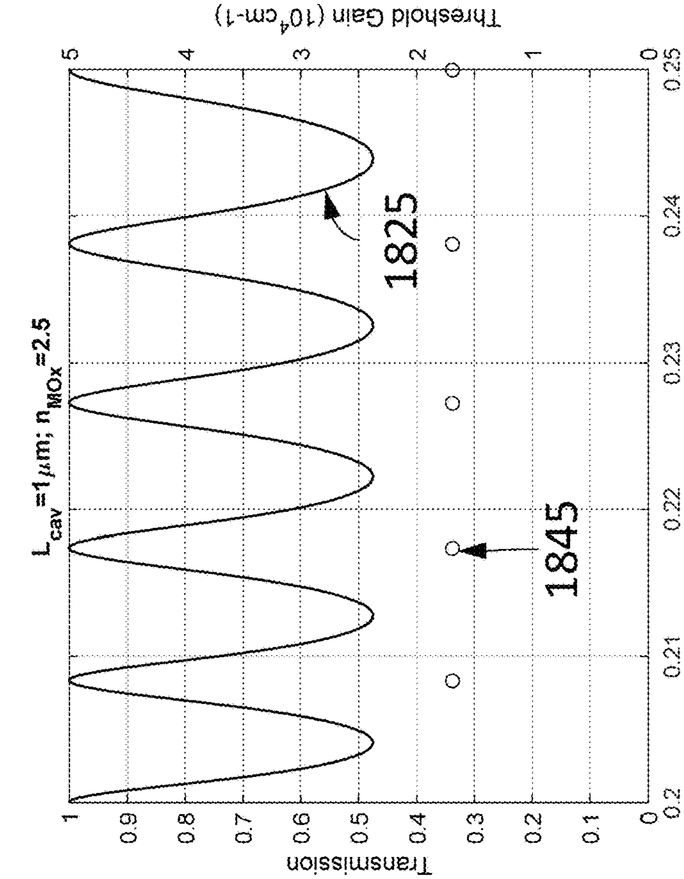
FIG. 58A
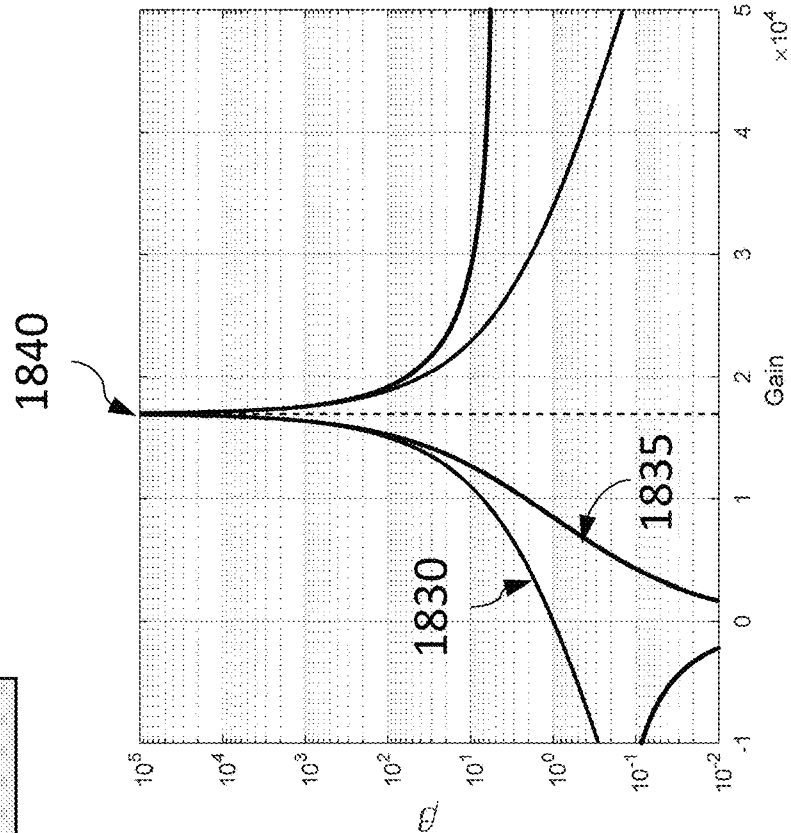
FIG. 58B

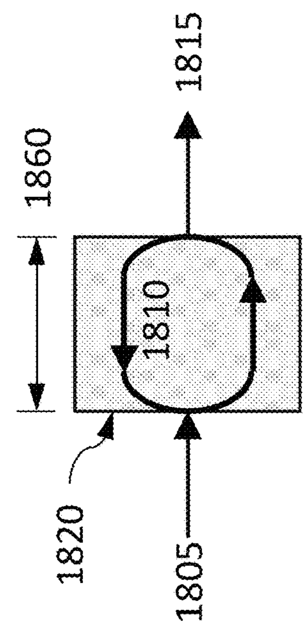
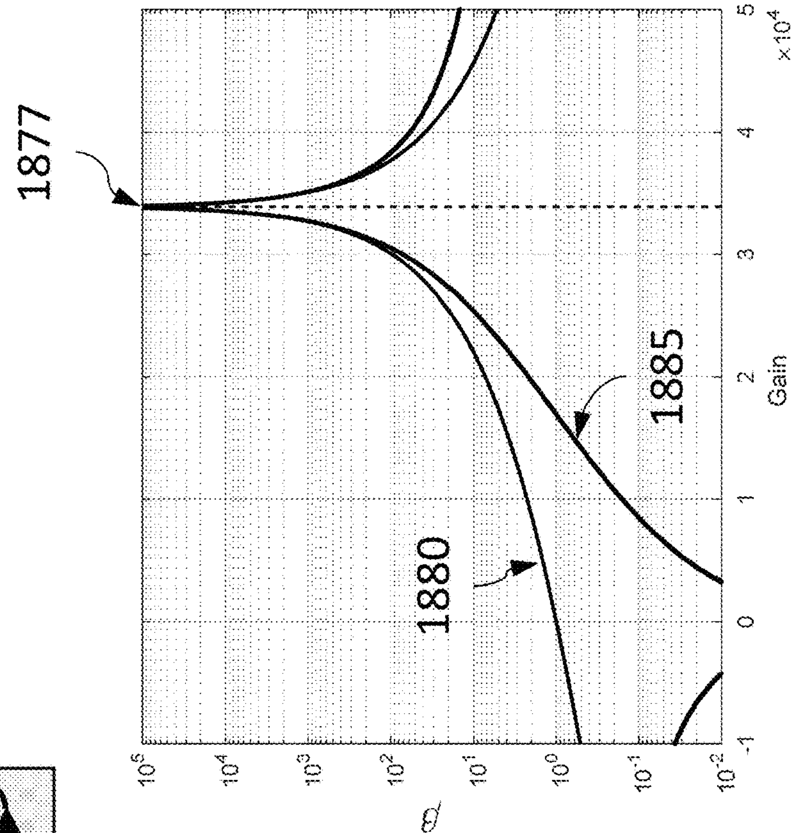
FIG. 59B
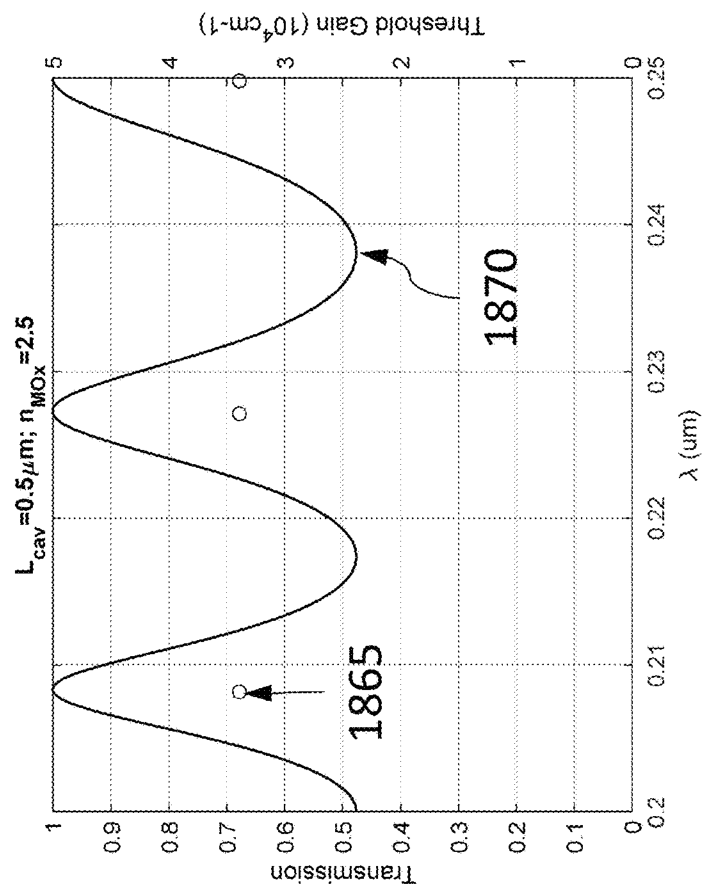
FIG. 59A

| Material | SG | a | b | c | Eg (eV) | λ_g |
|---|---|---|---|---|---|---|
| MgO | Fm3m | 4.2565 | 4.2565 | 4.2565 | 7.6865 | 161.30 |
| 2ax MgO | Fm3m | 8.5130 | 8.5130 | 8.5130 | 7.6865 | 161.30 |
| \sqrt{2a}x MgO | Fm3m | 6.0196 | 6.0196 | 6.0196 | 7.6865 | 161.30 |
| 2\sqrt2x MgO | Fm3m | 12.0392 | 12.0392 | 12.0392 | 7.6865 | 161.30 |
| NiO | Fm3m | 4.2166 | 4.2166 | 4.2166 | 1.9600 | 280.88 |
| \sqrt{2a}x NiO | Fm3m | 5.9632 | 5.9632 | 5.9632 | 1.9600 | 280.88 |
| 2ax NiO | Fm3m | 8.4332 | 8.4332 | 8.4332 | 1.9600 | 280.88 |
| 2\sqrt2x NiO | Fm3m | 11.9264 | 11.9264 | 11.9264 | 1.9600 | 280.88 |
| Mg_2GeO_4 | Fd3m | 8.3499 | 8.3499 | 8.3499 | 5.8052 | 213.57 |
| MgGa_2O_4 | Fd3m | 8.4568 | 8.4568 | 8.4568 | 6.1801 | 200.61 |
| Mg(Al_{0.5}Ga_{0.5})_2O_4 | Fd3m | 8.3137 | 8.3137 | 8.3137 | 7.3063 | 169.69 |
| MgAl_2O_4 | Fd3m | 8.1707 | 8.1707 | 8.1707 | 8.6054 | 144.07 |
| (Mg_{0.5}Zn_{0.5})Al_2O_4 | Fd3m | 8.1743 | 8.1743 | 8.1743 | 7.4621 | 166.15 |
| ZnGa_2O_4 | Fd3m | 8.4590 | 8.4590 | 8.4590 | 5.7651 | 215.05 |
| Zn(Al_{0.5}Ga_{0.5})_2O_4 | Fd3m | 8.3185 | 8.3185 | 8.3185 | 5.9800 | 207.32 |
| ZnAl_2O_4 | Fd3m | 8.1779 | 8.1779 | 8.1779 | 6.7745 | 183.01 |
| (Mg_{0.5}Zn_{0.5})Ga_2O_4 | Fd3m | 8.4579 | 8.4579 | 8.4579 | 5.9726 | 207.58 |
| \kappa-Ga_2O_3 | Pna21 | 5.0200 | 8.7000 | 9.2800 | 5.3595 | 231.33 |
| \kappa-(Al_{0.5}Ga_{0.5})_2O_3 | Pna21 | 4.9532 | 8.5484 | 9.1524 | 5.8799 | 210.85 |
| \kappa-Al_2O_3 | Pna21 | 4.8864 | 8.3968 | 9.0248 | 7.9897 | 155.17 |
| \alpha-Ga_2O_3 | R3c | 5.0595 | 5.0595 | 13.6248 | 5.1195 | 242.17 |
| \alpha-(Al_{0.25}Ga_{0.25})_2O_3 | R3c | 4.9959 | 4.9959 | 13.4977 | 5.8824 | 210.76 |
| \alpha-(Al_{0.5}Ga_{0.5})_2O_3 | R3c | 4.9323 | 4.9323 | 13.3705 | 6.7263 | 184.32 |
| \alpha-(Al_{0.75}Ga_{0.75})_2O_3 | R3c | 4.8687 | 4.8687 | 13.2434 | 7.7502 | 159.97 |
| \alpha-Al_2O_3 | R3c | 4.8050 | 4.8050 | 13.1163 | 8.9082 | 139.18 |
| \beta-Ga_2O_3 | C2m | 3.0830 | 5.8762 | 12.4524 | 4.9000 | 253.02 |
| \beta-(Al_{0.125}Ga_{0.875})_2O_3 | C2m | 3.0652 | 5.8504 | 12.3866 | 5.0880 | 243.67 |
| \beta-(Al_{0.25}Ga_{0.75})_2O_4 | C2m | 3.0475 | 5.8247 | 12.3208 | 5.3772 | 230.57 |
| \beta-(Al_{0.375}Ga_{0.625})_2O_3 | C2m | 3.0297 | 5.7990 | 12.2549 | 5.7082 | 217.20 |
| \beta-(Al_{0.5}Ga_{0.5})_2O_3 | C2m | 3.0120 | 5.7733 | 12.1891 | 6.0086 | 206.34 |
| \beta-Al_2O_3 | C2m | 2.9410 | 5.6705 | 11.9257 | 7.2400 | 171.24 |
| \gamma-Ga_2O_3 | Fd3m | 8.2376 | 8.2376 | 8.2376 | 4.8000 | 258.29 |
| \gamma-(Al_{0.5}Ga_{0.5})_2O_3 | Fd3m | 8.0743 | 8.0743 | 8.0743 | 5.8300 | 212.66 |
| \gamma-Al_2O_3 | Fd3m | 7.9110 | 7.9110 | 7.9110 | 6.8600 | 180.73 |
| Li_2O | Fm3m | 4.6588 | 4.6588 | 4.6588 | 7.4507 | 166.40 |
| LiGaO_2 | Pna21 | 5.0941 | 5.0941 | 6.4571 | 6.2705 | 197.72 |
| Li(Al_{0.25}Ga_{0.75})O_2 | Pna21 | 5.1281 | 5.1281 | 6.4245 | 6.5525 | 189.21 |
| Li(Al_{0.5}Ga_{0.5})O_2^{Pna21} | Pna21 | 5.1621 | 5.1621 | 6.3919 | 6.8626 | 180.66 |
| Li(Al_{0.5}Ga_{0.5})O_2^{P421} | P421212 | 5.1621 | 5.1621 | 6.3919 | 7.9425 | 156.10 |
| Li(Al_{0.75}Ga_{0.25})O_2 | P421212 | 5.1961 | 5.1961 | 6.3593 | 8.0277 | 154.44 |
| LiAlO_2 | P421212 | 5.2301 | 5.2301 | 6.3267 | 8.5273 | 145.39 |
| LiF | Fm3m | 4.0834 | 4.0834 | 4.0834 | 13.2616 | 93.49 |
| 2ax LiF | Fm3m | 8.1669 | 8.1669 | 8.1669 | 13.2616 | 93.49 |
| \sqrt2x LiF | Fm3m | 5.7748 | 5.7748 | 5.7748 | 13.2616 | 93.49 |
| 2\sqrt2x LiF | Fm3m | 11.5497 | 11.5497 | 11.5497 | 13.2616 | 93.49 |

*FIG. 76A-1*

| Material | SG | a | b | c | Eg (eV) | λ_g |
|---|---|---|---|---|---|---|
| Zn_2GeO_4 | R3 | 9.6625 | 14.4727 | 14.4727 | 5.5550 | 223.19 |
| ZnGeO_3 | R3 | 5.0937 | 5.0937 | 13.2629 | 4.7671 | 260.07 |
| Al_2Ge_2O_7 | C2c | 7.2791 | 7.8244 | 9.8132 | 6.1737 | 200.82 |
| Ni_2GeO_4 | Fd3m | 8.3131 | 8.3131 | 8.3131 | 1.5400 | 805.06 |
| Ga_4GeO_8 | C2m | 3.0475 | 9.5257 | 12.3879 | 4.1830 | 296.39 |
| NiGa_2O_4 | Fd3m | 8.4109 | 8.4109 | 8.4109 | 4.4000 | 281.77 |
| Li_4GeO_4 | Cmcm | 6.1384 | 7.4326 | 7.8796 | 7.2005 | 172.18 |
| Li_2GeO_3 | Cmc21 | 4.9348 | 5.5482 | 9.7284 | 6.4792 | 191.35 |
| LiMg_3O_4 | Pm3m | 4.2294 | 4.2294 | 4.2294 | 8.0208 | 154.57 |
| Ga_3NO_3 | R3m | 5.9139 | 5.9139 | 14.7213 | 4.0235 | 308.14 |
| Ga_3NO_3 | C2m | 5.9174 | 10.3343 | 10.3539 | 3.8100 | 325.41 |
| LiNi_2O_4 | P4332 | 8.1127 | 8.1127 | 8.1127 | 6.6476 | 186.50 |
| SiC-4H | P63mc | 3.0949 | 3.0949 | 15.1845 | 3.3608 | 368.90 |
| wz-AlN | P63mc | 3.1286 | 3.1286 | 5.0170 | 6.4404 | 192.50 |
| zb-AlN | F43m | 4.4014 | 4.4014 | 4.4014 | 5.4069 | 229.30 |
| c-AlN | Fm3m | 4.0690 | 4.0690 | 4.0690 | 6.1832 | 200.51 |
| ErAlO_3 | P63mmc | 3.4458 | 3.4458 | 11.4497 | 5.6210 | 220.57 |
| ErAlO_3 | Ia3d | 12.0502 | 12.0502 | 12.0502 | 6.7460 | 183.78 |
| PrAlO_3 | Pm3m | 3.7902 | 3.7902 | 3.7902 | 4.9570 | 250.11 |
| MgF_2 | P42mnm | 3.0946 | 4.6940 | 4.6940 | 11.9118 | 104.08 |
| NaCl | Fm3m | 5.6917 | 5.6917 | 5.6917 | 10.3897 | 119.33 |
| MgNi_2O_4 | Fd3m | 8.3587 | 8.3587 | 8.3587 | 5.0480 | 245.60 |
| NiAl_2O_4 | Fm3m | 8.2077 | 8.2077 | 8.2077 | 4.6891 | 264.40 |
| NiAl_2O_4 | Imma | 5.6748 | 5.7902 | 8.1022 | 2.5000 | 495.92 |
| Mg_{0.75}Zn_{0.25}O | Fd3m | 4.2465 | 4.2465 | 4.2465 | 5.1252 | 191.1916 |
| (Mg_{0.5}Ni_{0.5})Al_2O_4 | Fd3m | 8.1892 | 8.1892 | 8.1892 | 4.7990 | 258.35 |
| (Mg_{0.5}Ni_{0.5})Ga_2O_4 | Fd3m | 8.4338 | 8.4338 | 8.4338 | 5.2901 | 234.36 |
| (Zn_{0.5}Ni_{0.5})Al_2O_4 | Fd3m | 8.1928 | 8.1928 | 8.1928 | 4.3020 | 288.19 |
| (Zn_{0.5}Ni_{0.5})Ga_2O_4 | Fd3m | 8.4350 | 8.4350 | 8.4350 | 5.0826 | 243.93 |
| Mg_{0.75}Ni_{0.25}0 | Fm3m | 4.2525 | 4.2525 | 4.2525 | 5.1252 | 241.90 |
| rGeO_2 | P42mnm | 4.4851 | 4.4851 | 2.9079 | 3.4333 | 361.11 |
| (Mg_{0.5}Zn_{0.5})_2GeO_4 | Fd3m | 8.3315 | 8.3315 | 8.3315 | 4.3377 | 285.82 |

Ni Tetrahedral sites, Al Octahedral sites

8950

Lattice matching for LiGaO2

| | material | SG | a | b | %Δa | %Δb | |
|---|---|---|---|---|---|---|---|
| film | **LiGaO2(001)** | Pna21 | 5.094112 | 5.4665 | | | |
| | | | | | | | |
| sub | **LiAlO2(001)** | P41212 | 5.230133 | 5.230133 | -2.60% | 4.52% | |
| sub | **AlN(110)** | P63mc | 5.01695 | 5.41887 | 1.54% | 0.88% | |
| sub | **SiO2(100)** | P3221 | 5.02778 | 5.51892 | 1.32% | -0.95% | good match |
| sub | **Al(111)** | Fm3m | 4.94666 | 5.71191 | 2.98% | -4.30% | |

*FIG. 89B*

Lithium Aluminum Gallium Oxide $Li(Al_{0.5}Ga_{0.5})O_2$ $SG = Pna21$

Lithium Gallium Oxide $LiGaO_2$
$SG = Pna21$

Zinc Aluminum Oxide $ZnAl_2O_4$ $SG = Fd3m$

Zinc Gallium Oxide $ZnGa_2O_4$
$SG = Fd3m$

Nickel Oxide $NiO$
$SG = Fm3m$

κ-Gallium Oxide $\kappa Ga_2O_3$
$SG = Pna21$

κ-Alluminum Gallium Oxide $\kappa(Al_{0.5}Ga_{0.5})_2O_3$ $SG = Pna21$

κ-Alluminum Oxide $\kappa Al_2O_3$
$SG = Pna21$

Magnesium Aluminum Oxide $MgAl_2O_4$
$SG = Fd3m$

Sodium Chloride (*Rock salt*) *NaCl*

$SG = Fm3m$

Magnesium Zinc Oxide (Rock Salt) $Mg_{0.75}Zn_{0.25}O$
$SG = Fd3m$

Erbium Aluminum Oxide $ErAlO_3$
$SG = P63mcm$

Germanium Lithium Oxide $GeLi_2O_3$ $SG = Cmc21$

Zinc Aluminum Gallium Oxide $Zn(Al_{0.5}Ga_{0.5})_2O_4$ $SG = Fd3m$

Magnesium Zinc Aluminum Oxide $(Mg_{0.5}Zn_{0.5})Al_2O_4$ $SG = Fd3m$

Magnesium Nickel Aluminum Oxide $(Mg_{0.5}Ni_{0.5})Al_2O_4$
$SG = Fd3m$

β-Aluminum Gallium Oxide $\beta(Al_{0.375}Ga_{0.625})_2O_3$
$SG = C2m$

β-Aluminum Gallium Oxide $\beta(Al_{0.5}Ga_{0.5})_2O_3$ $SG = C2m$

θ-Aluminum Oxide

β-Aluminum Gallium Oxide $\beta(Al_{1.0}Ga_{0.0})_2O_3$ $SG = C2m$

Germanium Magnesium Zinc Oxide $Ge(Mg_{0.5}Zn_{0.5})_2O_4$ $SG = Fd3m$

Nickel Zinc Aluminum Oxide $(Ni_{0.5}Zn_{0.5})Al_2O_4$ $SG = Fd3m$

Superlattice (SL) Structure $[AB_2O_4|CD_2O_4]$ $$SL = [MgAl_2O_4]_m \mid [MgGa_2O_4]_n$$
$$m, n = \#\ of\ unit\ cells\ in\ repeating\ period$$

$SL = [MgAl_2O_4]_1 \mid [MgGa_2O_4]_1$

SG unit cells = Fd3m $SL = [MgAl_2O_4]_1 \mid [Mg(Al_{0.5}Ga_{0.5})_2O_4]_1$

SG unit cells = Fd3m $SL = [MgGa_2O_4]_1 \mid [(Mg_{0.5}Zn_{0.5})O]_1$

SG unit cells = Fd3m $SL = [\alpha Al_2O_3]_1 \mid [\alpha Ga_2O_3]_1$

SG unit cells = R3c

Growth direction =A-plane $SL = [GeMg_2O_4]_1 \mid [MgO]_1$

SG unit cells = Fd3m/Fd3m $\vec{k}$

β-Gallium Oxide $\beta Ga_2O_3(100) - oriented\ film$

Pseudomorphic strain to $\sqrt{2}$ x MgO $SG = C2m$ $$SL = [MgO(100)]_1 \mid [\beta Ga_2O_3(100)]_1$$

9810 9805 9820 9822 9824

| material | preferred growth orient | SG | a (Ang) | b(Ang) | c(Ang) | % mismatch MgO | % mismatch Al2MgO4 | % mismatch LiF(100) |
|---|---|---|---|---|---|---|---|---|
| **MgO** | (100), (001) | Fm3m | 4.256484 | 4.256484 | 4.256484 | 0.00% | 4.19% | 4.24% |
| **Mg2GeO4** | (100), (001) | Fd3m | 8.349934 | 8.349934 | 8.349934 | -1.92% | 2.19% | 2.24% |
| **MgGa2O4** | (100), (001) | Fd3m | 8.456758 | 8.456758 | 8.456758 | -0.66% | 3.50% | 3.55% |
| **MgAl2O4** | (100), (001) | Fd3m | 8.170734 | 8.170734 | 8.170734 | -4.02% | 0.00% | 0.05% |
| **ZnAl2O4** | (100), (001) | Fd3m | 8.177936 | 8.177936 | 8.177936 | -3.94% | 0.09% | 0.14% |
| **ZnGa2O4** | (100), (001) | Fd3m | 8.459002 | 8.459002 | 8.459002 | -0.63% | 3.53% | 3.58% |
| **gamma-Ga2O3** | (100), (001) | Fd3m | 8.22 | 8.22 | 8.22 | -3.44% | 0.60% | 0.65% |
| **LiF** | (100), (001) | Fm3m | 4.083428 | 4.083428 | 4.083428 | -4.07% | -0.05% | 0.00% |

*FIG. 98A*

| material | preferred growth orient | SG | a (Ang) | b(Ang) | c(Ang) |
|---|---|---|---|---|---|
| **beta-Ga2O3** | (100), | C2m | 12.45245 | 3.082968 | 5.876154 |
| | *mismatch MgO* | | | 2.43% | -2.38% |
| | *mismatch LiF(100)* | | | 6.77% | 1.75% |
| | *mismatch Al2MgO4* | | | 6.72% | 1.71% |
| | *mismatch Ga2MgO4* | | | 3.11% | -1.73% |
| | *mismatch ZnGa2O4* | | | 3.08% | -1.76% |
| | *mismatch ZnAl2O4* | | | 6.63% | 1.62% |
| | *mismatch Mg2GeO4* | | | 4.43% | -0.48% |

Oxide_type_A (columns) / Oxide_type_B (rows)

| | MgO | $GeMg_2O_4$ | $ZnGa_2O_4$ | $MgGa_2O_4$ | $MgAl_2O_4$ | $ZnAl_2O_4$ | $\gamma$-$Ga_2O_3$ | RS-MgZnO |
|---|---|---|---|---|---|---|---|---|
| MgO | MgO | HJ / SL | HJ / SL | HJ / SL | HJ / SL | HJ / SL | HJ / SL | HJ / SL |
| $GeMg_2O_4$ | | $GeMg_2O_4$ | HJ / SL | HJ / SL | HJ / SL | HJ / SL | HJ / SL | HJ / SL |
| $ZnGa_2O_4$ | | | $ZnGa_2O_4$ | HJ / SL | HJ / SL | HJ / SL | HJ / SL | HJ / SL |
| $MgGa_2O_4$ | | | | $MgGa_2O_4$ | HJ / SL | HJ / SL | HJ / SL | HJ / SL |
| $MgAl_2O_4$ | | | | | $MgAl_2O_4$ | HJ / SL | HJ / SL | HJ / SL |
| $ZnAl_2O_4$ | | | | | | $ZnAl_2O_4$ | HJ / SL | HJ / SL |
| $\gamma$-$Ga_2O_3$ | | | | | | | $\gamma$-$Ga_2O_3$ | HJ / SL |
| RS-MgZnO | | | | | | | | MgZnO |

HJ = Heterojunction(s)

SL = Superlattice, Multiple Quantum Well

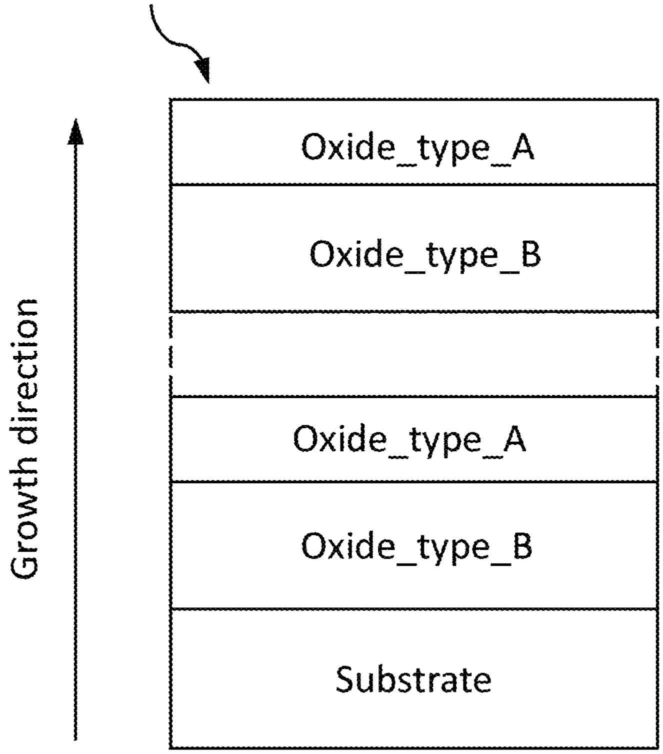

5G band allocation

Insulator and gate oxide $\alpha - Al_2O_3$

SG= Pna21 Ga2O3

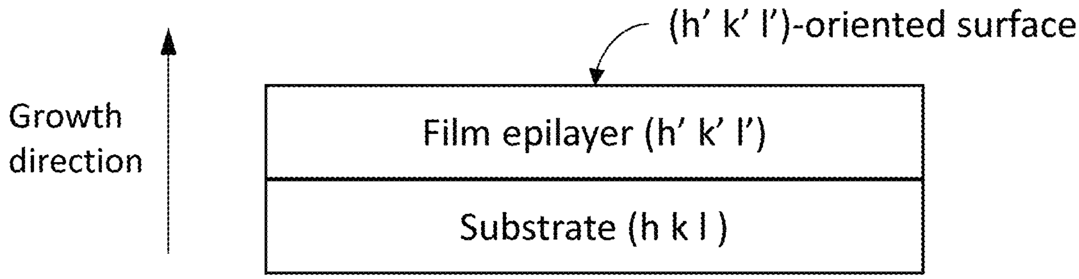
*FIG. 198A*
| substrate material | SG | substrate orientation | film orientation | *Elastic Strain Energy due Mismatch* |
|---|---|---|---|---|
| alpha SiO2 quartz | P3221 | <0 0 1> | <0 0 1> | 43 |
| LiGaO2 | Pna21 | <0 1 1> | <0 0 1> | 43 |
| AlN | P63mc | <1 0 0> | <0 1 0> | 46.4 |
| LiGaO2 | Pna21 | <0 1 0> | <0 1 1> | 63.3 |
| KTaO3 | Pm3m | <1 1 1> | <0 0 1> | 86 |
| Al | Fm3m | <1 1 1> | <0 0 1> | 86 |
*FIG. 198B*
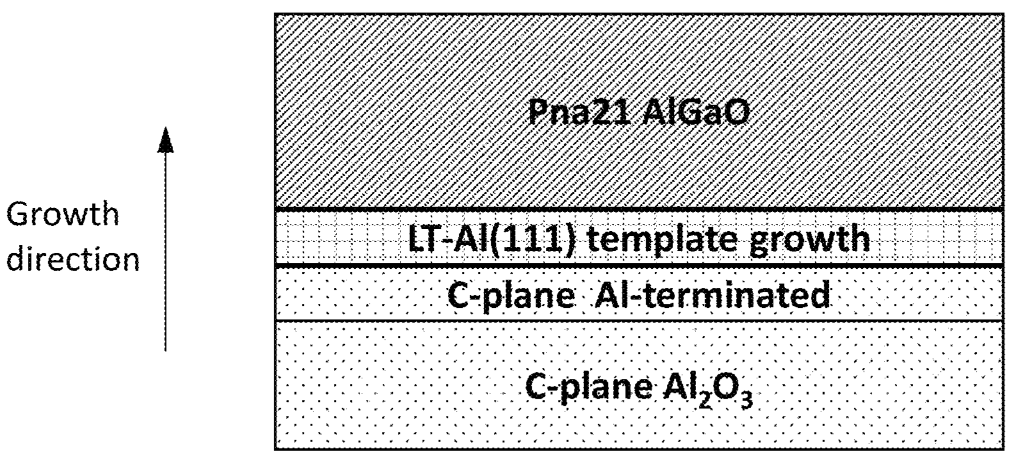
*FIG. 199*

EPITAXIAL OXIDE MATERIALS, STRUCTURES, AND DEVICES

RELATED APPLICATIONS

This application is a continuation of International Application No. PCT/IB2021/060466 filed on Nov. 11, 2021, and entitled "Epitaxial Oxide Materials, Structures, and Devices"; which is a 1) continuation-in-part of International Application No. PCT/IB2021/060414, entitled "Ultrawide Bandgap Semiconductor Devices Including Magnesium Germanium Oxides," filed on Nov. 10, 2021; 2) continuation-in-part of International Application No. PCT/IB2021/060413, entitled "Epitaxial Oxide Materials, Structures and Devices," filed on Nov. 10, 2021; and 3) a continuation of International Application No. PCT/IB2021/060427, entitled "Epitaxial Oxide Materials, Structures, and Devices", filed on Nov. 10, 2021; all of which are hereby incorporated by reference for all purposes.

This application is related to U.S. Non-Provisional Patent Application No. 16/990,349, filed on Aug. 11, 2020, and entitled "Metal Oxide Semiconductor-Based Light Emitting Device"; all of which is hereby incorporated by reference for all purposes.

This application is also related to U.S. application Ser. No. 17/652,019, filed on Feb. 22, 2022, entitled "Epitaxial Oxide Materials, Structures, and Devices"; and to U.S. application Ser. No. 17/652,031, filed on Feb. 22, 2022, entitled "Epitaxial Oxide Materials, Structures, and Devices"; both of which are hereby incorporated by reference for all purposes.

The following publications are referred to in the present application and their contents are hereby incorporated by reference in their entirety:

- U.S. Pat. No. 9,412,911 titled "OPTICAL TUNING OF LIGHT EMITTING SEMICONDUCTOR JUNCTIONS", issued 9 Aug. 2016, and assigned to the applicant of the present application;
- U.S. Pat. No. 9,691,938 titled "ADVANCED ELECTRONIC DEVICE STRUCTURES USING SEMICONDUCTOR STRUCTURES AND SUPERLATTICES", issued 27 Jun. 2017, and assigned to the applicant of the present application;
- U.S. Pat. No. 10,475,956 titled "OPTOELECTRONIC DEVICE", issued 12 Nov. 2019, and assigned to the applicant of the present application; and The contents of each of the above publications are expressly incorporated by reference in their entirety.

BACKGROUND

Electronic and optoelectronic devices such as diodes, transistors, photodetectors, LEDs and lasers can use epitaxial semiconductor structures to control the transport of free carriers, detect light, or generate light. Wide bandgap semiconductor materials, such as those with bandgaps above about 4 eV, are useful in some applications such as high power devices, and optoelectronic devices that detect or emit light in ultraviolet (UV) wavelengths.

For example, UV light emitting devices (UVLEDs) have many applications in medicine, medical diagnostics, water purification, food processing, sterilization, aseptic packaging and deep submicron lithographic processing. Emerging applications in bio-sensing, communications, pharmaceutical process industry and materials manufacturing are also enabled by delivering extremely short wavelength optical sources in a compact and lightweight package having high electrical conversion efficiency such as a UVLED. Electro-optical conversion of electrical energy into discrete optical wavelengths with extremely high efficiency has generally been achieved using a semiconductor having the required properties to achieve the spatial recombination of charge carriers of electrons and holes to emit light of the required wavelength. In the case where UV light is required, UVLEDs have been developed using almost exclusively Gallium-Indium-Aluminum-Nitride (GaInAlN) compositions forming wurtzite-type crystal structures.

In another example, high power RF switches are used to separate, amplify and filter transmitted and received signals in a transceiver of a wireless communication system. A requirement of transistor devices making up such RF switches are the ability to handle high voltages without being damaged. Typical RF switches use transistor devices employing low bandgap semiconductors (e.g., Si or GaAs) with relatively low breakdown voltages (e.g., below about 3 V), and therefore many transistor devices are connected in series to withstand the required voltages. Wider bandgap semiconductors (e.g., GaN) with higher breakdown voltages have been used to improve the maximum voltage limit of RF switches using fewer transistor devices connected in series. An added benefit of using wider bandgap semiconductors such as GaN in RF switches is the ability to simplify the impedance matching with microwave circuits.

SUMMARY

The present disclosure provides techniques for epitaxial oxide materials, structures and devices. In some embodiments, a semiconductor structure includes an epitaxial oxide material. In some embodiments, a semiconductor structure includes two or more epitaxial oxide materials with different properties, such as compositions, crystal symmetries, or bandgaps. The semiconductor structures can comprise one or more epitaxial oxide layers formed on a compatible substrate with in-plane lattice parameters and atomic positions that provide a suitable template for the growth of the epitaxial oxide materials. In some embodiments, one or more of the epitaxial oxide materials is strained. In some embodiments, one or more of the epitaxial oxide materials is doped n- or p-type. In some embodiments, the semiconductor structure comprises a superlattice with epitaxial oxide materials. In some embodiments, the semiconductor structure comprises a chirp layer with epitaxial oxide materials.

The semiconductor structures described herein can be a portion of a semiconductor device, such as an optoelectronic device with wavelengths ranging from infra-red to deep-ultraviolet, a light emitting diode, a laser diode, a photodetector, a solar cell, a high-power diode, a high-power transistor, a transducer, or a high electron mobility transistor. In some embodiments, the semiconductor device has a high breakdown voltage due to the properties of the epitaxial oxide materials therein. In some embodiments, the semiconductor device uses impact ionization mechanisms for carrier multiplication.

In some embodiments, a semiconductor structure includes an epitaxial oxide heterostructure, comprising: a substrate; a first epitaxial oxide layer comprising $(Ni_{x1}Mg_{y1}Zn_{1-x1-y1})_2GeO_4$ wherein $0 \le x1 \le 1$ and $0 \le y1 \le 1$; and a second epitaxial oxide layer comprising $(Ni_{x2}Mg_{y2}Zn_{1-x2-y2})_2GeO_4$ wherein $0 \le x2 \le 1$ and $0 \le y2 \le 1$. In some cases, either: $x1 \ne x2$ and $y1 = y2$; $x1 = x2$ and $y1 \ne y2$; or $x1 \ne x2$ and $y1 \ne y2$.

In some embodiments, a semiconductor structure includes an epitaxial oxide heterostructure, comprising: a substrate; a first epitaxial oxide layer comprising $(Mg_{x1}Zn_{1-x1})(Al_{y1}Ga_{1-y1})_2O_4$ wherein $0 \le x1 \le 1$ and $0 \le y1 \le 1$; and a second epitaxial oxide layer comprising $(Ni_{x2}Mg_{y2}Zn_{1-x2-y2})_2GeO_4$ wherein $0 \leq x2 \leq 1$ and $0 \leq y2 \leq 1$.

BRIEF DESCRIPTION OF THE DRAWINGS

Embodiments of the present disclosure will be discussed with reference to the accompanying figures.

FIG. 28 shows a chart of ternary metal oxide combinations that may be adopted in accordance with various illustrative embodiments of the present disclosure in the forming of optoelectronic devices.

FIG. 43A shows in TABLE I a selection of substrate crystals for depositing metal oxide structures in accordance with various illustrative embodiments of the present disclosure.

FIG. 43B shows in TABLE II unit cell parameters of a selection of metal oxides in accordance with various illustrative embodiments of the present disclosure, showing lattice constant mismatches between $Al_2O_3$ and $Ga_2O_3$.

FIG. 441 shows a strain-free energy-crystal momentum (E-k) dispersion in the vicinity of the Brillouin-zone center for the case of a ternary Aluminum-Erbium-Oxide $(Al_xEr_{1-x})_2O_3$ illustrating the direct bandgap at $\Gamma$(k=0) in accordance with an illustrative embodiment of the present disclosure.

FIGS. 58A and 58B illustrate optical mode structure and threshold gain for a slab of metal-oxide semiconductor material in accordance with an illustrative embodiment of the present disclosure.

FIGS. 59A and 59B illustrate optical mode structure and threshold gain for a slab of metal-oxide semiconductor material in accordance with another illustrative embodiment of the present disclosure.

FIGS. 76A-1 and 76A-2 show a table of crystal symmetries (or space groups), lattice constants ("a," "b" and "c," in different crystal directions, in Angstroms), bandgaps (minimum bandgap energies in eV), and the wavelength of light ("λ_g," in nm) that corresponds to the bandgap energy for various materials.

FIG. 82A is a schematic of an example semiconductor structure comprising epitaxial oxide layers on a suitable substrate.

FIGS. 82B-82I are plots showing electron energy (on the y-axis) vs. growth direction (on the x-axis) for embodiments of epitaxial oxide heterostructures comprising layers of dissimilar epitaxial oxide materials.

FIGS. 83A-83C show electron energy versus growth direction for three examples of different digital alloys, and example wavefunctions for the confined electrons and holes in each case.

FIG. 84 shows a plot of effective bandgap versus an average composition (x) of the digital alloys shown in FIGS. 83A-83C.

FIG. 85 shows a chart of some DFT calculated epitaxial oxide material bandgaps (minimum bandgap energies in eV) and in some cases crystal symmetry versus a lattice constant of the epitaxial oxide material.

FIG. 86 shows a schematic explaining how an epitaxial oxide material with a monoclinic unit cell can be compatible with an epitaxial oxide material with a cubic unit cell.

FIG. 87 shows a chart of some DFT calculated epitaxial oxide material bandgaps (minimum bandgap energies in eV) and in some cases crystal symmetry versus a lattice constant of the epitaxial oxide material further indicating groupings where the epitaxial oxide materials within each group are compatible with the other materials in the group.

FIG. 88A shows a chart of some DFT calculated epitaxial oxide material bandgaps (minimum bandgap energies in eV) versus lattice constant where the epitaxial oxide materials all have cubic crystal symmetry with a Fd3m or Fm3m space group.

FIG. 88B-1 is a schematic showing how an epitaxial oxide material with cubic crystal symmetry with a relatively small lattice constant (e.g., approximately equal to 4 Angstroms) can lattice match (or have a small lattice mismatch) with an epitaxial oxide material that has a relatively large lattice constant (e.g., approximately equal to 8 Angstroms).

FIG. 88B-2 shows the crystal structure of $NiAl_2O_4$ with an Fd3m space group.

Figure 88A:
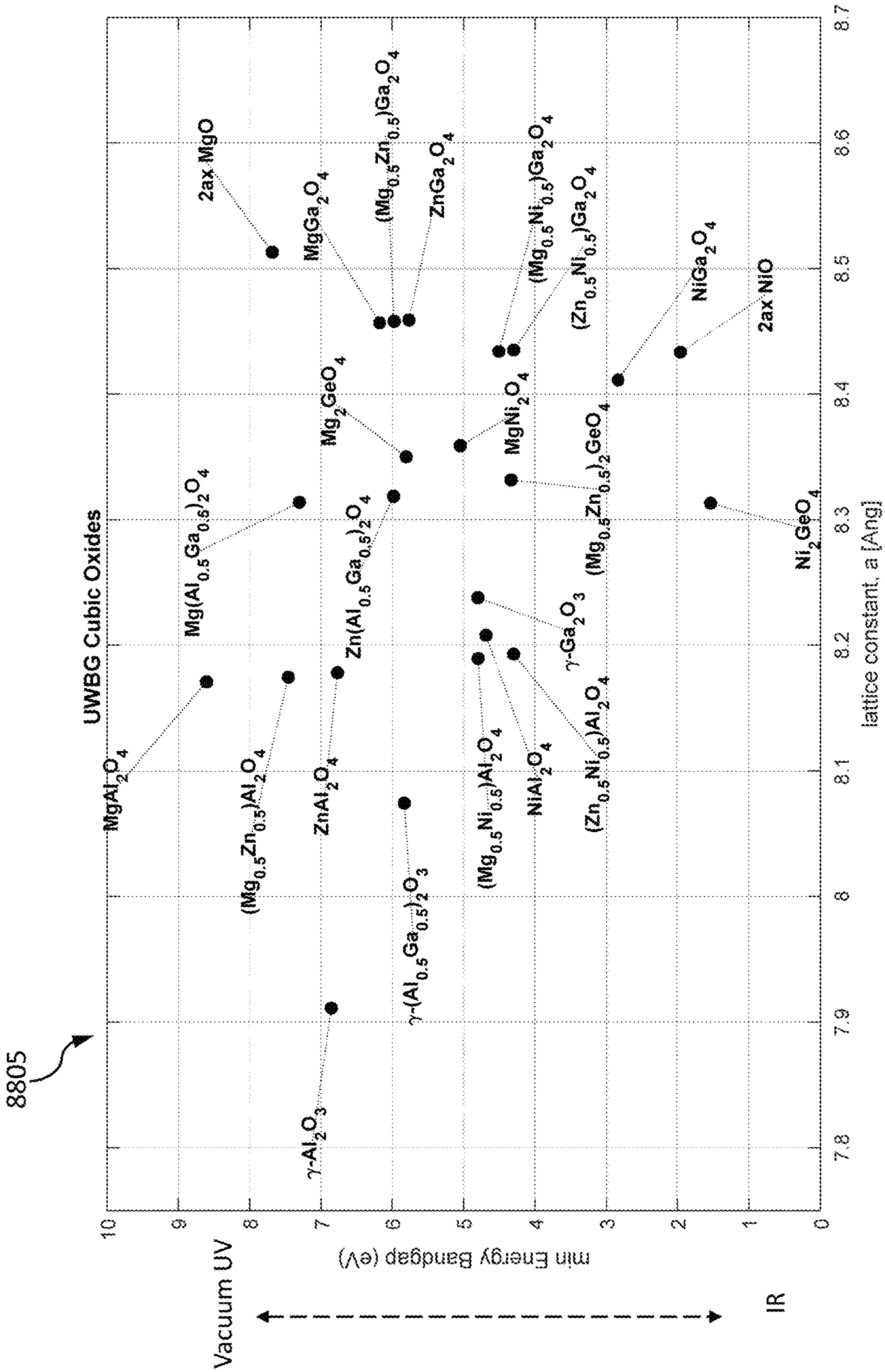
Figures 1, 88B:
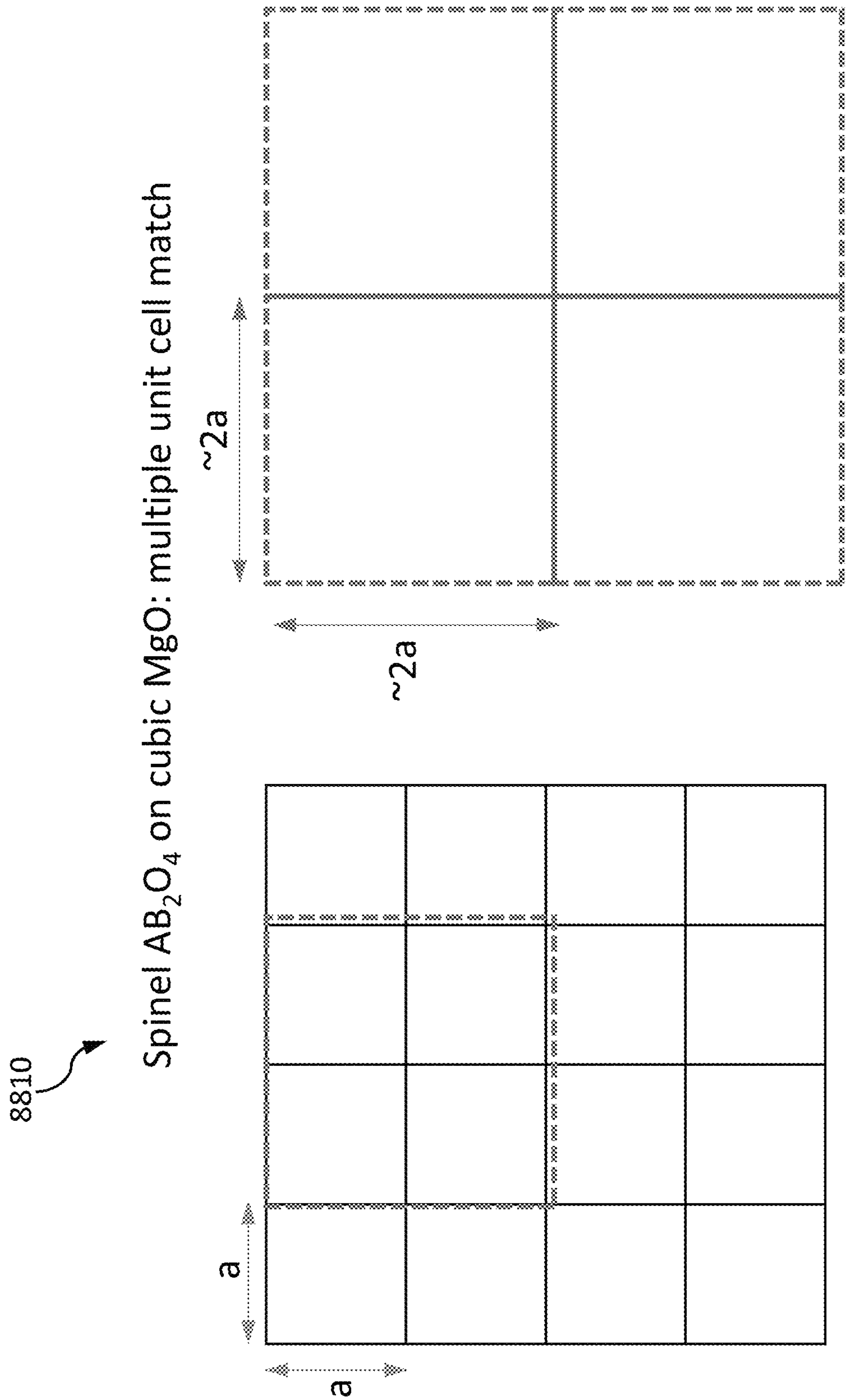
Figures 2, 88B:
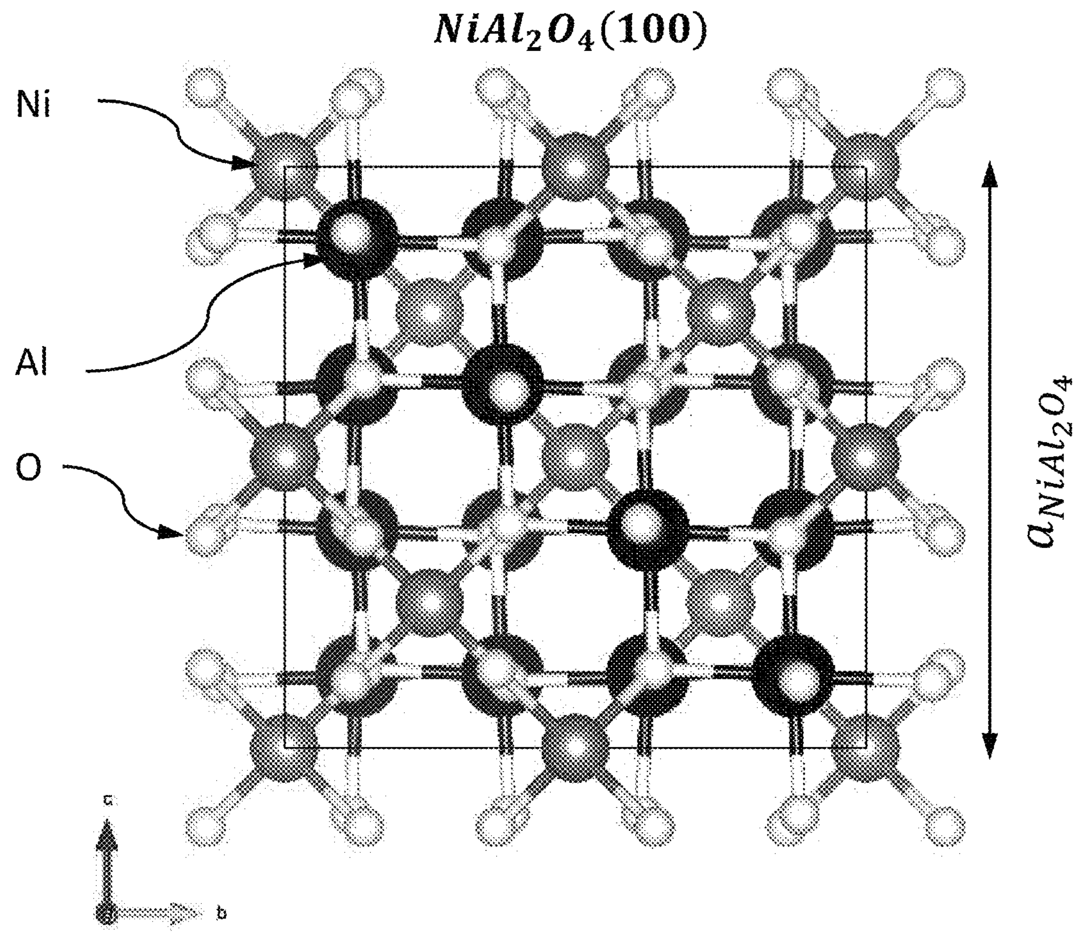
Figure 88C:
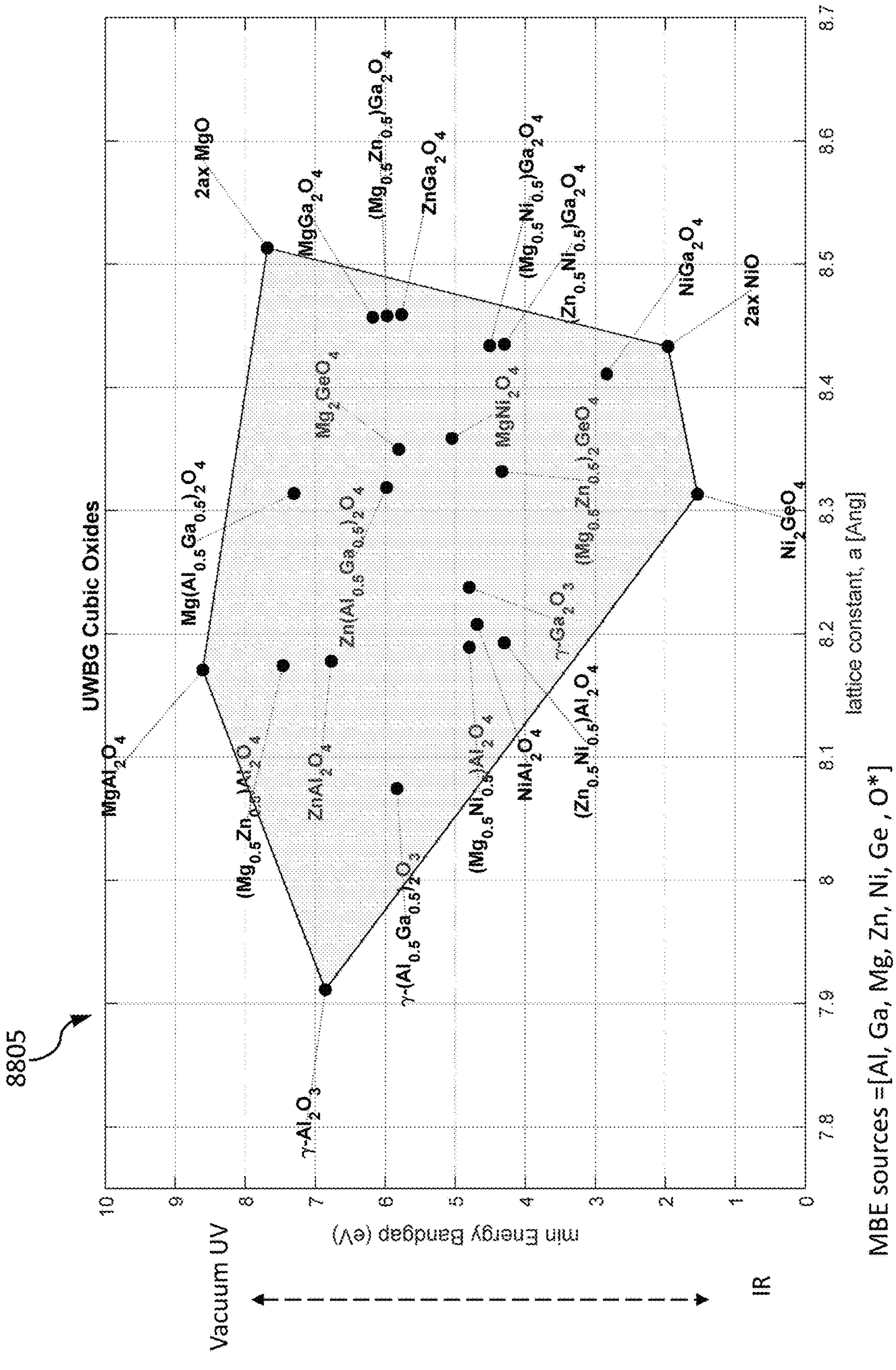

FIG. 88C shows the chart in FIG. 88A, with lines connecting a subset of epitaxial oxide materials having compositions $(Ni_xMg_yZn_{1-x-y})(Al_qGa_{1-q})_2O_4$ where 0≤x≤1, 0≤y≤1, 0≤z≤1 and 0≤q≤1, or $(Ni_xMg_yZn_{1-x-y})GeO_4$ where 0≤x≤1, 0≤y≤1, and 0≤z≤1 and where the shaded area is a convex hull of the connected materials shown on the plot.

Figure 88D:
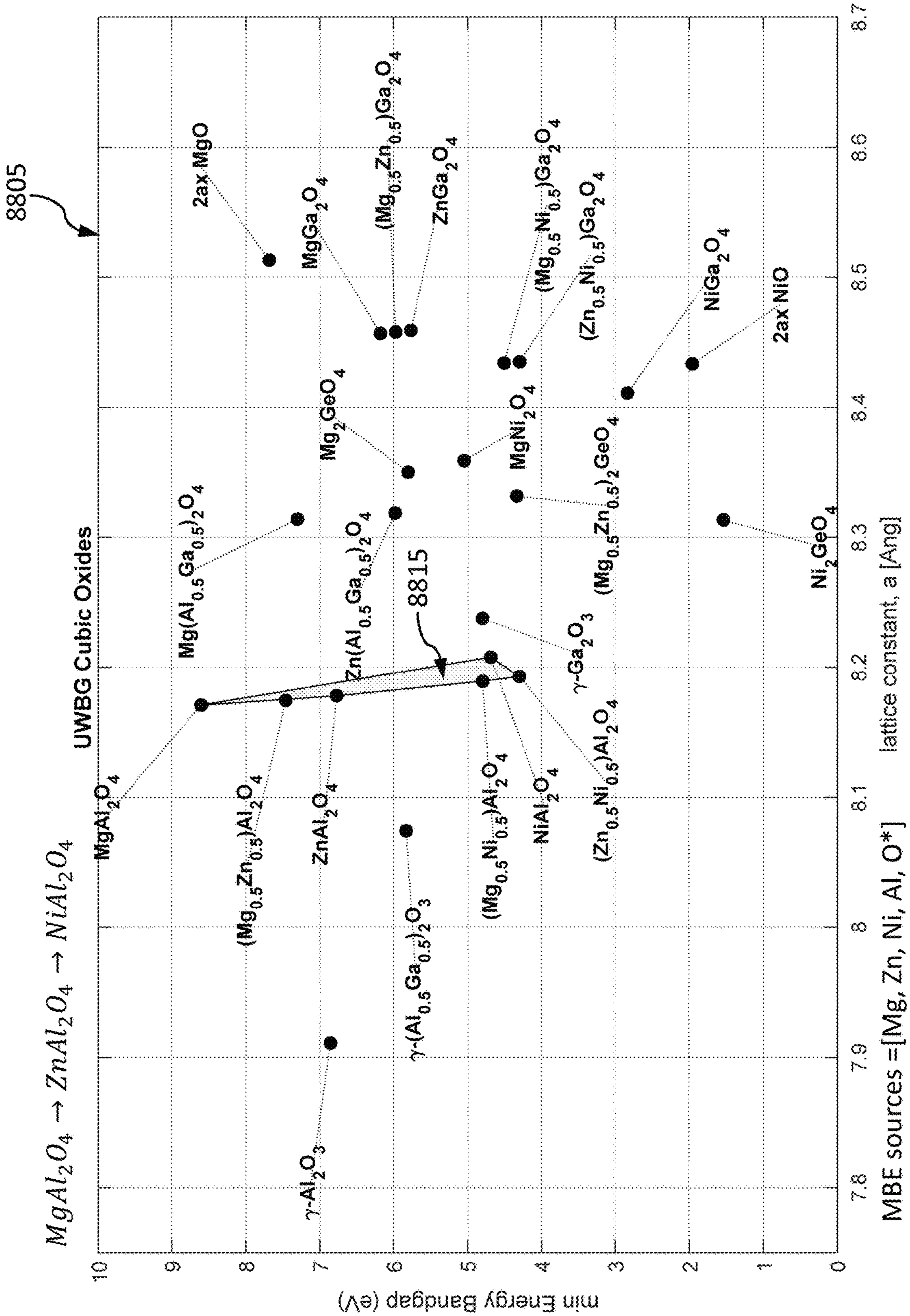

FIG. 88D shows the chart in FIG. 88A, with lines connecting a subset of epitaxial oxide materials including $MgAl_2O_4$, $ZnAl_2O_4$, $NiAl_2O_4$, and some alloys thereof.

Figure 88E:
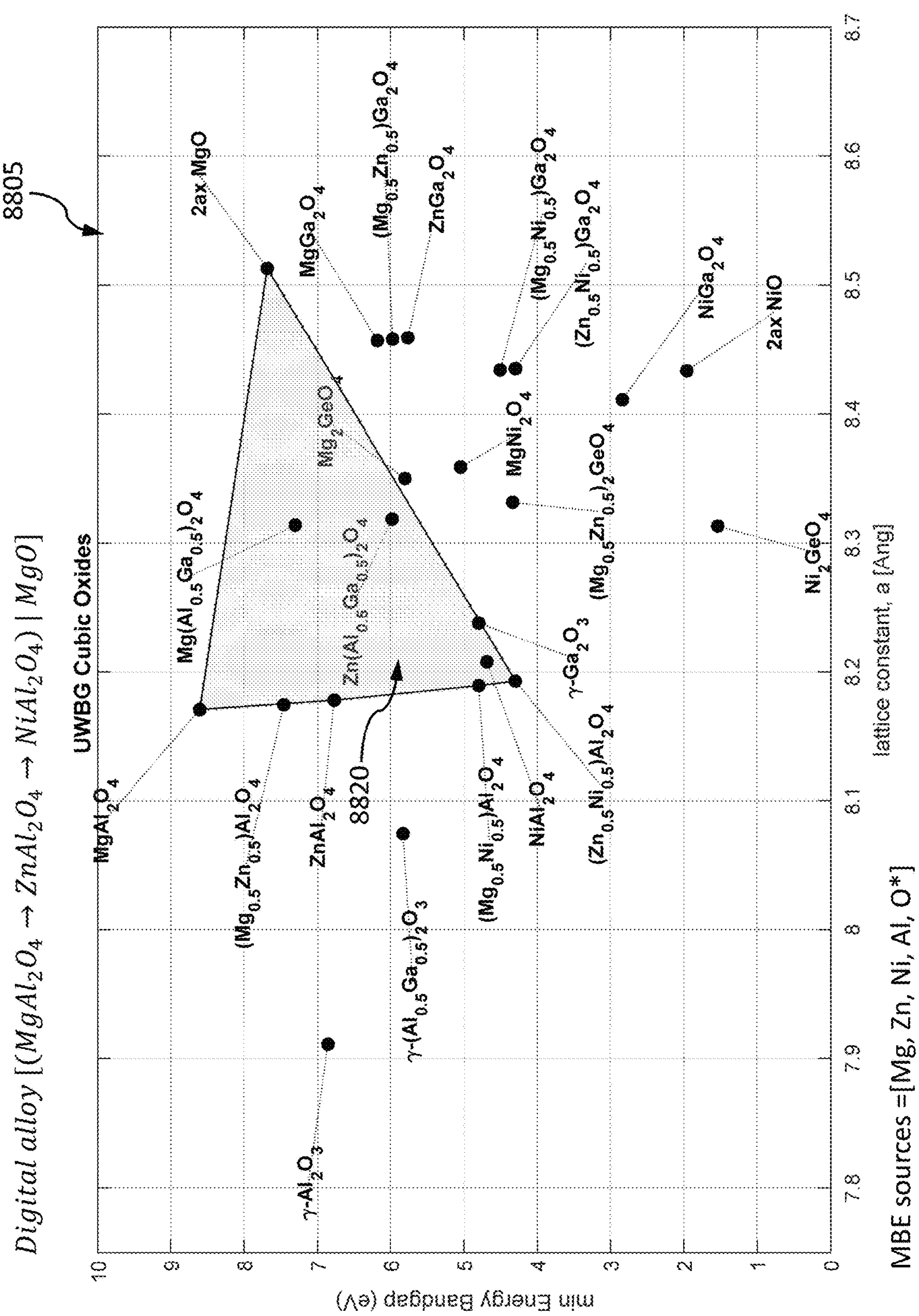

FIG. 88E shows the chart in FIG. 88A, with lines connecting a subset of epitaxial oxide materials including "2ax MgO," γ-$Ga_2O_3$, $MgAl_2O_4$, $ZnAl_2O_4$, $NiAl_2O_4$, and some alloys thereof.

Figure 88F:
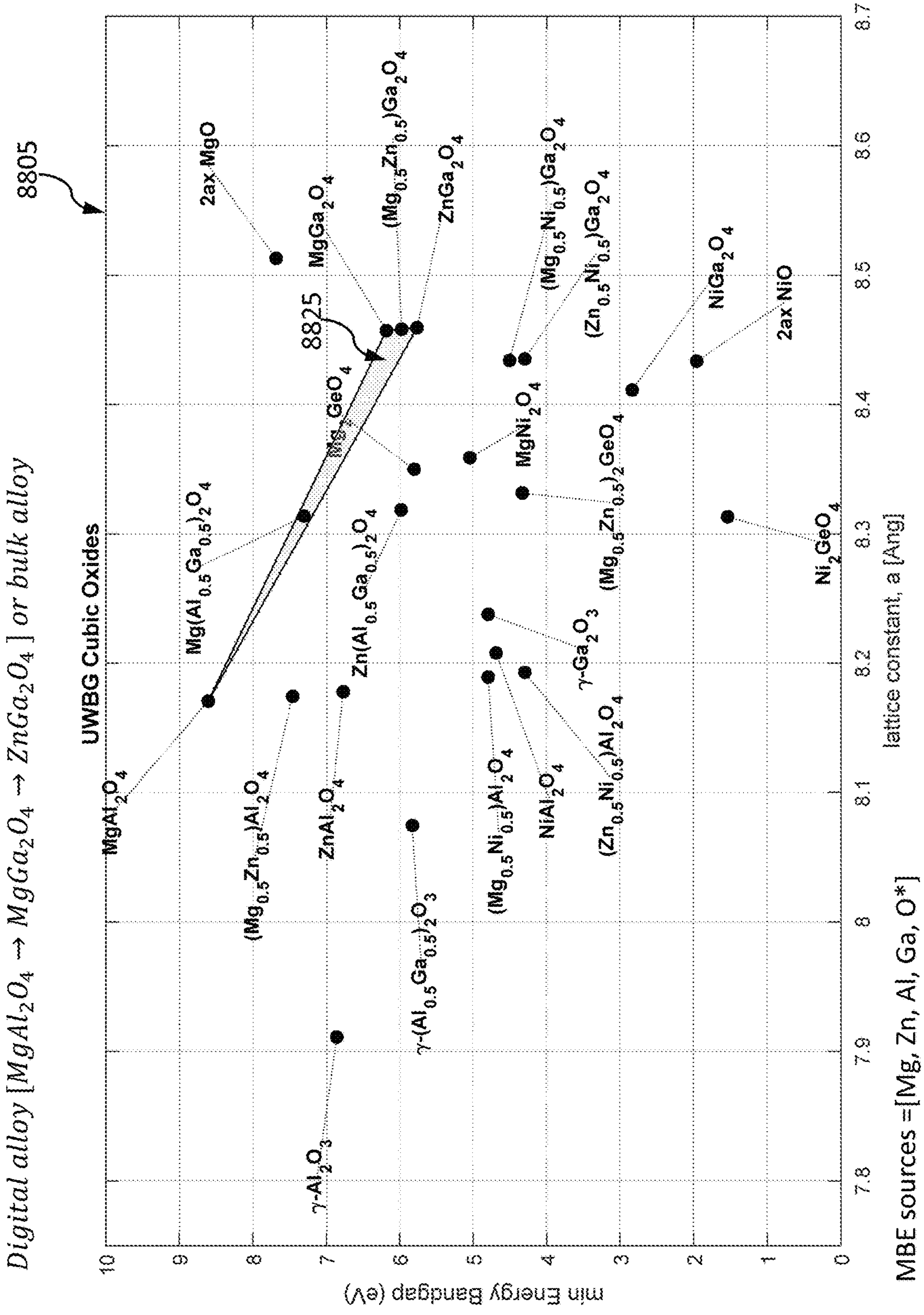

FIG. 88F shows the chart in FIG. 88A, with lines connecting a subset of epitaxial oxide materials including $MgAl_2O_4$, $MgGa_2O_4$, $ZnGa_2O_4$, and some alloys thereof.

Figure 88G:
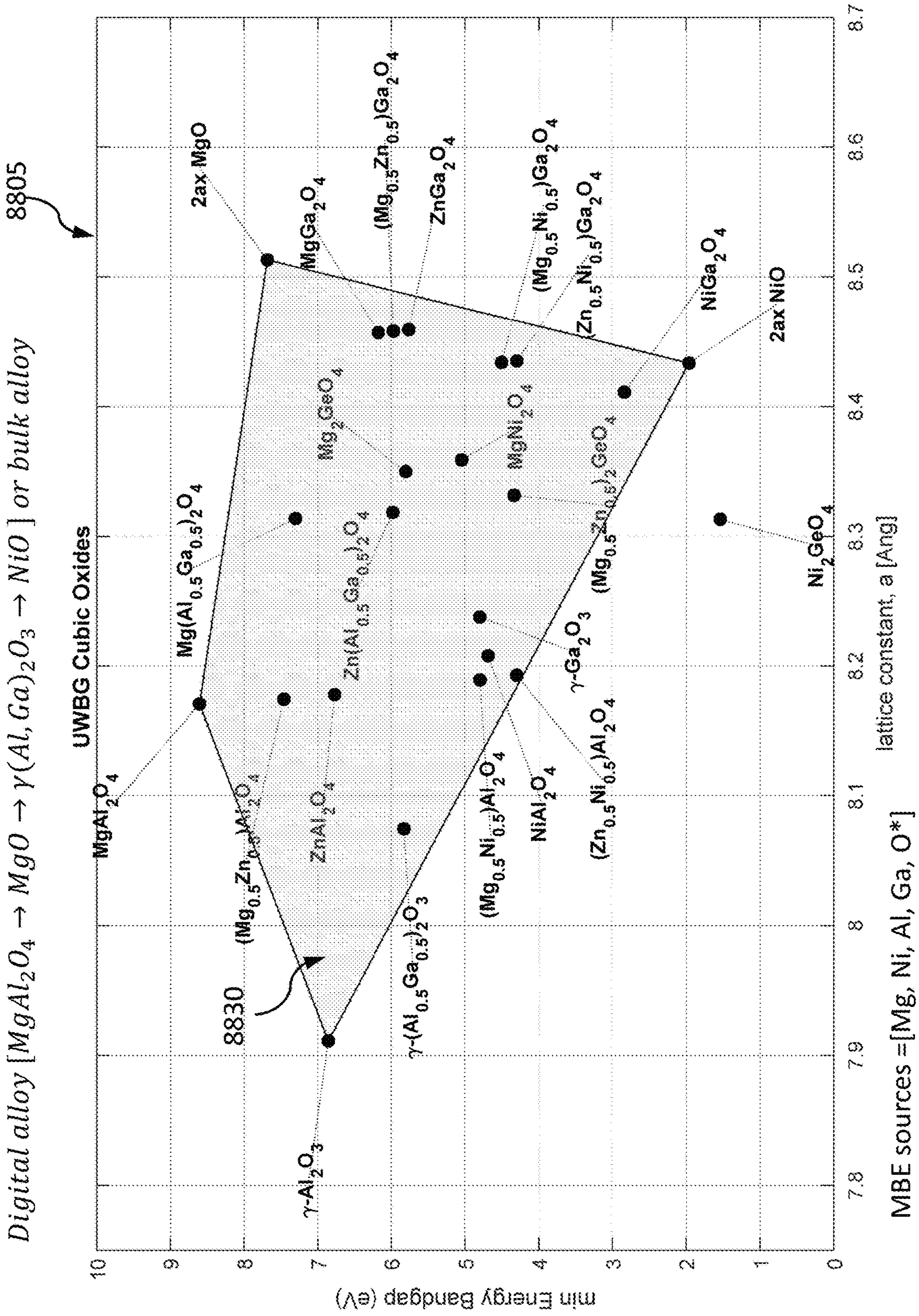

FIG. 88G shows the chart in FIG. 88A, with lines connecting a subset of epitaxial oxide materials including "2ax NiO" (which is NiO, where the lattice constant plotted is twice the lattice constant of the NiO unit cell), "2ax MgO," γ-$Al_2O_3$, γ-$Ga_2O_3$, $MgAl_2O_4$, and some alloys thereof.

Figure 88H:
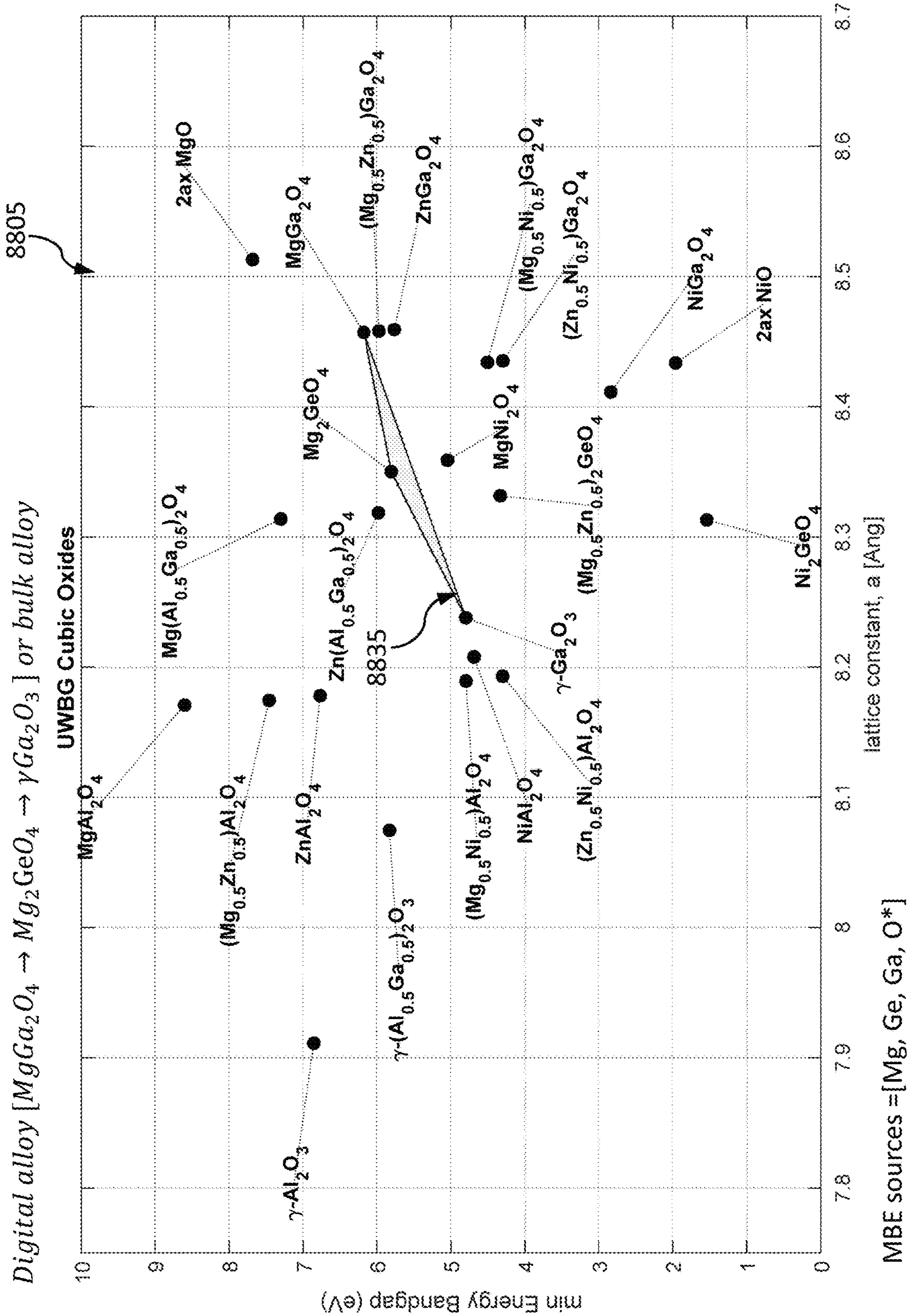

FIG. 88H shows the chart in FIG. 88A, with lines connecting a subset of epitaxial oxide materials including γ-$Ga_2O_3$, $MgGa_2O_4$, $Mg_2GeO_4$, and some alloys thereof.

Figure 88I:
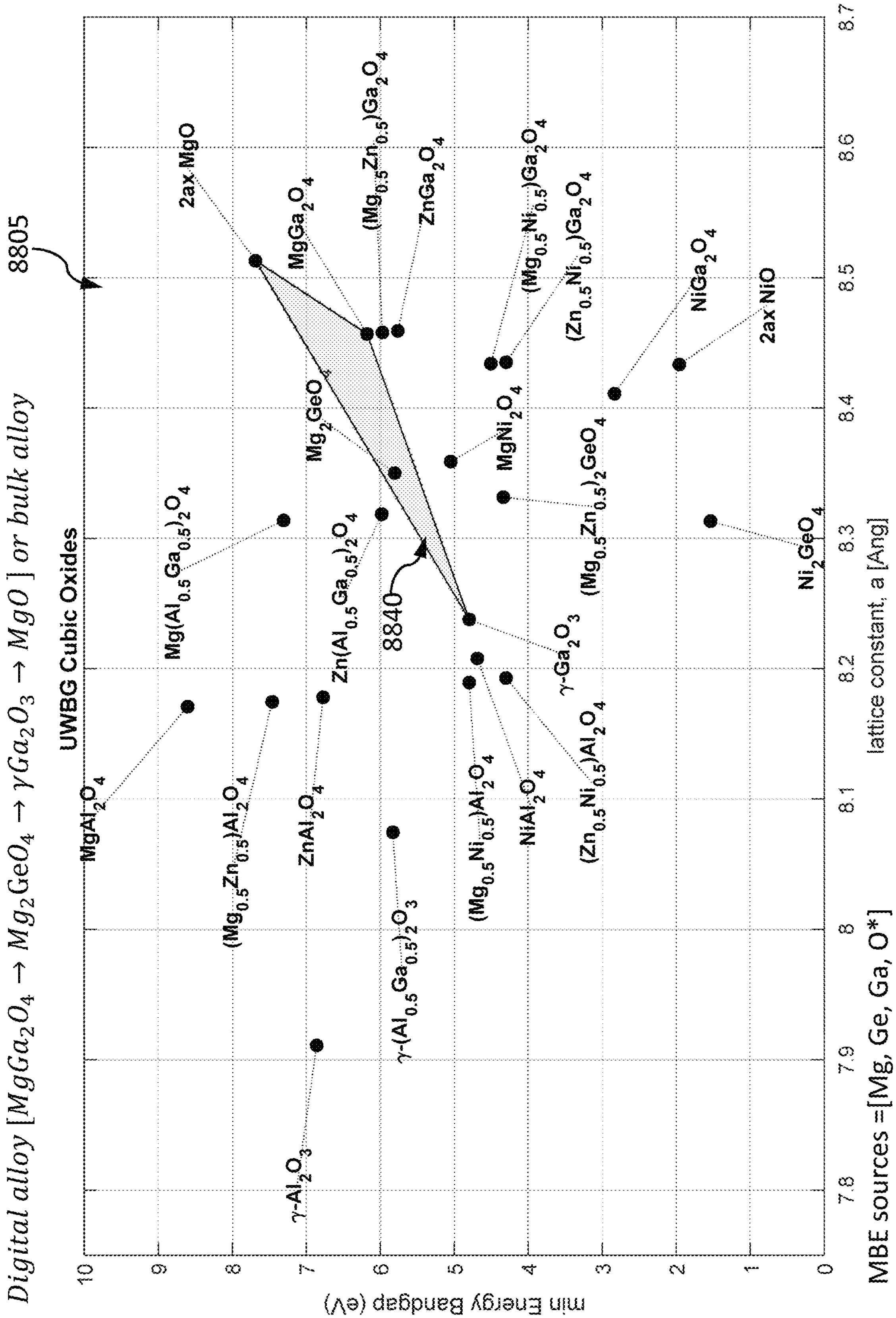

FIG. 88I shows the chart in FIG. 88A, with lines connecting a subset of epitaxial oxide materials including γ-$Ga_2O_3$, $MgGa_2O_4$, "2ax MgO," and some alloys thereof.

Figure 88J:
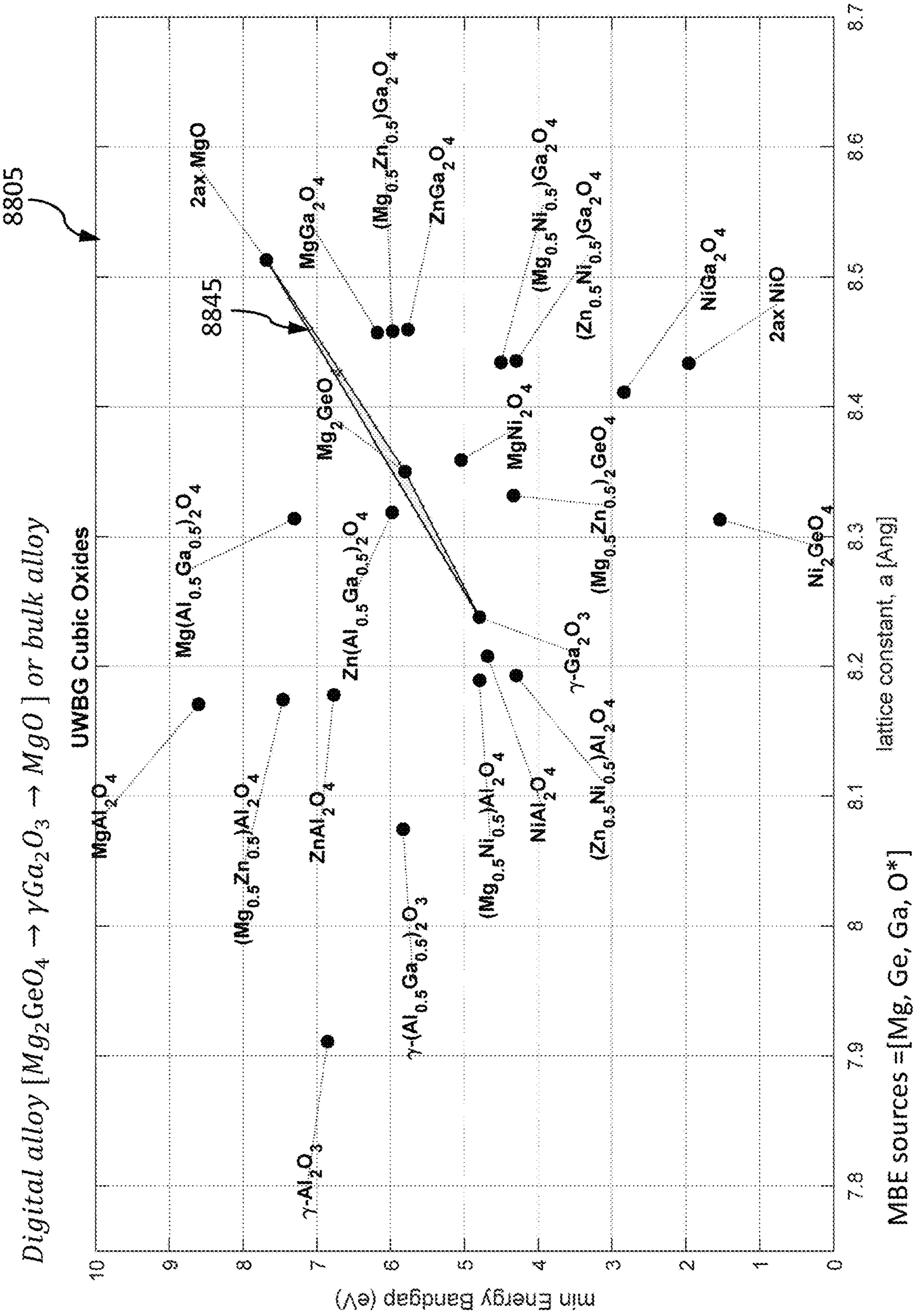

FIG. 88J shows the chart in FIG. 88A, with lines connecting a subset of epitaxial oxide materials including γ-$Ga_2O_3$, $Mg_2GeO_4$, "2ax MgO," and some alloys thereof.

Figure 88K:
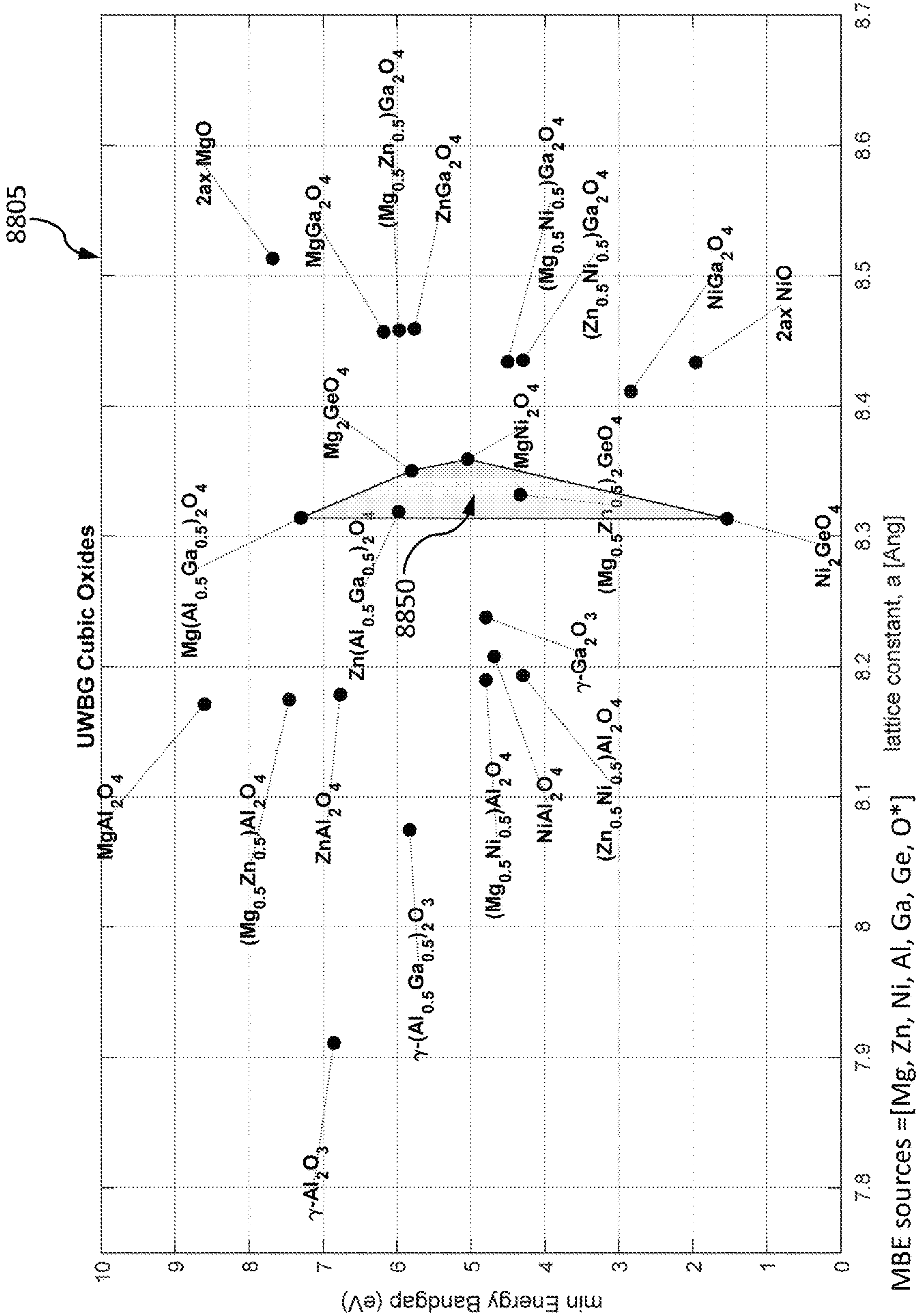

FIG. 88K shows the chart in FIG. 88A, with lines connecting a subset of epitaxial oxide materials including $Ni_2GeO_4$, $Mg_2GeO_4$, $(Mg_{0.5}Zn_{0.5})_2GeO_4$, $Zn(Al_{0.5}Ga_{0.5})_2O_4$, $Mg(Al_{0.5}Ga_{0.5})_2O_4$, "2ax MgO," and some alloys thereof.

Figure 88L:
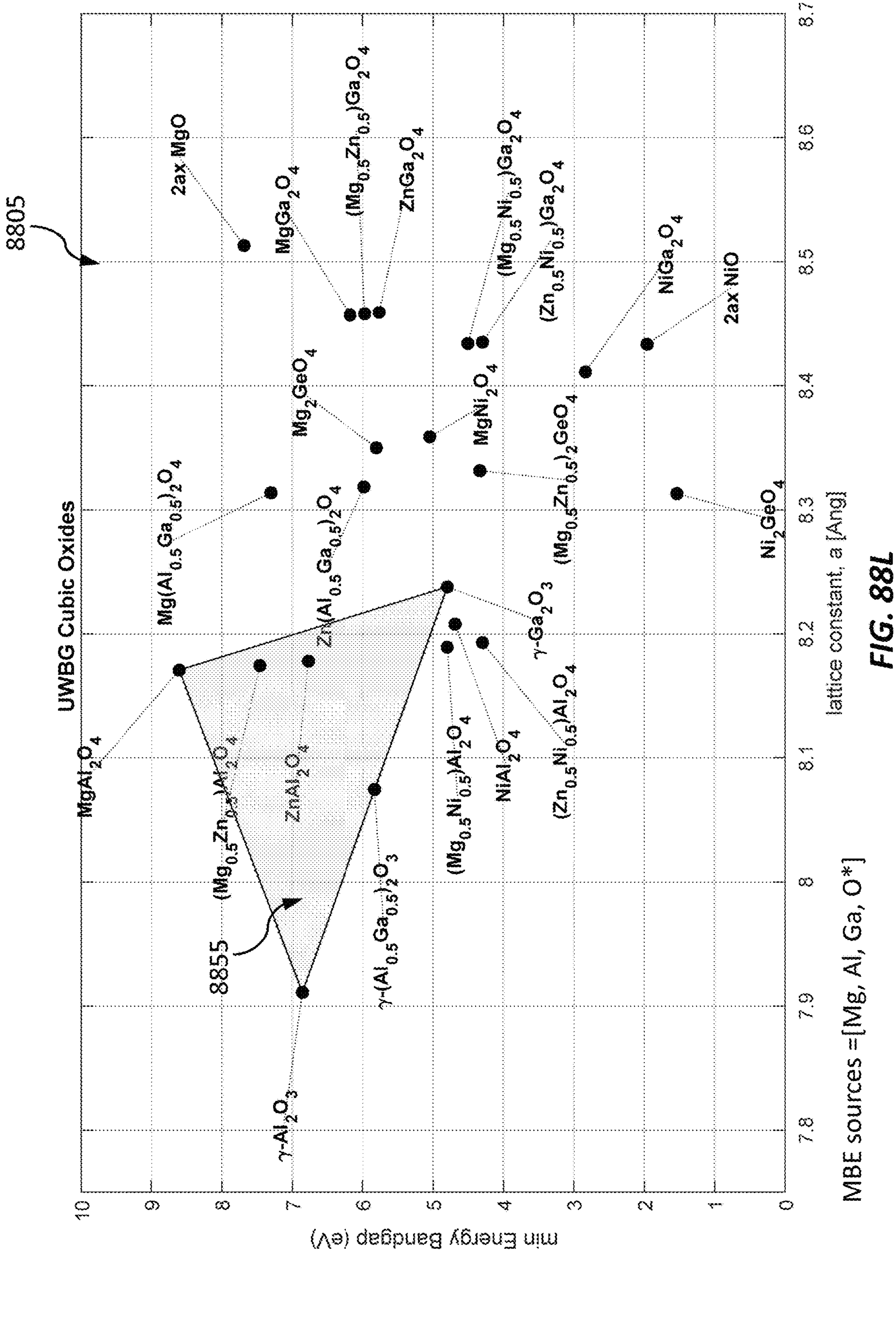

FIG. 88L shows the chart in FIG. 88A, with lines connecting a subset of epitaxial oxide materials including γ-$Ga_2O_3$, γ-$Al_2O_3$, $MgAl_2O_4$, $ZnAl_2O_4$, and some alloys thereof.

Figure 88M:
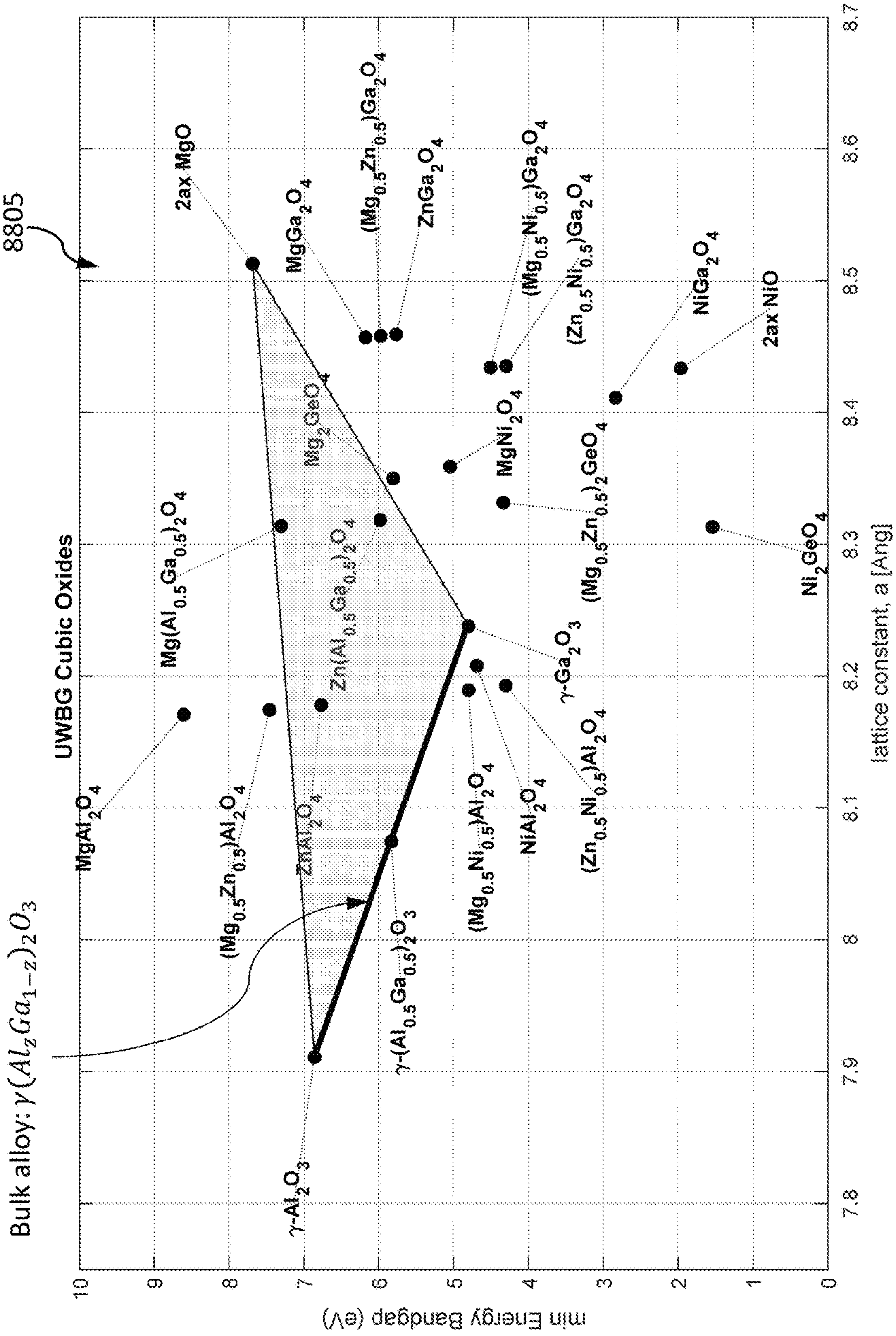

FIG. 88M shows the chart in FIG. 88A, with lines connecting a subset of epitaxial oxide materials including γ-$Ga_2O_3$, γ-$Al_2O_3$, $MgAl_2O_4$, $ZnAl_2O_4$, "2ax MgO," and some alloys thereof where the bulk alloy γ-$(Al_xGa_{1-x})_2O_3$ is shown along one of the lines.

Figure 88N:
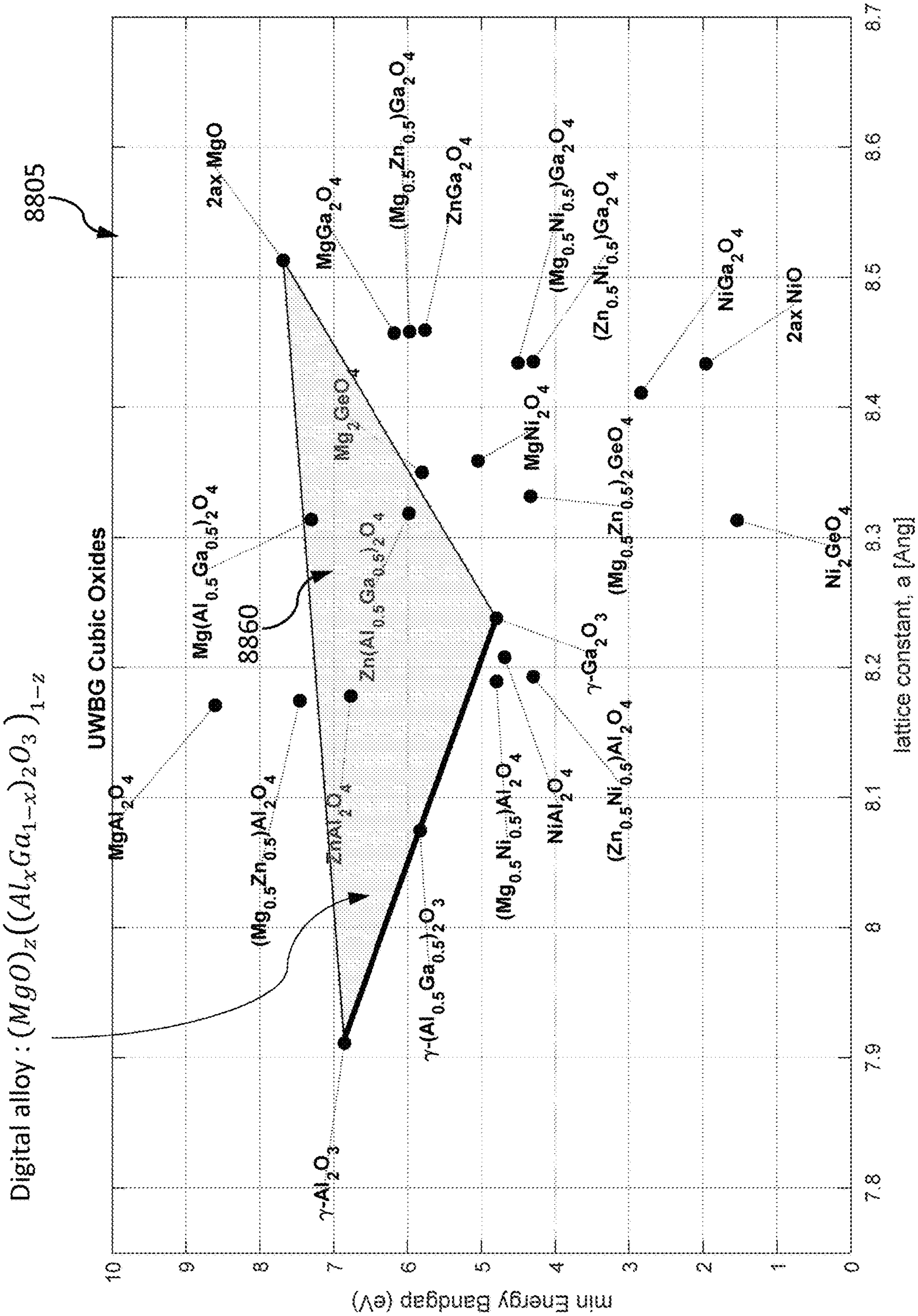

FIG. 88N shows the chart in FIG. 88A, with lines connecting a subset of epitaxial oxide materials including γ-$Ga_2O_3$, γ-$Al_2O_3$, $MgAl_2O_4$, $ZnAl_2O_4$, "2ax MgO," and some alloys thereof where the digital alloy compositions comprising layers of $(MgO)_z((Al_xGa_{1-x})_2O_3)_{1-z}$ materials are shown in the shaded region bounded by the lines.

Figure 88O:
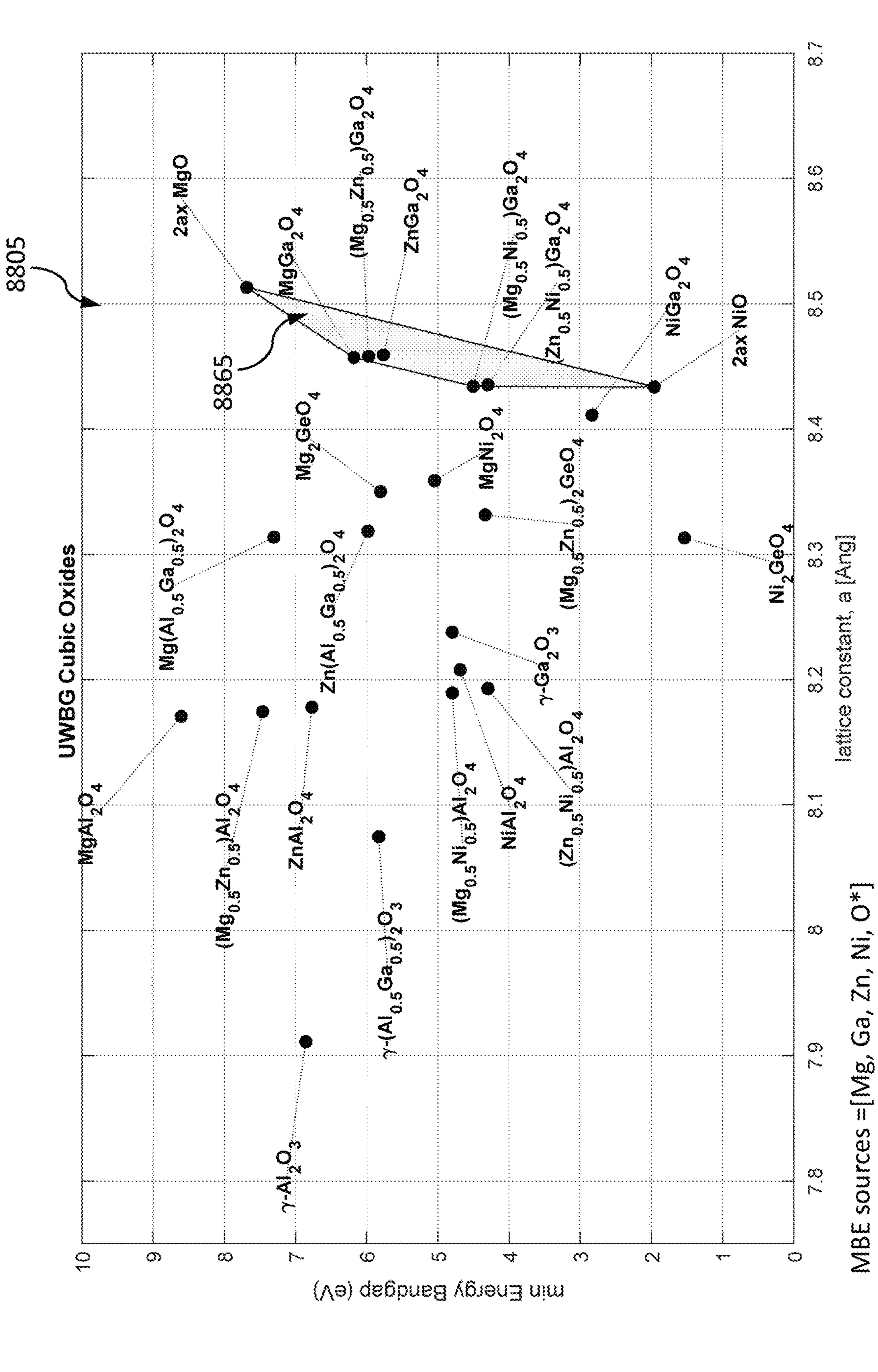

FIG. 88O shows the chart in FIG. 88A, with lines connecting a subset of epitaxial oxide materials including $MgGa_2O_4$, $ZnGa_2O_4$, $(Mg_{0.5}Zn_{0.5})Ga_2O_4$, $(Mg_{0.5}Ni_{0.5})Ga_2O_4$, $(Zn_{0.5}Ni_{0.5})Ga_2O_4$, "2ax NiO," "2ax MgO," and some alloys thereof.

Figure 89A:
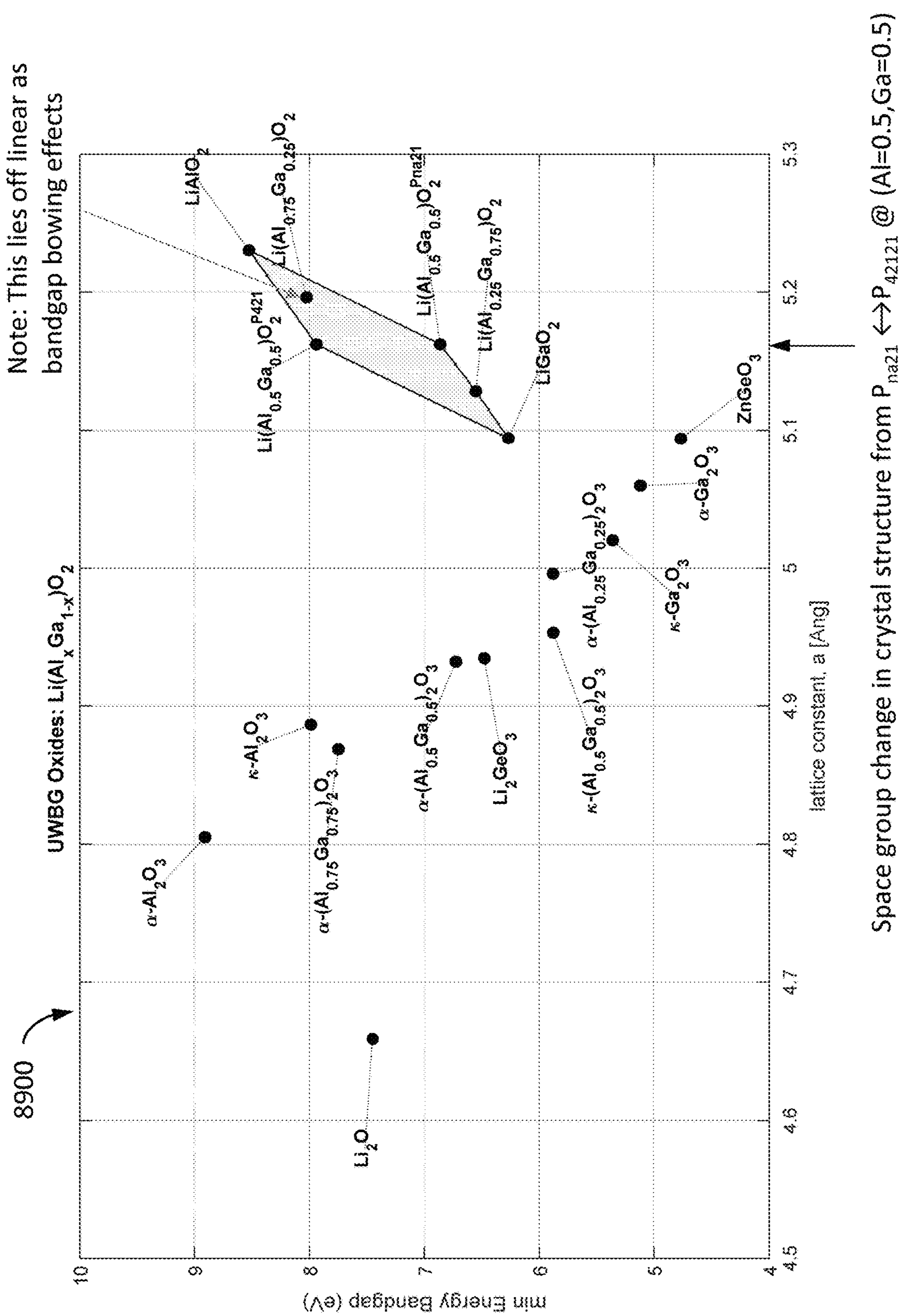

FIG. 89A shows a chart of some DFT calculated epitaxial oxide material bandgaps (minimum bandgap energies in eV) versus lattice constant, with lattice constants from approximately 4.5 Angstroms to 5.3 Angstroms and where the materials have non-cubic crystal symmetries, such as hexagonal and orthorhombic crystal symmetries.

FIG. 89B shows a table of DFT calculated $Li(Al_xGa_{1-x})O_2$ film properties (space group ("SG"), lattice constants ("a" and "b") in Angstroms, and percentage lattice mismatch ("% Δa" and "% Δb") between a $LiGaO_2$ film and the possible substrates ("sub") listed.

Figure 90A:
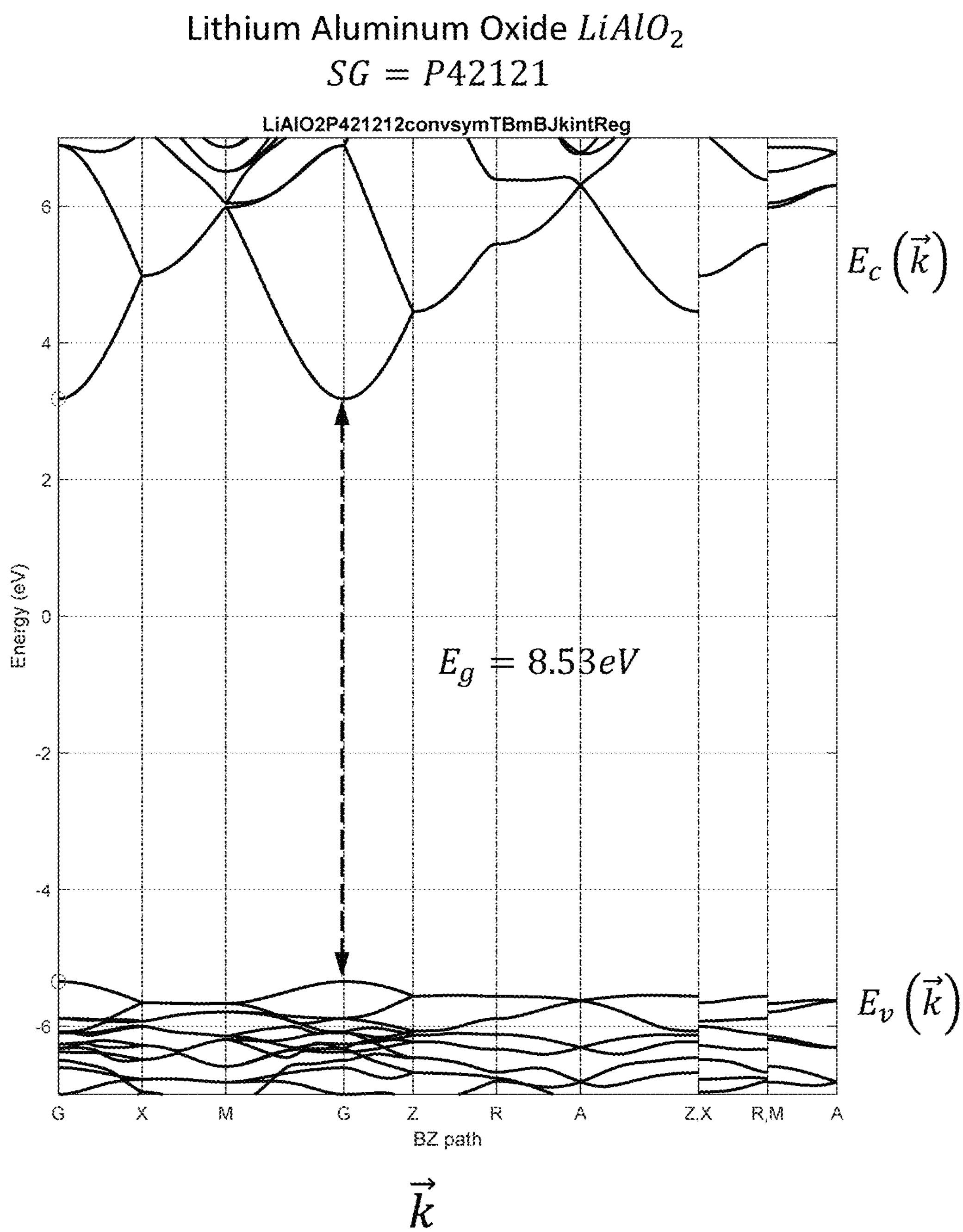

FIG. 90A shows a calculated energy-crystal momentum (E-k) dispersion plot in the vicinity of the Brillouin-zone center for $LiAlO_2$ with a P41212 space group.

Figure 90B:
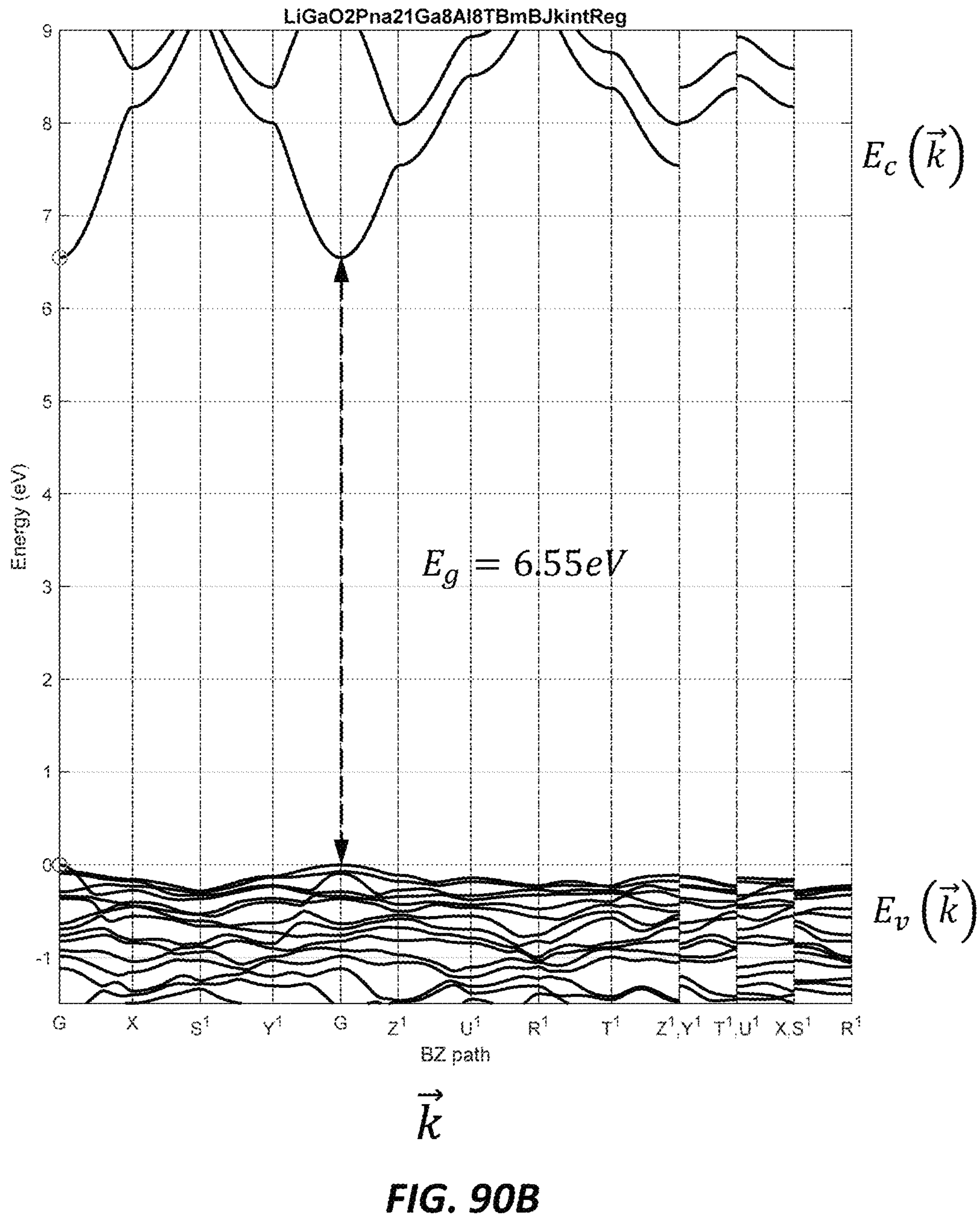

FIG. 90B shows a calculated energy-crystal momentum (E-k) dispersion plot in the vicinity of the Brillouin-zone center for $Li(Al_{0.5}Ga_{0.5})O_2$ with a Pna21 space group.

Figure 90C:
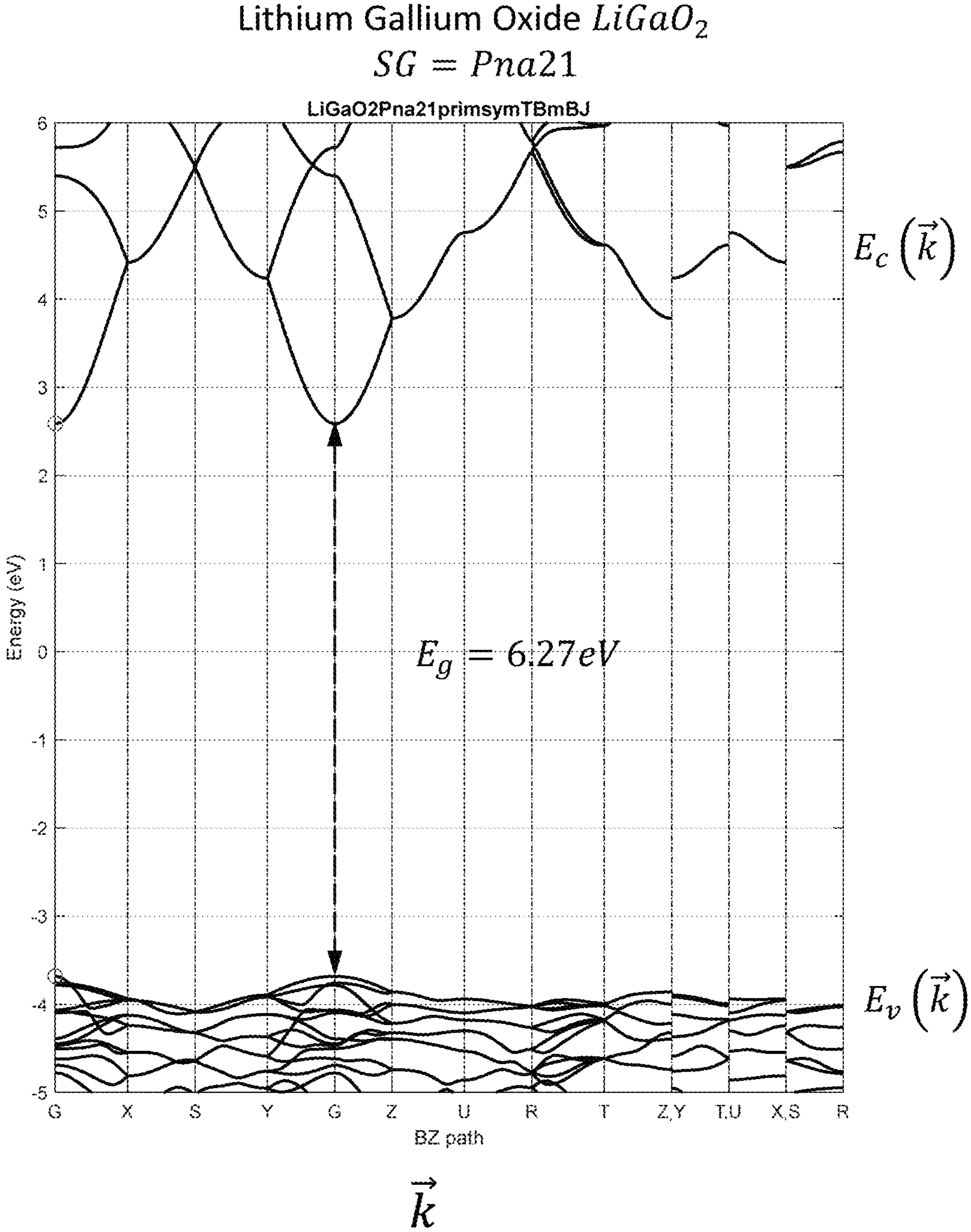

FIG. 90C shows a calculated energy-crystal momentum (E-k) dispersion plot in the vicinity of the Brillouin-zone center for $LiGaO_2$ with a Pna21 space group.

Figure 90D:
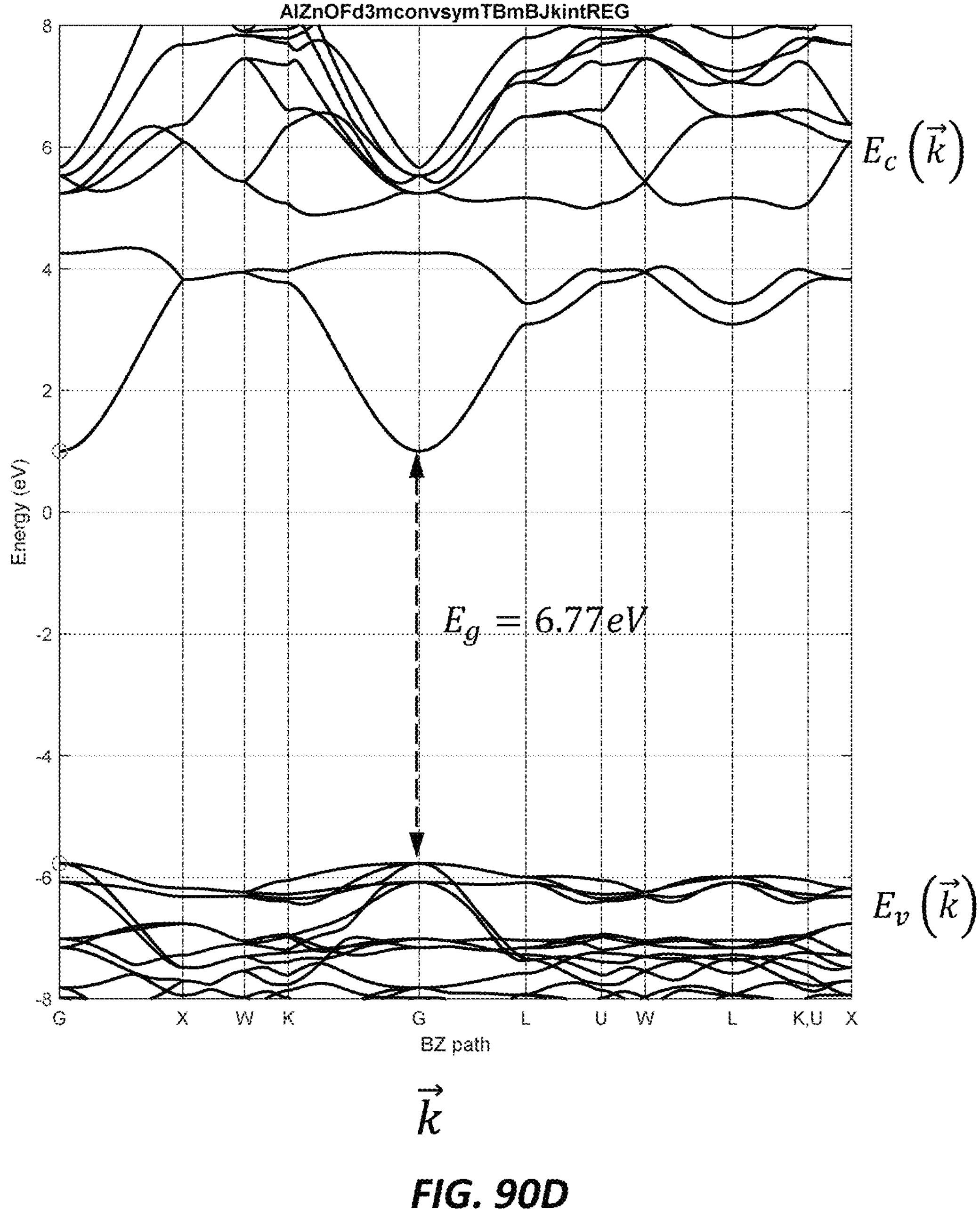

FIG. 90D shows a calculated energy-crystal momentum (E-k) dispersion plot in the vicinity of the Brillouin-zone center for $ZnAl_2O_4$ with a Fd3m space group.

Figure 90E:
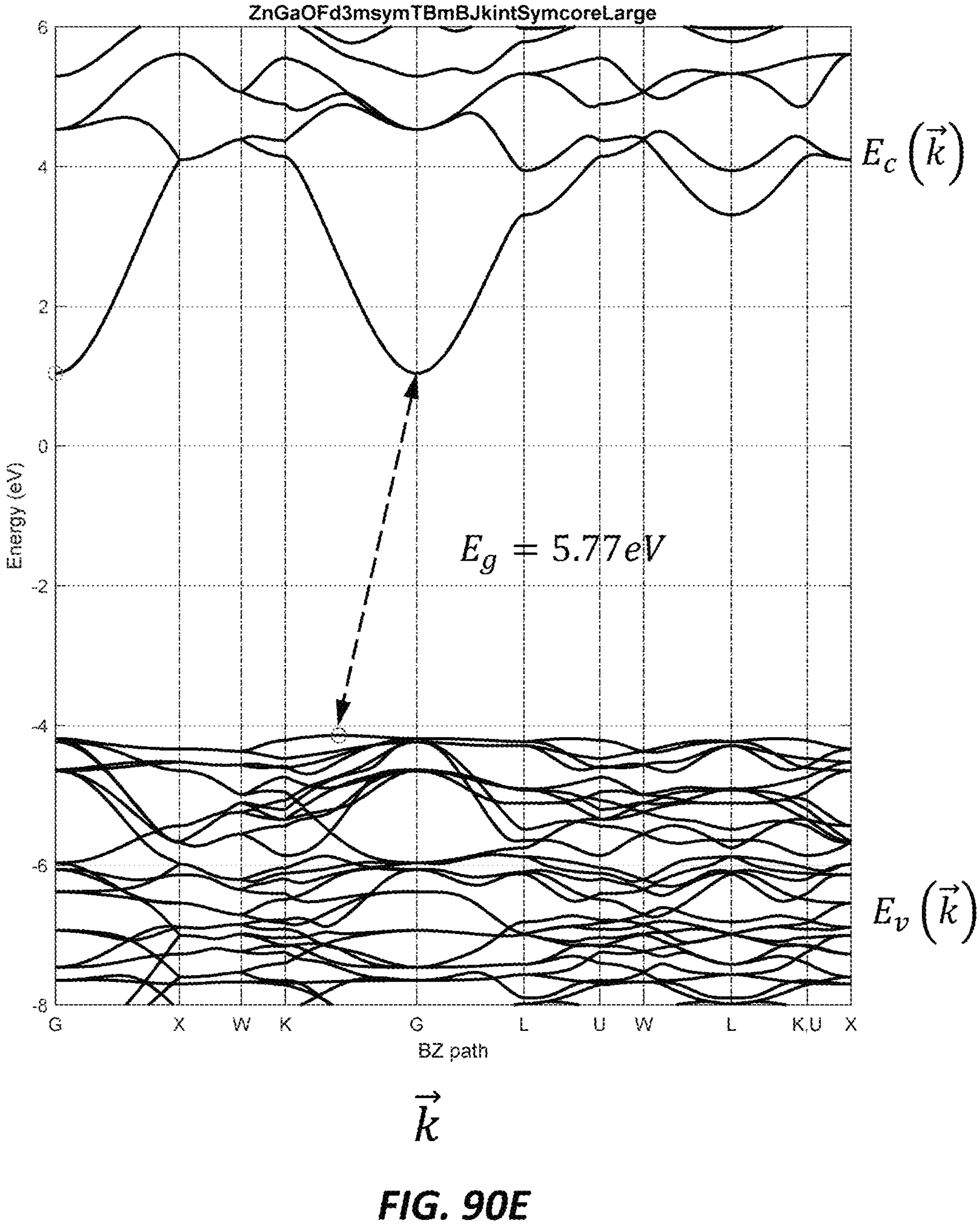

FIG. 90E shows a calculated energy-crystal momentum (E-k) dispersion plot in the vicinity of the Brillouin-zone center for $ZnGa_2O_4$with a Fd3m space group.

Figure 90F:
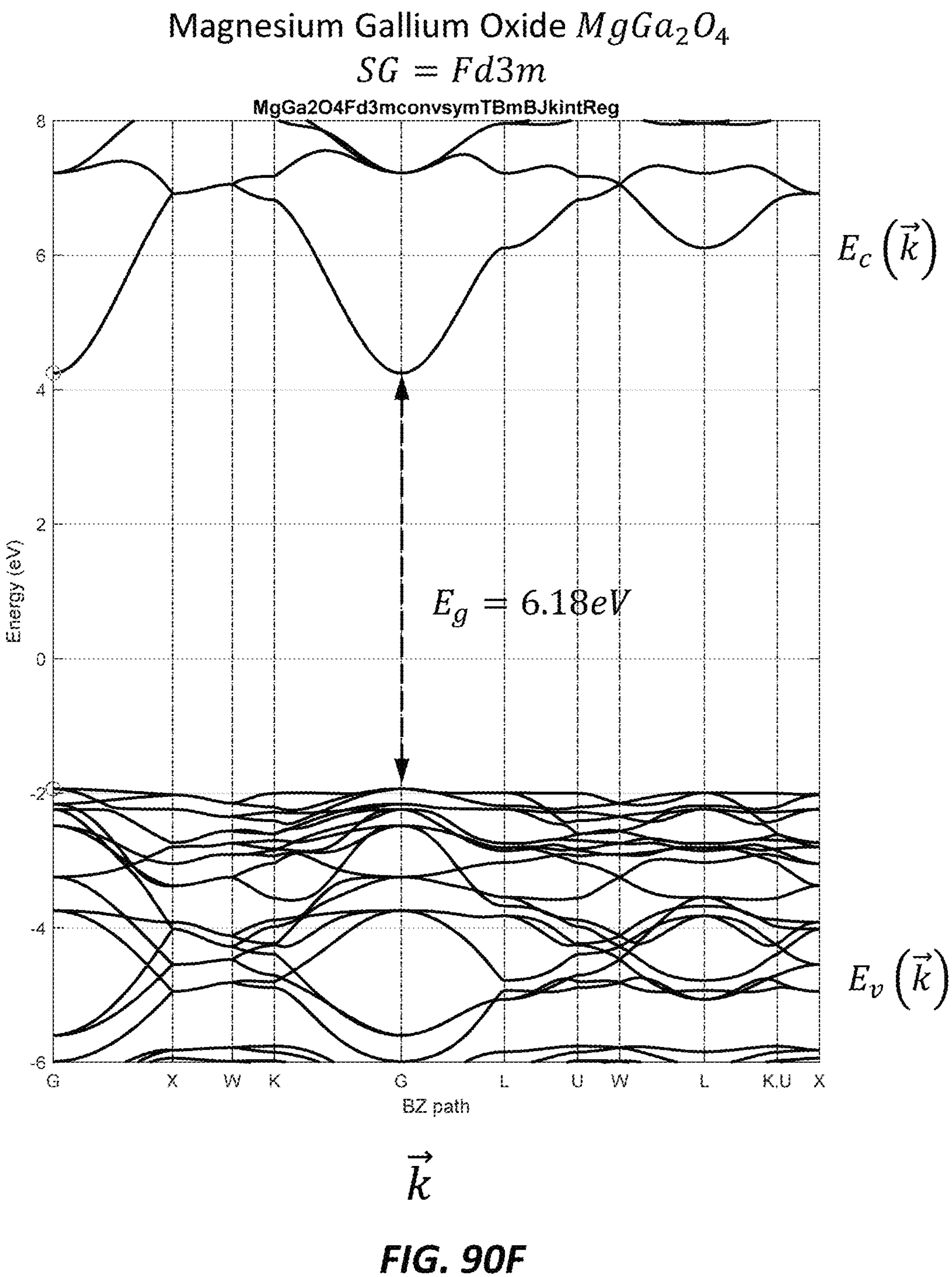

FIG. 90F shows a calculated energy-crystal momentum (E-k) dispersion plot in the vicinity of the Brillouin-zone center for $MgGa_2O_4$ with a Fd3m space group.

Figure 90G:
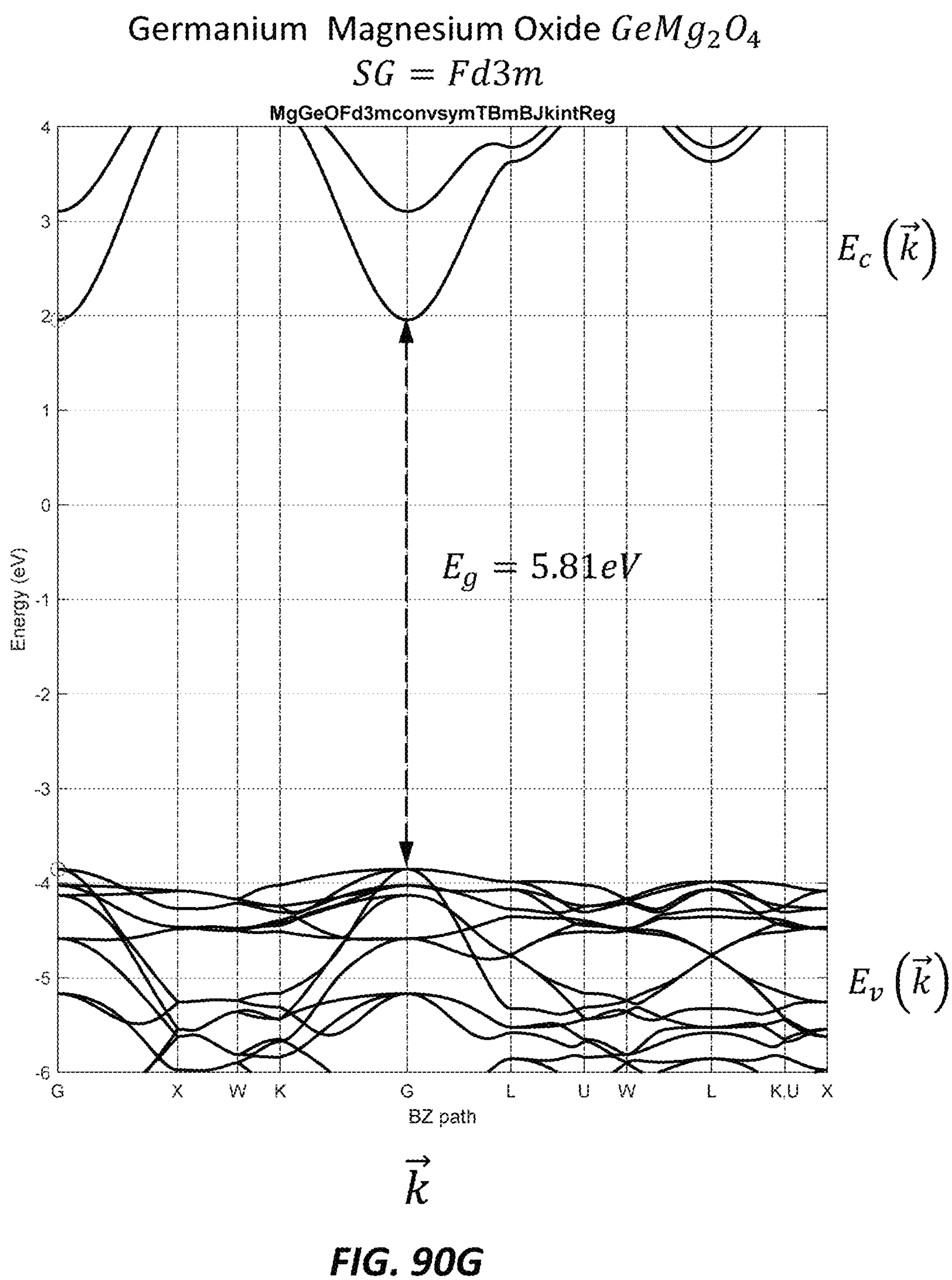

FIG. 90G shows a calculated energy-crystal momentum (E-k) dispersion plot in the vicinity of the Brillouin-zone center for $GeMg_2O_4$ with a Fd3m space group.

Figure 90H:
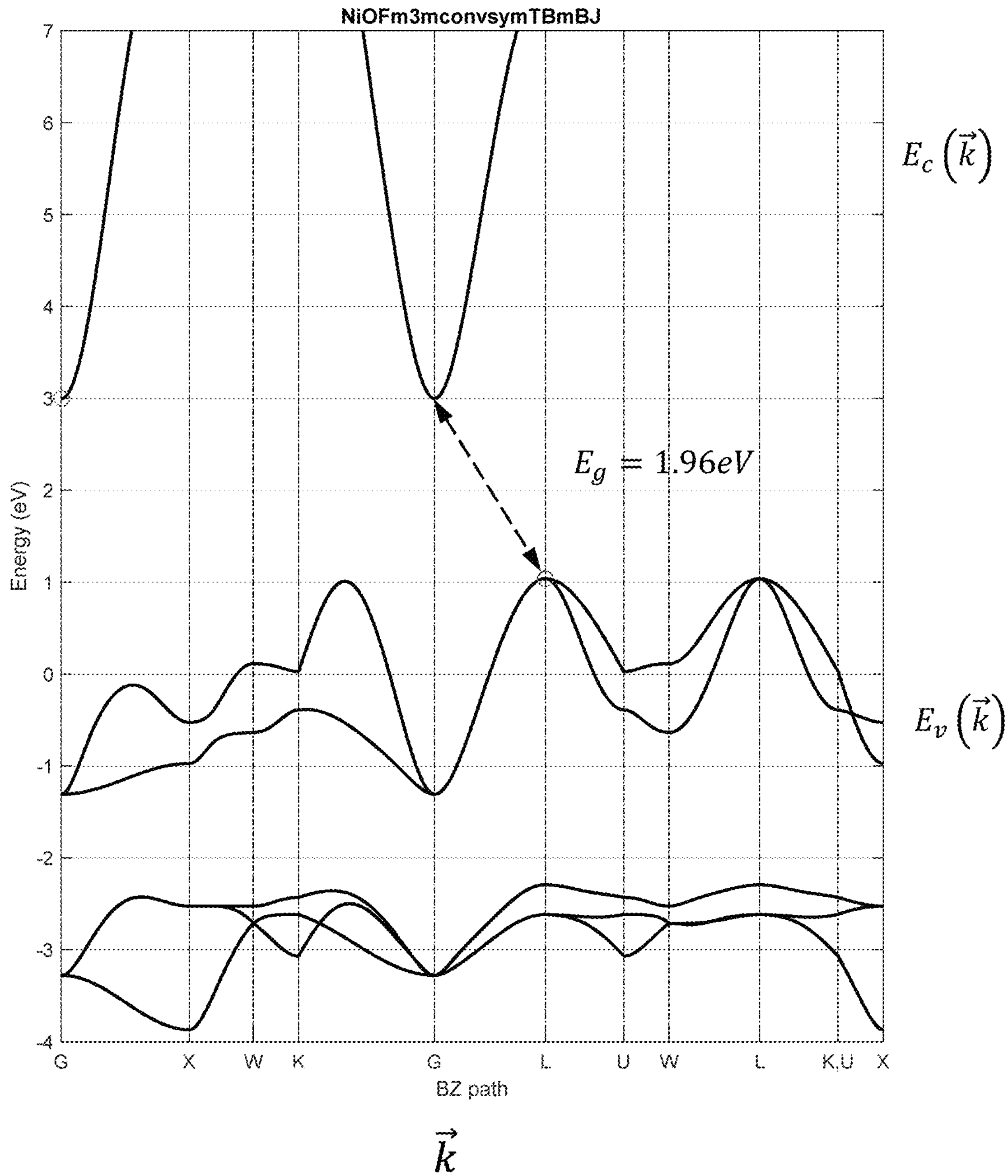

FIG. 90H shows a calculated energy-crystal momentum (E-k) dispersion plot in the vicinity of the Brillouin-zone center for NiO with a Fm3m space group.

Figure 90I:
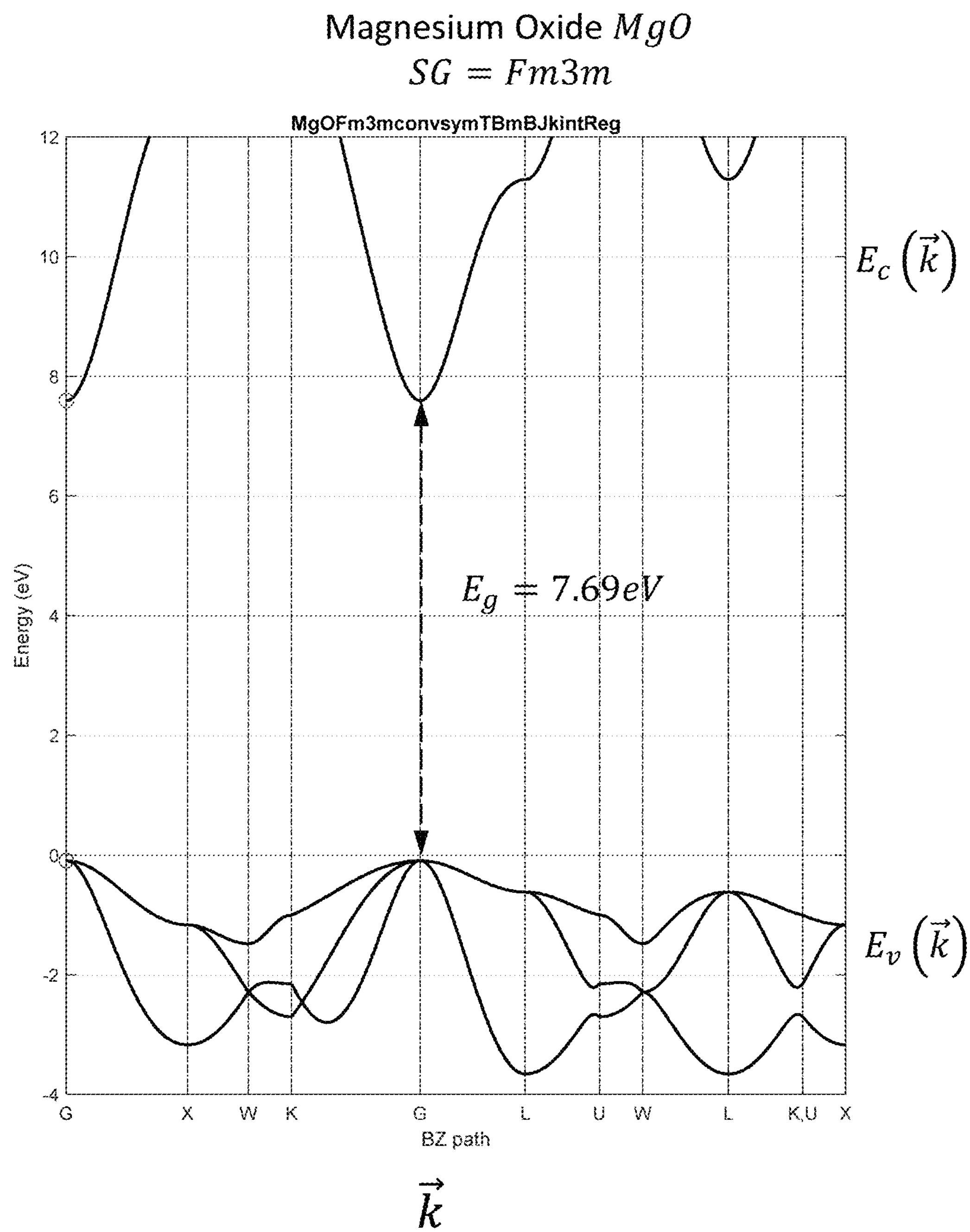

FIG. 90I shows a calculated energy-crystal momentum (E-k) dispersion plot in the vicinity of the Brillouin-zone center for MgO with a Fm3m space group.

Figure 90J:
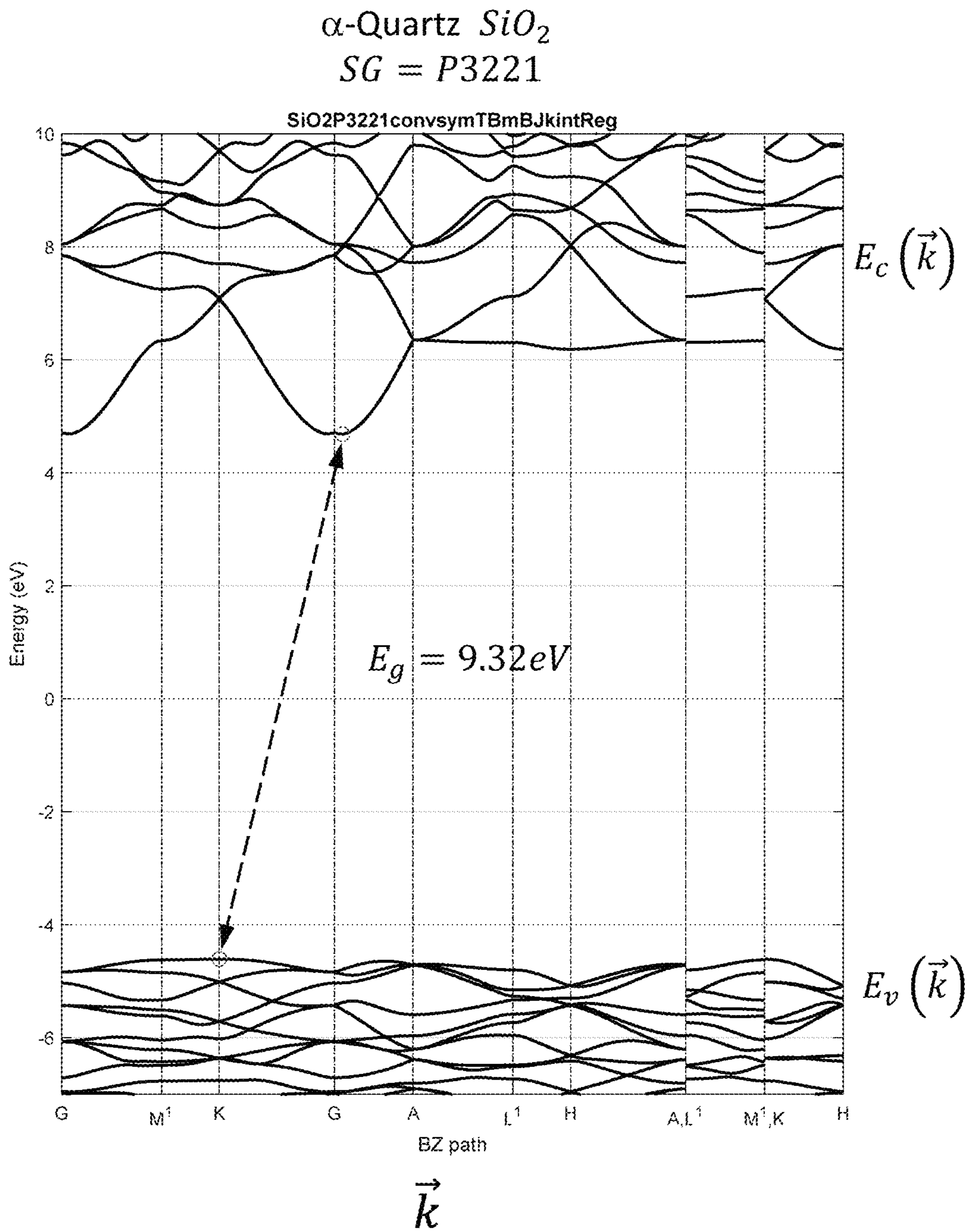

FIG. 90J shows a calculated energy-crystal momentum (E-k) dispersion plot in the vicinity of the Brillouin-zone center for $SiO_2$ with a P3221 space group.

Figure 90K:
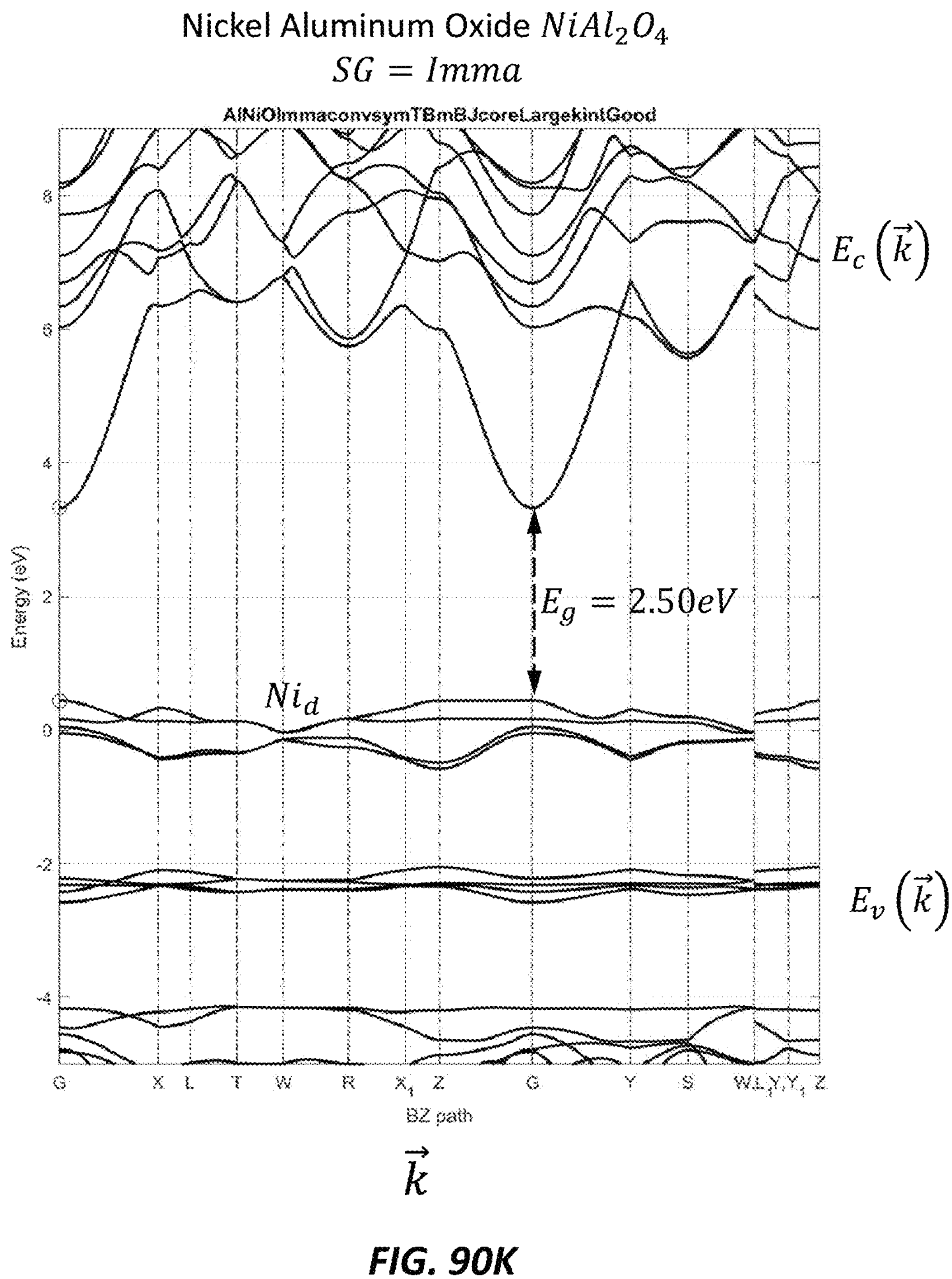

FIG. 90K shows a calculated energy-crystal momentum (E-k) dispersion plot in the vicinity of the Brillouin-zone center for $NiAl_2O_4$ with a Imma space group.

Figure 90L:
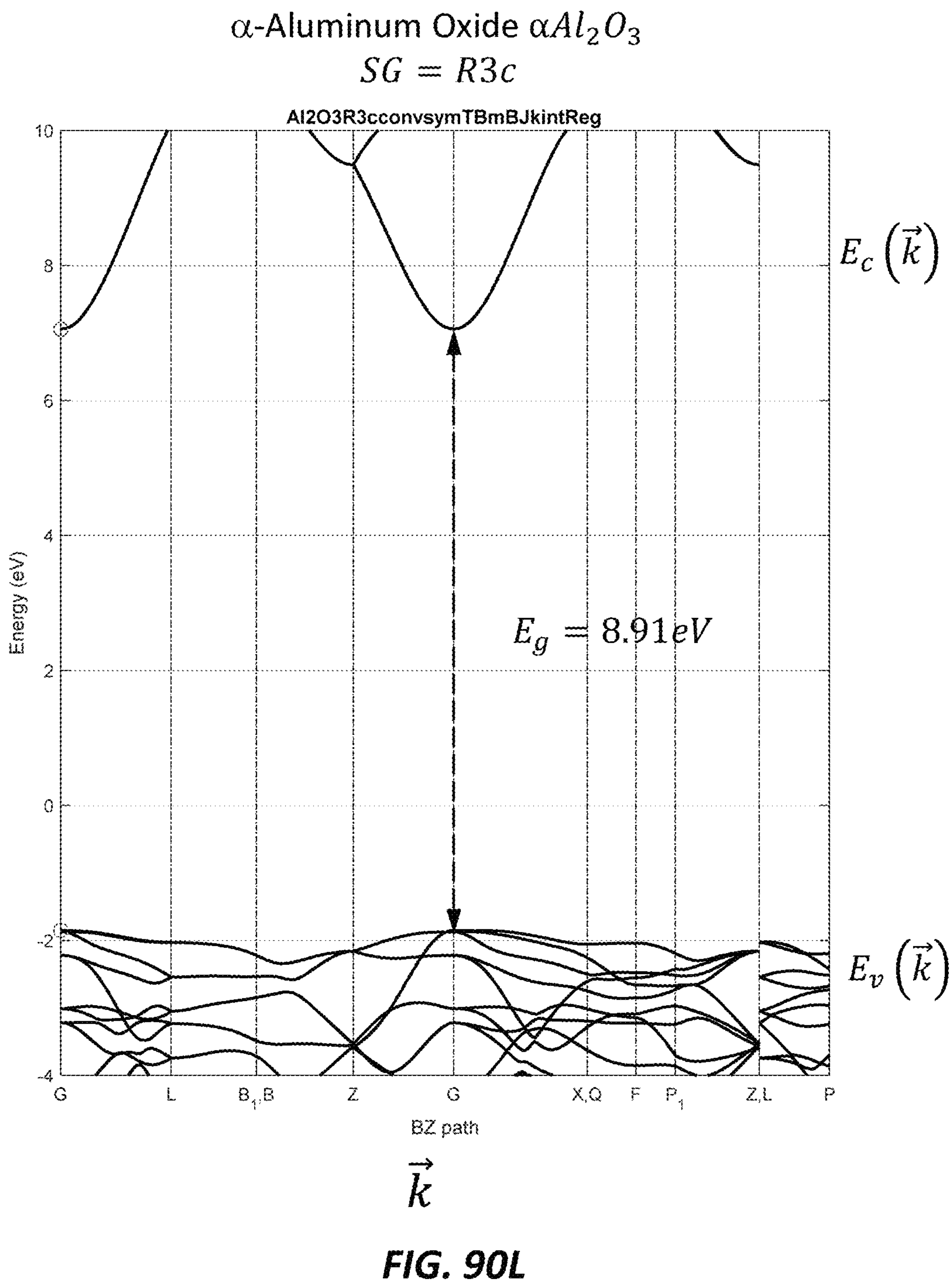

FIG. 90L shows a calculated energy-crystal momentum (E-k) dispersion plot in the vicinity of the Brillouin-zone center for $\alpha Al_2O_3$ with a R3c space group.

Figure 90M:
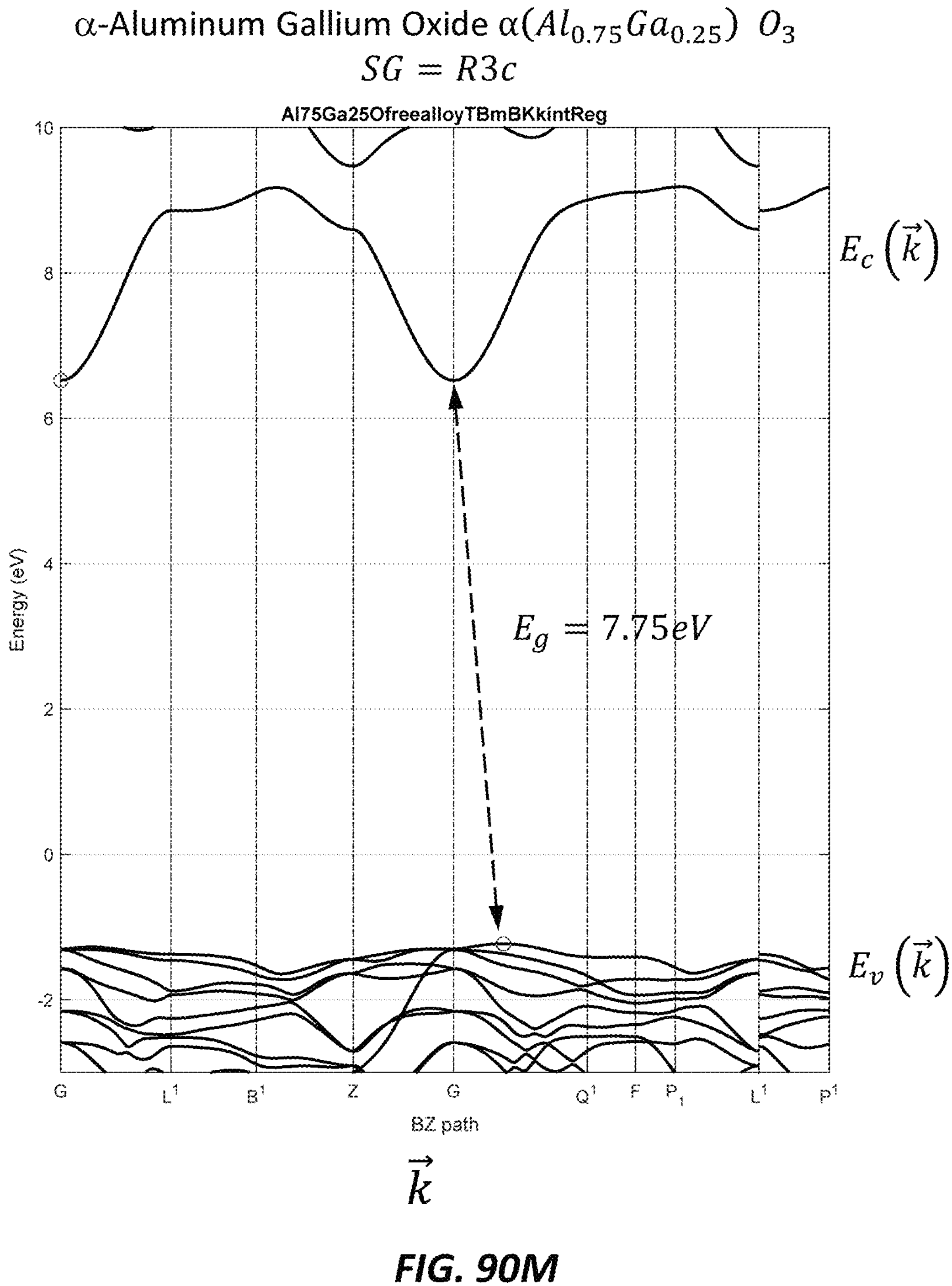

FIG. 90M shows a calculated energy-crystal momentum (E-k) dispersion plot in the vicinity of the Brillouin-zone center for $\alpha(Al_{0.75}Ga_{0.25})_2O_3$ with a R3c space group.

Figure 90N:
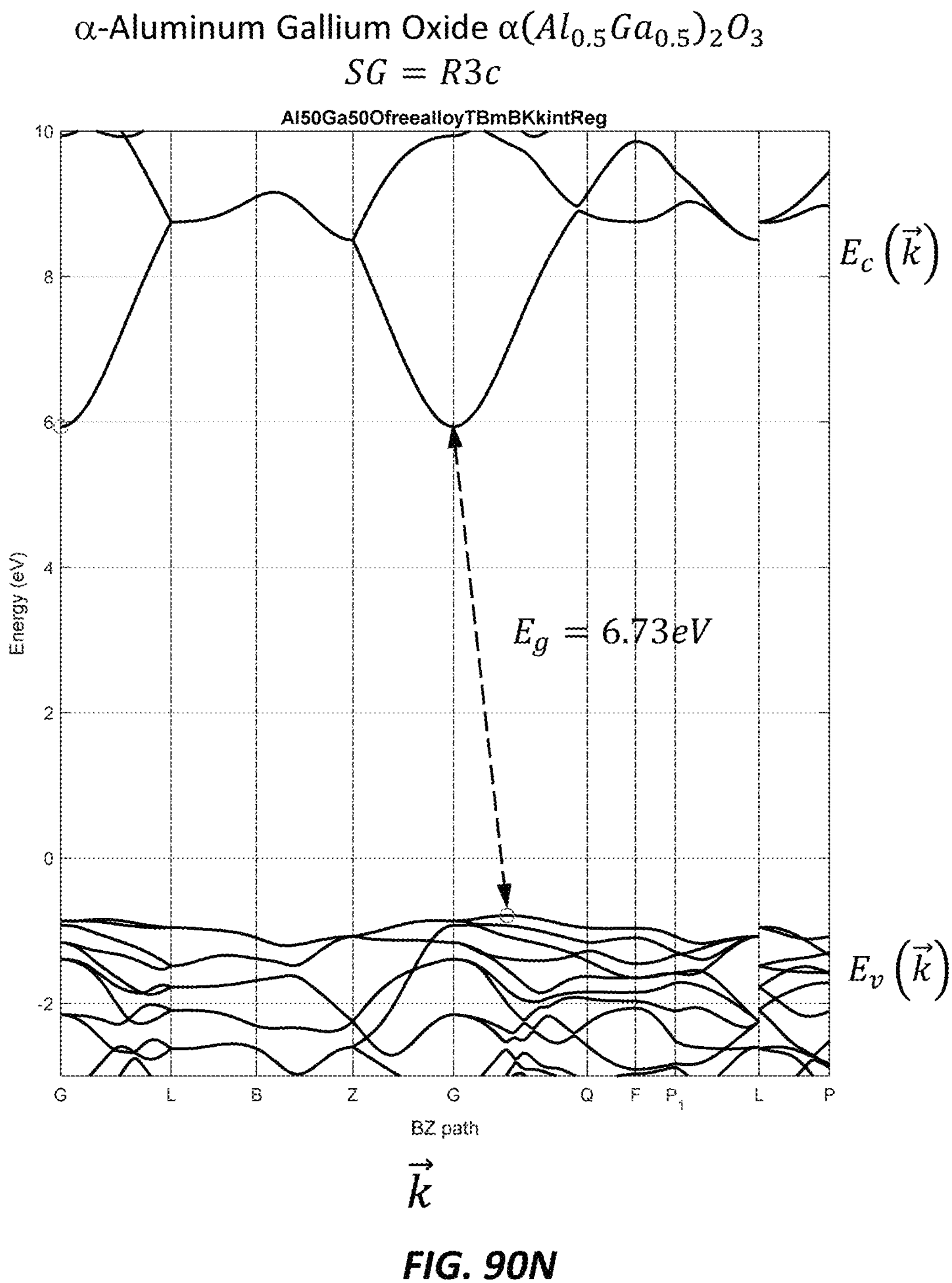

FIG. 90N shows a calculated energy-crystal momentum (E-k) dispersion plot in the vicinity of the Brillouin-zone center for $\alpha(Al_{0.5}Ga_{0.5})_2O_3$ with a R3c space group.

Figure 90O:
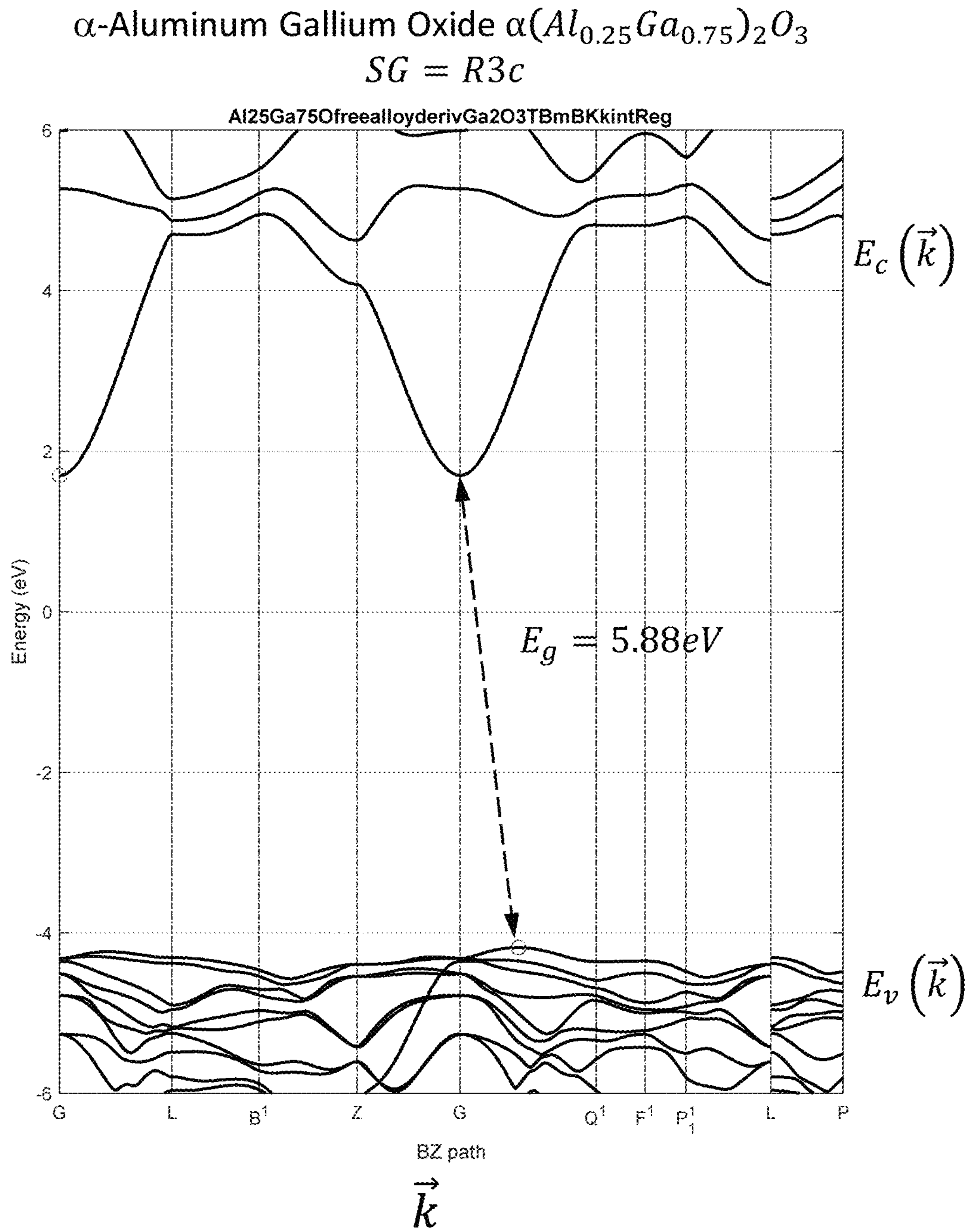

FIG. 90O shows a calculated energy-crystal momentum (E-k) dispersion plot in the vicinity of the Brillouin-zone center for $\alpha(Al_{0.25}Ga_{0.75})_2O_3$ with a R3c space group.

Figure 90P:
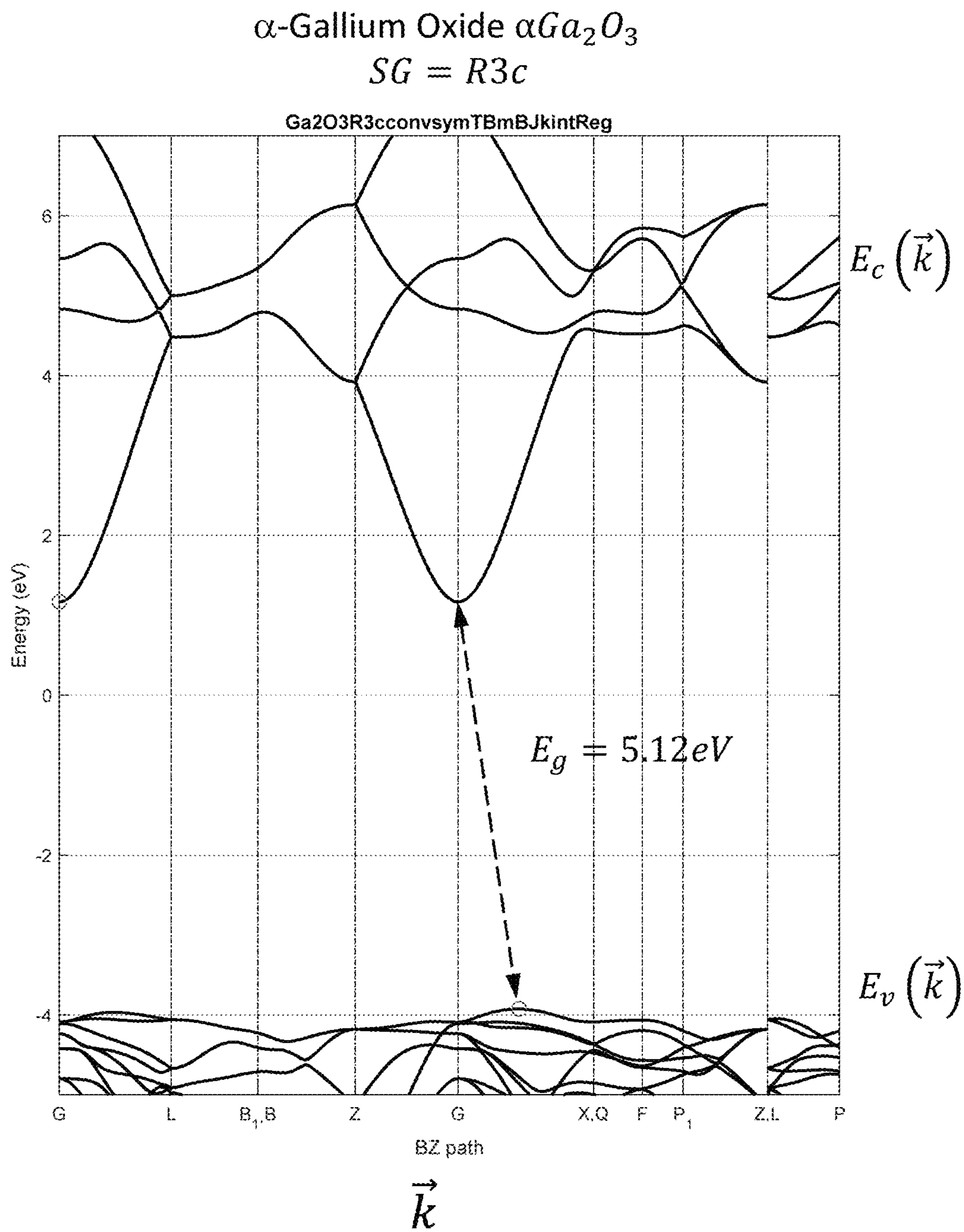

FIG. 90P shows a calculated energy-crystal momentum (E-k) dispersion plot in the vicinity of the Brillouin-zone center for $\alpha Ga_2O_3$ with a R3c space group.

Figure 90Q:
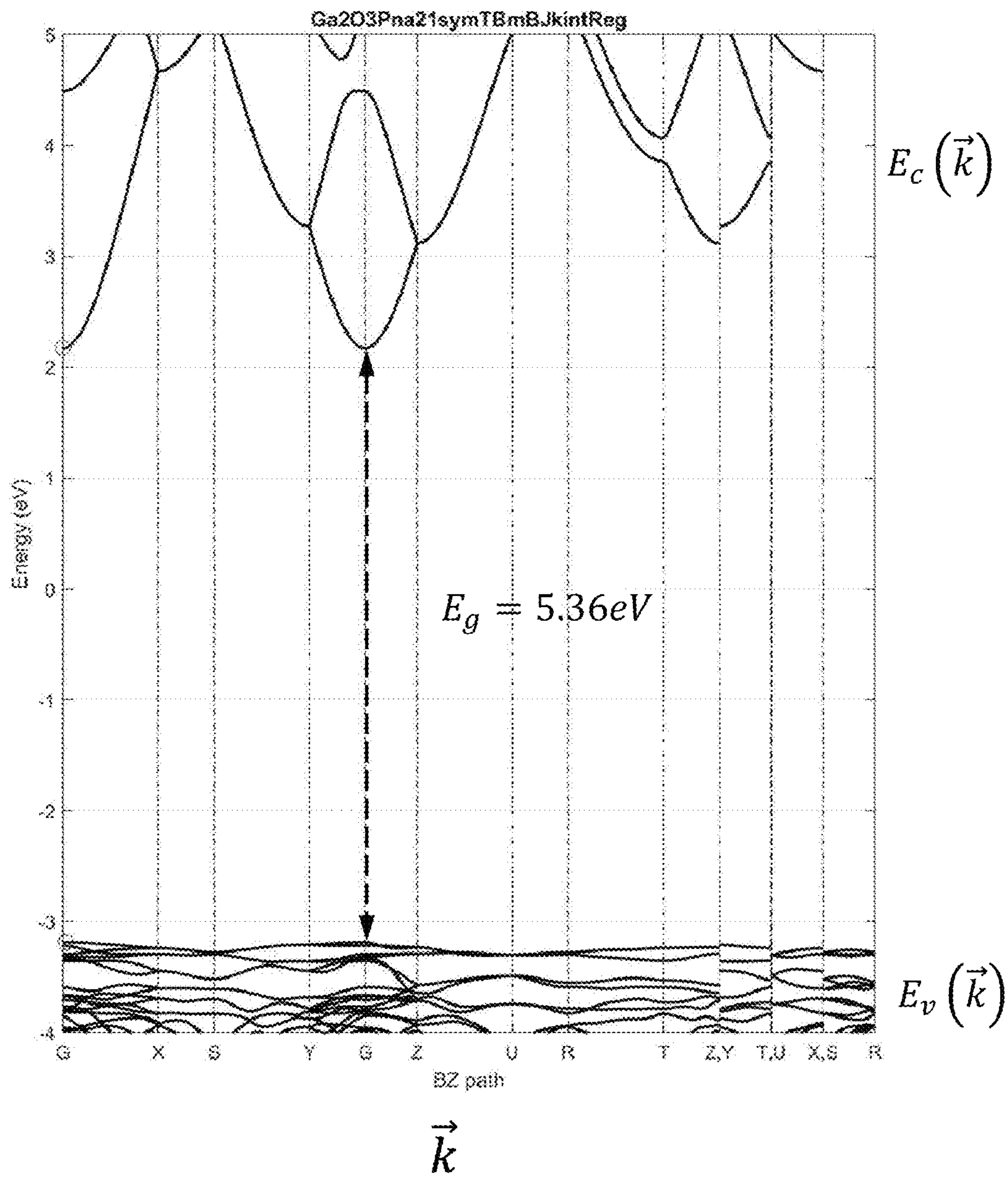

FIG. 90Q shows a calculated energy-crystal momentum (E-k) dispersion plot in the vicinity of the Brillouin-zone center for $\kappa Ga_2O_3$ with a Pna21 space group.

Figure 90R:
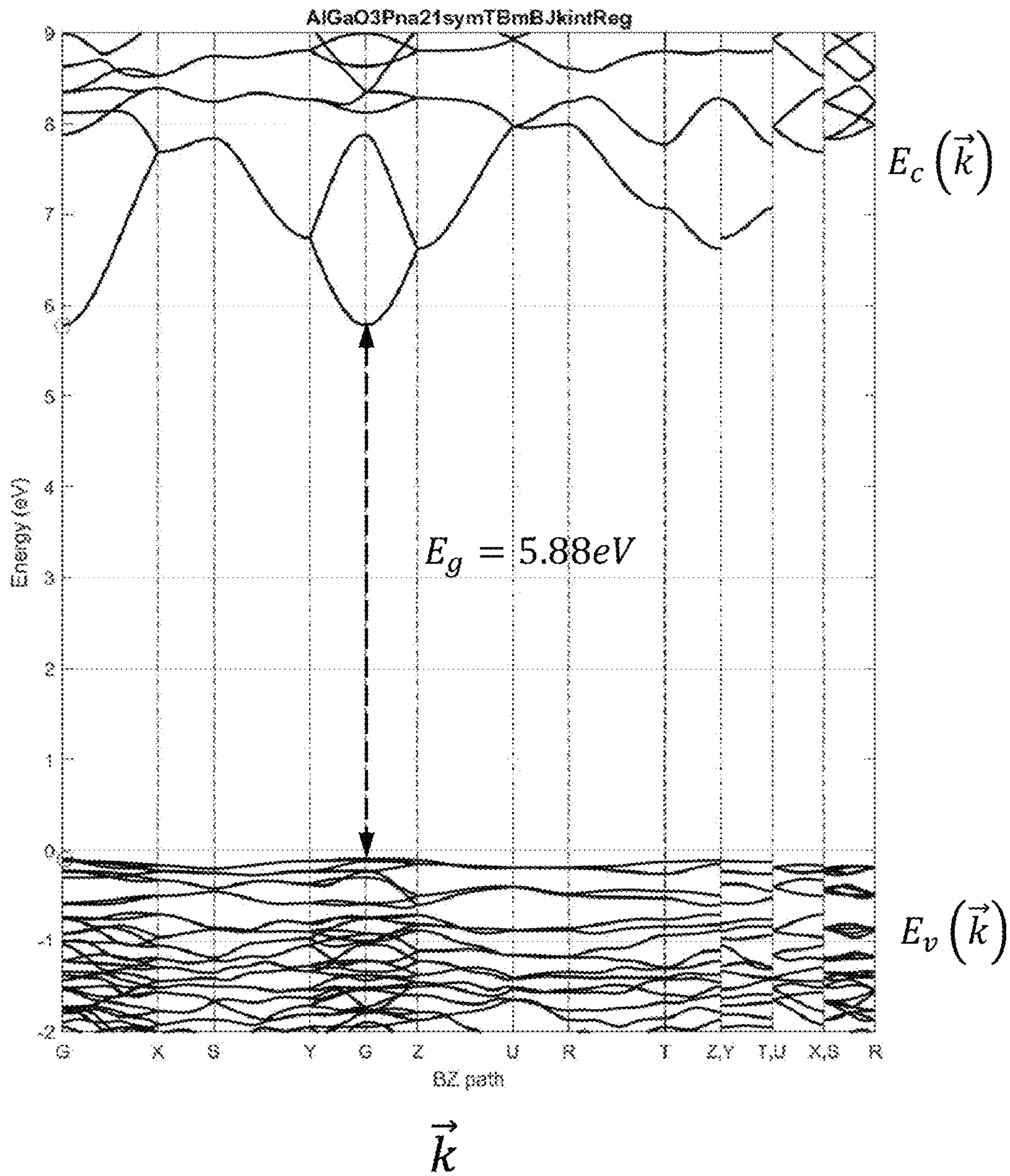

FIG. 90R shows a calculated energy-crystal momentum (E-k) dispersion plot in the vicinity of the Brillouin-zone center for $\kappa(Al_{0.5}Ga_{0.5})_2O_3$ with a Pna21 space group.

Figure 90S:
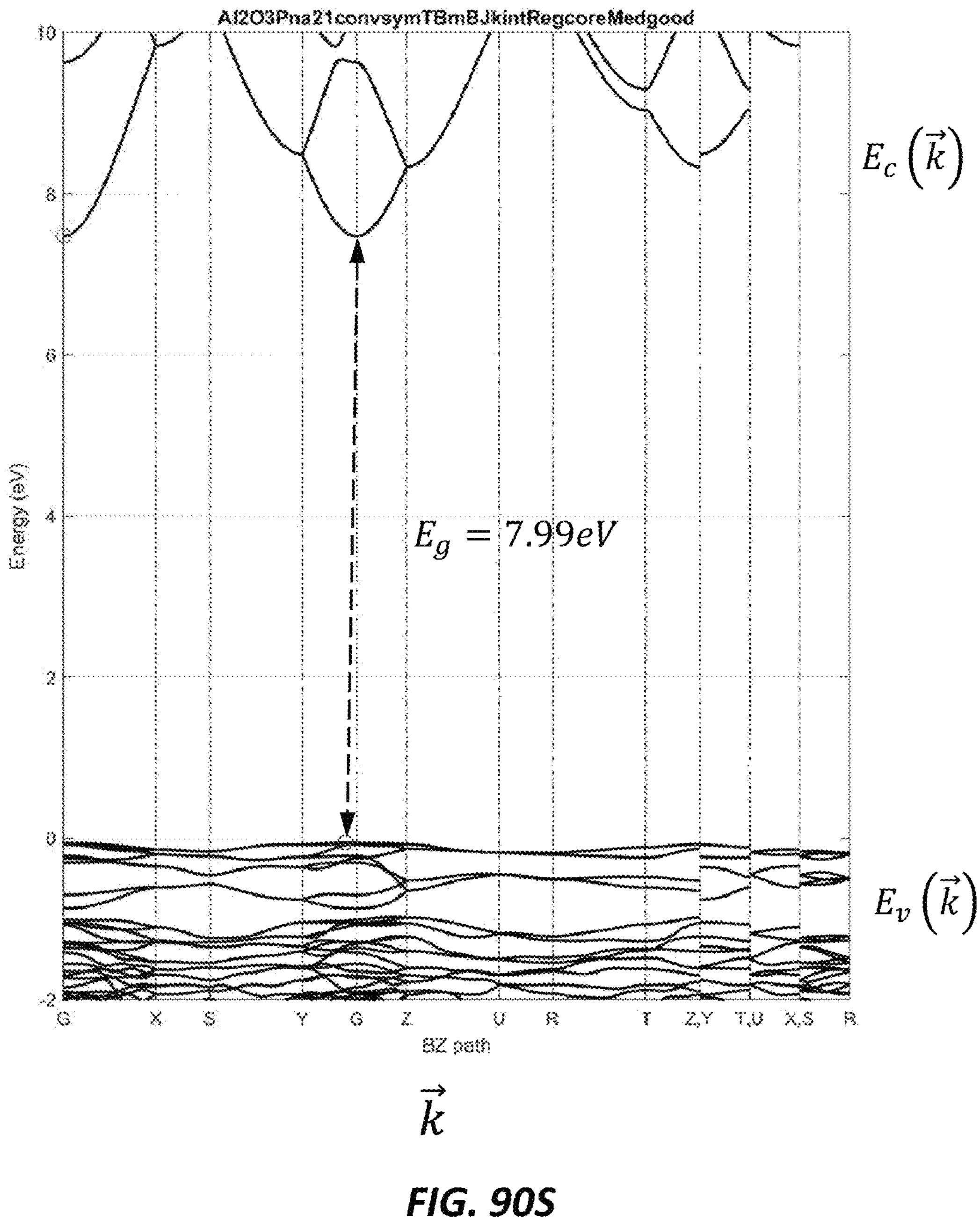

FIG. 90S shows a calculated energy-crystal momentum (E-k) dispersion plot in the vicinity of the Brillouin-zone center for $\kappa Al_2O_3$ with a Pna21 space group.

Figure 90T:
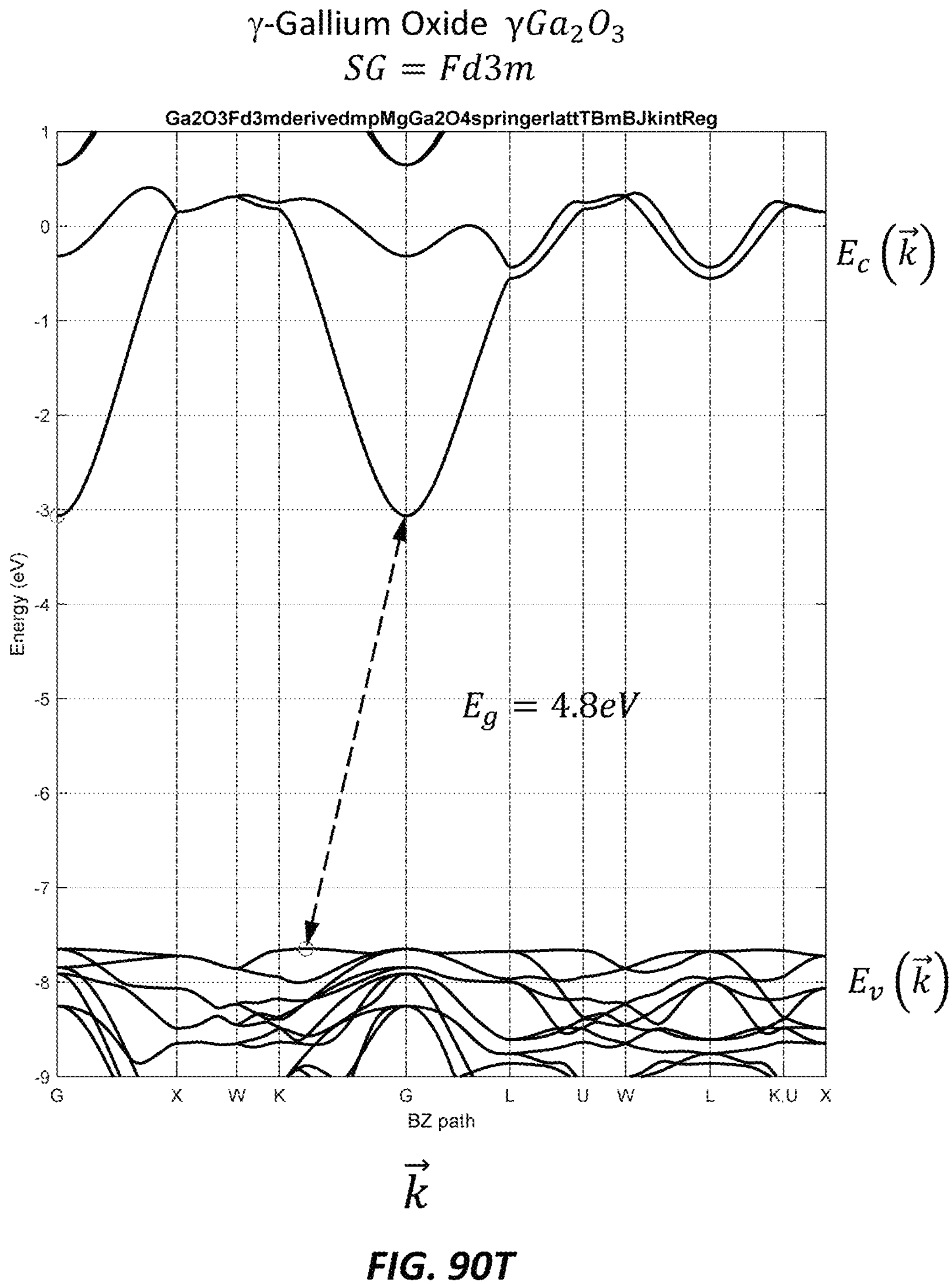

FIG. 90T shows a calculated energy-crystal momentum (E-k) dispersion plot in the vicinity of the Brillouin-zone center for $\gamma Ga_2O_3$ with a Fd3m space group.

Figure 90U:
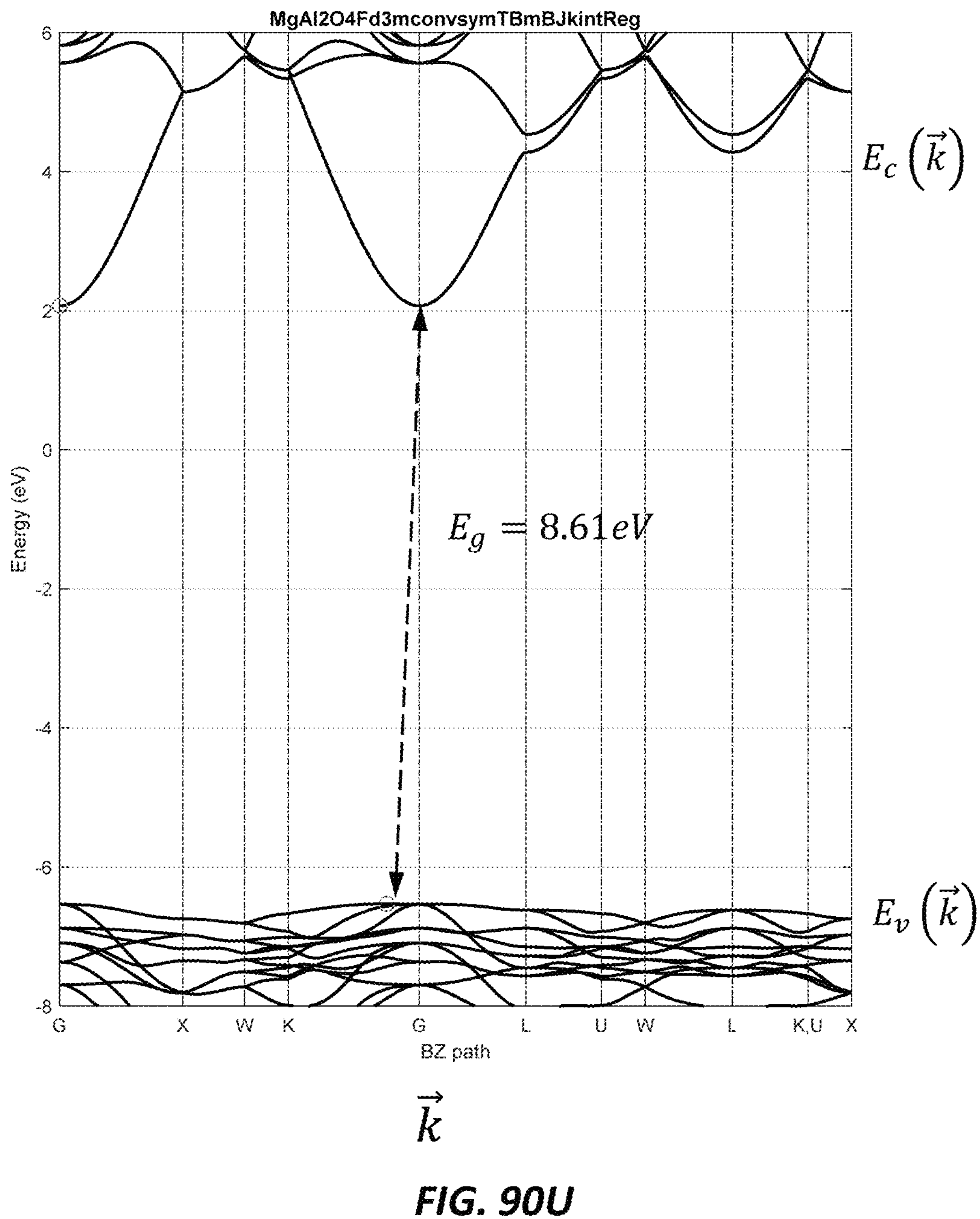

FIG. 90U shows a calculated energy-crystal momentum (E-k) dispersion plot in the vicinity of the Brillouin-zone center for $MgAl_2O_4$ with a Fd3m space group.

Figure 90V:
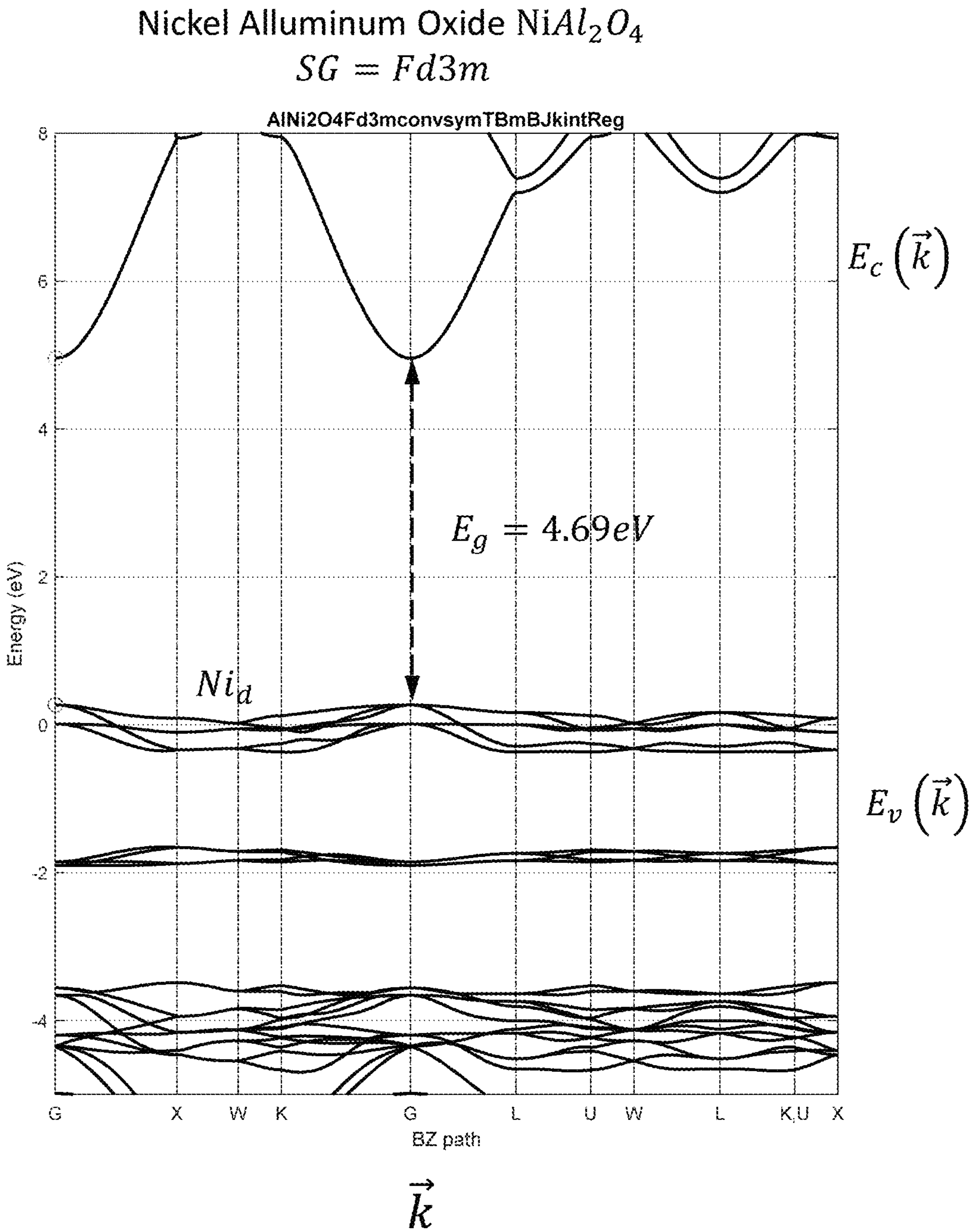

FIG. 90V shows a calculated energy-crystal momentum (E-k) dispersion plot in the vicinity of the Brillouin-zone center for $NiAl_2O_4$ with a Fd3m space group.

Figure 90W:
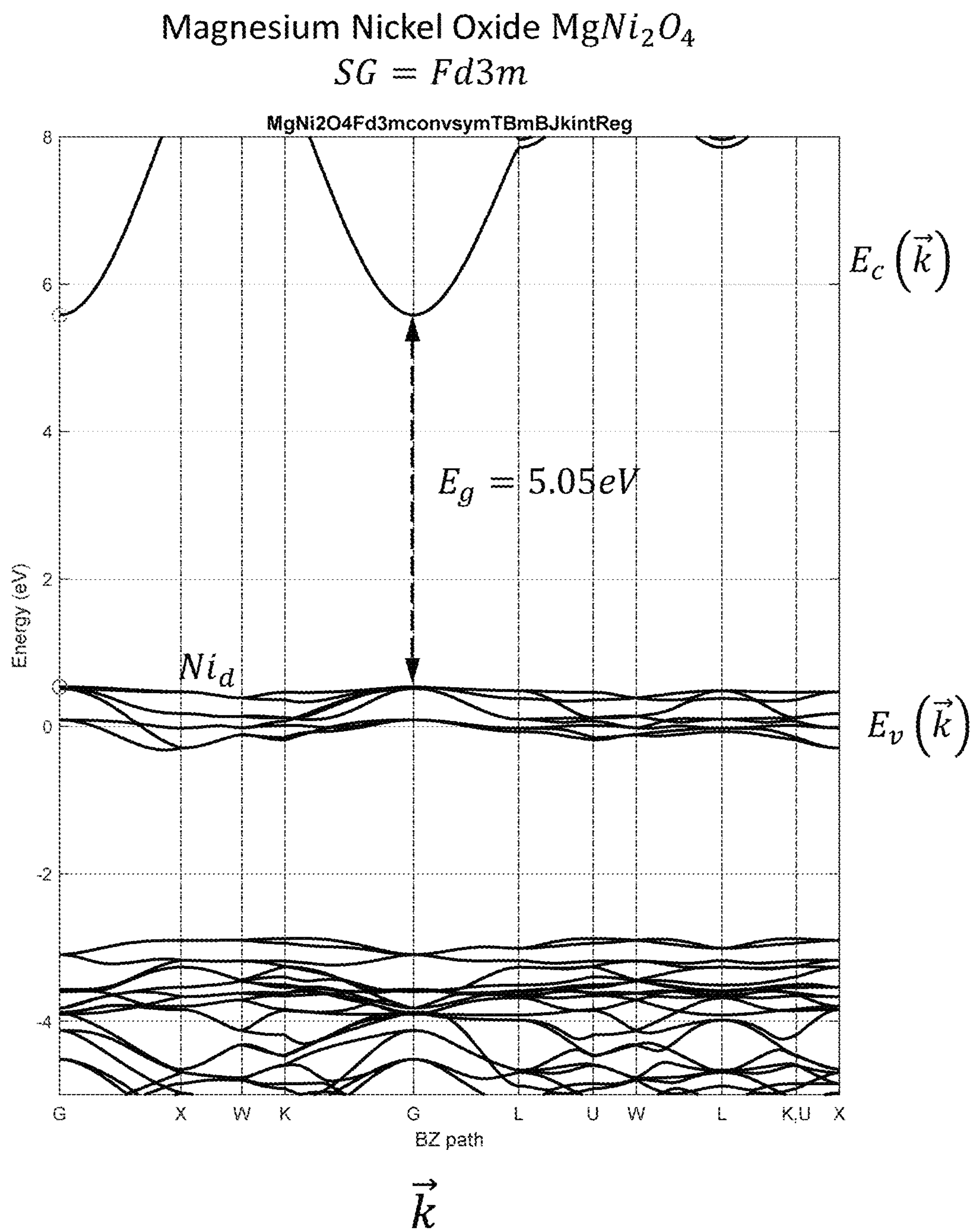

FIG. 90W shows a calculated energy-crystal momentum (E-k) dispersion plot in the vicinity of the Brillouin-zone center for $MgNi_2O_4$ with a Fd3m space group.

Figure 90X:
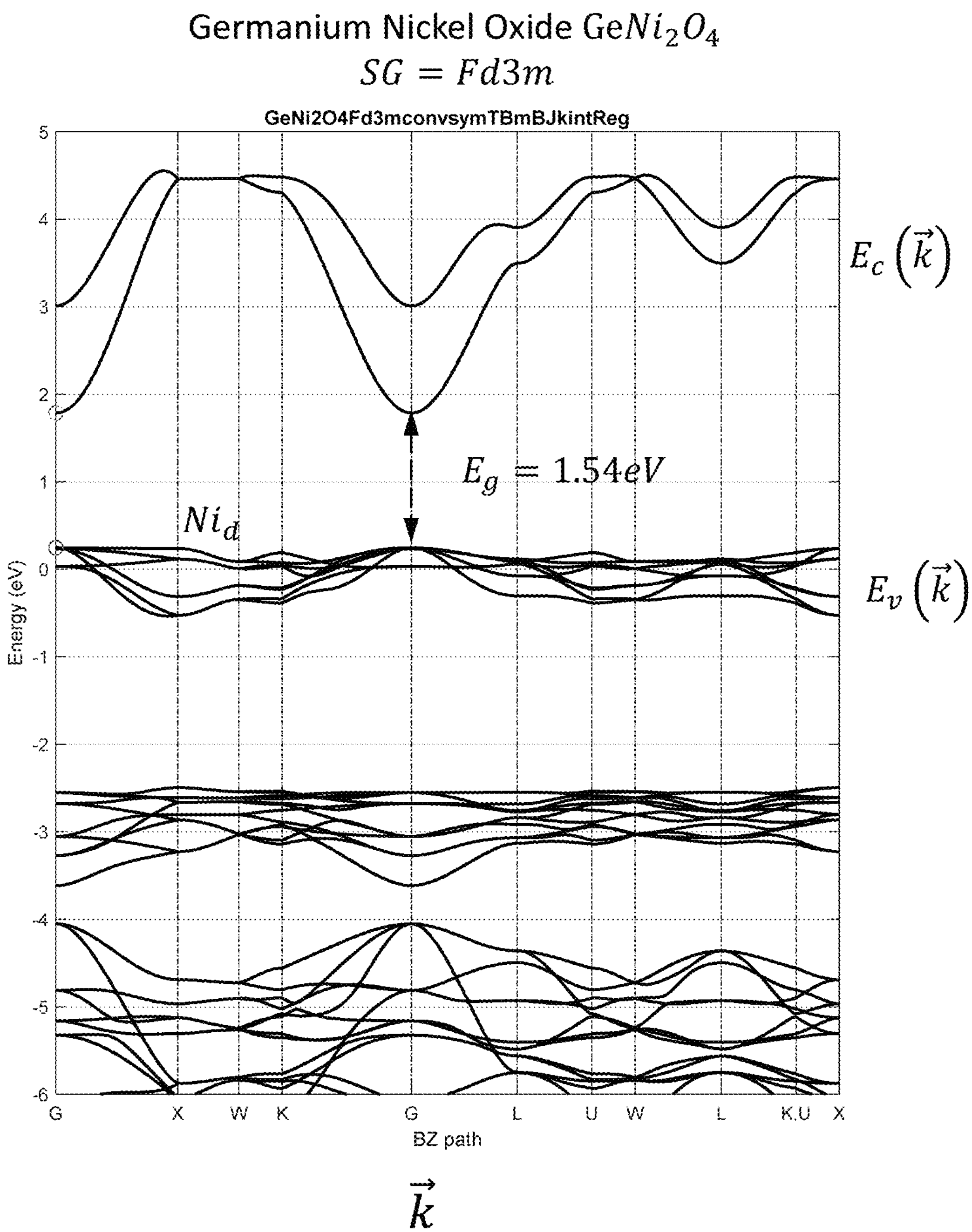

FIG. 90X shows a calculated energy-crystal momentum (E-k) dispersion plot in the vicinity of the Brillouin-zone center for $GeNi_2O_4$ with a Fd3m space group.

Figure 90Y:
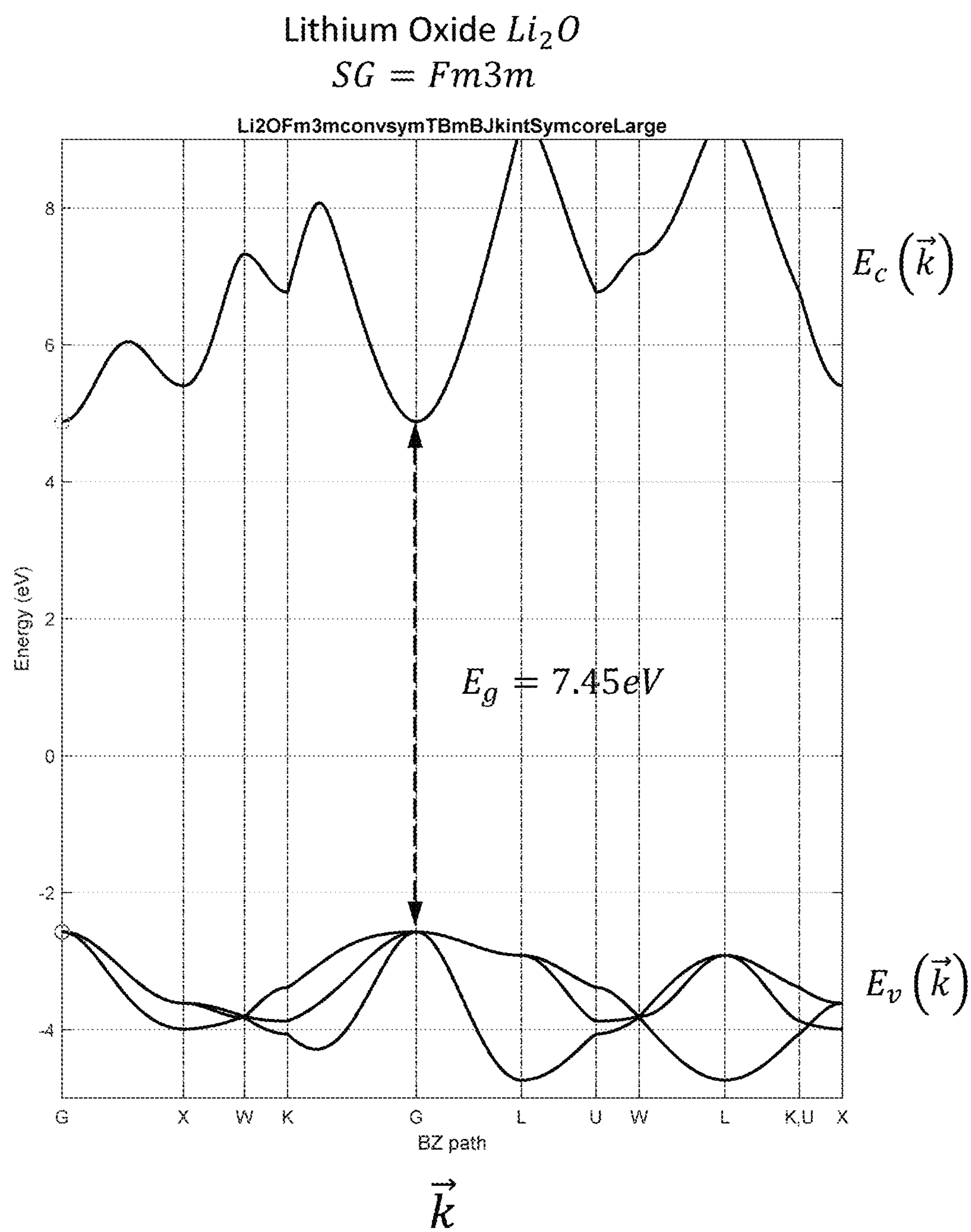

FIG. 90Y shows a calculated energy-crystal momentum (E-k) dispersion plot in the vicinity of the Brillouin-zone center for $Li_2O$ with a Fm3m space group.

Figure 90Z:
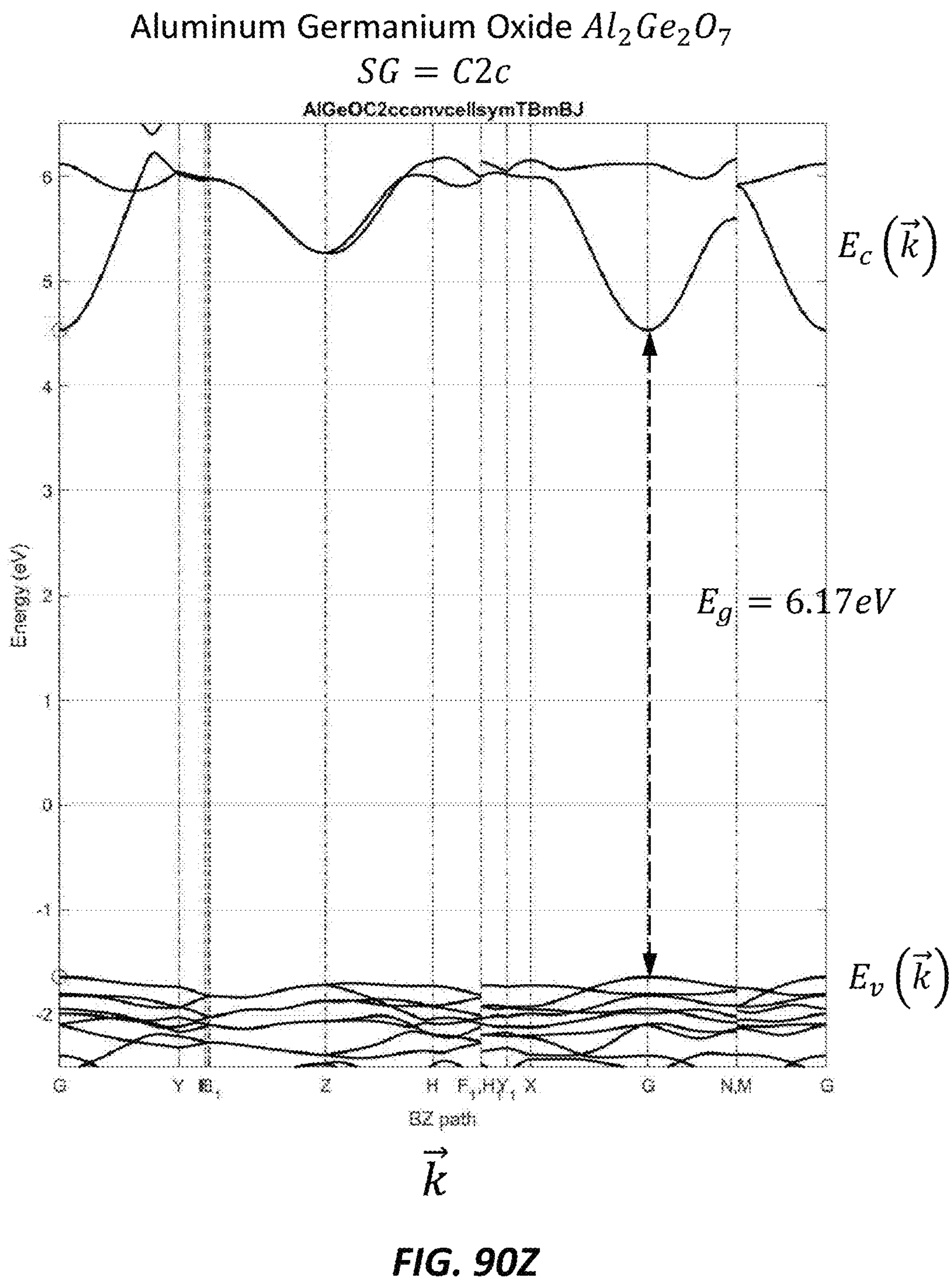
Figure 90A:
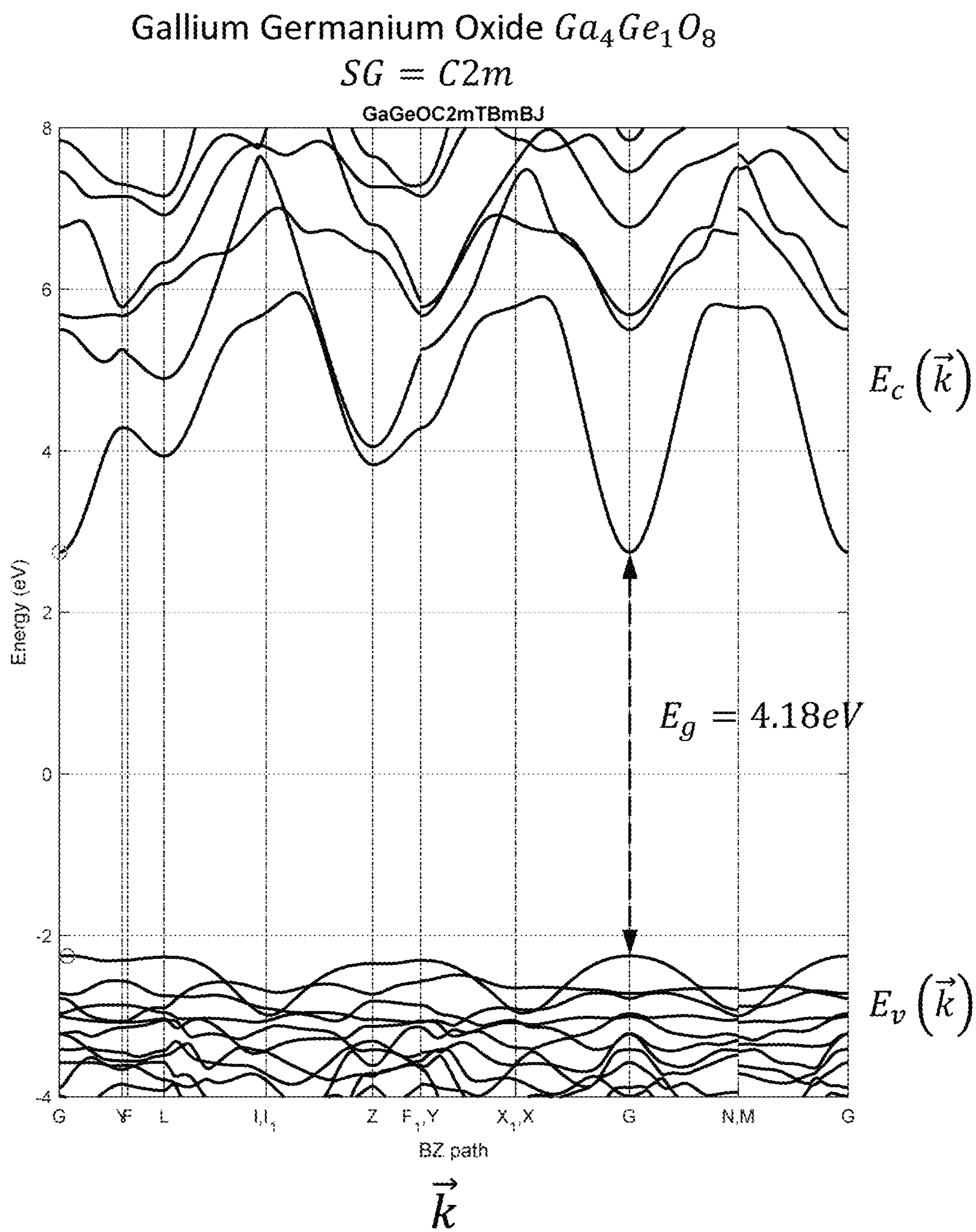
Figure 90B:
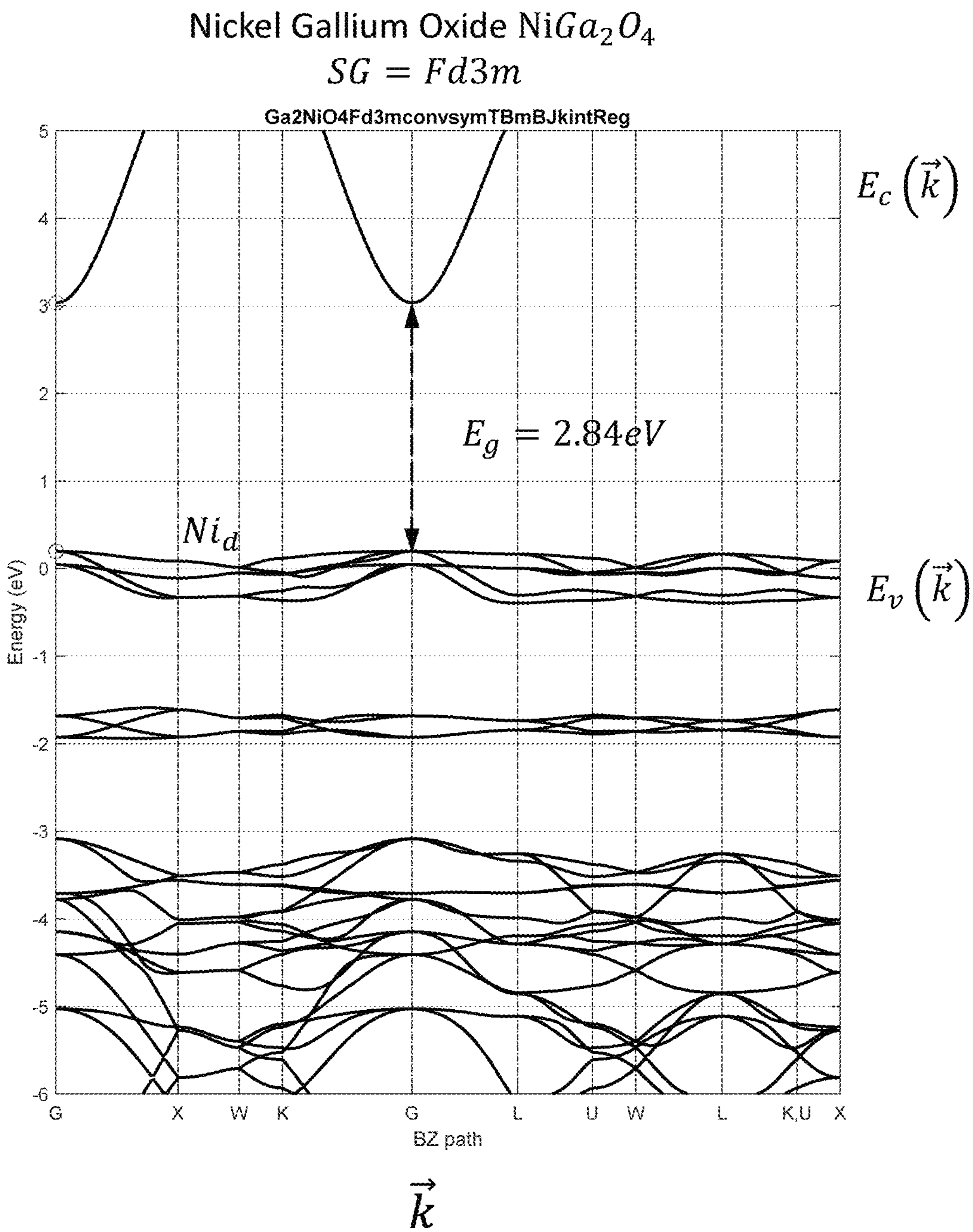
Figure 90C:
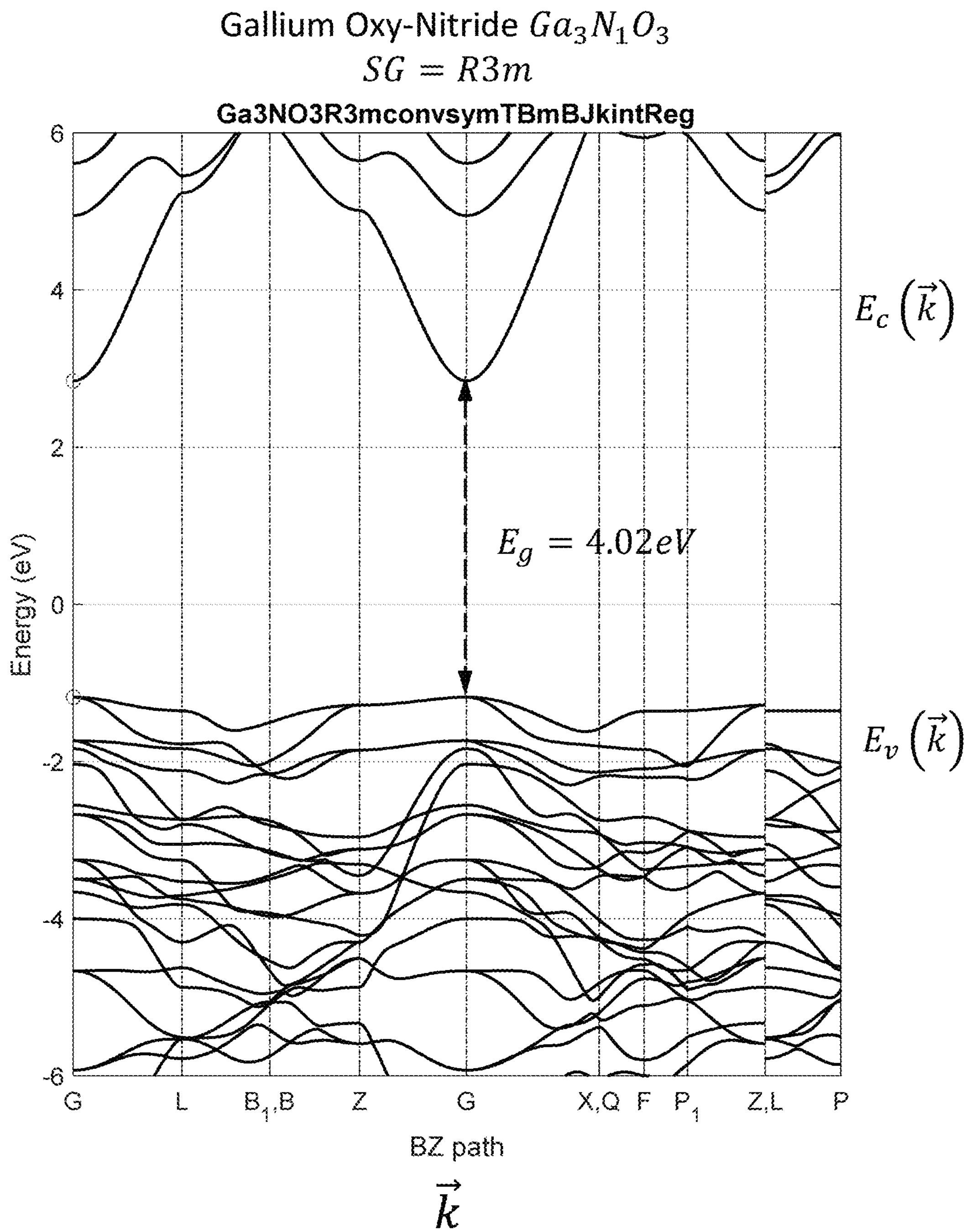
Figure 90D:
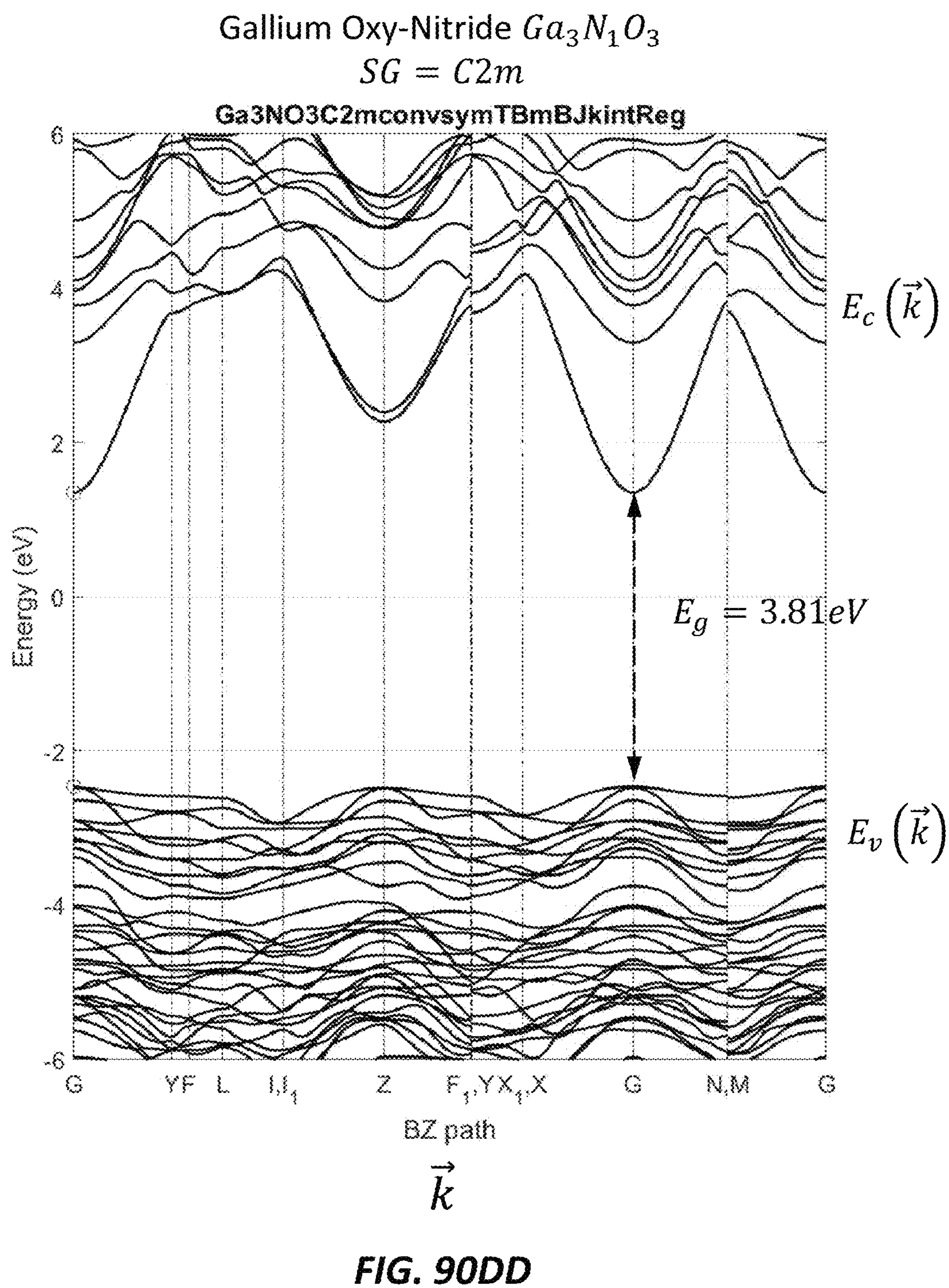
Figure 90E:
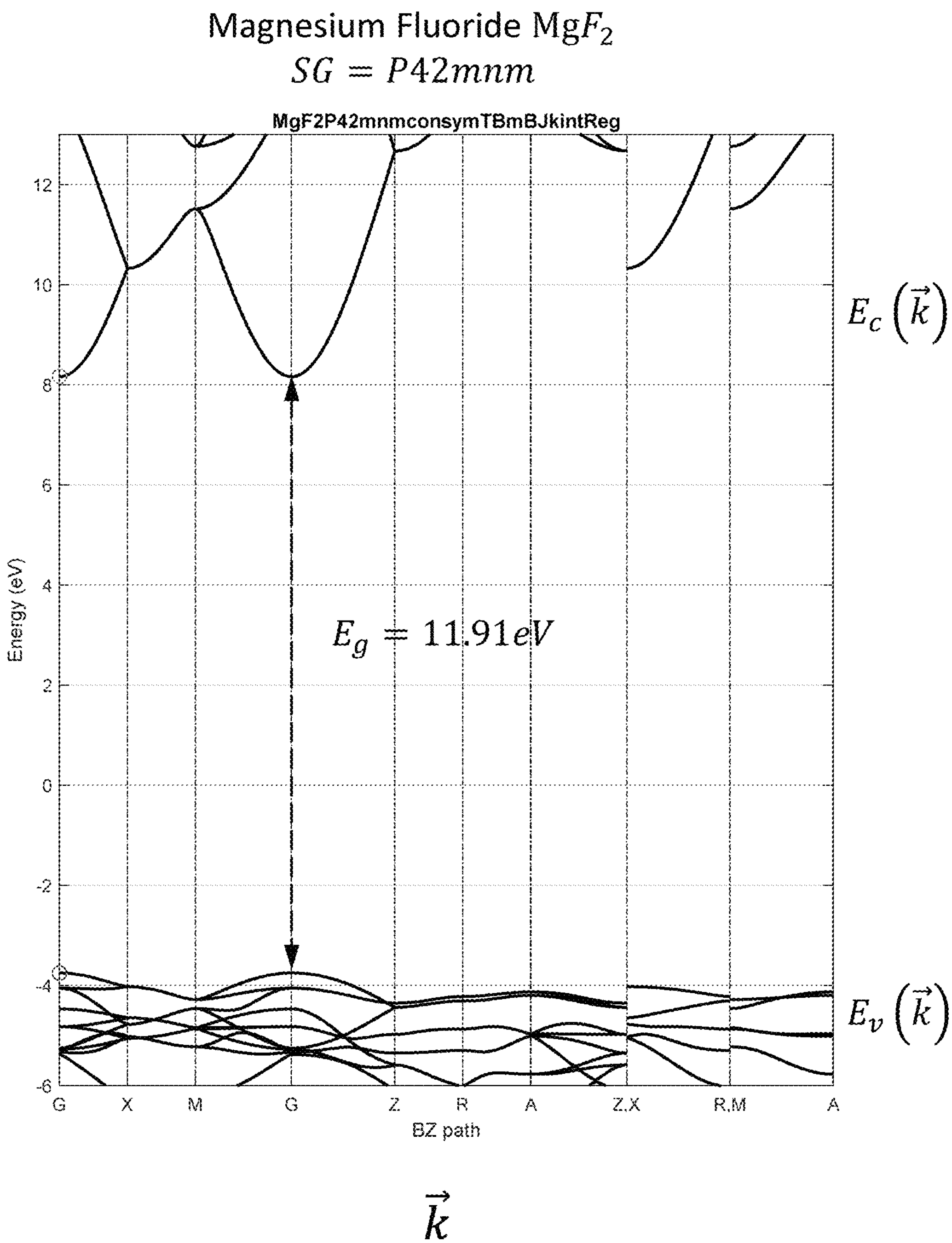
Figure 90F:
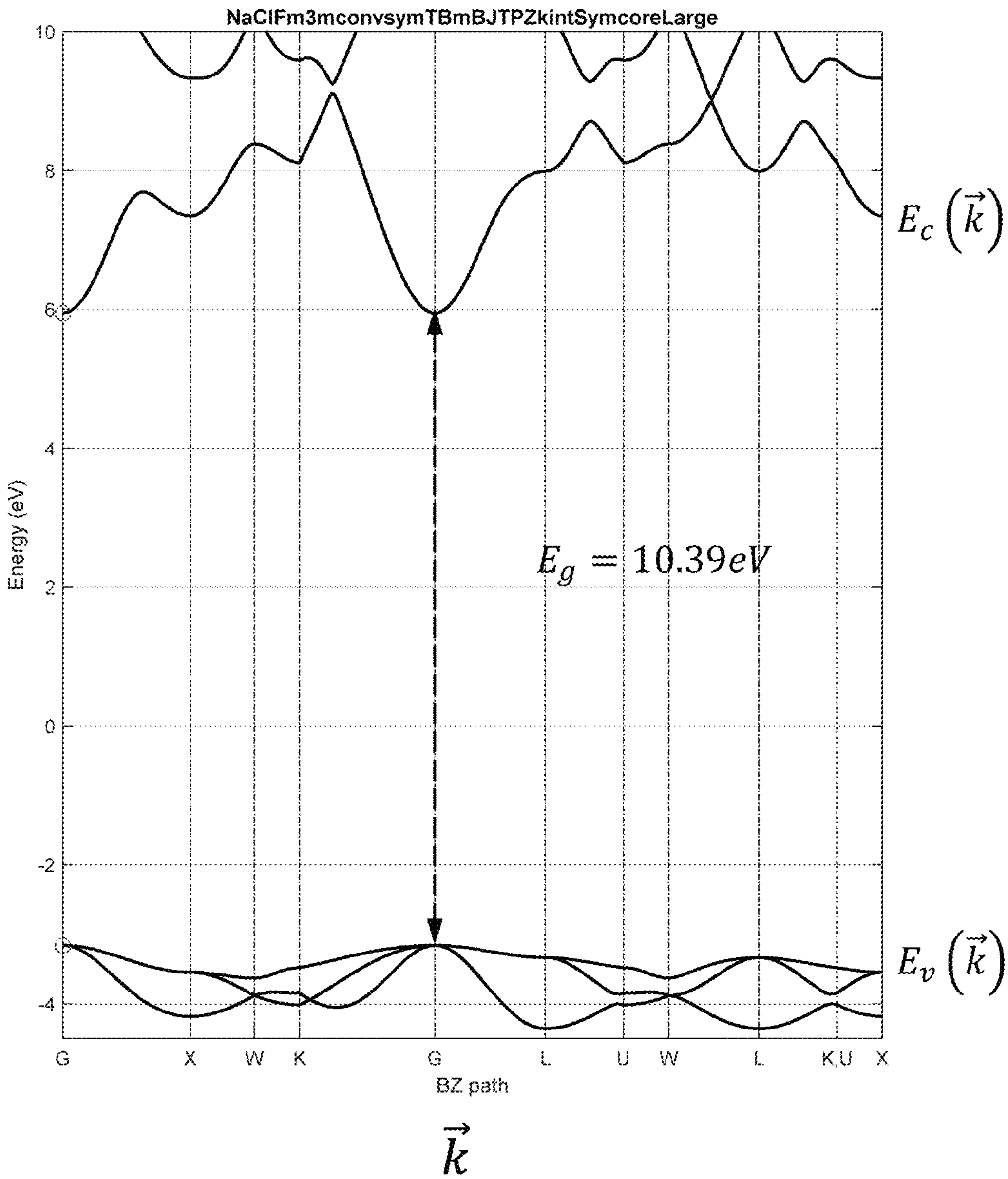
Figure 90G:
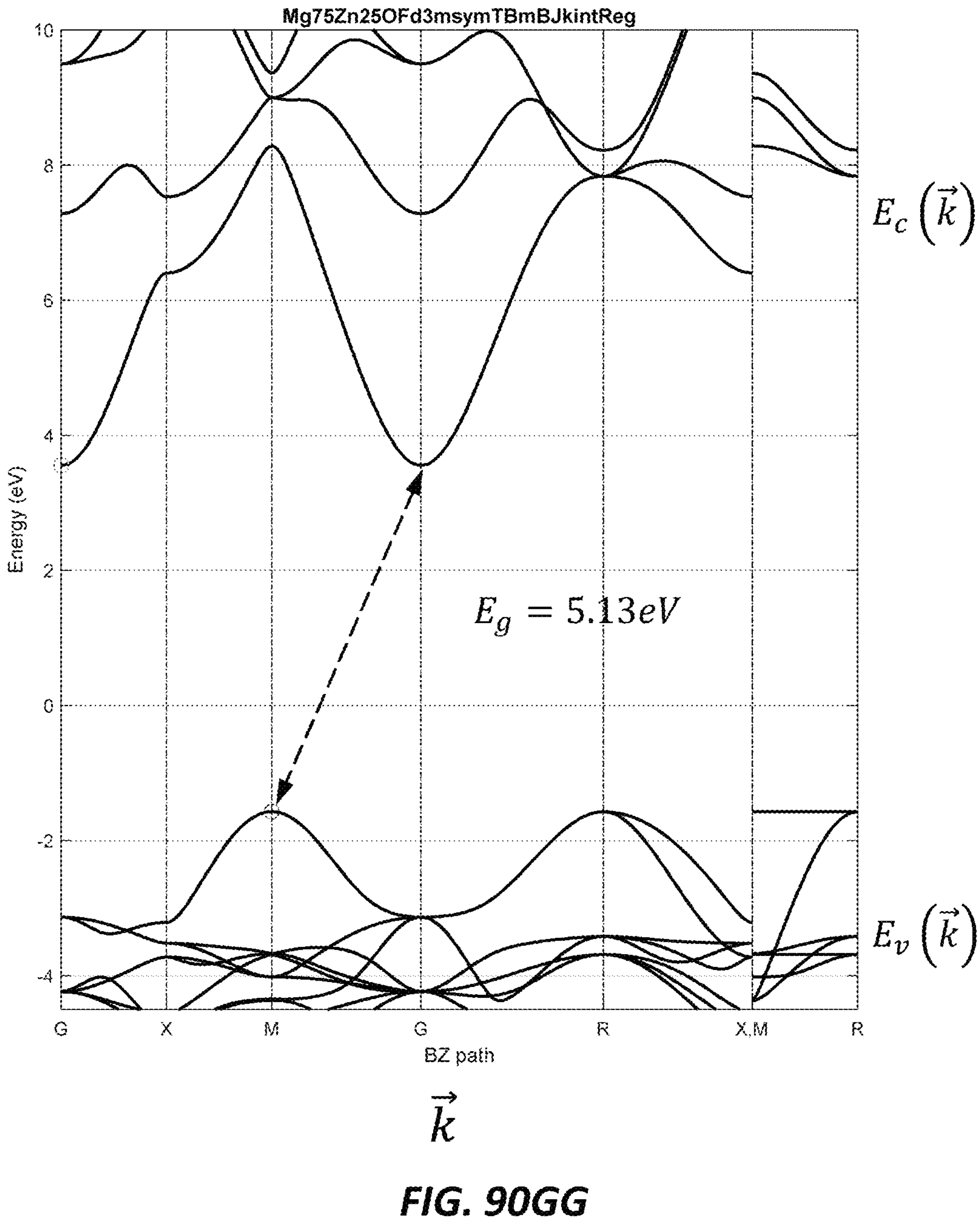
Figure 90H:
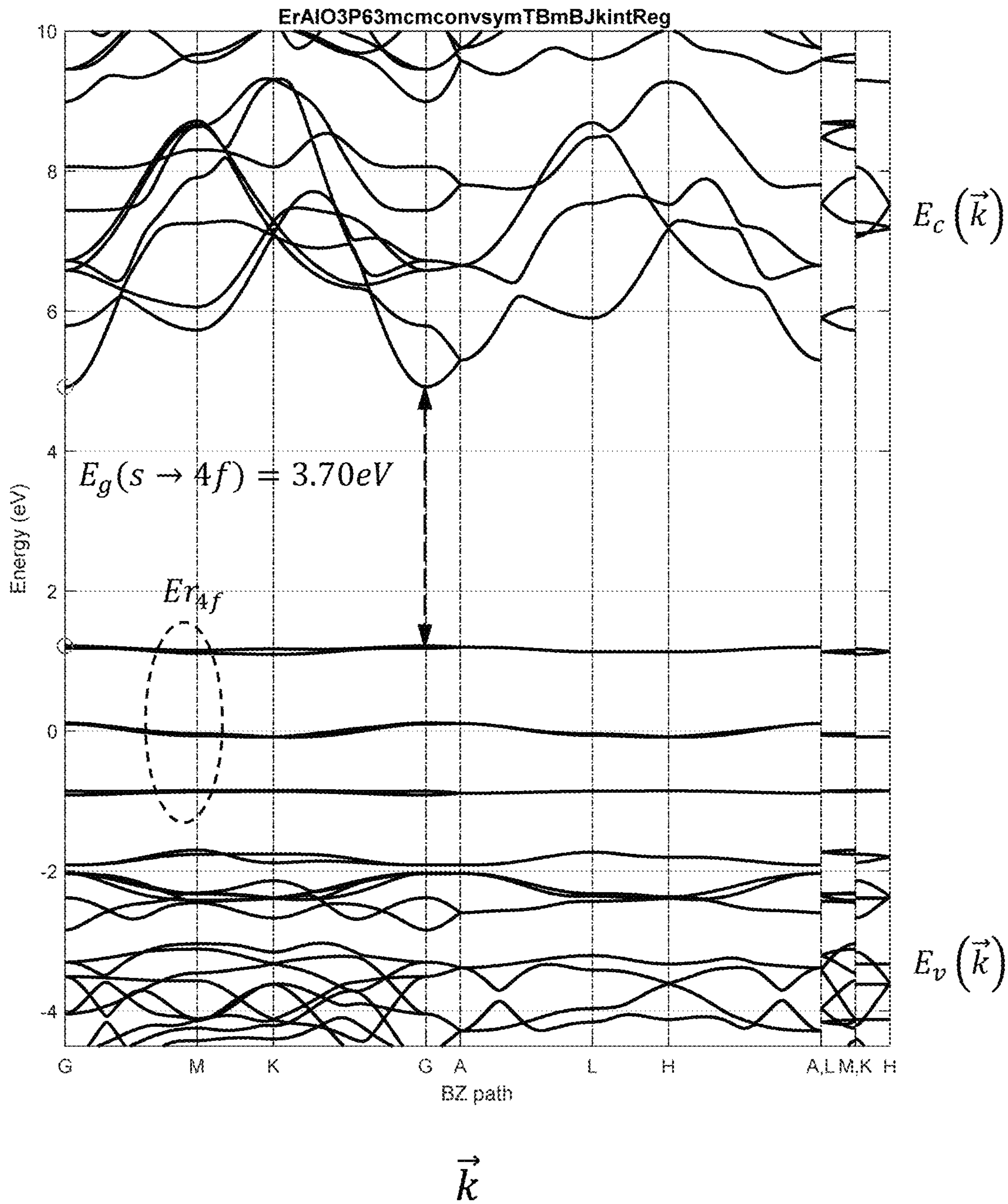
Figure 90I:
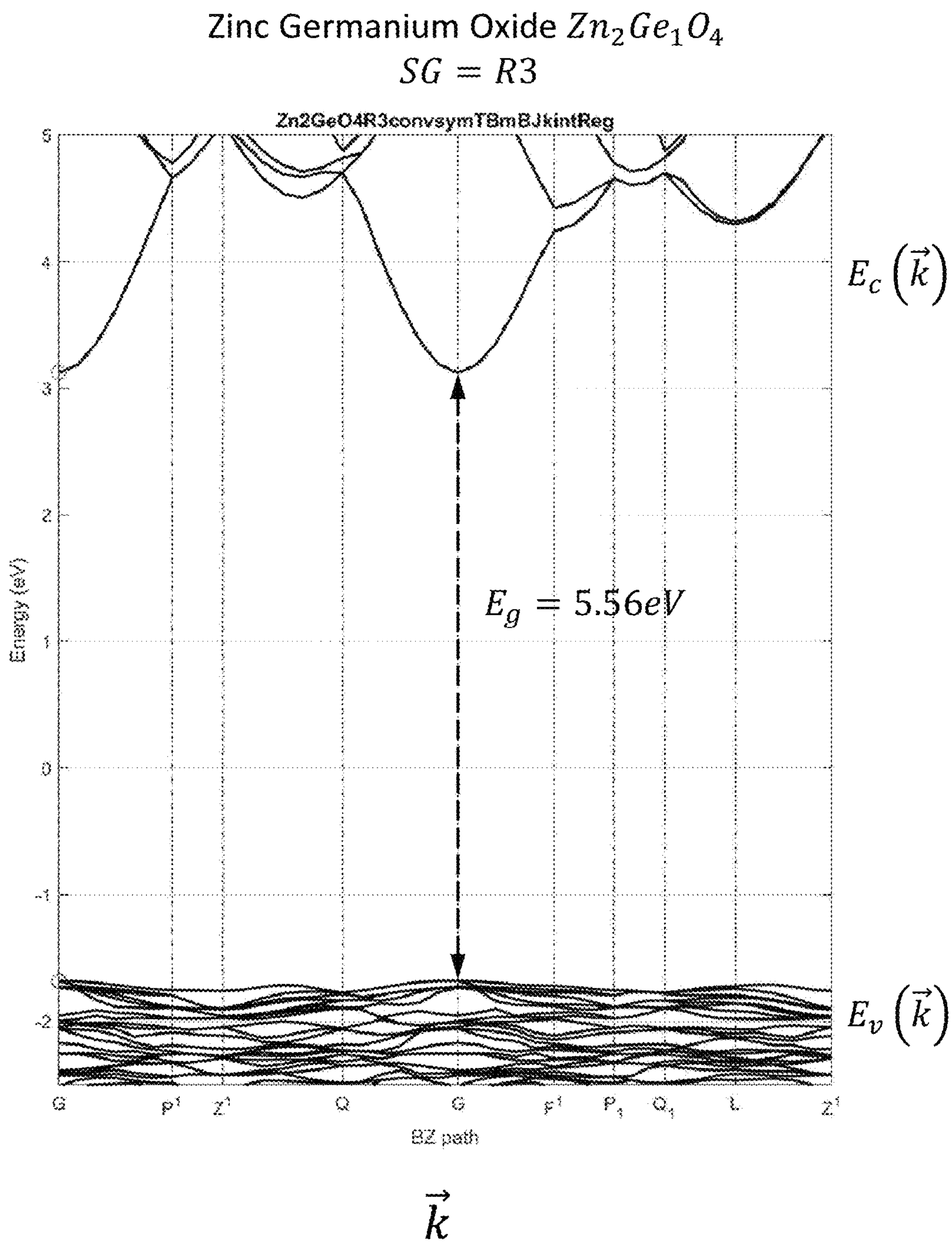
Figure 90J:
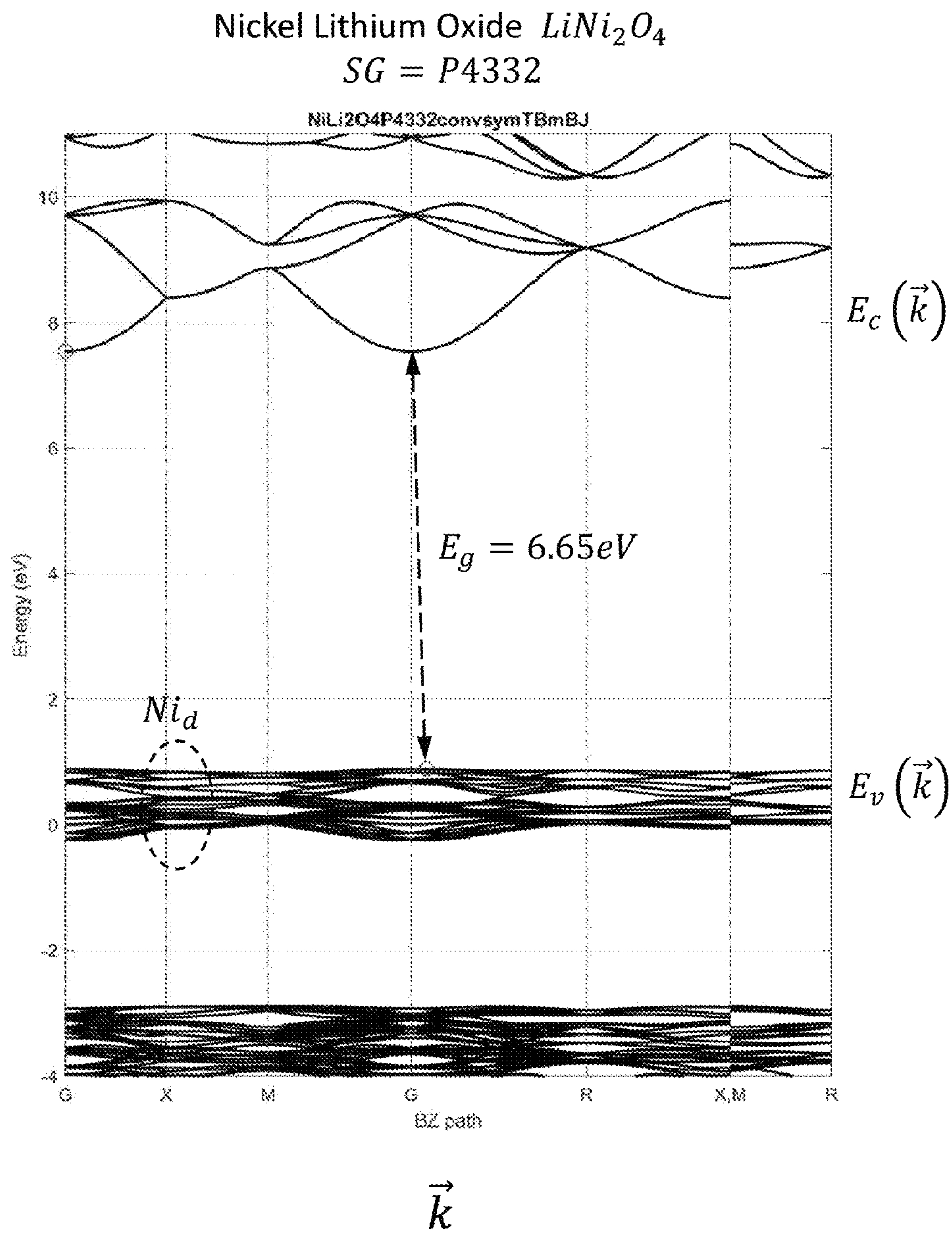
Figure 90K:
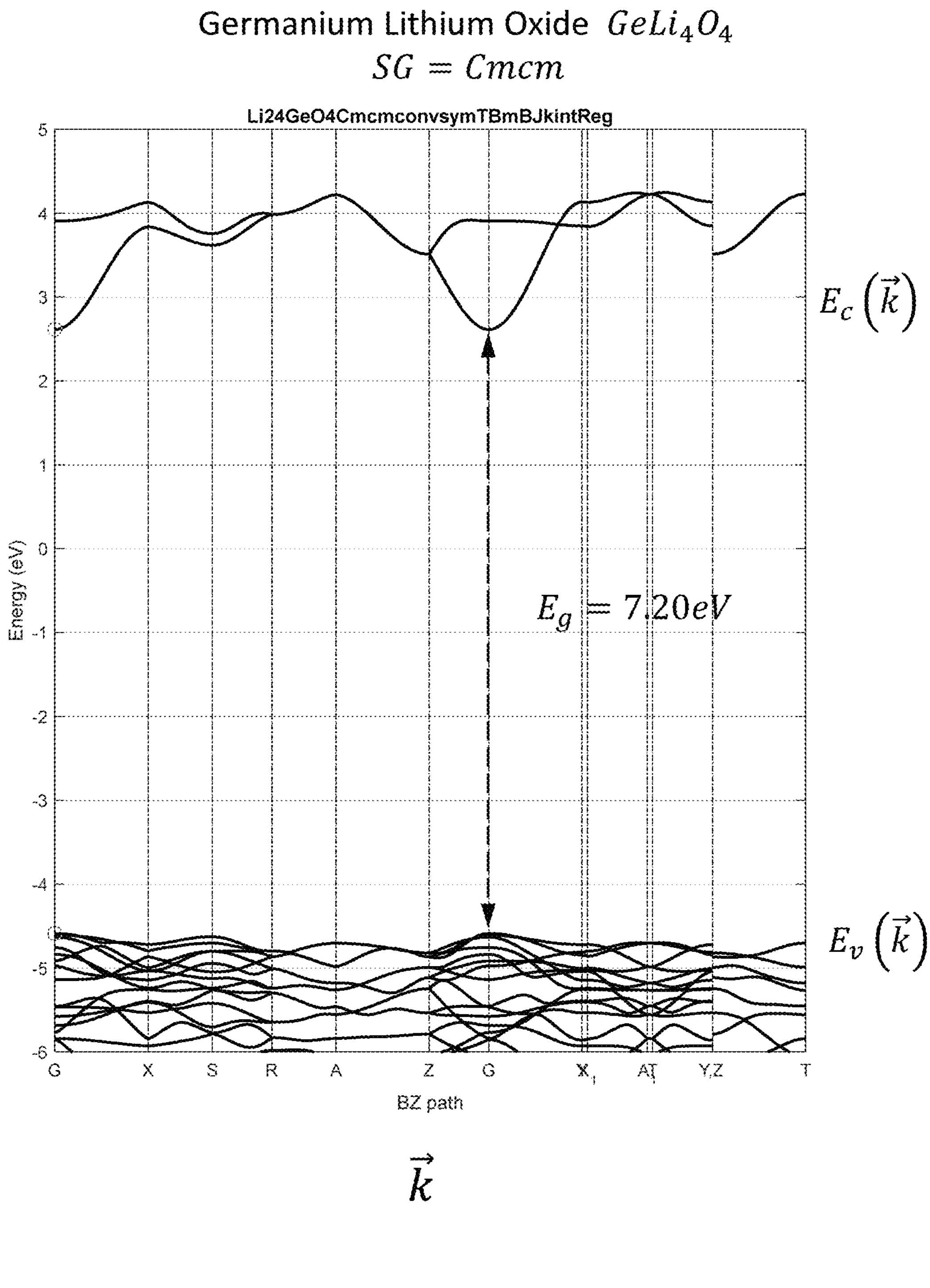
Figure 90L:
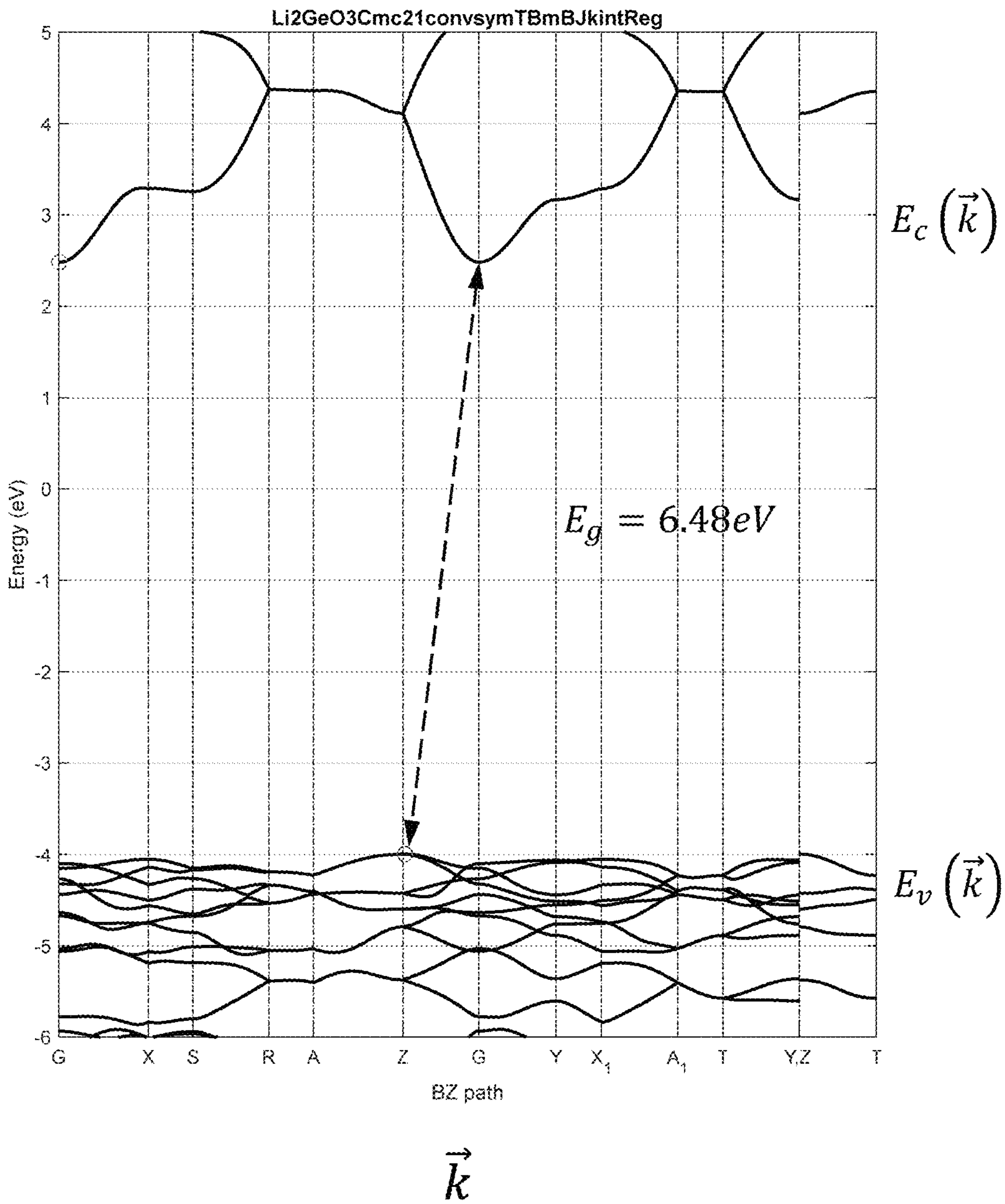
Figure 90M:
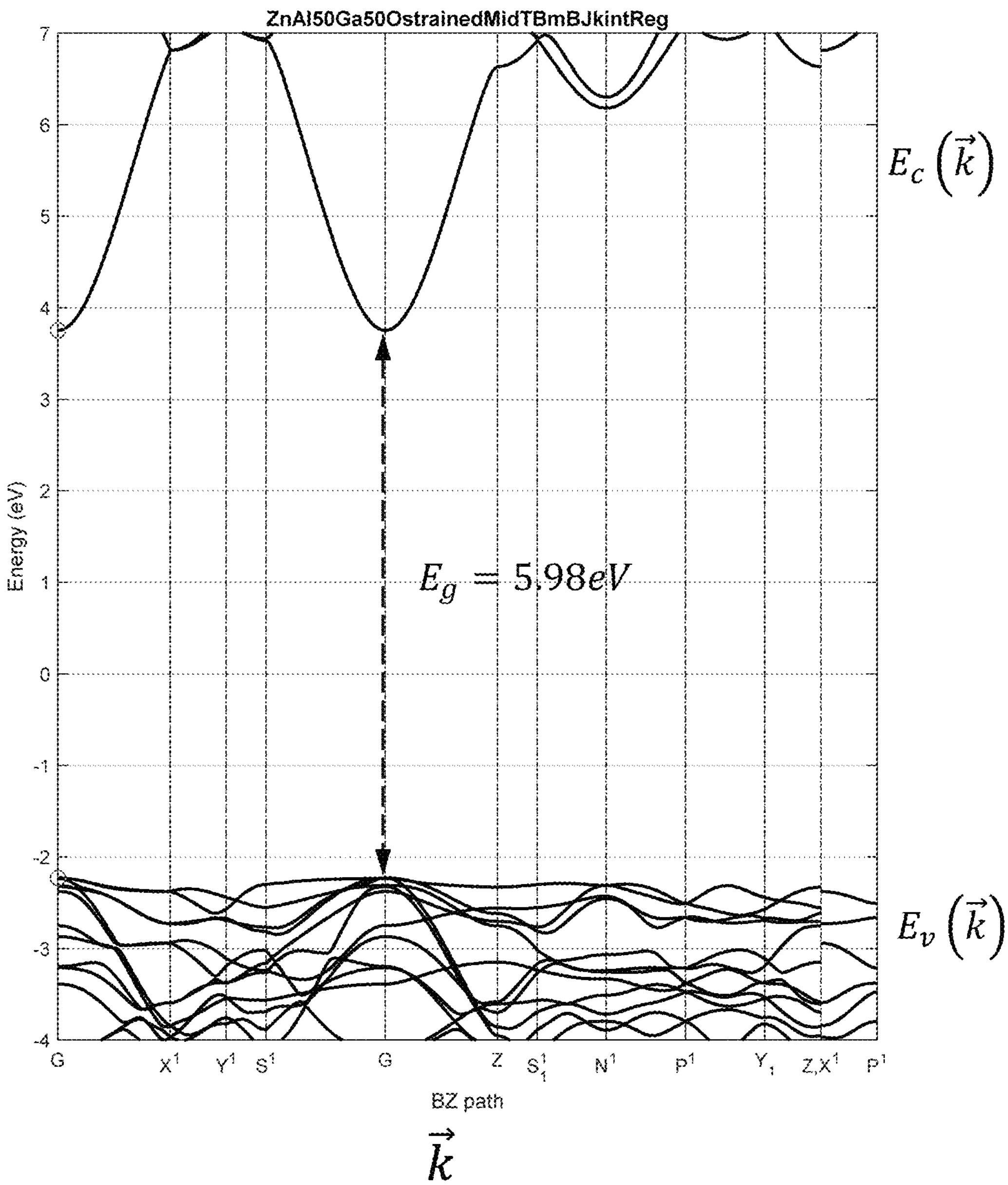
Figure 90N:
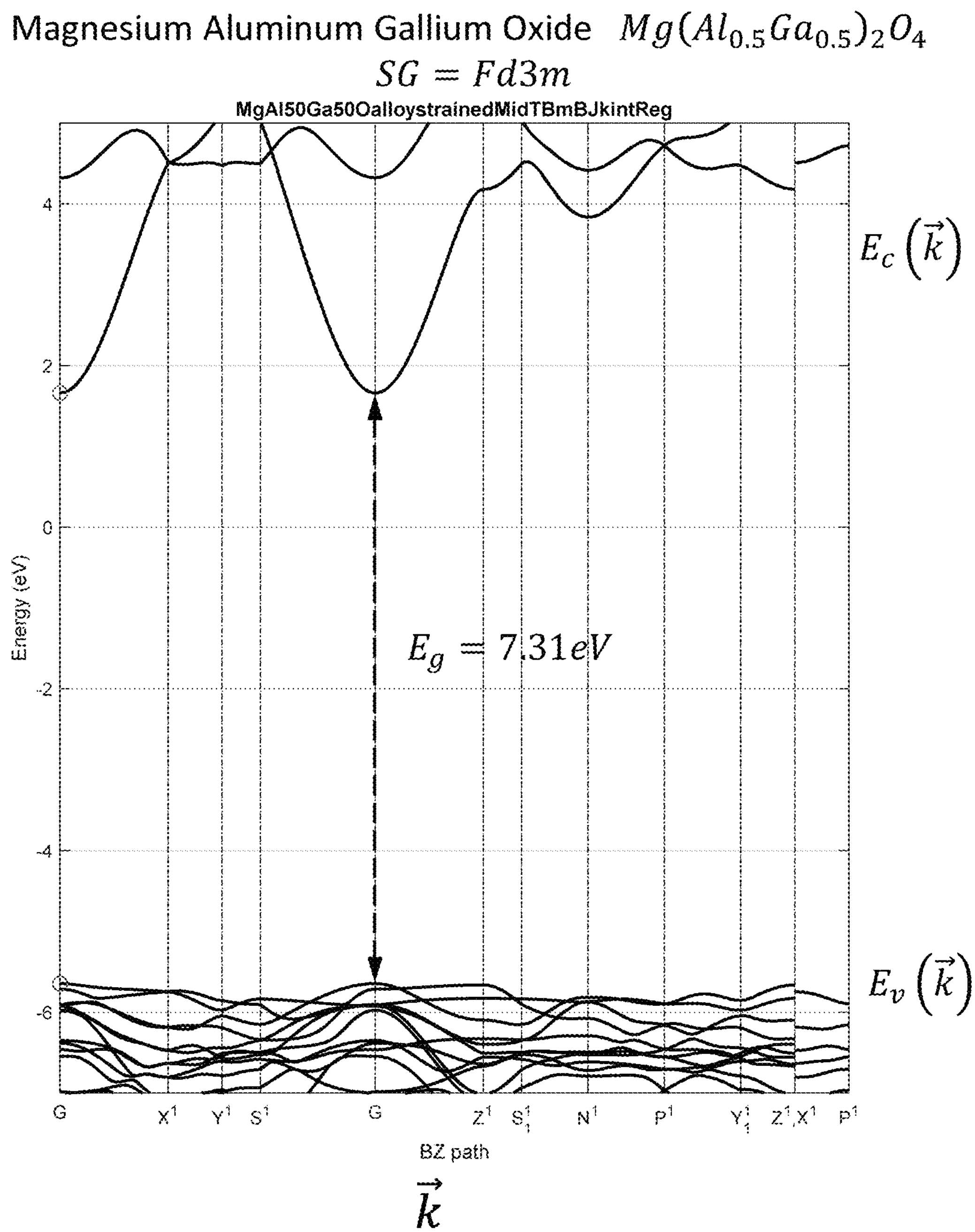
Figure 90O:
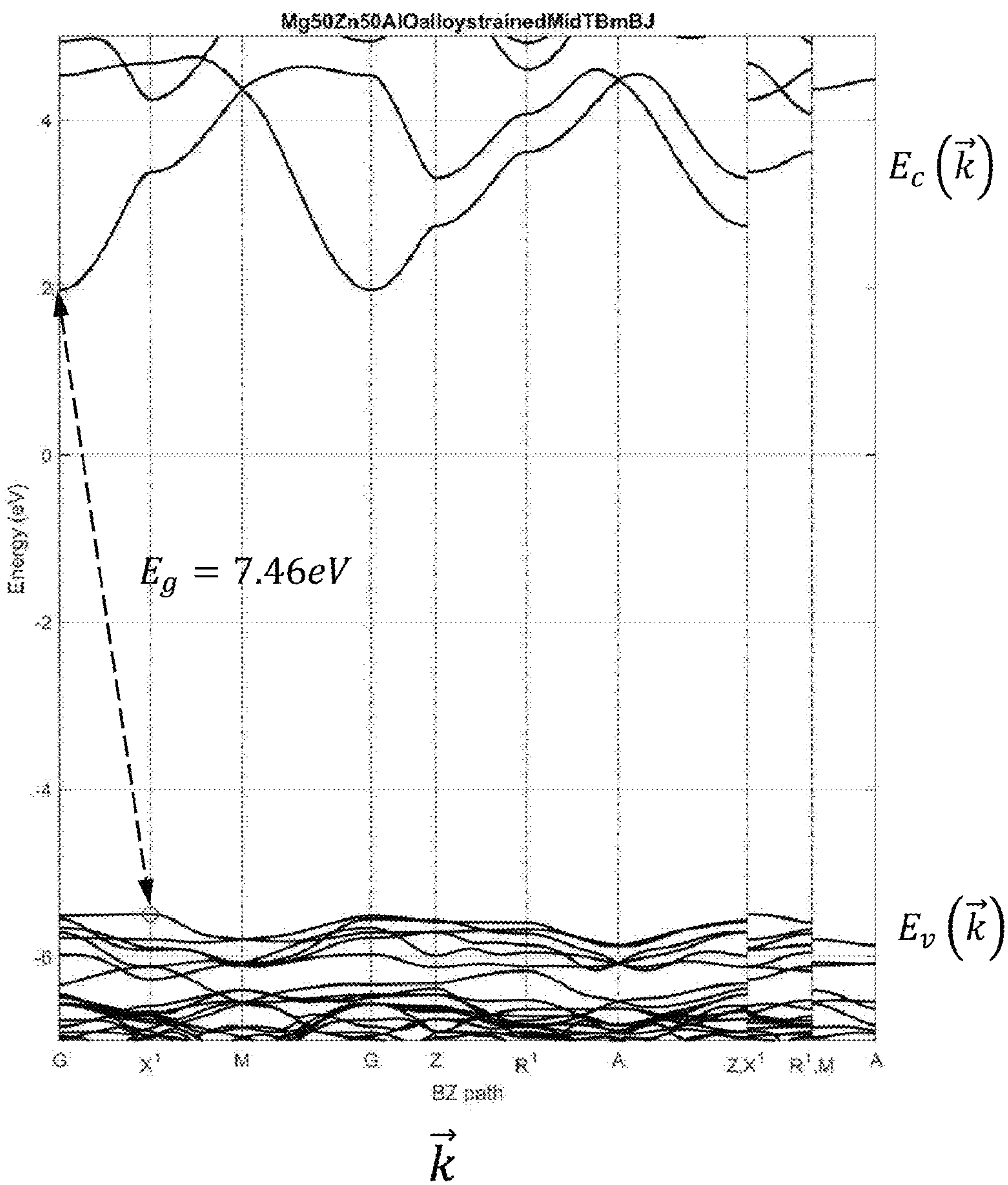
Figure 90P:
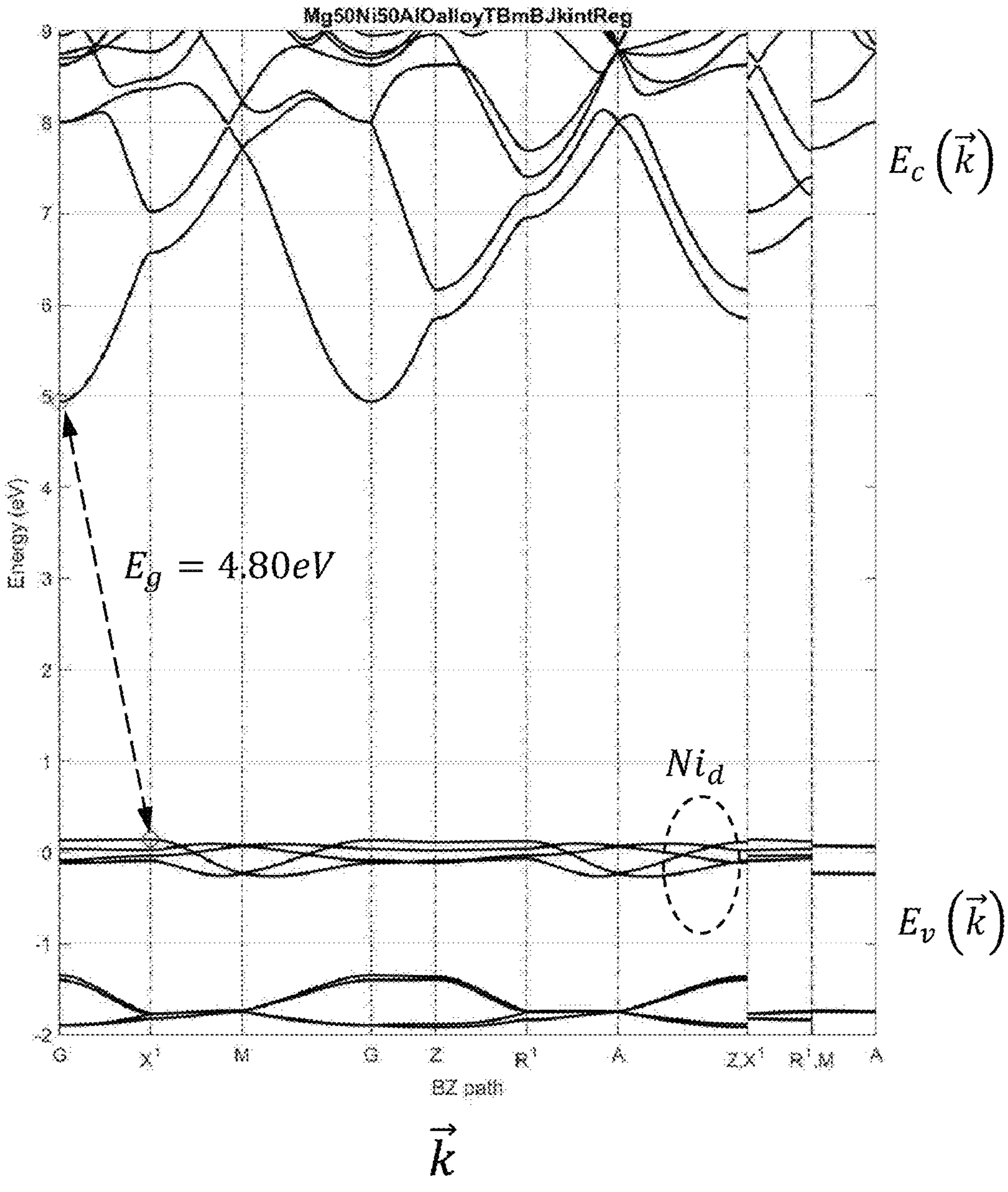
Figure 90Q:
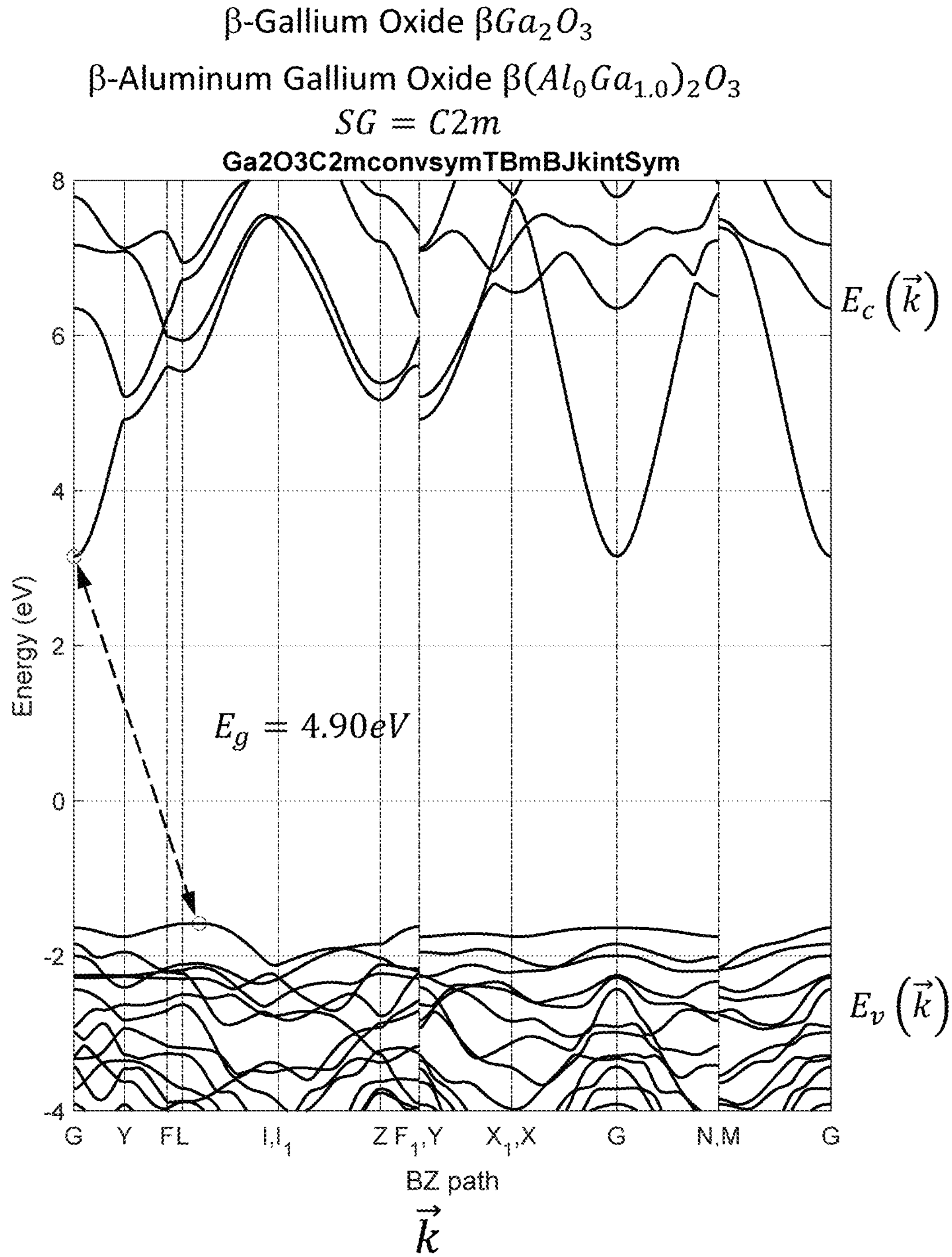
Figure 90R:
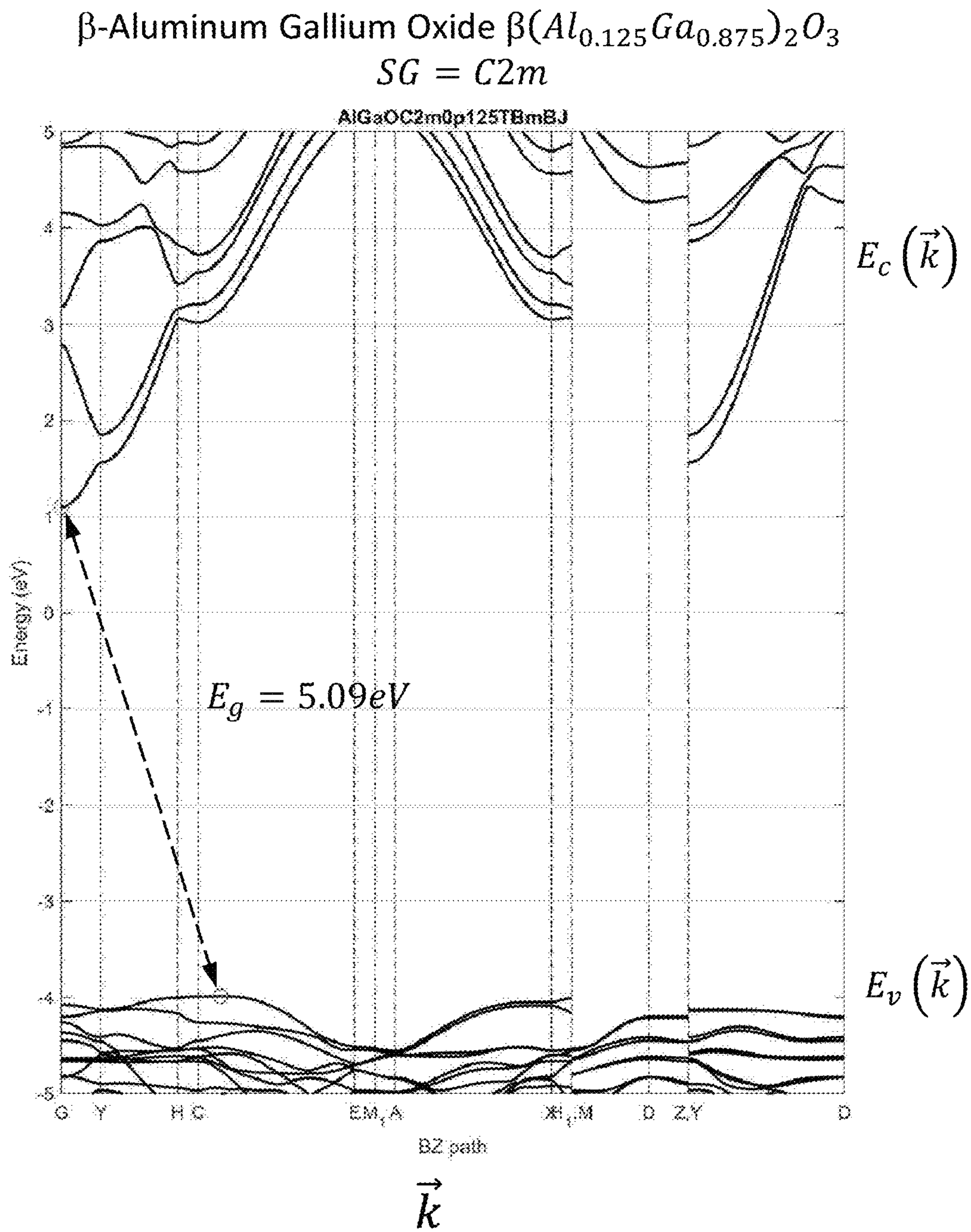
Figure 90S:
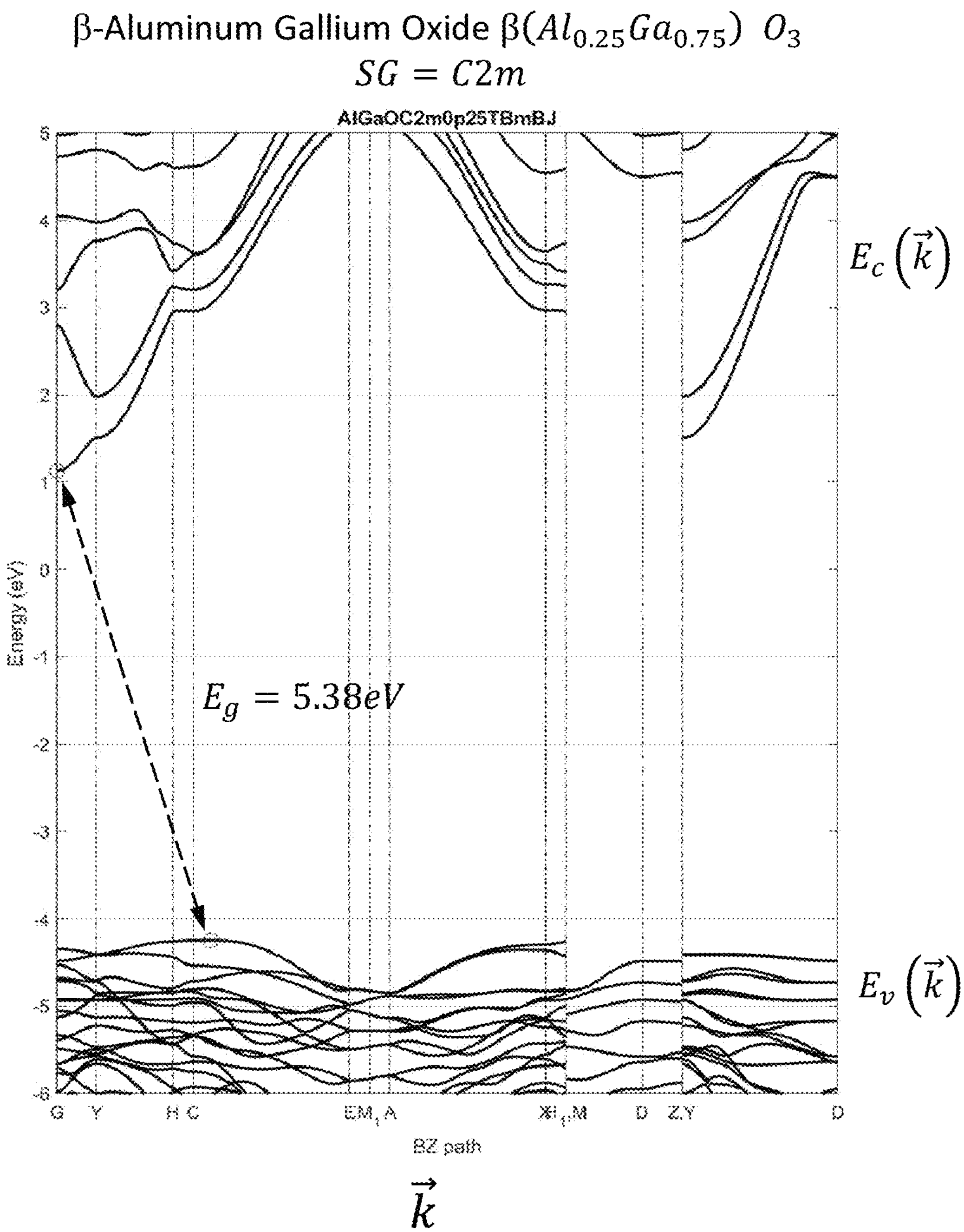
Figure 90T:
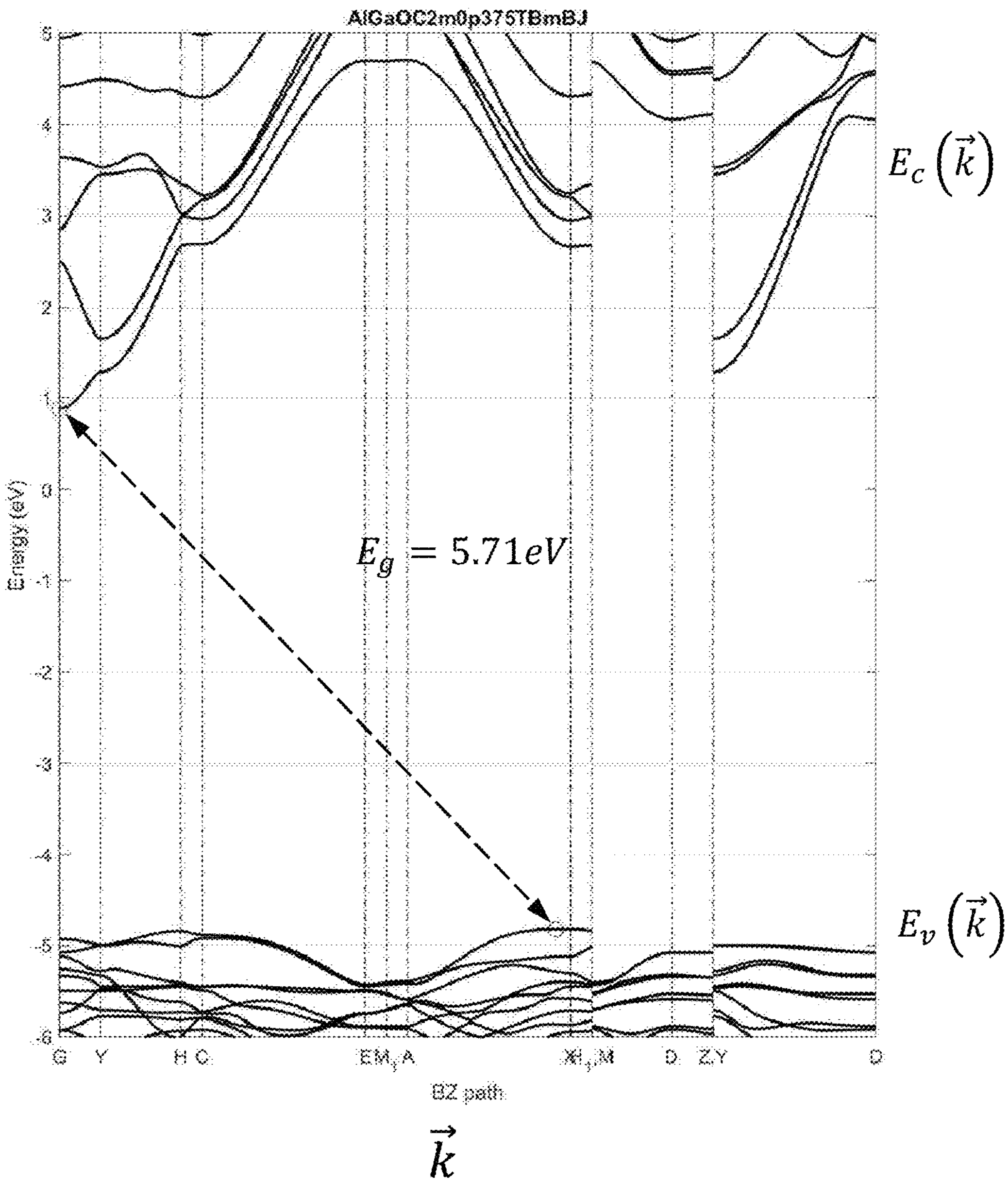
Figure 90U:
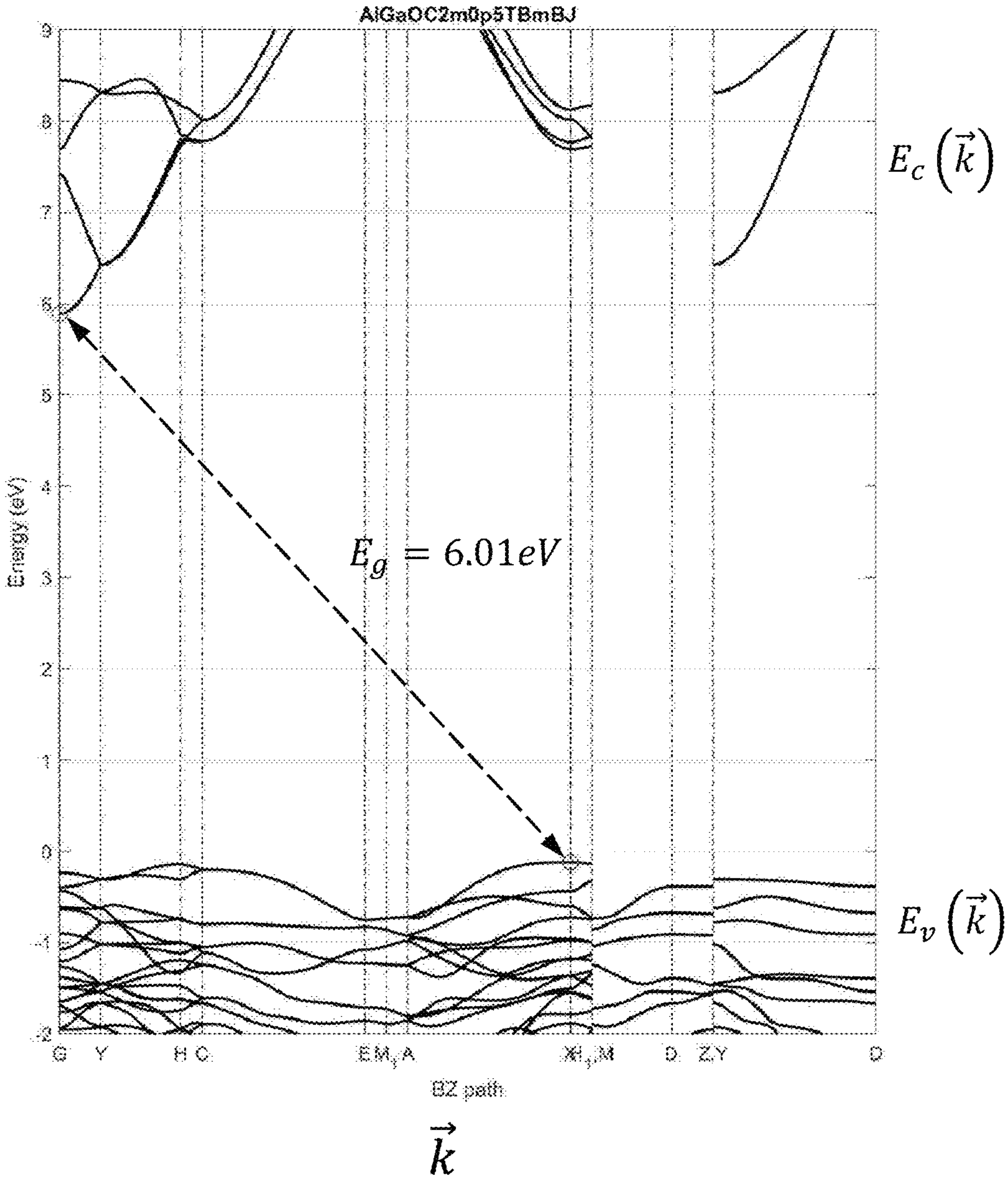
Figure 90V:
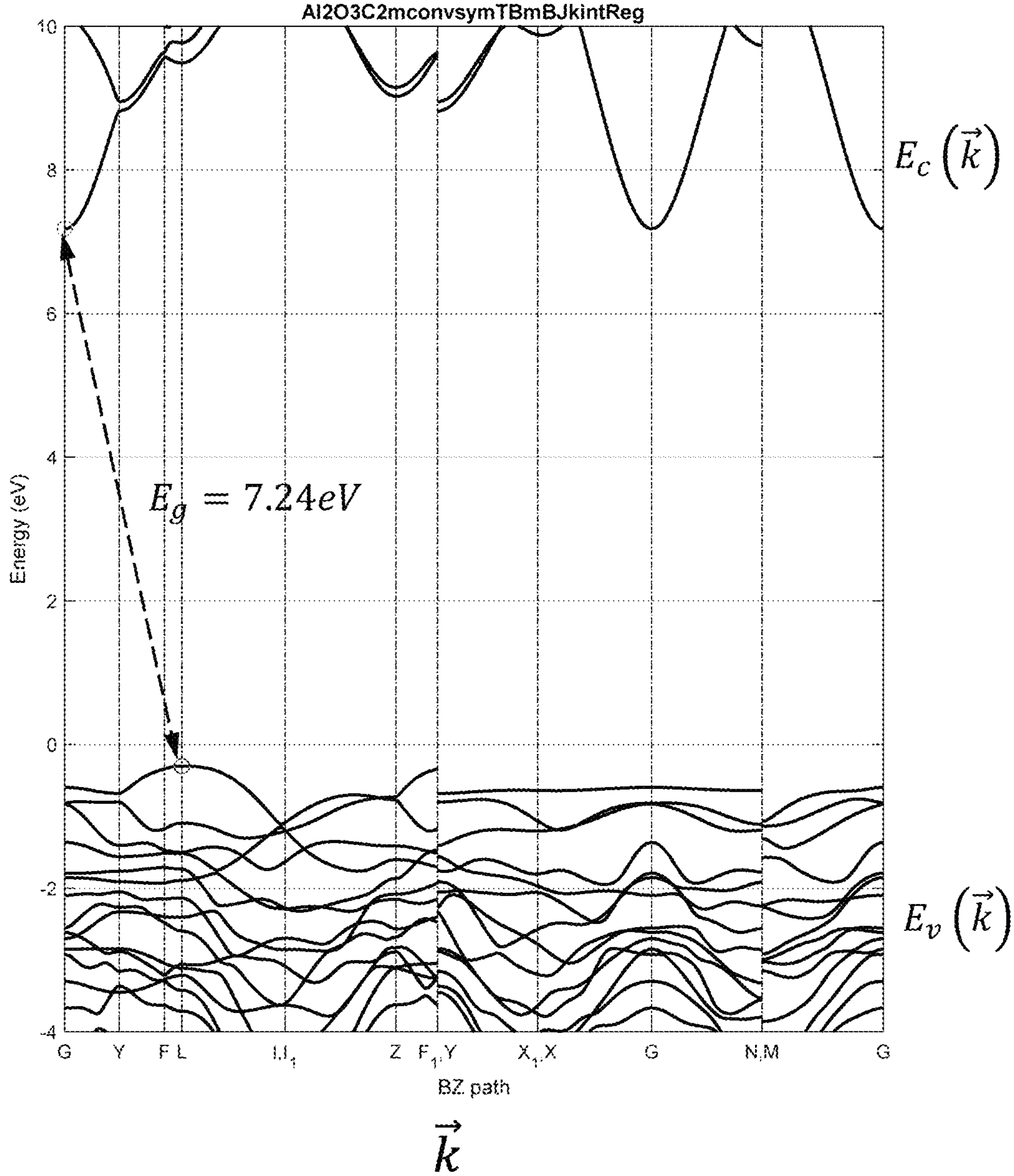
Figure 90W:
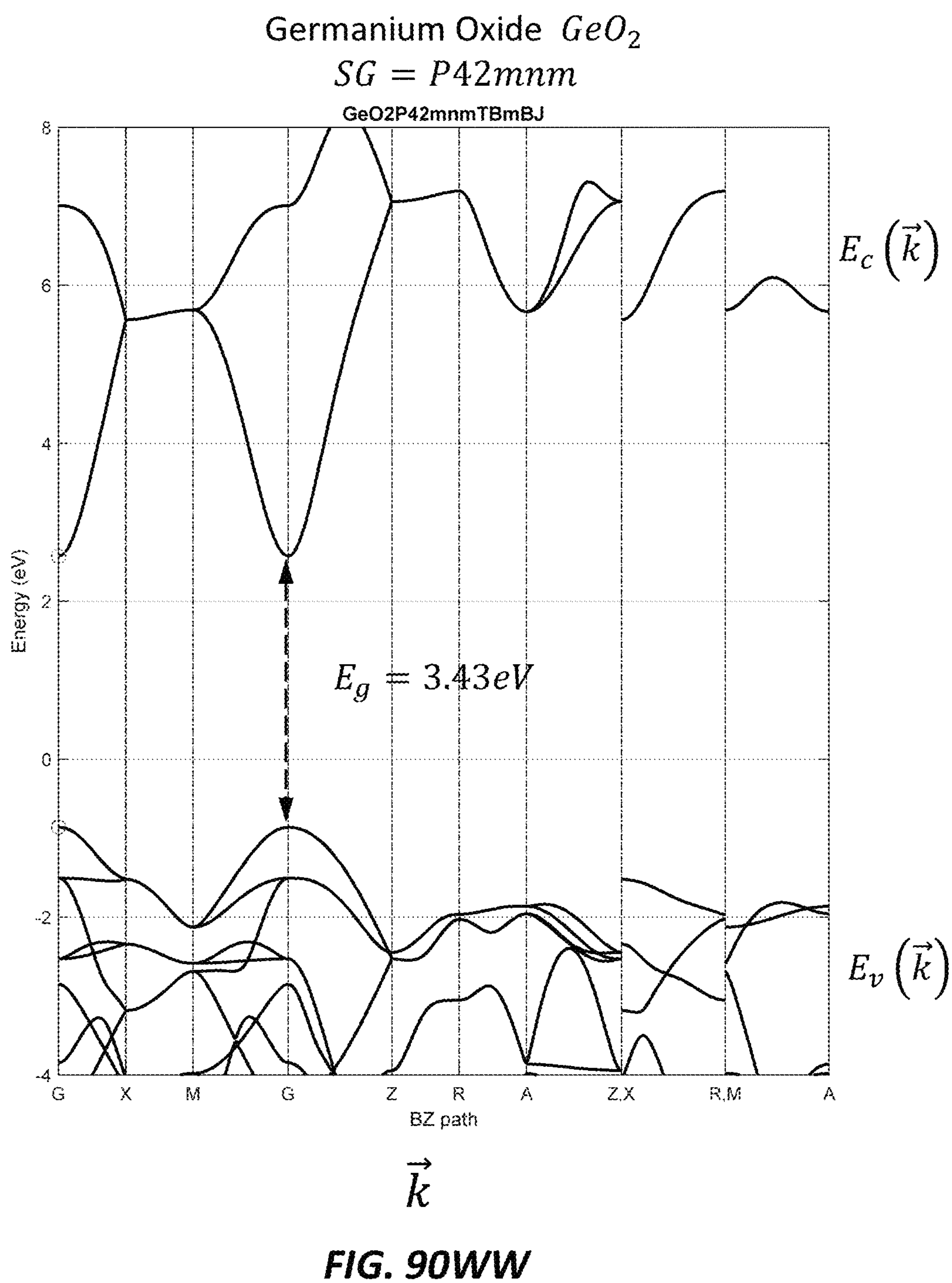
Figure 90X:
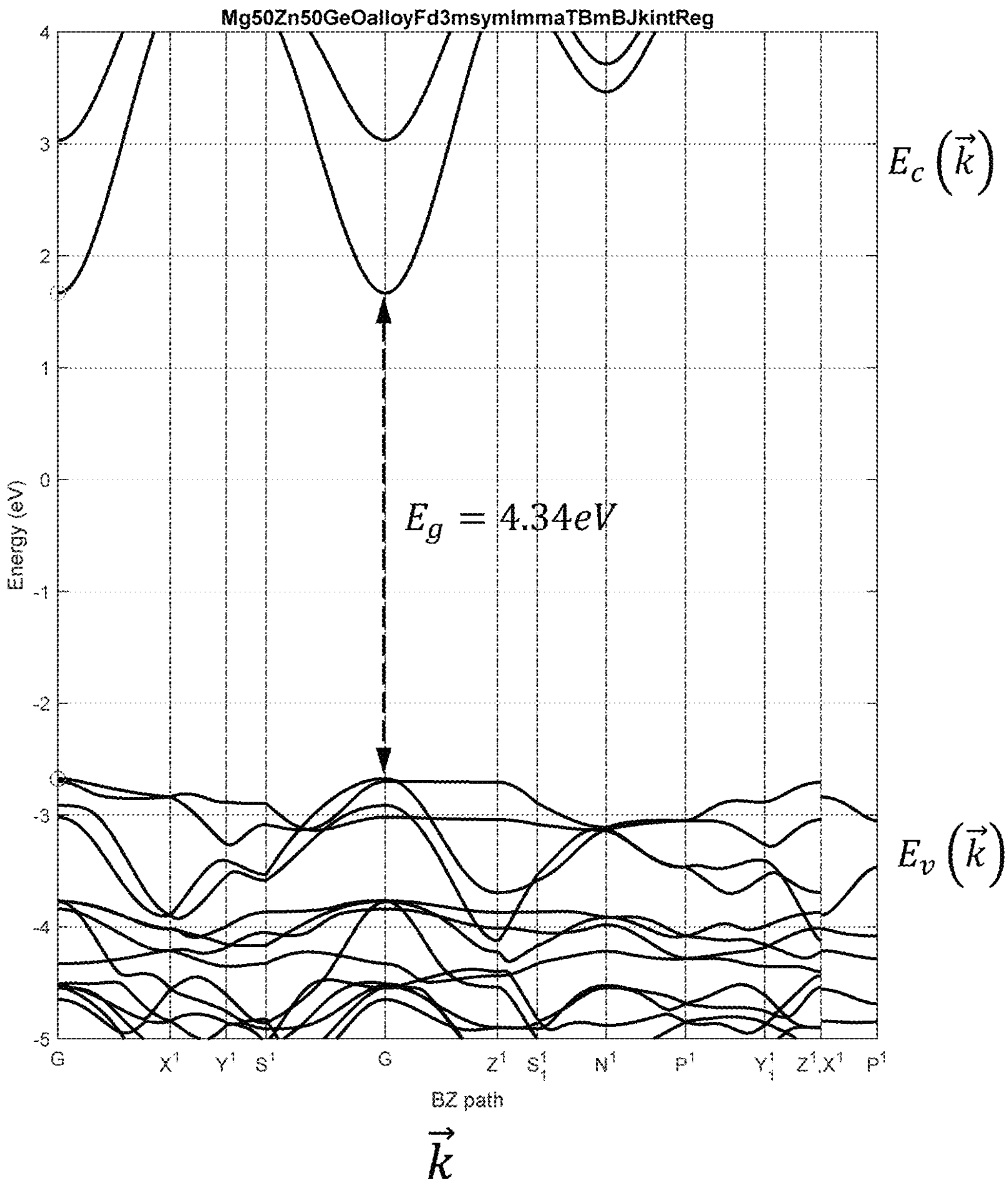
Figure 90Y:
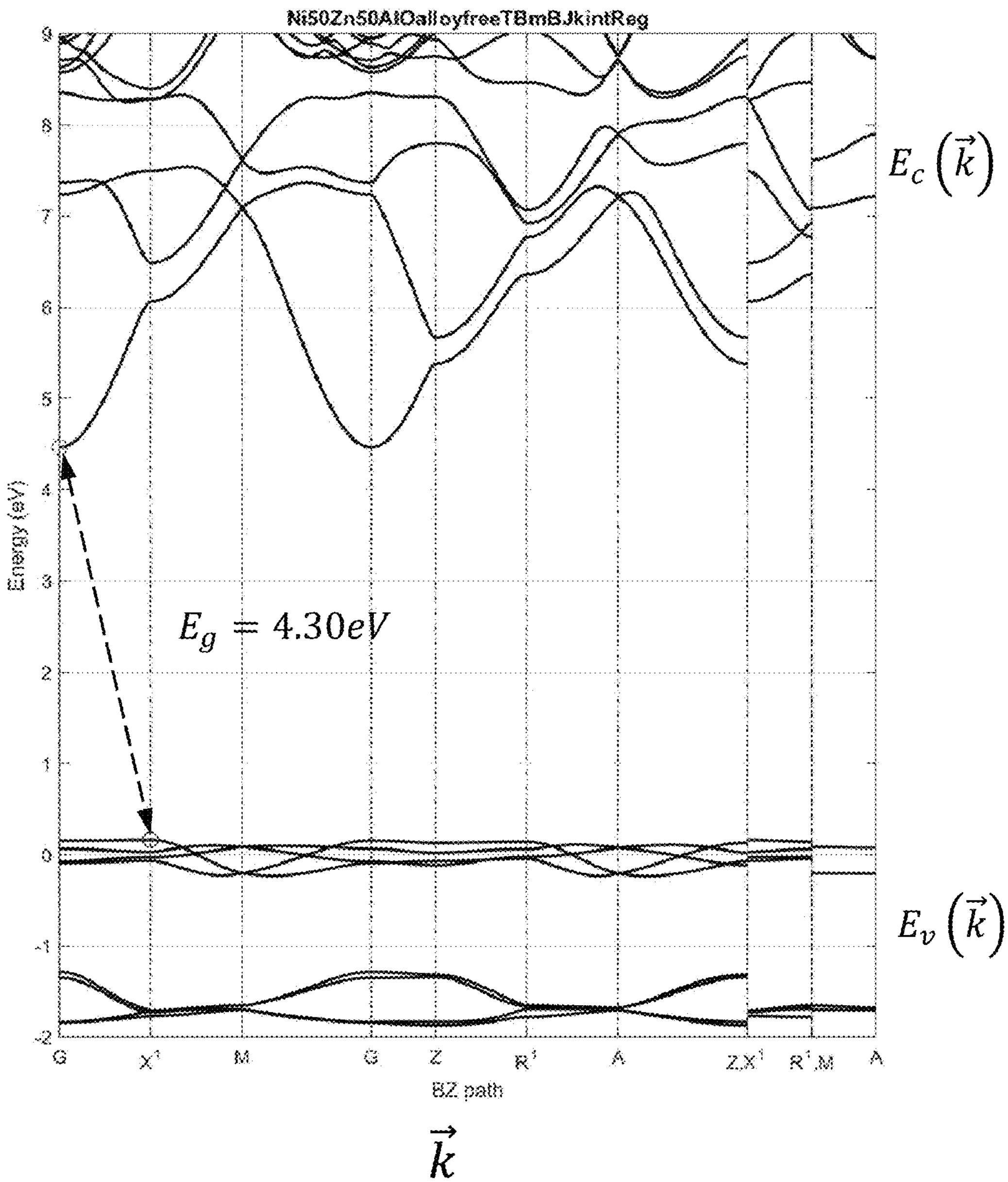
Figure 90Z:
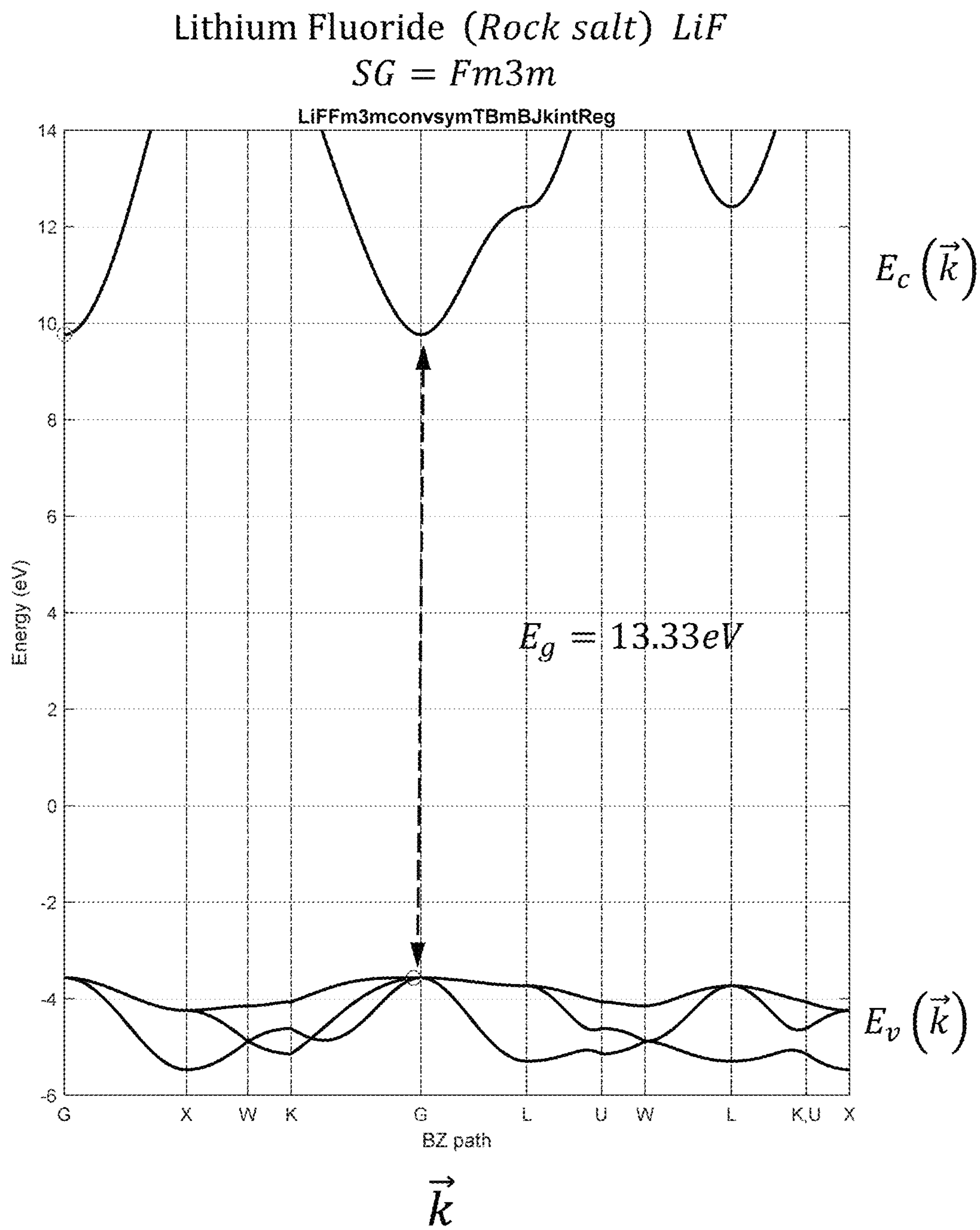

FIG. 90Z shows a calculated energy-crystal momentum (E-k) dispersion plot in the vicinity of the Brillouin-zone center for $Al_2Ge_2O_7$ with a C2c space group.

FIG. 90AA shows a calculated energy-crystal momentum (E-k) dispersion plot in the vicinity of the Brillouin-zone center for $Ga_4Ge_1O_8$ with a C2m space group.

FIG. 90BB shows a calculated energy-crystal momentum (E-k) dispersion plot in the vicinity of the Brillouin-zone center for $NiGa_2O_4$ with a Fd3m space group.

FIG. 90CC shows a calculated energy-crystal momentum (E-k) dispersion plot in the vicinity of the Brillouin-zone center for $Ga_3N_1O_3$ with a R3m space group.

FIG. 90DD shows a calculated energy-crystal momentum (E-k) dispersion plot in the vicinity of the Brillouin-zone center for $Ga_3N_1O_3$ with a C2m space group.

FIG. 90EE shows a calculated energy-crystal momentum (E-k) dispersion plot in the vicinity of the Brillouin-zone center for $MgF_2$ with a P42mnm space group.

FIG. 90FF shows a calculated energy-crystal momentum (E-k) dispersion plot in the vicinity of the Brillouin-zone center for NaCl with a Fm3m space group.

FIG. 90GG shows a calculated energy-crystal momentum (E-k) dispersion plot in the vicinity of the Brillouin-zone center for $Mg_{0.75}Zn_{0.25}O$ with a Fd3m space group.

FIG. 90HH shows a calculated energy-crystal momentum (E-k) dispersion plot in the vicinity of the Brillouin-zone center for $ErAlO_3$ with a P63mcm space group.

FIG. 90II shows a calculated energy-crystal momentum (E-k) dispersion plot in the vicinity of the Brillouin-zone center for $Zn_2$ $Ge_1O_4$ with a R3 space group.

FIG. 90JJ shows a calculated energy-crystal momentum (E-k) dispersion plot in the vicinity of the Brillouin-zone center for $LiNi_2O_4$ with a P4332 space group.

FIG. 90KK shows a calculated energy-crystal momentum (E-k) dispersion plot in the vicinity of the Brillouin-zone center for $GeLi_4O_4$ with a Cmcm space group.

FIG. 90LL shows a calculated energy-crystal momentum (E-k) dispersion plot in the vicinity of the Brillouin-zone center for $GeLi_2O_3$ with a Cmc21 space group.

FIG. 90MM shows a calculated energy-crystal momentum (E-k) dispersion plot in the vicinity of the Brillouin-zone center for $Zn(Al_{0.5}Ga_{0.5})_2O_4$ with a Fd3m space group.

FIG. 90NN shows a calculated energy-crystal momentum (E-k) dispersion plot in the vicinity of the Brillouin-zone center for $Mg(Al_{0.5}Ga_{0.5})_2O_4$ with a Fd3m space group.

FIG. 90OO shows a calculated energy-crystal momentum (E-k) dispersion plot in the vicinity of the Brillouin-zone center for $(Mg_{0.5}Zn_{0.5})Al_2O_4$ with a Fd3m space group.

FIG. 90PP shows a calculated energy-crystal momentum (E-k) dispersion plot in the vicinity of the Brillouin-zone center for $(Mg_{0.5}Ni_{0.5})Al_2\ O_4$ with a Fd3m space group.

FIG. 90QQ shows a calculated energy-crystal momentum (E-k) dispersion plot in the vicinity of the Brillouin-zone center for $\beta(Al_0Ga_{1.0})_2O_3$ (i.e., $\beta Ga_2O_3$) with a C2m space group.

FIG. 90RR shows a calculated energy-crystal momentum (E-k) dispersion plot in the vicinity of the Brillouin-zone center for $\beta(Al_{0.125}Ga_{0.875})_2O_3$ with a C2m space group.

FIG. 90SS shows a calculated energy-crystal momentum (E-k) dispersion plot in the vicinity of the Brillouin-zone center for $\beta(Al_{0.25}Ga_{0.75})_2O_3$ with a C2m space group.

FIG. 90TT shows a calculated energy-crystal momentum (E-k) dispersion plot in the vicinity of the Brillouin-zone center for $\beta(Al_{0.375}Ga_{0.625})_2O_3$ with a C2m space group.

FIG. 90UU shows a calculated energy-crystal momentum (E-k) dispersion plot in the vicinity of the Brillouin-zone center for $\beta(Al_{0.5}Ga_{0.5})_2O_3$ with a C2m space group.

FIG. 90VV shows a calculated energy-crystal momentum (E-k) dispersion plot in the vicinity of the Brillouin-zone center for $\beta(Al_{1.0}Ga_{0.0})_2O_3$ (i.e., θ-Aluminum Oxide) with a C2m space group.

FIG. 90WW shows a calculated energy-crystal momentum (E-k) dispersion plot in the vicinity of the Brillouin-zone center for $GeO_2$ with a P42mnm space group.

FIG. 90XX shows a calculated energy-crystal momentum (E-k) dispersion plot in the vicinity of the Brillouin-zone center for $Ge(Mg_{0.5}Zn_{0.5})_2O_4$ with a Fd3m space group.

FIG. 90YY shows a calculated energy-crystal momentum (E-k) dispersion plot in the vicinity of the Brillouin-zone center for $(Ni_{0.5}Zn_{0.5})Al_2O_4$ with a Fd3m space group.

FIG. 90ZZ shows a calculated energy-crystal momentum (E-k) dispersion plot in the vicinity of the Brillouin-zone center for LiF with a Fm3m space group.

Figure 91:
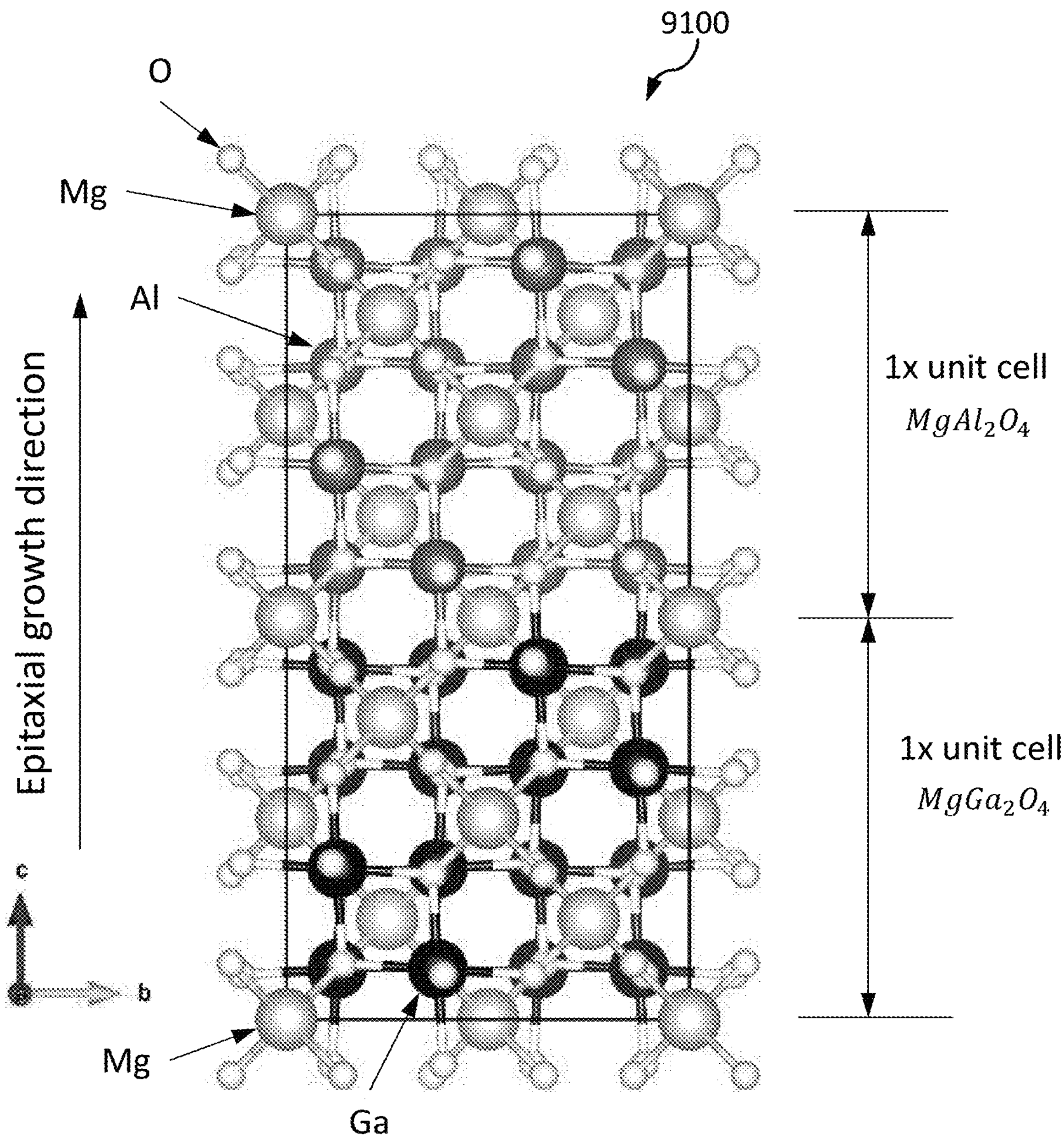

FIG. 91 shows an atomic crystal structure of a heterojunction between $MgGa_2O_4$ and $MgAl_2O_4$ epitaxial oxide material.

Figure 92A:
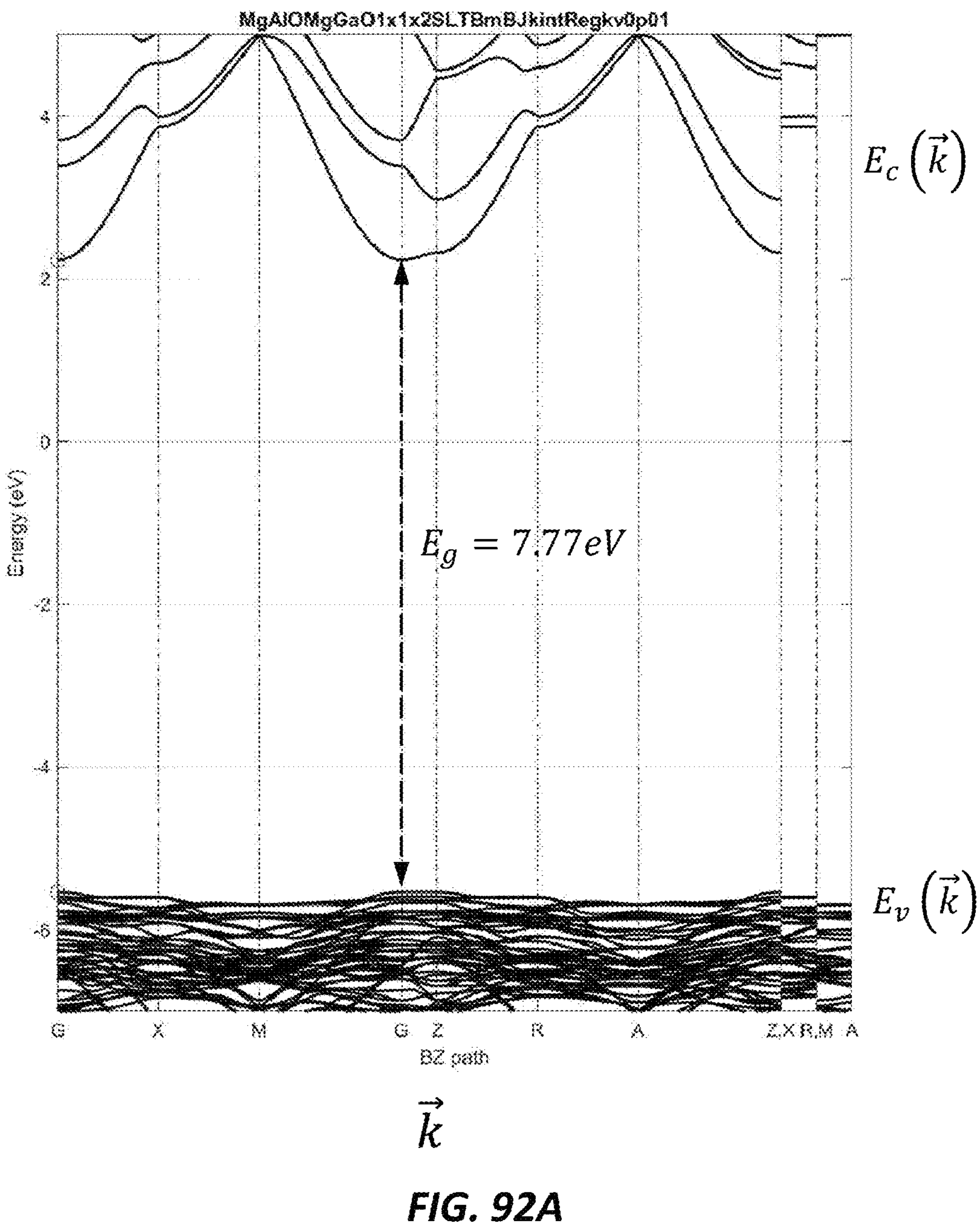

FIG. 92A shows a calculated energy-crystal momentum (E-k) dispersion plot in the vicinity of the Brillouin-zone center for a superlattice comprising $[MgAl_2O_4]_1|[MgGa_2O_4]_1$ with a Fd3m space group for the unit cells.

Figure 92B:
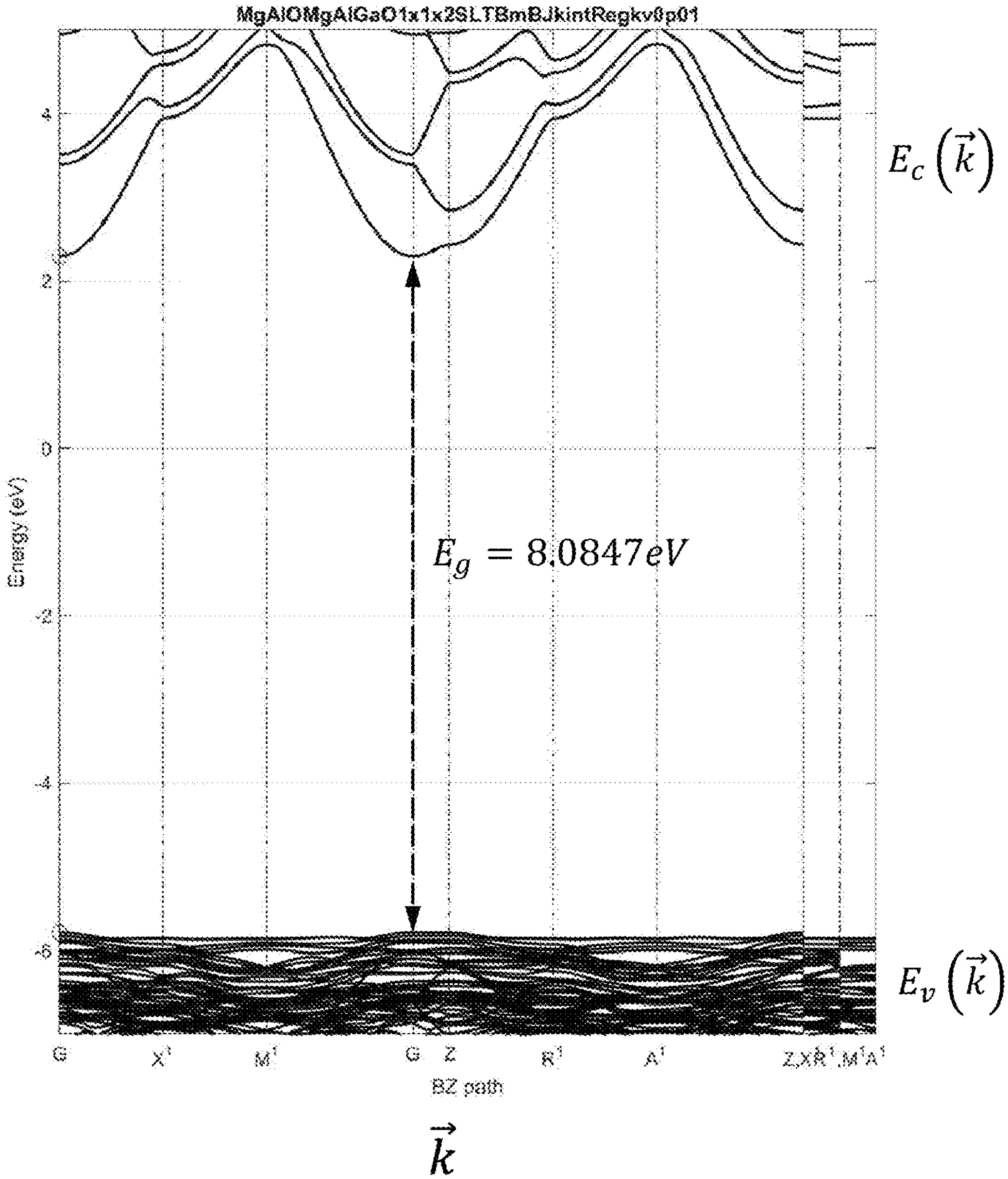

FIG. 92B shows a calculated energy-crystal momentum (E-k) dispersion plot in the vicinity of the Brillouin-zone center for a superlattice comprising $[MgAl_2O_4]_1|[Mg(Al_{0.5}Ga_{0.5})_2O_4]_1$ with a Fd3m space group for the unit cells.

Figure 92C:
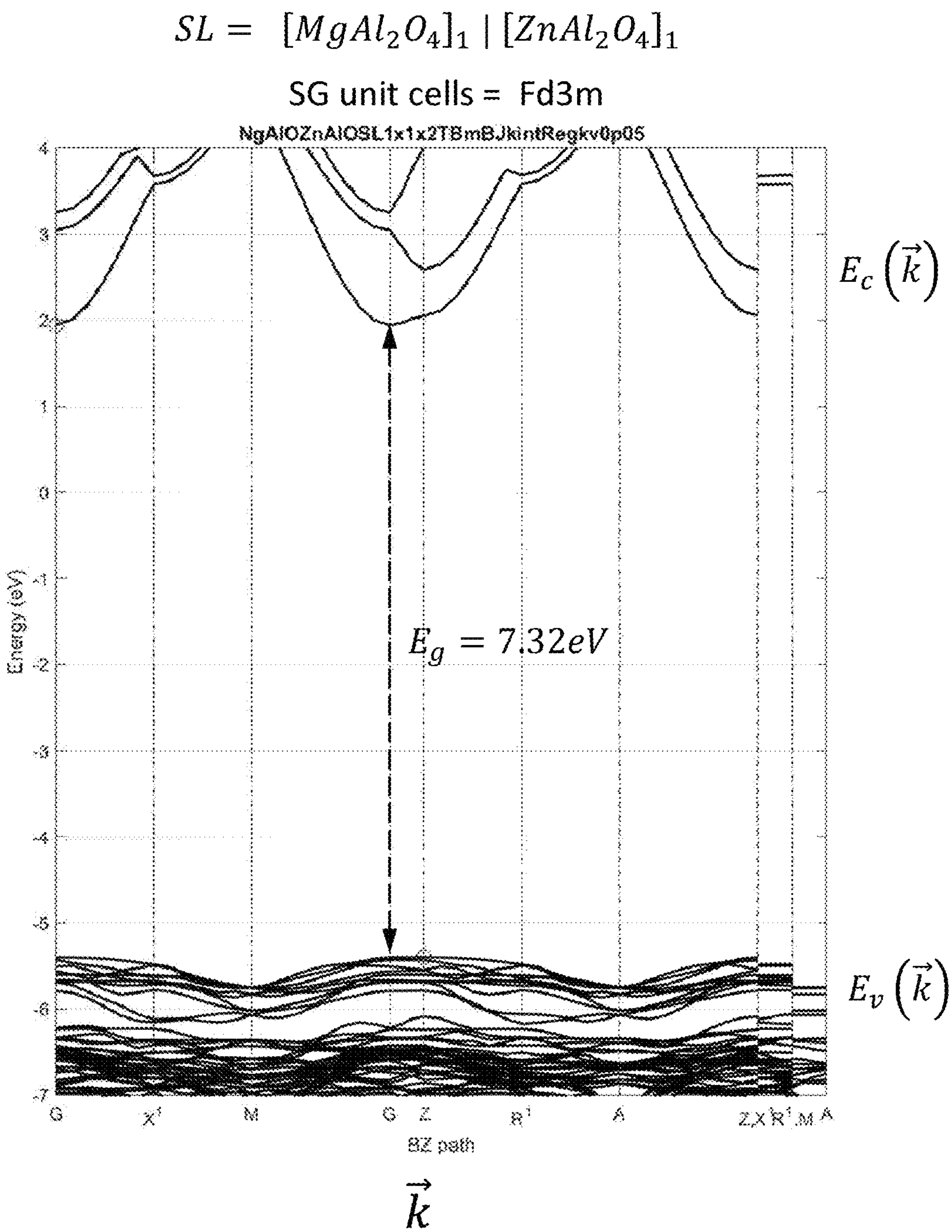

FIG. 92C shows a calculated energy-crystal momentum (E-k) dispersion plot in the vicinity of the Brillouin-zone center for a superlattice comprising $[MgAl_2O_4]_1|[ZnAl_2O_4]_1$ with a Fd3m space group for the unit cells.

Figure 92D:
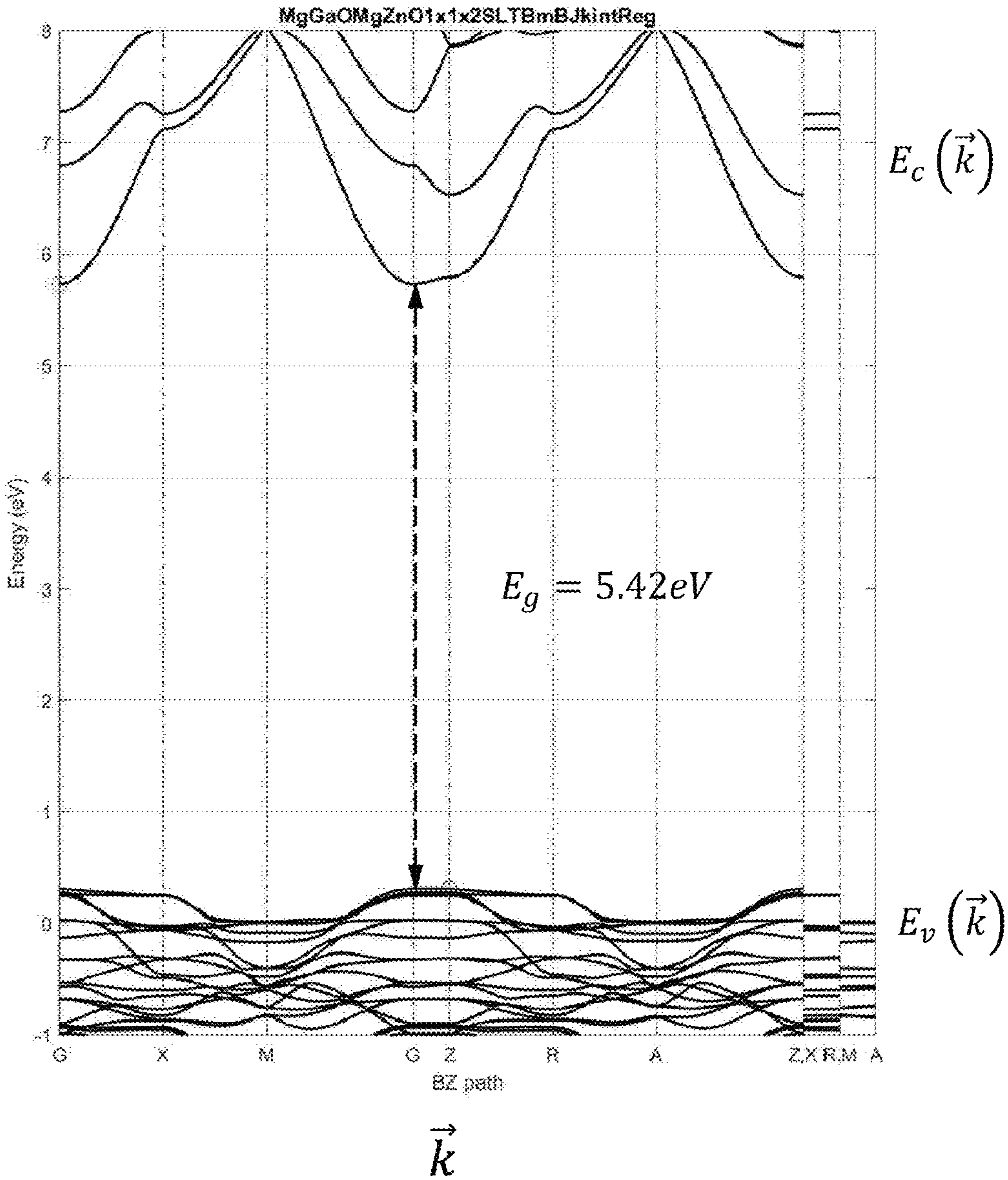

FIG. 92D shows a calculated energy-crystal momentum (E-k) dispersion plot in the vicinity of the Brillouin-zone center for a superlattice comprising $[MgGa_2O_4]_1|[(Mg_{0.5}Zn_{0.5})O]_1$ with a Fd3m space group for the unit cells.

Figure 92E:
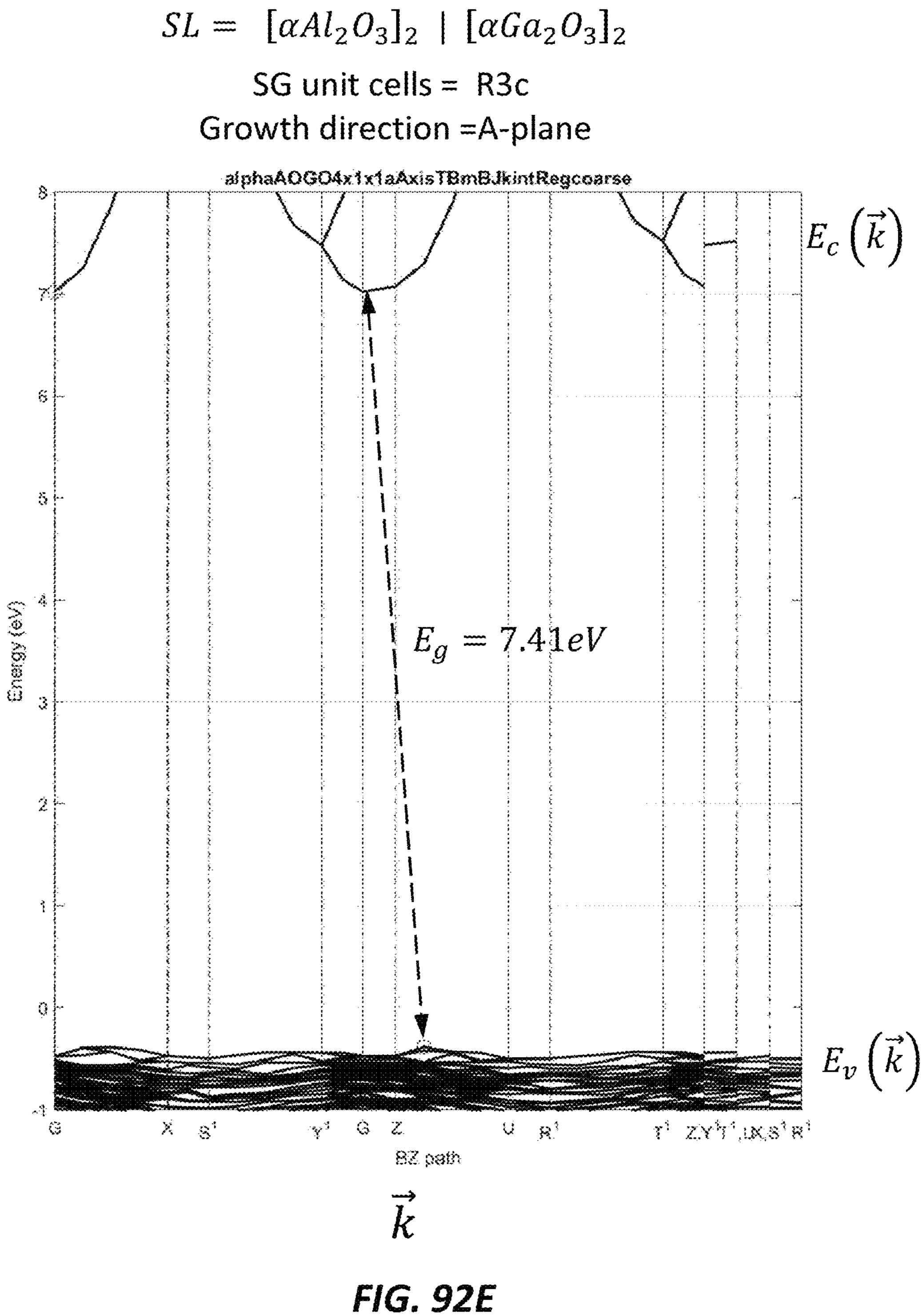

FIG. 92E shows a calculated energy-crystal momentum (E-k) dispersion plot in the vicinity of the Brillouin-zone center for a superlattice comprising $[\alpha Al_2O_3]_2|[\alpha Ga_2O_3]_2$ with a R3c space group for the unit cells and a growth direction in the A-plane.

Figure 92F:
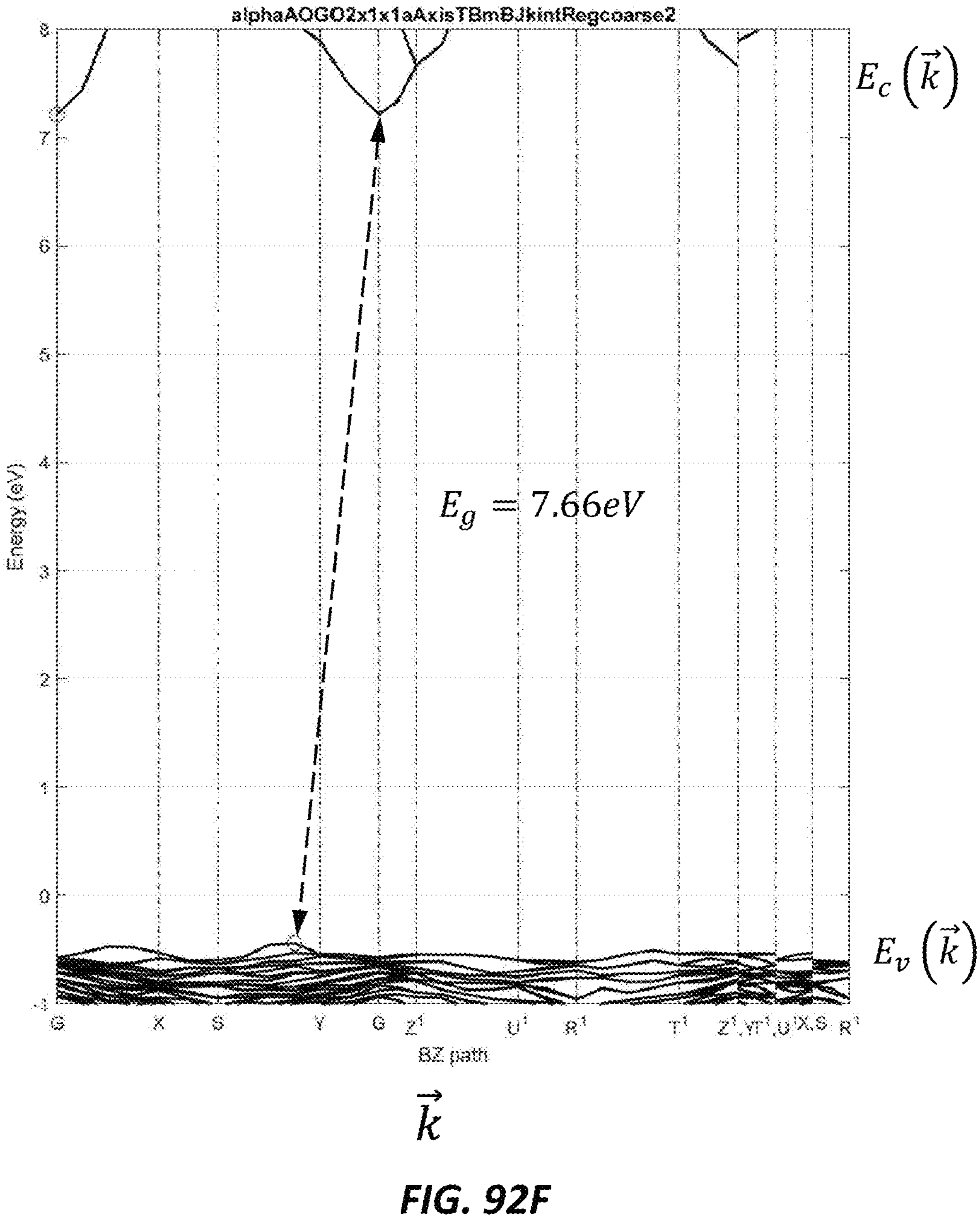

FIG. 92F shows a calculated energy-crystal momentum (E-k) dispersion plot in the vicinity of the Brillouin-zone center for a superlattice comprising $[\alpha Al_2O_3]_1|[\alpha Ga_2O_3]_1$ with a R3c space group for the unit cells and a growth direction in the A-plane.

Figure 92G:
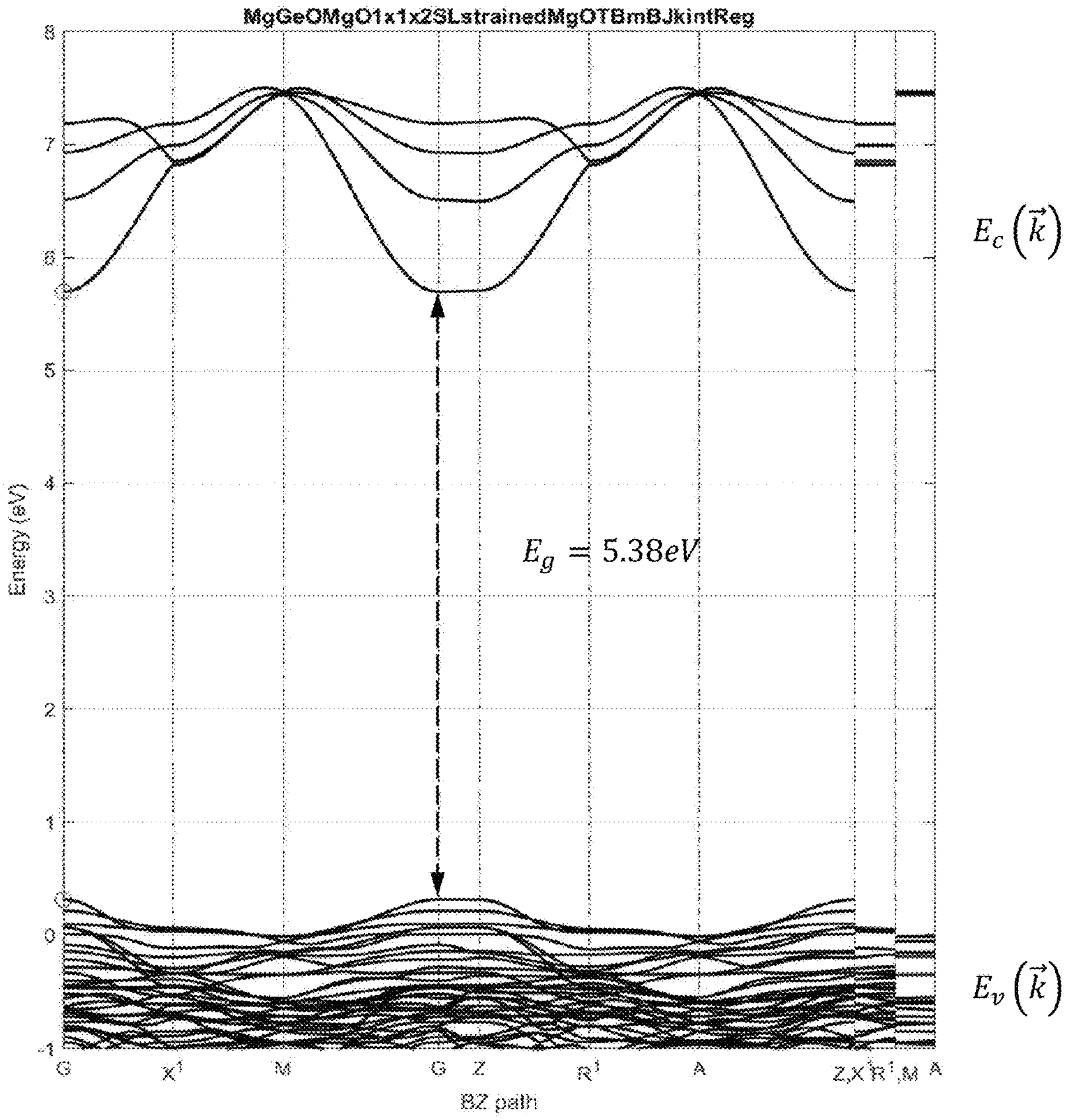

FIG. 92G shows a calculated energy-crystal momentum (E-k) dispersion plot in the vicinity of the Brillouin-zone center for a superlattice comprising $[GeMg_2O_4]_1|[MgO]_1$ with Fd3m/Fd3m space groups for the unit cells.

Figure 93:
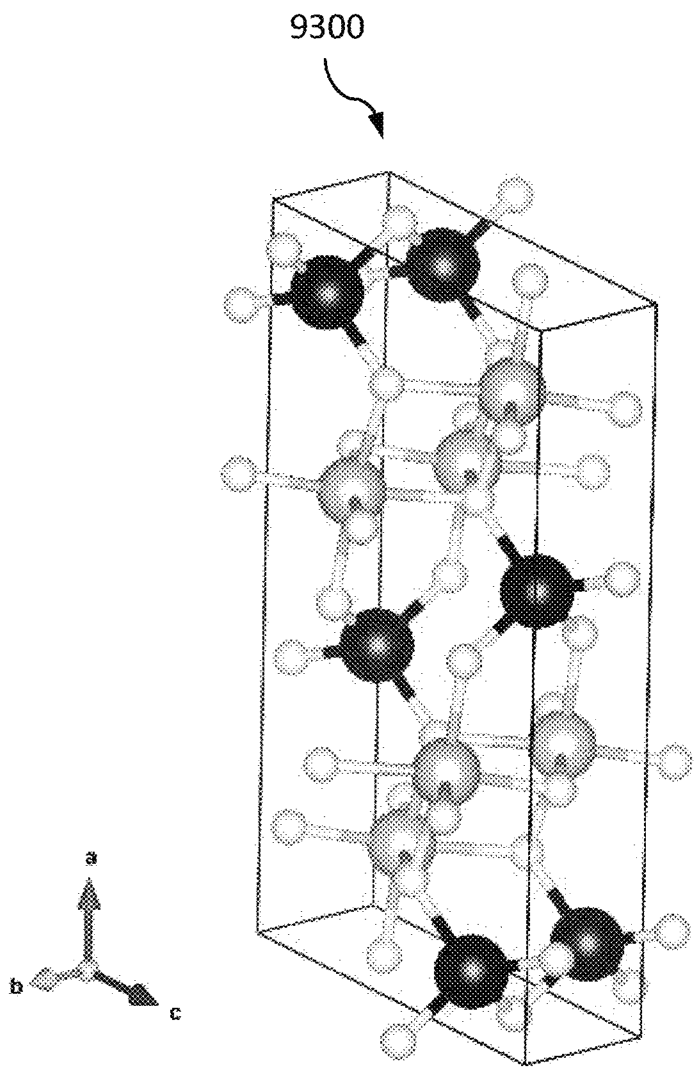

FIG. 93 shows an atomic crystal structure of $\beta$-$(Al_{0.5}Ga_{0.5})_2O_3$ with a space group C2m.

Figure 94:
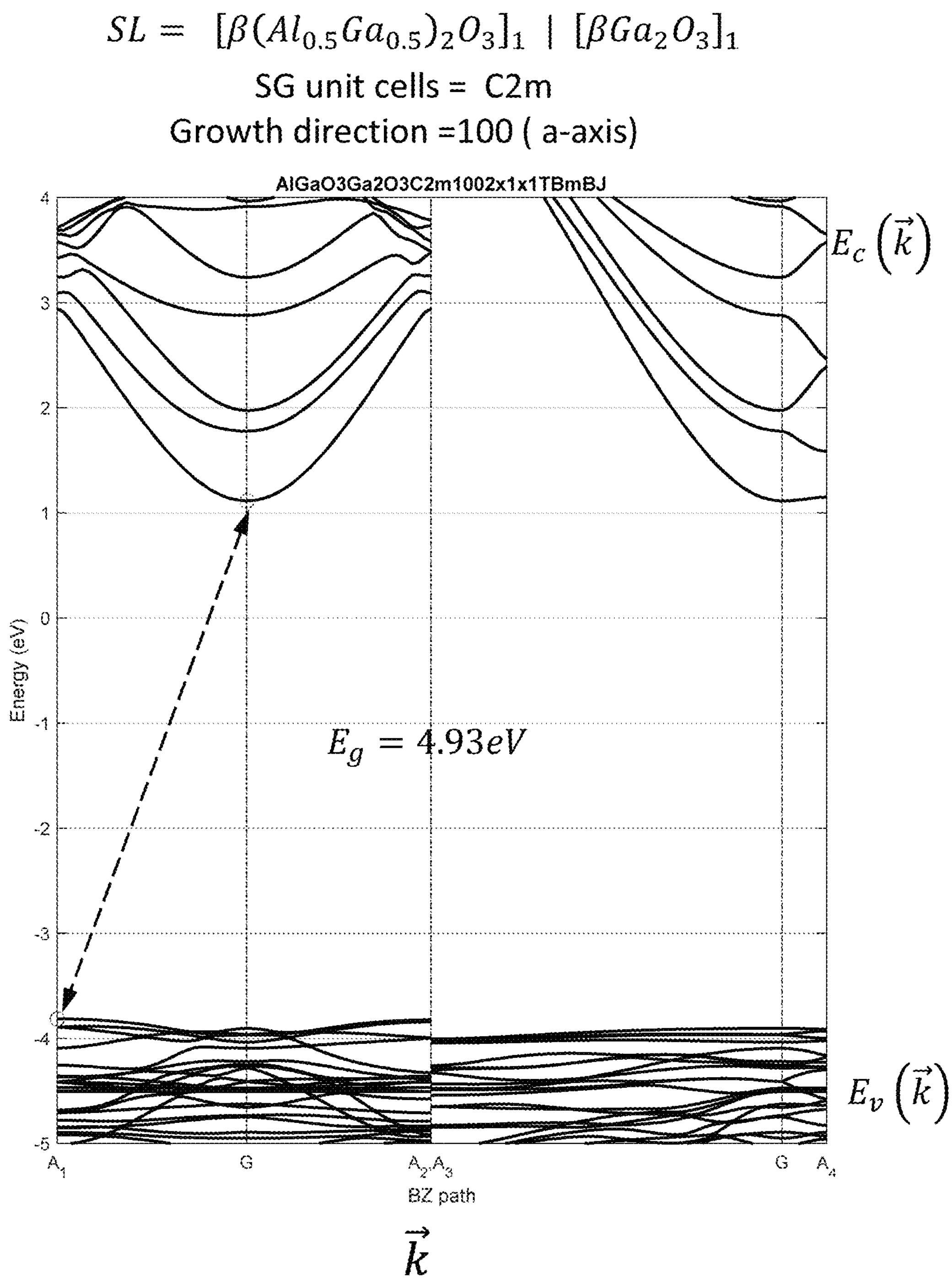
Figure 95A:
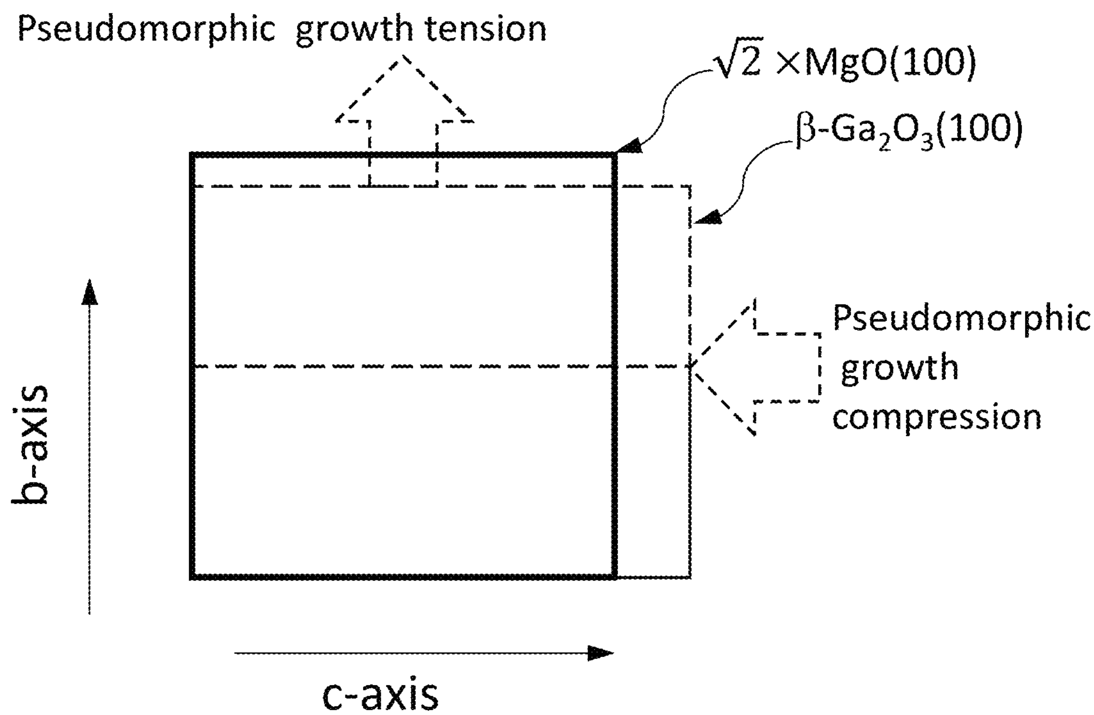

FIG. 94 shows a DFT calculated energy-crystal momentum (E-k) dispersion plot in the vicinity of the Brillouin-zone center for a superlattice with $\beta$-$(Al_{0.5}Ga_{0.5})_2O_3$ and $\beta$-$Ga_2O_3$ FIG. 95A shows a schematic of a $\beta$-$Ga_2O_3$(100) film coherently (and pseudomorphically) strained to an MgO (100) substrate depicting the in-plane unit cell alignment (in plan view, along the "b" and "c" direction).

Figure 95B:
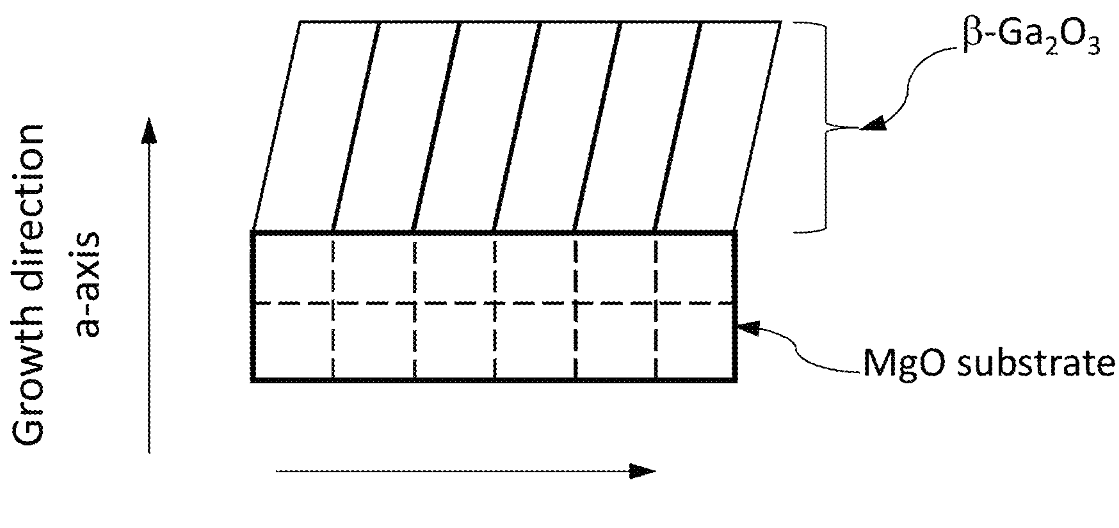

FIG. 95B shows a schematic of a $\beta$-$Ga_2O_3$(100) film coherently (and pseudomorphically) strained to an MgO (100) substrate depicting the unit cell alignment along the growth direction ("a") where the lattice of the film is rotated by 45° with respect to that of the substrate.

Figure 96:
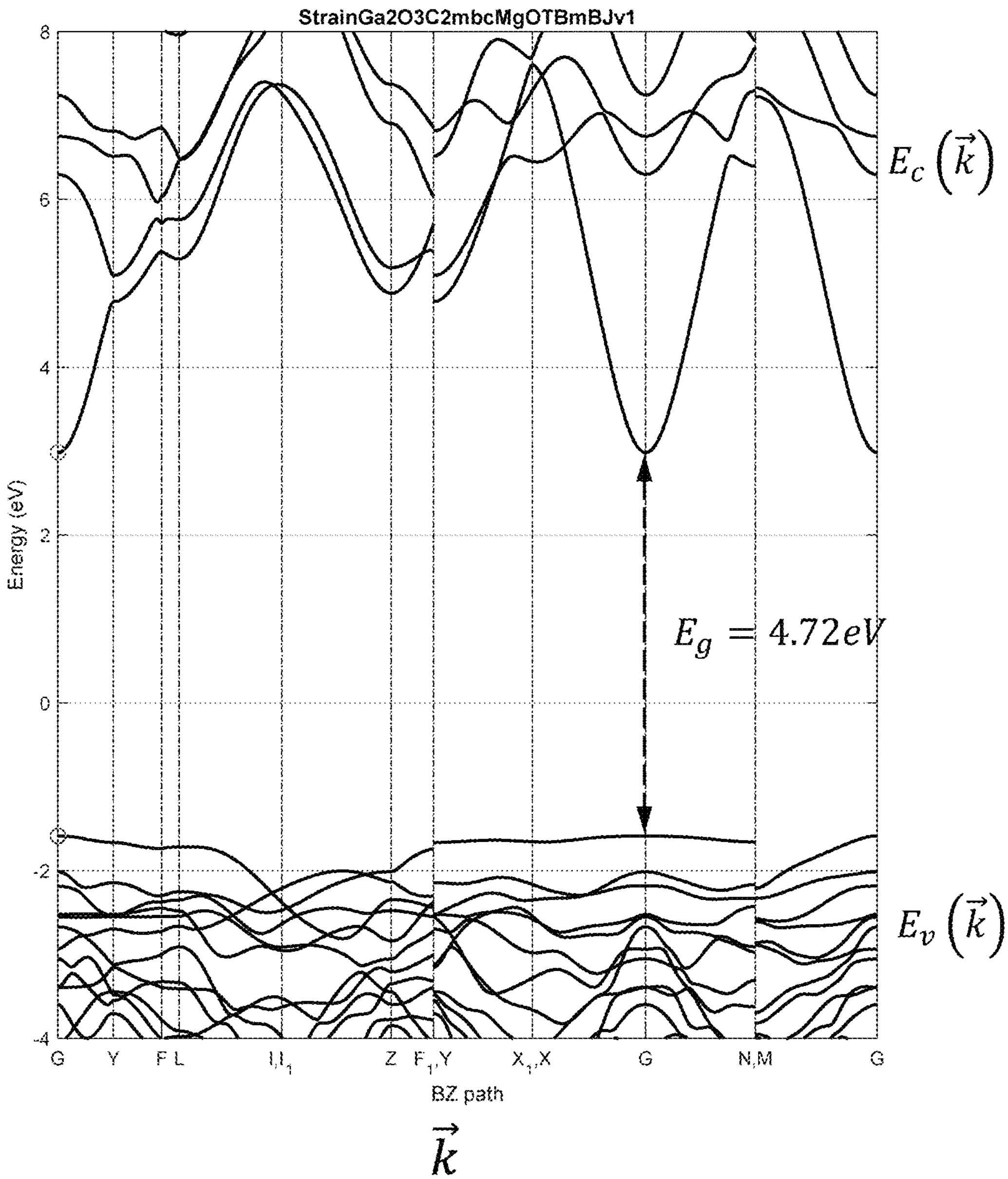

FIG. 96 shows a DFT calculated energy-crystal momentum (E-k) dispersion plot in the vicinity of the Brillouin-zone center for $\beta$-$Ga_2O_3$ pseudomorphically strained to the lattice of MgO rotated by 45°.

Figure 97:
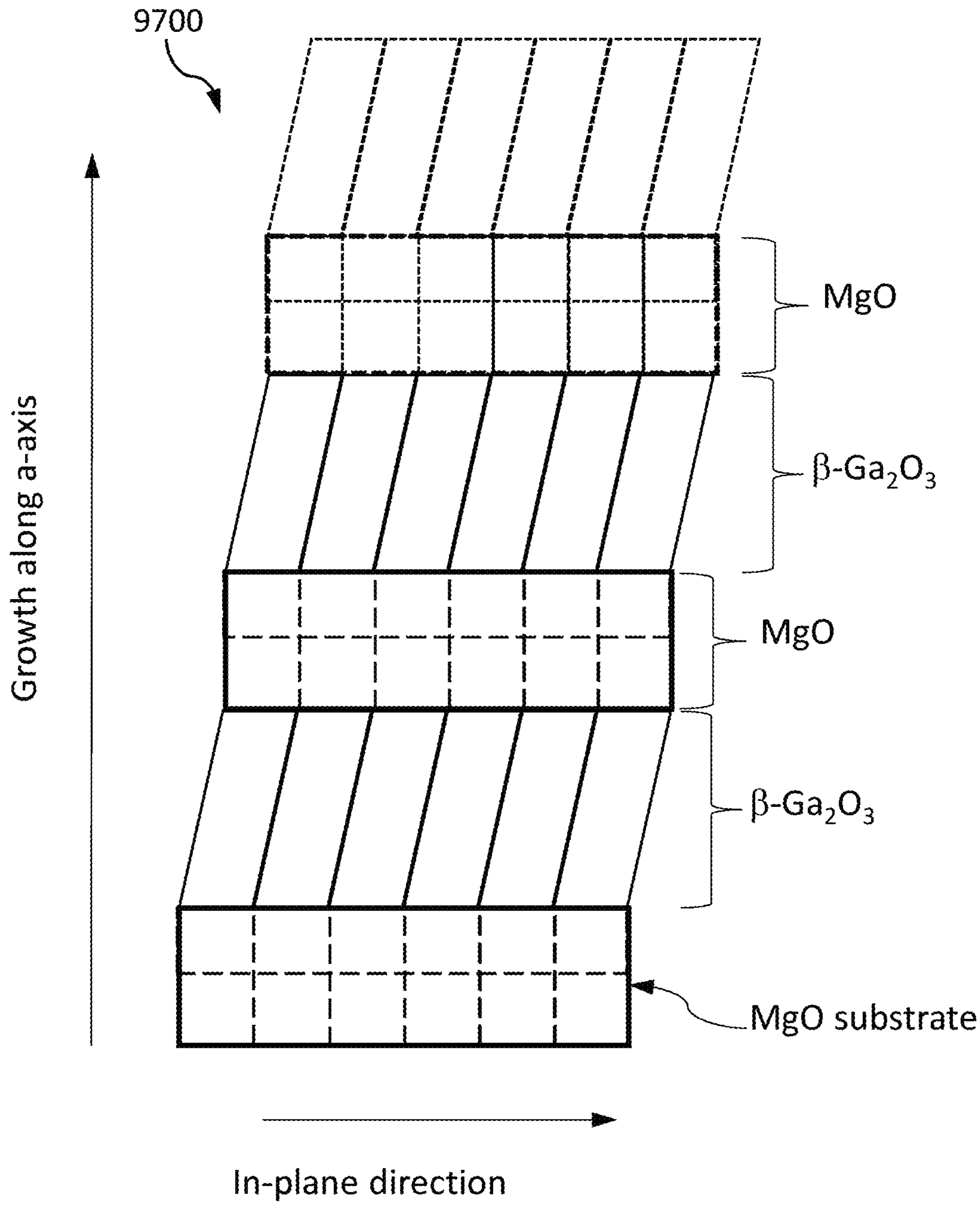

FIG. 97 shows a schematic of a superlattice formed from alternating layers (with one or more unit cells in each layer) of $\beta$-$Ga_2O_3$ and MgO, where the $\beta$-$Ga_2O_3$ layers are pseudomorphically strained to the lattice of MgO rotated by 45°.

FIG. 98A is a table of crystal structure properties of example epitaxial films and substrates that are compatible with $Mg_2GeO_4$.

FIG. 98B is a table of compatibility of $\beta$-$Ga_2O_3$ with various heterostructure materials.

FIG. 99 is a table describing a selection of possible oxide material compositions comprising constituent elements (Mg, Zn, Al, Ga, O).

FIG. 100 shows a schematic of an epitaxial layered structure formed from at least two distinct materials further selected from categories of Oxide_type_A and Oxide_type_B shown in FIG. 99.

Figure 101:
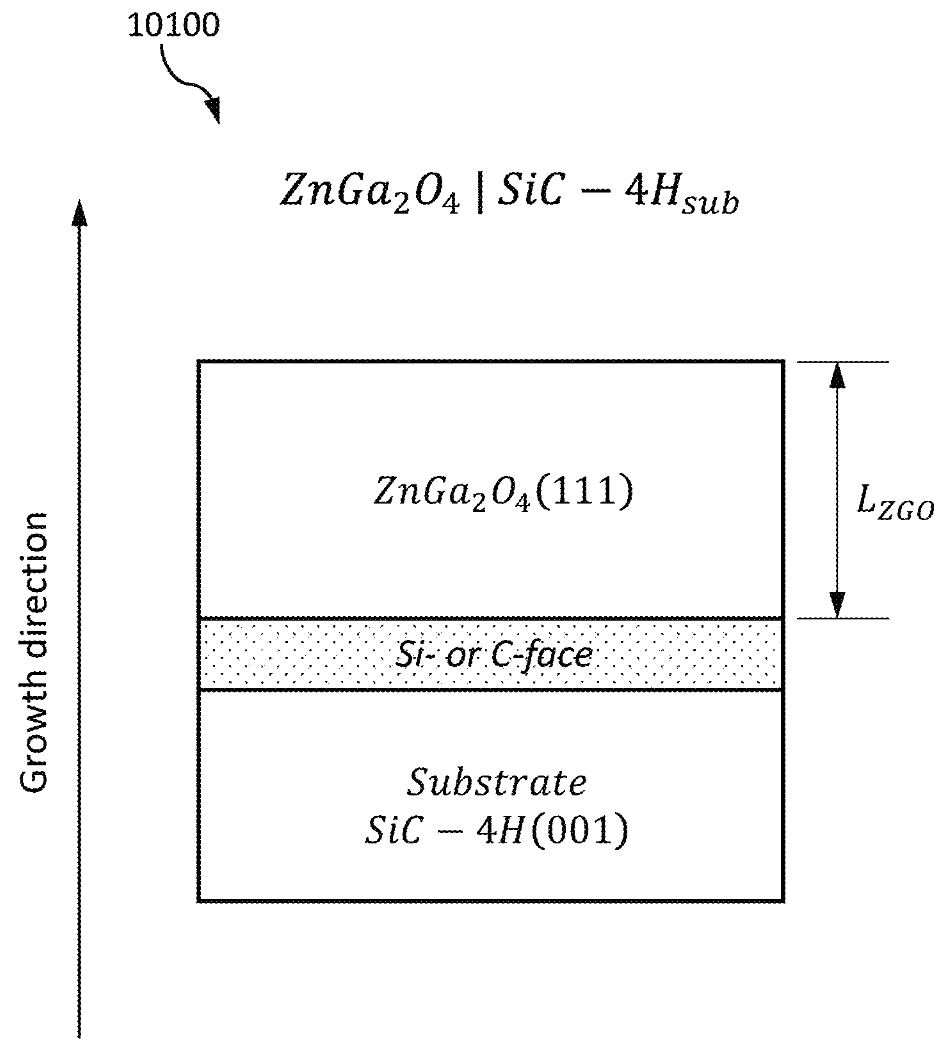

FIG. 101 shows the single crystal orientation of an ultrawide bandgap cubic oxide composition comprising $ZnGa_2O_4$ (ZGO) epitaxially deposited and formed on a smaller bandgap wurtzite type crystal surface of SiC-4H.

Figure 102:
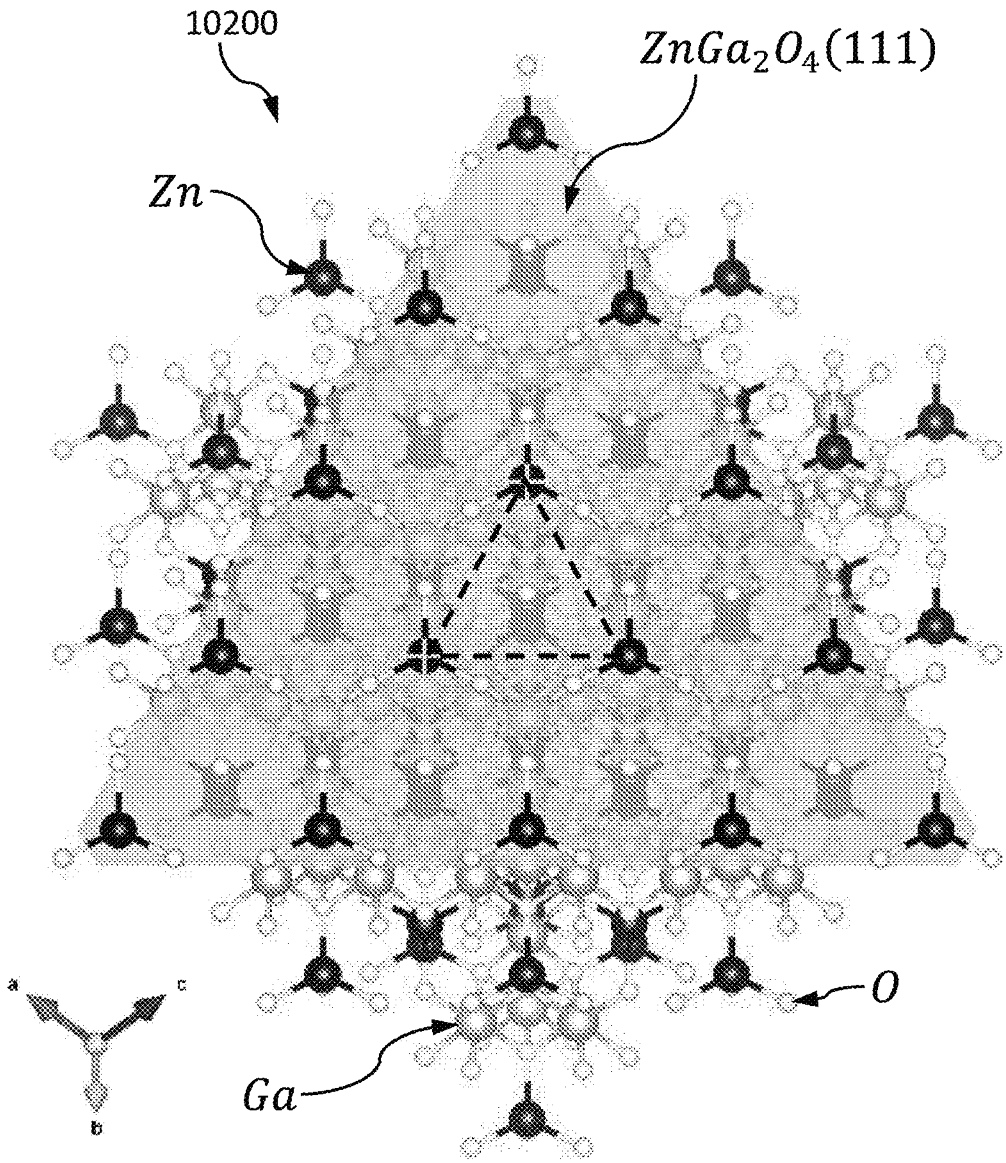

FIG. 102 shows the atomic configuration of the $ZnGa_2O_4$ (111) surface represented by the shaded triangular area.

Figure 103A:
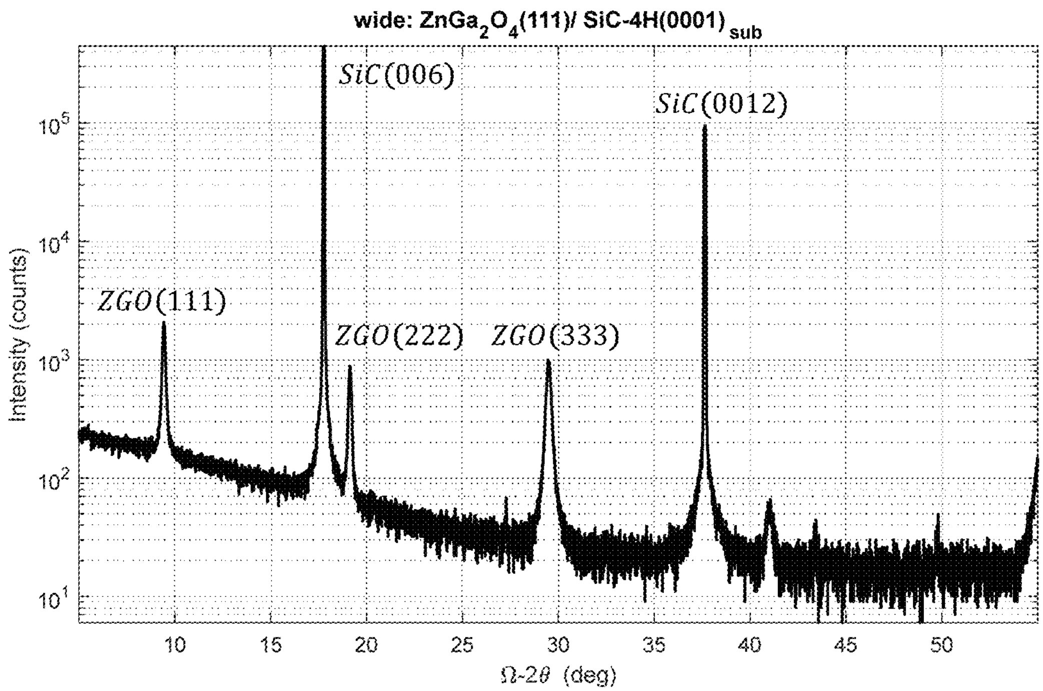
Figure 103B:
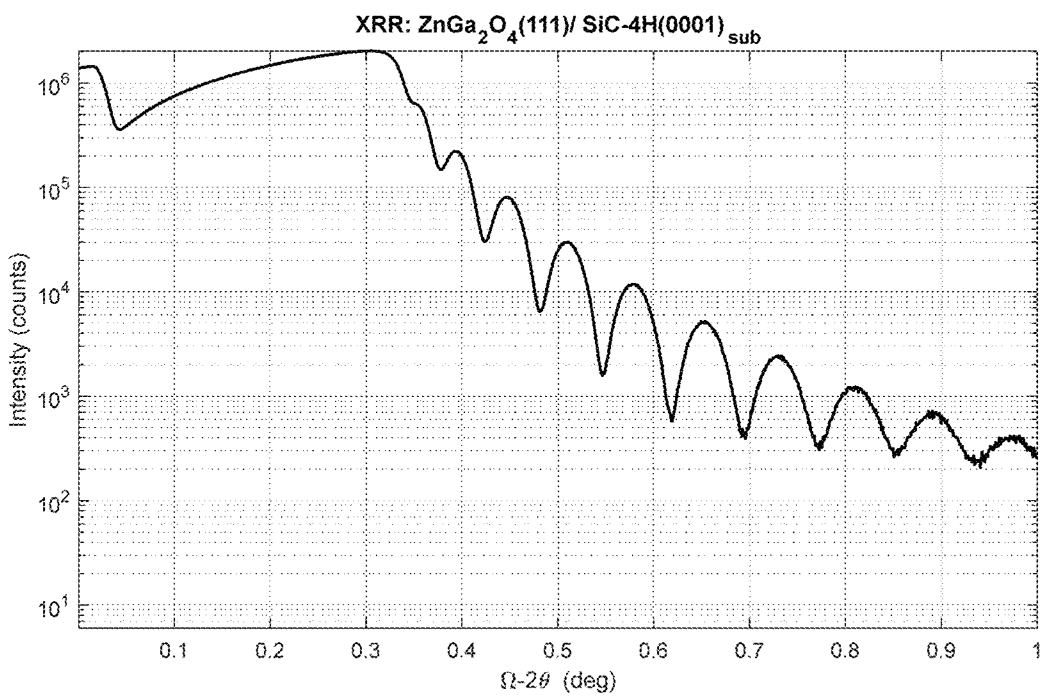

FIGS. 103A and 103B show the experimental XRD and XRR data of a $ZGa_2O_4$(111)-oriented film to be formed epitaxially on a prepared SiC-4H(0001) surface.

Figure 104A:
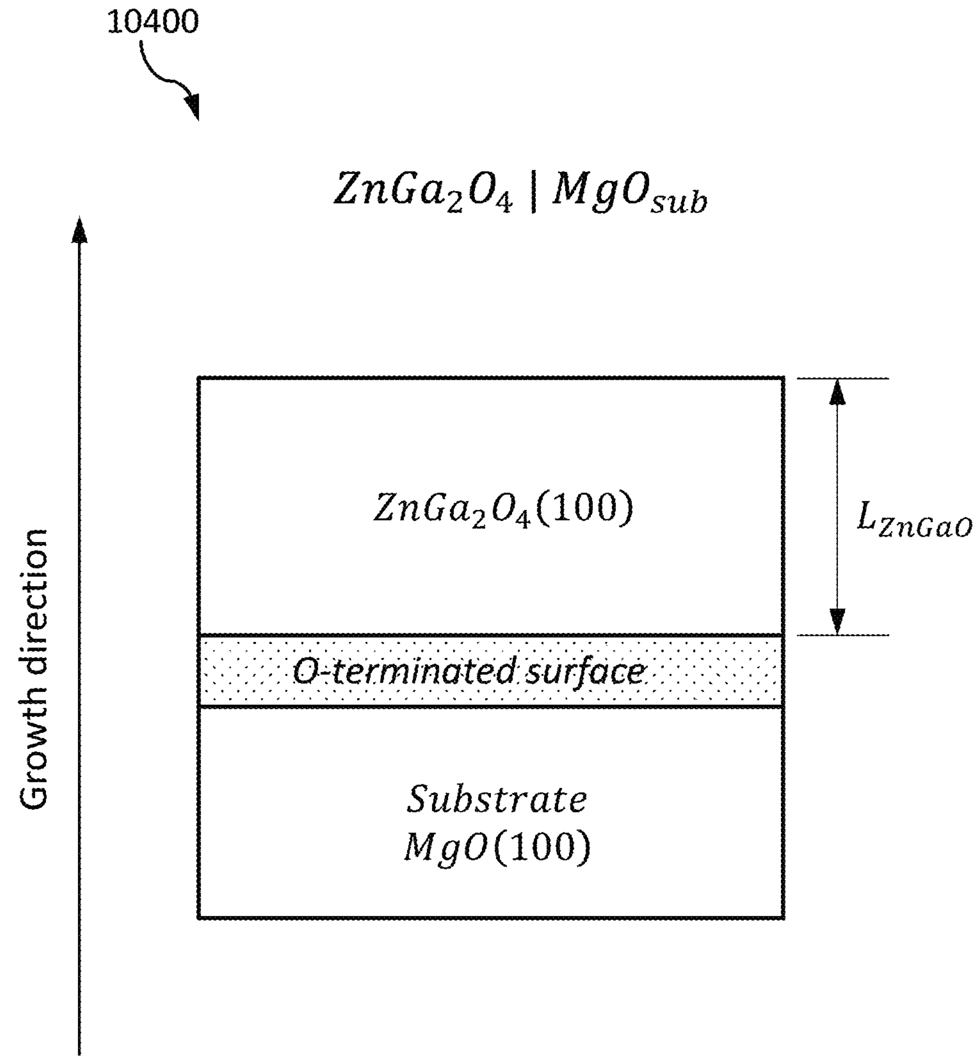

FIG. 104A shows a schematic diagram of a large lattice constant cubic oxide represented by $ZnGa_2O_4$ formed on a smaller cubic lattice constant oxide represented by MgO.

Figure 104B:
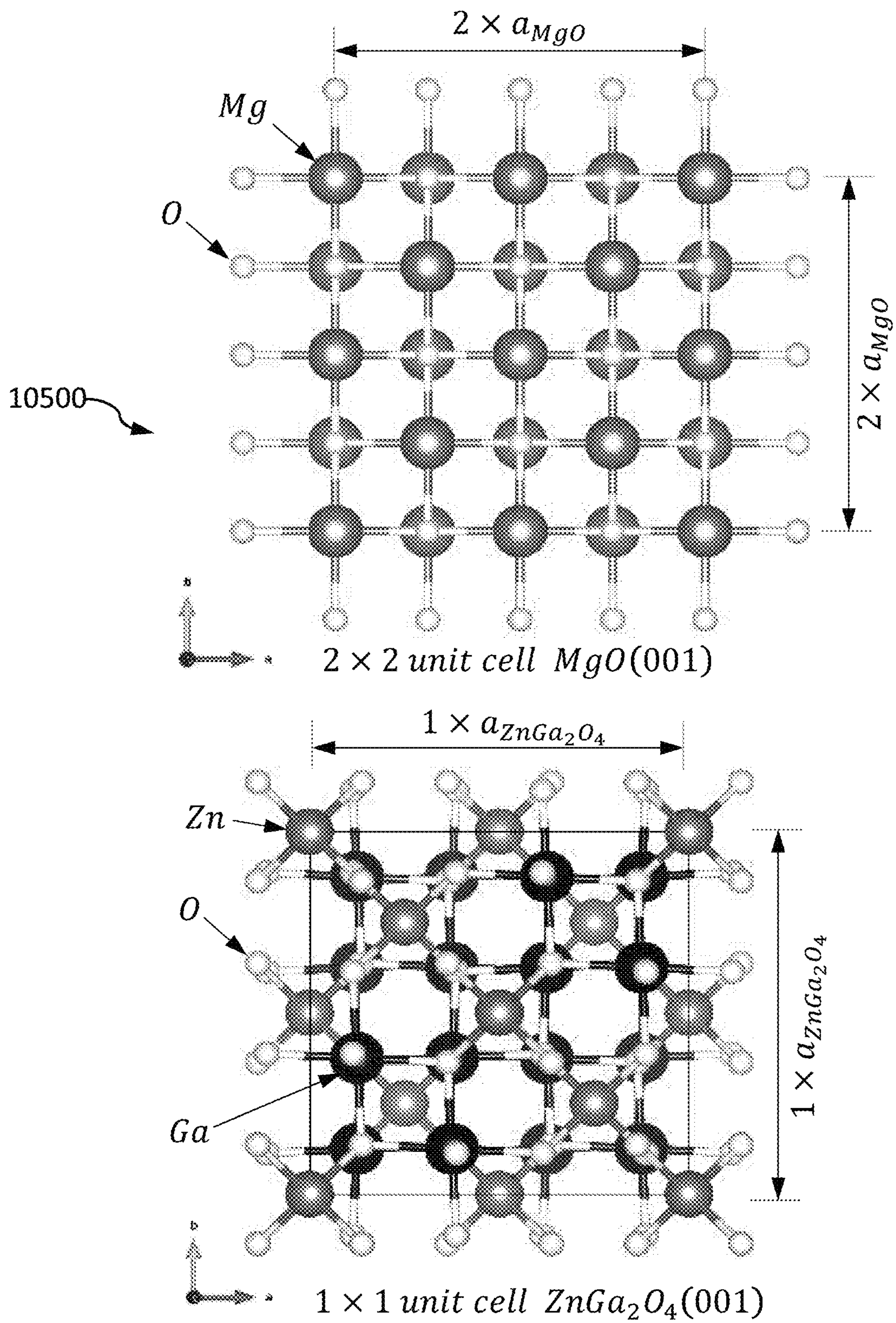

FIG. 104B shows the crystal structures of the epitaxial growth surfaces presented for the structure of FIG. 104A comprising respectively the upper and lower atomic structures of MgO(100) and $ZnGa_2O_4$(100).

Figure 105A:
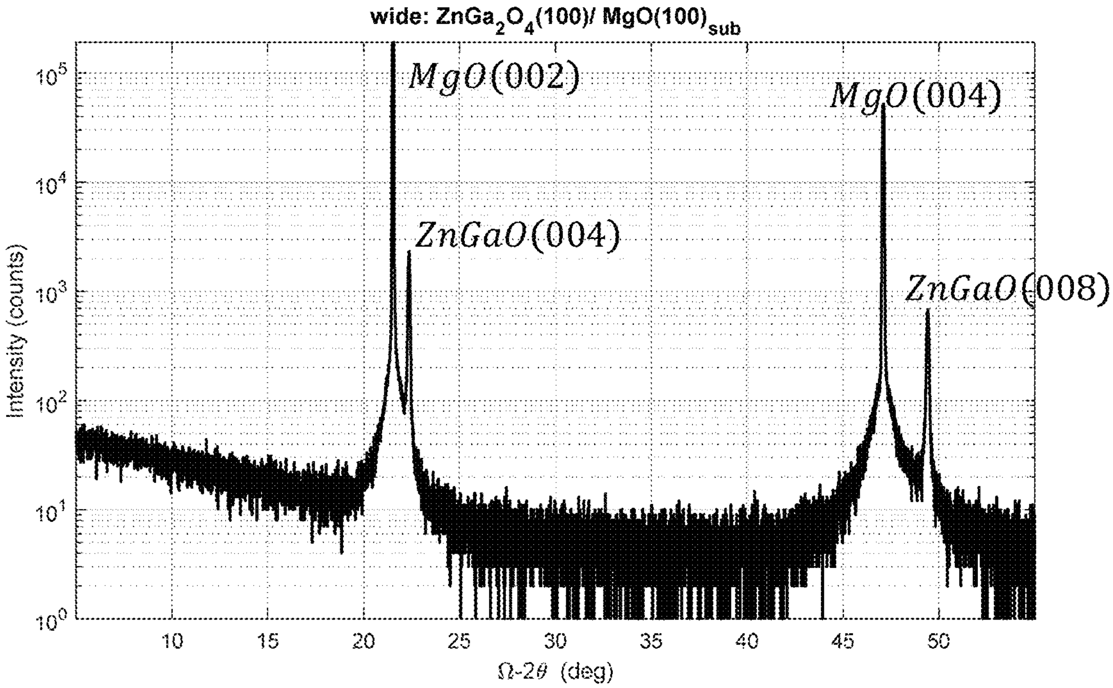
Figure 105B:
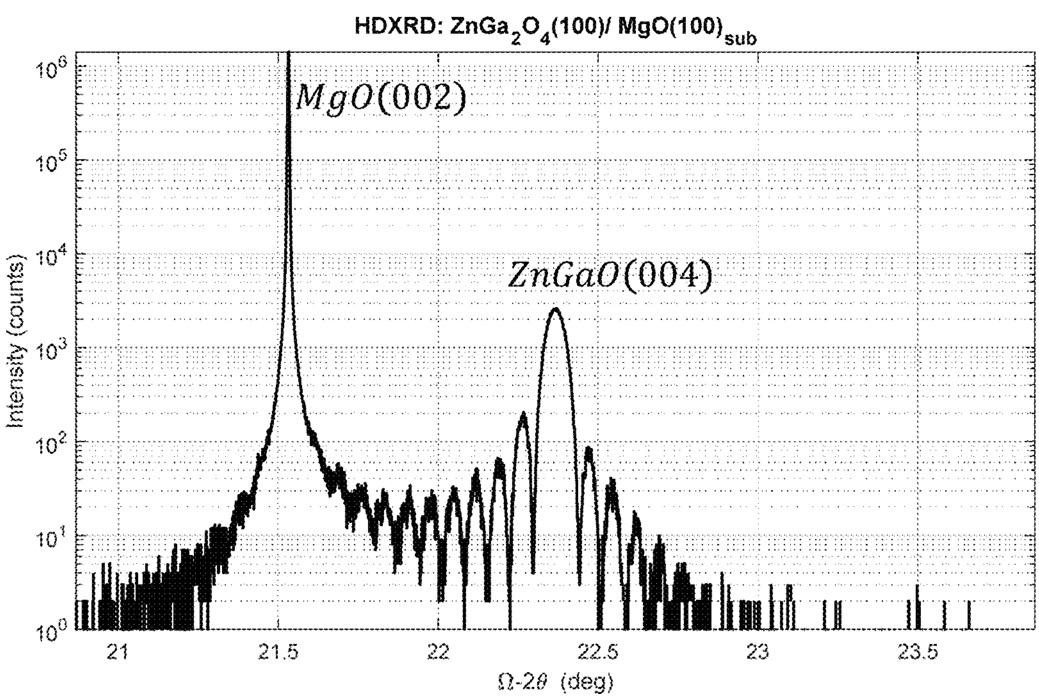

FIGS. 105A and 105B show the experimental XRD data of a high structural quality epilayer of a $ZnGa_2O_4$ film deposited on a MgO substrate.

Figure 106:
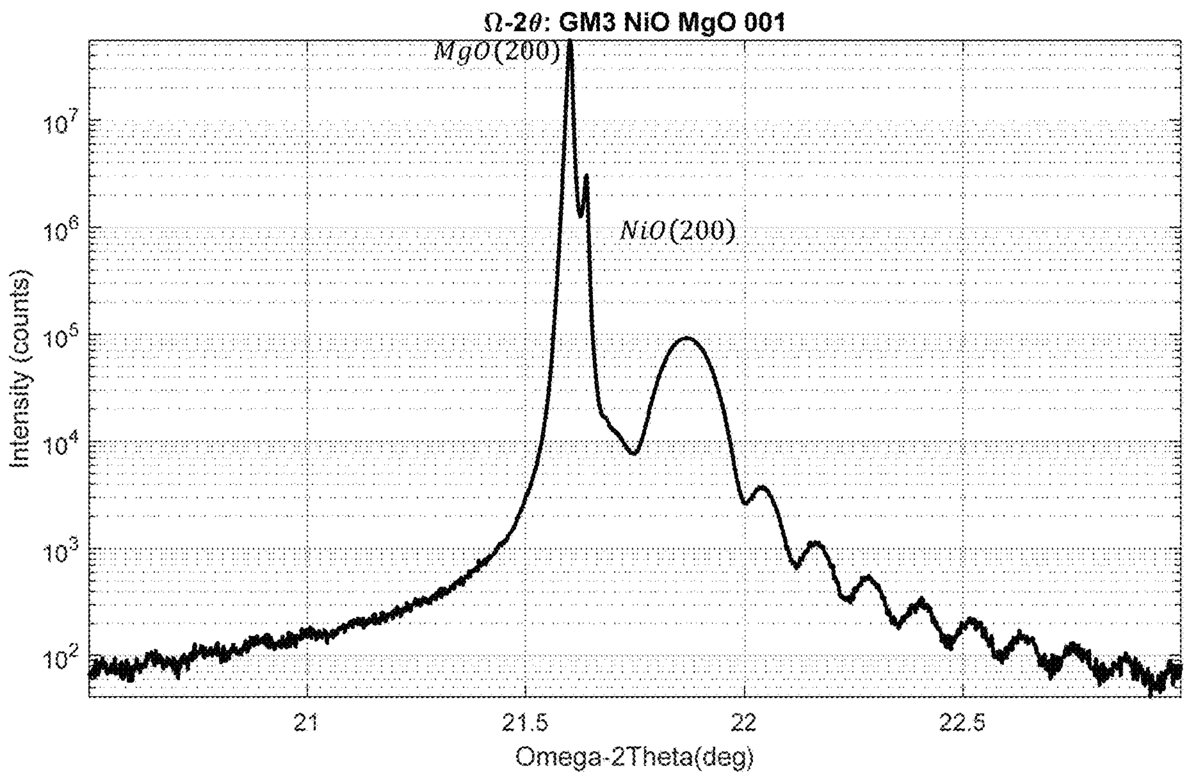

FIG. 106 shows the experimental XRD data of a high structural quality epilayer of an NiO film deposited on a MgO substrate.

Figure 107:
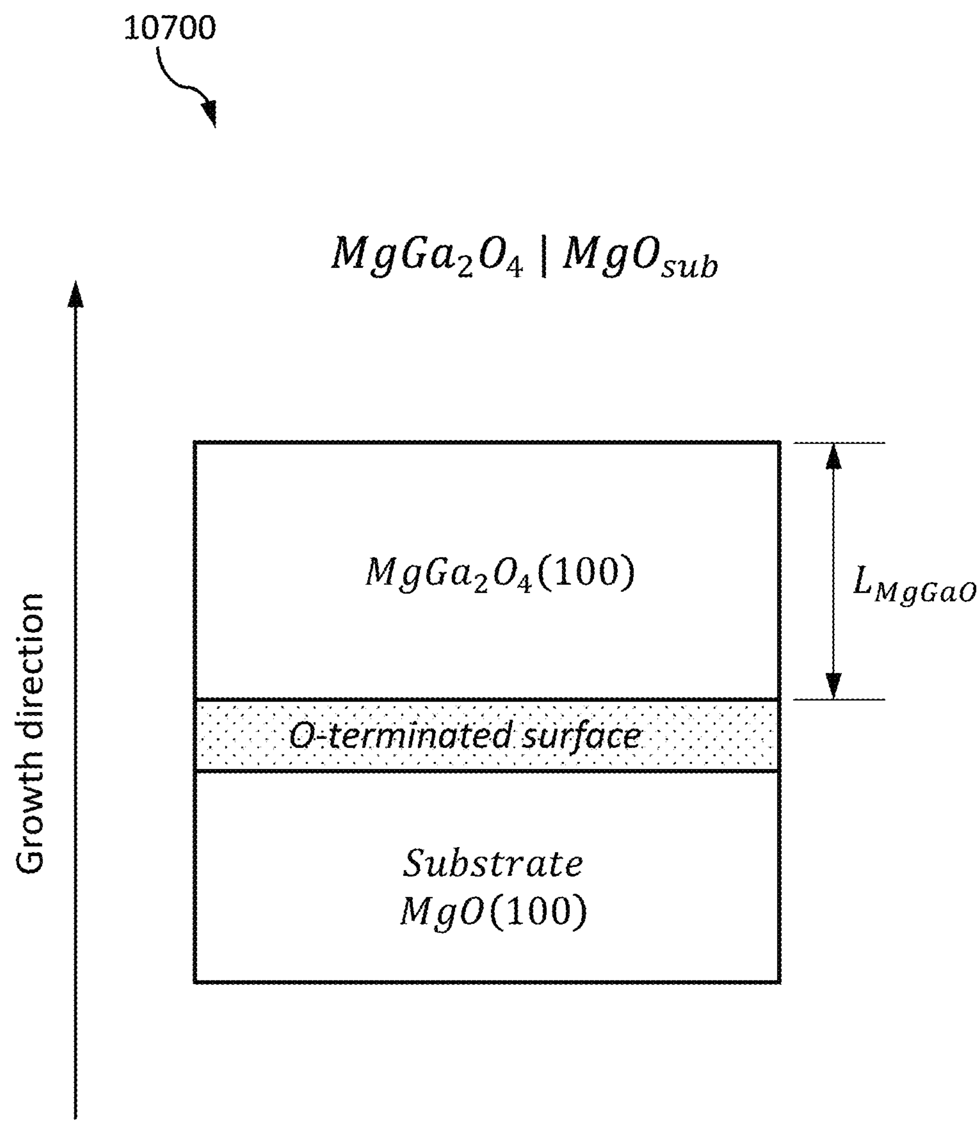

FIG. 107 shows a schematic diagram of a large lattice constant cubic oxide represented by $MgGa_2O_4$ formed on a smaller cubic lattice constant oxide represented by MgO.

Figure 108A:
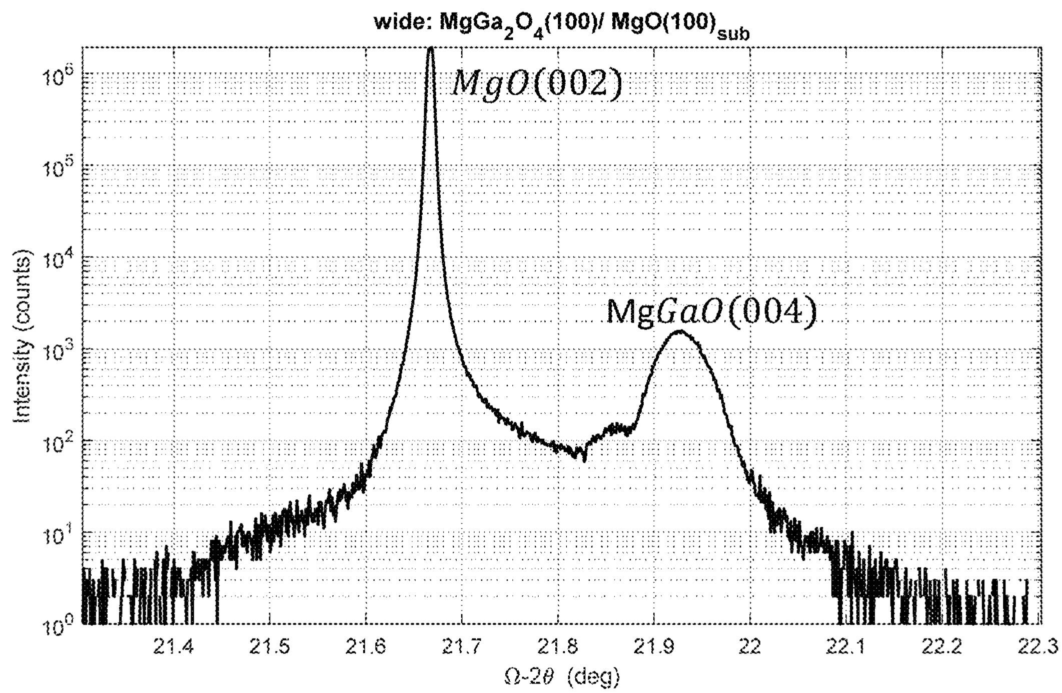
Figure 108B:
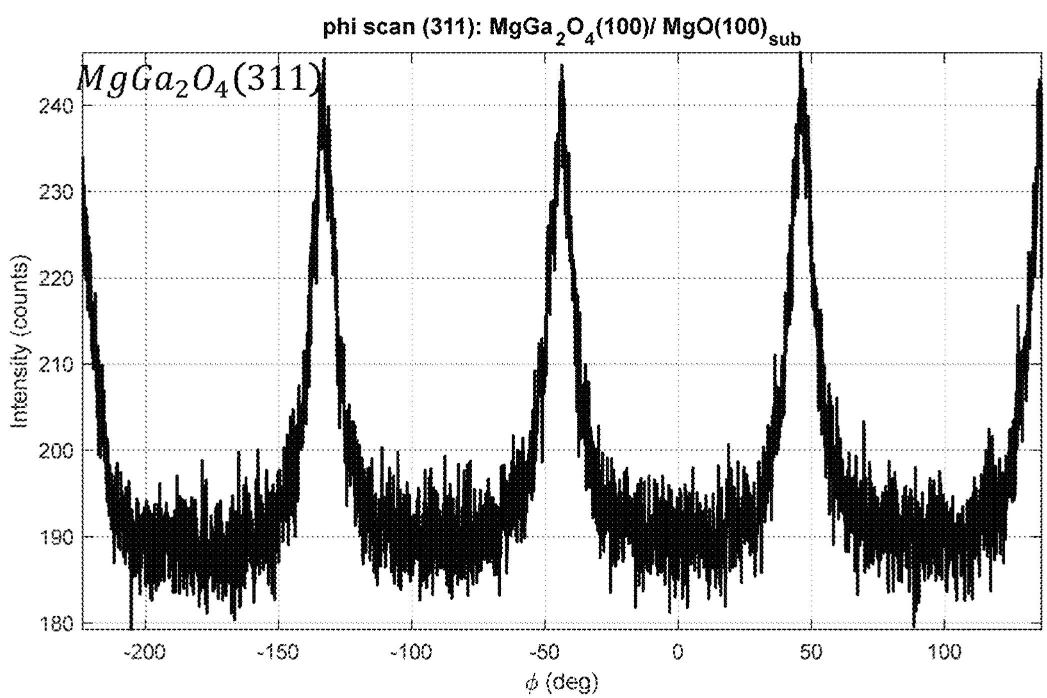

FIGS. 108A and 108B show the experimental XRD data for the formation of an ultrawide bandgap cubic $MgGa_2O_4$ (100)-oriented epilayer on a prepared MgO(100) substrate.

Figure 109:
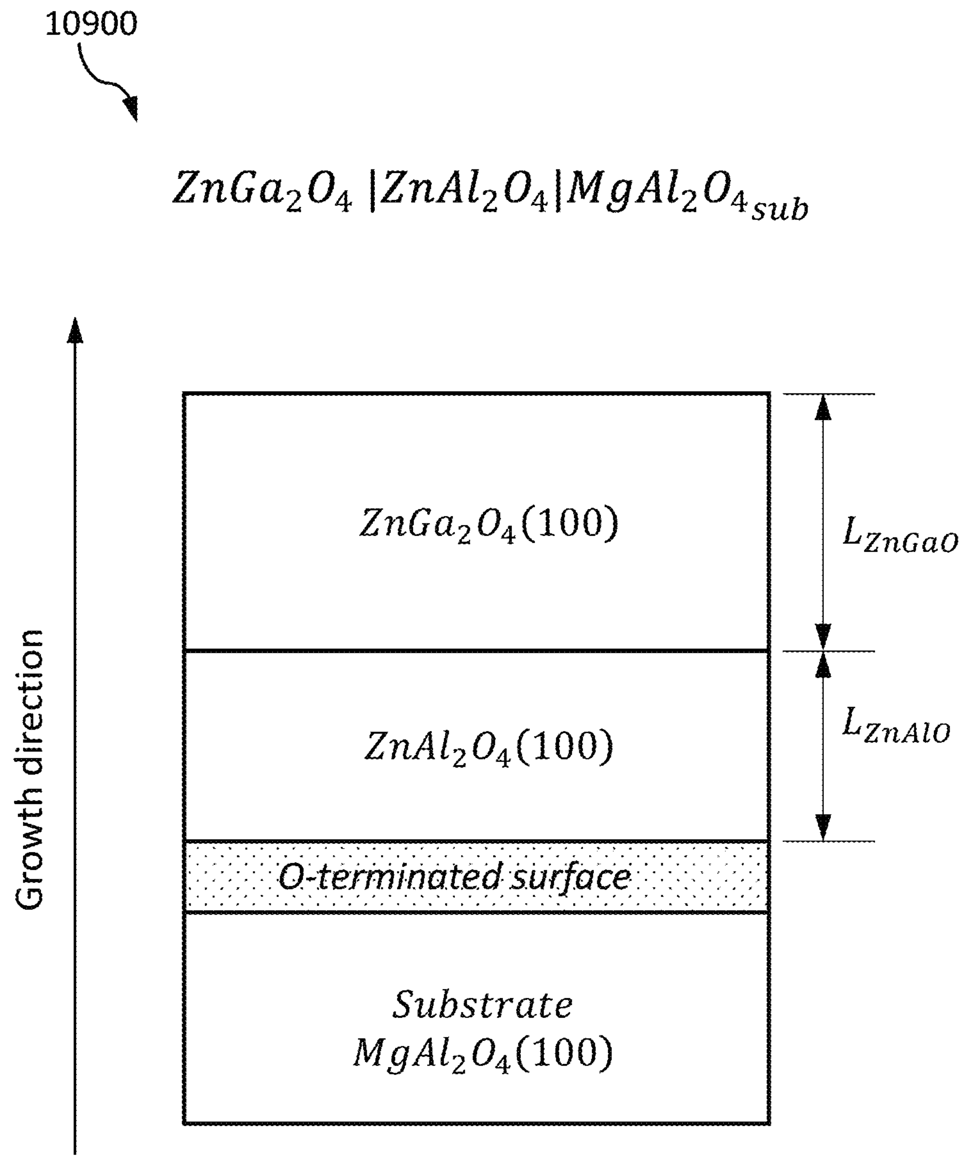

FIG. 109 shows a further epilayer structure comprising two UWBG large lattice constant cubic oxide layers integrated into a dissimilar bandgap oxide structure deposited on a large lattice constant cubic $MgAl_2O_4$(100)-oriented substrate.

Figure 110A:
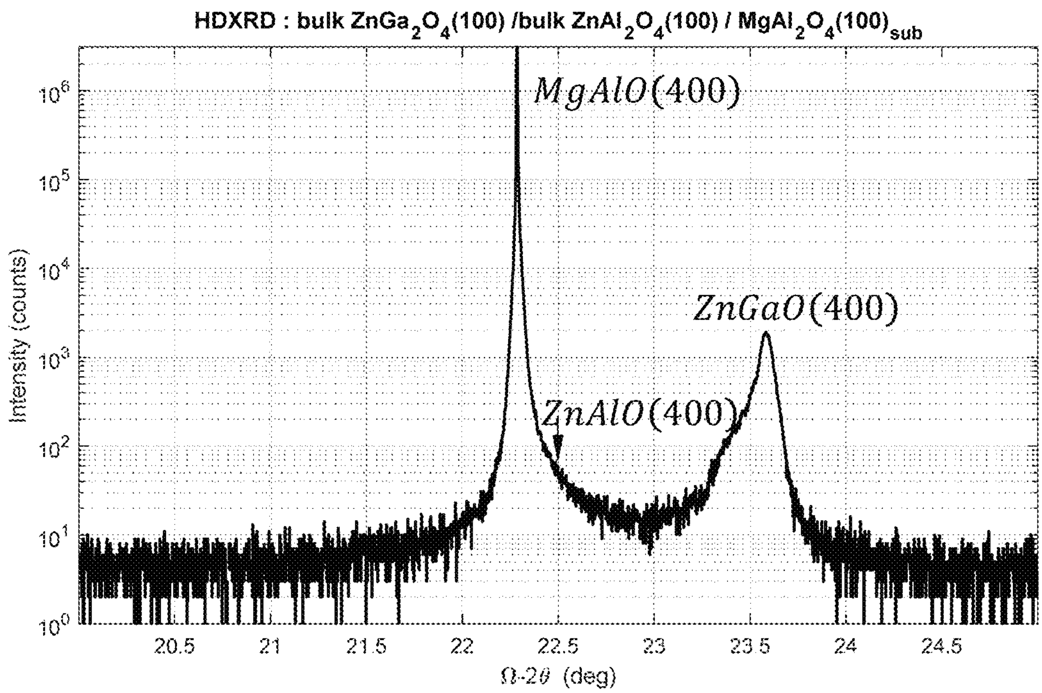
Figure 110B:
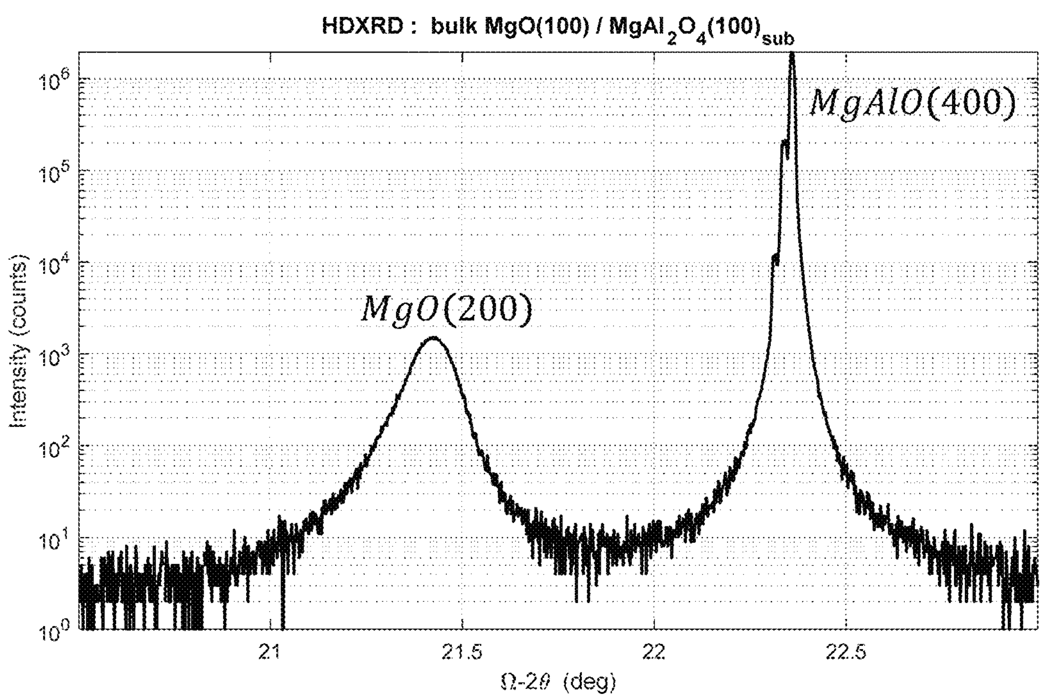

FIGS. 110A and 110B show the experimental XRD data of MgO, $ZnAl_2O_4$ and $ZnGa_2O_4$ cubic oxide films on a $MgAl_2O_4$(100)-oriented substrate.

Figure 111:
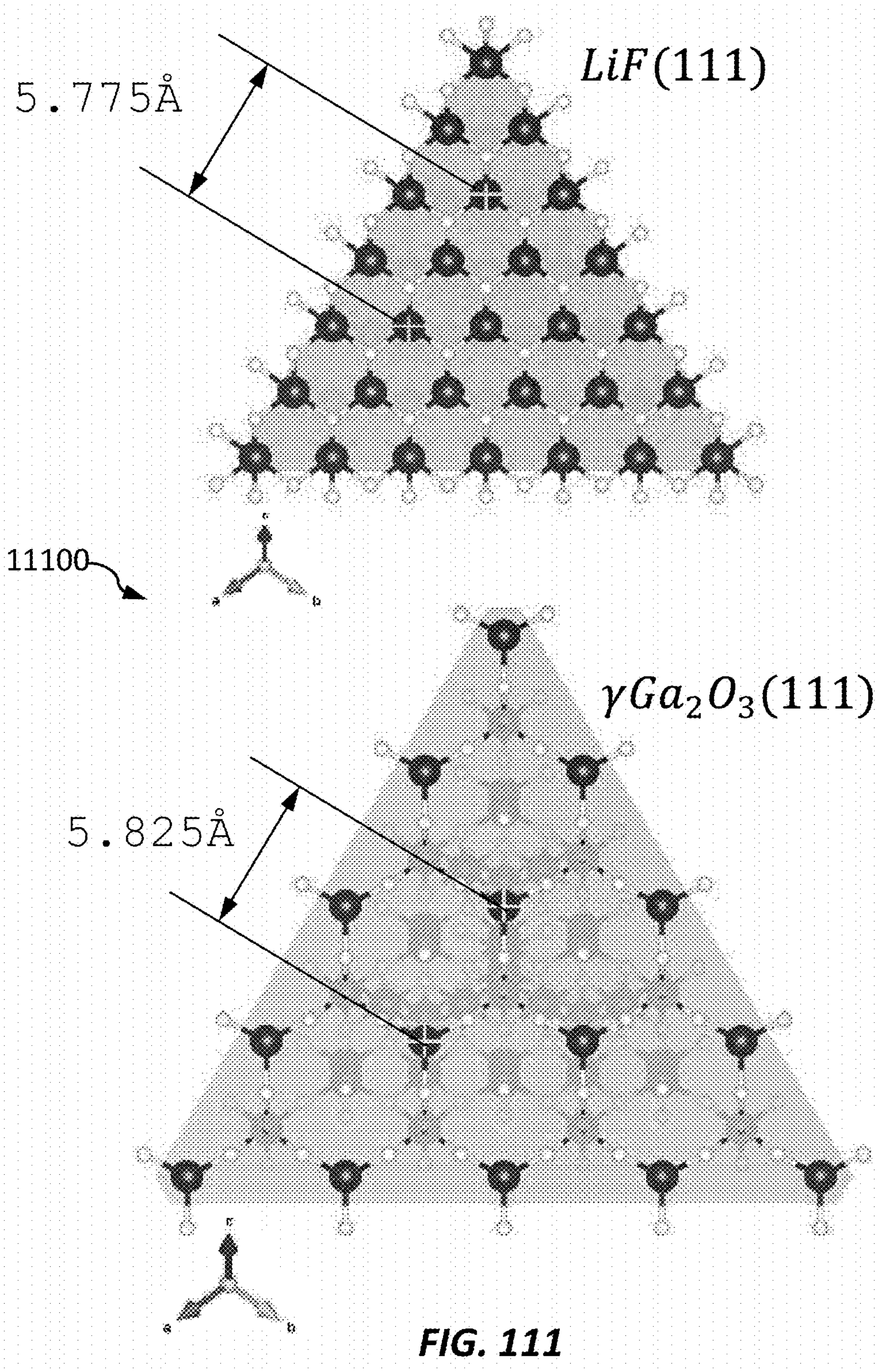

FIG. 111 shows the surface atom configurations of a cubic LiF(111)-oriented surface and a cubic $\gamma Ga_2O_3$(111)-oriented surface.

Figure 112A:
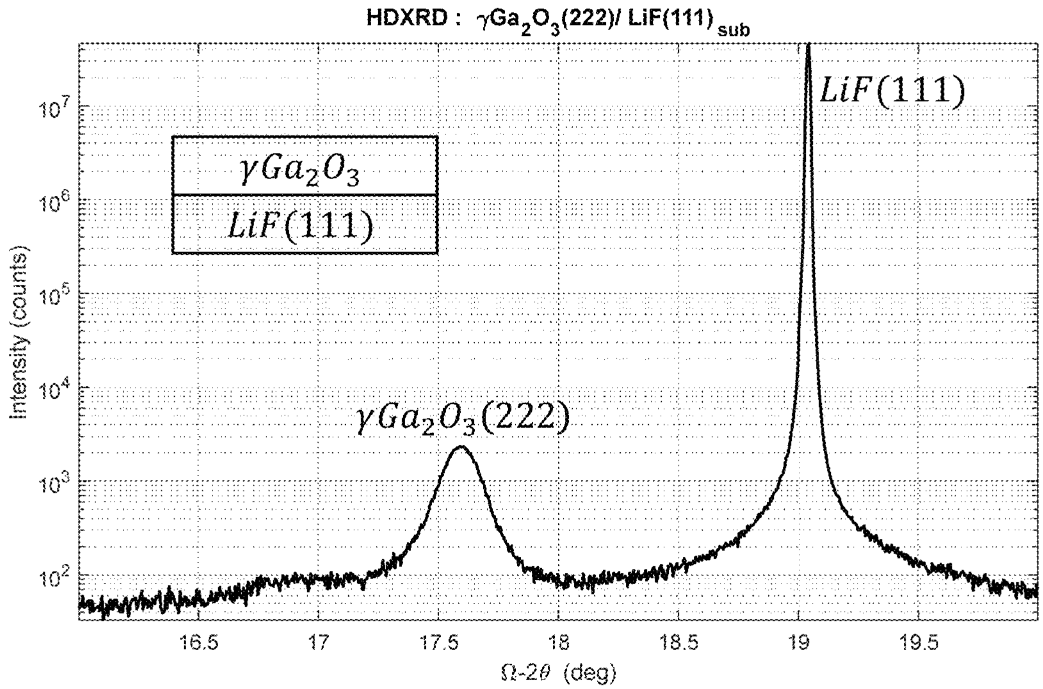
Figure 112B:
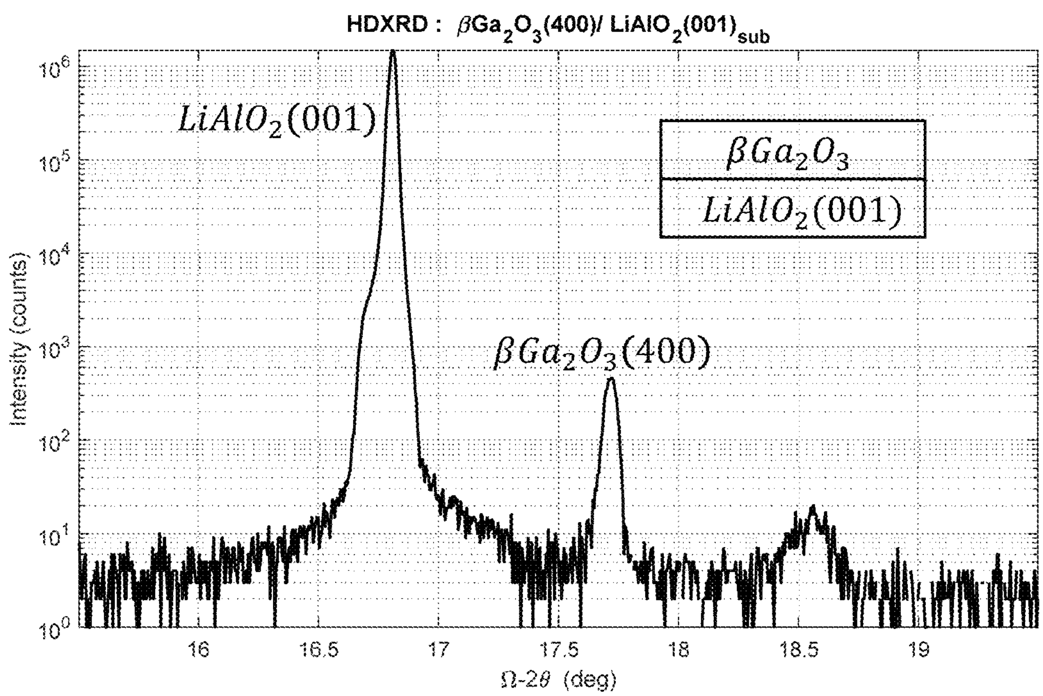

FIGS. 112A and 112B show the experimental XRD data of gallium oxide showing the crystal symmetry group of the epilayer controlled by the underlying substrate or seed surface symmetry.

Figure 113:
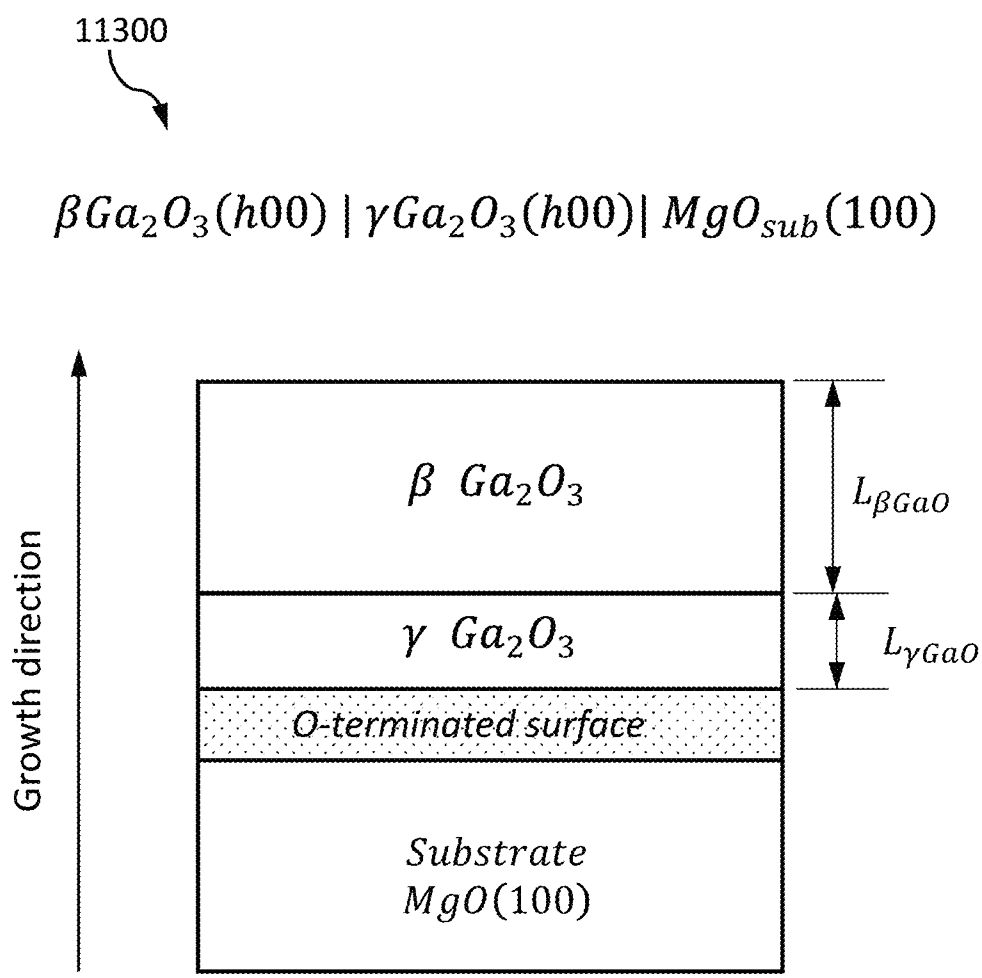

FIG. 113 shows the epitaxial structure of $Ga_2O_3$ formed on a cubic MgO substrate.

Figure 114A:
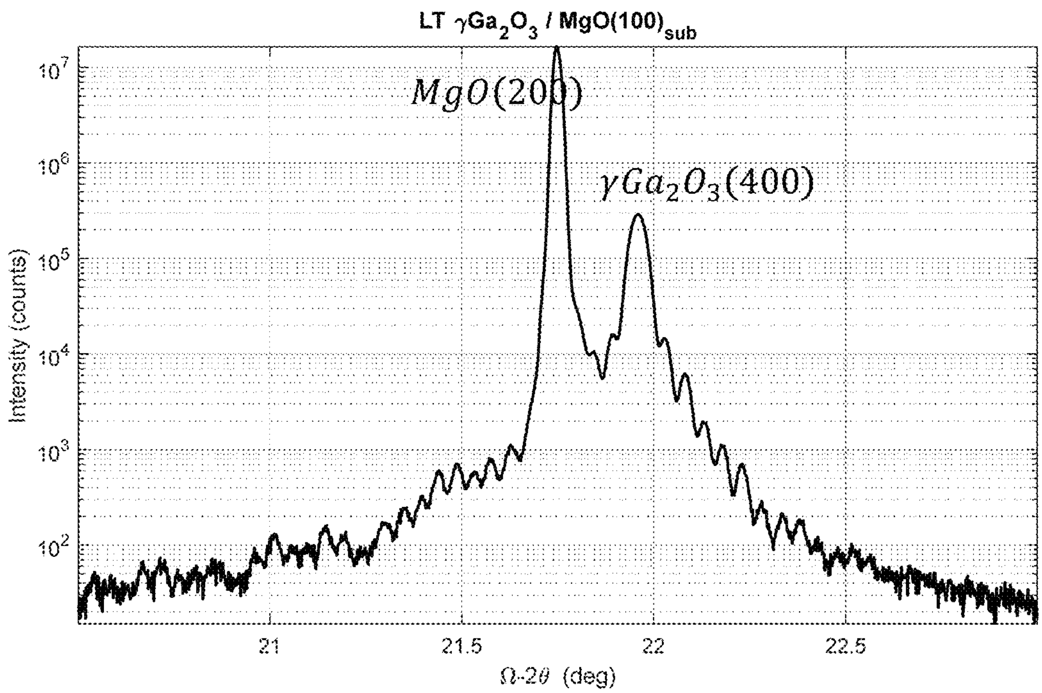
Figure 114B:
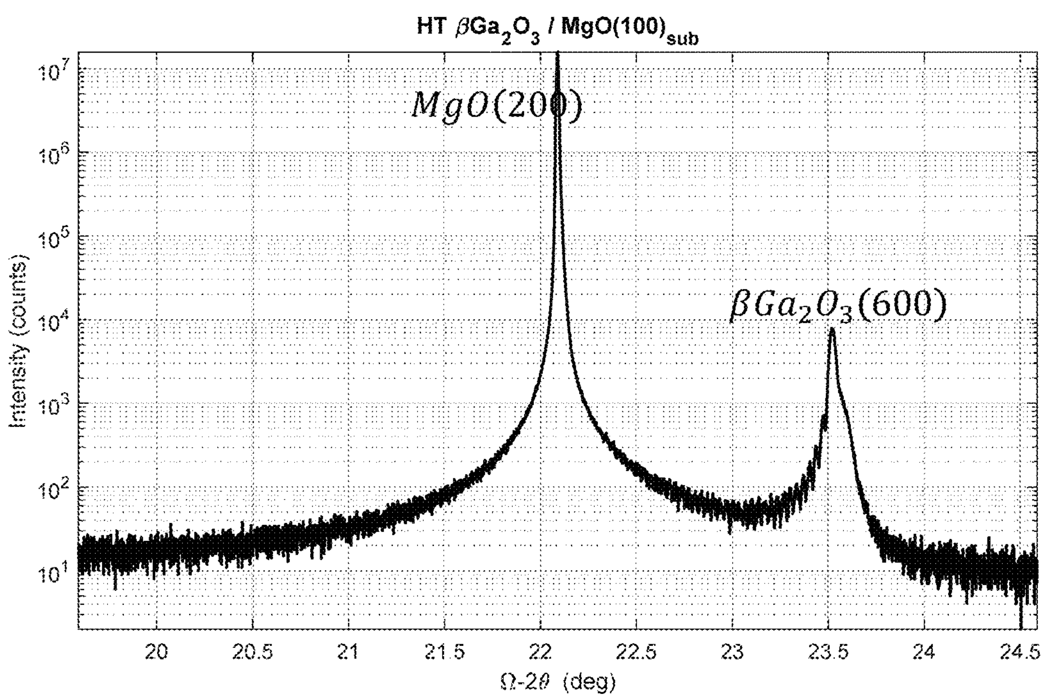

FIGS. 114A and 114B show respectively the experimental XRD data of low growth temperature (LT) and high growth temperature (HT) $Ga_2O_3$ film formation on prepared MgO (100)-oriented substrates.

Figure 115:
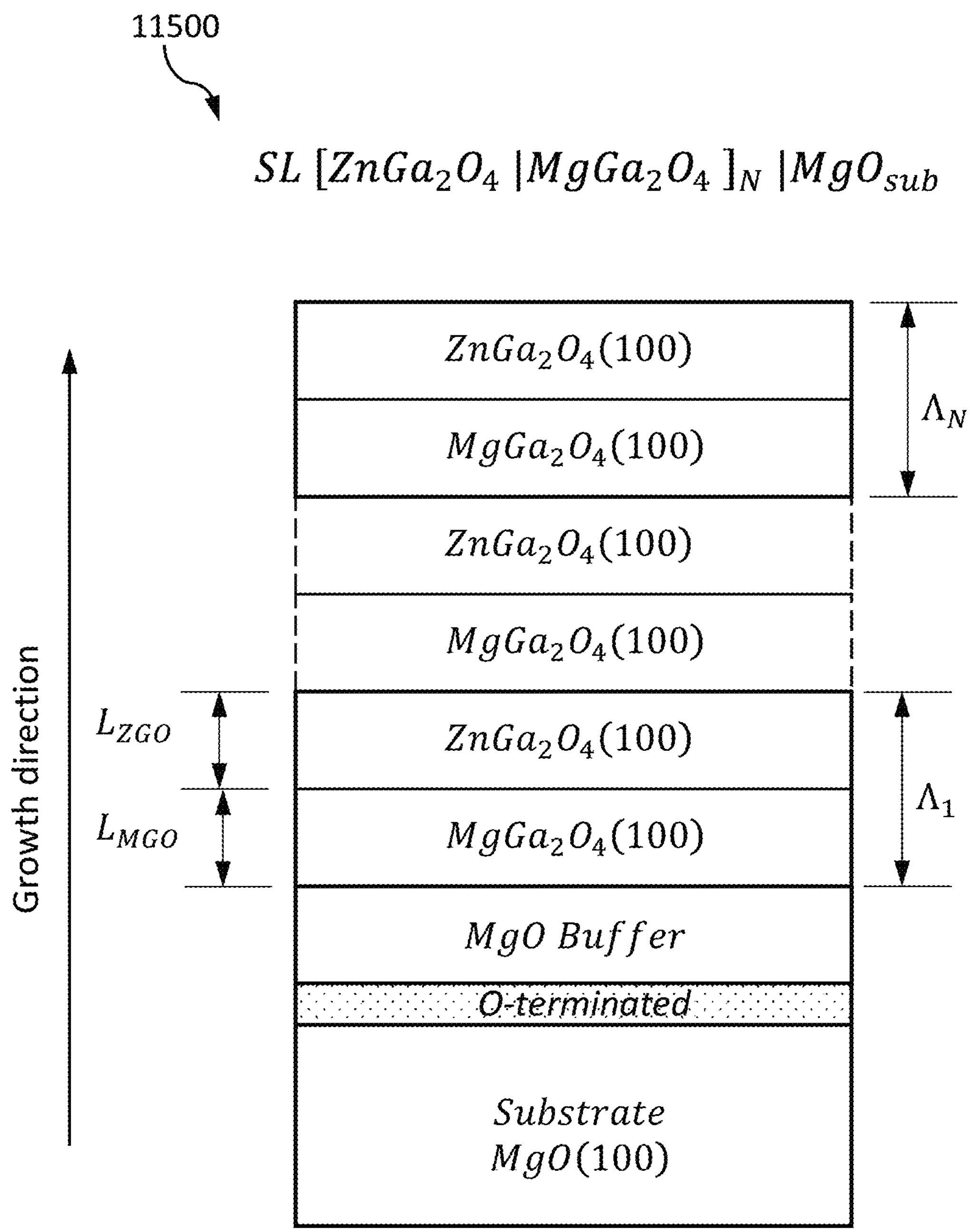

FIG. 115 shows the complex epilayer structure of dissimilar cubic oxide layers integrated into a superlattice or multi-heterojunction structure.

Figure 116A:
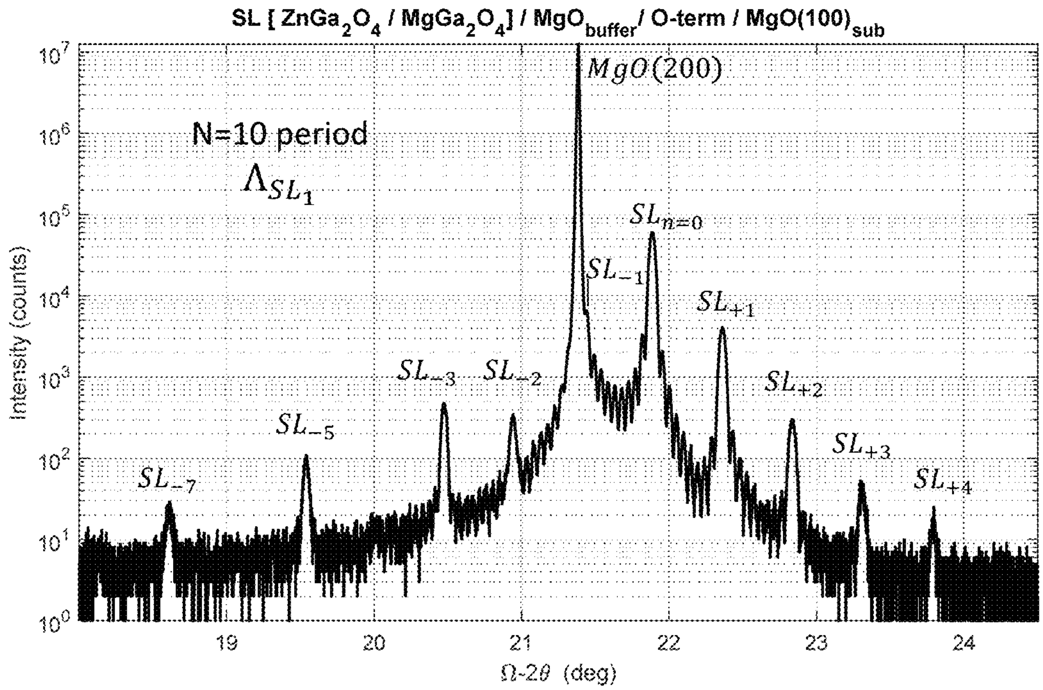
Figure 116B:
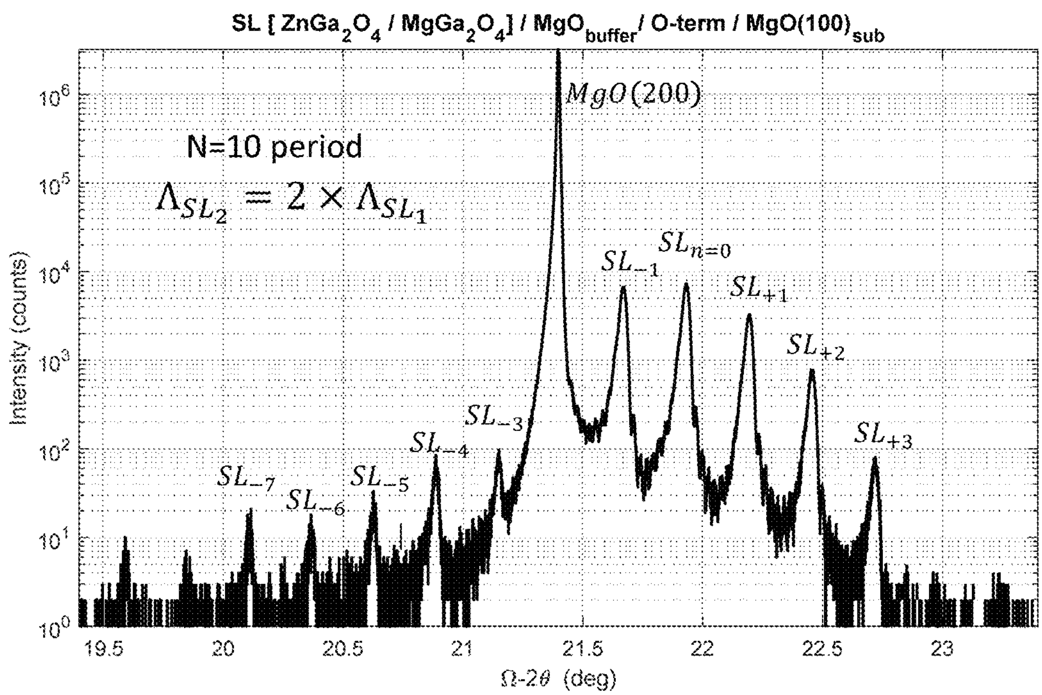

FIGS. 116A and 116B show the experimental XRD data of SL structures formed using $MgGa_2O_4$ and $ZnGa_2O_4$ layers deposited on MgO(100) substrate but having different periods.

Figure 117A:
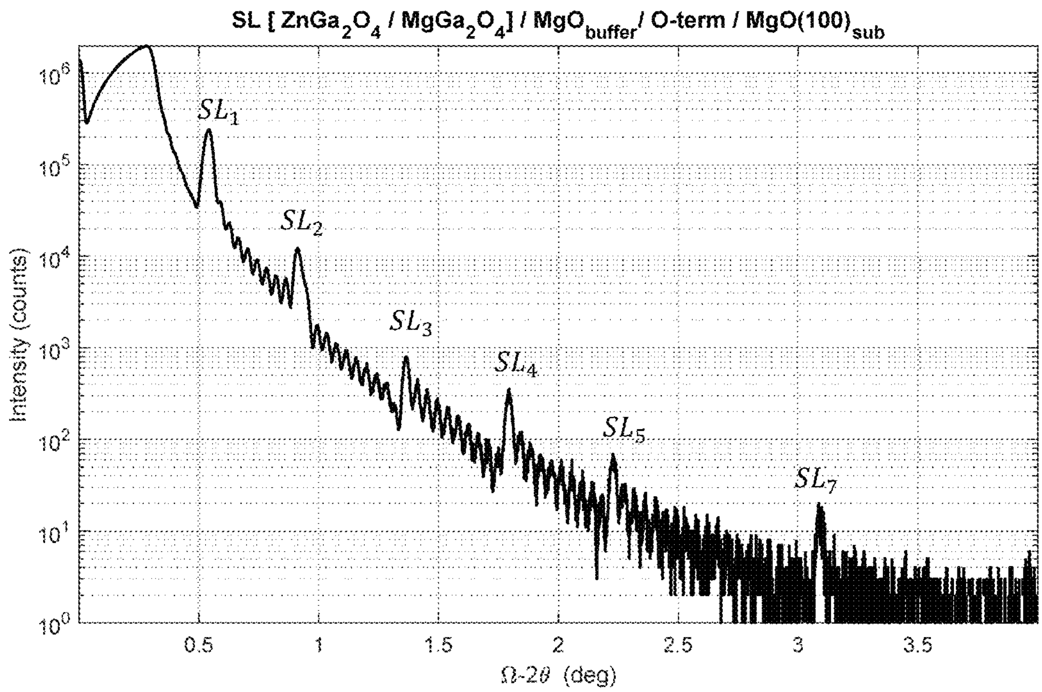
Figure 117B:
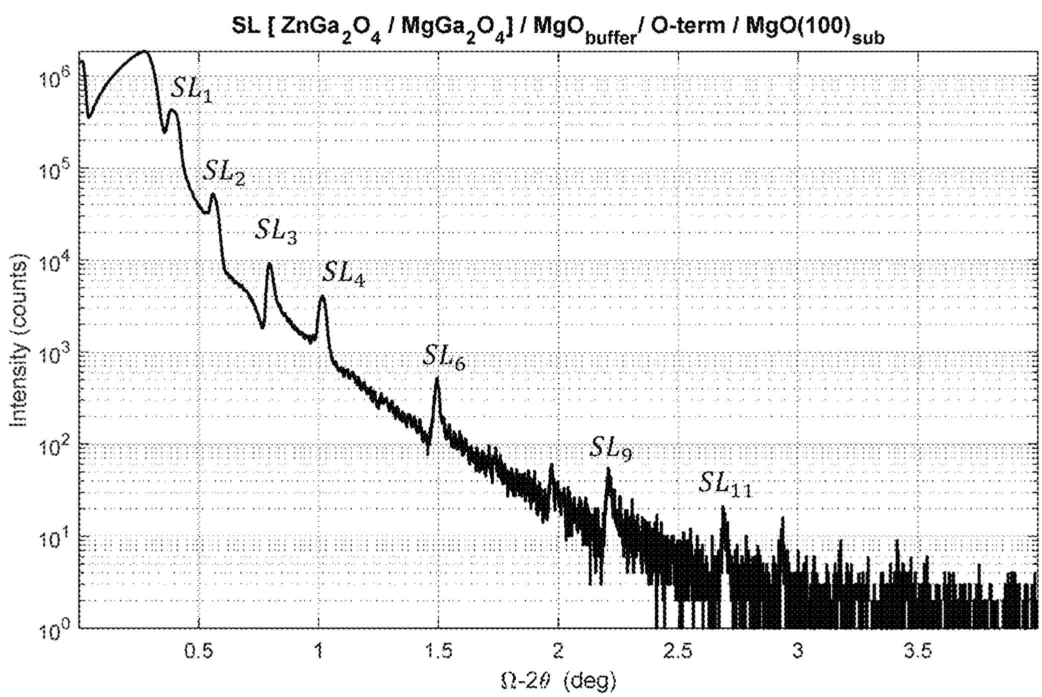

FIGS. 117A and 117B show the experimentally determined grazing incidence XRR data evidencing the extremely high crystal structure quality of the SL[$MgGa_2O_4$/$ZnGa_2O_4$]//MgO(100) structures shown in FIGS. 116A and 116B respectively.

Figure 118:
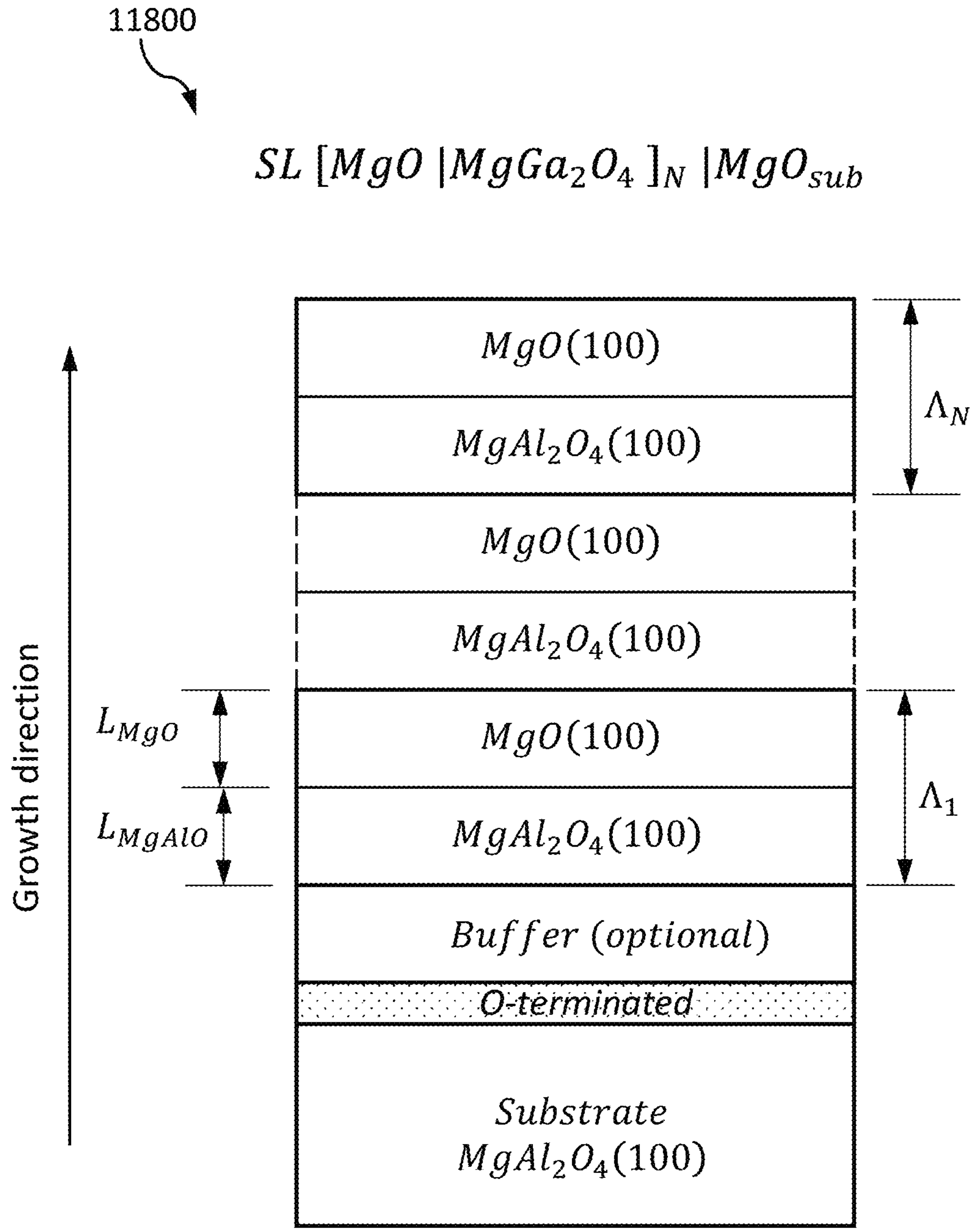

FIG. 118 shows the complex epilayer structure of dissimilar cubic oxide layers integrated into a superlattice or multi-heterojunction structure in another example.

Figure 119A:
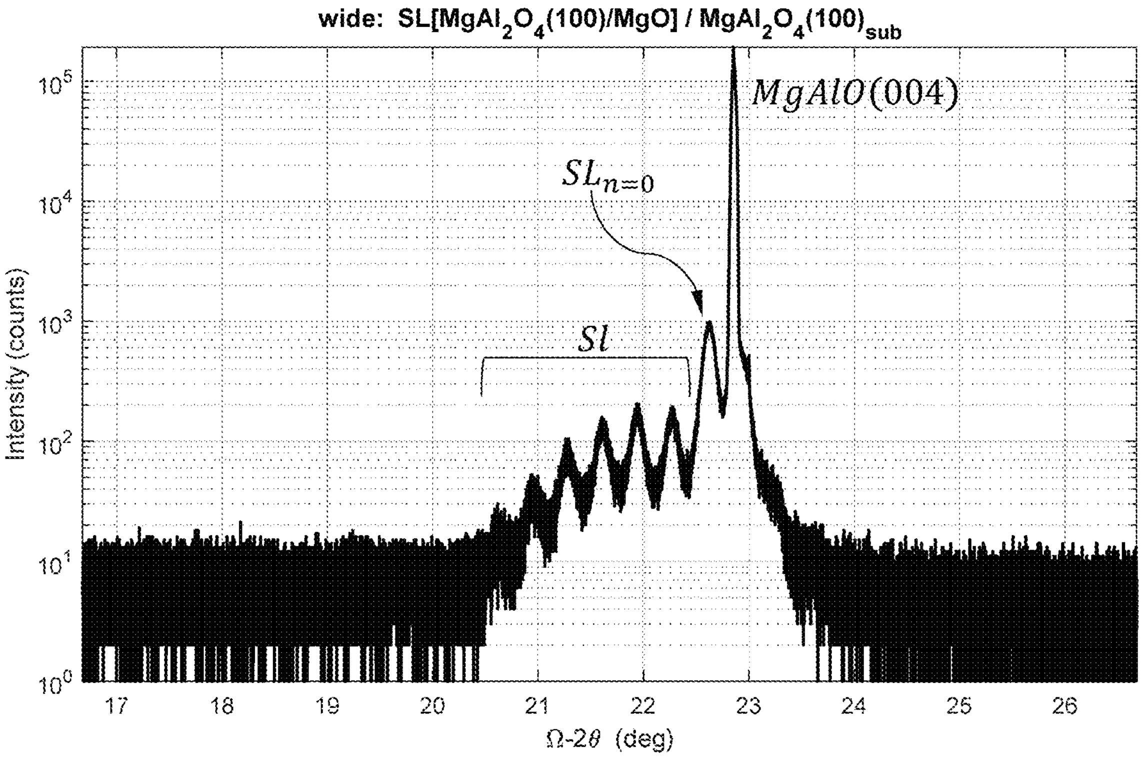
Figure 119B:
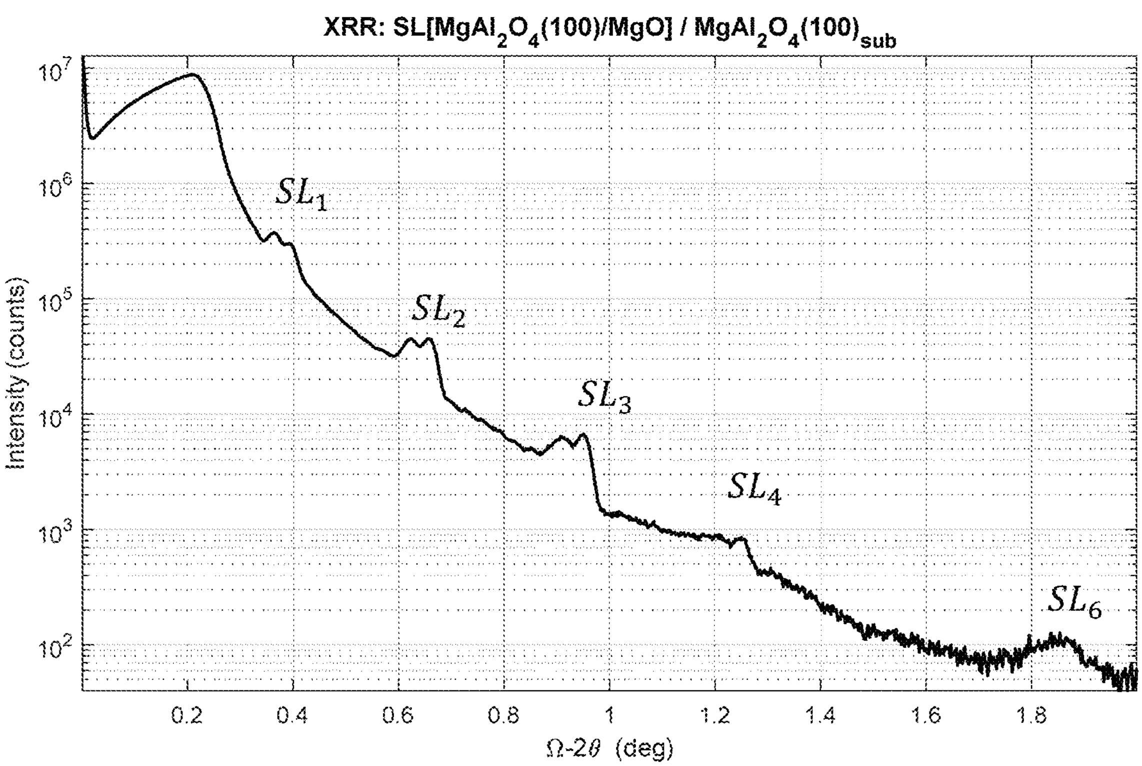

FIGS. 119A and 119B show the experimental XRD and XRR data of the epitaxial SL structure described in FIG. 118 forming a SL[$MgAl_2O_4$/MgO]//$MgAl_2O_4$(100).

Figure 120:
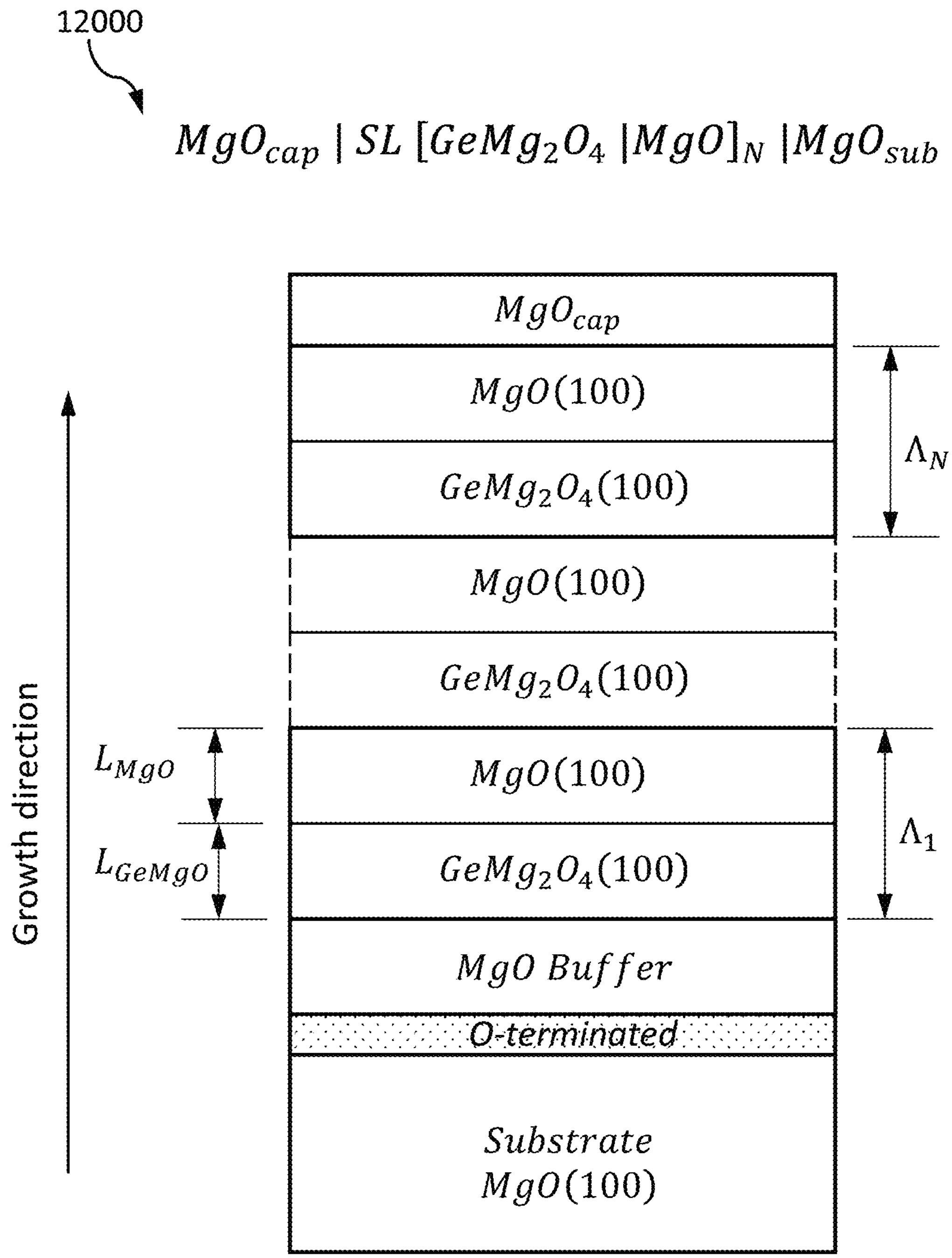

FIG. 120 shows the complex epilayer structure of dissimilar cubic oxide layers integrated into a superlattice or multi-heterojunction structure in a further example.

Figure 121:
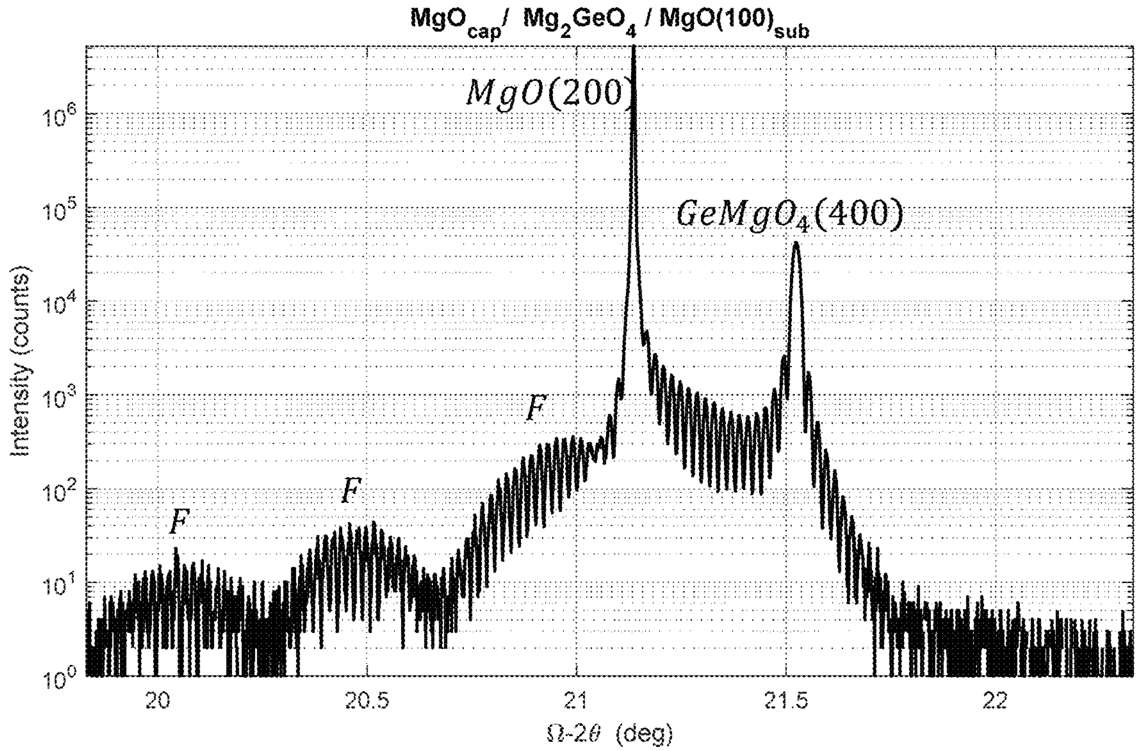

FIG. 121 shows the experimental XRD data of a Fd3m crystal structure $GeMg_2O_4$ deposited as a high quality bulk layer on a Fm3m MgO(100) substrate and further comprising a MgO cap.

Figure 122:
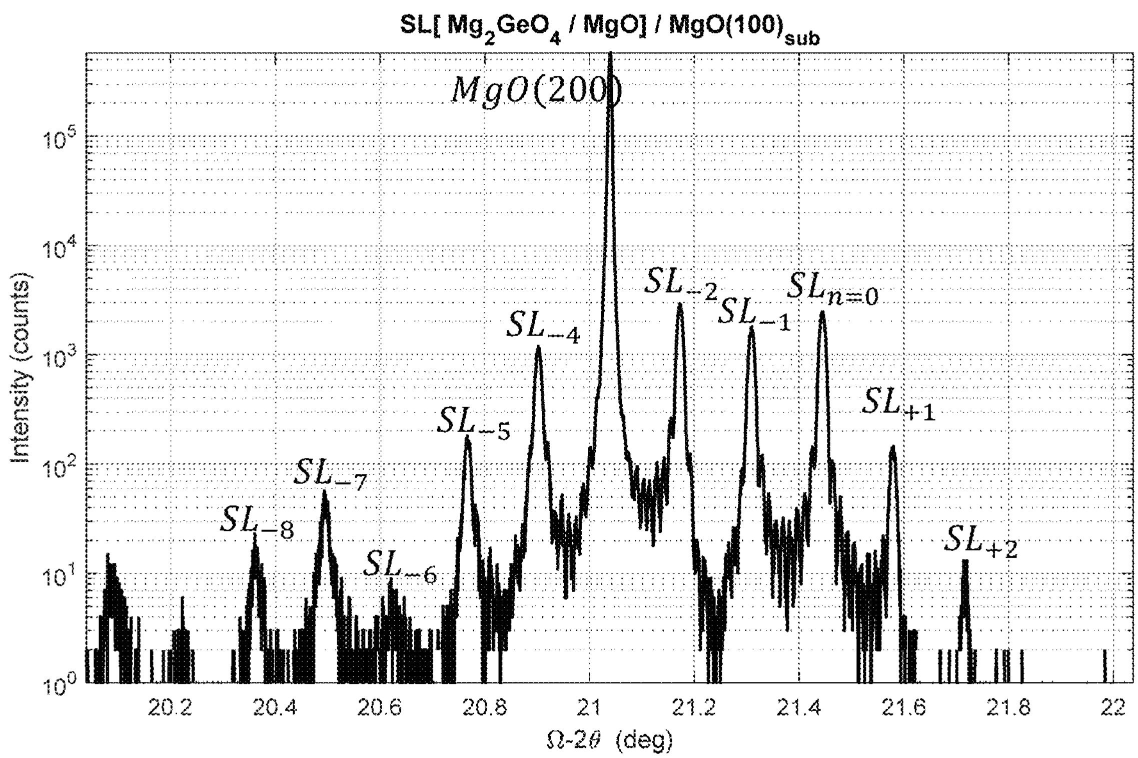

FIG. 122 shows the experimental XRD data of a Fd3m crystal structure $GeMg_2O_4$ when incorporated as a SL structure comprising 20× period SL[$GeMg_2O_4$/MgO] on a Fm3m MgO(100) substrate.

Figure 123:
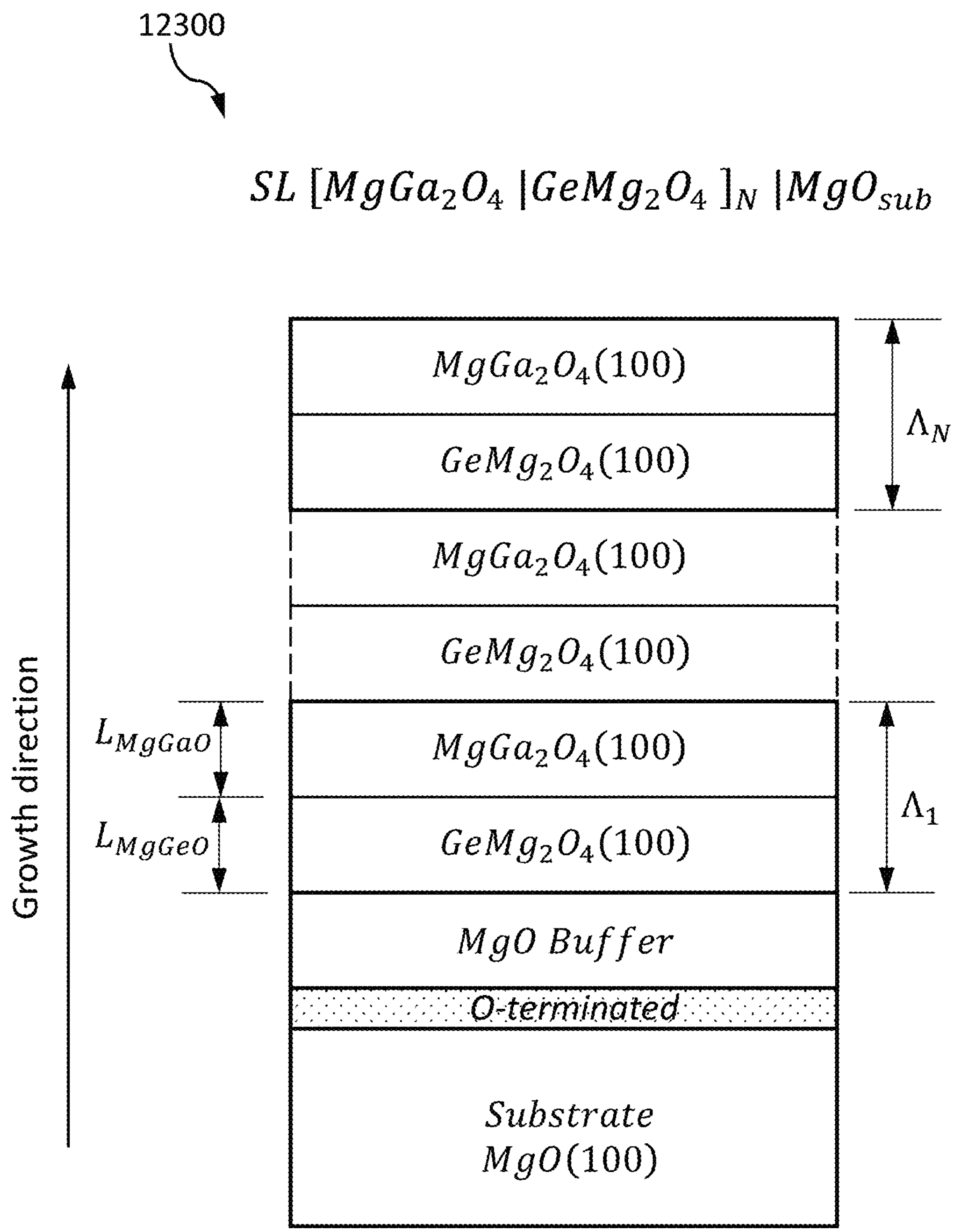

FIG. 123 shows the complex epilayer structure of dissimilar cubic oxide layers integrated into a superlattice or multi-heterojunction structure in another example.

Figure 124:
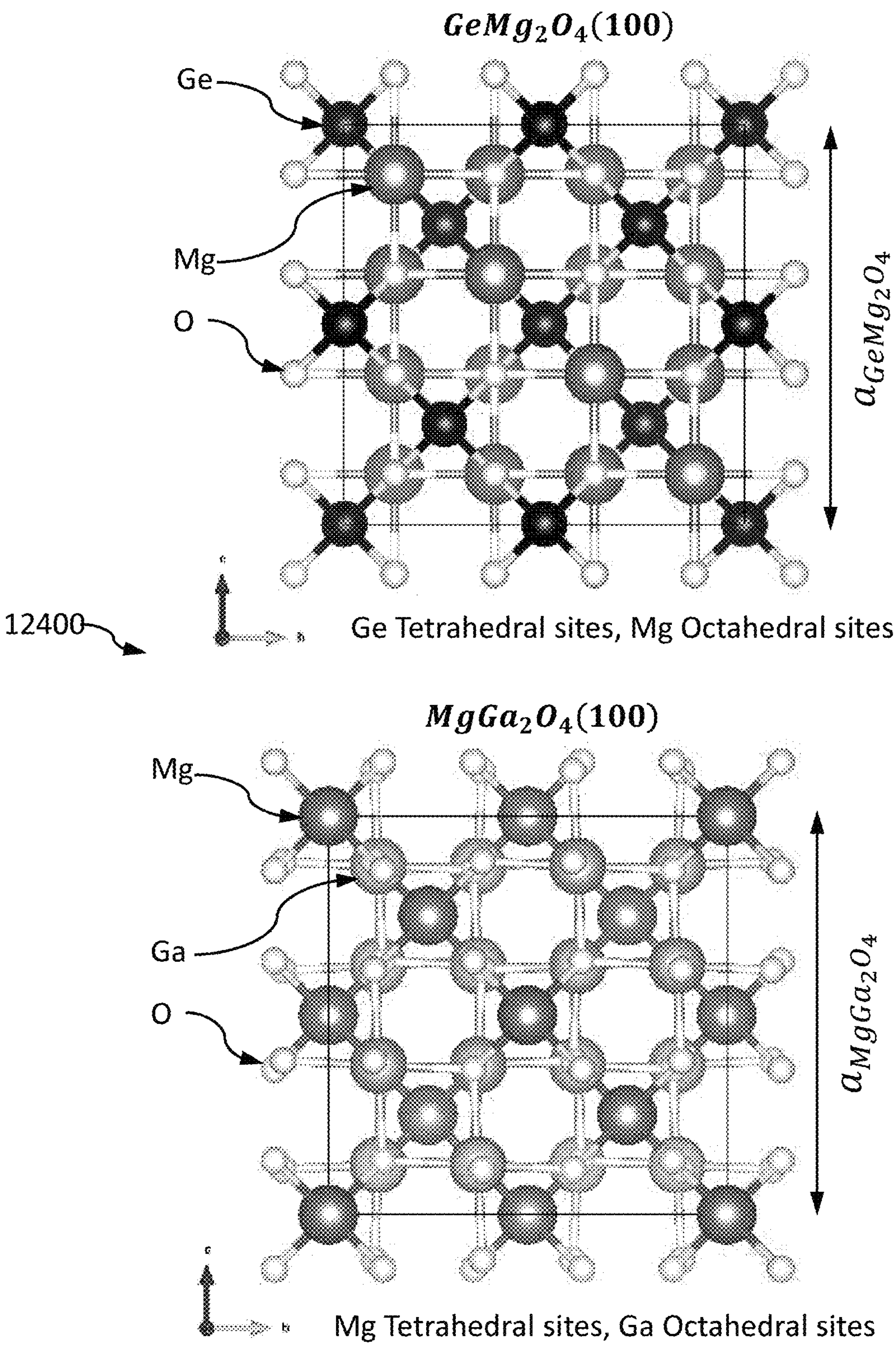

FIG. 124 shows a representation of the (100) crystal plane of the Fd3m cubic symmetry unit cells of $GeMg_2O_4$ and $MgGa_2O_4$.

Figure 125:
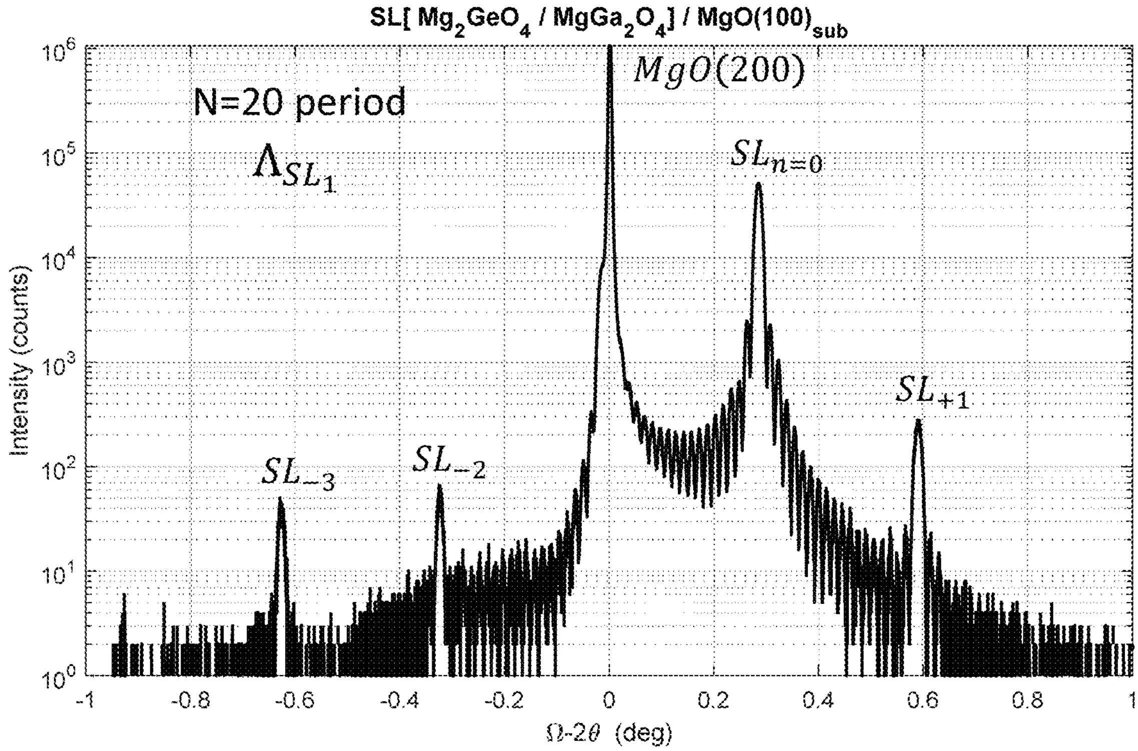

FIG. 125 shows the experimental XRD data of an SL structure comprising a 20× period SL[$Mg_2GeO_4$/$MgGa_2O_4$] on a MgO(100) substrate.

Figure 126:
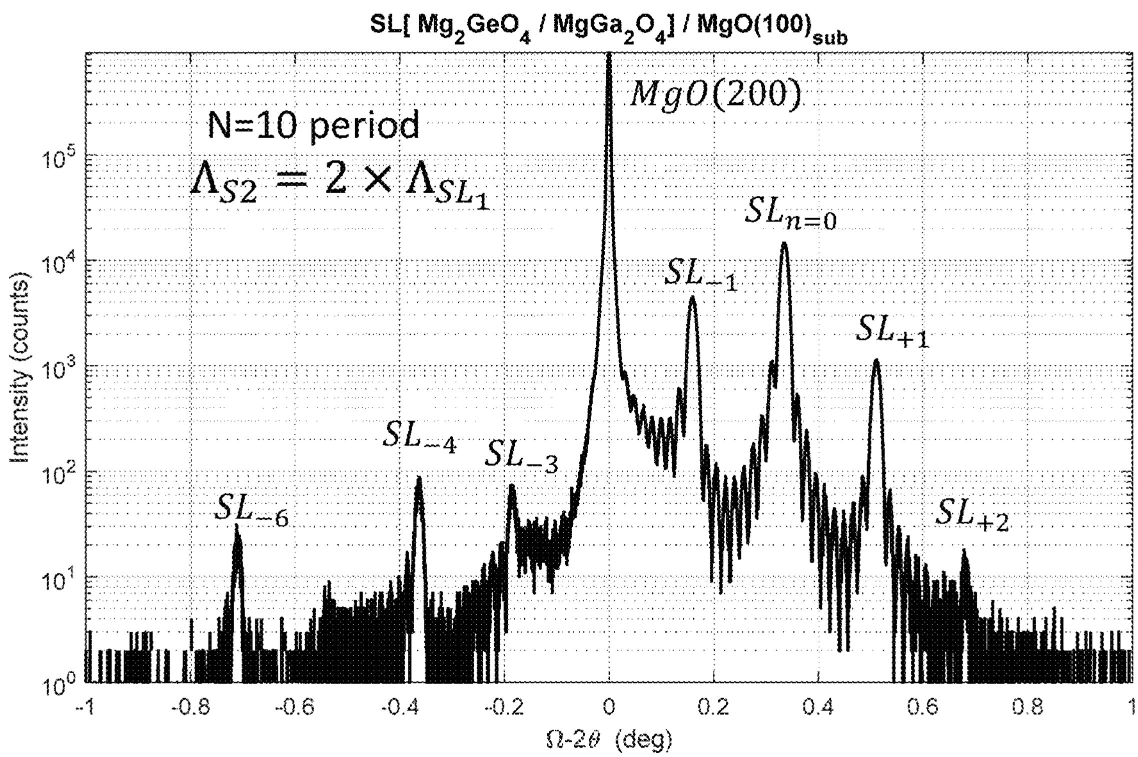

FIG. 126 shows the experimental XRD data of an SL structure comprising a 10× period SL[$Mg_2GeO_4$/$MgGa_2O_4$] on a MgO(100) substrate.

Figure 127:
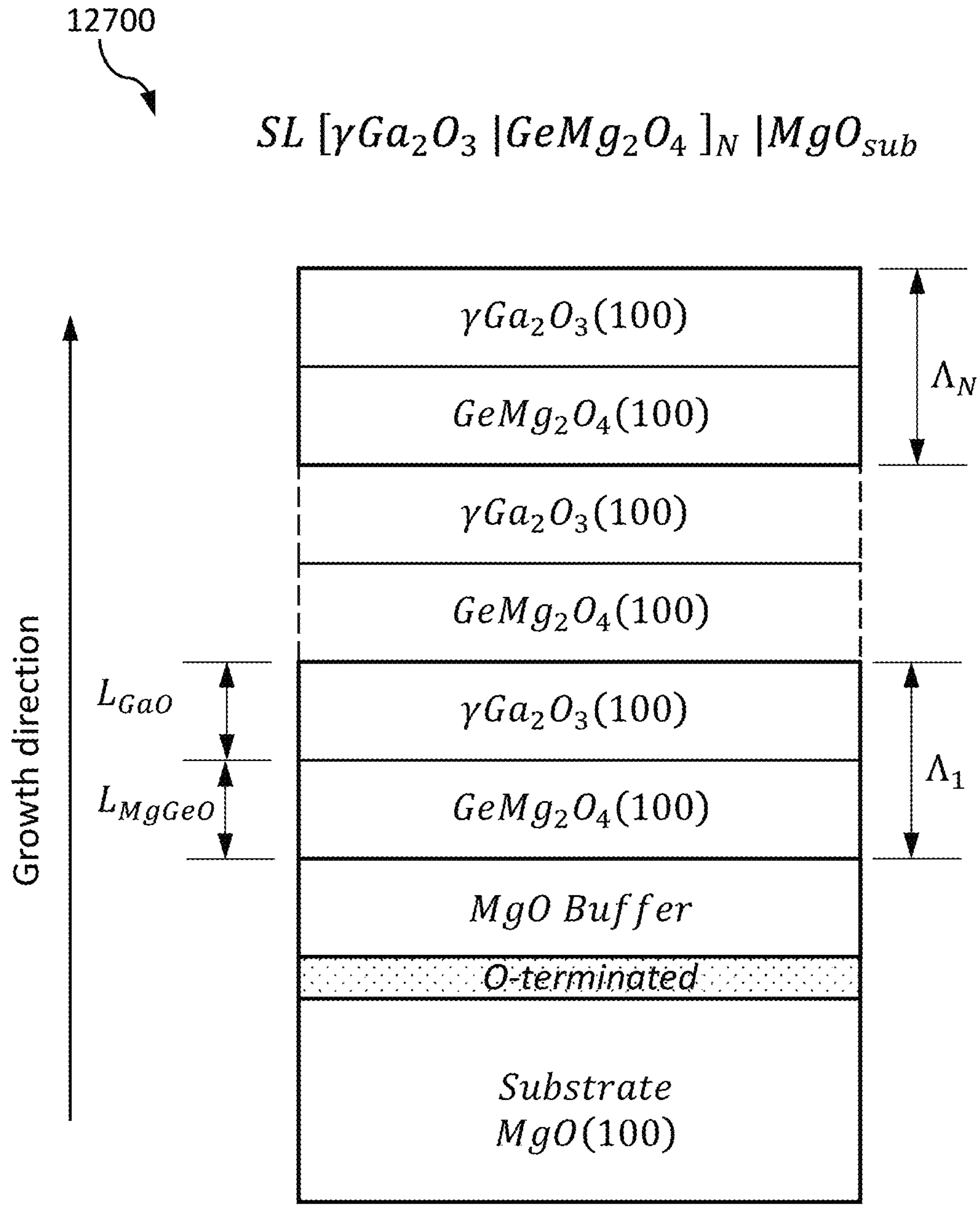

FIG. 127 shows the complex epilayer structure of dissimilar cubic oxide layers integrated into a superlattice or multi-heterojunction structure in a further example.

Figure 128A:
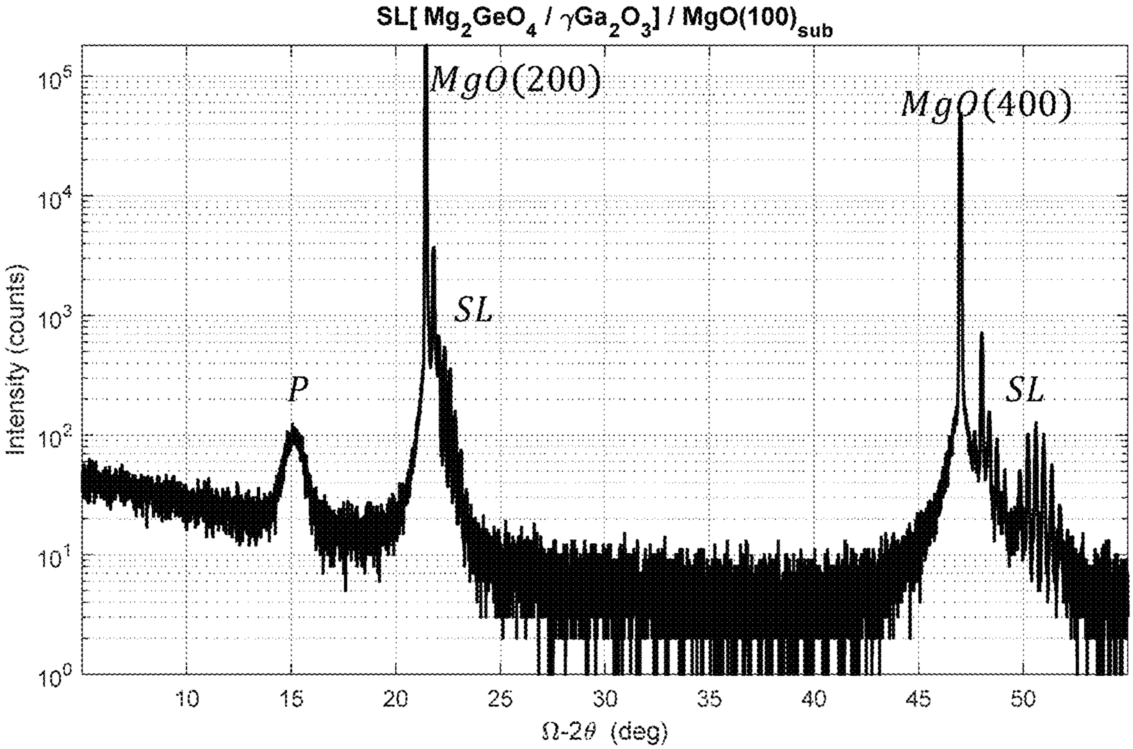
Figure 128B:
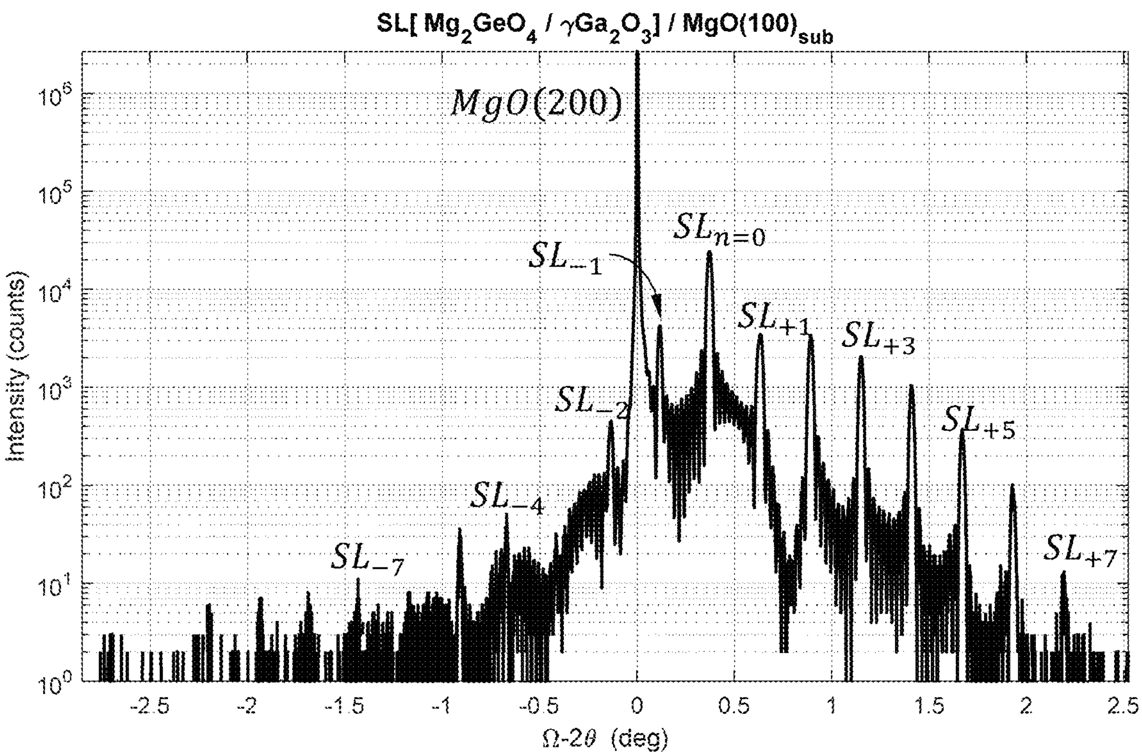

FIGS. 128A and 128B show experimental XRD data for a superlattice structure comprising SL[$GeMg_2O_4$/$\gamma Ga_2O_3$]//$MgO_{sub}$(100).

Figure 129:
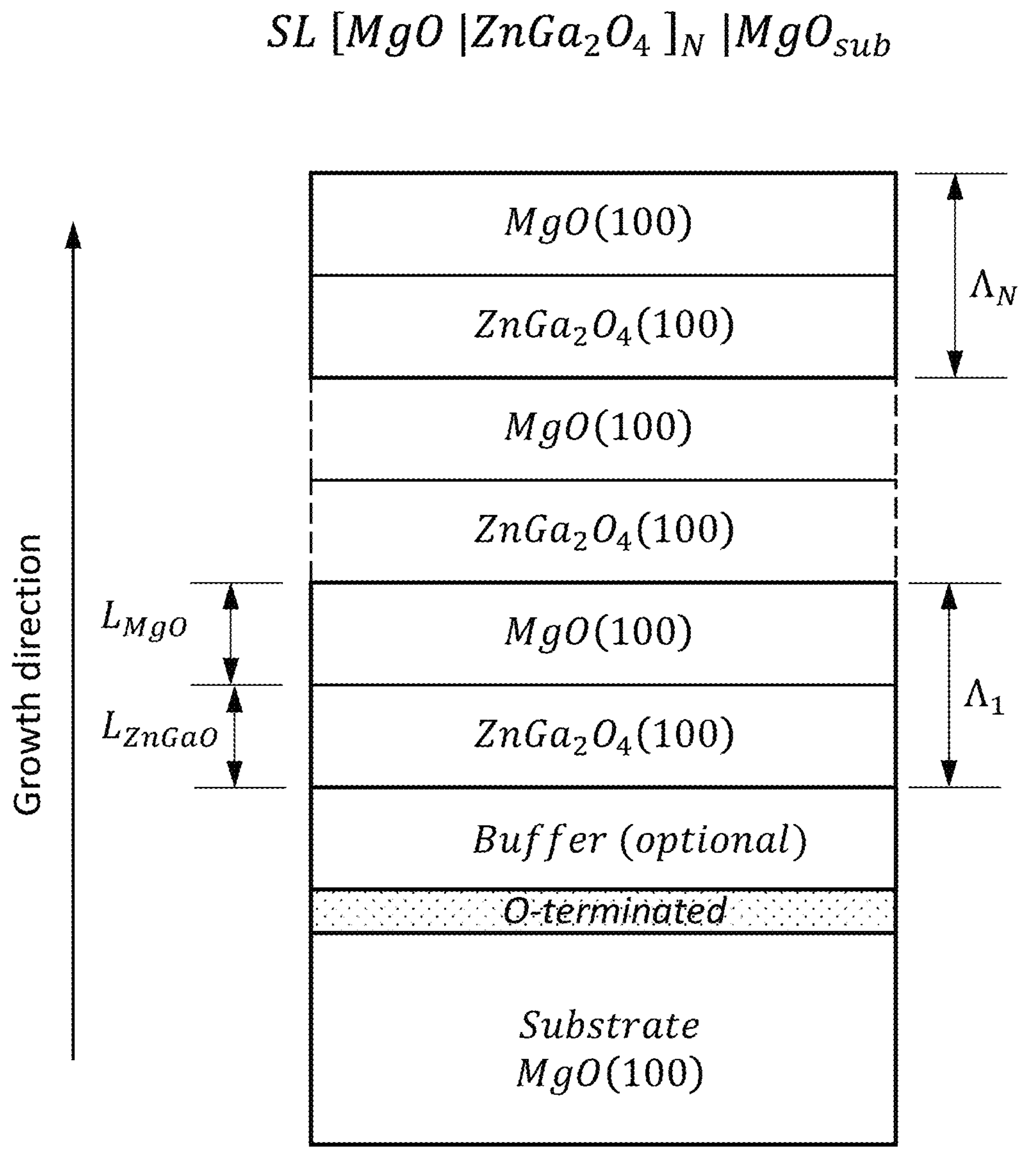

FIG. 129 shows the complex epilayer structure of dissimilar cubic oxide layers integrated into a superlattice or multi-heterojunction structure in another example.

Figure 130A:
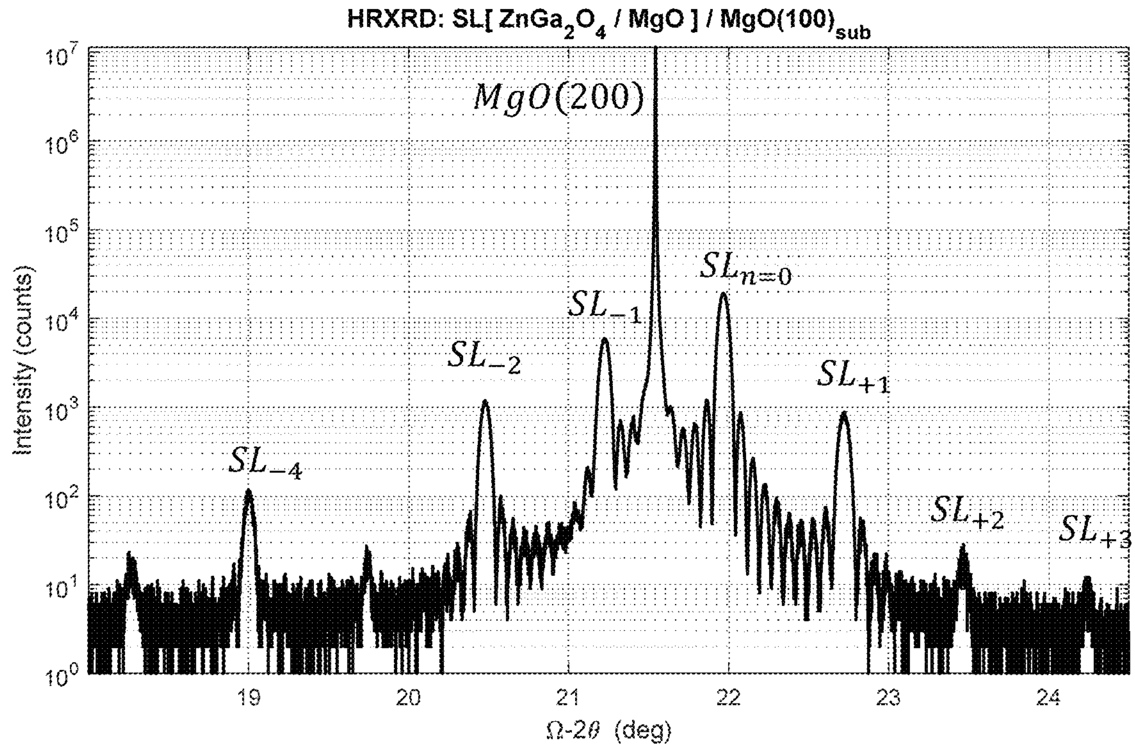
Figure 130B:
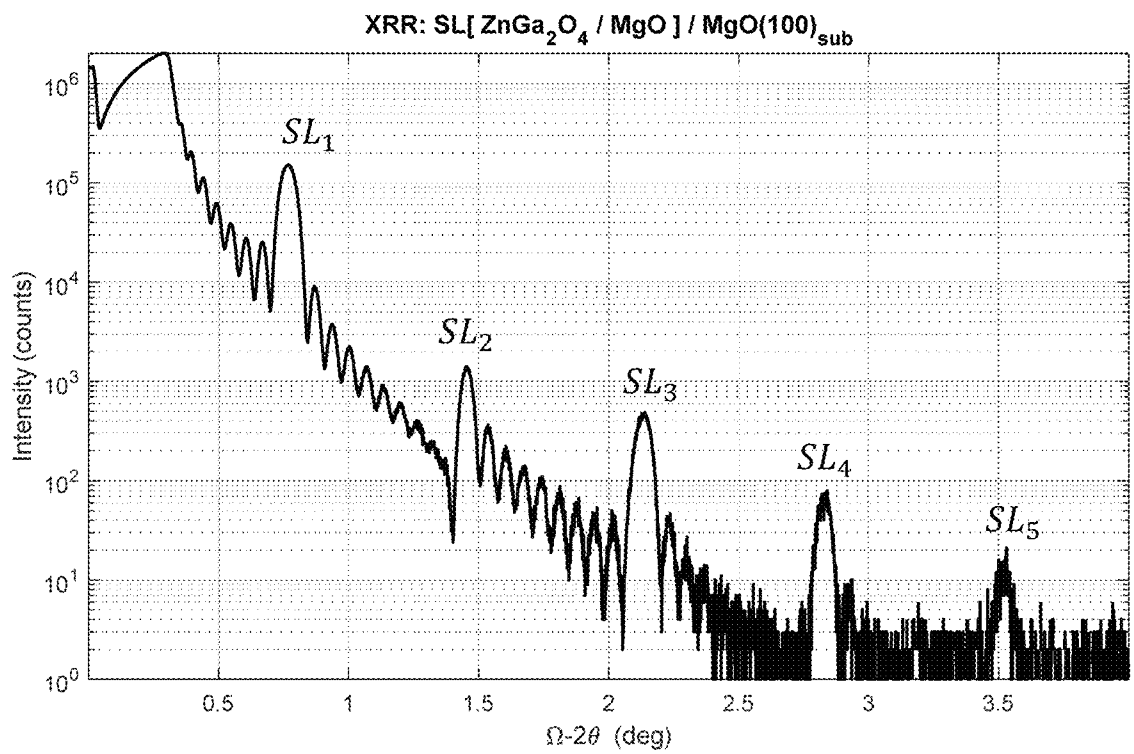

FIGS. 130A and 130B show experimental XRD and XRR data for a heterostructure and superlattice structure comprising SL[$ZnGa_2O_4$/MgO]//$MgO_{sub}$(100).

Figure 131:
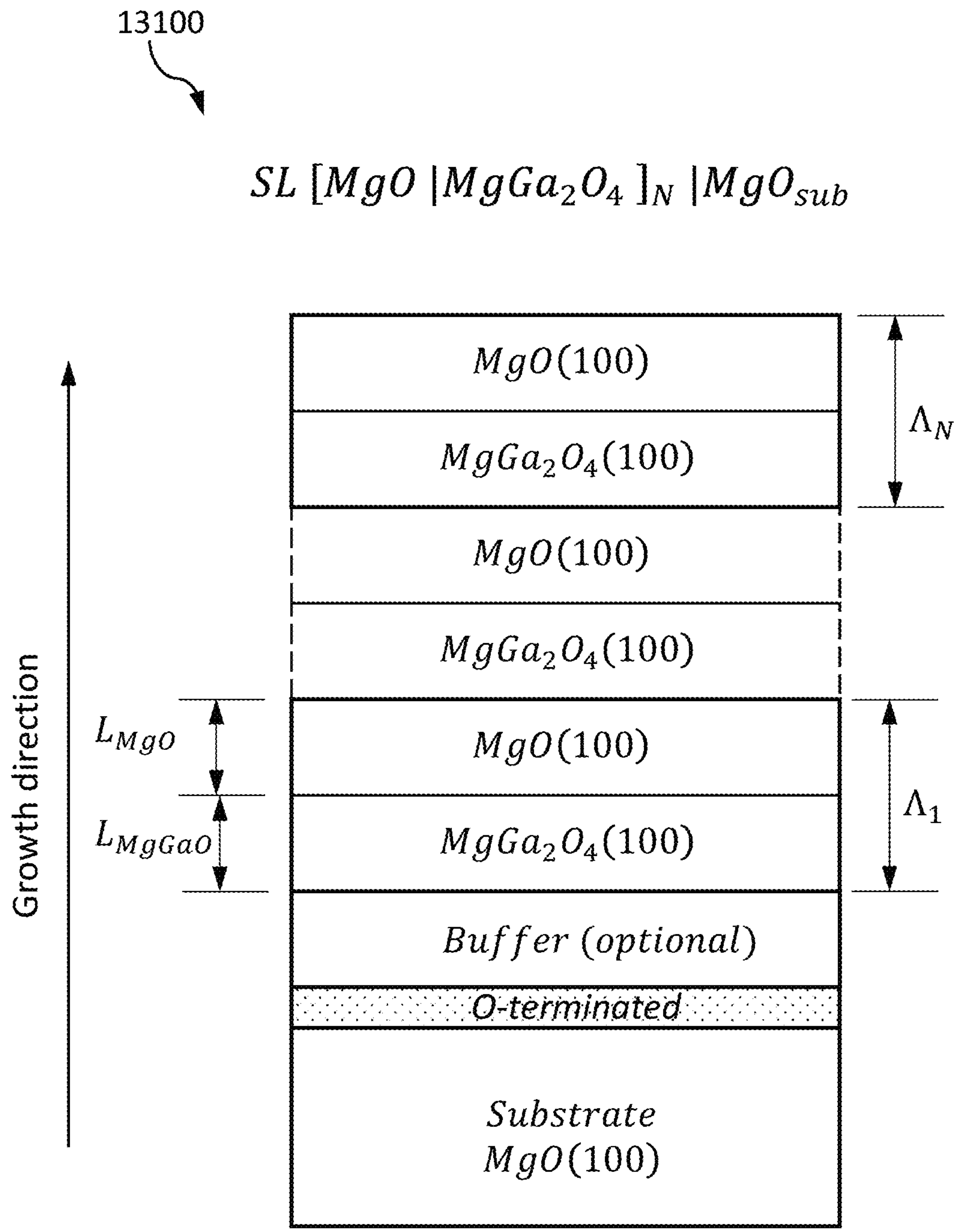

FIG. 131 shows the complex epilayer structure of dissimilar cubic oxide layers integrated into a superlattice or multi-heterojunction structure in another example.

Figure 132A:
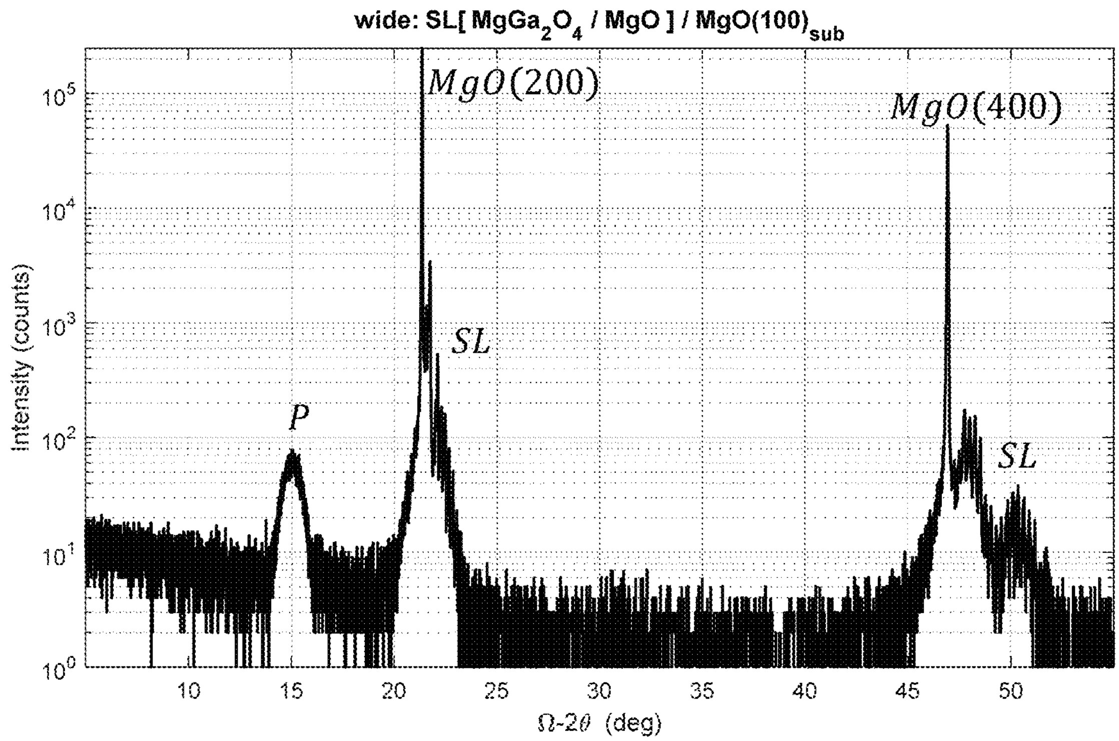
Figure 132B:
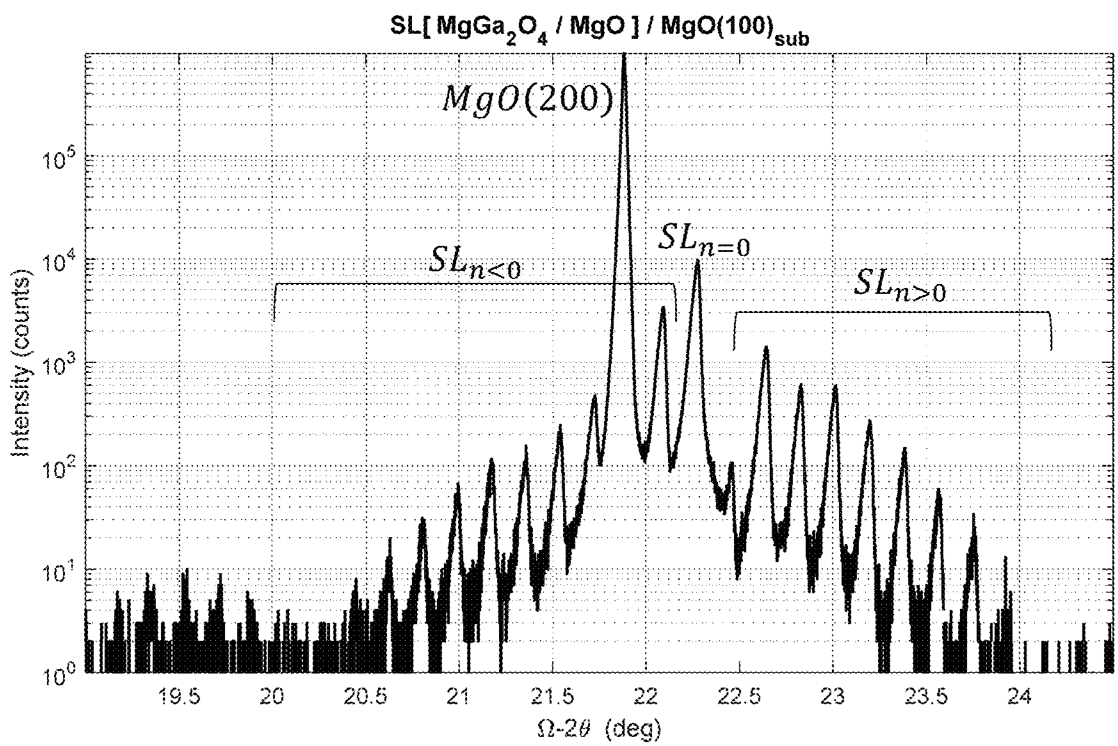

FIGS. 132A and 132B show experimental XRD data for a superlattice structure comprising SL[$MgGa_2O_4$/MgO]//$MgO_{sub}$(100).

Figure 133:
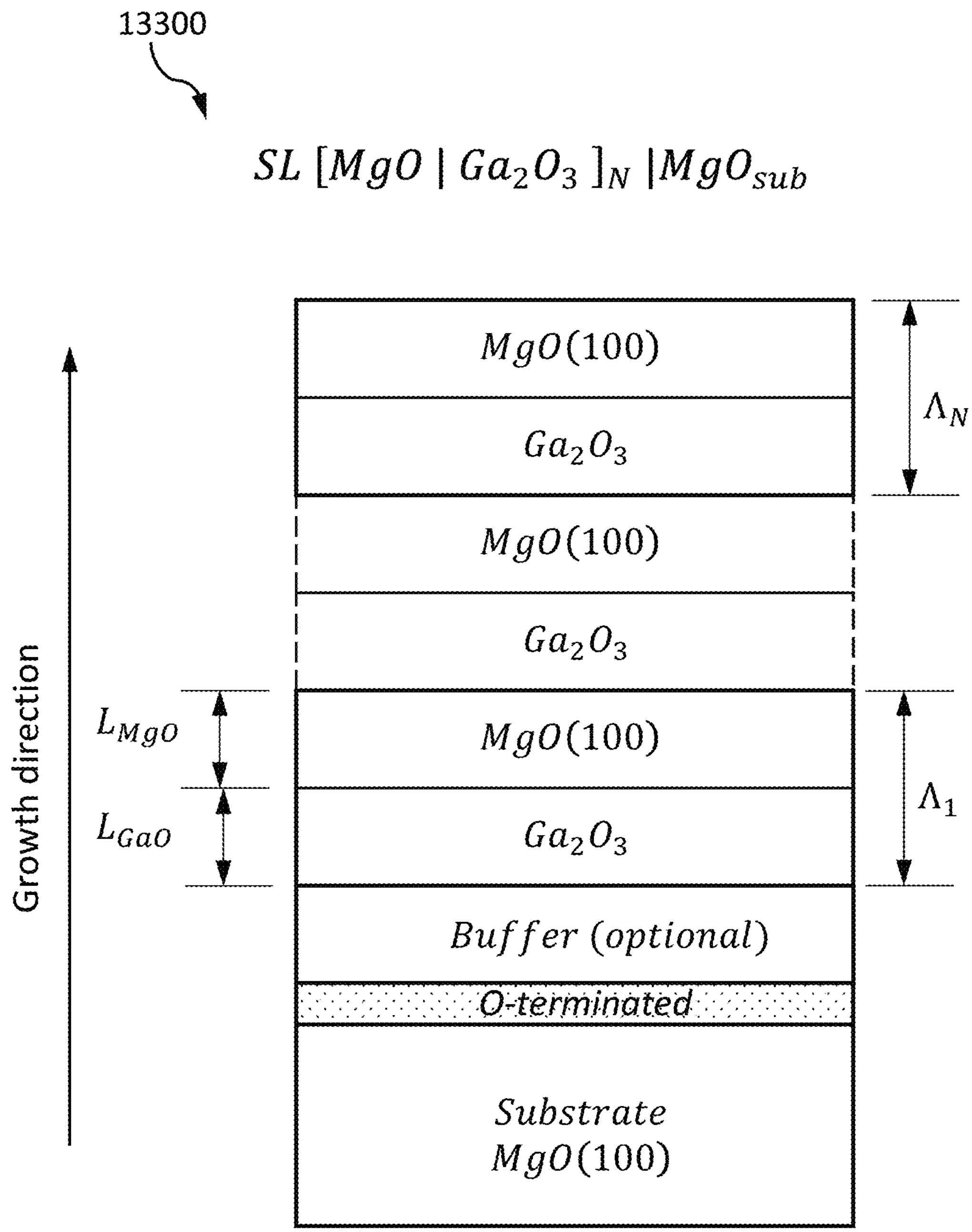

FIG. 133 shows the complex epilayer structure of dissimilar cubic oxide layers integrated to form a heterostructure and SL where the SL comprises SL[$Ga_2O_3$/MgO]//$MgO_{sub}$(100).

Figure 134A:
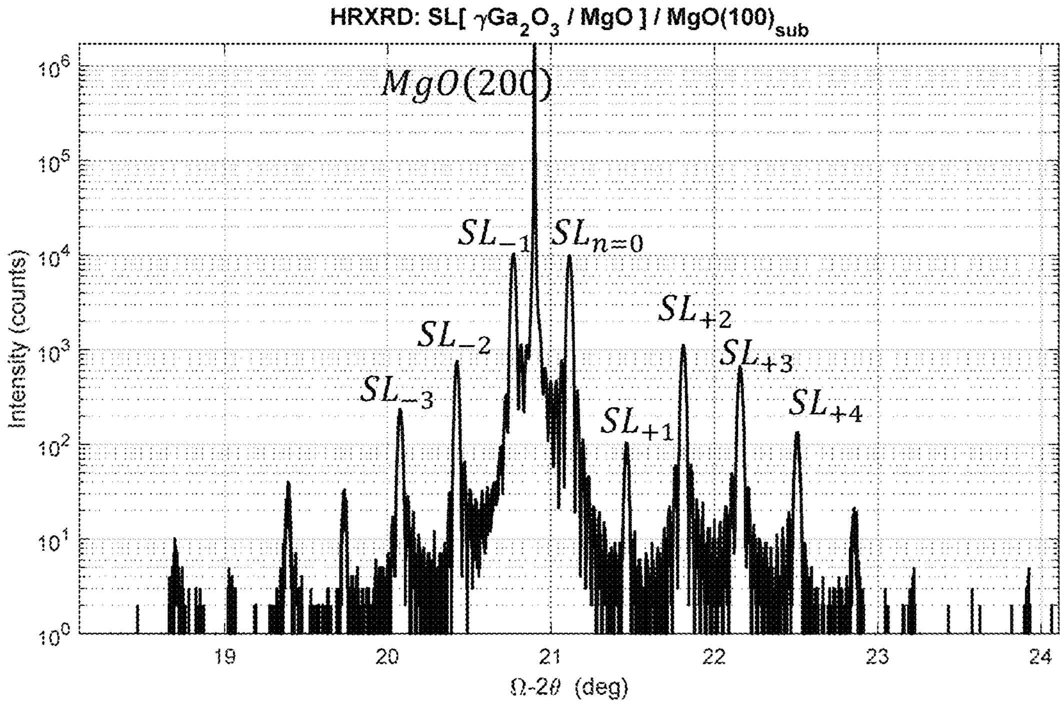
Figure 134B:
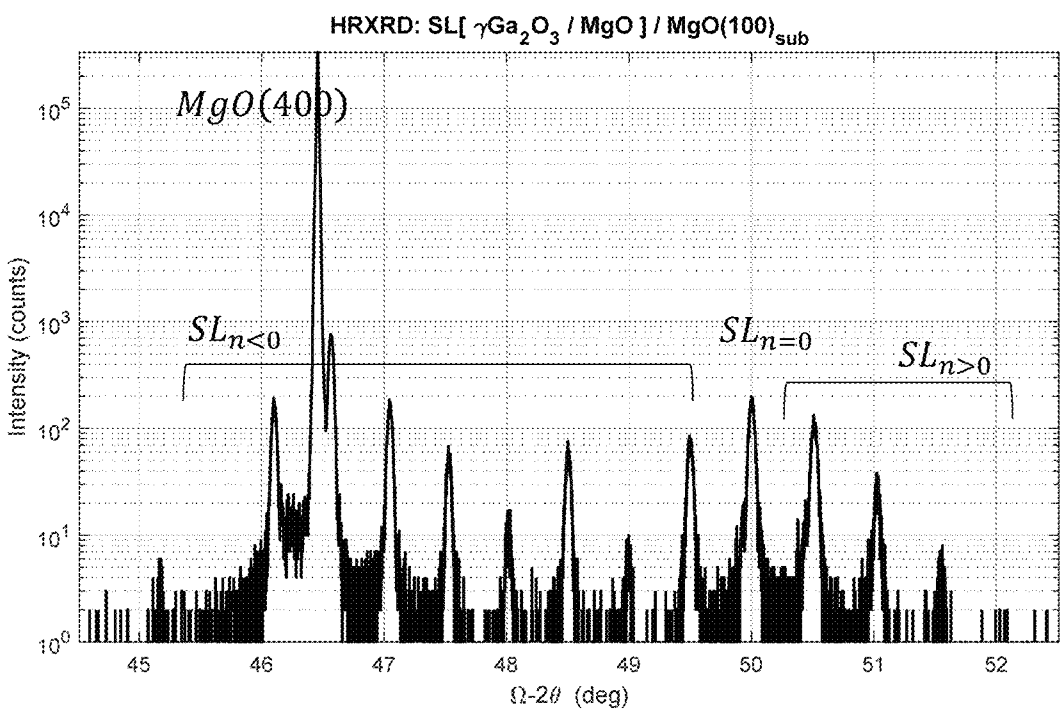

FIGS. 134A and 134B show experimental XRD data for the SL structure of FIG. 133 where the growth temperature is selected to achieve the cubic-phase $\gamma Ga_2O_3$ during the MBE deposition process.

Figure 135:
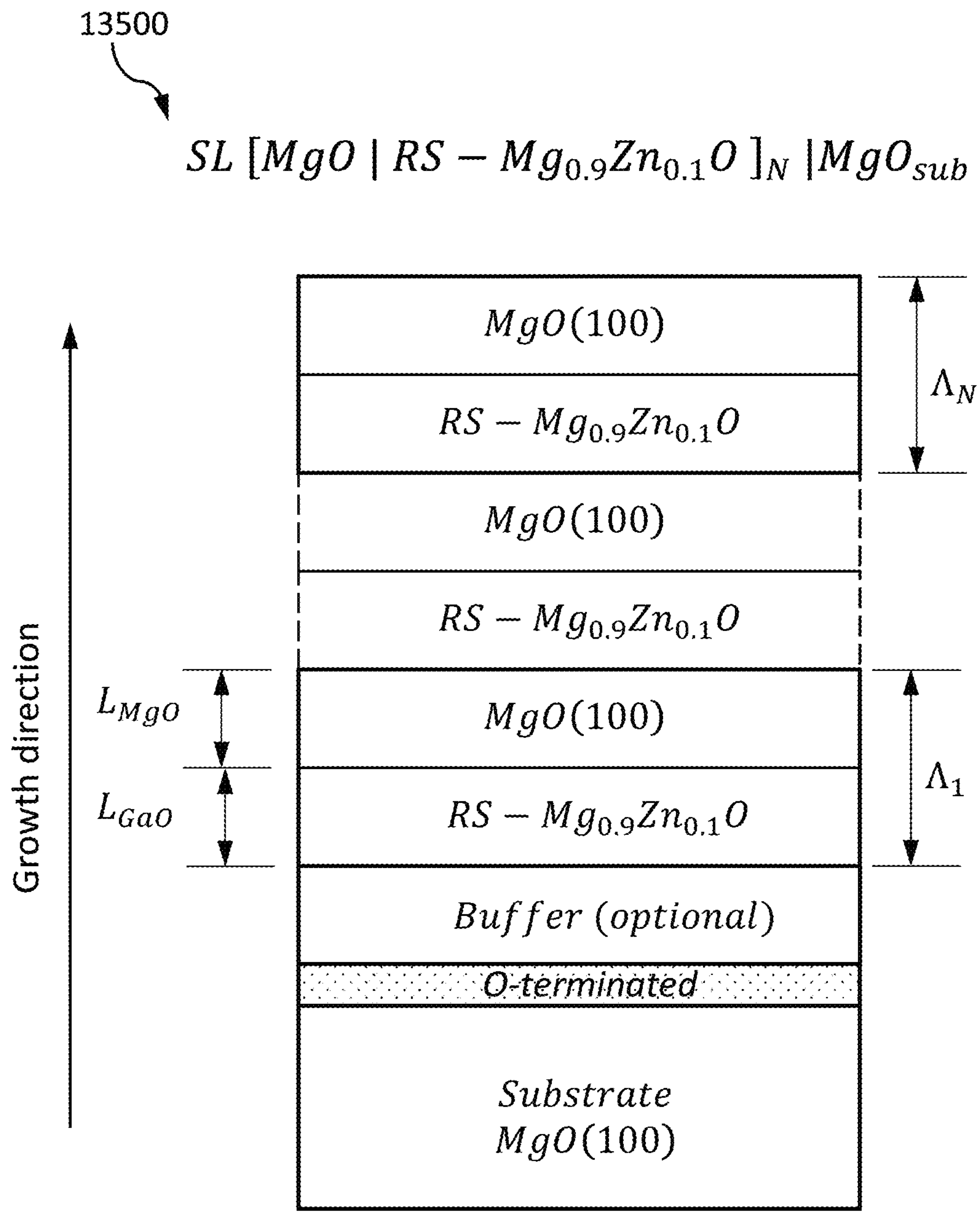

FIG. 135 shows the complex epilayer structure of dissimilar cubic oxide layers integrated into a superlattice or multi-heterojunction structure in a further example.

Figure 136:
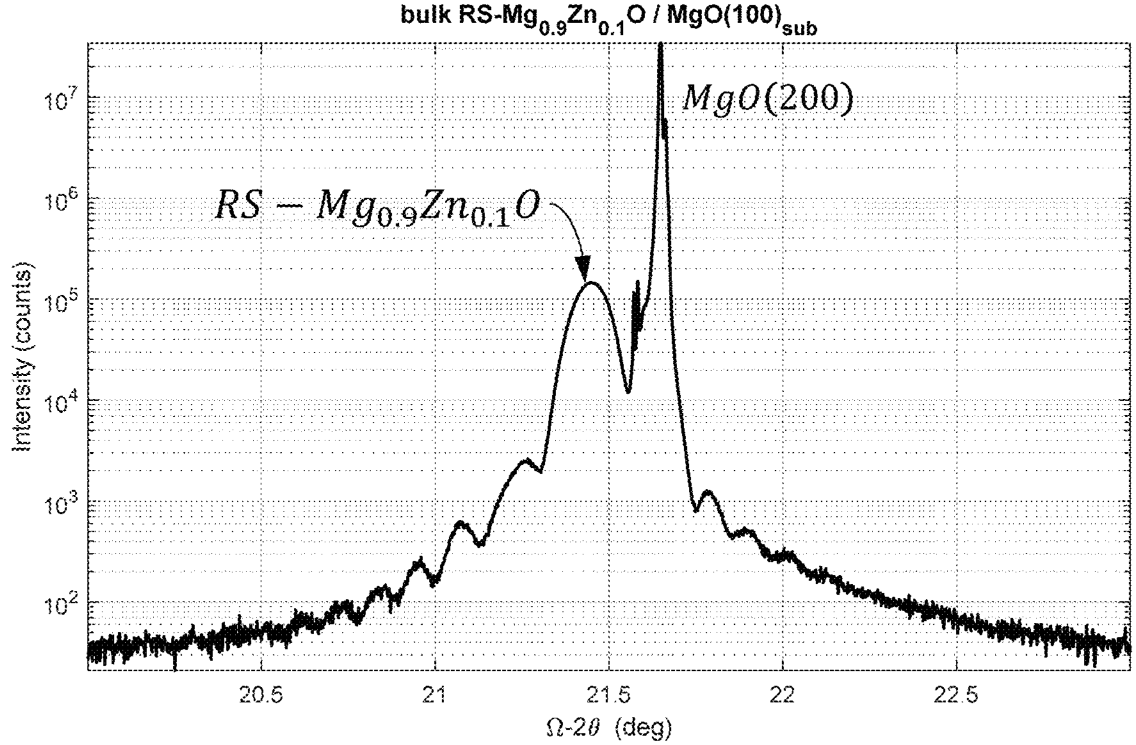

FIG. 136 shows experimental XRD data of a bulk RS-$Mg_{0.9}Zn_{0.1}O$ epilayer pseudomorphically strained to a cubic Fm3m MgO(100)-oriented substrate.

Figure 137:
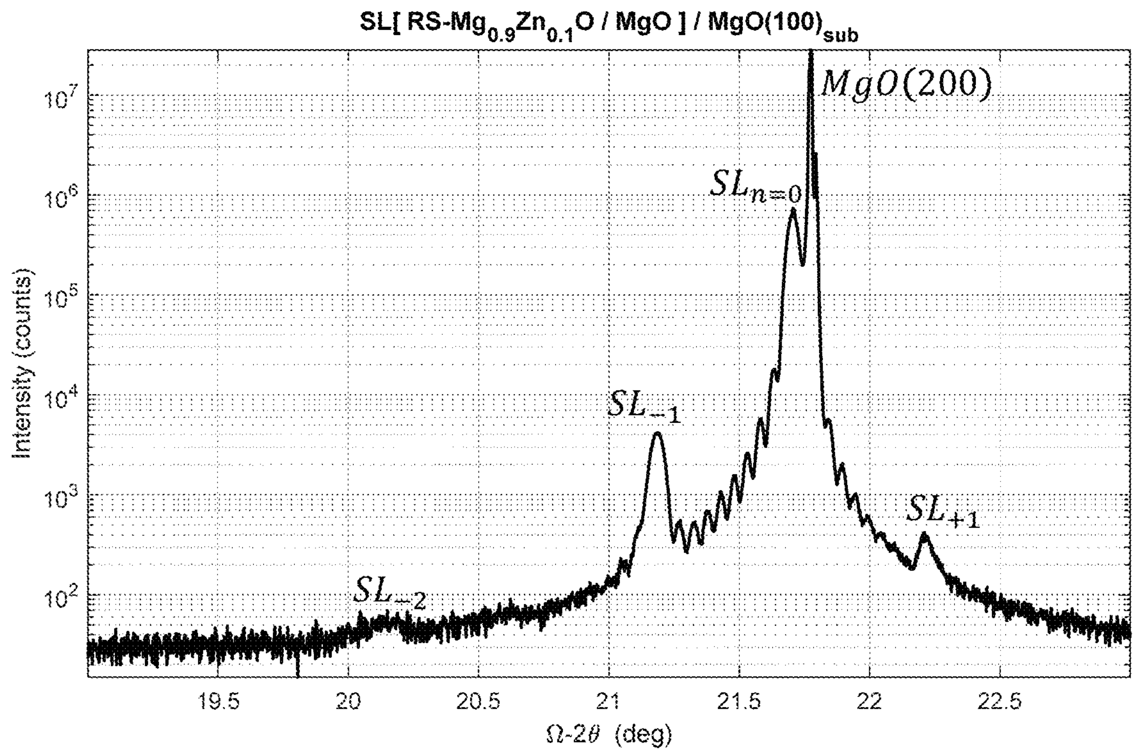

FIG. 137 shows experimental XRD data of the bulk RS-$Mg_{0.9}Zn_{0.1}O$ composition referred to FIG. 136 incorporated into a digital alloy in the form of SL[RS-$Mg_{0.9}Zn_{0.1}O$/MgO]//$MgO_{sub}$(100).

Figure 138A:
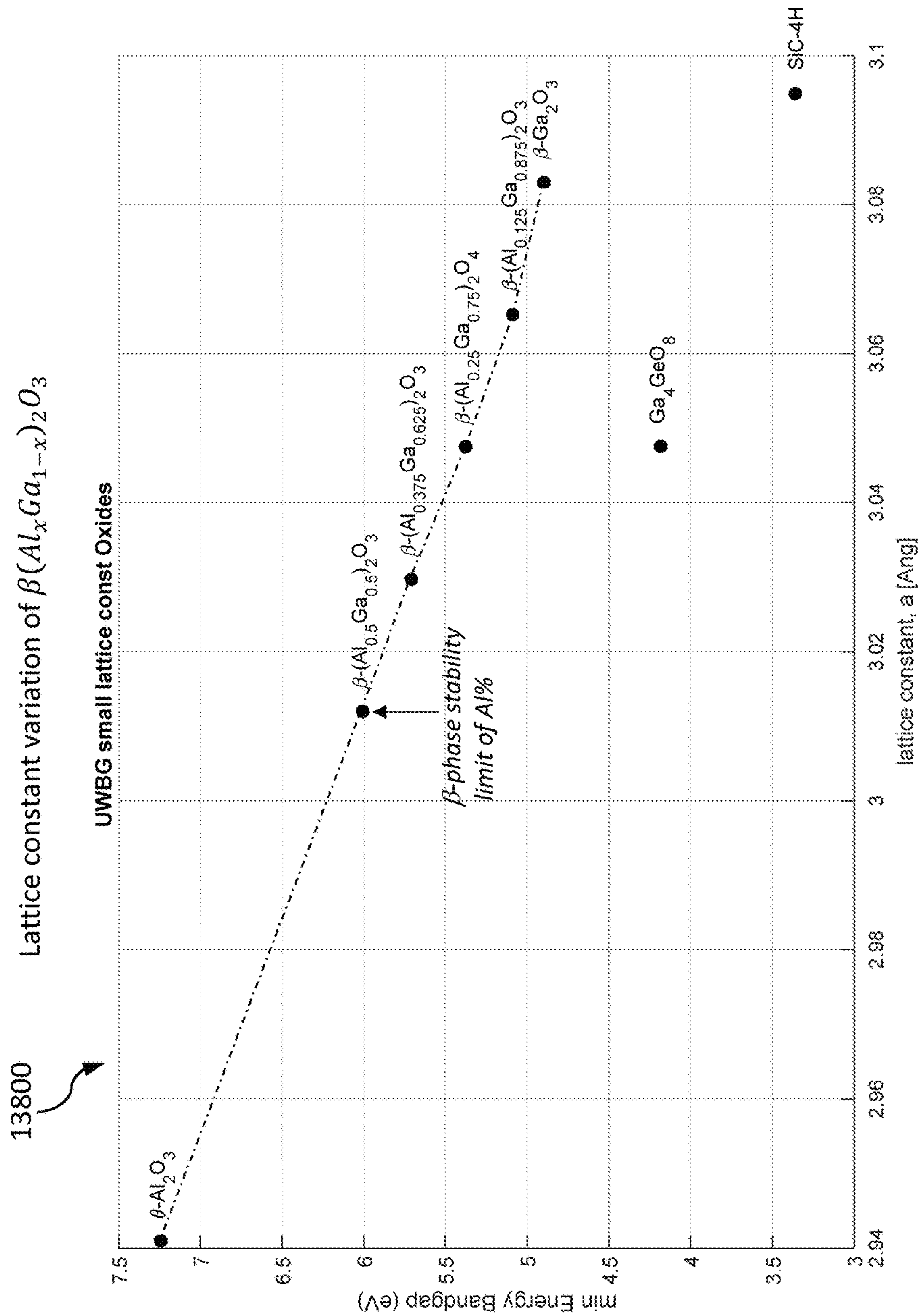

FIG. 138A shows a plot of the minimum bandgap energy versus the minor lattice constant of monoclinic $\beta(Al_xGa_{1-x})_2O_3$.

Figure 138B:
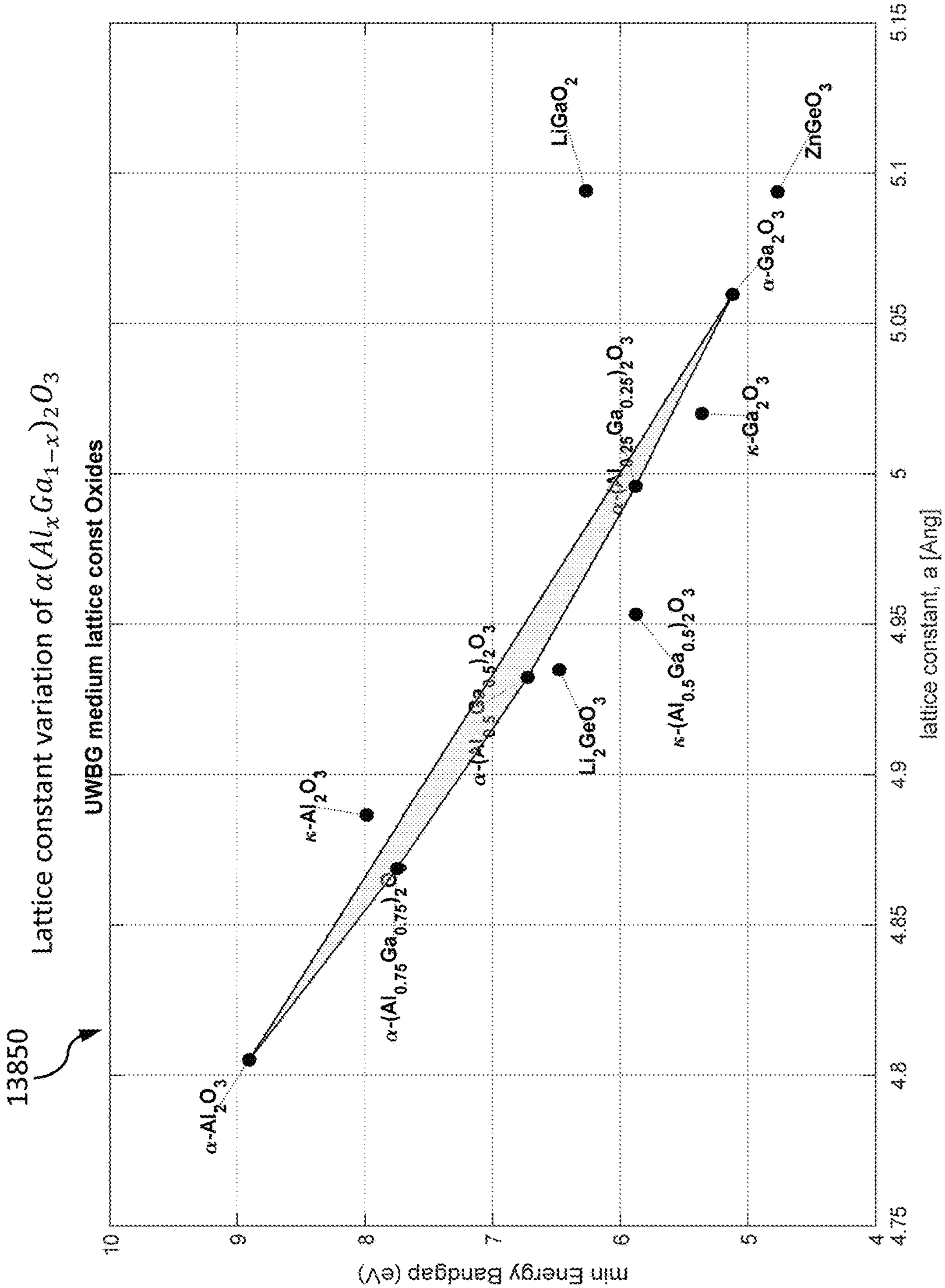

FIG. 138B shows a plot of the minimum bandgap energy versus the minor lattice constant of hexagonal $\alpha(Al_xGa_{1-x})_2O_3$.

Figure 138C:
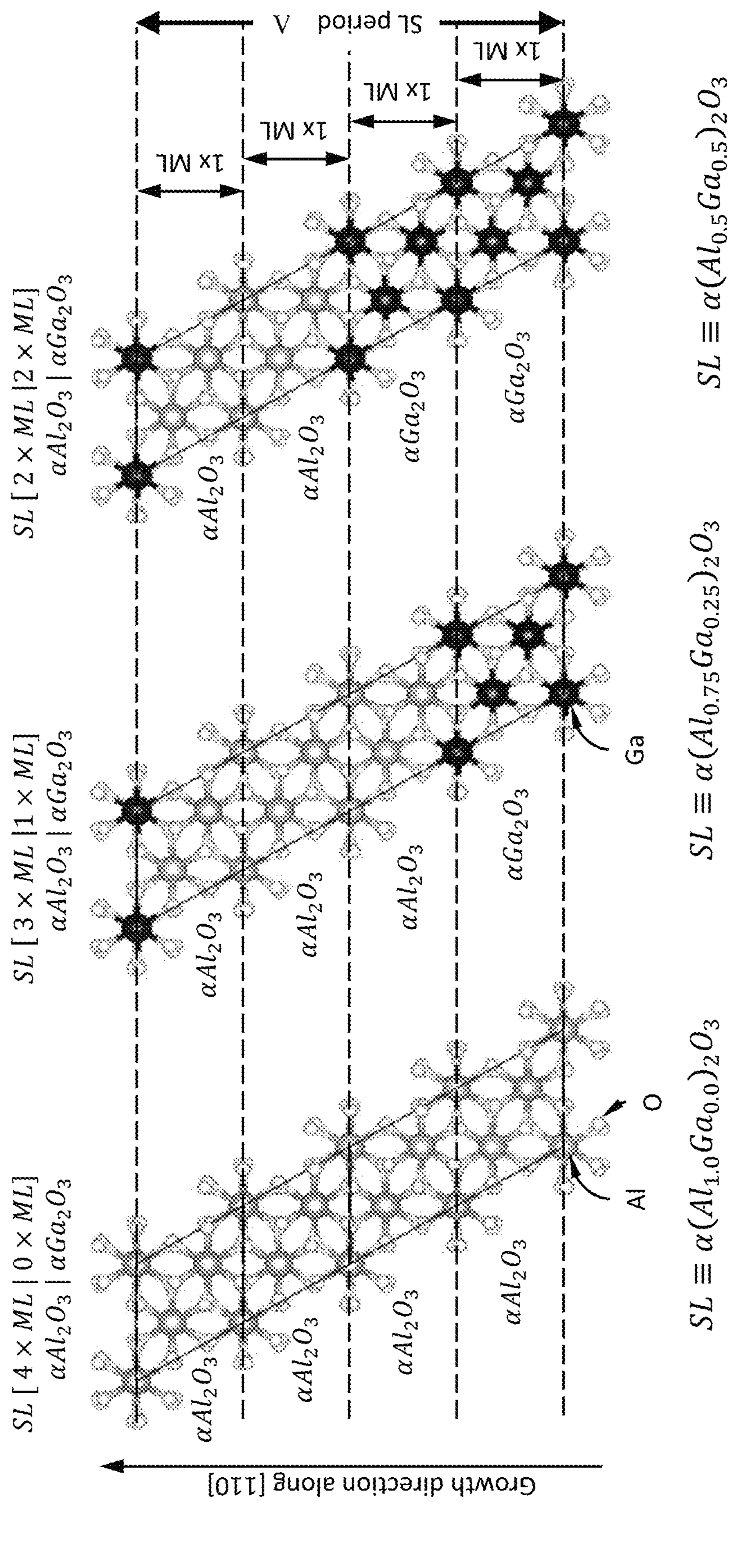

FIG. 138C shows examples of R3c $\alpha(Al_xGa_{1-x})_2O_3$ epitaxial structures that may be formed.

Figure 139A:
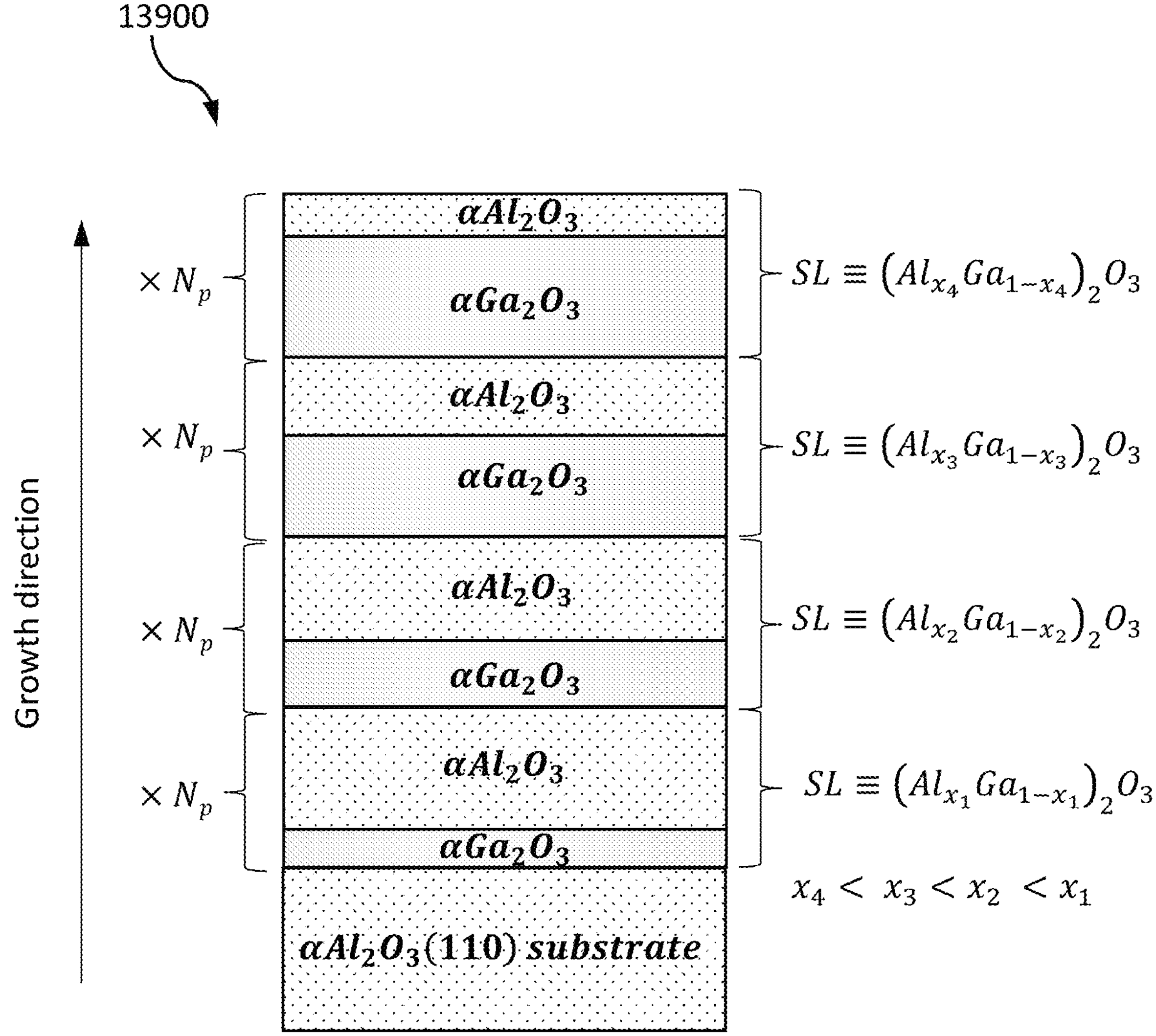

FIG. 139A shows an epilayer structure implementing a stepped increment tuning of the effective alloy composition of each SL region along the growth direction.

Figure 139B:
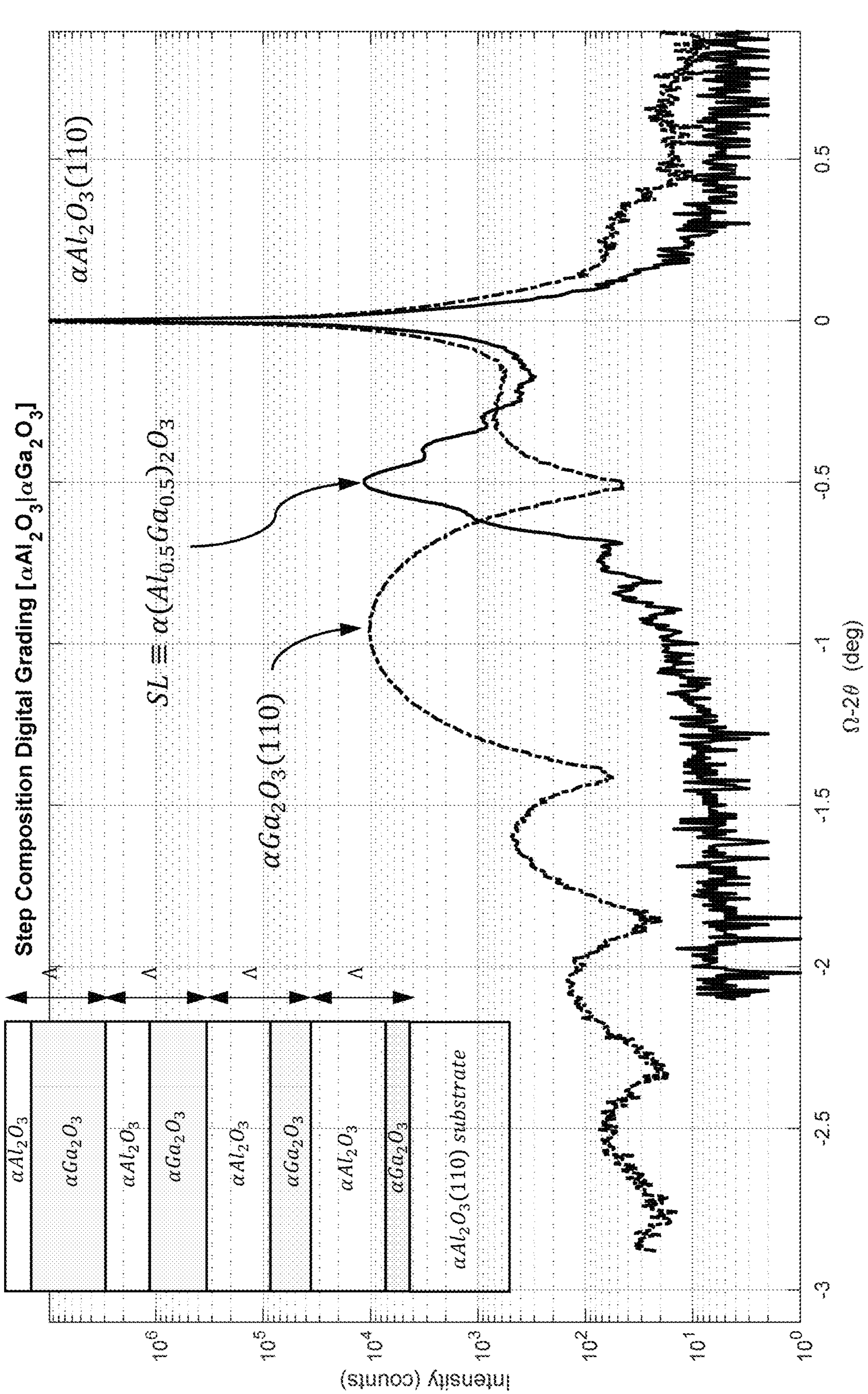

FIG. 139B shows the experimental XRD data of a step graded SL (SGSL) structure as shown in FIG. 139A using a digital alloy comprising bilayers of $\alpha Ga_2\ O_3$ and $\alpha Al_2\ O_3$ deposited on (110)-oriented Sapphire (zero miscut).

Figure 140:
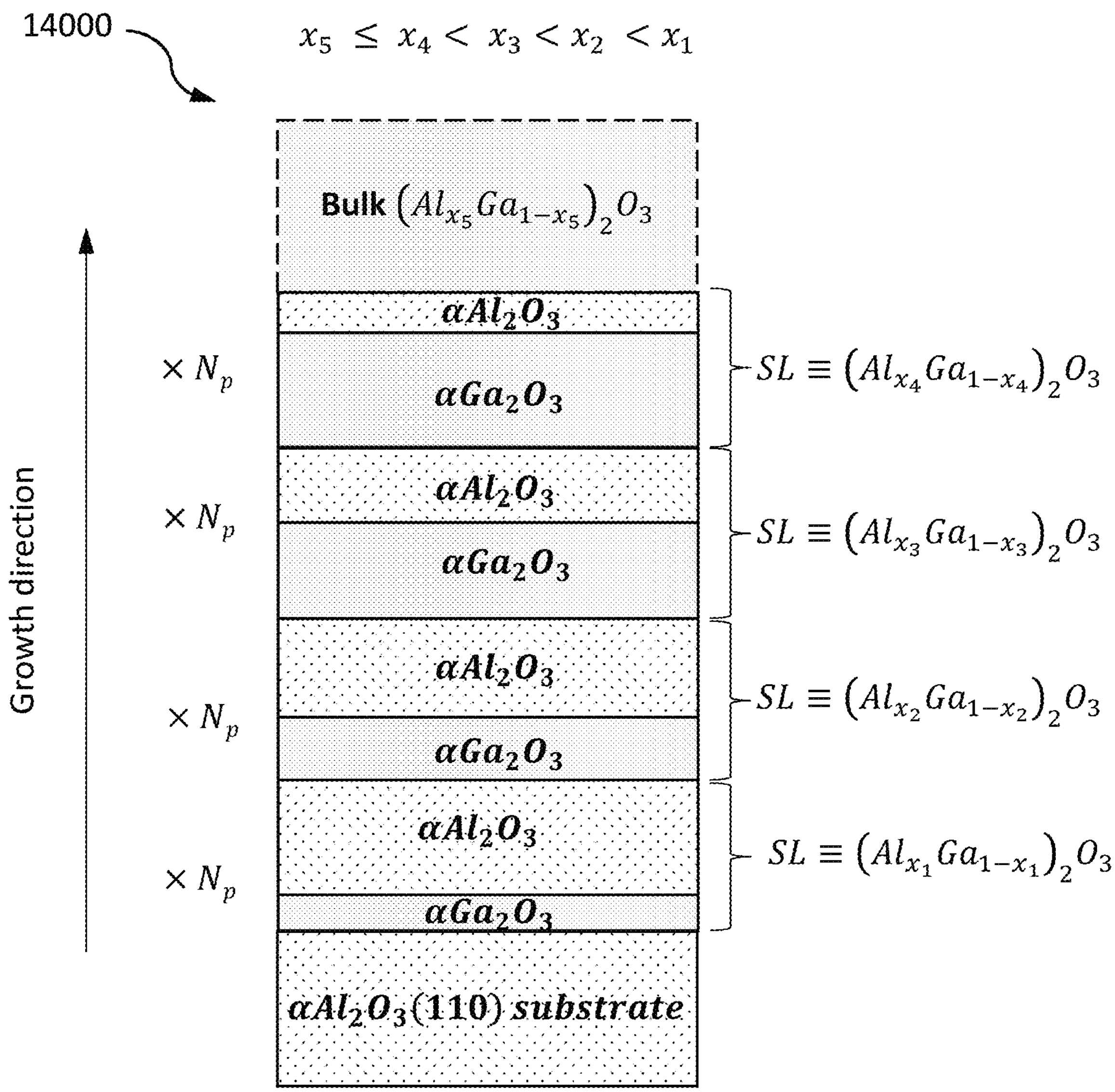

FIG. 140 shows another step graded SL structure which in one example may be used to form a pseudo-substrate with a tuned in-plane lattice constant for a subsequent high quality and close lattice matched active layer.

Figure 141A:
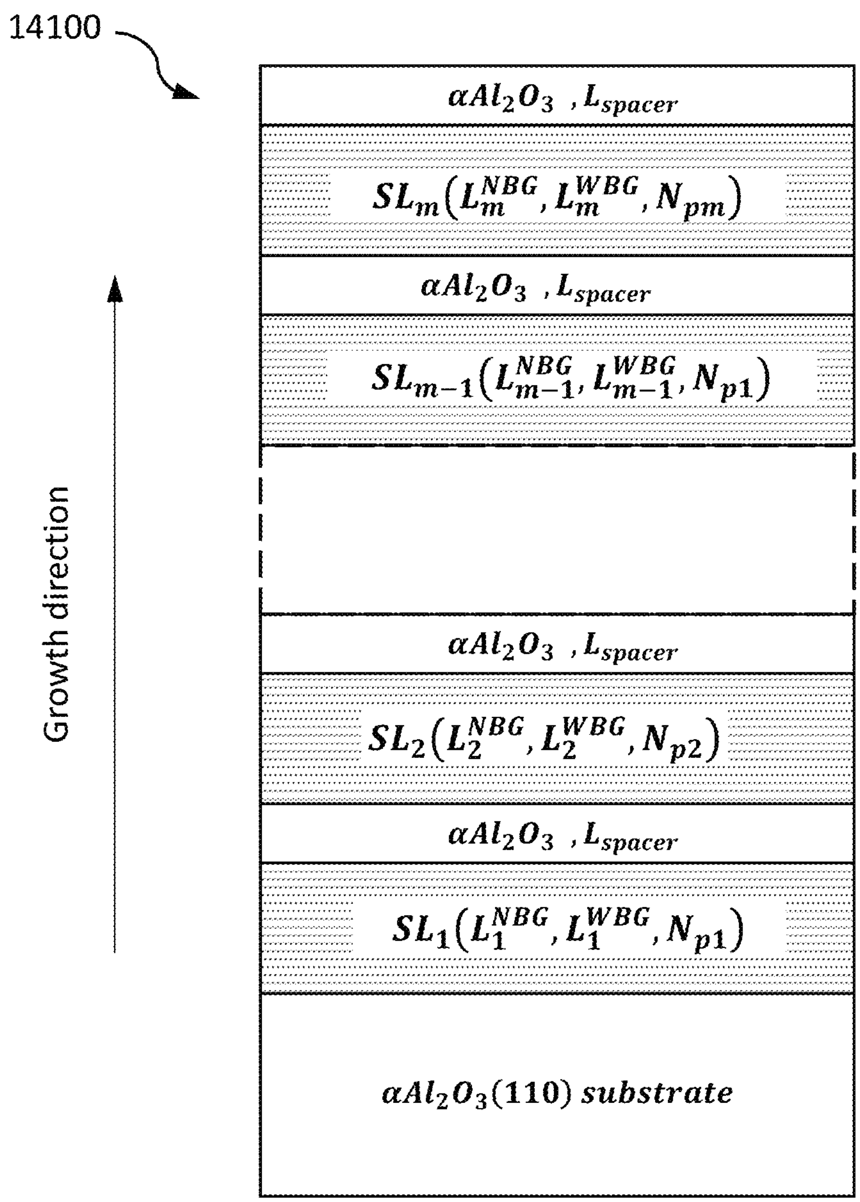

FIG. 141A shows another step graded SL structure comprising a high complexity digital alloy grading interleaved by a wide bandgap spacer.

Figure 141B:
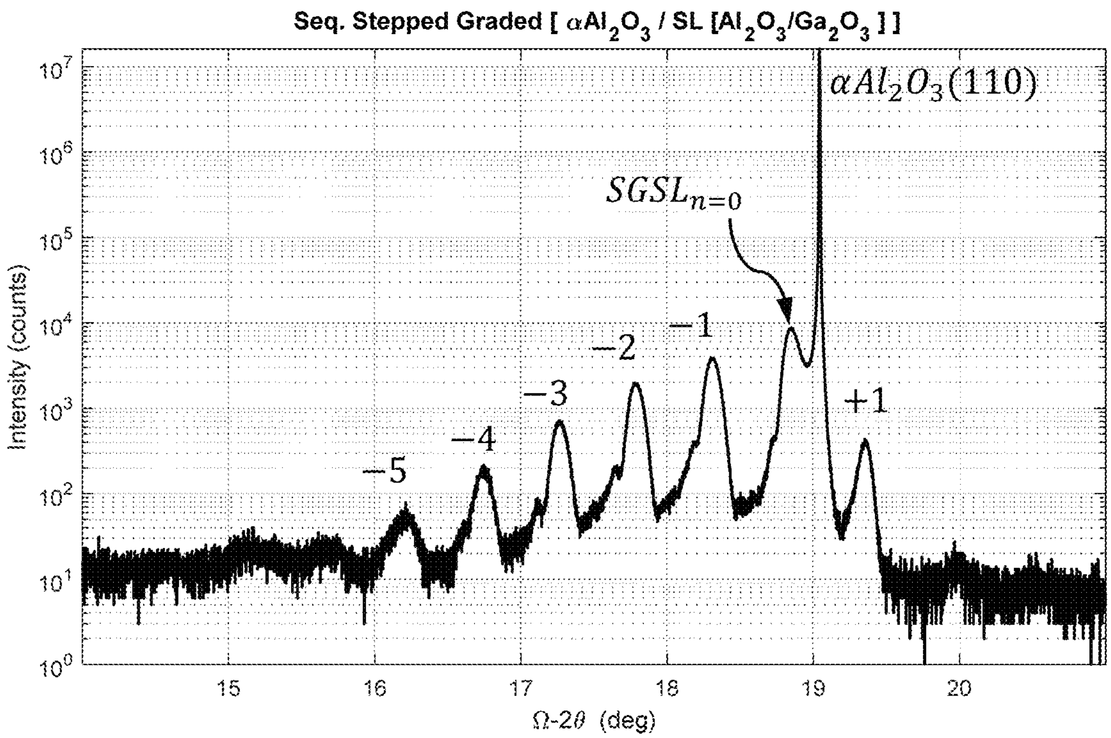

FIG. 141B shows the experimental high-resolution XRD data of the step graded (i.e., chirped) SL structure with interposer shown in FIG. 141A.

Figure 141C:
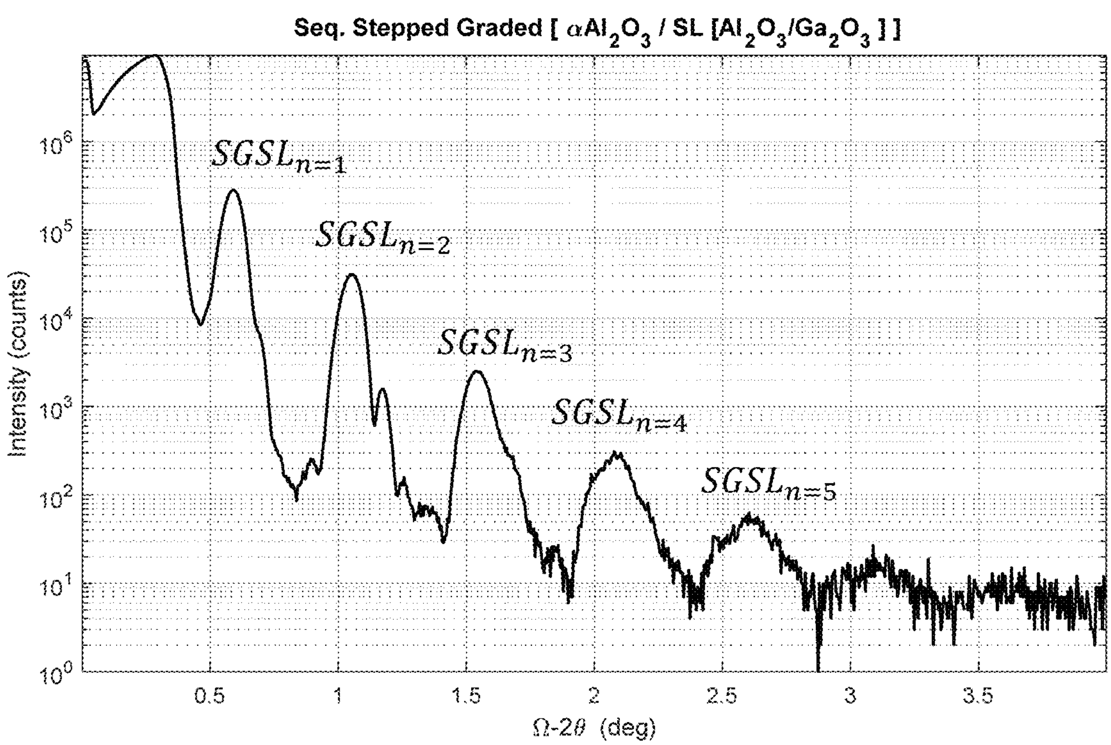

FIG. 141C shows the high-resolution XRR data of the step graded (i.e., chirped) SL structure with interposer shown in FIG. 141A.

Figure 142A:
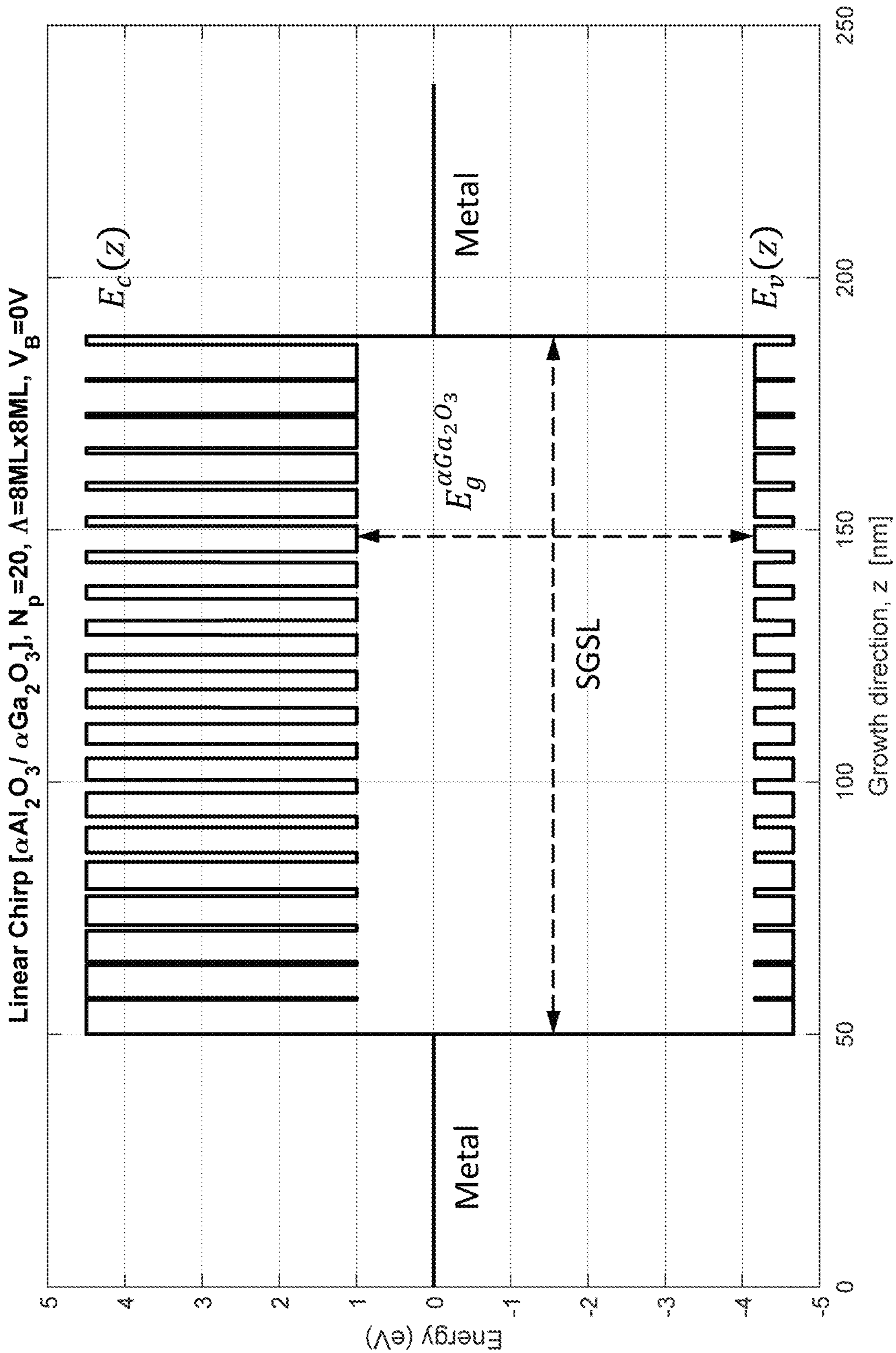
Figure 142B:
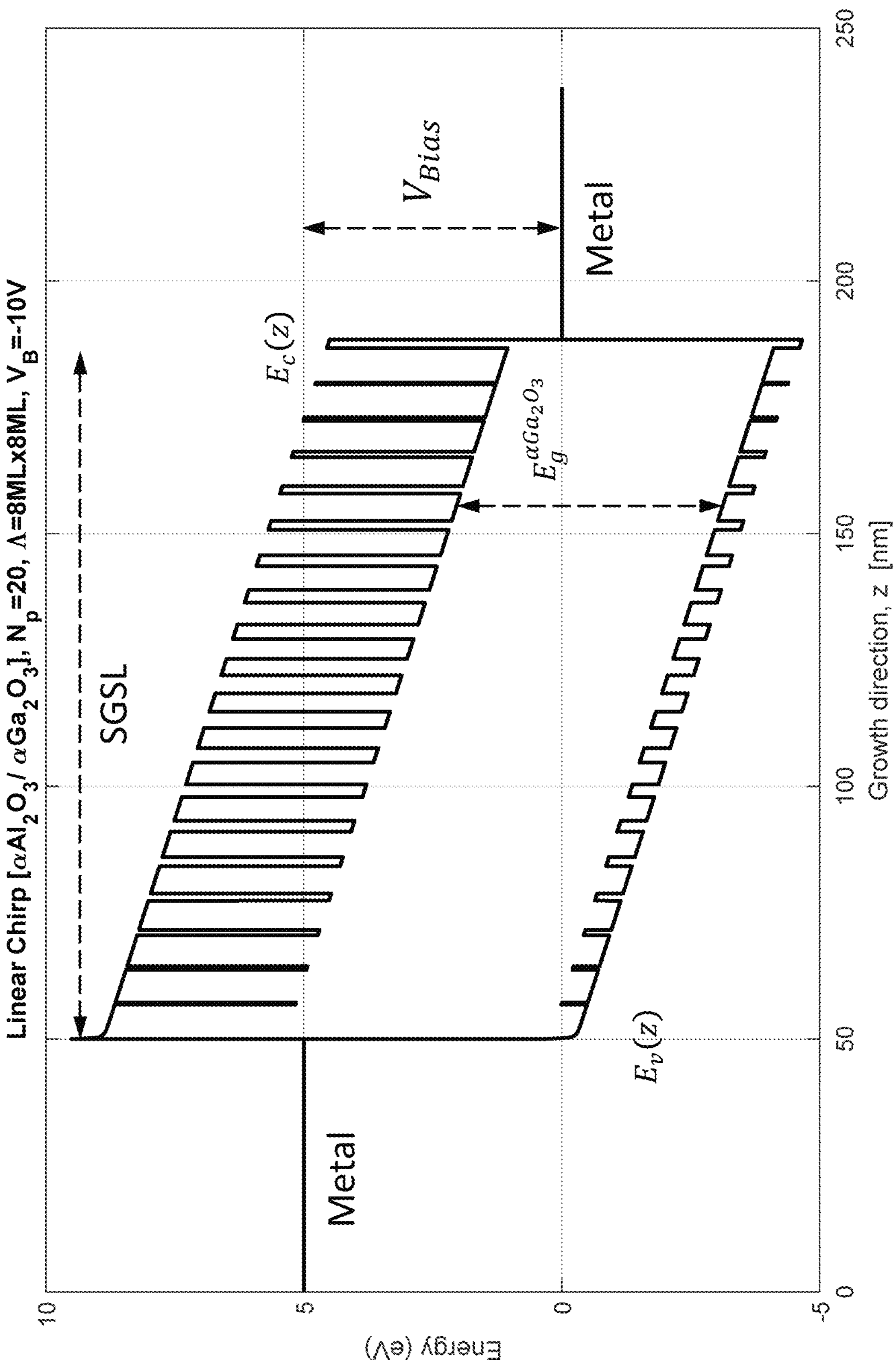
Figure 142C:
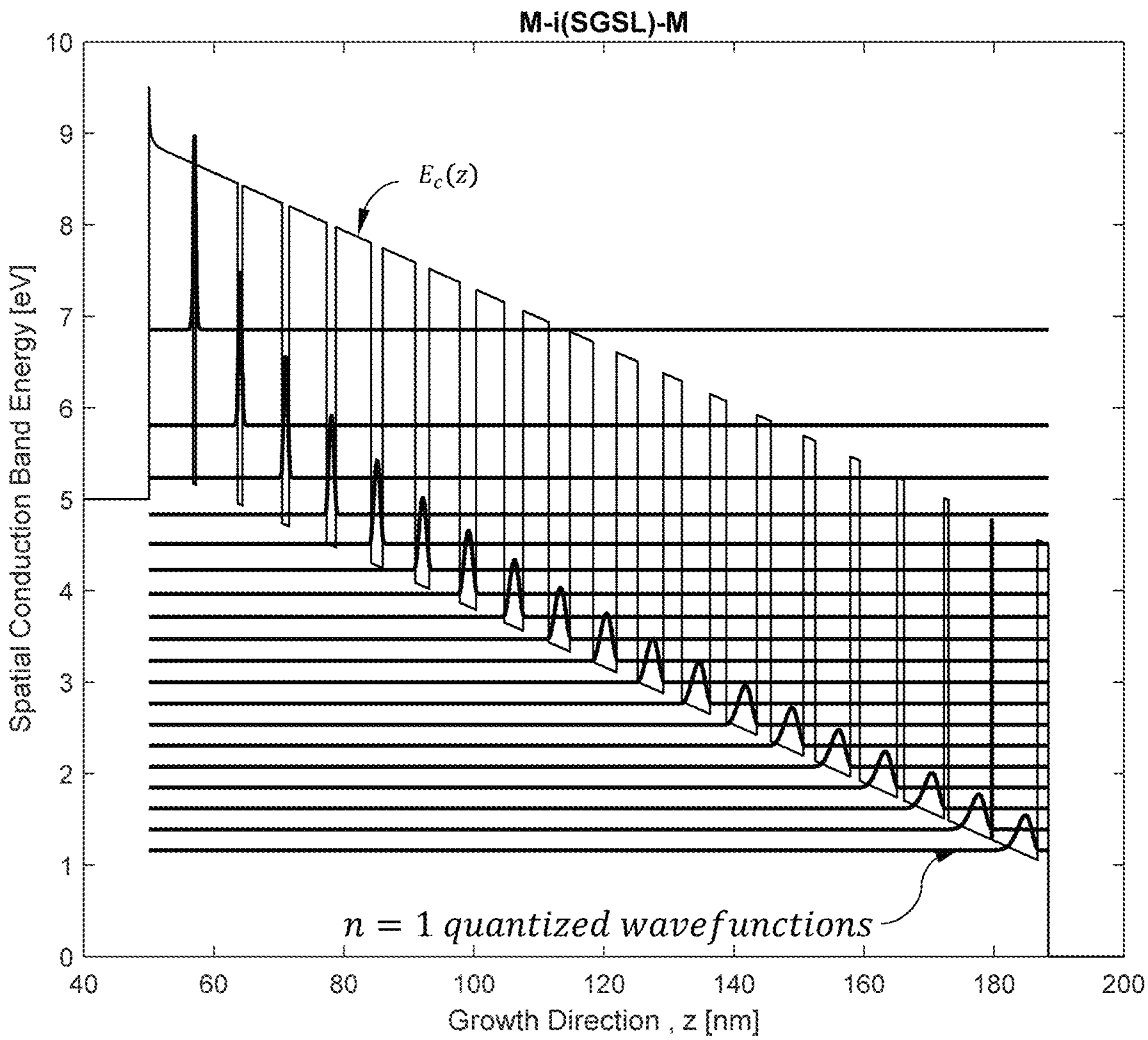

FIGS. 142A-142C show the electronic band diagram as a function of the growth direction for a chirp layer structure.

Figure 142D:
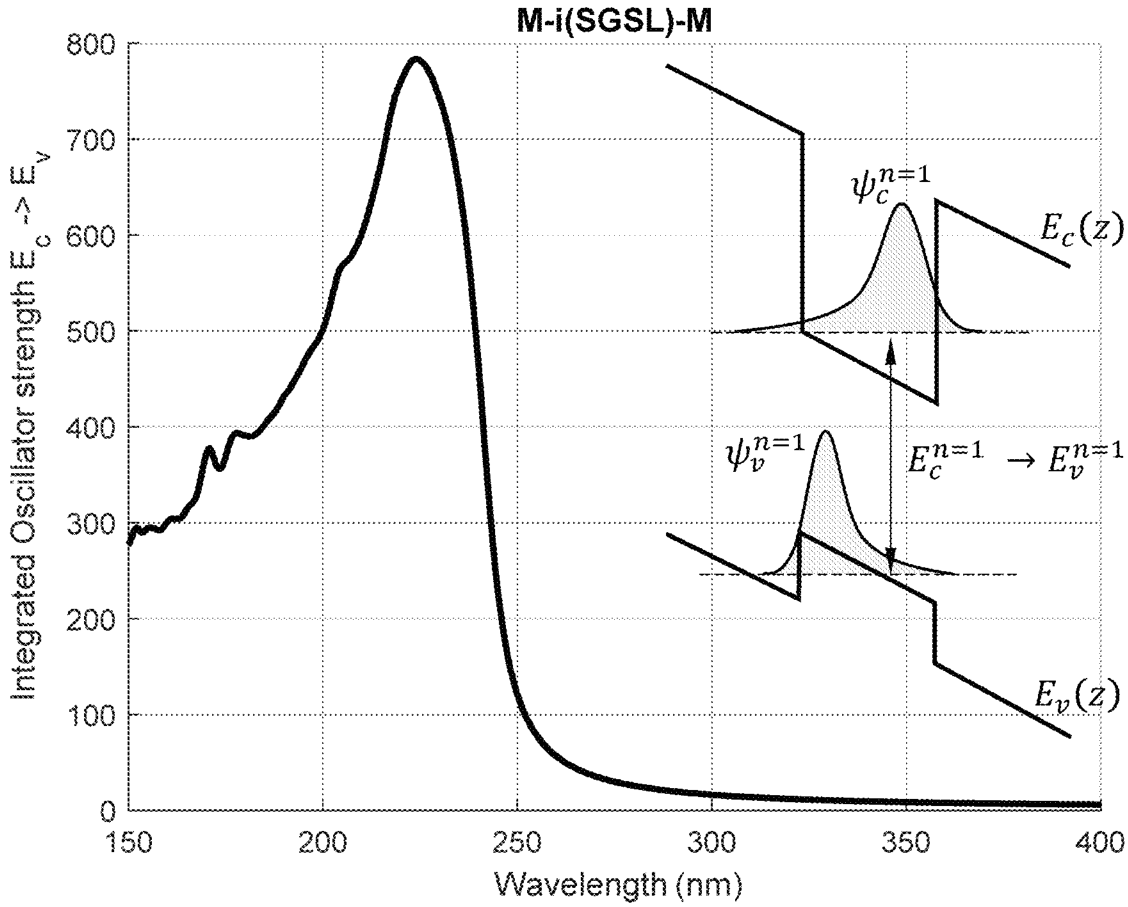

FIG. 142D is the wavelength spectrum of the oscillator strength for electric dipole transitions between the conduction and valence band of the chirp layer modeled in FIGS. 142A-142C.

Figure 143A:
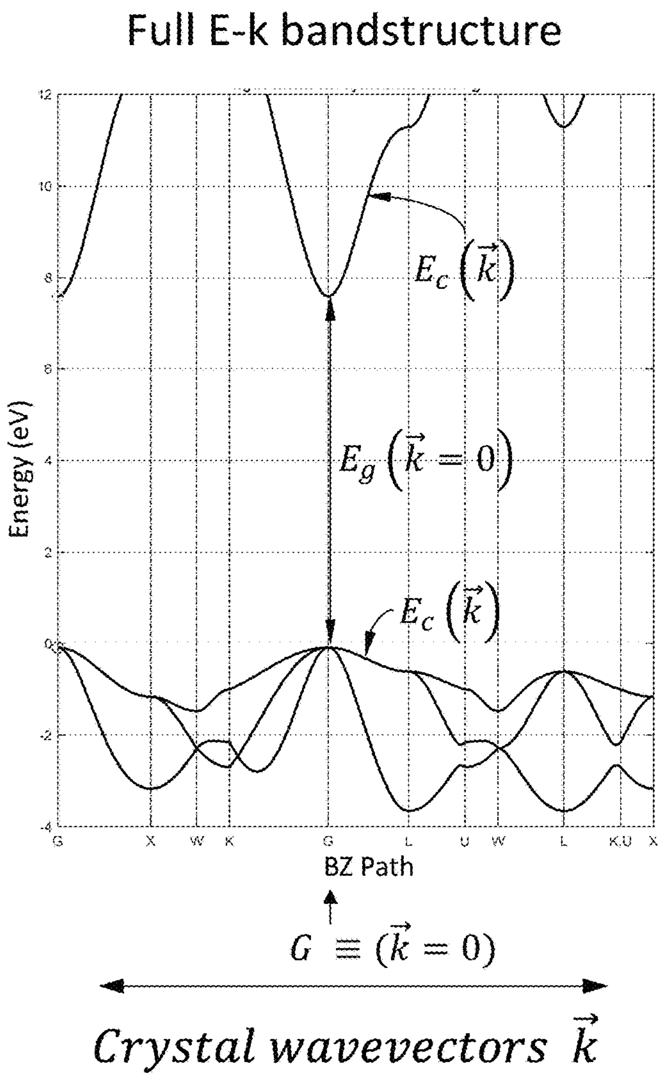

FIG. 143A shows an example full E-k band structure of an epitaxial oxide material which can be derived from the atomic structure of the crystal.

Figure 143B:
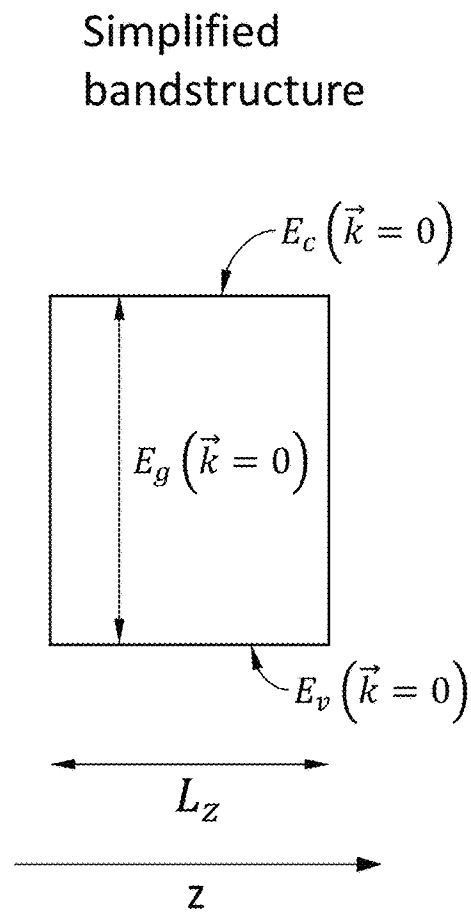

FIG. 143B shows a simplified band structure which is a representation of the minimum bandgap of the material where the x-axis is space (z) rather than wave vectors as in the E-k diagram of FIG. 143A.

Figure 144A:
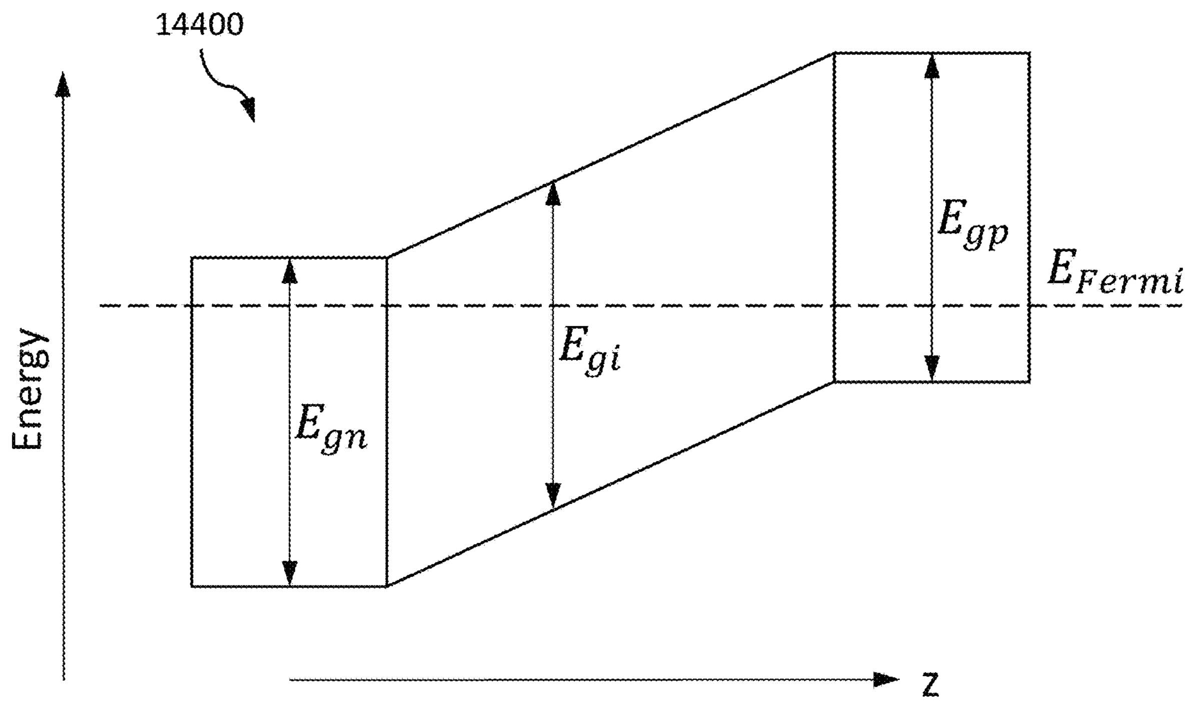

FIG. 144A shows a simplified band structure for a homojunction device comprising a p-i-n structure comprising epitaxial oxide layers.

Figure 144B:
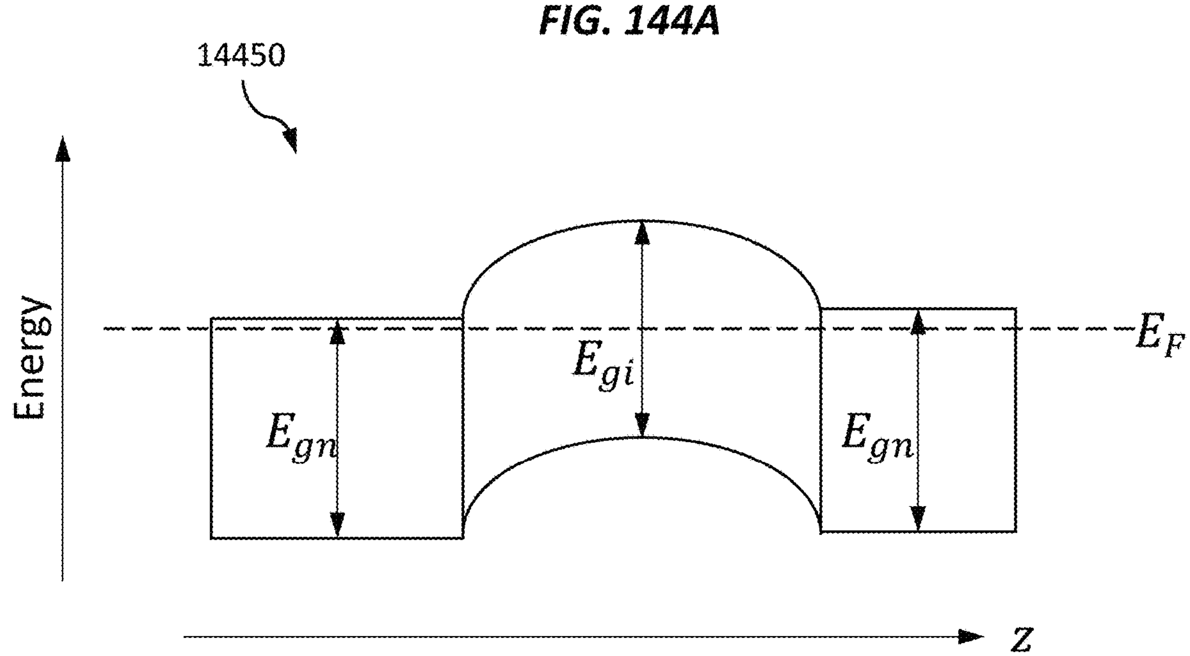

FIG. 144B shows a simplified band structure for a homojunction device comprising an n-i-n structure comprising epitaxial oxide layers.

Figure 145A:
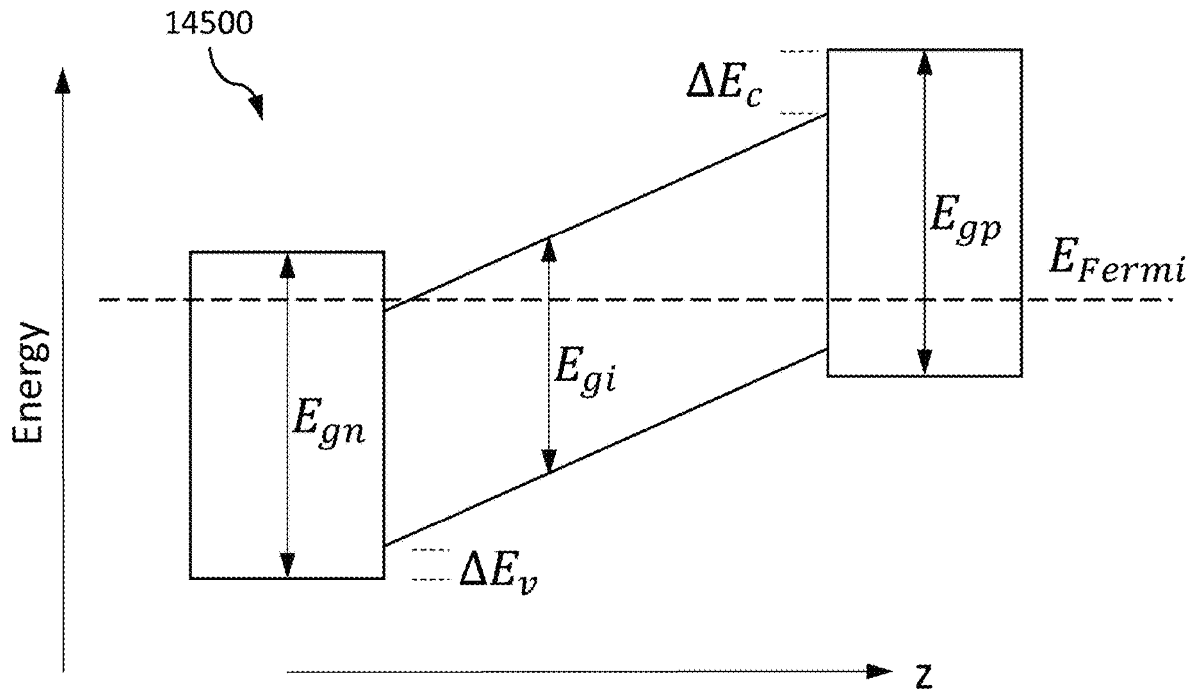

FIG. 145A shows a simplified band structure of a heterojunction p-i-n device comprising epitaxial oxide layers.

Figure 145B:
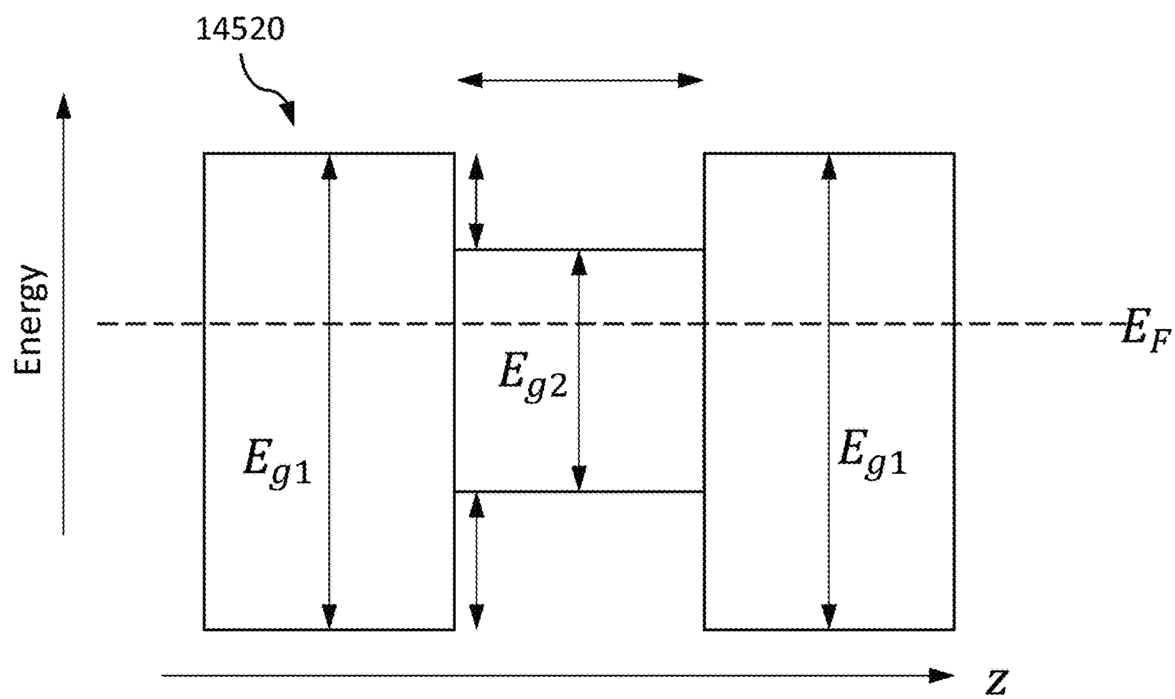

FIG. 145B shows a band structure diagram for a double heterojunction device comprising epitaxial oxide layers.

Figure 145C:
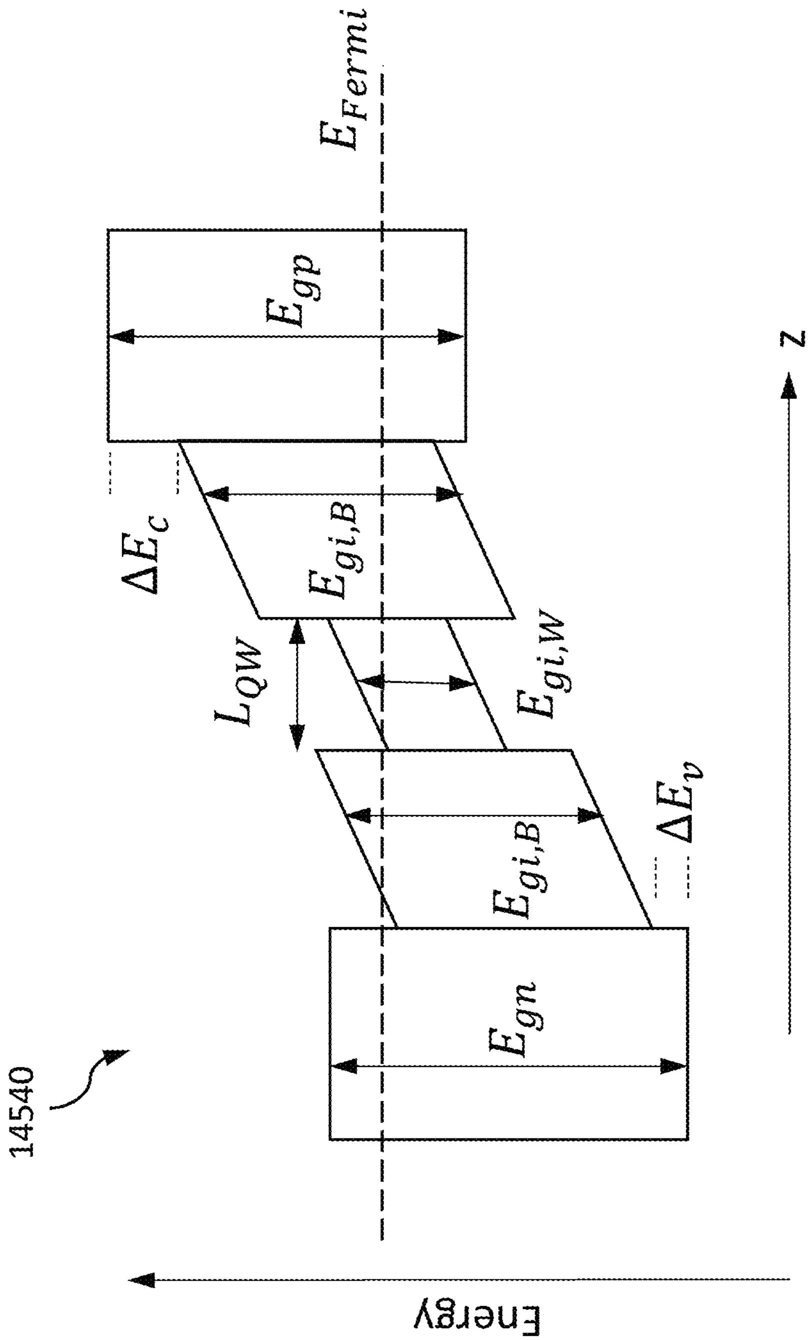

FIG. 145C shows a simplified band structure of a multiple heterojunction p-i-n device comprising epitaxial oxide layers.

Figure 146:
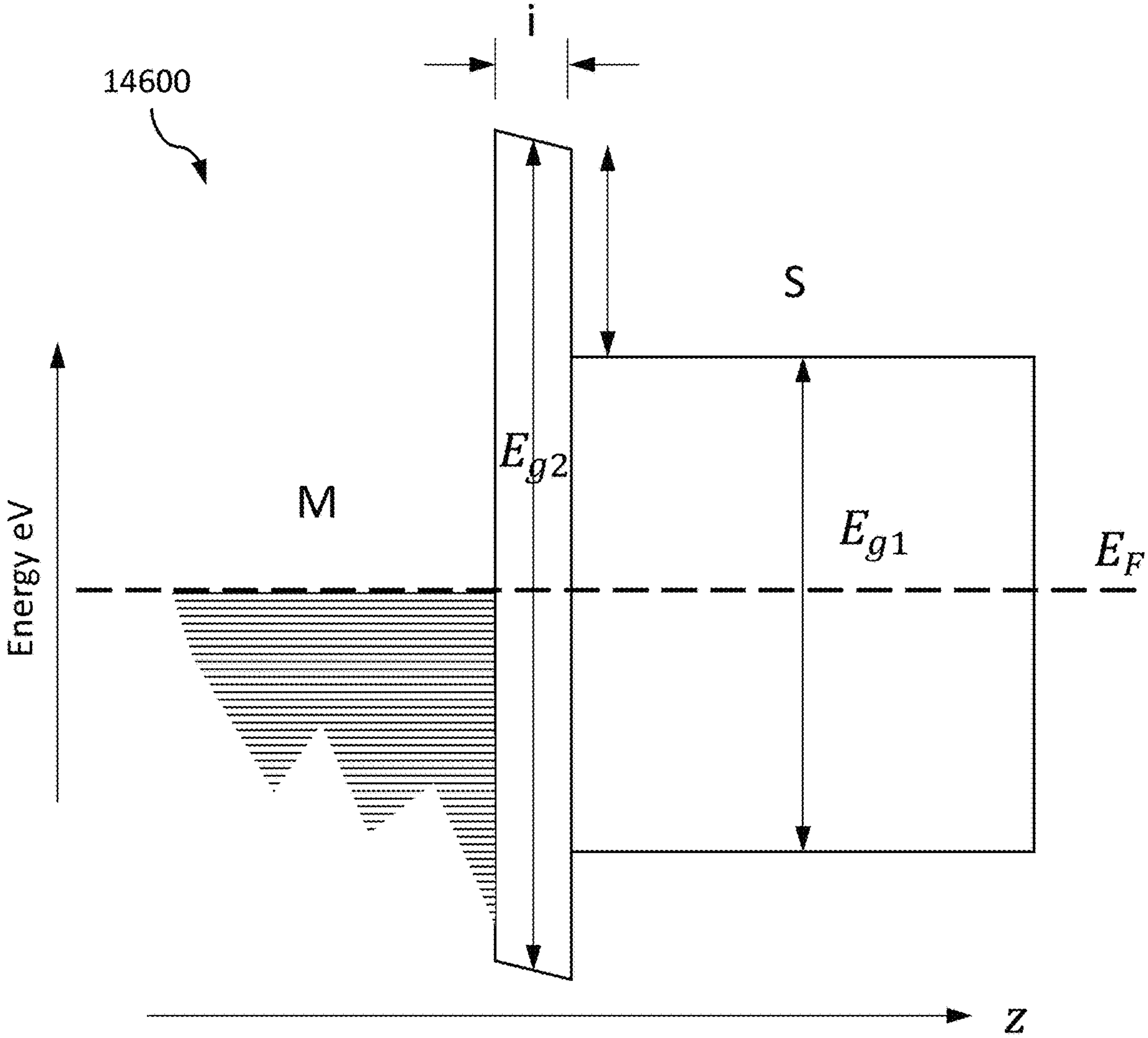

FIG. 146 shows a band structure diagram for a metal-insulator-semiconductor (MIS) structure comprising epitaxial oxide layers.

Figure 147A:
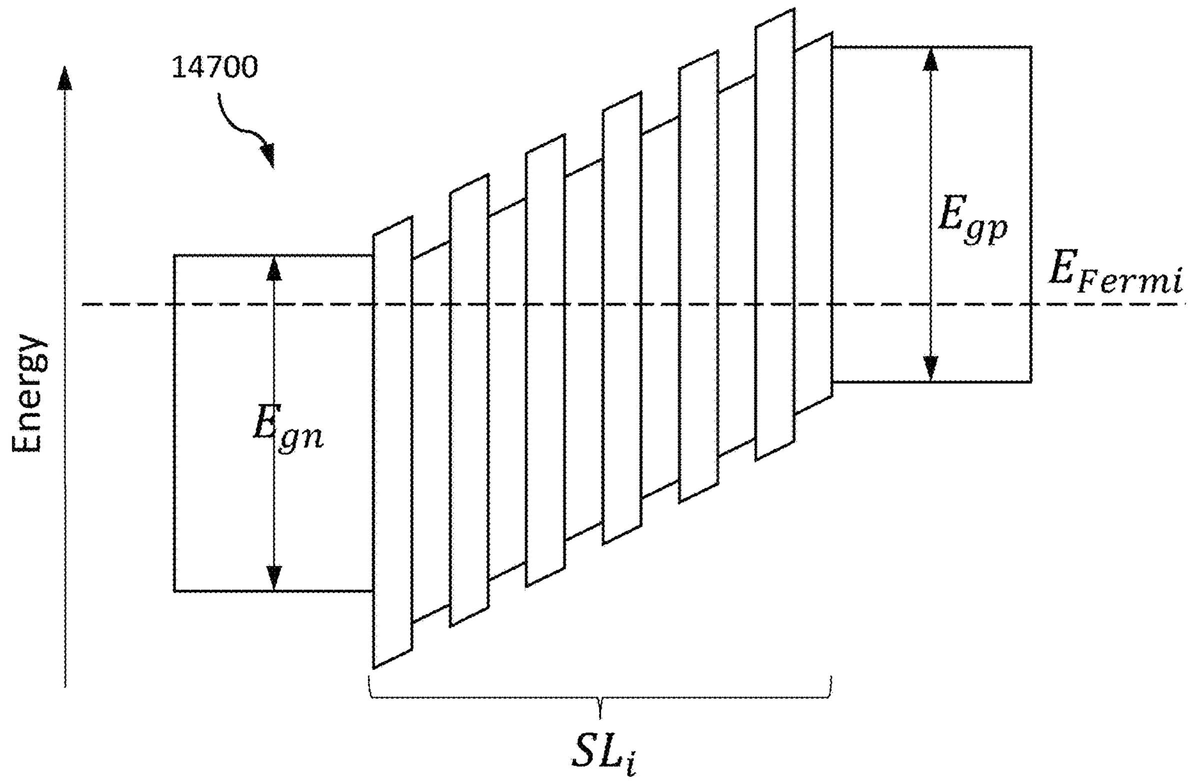

FIGS. 147A shows a simplified band structure of another example p-i-n structure, with a superlattice in the i-region.

Figure 147B:
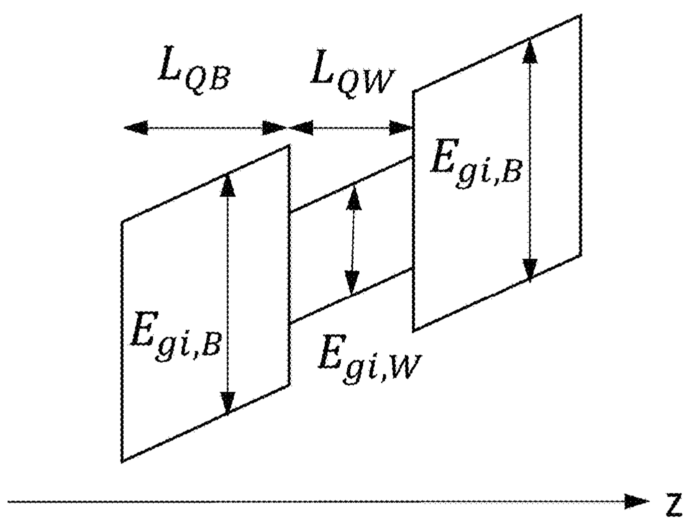

FIG. 147B shows a single quantum well of the structure shown in FIG. 147A.

Figure 148:
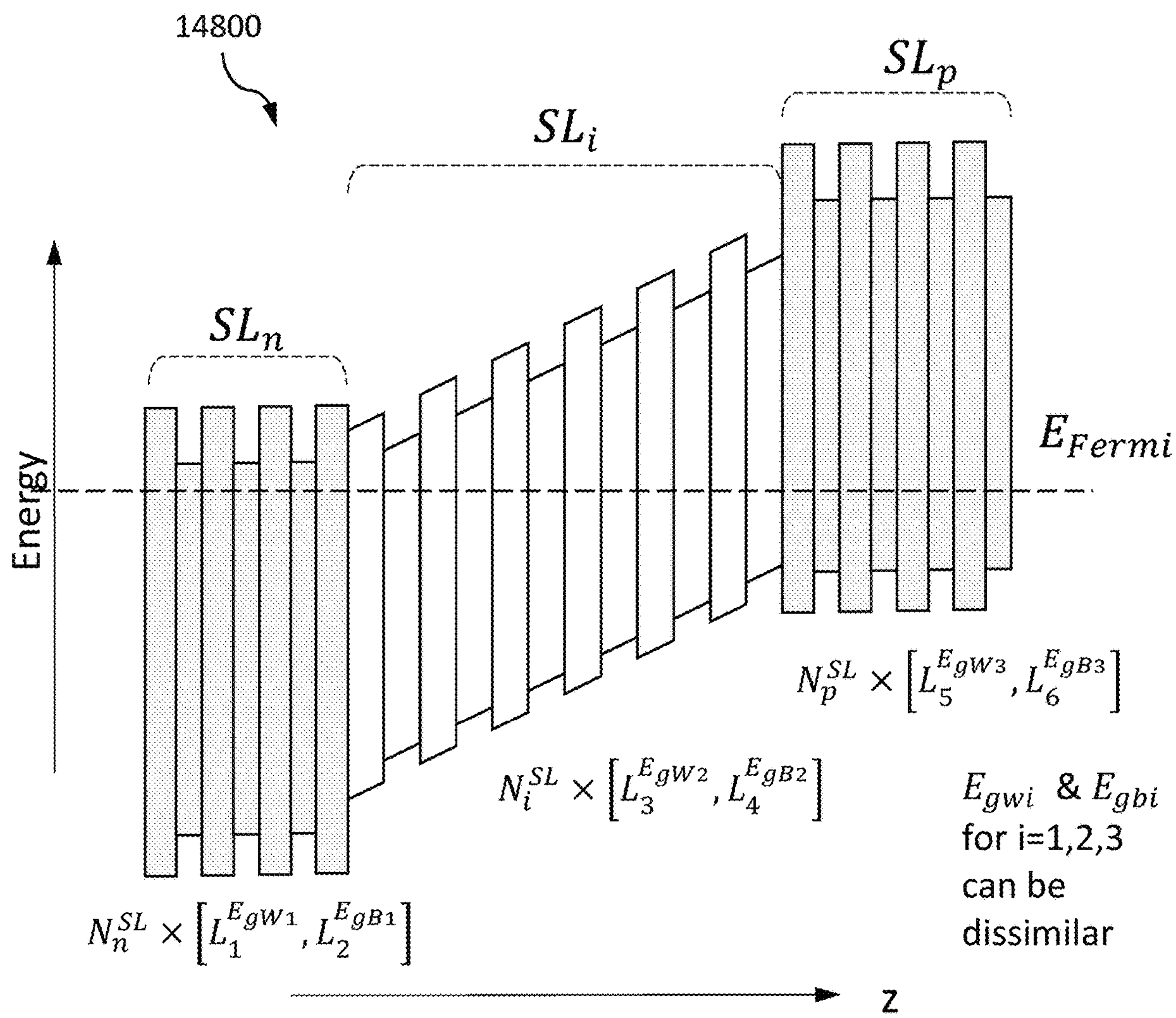

FIG. 148 shows a simplified band structure of another example p-i-n structure with a superlattice in the n-, i- and p-layers.

Figure 149:
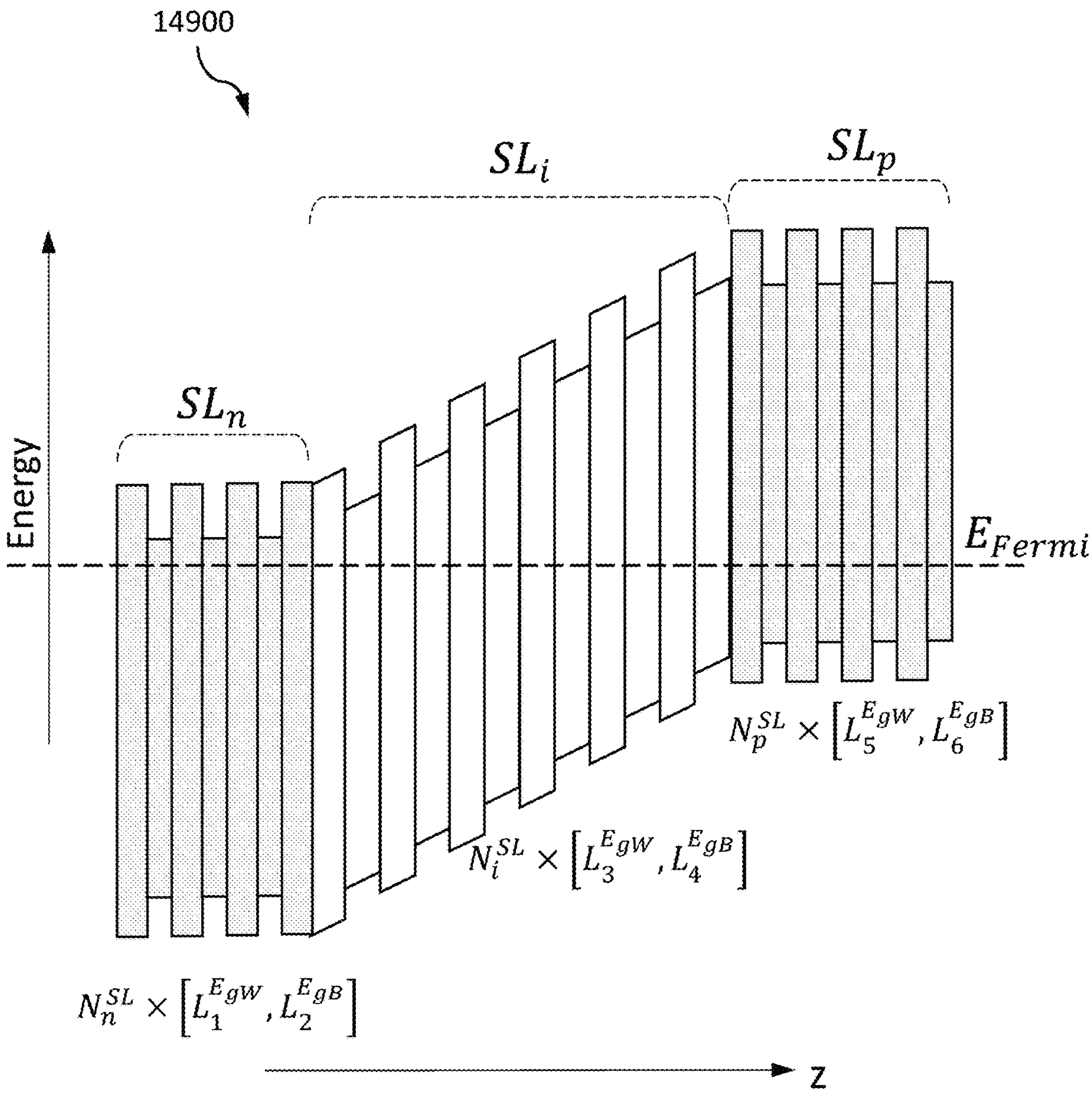

FIG. 149 shows a simplified band structure of another example p-i-n structure, with a superlattice in the n-, i- and p-layers similar to the structure in FIG. 148.

Figure 150A:
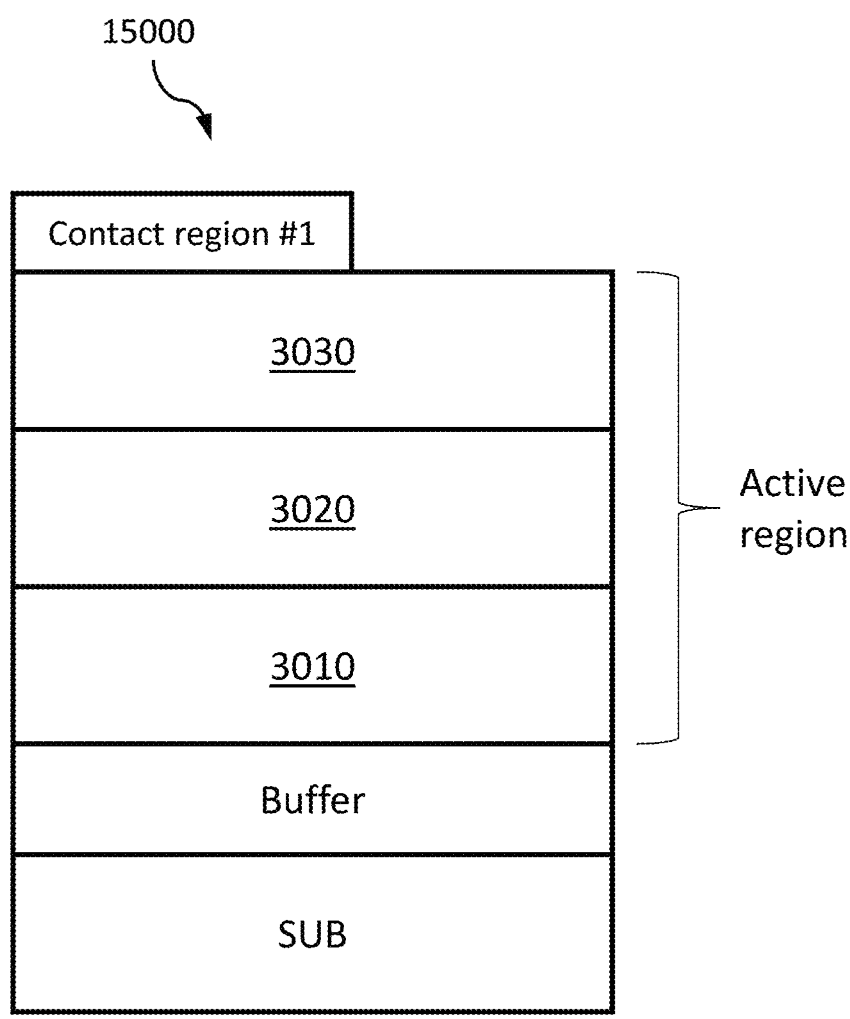

FIG. 150A shows an example of a semiconductor structure comprising epitaxial oxide layers.

Figure 150B:
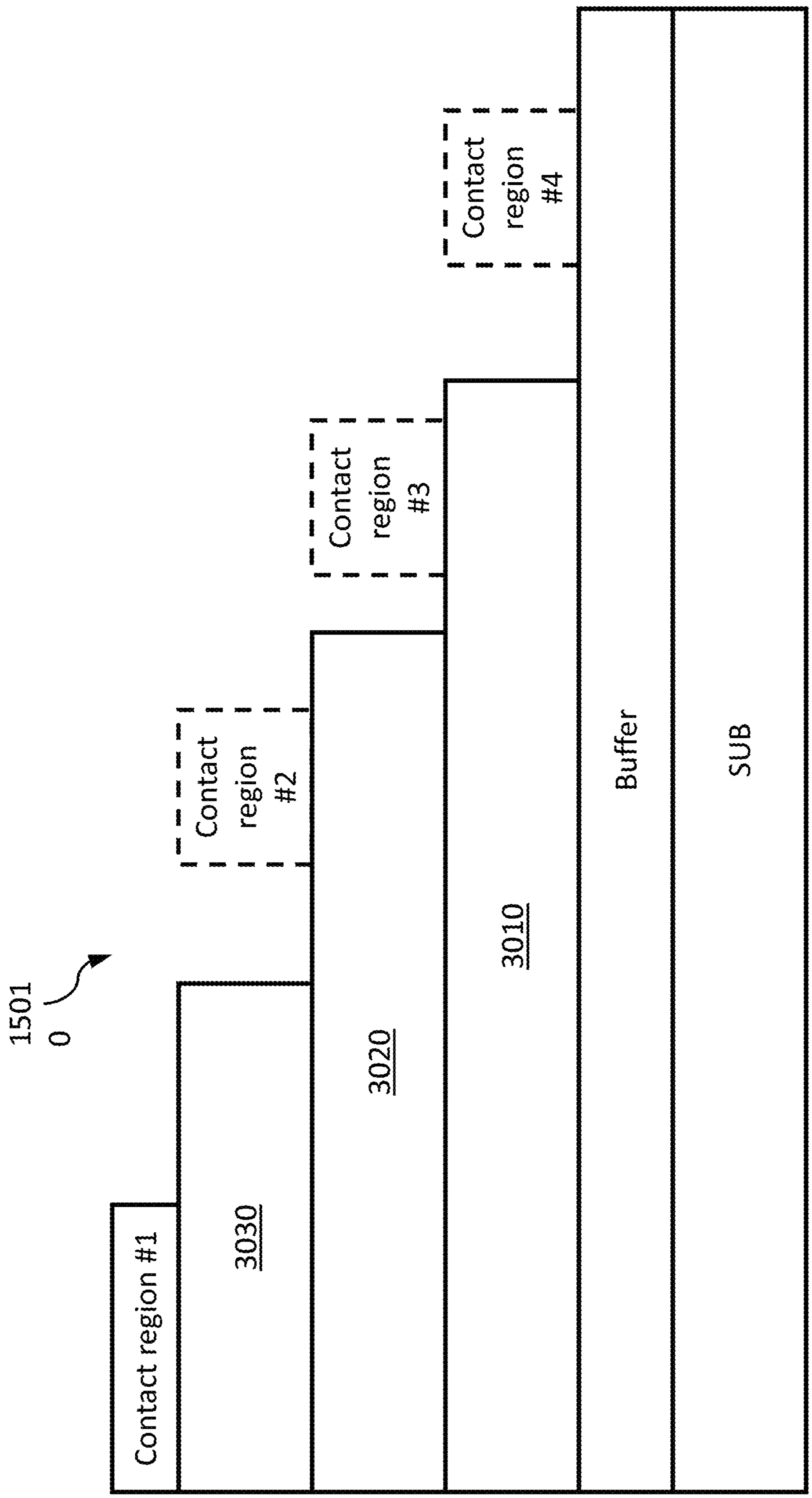

FIG. 150B shows the structure from FIG. 150A with the layers etched such that contact can be made respectively to any layer of the semiconductor structure.

Figure 150C:
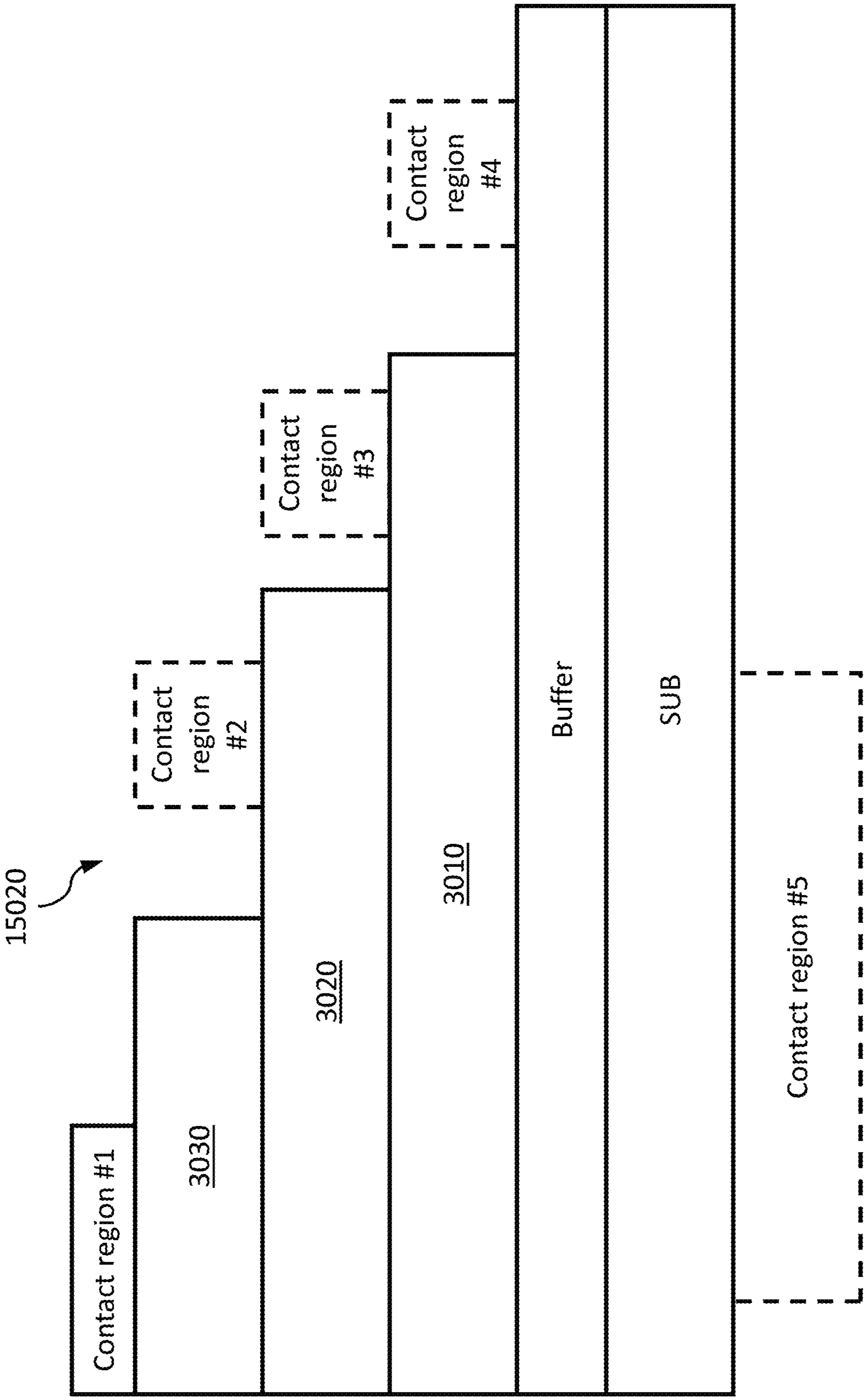

FIG. 150C shows the structure from FIG. 150B with an additional contact region which makes contact to the back side (opposite the epitaxial oxide layers) of the substrate.

Figure 151:
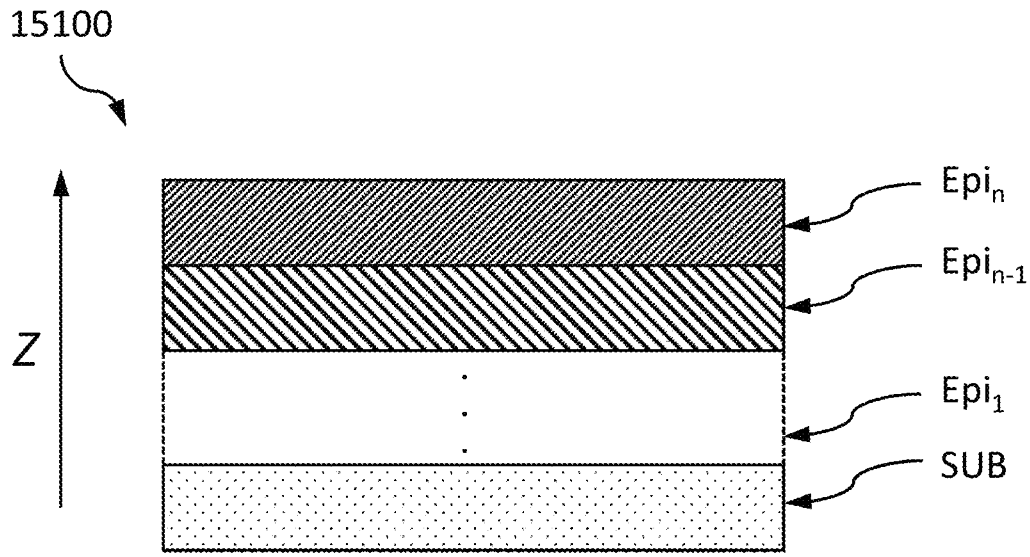

FIG. 151 shows a multilayer structure used to form an electronic device having distinct regions comprising at least one layer of $Mg_aGe_bO_c$.

Figure 152:
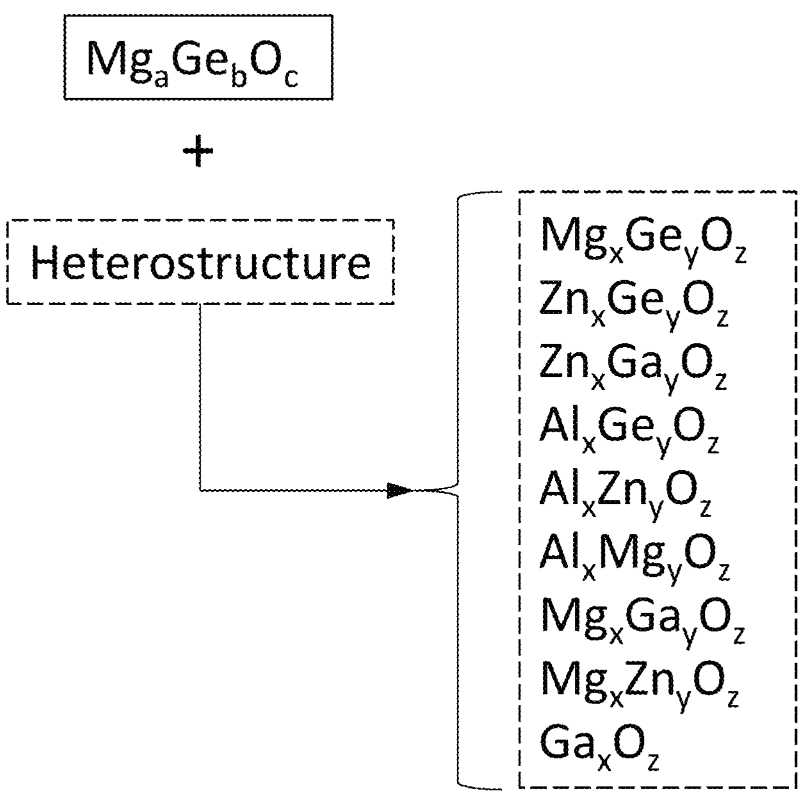

FIG. 152 is a figurative diagram showing example materials that may be combined with $Mg_aGe_bO_c$ to form a heterostructure.

Figure 153:
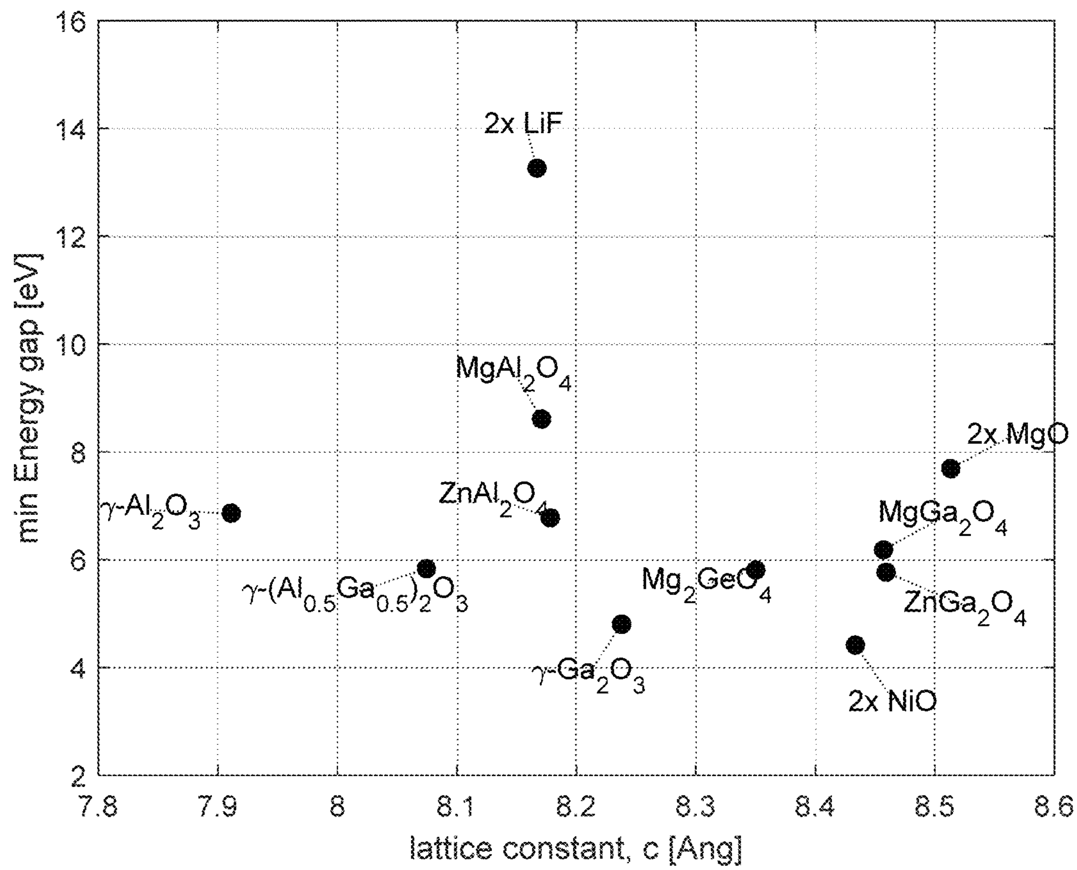

FIG. 153 is a plot of the bandgap energy as a function of lattice constant for example materials that may be used in heterostructures for semiconductor structures.

Figure 154:
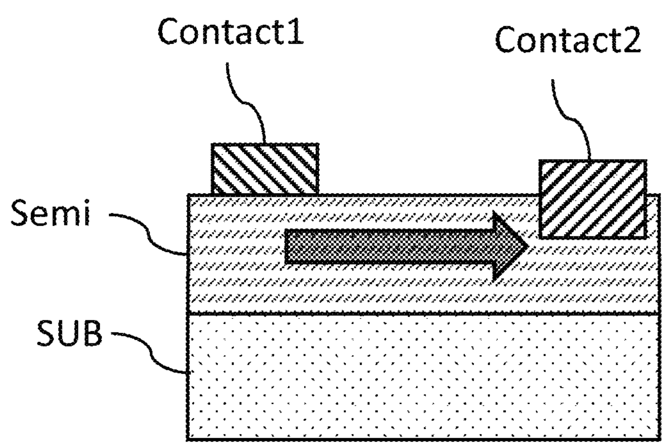

FIG. 154 is a figurative sectional view of an in-plane conduction device comprising an insulating substrate and a semiconductor layer region formed on the substrate with the electrical contacts positioned on the top semiconductor layer of the device.

Figure 155:
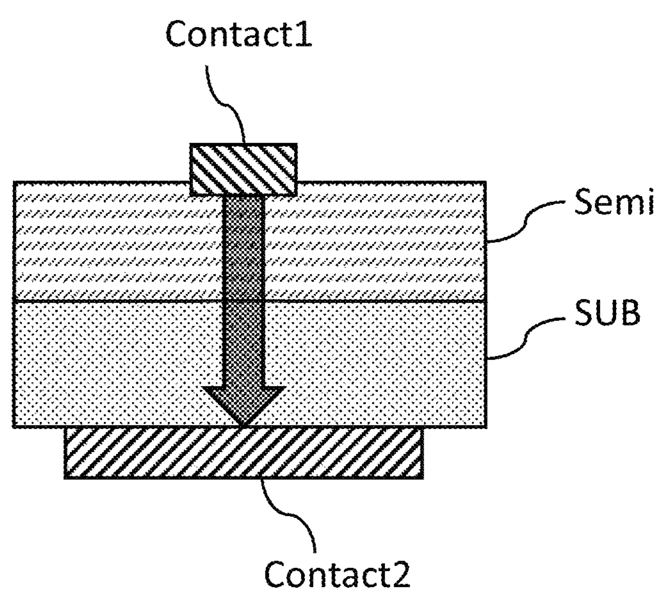

FIG. 155 is figurative sectional view of a vertical conduction device comprising a conducting substrate and a semiconductor layer region formed on the substrate with the electrical contacts positioned on the top and bottom of the device.

Figure 156A:
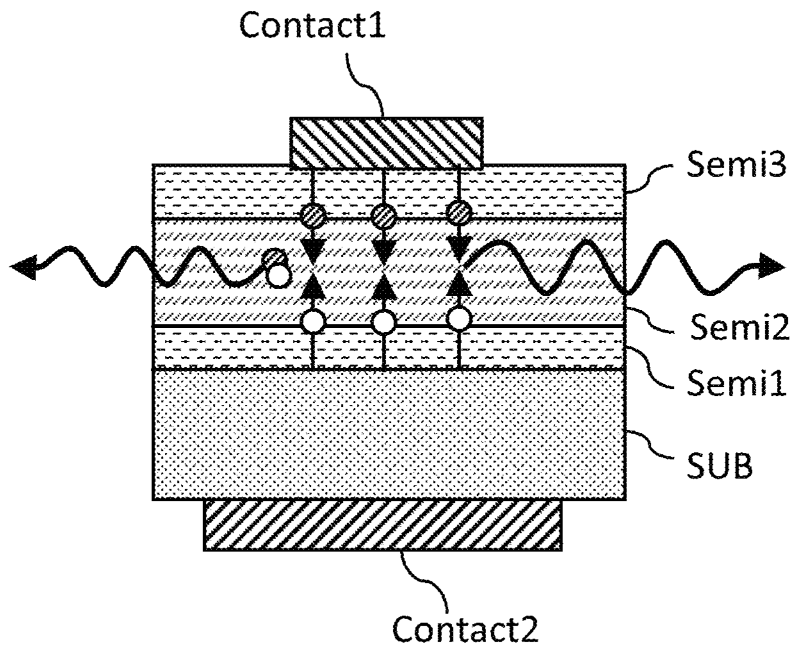

FIG. 156A is a figurative sectional view of a vertical conduction device for light emission having the electrical contact configuration illustrated in FIG. 155, configured as a plane parallel waveguide for the emitted light.

Figure 156B:
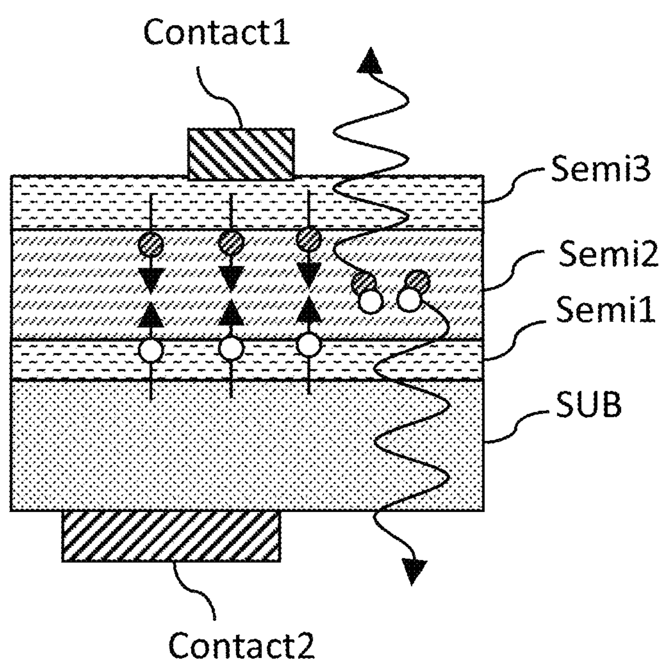

FIG. 156B is a figurative sectional view of a vertical conduction device for light emission having the electrical contact configuration illustrated in FIG. 155, configured as a vertical light emission device.

Figure 157A:
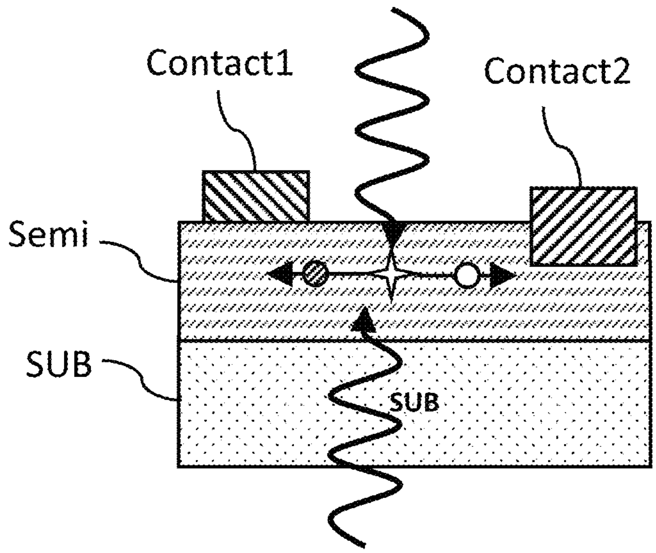

FIG. 157A is a figurative sectional view of an in-plane conduction device for photo-detection, having the electrical contact configuration illustrated in FIG. 154, and configured to receive light passing through the semiconductor layer region and/or the substrate.

Figure 157B:
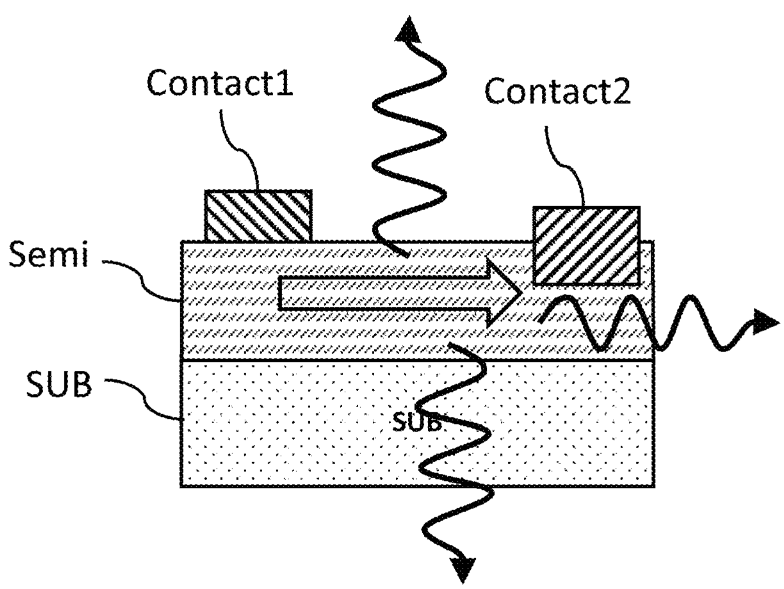

FIG. 157B is a figurative sectional view of an in-plane conduction device for light emission, having the electrical contact configuration illustrated in FIG. 154, and configured to emit light either vertically or in-plane.

Figure 158A:
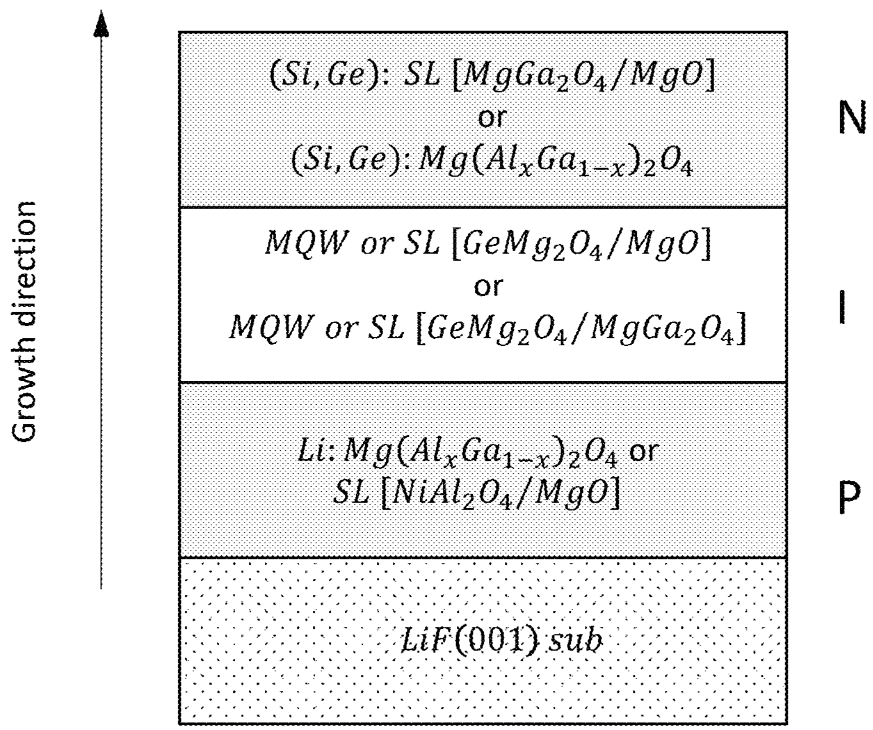

FIG. 158A is a semiconductor structure that can be used as a portion of a light emitting device.

Figure 158B:
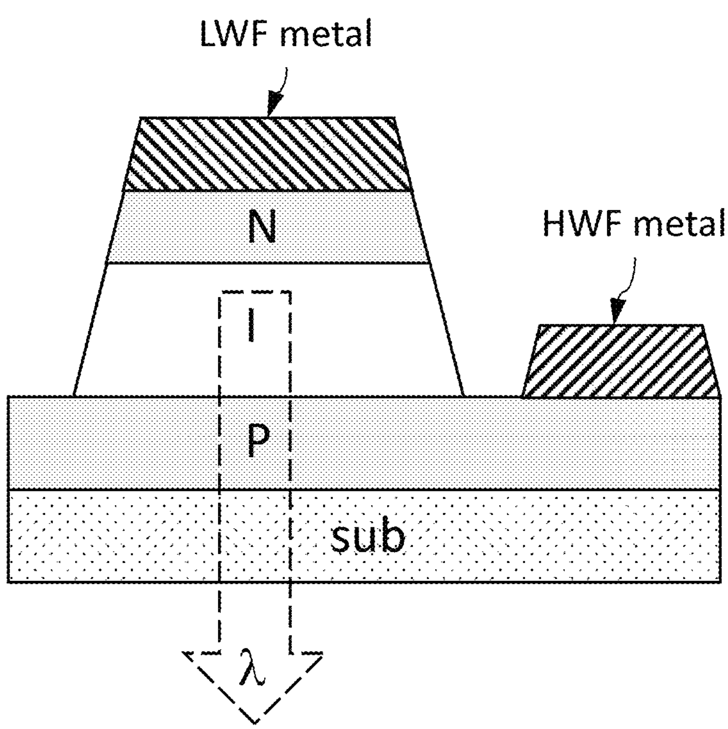

FIG. 158B is a figurative sectional view of a light emitting device that can be formed using the semiconductor structure of FIG. 158A.

Figure 159A:
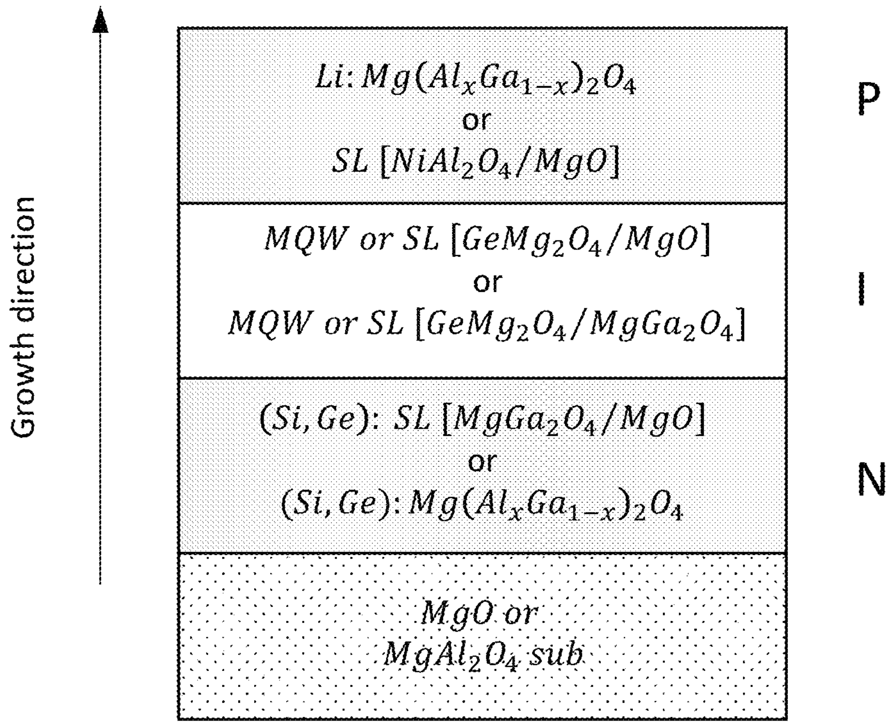

FIG. 159A is a semiconductor structure that can be used as a portion of a light emitting device.

Figure 159B:
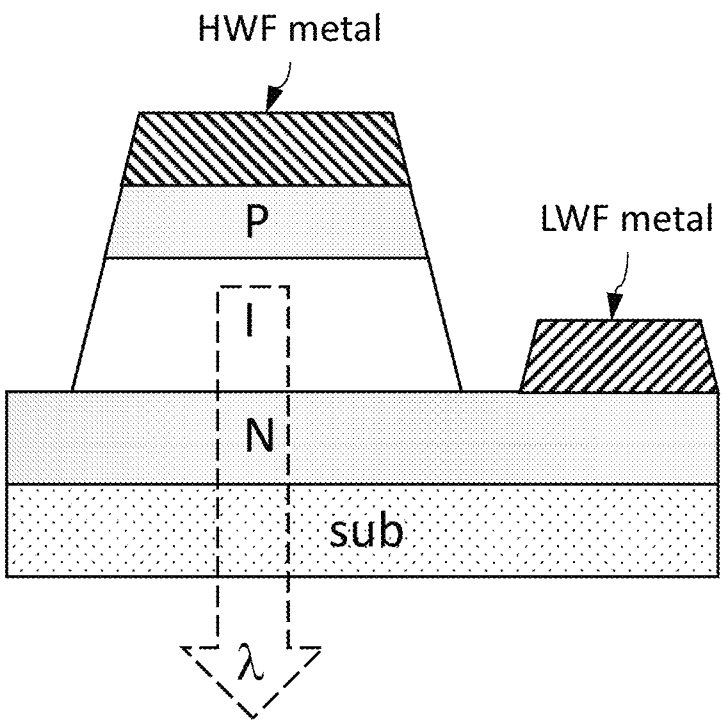

FIG. 159B is a figurative sectional view of a light emitting device that can be formed using the semiconductor structure of FIG. 159A.

Figure 160:
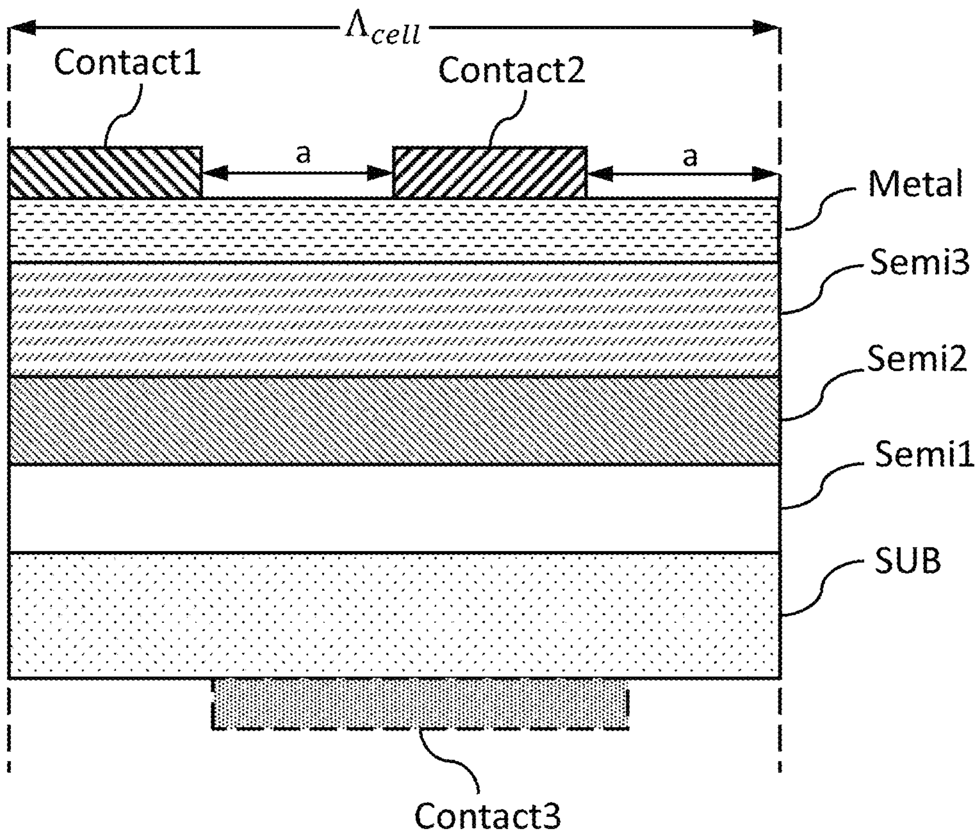

FIG. 160 is a figurative sectional view of an in-plane surface metal-semi-conductor-metal (MSM) conduction device comprising a substrate and a semiconductor layer region comprising multiple semiconductor layers, with a top layer comprising a pair of planar interdigitated electrical contacts.

Figure 161A:
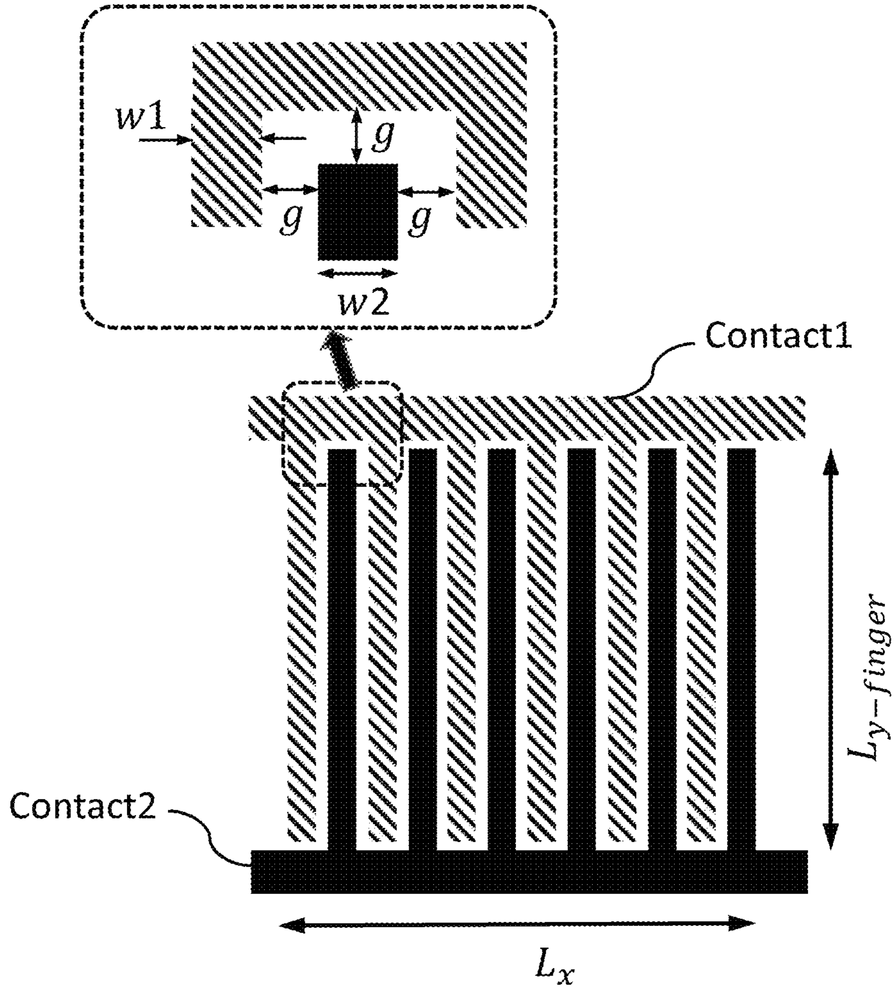

FIG. 161A is a top view of an in-plane dual metal MSM conduction device comprising a first electrical contact formed of a first metallic substance interdigitated with a second electrical contact formed of a second metallic substance.

Figure 64B:
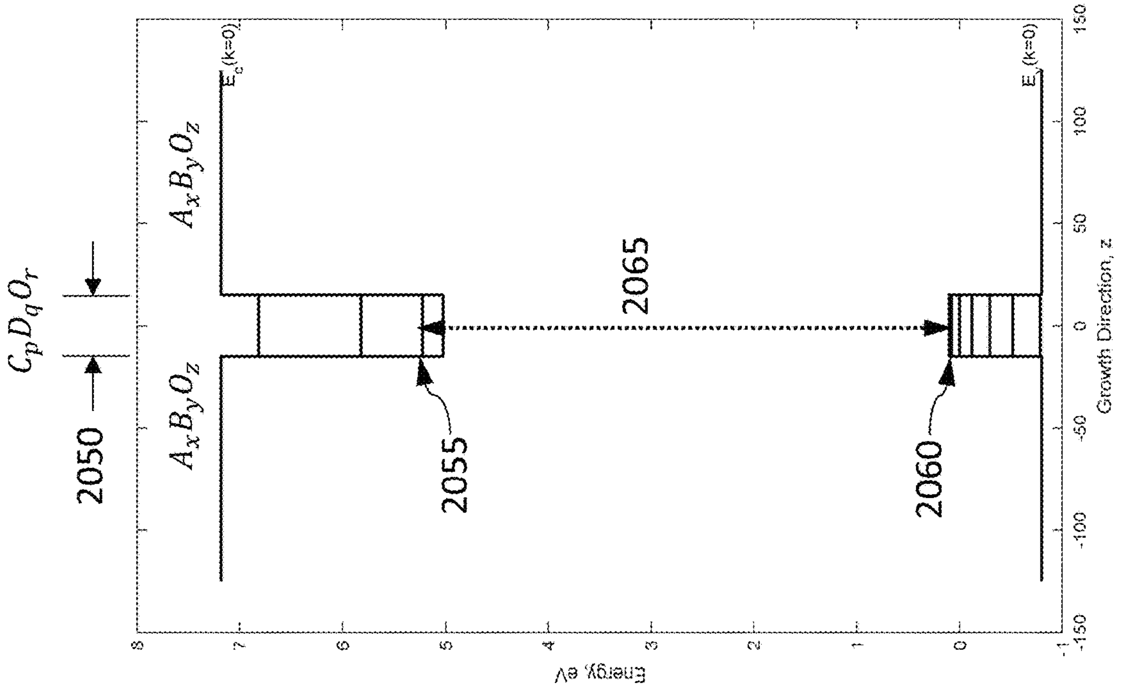
FIGS. 64A and 64B show single quantum well structures comprising metal-oxide ternary materials with quantized electron and holes states in accordance with an illustrative embodiment of the present disclosure depicting two different quantum well thicknesses.
Figure 64A:
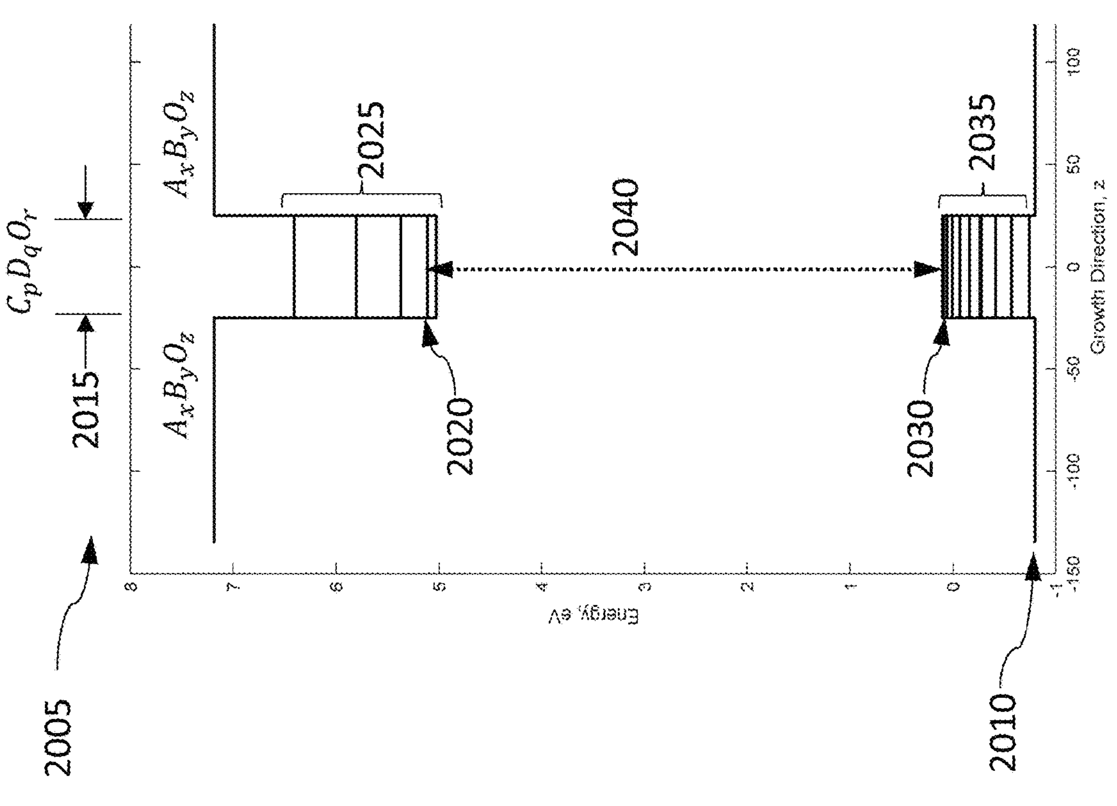
Figure 161B:
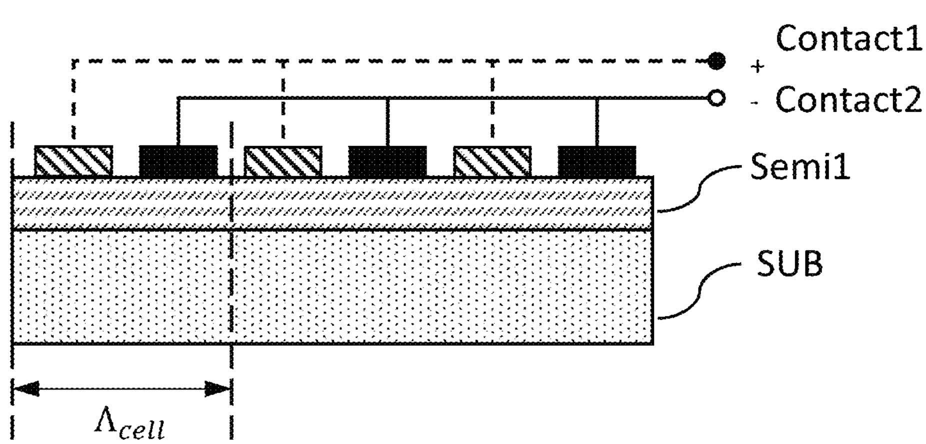

FIG. 161B is a figurative sectional view of the in-plane dual metal MSM conduction device illustrated FIG. 64A formed of a substrate and a semiconductor layer region showing the unit cell arrangement.

Figure 162:
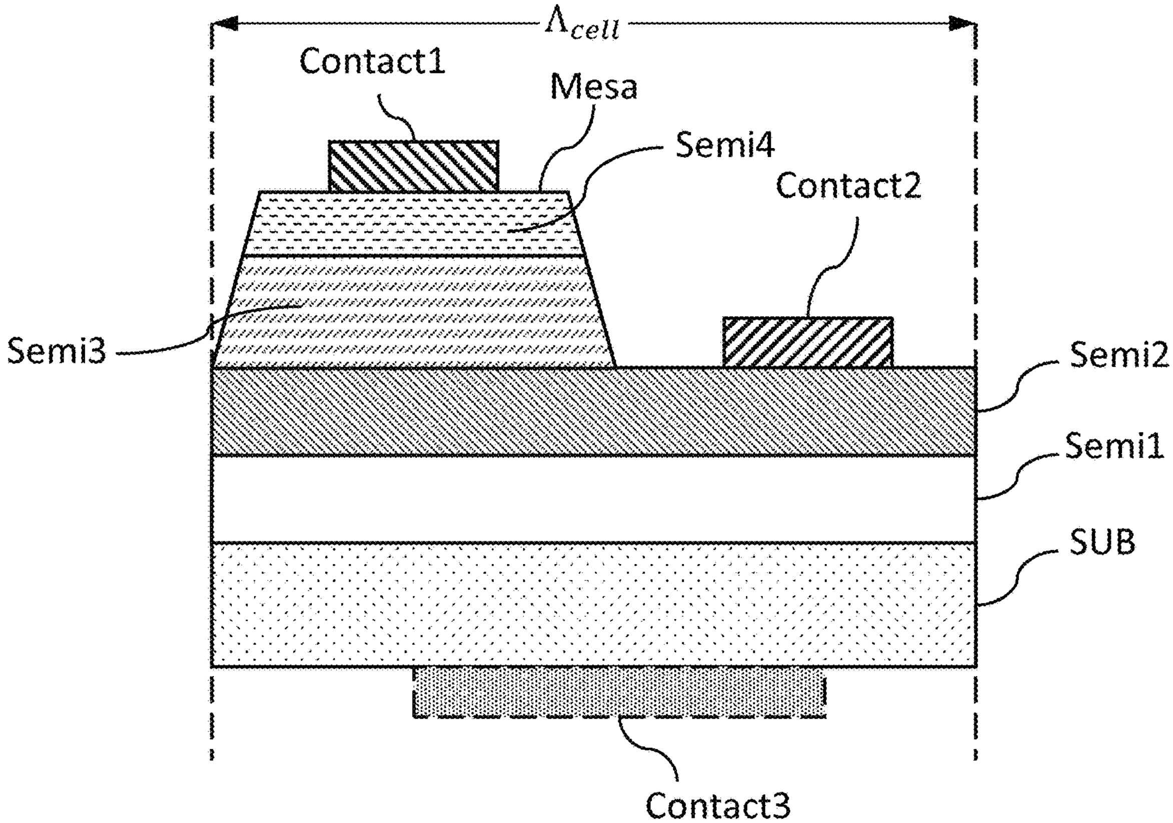

FIG. 162 is a figurative sectional view of a multilayered semiconductor device having a first electrical contact formed on a mesa surface and a second electrical contact spaced both horizontally and vertically from the first electrical contact.

Figure 163:
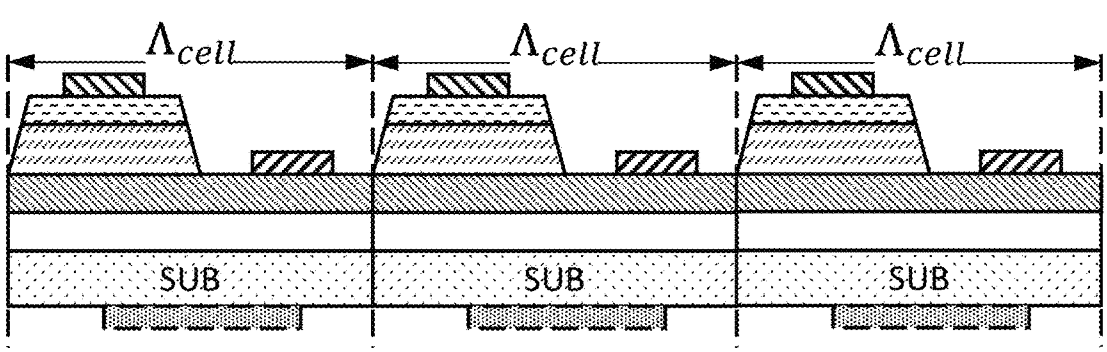

FIG. 163 is figurative sectional view of an in-plane MSM conduction device comprising multiple unit cells of the mesa structure illustrated in FIG. 162 disposed laterally to form the device.

Figure 164:
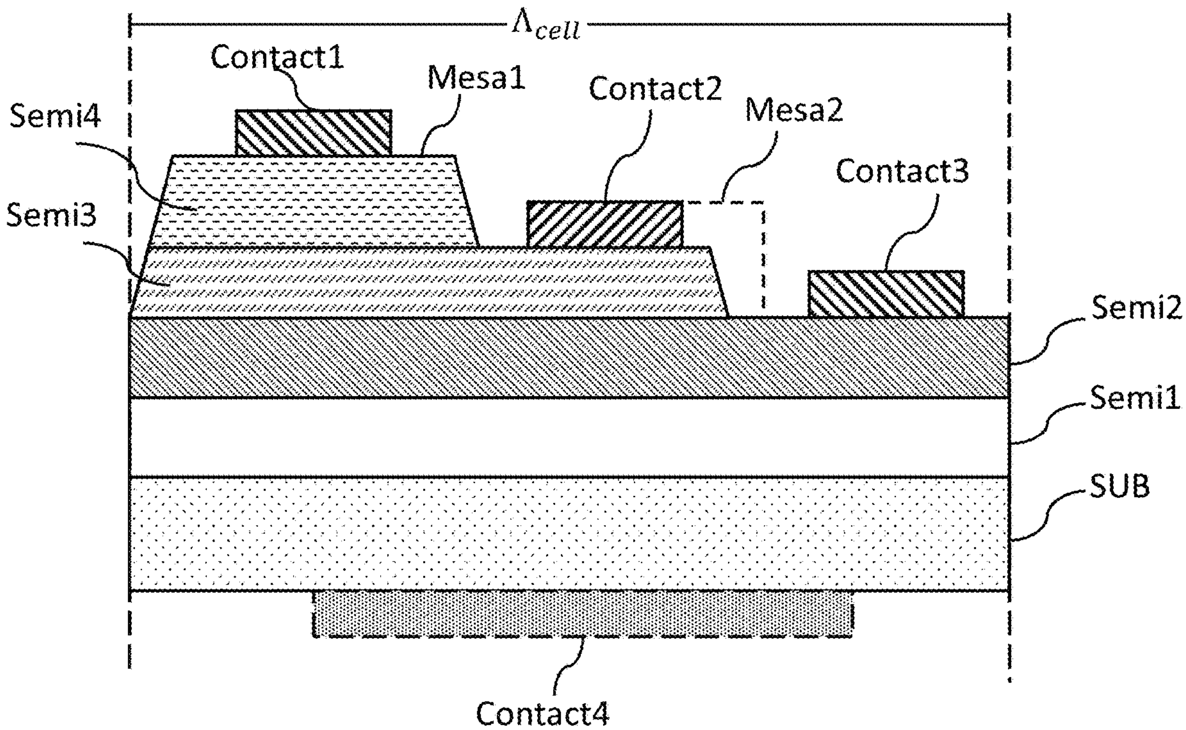

FIG. 164 is a figurative sectional view of a multi-electrical terminal device having multiple mesa structures.

Figure 165A:
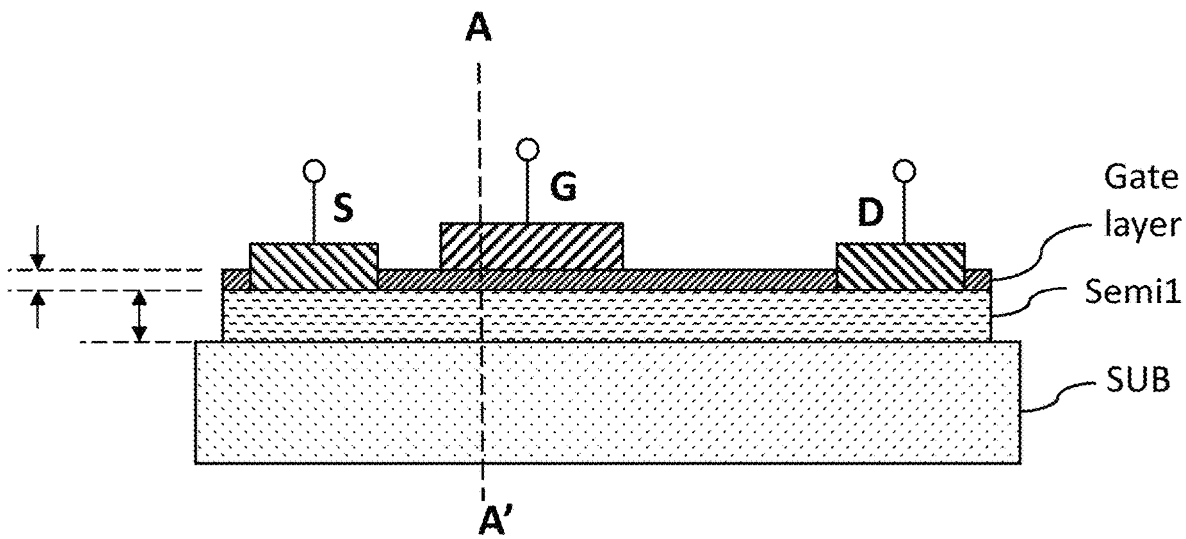

FIG. 165A is a figurative sectional view of a planar field effect transistor (FET) comprising source, gate and drain electrical contacts where the source and drain electrical contacts are formed on a semiconductor layer region that is formed on an insulating substrate, and the gate electrical contact is formed on a gate layer formed on the semiconductor layer region.

Figure 165B:
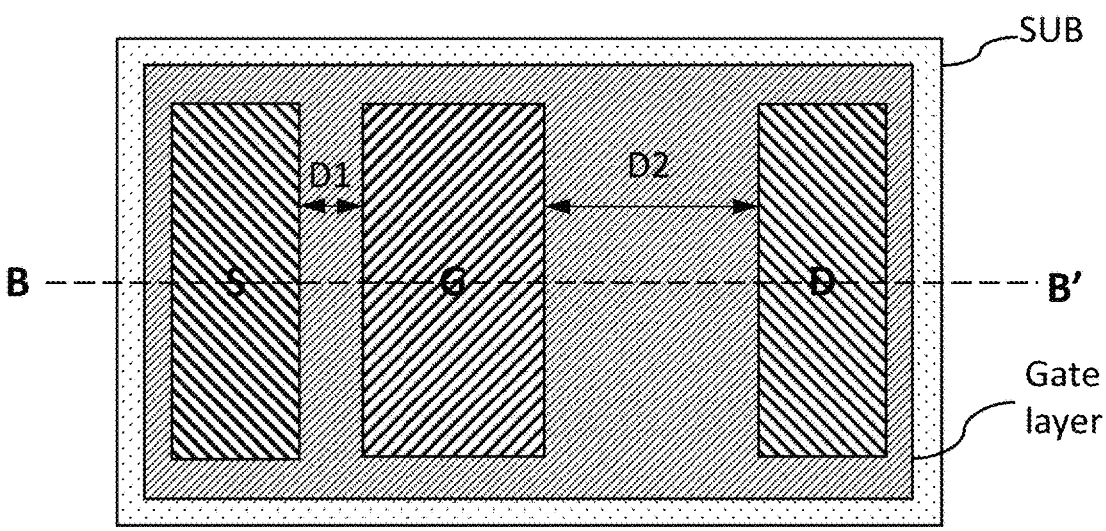

FIG. 165B is a top view of the planar FET illustrated FIG. 165A showing distances between the source to gate and drain to gate electrical contacts.

Figure 166A:
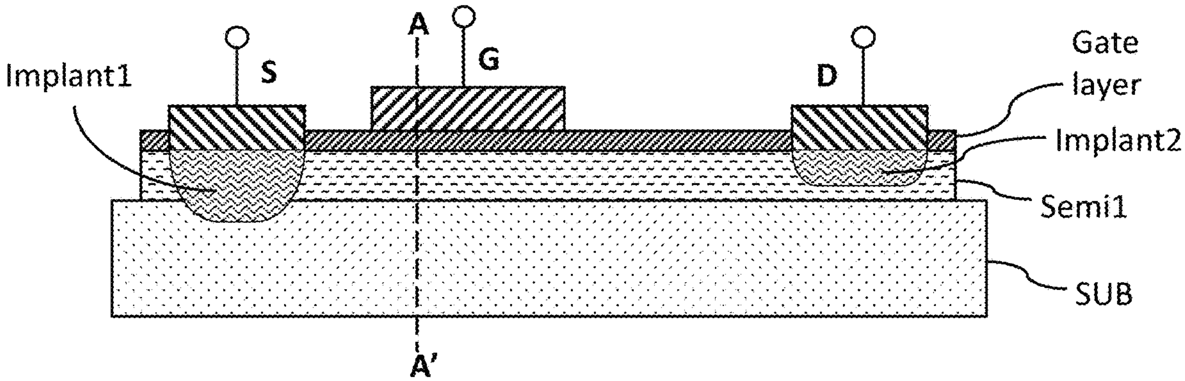

FIG. 166A is a figurative sectional view of a planar field effect transistor (FET) of a similar configuration to that illustrated in FIGS. 165A and 165B except that the source electrical contact is implanted through the semiconductor layer region into the substrate, and the drain electrical contact is implanted into the semiconductor layer region only, in accordance with some embodiments.

Figure 166B:
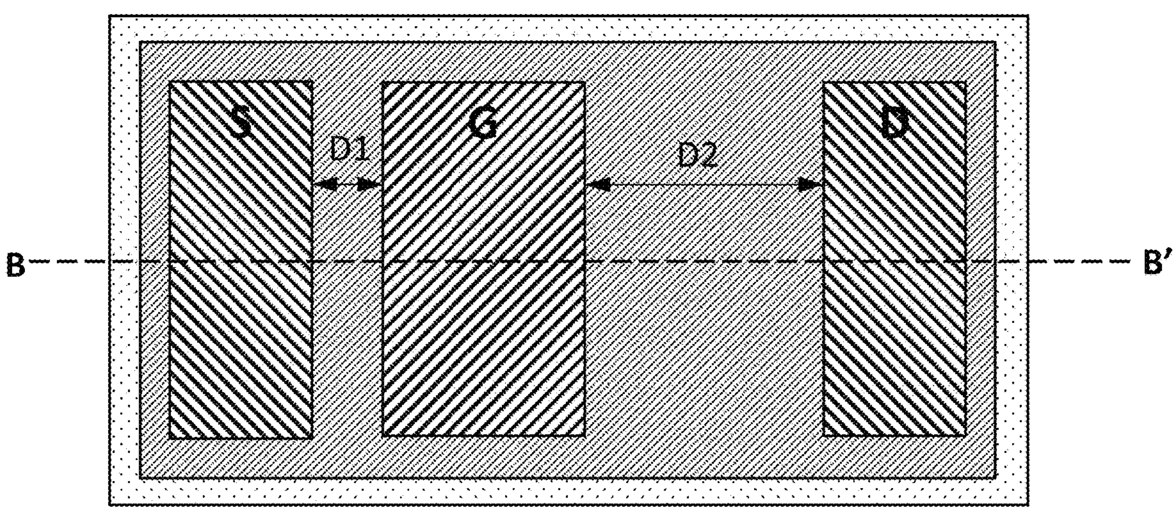

FIG. 166B is a top view of the planar FET illustrated in FIG. 166A.

Figure 167:
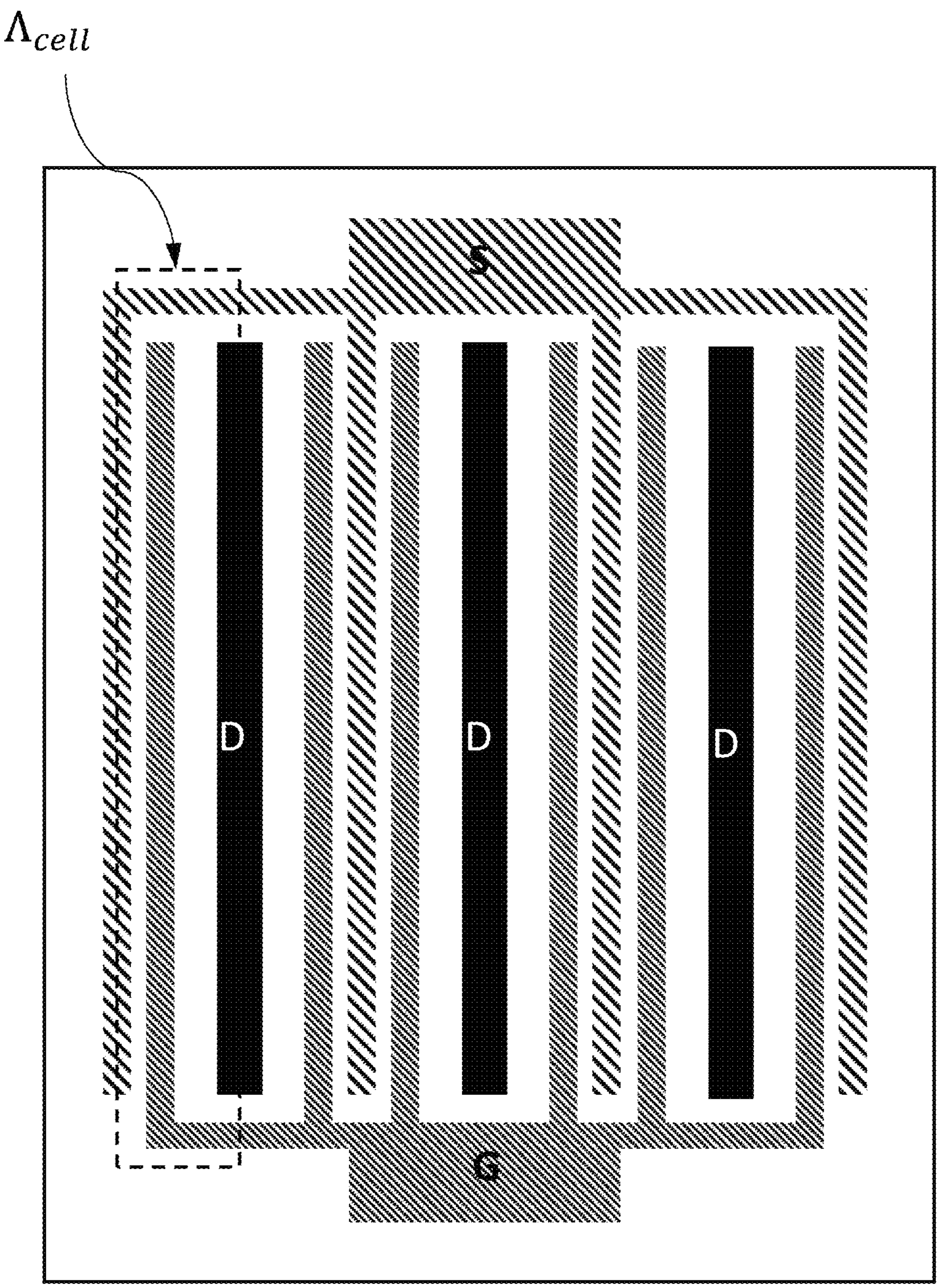

FIG. 167 is a top view of a planar FET comprising multiple interconnected unit cells of the planar FET illustrated in FIGS. 165A or 166A.

Figure 168:
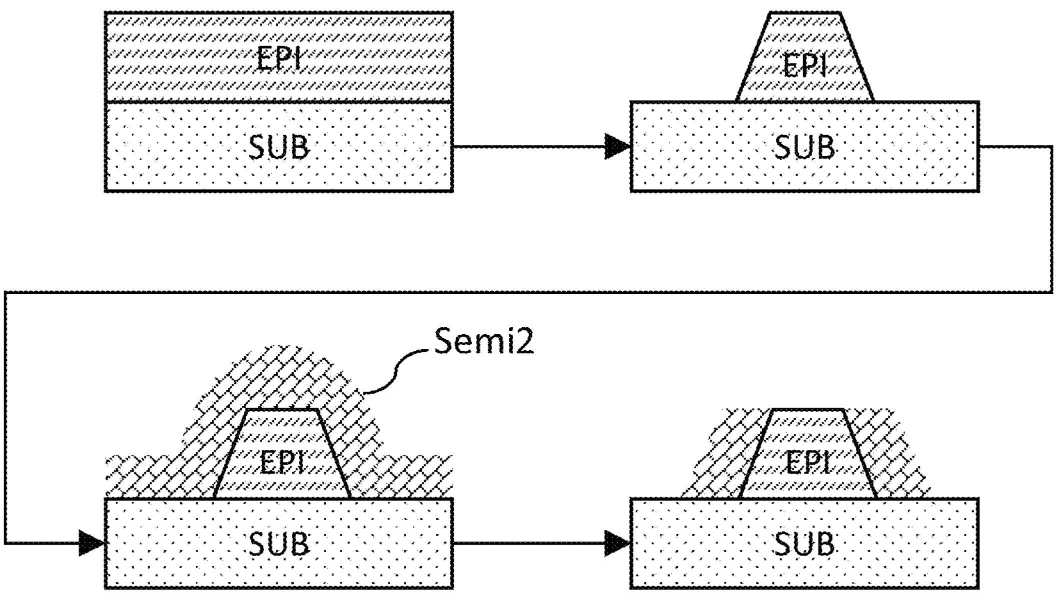

FIG. 168 is a process flow diagram for forming a conduction device comprising a regrown conformal semiconductor layer region on an exposed etched mesa sidewall.

Figure 169A:
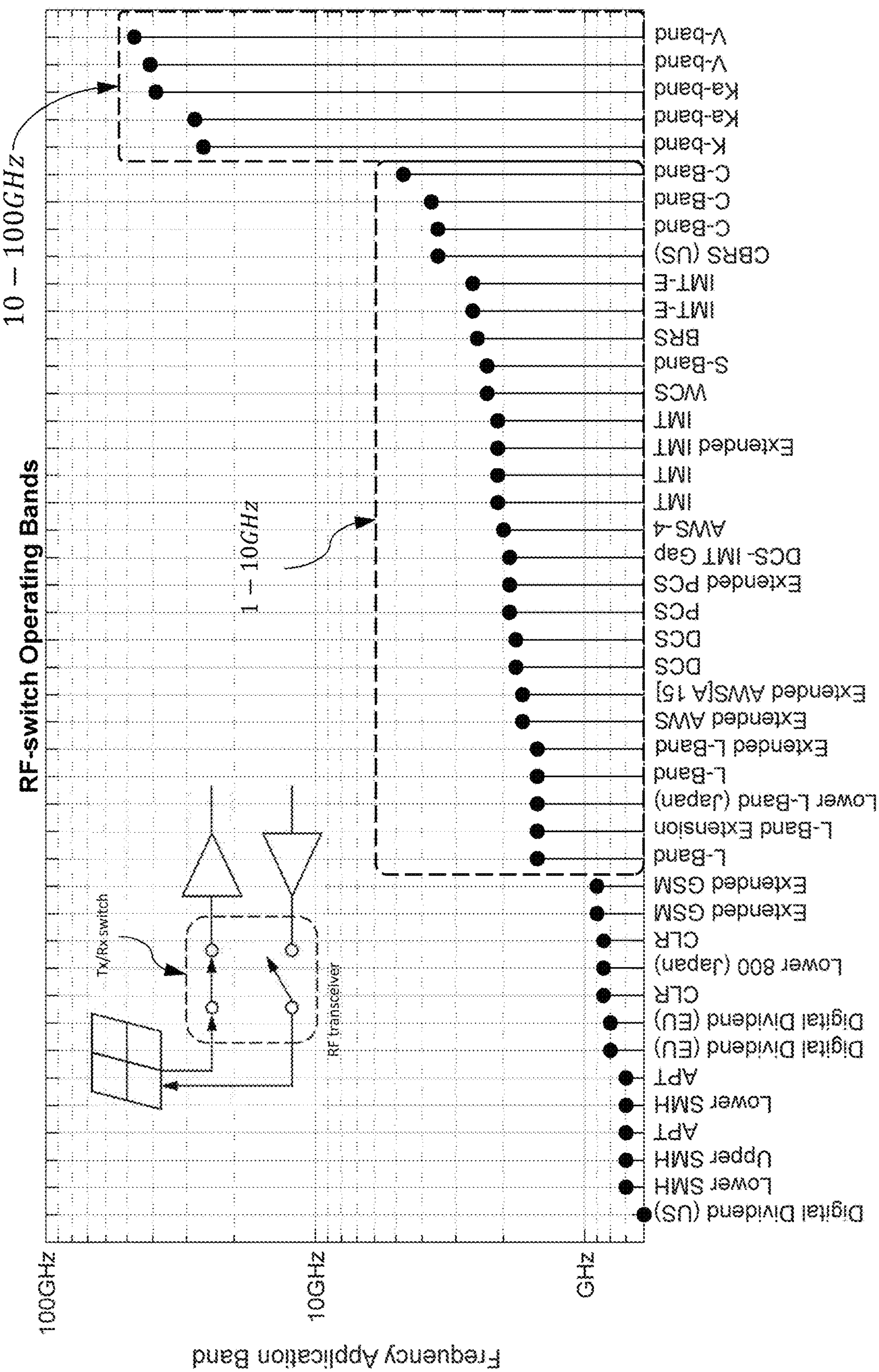

FIG. 169A is a chart showing center frequencies of RF operating bands that may be used in different applications.

Figure 169B:
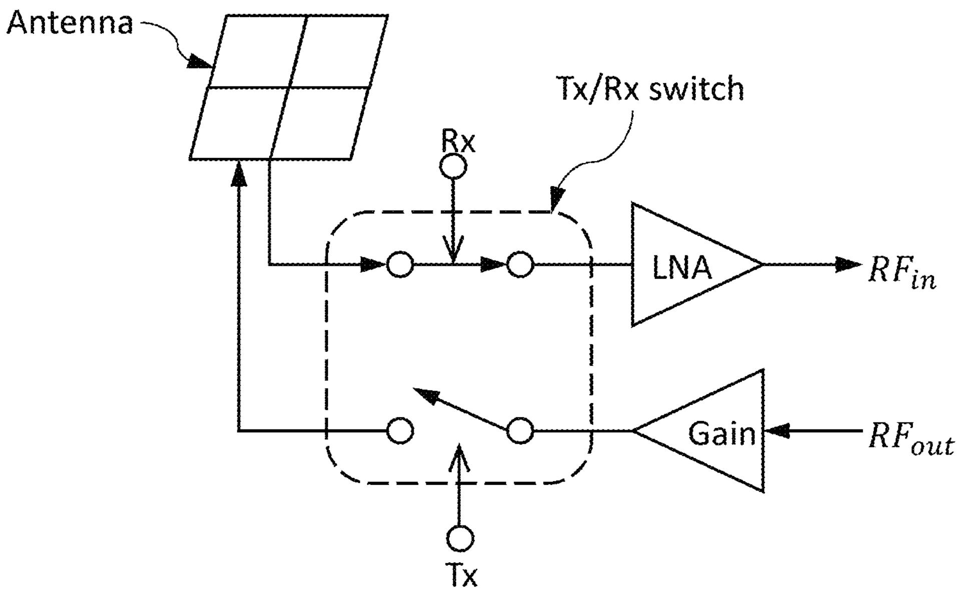

FIG. 169B shows a schematic of a general RF-switch.

Figure 170A:
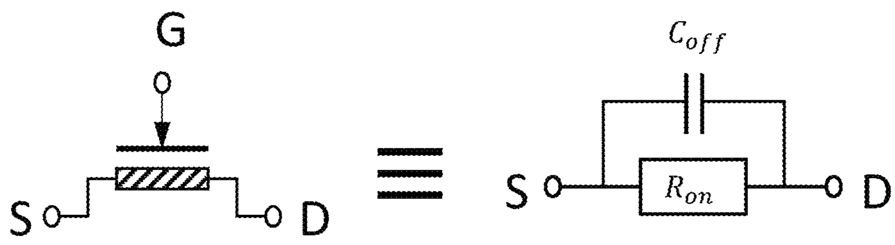

FIG. 170A shows a schematic and an equivalent circuit diagram of a FET, with source ("S"), drain ("D"), and gate ("G") terminals.

Figure 170B:
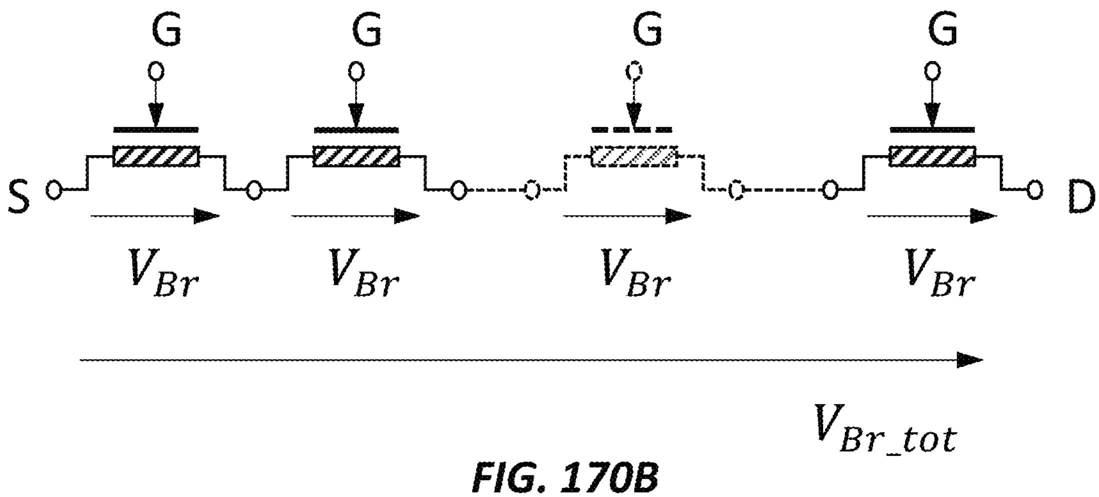
Figure 170C:
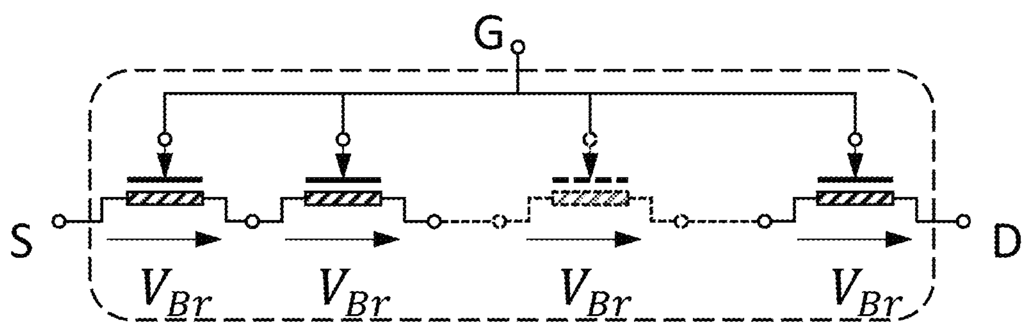
Figure 170D:
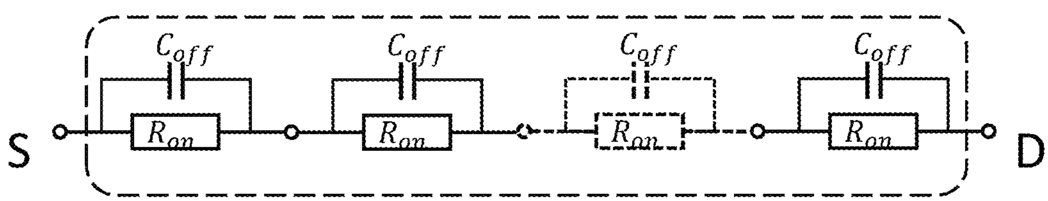

FIGS. 170B-170D show schematics and an equivalent circuit diagram of an RF switch employing multiple FETs in series to achieve high breakdown voltage.

Figure 171:
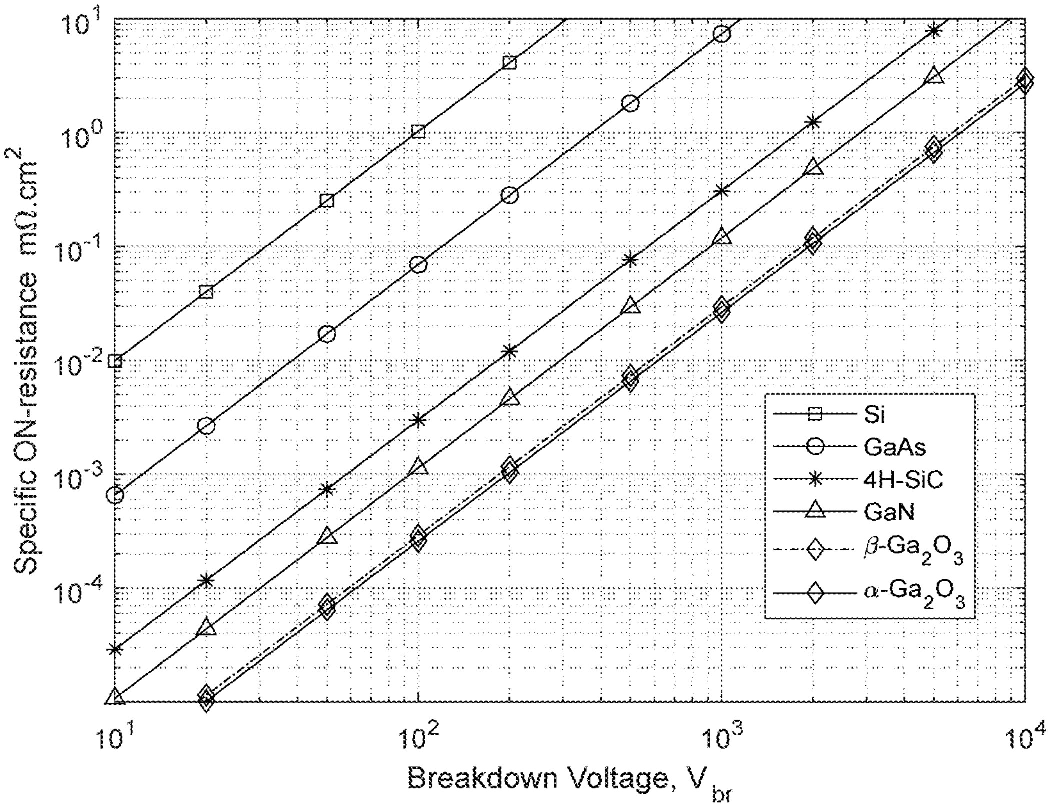

FIG. 171 shows a chart of calculated specific ON resistances of an RF switch and the calculated breakdown voltage associated with different semiconductors comprising the RF switch.

Figure 172A:
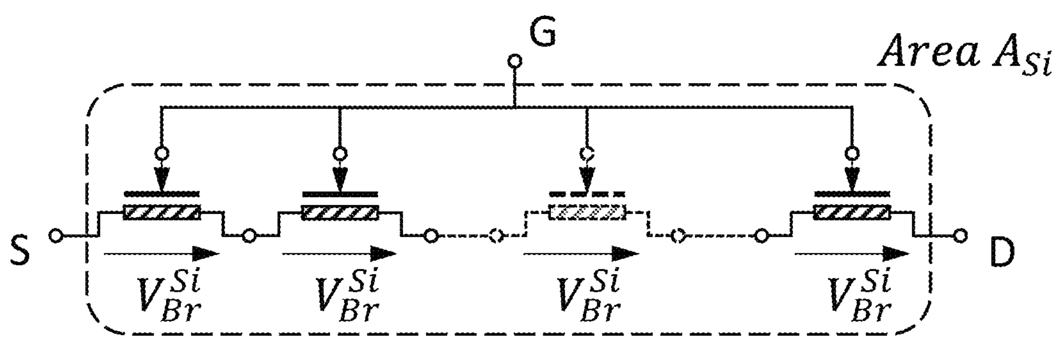

FIG. 172A shows a schematic of multiple Si-based FETs connected in series to achieve a high breakdown voltage.

Figure 172B:
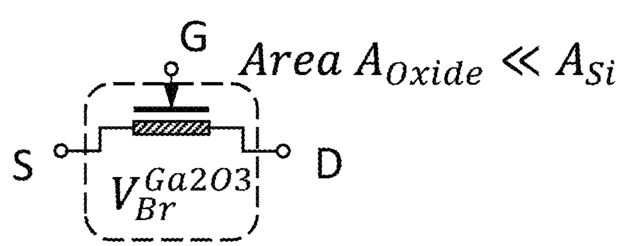

FIG. 172B shows a schematic of a single $Ga_2O_3$-based FET that can achieve a high breakdown voltage equivalent to that of the series Si-based FET shown in FIG. 172A.

Figure 173:
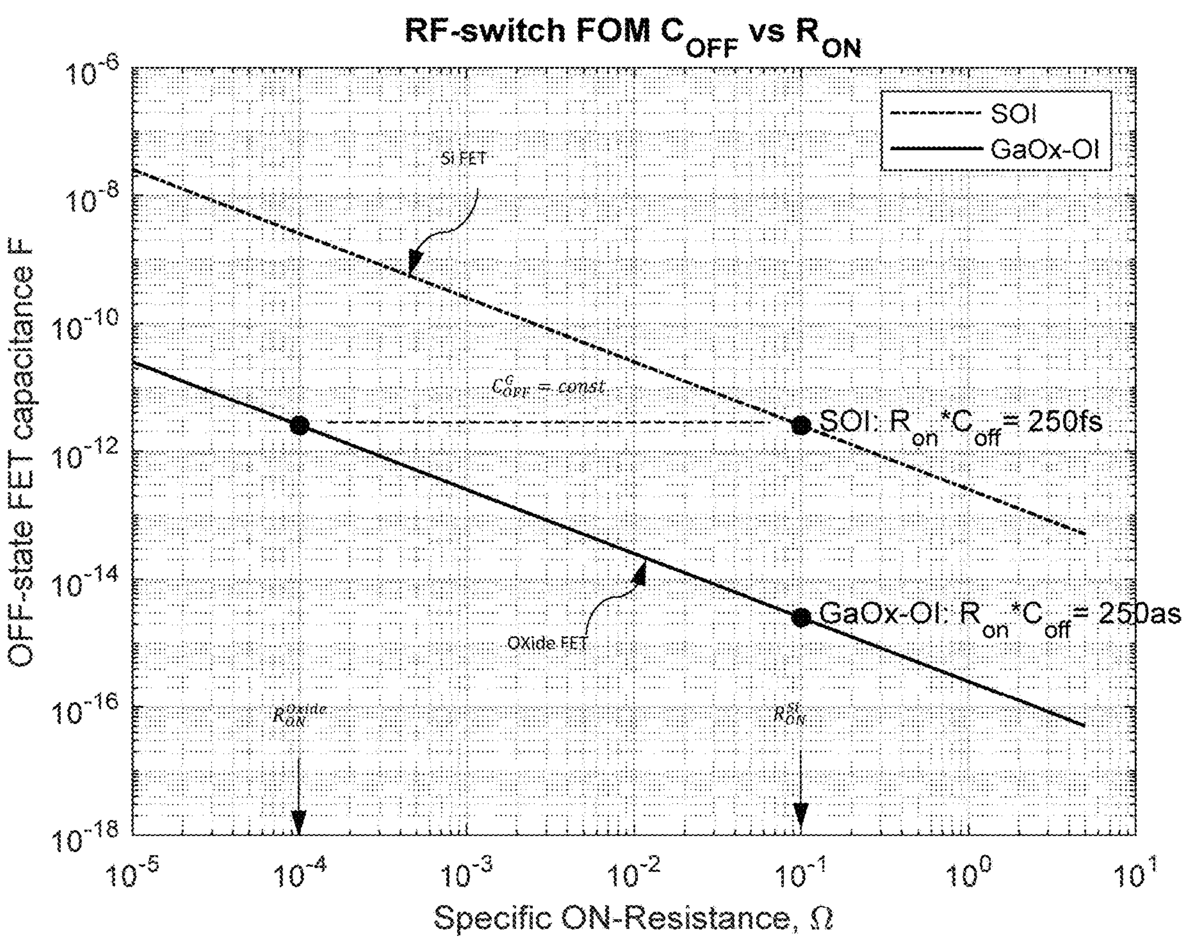

FIG. 173 shows a chart of calculated OFF-state FET capacitance (in F) versus calculated specific ON resistance ($R_{ON}$) for Si (a low bandgap material) and an epitaxial oxide material with a high bandgap.

Figure 174:
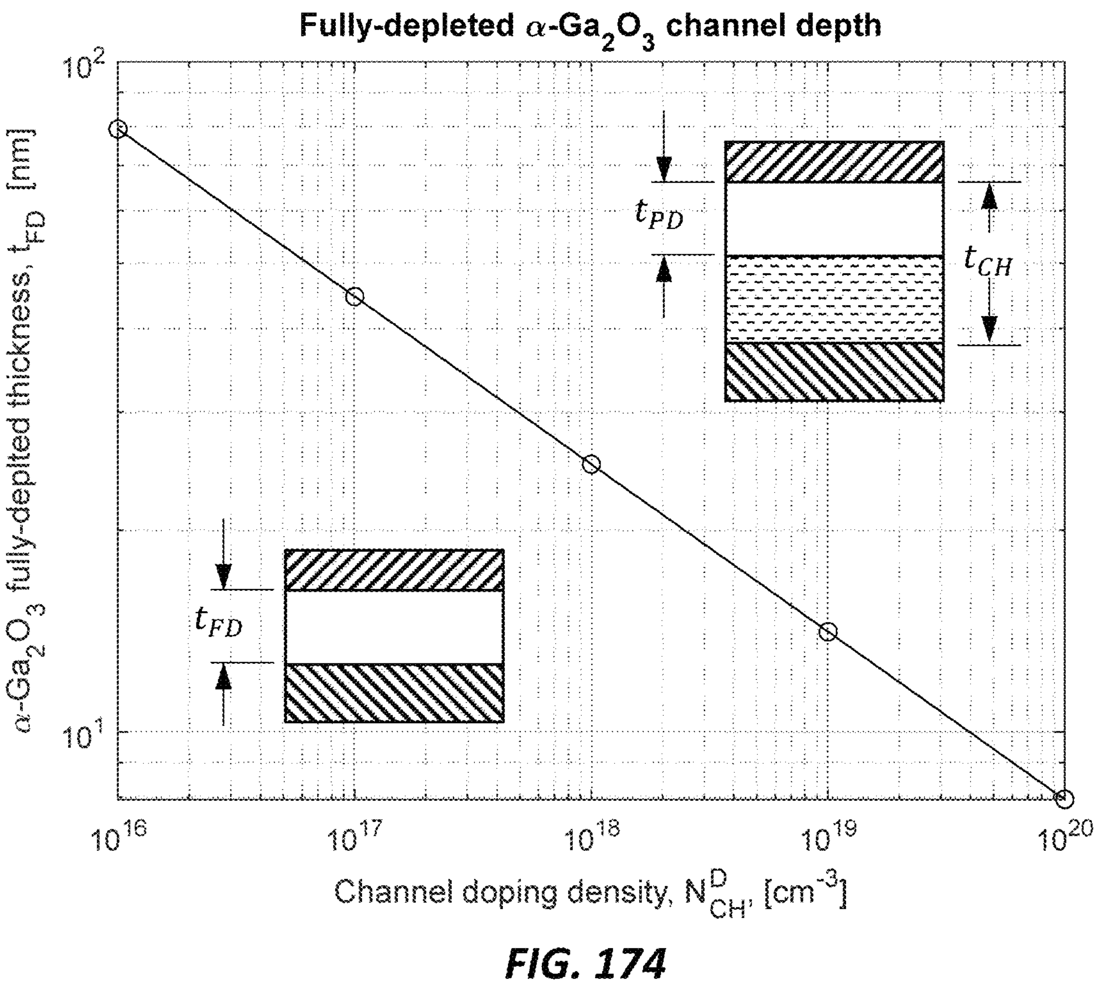

FIG. 174 shows a chart of fully depleted thickness ($t_{FD}$) of a channel in an FET comprising $\alpha$-$Ga_2O_3$ versus the doping density ($N^D_{CH}$) of the $\alpha$-$Ga_2O_3$ in the channel.

Figure 175:
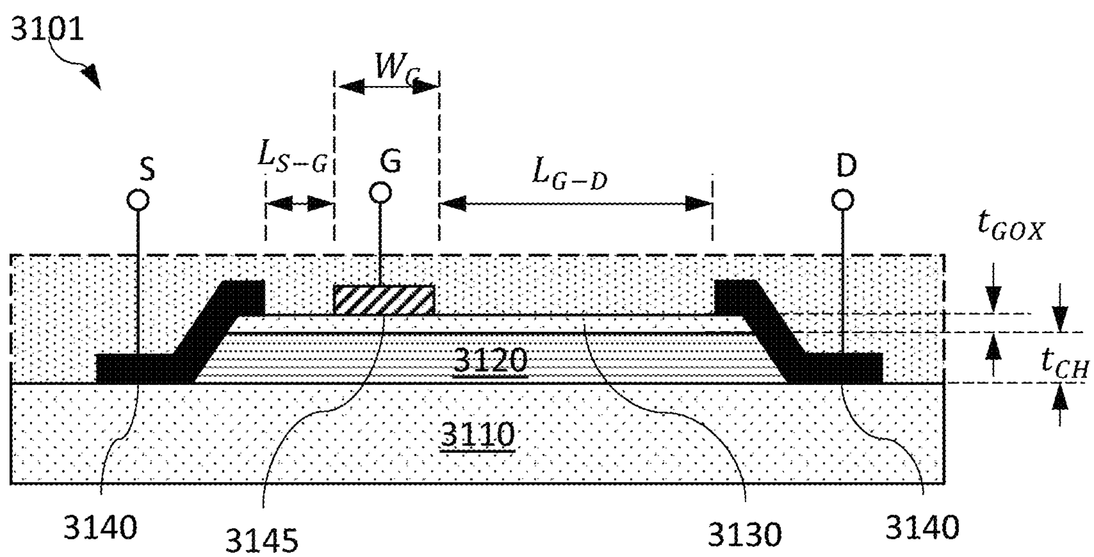

FIG. 175 shows a schematic of an example of a FET comprising epitaxial oxide materials.

Figure 176A:
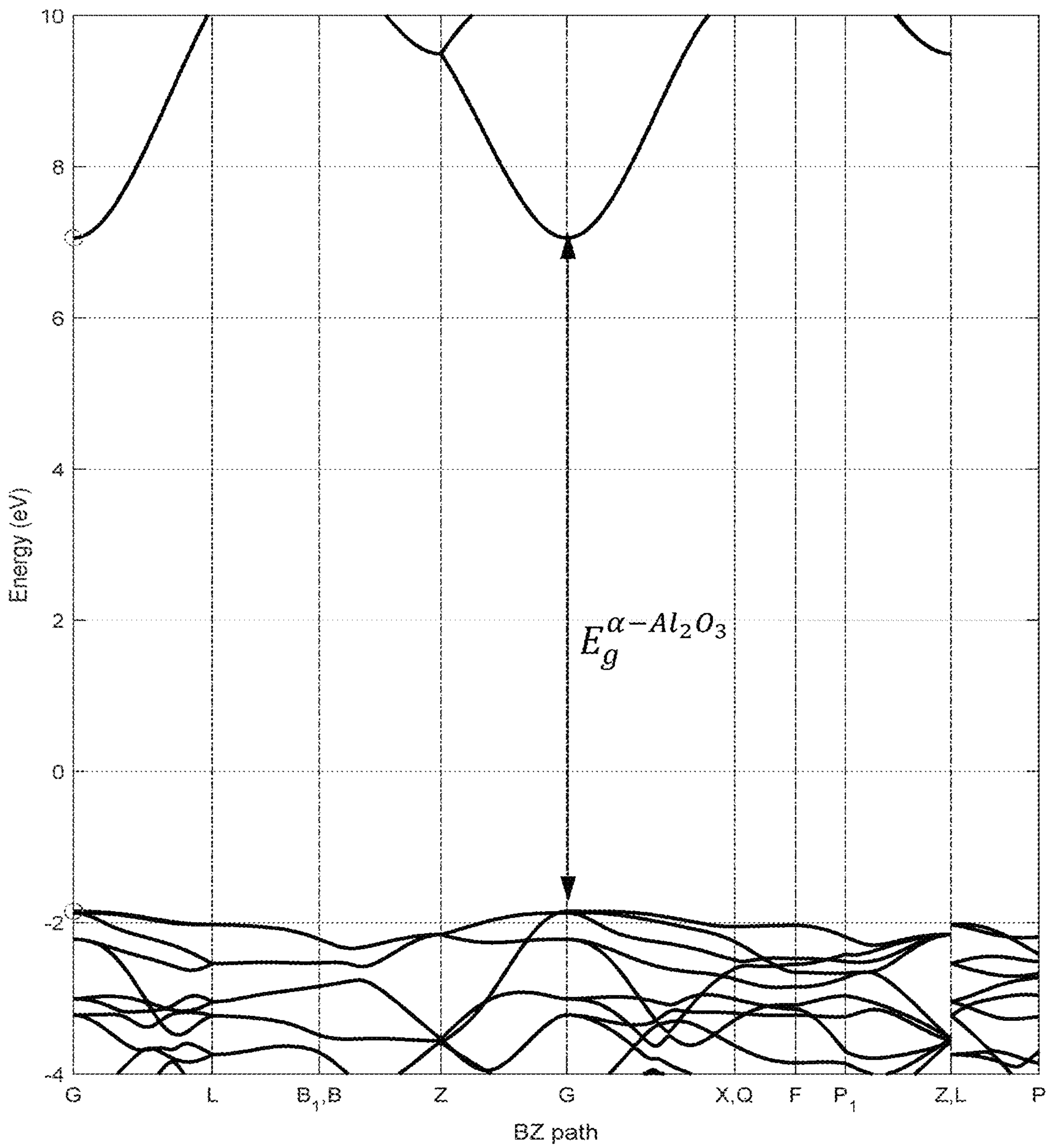

FIG. 176A is an E-k diagram showing a calculated band structure for an epitaxial oxide material that can be used in the FETs and RF switches of the present disclosure showing in this example that $\alpha$-$Al_2O_3$ can be used as the gate layer or the additional oxide encapsulation.

Figure 176B:
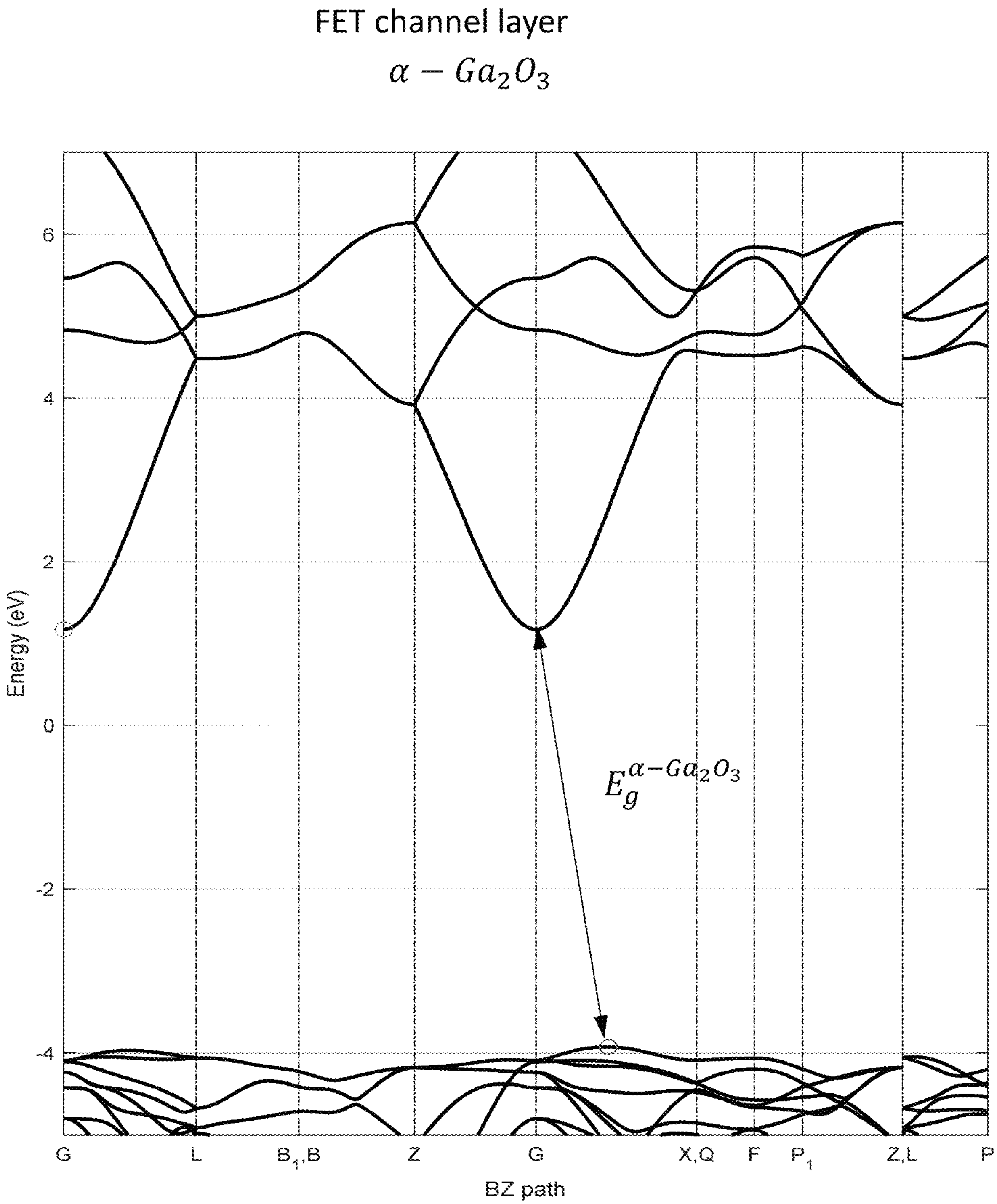

FIG. 176B is an E-k diagram showing a calculated band structure for an epitaxial oxide material that can be used in the FETs and RF switches of the present disclosure showing in this example that $\alpha$-$Ga_2O_3$ can be used as the channel layer.

Figure 177:
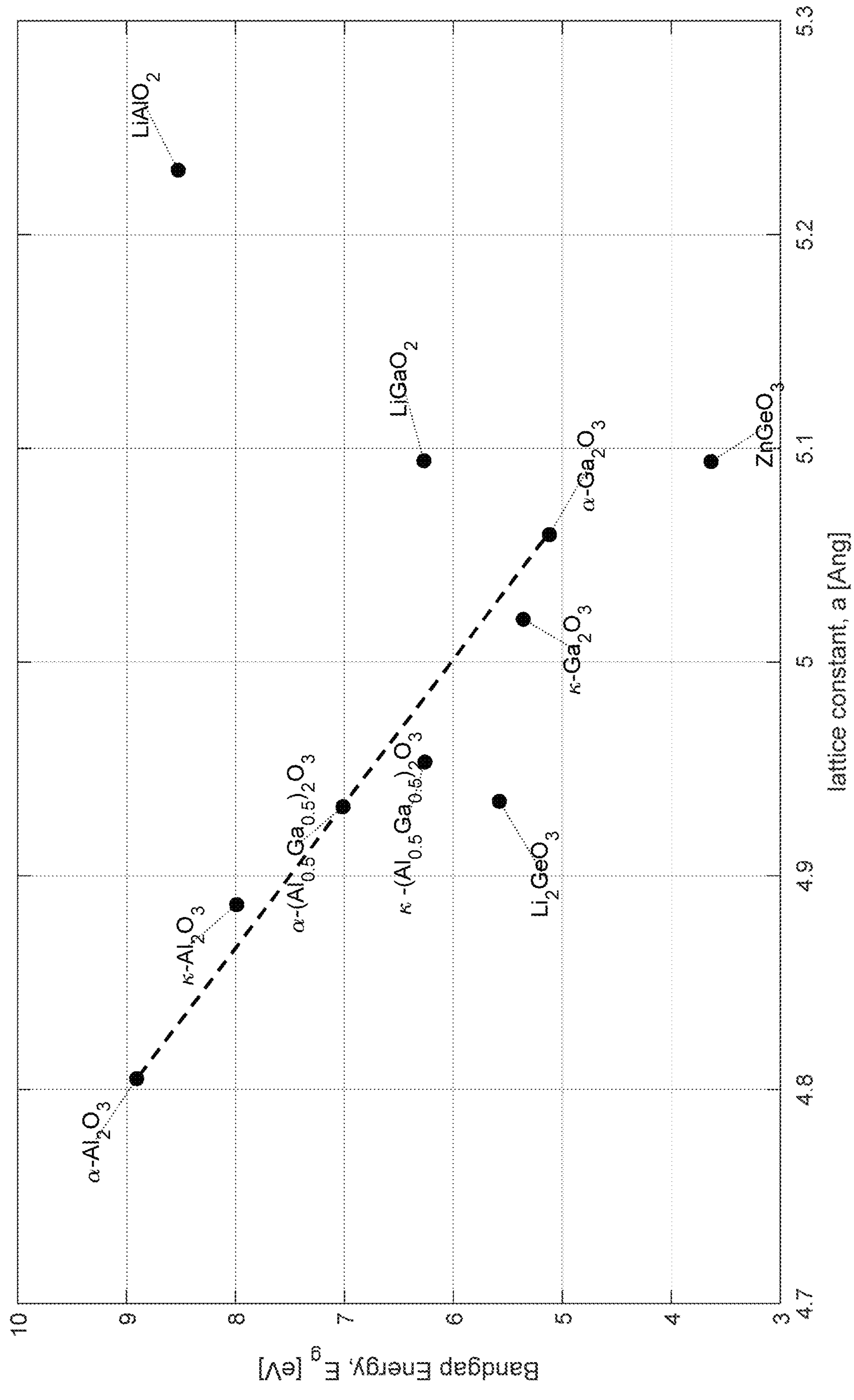

FIG. 177 shows a chart of calculated minimum bandgap energy (in eV) versus lattice constant (in Angstroms) for $\alpha$- and $\kappa$-$(Al_xGa_{1-x})_2O_3$ materials that are compatible with sapphire ($\alpha$-$Al_2O_3$) substrates.

Figure 178:
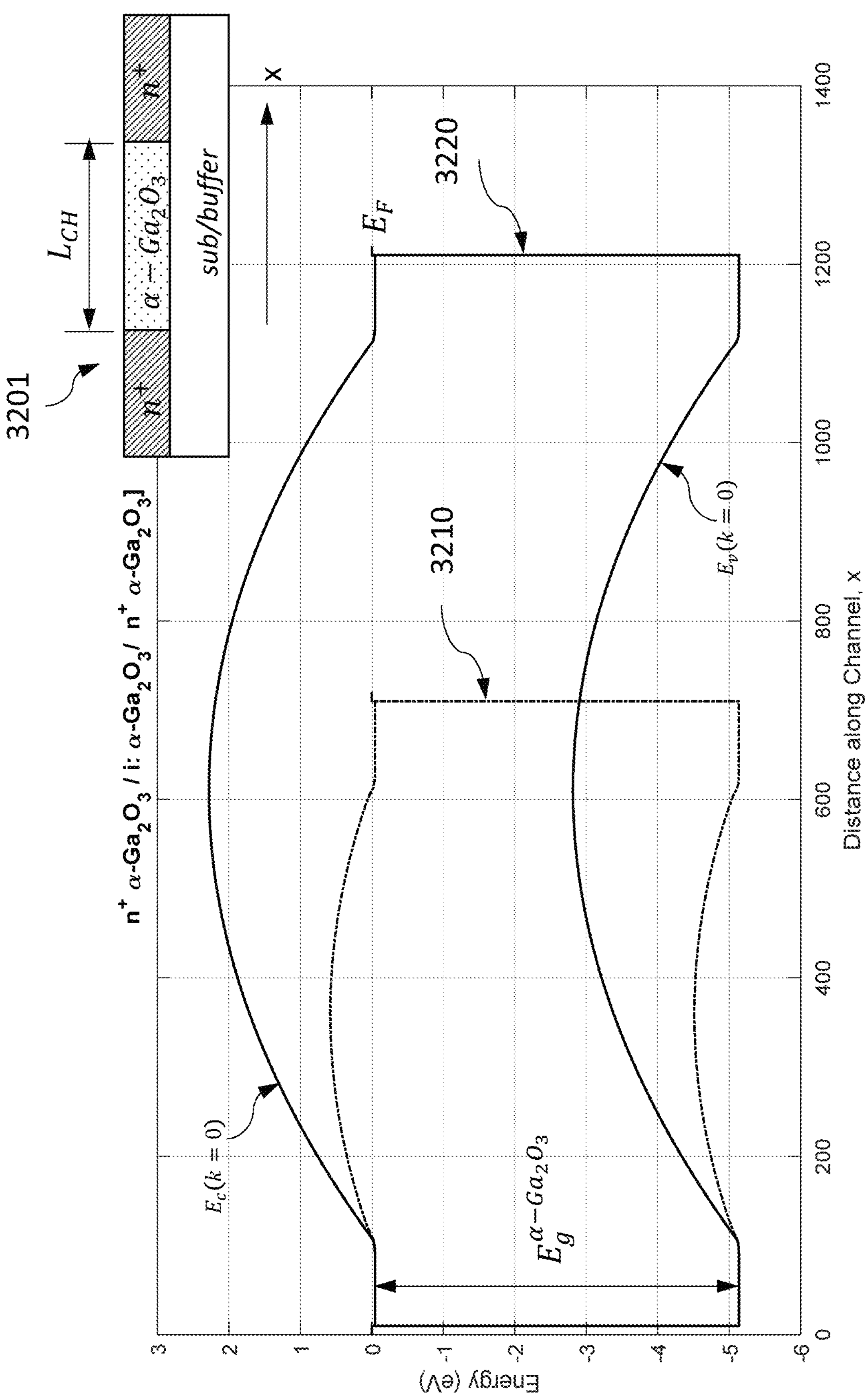

FIG. 178 shows a schematic of a portion of a FET and a chart of energy versus distance along the channel (in the "x" direction).

Figure 179:
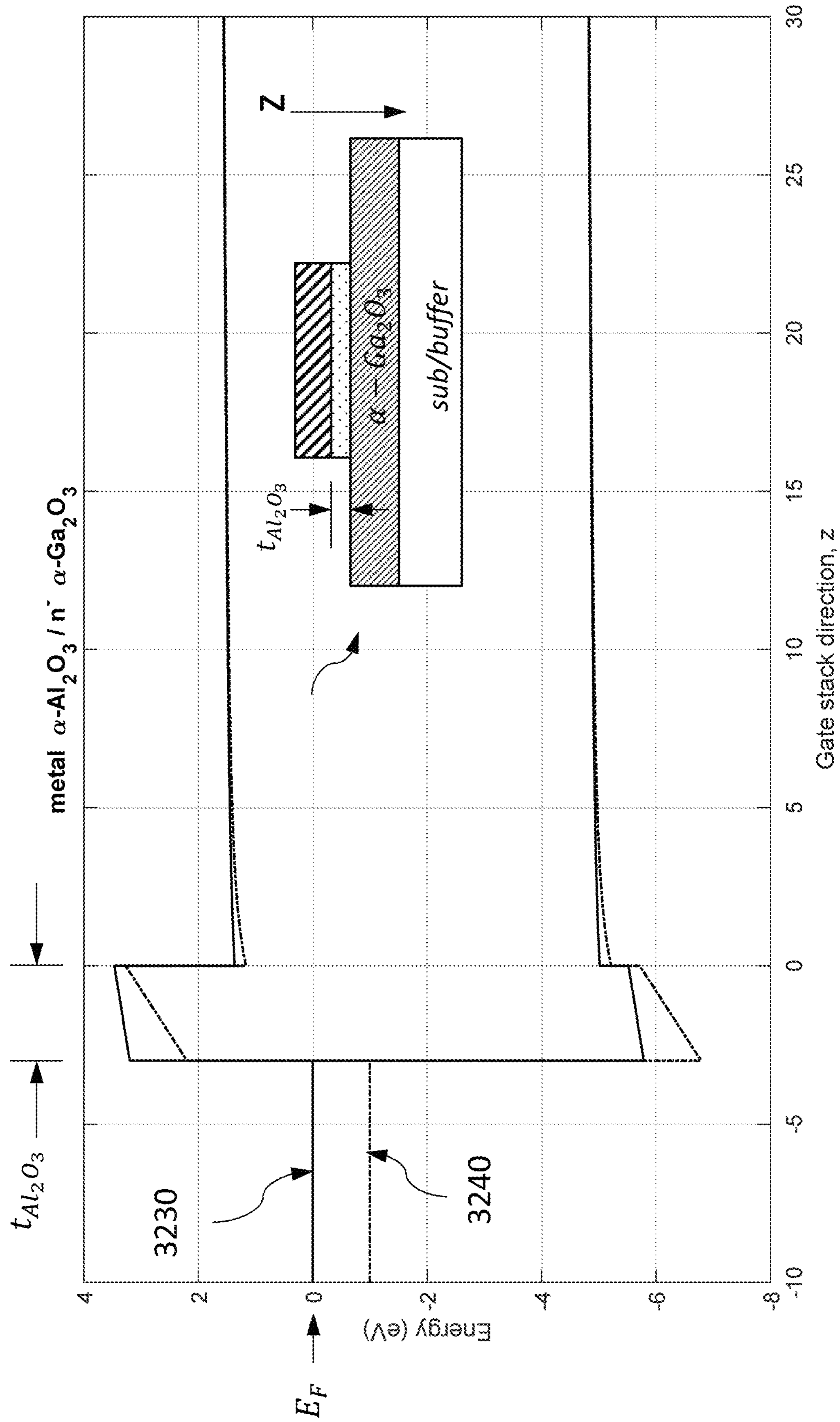

FIG. 179 shows a schematic of a portion of a FET and a chart of energy versus distance along the channel (in the "z" direction) to illustrate the operation of the FET with epitaxial oxide materials.

Figure 180:
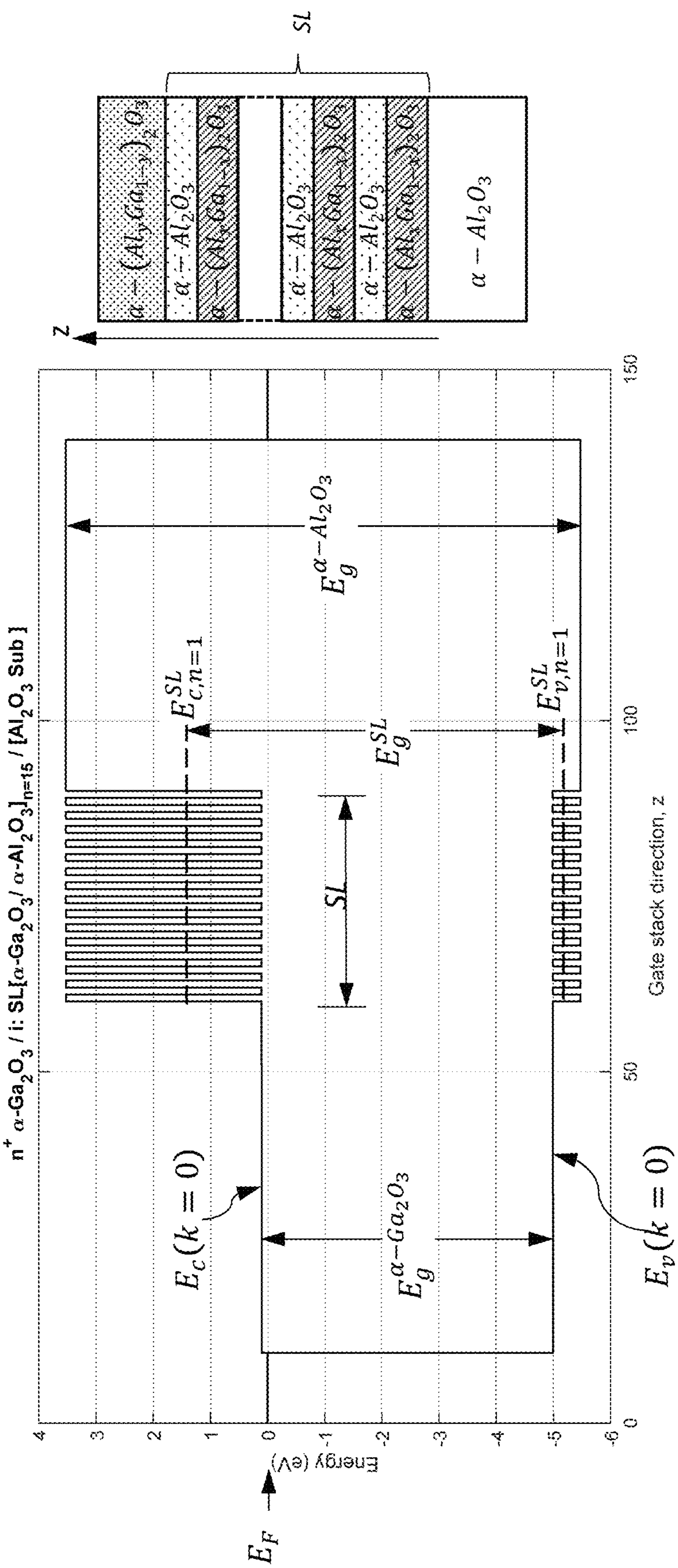

FIG. 180 shows a schematic of a portion of a FET and a chart of energy versus distance along the channel (in the "z" direction).

Figure 181:
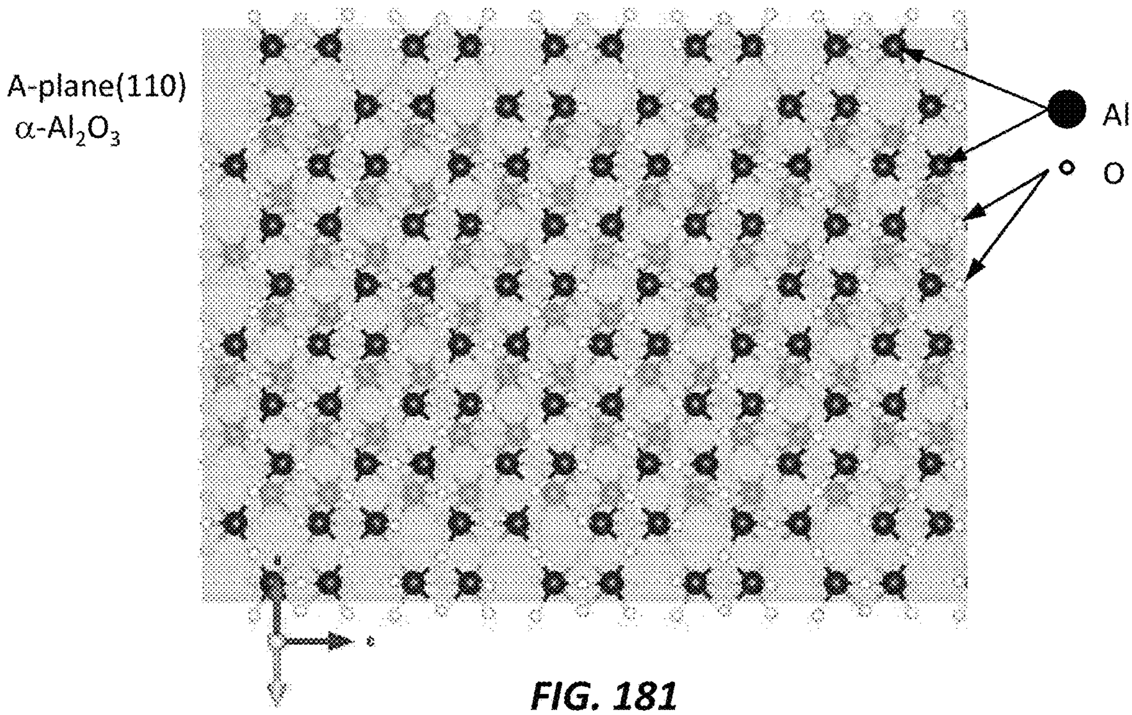

FIG. 181 shows a schematic of the atomic surface of $\alpha$-$Al_2O_3$ oriented in the A-plane (i.e., the (110) plane).

Figure 182:
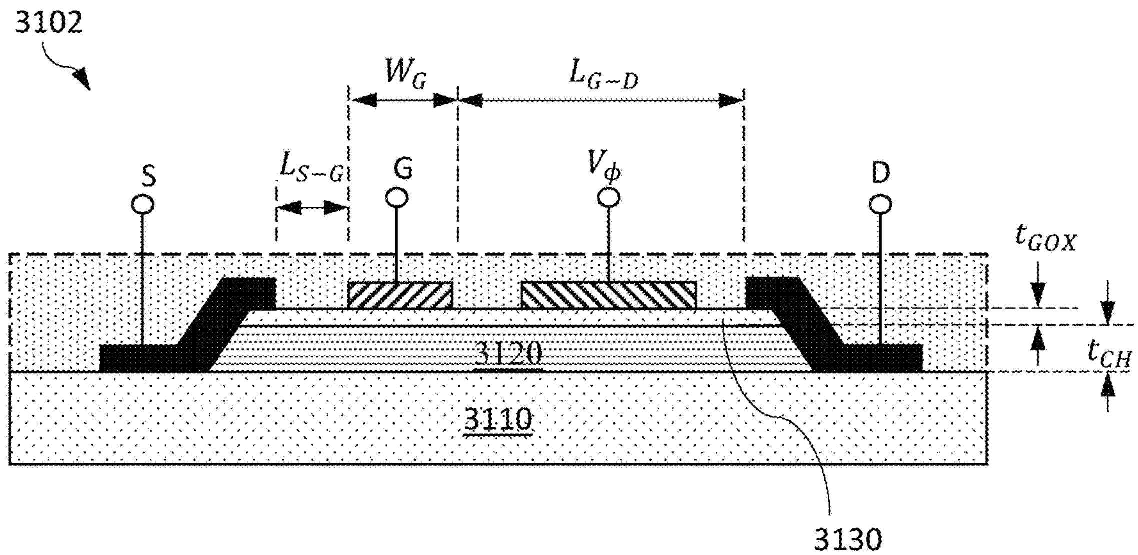

FIG. 182 shows a schematic of an example of a FET comprising epitaxial oxide materials and an integrated phase shifter.

Figure 183A:
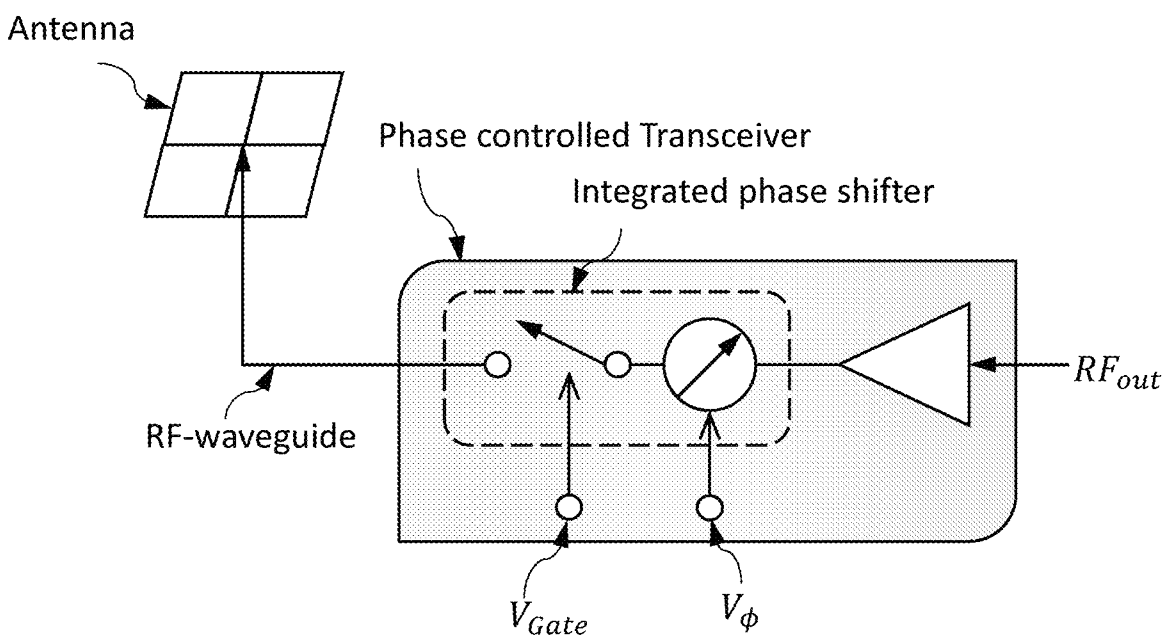
Figure 183B:
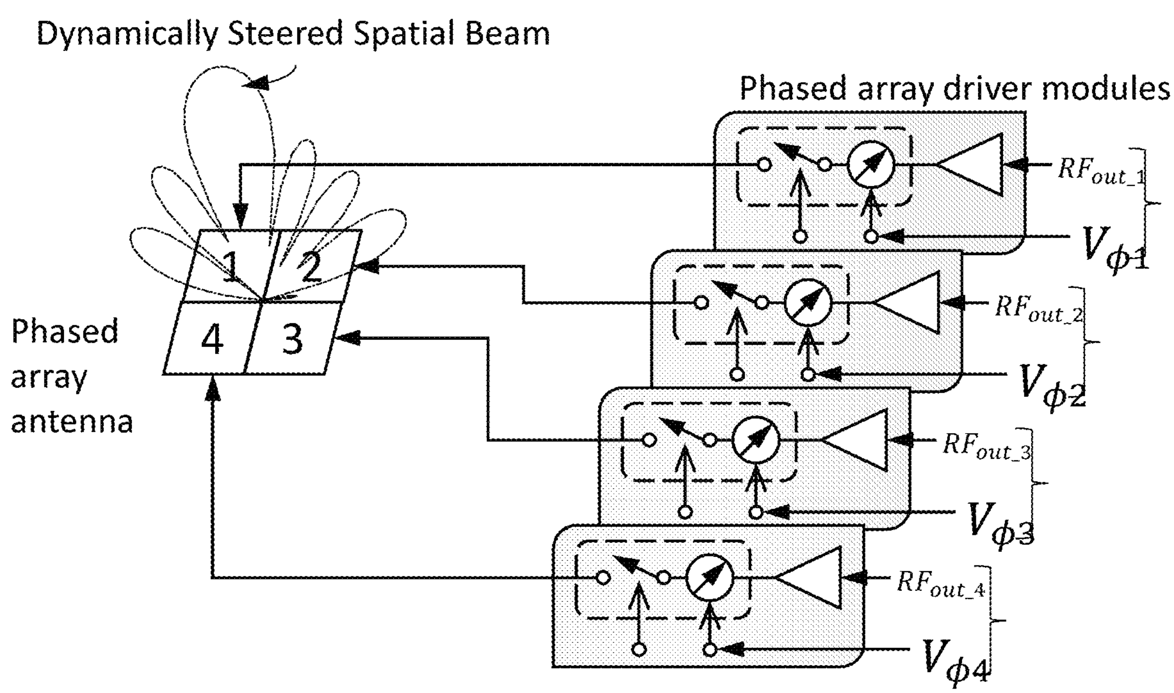

FIGS. 183A and 183B show schematics of systems including one or more switches with an integrated phase shifter (e.g., containing the FET in FIG. 182).

Figure 184:
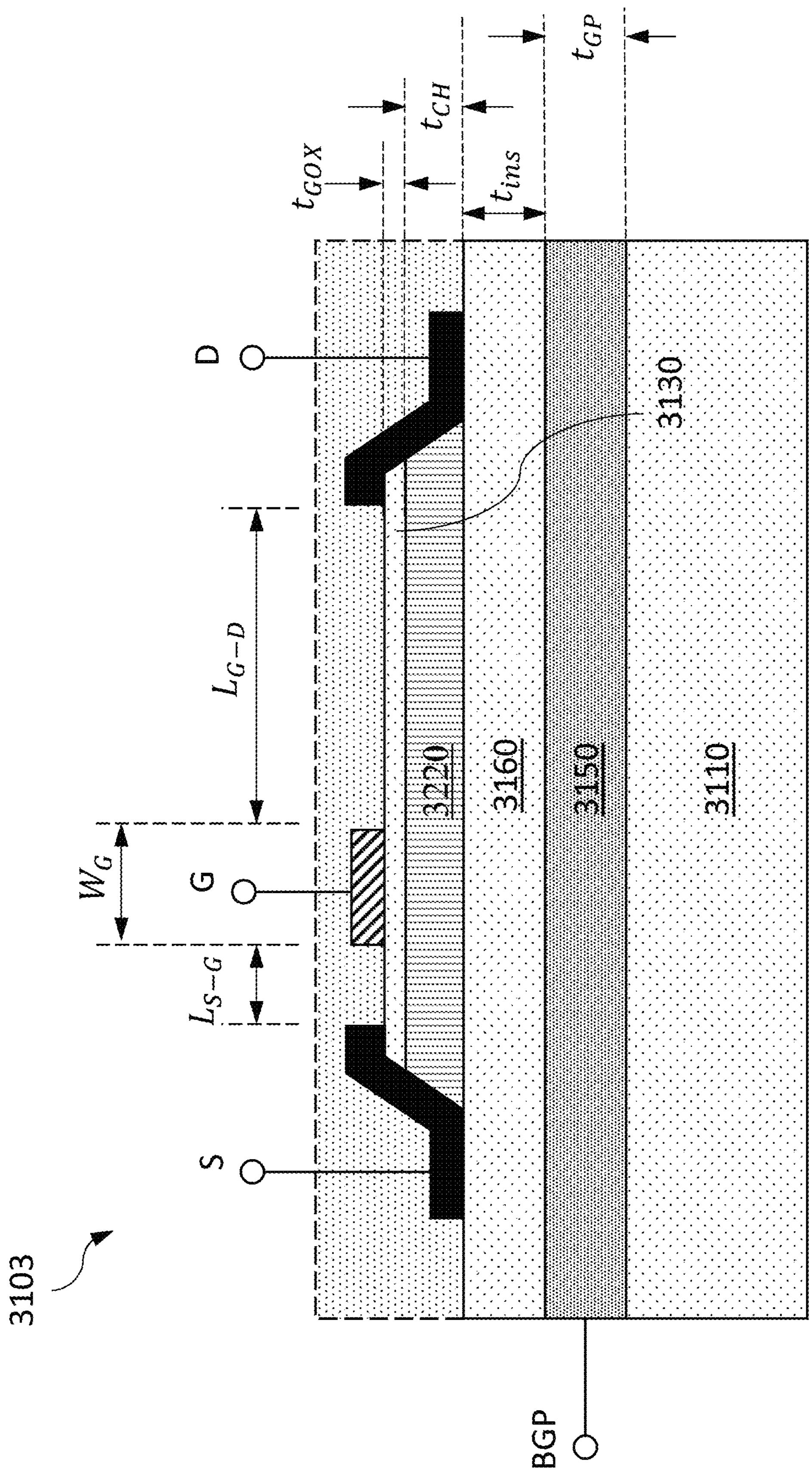

FIG. 184 shows a schematic of an example of a FET comprising epitaxial oxide materials and an epitaxial oxide buried ground plane.

Figure 185A:
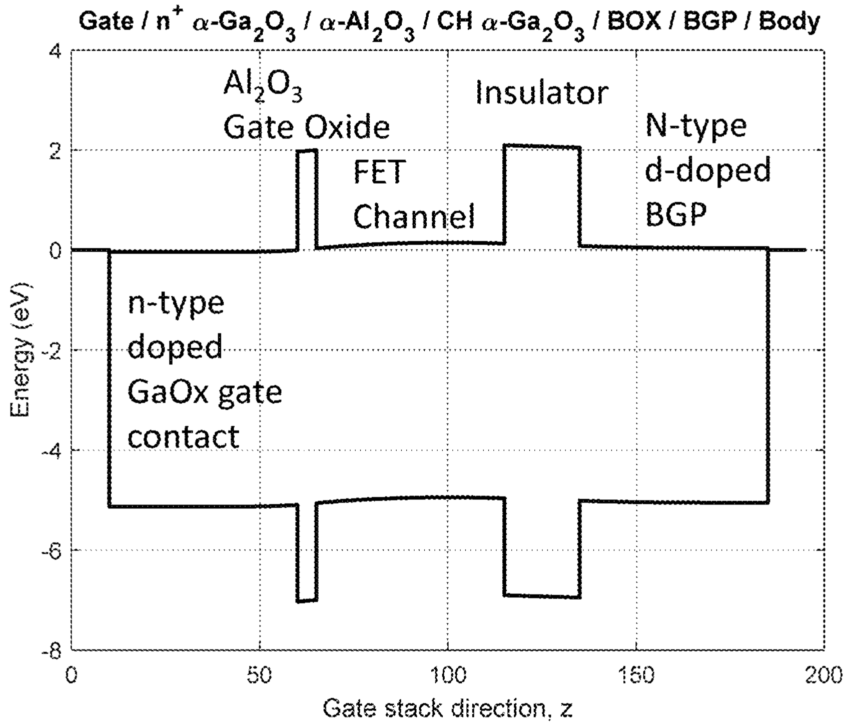
Figure 185B:
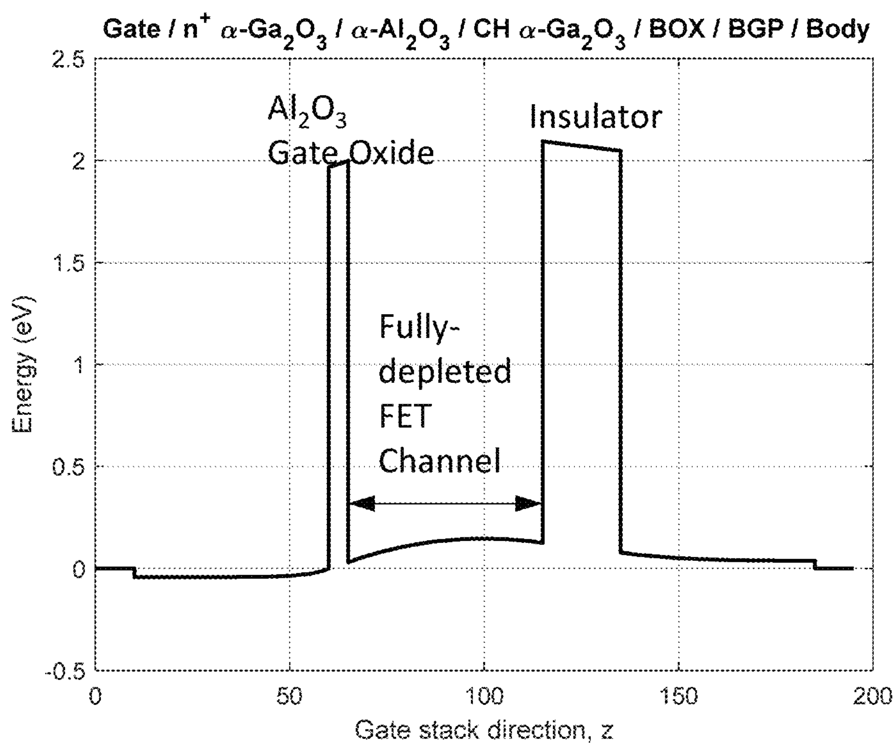

FIGS. 185A and 185B are energy band diagrams along the gate stack direction ("z," as shown in the schematic in FIG. 179) of an example of a FET with a structure like that of the FET in FIG. 184 where the layers are formed of $\alpha$-$(Al_xGa_{1-x})_2O_3$ and $\alpha$-$Al_2O_3$.

Figure 186:
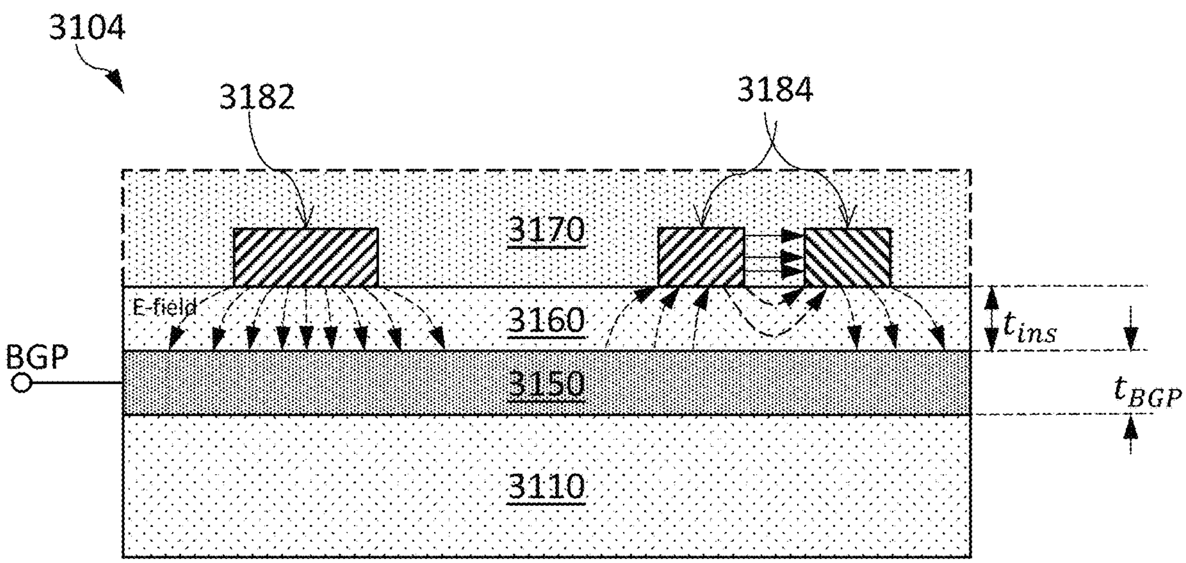

FIG. 186 shows a structure of some RF-waveguides that can be formed using buried ground planes comprising epitaxial oxide materials.

Figure 187:
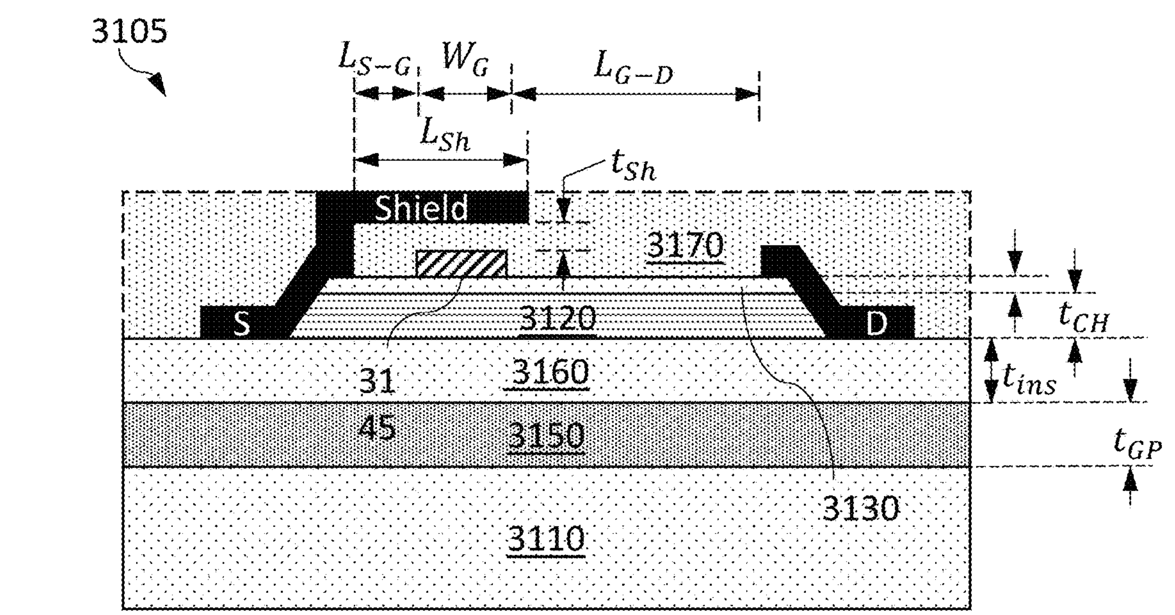

FIG. 187 shows a schematic of an example of a FET comprising epitaxial oxide materials and an electric field shield above the gate electrode.

Figure 188:
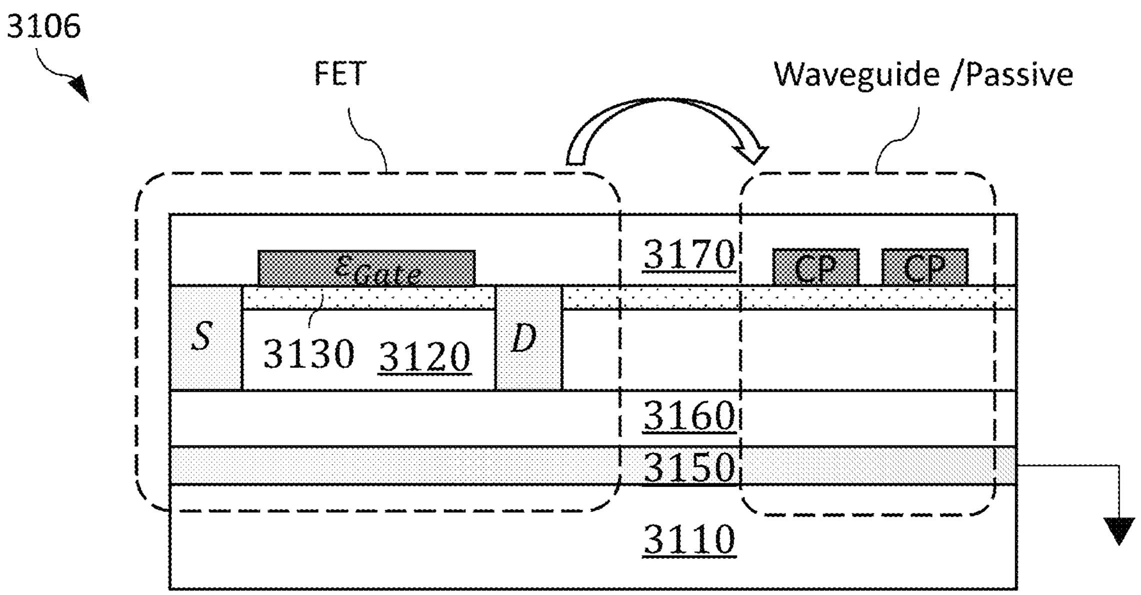

FIG. 188 shows a schematic of the epitaxial oxide and dielectric materials forming an integrated FET and coplanar (CP) waveguide structure.

Figure 189:
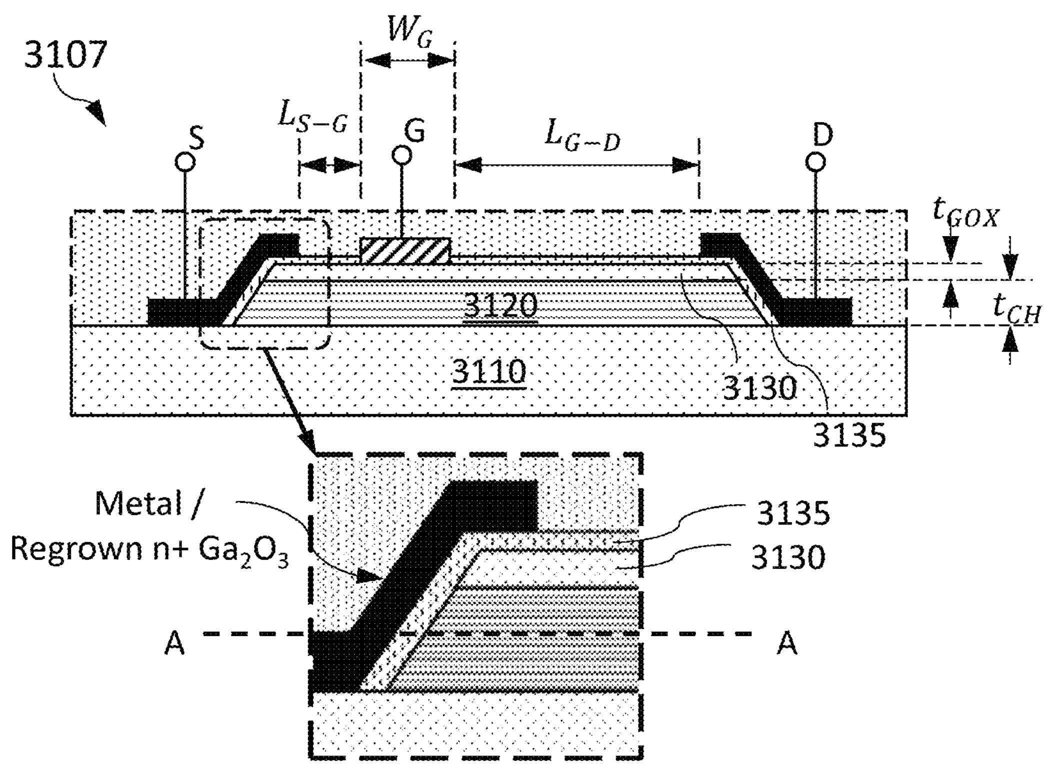

FIG. 189 shows a schematic of an example of a FET comprising epitaxial oxide materials and an integrated phase shifter.

Figure 190C:
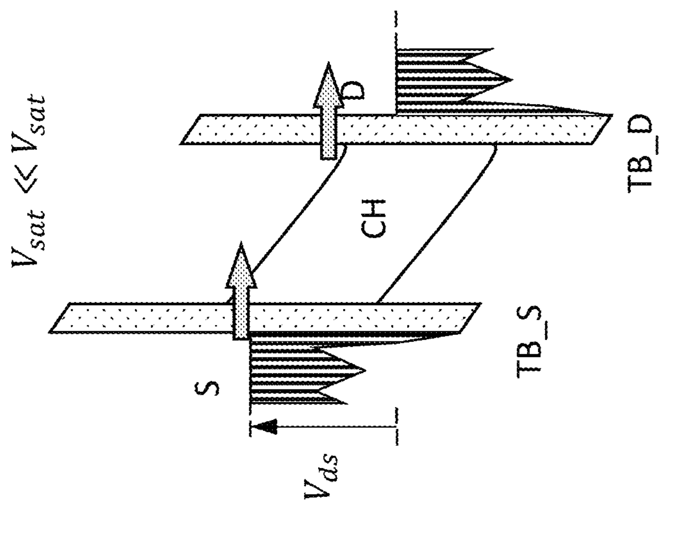
Figure 190B:
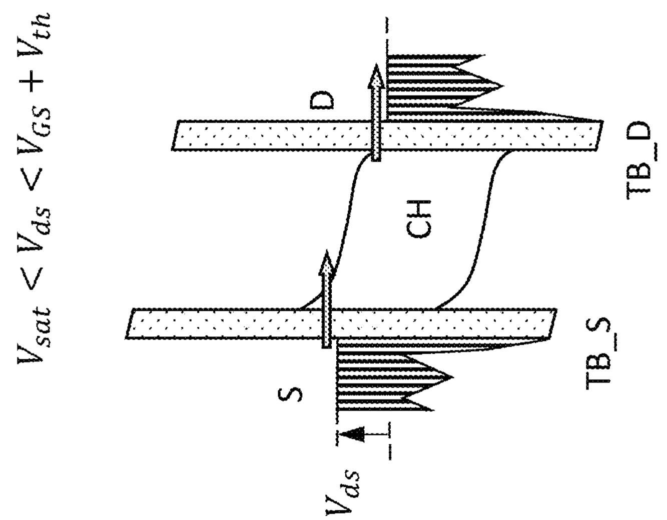
Figure 190A:
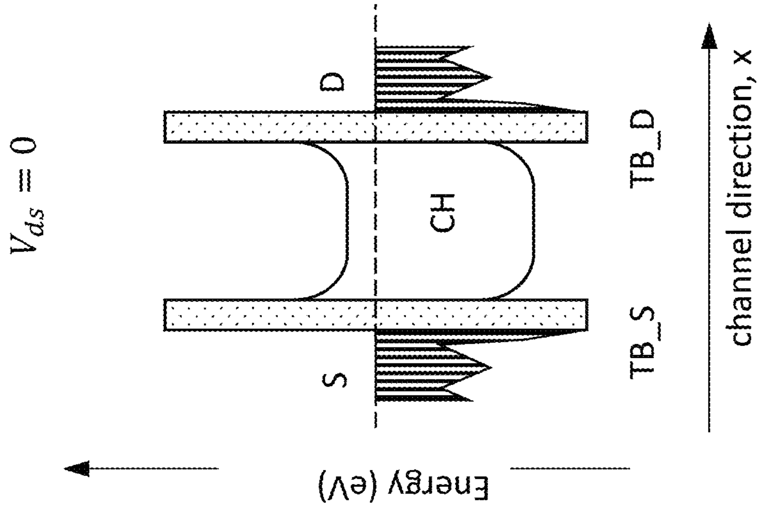

FIGS. 190A-190C show energy band diagrams along the channel direction ("x," as shown in FIG. 178) of the S and D tunnel junctions described with respect to the FET illustrated in FIG. 189

FIGS. 191A-191G are schematics of an example of a process flow to fabricate a FET comprising epitaxial oxide materials, such as the FET shown in FIG. 189.

Figure 192:
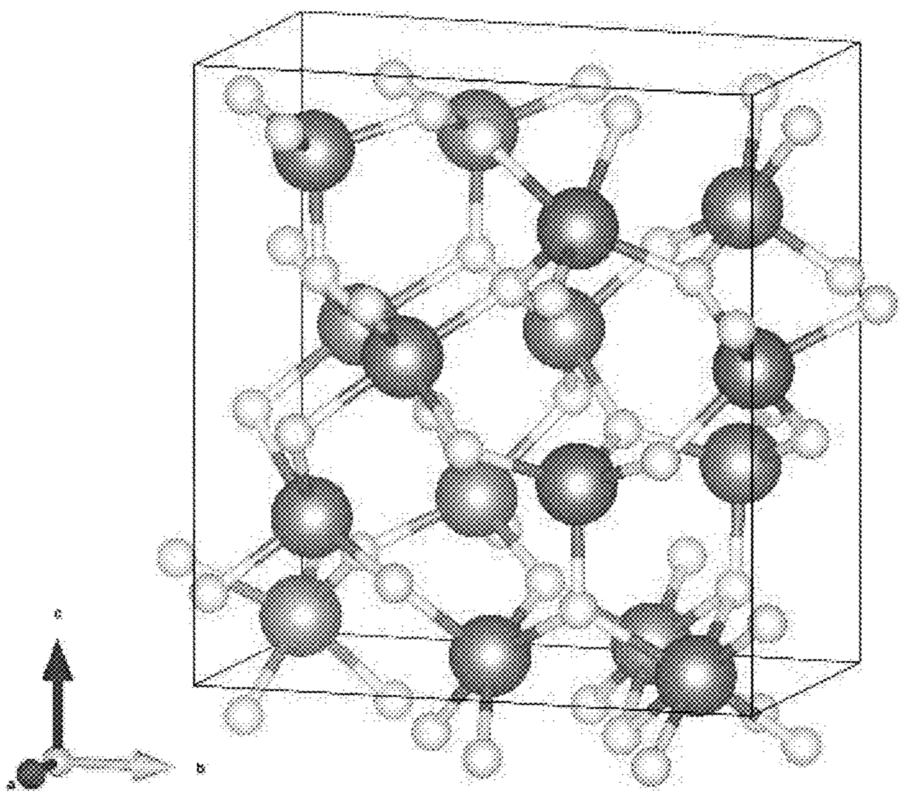

FIG. 192 shows the DFT calculated atomic structure of $\kappa$-$Ga_2O_3$ (i.e., $Ga_2O_3$ with a Pna21 space group).

Figure 193A:
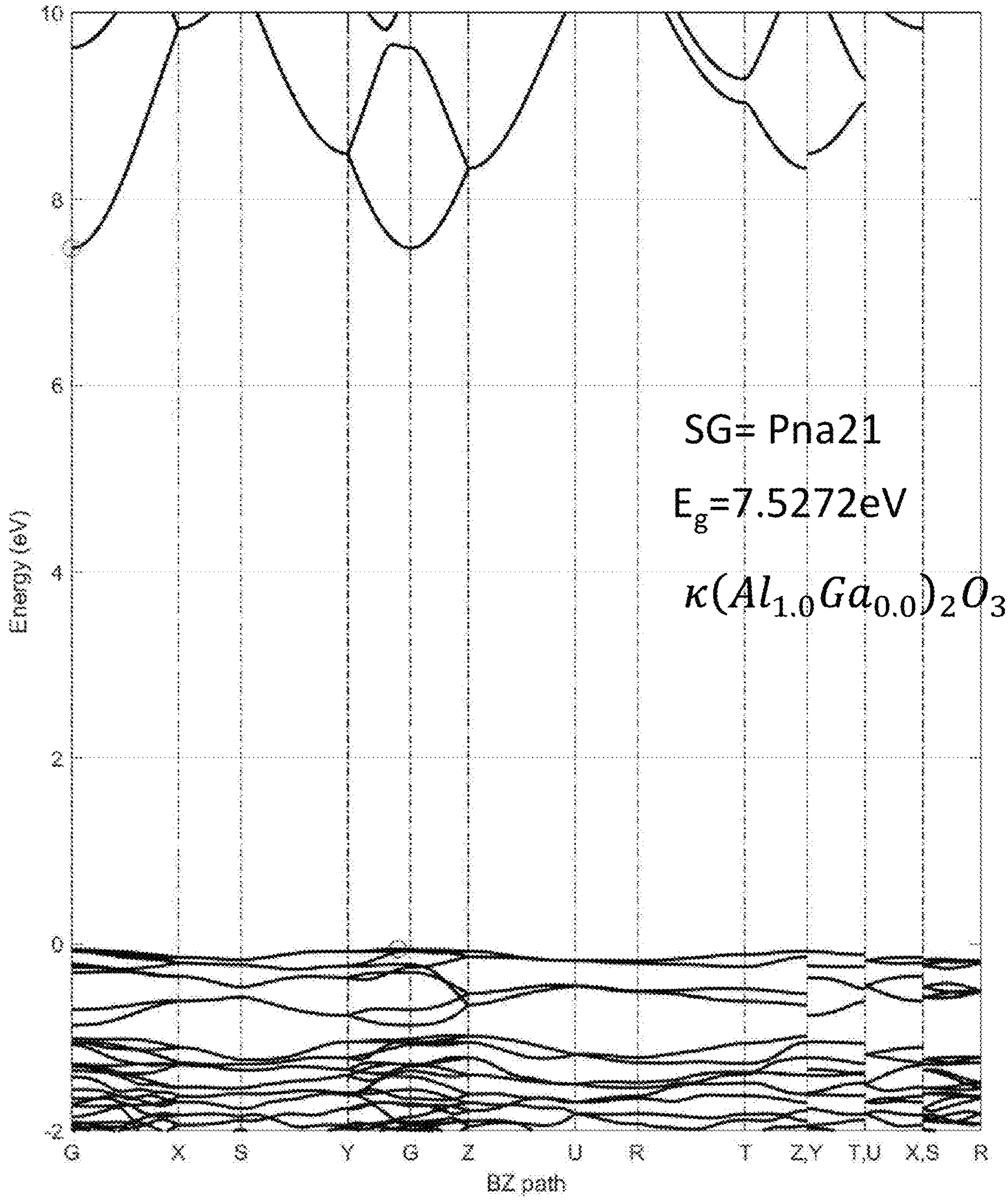
Figure 193B:
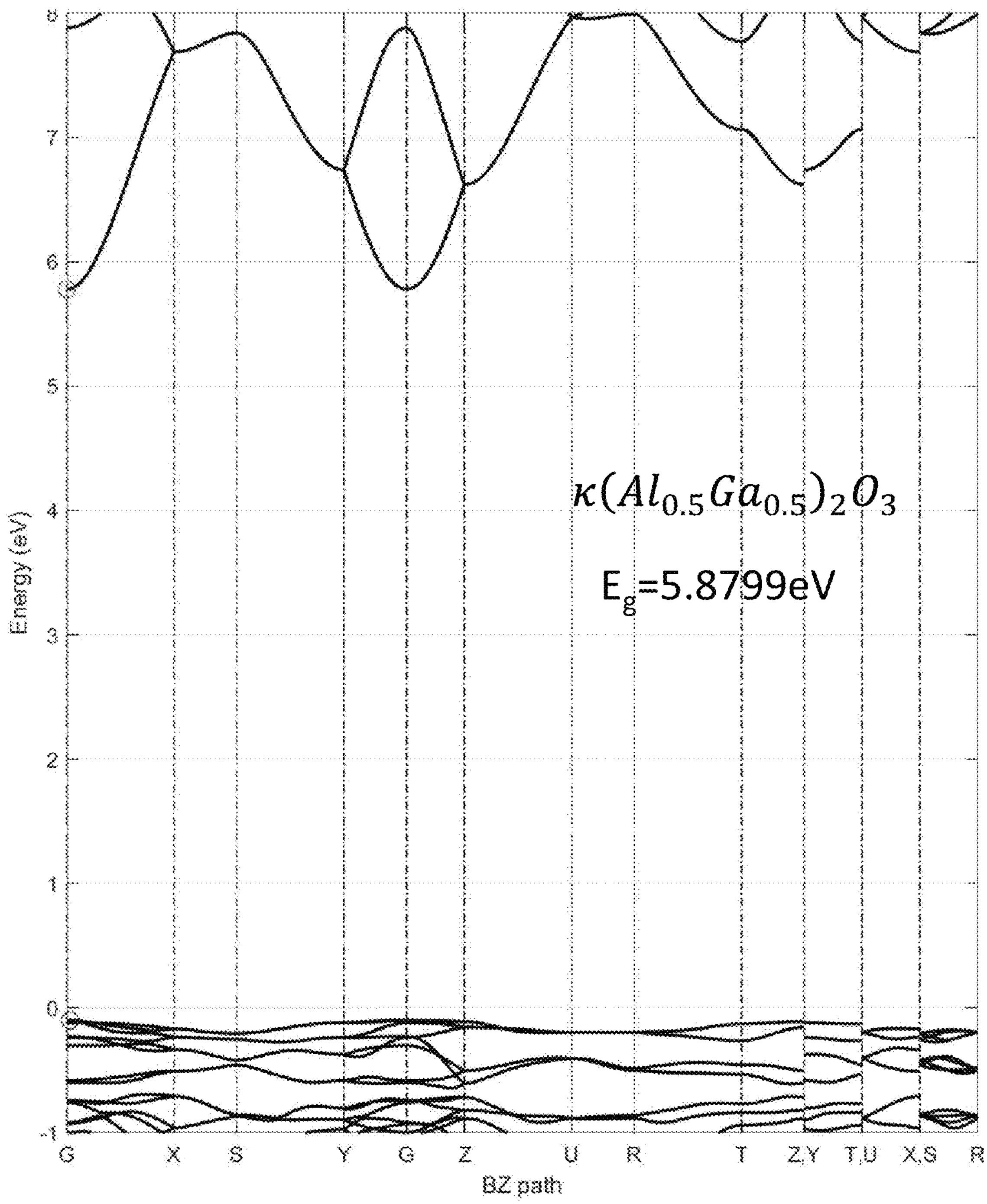
Figure 193C:
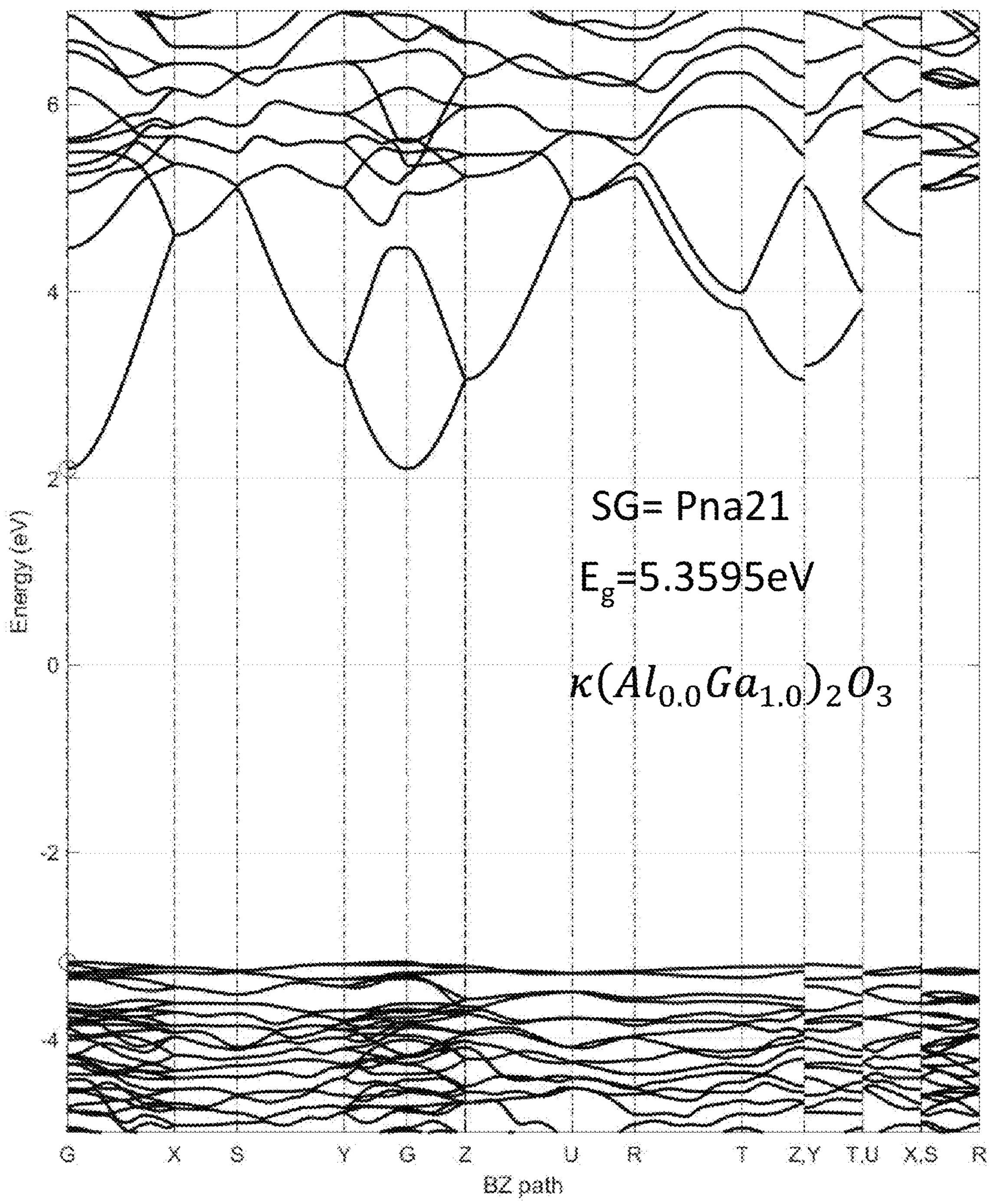

FIGS. 193A-193C show DFT calculated band structures of $\kappa$-$(Al_xGa_{1-x})_2O_3$, where x=1, 0.5 and 0.

Figure 193D:
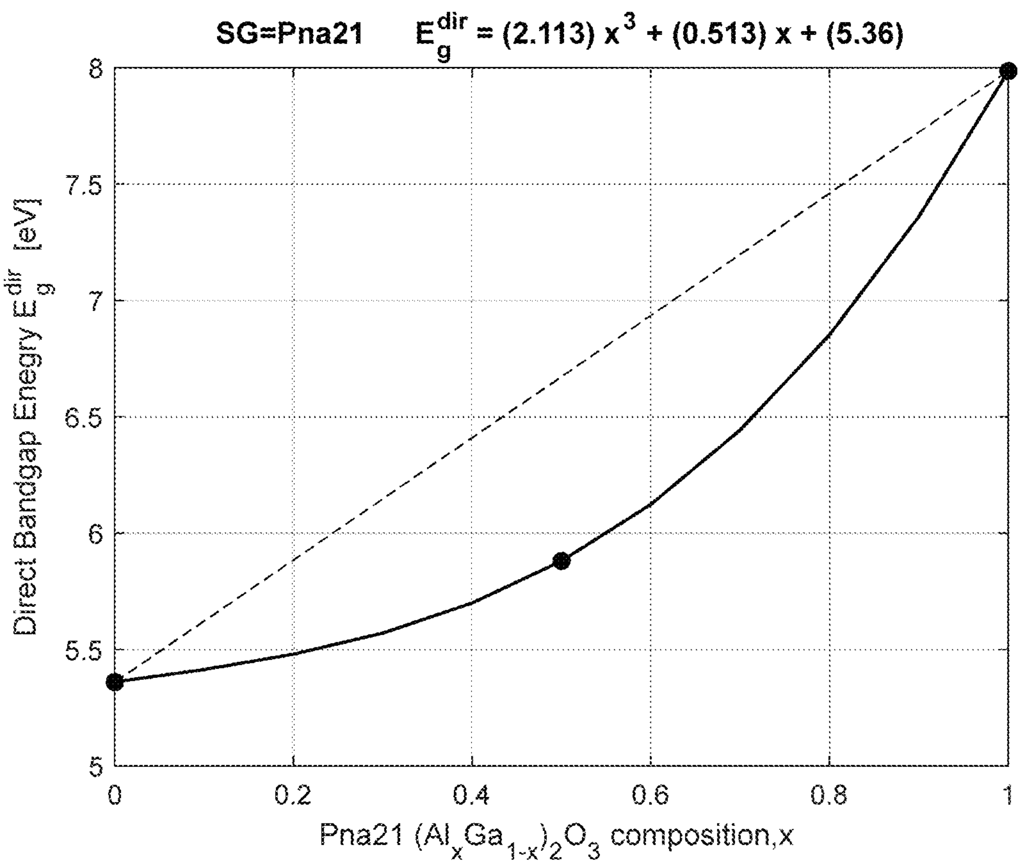

FIG. 193D shows the DFT calculated minimum bandgap energy of $\kappa$-$(Al_xGa_{1-x})_2O_3$, where x=1, 0.5 and 0.

Figure 194A:
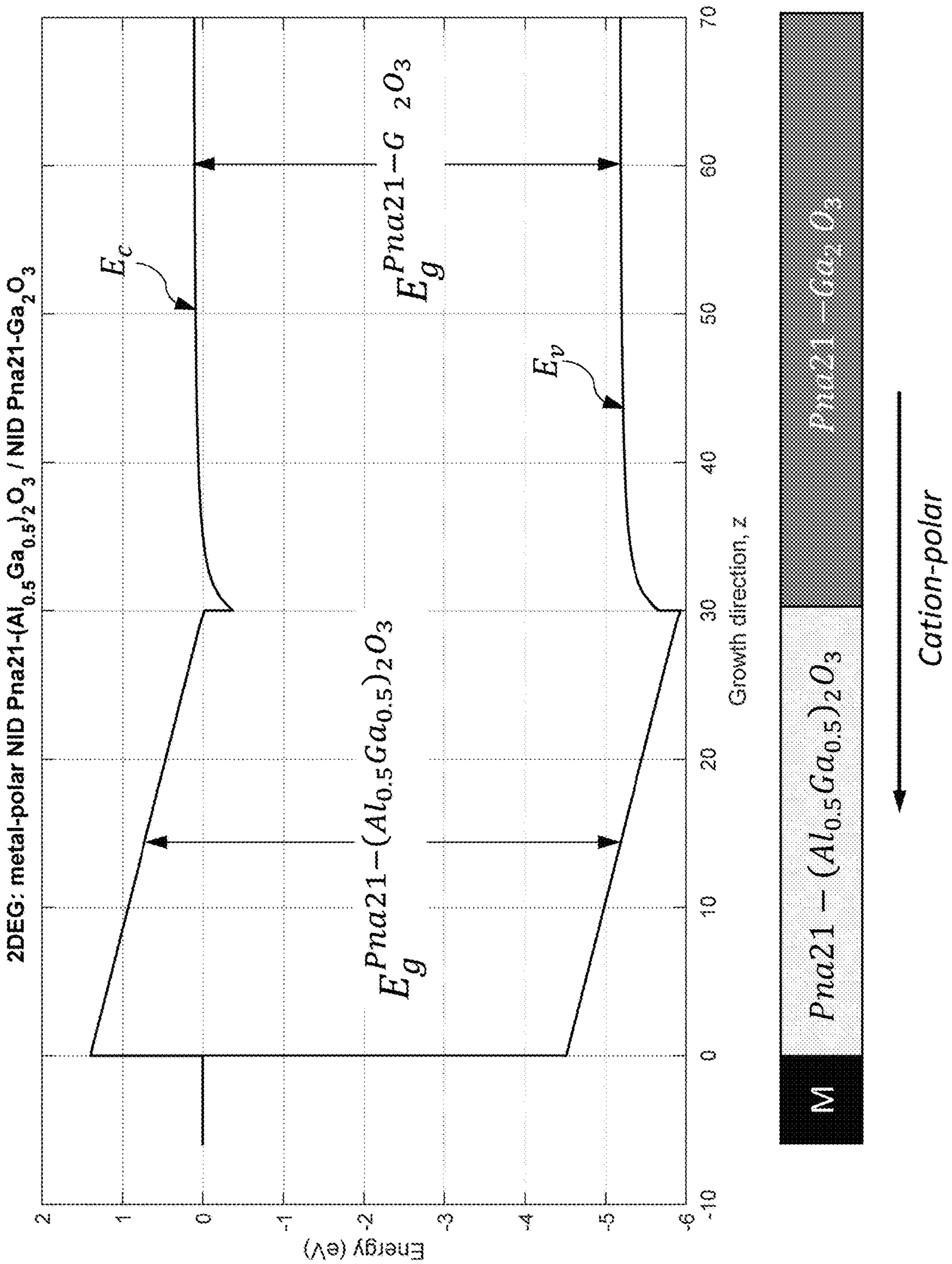
Figure 194B:
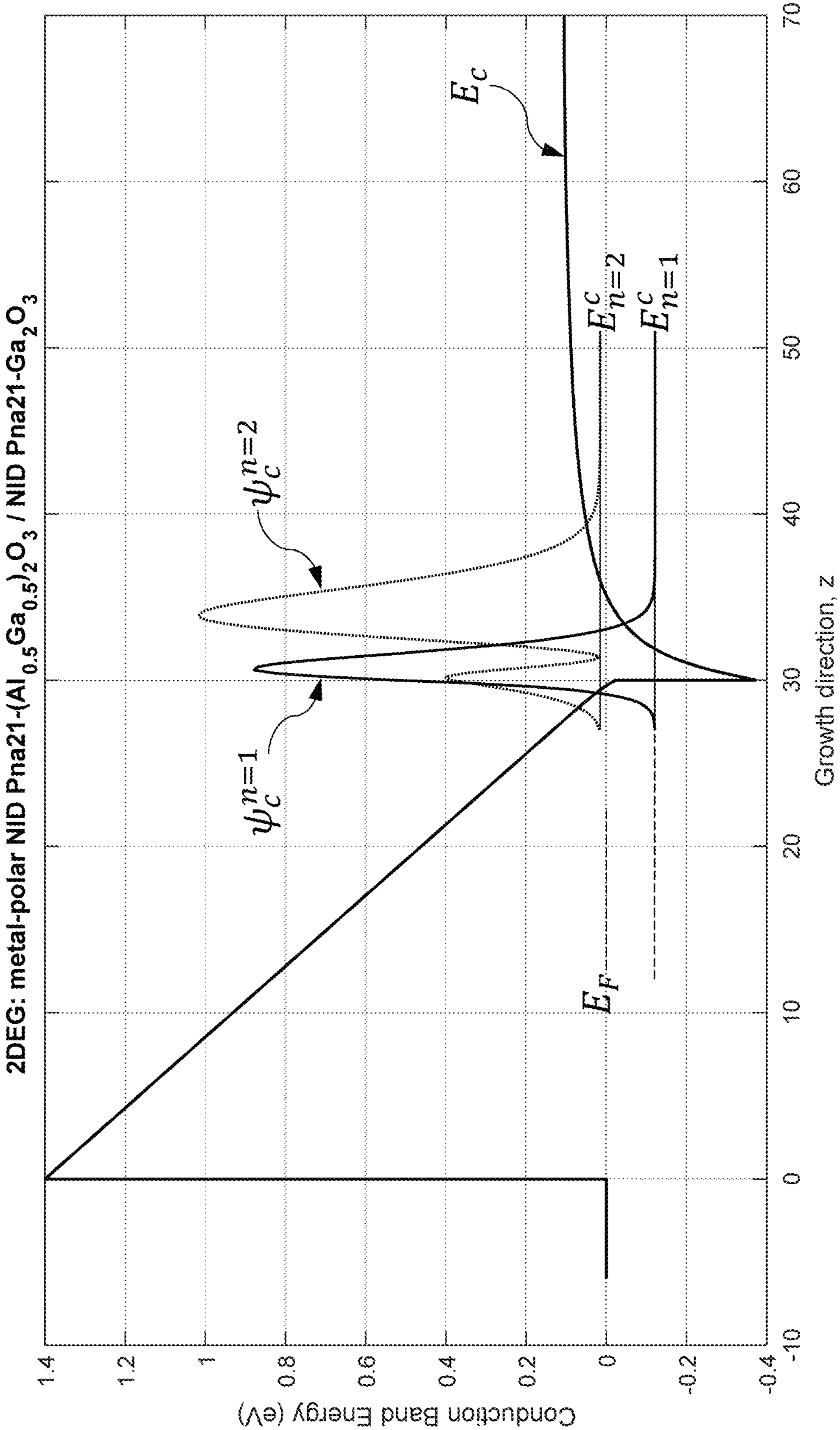
Figure 194C:
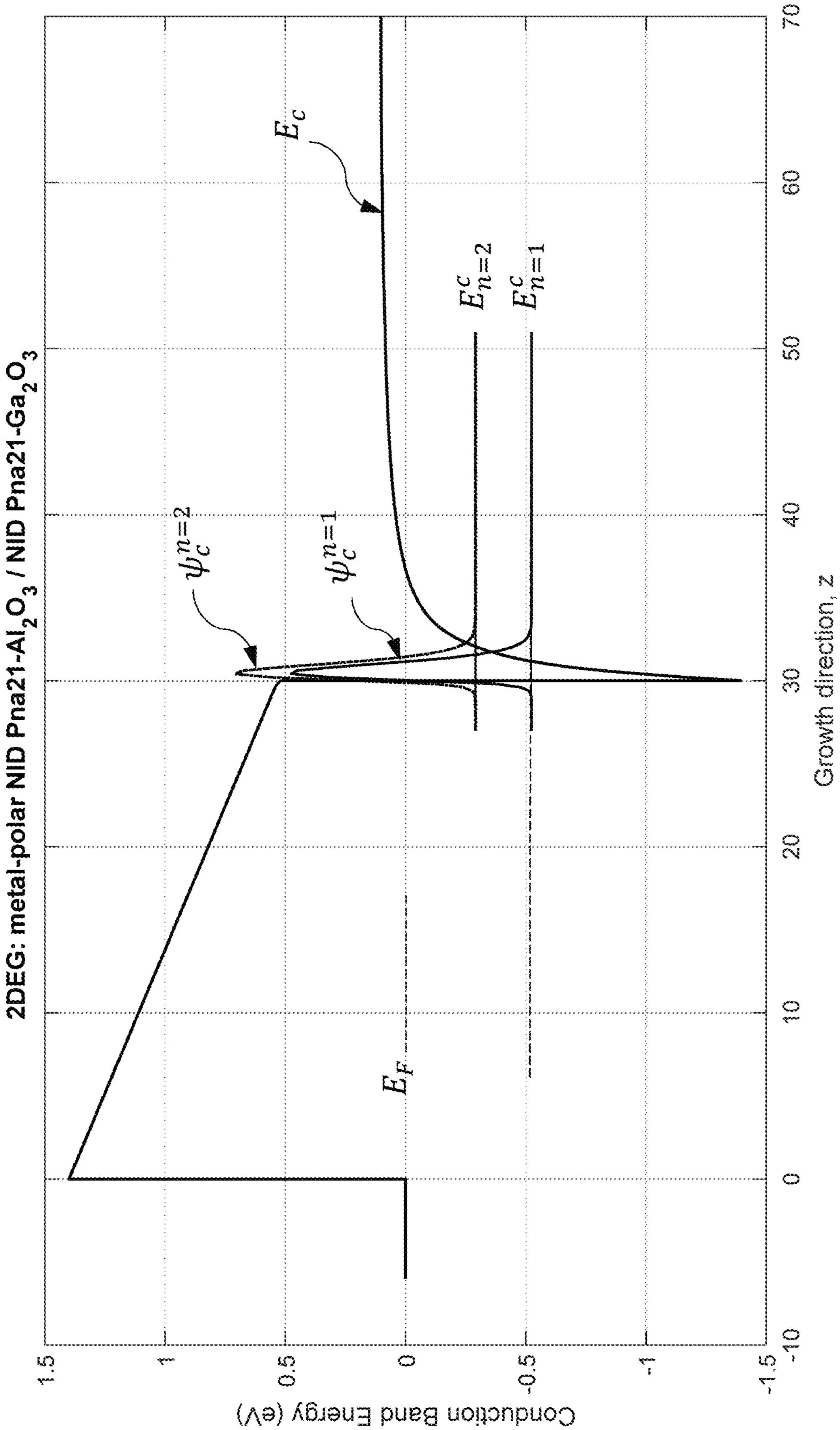

FIGS. 194A-194C show schematics and calculated band diagrams (conduction and valence band edges) of energy versus growth direction "z," calculated electron wavefunctions, and calculated electron densities, in $\kappa$-$(Al_xGa_{1-x})_2O_3$/$\kappa$-$Ga_2O_3$ heterostructures.

Figure 194D:
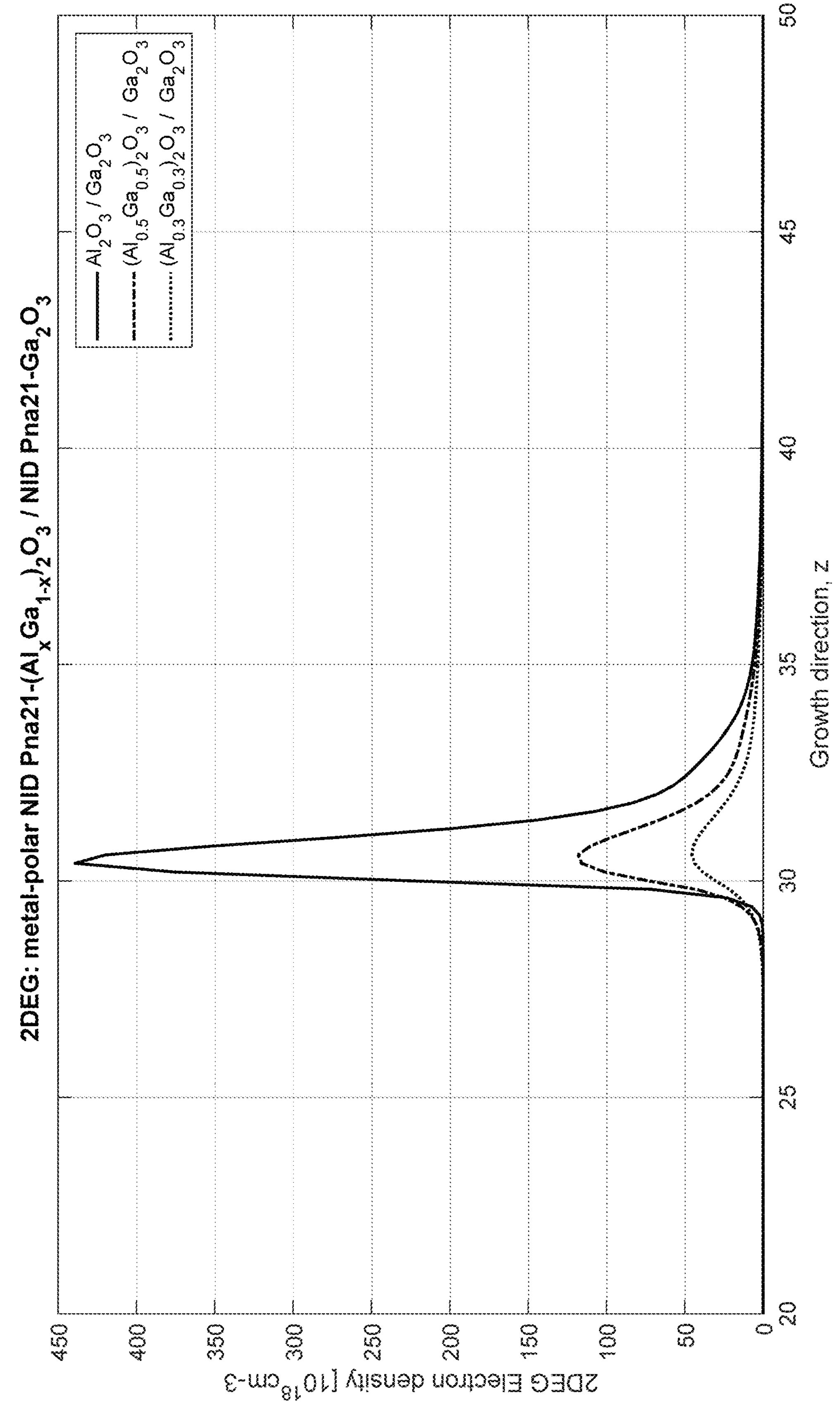
Figure 194E:
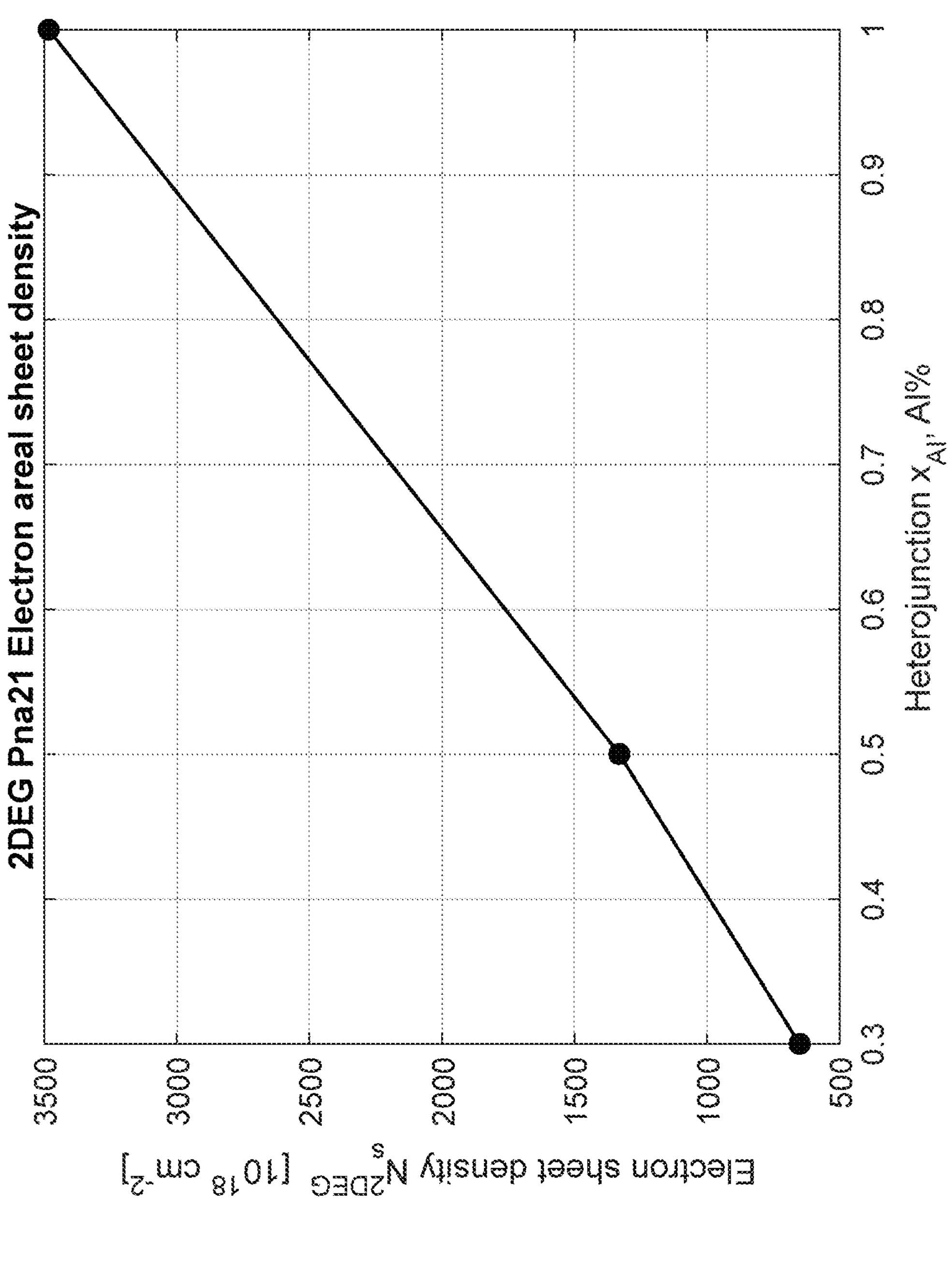

FIGS. 194D-194E show the electron density in the thin layer in the confined energy well formed in $\kappa$-$(Al_xGa_{1-x})_2O_3$/$\kappa$-$Ga_2O_3$ heterostructures where x=0.3, 0.5, and 1.

Figure 195:
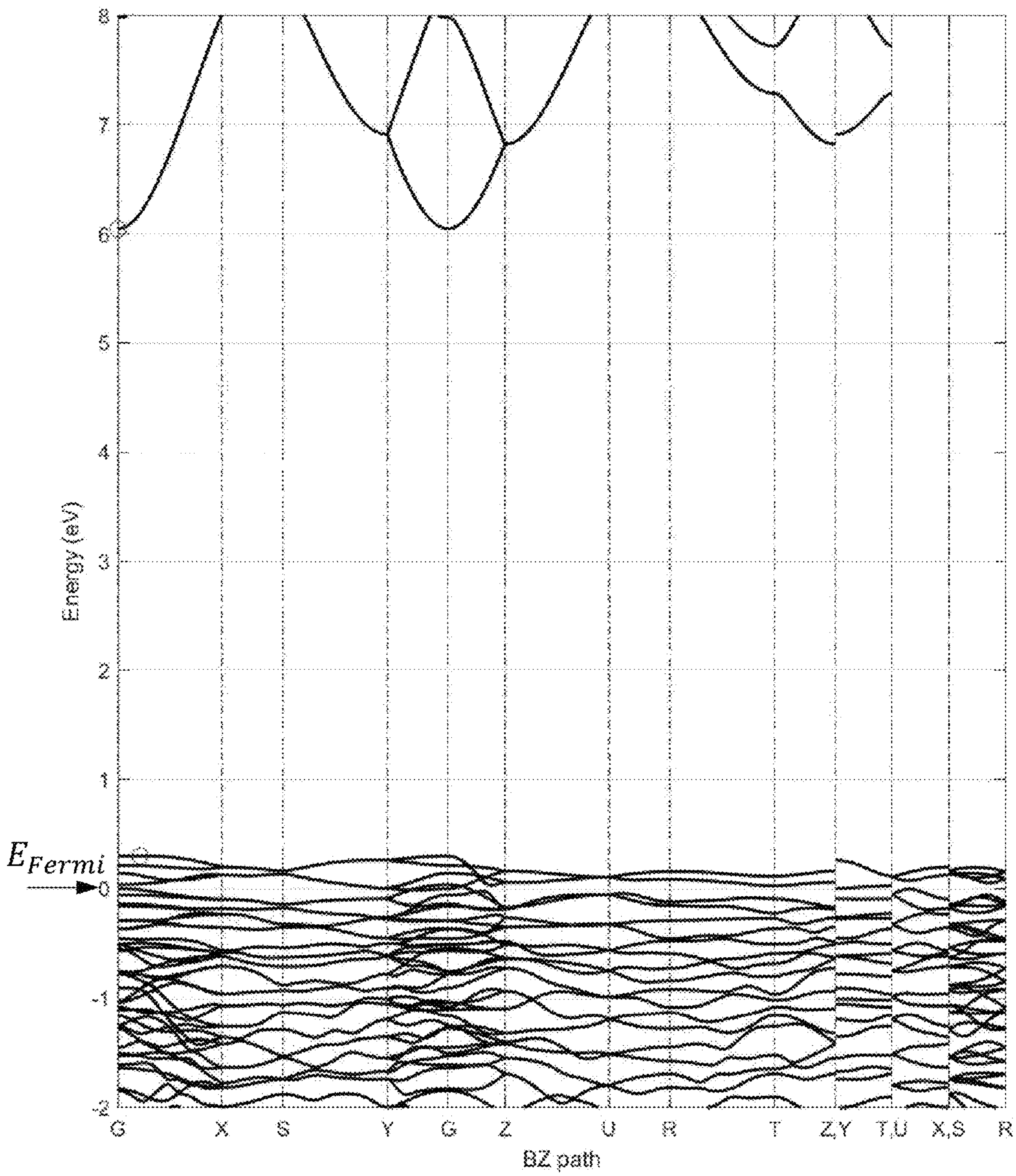

FIG. 195 shows a DFT calculated band structure of Li-doped $\kappa$-$Ga_2O_3$.

Figure 196:
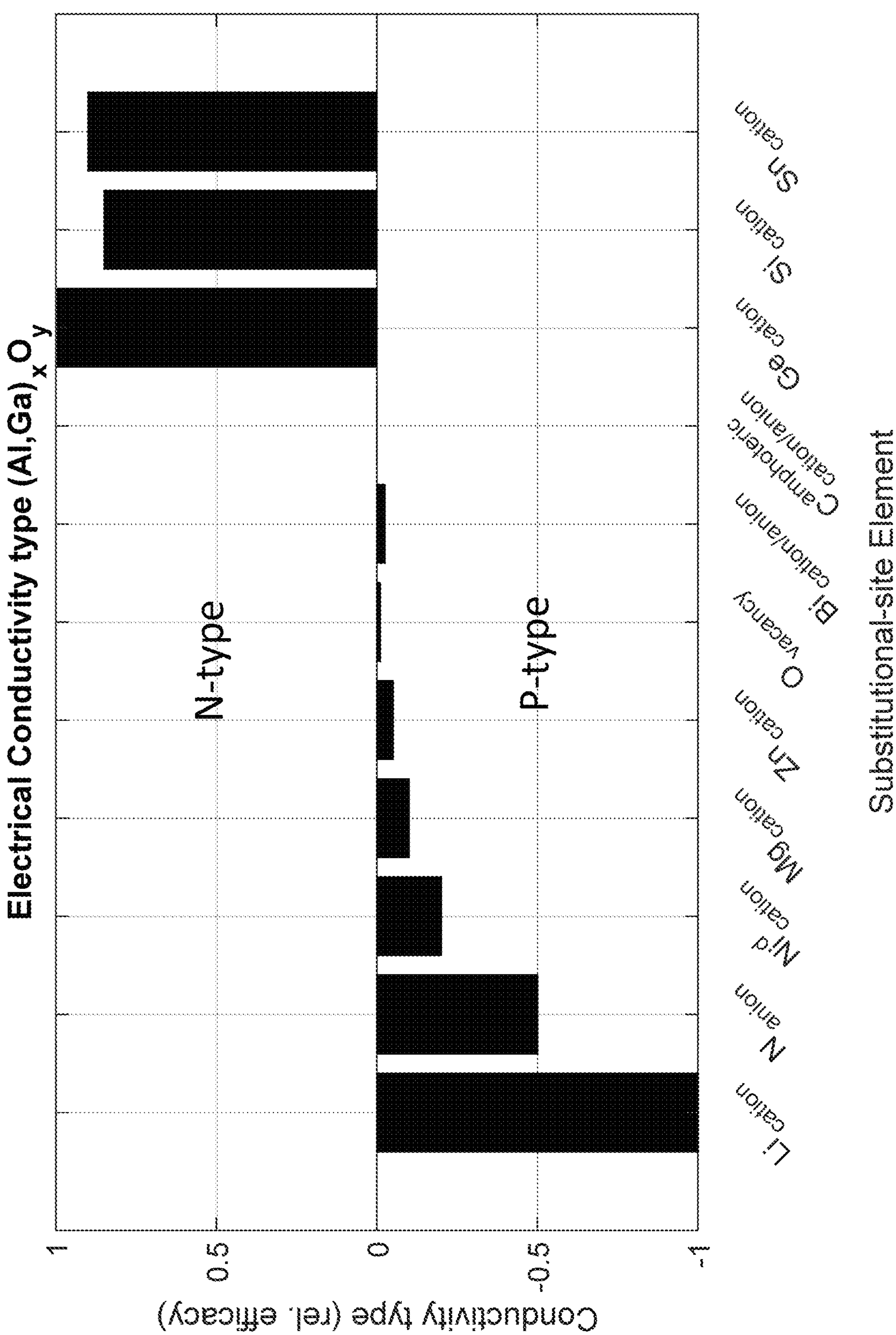

FIG. 196 shows a chart that summarizes the results from DFT calculated band structures of doped $(Al,Ga)_xO_y$ using different dopants.

Figure 197A:
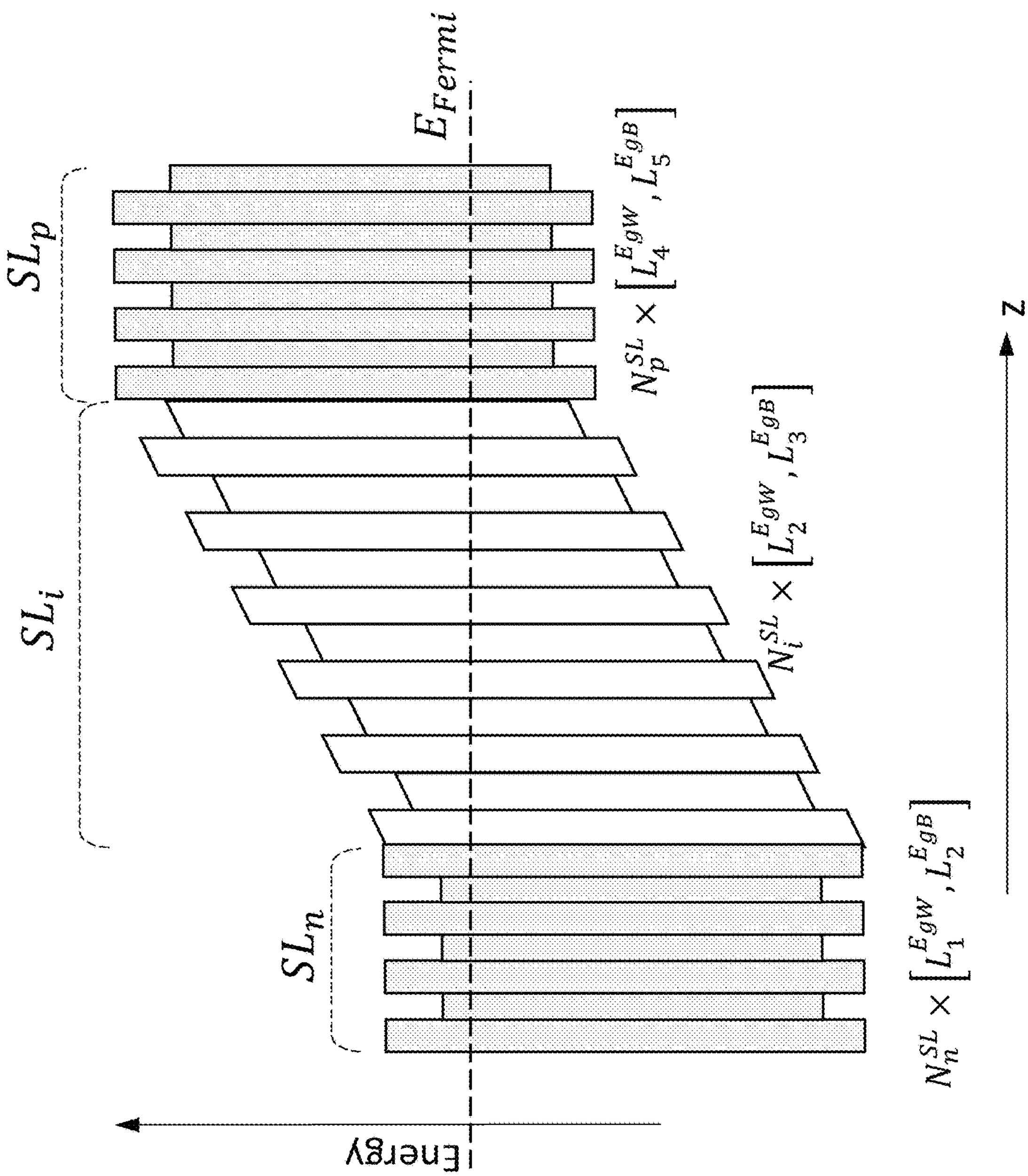

FIG. 197A shows an example of a p-i-n structure, with multiple quantum wells in the n-, i- and p-layers (similar to the structure shown in FIG. 149).

Figure 197B:
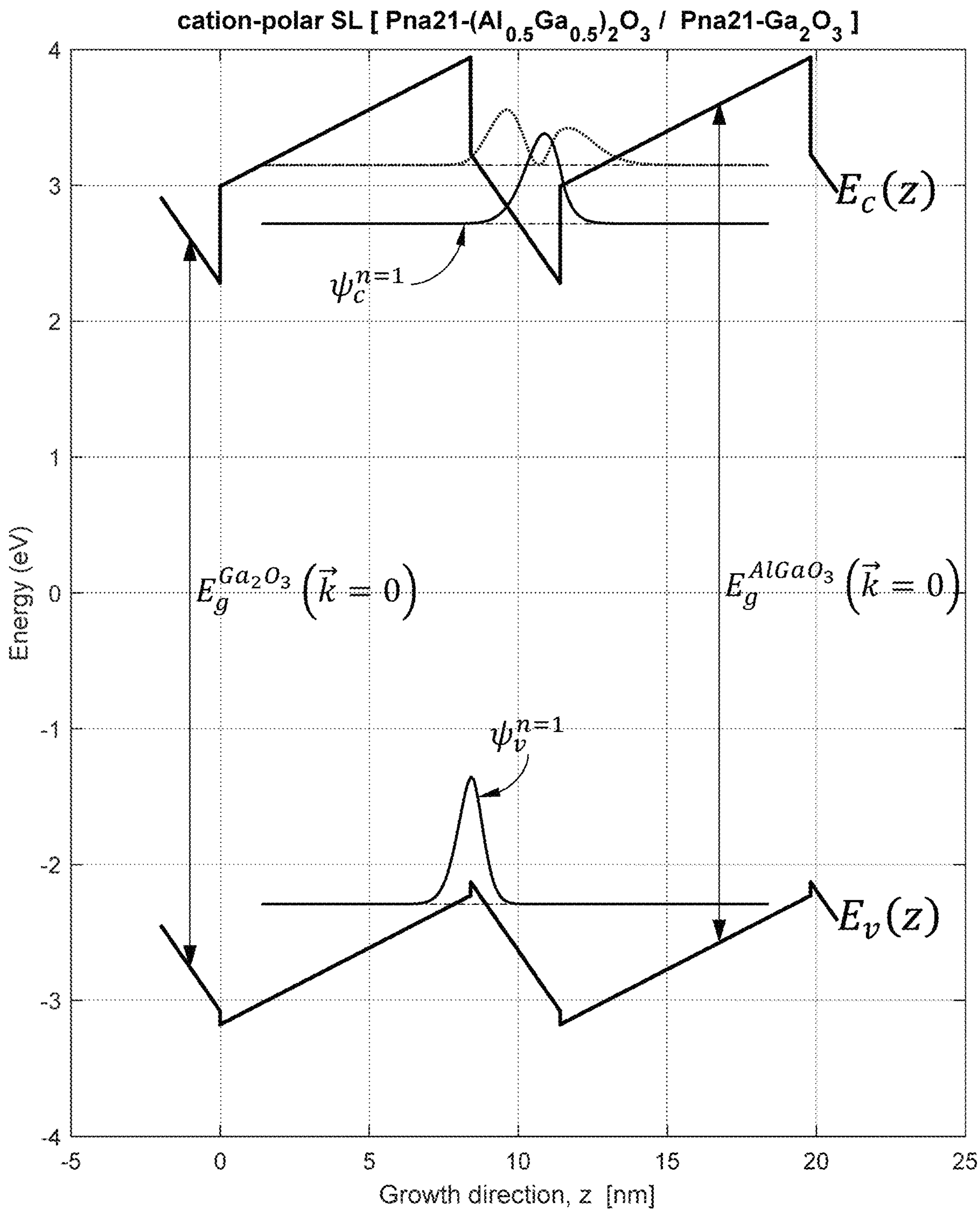
Figure 197C:
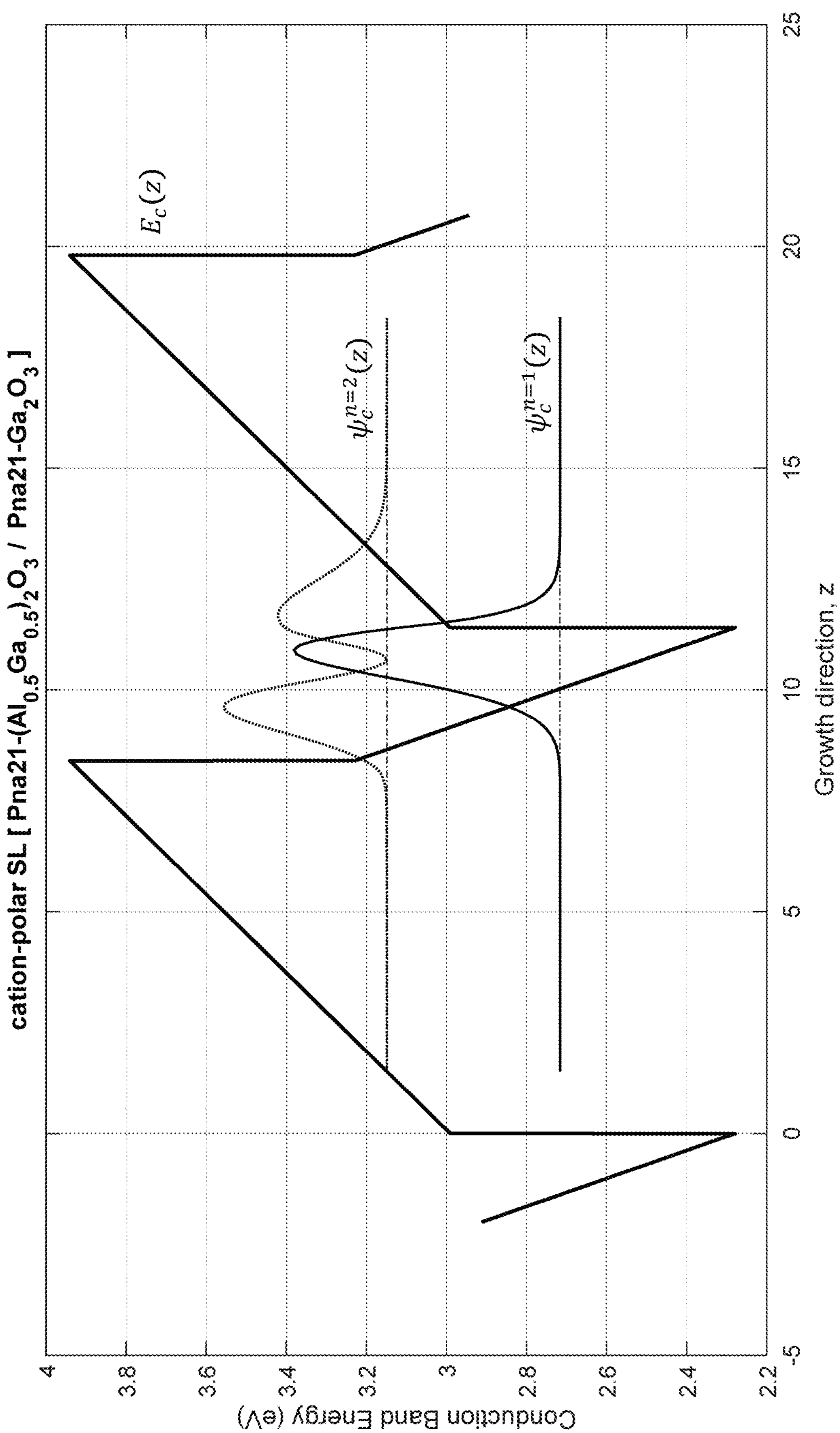

FIGS. 197B and 197C show calculated band diagrams and confined electron and hole wavefunctions (similar to those in the examples in FIGS. 194B and 194C) for a portion of the superlattice in the n-region in a structure like the one in FIG. 197A.

FIG. 198A shows a structure with a crystalline substrate having a particular orientation (h k l) with respect to the growth direction, and an epitaxial layer ("film epilayer") with an orientation (h' k' l').

FIG. 198B is a table showing some substrates that are compatible with κ-$Al_xGa_{1-x}O_y$ epitaxial layers, the space group ("SG") of the substrates, the orientation of the substrate, the orientation of a κ-$Al_xGa_{1-x}O_y$ film grown on the substrate, and the elastic strain energy due to the mismatch.

FIG. 199 shows an example containing a substrate (C-plane α-$Al_2O_3$) and a template (low temperature "LT" grown Al(111)) structure used to match the in-plane lattice constants to κ-$Al_xGa_{1-x}O_y$ ("Pna21 AlGaO").

Figure 200:
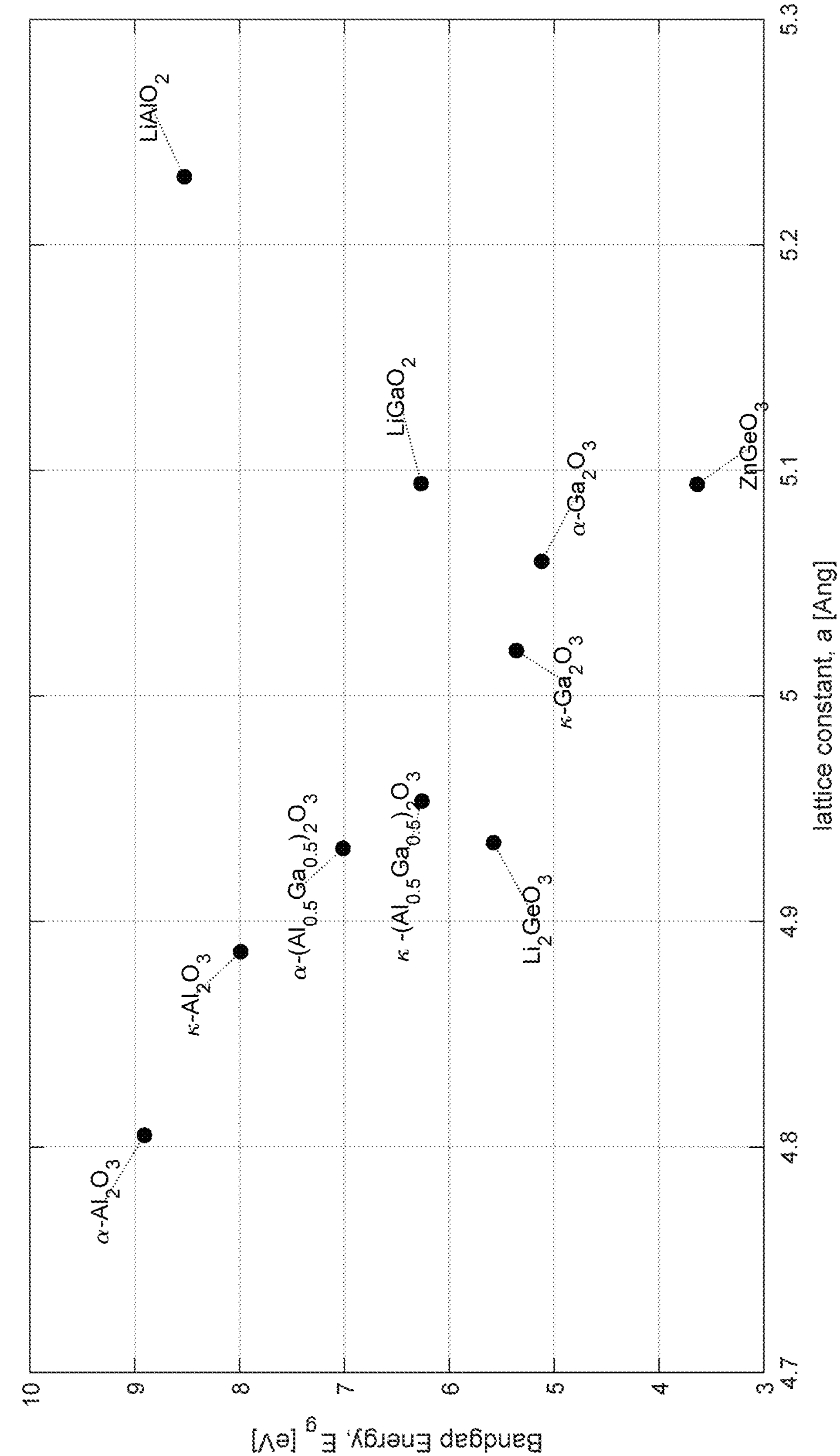

FIG. 200 shows some DFT calculated epitaxial oxide materials with lattice constants from about 4.8 Angstroms to about 5.3 Angstroms which in various examples may be substrates for, and/or form heterostructures with, κ-$Al_xGa_{1-x}O_y$.

Figure 201:
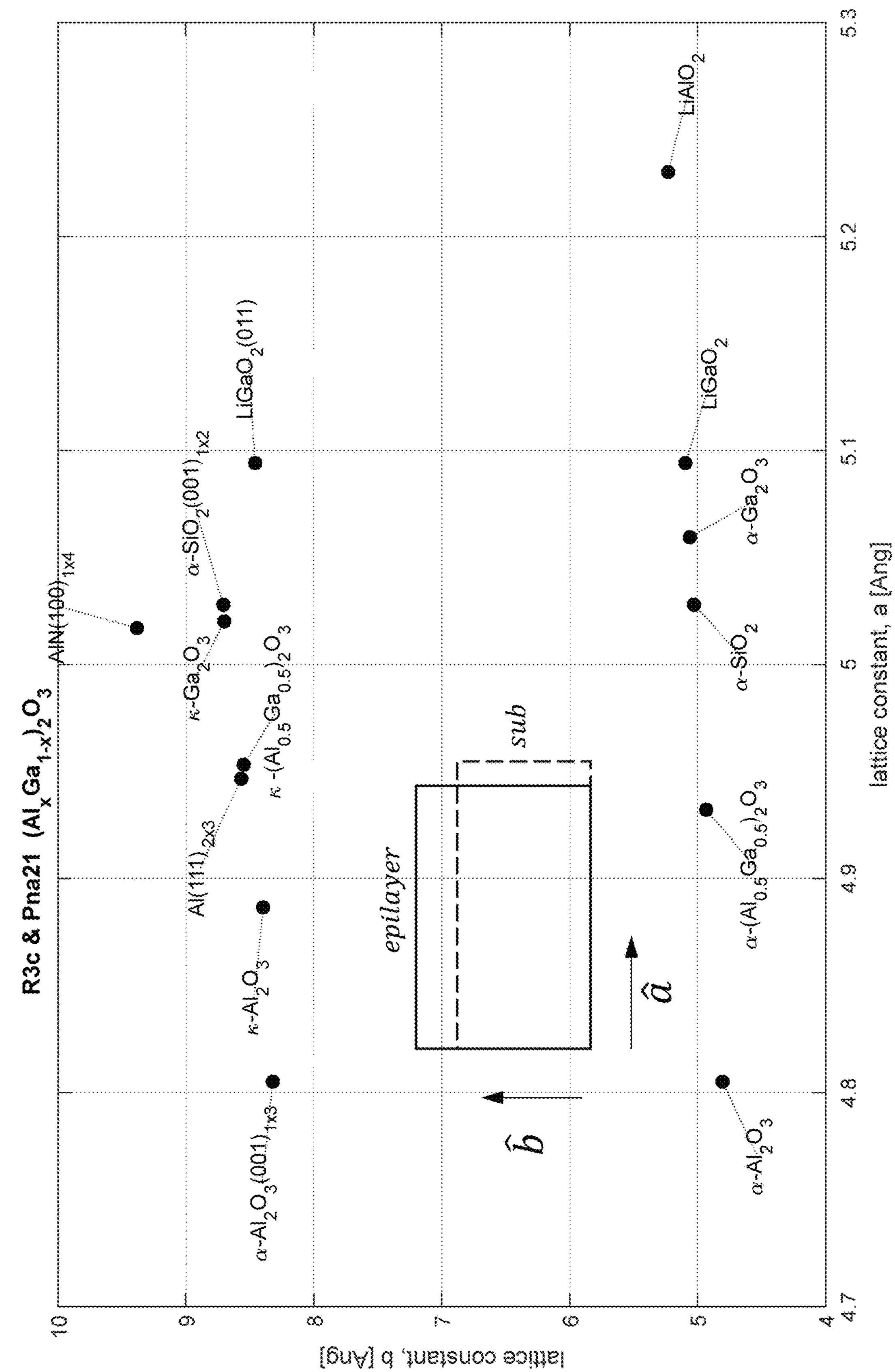

FIG. 201 shows some additional DFT calculated epitaxial oxide materials with possible in-plane lattice constants from about 4.8 Angstroms to about 5.3 Angstroms which in various examples may be substrates for, and/or or form heterostructures with, κ-$Al_xGa_{1-x}O_y$.

Figure 202A:
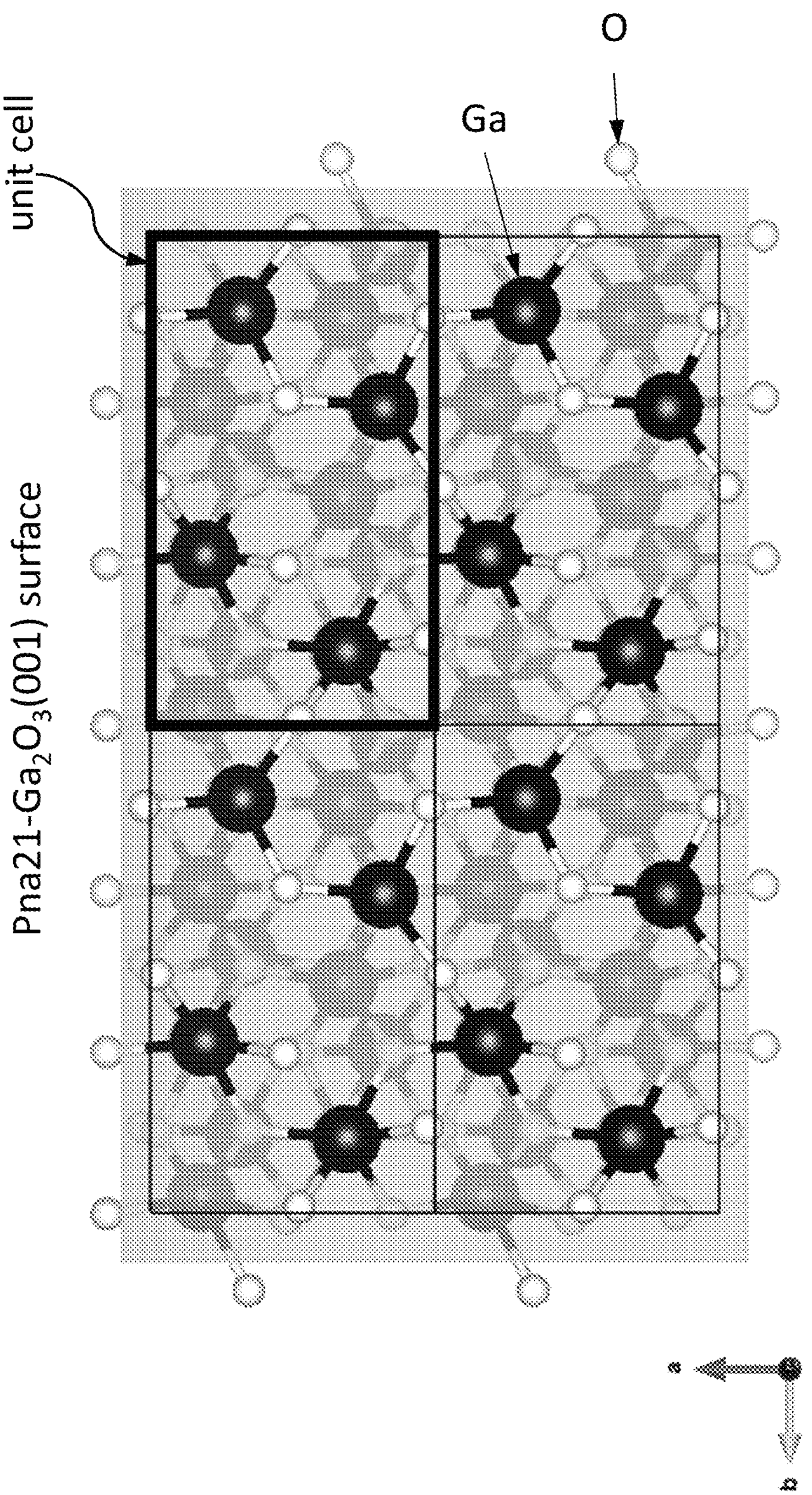

FIG. 202A shows the rectangular array of atoms in the unit cells at the (001) surface of κ-$Ga_2O_3$.

Figure 202B:
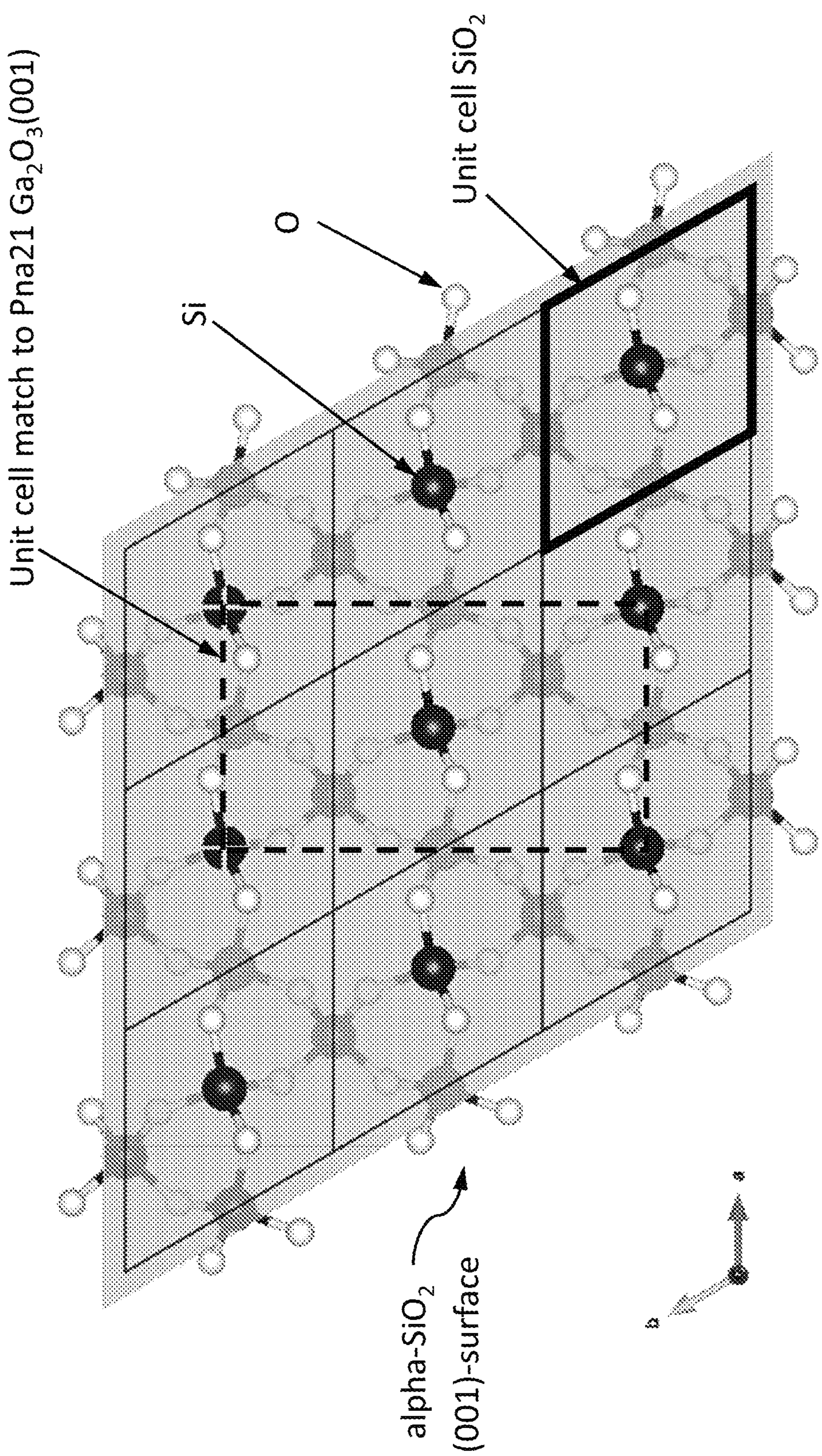

FIG. 202B shows the surface of α-$SiO_2$, with the rectangular unit cell of κ-$Ga_2O_3$(001) overlayed.

Figure 202C:
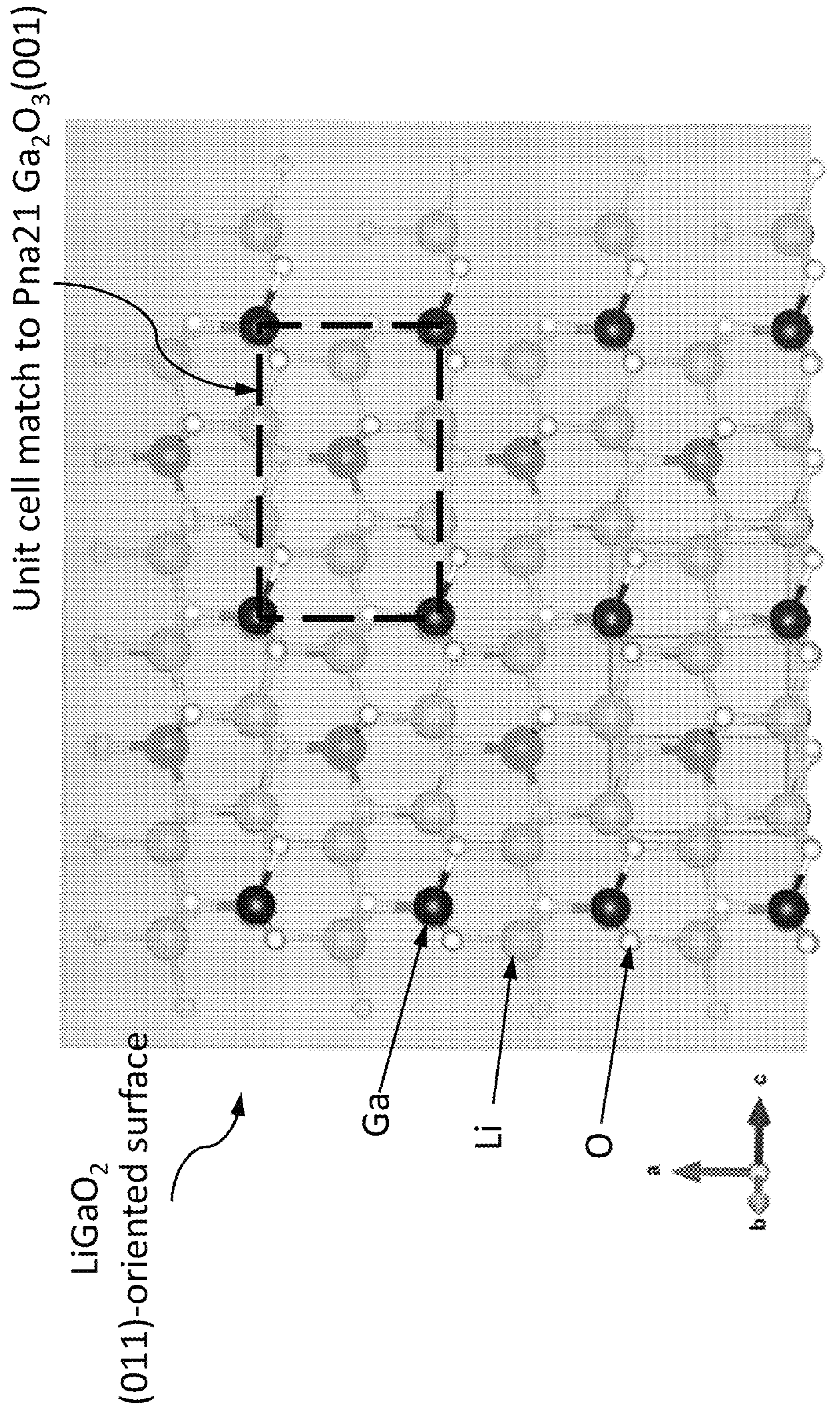

FIG. 202C shows the surface of $LiGaO_2$(011), with the rectangular unit cell of κ-$Ga_2O_3$(001) overlayed.

Figure 202D:
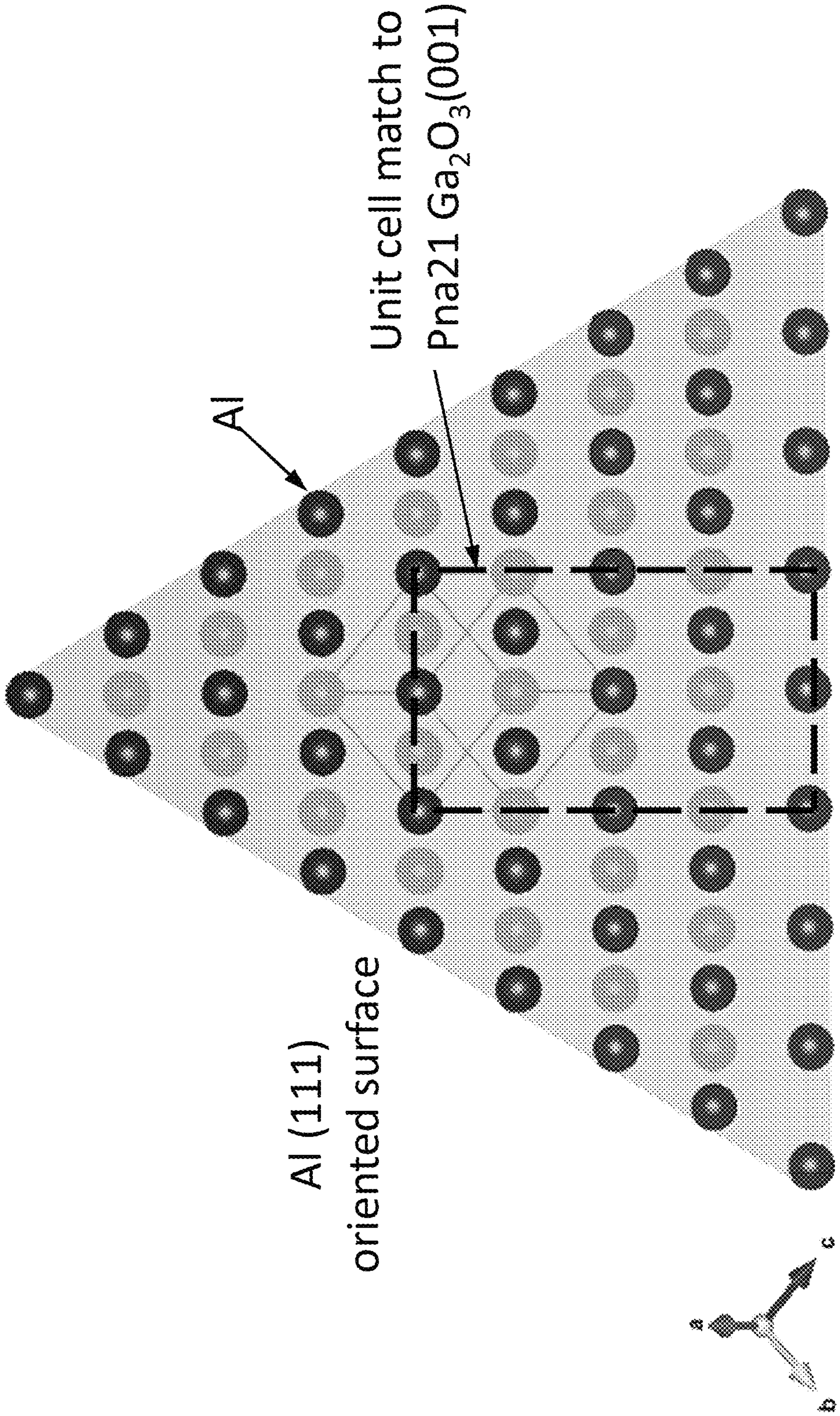

FIG. 202D shows the surface of Al(111), with the rectangular unit cell of κ-$Ga_2O_3$(001) overlayed.

Figure 202E:
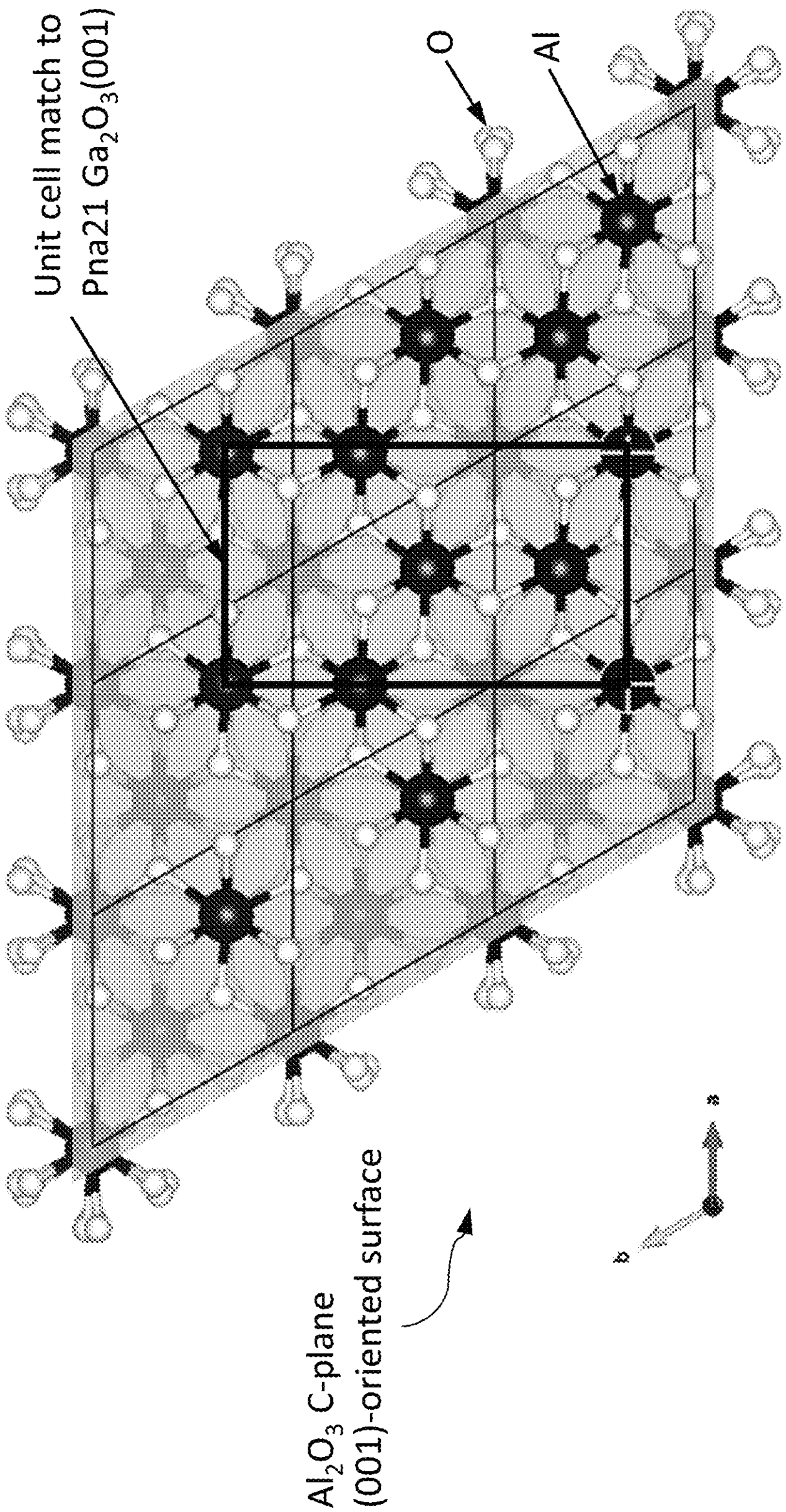

FIG. 202E shows the surface of α-$Al_2O_2$(001) (i.e., C-plane sapphire), with the rectangular unit cell of κ-$Ga_2O_3$ (001) overlayed.

Figure 203:
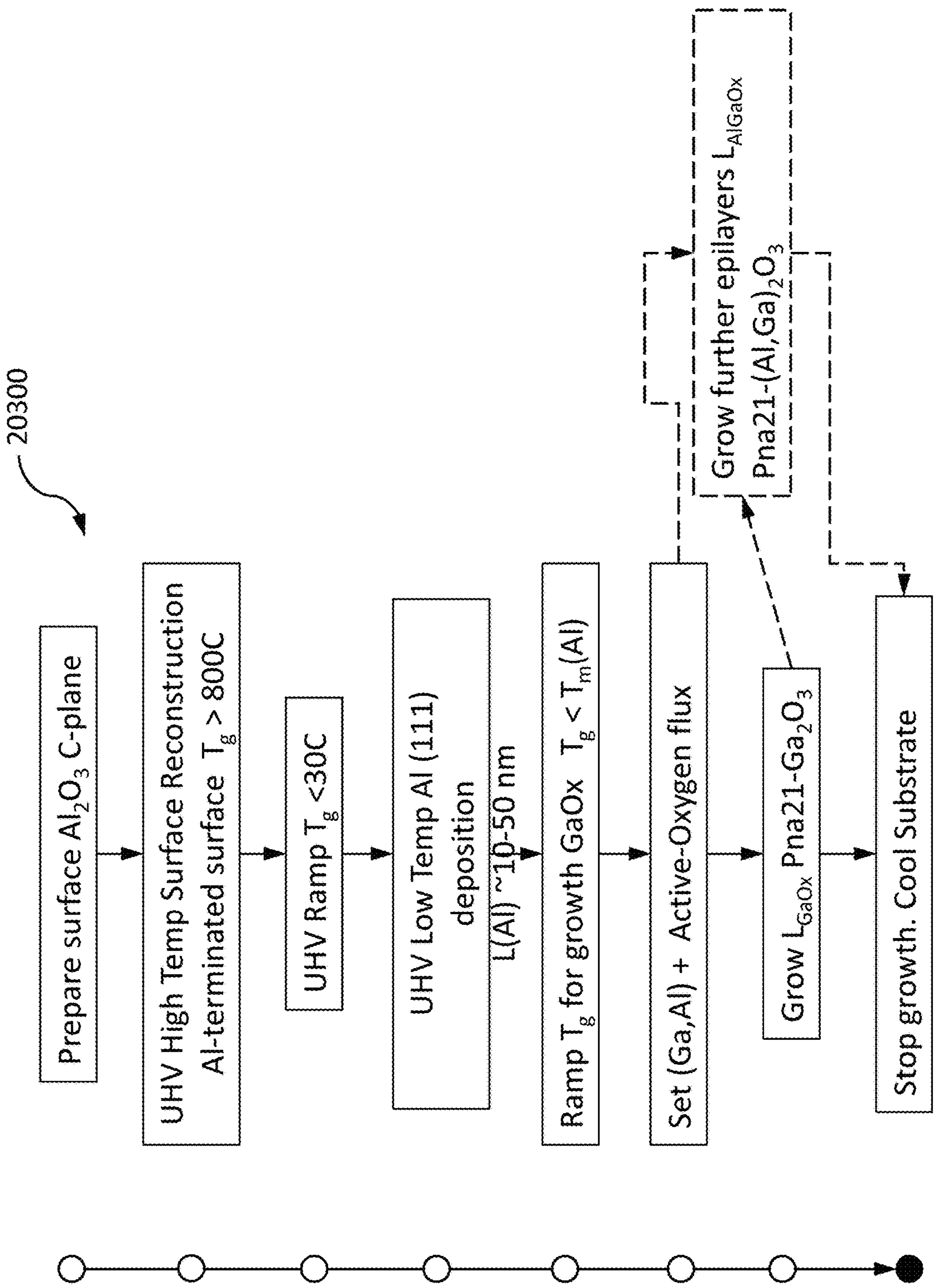

FIG. 203 shows a flowchart of an example method for forming a semiconductor structure comprising κ-$Al_xGa_{1-x}O_y$.

Figure 204A:
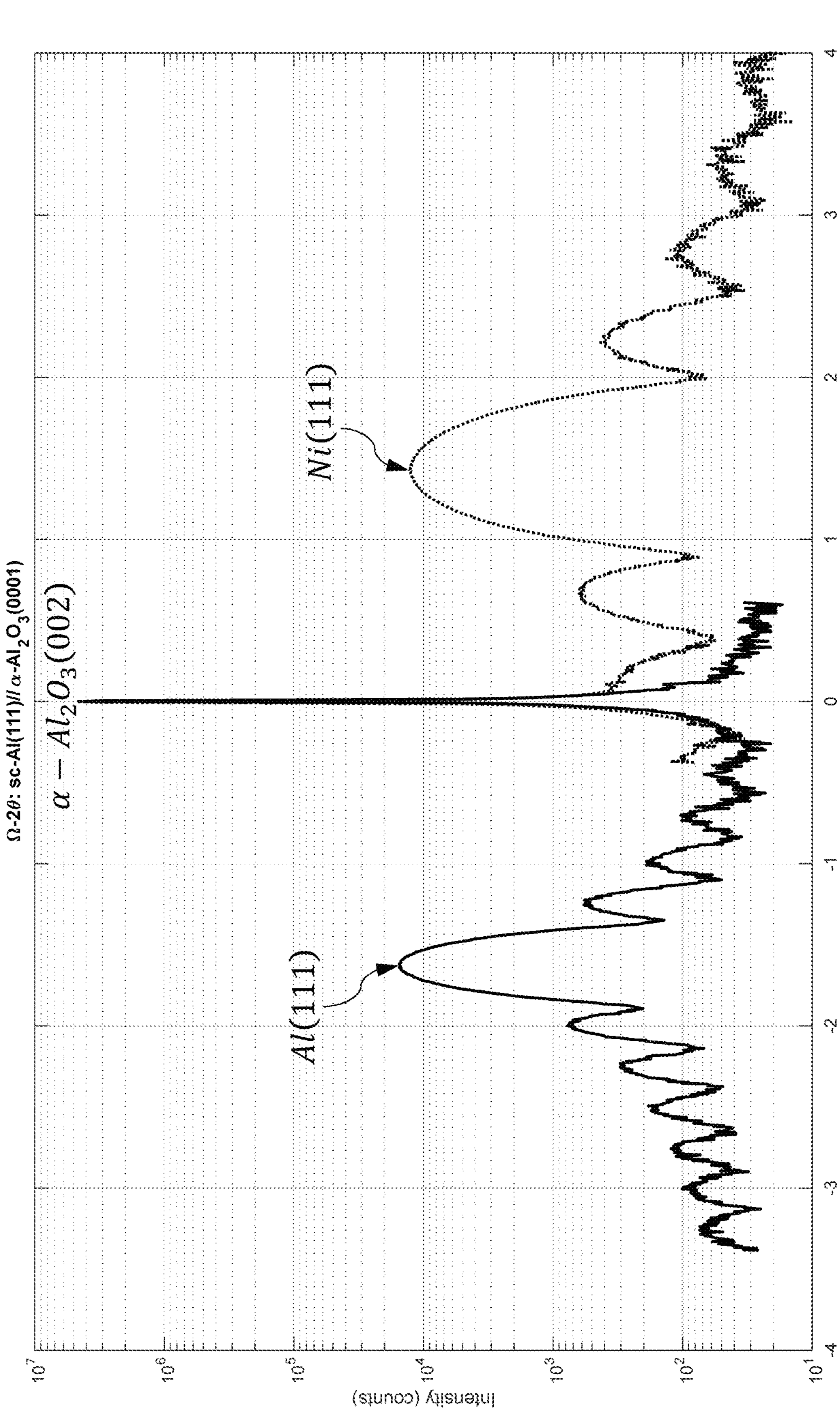

FIG. 204A shows two overlayed experimental XRD scans, one of κ-$Al_2O_3$ grown on an Al(111) template, and the other of κ-$Al_2O_3$ grown on a Ni(111) template.

Figure 204B:
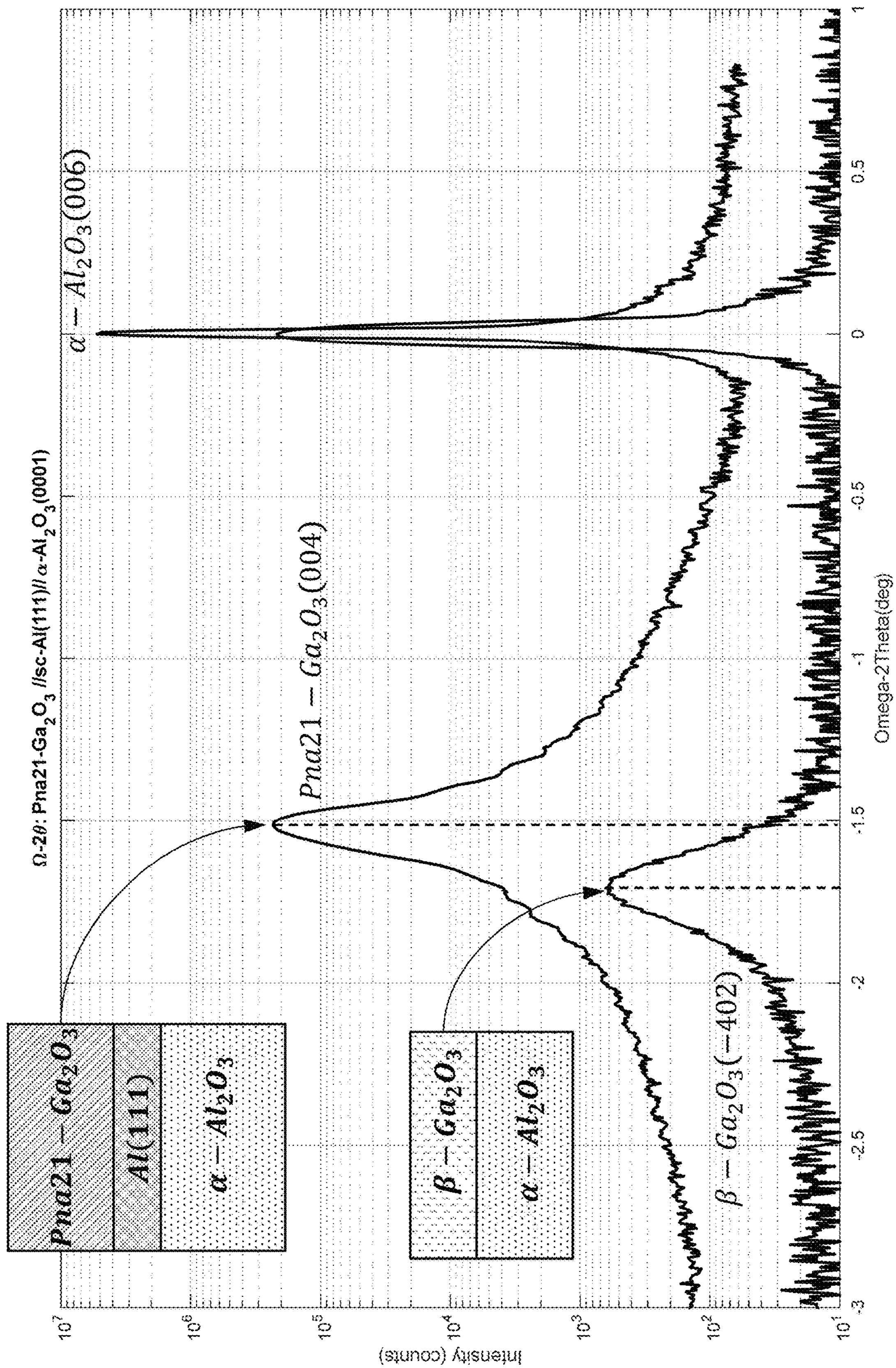

FIG. 204B shows two overlayed experimental XRD scans (shifted in the y-axis) of the structures shown, one including a κ-$Ga_2O_3$ layer grown on an α-$Al_2O_3$ substrate with an Al(111) template layer, and the other a β-$Ga_2O_3$ layer grown on an α-$Al_2O_3$ substrate without a template layer.

Figure 204C:
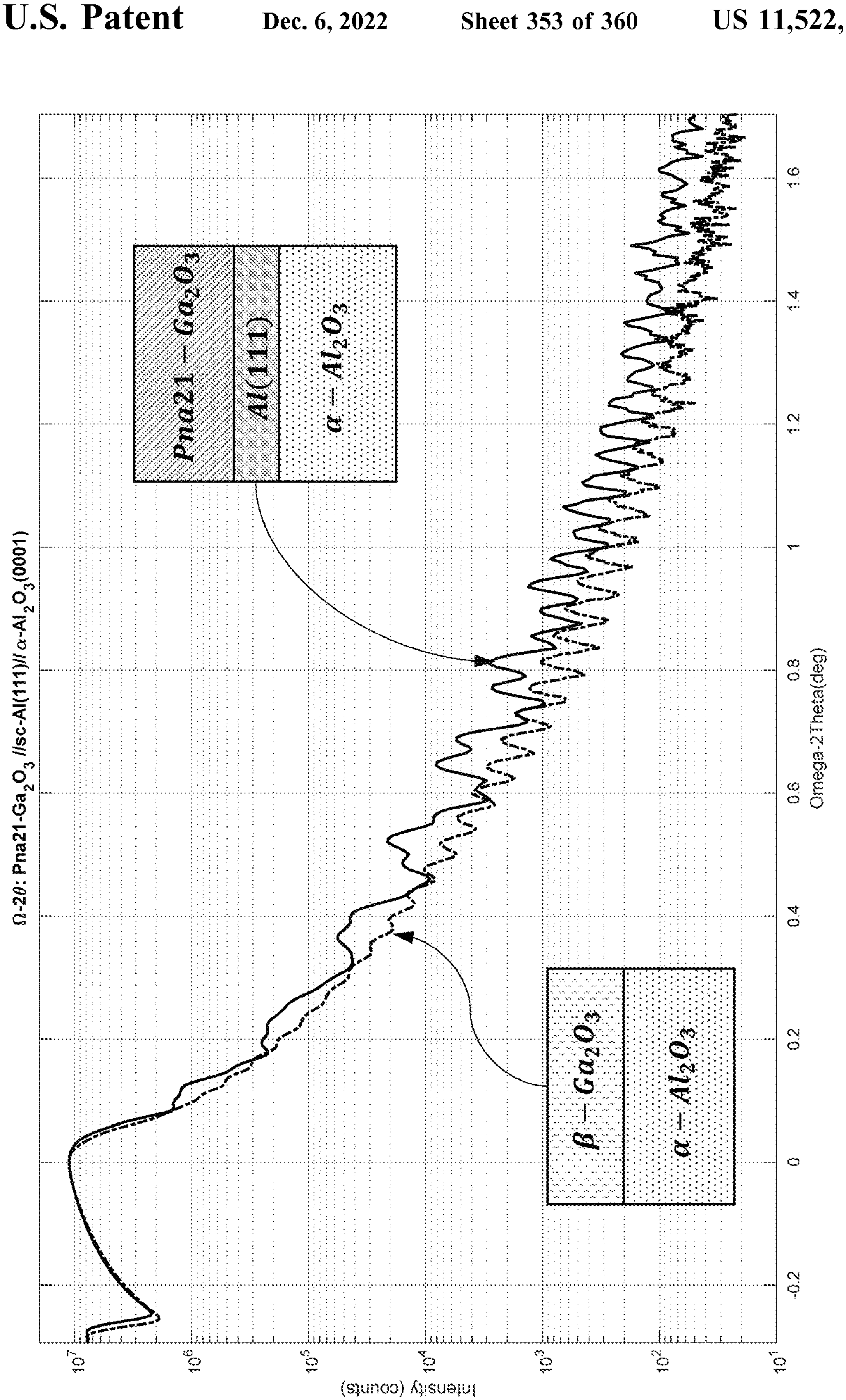

FIG. 204C shows the two overlayed scans from FIG. 204B in high resolution where the fringes due to the high quality of the layers were observed.

Figure 205A:
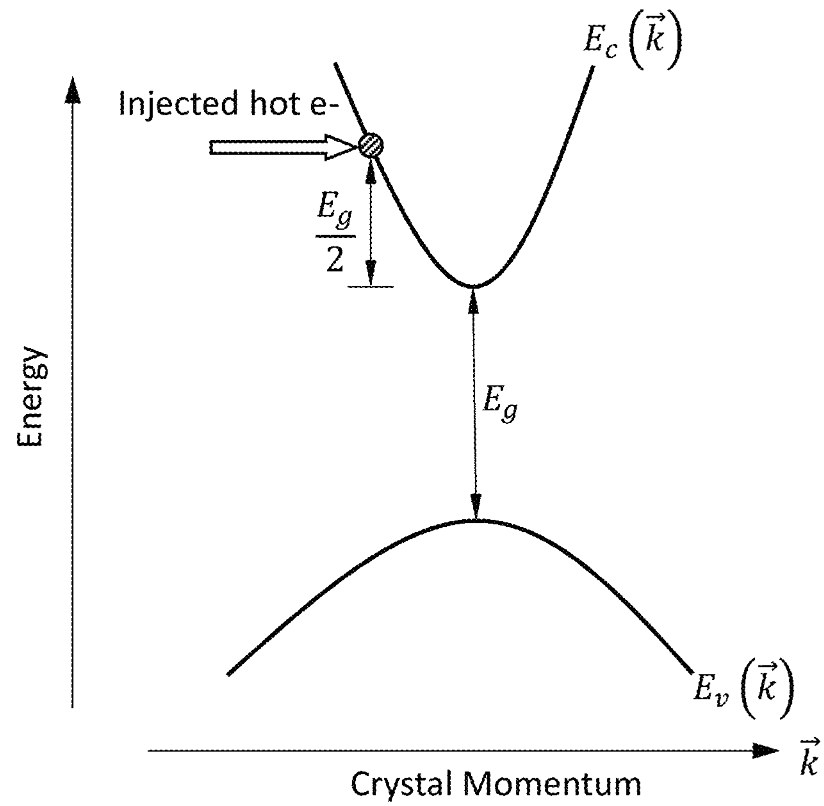
Figure 205B:
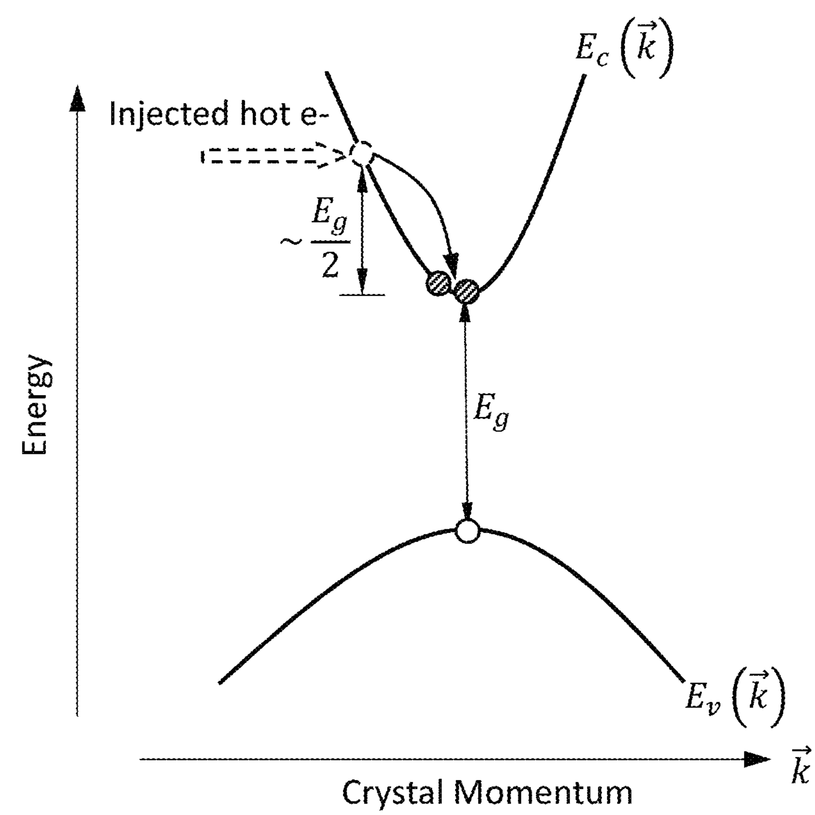

FIGS. 205A and 205B show simplified E-k diagrams in the vicinity of the Brillouin-zone center for an epitaxial oxide material, such as those shown in FIGS. 28, 76A-1, 76A-2 and 76B, showing a process of impact ionization.

Figure 206A:
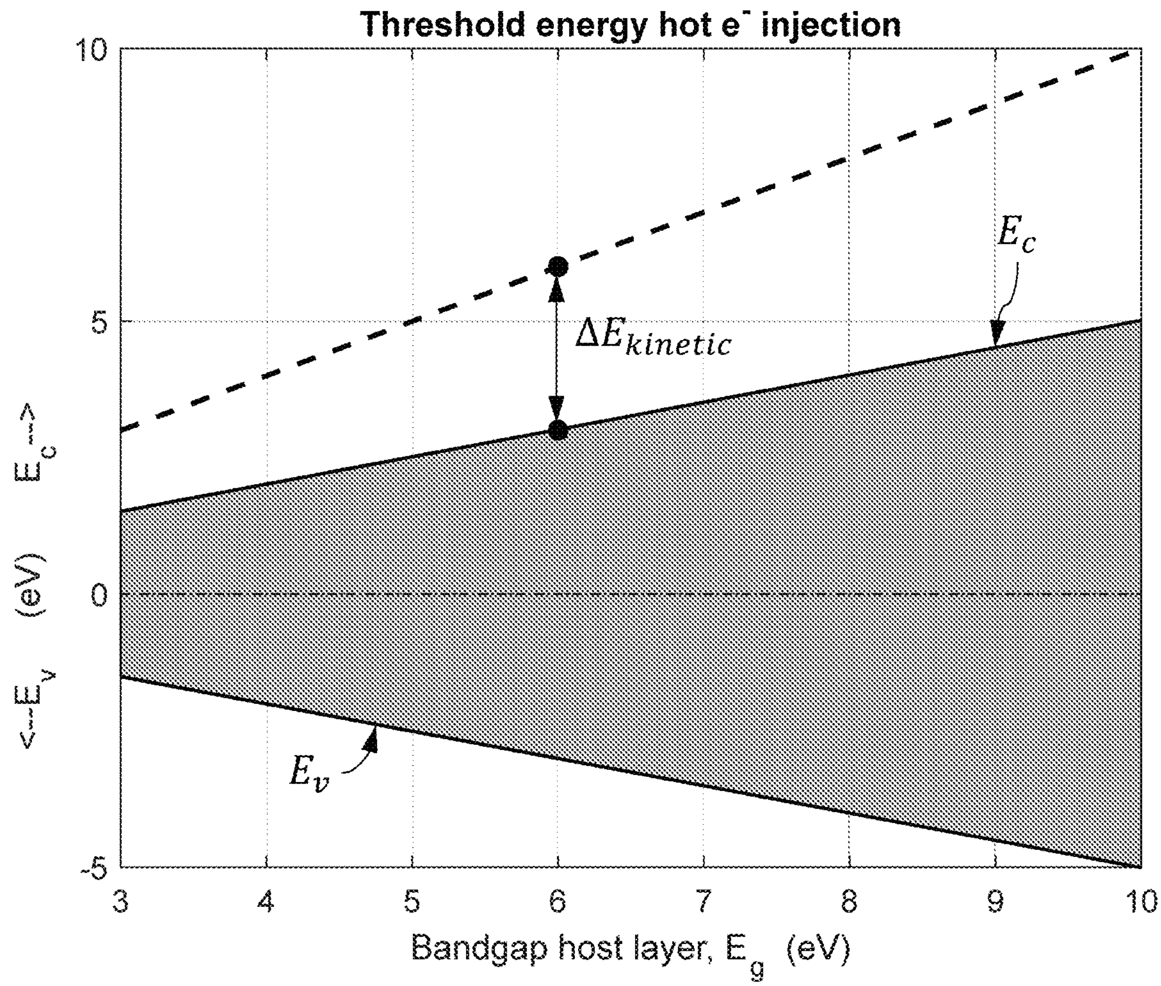

FIG. 206A shows a plot of energy versus bandgap of an epitaxial oxide material (including the conduction band edge, $E_c$, and the valence band edge, $E_v$), where the dotted line shows the approximate threshold energy required by a hot electron to generate an excess electron-hole pair through an impact ionization process.

Figure 206B:
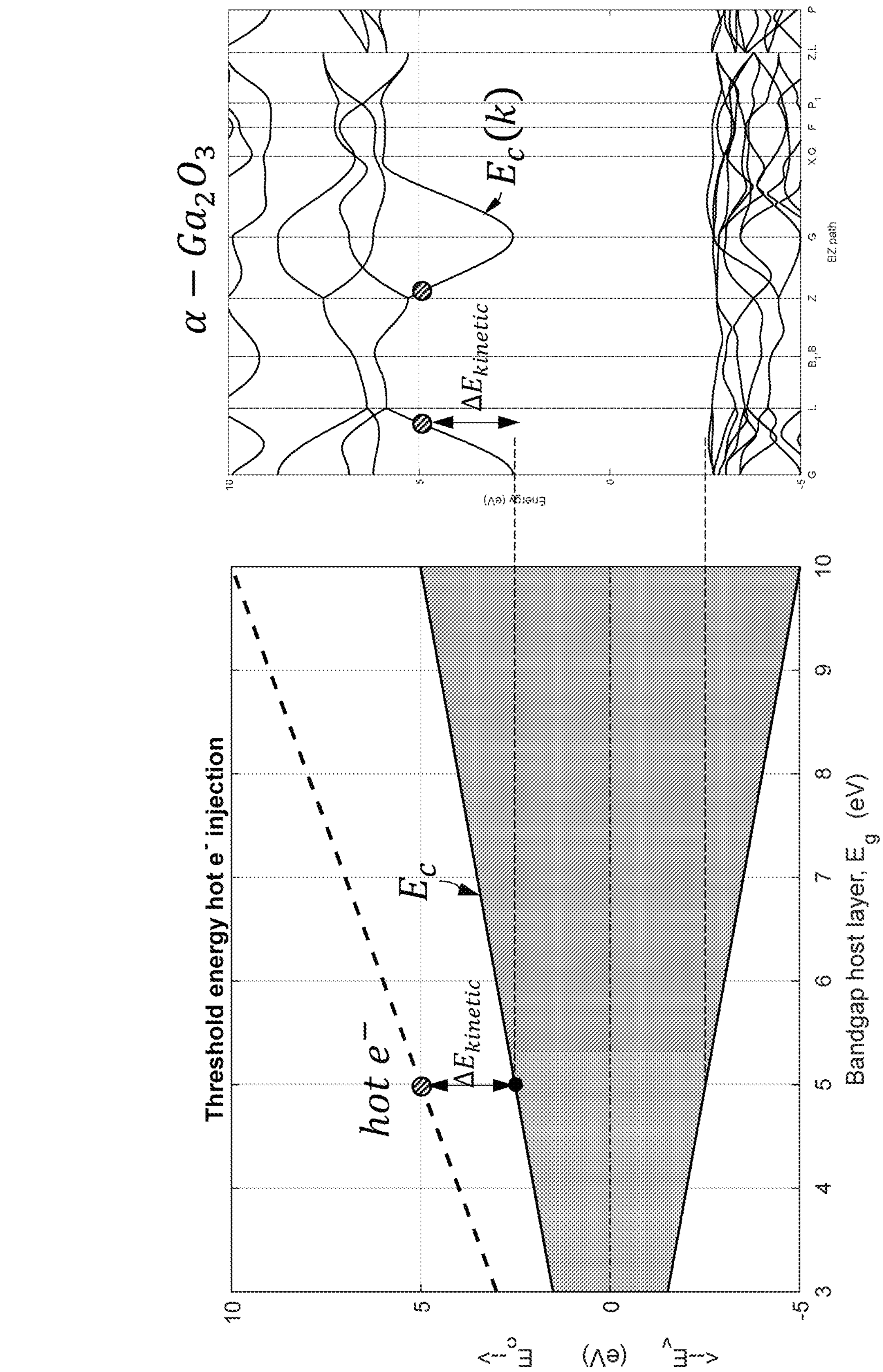

FIG. 206B shows an example using α-$Ga_2O_3$ with a bandgap of about 5 eV.

Figure 207A:
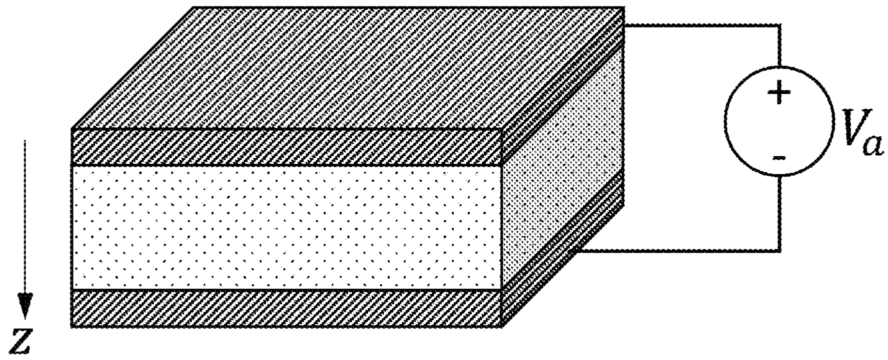

FIG. 207A shows a schematic of an epitaxial oxide material with two planar contact layers (e.g., metals, or highly doped semiconductor contact materials and metal contacts) coupled to an applied voltage, $V_a$.

Figure 207B:
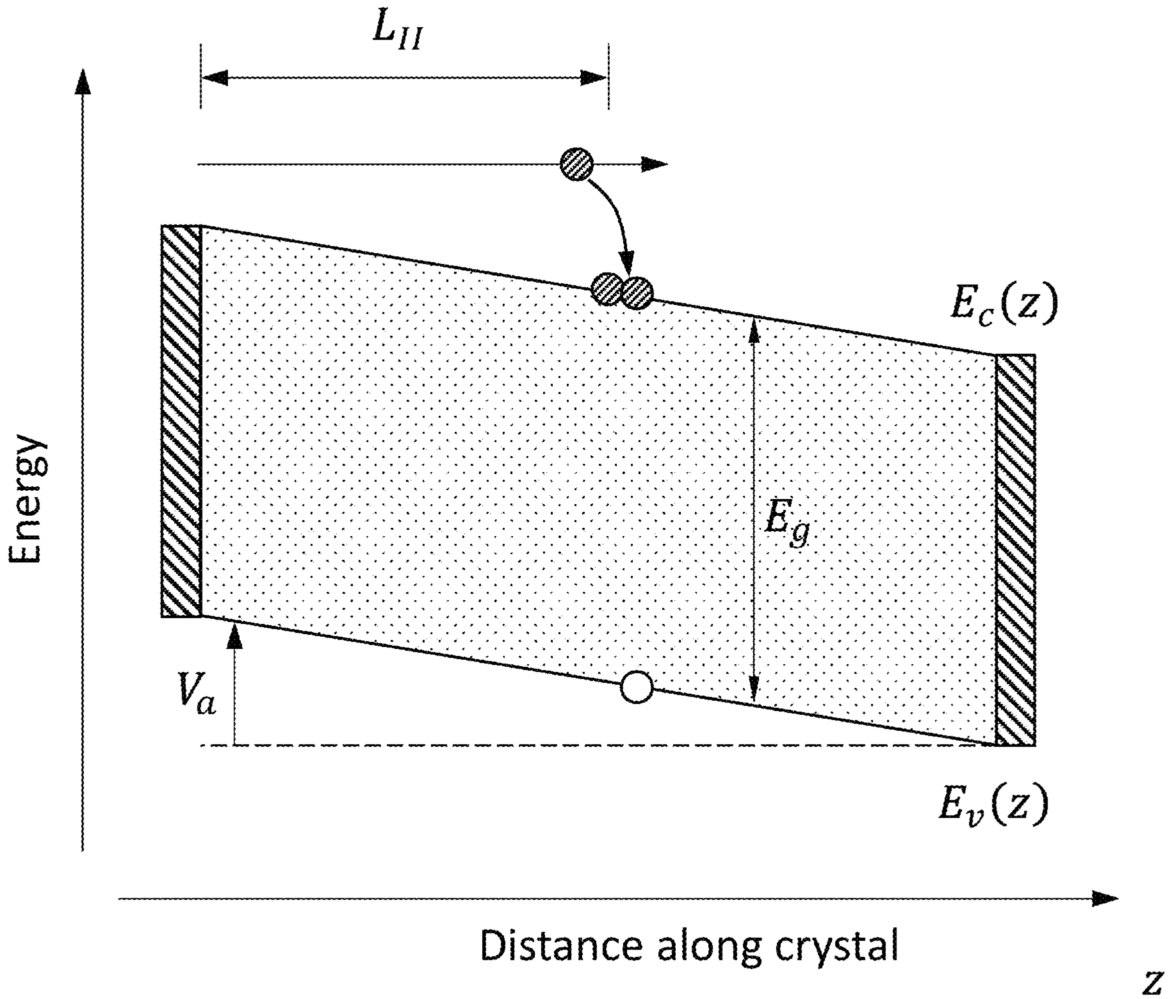

FIG. 207B shows a band diagram of the structure shown in FIG. 207A along the growth ("z") direction of the epitaxial oxide material.

Figure 207C:
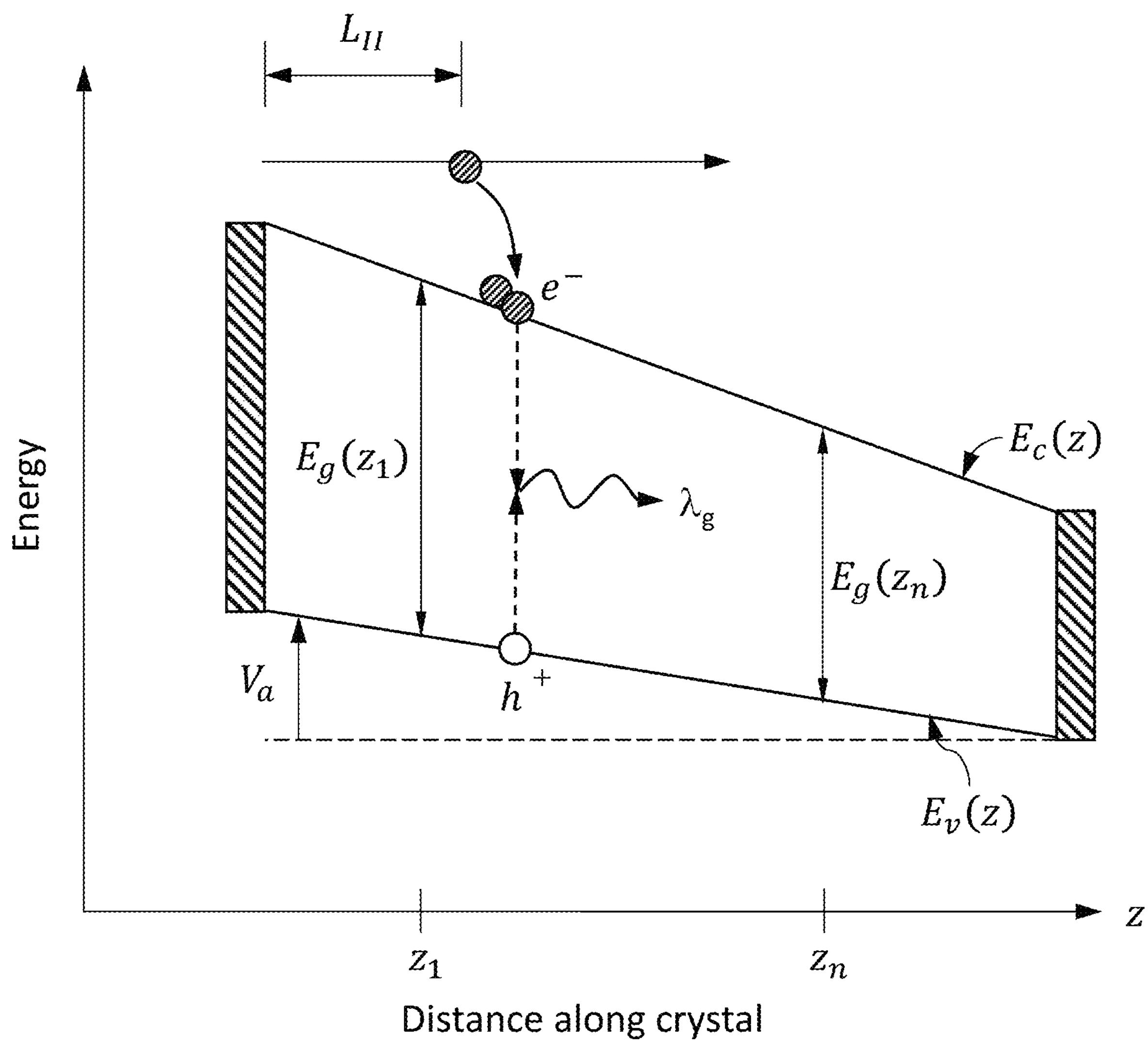

FIG. 207C shows a band diagram of the structure shown in FIG. 207A along the growth ("z") direction of the epitaxial oxide material where the epitaxial oxide has a gradient in bandgap (i.e., a graded bandgap) in the growth "z" direction, $E_c(z)$.

Figure 208:
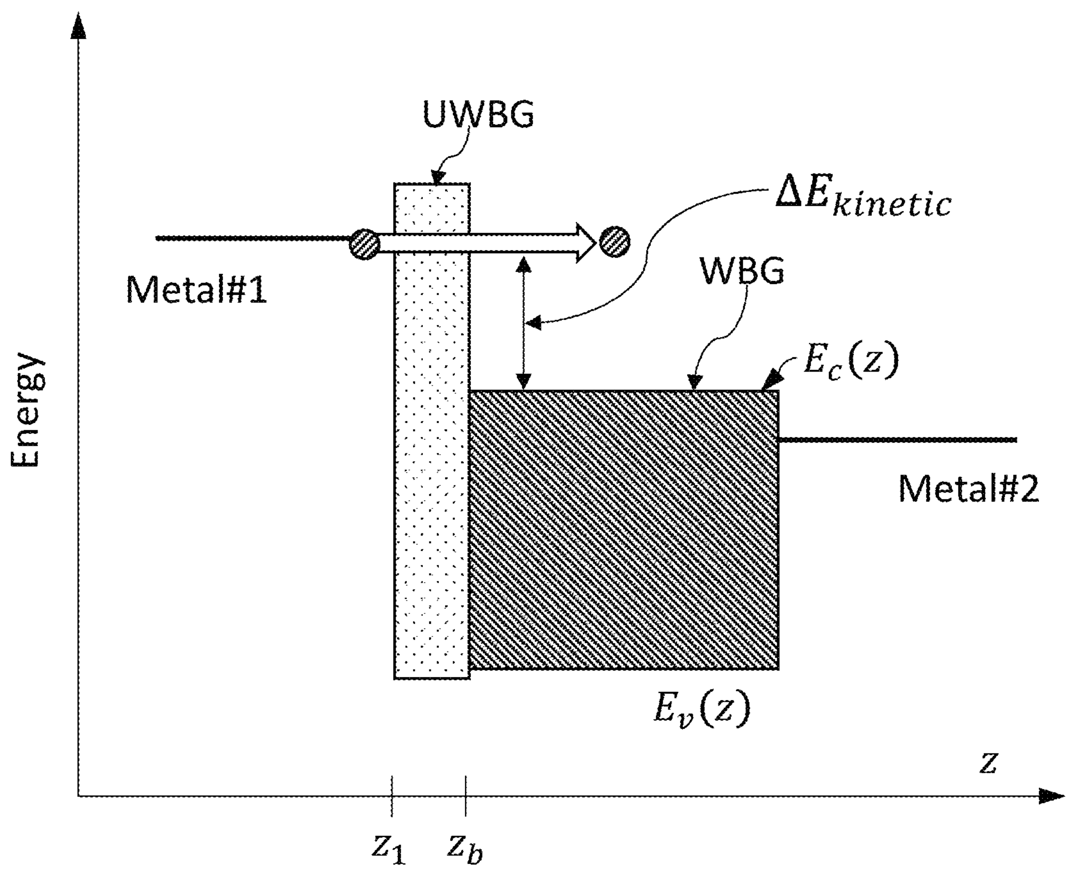

FIG. 208 shows a schematic of an example of an electroluminescent device including a high work function metal ("metal #1"), an ultra-high bandgap ("UWBG") layer, a wide bandgap ("WBG") epitaxial oxide layer, and a second metal contact ("metal #2").

Figure 209A:
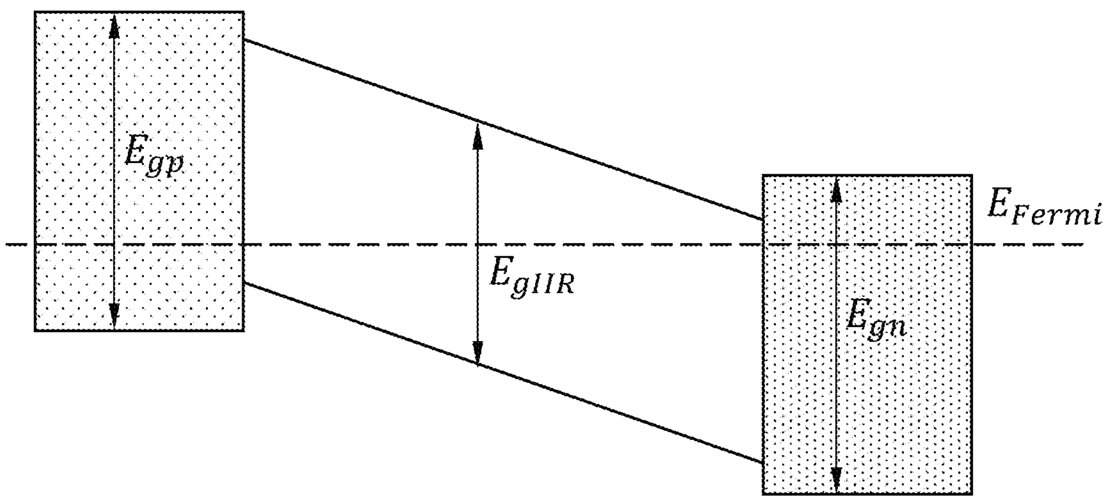
Figure 209B:
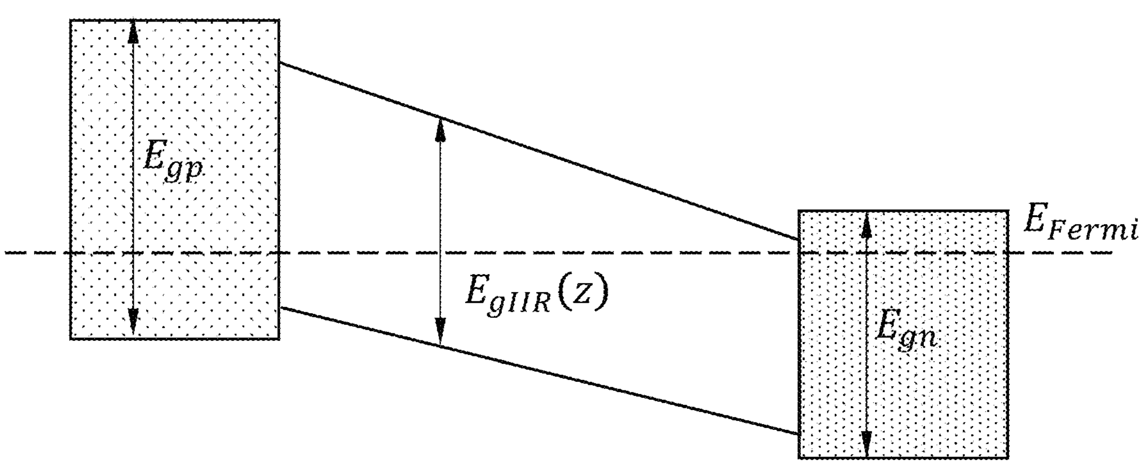

FIGS. 209A and 209B show schematics of examples of electroluminescent devices that are p-i-n diodes including a p-type semiconductor layer, an epitaxial oxide layer that is not intentionally doped (NID) and comprises an impact ionization region (IIR), and an n-type semiconductor layer.

DETAILED DESCRIPTION

Disclosed herein are embodiments of epitaxial oxide materials, with structures and electronic devices including the epitaxial oxide materials. Some embodiments disclose an optoelectronic semiconductor light emitting device that may be configured to emit light having a wavelength in the range of from about 150 nm to about 280 nm. The devices comprise a metal oxide substrate having at least one epitaxial semiconductor metal oxide layer disposed thereon. The substrate may comprise $Al_2O_3$, $Ga_2O_3$, MgO, LiF, $MgAl_2O_4$, $MgGa_2O_4$, $LiGaO_2$, $LiAlO_2$, $(Al_xGa_{1-x})_2O_3$, $MgF_2$, $LaAlO_3$, $TiO_2$ or quartz. In certain embodiments, the one or more of the at least one semiconductor layer comprises at least one of $Al_2O_3$ and $Ga_2O_3$.

In a first aspect, the present disclosure provides an optoelectronic semiconductor light emitting device configured to emit light having a wavelength in the range from about 150 nm to about 280 nm, the device comprising a substrate having at least one epitaxial semiconductor layer disposed thereon, wherein each of the one or more epitaxial semiconductor layers comprises a metal oxide.

In another form, the metal oxide of each of the one or more semiconductor layers is selected from the group consisting of $Al_2O_3$, $Ga_2O_3$, MgO, NiO, $Li_2O$, ZnO, $SiO_2$, $GeO_2$, $Er_2O_3$, $Gd_2O_3$, PdO, $Bi_2O_3$, $IrO_2$, and any combination of the aforementioned metal oxides.

In another form, at least one of the one or more semiconductor layers is a single crystal.

In another form, the at least one of the one or more semiconductor layers has rhombohedral, hexagonal or monoclinic crystal symmetry.

In another form, at least one of the one or more semiconductor layers is composed of a binary metal oxide, wherein the metal oxide is selected from $Al_2O_3$ and $Ga_2O_3$.

In another form, at least one of the one or more semiconductor layers is composed of a ternary metal-oxide composition, and the ternary metal oxide composition comprises at least one of $Al_2O_3$ and $Ga_2O_3$, and, optionally, a metal oxide selected from MgO, NiO, $LiO_2$, ZnO, $SiO_2$, $GeO_2$, $Er_2O_3$, $Gd_2O_3$, PdO, $Bi_2O_3$, and $IrO_2$.

In another form, the at least one of the one or more semiconductor layers is composed of a ternary metal-oxide composition of $(Al_xGa_{1-x})_2O_3$ wherein $0<x<1$.

In another form, the at least one of the one or more semiconductor layers comprises uniaxially deformed unit cells.

In another form, the at least one of the one or more semiconductor layers comprises biaxially deformed unit cells.

In another form, the at least one of the one or more semiconductor layers comprises triaxially deformed unit cells.

In another form, the at least one of the one or more semiconductor layer is composed of a quaternary metal oxide composition, and the quaternary metal oxide composition comprises either: (i) $Ga_2O_3$ and a metal oxide selected from $Al_2O_3$, MgO, NiO, $LiO_2$, ZnO, $SiO_2$, $GeO_2$, $Er_2O_3$, $Gd_2O_3$, PdO, $Bi_2O_3$, and $IrO_2$; or (ii) $Al_2O_3$ and a metal oxide selected from $Ga_2O_3$, MgO, NiO, $LiO_2$, ZnO, $SiO_2$, $GeO_2$, $Er_2O_3$, $Gd_2O_3$, PdO, $Bi_2O_3$, and $IrO_2$.

In another form, the at least one of the one or more semiconductor layers is composed of a quaternary metal oxide composition $(Ni_xMg_{1-x})_yGa_{2(1-y)}O_{3-2y}$ where $0<x<1$ and $0<y<1$.

In another form, the surface of the substrate is configured to enable lattice matching of crystal symmetry of the at least one semiconductor layer.

In another form, the substrate is a single crystal substrate.

In another form, the substrate is selected from $Al_2O_3$, $Ga_2O_3$, MgO, LiF, $MgAl_2O_4$, $MgGa_2O_4$, $LiGaO_2$, $LiAlO_2$, $MgF_2$, $LaAlO_3$, $TiO_2$ and quartz.

In another form, the surface of the substrate has crystal symmetry and in-plane lattice constant matching so as to enable homoepitaxy or heteroepitaxy of the at least one semiconductor layer.

In another form, one or more of the at least one semiconductor layer is of direct bandgap type.

In a second aspect, the present disclosure provides an optoelectronic semiconductor device for generating light of a predetermined wavelength comprising a substrate; and an optical emission region having an optical emission region band structure configured for generating light of the predetermined wavelength and comprising one or more epitaxial metal oxide layers supported by the substrate.

In another form, configuring the optical emission region band structure for generating light of the predetermined wavelength comprises selecting the one or more epitaxial metal oxide layers to have an optical emission region band gap energy capable of generating light of the predetermined wavelength.

In another form, selecting the one or more epitaxial metal oxide layers to have an optical emission region band gap energy capable of generating light of the predetermined wavelength comprises forming the one or more epitaxial metal oxide layers of a binary metal oxide of the form $A_xO_y$ comprising a metal specie (A) combined with oxygen (O) in the relative proportions x and y.

In another form, the binary metal oxide is $Al_2O_3$.

In another form, the binary metal oxide is $Ga_2O_3$.

In another form, the binary metal oxide is selected from the group consisting of MgO, NiO, $LiO_2$, ZnO, $SiO_2$, $GeO_2$, $Er_2O_3$, $Gd_2O_3$, PdO, $Bi_2O_3$ and $IrO_2$.

In another form, selecting the one or more epitaxial metal oxide layers to have an optical emission region band gap energy capable of generating light of the predetermined wavelength comprises forming the one or more epitaxial metal oxide layers of a ternary metal oxide.

In another form, the ternary metal oxide is a ternary metal oxide bulk alloy of the form $A_xB_yO_n$ comprising a metal species (A) and (B) combined with oxygen (O) in the relative proportions x, y and n.

In another form, a relative fraction of the metal specie B to the metal specie A ranges from a minority relative fraction to a majority relative fraction.

In another form, the ternary metal oxide is of the form $A_xBi_{1-x}O_n$ where $0<x<1.0$.

In another form, the metal specie A is Al and metal specie B is selected from the group consisting of: Zn, Mg, Ga, Ni, Rare Earth, Ir Bi, and Li.

In another form, the metal specie A is Ga and metal specie B is selected from the group consisting of: Zn, Mg, Ni, Al, Rare Earth, Ir, Bi and Li.

In another form, the ternary metal oxide is of the form $(Al_xGa_{1-x})_2O_3$, where $0<x<1$. In other forms, x is about 0.1, or about 0.3, or about 0.5.

In another form, the ternary metal oxide is a ternary metal oxide ordered alloy structure formed by sequential deposition of unit cells formed along a unit cell direction and comprising alternating layers of metal specie A and metal specie B having intermediate O layers to form a metal oxide ordered alloy of the form A-O-B-O-A-O-B etc.

In another form, the metal specie A is Al and the metal specie B is Ga, and the ternary metal oxide ordered alloy is of the form Al-O-Ga-O-Al- etc.

In another form, the ternary metal oxide is of the form of a host binary metal oxide crystal with a crystal modification specie.

In another form, the host binary metal oxide crystal is selected from the group consisting of $Ga_2O_3$, $Al_2O_3$, MgO, NiO, ZnO, $Bi_2O_3$, r-$GeO_2$, $Ir_2O_3$, $RE_2O_3$ and $Li_2O$ and the crystal modification specie is selected from the group consisting of Ga, Al, Mg, Ni, Zn, Bi, Ge, Ir, RE and Li.

In another form, selecting the one or more epitaxial metal oxide layers to have an optical emission region band gap energy capable of generating light of the predetermined wavelength comprises forming the one or more epitaxial metal oxide layers as a superlattice comprising two or more layers of metal oxides forming a unit cell and repeating with a fixed unit cell period along a growth direction.

In another form, the superlattice is a bi-layered superlattice comprising repeating layers comprising two different metal oxides.

In another form, the two different metal oxides comprise a first binary metal oxide and a second binary metal oxide.

In another form, the first binary metal oxide is $Al_2O_3$ and the second binary metal oxide is $Ga_2O_3$.

In another form, the first binary metal oxide is NiO and the second binary metal oxide is $Ga_2O_3$.

In another form, the first binary metal oxide is MgO and the second binary metal oxide is NiO.

In another form, the first binary metal oxide is selected from the group consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$ and wherein the second binary metal oxide is selected from the group consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$absent the first selected binary metal oxide.

In another form, the two different metal oxides comprise a binary metal oxide and a ternary metal oxide.

In another form, the binary metal oxide is $Ga_2O_3$ and the ternary metal oxide is $(Al_xGa_{1-x})_2O_3$, where $0<x<1.0$.

In another form, the binary metal oxide is $Ga_2O_3$ and the ternary metal oxide is $Al_xGa_{1-x}O_3$, where $0<x<1.0$.

In another form, the binary metal oxide is $Ga_2O_3$ and the ternary metal oxide is $Mg_xGa_{2(1-x)}O_{3-2x}$, where $0<x<1.0$.

In another form, the binary metal oxide is $Al_2O_3$ and the ternary metal oxide is $(Al_xGa_{1-x})_2O_3$, where $0<x<1.0$.

In another form, the binary metal oxide is $Al_2O_3$ and the ternary metal oxide is $Al_xGa_{1-x}O_3$, where $0<x<1.0$.

In another form, the binary metal oxide is $Al_2O_3$ and the ternary metal oxide is $(Al_xEr_{1-x})_2O_3$.

In another form, the ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, where $0<x<1.0$.

In another form, the binary metal oxide is selected from the group consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$.

In another form, the two different metal oxides comprise a first ternary metal oxide and a second ternary metal oxide.

In another form, the first ternary metal oxide is $Al_xGa_{1-x}O$ and the second ternary metal oxide is $(Al_xGa_{1-x})_2O_3$ or $Al_yGa_{1-y}O_3$ where $0<x<1$ and $0<y<1$.

In another form, the first ternary metal oxide is $(Al_xGa_{1-x})_2O_3$ and the second ternary metal oxide is $(Al_yGa_{1-y})_2O_3$, where $0<x<1$ and $0<y<1$.

In another form, the first ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, and wherein the second ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$ absent the first selected ternary metal oxide, where $0<x<1.0$.

In another form, the superlattice is a tri-layered superlattice comprising repeating layers of three different metal oxides.

In another form, the three different metal oxides comprise a first binary metal oxide, a second binary metal oxide and a third binary metal oxide.

In another form, the first binary metal oxide is MgO, the second binary metal oxide is NiO and the third binary metal oxide $Ga_2O_3$.

In another form, the first binary metal oxide is selected from the group consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$, and wherein the second binary metal oxide is selected from the group $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$ absent the first selected binary metal oxide, and wherein the third binary metal oxide is selected from the group $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$ absent the first and second selected binary metal oxides.

In another form, the three different metal oxides comprise a first binary metal oxide, a second binary metal oxide and a ternary metal oxide.

In another form, the first binary metal oxide is selected from the group consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$, and wherein the second binary metal oxide is selected from the group consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$ absent the first selected binary metal oxide, and wherein the ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, where $0<x<1$.

In another form, the three different metal oxides comprise a binary metal oxide, a first ternary metal oxide and a second ternary metal oxide.

In another form, the binary metal oxide is selected from the group consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$ and $IrO_2$, and wherein the first ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, and wherein the second ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$ absent the first selected ternary metal oxide, where $0<x<1$.

In another form, the three different metal oxides comprise a first ternary metal oxide, a second ternary metal oxide and a third ternary metal oxide.

In another form, the first ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, and wherein the second ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$ absent the first selected ternary metal oxide, and wherein the third ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$ absent the first and second selected ternary metal oxides, where $0<x<1$.

In another form, the superlattice is a quad-layered superlattice comprising repeating layers of at least three different metal oxides.

In another form, the superlattice is a quad-layered superlattice comprising repeating layers of three different metal oxides, and a selected metal oxide layer of the three different metal oxides is repeated in the quad-layered superlattice.

In another form, the three different metal oxides comprise a first binary metal oxide, a second binary metal oxide and a third binary metal oxide.

In another form, the first binary metal oxide is MgO, the second binary metal oxide is NiO and the third binary metal oxide is $Ga_2O_3$ forming a quad-layer superlattice comprising MgO-$Ga_2O_3$-NiO-$Ga_2O_3$ layers.

In another form, the three different metal oxides are selected from the group of consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$, $IrO_2$, $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, where 0<x<1.0.

In another form, the superlattice is a quad-layered superlattice comprising repeating layers of four different metal oxides.

In another form, the four different metal oxides are selected from the group of consisting of $Al_2O_3$, $Ga_2O_3$, MgO, NiO, $LiO_2$, ZnO, $SiO_2$, $GeO_2$, $Er_2O_3$, $Gd_2O_3$, PdO, $Bi_2O_3$, $IrO_2$, $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, where 0<x<1.0.

In another form, respective individual layers of the two or more metal oxide layers forming the unit cell of the superlattice have a thickness less than or approximately equal to an electron de Broglie wavelength in that respective individual layer.

In another form, configuring the optical emission region band structure for generating light of the predetermined wavelength comprises modifying an initial optical emission region band structure of the one or more epitaxial metal oxide layers on forming the optoelectronic device.

In another form, modifying the initial optical emission region band structure of the one or more epitaxial metal oxide layers on forming the optoelectronic device comprises introducing a predetermined strain to the one or more epitaxial metal oxide layers during epitaxial deposition of the one or more epitaxial metal oxide layers.

In another form, the predetermined strain is introduced to modify the initial optical emission region band structure from an indirect band gap to a direct band gap.

In another form, the predetermined strain is introduced to modify an initial bandgap energy of the initial optical emission region band structure.

In another form, the predetermined strain is introduced to modify an initial valence band structure of the initial optical emission region band structure.

In another form, modifying the initial valence band structure comprises raising or lowering a selected valence band with respect to the Fermi energy level of the optical emission region.

In another form, modifying the initial valence band structure comprises modifying the shape of the valence band structure to change localization characteristics of holes formed in the optical emission region.

In another form, introducing the predetermined strain to the one or more epitaxial metal oxide layers comprises selecting a to be strained metal oxide layer having a composition and crystal symmetry type which, when epitaxially formed on an underlying layer having a underlying layer composition and crystal symmetry type, will introduce the predetermined strain into the to be strained metal oxide layer.

In another form, the predetermined strain is a biaxial strain.

In another form, the underlying layer is a metal oxide having a first crystal symmetry type and the to be strained metal oxide layer also has the first crystal symmetry type but with a different lattice constant to introduce the biaxial strain into the to be strained metal oxide layer.

In another form, the underlying layer of metal oxide is $Ga_2O_3$ and the to be strained metal oxide layer is $Al_2O_3$, and biaxial compression is introduced into the $Al_2O_3$ layer.

In another form, the underlying layer of metal oxide is $Al_2O_3$ and the to be strained layer of metal oxide is $Ga_2O_3$, and biaxial tension is introduced into the $Ga_2O_3$ layer.

In another form, the predetermined strain is a uniaxial strain.

In another form, the underlying layer has a first crystal symmetry type having asymmetric unit cells.

In another form, the to be strained metal oxide layer is monoclinic $Ga_2O_3$, $Al_xGa_{1-x}O$ or $Al_2O_3$, where x<0<1.

In another form, the underlying layer and the to be strained layer form layers in a superlattice.

In another form, modifying an initial optical emission region band structure of the one or more epitaxial metal oxide layers on forming the optoelectronic device comprises introducing a predetermined strain to the one or more epitaxial metal oxide layers following epitaxial deposition of the one or more epitaxial metal oxide layers.

In another form, the optoelectronic device comprises a first conductivity type region comprising one or more epitaxial metal oxide layers having a first conductivity type region band structure configured to operate in combination with the optical emission region to generate light of the predetermined wavelength.

In another form, configuring the first conductivity type region band structure to operate in combination with the optical emission region to generate light of the predetermined wavelength comprises selecting a first conductivity type region energy band gap greater than the optical emission region energy band gap.

In another form, configuring the first conductivity type region band structure to operate in combination with the optical emission region to generate light of the predetermined wavelength comprises selecting the first conductivity type region to have an indirect bandgap.

In another form, configuring the first conductivity type region band structure comprises one or more of: selecting an appropriate metal oxide material or materials in line with the principles and techniques considered in the present disclosure in relation to the optical emission region; forming a superlattice in line with the principles and techniques considered in the present disclosure in relation to the optical emission region; and/or modifying the first conductivity type region band structure by applying strain in line with the principles and techniques considered in the present disclosure in relation to the optical emission region.

In another form, the first conductivity type region is a n-type region.

In another form, the optoelectronic device comprises a second conductivity type region comprising one or more epitaxial metal oxide layers having a second conductivity type region band structure configured to operate in combination with the optical emission region and the first conductivity type region to generate light of the predetermined wavelength.

In another form, configuring the second conductivity type region band structure to operate in combination with the optical emission region to generate light of the predetermined wavelength comprises selecting a second conductivity type region energy band gap greater than the optical emission region energy band gap.

In another form, configuring the second conductivity type region band structure to operate in combination with the optical emission region to generate light of the predetermined wavelength comprises selecting the second conductivity type region to have an indirect bandgap.

In another form, configuring the second conductivity type region band structure comprises one or more of: selecting an appropriate metal oxide material or materials in line with the principles and techniques considered in the present disclosure in relation to the optical emission region; forming a superlattice in line with the principles and techniques considered in the present disclosure in relation to the optical emission region; and/or modifying the first conductivity type region band structure by applying strain in line with the principles and techniques considered in the present disclosure in relation to the optical emission region.

In another form, the second conductivity type region is a p-type region.

In another form, the substrate is formed from a metal oxide.

In another form, the metal oxide is selected from the group consisting of $Al_2O_3$, $Ga_2O_3$, MgO, LiF, $MgAl_2O_4$, $MgGa_2O_4$, $LiGaO_2$, $LiAlO_2$, $(Al_xGa_{1-x})_2O_3$, $LaAlO_3$, $TiO_2$ and quartz.

In another form, the substrate is formed from a metal fluoride.

In another form, the metal fluoride is $MgF_2$ or LiF.

In another form, the predetermined wavelength is in the wavelength range of 150 nm to 700 nm.

In another form, the predetermined wavelength is in the wavelength range of 150 nm to 280 nm.

In a third aspect, the present disclosure provides a method for forming an optoelectronic semiconductor device configured to emit light having a wavelength in the range from about 150 nm to about 280 nm, the method comprising: providing a metal oxide substrate having an epitaxial growth surface; oxidizing the epitaxial growth surface to form an activated epitaxial growth surface; and exposing the activated epitaxial growth surface to one or more atomic beams each comprising high purity metal atoms and one or more atomic beams comprising oxygen atoms under conditions to deposit two or more epitaxial metal oxide films.

In another form, the metal oxide substrate comprises an Al or a Ga metal oxide substrate.

In another form, the one or more atomic beams each comprising high purity metal atoms comprise any one or more of the metals selected from the group consisting of Al, Ga, Mg, Ni, Li, Zn, Si, Ge, Er, Y, La, Pr, Gd, Pd, Bi, Ir, and any combination of the aforementioned metals.

In another form, the one or more atomic beams each comprising high purity metal atoms comprise any one or more of the metals selected from the group consisting of Al and Ga, and the epitaxial metal oxide films comprise $(Al_xGa_{1-x})_2O_3$, wherein $0 \leq x \leq 1$.

In another form, the conditions to deposit two or more epitaxial metal oxide films comprise exposing the activated epitaxial growth surface to atomic beams comprising high purity metal atoms and atomic beams comprising oxygen atoms at an oxygen:total metal flux ratio of >1.

In another form, at least one of the two or more epitaxial metal oxide films provides a first conductivity type region comprising one or more epitaxial metal oxide layers, and at least another of the two or more epitaxial metal oxide films provides a second conductivity type region comprising one or more epitaxial metal oxide layers.

In another form, at least one of the two or more epitaxial $(Al_xGa_{1-x})_2O_3$ films provides a first conductivity type region comprising one or more epitaxial $(Al_xGa_{1-x})_2O_3$ layers, and at least another of the two or more epitaxial $(Al_xGa_{1-x})_2O_3$ films provides a second conductivity type region comprising one or more epitaxial $(Al_xGa_{1-x})_2O_3$ layers.

In another form, the substrate is treated prior to the oxidizing step by high temperature (>800° C.) desorption in an ultrahigh vacuum chamber (less than $5\times10^{-10}$ Torr) to form an atomically flat epitaxial growth surface.

In another form, the method further comprises monitoring the surface in real-time to assess atomic surface quality.

In another form, the surface is monitored in real-time by reflection high energy electron diffraction (RHEED).

In another form, oxidizing the epitaxial growth surface comprises exposing the epitaxial growth surface to an oxygen source under conditions to oxidize the epitaxial growth surface.

In another form, the oxygen source is selected from one or more of the group consisting of an oxygen plasma, ozone and nitrous oxide.

In another form, the oxygen source is radiofrequency inductively coupled plasma (RF-ICP).

In another form, the method further comprises monitoring the surface in real-time to assess surface oxygen density.

In another form, the surface is monitored in real-time by RHEED.

In another form, the atomic beams comprising high purity Al atoms and/or high purity Ga atoms are each provided by effusion cells comprising inert ceramic crucibles radiatively heated by a filament and controlled by feedback sensing to monitor the metal melt temperature within the crucible.

In another form, high purity elemental metals of 6N to 7N or higher purity are used.

In another form, the method further comprises measuring the beam flux of each Al and/or Ga and oxygen atomic beam to determine the relative flux ratio prior to exposing the activated epitaxial growth surface to the atomic beams at the determined relative flux ratio.

In another form, the method further comprises rotating the substrate as the activated epitaxial growth surface is exposed to the atomic beams so as to accumulate a uniform amount of atomic beam intersecting the substrate surface for a given amount of deposition time.

In another form, the method further comprises heating the substrate as the activated epitaxial growth surface is exposed to the atomic beams.

In another form, the substrate is heated radiatively from behind using a blackbody emissivity matched to the below bandgap absorption of the metal oxide substrate.

In another form, the activated epitaxial growth surface is exposed to the atomic beams in a vacuum of from about $1\times10^{-6}$ Torr to about $1\times10^{-5}$ Torr.

In another form, Al and Ga atomic beam fluxes at the substrate surface are from about $1\times10^{-8}$ Torr to about $1\times10^{-6}$ Torr.

In another form, oxygen atomic beam fluxes at the substrate surface are from about $1\times10^{-7}$ Torr to about $1\times10^{-5}$ Torr.

In another form, the Al or Ga metal oxide substrate is A-plane sapphire.

In another form, the Al or Ga metal oxide substrate is monoclinic $Ga_2O_3$.

In another form, the two or more epitaxial $(Al_xGa_{1-x})_2O_3$ films comprise corundum type $AlGaO_3$.

In another form, $x \leq 0.5$ for each of the two or more epitaxial $(Al_xGa_{1-x})_2O_3$ films.

In a fourth aspect, the present disclosure provides a method for forming a multilayer semiconducting device comprising: forming a first layer having a first crystal symmetry type and a first composition; and depositing in a non-equilibrium environment a metal oxide layer having a second crystal symmetry type and a second composition onto the first layer, wherein depositing the second layer onto the first layer comprises initially matching the second crystal symmetry type to the first crystal symmetry type.

In another form, initially matching the second crystal symmetry type to the first crystal symmetry type comprises matching a first lattice configuration of the first crystal symmetry type with a second lattice configuration of the second crystal symmetry at a horizontal planar growing interface.

In another form, matching the first and second crystal symmetry types comprise substantially matching respective end plane lattice constants of the first and second lattice configurations.

In another form, the first layer is corundum $Al_2O_3$ (sapphire) and the metal oxide layer is corundum $Ga_2O_3$.

In another form, the first layer is monoclinic $Al_2O_3$ and the metal oxide layer is monoclinic $Ga_2O_3$.

In another form, the first layer is R-plane corundum $Al_2O_3$ (sapphire) prepared under O-rich growth conditions and the metal oxide layer is corundum $AlGaO_3$ selectively grown at low temperatures (<550° C.).

In another form, the first layer is M-plane corundum $Al_2O_3$ (sapphire) and the metal oxide layer is corundum $AlGaO_3$.

In another form, the first layer is A-plane corundum $Al_2O_3$ (sapphire) and the metal oxide layer is corundum $AlGaO_3$.

In another form, the first layer is corundum $Ga_2O_3$ and the metal oxide layer is corundum $Al_2O_3$ (sapphire).

In another form, the first layer is monoclinic $Ga_2O_3$ and the metal oxide layer is monoclinic $Al_2O_3$ (sapphire).

In another form, the first layer is (−201)-oriented monoclinic $Ga_2O_3$ and the metal oxide layer is (−201)-oriented monoclinic $AlGaO_3$.

In another form, the first layer is (010)-oriented monoclinic $Ga_2O_3$ and the metal oxide layer is (010)-oriented monoclinic $AlGaO_3$.

In another form, the first layer is (001)-oriented monoclinic $Ga_2O_3$ and the metal oxide layer is (001)-oriented monoclinic $AlGaO_3$.

In another form, the first and second crystal symmetry types are different, and matching the first and second lattice configuration comprises reorienting the metal oxide layer to substantially matching the in-plane atomic arrangement at the horizontal planar growing interface.

In another form, the first layer is C-plane corundum $Al_2O_3$ (sapphire) and wherein the metal oxide layer is any one of monoclinic, triclinic or hexagonal $AlGaO_3$.

In another form, the C-plane corundum $Al_2O_3$ (sapphire) is prepared under O-rich growth conditions to selectively grow hexagonal $AlGaO_3$ at lower growth temperatures (<650° C.).

In another form, the C-plane corundum $Al_2O_3$ (sapphire) is prepared under O-rich growth conditions to selectively grow monoclinic $AlGaO_3$ at higher growth temperatures (>650° C.) with Al % limited to approximately 45-50%.

In another form, where the R-plane corundum $Al_2O_3$ (sapphire) is prepared under O-rich growth conditions to selectively grow monoclinic $AlGaO_3$ at higher growth temperatures (>700° C.) with Al % <50%.

In another form, the first layer is A-plane corundum $Al_2O_3$ (sapphire) and wherein the metal oxide layer is (110)-oriented monoclinic $Ga_2O_3$.

In another form, the first layer is (110)-oriented monoclinic $Ga_2O_3$ and wherein the metal oxide layer is corundum $AlGaO_3$.

In another form, the first layer is (010)-oriented monoclinic $Ga_2O_3$ and the metal oxide layer is (111)-oriented cubic $MgGa_2O_4$.

In another form, the first layer is (100)-oriented cubic MgO and wherein the metal oxide layer is (100)-oriented monoclinic $AlGaO_3$.

In another form, the first layer is (100)-oriented cubic NiO and the metal oxide layer is (100)-oriented monoclinic $AlGaO_3$ In another form, initially matching the second crystal symmetry type to the first crystal symmetry type comprises depositing, in a non-equilibrium environment, a buffer layer between the first layer and the metal oxide layer wherein a buffer layer crystal symmetry type is the same as the first crystal symmetry type to provide atomically flat layers for seeding the metal oxide layer having the second crystal symmetry type.

In another form, the buffer layer comprises an O-terminated template for seeding the metal oxide layer.

In another form, the buffer layer comprises a metal terminated template for seeding the metal oxide layer.

In another form, the first and second crystal symmetry types are selected from the group consisting of cubic, hexagonal, orthorhombic, trigonal, rhombic and monoclinic.

In another form, the first crystal symmetry type and first composition of the first layer and the second crystal symmetry type and second composition of the second layer are selected to introduce a predetermined strain into the second layer.

In another form, the first layer is a metal oxide layer.

In another form, the first and second layers form a unit cell that is repeated with a fixed unit cell period to form a superlattice.

In another form, the first and second layers are configured to have substantially equal but opposite strain to facilitate forming of the superlattice without defects.

In another form, the method comprises depositing, in a non-equilibrium environment, an additional metal oxide layer having a third crystal symmetry type and a third composition onto the metal oxide layer.

In another form, the third crystal type is selected from the group consisting of cubic, hexagonal, orthorhombic, trigonal, rhombic and monoclinic.

In another form, the multilayer semiconductor device is an optoelectronic semiconductor device for generating light of a predetermined wavelength.

In another form, the predetermined wavelength is in the wavelength range of 150 nm to 700 nm.

In another form, the predetermined wavelength is in the wavelength range of 150 nm to 280 nm.

In a fifth aspect, the present disclosure provides a method for forming an optoelectronic semiconductor device for generating light of a predetermined wavelength, the method comprising: introducing a substrate; depositing in a non-equilibrium environment a first conductivity type region comprising one or more epitaxial layers of metal oxide; depositing in a non-equilibrium environment an optical emission region comprising one or more epitaxial layers of metal oxide and comprising an optical emission region band structure configured for generating light of the predetermined wavelength; and depositing in a non-equilibrium environment a second conductivity type region comprising one or more epitaxial layers of metal oxide In another form, the predetermined wavelength is in the wavelength range of about 150 nm to about 700 nm. In another form, the predetermined wavelength is in the wavelength range of about 150 nm to about 425 nm. In one example, bismuth oxide can be used to produce wavelengths up to approximately 425 nm.

In another form, the predetermined wavelength is in the wavelength range of about 150 nm to about 280 nm.

In yet another form, the optical emission efficacy is controlled by the selection of the crystal symmetry type of the optically emissive region. The optical selection rule for electric-dipole emission is governed by the symmetry properties of the conduction band and valence band states as well as the crystal symmetry type. An optically emissive region having crystal structure possessing point group symmetry can have a property of either a center-of-inversion symmetry or non-inversion symmetry. Advantageous selection of crystal symmetry to promote electric-dipole or magnetic-dipole optical transitions are claimed herein for application to the optically emissive region. Conversely, advantageous selection of crystal symmetry to inhibit electric-dipole or magnetic-dipole optical transitions are also possible for promoting optically non-absorptive regions of the device.

Figure 1:
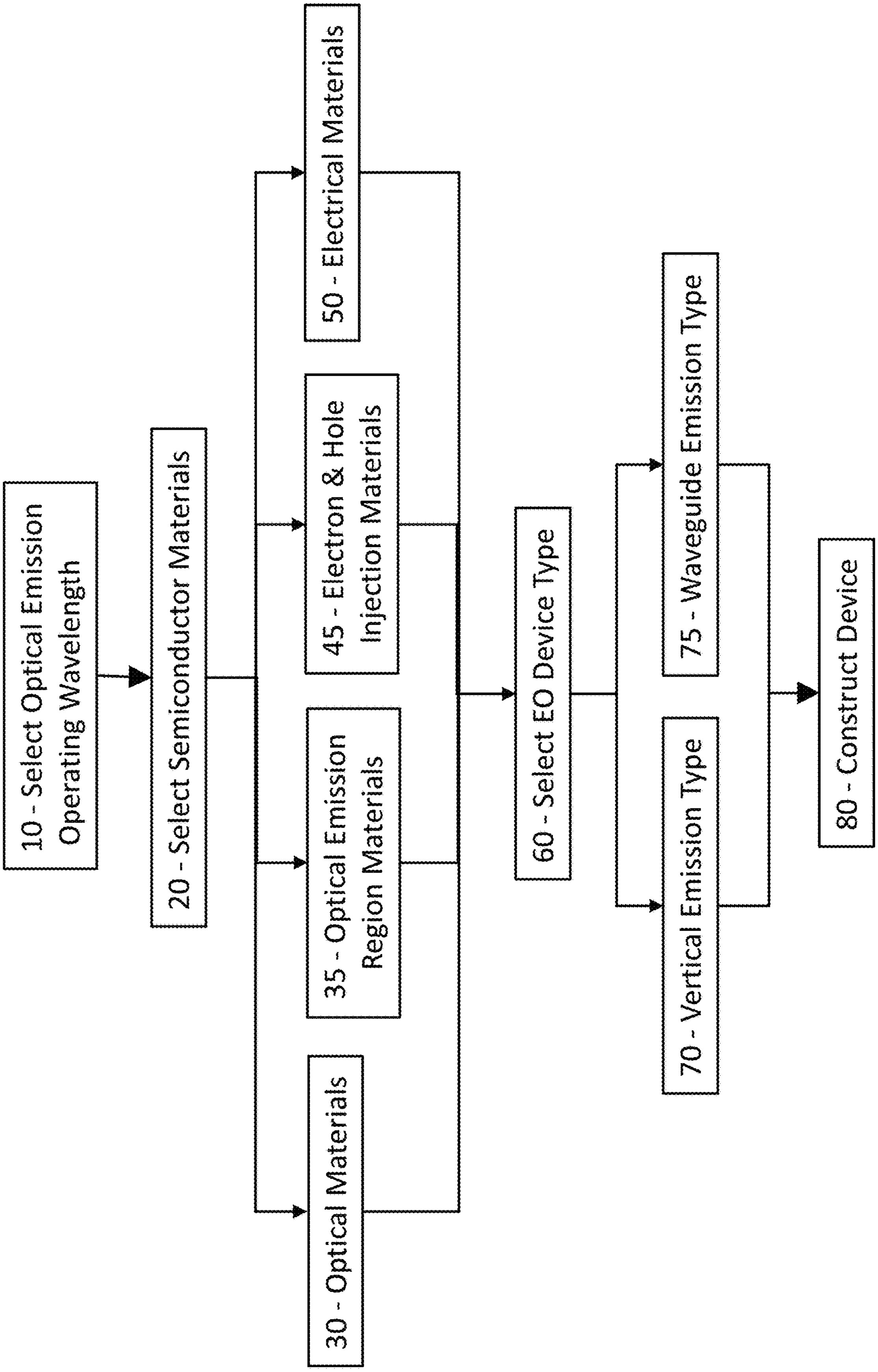
FIG. 1 is process flow diagram for constructing a metal oxide semiconductor-based LED in accordance with an illustrative embodiment of the present disclosure.

By way of overview, FIG. 1 is a process flow diagram for constructing an optoelectronic semiconductor optoelectronic device in accordance with an illustrative embodiment. In one example, the optoelectronic semiconductor device is a UVLED and in a further example, the UVLED is configured to generate a predetermined wavelength in the wavelength region of about 150 nm to about 280 nm. In this example, the construction process comprises selecting initially (i) the operating wavelength desired (e.g., a UVC wavelength or lower wavelength) in step 10 and (ii) the optical configuration of the devices in step 60 (e.g., a vertically emissive device 70 where the light output vector or direction is substantially perpendicular to the plane of the epi-layers, or a waveguide device 75 where the light output vector is substantially parallel to the plane of the epi-layers). The optical emission characteristics of the device is implemented in part by selection of semiconductor materials 20 and optical materials 30.

Taking the example of a UVLED, the optoelectronic semiconductor device constructed in accordance with the process illustrated in FIG. 1 will comprise an optical emission region based on the selected optical emission region material 35 wherein a photon is created by the advantageous spatial recombination of an electron in the conduction band and a hole in the valence band. In one example, the optical emission region comprises one or more metal oxide layers.

The optical emission region may be a direct bandgap type band structure configuration. This can be an intrinsic property of the materials(s) selected or can be tuned using one or more of the techniques of the present disclosure. The optical recombination or optical emission region may be clad by electron and hole reservoirs comprising n-type and p-type conductivity regions. The n-type and p-type conductivity regions are selected from electron and hole injection materials 45 that may have larger bandgaps relative to the optical emission region material 35, or can comprise an indirect bandgap structure that limits the optical absorption at the operating wavelength. In one example, the n-type and p-type conductivity regions are formed of one or more metal oxide layers.

Impurity doping of $Ga_2O_3$ and low Al % $AlGaO_3$ is possible for both n-type and p-type materials. N-type doping is particularly favorable for $Ga_2O_3$ and $AlGaO_3$, whereas p-type doping is more challenging but possible. Impurities suitable for n-type doping are Si, Ge, Sn and rare-earths (e.g., Erbium (Er) and Gadolinium (Gd)). The use of Ge-fluxes for co-deposition doping control is particularly suitable. For p-type co-doping using group-III metals, Ga-sites can be substituted via Magnesium ($Mg^{2+}$), Zinc ($Zn^{2+}$) and atomic-Nitrogen ($N^{3-}$ substitution for O-sites). Further improvements can also be obtained using Iridium (Ir), Bismuth (Bi), Nickel (Ni) and Palladium (Pd).

Digital alloys using NiO, $Bi_2O_3$, $Ir_2O_3$ and PdO may also be used in some embodiments to advantageously aid p-type formation in $Ga_2O_3$-based materials. While p-type doping for $AlGaO_3$ is possible, alternative doping strategies are also possible using cubic crystal symmetry metal oxides (e.g. Li-doped NiO or Ni vacancy $NiO_{x>1}$) and wurtzite p-type Mg:GaN.

Yet a further opportunity is the ability to form highly polar forms of hexagonal crystal symmetry and epsilon-phase $Ga_2O_3$ directly integrated to $AlGaO_3$ thereby inducing polarization doping in accordance with the principles and techniques described and referred to in U.S. Pat. No. 9,691,938. The optical materials 30 necessary for the confinement of light in the device as differential changes in refractive index also requires selection. For far or vacuum ultraviolet, the selection of optically transparent materials ranges from MgO to metal-fluorides, such as $MgF_2$, LiF and the like. It has been found in accordance with the present disclosure that single crystal LiF and MgO substrates are advantageous for the realization of UVLEDs.

The electrical materials 50 forming the contacts to the electron and hole injector regions are selected from low- and high-work function metals, respectively. In one example, the metal ohmic contacts are formed in-situ directly on the final metal oxide surface, as a result reducing any mid-level traps/defects created at the semiconducting oxide-metal interface. The device is then constructed in step 80.

Figure 2A:
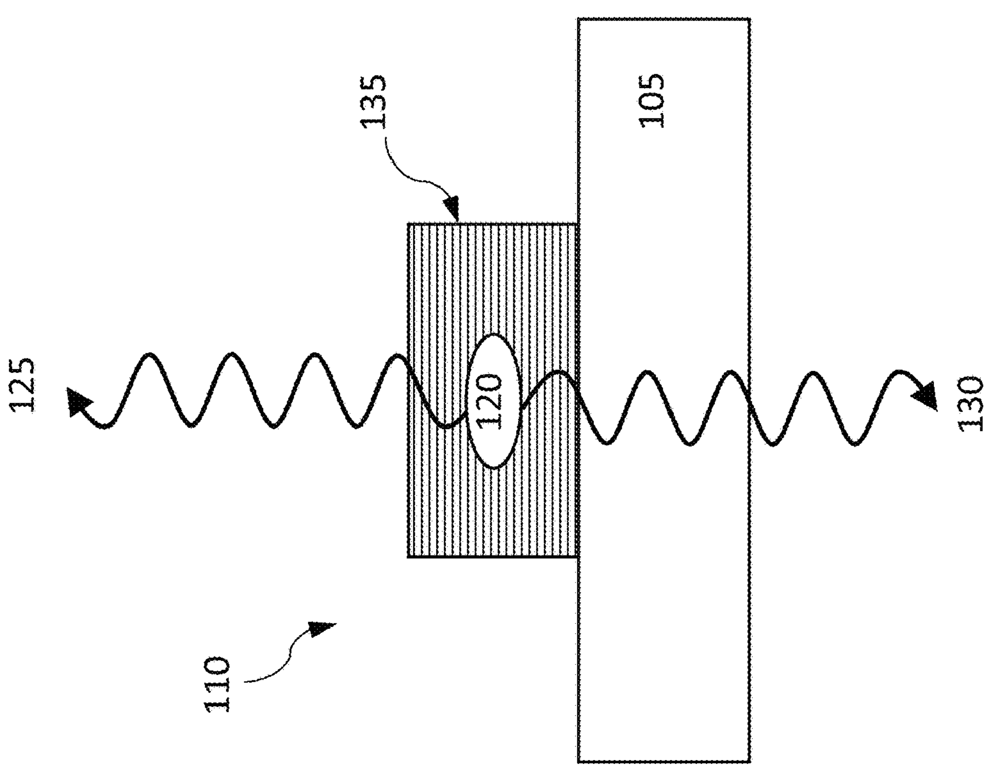
FIGS. 2A and 2B depict schematically two classes of LED devices based on vertical and waveguide optical confinement and emission disposed upon a substrate in accordance with illustrative embodiments of the present disclosure.
Figure 2B:
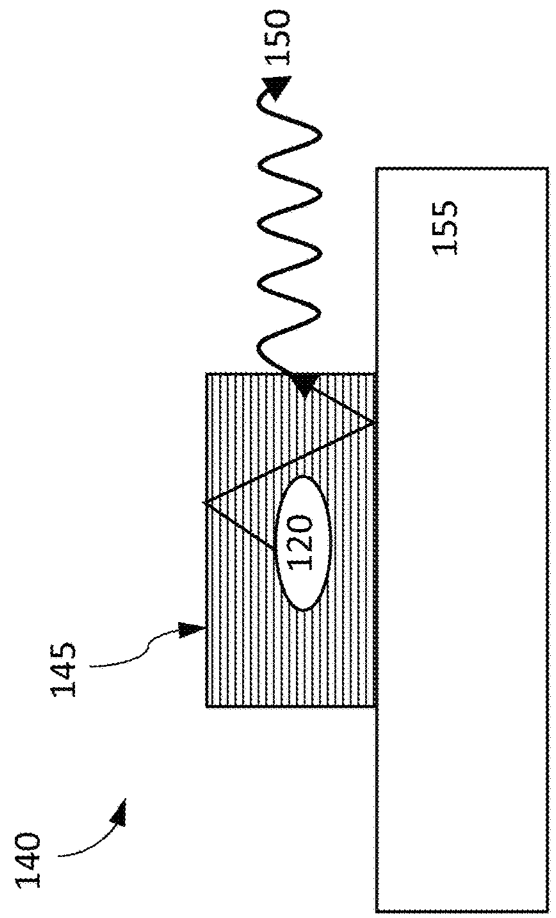

FIGS. 2A and 2B show schematically a vertical emission device 110 and waveguide emissive device 140 in accordance with illustrative embodiments. Device 110 has a substrate 105 and emission structure 135. Similarly, device 140 has a substrate 155 and emission structure 145. Light 125 and 130 from device 110 and light 150 from device 140, generated from the light generation region 120, propagates through the device from region 120 and is confined by a light escape cone defined by the difference in refractive indices at the semiconductor-air interface. As metal oxide semiconductors have extremely large bandgap energy, they have a substantially lower refractive index compared to III-N materials. Therefore, the use of metal oxide materials provides an improved light escape cone and therefore higher optical output coupling efficiency compared to conventional emission devices. Waveguide devices having single mode and multimode operation are also possible.

Broad area stripe waveguides can also be constructed further utilizing elemental metals Al- or Mg-metal to directly form ultraviolet plasmon guiding at the semiconductor-metal interface. This is an efficient method for forming waveguide structures. The E-k band structure for Al, Mg and Ni will be discussed below. Once the desired materials selections are available the process for constructing the semiconductor optoelectronic device may occur at step 80 (see FIG. 1).

Figure 3A:
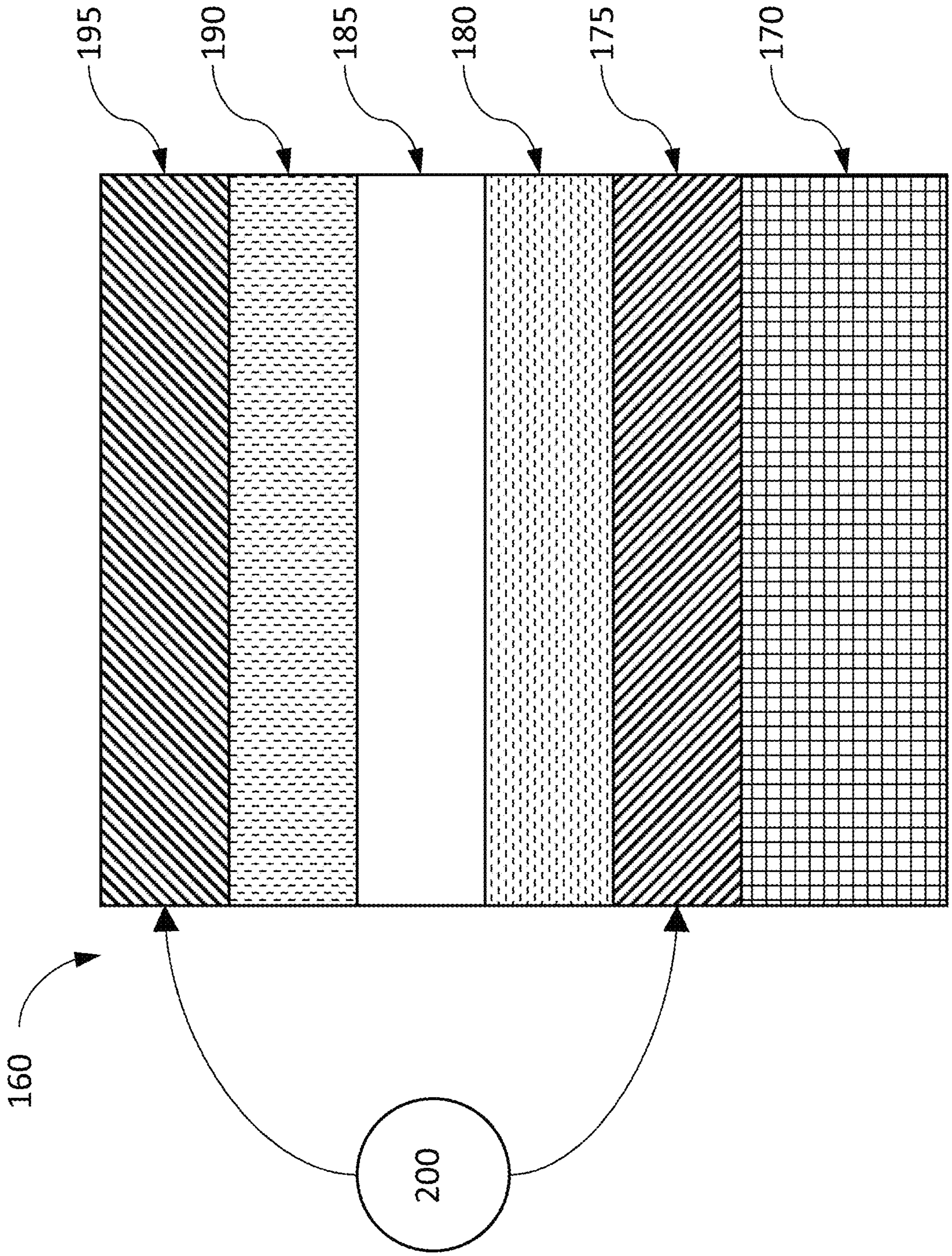
FIGS. 3A-3E are schematic diagrams of different LED device configurations in accordance with illustrative embodiments of the present disclosure comprising a plurality of regions.

FIG. 3A depicts functional regions of the epitaxial structure of an optoelectronic semiconductor device 160 for generating light of a predetermined wavelength according to an illustrative embodiment.

Figure 3B:
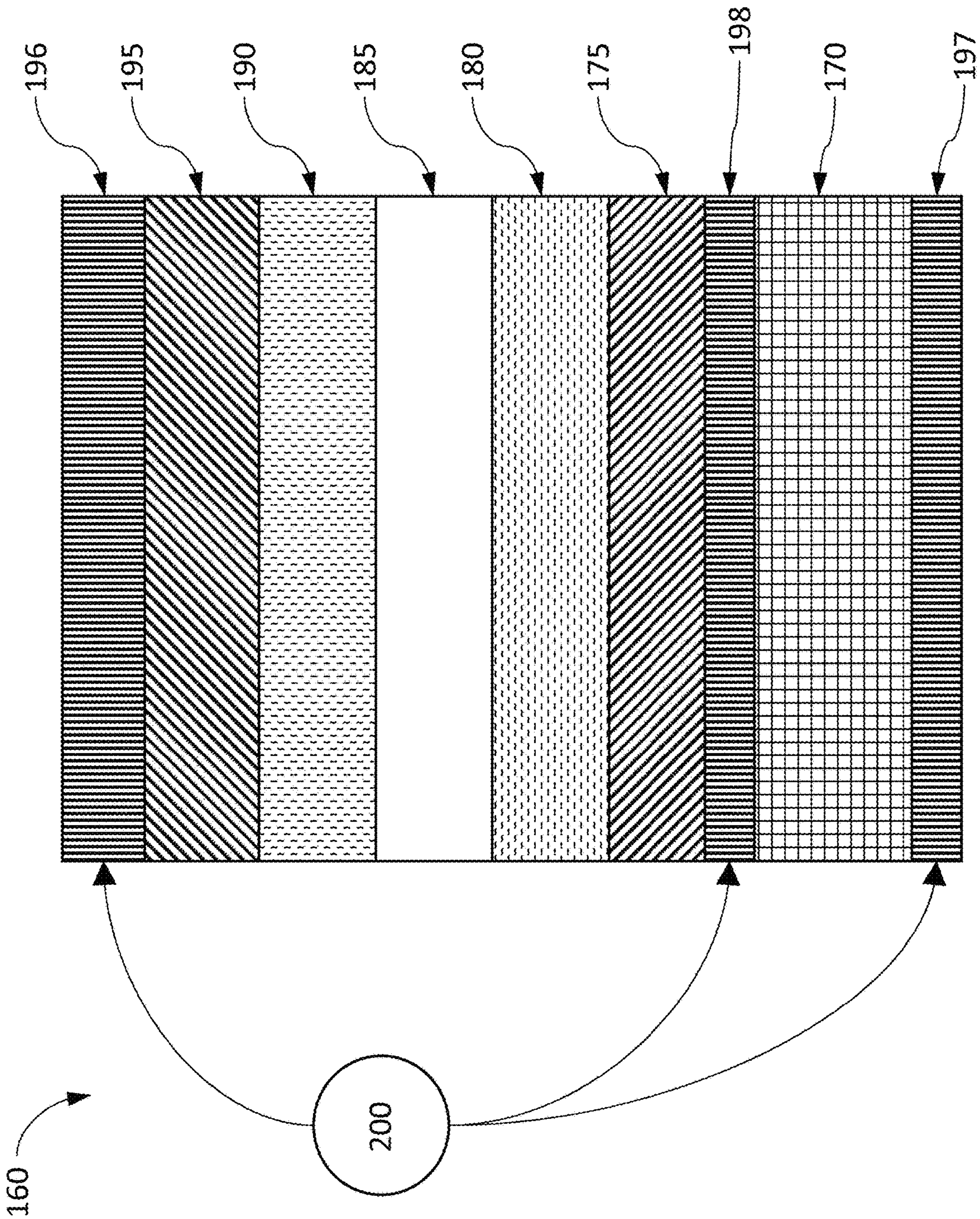

A substrate 170 is provided with advantageous crystal symmetry and in-plane lattice constant matching at the surface to enable homoepitaxy or heteroepitaxy of a first conductivity type region 175 with a subsequent non-absorbing spacer region 180, an optical emission region 185, an optional second spacer region 190 and a second conductivity type region 195. In one example, the in-plane lattice constant and the lattice geometry/arrangement are matched to modify (i.e., reduce) lattice defects. Electrical excitation is provided by a source 200 that is connected to the electron and hole injection regions of the first and second conductivity type regions 175 and 195. ohmic metal contacts and low-bandgap or semi-metallic zero-bandgap oxide semiconductors are shown in FIG. 3B as regions 196, 197, 198 in another illustrative embodiment.

First and second conductivity type regions 175 and 195 are formed in one example using metal oxides having wide bandgap and are electrically contacted using ohmic contact regions 197, 198 and 196 as described herein. In the case of an insulating type substrate 170 the electrical contact configuration is via ohmic contact region 198 and first conductivity type region 175 for one electrical conductivity type (viz., electron or holes) and the other using ohmic contact region 196 and second conductivity type region 195. Ohmic contact region 198 may optionally be made to an exposed portion of first conductivity type region 175. As the insulating substrate 170 may further be transparent or opaque to the operating wavelength, for the case of a transparent substrate the lower ohmic contact region 197 may be utilized as an optical reflector as part of an optical resonator in another embodiment.

For the case of a vertical conduction device, the substrate 170 is electrically conducting and maybe either be transparent or opaque to the operating wavelength. Electrical or ohmic contact regions 197 and 198 are disposed to advantageously enable both electrical connection and optical propagation within the device.

Figure 3C:
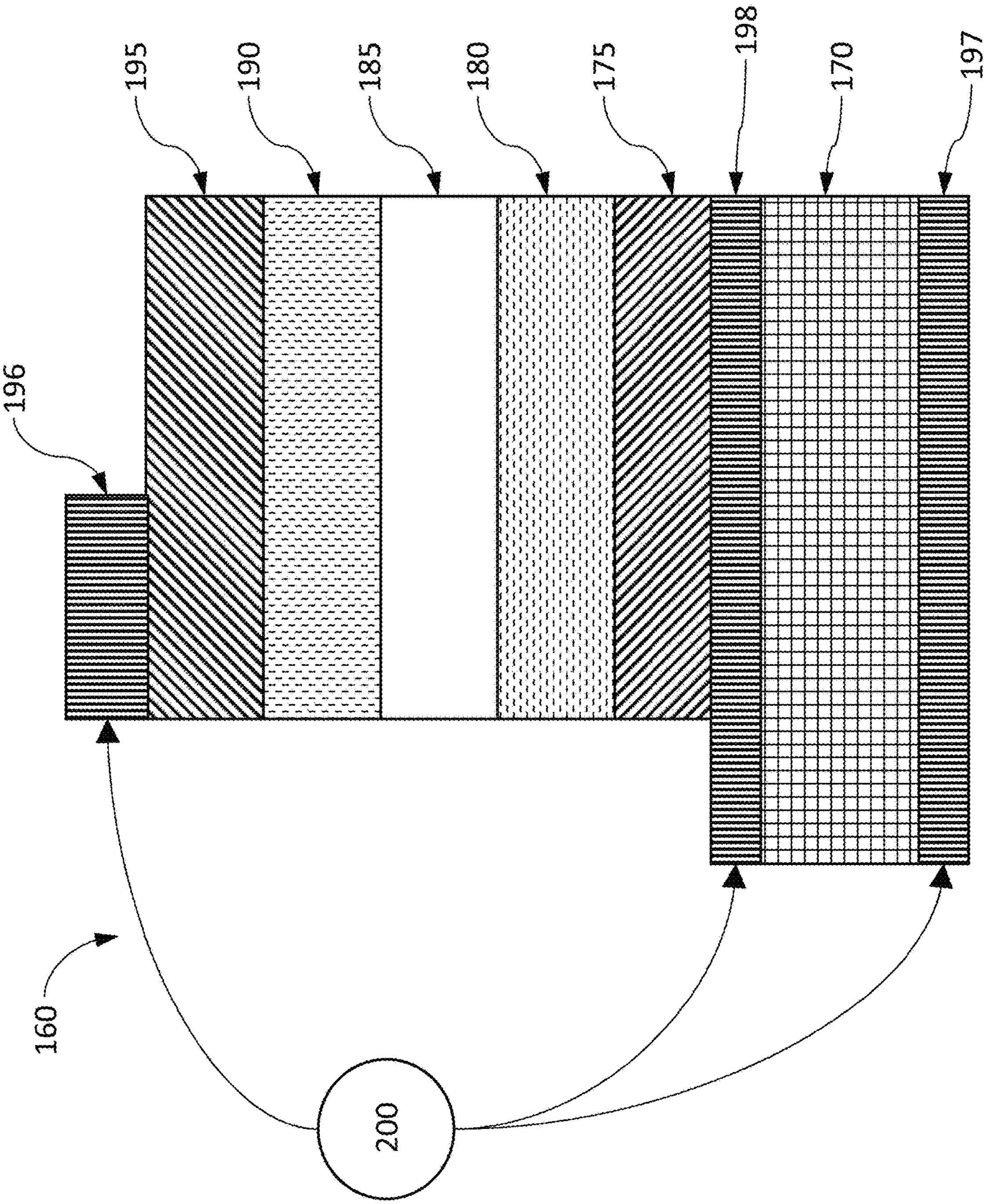

FIG. 3C illustrates schematically further possible electrical arrangements for the electrical contact regions 196 and 198 showing a mesa etched portion to expose lower conductivity type regions 175 and 198. The ohmic contact region 196 may further be patterned to expose a portion of the device for light extraction.

Figure 3D:
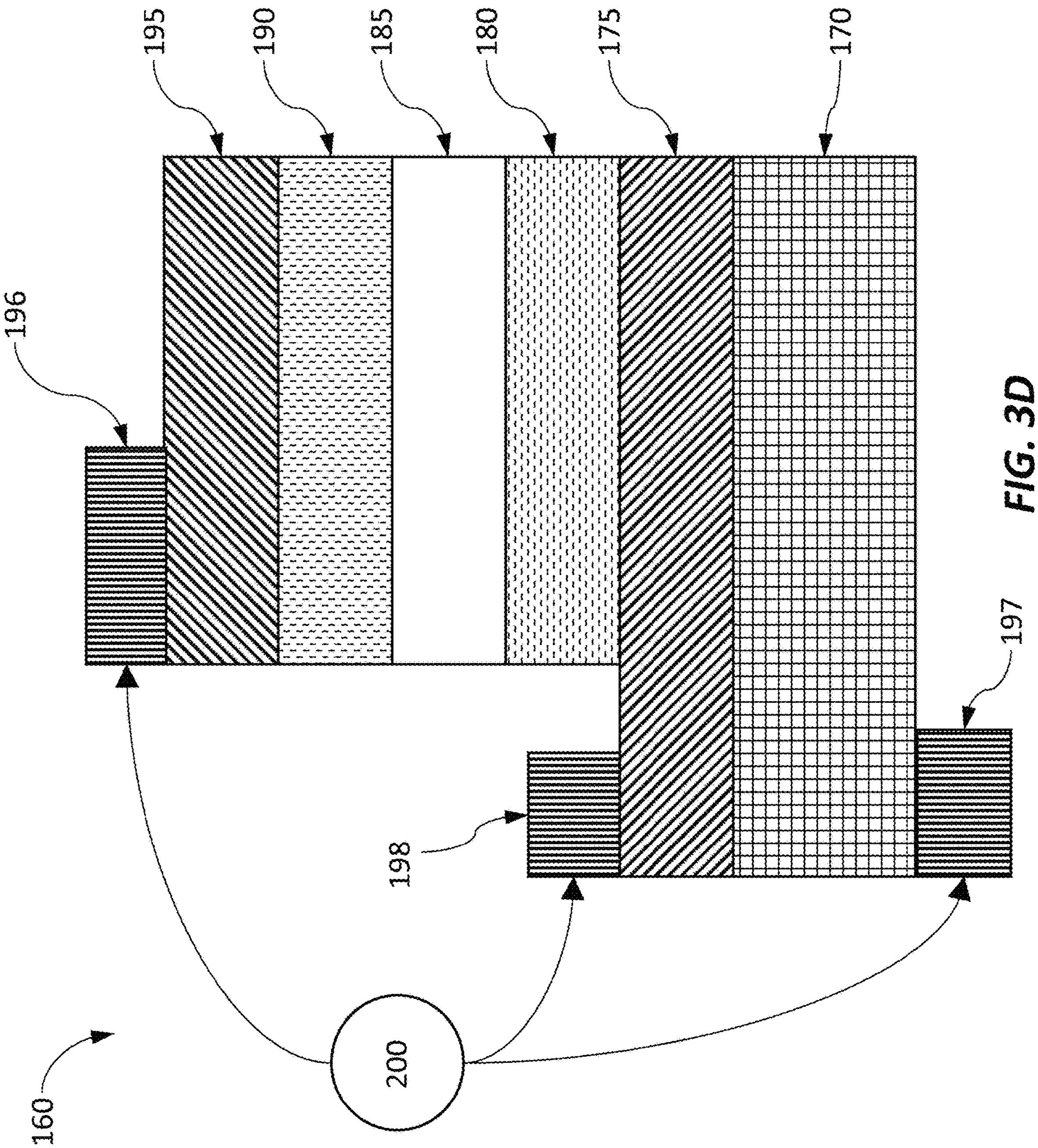

FIG. 3D shows yet a further electrical configuration wherein the insulating substrate 170 is used such that the first conductivity type region 175 is exposed and an electrical contact formed on a partially exposed portion of first conductivity type region 175. For the case of an electrically conductive and transparent substrate contact, ohmic contact region 198 is not required and a spatially disposed electrical contact region 197 is used.

Figure 3E:
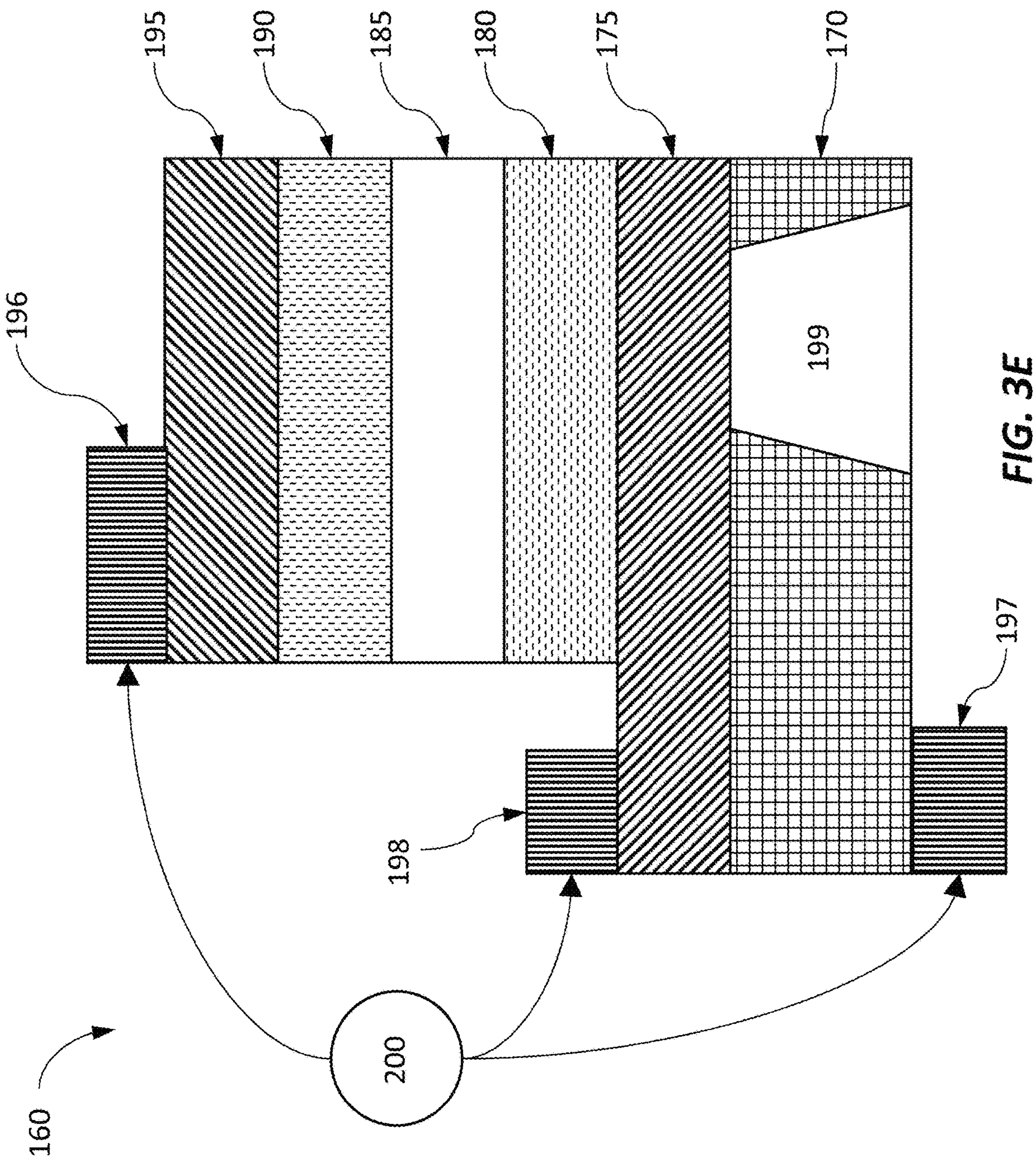

FIG. 3E yet further shows a possible arrangement of an optical aperture 199 etched partially or fully into an optically opaque substrate 170 for the optical coupling of light generated from optical emission region 185. The optical aperture may be utilized with the previous embodiments of FIGS. 3A-3D as well.

Figure 4:
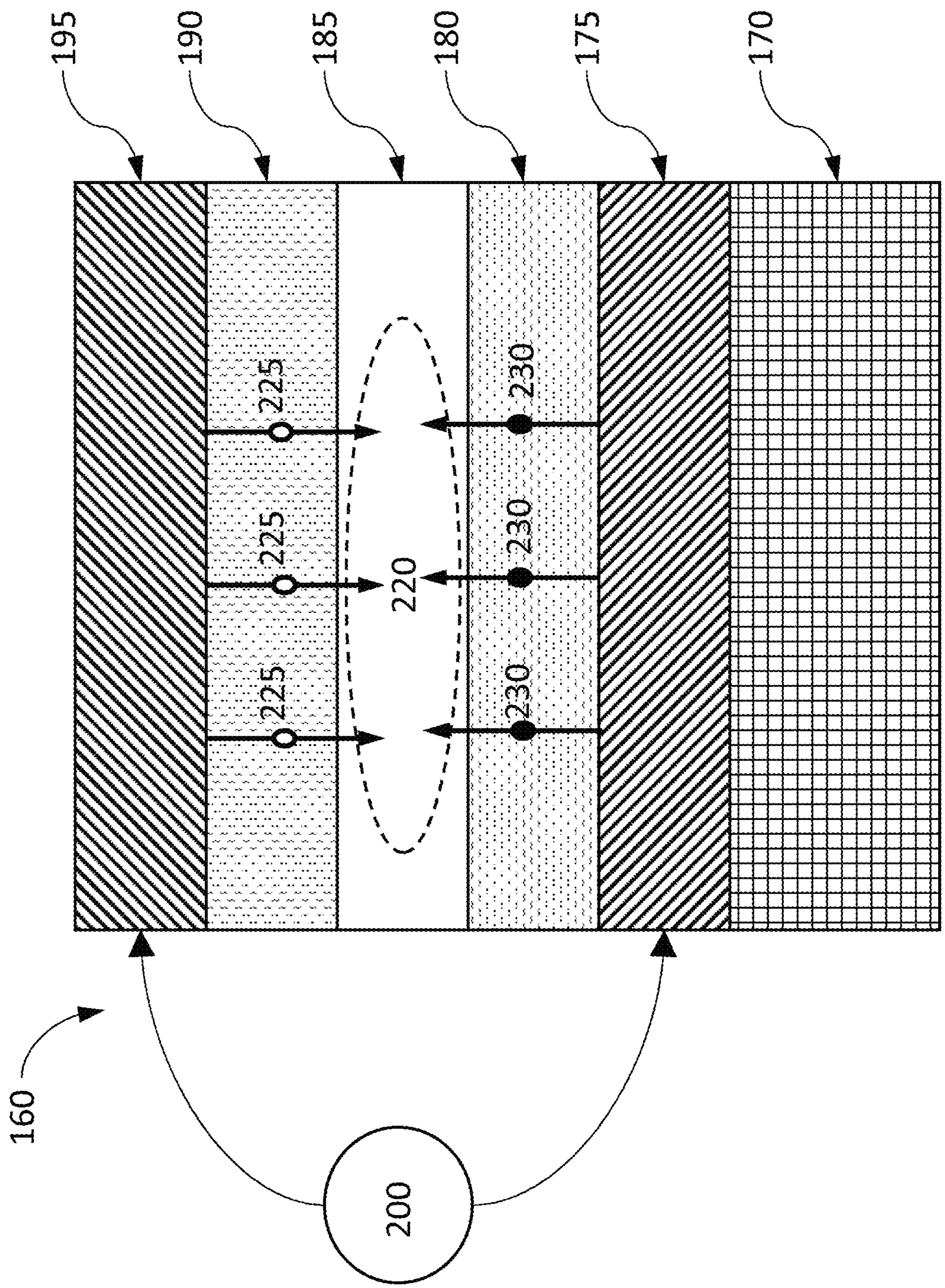
FIG. 4 depicts schematically the injection of oppositely charged carriers from physically separated regions into a recombination region in accordance with an illustrative embodiment of the present disclosure.

FIG. 4 shows schematically operation of optoelectronic semiconductor device 160 wherein an example configuration comprises an electron injection region 180 and a hole injection region 190 with electrical bias 200 to transport and direct mobile electrons 230 and holes 225 into the recombination region 220. The resulting electron and hole recombination forms a spatial optical emission region 185.

Extremely large energy bandgap ($E_G$) metal oxide semiconductors ($E_G$>4 eV) may exhibit low mobility hole-type carriers and may even be highly localized spatially—as a result limiting the spatial extent for hole injection. The region in the vicinity of the hole injection region 190 and recombination region 220 may then become advantageous for recombination process. Furthermore, the hole injection region 190 itself may be the preferred region for injecting electrons such that recombination region 220 is located within a portion of hole injection region 190.

Figure 5:
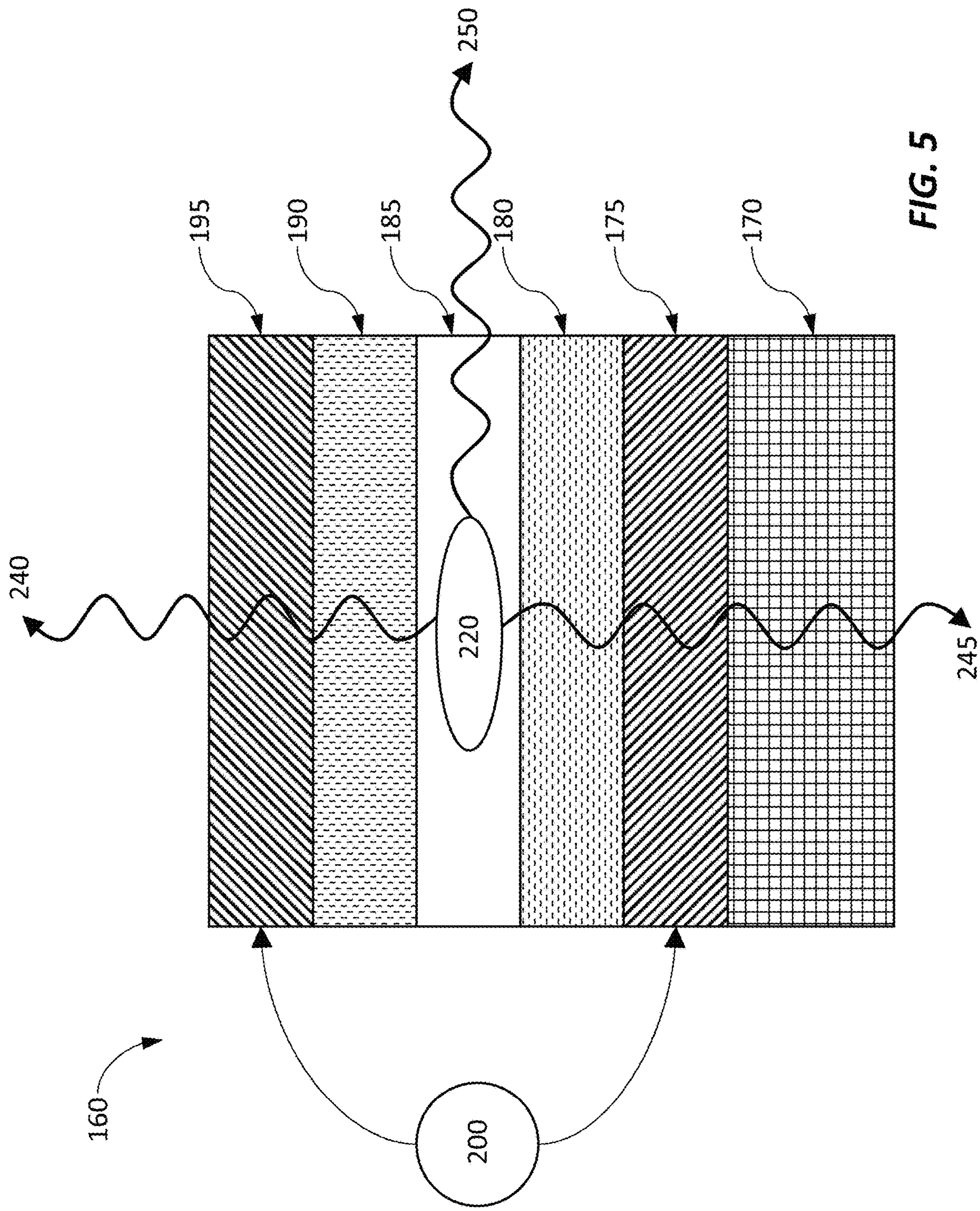
FIG. 5 shows the optical emission directions possible from the emission region of an LED in accordance with an illustrative embodiment of the present disclosure.

Referring now to FIG. 5, light or optical emission is generated within the device 160 by selective spatial recombination of electrons and holes to create high energy photons 240, 245 and 250 of a predetermined wavelength dictated by the configuration of the band structure of the metal oxide layer or layers forming the optical emission region 185 as will be described below. The electrons and holes are both instantaneously annihilated to create a photon that is a property of the band structure of the metal oxide selected.

The light generated within optical emission region 185 can propagate within the device according to the crystal symmetry of the metal oxide host regions. The crystal symmetry group of the host metal oxide semiconductor has definite energy and crystal momentum dispersion known as the E-k configuration that characterizes the band structure of various regions including the optical emission region 185. The non-trivial E-k dispersions are fundamentally dictated by the underlying physical atomic arrangements of definite crystal symmetry of the host medium. In general, the possible optical polarizations, optical energy emitted and optical emission oscillator strengths are directly related to the valence band dispersion of the host crystal. In accordance with the present disclosure, embodiments advantageously configure the band structure including the valence band dispersion of selected metal oxide semiconductors for application to optoelectronic semiconductor devices, such as for, in one example, UVLEDs.

Light 240 and 245 generated vertically requires optical selection rules of the underlying band structure to be fulfilled. Similarly, there are optical selection rules for generation of lateral light 250. These optical selection rules can be achieved by advantageous arrangement of the crystal symmetry types and physical spatial orientation of the crystal for each of the regions within the UVLED. Advantageous orientation of the constituent metal oxide crystals as a function of the growth direction is beneficial for optimal operation of the UVLEDs of the present disclosure. Furthermore, selection of the optical properties 30 in the process flow diagram illustrated in FIG. 1 such as the refractive index forming the waveguide type device is indicated for optical confinement and low loss.

Figure 6:
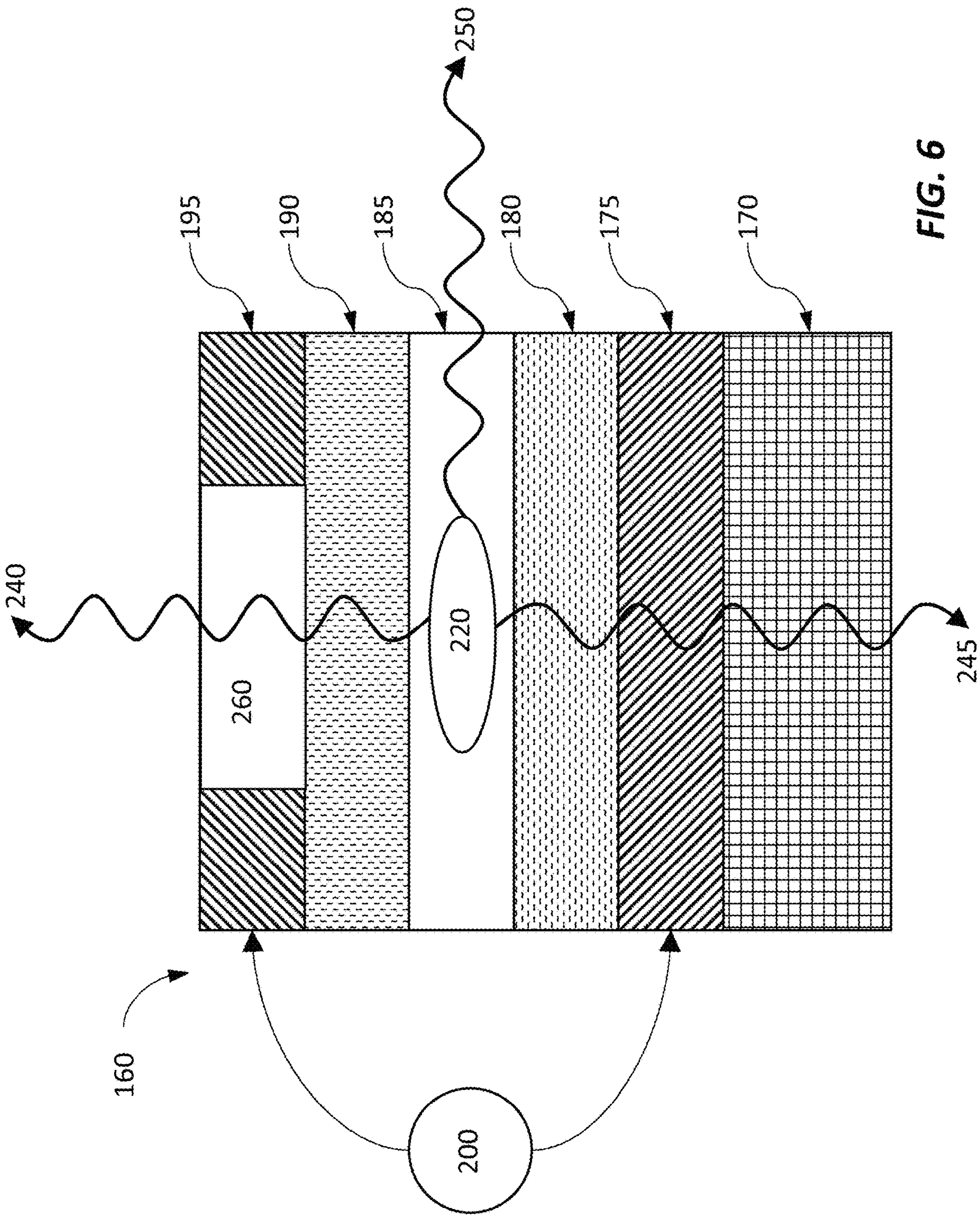
FIG. 6 depicts an aperture through an opaque region to enable light emission from an LED in accordance with an illustrative embodiment of the present disclosure.

FIG. 6 further shows for completeness, another embodiment comprising an optical aperture 260 disposed within optoelectronic semiconductor device 160 to enable the use of materials 195 which are opaque to the operating wavelength to provide optical out coupling from optical emission region 185.

Figure 7:
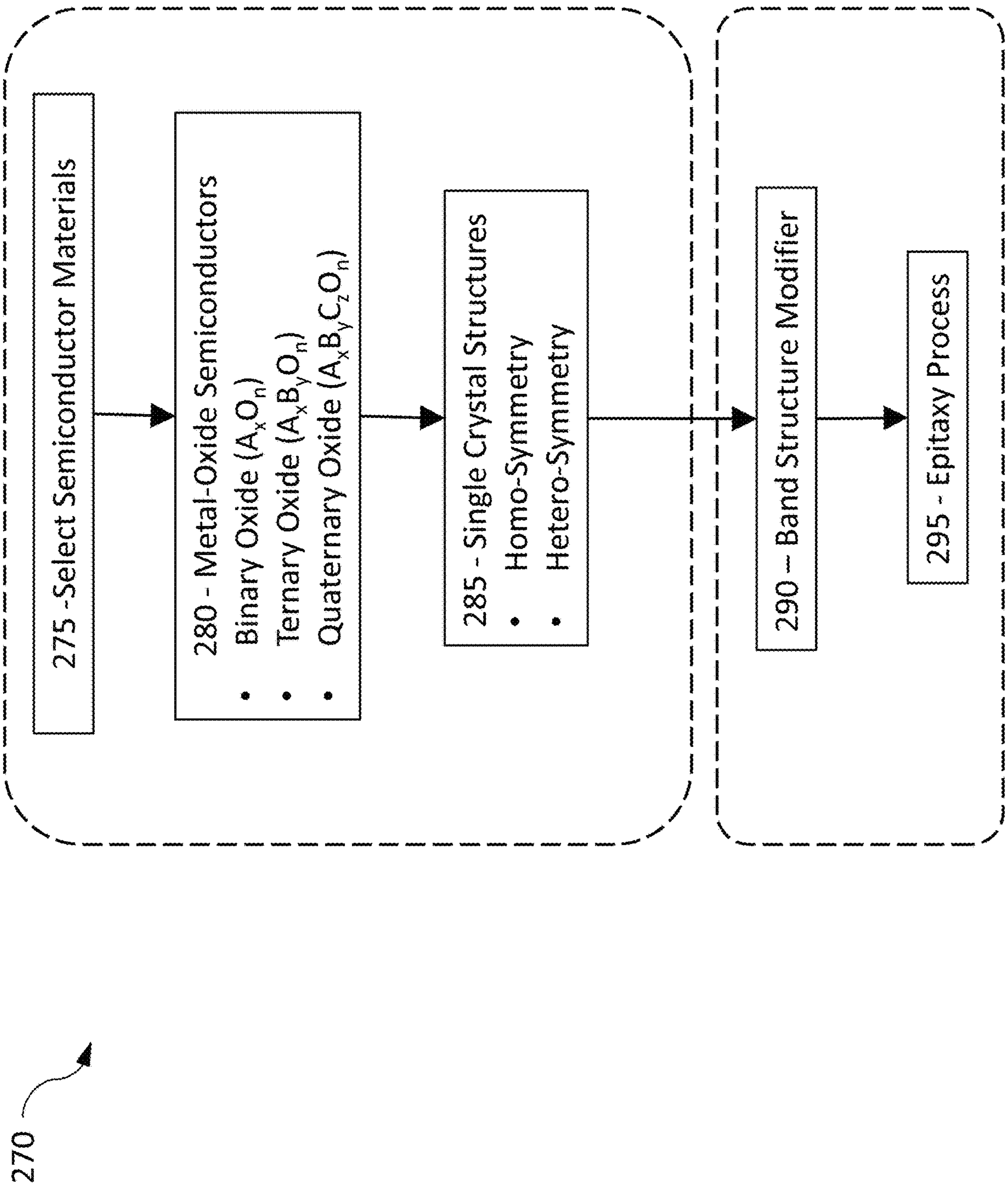
FIG. 7 shows example selection criteria to construct a metal oxide semiconductor structure in accordance with an illustrative embodiment of the present disclosure.

FIG. 7 shows by way of overview, selection criteria 270 for one or more metal oxide crystal compositions in accordance with illustrative embodiments. First, semiconductor materials 275 are selected. The semiconductor materials 275 may include metal-oxide semiconductors 280, which may be one or more of binary oxides, ternary oxides or quaternary oxides. The recombination region 220 forming the optical emission region 185 of optoelectronic semiconductor device 160 (for example see FIG. 5) is selected to exhibit efficient electron-hole recombination whereas the conductivity type regions are selected for their ability to provide sources of electrons and holes. Metal oxide semiconductors can also be created selectively from a plurality of possible crystal symmetry types even with the same species of constituent metals. Binary metal oxides of the form $A_xO_y$ comprising one metal species may be used, wherein the metal specie (A) is combined with oxygen (O) in the relative proportions x and y. Even with the same relative proportions x and y, a plurality of crystal structure configurations are possible having vastly different crystal symmetry groups.

As will be described below, compositions $Ga_2O_3$ and $Al_2O_3$ exhibit several advantageous and distinct crystal symmetries (e.g., monoclinic, rhombohedral, triclinic and hexagonal) but require careful attention to the utility of incorporating them and constructing a UVLED. Other advantageous metal oxide compositions, such as MgO and NiO, exhibit less variation in practically attainable crystal structures, namely cubic crystals.

Addition of advantageous second dissimilar metal species (B) can also augment a host binary metal oxide crystal structure to create a ternary metal oxide of the form $A_xB_yO_n$. Ternary metal oxides range from dilute addition of B-species up to a majority relative fraction. As described below, ternary metal oxides may be adopted for the advantageous formation of direct bandgap optically emissive structures in various embodiments. Yet further materials can be engineered comprising three dissimilar cation-atom species coupled to oxygen forming a quaternary composition $A_xB_yC_zO_n$.

In general, while a larger number (>4) of dissimilar metal atoms can theoretically be incorporated to form complex oxide materials—they are seldom capable of producing high crystallographic quality with exceptionally distinct crystal symmetry structures. Such complex oxides are in general polycrystalline or amorphous and therefore lack optimal utility for the applications to an optoelectronic device. As will be apparent, the present disclosure seeks in various examples substantially single crystal and low defect density configurations in order to exploit the band structure to form UVLED epitaxial formed devices. Some embodiments also include achieving desirable E-k configurations by the addition of another dissimilar metal specie.

Selection of desired bandgap structures for each of the UVLED regions of optoelectronic semiconductor device 160 may also involve integration of dissimilar crystal symmetry types. For example, a monoclinic crystal symmetry host region and a cubic crystal symmetry host region comprising a portion of the UVLED may be utilized. The epitaxial formation relationships then involve attention toward the formation of low defect layer formation. The type of layer formation steps are then classed 285 as homo-symmetry and hetero-symmetry formation. To achieve the goal of providing the materials forming the epilayer structure, band structure modifiers 290 can be utilized such as biaxial strain, uniaxial strain and digital alloys such as superlattice formation.

The epitaxy process 295 is then defined by the types and sequence of material composition required for deposition. The present disclosure describes new processes and compositions for achieving this goal.

Figure 8:
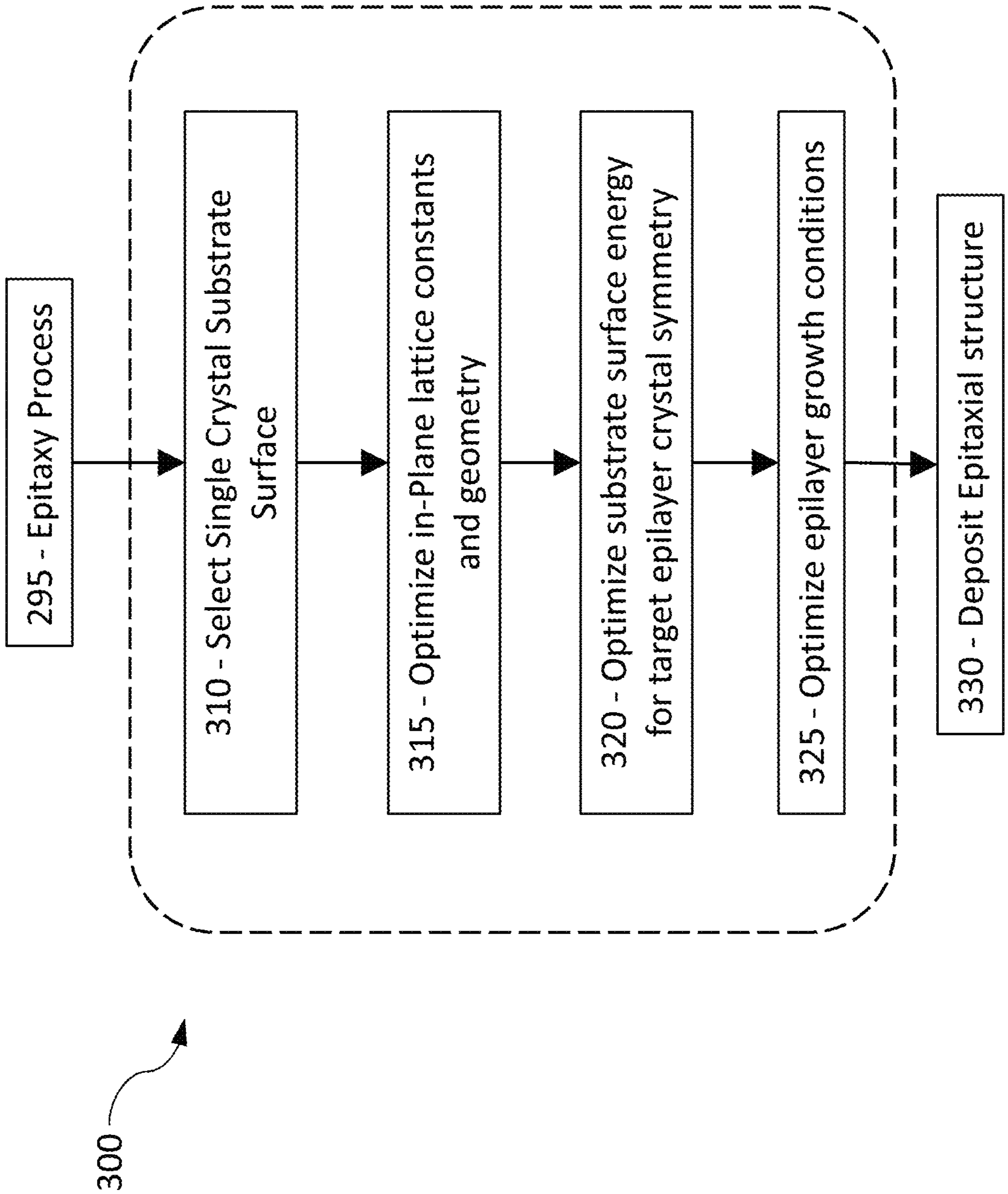
FIG. 8 is an example process flow diagram for selecting and depositing epitaxially a metal oxide structure in accordance with an illustrative embodiment of the present disclosure.

FIG. 8 shows the epitaxy process 300 formation steps. At step 310, a film formation substrate for supporting the optical emission region is selected with desirable properties of crystal symmetry type, and optical and electrical characteristics. In one example, the substrate is selected to be optically transparent to the operating wavelength and a crystal symmetry compatible with the epitaxial crystal symmetry types required. Even though equivalent crystal symmetry of both the substrate and epitaxial film(s) can be used there is also an optimization 315 for matching the in-plane atomic arrangements, such as in-plane lattice constants or advantageous co-incidence of in-plane geometry of respective crystal planes from dissimilar crystal symmetry types.

The substrate surface has a definite 2-dimensional crystal arrangement of terminated surface atoms. In vacuum, on a prepared surface this discontinuity of definite crystal structure results in a minimization of surface energy of the dangling bonds of the terminated atoms. For example, in one embodiment a metal oxide surface can be prepared as an oxygen terminated surface or in another embodiment as a metal-terminated surface. Metal oxide semiconductors can have complex crystal symmetry, and pure specie termination may require careful attention. For example, both $Ga_2O_3$ and $Al_2O_3$ can be O-terminated by high temperature anneal in vacuum followed by sustained exposure to atomic or molecular oxygen at high temperature.

The crystal surface orientation 320 of the substrate can also be selected to achieve selective film formation crystal symmetry type of the epitaxial metal oxide. For example, A-plane sapphire can be used to advantageously select (110)-oriented alpha-phase formation high quality epitaxial $Ga_2O_3$, $AlGaO_3$ and $Al_2O_3$; whereas for C-plane sapphire hexagonal and monoclinic $Ga_2O_3$and $AlGaO_3$ films are generated. $Ga_2O_3$ oriented surfaces are also used selectively for film formation selection of $AlGaO_3$ crystal symmetry.

The growth conditions 325 are then optimized for the relative proportions of elemental metal and activated oxygen required to achieve the desired material properties. The growth temperature also plays an important role in determining the crystal structure symmetry types possible. The judicious selection of the substrate surface energy via appropriate crystal surface orientation also dictates the temperature process window for the epitaxial process during which the epitaxial structure 330 is deposited.

Figure 9:
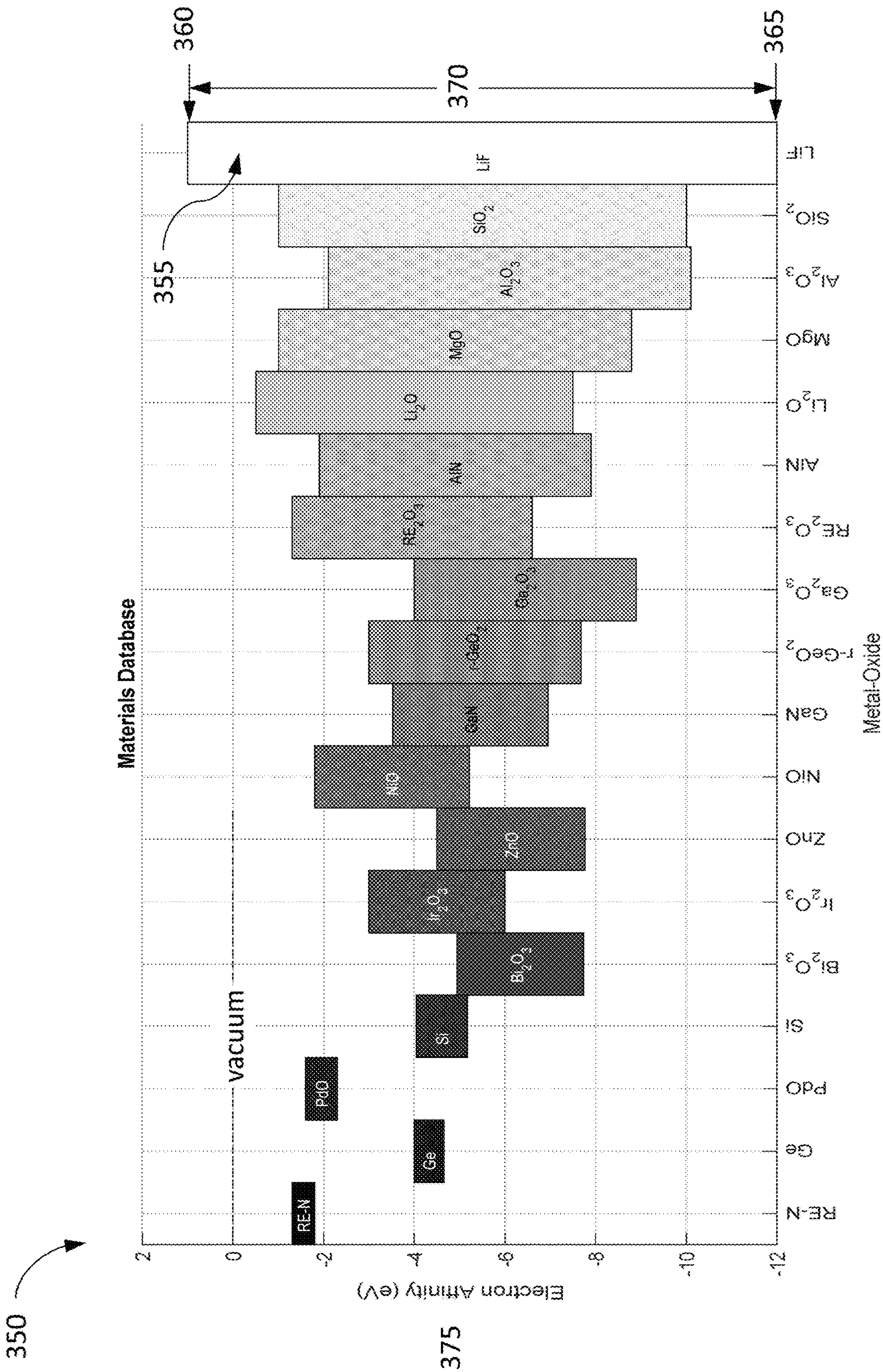
FIG. 9 is a summary of technologically relevant semiconductor bandgaps as a function of electron affinity, showing relative band lineups.

A materials selection database 350 for the application toward UVLED based optoelectronic devices is disclosed in FIG. 9. Metal oxide materials 380 are plotted as a function of their electron affinity energy 375 relative to vacuum. Ordered from left to right, the semiconductor materials have increasing optical bandgap and accordingly have greater utility for shorter wavelength operation UVLEDs. Using lithium fluoride (LiF) as an example in this graph, LiF has a bandgap 370 (represented as the box for each material) which is the energy difference in electron volts between conduction band minimum 360 and valence band maximum 365. The absolute energy positions represented by conduction band minimum 360 and valence band maximum 365 are plotted with respect to the vacuum energy. While narrow bandgap material such as rare-earth nitride (RE-N), germanium (Ge), palladium-oxide (PdO) and silicon (Si) do not offer suitable host properties for the optical emission region, they can be used advantageously for electrical contact formation. The use of intrinsic electron affinity of given materials can be used to form ohmic contacts and metal-insulator-semiconductor junctions as required.

Desirable materials combinations for use as a substrate are bismuth-oxide ($Bi_2O_3$), nickel-oxide (NiO), germanium-oxide ($GeO_{x-2}$), gallium-oxide ($Ga_2O_3$), lithium-oxide ($Li_2O$), magnesium-oxide (MgO), aluminum-oxide ($Al_2O_3$), single crystal quartz $SiO_2$, and ultimately lithium-fluoride 355 (LiF). In particular, $Al_2O_3$ (sapphire), $Ga_2O_3$, MgO and LiF are available as large high-quality single crystal substrates and may be used as substrates for UVLED type optoelectronic devices in some embodiments. Additional embodiments for substrates for UVLED applications also include single crystal cubic symmetry magnesium aluminate ($MgAl_2O_4$) and magnesium gallate ($MgGa_2O_4$). In some embodiments, the ternary form of $AlGaO_3$ may be deployed as a bulk substrate in monoclinic (high Ga %) and corundum (high Al %) crystal symmetry types using large area formation methods such as Czochralski (CZ) and edge-fed growth (EFG).

Considering host metal oxide semiconductors of $Ga_2O_3$ and $Al_2O_3$, in some embodiments alloying and/or doping via elements selected from database 350 are advantageous for film formation properties.

Therefore elements selected from Silicon (Si), Germanium (Ge), Er (Erbium), Gd (Gadolinium), Pd (Palladium), Bi (Bismuth), Jr (Iridium), Zn (Zinc), Ni (Nickel), Li (Lithium), Magnesium (Mg) are desirable crystal modification specie to form ternary crystal structures or dilute additions to the $Al_2O_3$, $AlGaO_3$ or $Ga_2O_3$ host crystals (see semiconductors 280 of FIG. 7).

Further embodiments include selection of the group of crystal modifiers selected from the group of Bi, Jr, Ni, Mg, Li.

For application to the host crystals $Al_2O_3$, $AlGaO_3$ or $Ga_2O_3$ multivalence states possible using Bi and Ir can be added to enable p-type impurity doping. The addition of Ni and Mg cations can also enable p-type impurity substitutional doping at Ga or Al crystal sites. In one embodiment, Lithium may be used as a crystal modifier capable of increasing the bandgap and modifying the crystal symmetry possible, ultimately toward orthorhombic crystal symmetry lithium gallate ($LiGaO_2$) and tetragonal crystal symmetry aluminum-gallate ($LiAlO_2$). For n-type doping Si and Ge may be used as impurity dopants, with Ge offering improved growth processes for film formation.

While other materials are also possible, the database 350 provides advantageous properties for application to UVLED.

Figure 10:
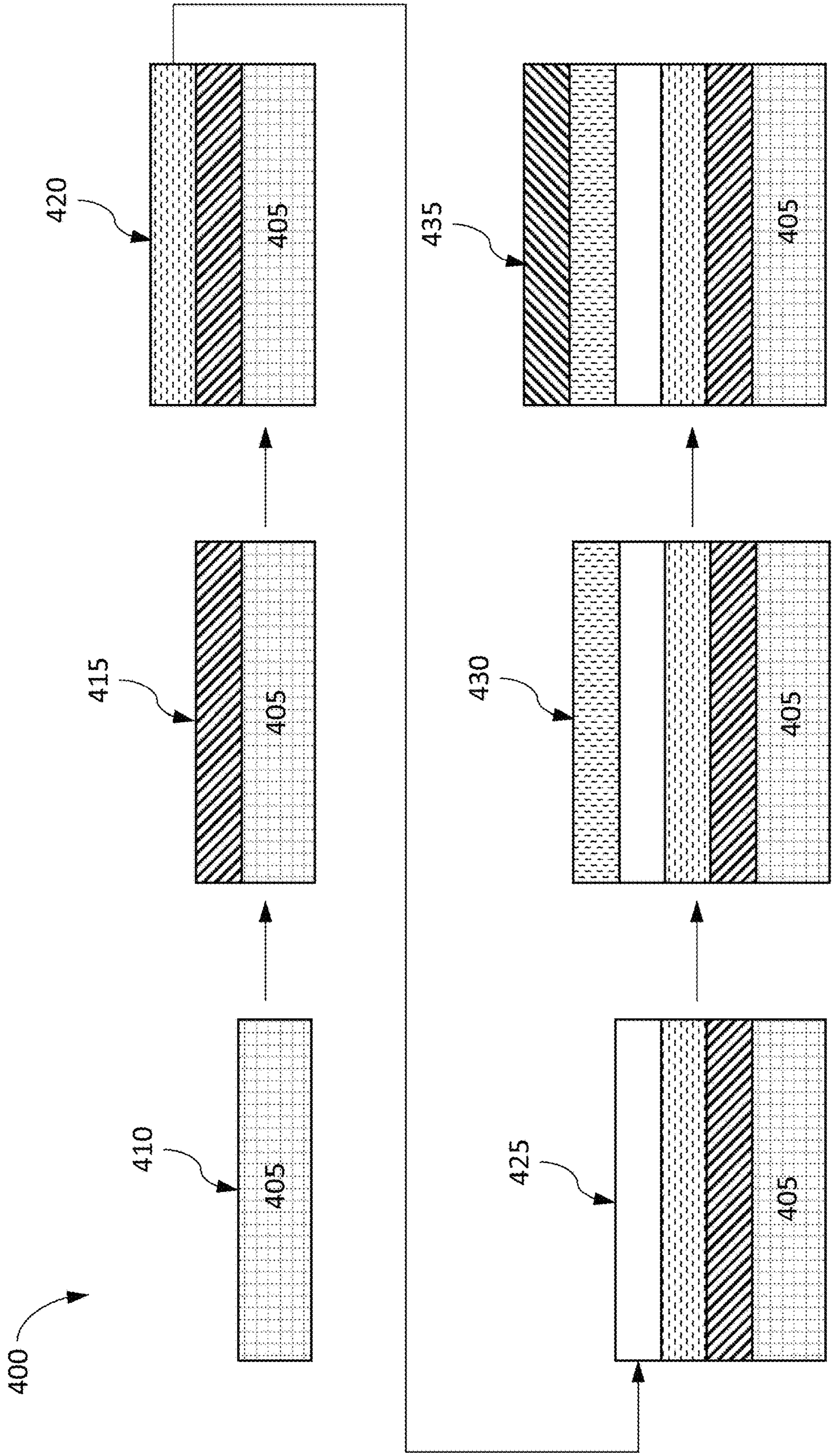
FIG. 10 is an example schematic process flow for depositing a plurality of layers for forming a plurality of regions comprising an LED in accordance with an illustrative embodiment of the present disclosure.

FIG. 10 depicts a sequential epitaxial layer formation process flow 400 utilized to epitaxially integrate the material regions as defined in optoelectronic semiconductor device 160 according to an illustrative embodiment.

A substrate 405 is prepared with surface 410 configured to accept a first conductivity type crystal structure layer(s) 415 which may comprise a plurality of epitaxial layers. Next first spacer region composition layer(s) 420 which may comprise a plurality of epitaxial layers is formed on layer 415. An optical emission region 425 is then formed on layer 420, in which region 425 may comprise a plurality of epitaxial layers. A second spacer region 430 which may comprise a plurality of epitaxial layers is then deposited on region 425. A second conductivity type cap region 435 which may comprise a plurality of epitaxial layers then completes a majority of the UVLED epitaxial structure. Other layers may be added to complete the optoelectronic semiconductor device, such as ohmic metal layers and passive optical layers, such as for optical confinement or antireflection.

Figure 11:
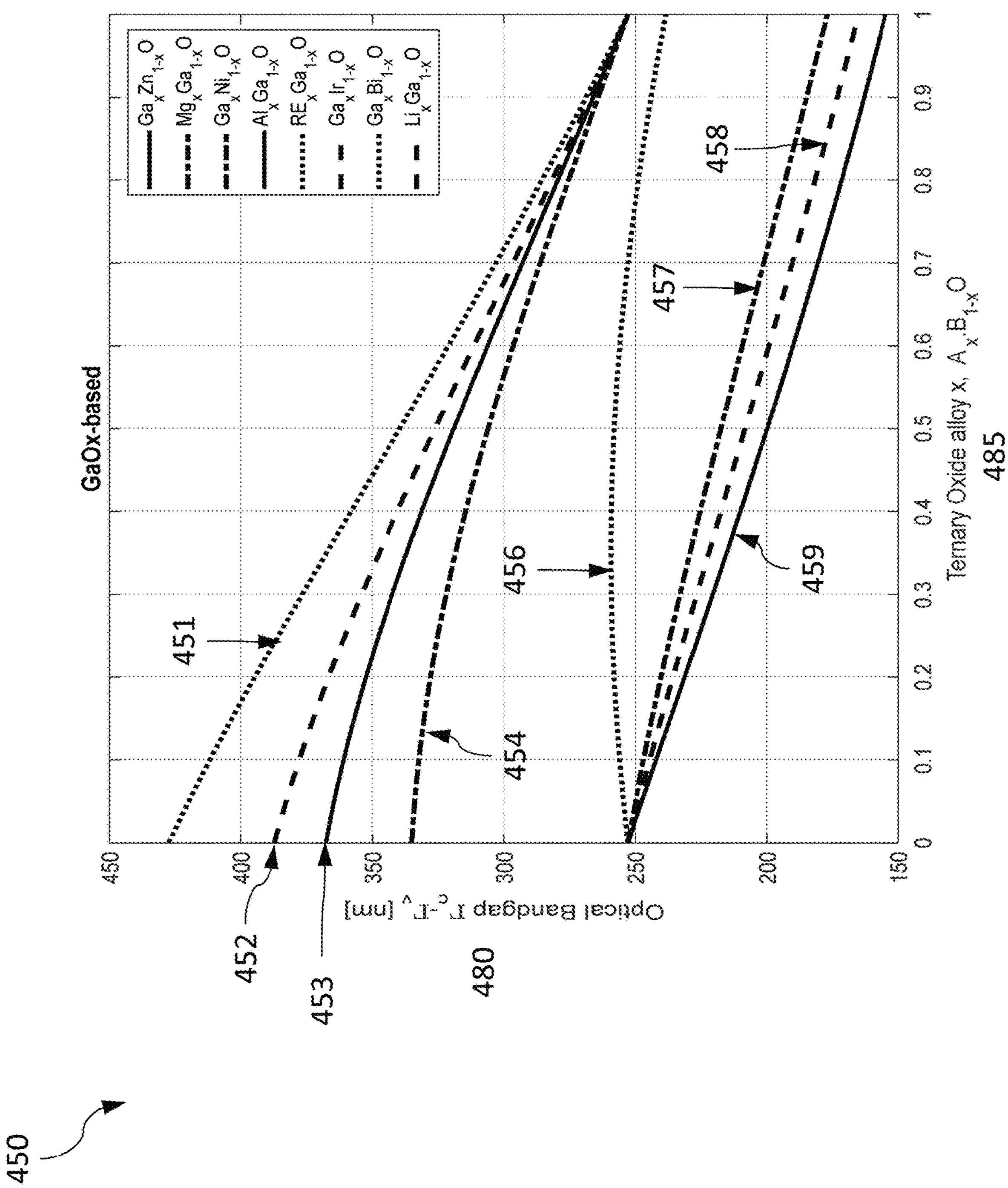
FIG. 11 is a ternary alloy optical bandgap tuning curve for metal oxide semiconductor ternary compositions based on Gallium-Oxide in accordance with illustrative embodiments of the present disclosure.

Referring to FIG. 11, a possible selection of ternary metal oxide semiconductors 450 is shown for the cases of Gallium-Oxide-based (GaOx-based) compositions 485. Optical bandgap 480 for various values of x in ternary oxide alloys $A_xB_{1-x}O$ are graphed. As previously stated, metal oxides may exhibit several stable forms of crystal symmetry structure which is further complicated by the addition of another specie to form a ternary. However, the example general trend can be found by selectively incorporating or alloying Aluminum, group-II cations {Mg, Ni, Zn}, Iridium, Erbium and Gadolinium atoms, as well as Lithium atoms advantageously with Ga-Oxide. Ni and Ir typically form deep d-bands but for high Ga % can form useful optical structures. Ir is capable of multiple valence states, where in some embodiments the $Ir_2O_3$ form is utilized.

Alloying one of X={Ir, Ni, Zn, Bi} into $Ga_xX_{1-x}O$ decreases the available optical bandgap (refer to curves labelled 451, 452, 453, 454). Conversely, alloying one of Y={Al, Mg, Li, RE} increases the available bandgap of the ternary $Ga_xY_{1-x}O$ (refer to curves 456, 457, 458, 459).

FIG. 11 can therefore be understood with application toward forming the optically emissive and conductivity type regions in accordance with the present disclosure.

Figure 12:
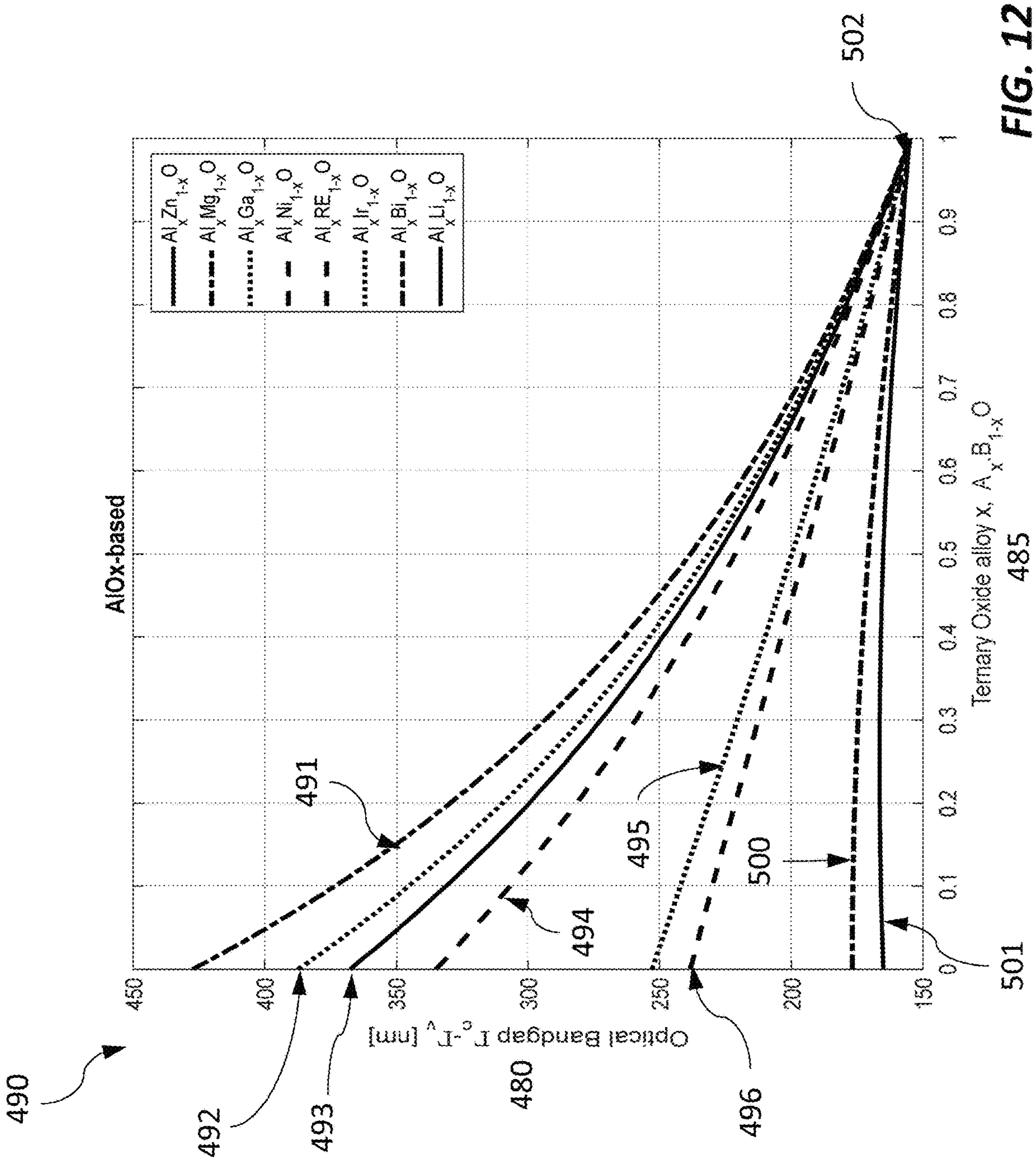
FIG. 12 is a ternary alloy optical bandgap tuning curve for metal oxide semiconductor ternary compositions based on Aluminum-Oxide in accordance with illustrative embodiments of the present disclosure.

Similarly, FIG. 12 discloses a possible selection of ternary metal oxide semiconductors 490 for the cases of Aluminum-Oxide-based (AlOx-based) compositions 485 in relation to optical bandgap 480. Scrutinizing the curves, it can be seen that alloying one of X={Ir, Ni, Zn, Mg, Bi, Ga, RE, Li} into $Al_xX_{1-x}O$ decreases the available optical bandgap. The group of Y={Ni, Mg, Zn} form spinel crystal structures but all decreases the available bandgap of the ternary $Al_xY_{1-x}O$ (refer to curves 491, 492, 493, 494, 495, 496, 500, 501). FIG. 12 also shows the energy gap 502 of the alpha-phase aluminum oxide ($Al_2O_3$) having rhombohedral crystal symmetry.

FIG. 12 can therefore be understood with application to forming the optically emissive and conductivity type regions in accordance with the present disclosure. Shown in FIG. 28 is a chart 2800 of potential ternary oxide combinations for ($0 \leq x \leq 1$) that may be adopted in accordance with the present disclosure. Chart 2800 shows the crystal growth modifier down the left-hand column and the host crystal across the top of the chart.

Figure 13B:
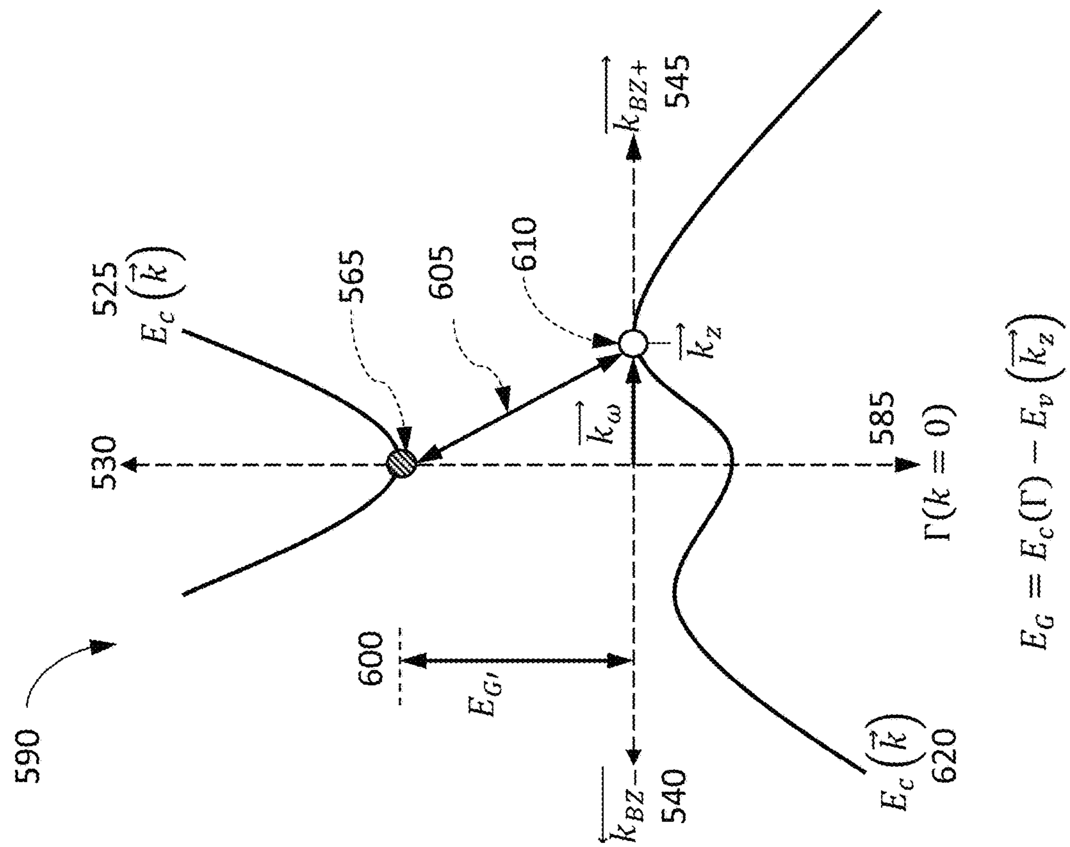
FIGS. 13A and 13B are electron energy-vs.-crystal momentum representations of metal oxide based optoelectronic semiconductors showing a direct bandgap (FIG. 13A) and indirect bandgap (FIG. 13B) in accordance with illustrative embodiments of the present disclosure.
Figure 13A:
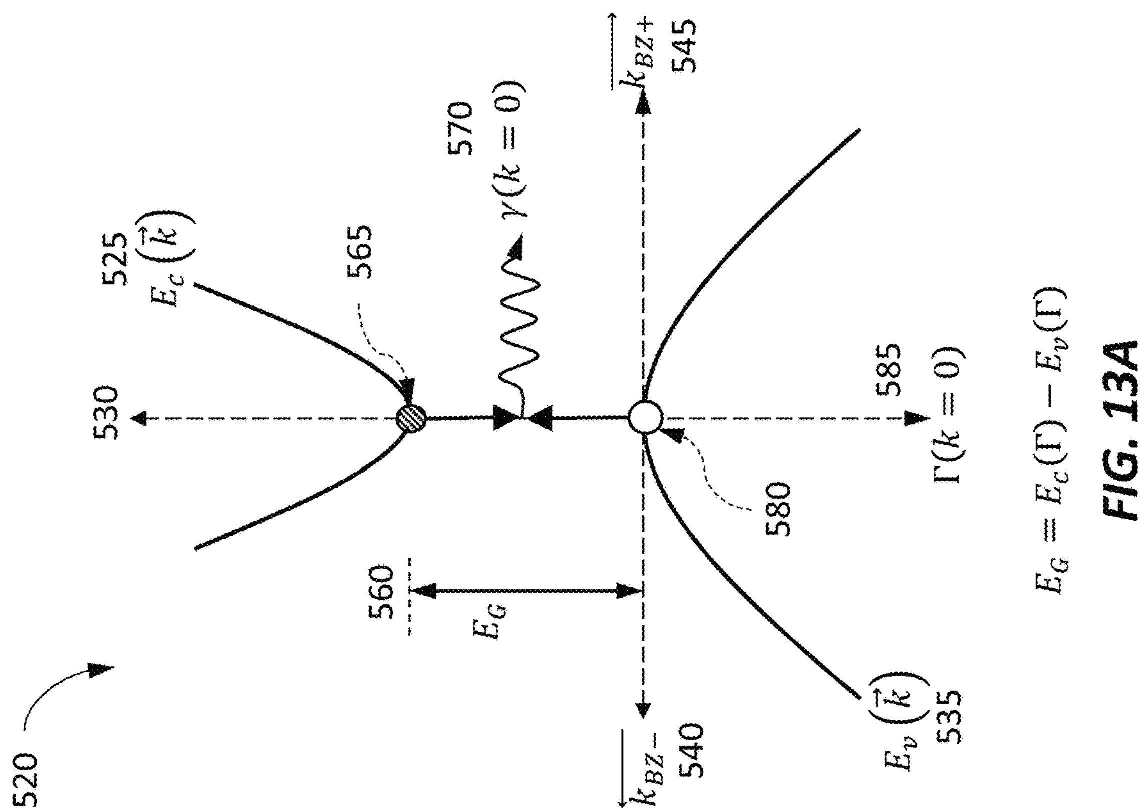

FIGS. 13A and 13B are electron energy-vs-crystal momentum representations of possible metal oxide based semiconductors showing a direct bandgap (FIG. 13A) and indirect bandgap (FIG. 13B) and are illustrative of concepts related to the formation of optoelectronic devices in accordance with the present disclosure. It is known by workers in the field of quantum mechanics and crystal structure design that symmetry directly dictates the electronic configuration or band structure of a single crystal structure.

In general, for application to optically emissive crystal structures, there exists two classes of electronic band structure as shown in FIGS. 13A and 13B. The fundamental process utilized in optoelectronic devices of the present disclosure is the recombination of physical (massive) electron and hole particle-like charge carriers which are manifestations of the allowed energy and crystal momentum. The recombination process can occur conserving crystal momentum of the incident carriers from their initial state to the final state.

To achieve a final state, wherein the electron and hole annihilate to form a massless photon (i.e., momentum $k_y$ of final state massless photon $k_y=0$), requires a special E-k band structure which is shown in FIG. 13A. A metal oxide semiconductor structure having pure crystal symmetry can be calculated using various computational techniques. One such method is the Density Function Theory wherein first principles can be used to construct an atomic structure comprising distinction pseudopotentials attached to each constituent atom comprising the structure. Iterative computational schemes for ab initio total-energy calculations using a plane-wave basis can be used to calculate the band structure due to the crystal symmetry and spatial geometry.

FIG. 13A represents the reciprocal space energy-versus-crystal momentum or band structure 520 for a crystal structure. The lowest lying conduction band 525 having energy dispersion $E_c(\vec{k})$ with respect to crystal momentum vector $k=\vec{k}=(k_x k_y k_z)$ describes the allowed configuration space for electrons. The highest lying valence band 535 having energy dispersion $E_v(\vec{k})$ also describes the allowed energy states for holes (positively charged crystal particles).

The dispersions 525 and 535 are plotted with respect to the electron energy (increasing direction 530, decreasing direction 585) in units of electron volts and the crystal momentum in units of reciprocal space (positive $K_{BZ}$ 545 and negative $K_{BZ}$ 540 representing distinct crystal wavevectors from the Brillouin zone center). The band structure 520 is shown at the highest symmetry point of the crystal labelled as the Γ-point representing the band structure at k=0. The bandgap is defined by the energy difference between the minima and maxima of 525 and 535, respectively. An electron propagating through the crystal will minimize energy and relax to the conduction band minimum 565, similarly a hole will relax to the lowest energy state 580.

If 565 and 580 are simultaneously located at k=0 then a direct recombination process can occur wherein the electron and hole annihilate and create a new massless photon 570 with energy approximately equal to the bandgap energy 560. That is, electron and holes at k=0 can recombine and conserve crystal moment to create a massless particle—termed a 'direct' bandgap material. As will be disclosed, this situation is rare in practice with only a small subset of all crystal symmetry type semiconductors exhibiting this advantageous configuration.

Referring now to crystal structure 590 of FIG. 13B, where the primary bands 525 and 620 of the band structure do not have their respective minima 565 and maxima 610 at k=0, this is termed an 'indirect' configuration. The minimum bandgap energy 600 is still defined as the energy difference between the conduction band minimum and the valence band maximum which do occur at the same wavevector, and is known as the indirect bandgap energy 600. Optical emission processes are clearly not favorable as crystal momentum cannot be conserved for the recombination event and requires secondary particles to conserve crystal momentum, such as crystal vibrational quanta phonons. In metal oxides, the longitudinal optical phonon energy scales with bandgap and are in comparison very large to those found in for example, GaAs, Si and the like.

It is therefore challenging to use indirect E-k configurations for the purpose of optically emissive regions. The present disclosure describes methods to manipulate an otherwise indirect bandgap of a specific crystal symmetry structure and transform or modify the zone-center k=0 character of the band structure into direct bandgap dispersion suitable for optical emission. These methods are now disclosed for application to the manufacture of optoelectronic devices and in particular to the fabrication of UVLEDs.

Even if there exists a direct bandgap configuration, the design selection is then confronted by specific crystal symmetry of given metal oxide having electric dipole selection rules governed by the symmetry character group assigned to each of the energy bands. For the case of $Ga_2O_3$ and $Al_2O_3$ the optical absorption is governed between the lowest conduction band and the three topmost valence bands.

Figure 13E:
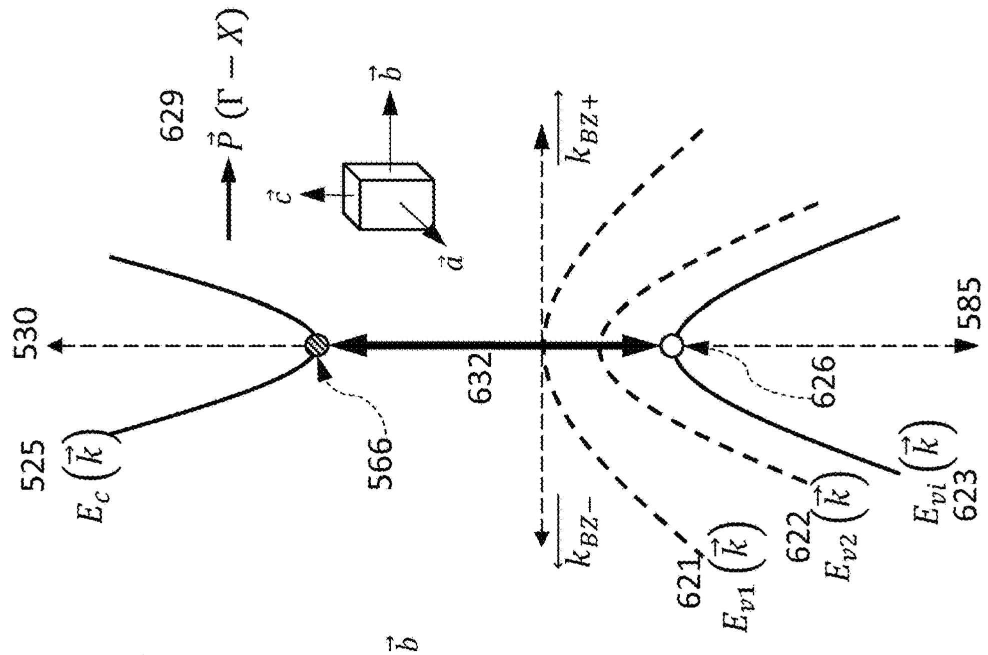
FIGS. 13C-13E are electron energy-vs.-crystal momentum representations showing allowed optical emission and absorption transitions at k=0 with respect to the axes of $Ga_2O_3$ monoclinic crystal symmetry in accordance with an illustrative embodiment of the present disclosure.
Figure 13D:
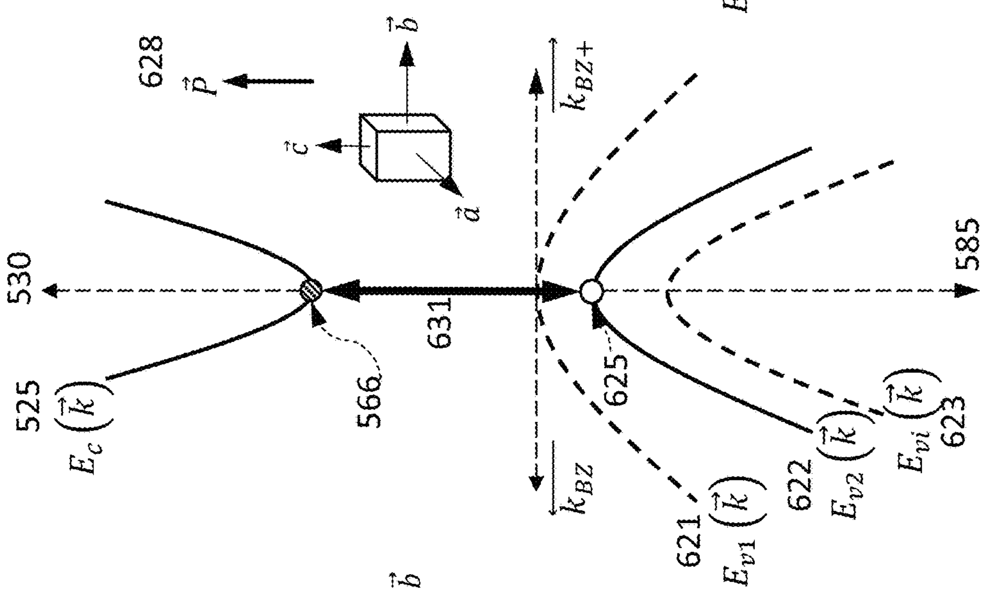
Figure 13C:
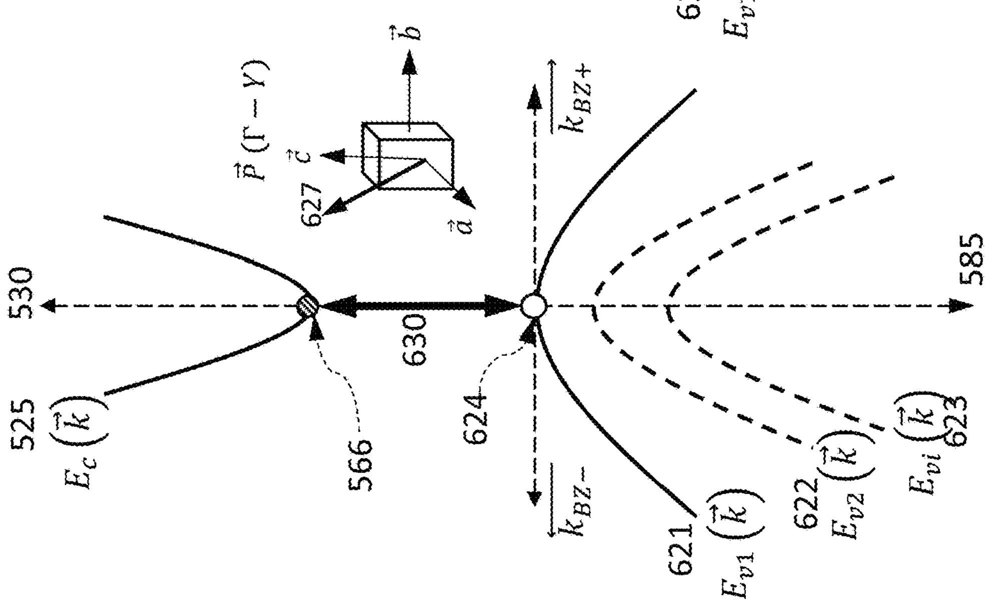

FIGS. 13C-13E show the optical emission and absorption transition at k=0 with respect to a $Ga_2O_3$ monoclinic crystal symmetry. FIGS. 13C-13E each show three valence bands $E_{vi}(k)$ 621, 622 and 623. In FIG. 13C, the optically allowed electric dipole transition are shown for an electron 566 and a hole 624 being allowed for optical polarization vectors within the a-axis and c-axis of the monoclinic unit cell. With respect to the reciprocal space E-k this corresponds to wave vector 627 in the Γ-Y branches. Similarly, electric-dipole transition between electron 566 and hole 625 in FIG. 13D are allowed for polarizations along the c-axis 628 of the crystal unit cell. Furthermore, higher energy transitions between electron 566 and hole 626 in FIG. 13E are allowed for optical polarization fields along the b-axis 629 of the unit cell corresponding to the E-k (Γ-X) branch.

Clearly, the magnitude of the energy transitions 630, 631 and 632 in FIGS. 13C, 13D and 13E respectively are increasing with only the lowest energy transition favorable for optical light emission. If, however, the Fermi energy level ($E_F$) is configured such that the lowest lying valence band 621 is above $E_F$ and 622 below $E_F$, then optical emission can occur at energy 631. These selection rules are particularly useful when designing waveguide devices which are optical polarization dependent for specific TE, TM and TEM modes of operation.

Figure 14B:
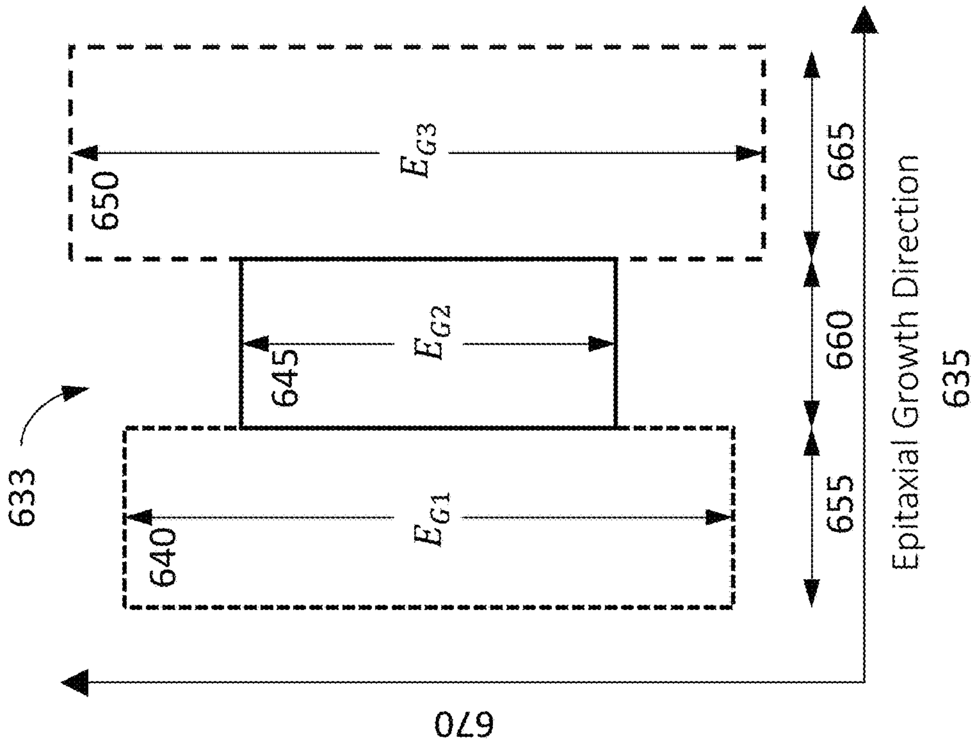
FIGS. 14A and 14B depict sequential deposition of a plurality of heterogenous metal oxide semiconductor layers having dissimilar crystal symmetry types to embed an optical emission region in accordance with an illustrative embodiment of the present disclosure.
Figure 14A:
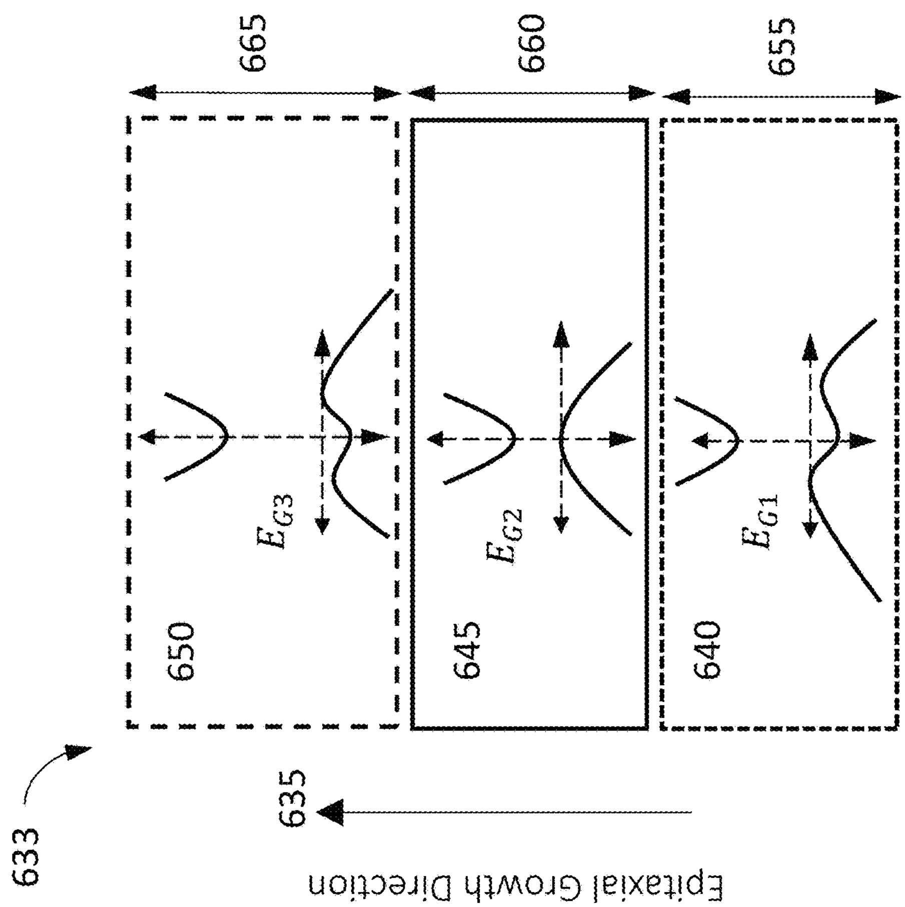

By reference to the explanations above relating to band structure, referring now to FIGS. 14A-14B these diagrams show how these complex elements may be incorporated in the device structure 160. Each functional region of the UVLED has a specific E-k dispersion having both indirect and direct type materials—which can also be due to dramatically different crystal symmetry types. This then allows the optically emissive region to be embedded advantageously within the device.

FIGS. 14A and 14B show the representations of complex E-k materials by single blocks 633 defined by the layer thickness 655, 660 and 665 and the fundamental bandgap energy 640, 645 and 650, respectively. The relative alignments of the conduction and valence band edges are shown in blocks 633. FIG. 14B represents the electron energy 670 versus a spatial growth direction 635 for three distinct materials having bandgap energies 640, 645 and 650. For example, a first region deposited along a growth direction 635 using an indirect type crystal but otherwise having a final surface lattice constant geometry capable of providing mechanical elastic deformation of the subsequent crystal 645 is possible. For example, this can occur for the growth of $AlGaO_3$ directly on $Ga_2O_3$.

Epitaxial Fabrication Methods

Figure 15:
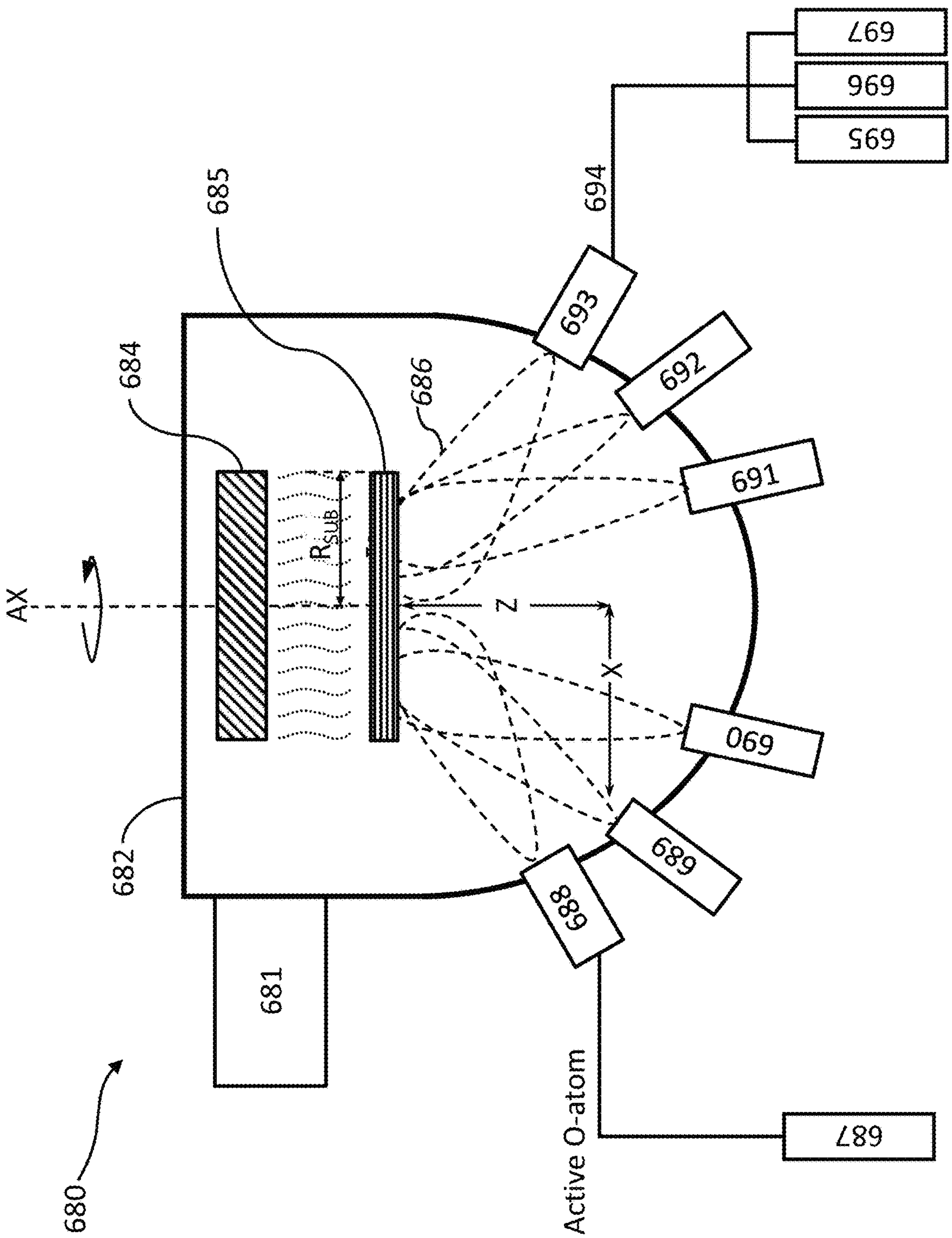
FIG. 15 is a schematic representation of an atomic deposition tool for the creation of multi-layered metal oxide semiconductor films comprising a plurality of material compositions in accordance with illustrative embodiments of the present disclosure.

Non-equilibrium growth techniques are known in the prior art and are called Atomic and Molecular Beam Epitaxy, Chemical Vapor Epitaxy or Physical Vapor Epitaxy. Atomic and Molecular Beam Epitaxy utilizes atomic beams of constituents directed toward a growth surface spatially separate as shown FIG. 15. While molecular beams are also used it is the combination of molecular and atomic beams which may be used in accordance with the present disclosure.

One guiding principle is the use of pure constituent sources that can be multiplexed at a growth surface through favorable condensation and kinematically favored growth conditions to physically build a crystal atomic layer by layer. While the growth crystal can be substantially self-assembled, the control of the present methods can also intervene at the atomic level and deposit single specie atomic thick epilayers. Unlike equilibrium growth techniques which rely on the thermodynamic chemical potentials for bulk crystal formation, the present techniques can deposit extraordinarily thin atomic layers at growth parameters far from the equilibrium growth temperature for a bulk crystal.

In one example, $Al_2O_3$ films are formed at film formation temperature in the range of 300-800° C., whereas the conventional bulk equilibrium growth of $Al_2O_3$(Sapphire) is produced well in excess of 1500° C. requiring a molten reservoir containing Al and O liquid which can be configured to position a solid seed crystal in close proximity to the molten surface. Careful positioning of a seed crystal orientation is placed in contact to the melt which forms a recrystallized portion in the vicinity of the melt. Pulling the seed and partially solidified recrystallized portion away from the melt forms a continuous crystal boule.

Such equilibrium growth methods for metal oxides limit the possible combinations of metals and the complexity of discontinuous regions possible for heteroepitaxial formation of complex structures. The non-equilibrium growth techniques in accordance with the present disclosure can operate at growth parameters well away from the melting point of the target metal oxide and can even modulate the atomic specie present in a single atomic layer of a unit cell of crystal along a preselected growth direction. Such non-equilibrium growth methods are not bound by equilibrium phase diagrams. In one example, the present methods utilize evaporated source materials comprising the beams impinging upon the growth surface to be ultrapure and substantially charge neutral. Charged ions are in some cases created but these should be minimized as best possible.

For the growth of metal oxides the constituent source beams can be altered in a known way for their relative ratio. For example, oxygen-rich and metal-rich growth conditions can be attained by control of the relative beam flux measured at the growth surface. While nearly all metal oxides grow optimally for oxygen-rich growth conditions, analogous to arsenic-rich growth of gallium arsenide GaAs, some materials are different. For example, GaN and AlN require metal rich growth conditions with extremely narrow growth window, which are one of the most limiting reasons for high volume production.

While metal oxides favor oxygen-rich growth with wide growth windows—there are opportunities to intervene and create intentional metal-deficient growth conditions. For example, both $Ga_2O_3$ and NiO favor cation vacancies for the production of active hole conductivity type. A physical cation vacancy can produce an electronic carrier type hole and thus favor p-type conduction.

Figure 41:
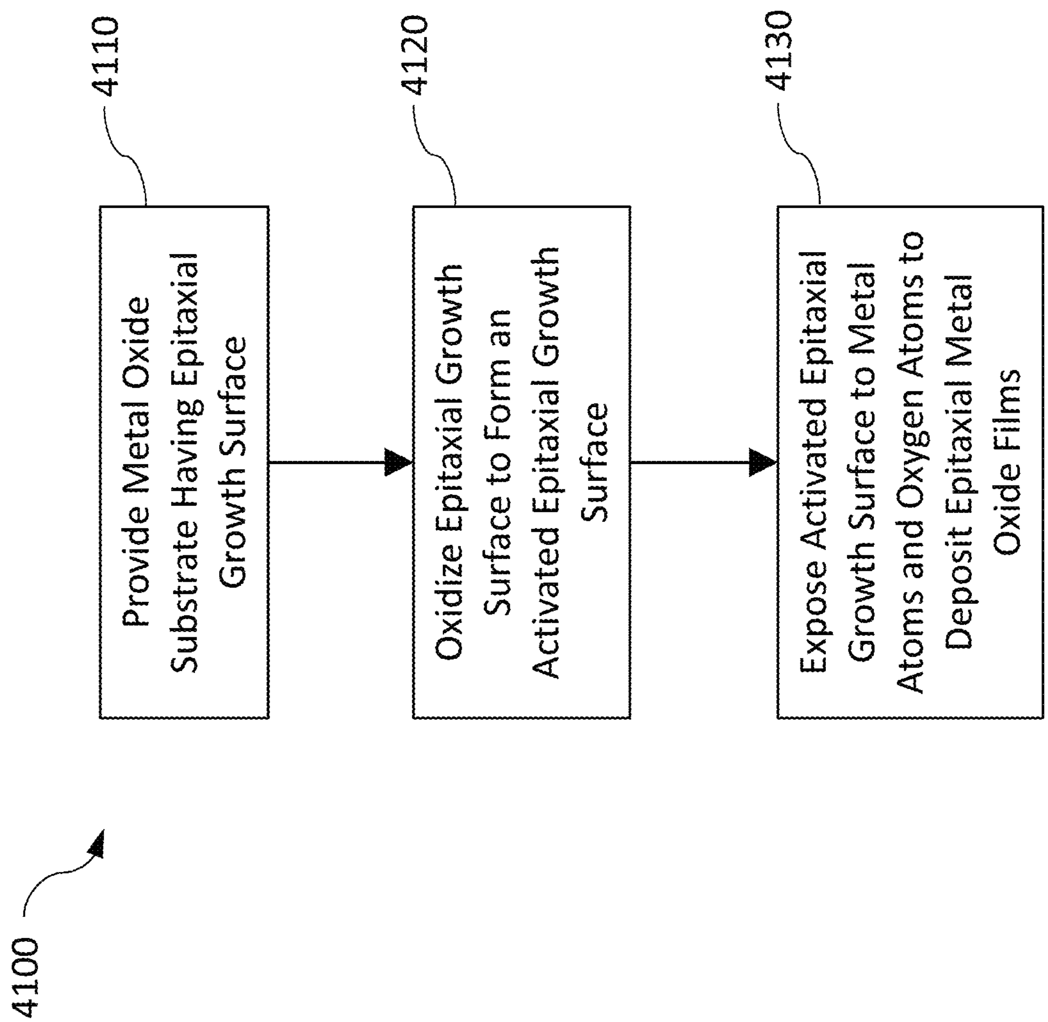
FIG. 41 is a process flow diagram for forming an optoelectronic semiconductor device in accordance with an illustrative embodiment of the present disclosure.

Referring now to FIG. 41, and by way of overview, there is shown a process flow diagram of a method 4100 for forming an optoelectronic semiconductor device according to the present disclosure. In one example the optoelectronic semiconductor device is configured to emit light in the wavelength of about 150 nm to about 280 nm.

At step 4110 a metal oxide substrate is provided having an epitaxial growth surface. At step 4120, the epitaxial growth surface is oxidized to form an activated epitaxial growth surface. At step 4130, the activated epitaxial growth surface is exposed to one or more atomic beams each comprising high purity metal atoms and one or more atomic beams comprising oxygen atoms under conditions to deposit two or more epitaxial metal oxide films or layers.

Referring again to FIG. 15 there is shown an epitaxial deposition system 680 for providing Atomic and Molecular Beam Epitaxy in accordance with, in one example, method 4100 referred to in FIG. 41.

In one example, a substrate 685 rotates about an axis AX and is heated radiatively by a heater 684 with emissivity designed to match the absorption of a metal oxide substrate. The high vacuum chamber 682 has a plurality of elemental sources 688, 689, 690, 691, 692 capable of producing atomic or molecular species as beams of a pure constituent of atoms. Also shown are plasma source or gas source 693, and gas feed 694 which is a connection to gas source 693.

For example, sources 689-692 may comprise effusion type sources of liquid Ga and Al and Ge or precursor based gases. The active oxygen sources 687 and 688 may be provided via plasma excited molecular oxygen (forming atomic-O and $O_2$*), ozone ($O_3$), nitrous oxide ($N_2O$) and the like. In some embodiments, plasma activated oxygen is used as a controllable source of atomic oxygen. A plurality of gases can be injected via sources 695, 696, 697 to provide a mixture of different species for growth. For example, atomic and excited molecular nitrogen enable n-type, p-type and semi-insulating conductivity type films to be created in GaOxide-based materials. The vacuum pump 681 maintains vacuum, and mechanical shutters intersecting the atomic beams 686 modulate the respective beam fluxes providing line of sight to the substrate deposition surface.

This method of deposition is found to have particular utility for enabling flexibility toward incorporating elemental species into Ga-Oxide based and Al-Oxide based materials.

Figure 16:
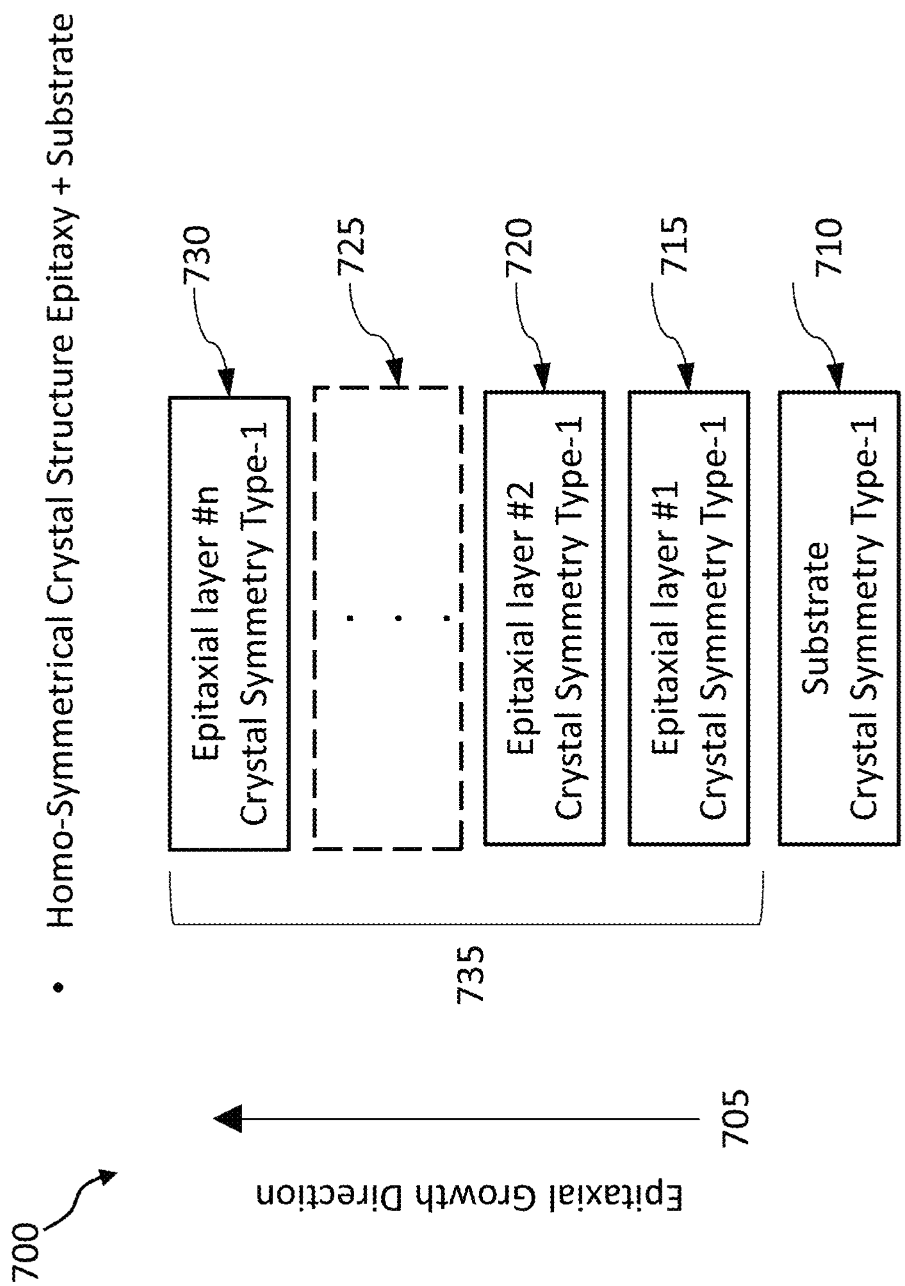
FIG. 16 is a representation of sequential deposition of layers and regions having similar crystal symmetry types matching the substrate in accordance with an illustrative embodiment of the present disclosure.

FIG. 16 shows an embodiment of an epitaxial process 700 for constructing UVLEDs as a function of the growth direction 705. Homo-symmetry type layers 735 can be formed using a native substrate 710. The substrate 710 and crystal structure epitaxy layers 735 are homo-symmetrical, being labeled here as Type-1. For example, a corundum type sapphire substrate can be used to deposit corundum crystal symmetry type layers 715, 720, 725, 730. Yet another example is the use of a monoclinic substrate crystal symmetry to form monoclinic type crystal symmetry layers 715-730. This is readily possible using native substrates for growth of the target materials disclosed herein (e.g., see Table I of FIG. 43A). Of particular interest is the growth of epitaxial layer formations such as corundum $AlGaO_3$ having a plurality of compositions of layers 715-730. Alternatively, a monoclinic $Ga_2O_3$ substrate 710 can be used to form a plurality of monoclinic $AlGaO_3$ compositions of layers 715-730.

Figure 17:
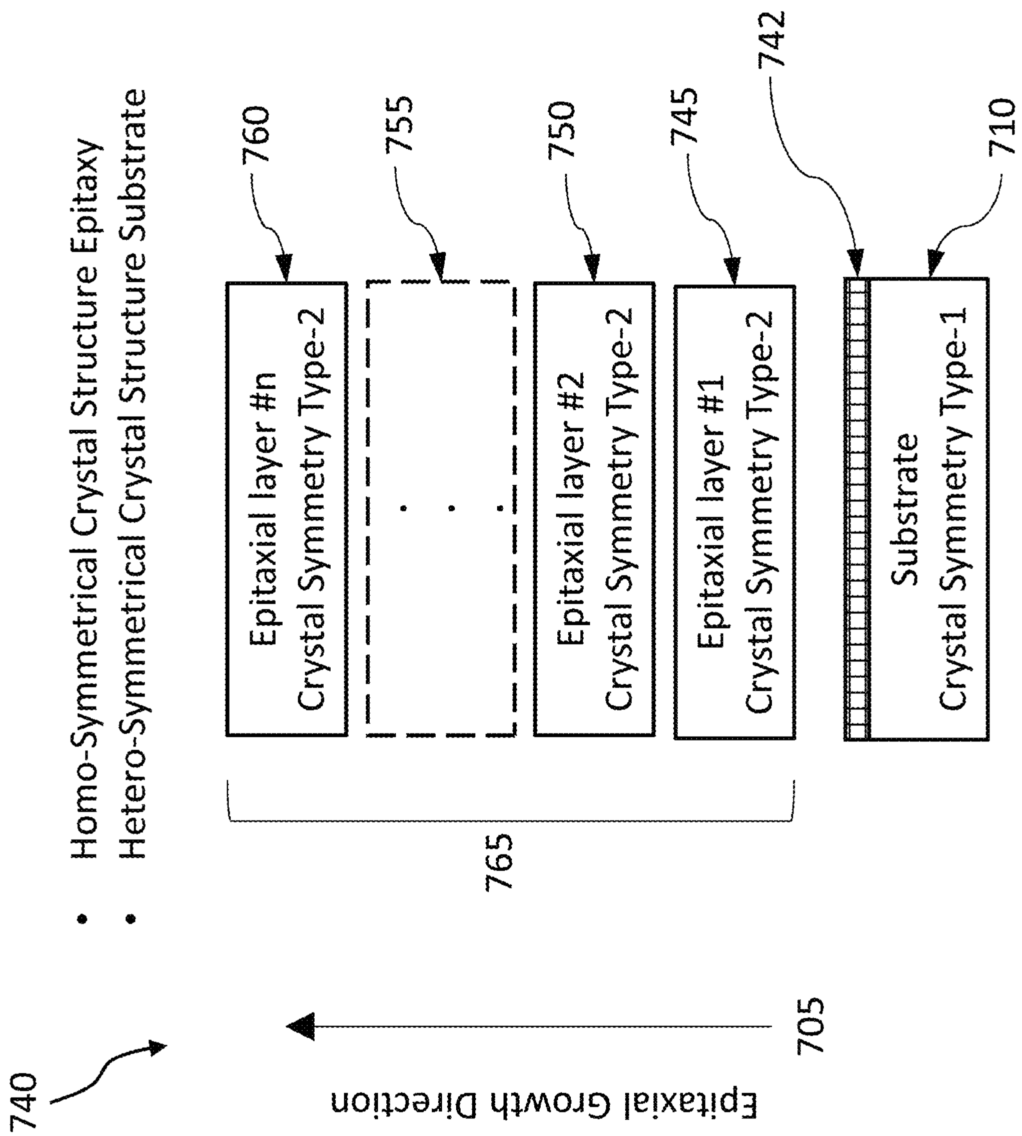
FIG. 17 depicts sequential deposition of regions having a different crystal symmetry to an underlying first surface of a substrate where a surface modification to the substrate is shown in accordance with an illustrative embodiment of the present disclosure.

Referring now to FIG. 17, a further epitaxial process 740 is illustrated that uses a substrate 710 with crystal symmetry that is inherently dissimilar to the target epitaxial metal oxide epilayer crystal types of layers 745, 750, 755, 760. That is, the substrate 710 is of crystal symmetry Type-1 which is hetero-symmetrical to the crystal structure epitaxy 765 that is made of layers 745, 750, 755, 760 that are all Type-2.

For example, C-plane corundum sapphire can be used as a substrate to deposit at least one of a monoclinic, triclinic or hexagonal $AlGaO_3$ structure. Another example is the use of (110)-oriented monoclinic $Ga_2O_3$ substrate to epitaxially deposit corundum $AlGaO_3$ structure. Yet a further example is the use of a MgO (100) oriented cubic symmetry substrate to epitaxially deposit (100)-oriented monoclinic $AlGaO_3$ films.

Process 740 can also be used to create corundum $Ga_2O_3$ modified surface 742 by selectively diffusing Ga-atoms into the surface structure provided by the $Al_2O_3$ substrate. This can be done by elevating the growth temperature of the substrate 710 and exposing the $Al_2O_3$ surface to an excess of Ga while also providing an O-atom mixture. For Ga-rich conditions and elevated temperatures Ga-adatoms attach selectively to O-sites and form a volatile sub-oxide $Ga_2O$, and further excess Ga diffuses Ga-adatoms into the $Al_2O_3$ surface. Under suitable conditions a corundum $Ga_2O_3$ surface structure results enabling lattice matching of Ga-rich $AlGaO_3$ corundum constructions or thicker layers can result in monoclinic $AlGaO_3$ crystal symmetry.

Figure 18:
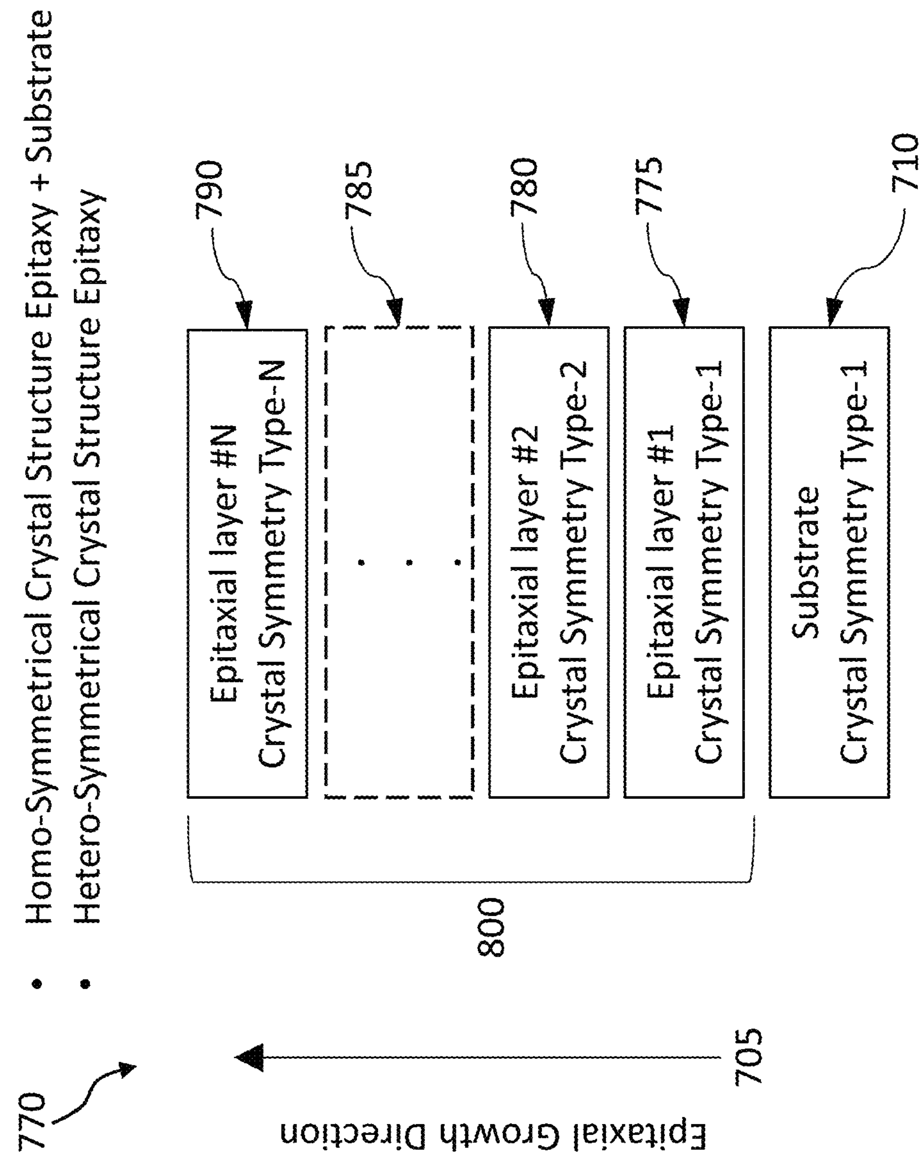
FIG. 18 depicts a buffer layer deposited with the same crystal symmetry as an underlying substrate to enable subsequent hetero-symmetry deposition of oxide materials in accordance with an illustrative embodiment of the present disclosure.

FIG. 18 describes yet another embodiment of a process 770 wherein a buffer layer 775 is deposited on the substrate 710, the buffer layer 775 having the same crystal symmetry type as substrate 710 (Type-1), thereby enabling atomically flat layers to seed alternate crystal symmetry types of layers 780, 785, 790 (Type 2, 3 . . . N). For example, a monoclinic buffer 775 is deposited upon a monoclinic bulk $Ga_2O_3$ substrate 710. Then cubic MgO and NiO layers 780-790 are formed. In this figure, the hetero-symmetrical crystal structure epitaxy with the homo-symmetrical buffer layer is labeled as structure 800.

Figure 19:
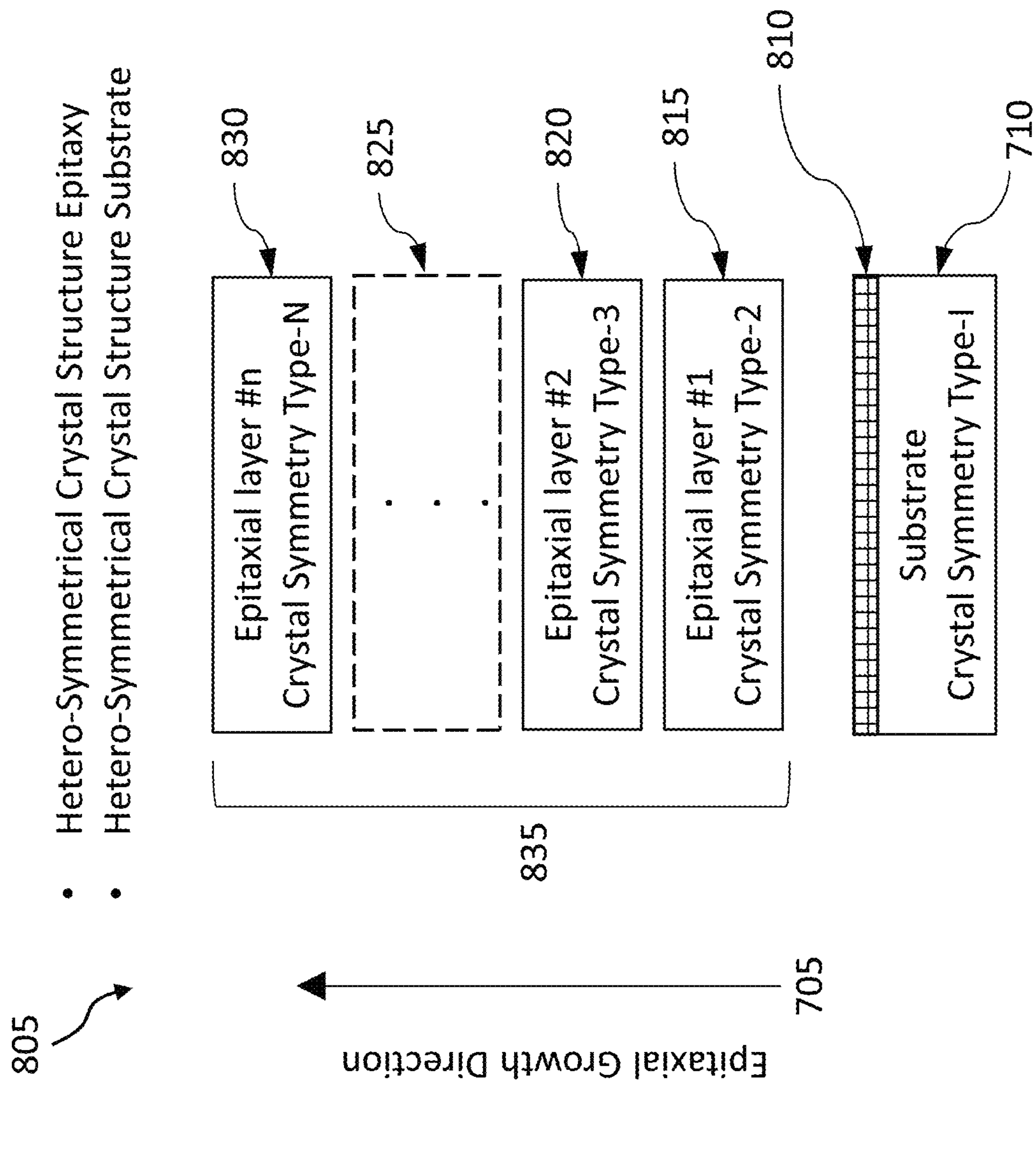
FIG. 19 depicts a structure comprising a plurality of hetero-symmetrical regions sequentially deposited as a function of the growth direction in accordance with an illustrative embodiment of the present disclosure.

FIG. 19 depicts yet a further embodiment of a process 805 showing sequential variation along a growth direction 705 of a plurality of crystal symmetry types. For example, a corundum $Al_2O_3$ substrate 710 (Type-1) creates an O-terminated template 810 which then seeds a corundum $AlGaO_3$ layer 815 of Type-2 crystal symmetry. A hexagonal $AlGaO_3$ layer 820 of Type-3 crystal symmetry can then be formed followed by cubic crystal symmetry type (Type-N) such as a MgO or NiO layer 830. The layers 815, 820, 825 and 830 are collectively labeled in this figure as hetero-symmetrical crystal structure epitaxy 835. Such crystal growth matching is possible using vastly different crystal symmetry type layers if in-plane lattice co-incidence geometry can occur. While rare, this is found to be possible in the present disclosure with (100)-oriented cubic $Mg_xNi_{1-x}O$ ($0 \leq x \leq 1$) and monoclinic $AlGaO_3$ compositions. This procedure can then be repeated along a growth direction.

Figure 20A:
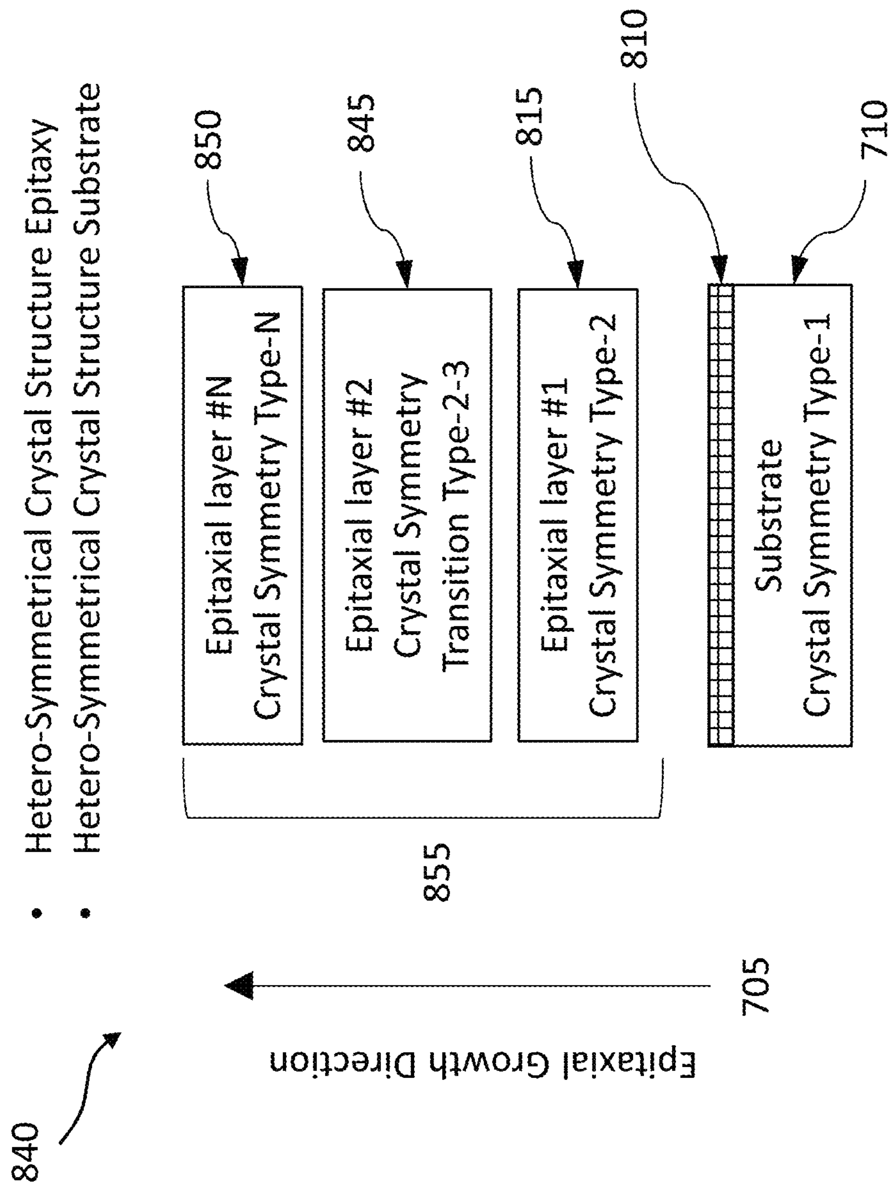
FIG. 20A shows a crystal symmetry transition region linking two deposited crystal symmetry types in accordance with an illustrative embodiment of the present disclosure.

Yet another embodiment is shown in FIG. 20A where the substrate 710 of Type-1 crystal symmetry has a prepared surface (template 810) seeding a first crystal symmetry type 815 (Type-2) which then can be engineered to transition to another symmetry type 845 (Transition Type 2-3) over a given layer thickness. An optional layer 850 can then be grown with yet another crystal symmetry type (Type-N). For example, C-plane sapphire substrate 710 forms a corundum $Ga_2O_3$layer 815 which then relaxes to a hexagonal $Ga_2O_3$ crystal symmetry type or a monoclinic crystal symmetry type. Further growth of layer 850 then can be used to form a high quality relaxed layer of high crystal structure quality. The layers 815, 845 and 850 are collectively labeled in this figure as hetero-symmetrical crystal structure epitaxy 855.

Figure 20B:
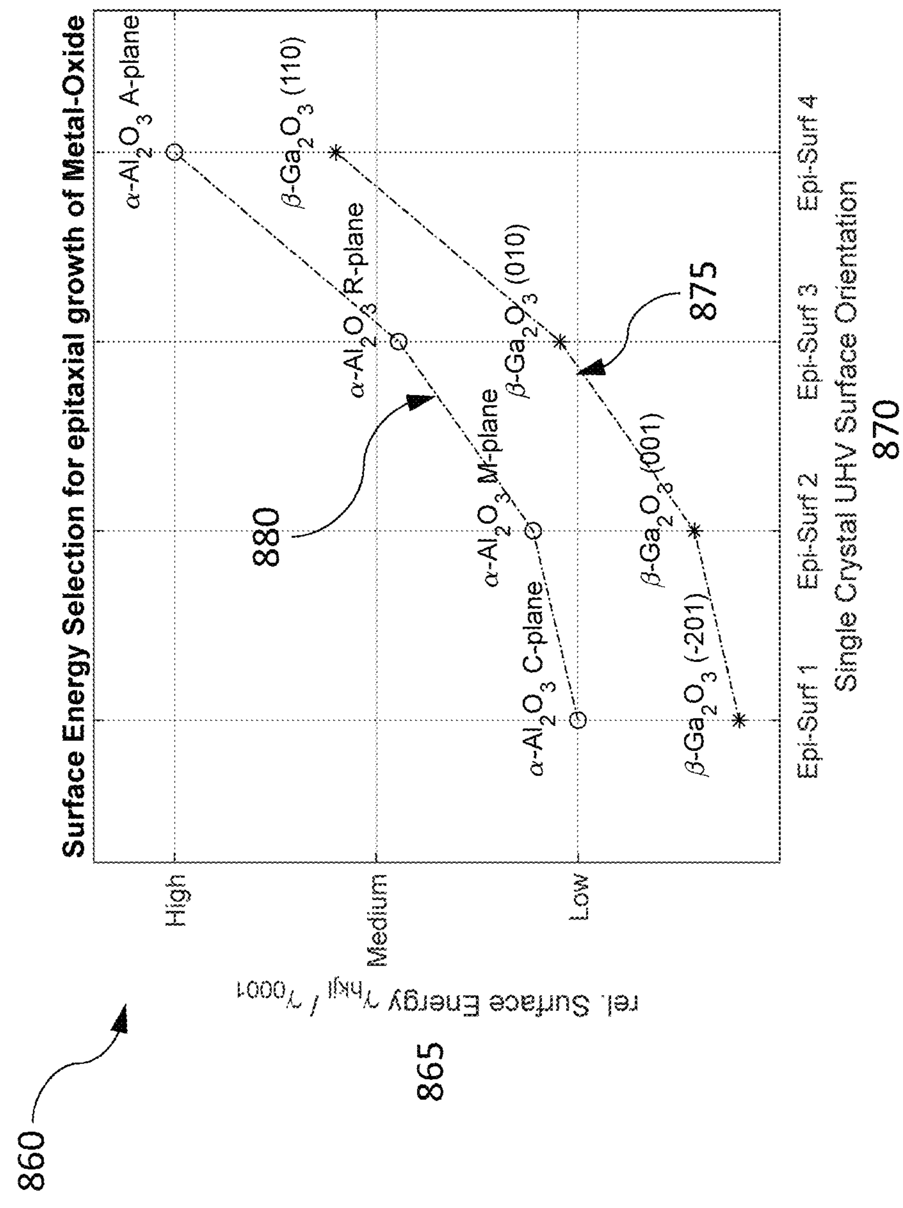
FIG. 20B shows the variation in a particular crystal surface energy as a function of crystal surface orientation for the cases of corundum-Sapphire and monoclinic Gallia single crystal oxide materials in accordance with an illustrative embodiment of the present disclosure.

Referring now to FIG. 20B, there is shown a chart 860 of the variation in a particular crystal surface energy 865 as a function of crystal surface orientation 870 for the cases of corundum-Sapphire 880 and monoclinic Gallia single crystal oxide materials 875. It has been found in accordance with the present disclosure that the crystal surface energy for technologically relevant corundum $Al_2O_3$ 880 and monoclinic substrates can be used to selectively form $AlGaO_3$ crystal symmetry types.

For example, Sapphire C-plane can be prepared under O-rich growth conditions to selectively grow hexagonal $AlGaO_3$ at lower growth temperature (<650° C.) and monoclinic $AlGaO_3$ at higher temperatures (>650° C.). Monoclinic $AlGaO_3$ is limited to Al % of approximately 45-50% owing to the monoclinic crystal symmetry having approximately 50% tetrahedrally coordinated bonds (TCB) and 50% octahedrally coordinated bonds (OCB). While Ga can accommodate both TCB and OCB, Al seeks in preference the OCB sites. R-plane sapphire can accommodate corundum $AlGaO_3$ compositions with Al % ranging 0-100% grown at low temperatures of less than about 550° C. under O-rich conditions and monoclinic $AlGaO_3$ with Al<50% at elevated temperatures >700° C.

M-plane sapphire surprisingly provides yet an even more stable surface which can grow exclusively corundum $AlGaO_3$ composition for Al %=0-100%, providing atomically flat surfaces.

Even more surprising is the discovery of A-plane sapphire surfaces presented for $AlGaO_3$ which are capable of extremely low defect density corundum $AlGaO_3$ compositions and superlattices (see discussion below). This result is fundamentally due to the fact that corundum $Ga_2O_3$ and corundum $Al_2O_3$ both share exclusive crystal symmetry structure formed by OCBs. This translates into very stable growth conditions with a growth temperature window ranging from room temperature to 800° C. This clearly shows attention toward crystal symmetry designs that can create new structural forms applicable to LEDs such as UVLEDs.

Similarly, native monoclinic $Ga_2O_3$ substrates with (−201)-oriented surfaces can only accommodate monoclinic $AlGaO_3$ compositions. The Al % for (−201)-oriented films is significantly lower owing to the TCB presented by the growing crystal surface. This does not favor large Al fractions but can be used to form extremely shallow MQWs of $AlGaO_3/Ga_2O_3$.

Surprisingly the (010)- and (001)-oriented surface of monoclinic $Ga_2O_3$ can accommodate monoclinic $AlGaO_3$ structures of exceedingly high crystal quality. The main limitation for $AlGaO_3$ Al % is the accumulation of biaxial strain. Careful strain management in accordance with the present disclosure using $AlGaO_3/Ga_2O_3$ superlattices also finds a limiting Al %<40%, with higher quality films achieved using (001)-oriented $Ga_2O_3$ substrate. Yet a further example of (010)-oriented monoclinic $Ga_2O_3$ substrates is the extremely high quality lattice matching of $MgGa_2O_4$ (111)-oriented films having cubic crystal symmetry structures.

Similarly, $MgAl_2O_4$ crystal symmetry is compatible with corundum $AlGaO_3$ compositions. It is also found experimentally in accordance with the present disclosure that (100)-oriented $Ga_2O_3$ provides an almost perfect coincidence lattice match for cubic MgO(100) and NiO(100) films. Even more surprising is the utility of (110)-oriented monoclinic $Ga_2O_3$ substrates for the epitaxial growth of corundum $AlGaO_3$.

These unique properties provide for the selective utility of $Al_2O_3$ and $Ga_2O_3$ crystal symmetry type substrates, as an example, with the selective use of crystal surface orientations to offer many advantages for the fabrication of LEDs and in particular UVLED.

In some embodiments, conventional bulk crystal growth techniques may be adopted to form corundum $AlGaO_3$ composition bulk substrates having corundum and monoclinic crystal symmetry types. These ternary $AlGaO_3$ substrates can also prove valuable for application to UVLED devices.

Band Structure Modifiers

Optimizing the $AlGaO_3$ band structure can be achieved by careful attention to the structural deformations of a given crystal symmetry type. For application to a solid-state, and in particular a semiconductor-based electro-optically driven ultraviolet emissive device, the valence band structure (VBS) is of major importance. It is typically the VBS E-k dispersion which determines the efficacy for the creation of optical radiation by direct recombination of electrons and holes. Therefore, attention is now directed toward valence band tuning options for achieving in one example UVLED operation.

Configuring of the Band Structure by Bi-Axial Strain

In some embodiments, selective epitaxial deposition of $AlGaO_3$ crystal structures can be formed under the elastic structural deformation by the use of composition control or by using a surface crystal geometric arrangement that can epitaxially register the $AlGaO_3$ film while still maintaining an elastic deformation of the $AlGaO_3$ unit cell.

Figures 21A, 21B, 21C:
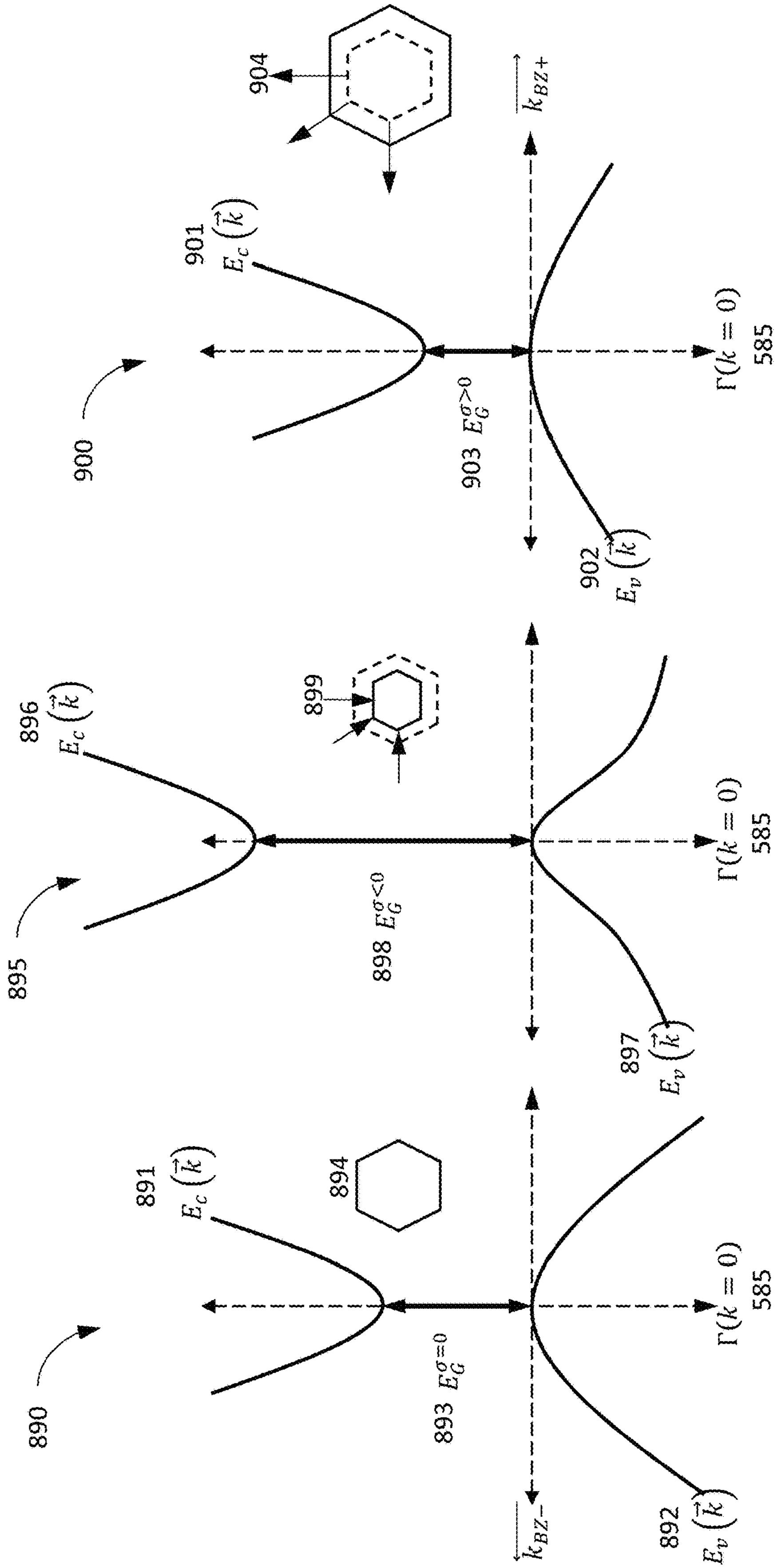
FIGS. 21A-21C depict schematically the change in electronic energy configuration or band structure of a metal oxide semiconductor under the influence of bi-axial strain applied to the crystal unit cell in accordance with an illustrative embodiment of the present disclosure.

For example, FIGS. 21A-21C depict the change in E-k band structure in the vicinity of the Brillouin zone-center (k=0) which favors e-h recombination for generating bandgap energy photons under the influence of bi-axial strain applied to the crystal unit cell. The band structures for both corundum and monoclinic $Al_2O_3$ are direct. Depositing $Al_2O_3$, $Ga_2O_3$ or $AlGaO_3$ thin films onto a suitable surface which can elastically strain the in-plane lattice constant of the film may be achieved and engineered in accordance with the present disclosure.

The lattice constant mismatches between $Al_2O_3$ and $Ga_2O_3$ are shown in Table II of FIG. 43B. The ternary alloys can be roughly interpolated between the end point binaries for the same crystal symmetry type. In general, an $Al_2O_3$ film deposited on a $Ga_2O_3$ substrate conserving crystal orientations will create the $Al_2O_3$ film in biaxial tension, whereas a $Ga_2O_3$ film deposited on an $Al_2O_3$ substrate having the same crystal orientation will be in a state of compression.

The monoclinic and corundum crystals have non-trivial geometric structures with relatively complex strain tensors compared to conventional cubic, zinc-blende or even wurtzite crystals. The general trend observed on E-k dispersion in vicinity of the BZ center is shown in FIGS. 21A-21B. For example, diagram 890 of FIG. 21A describes a c-plane corundum crystal unit cell 894 having a strain free ($\sigma$=0) E-k dispersion, with conduction band 891 and valence band 892 separated by a bandgap 893. Biaxial compression of the unit cell 899 in diagram 895 of FIG. 21B changes the dispersion by hydrostatically lifting the conduction band, e.g., see conduction band 896 and warping the E-k curvature of the valence band 897. The compressively strained ($\sigma$<0) bandgap 898 is generally increased $E_G^{\sigma<0}<E_G^{\sigma=0}$.

Conversely, as shown in diagram 900 of FIG. 21C, biaxial tension applied to the unit cell 904 has the effect of reducing the bandgap 903 $E_G^{\sigma>0}<E_G^{\sigma=0}$, lowering the conduction band 901 and flattening the valence band curvature 902. As the valence band curvature is directly related to the hole effective mass, a larger curvature decreases the effective hole mass, whereas smaller curvature (i.e., flatter E-k bands) increase the hole effective mass (note: a totally flat valence band dispersion potentially creates immobile holes). Therefore, it is possible to improve the $Ga_2O_3$ valence band dispersion by judicious choice of biaxial strain via the epitaxy on a suitable crystal surface symmetry and in-plane lattice structure.

Configuring of the Band Structure by Uni-Axial Strain

Figure 22B:
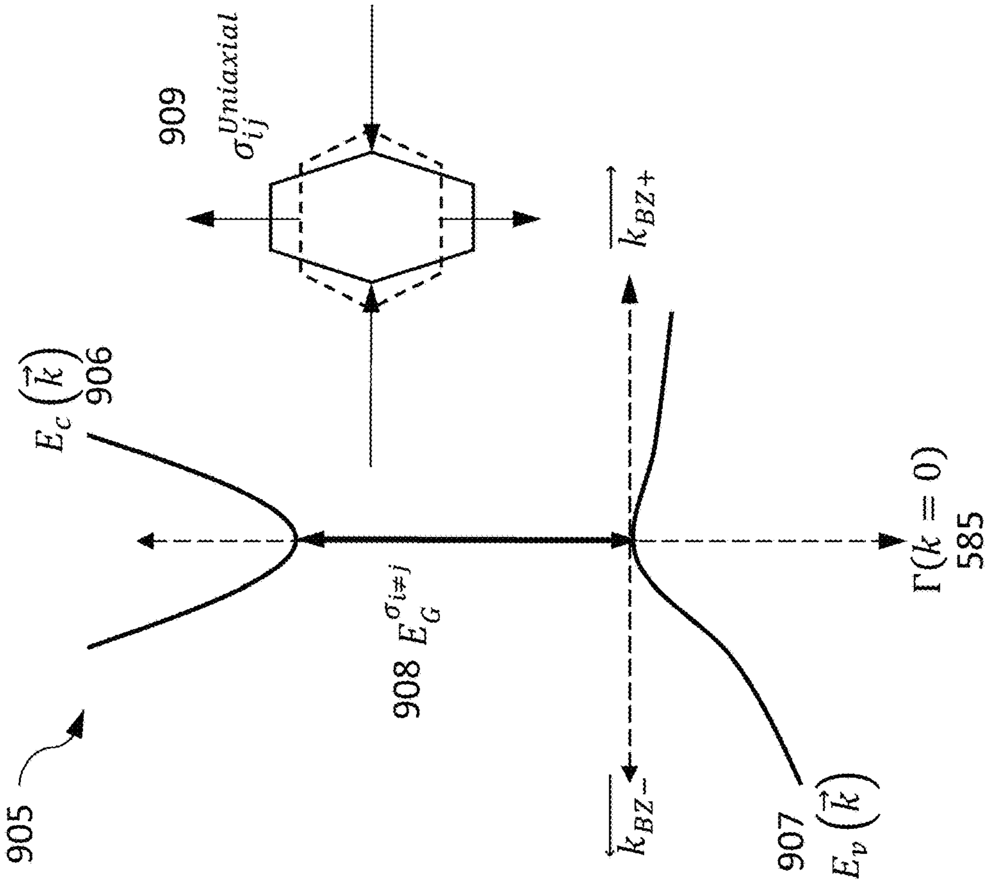
FIGS. 22A and 22B depict schematically the change in band structure of a metal oxide semiconductor under the influence of uniaxial strain applied to the crystal unit cell in accordance with an illustrative embodiment of the present disclosure.
Figure 22A:
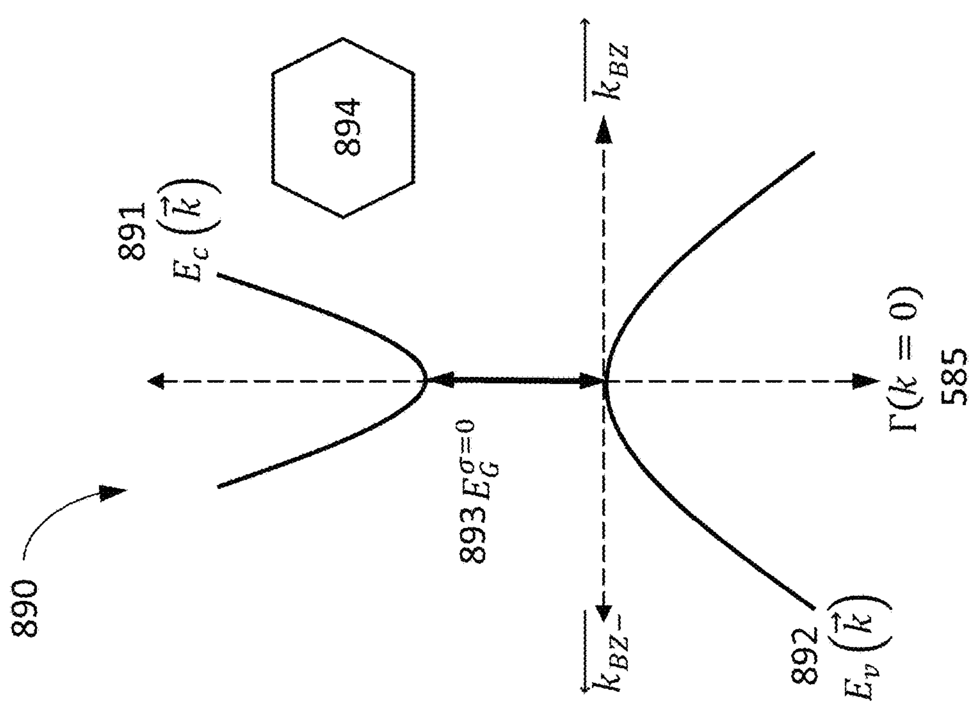

Of particular interest is the possibility of using uniaxial strain to advantageously modify the valence band structure as shown in FIGS. 22A and 22B, where reference numbers in FIG. 22A correspond to those of FIG. 21A. For example, in-plane uniaxial deformation of the unit cell 894 along substantially one crystal direction as shown in unit cell 909 will asymmetrically deform the valence band 907 as shown in diagram 905, which also shows conduction band 906 and bandgap 908.

For the case of monoclinic and corundum crystal symmetry films, similar behavior will occur and can be shown via the growth of elastically strained superlattice structures comprising $Al_2O_3/Ga_2O_3$, $Al_xGa_{1-x}O_3/Ga_2O_3$ and $Al_xGa_{1-x}O_3/Al_2O_3$ on $Al_2O_3$ and $Ga_2O_3$, substrates. Such structures have been grown in relation to the present disclosure, and the critical layer thickness (CLT) was found to depend on the surface orientation of the substrate and be in the range of 1-2 nm to about 50 nm for binary $Ga_2O_3$ on Sapphire. For monoclinic $Al_xGa_{1-x}O_{3-x}$, x<10% the CLT can exceed 100 nm on $Ga_2O_3$.

Uniaxial strain can be implemented by growth on crystal symmetry surface with surface geometries having asymmetric surface unit cells. This is achieved in both corundum and monoclinic crystals under various surface orientations as described in FIG. 20B, although other surface orientation and crystals are also possible, for example, MgO(100), $MgAl_2O_4$(100), 4H-SiC(0001), ZnO(111), $Er_2O_3$(222) and AlN(0002) among others.

Figures 23A, 23B, 23C:
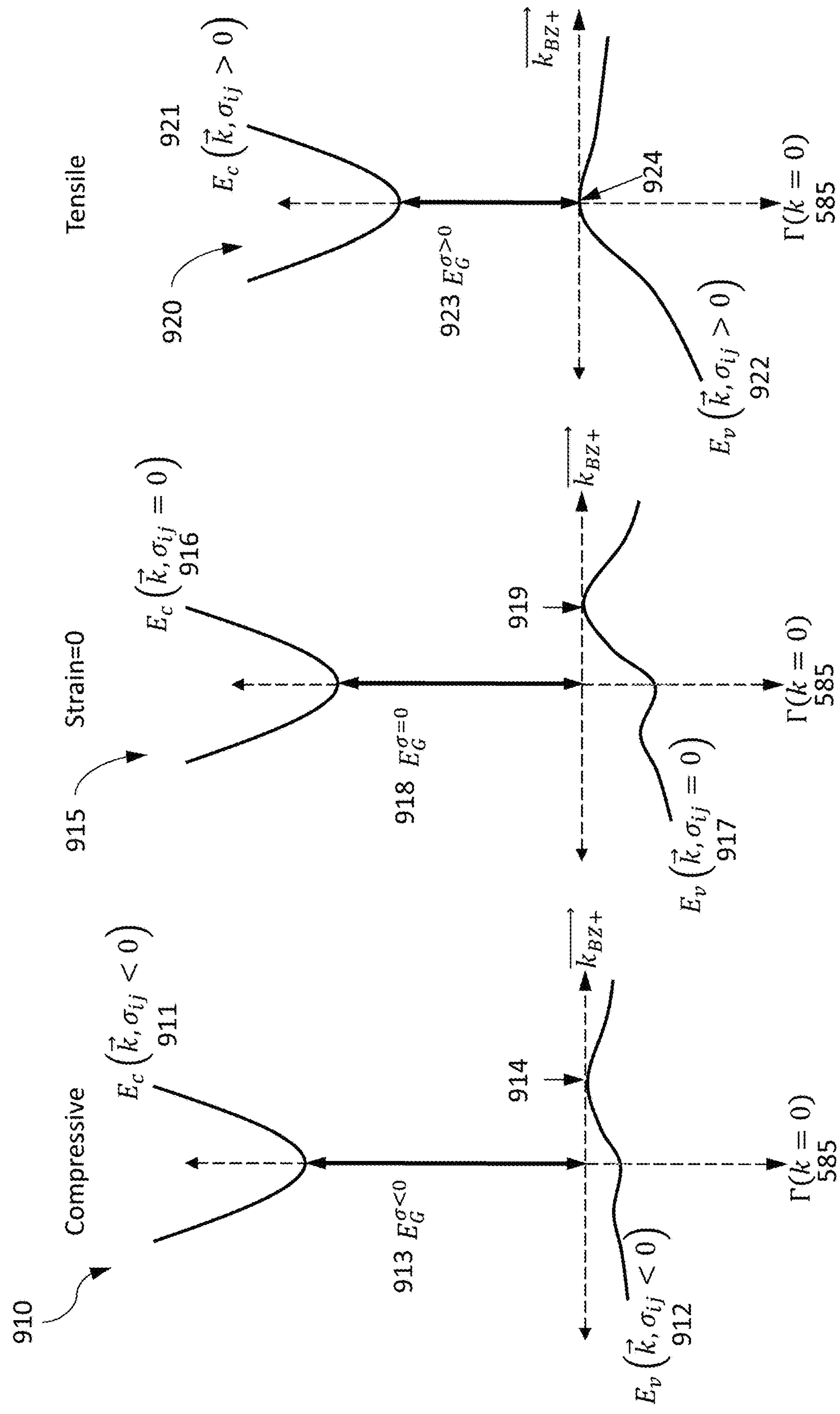
FIGS. 23A-23C show the effect on the band structure of monoclinic gallium-oxide as a function of applied uniaxial strain to the crystal unit cell in accordance with an illustrative embodiment of the present disclosure.

FIG. 22B shows the advantageous deformation of the valence band structure for the case of a direct bandgap. For the case of an indirect bandgap E-k dispersion, such as, thin monolayered monoclinic $Ga_2O_3$, the valence band dispersion can be tuned from an indirect to a direct band gap as shown in FIGS. 23A or 23B transitioning to FIG. 23C. Consider the strain-free band structure 915 of FIG. 23B having conduction band 916, valence band 917, bandgap 918 and valence band maximum 919. Similarly, compressive structure 910 of FIG. 23A shows conduction band 911, valence band 912, bandgap 913 and valence band maximum 914. Tensile structure 920 of FIG. 23C shows conduction band 921, valence band 922, bandgap 923 and valence band maximum 924. Detailed calculations and experimental angle resolved photoelectron spectroscopy (ARPES) can show that compressive and tensile strain applied to thin films of $Ga_2O_3$ can warp the valence band as shown in structures 910 and 920 for the cases of compressive (valence band 912) and tensile (valence band 922) uniaxial strain applied along the b-axis or c-axis of the monoclinic $Ga_2O_3$ unit cell.

As shown by these figures, strain plays an important role which typically will require management for complex epitaxy structure. Failure to manage the strain accumulation is likely to result in relief of the elastic energy within the unit cell by the creation of dislocations and crystallographic defects which reduce the efficiency of the UVLED.

Configuration of the Band Structure by Application of Post Growth Stress

While the above techniques involve the introduction of stresses in the form of uni-axial or bi-axial strain during forming of the layers, in other embodiments external stress may be applied following formation or growing of the layers or layers of metal oxide to configure the band structure as required. Illustrative techniques that may be adopted to introduce these stresses are disclosed in U.S. Pat. No. 9,412,911.

Configuration of the Band Structure by Selection of Compositional Alloy

Figure 24B:
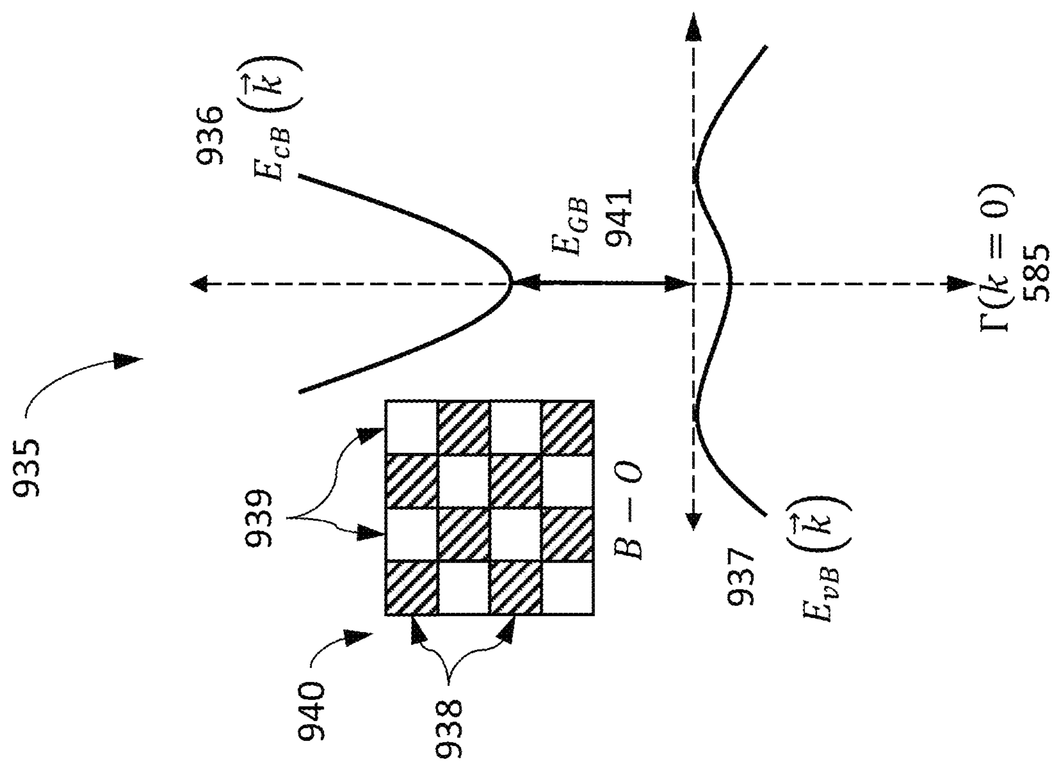
FIGS. 24A and 24B depict the E-k electronic configuration of two dissimilar binary metal oxides in accordance with an illustrative embodiment of the present disclosure: one having a wide direct-bandgap material and the other a narrow indirect-bandgap material.
Figure 24A:
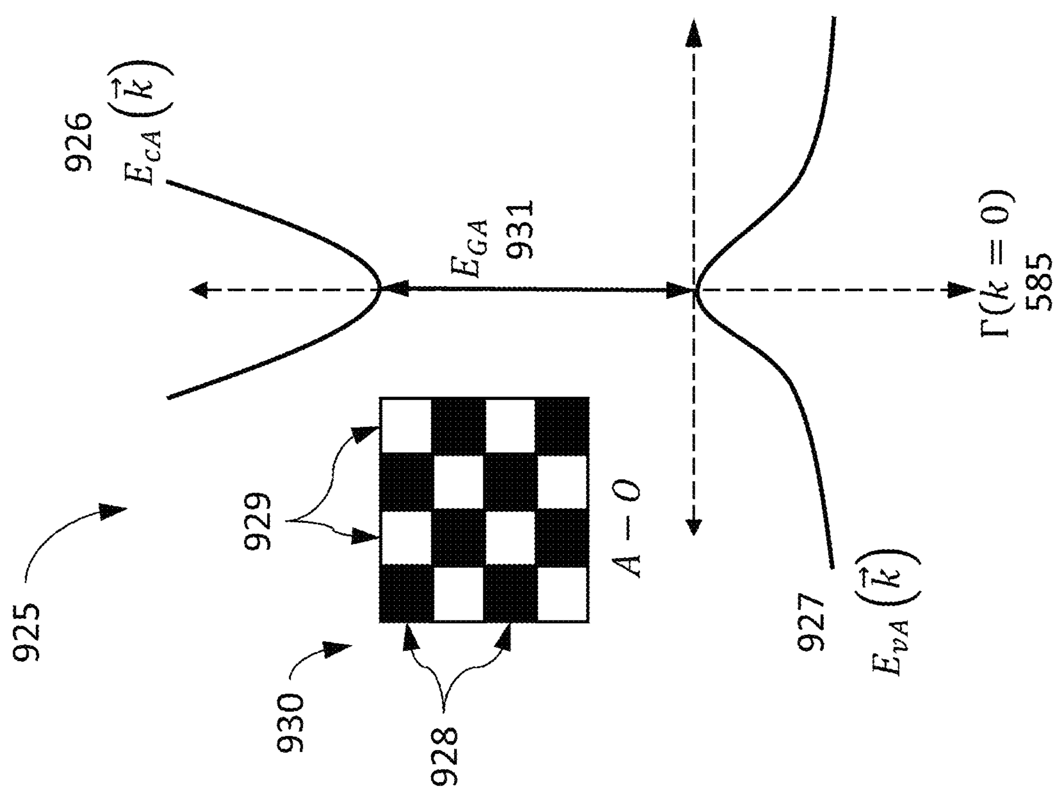

Yet another mechanism which is utilized in the present disclosure and applied to optically emissive metal oxide based UVLEDs is the use of compositional alloying to form ternary crystal structures with a desirable direct bandgap. In general, two distinct binary oxide material compositions are shown in FIGS. 24A and 24B. Band structure 925 comprises metal oxide A-O with crystal structure material 930 built from metal atoms 928 and oxygen atoms 929 having conduction band 926, valence band dispersion 927 and direct bandgap 931. Another binary metal oxide B-O has a crystal structure material 940 built from a different metal cation 938 of type B and oxygen atoms 939 and has an indirect band structure 935 with conduction band 936, bandgap 941 and valence band dispersion 937. In this example, the common anion is oxygen, and both A-O and B-O have the same underlying crystal symmetry type.

Figures 25A, 25B, 25C:
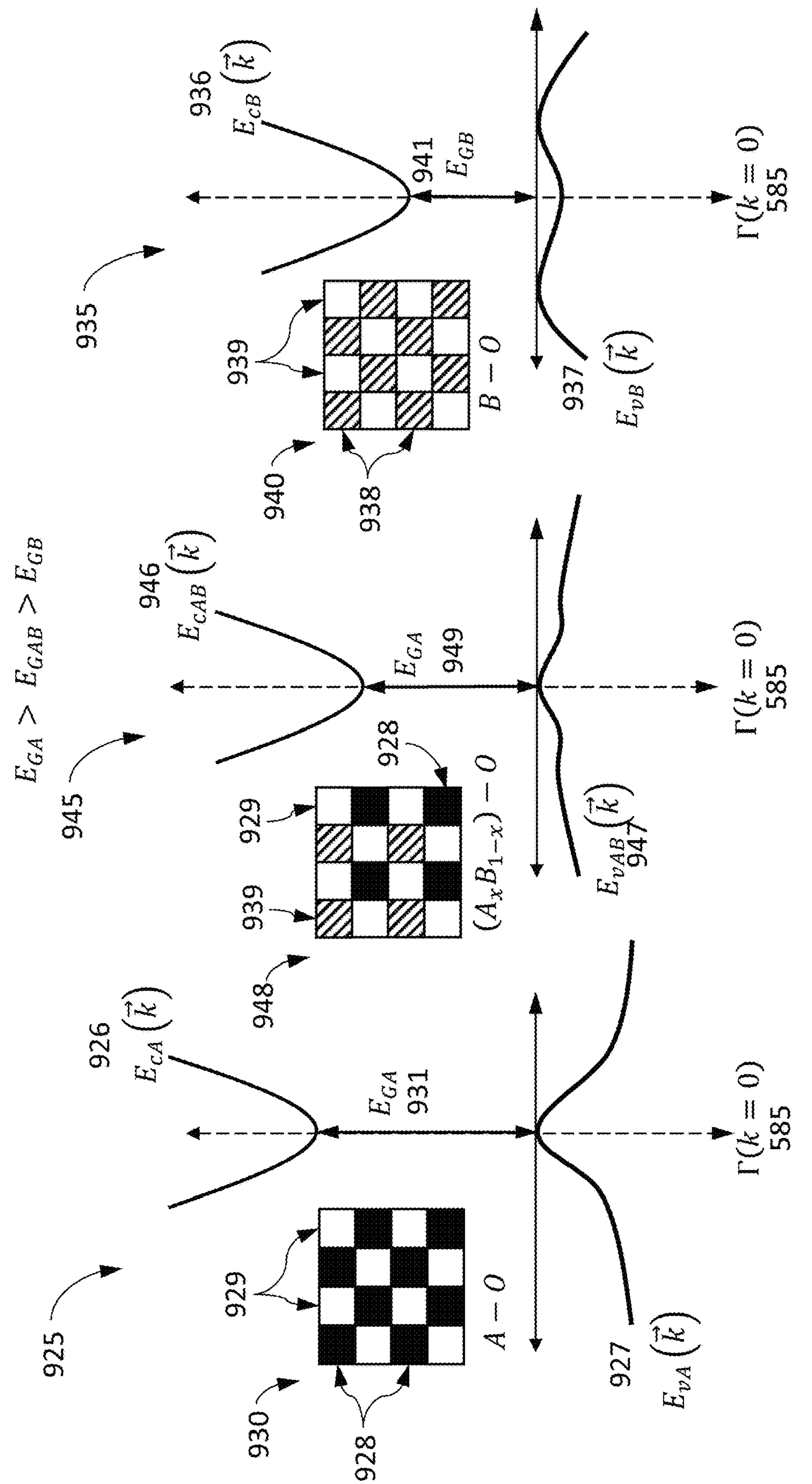
FIGS. 25A-25C show the effect of valence band mixing of two binary dissimilar metal oxide materials that together form a ternary metal oxide alloy in accordance with an illustrative embodiment of the present disclosure.

In the case where a ternary alloy may be formed by mixing cation sites with metal atoms A and B within an otherwise similar oxygen matrix to form $(A\text{-}O)_n(B\text{-}O)_{1-x}$ this will result in an $A_xB_{1-x}O$ composition with the same underlying crystal symmetry. On this basis, it is then possible to form a ternary metal oxide with valence band mixing effect as shown in FIG. 25B (Note: FIGS. 25A and 25C reproduce FIGS. 24A and 24B). The direct valence band dispersion 927 of A-O crystal structure material 930 alloyed with B-O crystal structure material 940 having indirect valence band dispersion 937 can produce a ternary material 948 that exhibits improved valence band dispersion 947, and having conduction band 946 and bandgap 949. That is, atomic species A of material 930 incorporated into B-sites of material 940 can augment the valence band dispersion. Atomistic Density Functional Theory calculations can be used to simulate this concept which will fully account for the pseudopotentials of the constituent atoms, strain energy and crystal symmetry.

Accordingly, alloying corundum $Al_2O_3$ and $Ga_2O_3$ can result in a direct bandgap for the band structure of the ternary metal oxide alloy and can also improve the valence band curvature of monoclinic crystal symmetry compositions.

Configuration of the Band Structure by Selection of Digital Alloy Fabrication

Figure 27B:
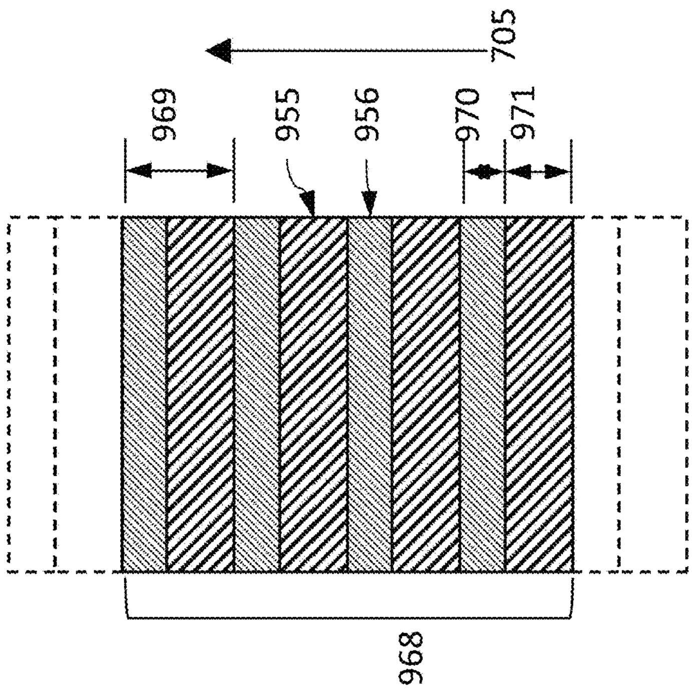
FIGS. 27A-27B show an effect of a superlattice (SL) in one dimension on the E-k configuration for a layered structure having a superlattice period equal to approximately twice the bulk lattice constant of the host metal oxide semiconductors, depicting the creation of a superlattice Brillouin-zone that opens an artificial bandgap at a zone center in accordance with an illustrative embodiment of the present disclosure.
Figure 27A:
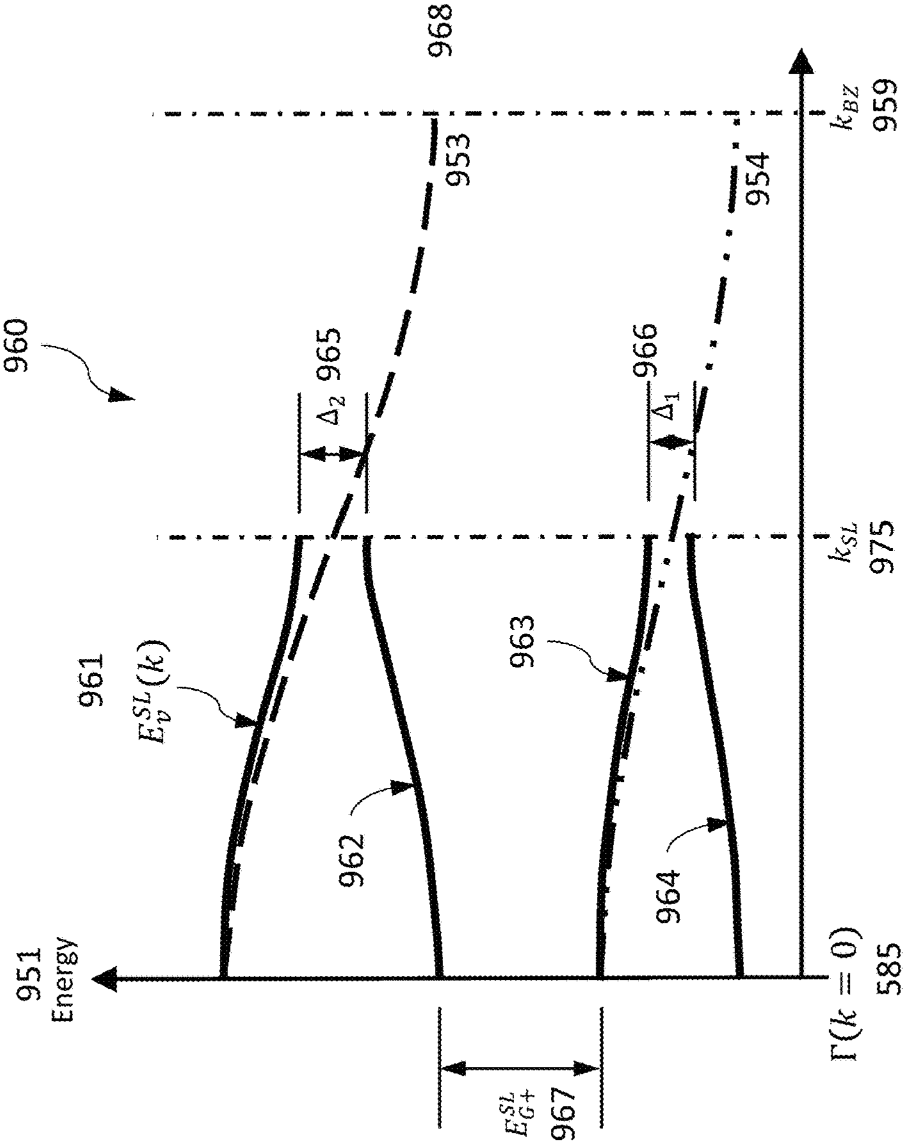

While ternary alloy compositions such as $AlGaO_3$ are desirable, an equivalent method for creating a ternary alloy is by the use of digital alloy formation employing superlattices (SLs) built from periodic repetitions of at least two dissimilar materials. If the each of the layers comprising the repeating unit cell of the SL are less than or equal to the electron de Broglie wavelength (typically about 0.1 to 10's of nm) then the superlattice periodicity forms a 'mini-Brillouin zone' within the crystal band structure as shown in FIG. 27A. In effect, a new periodicity is superimposed over the inherent crystal structure by the formation of the predetermined SL structure. The SL periodicity is typically in the one-dimension of the epitaxial film formation growth direction.

Figure 26:
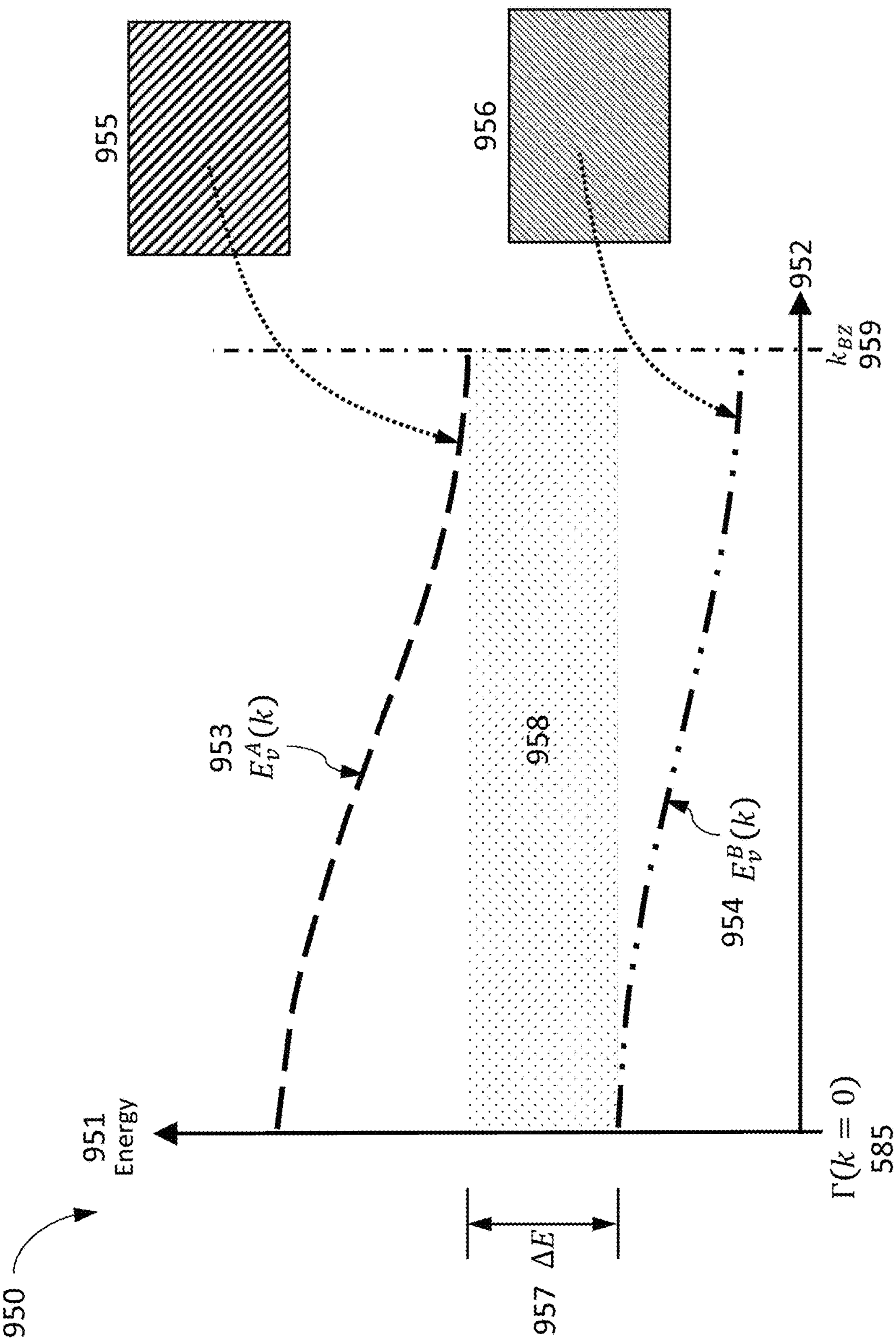
FIG. 26 depicts schematically a portion of the energy-vs-crystal momentum of dominant valence bands sourced from two bulk-like metal oxide semiconductor materials up to the first Brillouin zone in accordance with an illustrative embodiment of the present disclosure.

In the graph 950 of FIG. 26, consider the valence band states 953 native to material 955, and valence band states 954 from material 956. The E-k dispersion shows an energy gap 957 along the energy axis 951 for region 958, and a first Brillouin zone edge 959 relative to k=0. Region 958 is a forbidden energy gap (ΔE) between the energy band states 953 and 954, which are the bulk-like energy bands of materials 955 and 956. If material A and B form a superlattice 968 as shown in FIG. 27B and the SL period $L_{SL}$ is selected to be a multiple (e.g., $L_{SL}=2a_{AB}$) of the average lattice constant $a_{AB}$ of A and B, then new states 961, 962, 963 and 964 are generated as shown in FIG. 27A. The superlattice energy potential therefore creates a SL band gap 967 at k=0. This effectively folds the energy band 953 from the first bulk Brillouin zone edge 959 to k=0. That is, when making a superlattice using the two materials 955 and 956 into ultrathin layers (thicknesses 970 and 971, respectively) forming a periodic repeating unit 969, the original bulk-like valence band states 953 and 954 are folded into new energy band states 961, 962 and 963 and 964. Stated another way, the superlattice potential creates a new energy dispersion structure comprising band states 961, 962, 963 and 964. As the superlattice period imposes a new spatial potential, the Brillouin zone is contracted to wavevector 975.

This type of SL structure in FIG. 27B can be created using bi-layered pairs comprising in different examples: $Al_xGa_{1-x}O/Ga_2O_3$, $Al_xGa_{1-x}O_3/Al_2O_3$, $Al_2O_3/Ga_2O_3$ and $Al_xGa_{1-x}O_3/Al_yGa_{1-y}O_3$.

The general use of SLs to configure an optoelectronic device is disclosed in U.S. Pat. No. 10,475,956.

Figure 27C:
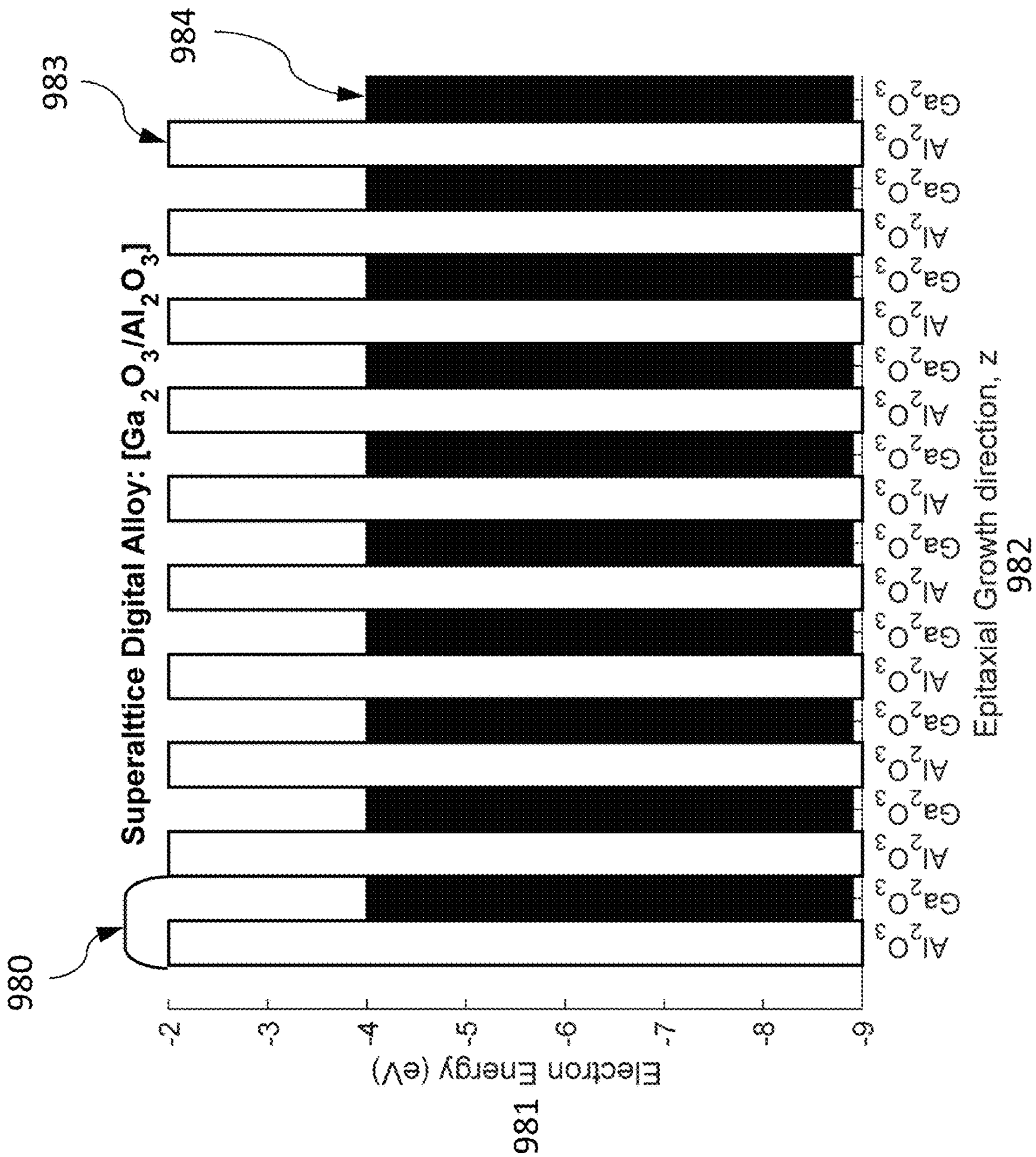
FIG. 27C shows a bi-layered binary superlattice comprising a plurality of thin epitaxial layers of $Al_2O_3$ and $Ga_2O_3$ repeating with a fixed unit cell period where the digital alloy simulates an equivalent ternary $Al_xGa_{1-x}O_3$ bulk alloy depending on the constituent layer thickness ratio of the superlattice period in accordance with an illustrative embodiment of the present disclosure.

FIG. 27C shows the SL structure for the case of a digital binary metal oxide comprising $Al_2O_3$ layers 983 and $Ga_2O_3$ layers 984. The structure is shown in terms of electron energy 981 as a function of epitaxial growth direction 982. The period of the SL forming the repeating unit cell 980 is repeated in integer or half-integer repetitions. For example, the number of repetitions can vary from 3 or more periods and even up to 100 or 1000 or more. The average Al % content of the equivalent digital alloy $Al_xGa_{1-x}O$ is calculated as $$x_{Al}^{SL} = \frac{L_{Al_2O_3}}{L_{Al_2O_3+L_{Ga_2O_3}}},$$

where $L_{Al_2O_3}$ is the layer thickness of $Al_2O_3$ and $L_{Ga_2O_3}$=thickness of $Ga_2O_3$ layer.

Figure 27D:
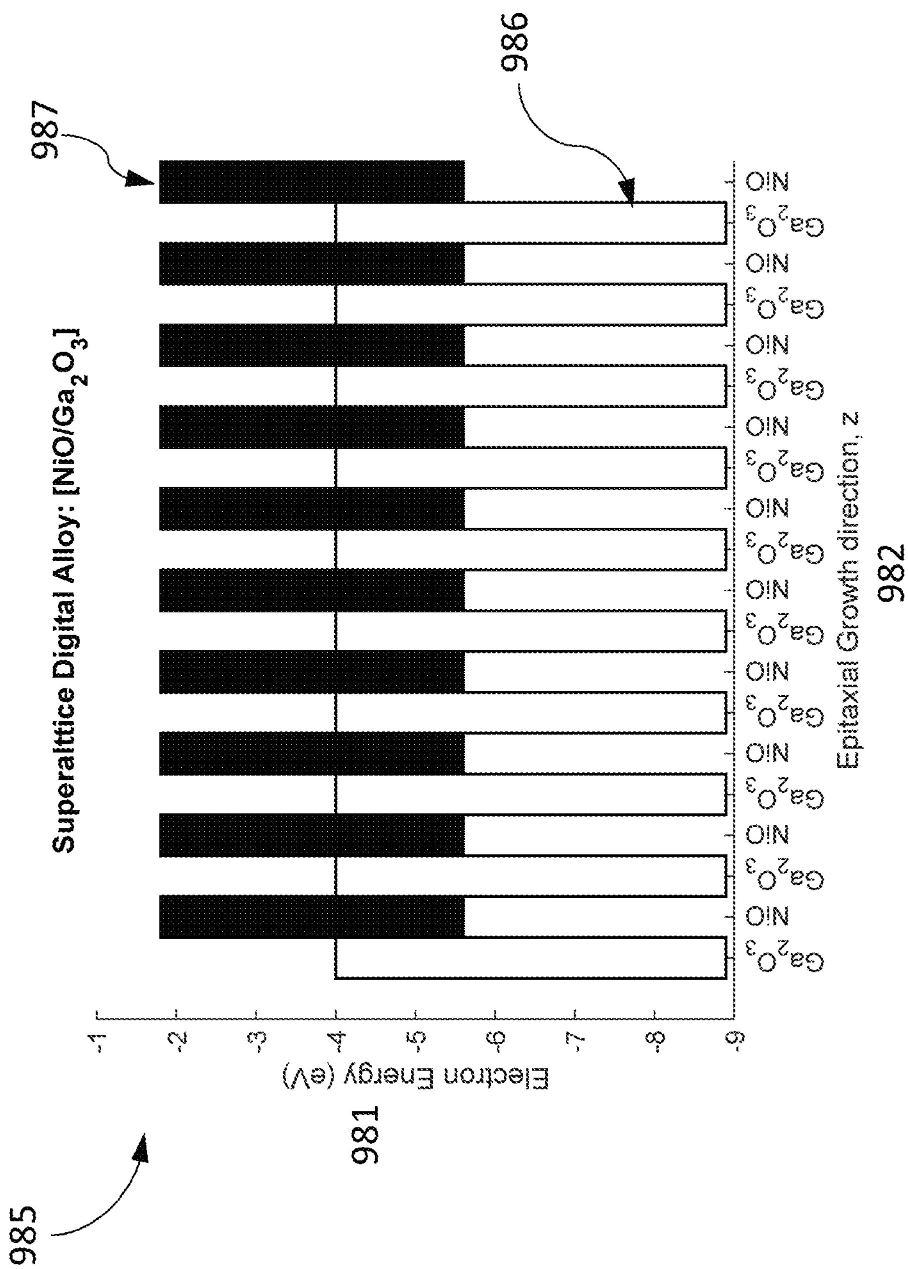
FIG. 27D shows another bi-layered binary superlattice comprising a plurality of thin epitaxial layers of NiO and $Ga_2O_3$ repeating with a fixed unit cell period where the digital alloy simulates an equivalent ternary $(NiO)_x(Ga_2O_3)_{1-x}$ bulk alloy depending on the constituent layer thickness ratio of the superlattice period in accordance with an illustrative embodiment of the present disclosure.
Figure 27E:
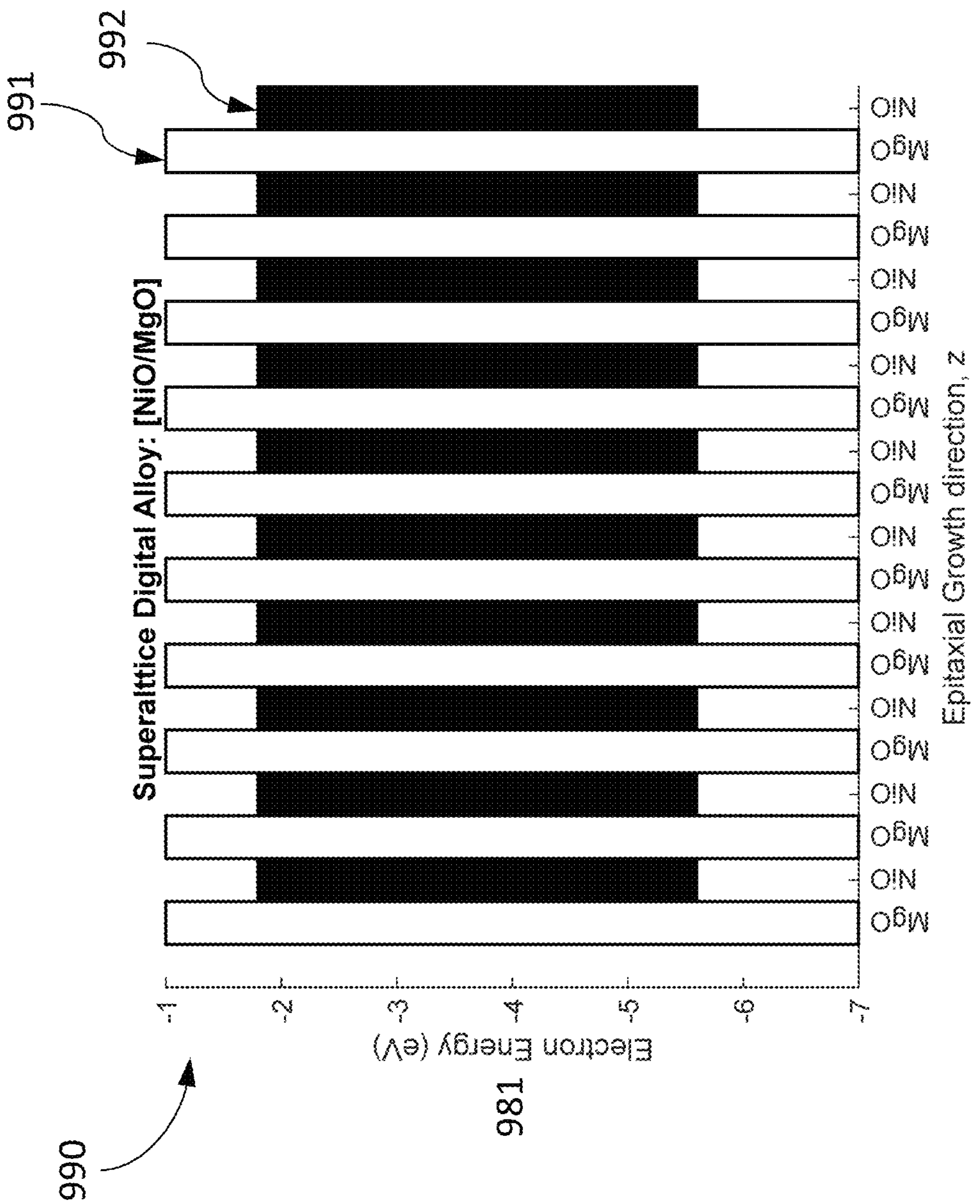
FIG. 27E shows yet another triple material binary superlattice comprising a plurality of thin epitaxial layers of MgO, NiO repeating with a fixed unit cell period where the digital alloy simulates an equivalent ternary bulk alloy $(NiO)_x(MgO)_{1-x}$ depending on the constituent layer thickness ratio of the superlattice period and where the binary metal oxides used for the repeating unit are each selected to vary from between 1 to 10 unit cells in thickness respectively to together comprise the unit cell of the SL in accordance with an illustrative embodiment of the present disclosure.
Figure 27F:
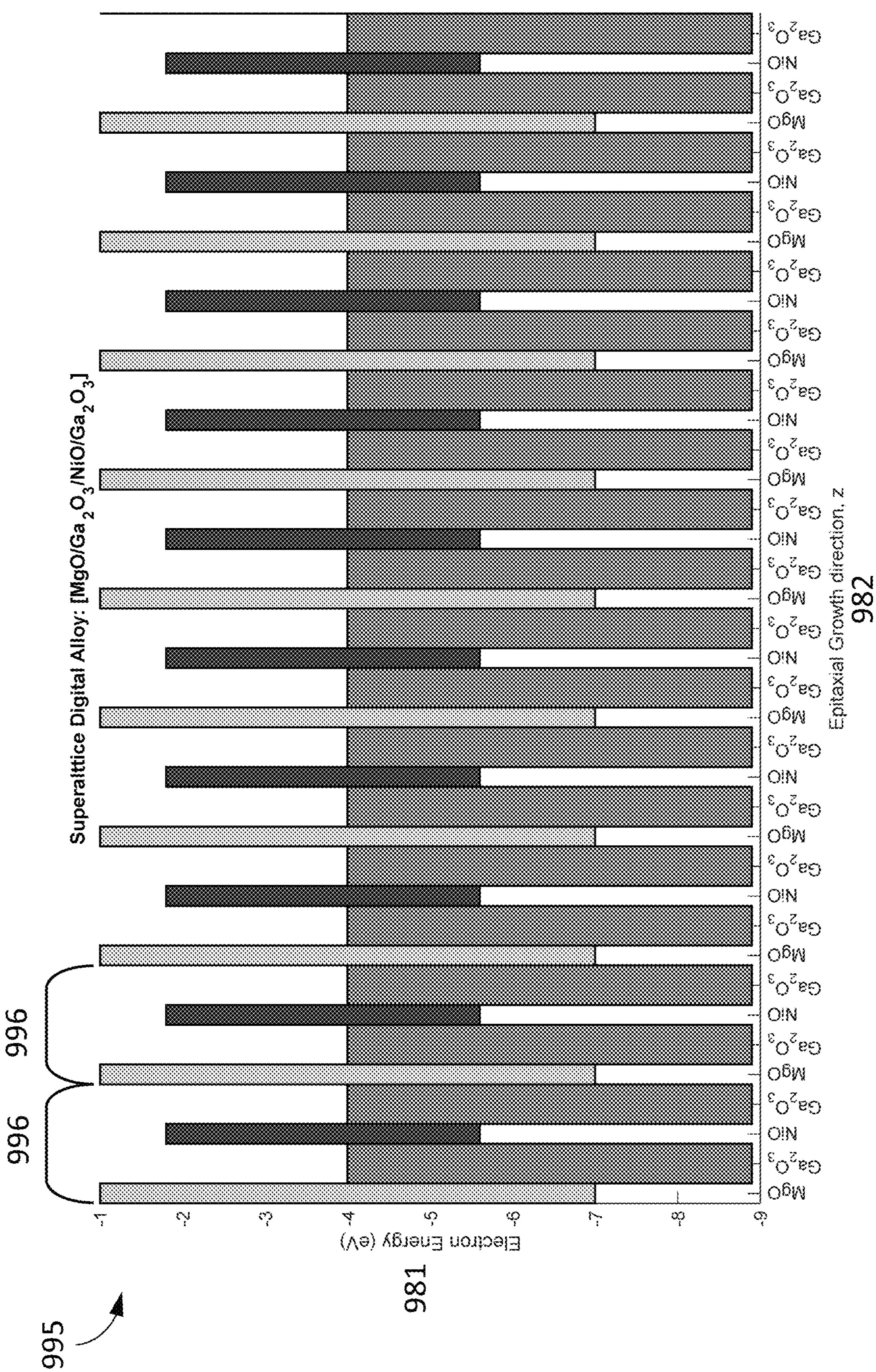
FIG. 27F shows yet another possible four-material binary superlattice comprising plurality of thin epitaxial layers of MgO, NiO and $Ga_2O_3$ repeating with a fixed unit cell period where the digital alloy simulates an equivalent quaternary bulk alloy $(NiO)_x(Ga_2O_3)_y(MgO)_z$ depending on the constituent layer thickness ratio of the superlattice period where the binary metal oxides used for the repeating unit are each selected to vary from between 1 to 10 unit cells in thickness respectively to comprise the unit cell of the SL in accordance with an illustrative embodiment of the present disclosure.

Yet further examples of SL structures possible are shown in FIGS. 27D-27F.

The digital alloy concept can be expanded to other dissimilar crystal symmetry types, for example cubic NiO 987 and monoclinic $Ga_2O_3$ 986 as shown in FIG. 27D where the digital alloy 985 simulates an equivalent ternary $(NiO)_x(Ga_2O_3)_{1-x}$ bulk alloy.

Yet a further example is shown in digital alloy 990 of FIG. 27E using cubic MgO layers 991 and cubic NiO layers 992 comprising the SL. In this example, MgO and NiO have a very close lattice match, unlike $Al_2O_3$ and $Ga_2O_3$ which are high lattice mismatched.

A four layer period SL 996 is shown in the digital alloy 995 of FIG. 27F where cubic MgO and NiO with oriented growth along (100) can coincidence lattice match for (100)-oriented monoclinic $Ga_2O_3$. Such a SL would have an effective quaternary composition of $Ga_xNi_yMg_zO_n$.

Al-Ga-Oxide Band Structures

Figure 29:
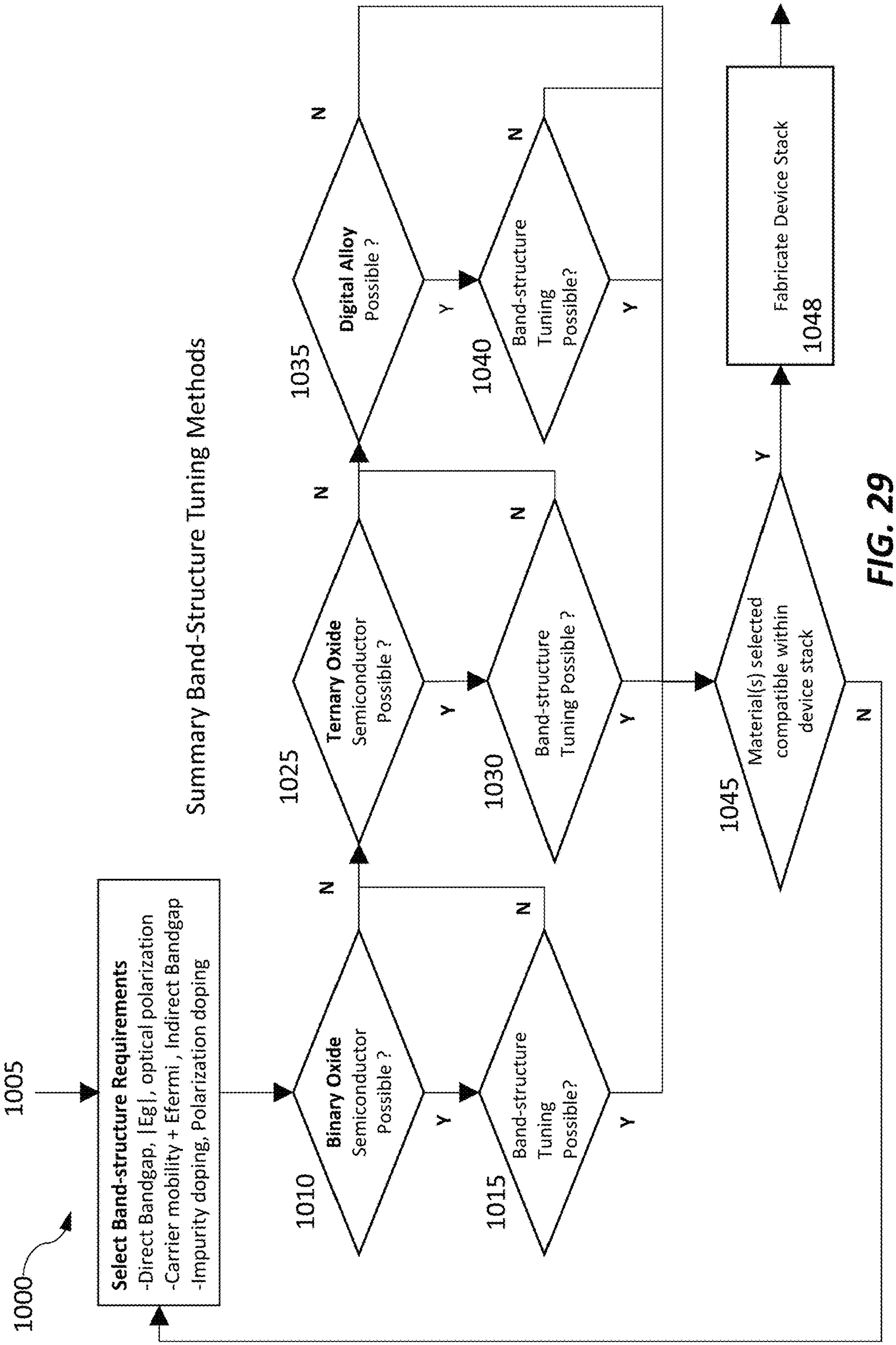
FIG. 29 is an example design flow diagram for tuning and constructing optoelectronic functionality of LED regions in accordance with an illustrative embodiment of the present disclosure.

The UVLED component regions can be selected using binary or ternary $Al_xGa_{1-x}O_3$ compositions either bulk-like or via digital alloy formation. Advantageous valence band tuning using bi-axial or uniaxial strain is also possible as described above. An example process flow 1000 is shown in FIG. 29 describing the possible selection criteria for selecting at least one of the crystal modification methods to form the bandgap regions of the UVLED.

At step 1005, the configuration of the band structure is selected including, but not limited to, band structure characteristics such as whether the band gap is direct or indirect, band gap energy, $E_{fermi}$, carrier mobility, and doping and polarization. At step 1010, it is determined whether a binary oxide may be suitable and further whether that band structure of the binary oxide may be modified (i.e., tuned) at step 1015 to meet requirements. If the binary oxide material meets the requirements then this material is selected for the relevant layer at step 1045 in the optoelectronic device. If a binary oxide is not suitable, then it is determined whether a ternary oxide may be suitable at step 1025 and further whether the band structure of the ternary oxide may be modified at step 1030 to meet requirements. If the ternary oxide meets requirements then this material is selected for the relevant layer at step 1045.

If a ternary oxide is not suitable, then it is determined whether a digital alloy may be suitable at step 1035 and further whether the band structure of the digital alloy may be modified at step 1040 to meet requirements. If the digital alloy meets requirements then this material is selected for the relevant layer at step 1045. Following determination of the layers by this method, then the optoelectronic device stack is fabricated at step 1048.

Figure 30:
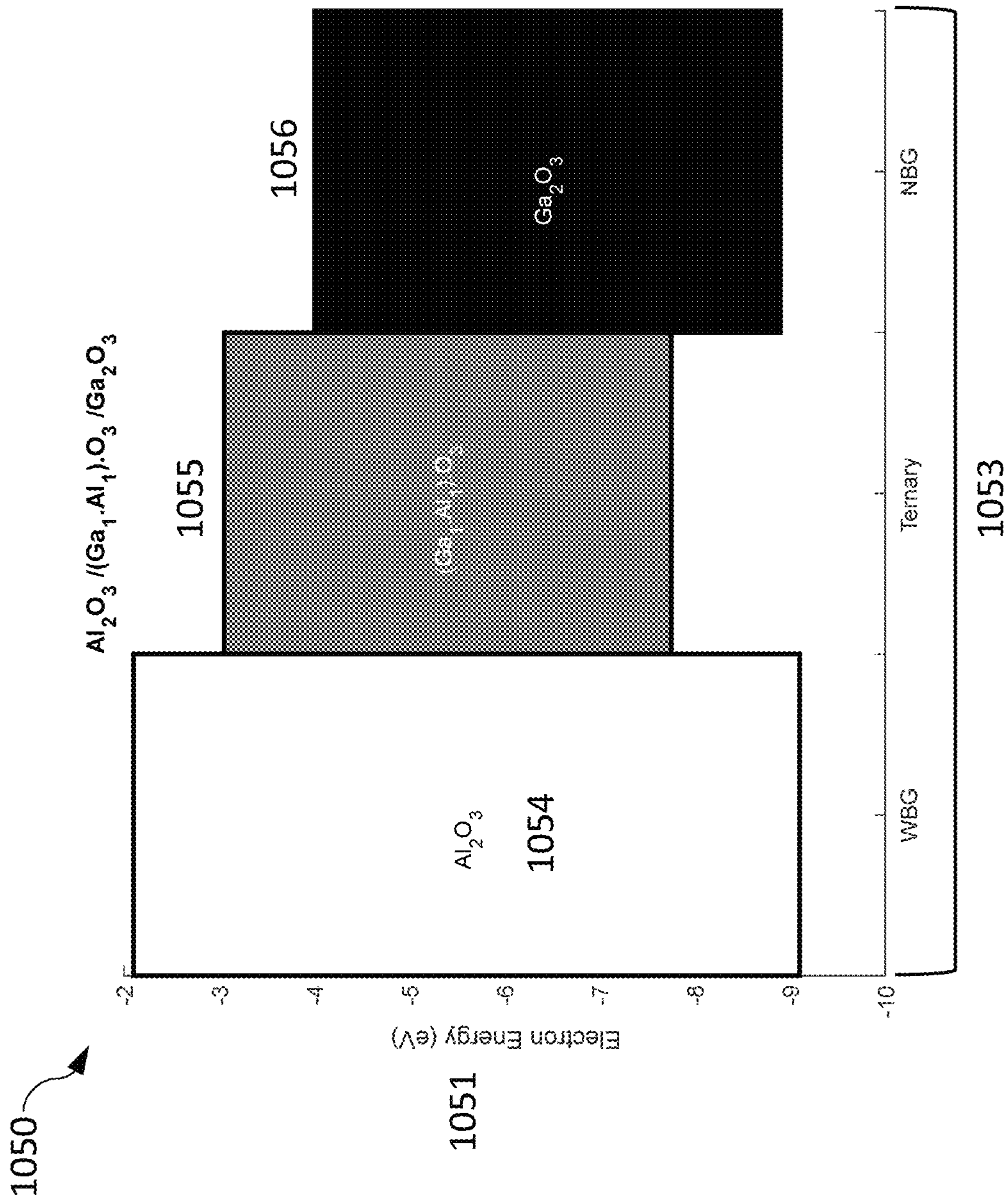
FIG. 30 shows a heterojunction band lineup for the binary $Al_2O_3$, ternary alloy $(Al,Ga)O_3$ and binary $Ga_2O_3$ semiconducting oxides in accordance with an illustrative embodiment of the present disclosure.

An embodiment of an energy band lineup for $Al_2O_3$ and $Ga_2O_3$ with respect to the ternary alloy $Al_xGa_{1-x}O_3$ is shown in diagram 1050 of FIG. 30 and varies in conduction and valence band offsets for corundum and monoclinic crystal symmetry. In diagram 1050 the y-axis is electron energy 1051 and the x-axis is different material types 1053 ($Al_2O_3$ 1054, $(Ga_1Al_1)O_3$ 1055 and $Ga_2O_3$ 1056). Corundum and monoclinic heterojunctions both appear to have type-I and type-II offsets whereas FIG. 30 simply plots the band alignment using existing values for the electron affinity of each material.

The theoretical electronic band structures of corundum and monoclinic bulk crystal forms of $Al_2O_3$ and $Ga_2O_3$ are known in the prior art. The application of strain to thin epitaxial films is however unexplored and is a subject of the present disclosure. By way of reference to the bulk band structures of $Ga_2O_3$ 1056 and $Al_2O_3$ 1054, embodiments of the present disclosure utilize how strain engineering can be applied advantageously for the application to UVLEDs. Incorporation of the monoclinic and trigonal strain tensor into a k.p-like Hamiltonian is necessary for understanding how the valence band is affected. Prior-art k.p crystal models as applied to zinc-blende and wurtzite crystal symmetry systems lack maturity for simulation of both the monoclinic and trigonal systems. Current efforts are being directed to perform a calculation of in the quadratic approximation to a valence band Hamiltonian at the center of the Brillioun zone of materials where this center possess the symmetry of the point group $C2_h$.

Single Crystal Aluminum-Oxide

The two main crystal forms of monoclinic (C2m) and corundum (R3c) crystal symmetry is discussed herein for both $Al_2O_3$ and $Ga_2O_3$; however, other crystal symmetry types are also possible such as triclinic and hexagonal forms. The other crystal symmetry forms can also be applied in accordance with the principles set out in the present disclosure.

(a) Corundum Symmetry $Al_2O_3$

Figure 31:
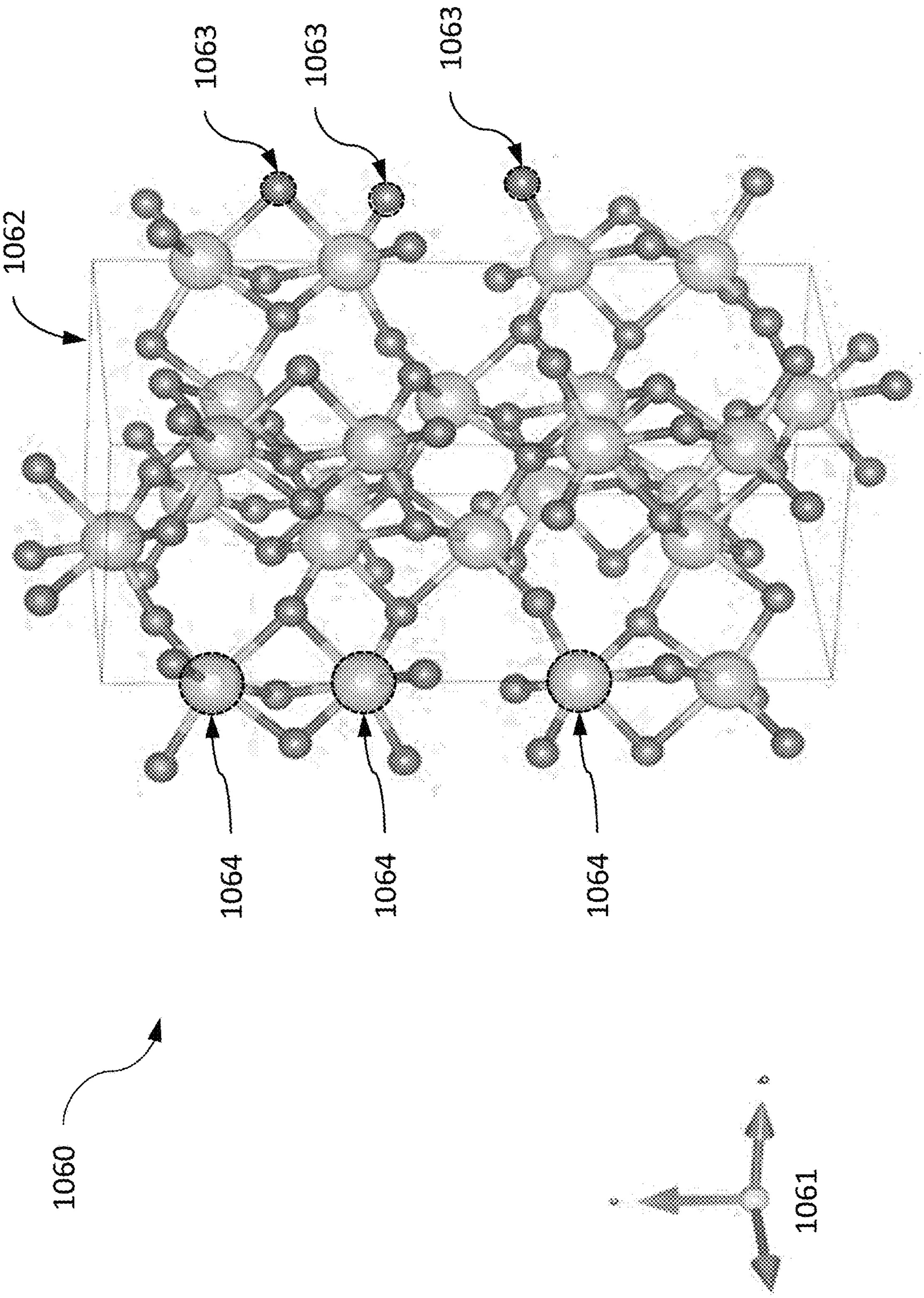
FIG. 31 shows a 3-dimensional crystal unit cell of corundum symmetry crystal structure (alpha-phase) $Al_2O_3$ used to calculate the E-k band structure in accordance with an illustrative embodiment of the present disclosure.
Figure 32B:
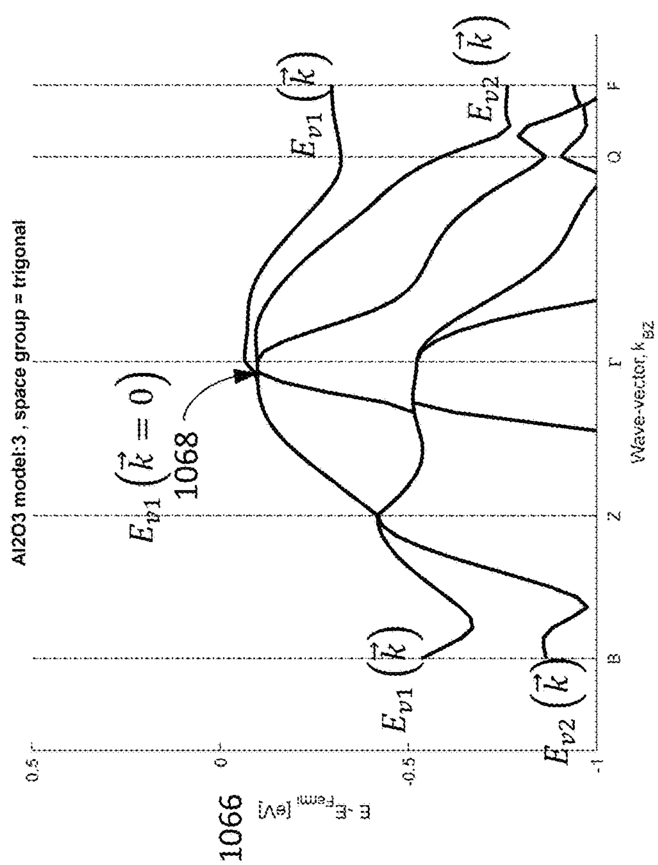
FIG. 32A and 32B show a calculated energy-momentum configuration of alpha-$Al_2O_3$ in the vicinity of the Brillouin zone center in accordance with an illustrative embodiment of the present disclosure.
Figure 32A:
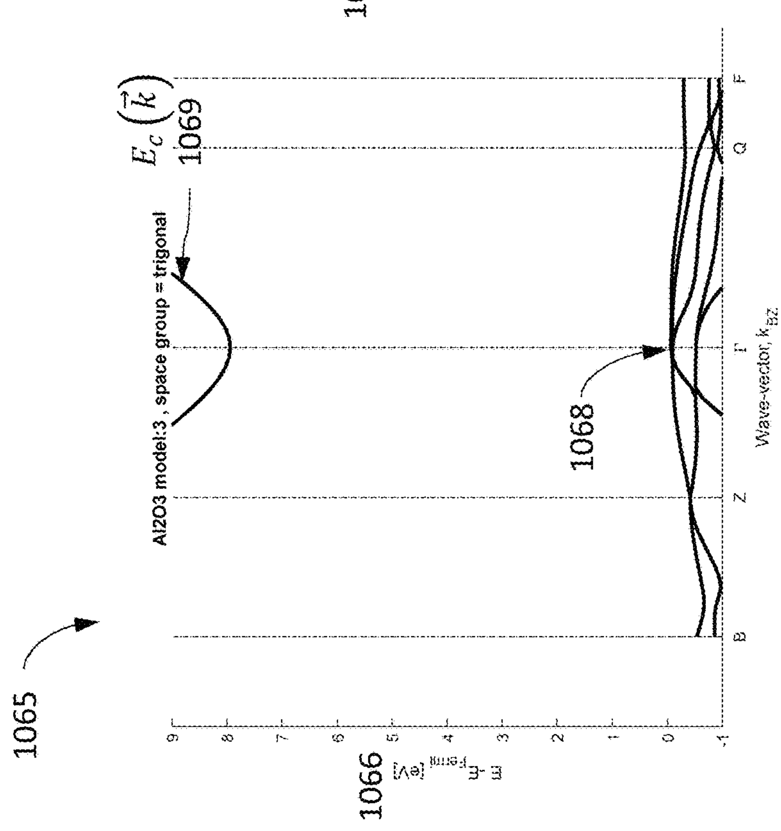

The crystal structure of trigonal $Al_2O_3$ (corundum) 1060 is shown in FIG. 31. The larger spheres represent Al-atoms 1064 and the smaller spheres are oxygen 1063. The unit cell 1062 has crystal axes 1061. Along the c-axis there are layers of Al atoms and O atoms. This crystal structure has a computed band structure 1065 as shown in FIGS. 32A-32B. The electron energy 1066 is plotted as a function of the crystal wave vectors 1067 within the Brillouin zone. The high symmetry points within the Brillouin zone are labelled as shown in the vicinity of the zone center k=0 which is applicable to understand the optical emission properties of the material.

The direct bandgap has valence band maximum 1068 and conduction band minimum 1069 at k=0. A detailed picture of the valence band in FIG. 32B shows a complex dispersion for the two uppermost valence bands. The topmost valence band determines the optical emission character if electrons and holes are indeed capable of being injected simultaneously into the $Al_2O_3$ band structure.

(b) Monoclinic Symmetry $Al_2O_3$

Figure 33:
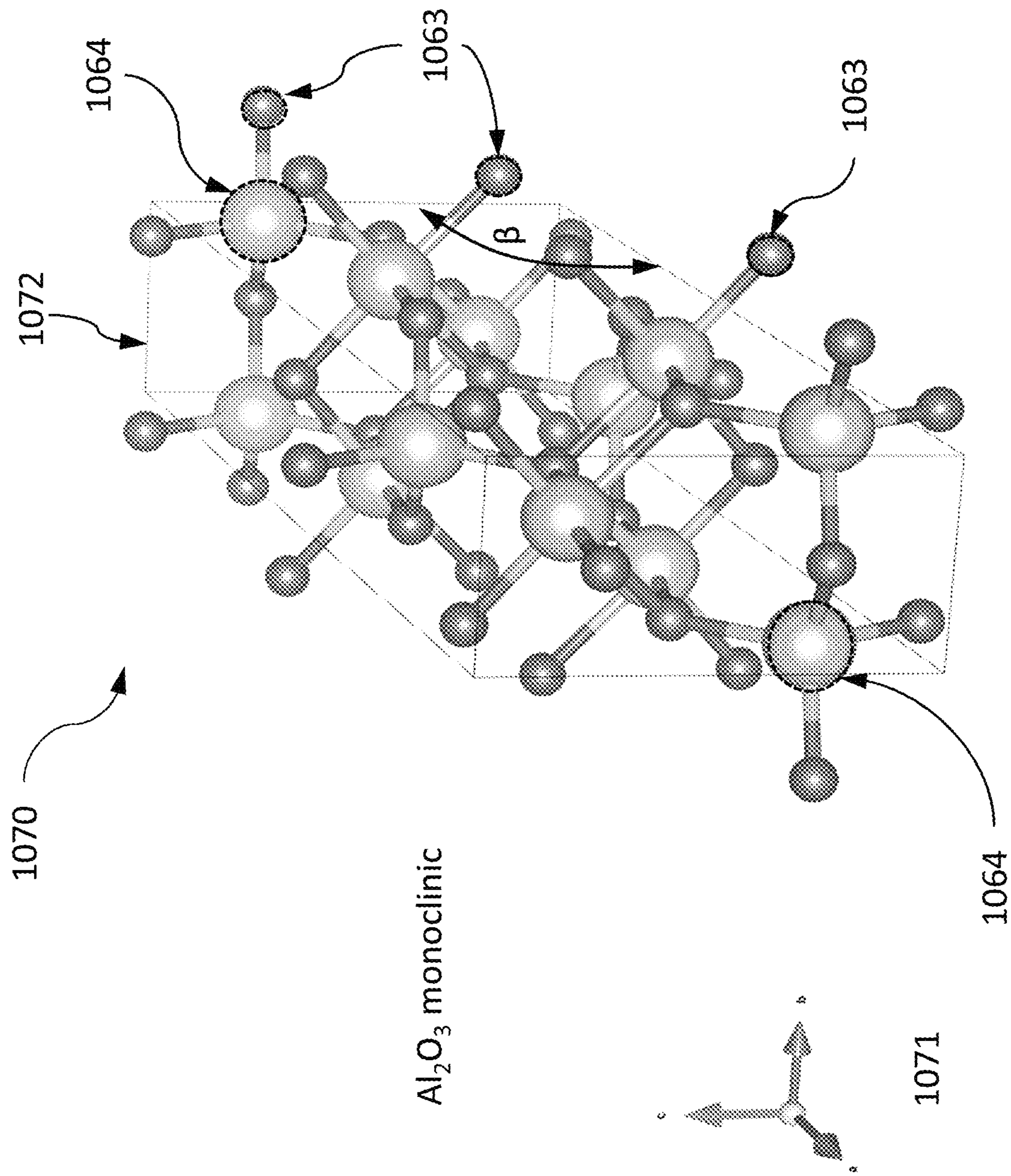
FIG. 33 shows a 3-dimensional crystal unit cell of a monoclinic symmetry crystal structure $Al_2O_3$ used to calculate the E-k band structure in accordance with an illustrative embodiment of the present disclosure.
Figure 34A:
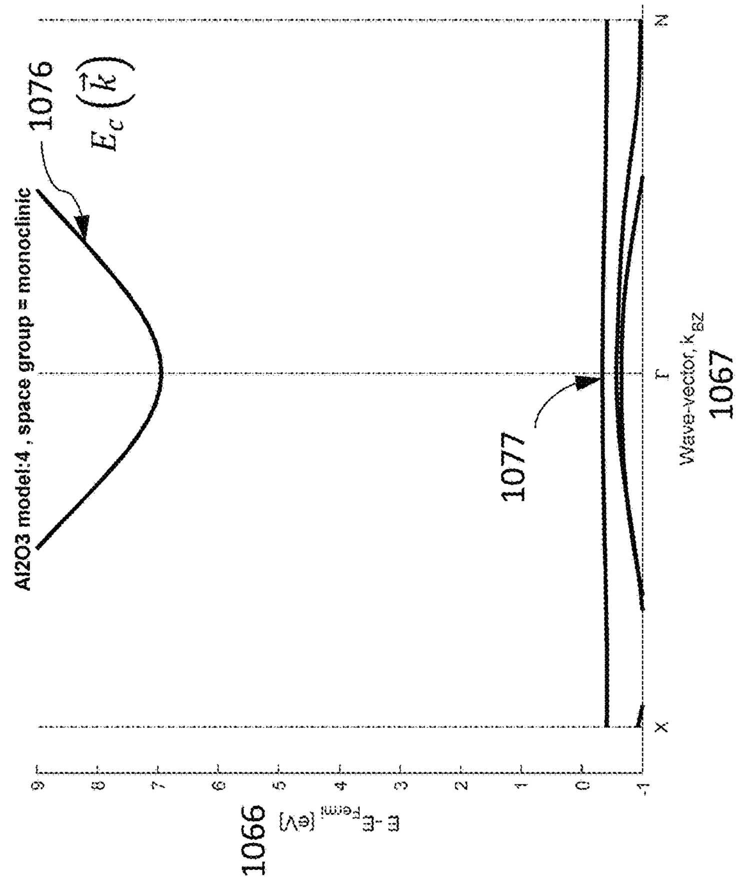
FIGS. 34A and 34B show calculated energy-momentum configurations of theta-$Al_2O_3$ in the vicinity of the Brillouin zone center in accordance with an illustrative embodiment of the present disclosure.
Figure 34B:
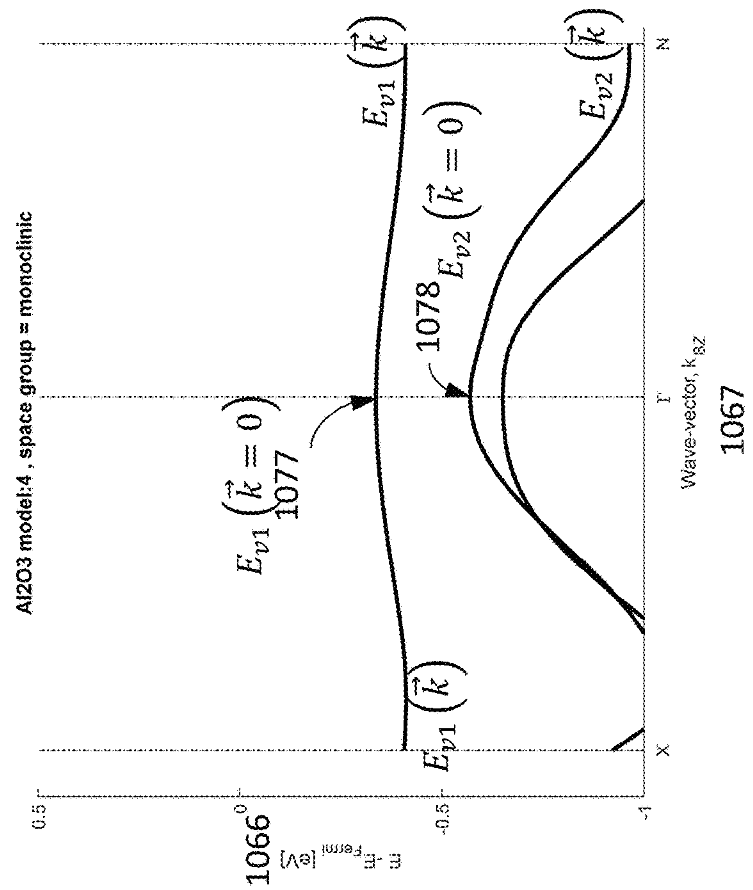

The crystal structure 1070 of monoclinic $Al_2O_3$ is shown in FIG. 33. The larger spheres represent Al-atoms 1064 and the smaller spheres are oxygen 1063. The unit cell 1072 has crystal axes 1071. This crystal structure has a computed band structure 1075 as shown in FIGS. 34A-34B, where FIG. 34B is a detailed picture of the valence band. FIG. 34A also shows conduction band 1076. The high symmetry points within the Brillouin zone are labelled as shown in the vicinity of the zone center k=0 which is applicable for understanding the optical emission properties of the material.

The monoclinic crystal structure 1070 is relatively more complex than the trigonal crystal symmetry and has lower density and smaller bandgap than the corundum Sapphire 1060 form illustrated in FIG. 31.

The monoclinic $Al_2O_3$ form also has a direct bandgap with clear split-off highest valence band 1077 which has lower curvature with respect to the E-k dispersion along the G-X and G-N wave vectors. The monoclinic bandgap is ~1.4 eV smaller than the corundum form. The second highest valence band 1078 is symmetry split from the upper most valence band.

Single Crystal Gallium-Oxide (a) Corundum Symmetry $Ga_2O_3$

Figure 35:
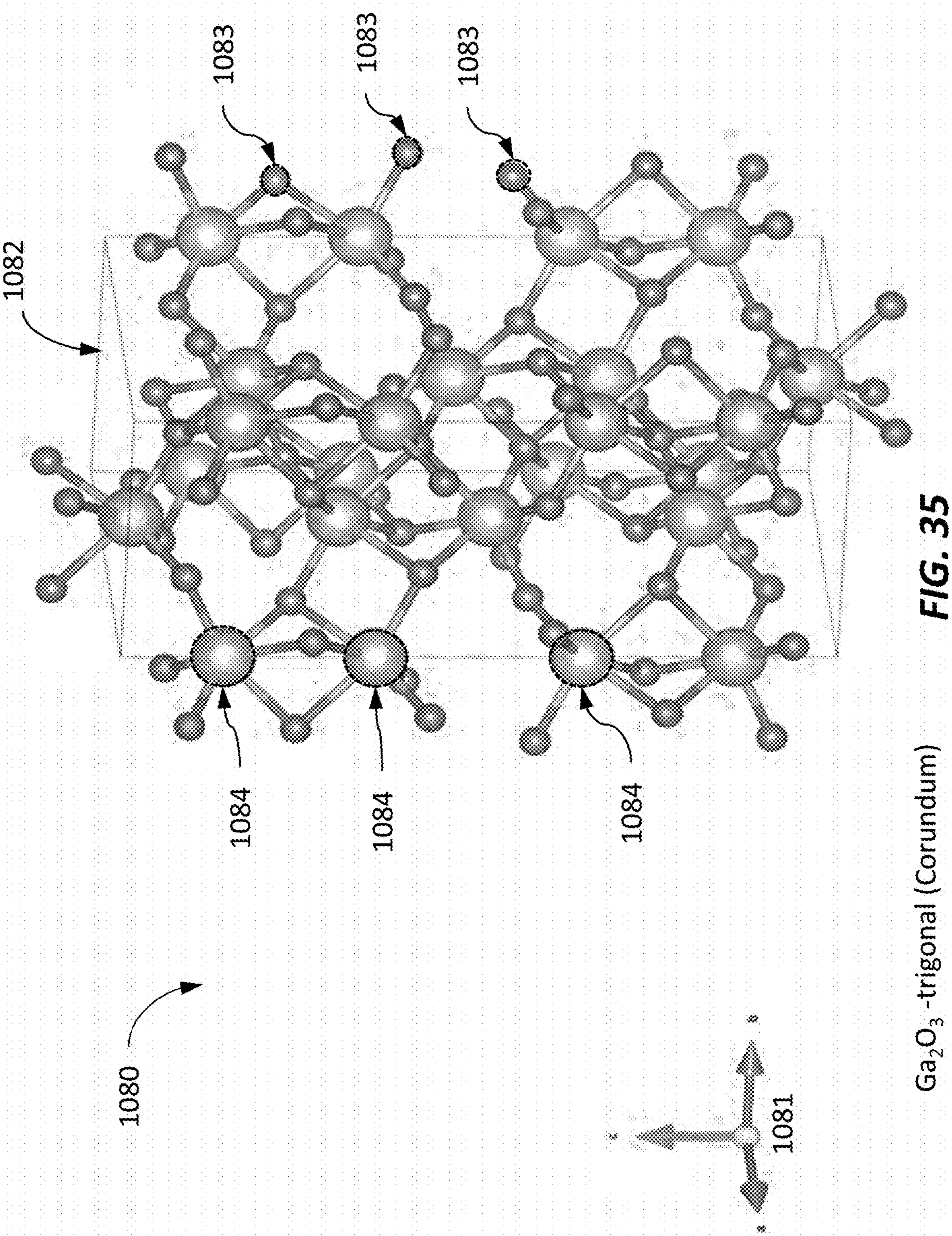
FIG. 35 shows a 3-dimensional crystal unit cell of a corundum symmetry crystal structure (alpha-phase) $Ga_2O_3$ used to calculate the E-k band structure in accordance with an illustrative embodiment of the present disclosure.

The crystal structure of trigonal $Ga_2O_3$ (corundum) 1080 is shown in FIG. 35. The larger spheres represent Ga-atoms 1084 and the smaller spheres are oxygen 1083. The unit cell 1082 has crystal axes 1081. The corundum (trigonal crystal symmetry type) is also known as the alpha-phase. The crystal structure is identical to Sapphire 1060 of FIG. 31 with lattice constants defining the unit cell 1082 shown in Table II of FIG. 43B. The $Ga_2O_3$ unit cell 1082 is larger than $Al_2O_3$. The corundum crystal has octahedrally bonded Ga-atoms.

Figure 36B:
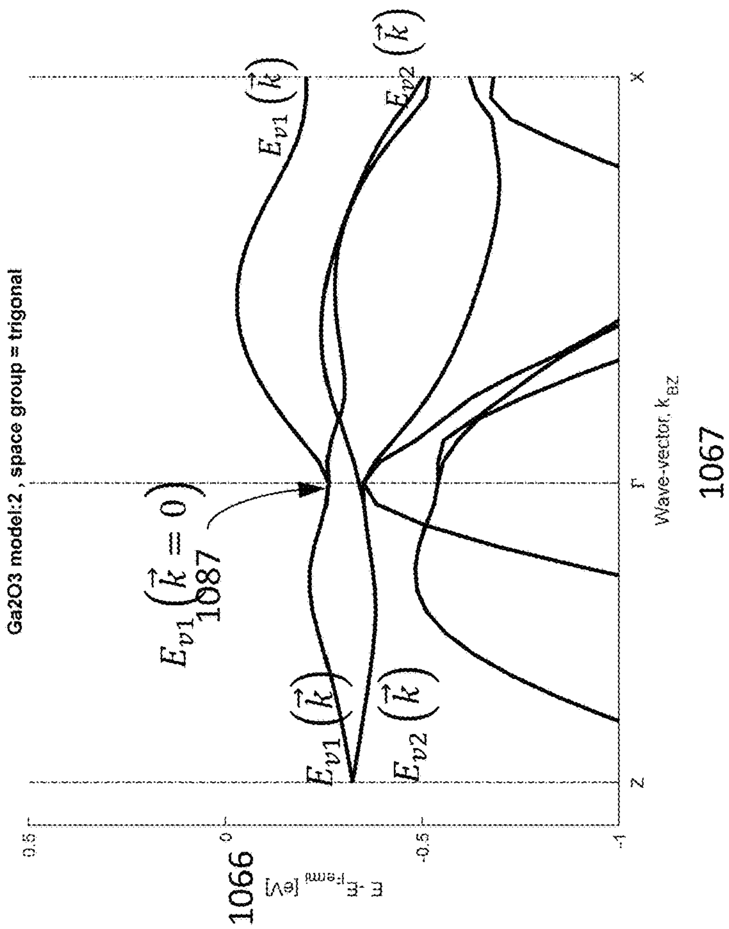
FIGS. 36A and 36B show calculated energy-momentum configurations of corundum alpha-$Ga_2O_3$ in the vicinity of the Brillouin zone center in accordance with an illustrative embodiment of the present disclosure.
Figure 36A:
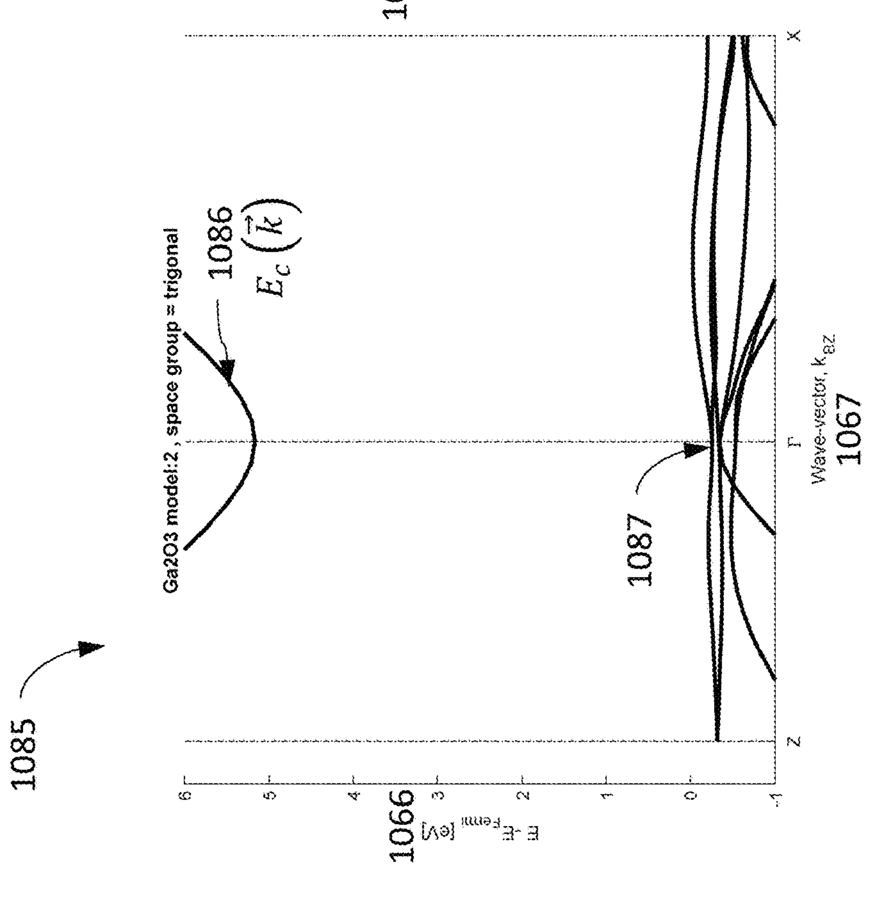

The calculated band structure 1085 for corundum $Ga_2O_3$ is shown in FIGS. 36A and 36B which is pseudo-direct having only a very small energy difference between the valence band maximum and the valence band energy 1087 at the zone center k=0. Conduction band 1086 is also shown in FIG. 36A.

Biaxial and uniaxial strain when applied to corundum $Ga_2O_3$ using the methods described above may then be used to modify the band structure and valence band into a direct bandgap. Indeed it is possible to use tensile strain applied along the b- and/or c-axes crystal to shift the valence band maximum to the zone center. It is estimated that ~5% tensile strain can be accommodated within a thin $Ga_2O_3$ layer comprising an $Al_2O_3/Ga_2O_3$ SL.

(b) Monoclinic Symmetry $Ga_2O_3$

Figure 37:
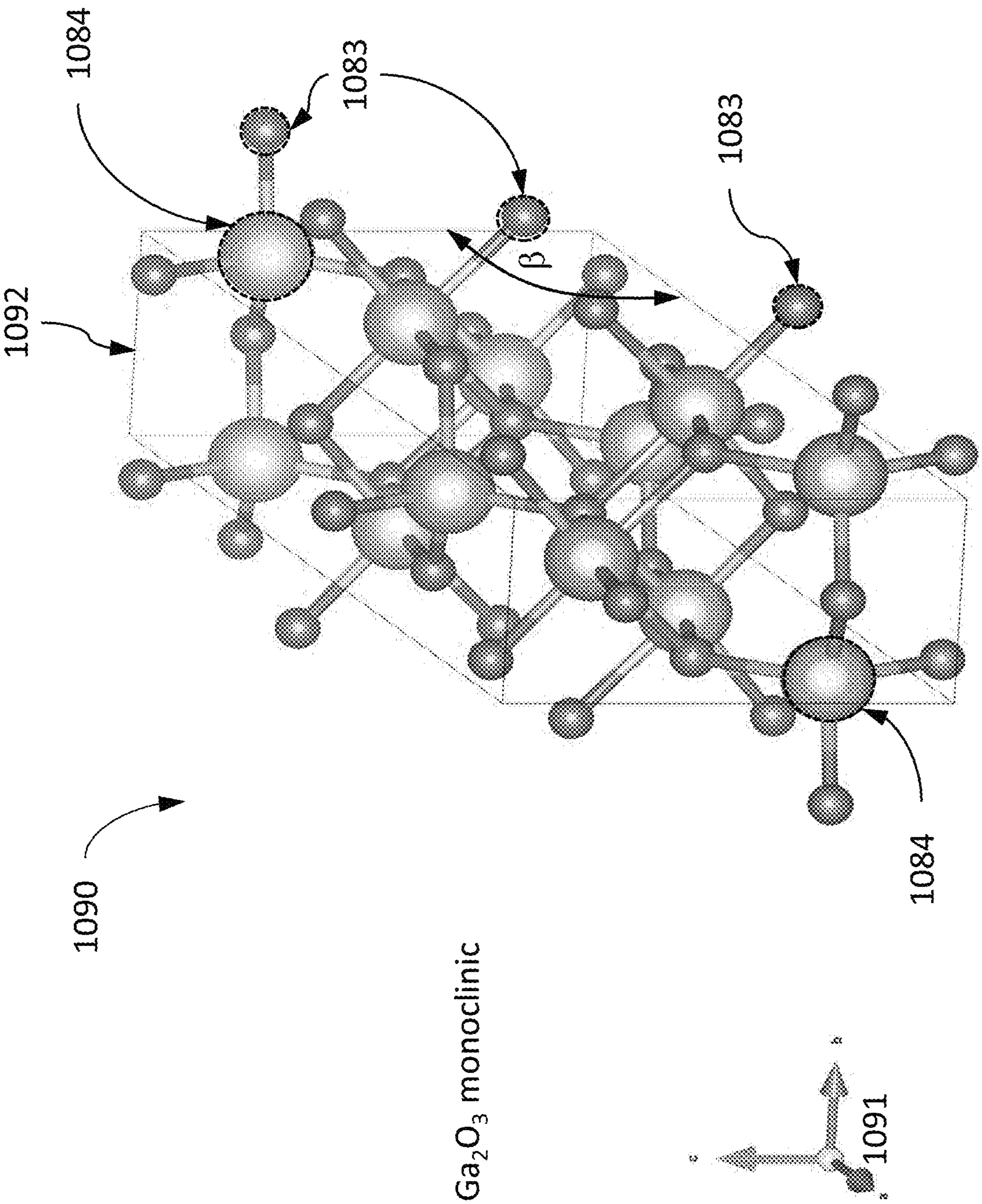
FIG. 37 shows a 3-dimensional crystal unit cell of a monoclinic symmetry crystal structure (beta-phase) $Ga_2O_3$ used to calculate the E-k band structure in accordance with an illustrative embodiment of the present disclosure.
Figure 38A:
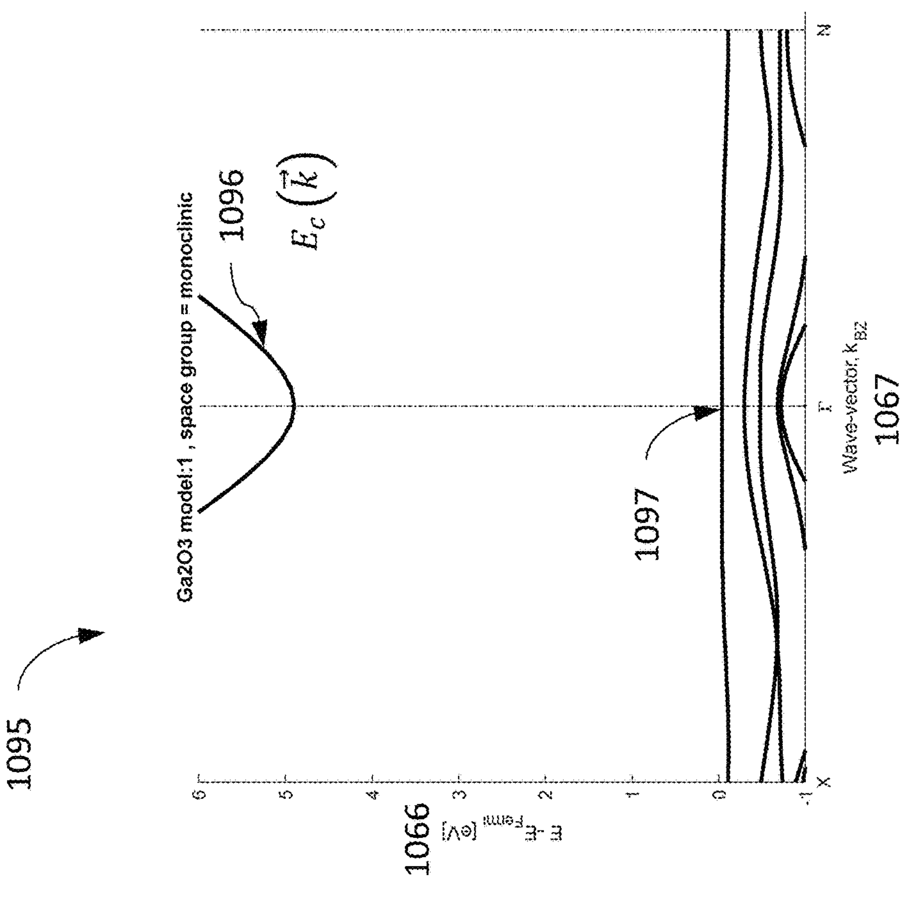
FIGS. 38A and 38B show calculated energy-momentum configurations of beta-$Ga_2O_3$ in the vicinity of the Brillouin zone center in accordance with an illustrative embodiment of the present disclosure.
Figure 38B:
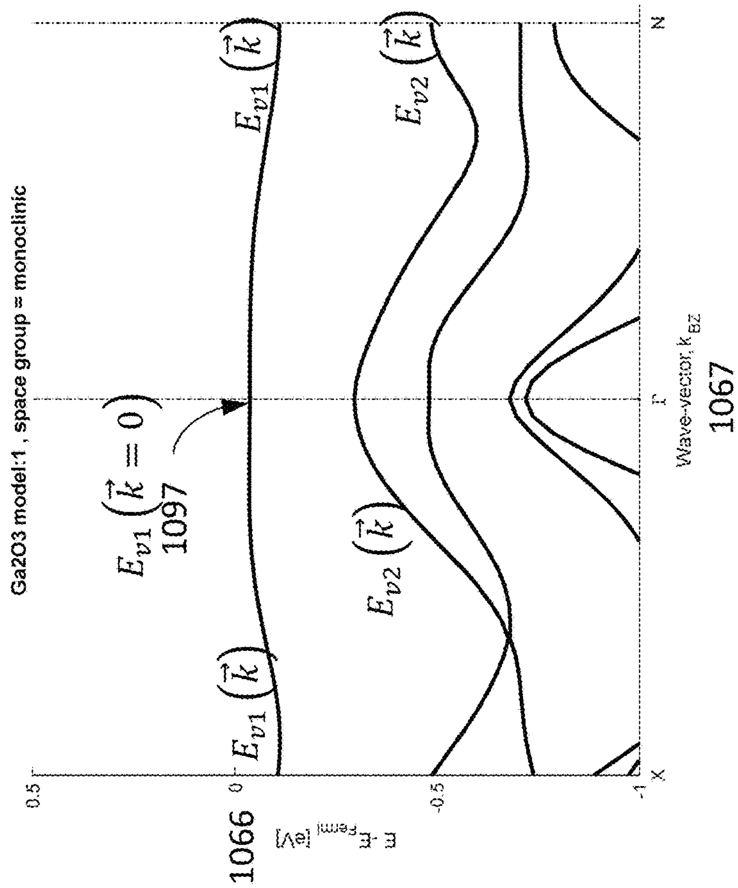

The crystal structure of monoclinic $Ga_2O_3$ (corundum) 1090 is shown in FIG. 37. The larger spheres represent Ga-atoms 1084 and the smaller spheres are oxygen 1083. The unit cell 1092 has crystal axes 1091. This crystal structure has a computed band structure 1095 as shown in FIGS. 38A-38B. The high symmetry points within the Brillouin zone are labelled as shown in the vicinity of the zone center k=0 which is applicable for understanding the optical emission properties of the material. Conduction band 1096 is also shown in FIG. 38A.

Monoclinic $Ga_2O_3$ has an uppermost valence 1097 with a relatively flat E-k dispersion. Close inspection reveals a few eV (less than the thermal energy $k_BT$~25 meV) variation in the actual maximum position of the valence band. The relatively small valence dispersion provides insight to the fact that monoclinic $Ga_2O_3$ will have relatively large hole effective masses and will therefore be relatively localized with potentially low mobility. Thus, strain can be used advantageously to improve the band structure and in particular the valence band dispersion.

Ternary Aluminum-Gallium-Oxide

Figure 39:
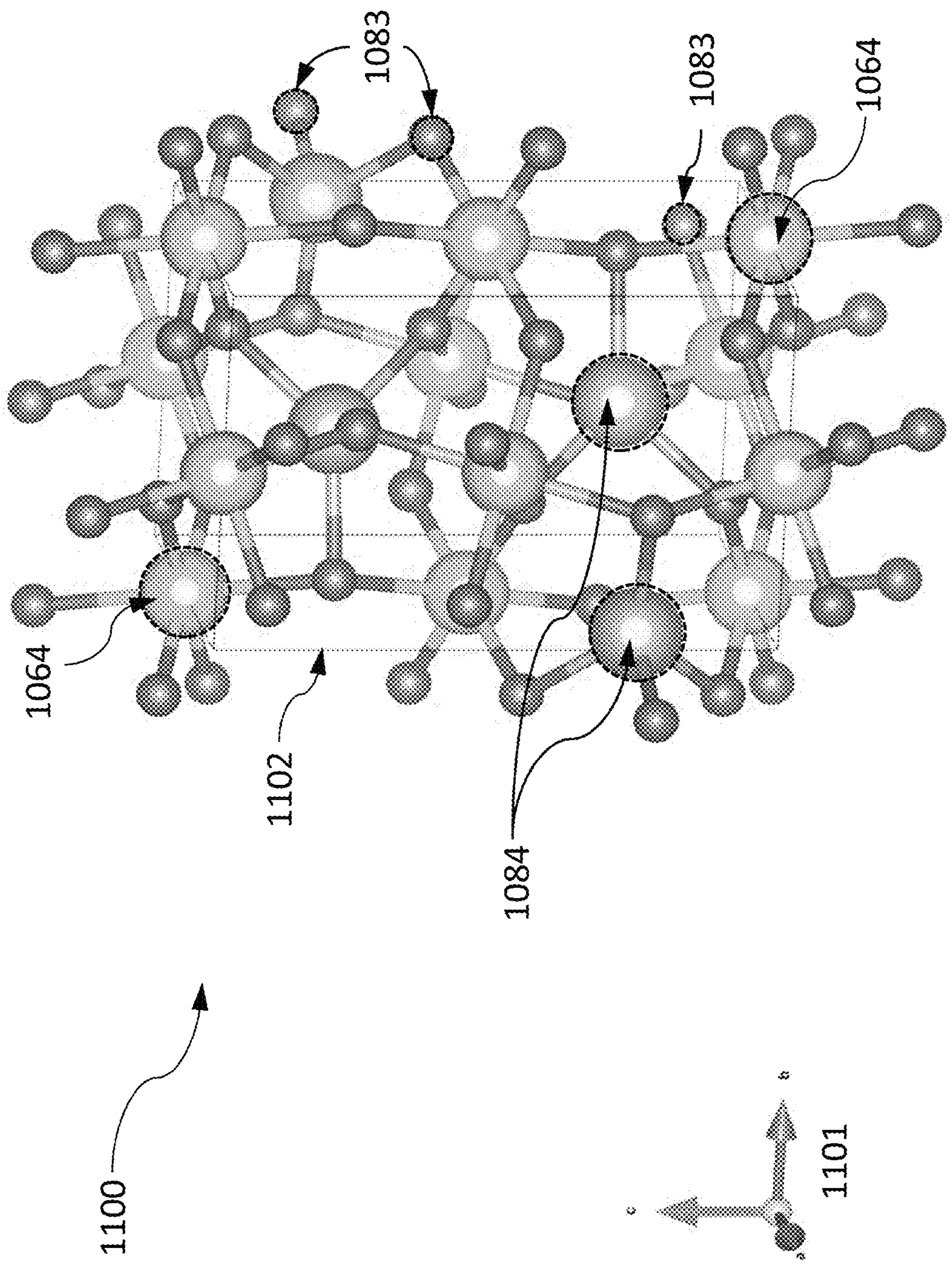
FIG. 39 shows a 3-dimensional crystal unit cell of an orthorhombic symmetry crystal structure of bulk ternary alloy of $(Al,Ga)O_3$ used to calculate the E-k band structure in accordance with an illustrative embodiment of the present disclosure.

Yet another example of the unique properties of the $AlGaO_3$ materials system is demonstrated by the crystal structures 1100 as shown in FIG. 39, having crystal axes 1101 and unit cell 1102. The ternary alloy comprises a 50% Al composition.

$(Al_xGa_{1-x})_2O_3$, where x=0.5 and can be deformed into substantially different crystal symmetry form having rhombic structure. The Ga atoms 1084 and Al atoms 1064 are disposed within the crystal as shown with oxygen atoms 1083. Of particular interest is the layered structure of Al and Ga atom planes. This type of structure can also be built using atomic layer techniques to form an ordered alloy as described throughout this disclosure.

Figure 40:
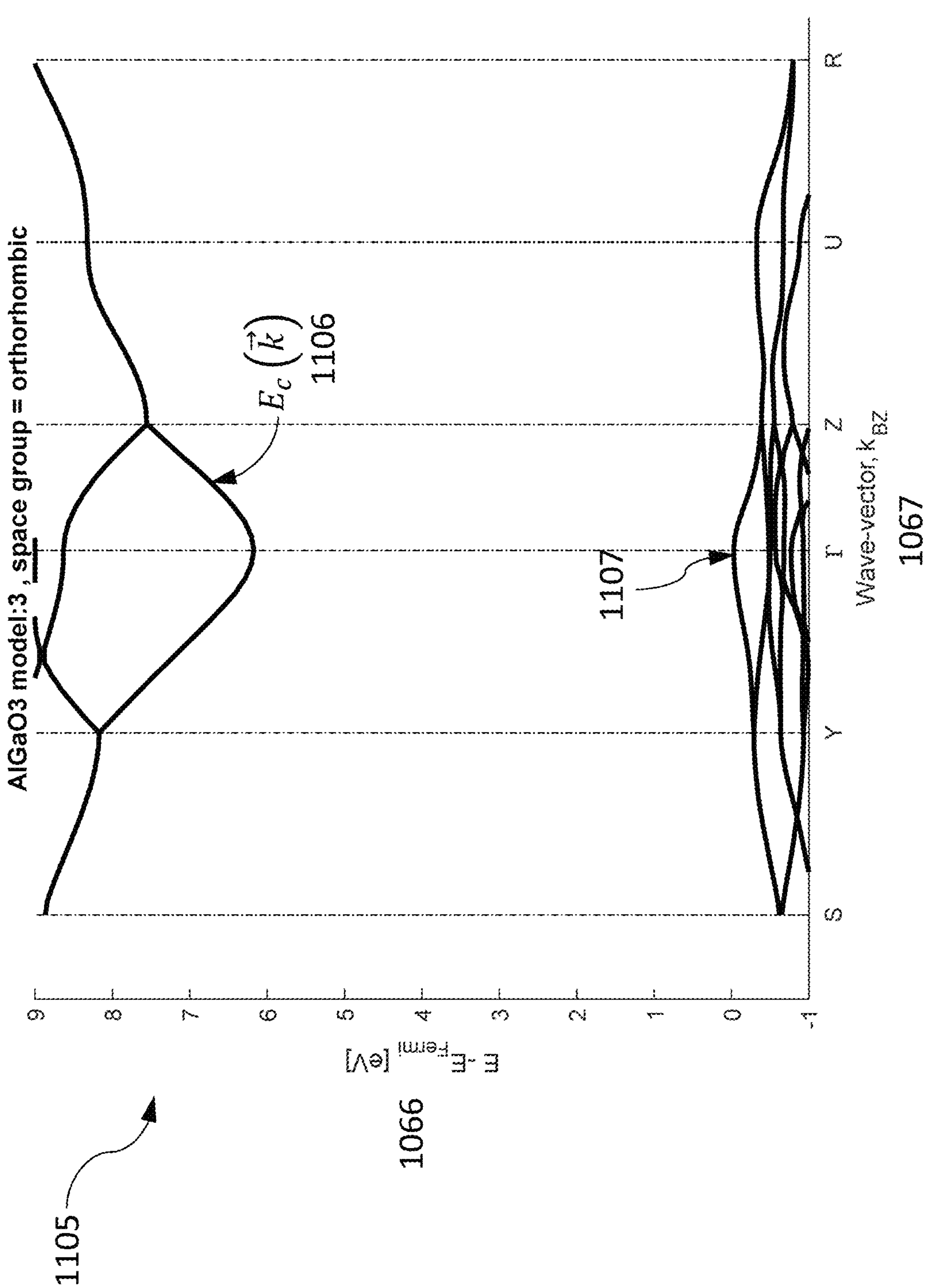
FIG. 40 shows a calculated energy-momentum configuration of $(Al,Ga)O_3$ in the vicinity of the Brillouin zone center showing a direct bandgap in accordance with an illustrative embodiment of the present disclosure.

The calculated band structure of 1105 is shown in FIG. 40. The conduction band minimum 1106 and valence band maximum 1107 exhibits a direct bandgap.

Ordered Ternary $AlGaO_3$ Alloy

Figure 42:
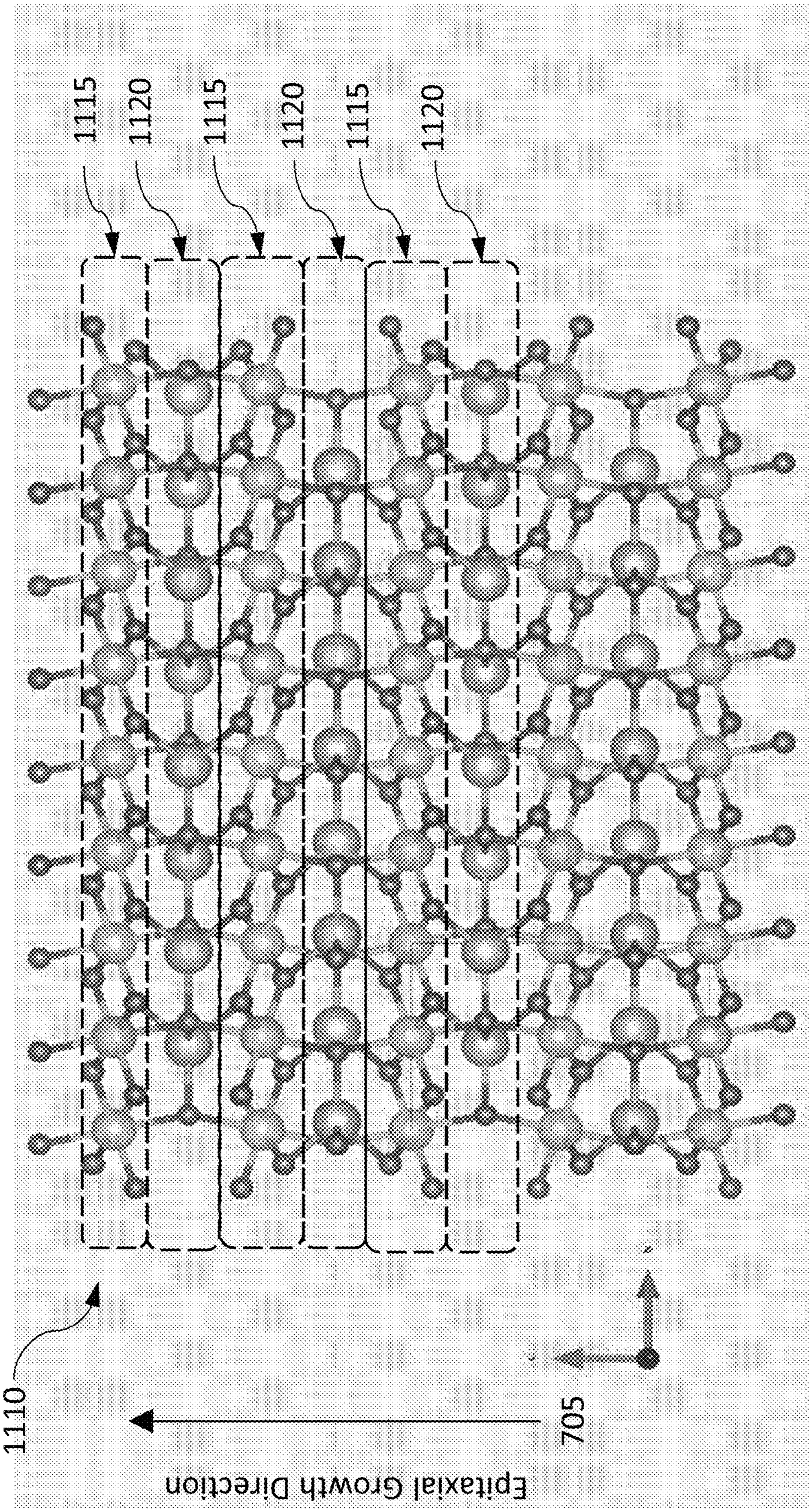
FIG. 42 depicts a cross-sectional portion of a $(Al,Ga)O_3$ ternary structure formed by sequentially depositing Al—O—Ga—O— . . . —O—Al epilayers along a growth direction in accordance with an illustrative embodiment of the present disclosure.

Using atomic layer epitaxy methods further enables new types of crystal symmetry structures to be formed. For example, some embodiments include ultrathin epilayers comprising alternate sequences along a growth direction of the form of [Al-O-Ga-O-Al- . . . ]. Structure 1110 of FIG. 42 shows one possible extreme case of creating ordered ternary alloys using alternate sequences 1115 and 1120. It has been demonstrated in relation to the present disclosure that growth conditions can be created where self-ordering of Al and Ga can occur. This condition can occur even under coincident Al and Ga fluxes simultaneously applied to the growing surface resulting in a self-assembled ordered alloy. Alternatively, a predetermined modulation of the Al and Ga fluxes arriving at the epilayer surface can also create an ordered alloys structure.

The ability to configure the band structure for optoelectronic devices, and in particular UVLEDS, by selecting from bulk-like metal oxides, ternary compositions or further still digital alloys are all contemplated to be within the scope of the present disclosure.

Yet another example is the use of biaxial and uniaxial strain to modify the band structure, with one example being the use of the $(Al_xGa_{1-x})_2O_3$material system employing strained layer epitaxy on $Al_2O_3$ or $Ga_2O_3$ substrates.

Substrate Selection for AlGaO-Based UVLEDs

The selection of a native metal oxide substrate is one advantage of the present disclosure applied to the epitaxy of the $(Al_xGa_{1-x})_2O_3$material systems using strained layer epitaxy on $Al_2O_3$ or $Ga_2O_3$ substrates.

Example substrates are listed in Table I in FIG. 43A. In some embodiments, intermediate $AlGaO_3$ bulk substrates may also be utilized and are advantageous for application to UVLEDs.

A beneficial utility for monoclinic $Ga_2O_3$ bulk substrates is the ability to form monoclinic $(Al_xGa_{1-x})_2O_3$ structures having high Ga % (e.g., approximately 30-40%), limited by strain accumulation. This enables vertical devices due to the ability of having an electrically conductive substrate. Conversely, the use of corundum $Al_2O_3$ substrates enable corundum epitaxial films $(Al_xGa_{1-x})_2O_3$ with $0 \leq x \leq 1$.

Other substrates such as MgO(100), $MgAl_2O_4$ and $MgGa_2O_4$ are also favorable for the epitaxial growth of metal oxide UVLED structures.

Selection and Action of Crystal Growth Modifiers

Examples of metal oxide structures are now discussed for optoelectronic applications and in particular to the fabrication of UVLEDs. The structures disclosed in FIGS. 44A-44Z, which shall be described subsequently, are not limiting as the possible crystal structure modifiers may be selected from either elemental cation and anion constituents into a given metal oxide M-O (where M=Al, Ga), such as binary $Ga_2O_3$, ternary $(Al_xGa_{1-x})_2O_3$ and binary $Al_2O_3$.

It is found both theoretically and experimentally in accordance with the present disclosure that the cation specie crystal modifiers into M-O defined above may be selected from at least one of the following:

Germanium (Ge)

Ge is beneficially supplied as pure elemental species to incorporate via co-deposition of M-O species during non-equilibrium crystal formation process. In some embodiments, elemental pure ballistic beams of atomic Ga and Ge are co-deposited along with an active Oxygen beam impinging upon the growth surface. For example, Ge has a valence of +4 and can be introduced in dilute atomic ratio by substitution onto metal cation M-sites of the M-O host crystal to form stoichiometric composition of the form $(Ge^{+4}O_2)_m(Ga_2O_3)_n=(Ge^{+4}O_2)_{m/(m+n)}(Ga_2O_3)_{n/(m+n)}=(Ge^{+4}O_2)_x(Ga_2O_3)_{1-x}=Ge_xGa_{2(1-x)}O_{3-x}$, wherein for dilute Ge compositions $x<0.1$.

In accordance with the present disclosure, it was found that for Ge $x<0.1$, a dilute ratio of Ge provides sufficient electronic modification to the intrinsic M-O for manipulating the Fermi-energy ($E_F$), thereby increasing the available electron free carrier concentration and altering the crystal lattice structure to impart advantageous strain during epitaxial growth. For dilute compositions the host M-O physical unit cell is substantially unperturbed. Further increase in Ge concentration results in modification of the host $Ga_2O_3$ crystal structure through lattice dilation or even resulting in a new material composition.

For example, for Ge $x \leq 1/3$ a monoclinic crystal structure of the host $Ga_2O_3$ unit cell can be maintained. For example, x=0.25 forming monoclinic $Ge_{0.25}Ga_{1.50}O_{2.75}=Ge_1Ga_6O_{11}$ is possible. Advantageously, monoclinic $Ge_xGa_{2(1-x)}O_{3-x}$ ($x=1/3$) crystal exhibits an excellent direct bandgap in excess of 5 eV. The lattice deformation by introducing Ge increases the monoclinic unit cell preferentially along the b-axis and c-axis while retaining the a-axis lattice constant in comparison to strain free monoclinic $Ga_2O_3$.

The lattice constants for monoclinic $Ga_2O_3$ are (a=3.08 A, b=5.88 A, c=6.41 A) and for monoclinic $Ge_1Ga_6O_{11}$ (a=3.04 A, b=6.38 A, c=7.97 A). Therefore, introducing Ge creates biaxial expansion of the free-standing unit cell along the b- and c-axes. Therefore, if $Ge_xGa_{2(1-x)}O_{3-x}$ is epitaxially deposited upon a bulk-like monoclinic $Ga_2O_3$ surface oriented along the b- and c-axis (that is, deposited along the a-axis), then a thin film of $Ge_xGa_{2(1-x)}O_{3-x}$ can be elastically deformed to induce biaxial compression, and therefore warp the valence band E-k dispersion advantageously, as discussed herein.

Beyond $x>1/3$ the higher Ge % transforms the crystal structure to cubic, for example, $GeGa_2O_5$.

In some embodiments, incorporation of Ge into $Al_2O_3$ and $(Al_xGa_{1-x})_2O_3$ are also possible.

For example, a direct bandgap $Ge_xAl_{2(1-x)}O_{3-x}$ ternary can also be epitaxially formed by co-deposition of elemental Al and Ge and active Oxygen so as to form a thin film of monoclinic crystal symmetry. In accordance with the present disclosure it was found that the monoclinic structure is stabilized for Ge % x~0.6 creating a free-standing lattice that has a large relative expansion along the a-axis and along the c-axis, while moderate decrease along the b-axis when compared to monoclinic $Al_2O_3$.

The lattice constants for monoclinic $Ge_2Al_2O_7$ are (a=5.34 A, b=5.34 A, c=9.81 A) and for monoclinic $Al_2O_3$ (a=2.94 A, b=5.671 A, c=6.14 A). Therefore, $Ge_xAl_{2(1-x)}O_3$ deposited along a growth direction oriented along the b-axis and deposited further on a monoclinic $Al_2O_3$ surface, for sufficiently thin films to maintain elastic deformation, will undergo biaxial tension.

Silicon (Si)

Elemental Si may also be supplied as a pure elemental species to incorporate via co-deposition of M—O species during non-equilibrium crystal formation process. In some embodiments, elemental pure ballistic beams of atomic Ga and Si are co-deposited along with an active Oxygen beam impinging upon the growth surface. For example, Si has a valence of +4 and can be introduced in dilute atomic ratio by substitution onto metal cation M-sites of the M—O host crystal to form stoichiometric composition of the form $(Si^{+4}O_2)_m(Ga_2O_3)_n=(Si^{+4}O_2)_{m/(m+n)}(Ga_2O_3)_{n/(m+n)}=(Si^{+4}O_2)_x(Ga_2O_3)_{1-x}=Si_xGa_{2(1-x)}O_{3-x}$, wherein for dilute Si compositions x<0.1.

In accordance with the present disclosure, it was found that for Si x<0.1, a dilute ratio of Si provides sufficient electronic modification to the intrinsic M—O for manipulating the Fermi-energy ($E_F$), thereby increasing the available electron free carrier concentration and altering the crystal lattice structure to impart advantageous strain during epitaxial growth. For dilute compositions the host M—O physical unit cell is substantially unperturbed. Further increase in Si concentration results in modification of the host $Ga_2O_3$ crystal structure through lattice dilation or even resulting in a new material composition.

For example, for Si x≤⅓ a monoclinic crystal structure of the host $Ga_2O_3$ unit cell can be maintained. For example, for the case of Si % x=0.25, forming monoclinic $Si_{0.25}Ga_{1.50}O_{2.75}=Si_1Ga_6O_{11}$ is possible. The lattice deformation by introducing Si increases the monoclinic unit cell preferentially along the b-axis and c-axis while retaining the a-axis lattice constant in comparison to strain free monoclinic $Ga_2O_3$. The lattice constants for monoclinic $Si_1Ga_6O_{11}$ are (a=6.40 A, b=6.40 A, c=9.40 A) compared to monoclinic $Ga_2O_3$ (a=3.08 A, b=5.88 A, c=6.41 A).

Therefore, introducing Si creates biaxial expansion of the free-standing unit cell along all the a-, b- and c-axes. Therefore, if $Si_xGa_{2(1-x)}O_{3-x}$ is epitaxially deposited upon a bulk-like monoclinic $Ga_2O_3$ surface oriented along the b- and c-axis (that is, deposited along the a-axis), then a thin film of $Si_xGa_{2(1-x)}O_{3-x}$ can be elastically deformed to induce asymmetric biaxial compression, and therefore warp the valence band E-k dispersion advantageously, as discussed herein.

Beyond x>⅓ the higher Si % transforms the crystal structure to cubic, for example, $SiGa_2O_5$.

In some embodiments, incorporation of Si into $Al_2O_3$ and $(Al_xGa_{1-x})_2O_3$ are also possible. For example, orthorhombic $(Si^{+4}O_2)_x(Al_2O_3)_{1-x}=Si_xAl_{2(1-x)}O_{3-x}$ is possible by direct co-deposition of elemental Si and Al with an active Oxygen flux onto a deposition surface. If the deposition surface is selected from the available trigonal alpha-$Al_2O_3$ surfaces (e.g., A-, R-, M-plane) then it is possible to form orthorhombic crystal symmetry $Al_2SiO_5$ (i.e., x=0.5) which reports a large direct bandgap at the Brillouin-zone center. The lattice constants for orthorhombic are (a=5.61 A, b=7.88 A, c=7.80 A) and trigonal (R3c) $Al_2O_3$ (a=4.75 A, b=4.75 A, c=12.982 A).

Deposition of oriented $Al_2SiO_5$ films on $Al_2O_3$ can therefore result in large biaxial compression for elastically strained films. Exceeding the elastic energy limit creates deleterious crystalline misfit dislocations and is generally to be avoided. To achieve elastically deformed film on $Al_2O_3$, in particular, films of thickness less than about 10 nm are preferred.

Magnesium (Mg)

Some embodiments include the incorporation of Mg elemental species with $Ga_2O_3$ and $Al_2O_3$ host crystals, where Mg is selected as a preferred group-II metal specie. Furthermore, incorporation of Mg into $(Al_xGa_{1-x})_2O_3$ up to and including the formation of a quaternary $Mg_x(Al,Ga)_yO_z$ may also be utilized. Particular useful compositions of $Mg_xGa_{2(1-x)}O_{3-2x}$, wherein x<0.1, enable the electronic structure of the $Ga_2O_3$ and $(Al_xGa_{1-x})_2O_3$ host to be made p-type conductivity type by substituting $Ga^{3+}$ cation sites by $Mg^{2+}$ cations. For $(Al_yGa_{1-y})_2O_3$ y=0.3 the bandgap is about 6.0 eV, and Mg can be incorporated up to about y~0.05 to 0.1 enabling the conductivity type of the host to be varied from intrinsic weak excess electron n-type to excess hole p-type.

Ternary compounds of the type $Mg_xGa_{2(1-x)}O_{3-2x}$ and $Mg_xAl_{2(1-x)}O_{3-2x}$ and $(Ni_xMg_{1-x})O$ are also example embodiments of active region materials for optically emissive UVLEDs.

In some embodiments, both stoichiometric compositions of $Mg_xGa_{2(1-x)}O_{3-2x}$ and $Mg_xAl_{2(1-x)}O_{3-2x}$ wherein x=0.5 producing cubic crystal symmetry structure exhibit advantageous direct bandgap E-k dispersion are suitable for optically emissive region.

Furthermore, in accordance with the present disclosure it was found that the $Mg_xGa_{2(1-x)}O_{3-2x}$ and $Mg_xAl_{2(1-x)}O_{3-2x}$ compositions are epitaxially compatible with cubic MgO and monoclinic, corundum and hexagonal crystal symmetry forms of $Ga_2O_3$.

Using non-equilibrium growth techniques enables a large miscibility range of Mg within both $Ga_2O_3$ and $Al_2O_3$ hosts spanning MgO to the respective M—O binary. This is in contradistinction with equilibrium growth techniques such as CZ wherein phase separation occurs due to the volatile Mg specie.

For example, the lattice constants of cubic and monoclinic forms of $Mg_xGa_{2(1-x)}O_{3-2x}$ for x~0.5 are (a=b=c=8.46 A) and (a=10.25 A, b=5.98, c=14.50 A), respectively. In accordance with the present disclosure, it was found that the cubic $Mg_xGa_{2(1-x)}O_{3-2x}$ form can orient as a thin film having (100)- and (111)-oriented films on monoclinic $Ga_2O_3(100)$ and $Ga_2O_3(001)$ substrates. Also, $Mg_xGa_{2(1-x)}O_{3-2x}$ thin epitaxial films can be deposited upon MgO substrates. Furthermore, $Mg_xGa_{2(1-x)}O_{3-2x}$ 0≤x≤1 films can be deposited directly onto $MgAl_2O_4(100)$ spinel crystal symmetry substrates.

In further embodiments, both $Mg_xAl_{2(1-x)}O_{3-2x}$ and $Mg_xGa_{2(1-x)}O_{3-2x}$ high quality (i.e., low defect density) epitaxial films can be deposited directly onto Lithium Fluoride (LiF) substrates.

Zinc (Zn)

Some embodiments include incorporation of Zn elemental species into $Ga_2O_3$ and $Al_2O_3$ host crystals, where Zn is another preferred group-II metal specie. Furthermore, incorporation of Zn into $(Al_xGa_{1-x})_2O_3$ up to and including the formation of a quaternary $Zn_x(Al,Ga)_yO_z$ may also be utilized.

Yet further quaternary compositions advantageous for tuning the direct bandgap structure are the compounds of the most general form:

$$(Mg_xZn_{1-x})_z(Al_yGa_{1-y})_{2(1-z)}O_{3-2z}, \text{ where } 0\le x, y, z\le 1.$$

In accordance with the present disclosure, it was found that the cubic crystal symmetry composition forms of z~0.5 can be used advantageously for a given fixed y composition between Al and Ga. By varying the Mg to Zn ratio x, the direct bandgap can be tuned from about 4 eV≤$E_G$(x)<7 eV. This can be achieved by disposing advantageously separately controllable fluxes of pure elemental beams of Al, Ga, Mg and Zn and providing an activated Oxygen flux for the anions species. In general, an excess of atomic oxygen is desired with respect to the total impinging metal flux. Control of the Al:Ga flux ratio and Mg:Zn ratio arriving at the growth surface can then be used to preselect the composition desired for bandgap tuning the UVLED regions.

Surprisingly, while Zinc-Oxide (ZnO) is generally a wurtzite hexagonal crystal symmetry structure, when introduced into $(Mg_xZn_{1-x})_z(Al_yGa_{1-y})_{2(1-z)}O_{3-2z}$, cubic and spinel crystal symmetry forms are readily possible using non-equilibrium growth methods described herein. The bandgap character at the Brillouin-zone center can be tuned by alloy composition (x, y, z) ranging from indirect to direct character. This is advantageous for application to substantially non-absorbing electrical injection regions and optical emissive regions, respectively. Furthermore, bandgap modulation is possible for bandgap engineered structures, such as superlattices and quantum wells described herein.

Nickel (Ni)

The incorporation of Ni elemental species into $Ga_2O_3$ and $Al_2O_3$ host crystals is yet another preferred group-II metal specie. Furthermore, incorporation of Ni into $(Al_xGa_{1-x})_2O_3$ up to and including the formation of a quaternary $Ni_x(Al, Ga)_yO_z$ may be utilized.

Yet further quaternary compositions advantageous for tuning the direct bandgap structure are the compounds of the most general form:

$$(Mg_xNi_{1-x})_z(Al_yGa_{1-y})_{2(1-z)}O_{3-2z}, \text{ where } 0\leq x, y, z\leq 1.$$

In accordance with the present disclosure, it was discovered that the cubic crystal symmetry composition forms of z~0.5 can be used advantageously for a given fixed y composition between Al and Ga. By varying the Mg to Ni ratio x, the direct bandgap can be tuned from about 4.9 $eV\leq E_G(x)<7$ eV. This can be achieved by disposing advantageously separately controllable fluxes of pure elemental beams of Al, Ga<Mg and Ni and providing an activated oxygen flux for the anion species. Control of the Al:Ga flux ratio and Mg:Ni ratio arriving at the growth surface can then be used to preselect the composition desired for bandgap tuning the UVLED regions.

Of enormous utility herein is the specific band structure and intrinsic conductivity type of cubic NiO. Nickel-Oxide (NiO) exhibits a native p-type conductivity type due to the Ni d-orbital electrons. The general cubic crystal symmetry form $(Mg_xNi_{1-x})_z(Al_yGa_{1-y})_{2(1-z)}O_{3-2z}$ are possible using non-equilibrium growth methods described herein.

Both $Ni_zGa_{2(1-z)}O_{3-2z}$ and $Ni_zAl_{2(1-z)}O_{3-2z}$ are advantageous for application to UVLED formation. Dilute composition of z<0.1 was found in accordance with the present disclosure to be advantageous for p-type conductivity creation, and for z~0.5 the ternary cubic crystal symmetry compounds also exhibit direct bandgap at the Brillouin-zone center.

Lanthanides

There exists a large selection of the Lanthanide-metal atomic species available which can be incorporated into the binary $Ga_2O_3$, ternary $(Al)_xGa_{1-x})_2O_3$ and binary $Al_2O_3$. The Lanthanide group metals range from the 15 elements starting with Lanthanum (Z=57) to Lutetium (Z=71). In some embodiments, Gadolinium Gd(Z=64) and Erbium Er(Z=68) are utilized for their distinct 4f-shell configuration and ability to form advantageous ternary compounds with $Ga_2O_3$, $GaAlO_3$ and $Al_2O_3$. Again, dilute impurity incorporation of exclusively one specie selected from RE={Gd or Er} incorporated into cation sites of $(RE_xGa_{1-x})_2O_3$, $(RE_xGa_yAl_{1-x-y})_2O_3$ and $(RE_xAl_{1-x})_2O_3$ where $0\leq x$, y, $z\leq 1$ enable tuning of the Fermi energy to form n-type conductivity type material exhibiting corundum, hexagonal and monoclinic crystal symmetry. The inner 4f-shell orbitals of Gd provide opportunity for the electronic bonding to circumvent parasitic optical 4f-to-4f energy level absorption for wavelengths below 250 nm.

Surprisingly, it was found both theoretically and experimentally in accordance with the present disclosure that ternary compounds of $(Er_xGa_{1-x})_2O_3$, and $(Er_xAl_{1-x})_2O_3$ for the case of x~0.5 exhibit cubic crystal symmetry structures with direct bandgaps. It is known to have a bixbyite crystal symmetry for binary Erbium-Oxide $Er_2O_3$ which can be formed epitaxially as single crystal films on Si(111) substrates. However, the lattice constant available by bixbyite $Er_2O_3$ is not readily applicable for seeding epitaxial films of $Ga_2O_3$, $GaAlO_3$ and $Al_2O_3$. In accordance with the present disclosure, it was discovered that graded composition incorporation along a growth direction of Er increasing from 0 to 0.5 is necessary for creating the necessary final surface commensurate for epitaxy of monoclinic $Ga_2O_3$. Cubic crystal symmetry forms of $(Er_xGa_{1-x})_2O_3$, $0\leq x\leq 0.5$ may be utilized, such as compositions exhibiting direct bandgap.

Of particular interest is the orthorhombic ternary composition of $(Er_xAl_{1-x})_2O_3$ with x~0.5 having lattice constants (a=5.18 A, b=5.38 A, c=7.41) and exhibiting a well-defined direct energy bandgap of $E_G(k=0)$ of approximately 6.5 to 7 eV. Such a structure can be deposited on monoclinic $Ga_2O_3$ and corundum $Al_2O_3$ substrates or epilayers. As mentioned, the inner $Er^{3+}$ 4f-4f transitions are not presented in the E-k band structure and are therefore classed as non-parasitic absorption for the application of UVLEDs.

Bismuth (Bi)

Bismuth is a known specie which acts as a surfactant for GaN non-equilibrium epitaxy of thin Gallium-Nitride GaN films. Surfactants lower the surface energy for an epitaxial film formation but in general are not incorporated within the growing film. Incorporation of Bi even in Gallium Arsenide is low. Bismuth is a volatile specie having high vapor pressure at low growth temperatures and would appear to be a poor adatom for incorporation into a growing epitaxial film. Surprisingly however, the incorporation of Bi into $Ga_2O_3$, (Ga, Al)$O_3$ and $Al_2O_3$ at dilute levels x<0.1 is extremely efficient using the non-equilibrium growth methods described in the present disclosure. For example, elemental sources of Bi, Ga and Al can be co-deposited with an overpressure ratio of activated Oxygen (namely, atomic Oxygen, Ozone and Nitrous Oxide). It was found in accordance with the present disclosure that Bi incorporation in the monoclinic and corundum crystal symmetry $Ga_2O_3$ and $(Ga_x,Al_{1-x})_2O_3$ for x<0.5 exhibits a conductivity type character that creates an activated hole carrier concentration suitable as a p-type conductivity region for UVLED function.

Yet higher Bi atomic incorporation x>0.1 enables band structure tuning of $(Bi_xGa_{1-x})_2O_3$ and $(Bi_xAl_{1-x})_2O_3$ ternary compositions and indeed all the way to stoichiometric binary Bismuth Oxide $Bi_2O_3$. Monoclinic $Bi_2O_3$ forms lattice constants of (a=12.55 A, b=5.28 and c=5.67 A) which is commensurate with strained layer film growth directly on monoclinic $Ga_2O_3$.

Furthermore, orthorhombic and trigonal forms may be utilized in some embodiments, exhibiting native p-type conductivity character and indirect bandgap.

Particular interest is toward the orthorhombic crystal symmetry composition of $(Bi_xAl_{1-x})_2O_3$ where for the case of x=⅓ exhibits an E-k dispersion that is direct and having $E_G$=4.78-4.8 eV.

Palladium (Pd)

The addition of Pd to $Ga_2O_3$, (Ga, Al)$O_3$ and $Al_2O_3$ may be utilized in some embodiments to create metallic behavior and is applicable for the formation of ohmic contacts. In some embodiments, Palladium Oxide PdO can be used as an in-situ deposited semi-metallic ohmic contact for n-type wide bandgap metal oxide owing to the intrinsically low work function of the compound (refer to FIG. 9).

Iridium (Ir)

Iridium is a preferred Platinum-group metal for incorporation into $Ga_2O_3$, (Ga, Al)$O_3$ and $Al_2O_3$. It was found in accordance with the present disclosure that Ir may bond in a large variety of valence states. In general, the rutile crystal symmetry form of $IrO_2$ composition is known and exhibits a semi-metallic character. Surprisingly, the triply charged $Ir^{3+}$ valence state is possible using non-equilibrium growth methods and is a preferred state for application to incorporation with $Ga_2O_3$ and in particular corundum crystal symmetry. Iridium has one of the highest melting points and lowest vapor pressures when heated. The present disclosure utilizes electron-beam evaporation to form an elemental pure beam of Ir specie impinging upon a growth surface. If activated oxygen is supplied in coincidence and a corundum $Ga_2O_3$ surface presented for epitaxy, corundum crystal symmetry form of $Ir_2O_3$ composition can be realized. Furthermore, by co-depositing with pure elemental beams of Ir and Ga with activated oxygen, compounds of $(Ir_xGa_{1-x})_2O_3$ for $0 \leq x \leq 1.0$ can be formed. Furthermore, by co-depositing with pure elemental beams of Ir and Al with activated oxygen, ternary compounds of $(Ir_xAl_{1-x})_2O_3$ for $0 \leq x \leq 1.0$ can be formed. The addition of Ir to a host metal oxide comprising at least one of $Ga_2O_3$, (Ga, Al)$O_3$ and $Al_2O_3$ can reduce the effective bandgap. Furthermore, for Ir fractions of $x>0.25$ the bandgap is exclusively indirect in nature.

Lithium (Li)

Lithium is a unique atomic specie especially when incorporated with oxygen. Pure Lithium metal readily oxidizes, and Lithium Oxide ($Li_2O$) is readily formed using non-equilibrium growth methods of pure elemental Li beam and activated oxygen directed toward a growth surface of definite surface crystal symmetry. Cubic crystal symmetry $Li_2O$ exhibits a large indirect bandgap Eg~6.9 eV with lattice constants (a=b=c=4.54 A). Lithium is a mobile atom if present in a defective crystal structure, and it is this property which is exploited in Li-ion battery technology. The present disclosure, in contradistinction, seeks to rigidly incorporate Li-atoms within a host crystal matrix comprising at least one of $Ga_2O_3$, (Ga, Al)$O_3$ and $Al_2O_3$. Again, dilute Li concentrations can be incorporated onto substitutional metal sites of $Ga_2O_3$, (Ga, Al)$O_3$ and $Al_2O_3$. For example, for a valence state of $Li^{+1}$ these compositions may be utilized:

$$(Li_2O)_x(Ga_2O_3)_{1-x}=Li_{2x}Ga_{2(1-x)}O_{3-2x}, \text{ where } 0 \leq x \leq 1;$$

and $$(Li_2O)_x(Al_2O_3)_{1-x}=Li_{2x}Al_{2(1-x)}O_{3-2x}, \text{ where } 0 \leq x \leq 1.$$

Stoichiometric forms of $Li_{2x}Ga_{2(1-x)}O_{3-2x}$ for x=0.5 provide for $LiGaO_2$, and $Li_{2x}Al_{2(1-x)}O_{3-2x}$ for x=0.5 provide for $LiAlO_2$.

Both $LiGaO_2$ and $LiAlO_2$ crystalize in preferred orthorhombic and trigonal forms having direct and indirect bandgap energies, respectively, with $E_G(LiGaO_2)$=5.2e V and $E_G(LiAlO_2)$~8 eV.

Of particular interest is the relatively small valence band curvature in both suggesting a smaller hole effective mass compared to $Ga_2O_3$.

The lattice constants of $LiGaO_2$ (a=5.09 A, b=5.47, c=6.46 A) and $LiAlO_2$ are (a=b=2.83 A, c=14.39 A). As bulk Li(Al, Ga)$O_2$ substrates may be utilized, orthorhombic and trigonal quaternary compositions such as $Li(Al_xGa_{1-x})O_2$ may also be utiliized thereby enabling UVLED operation for the optical emissive region.

Li impurity incorporation within even cubic NiO can enable improved p-type conduction and can serve as a possible electrical injector region for holes applied to the UVLED.

Yet a further composition in some embodiments is ternary comprising Lithium-Nickel-Oxide $Li_xNi_yO_z$. Theoretical calculations provide insight toward the possible higher valence states of $Ni^{2+}$ and $Li^{2+}$. An electronic composition comprising $Li_2^{(+4)}Ni^{+2}O_3^{(-6)}=Li_2NiO_3$ may be utilized to create via non-equilibrium growth techniques forming a monoclinic crystal symmetry. It was found in accordance with the present disclosure that $Li_2NiO_3$ forms an indirect bandgap of $E_G$~5 eV. Yet another composition is the trigonal crystal symmetry (R3m) where $Li^{+1}$ and $Ni^{+1}$ valence states form the composition $Li_2NiO_2$ having a direct bandgap between s-like and p-like states of $E_G$=8 eV, however the strong d-like states from Ni create crystal momentum independent mid bandgap energy states continuous across all the Brillouin zones.

Nitrogen and Fluorine Anion Substitution

Furthermore, it has been found in accordance with the present disclosure that selected anion crystal modifiers to the disclosed metal oxide compositions may be selected from at least one of a nitrogen (N) and fluorine (F) specie. Similar to p-type activated hole concentration creation in binary $Ga_2O_3$ and ternary $(GaxAl_{1-x})_2O_3$ by substitutional incorporation of a group-III metal cation site by a group-II metal specie, it is further possible to substitute an oxygen anion site during epitaxial growth by an activated Nitrogen atom (e.g., neutral atomic nitrogen species in some embodiments). In accordance with the present disclosure, dilute nitrogen incorporation within a $Ga_2O_3$ host was surprisingly been found to stabilize monoclinic $Ga_2O_3$ compositions during epitaxy. Prolonged exposure of $Ga_2O_3$ during growth to a combination of elemental Ga and neutral atomic fluxes of simultaneous oxygen and nitrogen was found to form competing GaN-like precipitates.

It was also found in accordance with the present disclosure that periodically modulating the $Ga_2O_3$ growth by interrupting the Ga and O fluxes periodically and preferentially exposing the terminated surface exclusively with activated atomic neutral nitrogen enables a portion of the surface to incorporate N on otherwise available O-sites within the $Ga_2O_3$ growth. Spacing these N-layer growth interruptions by a distance greater than 5 or more unit cells of $Ga_2O_3$ along the growth direction enables high density impurity incorporation aiding the achievement of p-type conductivity character in $Ga_2O_3$.

This process may be utilized for both corundum and trigonal forms of $Ga_2O_3$.

In some embodiments, a combination approach of group-II metal cation substation and Nitrogen anion substation may be utilized for controlling the p-type conductivity concentration in $Ga_2O_3$.

Fluorine impurity incorporation into $Ga_2O_3$ is also possible, however elemental fluorine sources are challenging. The present disclosure uniquely utilizes the sublimation of Lithium-Fluoride LiF bulk crystal within a Knudsen cell to provide a compositional constituent of both Li and F which is co-deposited during elemental Ga and Al beams under an activated oxygen environment supplying the growth surface. Such a technique enables the incorporation of Li and F atoms within an epitaxially formed $Ga_2O_3$ or $LiGaO_2$ host.

Figure 44A:
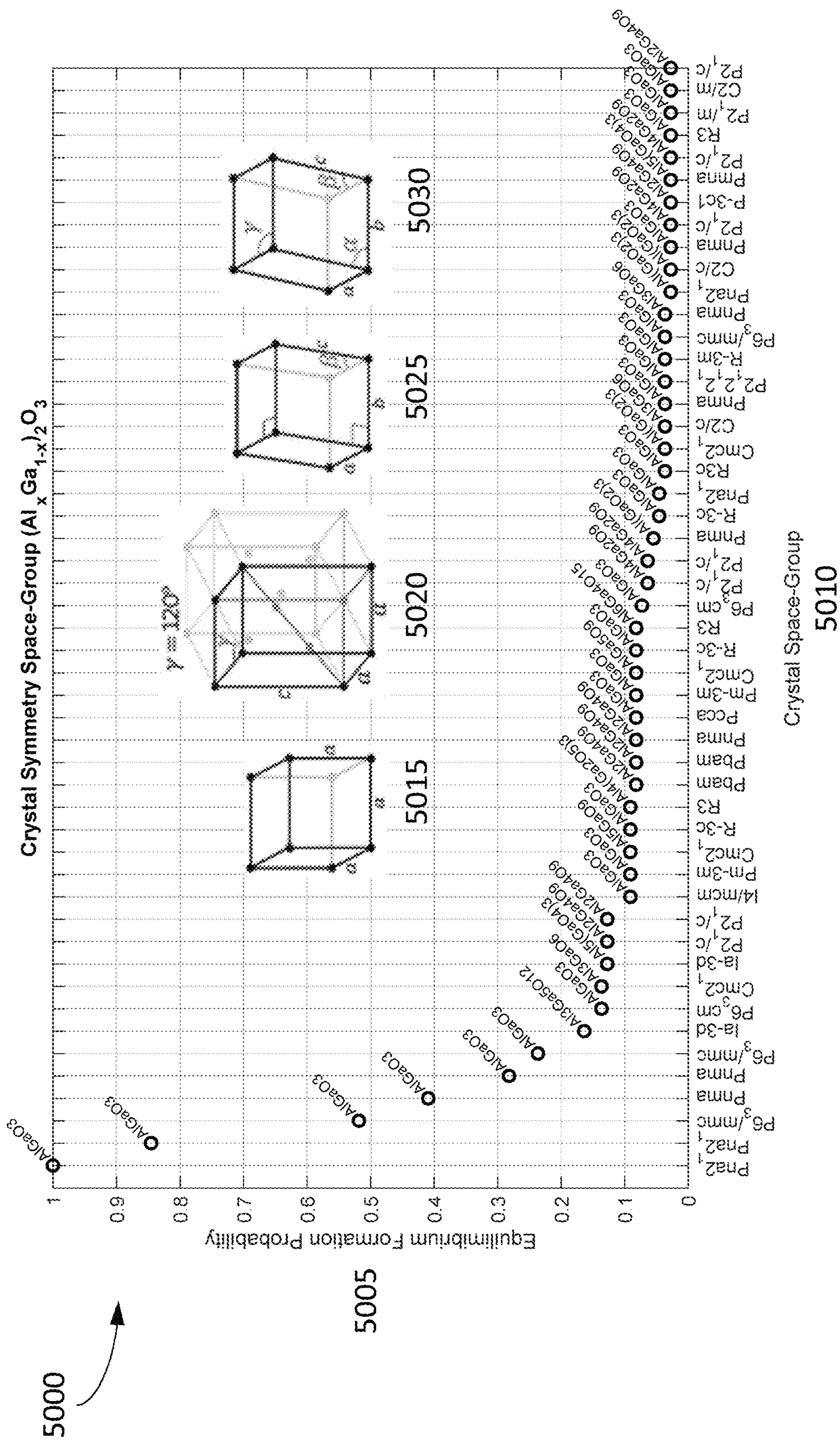
FIG. 44A depicts a calculated formation energy of Aluminum-Gallium-Oxide ternary alloy as a function of composition and crystal symmetry in accordance with an illustrative embodiment of the present disclosure.
Figure 44B:
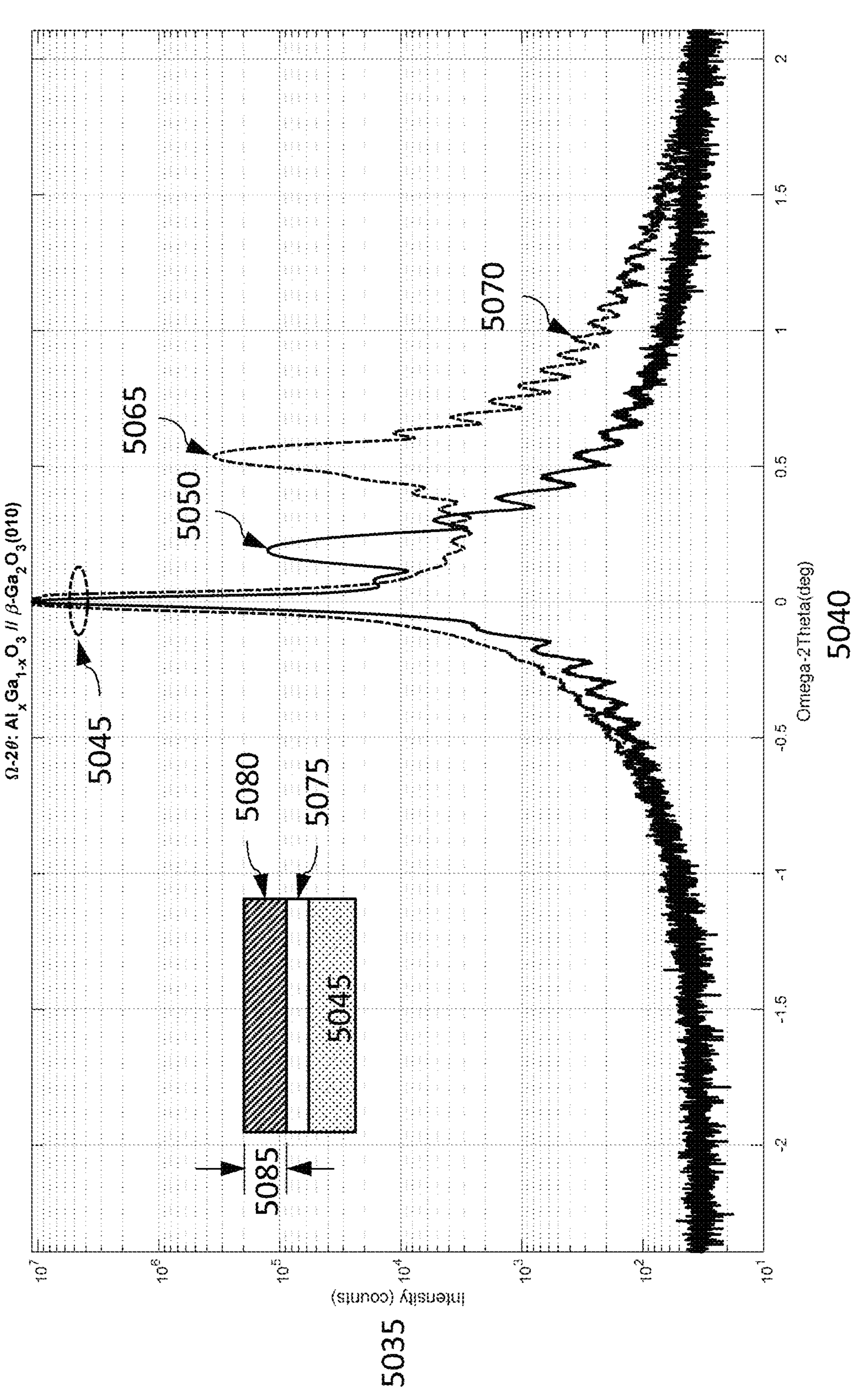
FIG. 44B shows an experimental high-resolution x-ray diffraction (HRXRD) of two example distinct compositions of high-quality single crystal ternary $(Al_xGa_{1-x})_2O_3$deposited epitaxially on a bulk (010)-oriented $Ga_2O_3$ substrate in accordance with an illustrative embodiment of the present disclosure.
Figure 44C:
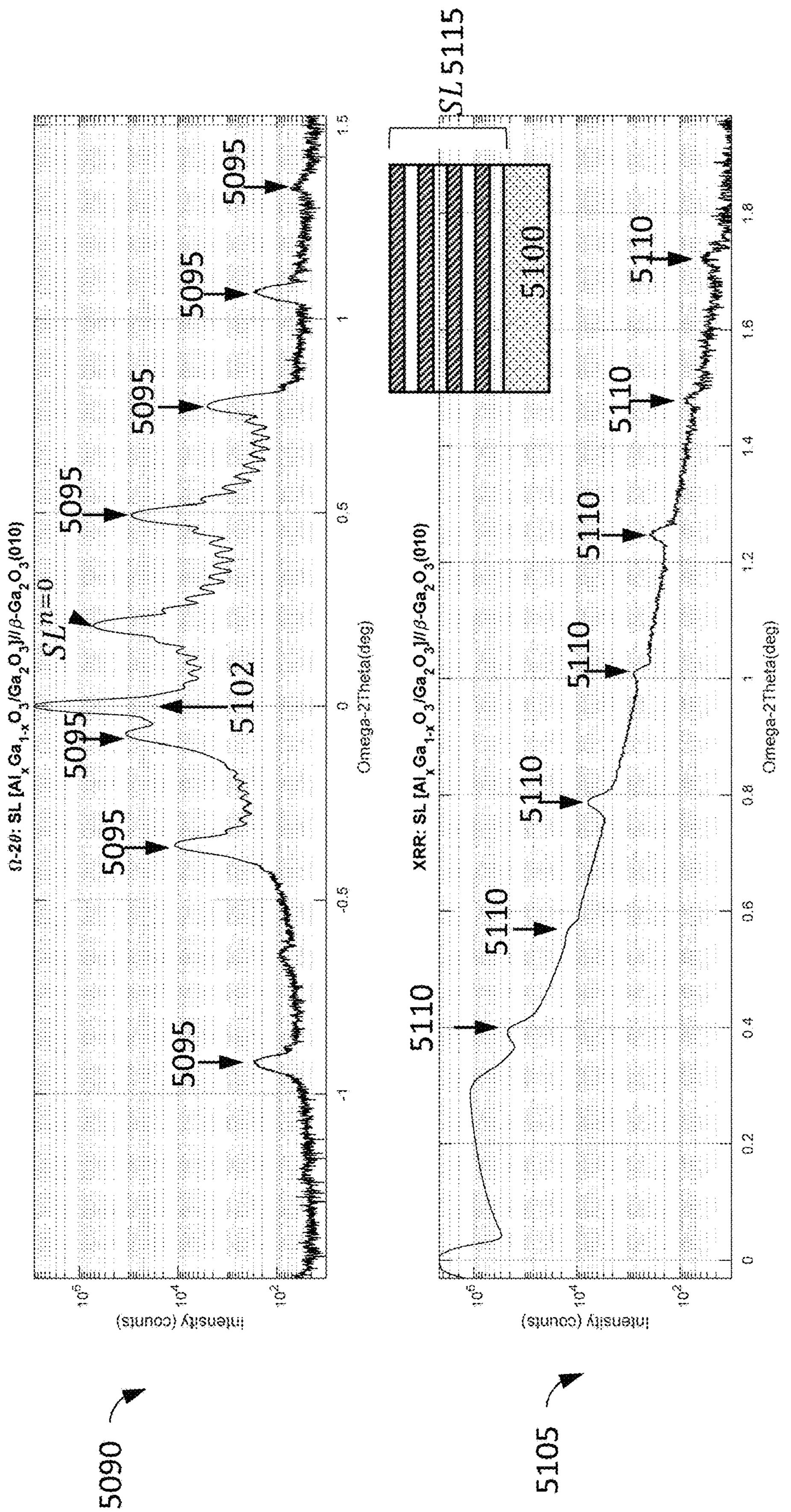
FIG. 44C shows an experimental HRXRD and x-ray grazing incidence reflection (GIXR) of an example superlattice comprising repeating unit cells of bilayers selected from a $[(Al_xGa_{1-x})_2O_3/Ga_2O_3]$ elastically strained to a β-$Ga_2O_3$(010)-oriented substrate in accordance with an illustrative embodiment of the present disclosure.
Figure 44D:
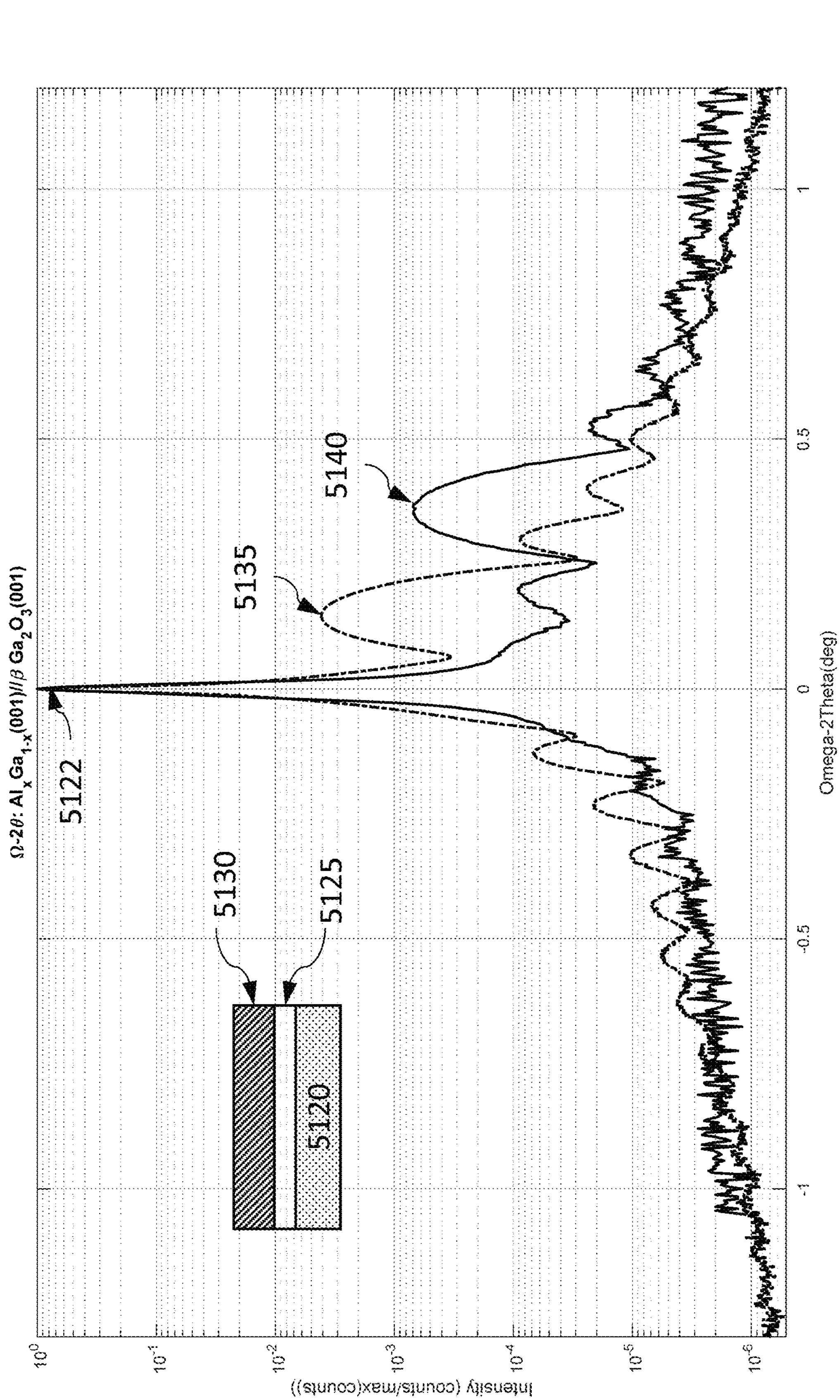
FIG. 44D shows an experimental HRXRD and GIXR of two example distinct compositions of high-quality single crystal ternary $(Al_xGa_{1-x})_2O_3$layers deposited epitaxially on a bulk (001)-oriented $Ga_2O_3$ substrate in accordance with an illustrative embodiment of the present disclosure.
Figure 44E:
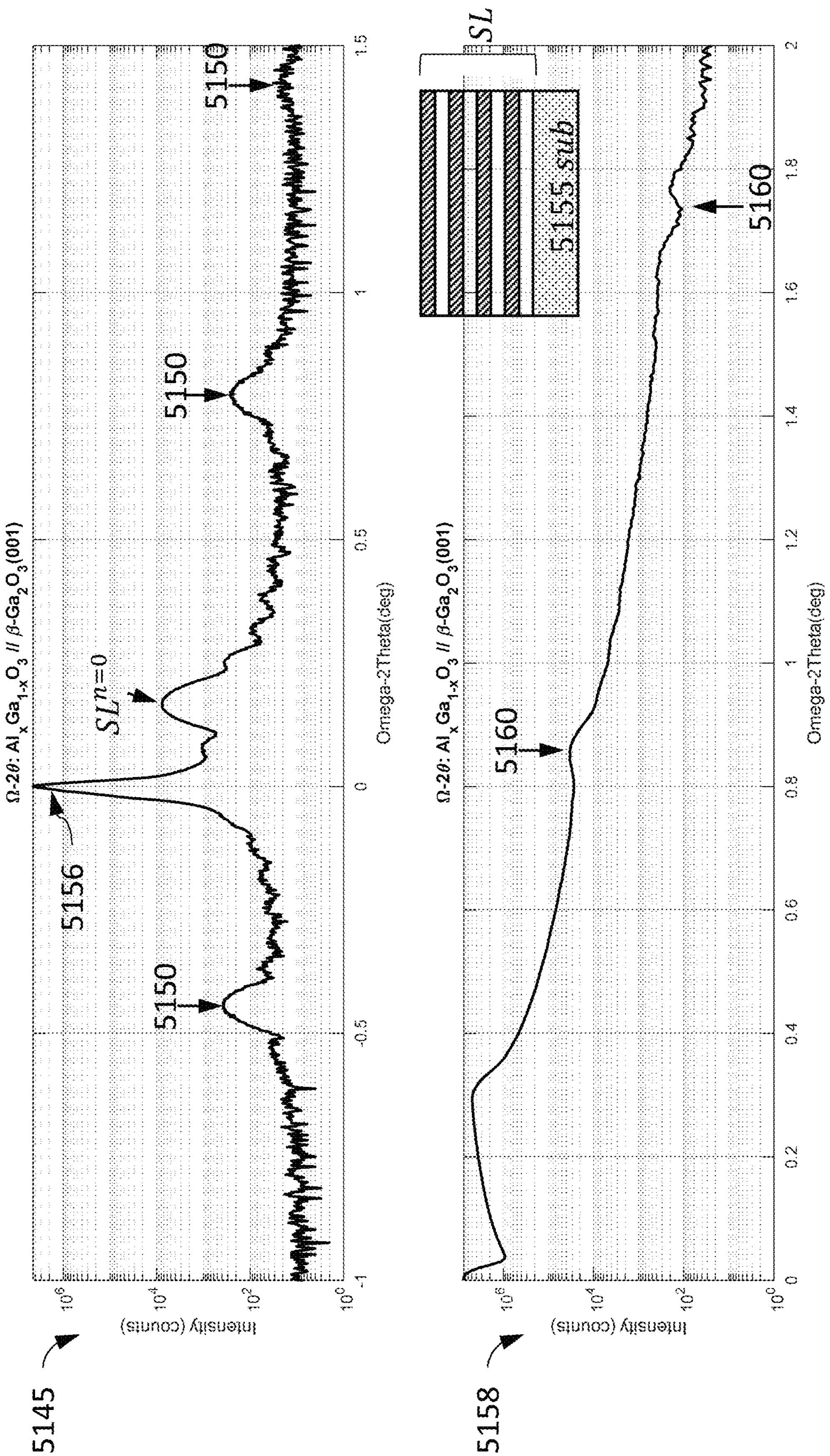
FIG. 44E shows an experimental HRXRD and GIXR of a superlattice comprising repeating unit cells of bilayers selected from a $[(Al_xGa_{1-x})_2O_3/Ga_2O_3]$ elastically strained to a β-$Ga_2O_3$(001)-oriented substrate in accordance with an illustrative embodiment of the present disclosure.
Figure 44F:
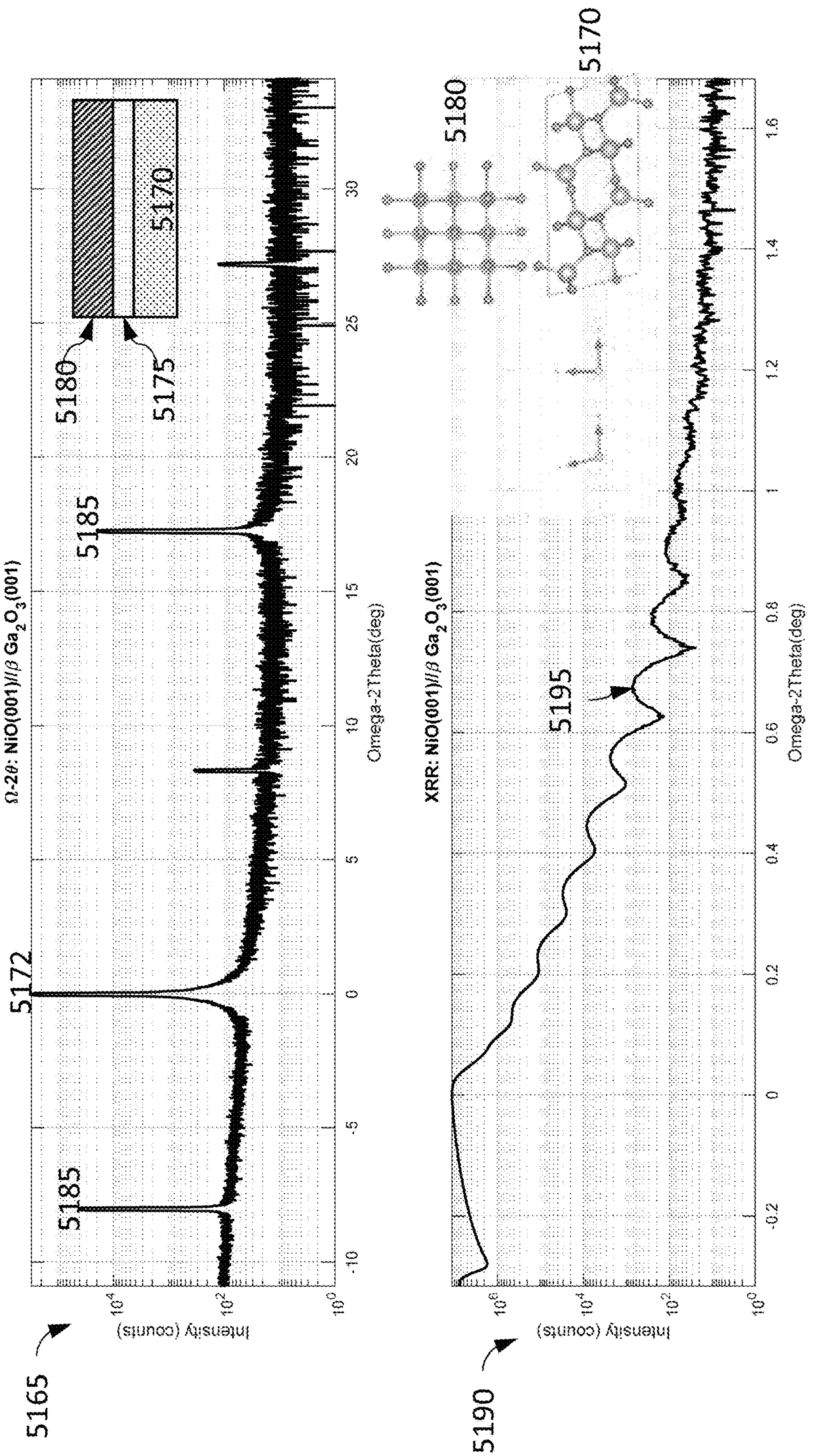
FIG. 44F shows an experimental HRXRD and GIXR of a cubic crystal symmetry binary Nickel Oxide (NiO) epilayer elastically strained to a monoclinic crystal symmetry β-$Ga_2O_3$(001)-oriented substrate in accordance with an illustrative embodiment of the present disclosure.
Figure 44G:
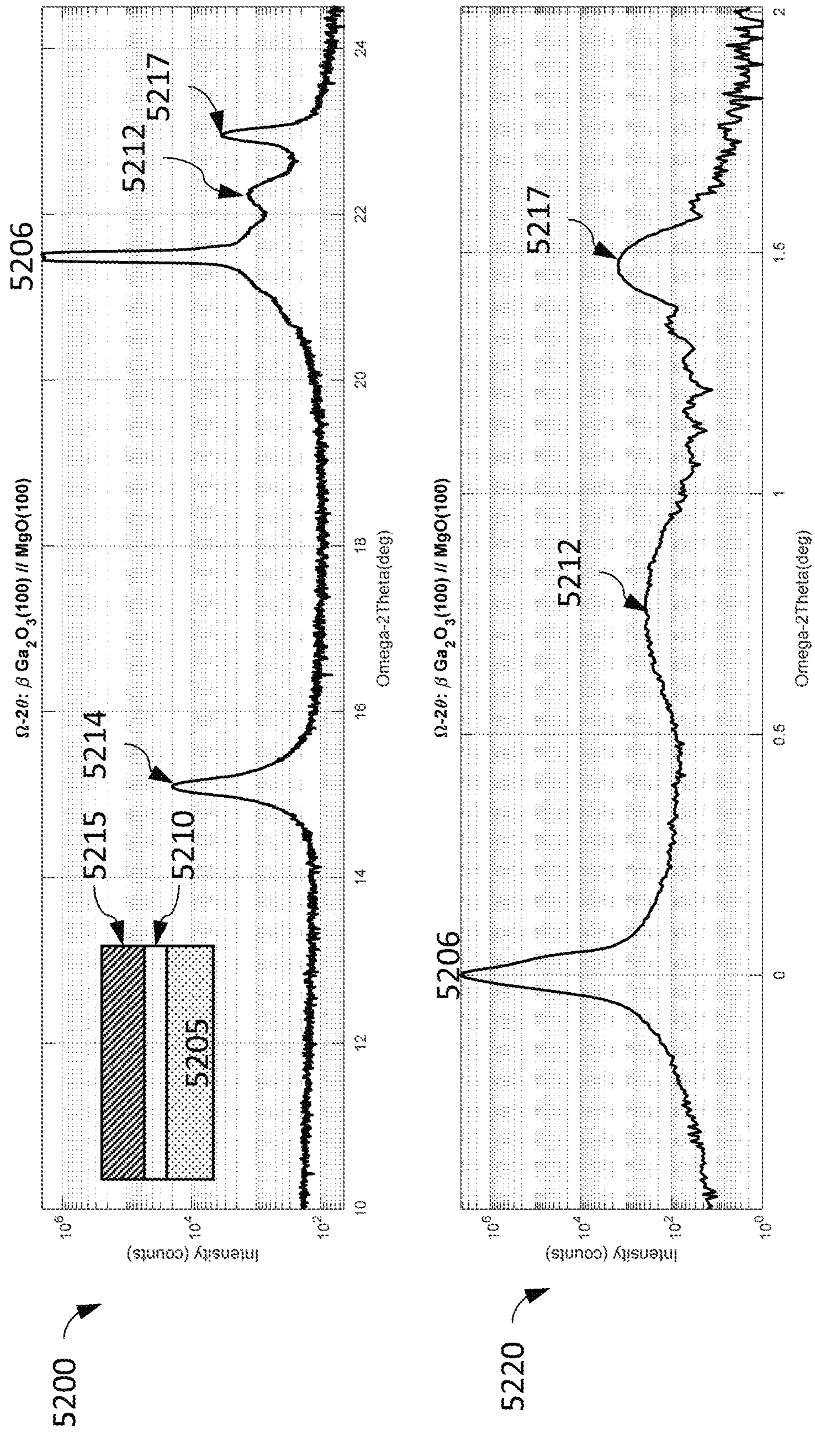
FIG. 44G shows an experimental HRXRD and GIXR of a monoclinic crystal symmetry $Ga_2O_3$(100)-oriented epilayer elastically strained to a cubic crystal symmetry MgO (100)-oriented substrate in accordance with an illustrative embodiment of the present disclosure.
Figure 44H:
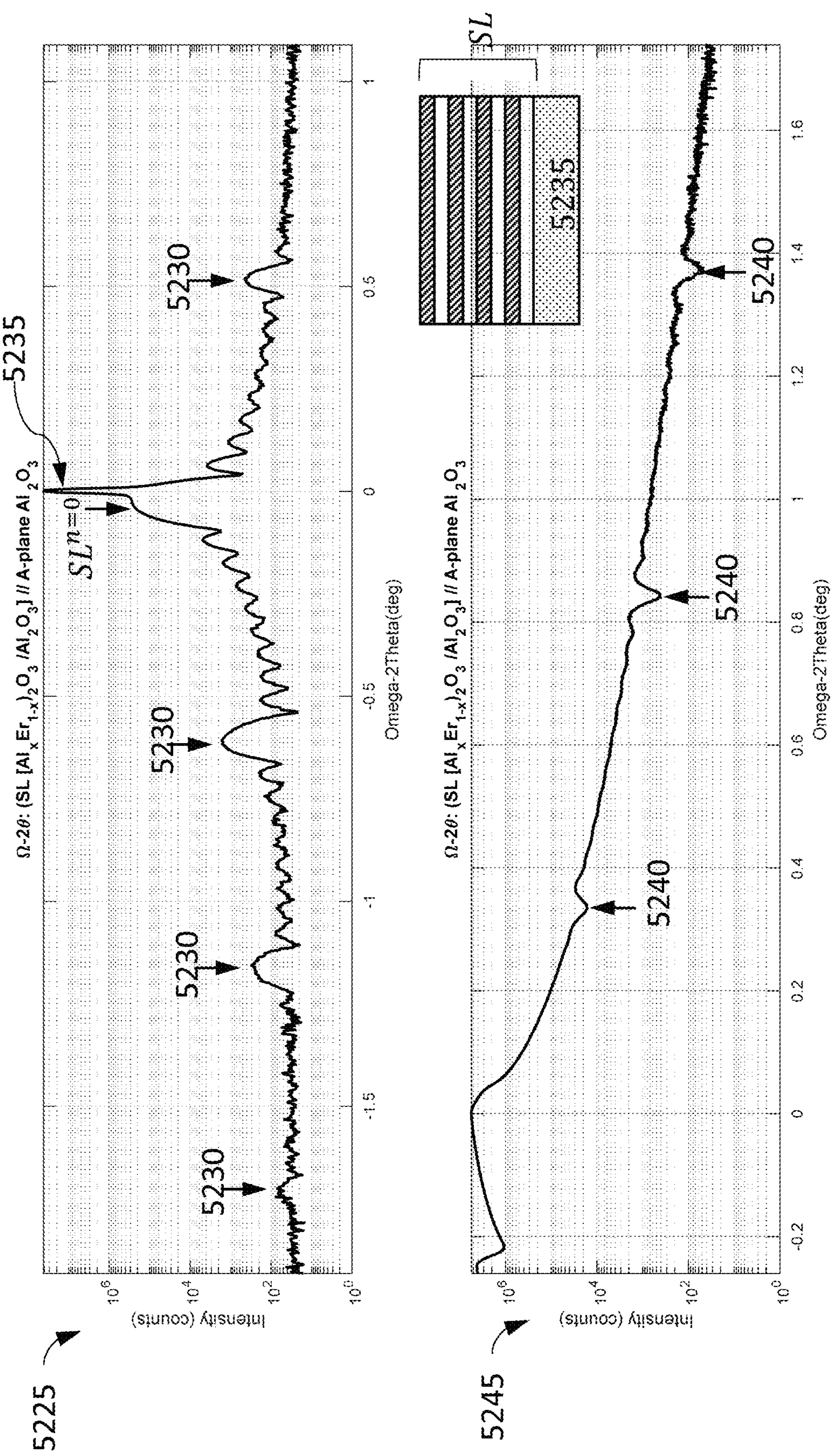
FIG. 44H shows an experimental HRXRD and GIXR of a superlattice comprising repeating unit cells of bilayers selected from a $[(Al_xEr_{1-x})_2O_3/Al_2O_3]$ elastically strained to a corundum crystal symmetry $\alpha$-$Al_2O_3$(001)-oriented substrate in accordance with an illustrative embodiment of the present disclosure.
Figure 44I:
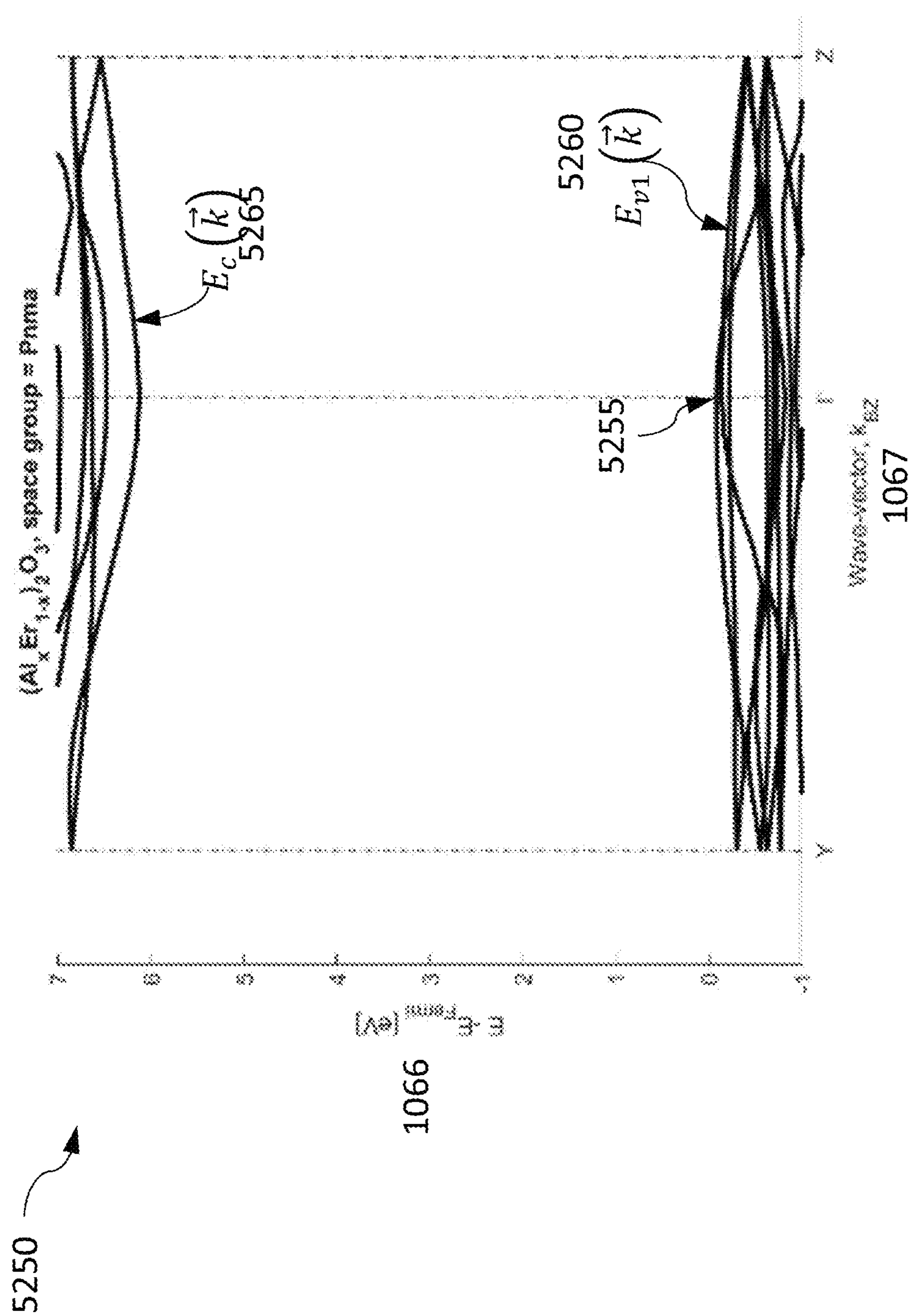
FIG. 44J shows an experimental HRXRD and GIXR of a superlattice comprising bilayered unit cells of a monoclinic crystal symmetry $Ga_2O_3$(100)-oriented film coupled to a cubic (spinel) crystal symmetry ternary composition of Magnesium-Gallium-Oxide, $Mg_xGa_{2(1-x)}O_{3-2x}$ where the SL is epitaxially deposited upon a monoclinic $Ga_2O_3$(010)-oriented substrate in accordance with an illustrative embodiment of the present disclosure.
FIG. 44K shows a strain-free energy-crystal momentum (E-k) dispersion in the vicinity of the Brillouin-zone center for the case of ternary Magnesium-Gallium-Oxide $Mg_xGa_{2(1-x)}O_{3-2x}$ illustrating the direct bandgap at $\Gamma$(k=0) in accordance with an illustrative embodiment of the present disclosure.
FIG. 44L shows an experimental HRXRD and GIXR of an orthorhombic $Ga_2O_3$ epilayer elastically strained to a cubic crystal symmetry Magnesium-Aluminum-Oxide $MgAl_2O_4$(100)-oriented substrate in accordance with an illustrative embodiment of the present disclosure.
FIG. 44M shows an experimental HRXRD of a ternary Zinc-Gallium-Oxide $ZnGa_2O_4$ epilayer elastically strained to a wurtzite Zinc-Oxide ZnO layer deposited upon a monoclinic crystal symmetry Gallium-Oxide (−201)-oriented substrate in accordance with an illustrative embodiment of the present disclosure.
FIG. 44N shows an energy-crystal momentum (E-k) dispersion in the vicinity of the Brillouin-zone center for the case of ternary cubic Zinc-Gallium-Oxide $Zn_xGa_{2(1-x)}O_{3-2x}$, where x=0.5 illustrating the indirect bandgap at $\Gamma$(k=0) in accordance with an illustrative embodiment of the present disclosure.
FIG. 44O shows an epitaxial layer stack deposited along a growth direction for the case of an orthorhombic $Ga_2O_3$ crystal symmetry film using an intermediate layer and a prepared substrate surface in accordance with an illustrative embodiment of the present disclosure.
FIG. 44P shows an experimental HRXRD of two distinctly different crystal symmetry binary $Ga_2O_3$ compositions deposited upon a rhombic Sapphire $\alpha$-$Al_2O_3$(0001)-oriented substrate controlled via growth conditions in accordance with an illustrative embodiment of the present disclosure.
FIG. 44Q shows a strain-free energy-crystal momentum (E-k) dispersion in the vicinity of the Brillouin-zone center for the case of binary orthorhombic Gallium-Oxide illustrating the direct bandgap at $\Gamma$(k=0) in accordance with an illustrative embodiment of the present disclosure.
FIG. 44R shows an experimental HRXRD and GIXR of two example distinct compositions of high-quality single crystal corundum symmetry ternary $(Al_xGa_{1-x})_2O_3$ deposited epitaxially on a bulk (1-100)-oriented corundum crystal symmetry $Al_2O_3$ substrate in accordance with an illustrative embodiment of the present disclosure.
FIG. 44S shows an experimental HRXRD of a monoclinic topmost active $Ga_2O_3$ epilayer deposited upon a ternary Erbium-Gallium-Oxide $(Er_xGa_{1-x})_2O_3$ transition layer deposited upon a single crystal Silicon (111)-oriented substrate in accordance with an illustrative embodiment of the present disclosure.
FIG. 44T shows an experimental HRXRD and GIXR of an example high-quality single crystal corundum symmetry binary $Ga_2O_3$ deposited epitaxially on a bulk (11-20)-oriented corundum crystal symmetry $Al_2O_3$ substrate where the two thicknesses of $Ga_2O_3$ are shown pseudomorphically strained (i.e., elastic deformation of the bulk $Ga_2O_3$ unit cell) to the underlying $Al_2O_3$ substrate in accordance with an illustrative embodiment of the present disclosure.
FIG. 44U shows an experimental HRXRD and GIXR of an example high-quality single crystal corundum symmetry superlattice comprising bilayers of binary pseudomorphic $Ga_2O_3$ and $Al_2O_3$ deposited epitaxially on a bulk (11-20)-oriented corundum crystal symmetry $Al_2O_3$ substrate where the superlattice $[Al_2O_3/Ga_2O_3]$ demonstrates the unique properties of the corundum crystal symmetry in accordance with an illustrative embodiment of the present disclosure.
FIG. 44V shows an experimental transmission electron micrograph (TEM) of a high-quality single crystal superlattice comprising SL$[Al_2O_3/Ga_2O_3]$ deposited upon a corundum $Al_2O_3$ substrate depicting the low dislocation defect density in accordance with an illustrative embodiment of the present disclosure.
FIG. 44W shows an experimental HRXRD of a corundum crystal symmetry topmost active $(Al_xGa_{1-x})_2O_3$ epilayer deposited upon a single corundum $Al_2O_3$ (1-102)-oriented substrate in accordance with an illustrative embodiment of the present disclosure.
FIG. 44X shows an experimental HRXRD and GIXR of an example high-quality single crystal corundum symmetry superlattice comprising bilayers of ternary pseudomorphic $(Al_xGa_{1-x})_2O_3$ and $Al_2O_3$ deposited epitaxially on a bulk (1-102)-oriented corundum crystal symmetry $Al_2O_3$ substrate in accordance with an illustrative embodiment of the present disclosure, where the superlattice $[Al_2O_3/(Al_xGa_{1-x})_2O_3]$ demonstrates the unique properties of the corundum crystal symmetry.
FIG. 44Y shows an experimental wide angle HRXRD of a cubic crystal symmetry topmost active Magnesium-Oxide MgO epilayer deposited upon a single crystal cubic (spinel) Magnesium-Aluminum-Oxide $MgAl_2O_4$ (100)-oriented substrate in accordance with an illustrative embodiment of the present disclosure.
FIG. 44Z shows a strain-free energy-crystal momentum (E-k) dispersion in the vicinity of the Brillouin-zone center for the case of ternary Magnesium-Aluminum-Oxide $Mg_xAl_{2(1-x)}O_{3-2x}$, x=0.5 illustrating the direct bandgap at $\Gamma$(k=0) in accordance with an illustrative embodiment of the present disclosure.
Figure 44J:
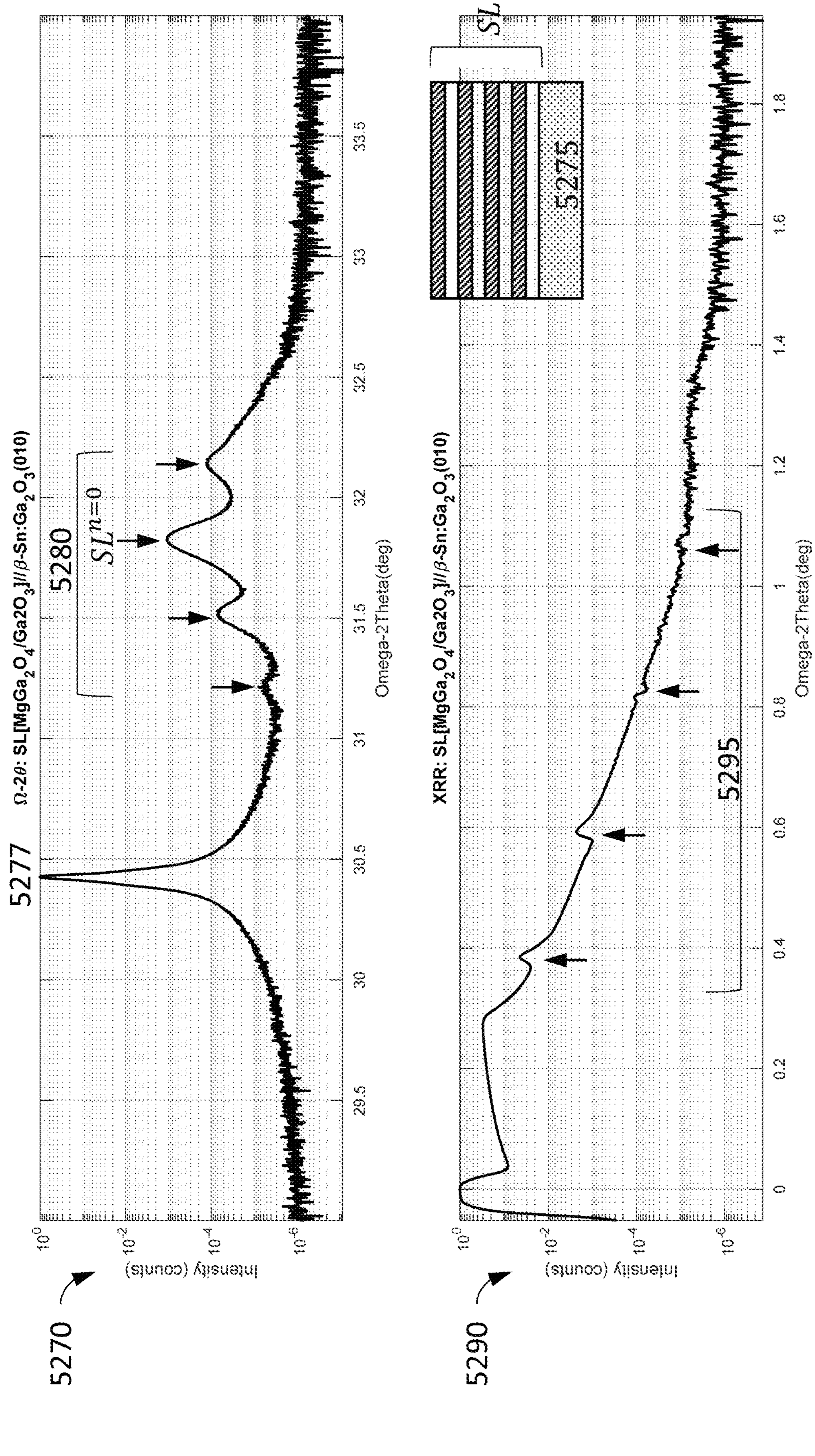
Figure 44K:
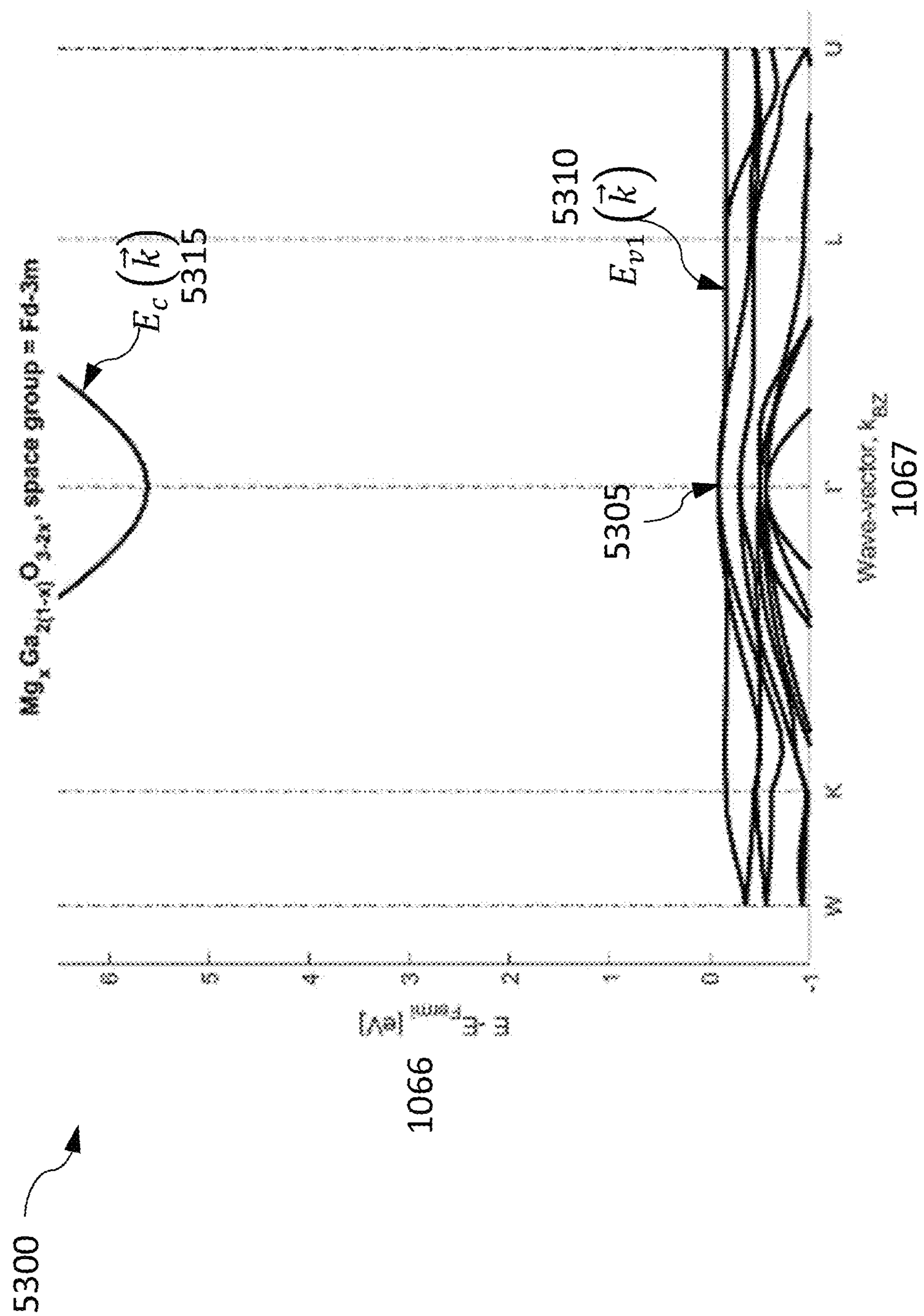
Figure 44L:
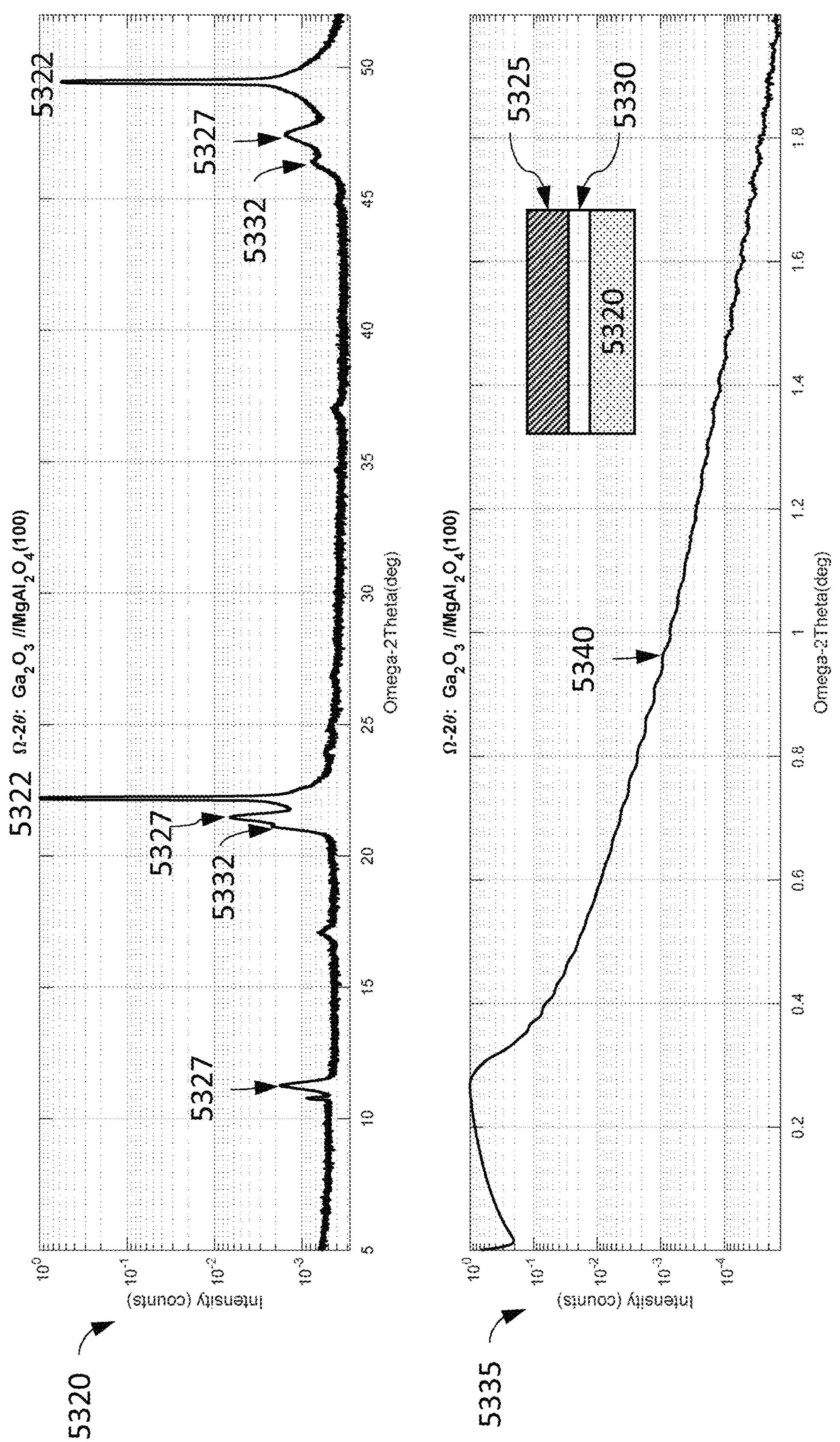
Figure 44M:
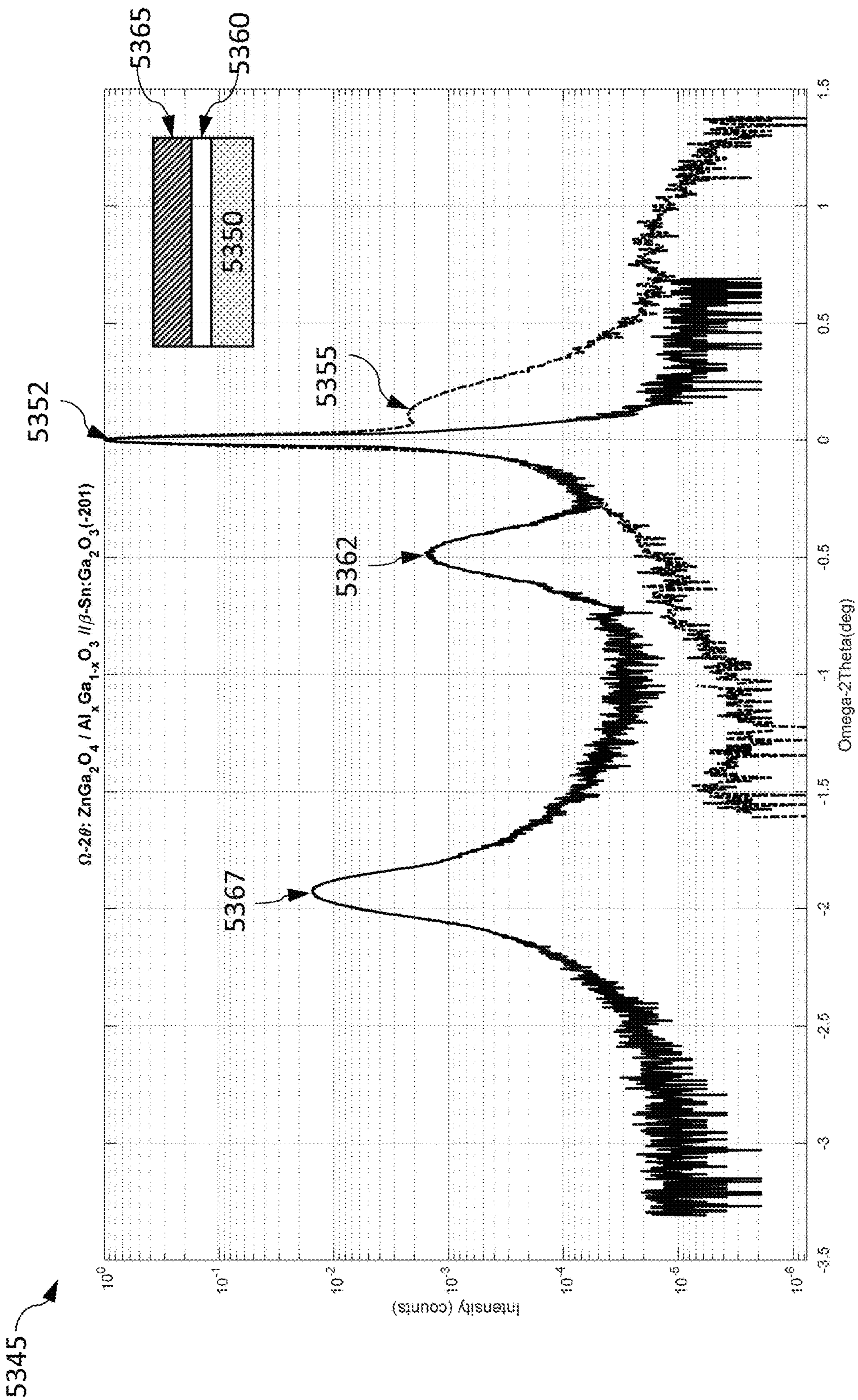
Figure 44N:
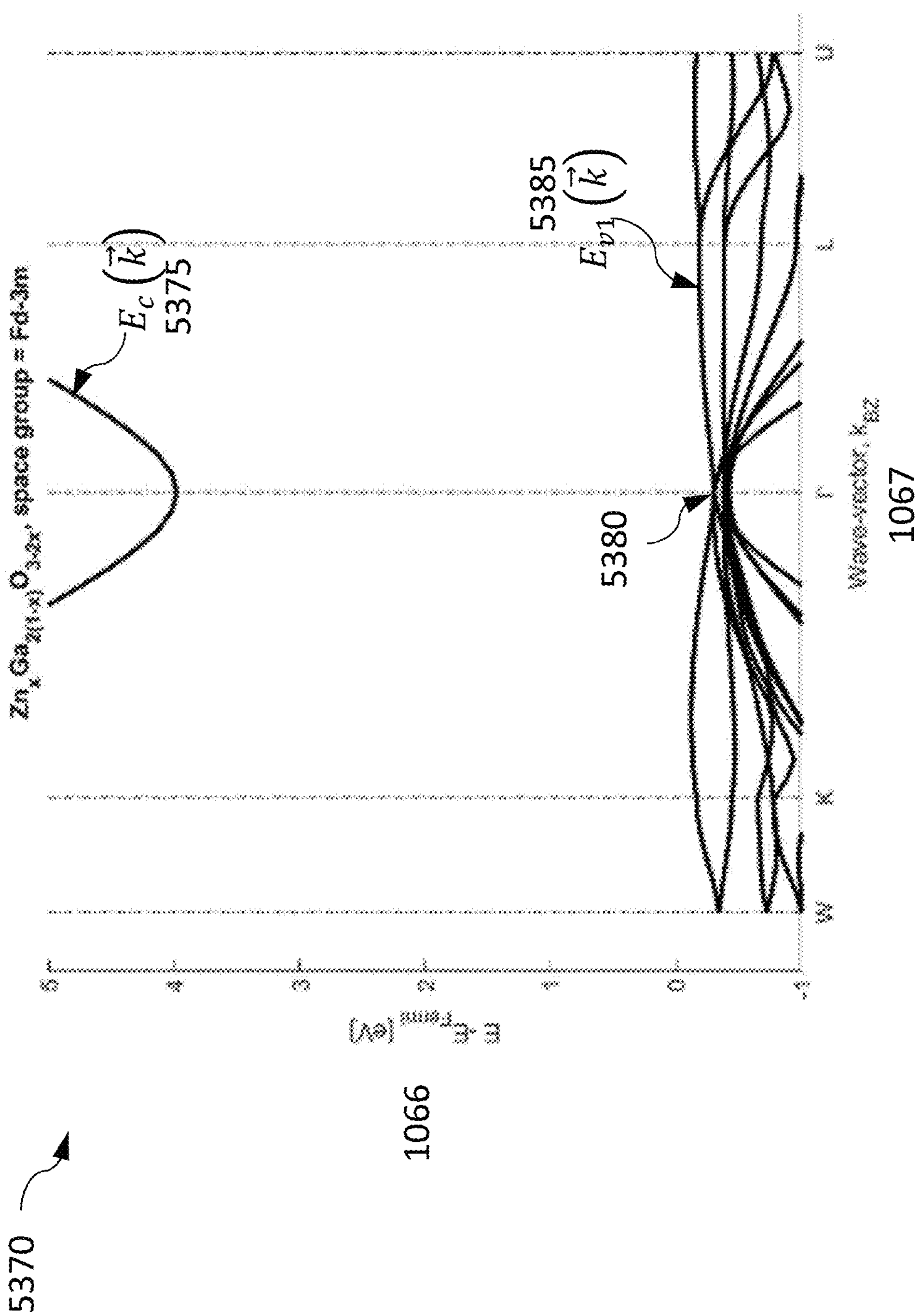
Figure 44O:
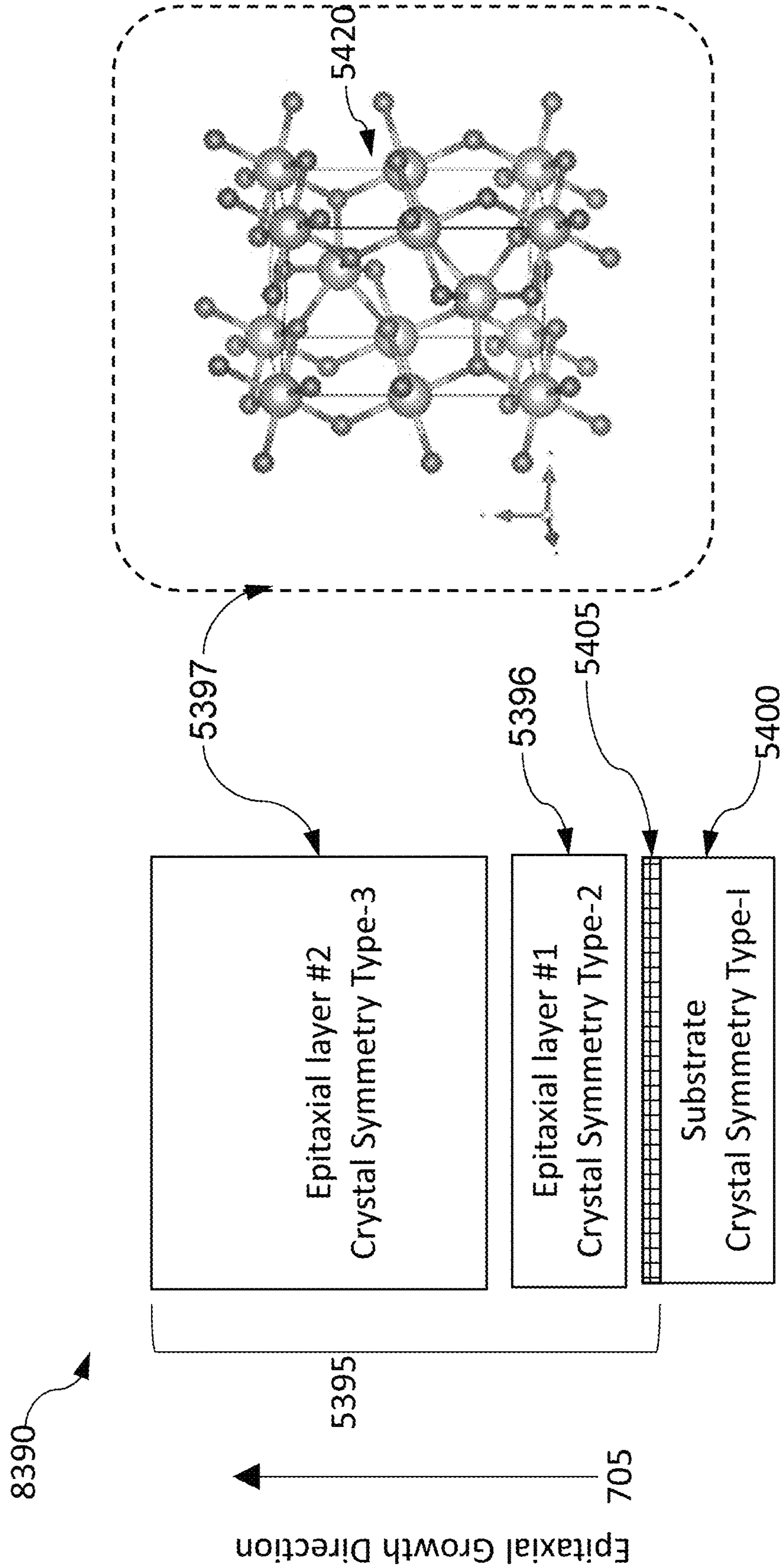
Figure 44P:
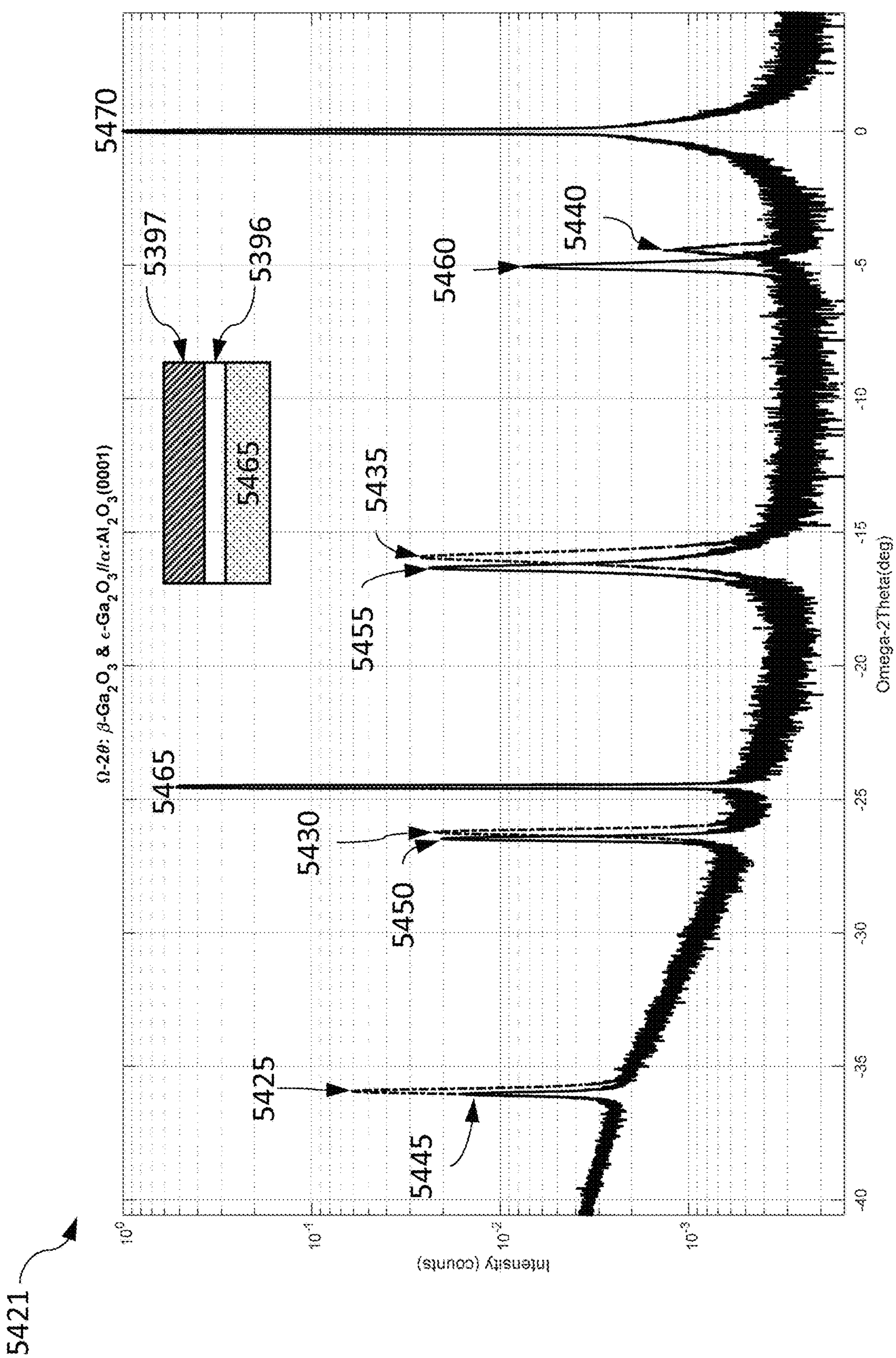
Figure 44Q:
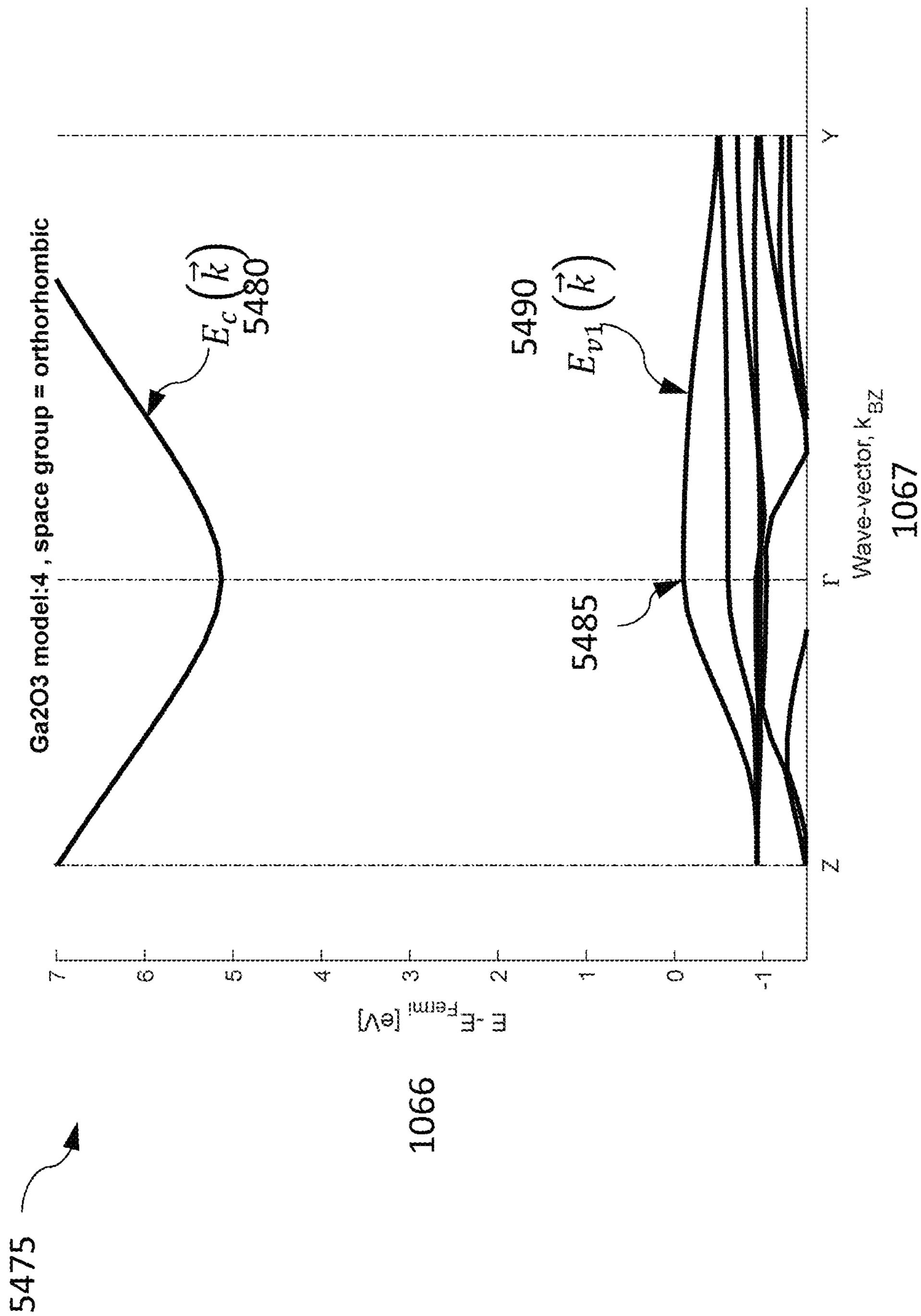
Figure 44R:
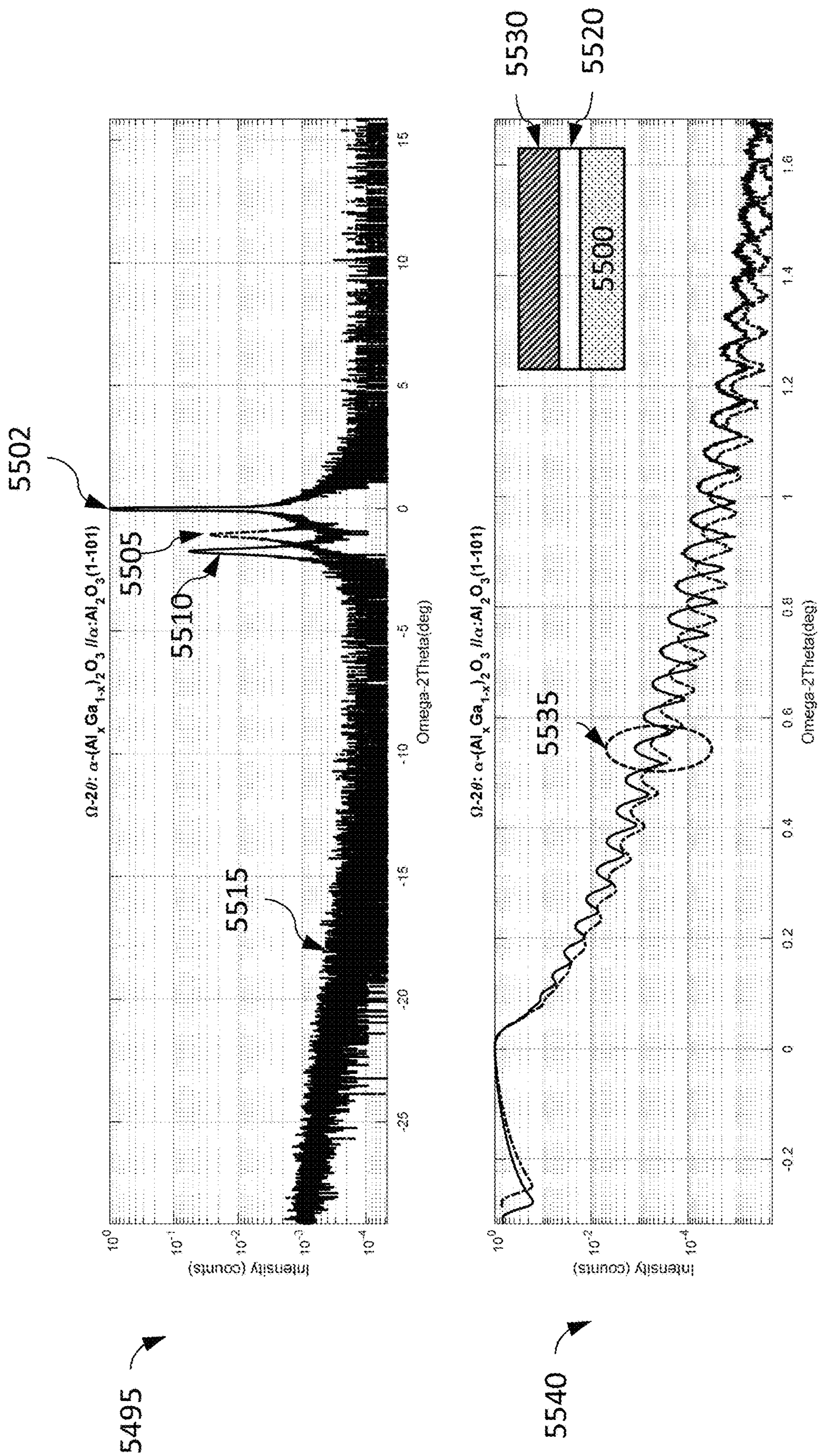
Figure 44S:
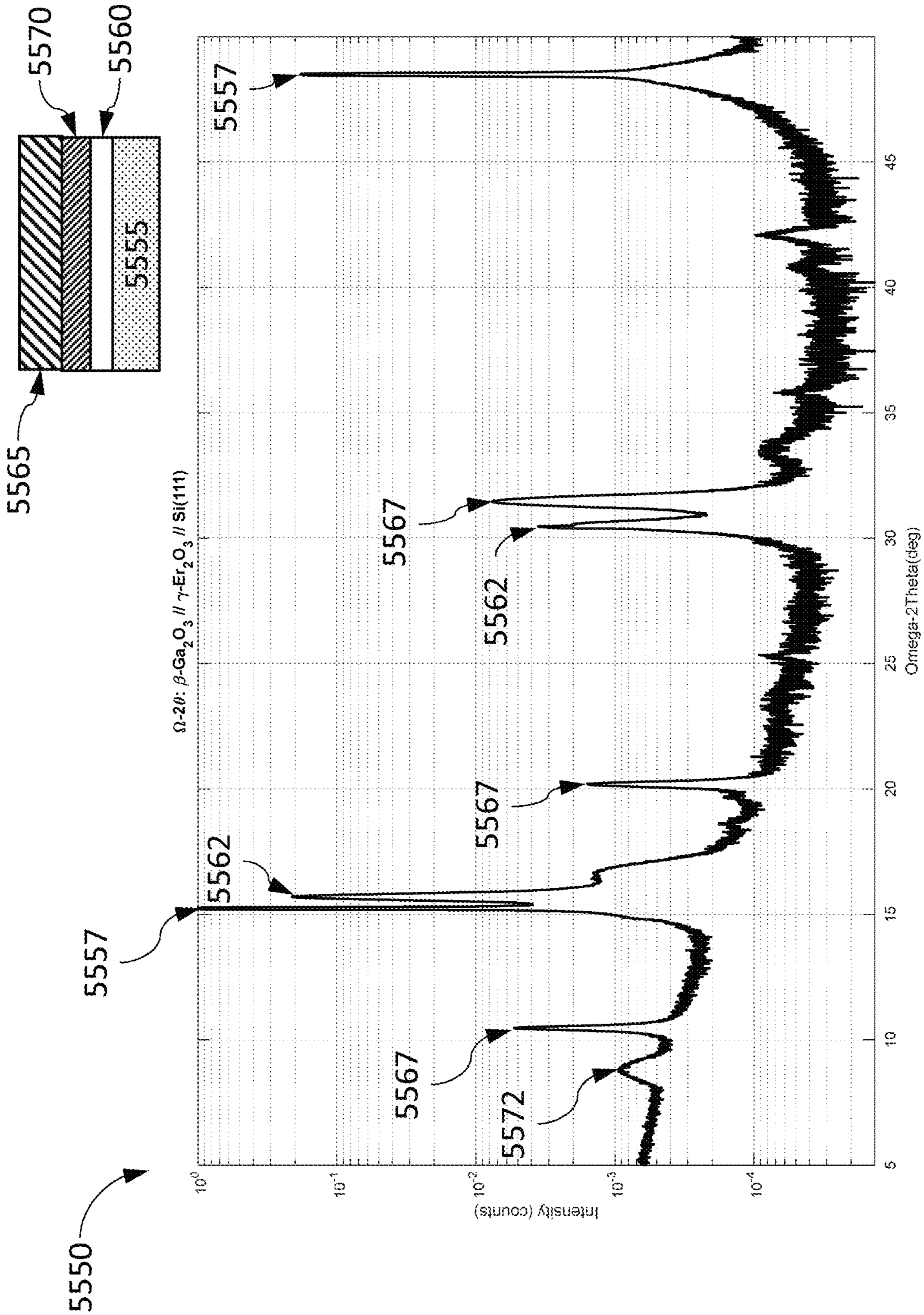
Figure 44T:
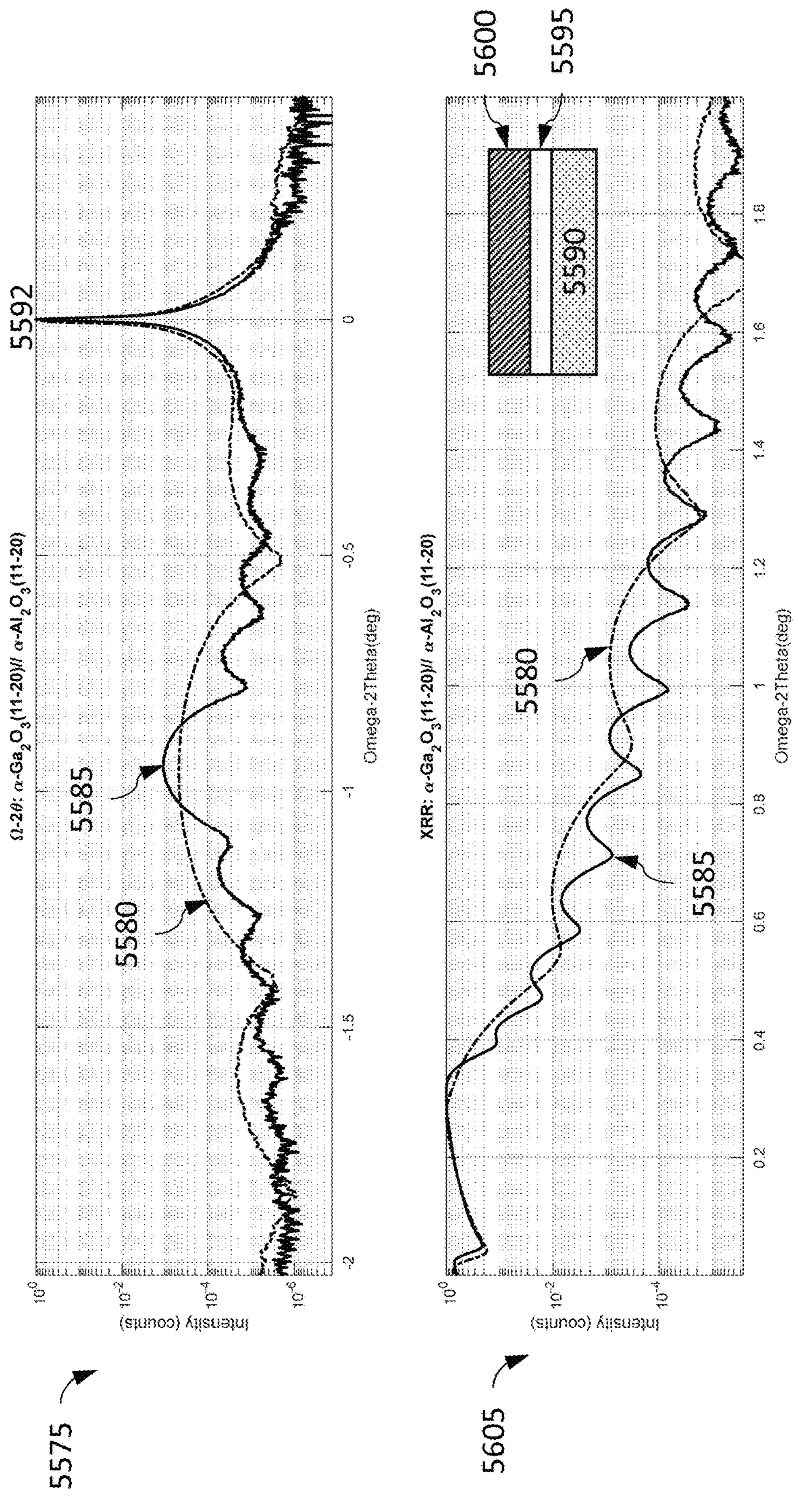
Figure 44U:
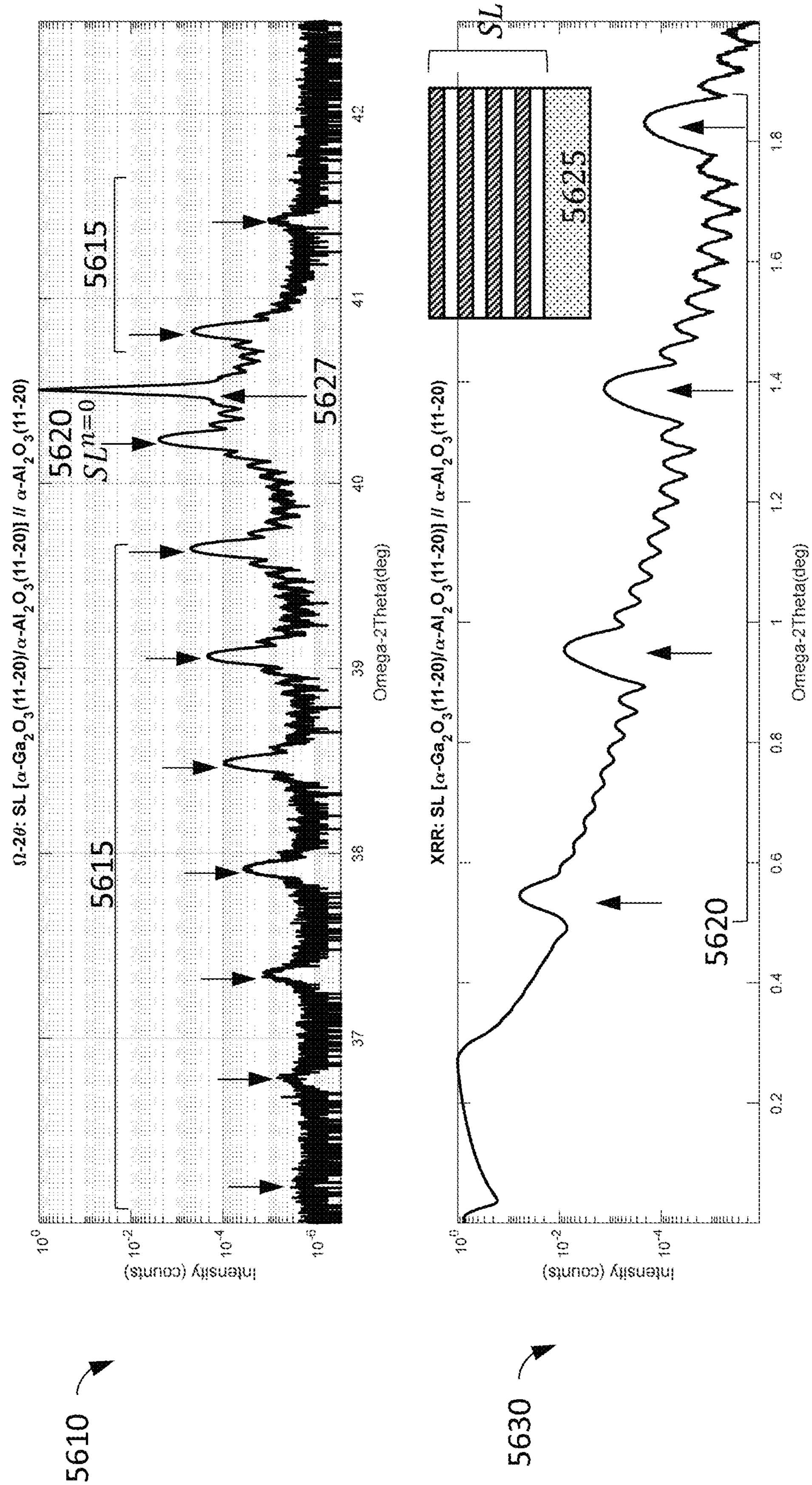
Figure 44V:
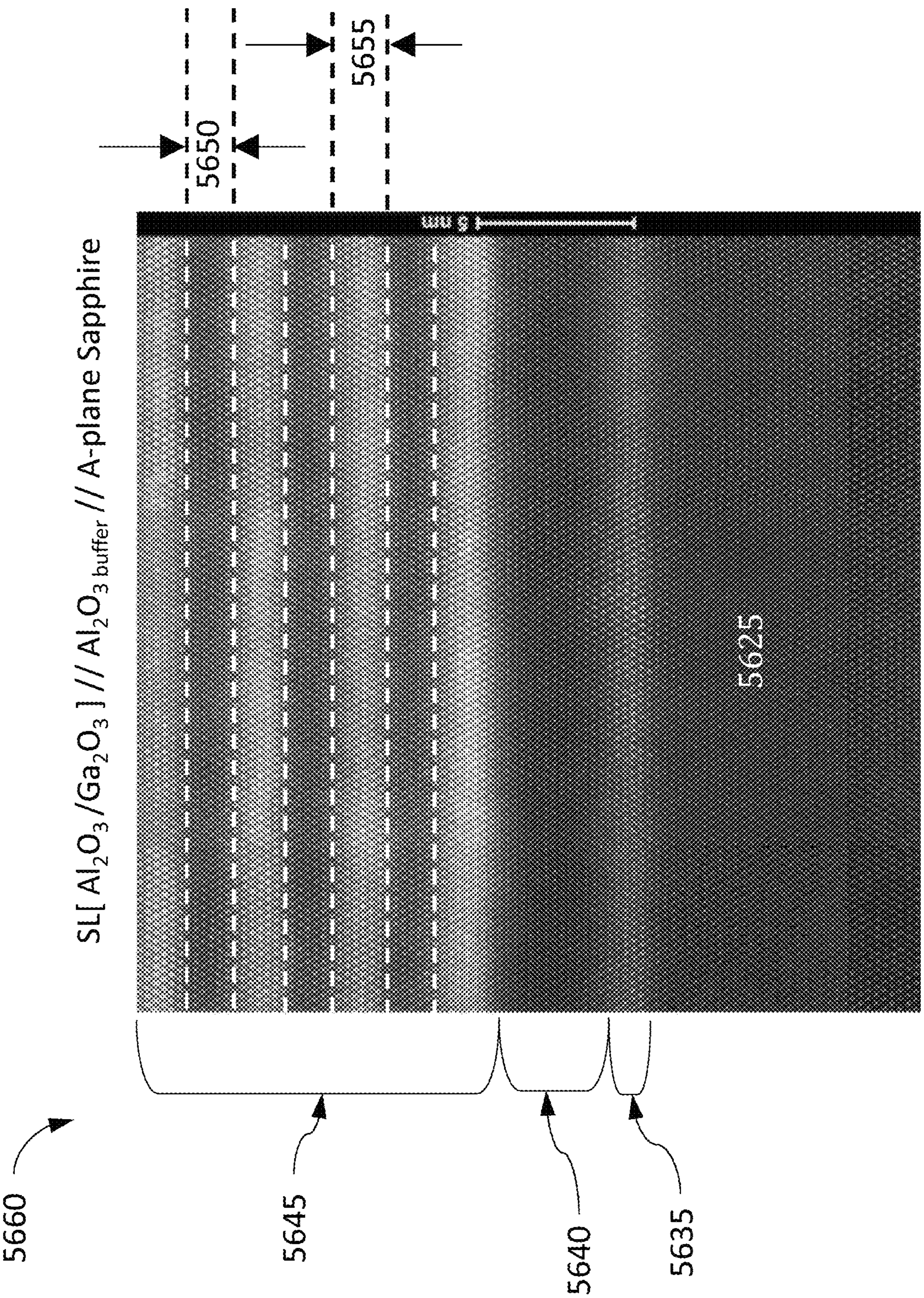
Figure 44W:
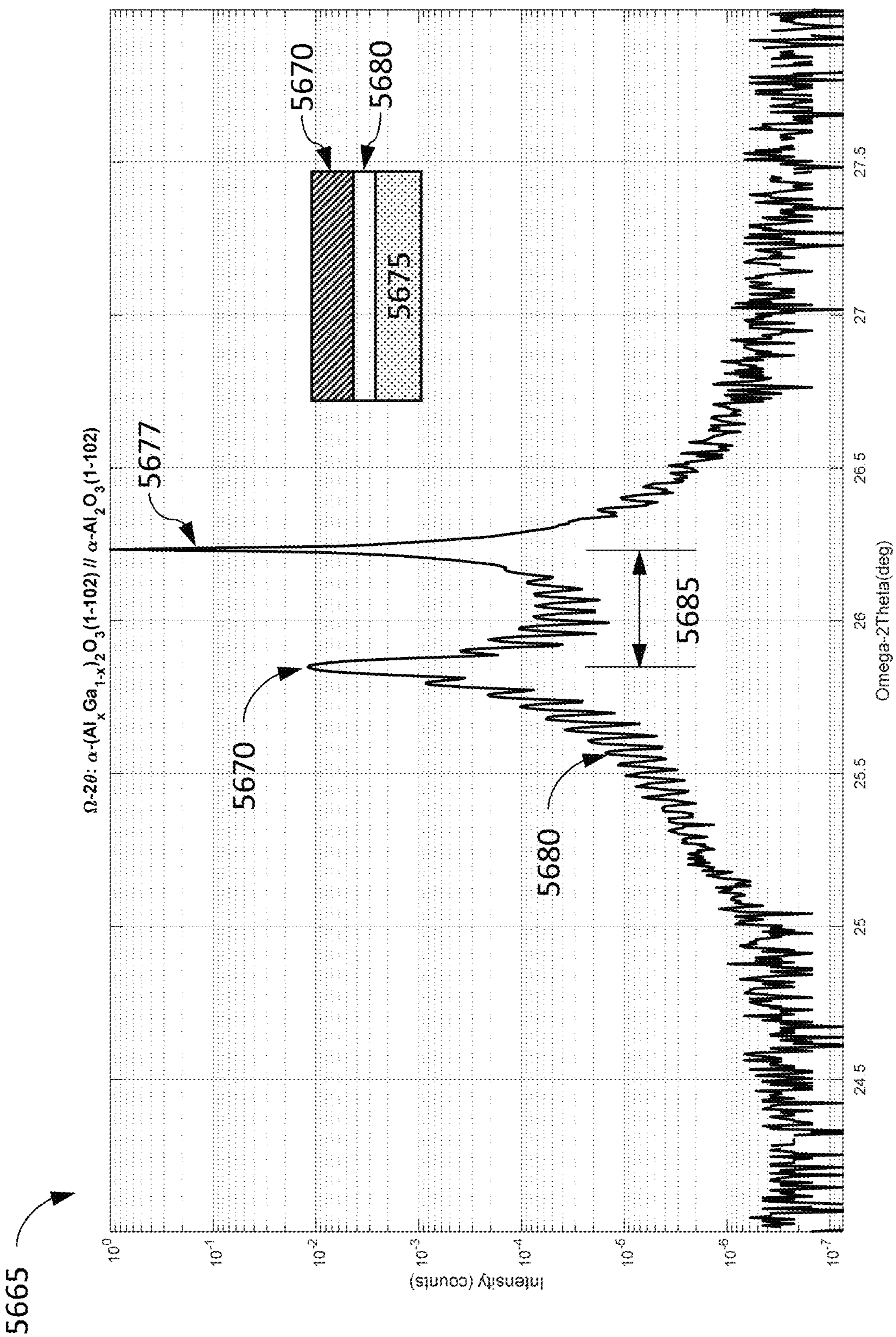
Figure 44X:
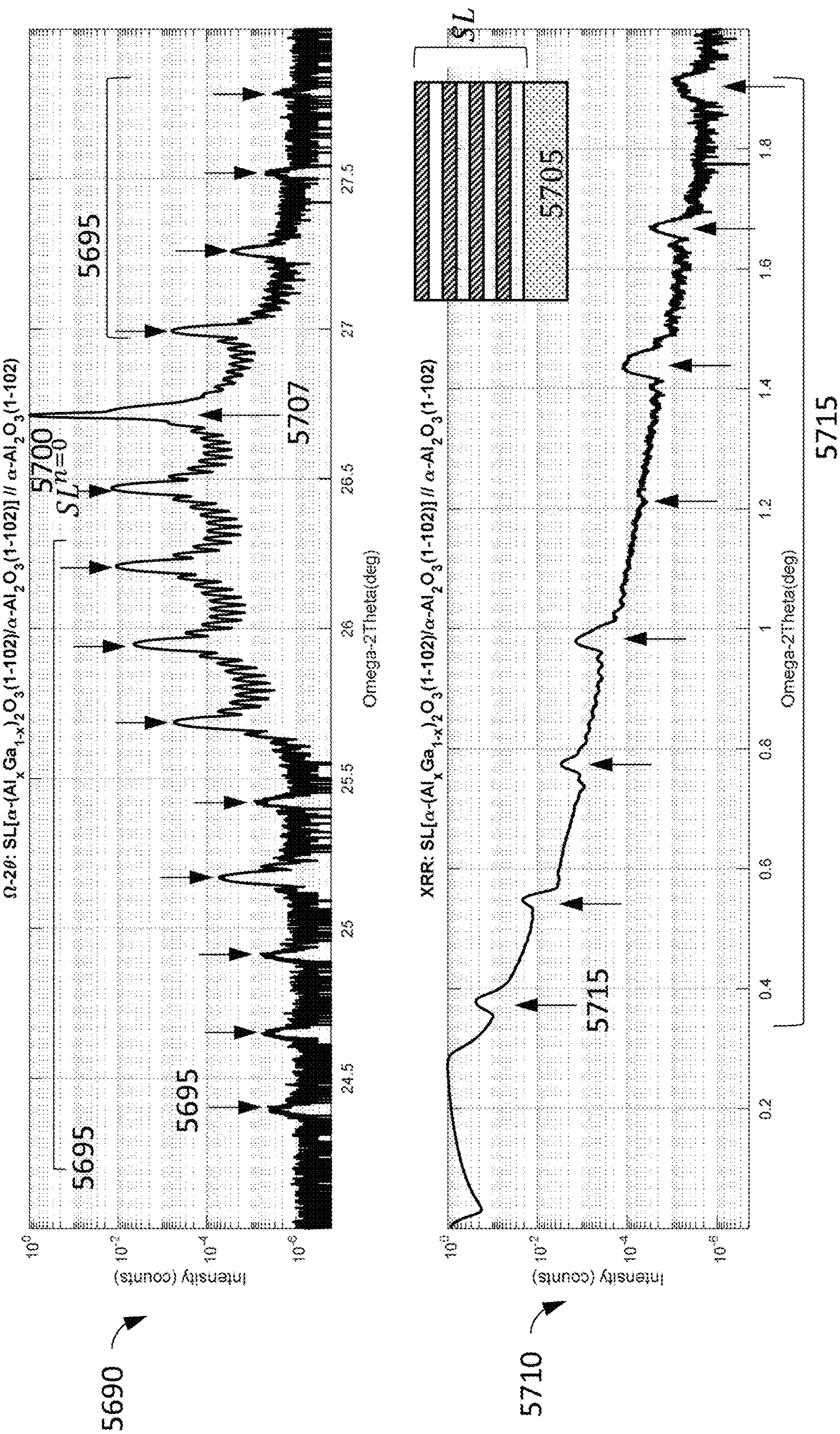
Figure 44Y:
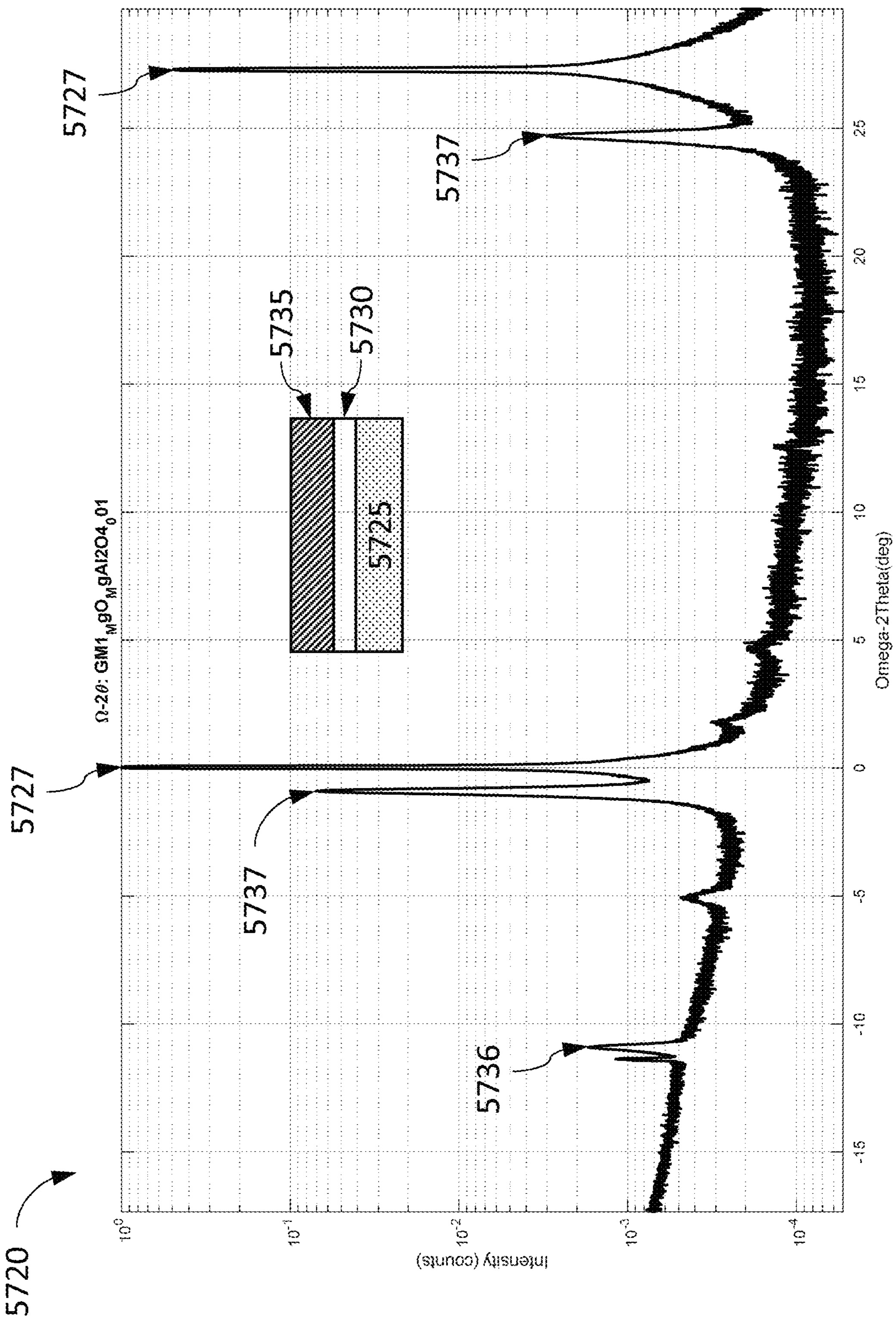
Figure 44Z:
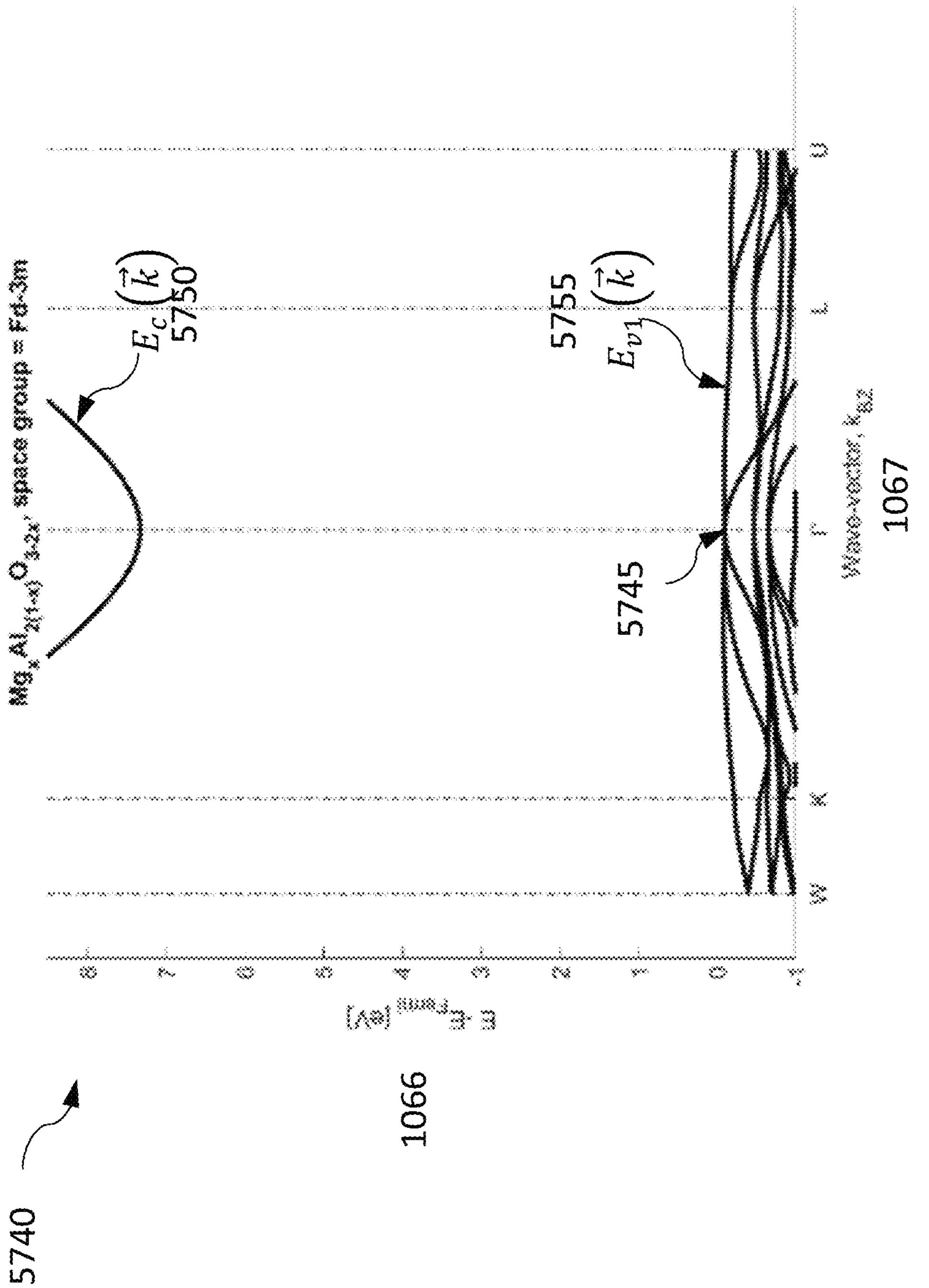

Examples of crystal symmetry structures formed using example compositions are now described and referred to in FIGS. 44A-44Z. The compositions shown are not intended to be limiting as discussed in the previous section using the crystal modifiers.

An example of crystal symmetry groups 5000 that are possible for the ternary composition of $(Al_xGa_{1-x})_2O_3$ is shown in FIG. 44A. The calculated equilibrium crystal formation probability 5005 is a measure of the probability the structure will form for a given crystal symmetry type. The space group nomenclature 5010 used in FIG. 44A is understood by those skilled in the art.

The non-equilibrium growth methods described herein can potentially select crystal symmetry types that are otherwise not accessible using equilibrium growth methods (such as CZ). The general crystal classes of cubic 5015, tetragonal, trigonal (rhombohedral/hexagonal) 5020, monoclinic 5025, and triclinic 5030 are shown in the inset of FIG. 44A.

For example, it was found in accordance with the present disclosure that monoclinic, trigonal and orthorhombic crystal symmetry types can be made energetically favorable by providing the kinematic growth conditions favoring exclusively a particular space group to be epitaxially formed. For example, as set out in TABLE I shown in FIG. 43A, the surface energy of a substrate can be selected by judicious preselection of the surface orientation presented for epitaxy.

FIG. 44B shows an example high-resolution x-ray Bragg diffraction (HRXRD) curves of a high quality, coherently strained, elastically deformed unit cell (i.e., the epilayer is termed pseudomorphic with respect to the underlying substrate) strained ternary $(Al_xGa_{1-x})_2O_3$ epilayer 5080 formed on a monoclinic $Ga_2O_3$(010)-oriented surface 5045. The graph shows intensity 5035 as a function of $\Omega-2\ \theta$ 5040. Two compositions $(Al_xGa_{1-x})_2O_3$ x=0.15 (5050) and x=0.25 (5065) are shown. The substrate is initially prepared by high temperature (>800° C.) desorption in an ultrahigh vacuum chamber (less than $5\times10^{-10}$ Torr) of surface impurities.

The surface is monitored in real-time by reflection high energy electron diffraction (RHEED) to assess atomic surface quality. Once a bright and streaky RHEED pattern indicative of an atomically flat surface of predetermined surface reconstruction of the discontinuous surface atom dangling bond is apparent, the activated Oxygen source comprising a radiofrequency inductively coupled plasma (RF-ICP) is ignited to produce a stream of substantially neutral atomic-Oxygen (O*) species and excited molecular neutral oxygen ($O_2$*) directed toward the heated surface of the substrate.

The RHEED is monitored to show an oxygen-terminated surface. The source of elemental and pure Ga and Al atoms are provided by effusion cells comprising inert ceramic crucibles radiatively heated by a filament and controlled by feedback sensing of a thermocouple advantageously positioned relative to the crucible to monitor the metal melt temperature within the crucible. High purity elemental metals are used, such as 6N to 7N or higher purity.

Each source beam flux is measured by a dedicated nude ion gauge that can be spatially positioned in the vicinity of the center of the substrate to sample the beam flux at the substrate surface. The beam flux is measured for each elemental specie so the relative flux ratio can be predetermined. During beam flux measurements a mechanical shutter is positioned between the substrate and the beam flux measurement. Mechanical shutters also intersect the atomic beams emanating from each crucible containing each elemental specie selected to comprise epitaxial film.

During deposition the substrate is rotated so as to accumulate a uniform amount of atomic beam intersecting the substrate surface for a given amount of deposition time. The substrate is heated radiatively from behind by an electrically heated filament, in preference for oxide growth is the advantageous use of a Silicon-Carbide (SiC) heater. A SiC heater has the unique advantage over refractory metal filament heaters in that a broad near-to-mid infrared emissivity is possible.

Not well known to workers in the field of epitaxial film growth, is that most metal oxides have the attribute of relatively large optical absorption for near to far infrared wavelengths. The deposition chamber is preferentially actively and continuously pumped to achieve and maintain vacuum in vicinity of 1e-6 to 1e-5 Torr during growth of epitaxial films. Operating in this vacuum range, the evaporating metals particles from the surface of each effusion crucible acquire a velocity that is essentially non-interacting and ballistic.

Advantageously positioning the effusion cell beam formed by the Clausing factor of the crucible aperture and UHV large mean free path, the collisionless ballistic transport of the effusion specie toward the substrate surface is ensured. The atomic beam flux from effusion type heated sources is determined by the Arrhenius behavior of the particular elemental specie placed in the crucible. In some embodiments, Al and Ga fluxes in the range of $1\times10^{-6}$ Torr are measured at the substrate surface. The oxygen plasma is controlled by the RF power coupled to the plasma and the flow rate of the feedstock gas.

RF plasma discharges typically operate from 10 milliTorr to 1 Torr. These RF plasma pressures are not compatible with atomic layer deposition process reported herein. To achieve activated oxygen beam fluxes in the range of $1\times10^{-7}$ Torr to $1\times10^{-5}$ Torr, a sealed fused quartz bulb with laser drilled apertures of the order of 100 microns in diameter are disposed across a circular end-face of the sealed cylindrical bulb. The said bulb is coupled to a helical wound copper tube and water-cooled RF antenna driven by an impedance matching network and a high power 100 W-1 kW RF oscillator operating at, for example, 2 MHz to 13.6 MHz or even 20 MHz.

The plasma is monitored using optical emission from the plasma discharge which provides accurate telemetry of actual species generated within the bulb. The size and number of the apertures on the bulb end face are the interface of the plasma to the UHV chamber and can be predetermined to achieve compatible beam fluxes so as to maintain ballistic transport conditions for long mean free path in excess of the source to substrate distance. Other in-situ diagnostics enabling accurate control and repeatability of film composition and uniformity include the use of ultraviolet polarized optical reflectometry and ellipsometry as well as a residual gas analyzer to monitor the desorption of species from the substrate surface.

Other forms of activated oxygen include the use of oxidizers such as Ozone ($O_3$) and nitrous oxide ($N_2O$). While all forms work relatively well, namely RF-plasma, $O_3$ and $N_2O$, RF plasma may be used in certain embodiments owing to the simplicity of point of use activation. RF-plasma, however, does potentially create very energetic charged ion species which can affect the material background conductivity type. This is mitigated by removing the apertures directly in the vicinity of the center of the plasma end plate coupled to the UHV chamber. The RF induced oscillating magnetic field at the center of the solenoid of the cylindrical discharge tube will be maximal along the center axis. Therefore, removing the apertures providing line of sight from the plasma interior toward the growth surface removes the charged ions specie ballistically delivered to the epilayer.

Having briefly described the growth method, refer again to FIG. 44B. The monoclinic $Ga_2O_3$(010)-oriented substrate 5045 is cleaned in-situ via high temperature in UHV conditions, such as at ~800° C. for 30 mins. The cleaned surface is then terminated with activated oxygen adatoms forming a surface reconstruction comprising oxygen atoms.

An optional homoepitaxial $Ga_2O_3$ buffer layer 5075 is deposited and monitored for crystallographic surface improvement by in-situ RHEED. In general, $Ga_2O_3$ growth conditions using elemental Ga and activated oxygen requires a flux ratio of $\phi(Ga):\phi(O^*)<1$, that is atomic oxygen rich conditions.

For flux ratios of $\Phi(Ga):\Phi(O^*)>1$ an excess Ga atoms on the growth surface is capable of attaching to surface bonded oxygen that can potentially form a volatile $Ga_2O_{(g)}$ suboxide species—which then desorbs from the surface and can remove material from the surface and even etch the surface of $Ga_2O_3$. It was found in accordance with the present disclosure that for high Al content $AlGaO_3$ this etching process is reduced if not eliminated for Al %>50%. The etching process can be used to clean a virgin $Ga_2O_3$ substrate for example to aid in the removal of chemical mechanical polish (CMP) damage.

To initiate growth of $AlGaO_3$ the activated oxygen source is optionally initially exposed to the surface followed by opening both shutters for each of the Ga and Al effusion cells. It was found experimentally in accordance with the present disclosure that the sticking coefficient for Al is near unity whereas the sticking coefficient on the growth surface is kinetically dependent on the Arrhenius behavior of the desorbing Ga adatoms which depend on the growth temperature.

The relative x=Al % of the epitaxial $(Al_xGa_{1-x})_2O_3$ film is related to $x=\Phi(Al)//[\Phi(Ga)+\Phi)(Al)]$. Clear high quality RHEED surface reconstruction streaks are evident during deposition of $(Al_xGa_{1-x})_2O_3$. The thickness can be monitored by in-situ ultraviolet laser reflectometry and the pseudomorphic strain state monitored by RHEED. As the free-standing in-plane lattice constant of monoclinic crystal symmetry $(Al_xGa_{1-x})_2O_3$ is smaller than the underlying $Ga_2O_3$ lattice, the $(Al_xGa_{1-x})_2O_3$ is grown under tensile strain during elastic deformation.

The thickness 5085 of epilayer 5080 at which the elastic energy can be matched or reduced by inclusion of misfit dislocation within the growth plane is called the critical layer thickness (CLT), beyond this point the film can begin to grow as a partially or fully relaxed bulk-like film. The curves 5050 and 5065 are for the case of coherently strained $(Al_xGa_{1-x})_2O_3$ films with thickness below the CLT. For the case of x=0.15 the CLT is >400 nm and for x=0.25 CLT ~100 nm. The thickness oscillations 5070 are also known as Pendellosung interference fringes and are indicative of highly coherent and atomically flat epitaxial film.

In experiments performed in relation to the present disclosure, growth of pure monoclinic $Al_2O_3$ epitaxial films directly on monoclinic $Ga_2O_3(010)$ surface achieved CLT <1 nm. It was further found experimentally that Al %>50% achieved low growth rate owing to the unique monoclinic bonding configuration of cations partitioned approximately as 50% tetrahedral bonding sites and 50% octahedral bonding sites. It was found that Al adatoms prefer to incorporate at octahedral bonding sites during crystal growth and have bonding affinity for tetrahedral sites.

Superlattices (SLs) are created and directly applicable to UVLED operation utilizing the quantum size effect tuning mechanism for quantization of allowed energy levels within a narrower bandgap material sandwiched between two potential energy barriers. Furthermore, SLs are example vehicles for creating pseudo ternary alloys as discussed herein, further enabling strain management of the layers.

For example, monoclinic $(Al_xGa_{1-x})_2O_3$ternary alloy experiences an asymmetric in-plane biaxial tensile strain when epitaxial deposited upon monoclinic $Ga_2O_3$. This tensile strain can be managed by ensuring the thickness of ternary is kept below the CLT within each layer comprising the SL. Furthermore, the strain can be balanced by tuning the thickness of both $Ga_2O_3$ and ternary layer to manage the built-in strain energy of the bilayer pair.

Yet a further embodiment of the present disclosure is the creation of a ternary alloy as bulk-like or SL grown sufficiently thick so as to exceed the CLT and form an essentially free-standing material that is strain-free. This virtually strain-free relaxed ternary layer possesses an effective in-plane lattice constant $a_{SL}$ which is parameterized by the effective Al % composition. If then a first relaxed ternary layer is formed, followed by yet another second SL deposited directly upon the relaxed layer then the bilayer pair forming the second SL can be tuned such that the layers comprising the bilayer are in equal and opposite strain states of tensile and compressive strain with respect to the first in-plane lattice constant.

FIG. 44C show an example SL 5115 formed directly on a $Ga_2O_3$ (010)-oriented substrate 5100.

The bilayer pairs comprising the SL 5115 are both monoclinic crystal symmetry $Ga_2O_3$ and ternary $(Al_xGa_{1-x})_2O_3$ (x=0.15) with SL period $\Delta_{SL}$=18 nm. The HRXRD 5090 shows the symmetric Bragg diffraction, and the GIXR 5105 shows the grazing incidence reflectivity of the SL. Ten periods are shown with extremely high crystal quality indicative of the $(Al_xGa_{1-x})_2O_3$ having thickness <CLT.

The plurality of narrow SL diffraction peaks 5095 and 5110 is indicative of coherently strained films registered with in-plane lattice constant matching the monoclinic $Ga_2O_3$ (010)-oriented bulk substrate 5100. The monoclinic crystal structure (refer to FIG. 37) having growth surface exposed of (010) exhibits a complex array of Ga and O atoms. In some embodiments, the starting substrate surface is prepared by O-terminations as described previously. The average Al % alloy content of the SL represents a pseudo-bulk-like ternary alloy which can be thought of as an order atomic plane ternary alloy.

The SL comprising bilayers of $[(Al_{xB}Ga_{1-xB})_2O_3/Ga_2O_3]$ has an equivalent Al % defined as:

$$x_{Al}^{SL} = \frac{L_B \cdot x_B}{\Delta_{SL}},$$

where $L_B$ is the thickness of the wider bandgap $(Al_{xB}Ga_{1-xB})_2O_3$ layer. This can be directly determined by reference to the angular separation and position of the zeroth-order diffraction peak $SL^{n=0}$ of the SL with respect to the substrate peak 5102. Reciprocal lattice maps show that the in-plane lattice constant is pseudomorphic with the underlying substrate and provides excellent application for the UVLED.

The tensile strain as shown in FIGS. 23A-23C can be used advantageously towards the formation of the optical emission region.

FIG. 44D shows yet further flexibility toward depositing ternary monoclinic 5130 alloy $(Al_xGa_{1-x})_2O_3$ directly upon yet another crystal orientation of monoclinic $Ga_2O_3(001)$ substrate 5120.

Again, the best results are obtained by careful attention to high quality CMP surface preparation of the cleaved substrate surface. The growth recipe in some embodiments utilizes in-situ activated oxygen polish at high temperatures (e.g., 700-800° C.) using a radiatively heated substrate via a high power and oxygen resistant radiatively coupled heater. The SiC heater possesses the unique property of having high near-to-far infrared emissivity. The SiC heater emissivity closely matches the intrinsic $Ga_2O_3$ absorption features and thus couples well to the radiative blackbody emission spectrum presented by the SiC heater. Region 5125 represents the O-termination process and the homoepitaxial growth of a high quality $Ga_2O_3$ buffer layer. The SL is then deposited showing two separate growths with different ternary alloy compositions.

Shown in FIG. 44D are coherently strained epilayers of $(Al_xGa_{1-x})_2O_3$ having thickness <CLT and achieving x~15% (5135) and x~30% (5140), relative to the (002) substrate peak 5122. Again, the high quality films are indicated by the presence of thickness interference fringes.

Discovering further that SL structures are also possible on the (001) oriented monoclinic $Ga_2O_3$ substrate 5155, the results are shown in FIG. 44E.

Clearly, HRXRD 5145 and GIXR 5158 demonstrate a high quality coherently deposited SL. Peak 5156 is the substrate peak. The SL diffraction peaks 5150 and 5160 enable direct measurement of the SL period, and the $SL^{n=0}$ peak enables the effective Al % of SL to be determined. For this case a ten period $SL[(Al_{0.18}Ga_{0.92})_2O_3/Ga_2O_3]$ having period ΔSL=8.6 nm is shown.

Demonstrating an example application of the versatility of the metal oxide film deposition method disclosed herein, refer to FIG. 44F. Two dissimilar crystal symmetry type structures are epitaxially formed along a growth direction as defined by FIG. 18. A substrate 5170 (peak 5172) comprising monoclinic $Ga_2O_3$(001)-oriented surface is presented for homoepitaxy of a monoclinic $Ga_2O_3$ 5175. Next a cubic crystal symmetry NiO epilayer 5180 is deposited. The HRXRD 5165 and GIXR 5190 show the topmost NiO film peak 5185 of thickness 50 nm has excellent atomic flatness and thickness fringes 5195.

In one example, mixing-and-matching crystal symmetry types can be favorable to a given material composition that is advantageous for a given function comprising the UVLED (refer FIG. 1) thereby increasing the flexibility for optimizing the UVLED design. $Ni_xO$ (0.5<x≤1 representing metal vacancy structures are possible), $Li_xNi_yO_n$, $Mg_xNi_{1-x}O$ and $Li_xMg_yNi_zO_n$ are compositions that may be utilized favorably for integration with $AlGaO_3$ materials comprising the UVLED.

As NiO and MgO share very close cubic crystal symmetry and lattice constants, they are advantageous for bandgap tuning application from about 3.8 to 7.8 eV. The d-states of Ni influence the optical and conductivity type of the MgNiO alloy and can be tailored for application to UVLED type devices. A similar behavior is found for the selective incorporation of Ir into corundum crystal symmetry ternary alloy $(Ir_xGa_{1-x})_2O_3$ which exhibits advantageous energy position within the E-k dispersion due to the Iridium d-state orbitals for creation of p-type conductivity.

Yet a further example of the metal oxide structures is shown in FIG. 44G. A cubic crystal symmetry MgO (100)-oriented surface of a substrate 5205 (corresponding to peak 5206) is presented for direct epitaxy of $Ga_2O_3$. It was found in accordance with the present disclosure that the surface of MgO can be selectively modified to create a cubic crystal symmetry form of $Ga_2O_3$ epilayer 5210 (peaks 5212 for gamma $Ga_2O_3$) that acts as an intermediate transition layer for subsequent epitaxy of monoclinic $Ga_2O_3(100)$ 5215 (peaks 5214 and 5217). Such a structure is represented by the growth process shown in FIG. 20A.

First a prepared clean MgO (100) surface is presented for MgO homoepitaxy. The magnesium source is a valved effusion source comprising 7N purity Mg with a beam flux of $\sim 1\times 10^{-10}$ Torr in the presence of active-oxygen supplied with ϕ (Mg): ϕ (O*)<1 and substrate surface growth temperature from 500-650° C.

The RHEED is monitored to show improved and high quality surface reconstruction of MgO surface of the epitaxial film. After about 10-50 nm of MgO homoepitaxy the Mg source is closed and the substrate elevated to a growth temperature of about 700° C. while under a protective flux of O*. Then the Ga source is exposed to the growth surface and the RHEED is observed to instantaneous change surface reconstruction toward a cubic crystal symmetry $Ga_2O_3$ epilayer 5210. After about 10-30 nm of cubic $Ga_2O_3$ (known also as the gamma-phase) it is observed via direct observation of RHEED the characteristic monoclinic surface reconstruction of $Ga_2O_3(100)$ appears and remains as the most stable crystal structure. A $Ga_2O_3(100)$-oriented film of 100 nm is deposited, with HRXRD 5200 and GIXR 5220 showing peak 5214 for beta-$Ga_2O_3(200)$ and peak 5217 for beta-$Ga_2O_3(400)$. Such fortuitous crystal symmetry alignments are rare but highly advantageous for the application toward UVLED.

Yet another example of a complex ternary metal oxide structure applied for UVLED is disclosed in FIG. 44H. The HRXRD 5225 and GIXR 5245 show experimental realization of a superlattice comprising a lanthanide-aluminum-oxide ternary integrated with corundum $Al_2O_3$ epilayers.

The SL comprises corundum crystal symmetry $(Al_xEr_{1-x})_2O_3$ ternary composition with the lanthanide selected from Erbium grown pseudomorphically with corundum $Al_2O_3$. Erbium is presented to the non-equilibrium growth via a sublimating 5N purity Erbium source using an effusion cell. The flux ratio of ϕ(Er):ϕ(Al) ~0.15 was used with the oxygen-rich condition of [ϕ(Er)+ϕ(Al)]:ϕ(O*)]<1 at a growth temperature of about 500° C.

Of particular note is the ability for Er to crack molecular oxygen at the epilayer surface and therefore the total oxygen overpressure is larger than the atomic oxygen flux. An A-plane Sapphire (11-20) substrate 5235 is prepared and heated to about 800° C. and exposed to an activated Oxygen polish. It was found in this example that the activated oxygen polish of the bare substrate surface dramatically improves the subsequent epilayer quality. Next a homoepitaxial corundum $Al_2O_3$ layer is formed and monitored by RHEED showing excellent crystal quality and atomically flat layer-by-layer deposition. Then a ten period SL is deposited and shown as the satellite peaks 5230 and 5240 in the HRXRD 5225 and GIXR 5245 scans. Clearly evident are the Pendellosung fringes indicating excellent coherent growth.

The effective alloy composition of the $(Er_{xSL}Al_{1-xSL})_2O_3$ of the SL can be deduced by position of the zeroth order SL peak $SL^{n=0}$ relative to the (110) substrate peak 5235. It is found xS1 ~0.15 is possible and that the $(Al_xEr_{1-x})_2O_3$ layer forming the SL period has corundum crystal symmetry. This discovery is particularly important for application to UVLED wherein FIG. 44I discloses the E-K band structure 5250 of corundum $(Al_xEr_{1-x})_2O_3$ is indeed a direct bandgap material having $E_G$>6 eV. The electron energy 1066 is plotted as a function of the crystal wave vectors 1067. The conduction band minimum 5265 and valence band 5260 is maximum at the Brillouin-zone center 5255 (k=0).

Next in FIG. 44J is demonstrated yet a further ternary magnesium-gallium-oxide cubic crystal symmetry $Mg_xGa_{2(1-x)}O_{3-2x}$ material composition integrable with $Ga_2O_3$. Shown is the HRXRD 5270 and GIXR 5290 experimental realization of a superlattice comprising a 10 period $SL[Mg_xGa_{2(1-x)}O_{3-2x}/Ga_2O_3]$ deposited upon a monoclinic $Ga_2O_3(010)$ oriented substrate 5275 (corresponding to peak 5277). The SL ternary alloy composition is selected from x=0.5 with thickness of 8 nm and $Ga_2O_3$ of 8 nm. The SL period is $\Delta_{SL}$=16 nm with average Mg % of $$x_{Mg}^{SL} = \frac{x \cdot L_{MgGaO}}{\Delta_{SL}}.$$

he diffraction satellite peaks 5280 and 5295 report slight diffusion of Mg across the SL interfaces which can be alleviated by growing at a lower temperature. The band structure of $Mg_xGa_{2(1-x)}O_{3-2x}$ x=0.5 is particularly useful for application toward UVLED. FIG. 44K reports the calculated energy band structure 5300 is direct in character (refer to band extrema 5315 and 5310 and k=0 5305) with bandgap of $E_G$~5.5 eV.

The ability for the monoclinic $Ga_2O_3$ crystal symmetry to integrate with cubic $MgAl_2O_4$ crystal symmetry substrates is presented in FIG. 44L. A high quality single crystal substrate 5320 (peak 5322) comprising $MgAl_2O_4$ spinel is cleaved and polished to expose the (100)-oriented crystal surface. The substrate is prepared and polished using active oxygen at elevated temperature (~700° C.) under UHV conditions (<le-9 Torr). Keeping the substrate at growth temperature of 700° C. the $MgGa_2O_4$ film 5330 is initiated showing excellent registration to the substrate. After about 10-20 nm the Mg is shuttered and only $Ga_2O_3$ is deposited as the topmost film 5325. The GIXR film flatness is excellent showing thickness fringes 5340 indicating a >150 nm film. The HRXRD shows transition material $MgGa_2O_4$ corresponding to peaks 5332 and $Ga_2O_3$(100)-oriented epilayer of peaks 5327 indicative of monoclinic crystal symmetry. In some embodiments, hexagonal $Ga_2O_3$ can also be deposited epitaxially.

The monoclinic $Ga_2O_3(-201)$-oriented crystal plane features unique attributes of a hexagonal oxygen surface matrix with in-plane lattice spacing acceptable for registering wurtzite-type hexagonal crystal symmetry materials. For example, as shown in diagram 5345 of FIG. 44M wurtzite ZnO 5360 (peak 5367) is deposited on an oxygen terminated $Ga_2O_3(-201)$-oriented surface of a substrate $Zn_xGa_{2(1-x)}O_{3-2x}$ 5350 (peak 5352). The Zn is supplied by sublimation of 7N purity Zn contained within an effusion cell. The growth temperature is selected from 450-650° C. for ZnO and exhibits extremely bright and sharp narrow RHEED streaks indicative high crystal quality. Peak 5362 represents $(Al_xGa_{1-x})_2O_3$. Peak 5355 represents a transition layer.

Next a ternary zinc-gallium-oxide epilayer $Zn_xGa_{2(1-x)}O_{3-2x}$ 5365 is deposited by co-deposition of Ga and Zn and active oxygen at 500° C. The flux ratio of $[\phi(Zn)+\phi(Ga)]:\phi(O^*)<1$ and the metal beam flux ratio $\phi(Zn):\phi(Ga)$ is chosen to achieve x~0.5. Zn desorbs at much lower surface temperatures than Ga and is controlled in part by absorption limited process depending on surface temperature dictated by the Arrhenius behavior of Zn adatoms.

Zn is a group metal and substitutes advantageously on available Ga-sites of the host crystal. In some embodiments, Zn can be used to alter the conductivity type of the host for dilute x<0.1 concentrations of incorporated Zn. The peak 5355 labelled $Zn_xGa_{2(1-x)}O_{3-2x}$ shows the transition layer formed on the substrate showing low Ga % formation of $Zn_xGa_{2(1-x)}O_{3-2x}$. This suggests strongly a high miscibility of Ga and Zn in the ternary offering non-equilibrium growth of full range of alloys 0≤x≤1. For the case of x=0.5 in $Zn_xGa_{2(1-x)}O_{3-2x}$ offers the cubic crystal symmetry form an E-k band structure as shown in diagram 5370 of FIG. 44N.

The indirect bandgap shown by band extrema 5375 and 5380 can be shaped using SL band engineering as shown in FIG. 27. The valence band dispersion 5385 showing maxima at k≠0 can be used to create a SL period that can advantageously map the maxima back to an equivalent energy at zone center thereby creating a pseudo-direct bandgap structure. Such a method is claimed in its entirety for application to the formation of optoelectronic devices such as UVLEDs as referred to in the present disclosure.

As explained in the present disclosure, there is a large design space available for crystal modifiers to the $Ga_2O_3$ and $Al_2O_3$ host crystals that can be exploited for application to UVLEDs.

Yet a further example is now disclosed where the growth conditions can be tuned to preselect a unique crystal symmetry type of $Ga_2O_3$, namely monoclinic (beta-phase) or hexagonal (epsilon or kappa phase).

FIG. 44O shows a specific application of the more general method disclosed in FIG. 19.

A prepared and clean surface of corundum crystal symmetry type of sapphire C-plane substrate 5400 is presented for epitaxy.

The substrate surface is polished via active oxygen at elevated temperature >750° C. and such as ~800-850° C. This creates an oxygen terminated surface 5405. While maintaining the high growth temperature, a Ga and active oxygen flux is directed toward the epi-surface and the surface reconstruction of bare $Al_2O_3$ is modified to either a corundum $Ga_2O_3$ thin template layer 5396 or a low Al % corundum $(Al_xGa_{1-x})_2O_3$ x<0.5 is formed by an additional co-deposited Al flux. After about 10 nm of the template layer 5396 the Al flux is closed and $Ga_2O_3$ is deposited. Maintaining a high growth temperature and a low Al % template 0≤x<0.1 favors exclusive film formation of monoclinic crystal structure epilayer 5397.

If after the initial template layer 5396 formation the growth temperature is reduced to about 650-750° C. then the $Ga_2O_3$ favors exclusively the growth of a new type of crystal symmetry structure having hexagonal symmetry. The hexagonal phase of $Ga_2O_3$ is also favored by x>0.1 template layer. The unique properties of the hexagonal crystal symmetry $Ga_2O_3$ 5420 composition is discussed later. The experimental evidence for the disclosed process of growing the epitaxial structure 5395 is provided in FIG. 44P, showing the HRXRD 5421 for two distinct growth process outcomes of phase pure monoclinic $Ga_2O_3$ and hexagonal crystal symmetry $Ga_2O_3$. The HRXRD scan shows the C-plane $Al_2O_3$ (0001)-oriented substrate Bragg diffraction peaks of corundum $Al_2O_3(0006)$ 5465 and $Al_2O_3(0012)$ 5470. For the case of monoclinic $Ga_2O_3$ topmost epitaxial film, the diffraction peaks indicated by 5445, 5450, 5455, and 5460 represent sharp single crystal monoclinic $Ga_2O_3(-201)$, $Ga_2O_3(-204)$, $Ga_2O_3(-306)$ and $Ga_2O_3(-408)$.

The orthorhombic crystal symmetry can further exhibit an advantageous property of possessing a non-inversion symmetry. This is particularly advantageous for allowing electric dipole transition between the conduction and valence band edges of the band structure at zone-center. For example, wurtzite ZnO and GaN both exhibit crystal symmetry having non-inversion symmetry. Likewise, orthorhombic (namely the space group 33 Pna21 crystal symmetry) has a non-inversion symmetry which enables electric dipole optical transitions.

Conversely, for the growth process of hexagonal $Ga_2O_3$, the peaks 5425, 5430, 5435 and 5440 represent sharp single crystal hexagonal crystal symmetry $Ga_2O_3$(002), $Ga_2O_3$ (004), $Ga_2O_3$(006), and $Ga_2O_3$(008).

The importance of achieving hexagonal crystal symmetry $Ga_2O_3$ and also hexagonal $(Al_xGa_{1-x})_2O_3$ is shown in FIG. 44Q.

The energy band structure 5475 shows the conduction band 5480 and valence band 5490 extrema are both located at the Brillouin-zone center 5485 and is therefore advantageous for application to UVLED.

Single crystal sapphire is one of the most mature crystalline oxide substrates. Yet another form of Sapphire is the corundum M-plane surface which can be used advantageously to form $Ga_2O_3$ and $AlGaO_3$ and other metal oxides discussed herein.

For example, it has been found experimentally in accordance with the present disclosure that the surface energy of Sapphire exhibited by specific crystal planes presented for epitaxy can be used to preselect the type of crystal symmetry of $Ga_2O_3$ that is epitaxially formed thereon.

Consider now FIG. 44R disclosing the utility of an M-plane corundum $Al_2O_3$ substrate 5500. The M-plane is the (1-100) oriented surface and can be prepared as discussed previously and atomically polished in-situ at elevated growth temperature of 800° C. while exposed to an activated oxygen flux. The oxygen terminated surface is then cooled to 500-700° C., such as 500° C. in one embodiment, and a $Ga_2O_3$ film is epitaxially deposited. It was found that in excess of 100-150 nm of corundum crystal symmetry $Ga_2O_3$ can be deposited on M-plane sapphire and about 400-500 nm of corundum $(Al_xGa_{1-x})_2O_3$ for x~0.3-0.45. Of particular interest, corundum $(Al_{0.3}Ga_{0.7})_2O_3$ exhibits a direct bandgap and is equivalent to the energy gap of wurtzite AlN.

The HRXRD 5495 and GIXR 5540 curves show two separate growths on M-plane sapphire 5500. High quality single crystal corundum $Ga_2O_3$ 5510 and $(Al_{0.3}Ga_{0.7})_2O_3$ 5505 are clearly shown with respect to the corundum $Al_2O_3$ substrate peak 5502. Therefore, M-plane oriented $AlGaO_3$ films are possible on M-plane Sapphire. The GIXR thickness oscillation 5535 is indicative of atomically flat interfaces 5520 and films 5530. Curve 5155 shows that there are no other crystal phases of $Ga_2O_3$ other than the corundum phase (rhombohedral crystal symmetry).

For completeness, it has also been found in accordance with the present disclosure that various metal oxides can also be used to exploit even the most technologically mature semiconductor substrate, namely Silicon. For example, while bulk $Ga_2O_3$ substrates are desirable for their crystallographic and electronic properties, they are still more expensive to produce than single crystal substrates and furthermore cannot scale as easily as Si to large wafer diameter substrates, for example up to 450 mm diameter for Si.

Therefore, embodiments include developing functional electronic $Ga_2O_3$ films directly on Silicon. To this end a process has been developed specifically for this application.

Referring now to FIG. 44S, there are shown the results of one experimentally developed process for depositing monoclinic $Ga_2O_3$ films on large area Silicon substrates.

A single crystal high quality monoclinic $Ga_2O_3$ epilayer 5565 is formed on a cubic transition layer 5570 comprising ternary $(Ga_{1-x}Er_x)_2O_3$. The transition layer is deposited using a compositional grading which can be abrupt or continuous. The transition layer can also be a digital layer comprising a SL of layers of $[(Ga_{1-x}Er_x)_2O_3/(Ga_{1-y}Er_y)_2O_3]$ wherein x and y are selected from 0≤x, y≤1. The transition layer is deposited optionally on a binary bixbyite crystal symmetry $Er_2O_3$(111)-oriented template layer 5560 deposited on a Si(111)-oriented substrate 5555. Initially the Si(111) is heated in UHV to 900° C. or more but less than 1300° C. to desorb the native $SiO_2$ oxide and remove impurities.

A clear temperature dependent surface reconstruction change is observed and can be used to in-situ calibrate the surface growth temperature which occurs at 830° C. and is only observable for a pristine Si surface devoid of surface $SiO_2$. Then the temperature of the Si substrate is reduced to 500-700° C. to deposit the $(Ga_{1-y}Er_y)_2O_3$ film(s) and then increased slightly to favor epitaxial growth of monoclinic $Ga_2O_3$(−201)-oriented active layer film. If $Er_2O_3$ binary is used, then activated oxygen is not necessary and pure molecular oxygen can be used to co-deposit with pure Er beam flux. As soon as Ga is introduced the activated oxygen flux is necessary. Other transition layers are also possible and can be selected from a number of ternary oxides described herein. The HRXRD 5550 shows the cubic $(Ga_{1-y}Er_y)_2O_3$peak 5572 along with the bixbyite $Er_2O_3$(111) and (222) peaks 5562. The monoclinic $Ga_2O_3$(−201), (−201), (−402) peaks are also observed as peaks 5567, and the Si(111) substrate as peaks 5557.

One application of the present disclosure is the use of cubic crystal symmetry metal oxides for the use of transition layers between Si(001)-oriented substrate surfaces to form $Ga_2O_3$(001) and $(Al,Ga)_2O_3$(001)-oriented active layer films. This is particularly advantageous for high volume manufacture.

Interest herein is directed toward exploiting transparent substrates that can accommodate a wide variety of metal oxide compositions and crystal symmetry types. In particular, again it is reiterated that the $Al_2O_3$, $(Al_xGa_{1-x})_2O_3$ and $Ga_2O_3$ materials are of great interest and the opportunity for accessing the entire miscibility range of Al % x in $(Al_xGa_{1-x})_2O_3$ and Ga % y in $(Al_{1-y}Ga_y)_2O_3$ can be addressed by corundum crystal symmetry type compositions.

Reference shall now be made to the examples in FIGS. 44T-44X.

FIG. 44T discloses high quality single crystal epitaxy of corundum $Ga_2O_3$(110)-oriented film on $Al_2O_3$(11-20)-oriented substrate (i.e., A-plane Sapphire). The surface energy of the A-plane $Al_2O_3$ surface can be used to grow exceptionally high quality corundum $Ga_2O_3$ and ternary films of corundum $(Al_xGa_{1-x})_2O_3$ where 0≤x≤1 for the entire alloy range. $Ga_2O_3$ can be growth up to a CLT of about 45-80 nm and the CLT increases dramatically with the introduction of Al to form the ternary $(Al_xGa_{1-x})_2O_3$.

Homoepitaxial growth of corundum $Al_2O_3$ is possible at a surprisingly wide growth window range. Corundum $AlGaO_3$ can be grown from room temperature up to about 750° C. All growths, however, require an activated oxygen (viz., atomic oxygen) flux to be well in excess of the total metal flux, that is, oxygen rich growth conditions. Corundum crystal symmetry $Ga_2O_3$ films are shown in the HRXRD 5575 and GIXR 5605 scan of two separate growths for different thickness films on A-plane $Al_2O_3$ substrates. The substrate 5590 surface (corresponding to peak 5592) is oriented in the (11-20) plane and O-polished at elevated temperature at about 800° C.

The activated oxygen polish is maintained while the growth temperature is reduced to an optimal range of 450-600° C., such as 500° C. Then an $Al_2O_3$ buffer 5595 is optionally deposited for 10-100 nm and then the ternary $(Al_xGa_{1-x})_2O_3$ epilayer 5600 is formed by co-depositing with suitably arranged Al and Ga fluxes to achieve the desired Al %. Oxygen-rich conditions are mandatory. Curves 5580 and 5585 show example x=0 $Ga_2O_3$ films 5600 of 20 and 65 nm respectively.

The Pendellosung interference fringes in both the HRXRD and GIXR demonstrate excellent coherent growth, and transmission electron microscopy (TEM) confirm off-axis XRD measurements that defect densities below $10^7 cm^{-3}$ are possible.

Corundum $Ga_2O_3$ films on A-plane $Al_2O_3$ in excess of about 65 nm show relaxation as evidenced in reciprocal lattice mapping (RSM) but however maintain excellent crystal quality for film>CLT.

Yet other methods for further improvement in the CLT of binary $Ga_2O_3$ films on A-plane $Al_2O_3$ are also possible. For example, during the high temperature O-polish step of a virgin $Al_2O_3$ substrate surface, the substrate temperature can be maintained at about 750-800° C. At this growth temperature the Ga flux can be presented along with the activated oxygen and a high temperature phenomenon can occur. It was found in accordance with the present disclosure that Ga effectively diffuses into the topmost surface of the $Al_2O_3$ substrate forming an extremely high quality corundum $(Al_xGa_{1-x})_2O_3$ template layer with 0<x<1. The growth can either be interrupted or continued while the substrate temperature is reduced to about 500° C. The template layer then acts as an in-plane lattice matching layer that is closer to $Ga_2O_3$ and thus a thicker CLT is found for the epitaxial film.

Having established the unique properties of A-plane surfaces and with reference to the surface energy trend disclosed in FIG. 20B, bandgap modulated superlattice structures are also shown to be possible.

FIG. 44U shows unique attributes of binary $Ga_2O_3$ and binary $Al_2O_3$ epilayers used to form a SL structure on an A-plane $Al_2O_3$ substrate 5625 (corresponding to peak 5627). The excellent SL HRXRD 5610 and GIXR 5630 data show a plurality of high quality SL Bragg diffraction satellite peaks 5615 and 5620 having period $\Delta_{SL}$=9.5 nm. Not only are the full width at half maximum (FWHM) of each satellite peak 5615 very small, there are also clearly observed the inter-peak oscillations of the Pendellosung fringes. For N=10 periods of SL, there exist N−2 Pendellosung oscillations as shown in both the HRDRD and GIXR. The zeroth order SL peak $SL^{n=0}$ is indicative of the average alloy Al % of the digital alloy formed by the SL and is $x_{Al}^{SL}$=0.85. This level of crystalline perfection is rarely observed in many other non-oxide commercially relevant material systems and is noted to be comparable to extremely mature GaAs/AlAs group-III-Arsenide material systems deposited on GaAs substrates. Such low defect density SL structures are necessary for high performance UVLED operation.

Image 5660 in FIG. 44V demonstrates the crystal quality observed for an example $[Al_2O_3/Ga_2O_3]$ SL 5645 deposited on A-plane sapphire 5625. Clearly evident is the contrast in Ga and Al specie showing the abrupt interfaces between the nanometer scale films 5650 and 5655 comprising the SL period.

Closer inspection of image 5660 shows the region labelled 5635 which is due to the high temperature Ga intermixing process described above. The $Al_2O_3$ buffer layer 5640 imparts a small strain to the SL stack. Careful attention is paid to maintaining the $Ga_2O_3$ film thickness to well below the CLT to create high quality SL. However, strain accumulation can result and other structures such as growing the SL structure on a relaxed buffer composition midway between the composition endpoints of the materials comprising the SL is possible in some embodiments.

This enables strain symmetrization to be engineered wherein the layer pairs forming the period of the superlattice can have equal and opposite in-plane strain. Each layer is deposited below the CLT and experiences biaxial elastic strain (thereby inhibiting dislocation formation at the interfaces). Therefore some embodiments include engineering a SL disposed on a relaxed buffer layer that enables the SL to accumulate zero strain and thus can be grown effectively strain-free with theoretically infinite thickness.

Yet a further application of corundum film growth can be demonstrated on yet another advantageous $Al_2O_3$ crystal surface, namely the R-plane (1-102).

FIG. 44W shows the ability to epitaxially deposit thick ternary corundum $(Al_xGa_{1-x})_2O_3$ films on R-plane corundum $Al_2O_3$. The HRXRD 5665 shows an R-plane $Al_2O_3$ substrate 5675 that is prepared using a high temperature O-polish and co-deposition of Al and Ga while reducing the growth temperature from 750 to 500° C. forming region 5680. Region 5680 is an optional surface layer modification to the sapphire substrate surface, such as an oxygen-terminated surface. The excellent high quality ternary epilayer 5670 (corresponding to XRD peak 5672) demonstrates sharp Pendellosung fringes 5680 and provides an alloy composition of x=0.64 with respect to the substrate peak 5677. The film thickness for this case is about 115 nm. Also shown in FIG. 44W is the angular separation of symmetric Bragg peaks 5685 of the pseudomorphic corundum $Ga_2O_3$ epilayer.

Again, high utility is placed on creating bandgap epilayer films that may be configured or engineered to construct the required functional regions for the UVLED. In this manner, strain and composition are tools that may be employed for manipulating known functional properties of the materials for application to UVLEDs in accordance with the present disclosure.

FIG. 44X shows an example of a high quality superlattice structure possible for R-plane $Al_2O_3$ (1-102) oriented substrates.

The HRXRD 5690 and GIXR 5710 are shown for an example SL epitaxially formed on R-plane $Al_2O_3$(1-102) substrate 5705 (corresponding to peak 5707).

The SL comprises a 10 period [ternary/binary]bilayer pair of $[(Al_xGa_{1-x})_2O_3/Al_2O_3]$ where x=0.50. The SL period $\Delta_{SL}$=20 nm. The plurality of SL Bragg diffraction peaks 5695 and reflectivity peaks 5715 indicate coherently grown pseudomorphic structure. The zeroth order SL diffraction peak $SL^{n=0}$ 5700 indicates an effective digital alloy $x_{SL}$ of the SL as comprising $(Al_{xSL}Ga_{1-xSL})_2O_3$ where $x_{SL}$=0.2.

Such highly coherent and largely dissimilar bandgap materials used to create epitaxial SL with abrupt discontinuities at the interfaces may be employed for the formation of quantum confined structures as disclosed herein for application to optoelectronic devices such as UVLEDs.

The conduction and valence band energy discontinuity available at the $Al_2O_3/Ga_2O_3$ heterointerface for corundum crystal symmetry (R3c) is:

$$\Delta E_{R3c}^{C}=E_{Al_2O_3}^{C}-E_{Ga_2O_3}^{C}=3.20\text{ eV}$$

$$\Delta E_{R3c}^{V}=E_{Al_2O_3}^{V}-E_{Ga_2O_3}^{V}=0.12\text{ eV}$$

Also, for the monoclinic crystal symmetry (C2m) heterointerface the band offsets are:

$$\Delta E_{C2m}^{C}=E_{Al_2O_3}^{C}-E_{Ga_2O_3}^{C}=2.68\text{ eV}$$

$$\Delta E_{C2m}^{V}=E_{Al_2O_3}^{V}-E_{Ga_2O_3}^{V}=0.34\text{ eV}$$

Some embodiments also include creating a potential energy discontinuity by creation of $Ga_2O_3$ layers having an abrupt change in crystal symmetry.

For example, it is disclosed herein that corundum crystal symmetry $Ga_2O_3$ can be directly epitaxially deposited on monoclinic $Ga_2O_3$(110)-oriented surfaces. Such a heterointerface produces band offsets given by:

$$\Delta E_{Ga_2O_3}{}^{C}=E_{R3c}{}^{C}-E_{C2m}{}^{C}\sim 0.50 \text{ eV}$$

$$\Delta E_{Ga_2O_3}{}^{V}=E_{R3c}{}^{V}-E_{C2m}{}^{V}\sim 0.10 \text{ eV}$$

These band offsets are sufficient to create quantum confined structures as will be described below.

As yet another example of embodiments of complex metal oxide heterostructures, refer to FIG. 44Y wherein a cubic MgO epilayer 5730 is formed directly on a spinel $MgAl_2O_4$(100) oriented substrate 5725. The HRXRD 5720 shows the cubic $MgAl_2O_4$(h 0 0), h=4, 8 substrate Bragg diffraction peaks 5727 and the epitaxial cubic MgO peaks 5737 corresponding to the MgO epilayer 5730. The lattice constant of MgO is almost exactly twice the lattice constant of $MgAl_2O_4$ and thus creates unique epitaxial coincidence for in-plane lattice registration at the heterointerface.

Clearly a high quality MgO(100)-oriented epilayer is formed as evidenced by the narrow FWHM. Next a monoclinic layer of $Ga_2O_3$ 5735 is formed on the MgO layer 5730. The $Ga_2O_3$(100) oriented film is evidenced by the 5736 Bragg diffraction peak.

The interest in cubic $MgAl_2O_4$ and $Mg_xAl_{2(1-x)}O_{3-2x}$ ternary structures is due to the direct and large bandgap possible.

Graph 5740 of FIG. 44Z shows the energy band structure for $Mg_xAl_{2(1-x)}O_{3-2x}$ x~0.5 showing a direct bandgap 5745 formed between the conduction band 5750 and valence band 5755 extrema.

Some embodiments also include growing directly $Ga_2O_3$ on Lanthanum-Aluminum-Oxide $LaAlO_3$(001) substrates.

The example structures disclosed in FIGS. 44A-44Z are for the purpose of demonstrating some of the possible configurations applicable for use in at least a portion of a UVLED structure. The wide variety of compatible mixed symmetry type heterostructures is a further attribute of the present disclosure. As would be appreciated, other configurations and structures are also possible and consistent with the present disclosure.

Figure 45:
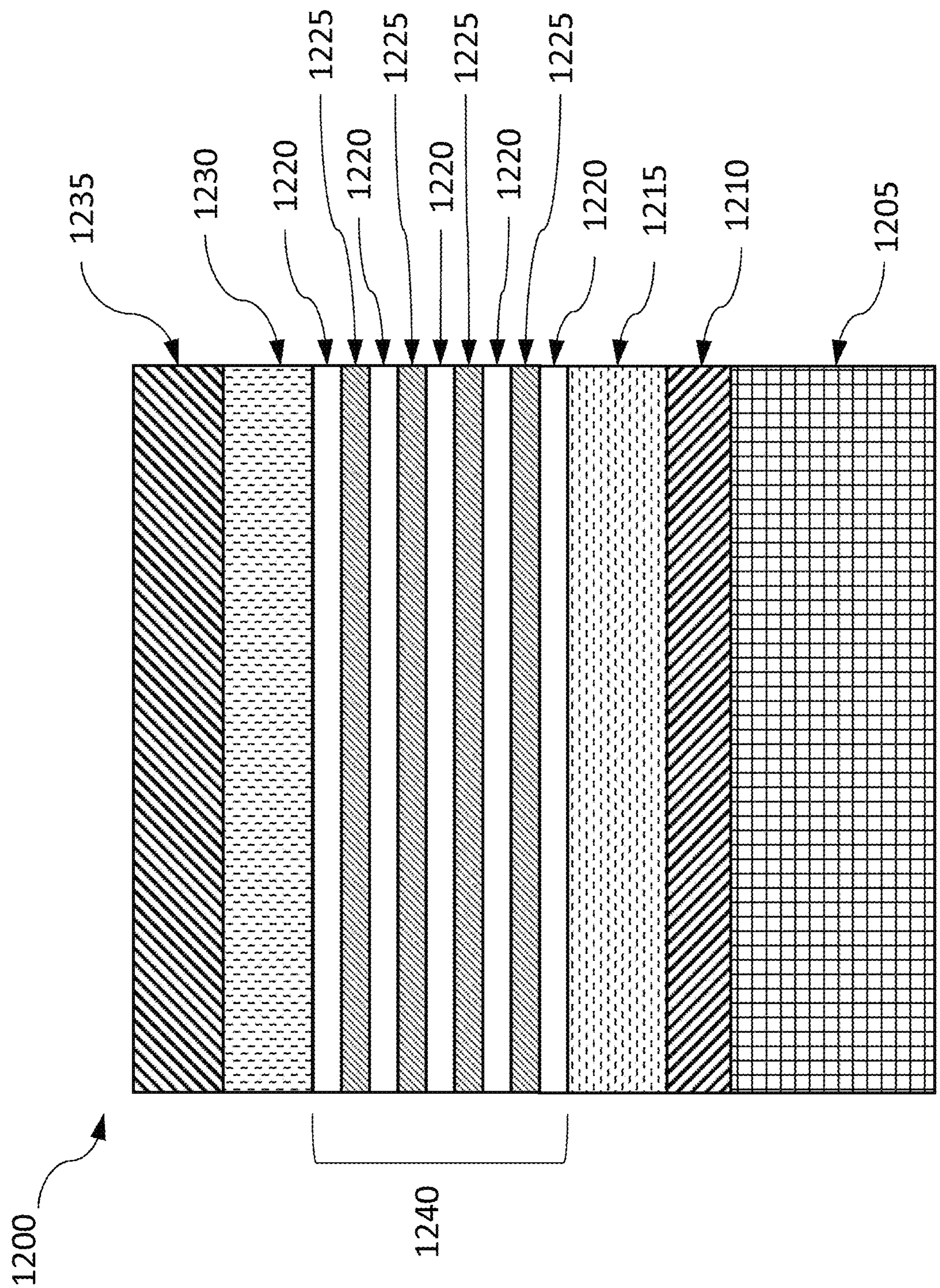
FIG. 45 shows schematically a construction of epitaxial regions for a metal oxide UVLED comprising a p-i-n heterojunction diode and multiple quantum wells to tune the optical emission energy in accordance with an illustrative embodiment of the present disclosure.
Figure 46:
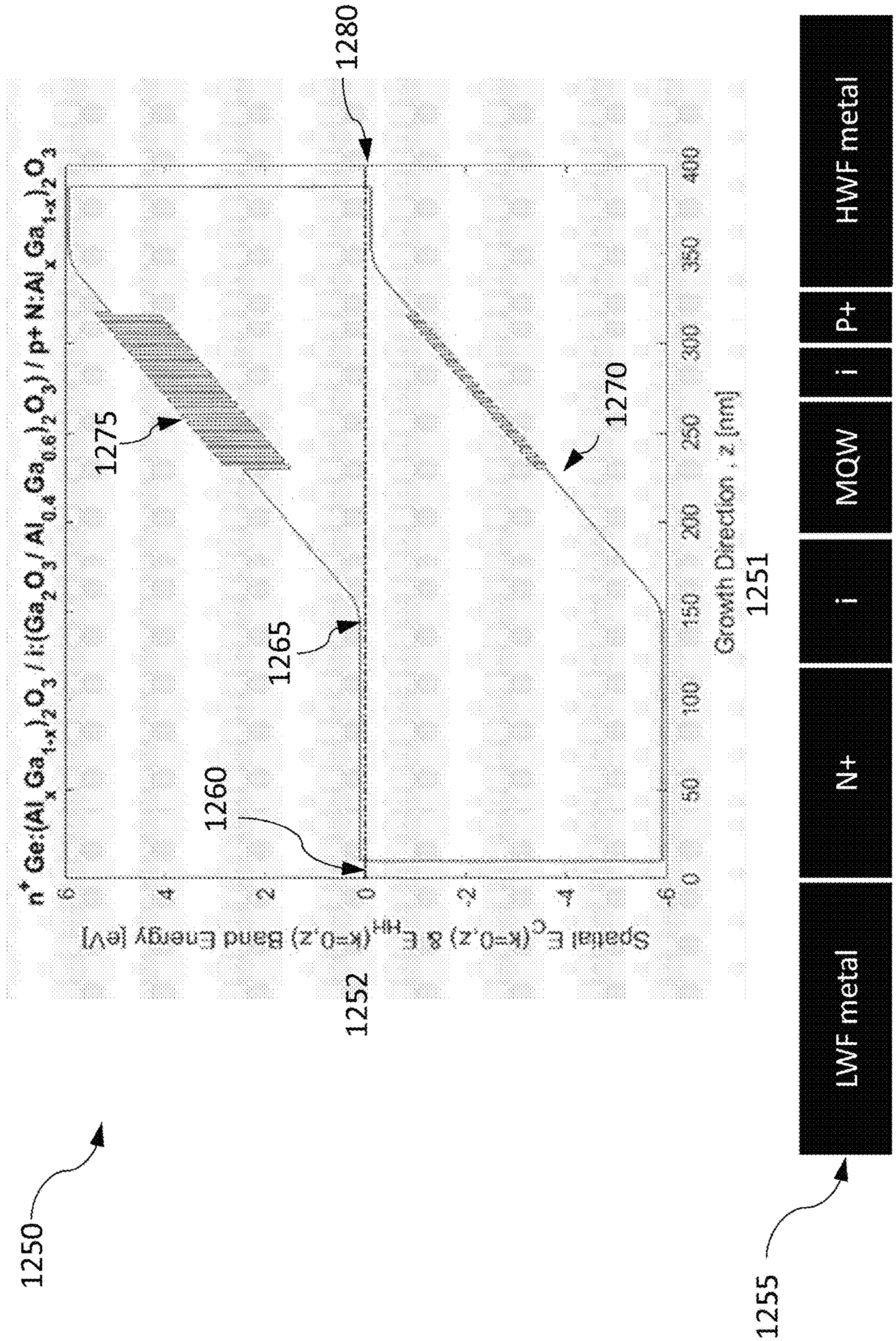
FIG. 46 is an energy band diagram versus growth direction of the epitaxial metal oxide UVLED structure illustrated in FIG. 45 where the k=0 representation of the band structure is plotted in accordance with an illustrative embodiment of the present disclosure.

The aforementioned unique properties of the $AlGaO_3$ material system can be applied to formation of a UVLED. FIG. 45 shows an example light emitting device structure 1200 in accordance with the present disclosure. Light emitting device 1200 is designed to operate such that optically generated light can be out-coupled vertically through the device. Device 1200 comprises a substrate 1205, a first conductivity n-type doped $AlGaO_3$ region 1210, followed by a not-intentionally doped (NID) intrinsic $AlGaO_3$ spacer region 1215, followed by a multiple quantum well (MQW) or superlattice 1240 formed using periodic repetitions of $(Al_xGa_{1-x})_2O_3/(Al_yGa_{1-y})_2O_3$ wherein the barrier layer comprises the larger bandgap composition 1220 and the well layer comprises the narrower bandgap composition 1225.

The total thickness of the MQW or SL 1240 is selected to achieve the desired emission intensity. The layer thicknesses comprising the unit cell of the MQW or SL 1240 are configured to produce a predetermined operating wavelength based on the quantum confinement effect. Next an optional $AlGaO_3$ spacer layer 1230 separates the MQW/SL from the p-type $AlGaO_3$ layer 1235.

Figure 53:
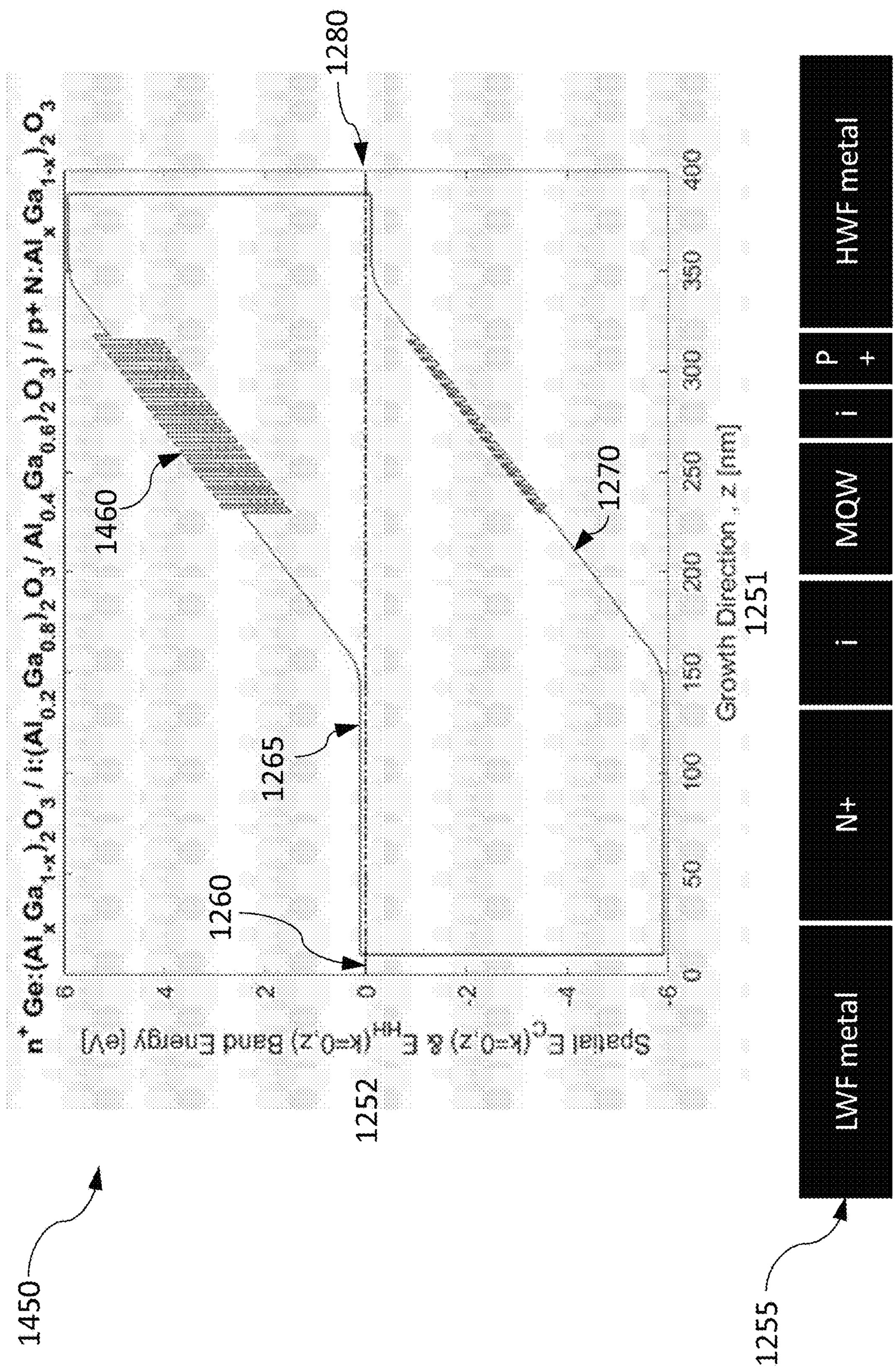
FIG. 53 is an energy band diagram versus growth direction of an epitaxial metal oxide UVLED structure where the MQW region has a narrow bandgap material comprising $(Al_{0.2}Ga_{0.8})_2O_3$ in accordance with an illustrative embodiment of the present disclosure.

Spatial energy band profiles using the k=0 representation are disclosed in FIGS. 46, 47, 49, 51 and 53 which are graphs of spatial band energy 1252 as a function of growth direction 1251. The n-type and p-type conductivity regions 1210 and 1235 are selected from monoclinic or corundum compositions of $(Al_xGa_{1-x})_2O_3$, where x=0.3, followed by a NID 1215 of the same composition x=0.3. The MQW or SL 1240 is tuned by keeping the thickness of both the well and barrier layers the same in each design 1250 (FIGS. 46, 47), 1350 (FIG. 49), 1390 (FIGS. 51) and 1450 (FIG. 53).

Figure 47:
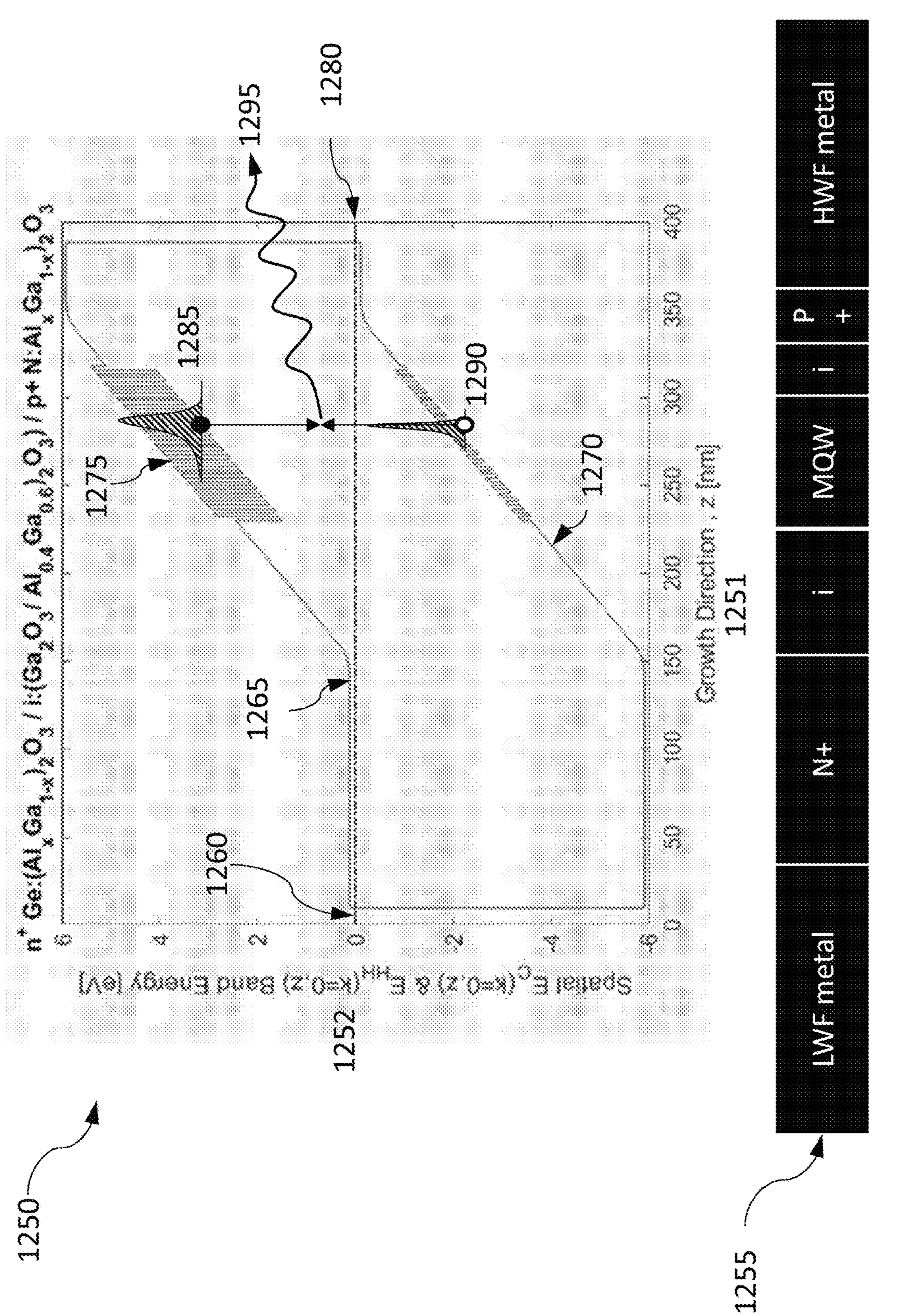
FIG. 47 shows a spatial carrier confinement structure of the multiple quantum well (MQW) regions of FIG. 46 having quantized electron and hole wavefunctions which spatially recombine in the MQW region to generate a predetermined emitted photon energy determined by the respective quantized states in the conduction and valence bands where the MQW region has a narrow bandgap material comprising $Ga_2O_3$ in accordance with an illustrative embodiment of the present disclosure.
Figure 49:
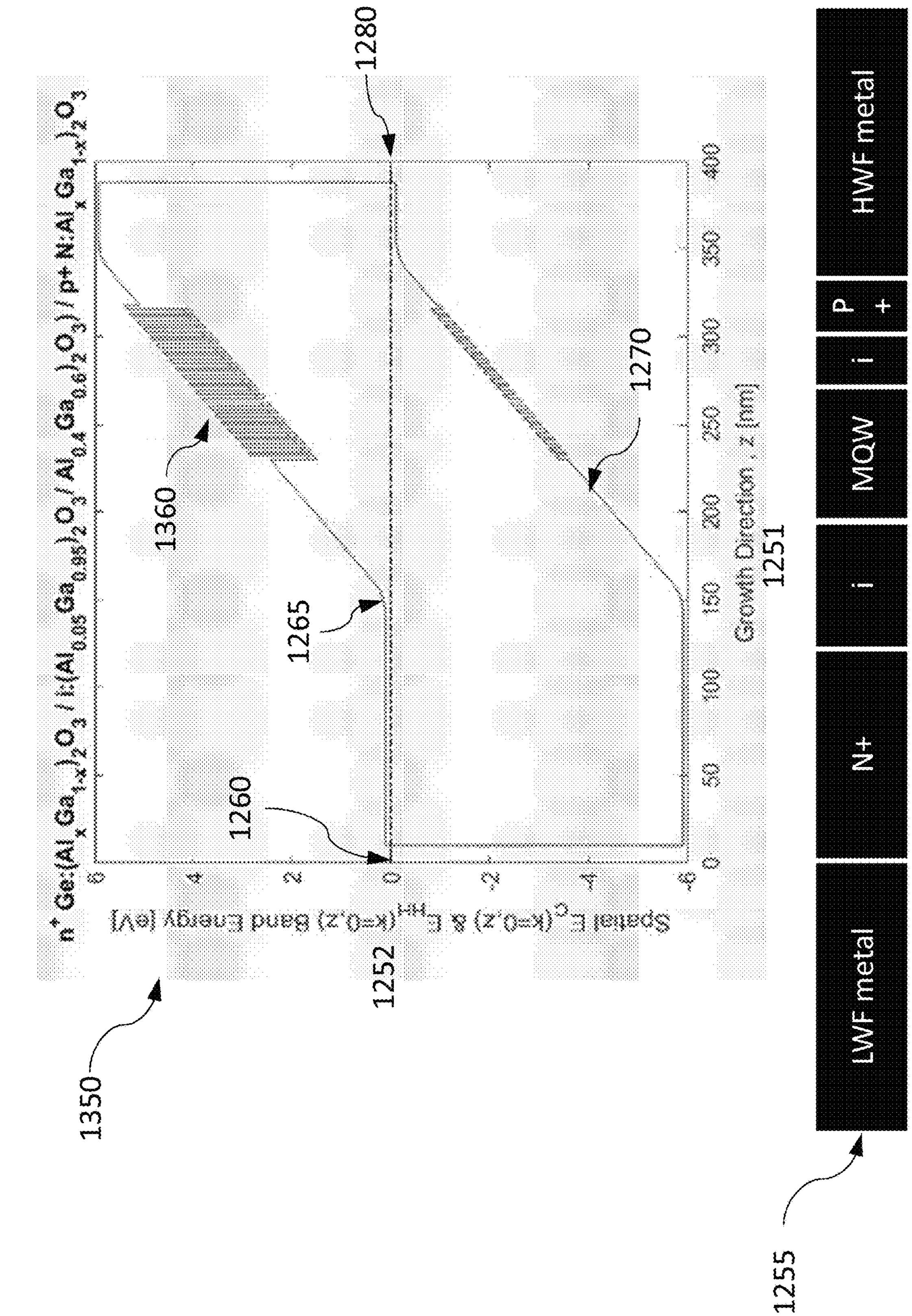
FIG. 49 is an energy band diagram versus growth direction of an epitaxial metal oxide UVLED structure where the MQW region has a narrow bandgap material comprising $(Al_{0.05}Ga_{0.95})_2O_3$ in accordance with an illustrative embodiment of the present disclosure.
Figure 51:
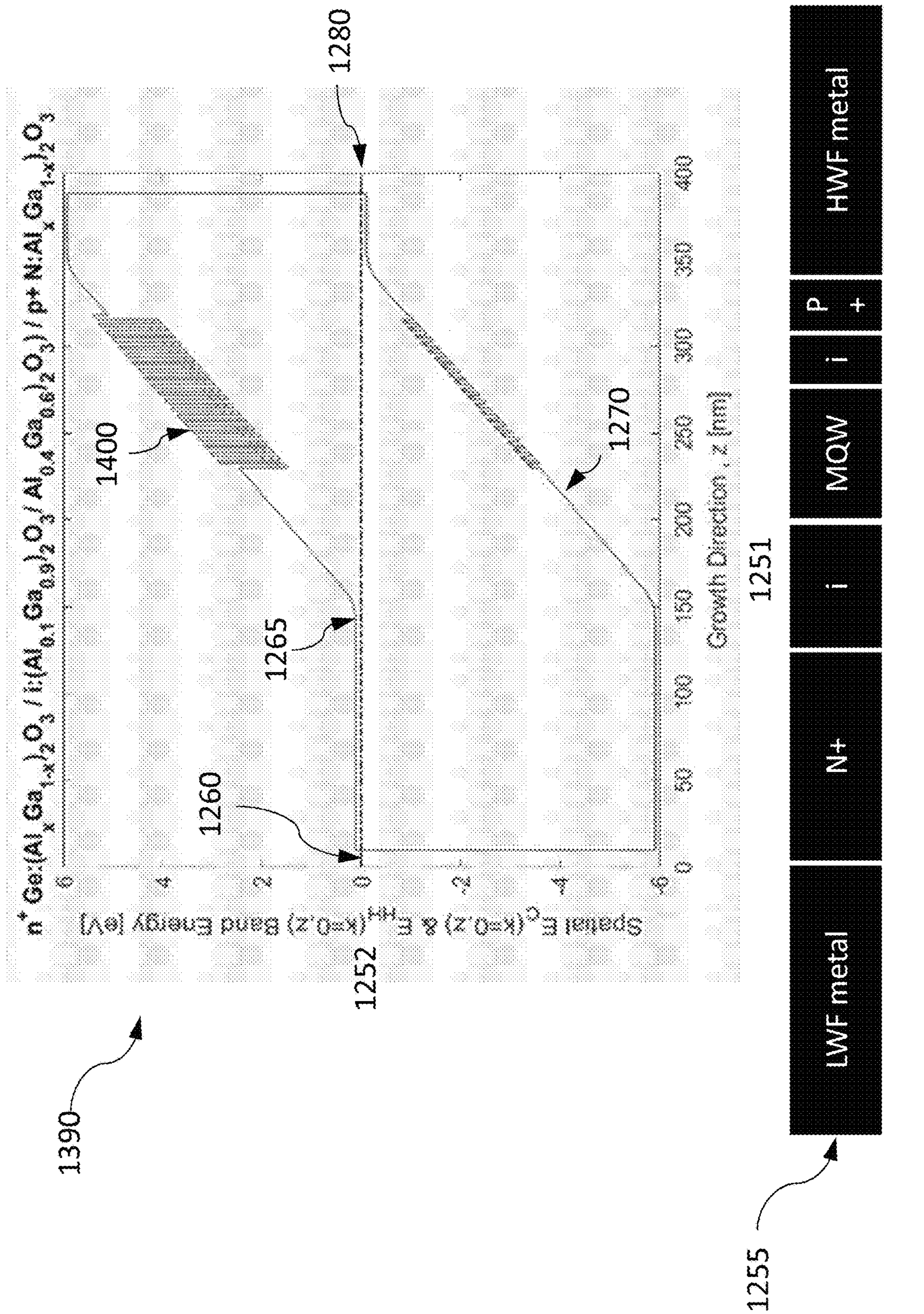
FIG. 51 is an energy band diagram versus growth direction of an epitaxial metal oxide UVLED structure where the MQW region has a narrow bandgap material comprising $(Al_{0.1}Ga_{0.9})_2O_3$ in accordance with an illustrative embodiment of the present disclosure.

The composition of the well is varied from x=0.0, 0.05, 0.10 and 0.20, and the barrier is fixed to y=0.4 for the bi-layer pairs $(Al_xGa_{1-x})_2O_3/(Al_yGa_{1-y})_2O_3$. These MQW regions are located at 1275, 1360, 1400 and 1460. The thickness of the well layer is selected from at least $0.5xa_w$ to $10xa_w$ the unit cell ($a_w$ lattice constant) of the host composition. For the present case, one unit cell is chosen. The periodic unit cell thickness can be relatively large as the corundum and monoclinic unit cells are relatively large. However, sub-unit-cell assemblies may be utilized in some embodiments. MQW region 1275 in FIG. 47 is configured for intrinsic or non-intentionally doped layer combination comprising $Ga_2O_3/(Al_{0.4}Ga_{0.6})_2O_3$. MQW region 1360 in FIG. 49 is configured for intrinsic or non-intentionally doped layer combination comprising $(Al_{0.05}Ga_{0.95})_2O_3/(Al_{0.4}Ga_{0.6})_2O_3$. MQW region 1400 in FIG. 51 is configured for intrinsic or non-intentionally doped layer combination comprising $(Al_{0.1}Ga_{0.9})_2O_3/(Al_{0.4}Ga_{0.6})_2O_3$. MQW region 1460 in FIG. 53 is configured for intrinsic or non-intentionally doped layer combination comprising $(Al_{0.2}Ga_{0.8})_2O_3/(Al_{0.4}Ga_{0.6})_2O_3$.

Also shown are ohmic contact metals 1260 and 1280. The conduction band edge $E_C(z)$ 1265 and the valence band edges $E_V(z)$ 1270 and the MQW region 1400 shows the modulation in bandgap energy with respect to the spatially modulated composition. This is yet another particular advantage of atomic layer epitaxy deposition techniques which make such structures possible.

FIG. 47 shows schematically the confined electron 1285 and hole 1290 wavefunctions within the MQW region 1275. The electric-dipole transition due to spatial recombination of electron 1285 and hole 1290 creates photon 1295.

Figure 48:
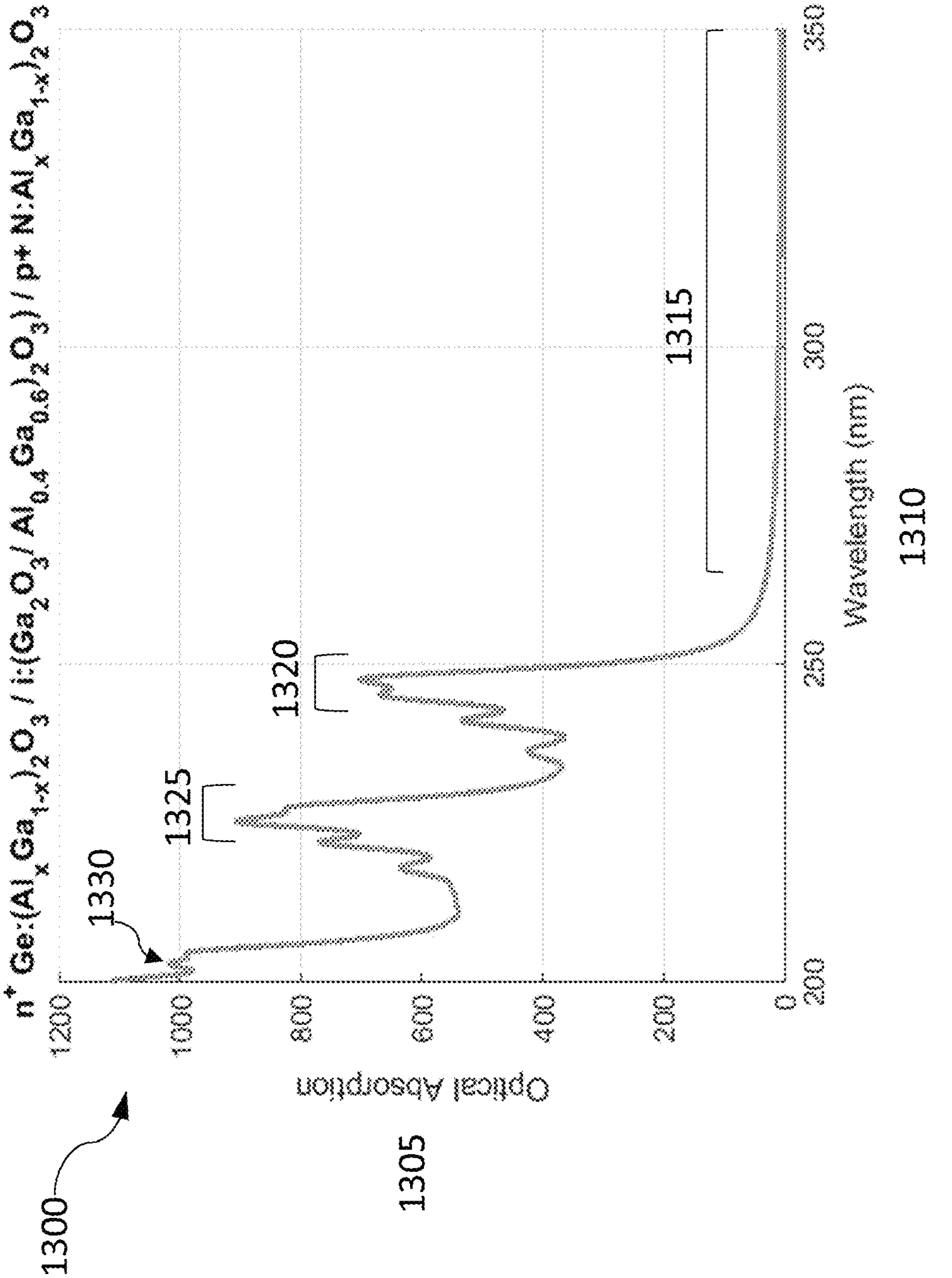
FIG. 48 shows a calculated optical absorption spectrum for the device structure in FIG. 47 where the lowest energy electron-hole recombination is determined by the quantized energy levels within the MQW giving rise to sharp and discrete absorption/emission energy in accordance with an illustrative embodiment of the present disclosure.

The emission spectrum can be calculated and is shown in FIG. 48, plotted in graph 1300 as the emission wavelength 1310 and the oscillator absorption strength 1305 due to the wavefunction overlap integrals for the spatially dependent quantized electron and holes states (also indicative of the emission strength). A plurality of peaks 1320, 1325 and 1330 are generated due to recombination of quantized energy states with the MQW. In particular, the lowest energy electron-hole recombination peak 1320 is the most probable and occurs at ~245 nm. Region 1315 shows that below the energy gap of the MQW there is no absorption or optical emission. The first onset of optical activity in moving toward shorter wavelengths is the n=1 exciton peak 1320 determined by the MQW configuration.

Figure 50:
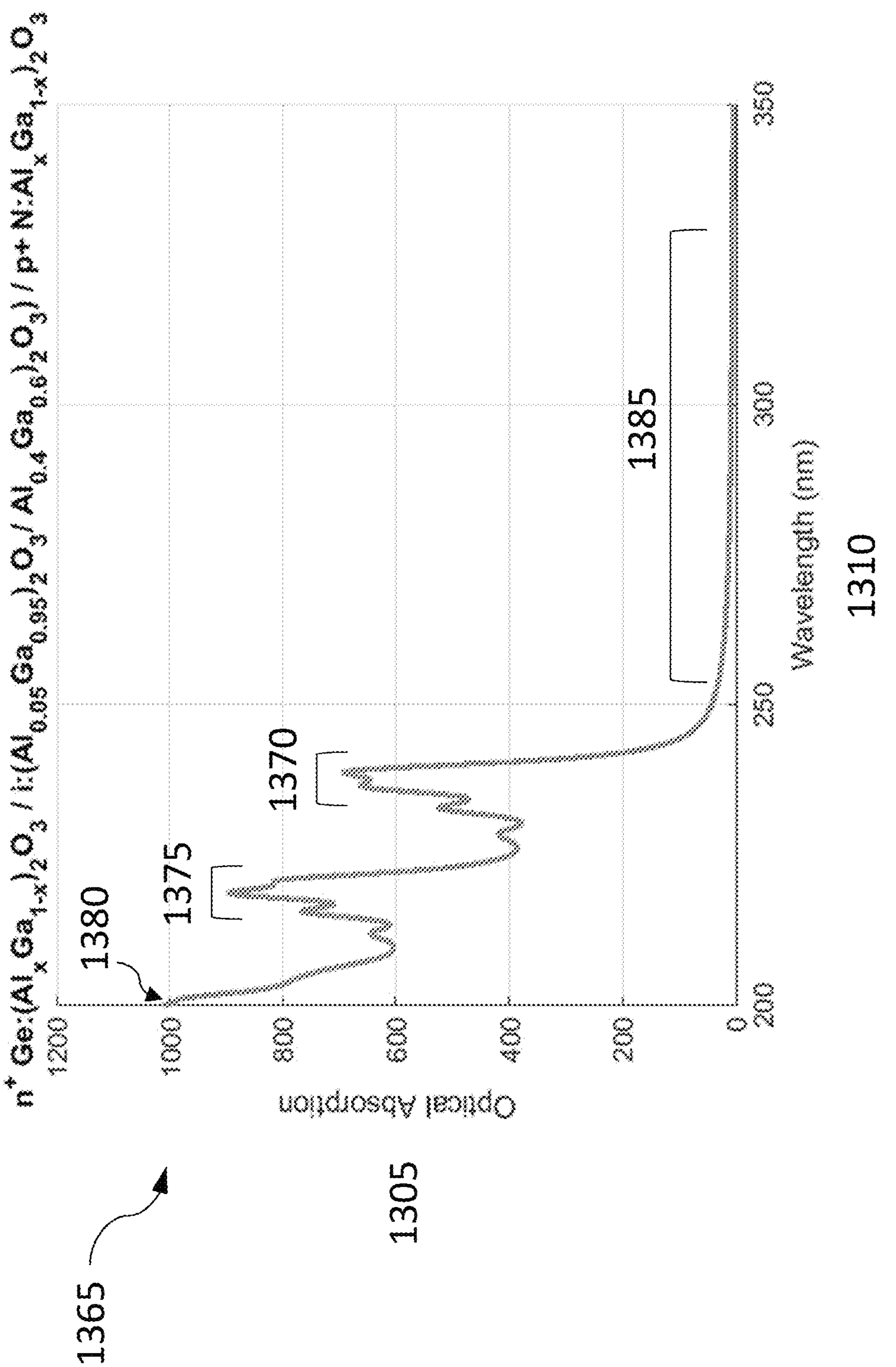
FIG. 50 shows a calculated optical absorption spectrum for the device structure in FIG. 49 where the lowest energy electron-hole recombination is determined by the quantized energy levels within the MQW giving rise to sharp and discrete absorption/emission energy in accordance with an illustrative embodiment of the present disclosure.
Figure 52:
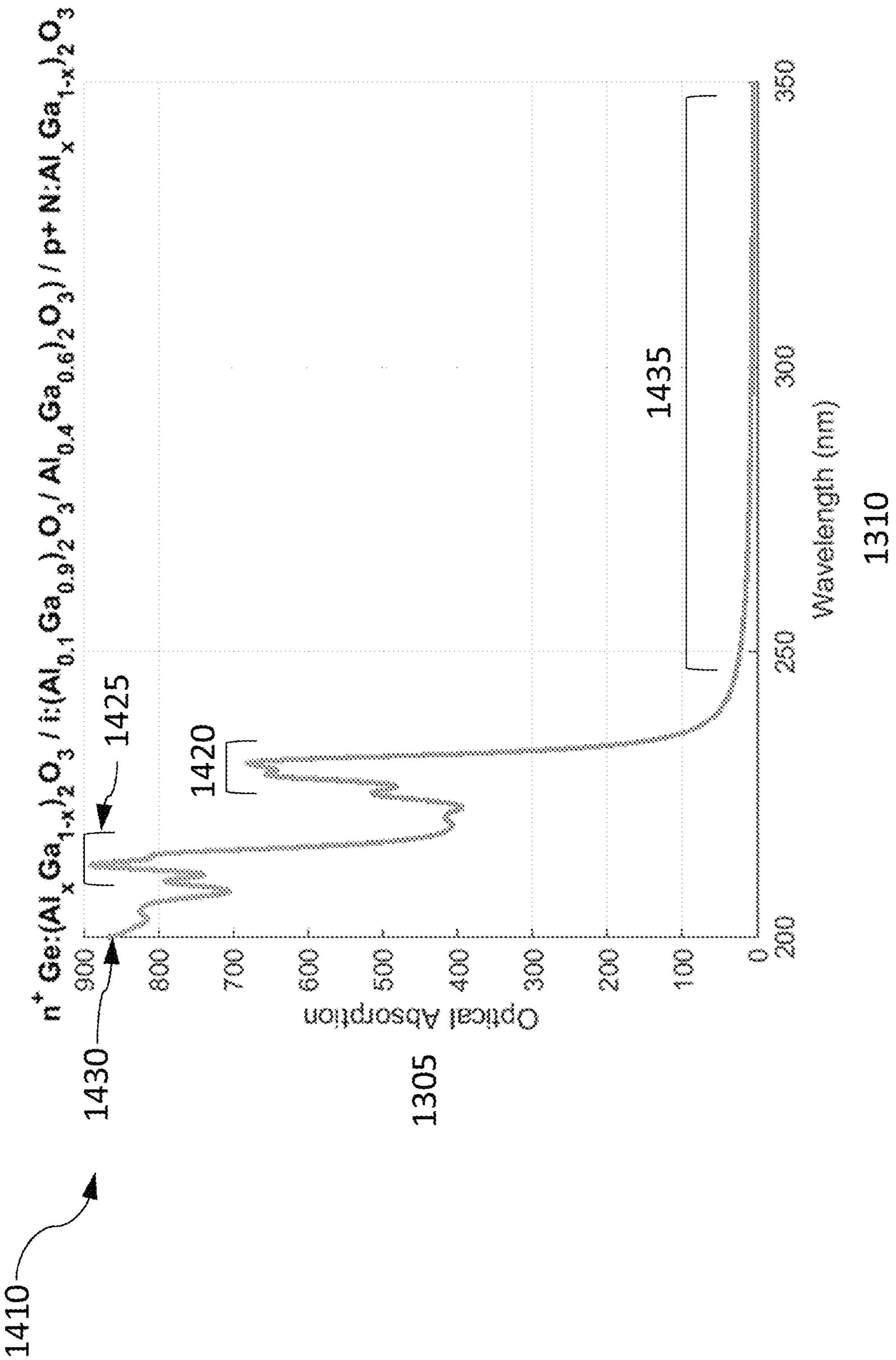
FIG. 52 shows a calculated optical absorption spectrum for the device structure in FIG. 49 where the lowest energy electron-hole recombination is determined by the quantized energy levels within the MQW giving rise to sharp and discrete absorption/emission energy in accordance with an illustrative embodiment of the present disclosure.
Figure 54:
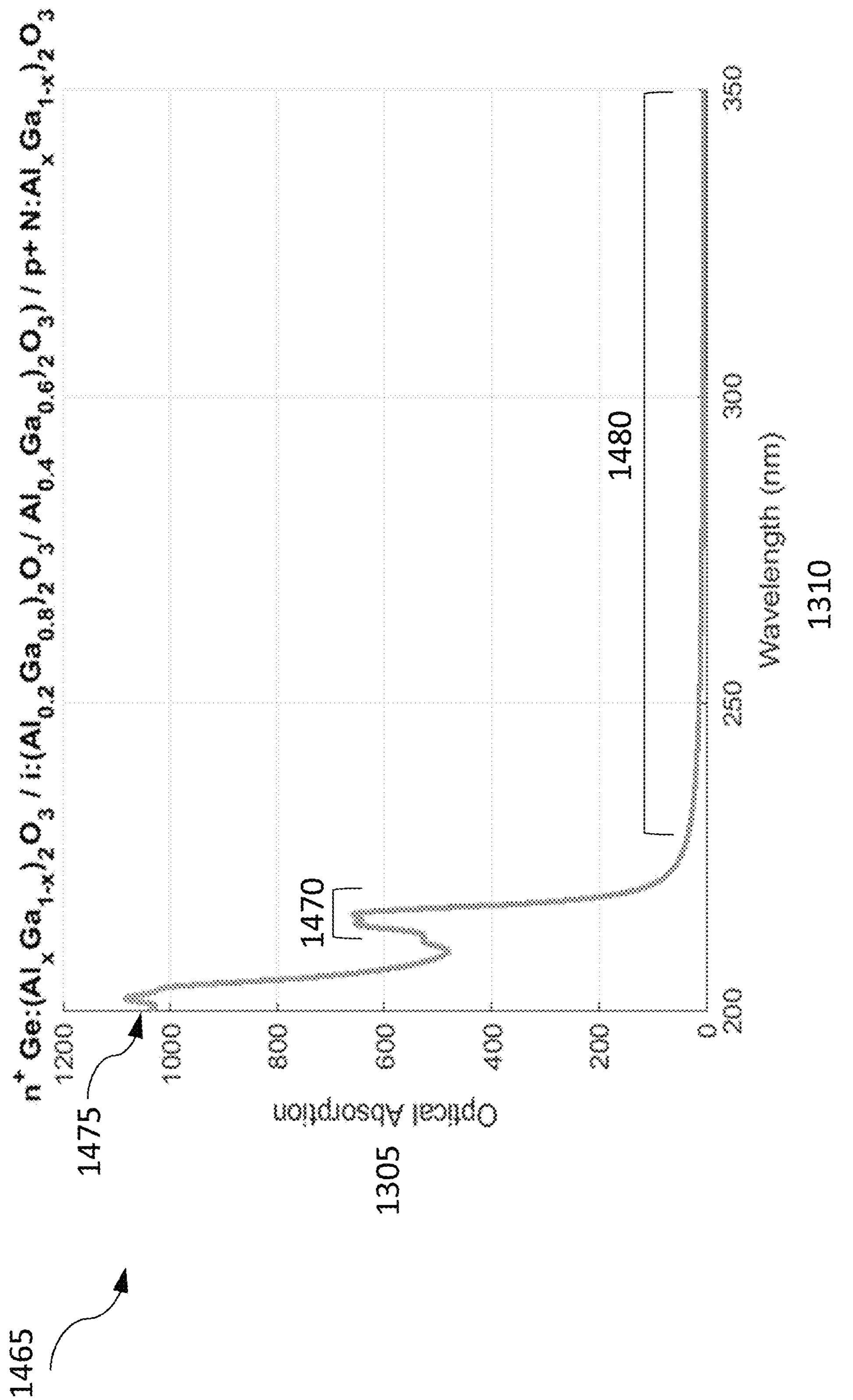
FIG. 54 shows a calculated optical absorption spectrum for the device structure in FIG. 53 where the lowest energy electron-hole recombination is determined by the quantized energy levels within the MQW giving rise to sharp and discrete absorption/emission energy in accordance with an illustrative embodiment of the present disclosure.

The MQW configurations 1275, 1360, 1400 and 1460 result in light emission energy peaks 1320 (FIG. 48), 1370 (FIG. 50), 1420 (FIGS. 52) and 1470 (FIG. 54) having peak operating wavelengths of 245 nm, 237 nm, 230 nm and 215 nm, respectively. Graph 1365 of FIG. 50 also shows peaks 1375 and 1380 along with region 1385. Graph 1410 of FIG. 52 also shows peaks 1425 and 1430 along with region 1435. Graph 1465 of FIG. 54 also shows peak 1475 along with region 1480. Regions 1385, 1435 and 1480 show that there is no optical absorption or emission for photon energy/wavelengths below the energy gap of the MQW.

Yet a further feature of extremely wide bandgap metal oxide semiconductors is the configuration of ohmic contacts to n-type and p-type regions. The example diode structures 1255 comprise high work-function metal 1280 and low work-function metal 1260 (ohmic contact metals). This is because of the relative electron affinity of the metal-oxides with respect to vacuum (refer to FIG. 9).

FIGS. 48, 50, 52 and 54 show the optical absorption spectrum for the MQW regions contained within the diode structures 1255. The MQW comprises two layers of a narrower bandgap material and a wider bandgap material. The thickness of the layers, and in particular the narrow bandgap layer, are selected such that they are small enough to exhibit quantization effects along the growth direction within the conduction and valence potentials wells that are formed. The absorption spectrum represents the creation of an electron and hole in the quantized state of the MQW upon resonant absorption of an incident photon.

The reversible process of photon creation is where the electron and hole are spatially localized in their respective quantum energy levels of the MQW and recombine by virtue of the direct bandgap. The recombination produces a photon with energy that equals approximately that of the bandgap of the layer acting as the potential well having a direct energy gap in addition to the energy separation of the quantized levels within the potentials wells relative to the conduction and valence band edges. The emission/absorption spectra therefore show the lowest lying energy resonance peak indicative of the UVLED primary emission wavelength and is engineered to be the desired operating wavelength of the device.

Figure 55:
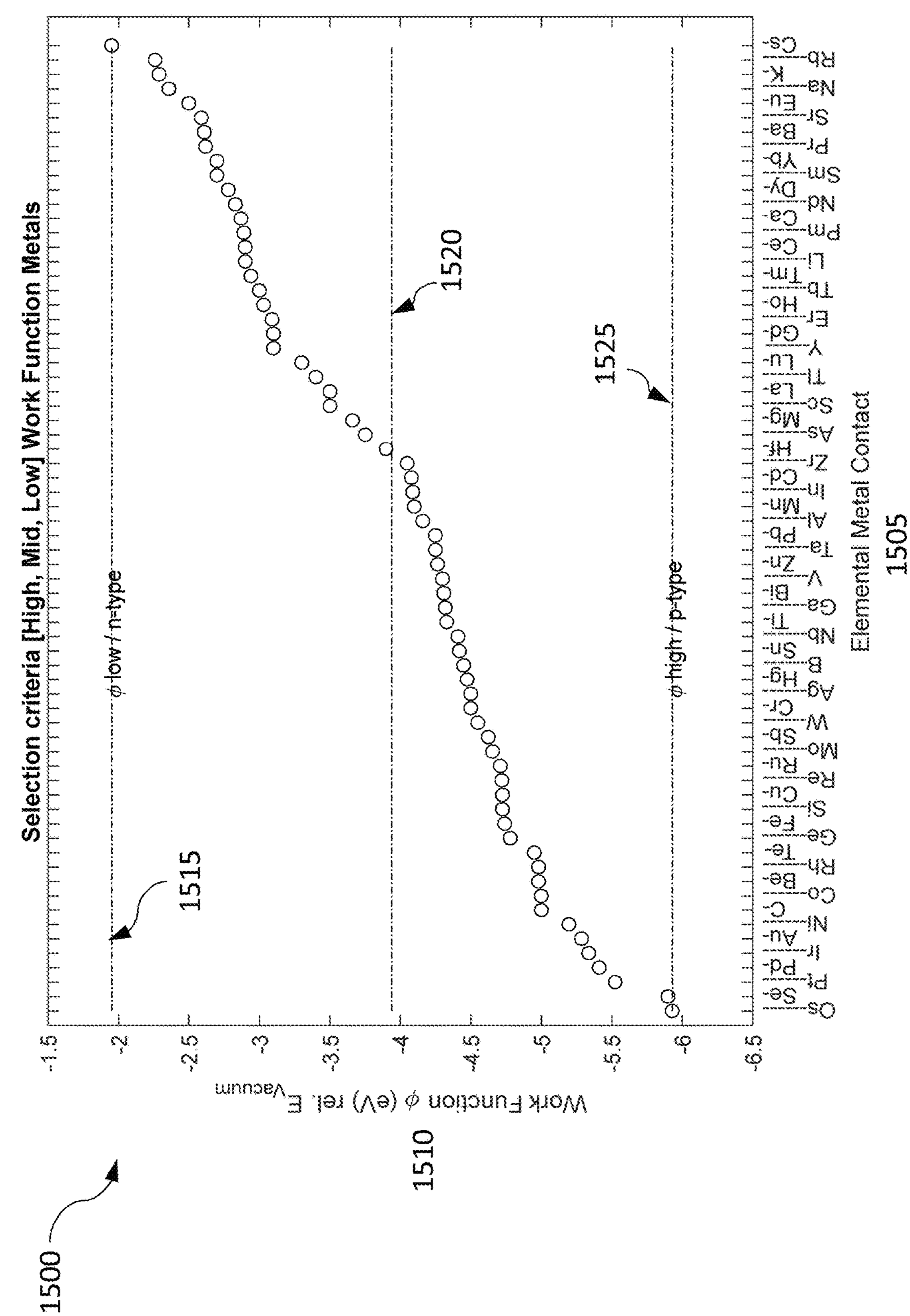
FIG. 55 plots pure metal work-function energy and sorts the metal species from high to low work function for application to p-type and n-type ohmic contacts to metal oxides in accordance with illustrative embodiments of the present disclosure.

FIG. 55 shows a plot 1500 of the known pure metal work-function energy 1510 and sorts the metal species (elemental metal contact 1505) from high 1525 to low 1515 work function for application to p-type and n-type ohmic contacts and provides selection criteria for the metal contacts for each of the conductivity type regions required by the UVLED. Line 1520 represents the mid-point work function energy with respect to the high 1525 and low 1515 limits depicted in FIG. 55.

In some embodiments, Ni, Os, Se, Pt, Pd, Jr, Au, W and alloys thereof are used for the p-type regions, and low work-function metals selected from Ba, Na, Cs, Nd and alloys thereof can be used. Other selections are also possible. For example, in some cases, Al, Ti, Ti—Al alloys, and titanium nitride (TiN) being common metals can also be used as contacts to an n-type epitaxial oxide layer.

Intermediary contact materials such as semi-metallic palladium oxide PdO, degenerately doped Si or Ge and rare-earth nitrides can be used. In some embodiments, ohmic contacts are formed in-situ to the deposition process for at least a portion of the contact materials to preserve the [metal contact/metal oxide] interface quality. In fact, single crystal metal deposition is possible for some metal oxide configurations.

Figure 56:
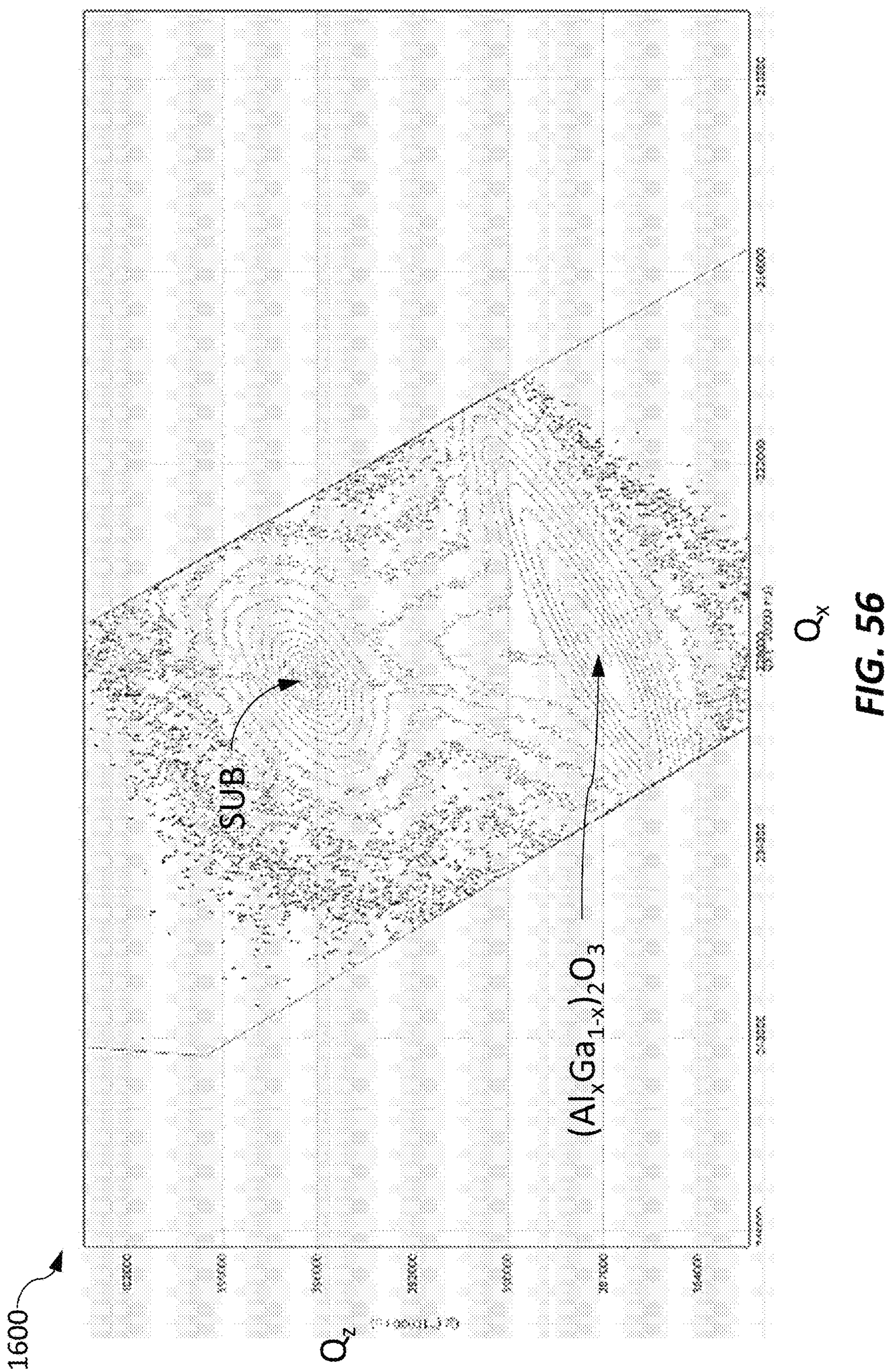
FIG. 56 is a reciprocal lattice map 2-axis x-ray diffraction pattern for pseudomorphic ternary $(Al_{0.5}Ga_{0.5})_2O_3$ on an A-plane $Al_2O_3$ substrate in accordance with an illustrative embodiment of the present disclosure.
Figure 57:
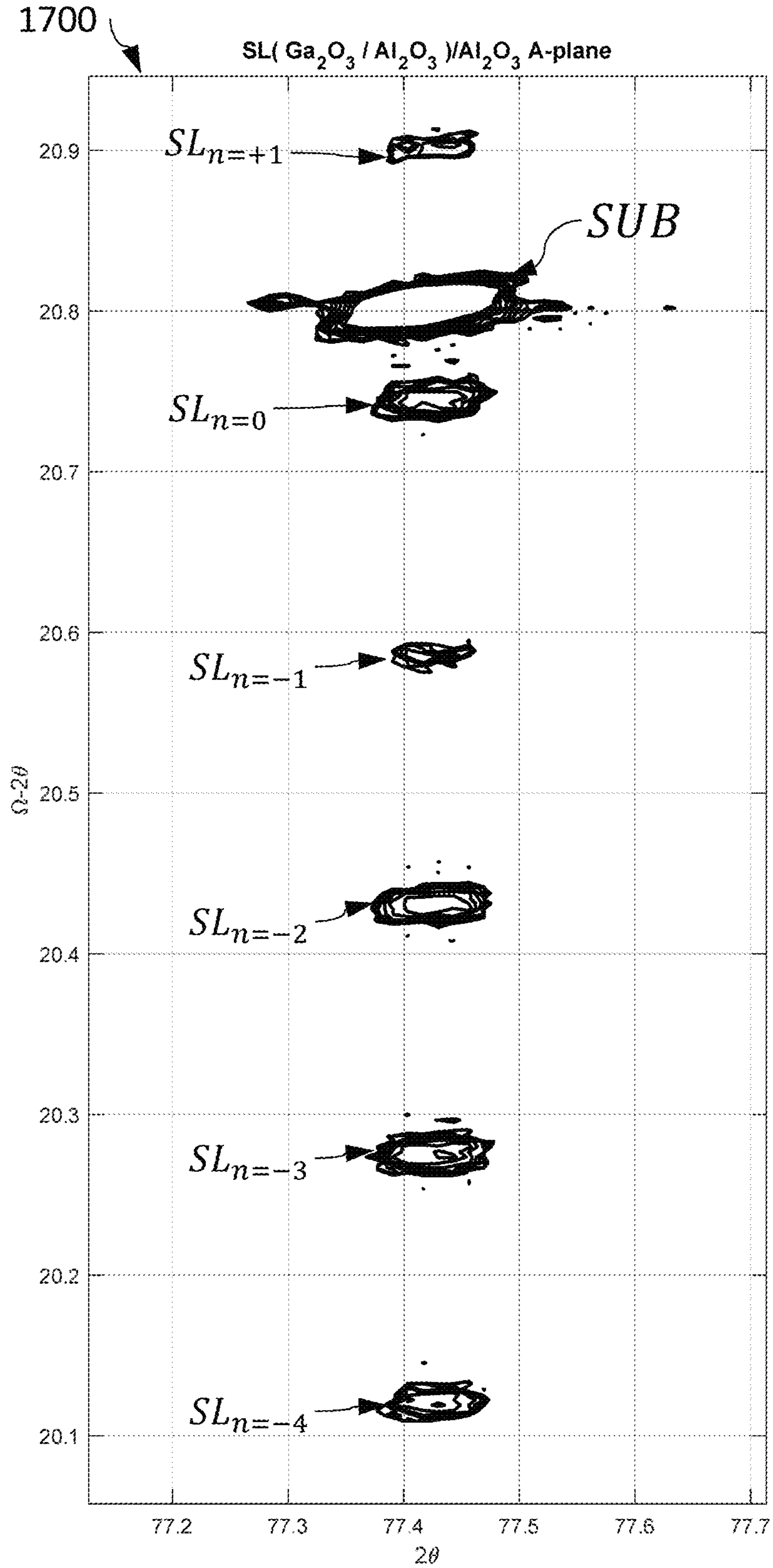
FIG. 57 is a 2-axis x-ray diffraction pattern of a pseudomorphic 10 period $SL[Al_2O_3/Ga_2O_3]$ on an A-plane $Al_2O_3$ substrate showing in-plane lattice matching throughout the structure in accordance with an illustrative embodiment of the present disclosure.

X-ray diffraction (XRD) is one of the most powerful tools available to crystal growth analysis to directly ascertain crystallographic quality and crystal symmetry type. FIGS. 56 and 57 show the two-dimensional XRD data of example materials of ternary $AlGaO_3$ and a binary $Al_2O_3/Ga_2O_3$ superlattice. Both structures are deposited pseudomorphically on corundum crystal symmetry substrates having an A-plane oriented surface.

Referring now to FIG. 56, there is shown a reciprocal lattice map 2-axis x-ray diffraction pattern 1600 for a 201 nm thick epitaxial ternary $(Al_{0.5}Ga_{0.5})_2O_3$ on an A-plane $Al_2O_3$ substrate. Clearly, the in-plane and perpendicular mismatch of the ternary film is well matched to the underlying substrate. The in-plane mismatch parallel to the plane of growth is ~4088 ppm, and the perpendicular lattice mismatch of the film is ~23440 ppm. The relatively vertical displacement of the ternary layer peak $(Al_xGa_{1-x})_2O_3$ with respect to the substrate (SUB) shows excellent film growth compatibility and is directly advantageous for UVLED application.

Referring now to FIG. 57, there is shown a 2-axis x-ray diffraction pattern 1700 of a 10 period $SL[Al_2O_3/Ga_2O_3]$ on an A-plane $Al_2O_3$ substrate showing excellent strained $Ga_2O_3$ layers (no spread in 2theta angle)=>elastically strained SL. The SL period=18.5 nm and an effective SL digital Al % ternary alloy, x_Al~18% .

In further illustrative embodiments, an optoelectronic semiconductor device in accordance with the present disclosure may be implemented as an ultraviolet laser device (UVLAS) based upon metal oxide semiconducting materials.

The metal oxide compositions having bandgap energy commensurate with operation in the UVC (150-280 nm) and far/vacuum UV wavelengths (120-200 nm) have the general distinguishing feature of having intrinsically small optical refractive index far from the fundamental band edge absorption. For operation as optoelectronic devices with energy states in the immediate vicinity of the conduction and valence band edges the effective refractive index is governed by the Krammers-Kronig relations.

FIGS. 58A-58B show a section of a metal-oxide semiconductor material 1820 having optical length 1850 along a one-dimensional optical axis in accordance with an illustrative embodiment of the present disclosure. An incident light vector 1805 enters the material 1820 from air having refractive index $n_{MOx}$. The light within the material 1820 is transmitted and reflected (beams 1810) at the refractive index discontinuities at each surface with a transmitted optical beam 1815.

The material slab of length 1850 can support a number of optical longitudinal modes 1825 as shown in FIG. 58A. The transmission 1815 as a function of the optical wavelength incident upon the slab shows a Fabry-Perot mode structure having modes 1825. For a photon trapped within the optical cavity defined by the one-dimensional slab it is possible in accordance with the present disclosure to determine the roundtrip losses of the slab and the required minimum optical gain required to overcome these losses and enable a net gain.

The threshold gain is calculated in FIG. 58B showing the transmission factor β as a function of optical gain within the slab for the forward 1830 and reverse 1835 propagating light beams 1810. For this simple Fabry-Perot case the low refractive index $n_{MOx}$=2.5 of slab length $L_{cav}$=1micrometer requires a threshold gain 1845 calculated by the full-width-half max point of the peak gain at 1840.

Some embodiments implement semiconductor cavities contained with a vertical-type structure 110 (e.g., see FIG. 2A) with sub-micron length scales. This is because of the desire to localize the electron and hole recombination into a narrow region. Confining the physical thickness of the slab, where the carrier recombination occurs and light emission is generated, aids in reducing the threshold current density required to achieve lasing. It is therefore instructive to understand the required threshold gain by reducing the gain slab length.

FIGS. 59A-59B show the same optical material as FIGS. 58A-58B, but for the case of $L_{cav}$=500 nm. The smaller cavity length 1860 compared to length 1850 results in fewer allowed optical modes 1870. The required threshold gain required to overcome cavity losses is increased to 1865 compared to the gain 1845 of FIG. 58A, referring to the peaks 1877 calculated for forward and reverse propagating modes 1880 and 1885, respectively, shown in FIG. 59B.

The increase in required threshold gain for a slab of metal oxide material can be reduced dramatically by increasing the slab length of the optical gain medium—in this case the metal-oxide semiconducting region responsible for the optical emission process.

Referring again to FIGS. 2A and 2B, instead of using vertical type 110 emission devices (i.e., FIG. 2A), some embodiments utilize planar waveguide structures where the optical mode overlaps an optical gain layer along the plane parallel length. That is, even though the gain material is still a thin slab the optical propagation vector is substantially parallel to the plane of the gain slab.

Figure 74:
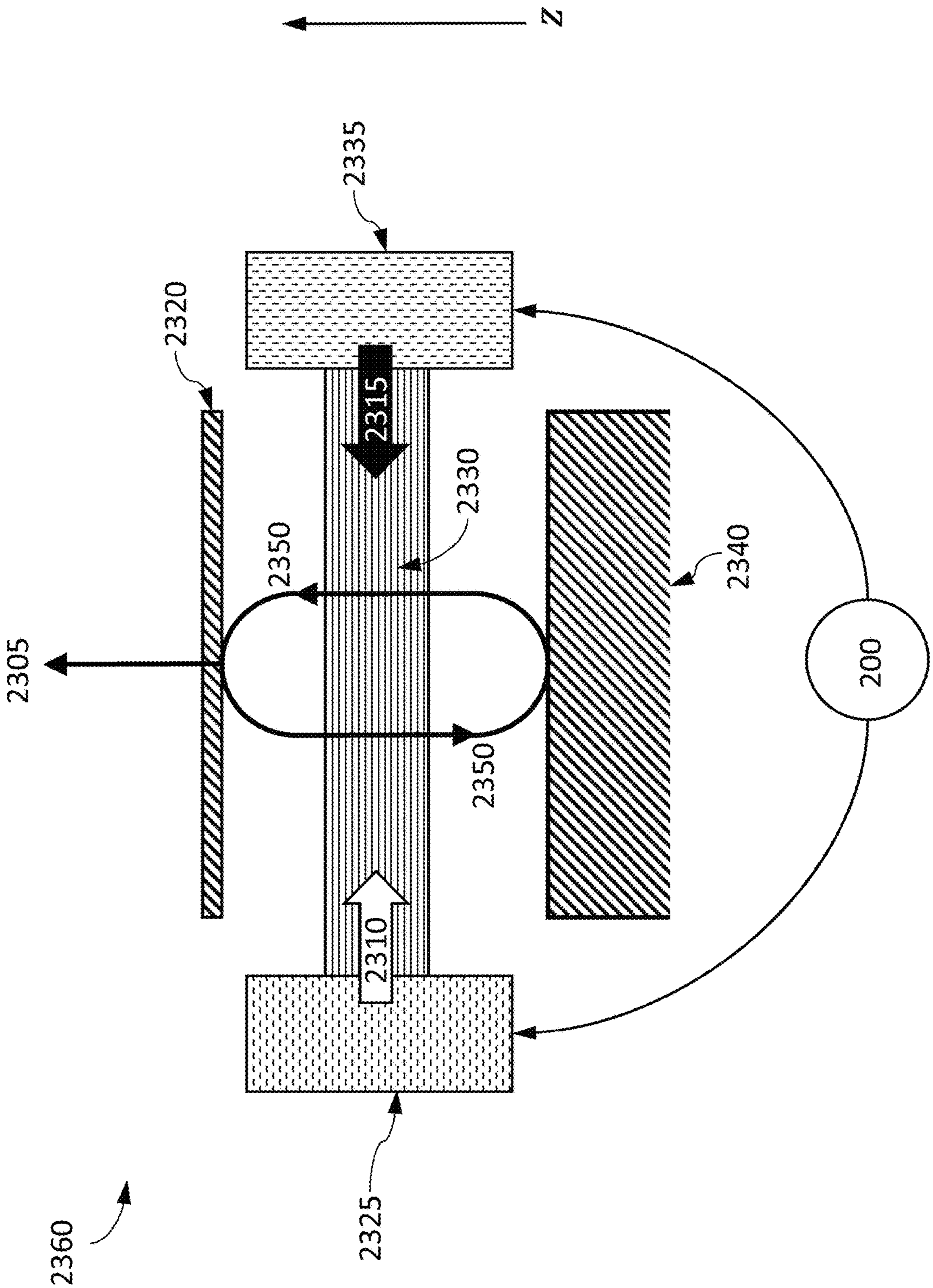
FIG. 74 shows a vertical type ultraviolet laser structure in accordance with an illustrative embodiment of the present disclosure where the reflectors forming the optical cavity are decoupled from the electrical circuit.

This is shown schematically for structure 140 FIG. 2B and structure 2360 in FIG. 74. Waveguide structures having optical gain region layer thicknesses well below 500 nm are possible and can even be as thin as 1 nanometer supporting a quantum well (refer to FIGS. 64 to 68). The longitudinal length of the waveguide can then be of the order of several microns to even a few millimeters or even a centimeter. This is an advantage of the waveguide structure. An added requirement is the ability to confine and guide optical modes along the major axis length of the waveguide, which can be achieved by use of suitable refractive index discontinuities. Optical modes prefer to be guided in a higher refractive index medium compared to the surrounding non-absorptive cladding regions. This can be achieved using metal-oxide compositions as set out in the present disclosure which can be preselected to exhibit advantageous E-k band structure.

A UVLAS requires, in the most fundamental configuration, at least one optical gain medium and an optical cavity for recycling generated photons. The optical cavity must also present a high reflector (HR) with low loss and an output coupling reflector (OC) that can transmit a portion of the optical energy generated with in the gain medium. The HR and OC reflectors are in general plane parallel or enable focusing of the energy within the cavity into the gain medium.

Figure 60:
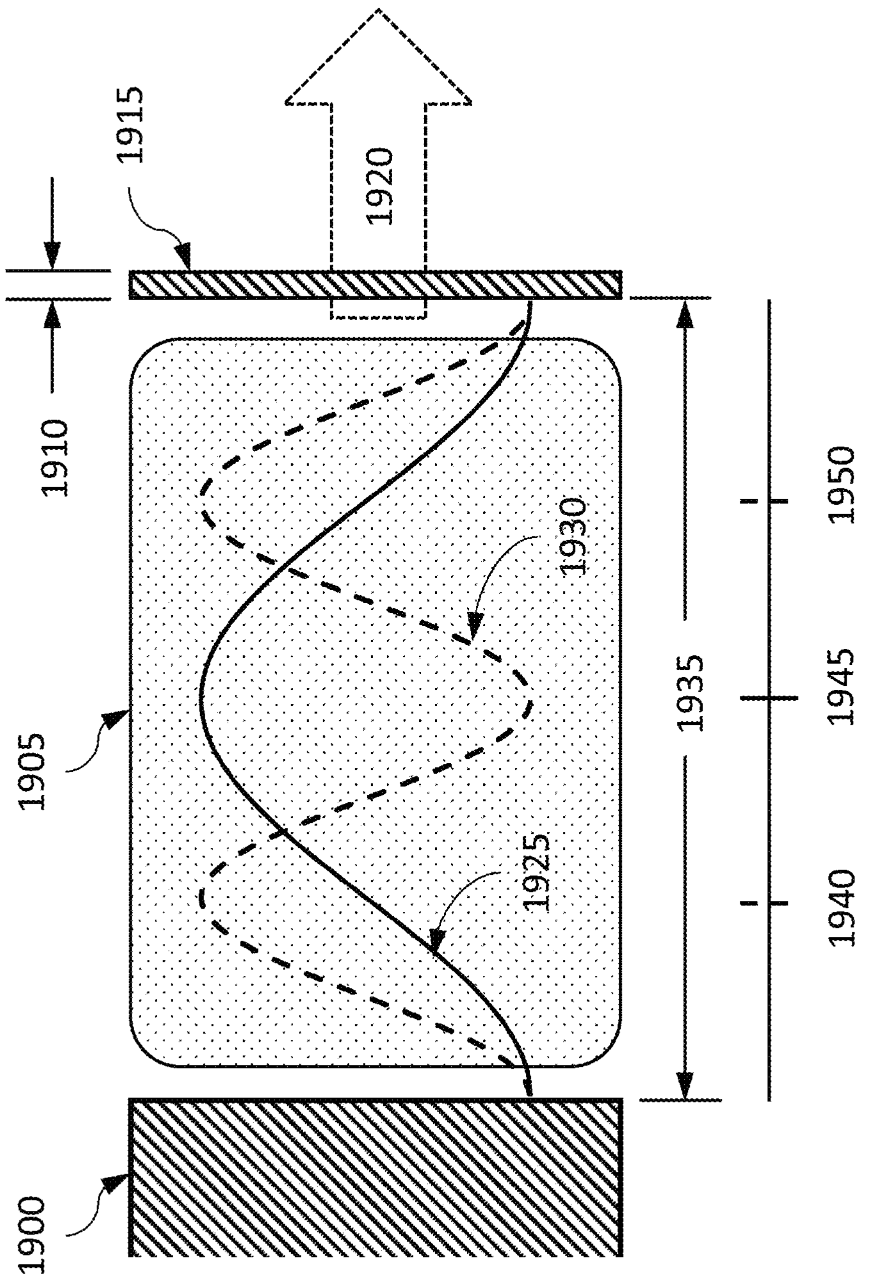
FIG. 60 shows an optical cavity formed using an optical gain medium embedded between two optical reflectors in accordance with an illustrative embodiment of the present disclosure.

FIG. 60 shows schematically an embodiment of an optical cavity having HR 1900, gain medium 1905 substantially filling the cavity of length 1935, and an OC 1915 having physical thickness 1910. The standing waves 1925 and 1930 show two distinct optical wavelength optical fields that are matched to the cavity length. The outcoupled light 1920 is due to the OC leaking a portion of the trapped energy within the cavity gain medium 1905. In one example, Aluminum metal of low thickness <15 nm is utilized in the far or vacuum UV wavelength regions and the transmission can be tuned accurately by the Al-film thickness 1910. The lowest energy standing wave 1925 has a node (peak intensity of the optical field) at the center node 1945 of the cavity. The $1^{st}$ harmonic (standing wave 1930) exhibits to nodes 1940 and 1950, as shown.

Figure 61:
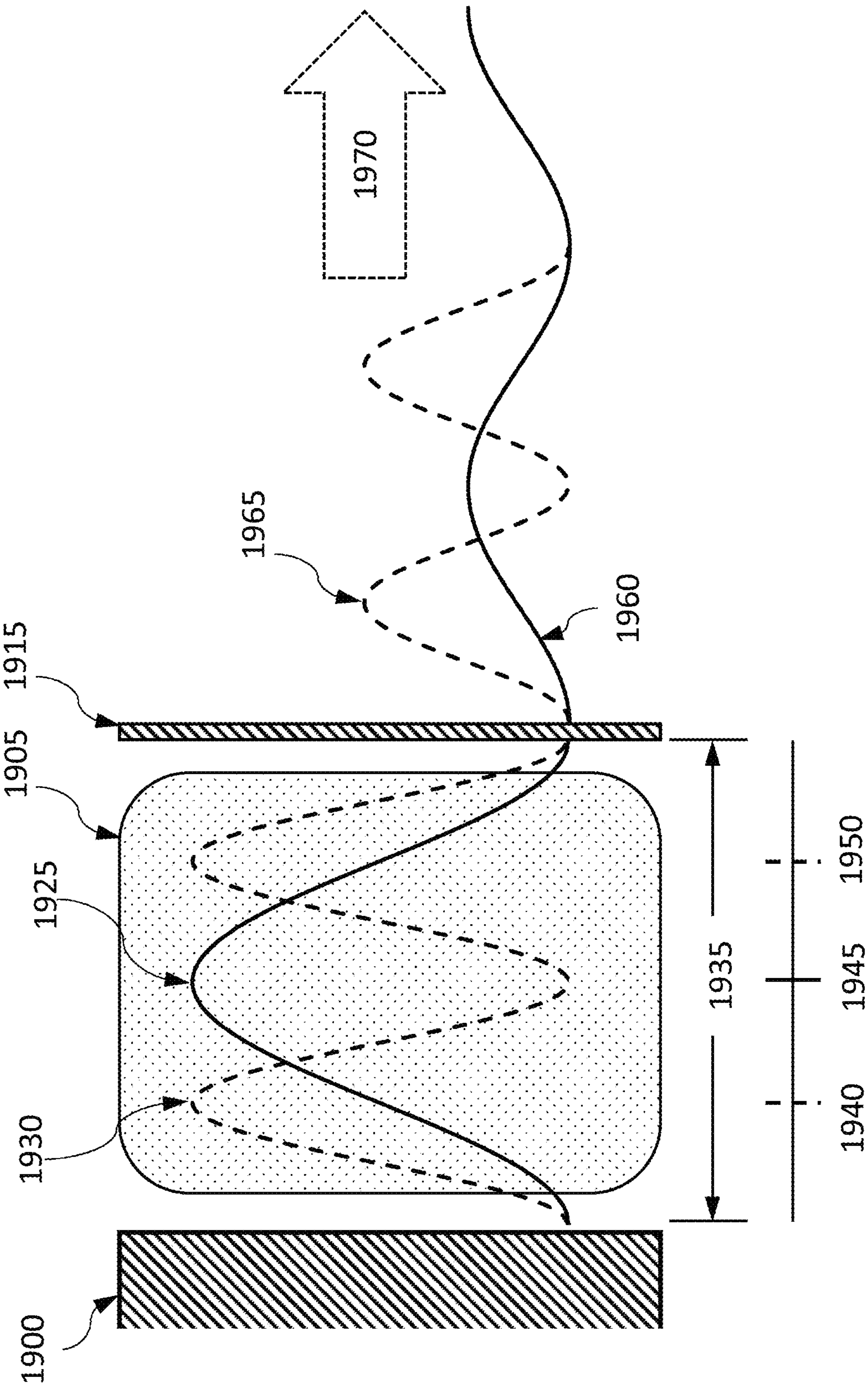
FIG. 61 shows an optical cavity formed using an optical gain medium embedded between two optical reflectors in accordance with an illustrative embodiment of the present disclosure, illustrating that two optical wavelengths can be supported by the gain medium and cavity length.

FIG. 61 shows output wavelengths 1960 and 1965 from the cavity with energy flow 1970. The cavity length 1935 is the same as in FIG. 60. FIG. 61 shows that the cavity length 1935 can support two optical modes forming standing waves 1930 and 1925 of two different wavelengths. FIG. 61 shows the emission or outcoupling of both wavelength modes (standing waves 1930 and 1925) as wavelengths 1965 and 1960, respectively. That is, both modes propagate. Optical gain medium 1905 substantially fills the optical cavity length 1935. Only the peak optical field intensity nodes 1940, 1945 and 1950 couples to the spatial portions of the gain medium 1905. It is therefore possible in accordance with the present disclosure to configure the gain medium within the optical cavity as shown in FIG. 62.

Figure 62:
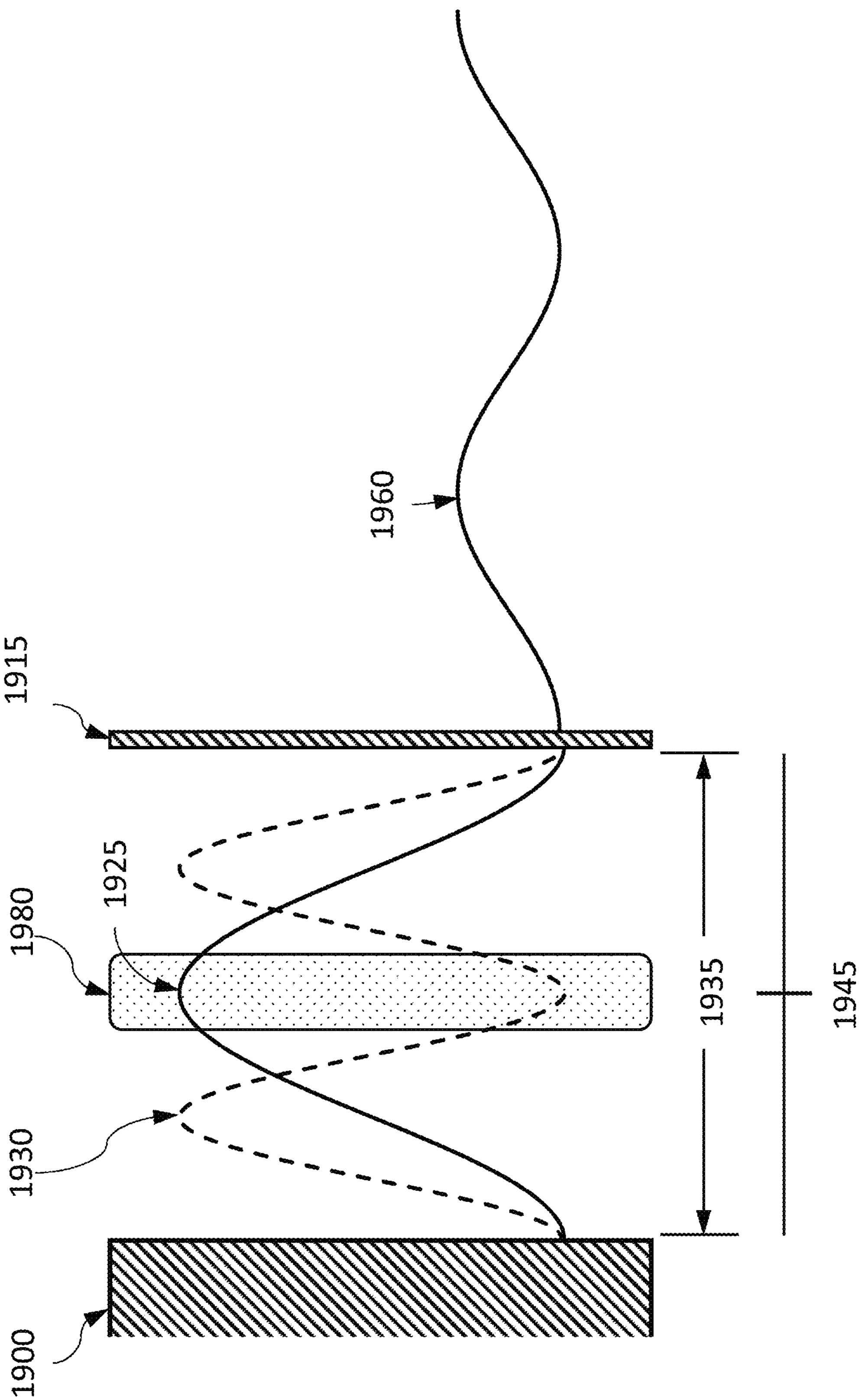
FIG. 62 shows an optical cavity formed using an optical gain medium of finite thickness embedded between two optical reflectors and positioned at the peak electric field intensity of a fundamental wavelength mode in accordance with an illustrative embodiment of the present disclosure, showing that only one optical wavelength can be supported by the gain medium and cavity length.

FIG. 62 shows a spatially selective gain medium 1980 which is contracted in length compared to optical gain medium 1905 of FIGS. 60-61 and is positioned advantageously within cavity length 1935 to amplify only the mode 1925. That is, optical gain medium 1980 favors the outcoupling of wavelength 1960 as the optical mode. The cavity thus preferentially provides gain to the fundamental mode 1925 with output energy selected as wavelength 1960.

Figure 63:
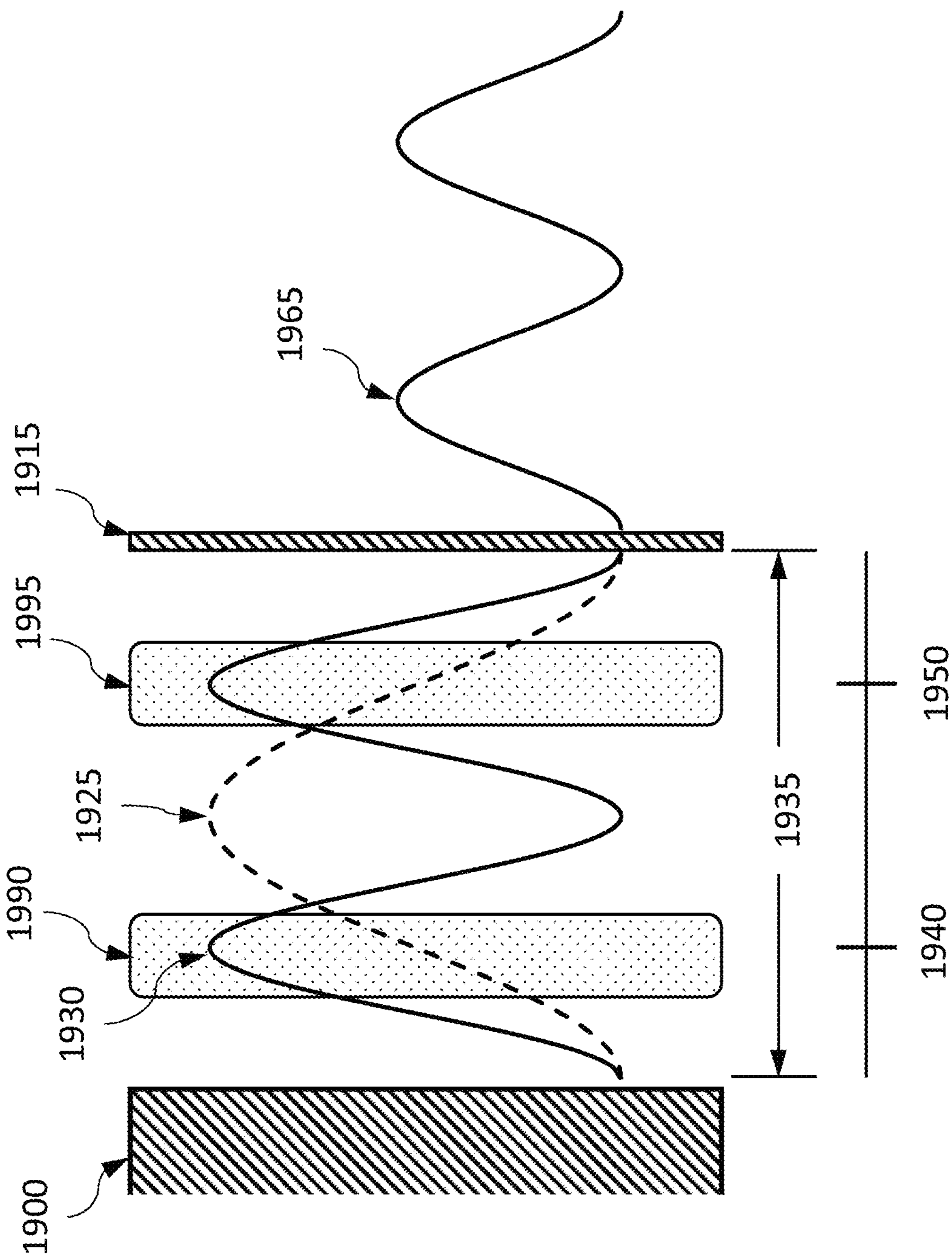
FIG. 63 shows an optical cavity formed using two optical gain media of finite thickness embedded between two optical reflectors in accordance with an illustrative embodiment that is positioned at the peak electric field intensity of a shorter wavelength mode, illustrating that only one optical wavelength can be supported by the gain medium and cavity length.

Similarly, FIG. 63 shows two spatially selective gain media 1990 and 1995 positioned advantageously to amplify only the mode of standing wave 1930. The cavity preferentially provides gain to the mode of standing wave 1930 with output energy selected as 1965.

This method involving spatially positioning the gain regions within the optical cavity is one example embodiment of the present disclosure. This can be achieved by predetermining the functional regions as a function of the growth direction during film formation process as described herein. A spacer layer between the gain sections can comprise substantially non-absorbing metal-oxide compositions and otherwise provide electronic carrier transport functions, and aid in the optical cavity tuning design.

Attention is now directed towards the optical gain medium design for application to UVLAS using metal-oxide compositions set out in the present disclosure.

FIGS. 64A-64B and 65A-65B disclose bandgap engineered quantum confinement structures of a single quantum well (QW). It is to be understood a plurality of QWs is possible, as is a superlattice. The wide bandgap electronic barrier cladding layers are selected from metal-oxide material composition $A_xB_yO_z$ and the potential well material is selected as $C_pD_qO_r$. Metal cations A, B, C and D are selected from the compositions set out in the present disclosure ($0 \le x, y, z, p, q, r \le 1$).

Predetermined selection of materials can achieve the conduction and valence band offsets as shown in FIGS. 64A and 64B. The case of A=Al, B=Ga to form $(Al_{0.95}B_{0.05})_2O_3=Al_{1.9}Ga_{0.1}O_3$ and C=Al, D=Ga to form $(Al_{0.05}B_{0.95})_2O_3=Al_{0.1}Ga_{1.9}O_3$ is shown. The conduction 2005 and valence 2010 band spatial profile along a growth direction, z is shown using the k=0 representation of the respective E-k curves for each material.

FIG. 64A shows the QW having thickness 2015 of $L_{QW}$=5 nm generating quantized energy states 2025 and 2035 for the allowed states of the electrons and holes in the conduction and valence bands, respectively. The lowest lying quantized electron state 2020 and highest quantized valence state 2030 participate in the spatial recombination process to create a photon of energy equal to 2040.

Similarly, FIG. 64B shows the QW having thickness 2050 of $L_{QW}$=2 nm generating quantized energy states within the potential well for the allowed states of the electrons and holes in the conduction and valence bands, respectively. The lowest lying quantized electron state 2055 and highest quantized valence state 2060 participate in the spatial recombination process to create a photon of energy equal to 2065.

Figures 65A, 65B:
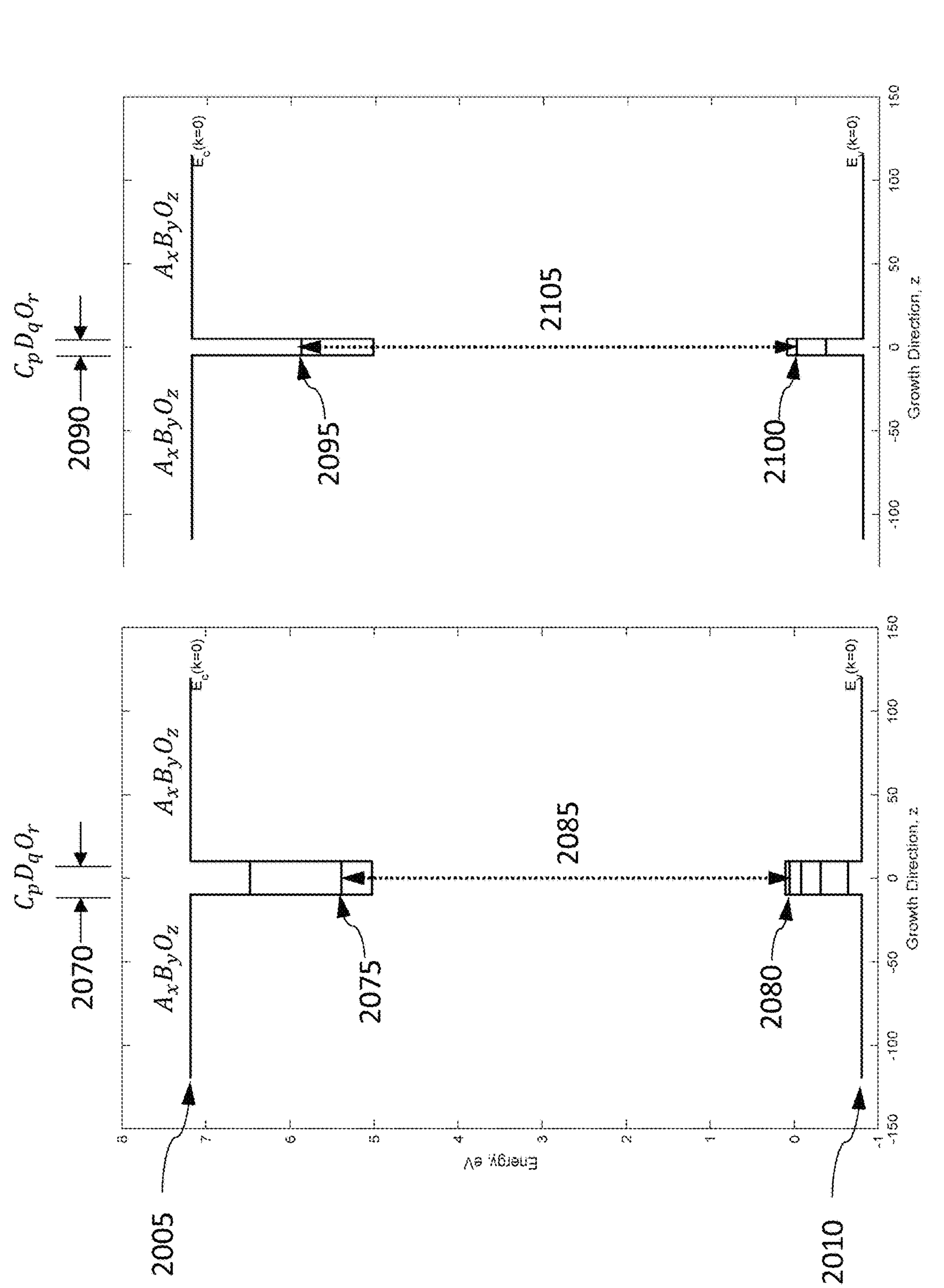
FIGS. 65A and 65B show single quantum well structures comprising metal-oxide ternary materials with quantized electron and hole states in accordance with an illustrative embodiment of the present disclosure depicting two different quantum well thicknesses.

Reducing the QW thickness yet further results in the spatial band structures of FIGS. 65A and 65B. FIG. 65A shows the QW having thickness 2070 of $L_{QW}$=1.5 nm generating quantized energy states within the potential well for the allowed states of the electrons and holes in the conduction 2005 and valence 2010 bands, respectively. The lowest lying quantized electron state 2075 and highest quantized valence state 2080 participate in the spatial recombination process to create a photon of energy equal to 2085.

FIG. 65B shows the QW having thickness 2090 of $L_{QW}$=1.0 nm generating quantized energy states within the potential well for the allowed states of the electrons and holes in the conduction and valence bands, respectively. The QW can only support a single quantized electron state 2095 which participates with the highest quantized valence state 2100 in the spatial recombination process to create a photon of energy equal to 2105.

Figure 66:
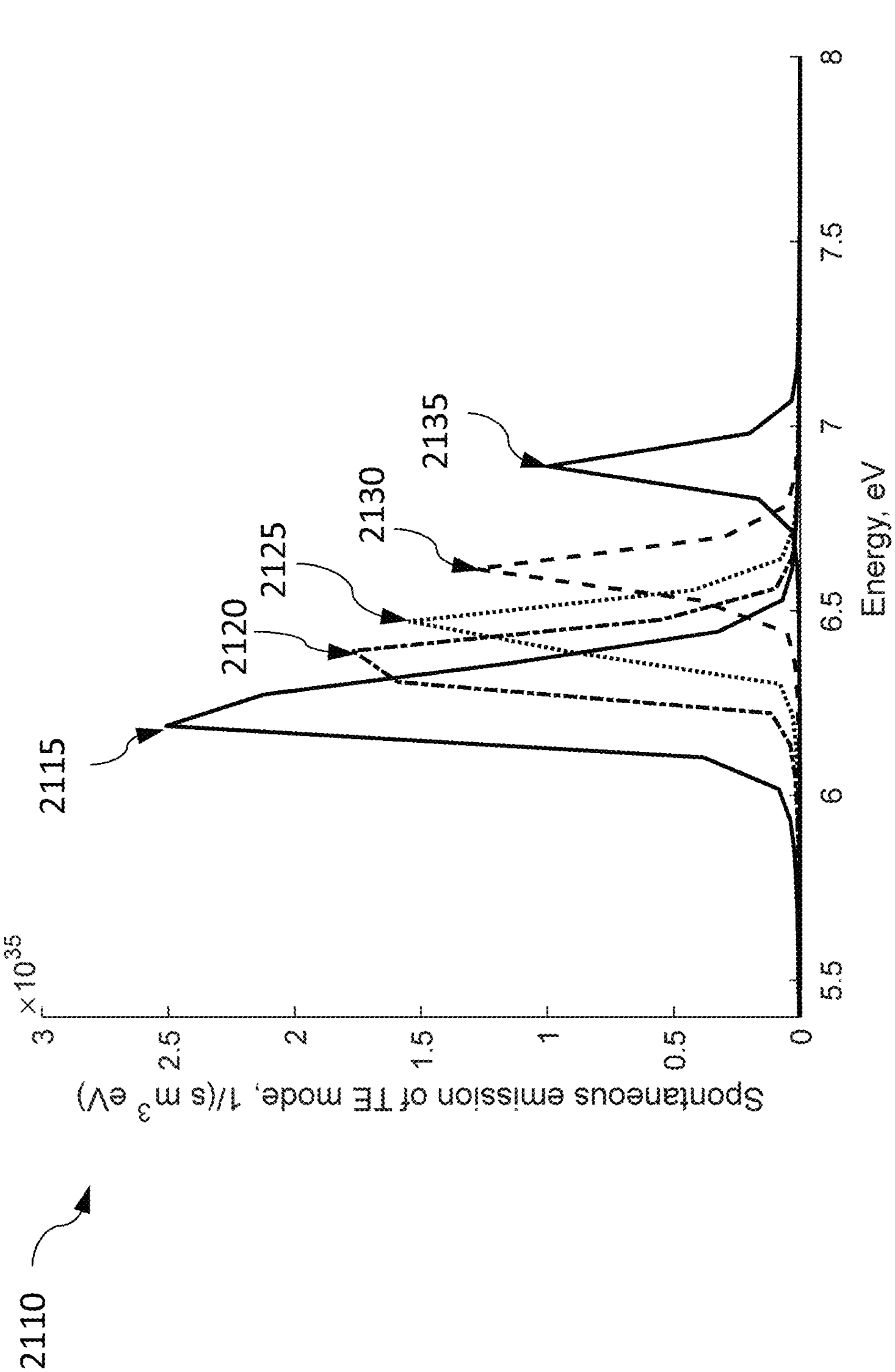
FIG. 66 shows spontaneous emission spectra from the quantum well structures disclosed in FIGS. 64A, 64B, 65A and 65B.

The spontaneous emission due to the spatial recombination of the quantized electron and hole states for the QW structures of FIGS. 64A, 64B, 65A and 65B are shown in FIG. 66. The annihilation of the electron and hole pair creates energetic photons of wavelengths peaked at 2115, 2120, 2125, 2130 and 2135 for the cases of $L_{QW}$=5.0, 2.5, 2.0, 1.5 and 1 nm, respectively. Evident from the emission spectra of 2110 is the excellent tunability of the operating wavelength possible for the gain medium by virtue of using the same barrier and well compositions but controlling $L_{QW}$.

Figures 67A, 67B:
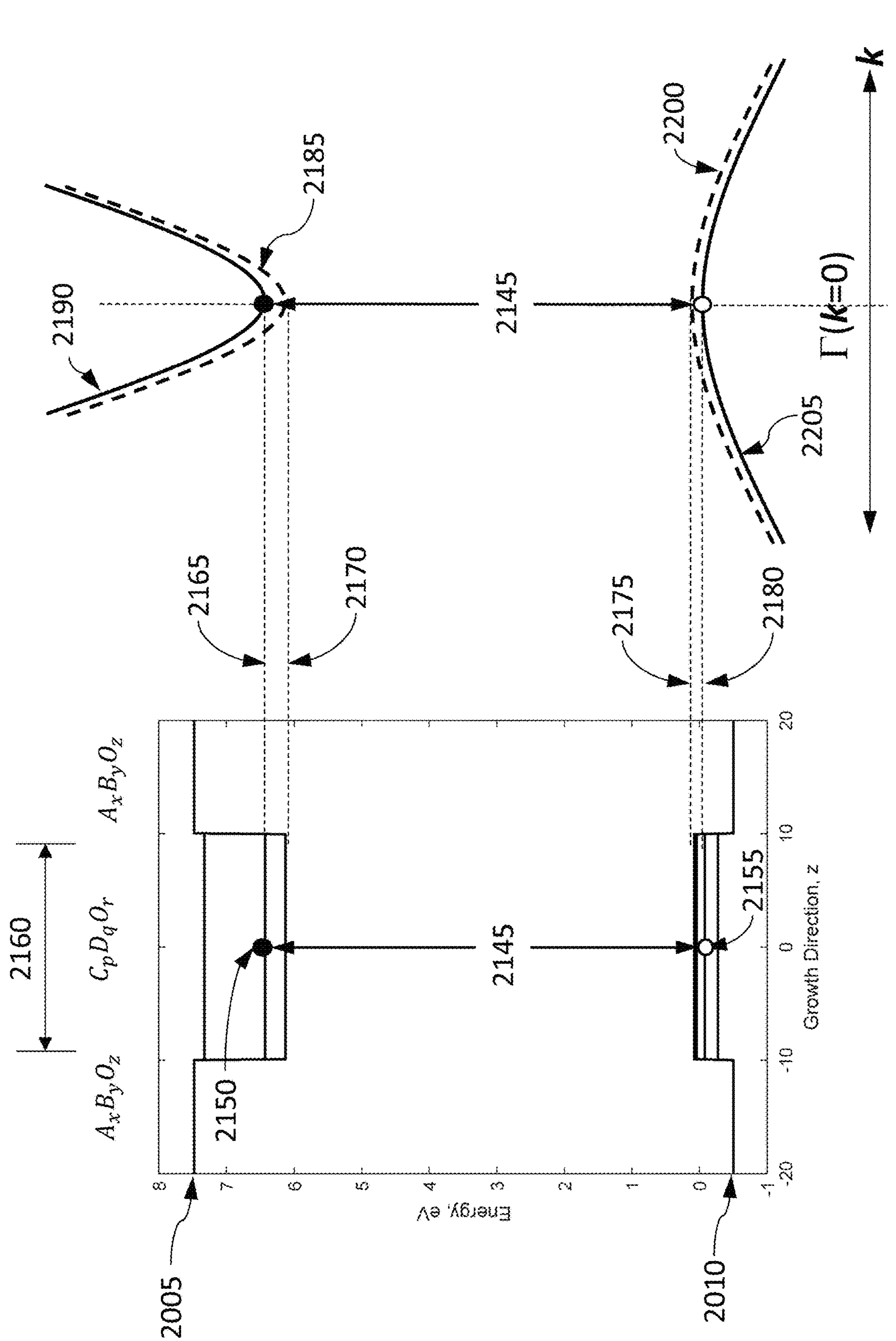
FIG. 67A and FIG. 67B show a spatial energy band structure of a metal oxide quantum well and the associated energy-crystal momentum band structure in accordance with an illustrative embodiment of the present disclosure.

Having fully described the utility of configuring metal-oxide compositions for direct application to UVLAS gain media, refer now to FIGS. 67A and 67B which describe in further detail the electronic configuration of the gain medium. FIG. 67A shows again a QW configured using metal-oxide layers to form an example QW structure as described previously.

The QW thickness 2160 is tuned to achieve recombination energy 2145. The k=0 representation of the QW in FIG. 67A is representative of the non-zero crystal wave vector dispersion of the quantized energy states 2165 and 2180 for the electron (conduction band 2190) and hole (valence band 2205) states. For completeness, the underlying bulk E-k dispersion are also shown as 2170 and 2175 at k=0 and 2185 and 2200 for non-zero k. The schematic E-k diagram is critical for describing the population inversion mechanism for creating excess electrons and holes in the conduction and valence band necessary for providing optical gain.

Figure 68B:
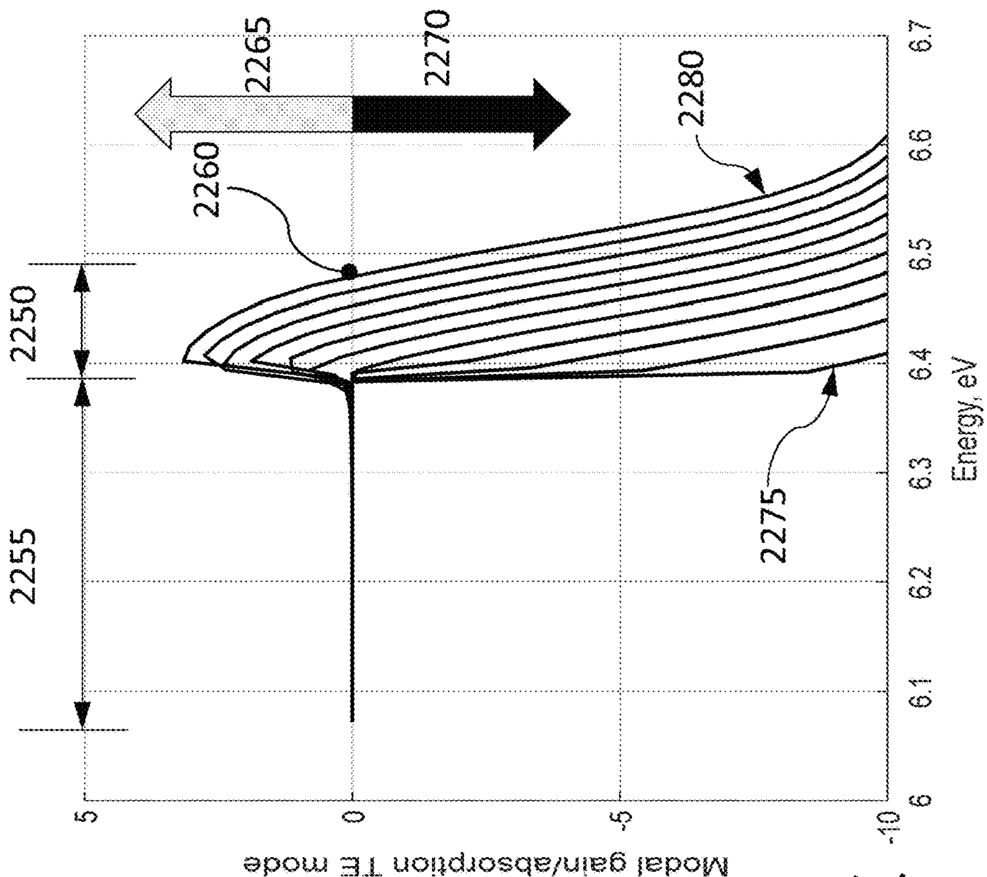
FIGS. 68A and 68B show a population inversion mechanism for the electrons and holes in a quantum well band structure and the resulting gain spectrum for the quantum well.
Figure 68A:
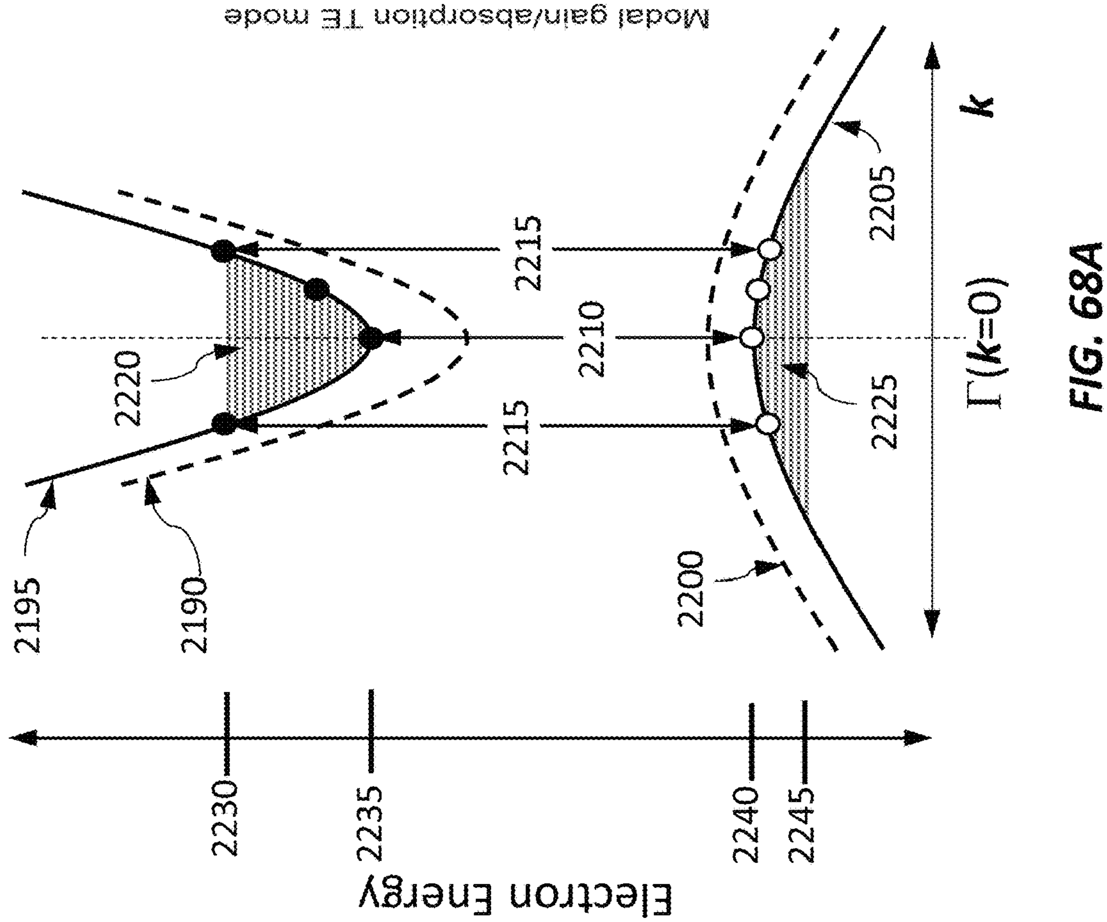

The band structure shown in FIG. 68A describes the electronic energy configuration states when the conduction band quasi-Fermi energy level 2230 is positioned such that it is above the electronic quantized energy state 2235. Similarly, the valence band quasi-Fermi energy is selected to penetrate the valence band level 2245 creating an excess hole density 2225. The E-k curve of conduction band 2195 shows that electron states 2220 are filled with electrons having non-zero crystal momentum states |k|>0 being possible. Valence band level 2240 is the valence band edge of the bulk material used in the narrow bandgap region of the MQW. When the narrow bandgap material is confined in the MQW, the energy states are quantized, creating the band structure dispersion for conduction band 2195 and valence band 2205. Valence band level 2240 is then the valence band maximum of the MQW region. Valence band level 2245 represents the Fermi energy level of the valence band when configured as a p-type material. This makes excess hole density 2225 region filled with holes that can participate in optical gain.

Optical recombination process can occur for 'vertical transitions' wherein the change in crystal momentum between the electron and holes state is identically zero. The allowed vertical transitions are shown as 2210 at k=0 and 2215 k≠0. Calculation of the integrated gain spectrum for the representative band structure of FIG. 68A is shown in FIG. 68B. Specific input parameters for the gain spectra are $L_{Qw}$=2 nm, an electron to hole concentration ratio of 1.0, a carrier relaxation time of τ=1 ns and an operating temperature of T=300 K. Curves 2275 to 2280 show an increase in the electron concentration Ne where $0 \le N_e \le 5\times10^{24}$ $m^{-3}$.

Net positive gain 2250 is achievable under high electron concentrations with threshold $N_e \sim 4\times10^{24}$ $m^{-3}$. These parameters are of the order achievable by other technologically mature semiconductors such as GaAs and GaN. In some embodiments, the metal oxide semiconductor by virtue of having an intrinsically high bandgap will also be less susceptible to gain reduction with operating temperature. This is evidenced by conventional optically pumped high power solid-state Ti-doped $Al_2O_3$ laser crystals.

FIG. 68B shows the net gain 2265 and net absorption 2270 as a function of $N_e$. The range of crystal wave vectors which can contribute to vertical transitions determines the width of the net gain region 2250. This is fundamentally determined by the achievable excess electron 2220 and hole 2225 states possible by manipulating the quasi-Fermi energies.

The region 2255 is below the fundamental bandgaps of the host QW and is therefore non absorbing. Optical modulators are therefore also possible using metal-oxide semiconductor QWs. Of note is the point of induced transparency 2260 where the QW achieves zero loss.

Figure 69B:
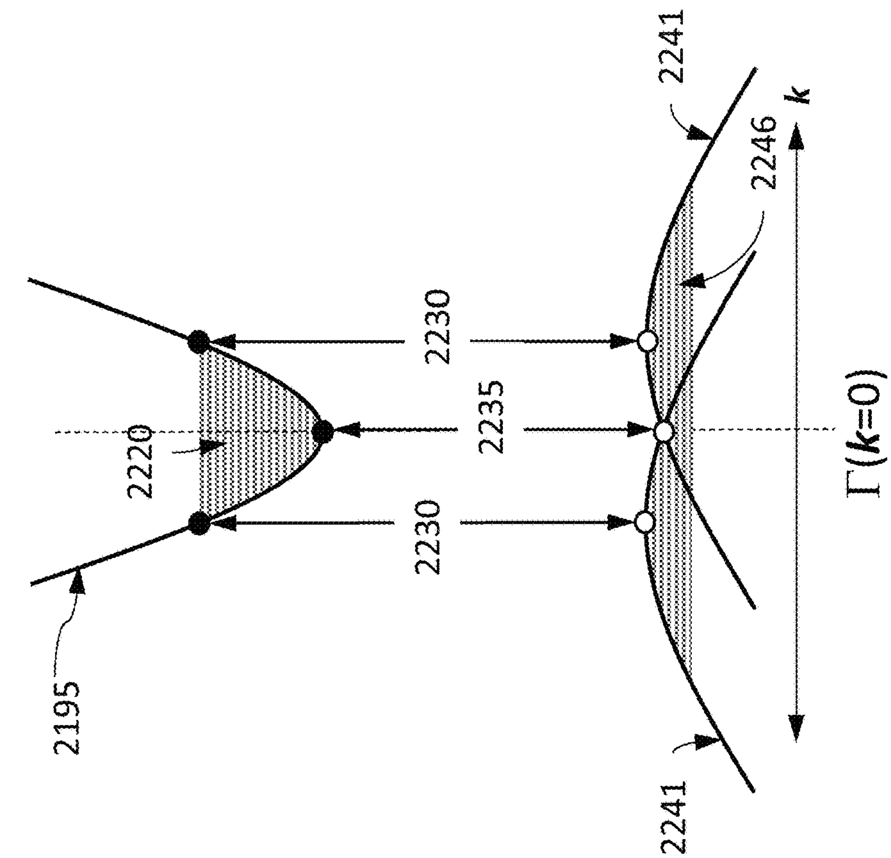
FIGS. 69A and 69B show electron and hole energy states for filled conduction and valence bands in the energy-momentum space for the case of a direct and pseudo-direct bandgap metal oxide structure in accordance with an illustrative embodiment of the present disclosure.
Figure 69A:
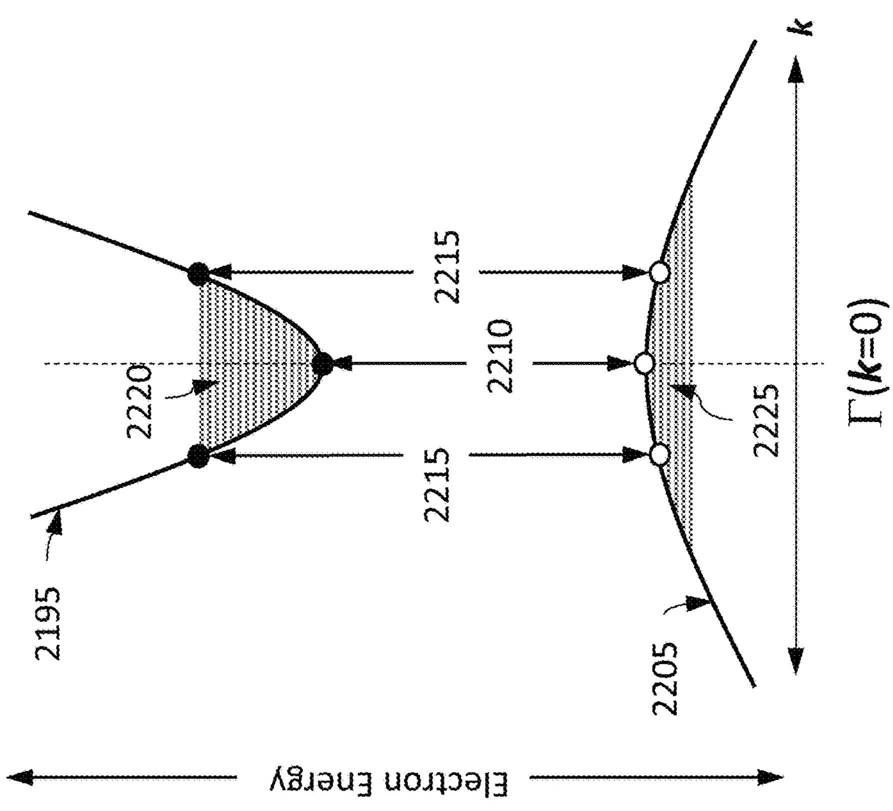

Manipulating the quasi-Fermi energy is not the only method available for creating excess electron and hole pairs in the vicinity of the zone-center band structure enabling optical emission. Consider FIGS. 69A and 69B showing the E-k band structures for the case of direct bandgap materials (FIG. 69A) and pseudo-direct bandgap materials, for example, metal-oxide SL with period selected to create valence maxima as shown in curves 2241 with hole states 2246 of FIG. 69B.

Assuming similar conduction band dispersions 2195, for both valence band types of 2205 and 2241, a configuration can be achieved wherein the same vertical transitions are possible. Substantially similar gain spectra as disclosed in FIG. 68B are possible for both types shown in FIGS. 69A and 69B.

Yet a further method is disclosed for an alternative method of creating electron and hole states suitable for creating optical emission and optical gain with metal-oxide semiconductor structures.

Figure 70B:
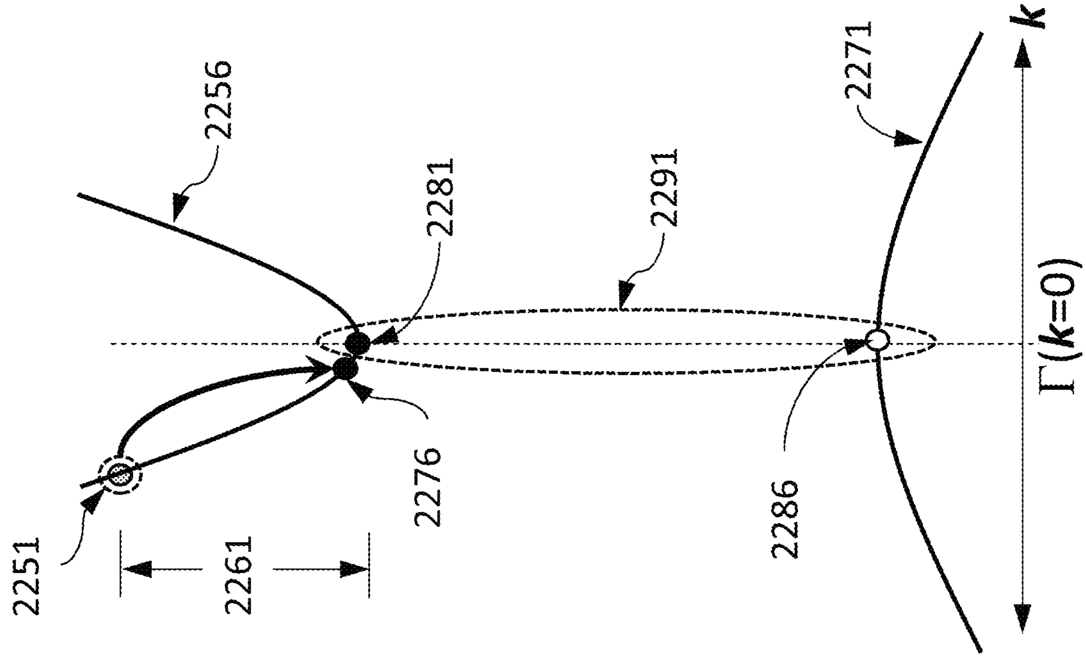
FIGS. 70A and 70B show an impact ionization process for metal oxide injected hot electrons resulting in pair production in accordance with an illustrative embodiment of the present disclosure.
Figure 70A:
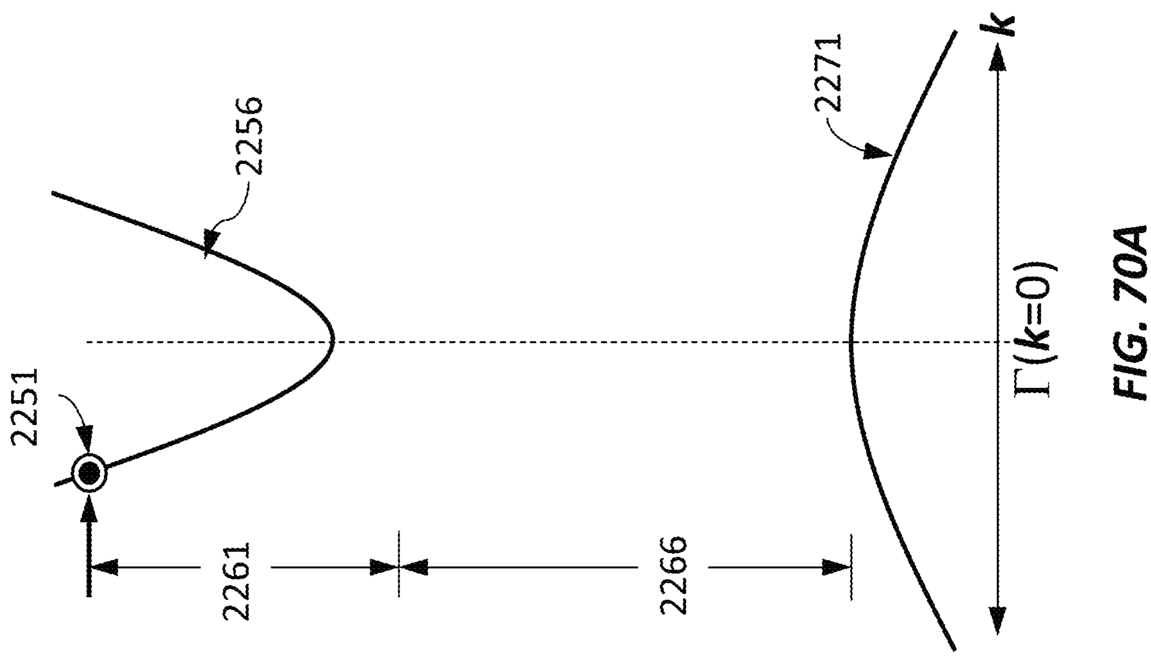

Consider FIGS. 70A and 70B, which show an impact ionization process with a metal-oxide semiconductor having a direct bandgap. While impact ionization is a known phenomenon and process in semiconductors, not so well known is the advantageous properties of extremely wide energy bandgap metal oxides. One of the most promising properties that has been found in accordance with the present disclosure is the exceedingly high dielectric breakdown strength of metal-oxides.

In prior art small bandgap semiconductors such as Si, GaAs and the like, impact ionization processes when leveraged in device functions tend to wear-out the materials by the creation of crystallographic defects/damage. This degrades the material over time and limits the number of breakdown events possible before catastrophic device failure.

Extreme wide bandgap gap metal oxides with Eg>5 eV possess advantageous properties for creating impact ionization light emission devices.

FIG. 70A shows a metal oxide direct bandgap of 2266 with a 'hot' (high energy) electron injected into the conduction band at electron state 2251 with excess kinetic energy 2261 with respect to the conduction band 2256 edge. Metal-oxides can easily withstand excessively high electrical fields placed across thin films ($V_{br}$>1 to 10 MV/cm).

Operating with a metal oxide slab biased at below and close to the breakdown voltage enables an impact ionization event as shown in FIG. 70B. The energetic electron 2251 interacts with the crystal symmetry of the host and can produce a lower energy state by coupling to the available thermalizing with lattice vibration quanta called phonons and pair production. That is, the impact ionization event comprising a hot electron 2251 is converted into two lower energy electron states 2276 and 2281 near the conduction band minimum as well as a new hole state 2286 created at the top of the valence band 2271. The electron-hole pair produced 2291 is a potential recombination pair to create a photon of energy 2266.

It has been found in accordance with the present disclosure that impact ionization pair production is possible for excess electron energy 2261 of about half the bandgap energy 2266. For example, if $E_G$=5 eV 2266 then hot electrons with respect to the conduction band edge of ~2.5 eV can initiate pair production process as described. This is achievable for $Al_2O_3/Ga_2O_3$ heterostructures wherein an electron from $Al_2O_3$ is injected into the $Ga_2O_3$ across the heterojunction. Impact ionization is a stochastic process and requires a minimum interaction length to create a finite energy distribution of electron-hole pairs. In general, 100 nm to 1 micron of interaction length is useful for creating significant pair production.

Figure 71A:
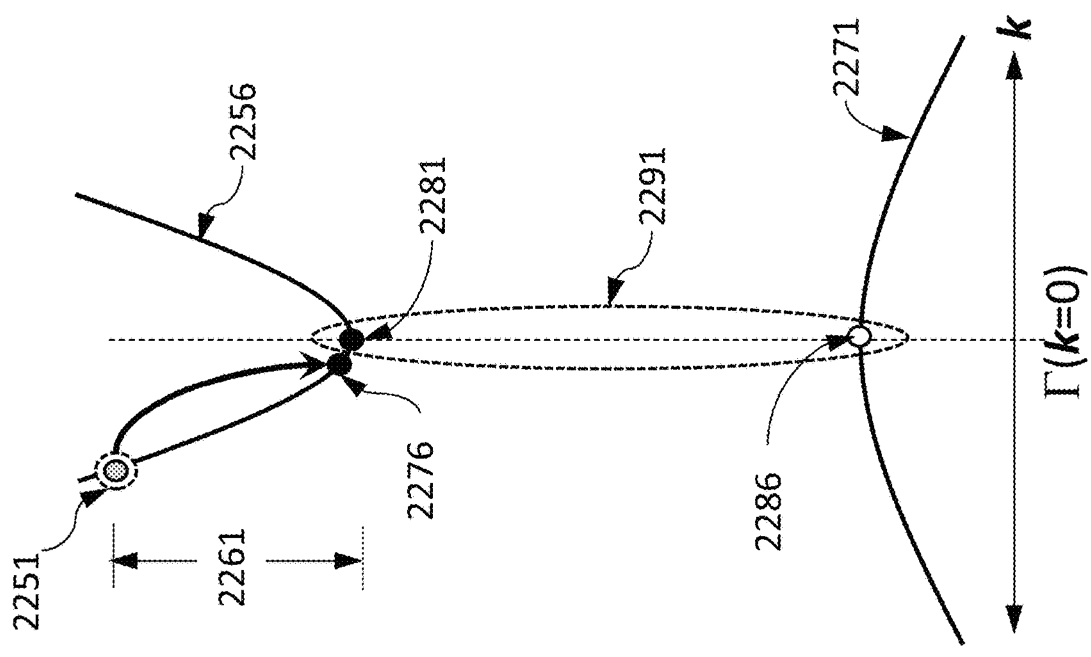
FIGS. 71A and 71B show an impact ionization process for metal oxide injected hot electrons resulting in pair production in accordance with another illustrative embodiment of the present disclosure.
Figure 71B:
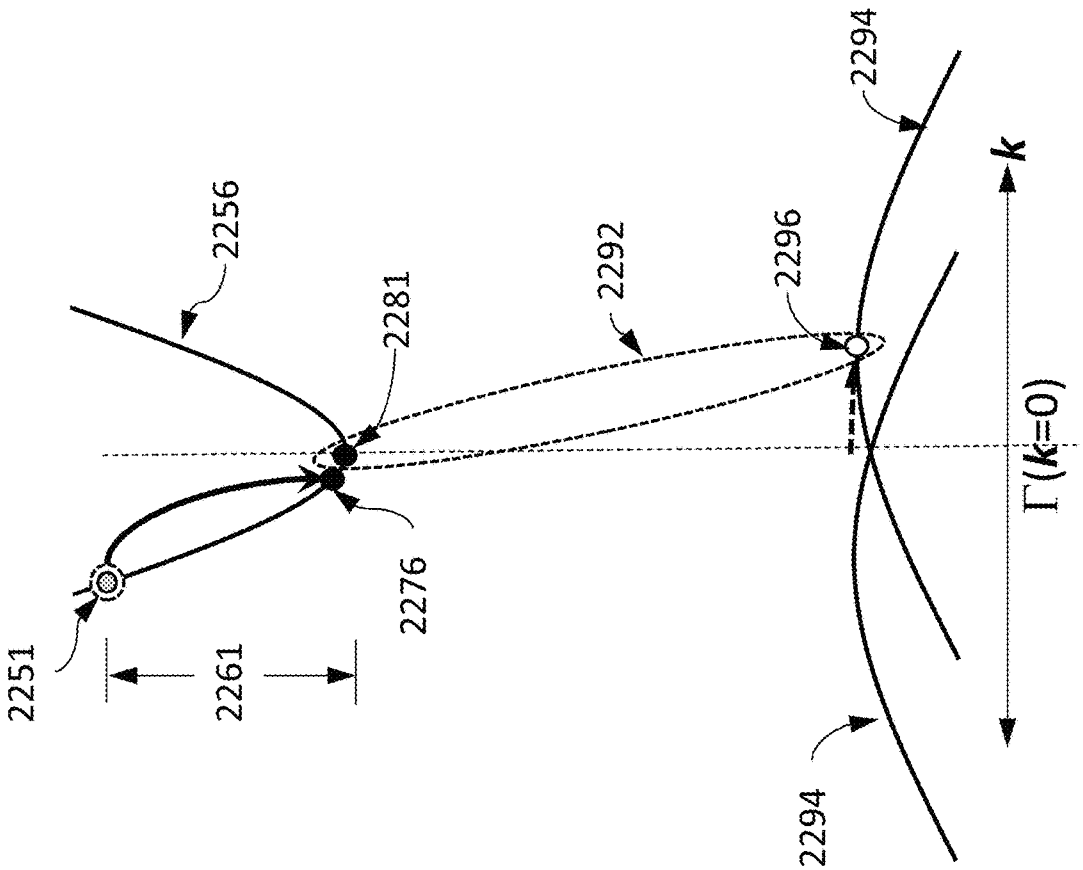

FIGS. 71A and 71B show that impact ionization is also possible in pseudo-direct and indirect band structure metal oxides. FIG. 71A recites the case previously for direct bandgap, and FIG. 71B shows the same process for an indirect bandgap valence band 2294 wherein the electron-hole pair production 2292 requires a $k \neq 0$ hole state 2296 to be created, necessitating a phonon for momentum conservation. As such, FIG. 71B demonstrates that an optical gain medium is also possible in pseudo-direct band structures such as 2294.

Figure 72B:
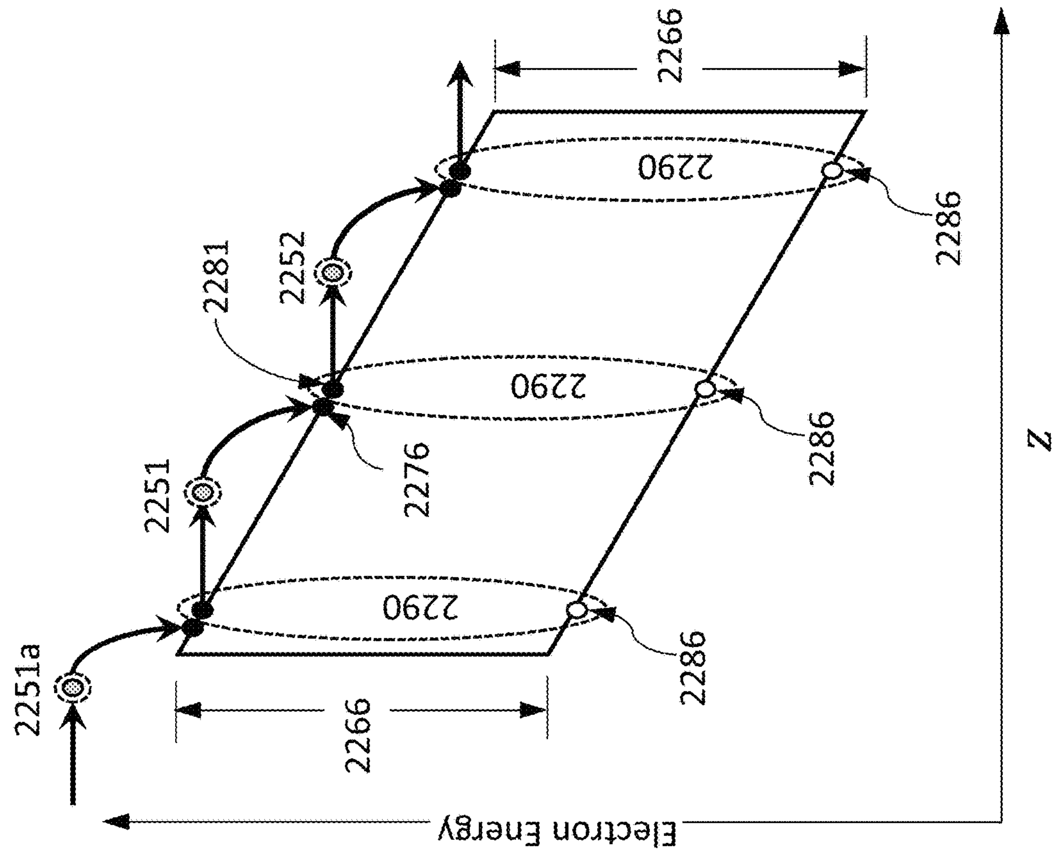
FIGS. 72A and 72B show an effect of an electric field applied to metal oxide creating a plurality of impact ionization events in accordance with another illustrative embodiment of the present disclosure.
Figure 72A:
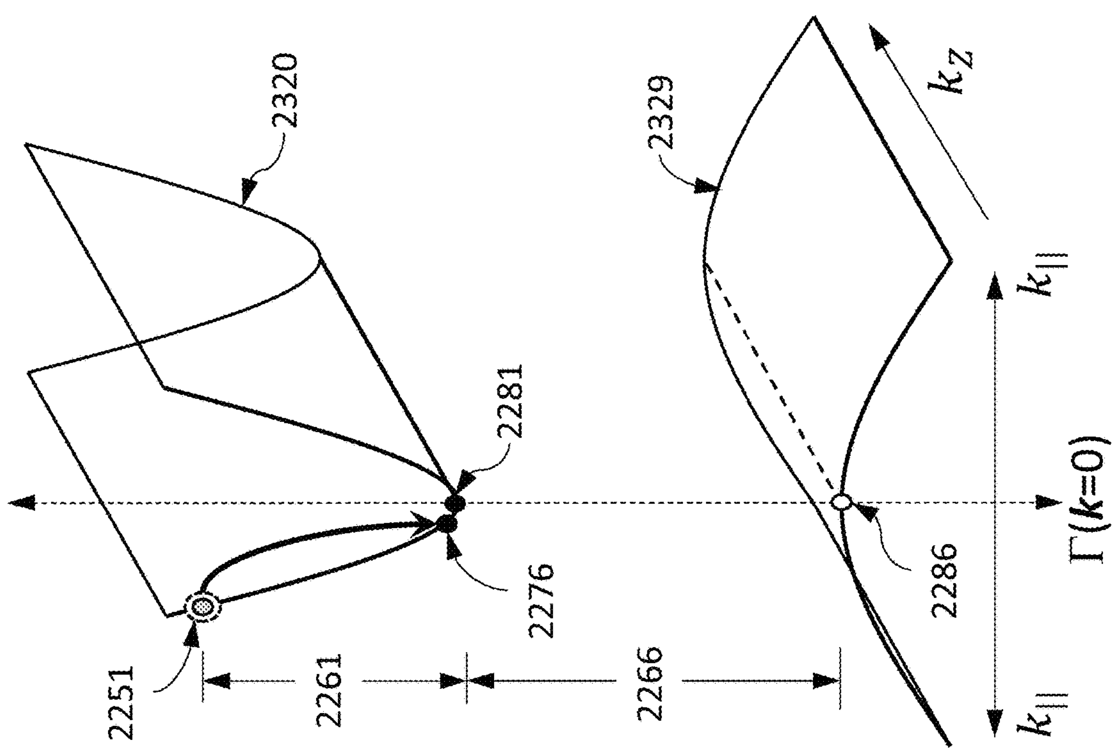

FIGS. 72A and 72B disclose further detail of the disclosure using impact ionization processes for optical gain medium by selecting advantageous properties of the band structure.

FIG. 72A describes the band structure of FIGS. 68A-68B, 69A-69B, 70A-70B and 71A-71B for in-plane crystal wave vectors $k_{\parallel}$ and the wavevector along the quantization axis $k_z$ that is parallel to the epilayer growth direction z.

The conduction 2320 and valence 2329 band dispersions are shown along $k_z$ in FIG. 72A. If the k=0 spatial band structure of material having bandgap 2266 depicted in FIG. 72A is plotted along the growth direction, the resulting spatial-energy band diagram is shown in FIG. 72B. Along the growth direction z, the hot electron 2251*a* is injected into the conduction band producing impact ionization process and pair production 2290. If a slab of the metal-oxide material is subjected to a large electric field directed along z, the band structure has a potential energy along z that is linearly decreasing. An impact ionization event producing electron 2276 and hole 2286 pair quasi-particle production 2290 can undergo recombination and produce a bandgap energy photon.

The remaining electron 2276 can be accelerated by the applied electric field to create another hot electron 2252. The hot electron 2252 can then impact ionize and repeat the process. Therefore, the energy supplied by the external electric field can generate the pair product and photon generation process. This process is particularly advantageous for metal-oxide light emission and optical gain formation.

Lastly, there are three laser topologies that can be utilized advantageously in accordance with the principle set out in the present disclosure.

The basic components are: (i) an electronic region forming and generating an optical gain region; and (ii) an optical cavity containing the optical gain region.

Figure 73:
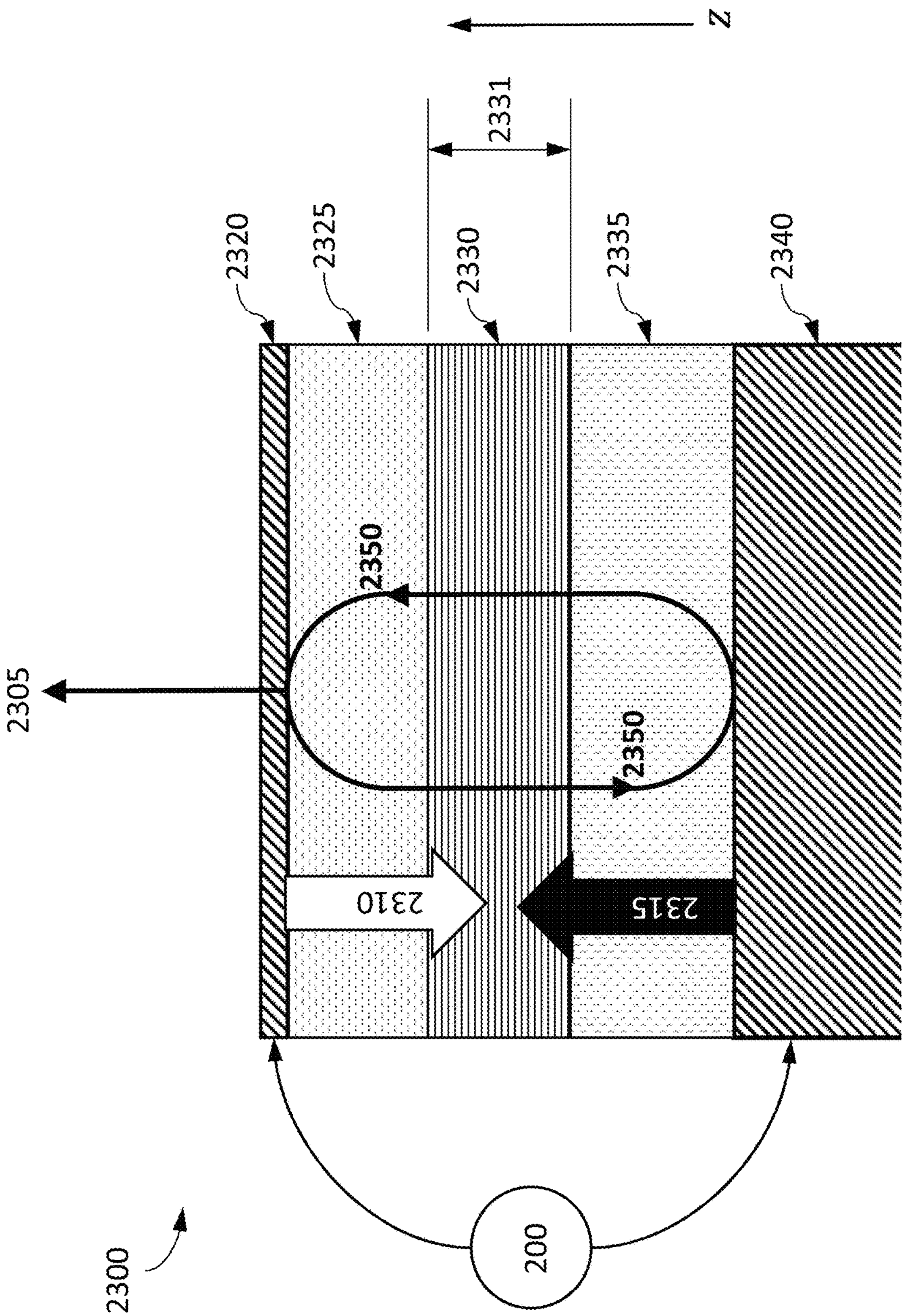
FIG. 73 shows a vertical type ultraviolet laser structure in accordance with an illustrative embodiment of the present disclosure where the reflectors form part of the cavity and electrical circuit.

FIG. 73 shows a semiconductor optoelectronic device in the form of a vertical emission type UVLAS 2300 comprising an optical gain region 2330 of thickness 2331; an electron injector 2310 region 2325; a hole injector 2315 region 2335. Regions 2325 and 2335 may be n-type and p-type metal oxide semiconductors and substantially transparent to the operating wavelength emitted from the device along axis 2305. The electrical excitation source 200 is operably connected to the device via conductive layers 2340 and 2320 which are also operable as a high reflector and output coupler, respectively. The optical cavity between the reflectors (conductive layers 2340 and 2320) is formed by the sum of the stack of layers 2325, 2330 and 2335.

A portion of the thickness of the reflectors is also included as the cavity thickness if they are partially absorbing and of multilayer dielectric type. For the case of pure and ideal metal reflectors, the mirror thickness can be neglected. Therefore, the optical cavity thickness is governed by the layers 2325, 2330 and 2335, of which the optical gain region 2330 is advantageously positioned with respect to the cavity modes as described in FIGS. 61, 62 and 63. The photon recycling 2350 is shown by the optical reflection from the mirrors/reflectors 2340 and 2320.

Yet another option for creating a UVLAS structure as shown in FIG. 73 is an embodiment in which the reflectors 2320 and 2340 form part of the electrical circuit and therefore must be conducting and must also be operable as reflectors forming the optical cavity. This can be achieved by using elemental Aluminum layers to act as at least one of the HR or OC.

An alternative UVLAS configuration decouples the optical cavity from the electrical portion for the structure. For example, FIG. 74 discloses a UVLAS 2360 having an optical cavity formed comprising HR 2340 and OC 2320 that are not part of the electrical circuit. The optical gain region 2330 is positioned with the cavity enabling photon recycling 2350. The optical axis is directed along axis 2305. Insulating spacer layer metal oxide regions may be provided within the cavity to tailor the position of the gain region 2330 between the reflectors 2340 and 2320. The electron 2325 and hole injectors and 2335 provide laterally transported carriers into the gain region 2330.

Such as structure can be achieved for a vertical emitting UVLAS by creating p-type and n-type regions laterally disposed to connect only a portion of the gain region. The reflectors may be positioned also on a portion of the optical gain region to create the cavity photon recycling 2350.

Figure 75:
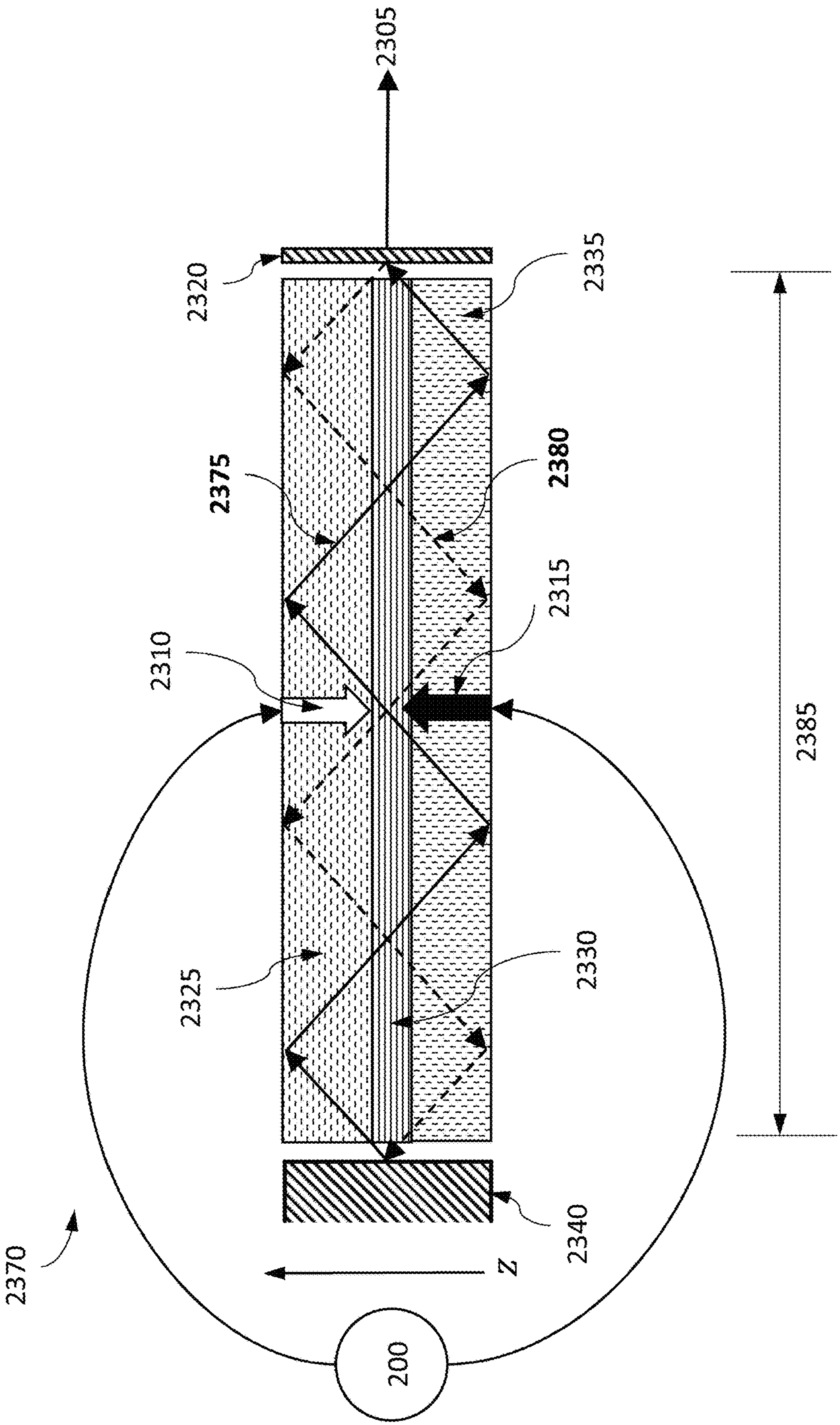
FIG. 75 shows a waveguide type ultraviolet laser structure in accordance with an illustrative embodiment of the present disclosure where the reflectors forming the optical cavity are decoupled from the electrical circuit and where the optical gain medium embedded within the lateral cavity can have a length optimized for a low threshold gain.

Yet even a further illustrative embodiment is the waveguide device 2370 shown in FIG. 75.

FIG. 75 shows the waveguide structure 2370 having a major axis 2305 with epitaxial regions formed sequentially along the growth direction z comprising of electron injector 2325, optical gain region 2330 and hole injector region 2335. Single-mode or multi-mode waveguide structures having refractive indices are selected to create confined optical radiation of forward and reverse propagating modes 2375 and 2380. The cavity length 2385 is terminated at each end with reflectors 2340 and 2320. High reflector 2340 can be metallic or distributed feedback type comprising etched grating or multilayer dielectric conformally coated to a ridge. The OC 2320 can be a metallic semi-transparent film of dielectric coating or even a cleaved facet of the semiconductor slab.

As would be appreciated, optical gain regions may be formed using metal-oxide semiconductors in accordance with the present disclosure that are electrically stimulated and/or optically pumped/stimulated where the optical cavity may be formed in both vertical and waveguide structures as required.

The present disclosure teaches new materials and processes for realizing optoelectronic light emitting devices based on metal oxides capable of generating light deep into the UVC and far/vacuum UV wavelength bands. These processes include tuning or configuring the band structure of different regions of the device using a number of different methods including, but not limited to, composition selection to achieve desired band structure including forming effective compositions by the use of superlattices comprising different layers of repeating metal oxides. The present disclosure also teaches the use of biaxial strain or uniaxial strain to modify band structures of relevant regions of the semiconductor device as well as strain matching between layers, e.g., in a superlattice, to reduce crystal defects during the formation of the optoelectronic device.

As would be appreciated, metal oxide based materials are commonly known in the prior-art for their insulating properties. Metal oxide single crystal compositions, such as Sapphire (corundum-$Al_2O_3$) are available with extremely high crystal quality and are readily grown in large diameter wafers using bulk crystal growth methods, such as Czochralski (CZ), Edge-fed growth (EFG) and Float-zone (FZ) growth. Semiconducting gallium-oxide having monoclinic crystal symmetry has been realized using essentially the same growth methods as Sapphire. The melting point of $Ga_2O_3$ is lower than Sapphire so the energy required for the CZ, EFG and FZ methods is slightly lower and may help reduce the large scale cost per wafer. Bulk alloys of $AlGaO_3$ bulk substrates have not yet been attempted using CZ or EFG. As such, metal oxide layers of the optoelectronic devices may be based on these metal oxide substrates in accordance with examples of the present disclosure.

The two binary metal oxide materials $Ga_2O_3$ and $Al_2O_3$ exist in several technologically relevant crystal symmetry forms. In particular, the alpha-phase (rhombohedral) and beta-phase (monoclinic) are possible for both $Al_2O_3$ and $Ga_2O_3$. $Ga_2O_3$ energetically favors the monoclinic structure whereas $Al_2O_3$ favors the rhombohedral for bulk crystal growth. In accordance with the present disclosure atomic beam epitaxy may be employed using constituent high purity metals and atomic oxygen. As demonstrated in this disclosure, this enables many opportunities for flexible growth of heterogeneous crystal symmetry epitaxial films.

Two example classes of device structures that are particularly suitable to UVLED include: high Al-content $Al_xGa_{1-x}O_3$ deposited on $Al_2O_3$ substrates and high Ga-content $AlGaO_3$ on bulk $Ga_2O_3$ substrates. As has been demonstrated in this disclosure, the use of digital alloys and superlattices further extends the possible designs for application to UVLEDs. As has also been demonstrated in some examples of the present disclosure, the selection of various $Ga_2O_3$ and $Al_2O_3$ surface orientations when presented for $AlGaO_3$ epitaxy can be used in conjunction with growth conditions such as temperature and metal-to-atomic-oxygen ratio and relative metal ratio of Al to Ga in order to predetermine the crystal symmetry type of the epitaxial films which may be exploited to determine the band structure of the optical emission or conductivity type regions.

Additional Embodiments of Epitaxial Oxide Materials, Structures and Devices

Epitaxial oxide materials, semiconductor structures comprising epitaxial oxide materials, and devices containing structures comprising epitaxial oxide materials are described herein.

The epitaxial oxide materials described herein can be any of those shown in the table in FIG. 28 and in FIGS. 76A-1, 76A-2 and 76B. Some examples of epitaxial oxide materials are $(Al_xGa_{1-x})_2O_3$ where $0 \le x \le 1$; $(Al_xGa_{1-x})_yO_z$ where $0 \le x \le 1$, $1 \le y \le 3$, and $2 \le z \le 4$; NiO; $(Mg_xZn_{1-x})_z(Al_yGa_{1-y})_{2(1-z)}O_{3-2z}$ where $0 \le x \le 1$, $0 \le y \le 1$ and $0 \le z \le 1$; $(Mg_xNi_{1-x})_z(Al_yGa_{1-y})_{2(1-z)}O_{3-2z}$ where $0 \le x \le 1$, $0 \le y \le 1$ and $0 \le z \le 1$; $MgAl_2O_4$; $ZnGa_2O_4$; $(Mg_xZn_yNi_{1-y-x})(Al_yGa_{1-y})_2O_4$ where $0 \le x \le 1$, $0 \le y \le 1$ (e.g., $(Mg_xZn_{1-x})(Al)_2O_4$), or $(Mg)(Al_yGa_{1-y})_2O_4$); $(Al_xGa_{1-x})_2(Si_zGe_{1-z})O_5$ where $0 \le x \le 1$ and $0 \le z \le 1$; $(Al_xGa_{1-x})_2LiO_2$ where $0 \le x \le 1$; $(Mg_xZn_{1-x-y}Ni_y)_2GeO_4$ where $0 \le x \le 1$, $0 \le y \le 1$.

An "epitaxial oxide" material described herein is a material comprising oxygen and other elements (e.g., metals or non-metals) having an ordered crystalline structure configured to be formed on a single crystal substrate, or on one or more layers formed on the single crystal substrate. Epitaxial oxide materials have defined crystal symmetries and crystal orientations with respect to the substrate. Epitaxial oxide materials can form layers that are coherent with the single crystal substrate and/or with the one or more layers formed on the single crystal substrate. Epitaxial oxide materials can be in layers of a semiconductor structure that are strained, wherein the crystal of the epitaxial oxide material is deformed compared to a relaxed state. Epitaxial oxide materials can also be in layers of a semiconductor structure that are unstrained or relaxed.

In some embodiments, the epitaxial oxide materials described herein are polar and piezoelectric, such that the epitaxial oxide materials can have spontaneous or induced piezoelectric polarization. In some cases, induced piezoelectric polarization is caused by a strain (or strain gradient) within the multilayer structure of the chirp layer. In some cases, spontaneous piezoelectric polarization is caused by a compositional gradient within the multilayer structure of the chirp layer. For example, $(Al_xGa_{1-x})_yO_z$, where $0 \le x \le 1$, $1 \le y \le 3$, and $2 \le z \le 4$, and with a Pna21 space group is a polar and piezoelectric material. Some other epitaxial oxide materials that are polar and piezoelectric are $Li(Al_xGa_{1-x})O_2$ where $0 \le x \le 1$, with a Pna21 or a P421212 space group. Additionally, the crystal symmetry of an epitaxial oxide layer (e.g., comprising materials shown in the table in FIG. 28 and in FIGS. 76A-1, 76A-2 and 76B) can be changed when the layer is in a strained state. In some cases, such an asymmetry in the crystal symmetry caused by strain can change the space group of an epitaxial oxide material. In some cases, an epitaxial oxide layer (e.g., comprising materials shown in the table in FIG. 28 and in FIGS. 76A-1, 76A-2 and 76B) can become polar and piezoelectric, when the layer is in a strained state.

In some embodiments, the epitaxial oxide materials described herein can each have a cubic, tetrahedral, rhombohedral, hexagonal, and/or monoclinic crystal symmetry. In some embodiments, the epitaxial oxide materials in the semiconductor structures described herein comprise $(Al_xGa_{1-x})_2O_3$ with a space group that is R3c, Pna21, C2m, Fd3m, and/or Ia3.

The epitaxial oxide materials described herein can have different space groups in different embodiments.

The space group notation used herein is representative of various space groups, in some embodiments. For example, the space group written as "Fd3m" herein can represent Fd$\bar{3}$m with international number convention SG #=227, and the space group written as "Fm3m" herein can represent Fm$\bar{3}$m with SG #=225. More information regarding full lists of space groups for the different space groups written as "R3c," "Pna21," "C2m," "Fd3m," and "Ia3" herein can be found in "The mathematical theory of symmetry in solids : representation theory for point groups and space groups," Oxford New York: Clarendon Press., ISBN 978-0-19-958258-7.

For example, the epitaxial oxide materials with cubic crystal symmetry described herein can have any cubic space group. The full list of cubic space groups (SG) assigned to their respective space group numbers (#SG) as SG(#SG) is: P23(195), F23(196), I23(197), P210(198), I213(199), Pm3 (200), Pn3(201), Fm3(202), Fd3(203), Im3(204), Pa3(205), Ia3(206), P432(207), P4232(208), F432(209), F4132(210), I432(211), P4332(212), P4132(213), I4132(214), P43m (215), F43m(216), I43m(217), P43n(218), F43c(219), I43d (220), Pm3m(221), Pn3n(222), Pm3n(223), Pn3m(224), Fm3m(225), Fm3c(226), Fd3m(227), Fd3c(228), Im3m (229), or Ia3d(230).

Additionally, strain can change the crystal symmetry and therefore the space group of an epitaxial material within a layer that is in a strained state. For example, a strain-free cubic crystal lattice can be pseudo-morphically grown as an epitaxial layer on a surface or substrate having a different lattice constant. The lattice mismatch can be accommodated via elastic deformation of the epitaxial layer unit cell resulting in a tetragonal distortion. Therefore, the cubic space group of the material forming the epitaxial layer can undergo biaxial or uniaxial crystal deformation into a tetragonal space group.

For example, a $MgGa_2O_4$ material having a freestanding (unstrained) SG=Fd3m can be pseudo-morphically strained via biaxial deformation in the plane of the heterojunction when formed on a MgO (Fm3m) crystals surface. The in-plane lattice mismatch at the $MgGa_2O_4(001)/MgO(001)$ heterointerface can be defined with reference to the rigid bulk MgO substrate as:

$$\Delta a_{epilayer} = 100 \times \frac{(a_{MgGa_2O_4} - (2 \times a_{MgO}))}{2 \times a_{MgO}} = -0.66\%$$

Representing an in-plane biaxial tensile strain on the $MgGa_2O_4$ film with resulting deformation of the Fd3m space group via tetragonal deformation into a space group of symmetry I41/amd (SG #141).

The present disclosure assigns space groups to the materials utilized in heterojunctions or superlattices to their native strain free assignment.

In another example, the epitaxial oxide materials with tetragonal crystal symmetry described herein can have any tetragonal space group. The full list of 68 distinct Tetragonal space groups (SG) assigned to their respective space group numbers (#SG) as SG(#SG) is: P4(75), P41(76), P42(77), P43(78), I4(79), I41(80), P4(81), I4(82), P4/m(83), P42/m (84), P4/n(85), P42/n(86), I4/m(87), I41/a(88), P422(89), P4212(90), P4122(91), P41212(92), P4222(93), P42212 (94), P4322(95), P43212(96), I422(97), I4122(98), P4mm (99), P4bm(100), P42cm(101), P42nm(102), P4cc(103), P4nc(104), P42mc(105), P42bc(106), I4mm(107), I4cm (108), I41md(109), I41cd(110), P42m(111), P42c(112), P421m(113), P421c(114), P4m2(115), P4c2(116), P4b2 (117), P4n2(118), I4m2(119), I4c2(120), I42m(121), I42d (122), P4/mmm(123), P4/mcc(124), P4/nbm(125), P4/nnc (126), P4/mbm(127), P4/mnc(128), P4/nmm(129), P4/ncc (130), P42/mmc(131), P42/mcm(132), P42/nbc(133), P42/nnm(134), P42/mbc(135), P42/mnm(136), P42/nmc(137), P42/ncm(138), I4/mmm(139), I4/mcm(140), I41/amd(141), I41/acd(142).

Similar lists can be compiled for the triclinic, monoclinic, orthorhombic, trigonal and hexagonal crystal symmetry space groups, and the epitaxial oxide materials described herein, with those crystal symmetries can have those space groups in different embodiments.

The epitaxial oxide materials described herein can be formed using an epitaxial growth technique such as molecular beam epitaxy (MBE), metal organic chemical vapor deposition (MOCVD), atomic layer deposition (ALD), and other physical vapor deposition (PVD) and chemical vapor deposition (CVD) techniques.

The semiconductor structures comprising epitaxial oxide materials described herein can be a single layer on a substrate or multiple layers on a substrate. Semiconductor structures with multiple layers can include a single quantum well, multiple quantum wells, a superlattice, multiple superlattices, a compositionally varied (or graded) layer, a compositionally varied (or graded) multilayer structure (or region), a doped layer (or region), and/or multiple doped layers (or regions). Such semiconductor structures with one or more doped layers (or regions) can include layers (or regions) that are doped p-n, p-i-n, n-i-n, p-i-p, n-p-n, p-n-p, p-metal (to form a Schottky junction), and/or n-metal (to form a Schottky junction). Other types of devices, such as m-s-m (metal-semiconductor-metal) where the semiconductor comprises an epitaxial oxide material doped n-type, p-type, or not intentionally doped (i-type).

The semiconductor structures described herein can include similar or dissimilar epitaxial oxide materials. In some cases, the crystal symmetry of the substrate and the epitaxial layers in the semiconductor structure will all have the same crystal symmetry. In other cases, the crystal symmetry can vary between the substrate and the epitaxial layers in the semiconductor structure.

The epitaxial oxide layers in the semiconductor structures described herein can be i-type (i.e., intrinsic, or not intentionally doped), n-type, or p-type. The epitaxial oxide layers that are n-type or p-type can contain impurities that act as extrinsic dopants. In some cases, the n-type or p-type layers can contain a polar epitaxial oxide material (e.g., $(Al_xGa_{1-x})_yO_z$, where 0≤x≤3, 1−y≤3, and 2≤z≤4, and with a Pna21 space group), and the n-type or p-type conductivity can be formed via polarization doping (e.g., due to a strain or composition gradient within the layer(s)).

The semiconductor structures with doped layers (or regions) comprising epitaxial oxide materials can be doped in several ways. In some embodiments, a dopant impurity (e.g., an acceptor impurity, or a donor impurity) can be co-deposited with the epitaxial oxide material to form a layer such that the dopant impurity is incorporated into the crystalline layer (e.g., substituted in the lattice, or in an interstitial position) and forms active acceptors or donors to provide the material p-type or n-type conductivity. In some embodiments, a dopant impurity layer can be deposited adjacent to a layer comprising an epitaxial oxide material such that the dopant impurity layer includes active acceptors or donors that provide the epitaxial oxide material p-type or n-type conductivity. In some cases, a plurality of alternating dopant impurity layers and layers comprising epitaxial oxide materials form a doped superlattice, where the dopant impurity layers provide p-type or n-type conductivity to the doped superlattice.

Suitable substrates for the formation of the semiconductor structures comprising epitaxial oxide materials described herein include those that have crystal symmetries and lattice parameters that are compatible with the epitaxial oxide materials deposited thereon. Some examples of suitable substrates include $Al_2O_3$ (any crystal symmetry, and C-plane, R-plane, A-plane or M-plane oriented), $Ga_2O_3$ (any crystal symmetry), MgO, LiF, $MgAl_2O_4$, $MgGa_2O_4$, $LiGaO_2$, $LiAlO_2$, $(Al_xGa_{1-x})_2O_3$ (any crystal symmetry), $MgF_2$, $LaAlO_3$, $TiO_2$, or quartz.

The crystal symmetry of the substrate and the epitaxial oxide material can be compatible if they have the same type of crystal symmetry and the in-plane (i.e., parallel with the surface of the substrate) lattice parameters and atomic positions at the surface of the substrate provide a suitable template for the growth of the subsequent epitaxial oxide materials. For example, a substrate and an epitaxial oxide material can be compatible if the in-plane lattice constant mismatch between the substrate and the epitaxial oxide material are less than 0.5%, 1%, 1.5%, 2%, 5% or 10%. For example, in some embodiments the crystal structure of the substrate material has a lattice mismatch of less than or equal to 10% with the epitaxial layer. In some cases, the crystal symmetry of the substrate and the epitaxial oxide material can be compatible if they have a different type crystal symmetry but the in-plane (i.e., parallel with the surface of the substrate) lattice parameters and atomic positions at the surface of the substrate provide a suitable template for the growth of the subsequent epitaxial oxide materials. In some cases, multiple (e.g., 2, 4 or other integer) unit cells of a substrate surface atomic arrangement can provide a suitable surface for the growth of an epitaxial oxide material with a larger unit cell than that of the substrate. In another case, the epitaxial oxide layer can have a smaller lattice constant (e.g., approximately half) than the substrate. In some cases, the unit cells of the epitaxial oxide layer may be rotated (e.g., by 45 degrees) compared to the unit cells of the substrate.

In the case of epitaxial oxide materials with cubic crystal symmetries, the lattice constants in all three directions of the crystal are the same, and the orthogonal in-plane lattice constants will be also be the same. In some cases, the epitaxial material has a crystal symmetry where two lattice constants are the same (e.g., $a=b\neq c$) and the crystal is oriented such that those lattice constants (a and b) are at an interface of a heterostructure between dissimilar epitaxial oxide materials (e.g., with different compositions, different bandgaps, and either the same or a different crystal symmetry). In other cases, the epitaxial oxide materials can have two different lattice constants (e.g., $a\neq b\neq c$, or $a=b\neq c$ and oriented such that lattice constants a and c, or b and c, are at the interface). In such cases, where the orthogonal in-plane lattice constants are different, the lattice constants in both orthogonal directions need to be within a certain percentage mismatch (e.g., within 0.5%, 1%, 1.5%, 2%, 5% or 10%) of the lattice constants in both orthogonal directions of another material with which it is compatible.

In some cases, the epitaxial oxide materials of the semiconductor structures described herein and the substrate material upon which the semiconductor structures described herein are grown are selected such that the layers of the semiconductor structure have a predetermined strain, or strain gradient. In some cases, the epitaxial oxide materials and the substrate material are selected such that the layers of the semiconductor structure have in-plane (i.e., parallel with the surface of the substrate) lattice constants (or crystal plane spacings) that are within 0.5%, 1%, 1.5%, 2%, 5% or 10% of an in-plane lattice constant (or crystal plane spacing) of the substrate.

In other cases, a buffer layer including a graded layer or region can be used to reset the lattice constant (or crystal plane spacing) of the substrate, and the layers of the semiconductor structure have in-plane lattice constants (or crystal plane spacings) that are within 0.5%, 1%, 1.5%, 2%, 5% or 10% of the final (or topmost) lattice constant (or crystal plane spacing) of the buffer layer. In such cases, the materials in the semiconductor structure may have lattice constants and/or crystal symmetries that are different from those of the substrate. In such cases, even though the materials in the semiconductor structure are not compatible with the substrate, the materials in the semiconductor structure can still be grown on the substrate using the buffer layer including the graded layer or region to reset the lattice constant.

The devices comprising the semiconductor structures comprising the epitaxial oxide materials described herein can include electronic and optoelectronic devices. For example, the devices described herein can be resistors, capacitors, inductors, diodes, transistors, amplifiers, photodetectors, LEDs or lasers.

In some embodiments, the devices comprising the semiconductor structures comprising the epitaxial oxide materials described herein are optoelectronic devices, such as photodetectors, LEDs and lasers, that detect or emit UV light (e.g., with a wavelength from 150 nm to 280 nm). In some cases, the device comprises an active region wherein the detection or emission of light occurs, and the active region comprises an epitaxial oxide material with a bandgap selected to detect or emit UV light (e.g., with a wavelength from 150 nm to 280 nm).

In some embodiments, the devices comprising the semiconductor structures comprising the epitaxial oxide materials described herein utilize carrier multiplication, for example from impact ionization mechanisms. The bandgaps of the epitaxial oxide materials are wide (e.g., from about 2.5 eV to about 10 eV, or from about 3 eV to about 9 eV). The wide bandgaps provide high dielectric breakdown strengths due to the epitaxial oxide materials described herein. Devices including wide bandgap epitaxial oxide materials can have large internal fields and/or be biased at high voltages without damaging the materials of the device due to the high dielectric breakdown strengths of the constituent epitaxial oxide materials. The large electric fields present in such devices can lead to carrier multiplication through impact ionization, which can improve the characteristics of the device. For example, an avalanche photodetector (APD) can be made to detect low intensity signals, or an LED or laser can be made with high electrical power to optical power conversion efficiency.

Density functional theory (DFT) enables prediction and calculation of the crystal oxide band structure on the basis of quantum mechanics without requiring phenomenological parameters. DFT calculations applied to understanding the electronic properties of solid-state oxide crystals is based fundamentally on treating the nuclei of the atoms comprising the crystal as fixed via the Born-Oppenheimer approximation, thereby generating a static external potential in which the many-body electron fields are embedded. The crystal structure symmetry of the atomic positions and species imposes a fundamental structure effective potential for the interacting electrons. The effective potential for the many-body electron interactions in three-dimensional spatial coordinates can be implemented by the utility of functionals of the electron density. This effective potential includes exchange and correlation interactions, representing interacting and non-interacting electrons. For application to solid-state semiconductors and oxides there exists a range of improved exchange functionals (XCF) that improve the accuracy of the DFT results. Within the DFT framework the many-electron Schrodinger equation is divided into two groups: (i) valence electrons; and (ii) inner core electrons. Inner shells electrons are strongly bound and partially screen the nucleus, forming with the nucleus an inert core. Crystal atomic bonds are primarily due to the valence electrons. Therefore, inner electrons can be ignored in a large number of cases, thereby reducing the atoms comprising the crystal to an ionic core that interacts with the valence electrons. This effective interaction is called a pseudopotential and approximates the potential felt by the valence electrons. One notable exception of the effect of inner core electrons is in the case of Lanthanide oxides, wherein partially filled Lanthanide atomic 4f-orbitals are surrounded by closed electron orbitals. The present DFT band structures disclosed herein account for this effect. There exist many improvements for XCF to attain higher accuracy of band structures applied to oxides. For example, improvements over historical XCFs of the known local density approximation (LDA), generalized gradient approximation (GGA) hybrid exchange (e.g., HSE (Heyd-Scuseria-Ernzerhof), PBE (Perdew-Burke-Ernzerhof) and BLYP (Becke, Lee, Yang, Parr)) include the use of the Tran-Blaha modified Becke-Johnson (TBmBJ) exchange functional, and further modifications, such as the KTBmBJ, JTBSm, and GLLBsc forms. It was found in accordance with the present disclosure that in particular for the present materials disclosed, the TBmBJ exchange potential can predict the electron energy-momentum (E-k) band structure, bandgaps, lattice constants, and some mechanical properties of epitaxial oxide materials. A further benefit of the TBmBJ is the lower computational cost compared to HSE when applied to a large number of atoms in large supercells which are used to simulate smaller perturbations to an idealized crystal structure, such as impurity incorporation. It is expected that further improvements over TBmBJ applied specifically to the present oxide systems can also be achieved. DTF calculations are used extensively in the present disclosure to provide ab-initio insights into the electronic and physical properties of the epitaxial oxide materials described herein, such as the bandgap and whether the bandgap is direct or indirect in character. The electronic and physical properties of the epitaxial oxide materials can be used to design semiconductor structures and devices utilizing the epitaxial oxide materials. In some cases, experimental data has also been used to verify the properties of the epitaxial oxide materials and structures described herein.

Calculated E-k band diagrams of epitaxial oxide materials derived using DFT calculations are described herein. There are several features of the E-k diagrams that can be used to provide insight into the electronic and physical properties of the epitaxial oxide materials. For example, the energies and k-vectors of valence band and conduction band extrema indicate the approximate energy width of the bandgap and whether the bandgap has a direct or an indirect character. The curvature of the branches of the valence band and conduction band near the extrema are related to the hole and electron effective masses, which relates to the carrier mobilities in the material. DFT calculations using the TBmBJ exchange functional more accurately shows the magnitude of the bandgap of the material compared to previous exchange functionals, as verified by experimental data. The calculated band diagrams of epitaxial materials in this disclosure may differ from the actual band diagrams of the epitaxial materials in some ways. However, certain features, such as the valence band and conduction band extrema, and the curvature of the branches of the valence band and conduction band near the extrema, may closely correspond to the actual band diagrams of the epitaxial materials. Therefore, even if some details of the band diagrams are inaccurate, the calculated band diagrams of epitaxial materials in this disclosure provide useful insights into the electronic and physical properties of the epitaxial oxide materials, and can be used to design semiconductor structures and devices utilizing the epitaxial oxide materials.

Figure 76B:
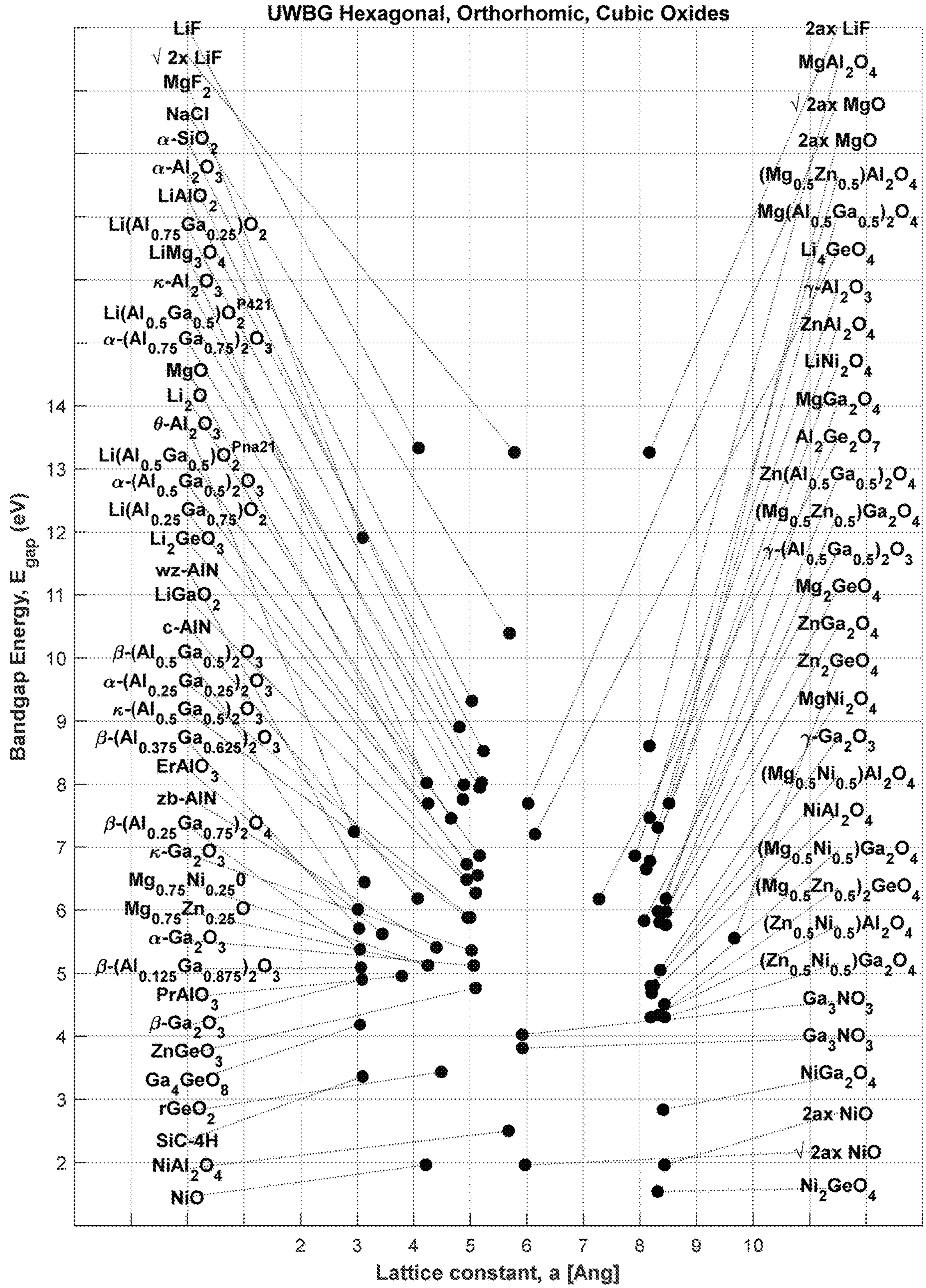
FIG. 76B shows a chart of some epitaxial oxide material bandgaps (minimum bandgap energies in eV) and in some cases crystal symmetry (e.g., α-, β-, γ- and κ-$Al_xGa_{1-x}O_y$) versus lattice constant (in Angstroms) of the epitaxial oxide material.
Figure 76C:
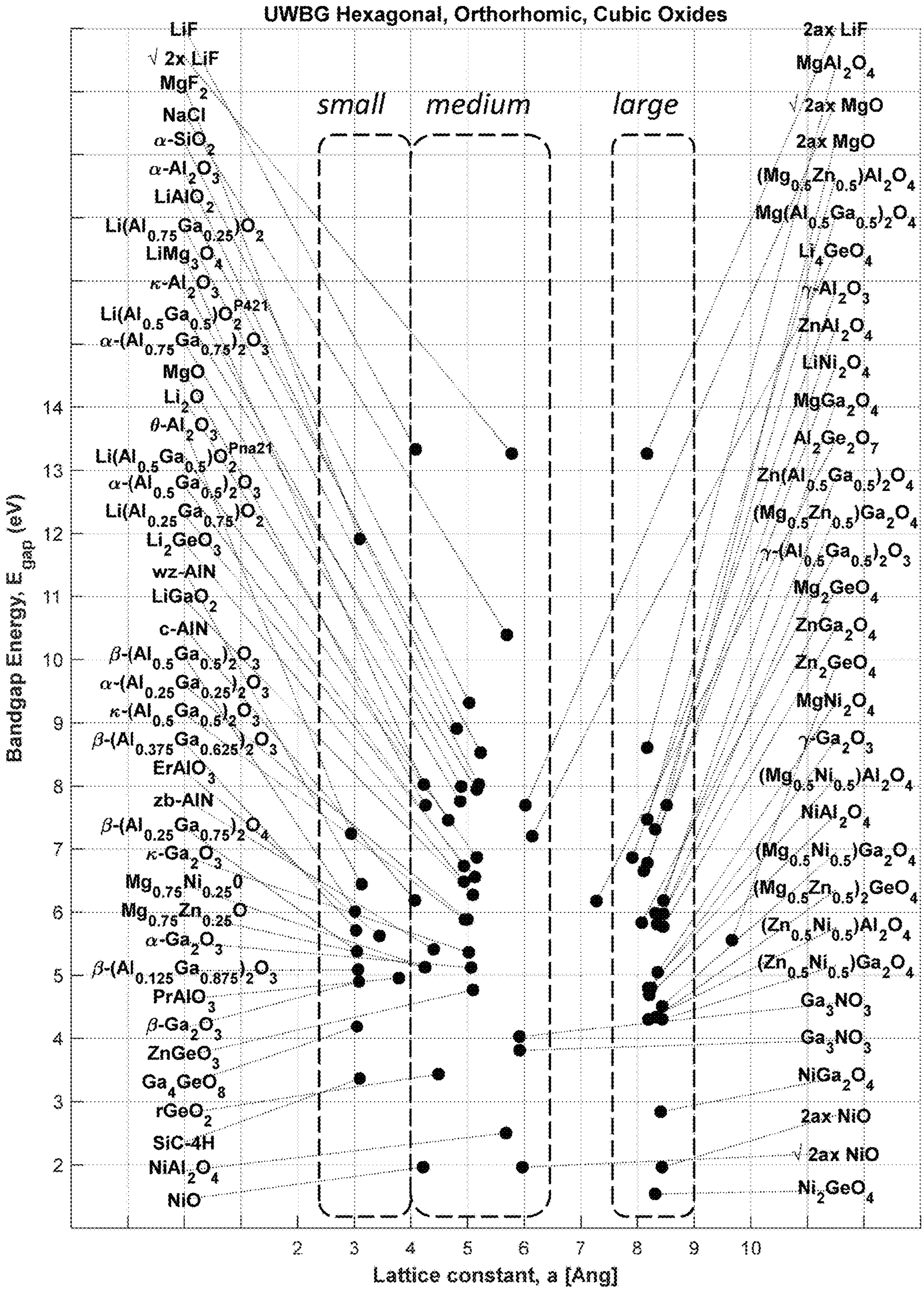
FIG. 76C is the chart shown in FIG. 76B further indicating classification of the size of the epitaxial oxide lattice constant.
Figure 76D:
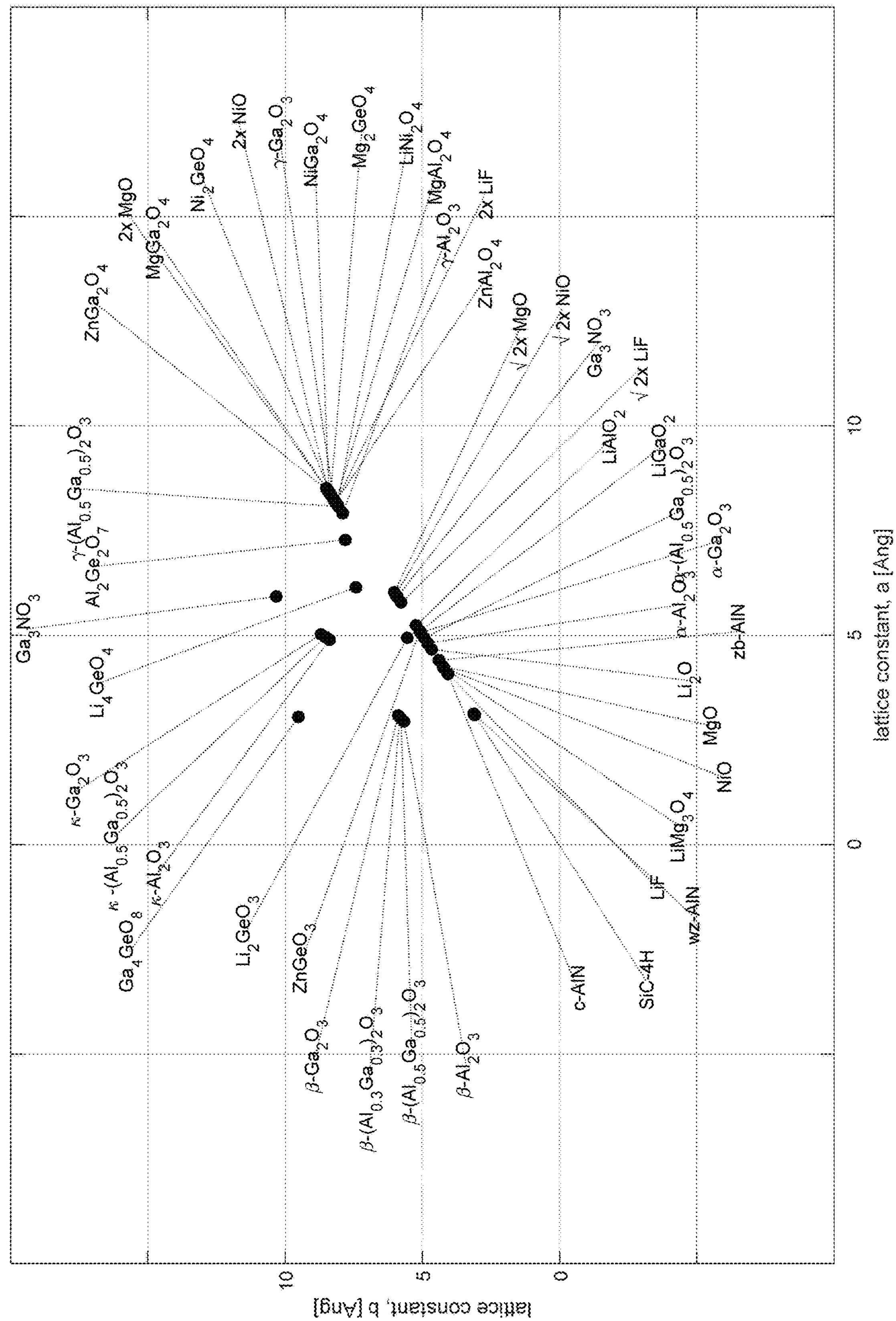
FIG. 76D shows a plot of lattice constant "a" versus lattice constant "b" for a selection of epitaxial oxides.
Figure 76E:
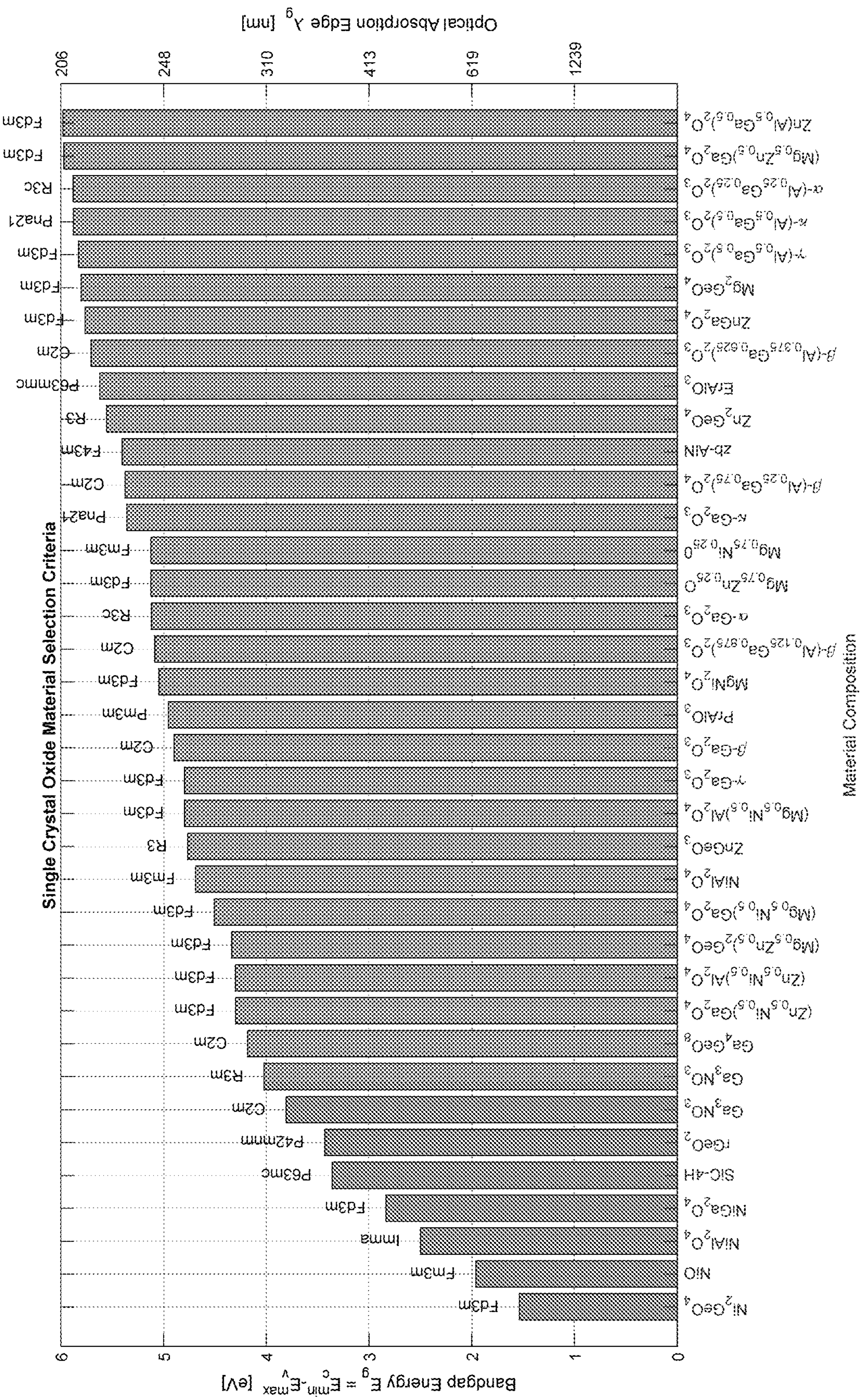
FIGS. 76E-76H show charts of some calculated epitaxial oxide material bandgaps (minimum bandgap energies in eV).
Figure 76F:
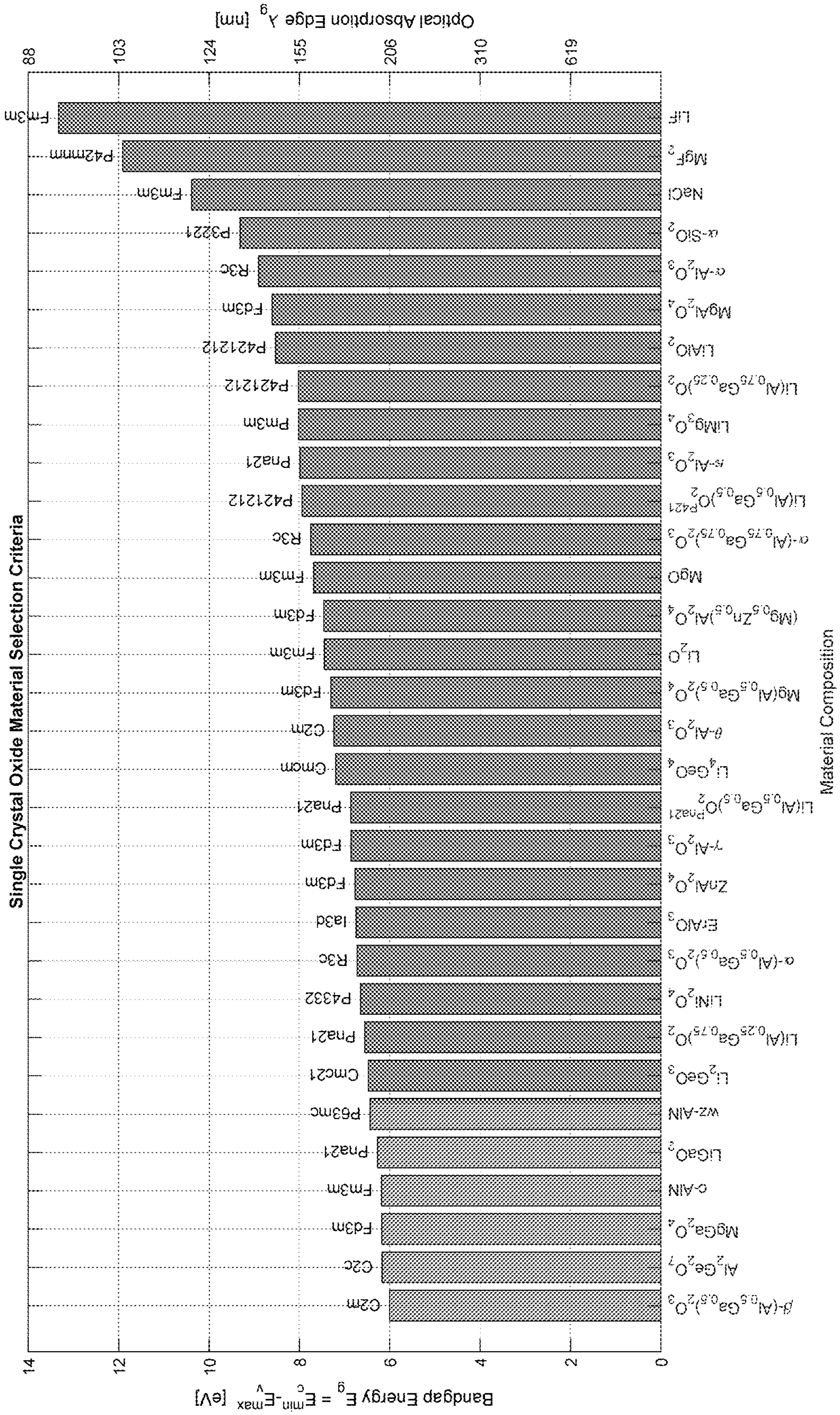
Figure 76G:
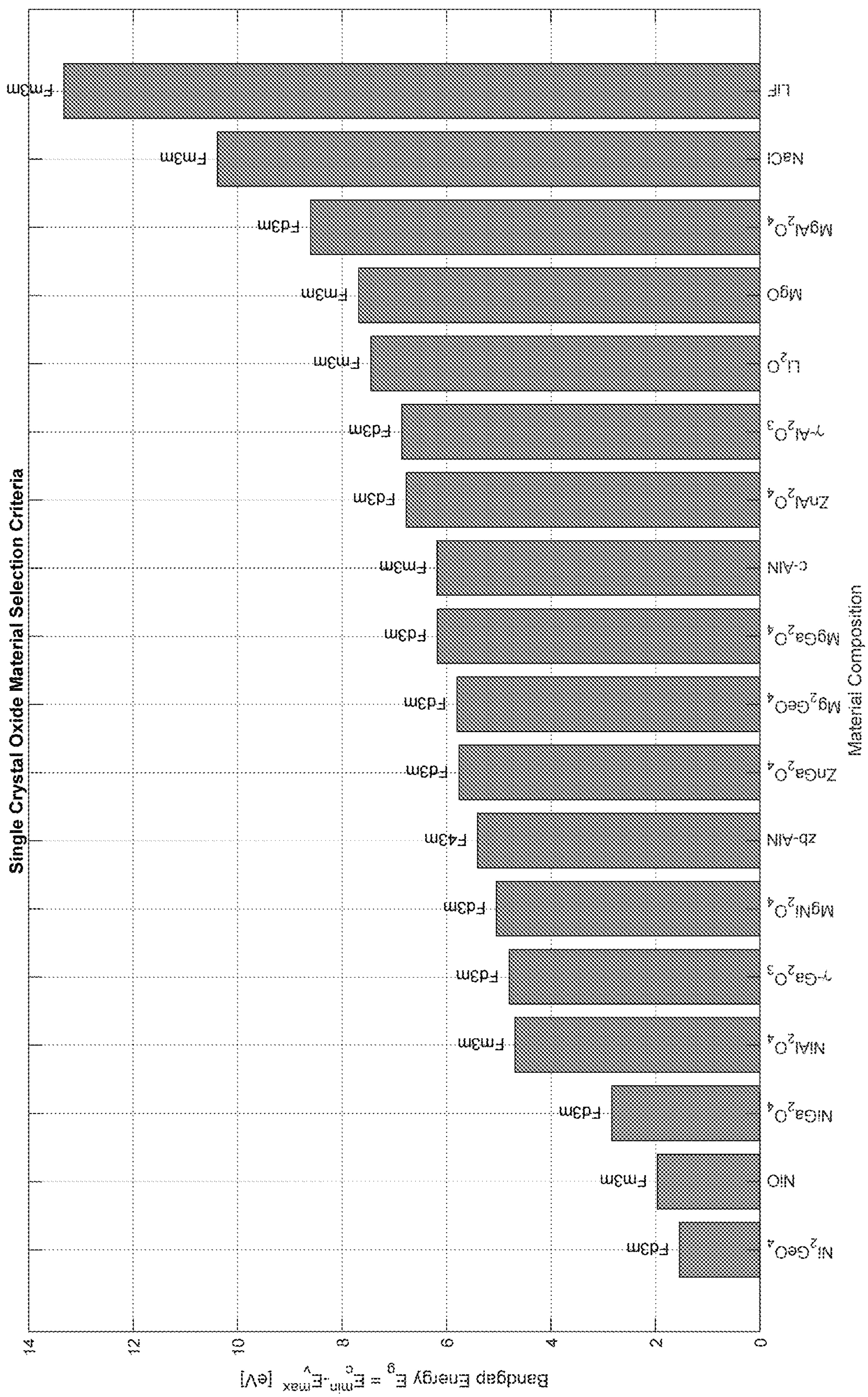
Figure 76H:
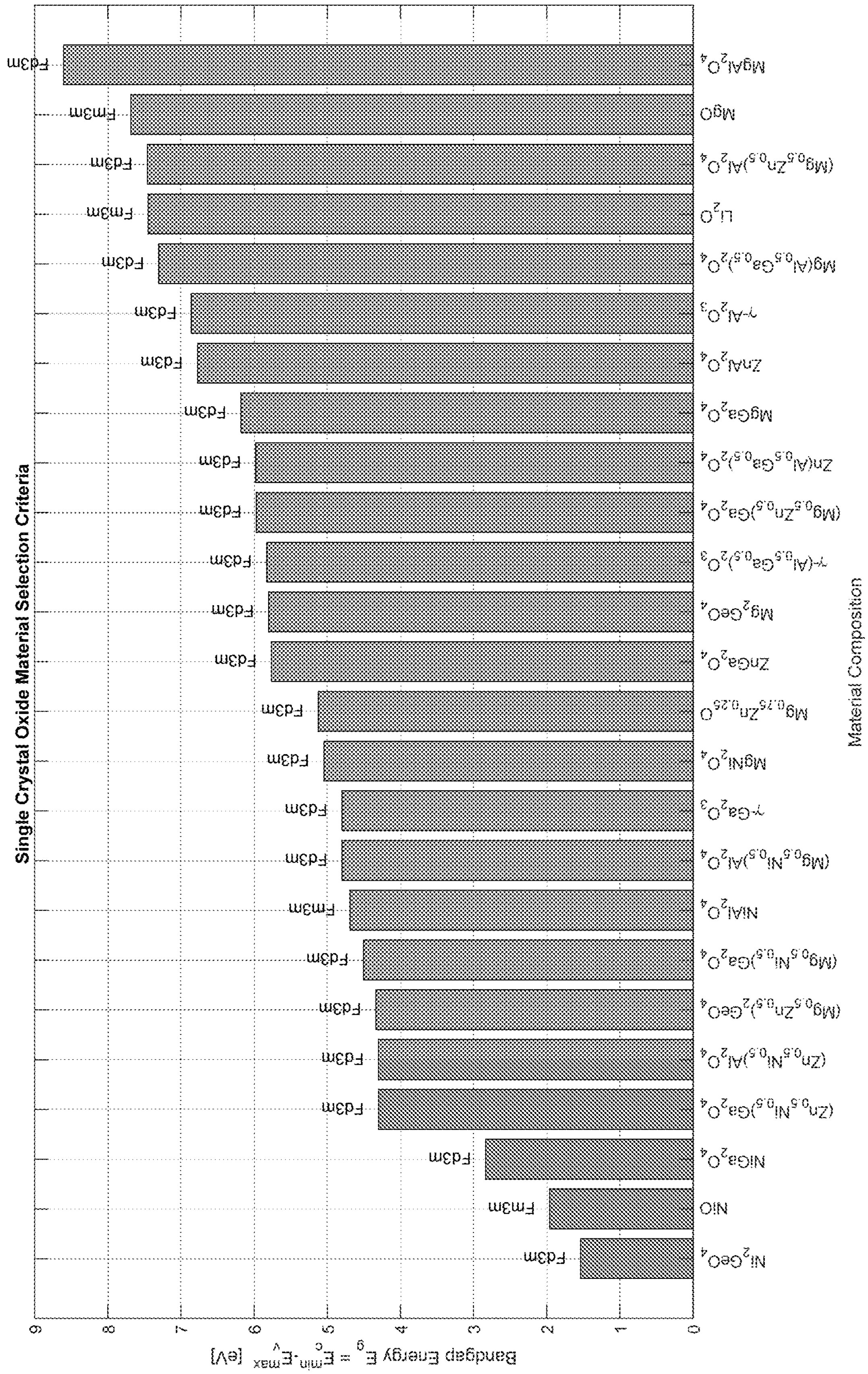

FIGS. 76A-1 through 76H show charts and tables of DFT calculated minimum bandgap energies and lattice parameters for some examples of epitaxial oxide materials.

FIGS. 76A-1 and 76A-2 show a table of crystal symmetries (or space groups), lattice constants ("a," "b" and "c," in different crystal directions, in Angstroms), bandgaps (minimum bandgap energies in eV), and the wavelength of light ("λ_g," in nm) that corresponds to the bandgap energy of various materials. FIGS. 76B and 76C show charts of some epitaxial oxide material bandgaps (minimum bandgap energies in eV) and in some cases crystal symmetry (e.g., α-, β-, γ- and κ-$Al_xGa_{1-x}O_y$) versus lattice constant (in Angstroms) of the epitaxial oxide material. FIG. 76C includes "small," "mid," and "large" lattice constant sets of epitaxial oxide materials. Epitaxial oxide materials within each of these sets (or in some cases between the sets) may be compatible with one another, as described further herein. FIG. S6-1D shows a chart of lattice constant, b, in Angstroms, versus lattice constant, a, in Angstroms, of some epitaxial oxide materials.

Bandgaps of the materials shown in FIGS. 76A-1 through 76C were obtained using computer modeling. The computer models used DFT and the TBMBJ exchange potential.

The charts and tables in FIGS. 76A-1 through 76C show that the composition and the crystal symmetry (or space group) can each affect the bandgap of an epitaxial oxide material. For example, β-$Ga_2O_3$ (i.e., $Ga_2O_3$ with a C2/m space group) has a bandgap of about 4.9 eV, while β-$(Al_{0.5}Ga_{0.5})_2O_3$ (i.e., $Ga_2O_3$ with a C2/m space group) has a bandgap of about 6.1 eV. In other words, changing the Al content of $(Al_xGa_{1-x})_2O_3$ (e.g., adding Al to $Ga_2O_3$ to form $(Al_{0.5}Ga_{0.5})_2O_3$) increases the bandgap of the material. In another example, β-$Ga_2O_3$ (i.e., $Ga_2O_3$ with a C2/m space group) has a bandgap of about 4.9 eV, while κ-$Ga_2O_3$ (i.e., $Ga_2O_3$ with a Pna21 space group) has a bandgap of about 5.36 eV, which illustrates that changing the crystal symmetry (or space group) of an epitaxial oxide material (without changing the composition) can also change its bandgap.

The character of the band structure can also be affected by the composition and the crystal symmetry (or space group) of epitaxial oxide materials, as well as by a tensile or compressive strain state of the material. For example, the composition and crystal symmetry (or space group) of an epitaxial oxide material can determine if the minimum bandgap energy corresponds to a direct bandgap transition or an indirect bandgap transition. In addition to the composition and crystal symmetry (or space group), the strain state of an epitaxial oxide material can also affect the minimum bandgap energy, and whether the minimum bandgap energy corresponds to a direct bandgap transition or an indirect bandgap transition. Other materials properties (e.g., the electron and hole effective masses) can also be impacted by the composition, crystal symmetry (or space group), and strain state of an epitaxial oxide material.

The charts and table in FIGS. 76A-1 through 76D illustrate that some epitaxial oxide materials have crystal symmetries such that the lattice constants in the a and b directions are the same. Some of the lattice constants shown in the chart in FIG. 76D lie along the diagonal (i.e., where lattice constant, a=lattice constant, b). Such epitaxial oxide materials can have a cubic crystal symmetry (or an Fd3m space group), for example $\gamma$-$Ga_2O_3$ (i.e., $Ga_2O_3$ with an Fd3m space group), or $\gamma$-$(Al_xGa_{1-x})_2O_3$. Such epitaxial oxide materials can also have a hexagonal crystal symmetry (or an R3c space group), for example $\alpha$-$Ga_2O_3$ (i.e., $Ga_2O_3$ with an R3c space group), or $\alpha$-$(Al_xGa_{1-x})_2O_3$.

The charts and table in FIGS. 76A-1 through 76D also illustrate that some epitaxial oxide materials have crystal symmetries such that the lattice constants in the a and b directions are different. Some of the lattice constants shown in the chart in FIG. 76D lie off of the diagonal (i.e., where lattice constant, a does not equal lattice constant, b). Such epitaxial oxide materials can have a monoclinic crystal symmetry (or an C2/m space group), for example $\beta$-$Ga_2O_3$ (i.e., $Ga_2O_3$ with a C2/m space group), or $\beta$-$(Al_xGa_{1-x})_2O_3$. Such epitaxial oxide materials can also have an orthorhombic crystal symmetry (or a Pna21space group), for example $\kappa$-$Ga_2O_3$ (i.e., $Ga_2O_3$ with a Pna21 space group), or $\kappa$-$(Al_xGa_{1-x})_2O_3$. Such epitaxial oxide materials can have different in-plane lattice constants in different directions (e.g., a and b), all of which can be matched (or close to matched) to the in-plane lattice constants of a compatible substrate.

The charts and table in FIGS. 76A-1 through 76D also illustrate that epitaxial oxide materials have wide minimum bandgaps, with most having a bandgap from about 3 eV to about 9 eV. The wide bandgaps have several advantages. The wide bandgaps of epitaxial oxide materials provide them with high dielectric breakdown voltages, and therefore can be used in electronic devices that require large biases (e.g., high voltage switches, and impact ionization devices). The bandgaps of epitaxial oxide materials are also well suited for use in optoelectronic devices that emit or detect light in the UV range, where materials with bandgaps from about 4.5 eV to about 8 eV can be used to emit or detect UV light with wavelengths from about 150 nm to 280 nm. Semiconductor heterostructures can also be formed with wide bandgap materials as the emitter or absorber layers, and materials that have wider bandgaps than the emitter or absorber layers can be used in other layers of the structure to be transparent to the wavelength being emitted or absorbed.

The chart in FIG. 76B can also serve as a guide to design semiconductor structures comprising epitaxial oxide materials. The lattice constants and crystal symmetries provide information regarding which materials can be epitaxially formed (or grown) in a semiconductor structure, for example, with high crystal quality and/or with layers of the semiconductor structure having desired strain states. As described herein, in some cases a strain state for an epitaxial oxide material can beneficially alter the properties of the material. For example, as described herein, an epitaxial oxide material can have a direct minimum bandgap energy in a strained state, but have an indirect bandgap in a relaxed (not strained) state. In some cases, the epitaxial oxide materials and the substrate material of a semiconductor structure are selected such that the layers of the semiconductor structure have in-plane (i.e., parallel with the surface of the substrate) lattice constants (or crystal plane spacings) that are within 0.5%, 1%, 1.5%, 2%, 5% or 10% of an in-plane lattice constant (or crystal plane spacing) of the substrate. Therefore, points on the chart in FIG. 76B that are vertically aligned within an acceptable amount of mismatch, and that have compatible crystal symmetries, can be combined into a semiconductor structure with different types of epitaxial oxide materials (or epitaxial oxide heterostructures). The bandgaps of such compatible materials can then be chosen for desired properties of the semiconductor structure and/or of a device that incorporates the semiconductor structure.

For example, the semiconductor structure can be used in a UV-LED with doped layers (or regions) forming a p-i-n doping profile. In such cases, the i-layer can include an epitaxial oxide material with an appropriate bandgap (corresponding to the desired emission wavelength of the UV-LED) chosen from an epitaxial material in FIG. 76B, which can be chosen from the set of compatible materials described above. In this example the n- and p-type layers can be chosen, from the set of compatible materials in FIG. 76B, to be transparent to the emission wavelength, for example, by having bandgaps above the bandgap of the epitaxial oxide material emitting the light. In another example, the n- and p-layers can be chosen, from the set of compatible materials in FIG. 76B, to have indirect bandgaps so that they have low absorption coefficients for the wavelength of the emitted light.

For example, FIG. 76C shows that there is a group of epitaxial oxide materials with "small" lattice constants from about 2.5 Angstroms to about 4 Angstroms, some or all of which could be compatible materials with each other if their lattice constants are sufficiently matched, and their crystal symmetries are compatible. The figure also shows that there is a group of epitaxial oxide materials with "mid" lattice constants from about 4 Angstroms to about 6.5 Angstroms, some or all of which could be compatible materials with each other if their lattice constants are sufficiently matched, and their crystal symmetries are compatible. The figure also shows that there is a group of epitaxial oxide materials with "large" lattice constants from about 7.5 Angstroms to about 9 Angstroms, some or all of which could be compatible materials with each other if their lattice constants are sufficiently matched, and their crystal symmetries are compatible.

FIG. 76C also shows that some fluoride materials (e.g., LiF or $MgF_2$) can be compatible with some epitaxial oxide materials, and can be used in the semiconductor structures described herein. For example, $2\sqrt{2x}$ LiF has a lattice constant of approximately 11.5 Angstroms and can be compatible with the group of epitaxial oxide materials having lattice constants from about 11 to about 13 Angstroms. Additionally, some nitride materials (e.g., AlN) and some carbide materials (e.g., SiC) can also be compatible with some epitaxial oxide materials, and can be used in the semiconductor structures described herein.

FIGS. 76E-76H show charts of some calculated epitaxial oxide material bandgaps (minimum bandgap energies in eV), and their crystal symmetries (space groups).

FIGS. 76G-76H show charts of some calculated epitaxial oxide material bandgaps where the epitaxial oxide materials all have cubic crystal symmetry with a Fd3m space group. The chart in FIG. 76G includes binary and ternary materials, while the chart in FIG. 76H also includes ternary and quaternary epitaxial oxide alloy materials formed by mixing some of the endpoint materials in the chart in FIG. 76G. These materials in the charts in FIGS. 76G-76H can be grown on MgO or LiF substrates, for example, because they have compatible crystal symmetries and lattice constants. As described further herein, MgO and LiF have lattice constants compatible with the epitaxial oxides in the charts in FIGS. 76G-76H when 4 unit cells (in a 2×2 arrangement) of the MgO or LiF substrate are aligned with one unit cell of the epitaxial oxides in the charts. In other cases, materials in the charts in FIGS. 76G-76H can be grown on $MgAl_2O_4$, which has compatible lattice constants and crystal symmetry. Some of the materials shown in the chart in FIG. 76H, for example, are alloys with mixed elements showing compounds formed by alloying or mixing two endpoint epitaxial oxide compounds. For example, "$(Mg_{0.5}Zn_{0.5})Ga_2O_4$" represents a material of type $AB_2O_4$ with half the available A-sites mixed with an equal molar ratio of Mg and Zn species. Such alloyed, or mixed, compounds, typically have bandgaps between the endpoint compositions, in the previous example, between those of $ZnGa_2O_4$ and $MgGa_2O_4$. Digital alloys can also be formed by using the endpoint compounds in a superlattice, for example, having alternating layers of $ZnGa_2O_4$ and $MgGa_2O_4$, to form structures with properties related to (e.g., between those of) the constituent materials, as described herein.

Figure 77:
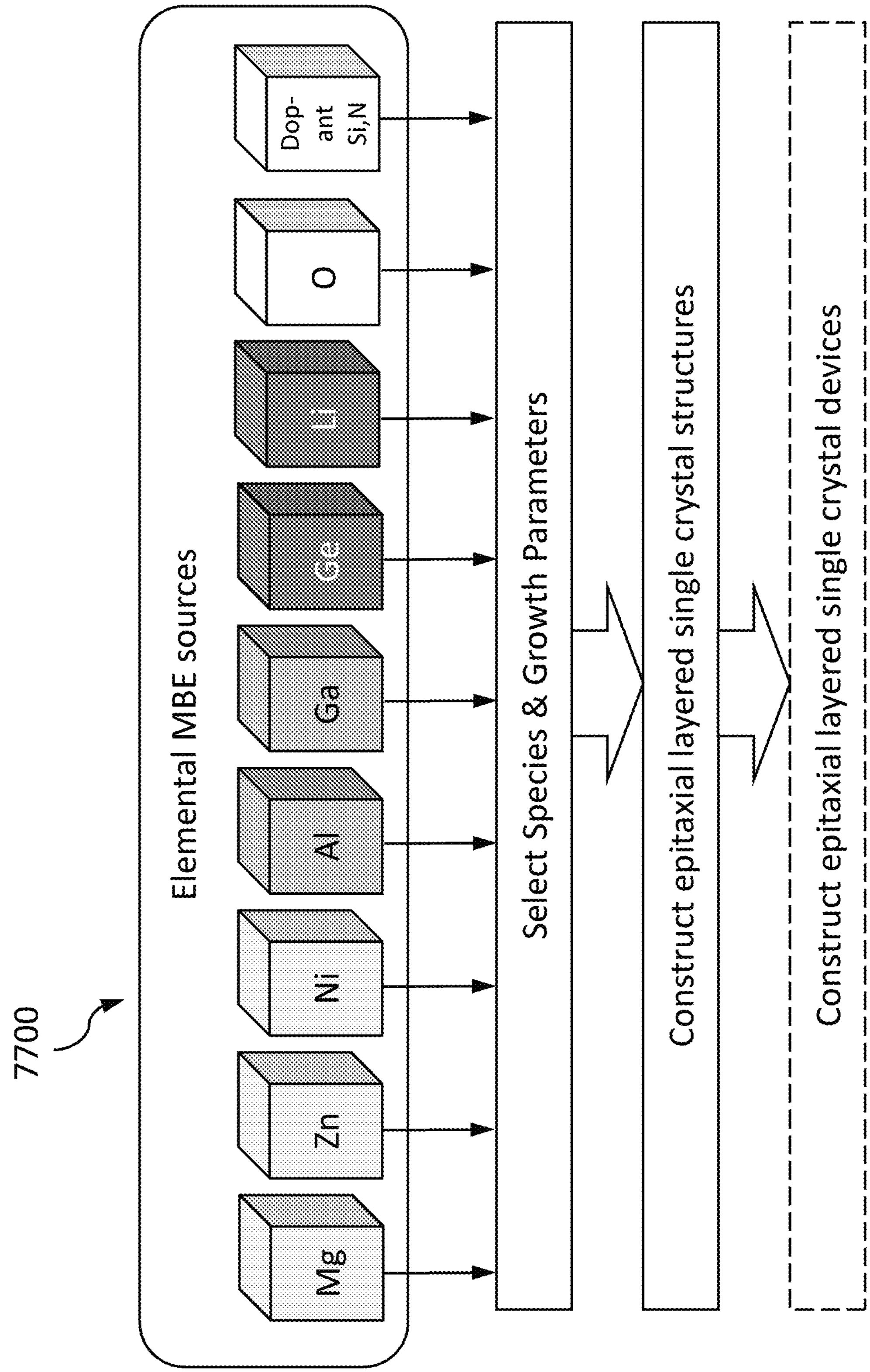
FIG. 77 is a flowchart illustrating a process to form the epitaxial materials described in the present disclosure including those in the table in FIGS. 76A-1 and 76A-2.

FIG. 77 is a flowchart 7700 illustrating a process to form the epitaxial materials described herein (e.g., those in the table in FIGS. 76A-1 and 76A-2). The epitaxial oxides described herein can be grown, for example, using MBE with a select set of elemental sources. A wide variety of epitaxial oxide materials can be grown using a limited number of elemental sources. For example, as shown in the figure, an MBE tool including Mg, Zn, Ni, Al, Ga, Ge, Li and Si (e.g., as a dopant source) solid sources, and O and N plasma sources, can form most of the epitaxial oxide materials shown in the table in FIGS. 76A-1 and 76A-2. In other cases, a smaller number of sources, (e.g., 4 or 5 or 6), can be used to form a set of compatible materials. Some examples of such sets are described herein, and the MBE sources needed to form them can be determined from the constituent elements of the epitaxial oxide materials in the set. As shown in the flowchart in FIG. 77, the MBE sources and growth parameters are chosen, then an epitaxial single crystal layered semiconductor structure is formed. Then, optionally, a device (e.g., a sensor, LED, laser, switch, or other device) can be formed from the semiconductor structure.

Figure 78:
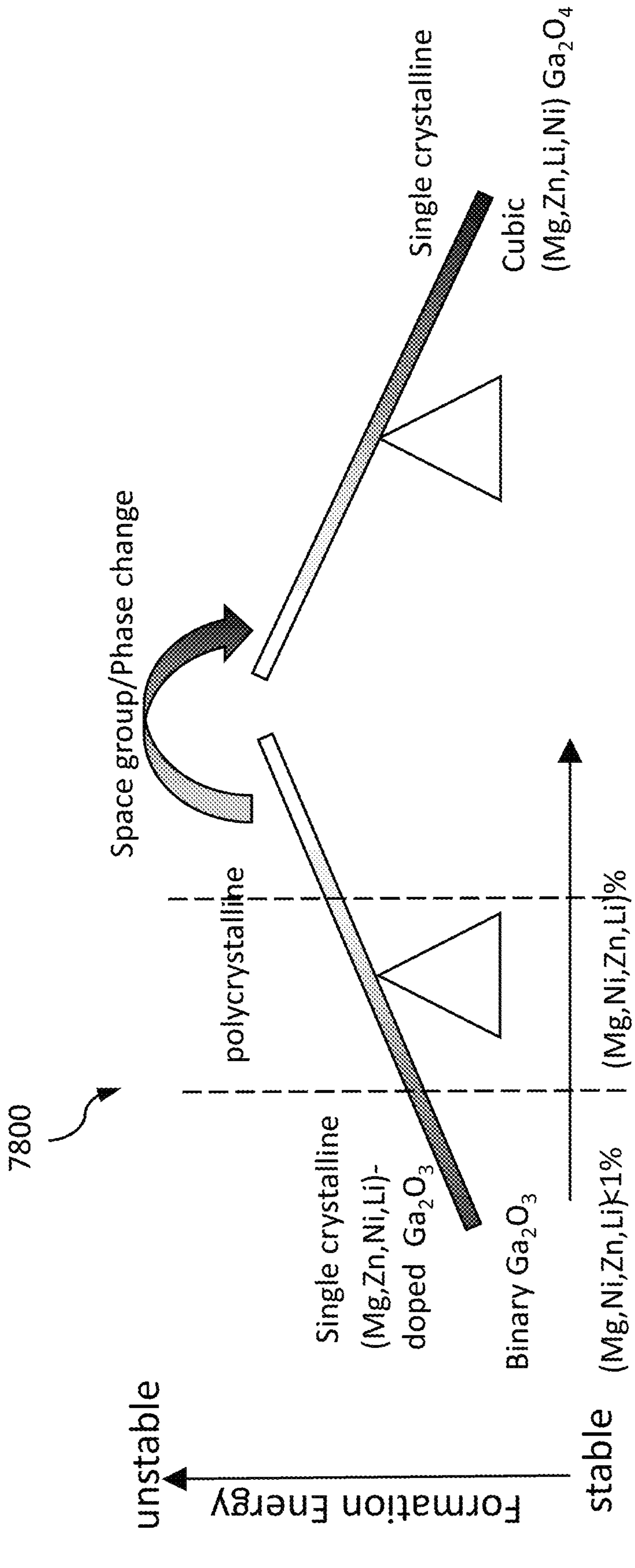
FIG. 78 is a schematic that illustrates the situation that occurs when an element is added to an epitaxial oxide, using the analogy of a seesaw.

FIG. 78 is a schematic 7800 that illustrates the situation that occurs when an element is added to an epitaxial oxide, using the analogy of a seesaw. In this example, the binary $Ga_2O_3$ with an $\alpha$- or $\beta$-crystal symmetry is contemplated. When a small amount of an additional element (e.g., Mg, Ni, Zn or Li) is added (e.g., less than 1 atomic %), the crystal symmetry remains unchanged and the crystal quality remains high (e.g., the concentration of point defects and dislocations remains low, and the smoothness of interfaces remains high). However, when too much of the additional element is added, the crystal quality suffers, and the films can even have multiple phases and/or be polycrystalline (or amorphous). Surprisingly, however, when more of the additional element is added, there can be a tipping point wherein a phase change (or change in the space group of the material) occurs, and the material formed can have the composition of $(A)Ga_2O_4$, where (A) is, for example, Mg, Ni, Li or Zn, and the new crystal symmetry is cubic. The phase change is represented by the analogy of the seesaw switching positions to tilt in the opposite direction.

Figure 79:
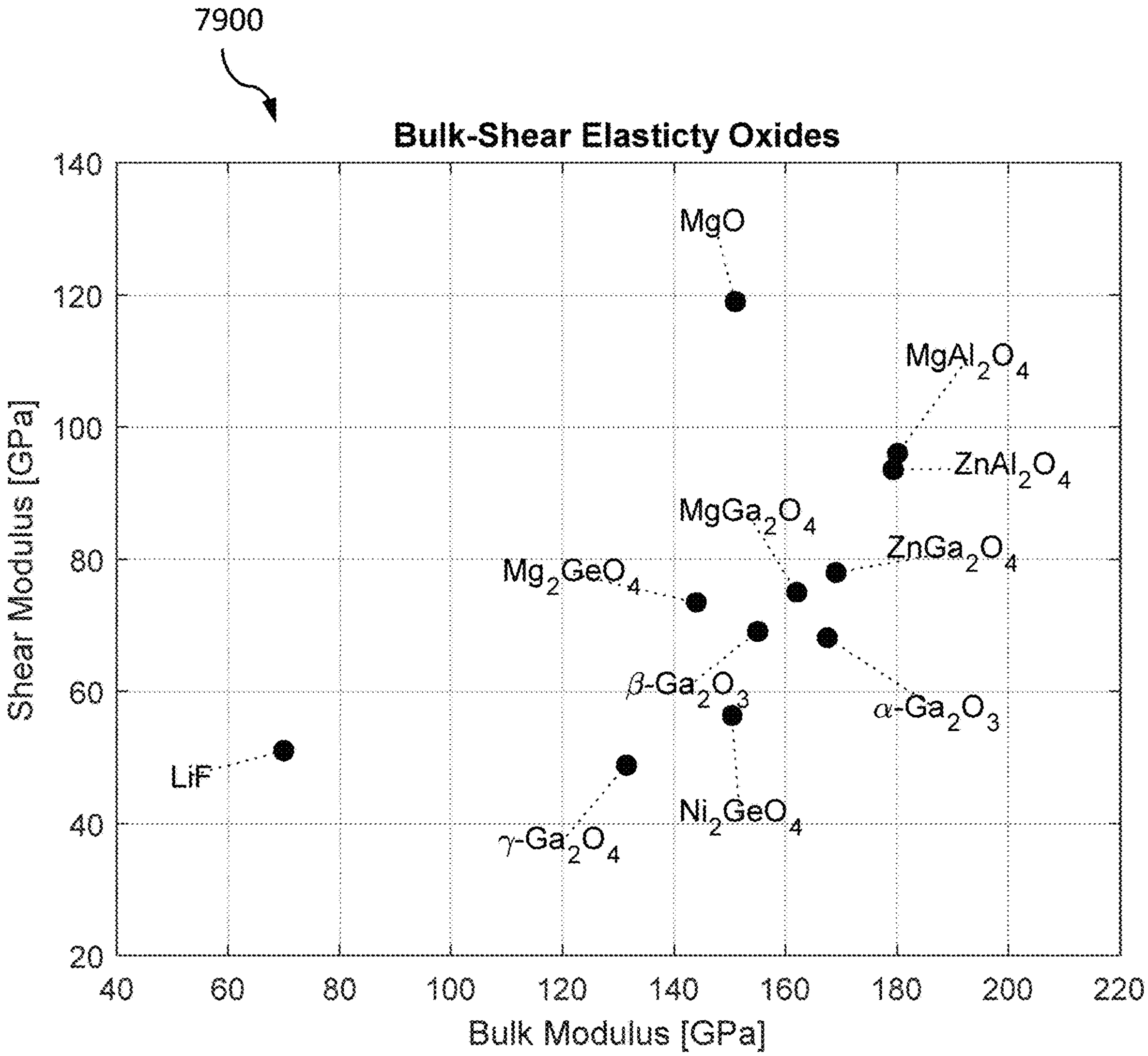
FIG. 79 is a plot of the shear modulus (in GPa) versus the bulk modulus (in GPa) for some example epitaxial oxide materials.
Figure 80:
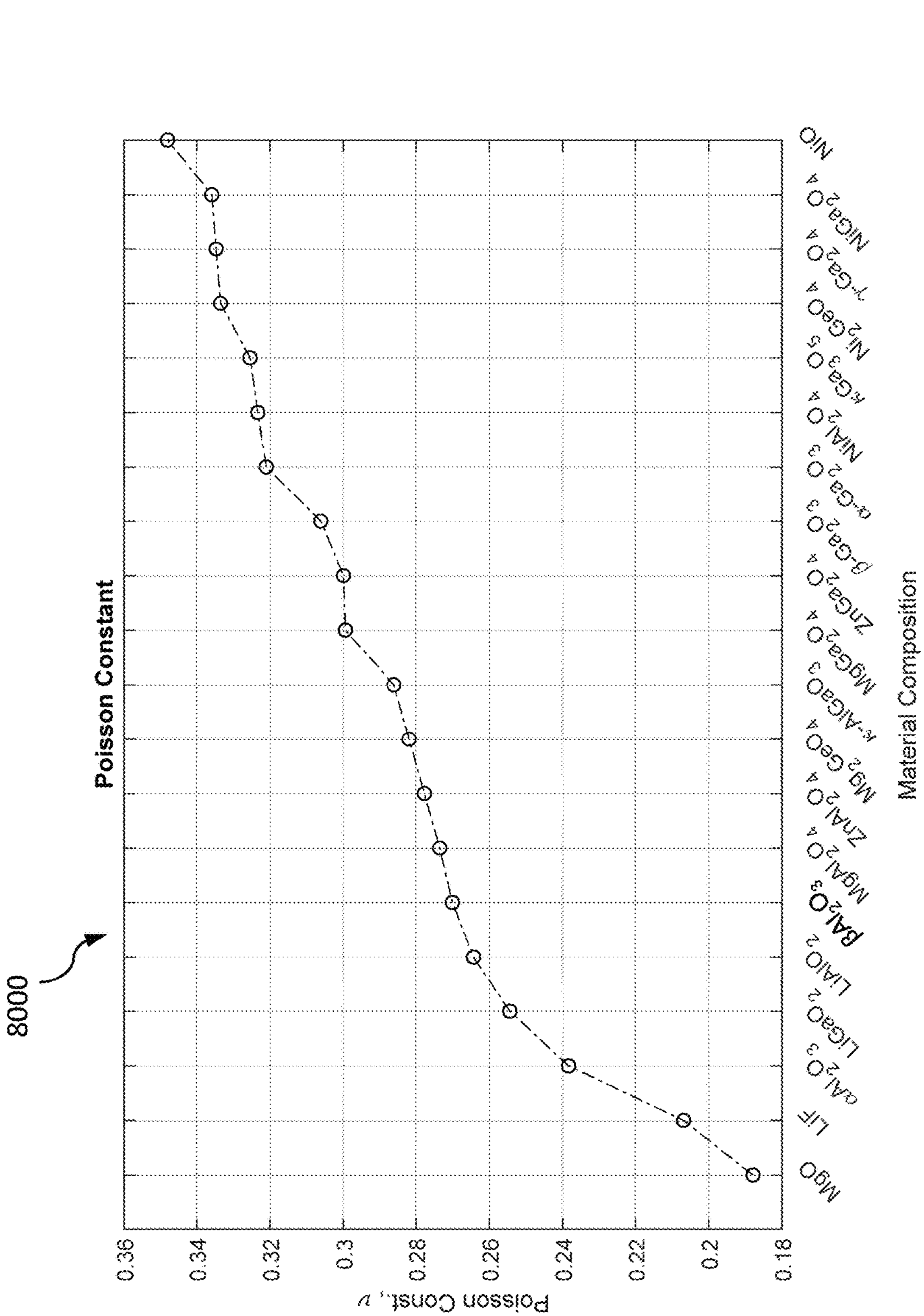
FIG. 80 is a plot of the Poisson's ratio for some example epitaxial oxide materials.

FIGS. 79 and 80 show plots 7900, 8000 of DFT calculated mechanical properties of some epitaxial oxides. In some embodiments, the epitaxial oxides described herein are strained. The mechanical properties of the epitaxial oxide materials can affect some parameters of a semiconductor structure including strained layers, for example the critical layer thickness and/or the amount of lattice constant mismatch that an epitaxial oxide material can tolerate before relaxing (and/or being low quality, and/or having large concentrations of defects). The mechanical properties in FIGS. 79 and 80 were obtained using computer modeling. The computer models used DFT and the TBMBJ exchange potential.

FIG. 79 is a plot 7900 of the shear modulus (in GPa) versus the bulk modulus (in GPa) for some example epitaxial oxide materials. The shear modulus and the bulk modulus are related to the Poisson's ratio, which is shown in plot 8000 in FIG. 80 for some example epitaxial oxide materials. Materials with lower values of Poisson's ratio will deform less in the growth direction when strained in one or more directions perpendicular to the growth direction. These softer materials (e.g., with Poisson's ratio less than 0.35, or less than 0.3, or less than 0.25) can have relatively large critical layer thicknesses even with a large amount of strain (e.g., 0.5%, 1%, 1.5%, 2%, 5% or 10%).

FIGS. 81A-81I show examples of semiconductor structures 6201-6209 comprising epitaxial oxide materials in layers or regions. Each of the semiconductor structures 6201-6209 comprises a substrate 6200*a*-*i* and a buffer layer on the substrate 6210*a*-*i*. The semiconductor structures 6201-6209 also comprise epitaxial oxide layer 6220*a*-*i* formed on buffer layers 6210*a*-*i*. Similarly numbered layers in structures 6201-6209 are the same as, or similar to, layers in other structures 6201-6209. For example, layers 6230*b*, 6230*c*, 6230*d*, etc. are the same as, or similar to, each other. The epitaxial oxide layers of semiconductor structures 6201-6209 can comprise any epitaxial oxide materials described herein, such as any of those with compositions and crystal symmetries shown in FIGS. 76A-1 through 76D.

Substrate 6200*a*-*i* can be any crystalline material compatible with an epitaxial oxide material described herein. For example, substrate 6200*a*-*i* can be $Al_2O_3$ (any crystal symmetry, and C-plane, R-plane, A-plane or M-plane oriented), $Ga_2O_3$ (any crystal symmetry), MgO, LiF, $MgAl_2O_4$, $MgGa_2O_4$, $LiGaO_2$, $LiAlO_2$, $(Al_xGa_{1-x})_2O_3$ (any crystal symmetry), $MgF_2$, $LaAlO_3$, $TiO_2$, or quartz.

Buffer layer 6210*a*-*i* can be any epitaxial oxide material described herein. For example, buffer 6210*a*-*i* can be a material that is the same as the material of the substrate, or the same as a material of a layer to be grown subsequently (e.g., layer 6220*a*-*i*). In some cases, buffer layer 6210*a*-*i* comprises multiple layers, a superlattice, and/or a gradient in composition. Superlattices and/or compositional gradients can in some cases be used to reduce the concentration of defects (e.g., dislocations or point defects) in the layer(s) of the semiconductor structure above the buffer layer (i.e., in a direction away from the substrate). In some cases, a buffer layer 6200*a*-*i* with a gradient in composition can be used to reset the lattice constant upon which the subsequent epitaxial oxide layers are formed. For example, a substrate 6200*a*-*i* can have a first in-plane lattice constant, a buffer layer 6210*a*-*i* can have a gradient in composition such that it starts with the first in-plane lattice constant of the substrate and ends with a second in-plane lattice constant, and a subsequent epitaxial oxide layer 6220*a*-*i* (formed on the buffer layer) can have the second in-plane lattice constant.

Epitaxial oxide layer 6220*a*-*i* can, in some cases, be doped and have an n-type or p-type conductivity. The dopant can be incorporated through co-deposition of an impurity dopant, or an impurity layer can be formed adjacent to epitaxial oxide layer 6220*a*-*i*. In some cases, epitaxial oxide layer 6220*a*-*i* is a polar piezoelectric material and is doped n-type or p-type via spontaneous or induced polarization doping.

Figure 81A:
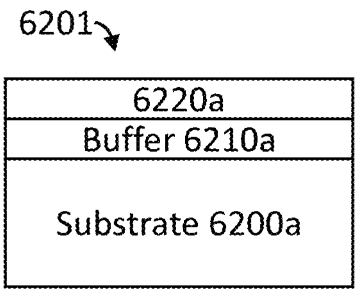
FIGS. 81A-81I show examples of semiconductor structures comprising epitaxial oxide materials in layers or regions.
Figure 81B:
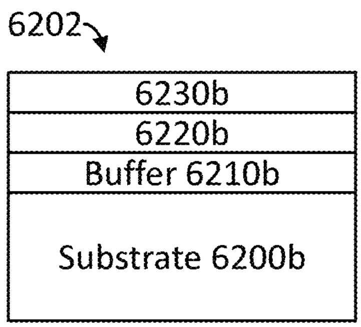
Figure 81C:
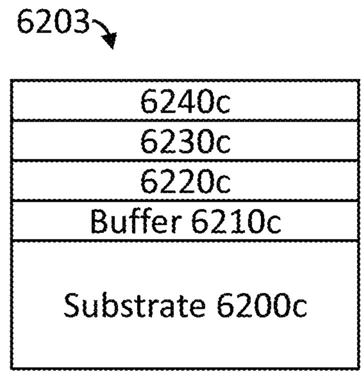
Figure 81D:
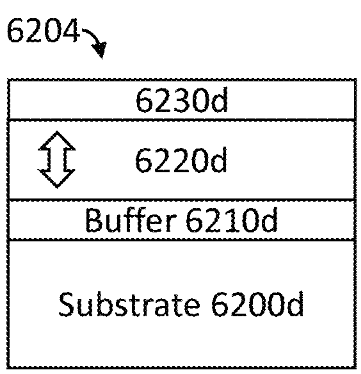
Figure 81E:
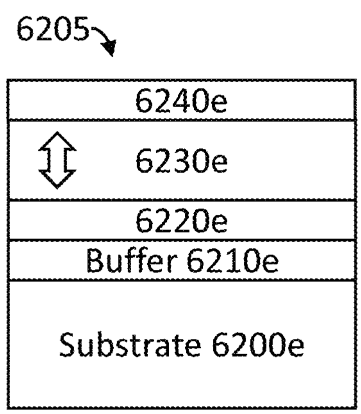
Figure 81F:
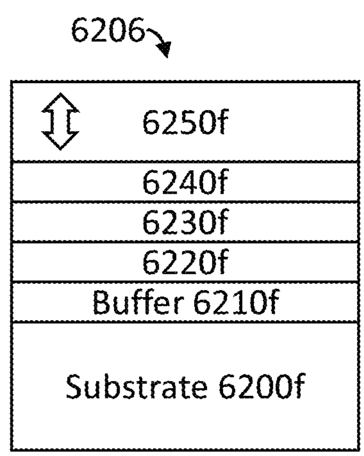

Structure 6201 in FIG. 81A can have a subsequent epitaxial oxide layer, fluoride layer, nitride layer, and/or a metal layer formed on top (i.e., away from the substrate 6200*a-i*) of layer 6220*a*. For example, a metal layer can be formed on epitaxial oxide layer 6220*a* to form a Schottky barrier between epitaxial oxide layer 6220*a* and the metal (e.g., see FIG. 55 where the extrema for creating p-type and n-type electrical contacts are shown). Some examples of medium work function metals that can be used to form a Schottky barrier include Al, Ti, Ti—Al alloys, and titanium nitride (TiN). In other examples, the metal can form an ohmic (or low resistance) contact to epitaxial oxide layer 6220*a*. Some examples of high work function metals that can be used in ohmic (or low resistance) contacts to a p-type epitaxial oxide layer (e.g., 6220*a*) are Ni, Os, Se, Pt, Pd, Ir, Au, W and alloys thereof. Some examples of low work function materials that can be used in ohmic (or low resistance) contacts to an n-type epitaxial oxide layer 6220*a* are Ba, Na, Cs, Nd and alloys thereof. However, in some cases, Al, Ti, Ti—Al alloys, and titanium nitride (TiN) being common metals can also be used as contacts to an n-type epitaxial oxide layer (e.g., 6220*a*). In some cases, the metal contact layer can contain 2 or more layers of metals with different compositions (e.g., a Ti layer and an Al layer).

Structures 6202-6208 in FIGS. 81B-81H further include epitaxial oxide layer 6230*b-h*. In some cases, epitaxial oxide layer 6230*b-h* is not intentionally doped. In some cases, epitaxial oxide layer 6230*b-h* is doped and has an n-type or p-type conductivity (e.g., as described for layer 6220*a-i*). In some cases, epitaxial oxide layer 6230*b-h* is doped and has an opposite conductivity type as epitaxial oxide layer 6220*b-h* to form a p-n junction. For example, epitaxial oxide layer 6220*b-h* can have n-type conductivity and epitaxial oxide layer 6230*b-h* can have p-type conductivity. Alternatively, epitaxial oxide layer 6220*b-h* can have p-type conductivity and epitaxial oxide layer 6230*b-h* can have n-type conductivity.

In structure 6202, in some cases, a metal layer can be formed on epitaxial oxide layer 6220*a* to form an ohmic (or low resistance) contact to epitaxial oxide layer 6230*b*. Some examples of high work function metals that can be used in ohmic (or low resistance) contacts to a p-type epitaxial oxide layer 6230*b* are Ni, Os, Se, Pt, Pd, Ir, Au, W and alloys thereof. Some examples of low work function materials that can be used in ohmic (or low resistance) contacts to an n-type epitaxial oxide layer 6230*b* are Ba, Na, Cs, Nd and alloys thereof. However, in some cases, Al, Ti, Ti—Al alloys, and titanium nitride (TiN) being common metals can also be used as contacts to an n-type epitaxial oxide layer (e.g., 6220*a*). In some cases, the metal contact layer can contain 2 or more layers of metals with different compositions (e.g., a Ti layer and an Al layer).

In an example of structure 6202, substrate 6200*b* is MgO or $\gamma$-$Ga_2O_3$ (i.e., $Ga_2O_3$ with an Fd3m space group), or $\gamma$-$Al_2O_3$ (i.e., $Al_2O_3$ with an Fd3m space group). Epitaxial oxide layer 6220*b* is $\gamma$-$(Al_xGa_{1-x})_2O_3$ with an Fd3m space group, where $0 \le x \le 1$, and has n-type conductivity. Epitaxial oxide layer 6230*b* is $\gamma$-$(Al_yGa_{1-y})_2O_3$ with an Fd3m space group, where $0 \le y \le 1$, and has p-type conductivity. In some cases, x and y are the same and the p-n junction is a homojunction, and in other cases x and y are different and the p-n junction is a heterojunction. A metal contact layer (e.g., Al, Os or Pt) can be formed to make an ohmic contact with epitaxial oxide layer 6230*b*. A second contact layer (e.g., containing Ti and/or Al, and or layers of Ti and Al) can be formed making contact to the substrate 6200*b* and/or epitaxial oxide layer 6220*b*. Such a semiconductor structure with metal contacts can be used as a diode in an optoelectronic device, such as an LED, laser or photodetector. In the case of optoelectronic devices, one or both of the metal contacts formed can be patterned (e.g., to form one or more exit apertures) to allow light to escape the semiconductor structure. In some cases, one or both contacts are reflective or partially reflective to improve the light extraction from the semiconductor structure, for example to form a resonant cavity, or redirect emitted light (e.g., towards one or more exit apertures).

Structure 6203 further includes epitaxial oxide layer 6240*c*. In some cases, epitaxial oxide layer 6240*c* is doped and has an n-type or p-type conductivity (e.g., as described for layer 6220*a-i*). In some cases, epitaxial oxide layer 6230*c* is not intentionally doped, and epitaxial oxide layer 6240*c* is doped and has an opposite conductivity type as epitaxial oxide layer 6220*c* to form a p-i-n junction.

In structure 6203, in some cases, a metal layer can be formed on epitaxial oxide layer 6240*c* to form an ohmic (or low resistance) contact to epitaxial oxide layer 6240*c* and on the substrate 6200*c* (and/or epitaxial oxide layer 6220*c*) using appropriate high or low work function metals (as described above).

In structure 6204 epitaxial oxide layer 6220*d* has a gradient in composition (as indicated by the double arrow), wherein the composition can change monotonically in either direction, or in both directions, or non-monotonically. In some cases, epitaxial oxide layer 6220*d* is doped and has an n-type or p-type conductivity (e.g., as described for layer 6220*a-i*). In some cases, epitaxial oxide layer 6230*d* is doped and has an opposite conductivity type as epitaxial oxide layer 6220*d* to form a p-n junction.

In structure 6204, in some cases, a metal layer can be formed on epitaxial oxide layer 6230*d* to form an ohmic (or low resistance) contact to epitaxial oxide layer 6230*d* and on the substrate 6200*d* (and/or epitaxial oxide layer 6220*d*) using appropriate high or low work function metals (as described above).

In structure 6205 epitaxial oxide layer 6230*e* has a gradient in composition, wherein the composition can change monotonically in either direction, or in both directions (as indicated by the double arrow), or non-monotonically. In some cases, epitaxial oxide layer 6230*e* is not intentionally doped, epitaxial oxide layer 6220*e* has n-type or p-type conductivity, and epitaxial oxide layer 6240*e* has an opposite conductivity to epitaxial oxide layer 6220*e* to form a p-i-n junction with a graded i-layer.

In structure 6205, in some cases, a metal layer can be formed on epitaxial oxide layer 6240*e* to form an ohmic (or low resistance) contact to epitaxial oxide layer 6240*e* and on the substrate 6200*e* (and/or epitaxial oxide layer 6220*e*) using appropriate high or low work function metals (as described above).

In structure 6206 epitaxial oxide layer 6250*f* has a gradient in composition (as indicated by the double arrow), wherein the composition can change monotonically in either direction, or in both directions, or non-monotonically. In some cases, epitaxial oxide layer 6250*f* is doped and has n-type or p-type conductivity, epitaxial oxide layer 6240*f* is doped and has the same conductivity type as epitaxial oxide layer 6250*f*, epitaxial oxide layer 6230*f* is not intentionally doped, and epitaxial oxide layer 6240*f* has an opposite conductivity to epitaxial oxide layer 6220*f* to form a p-i-n junction with epitaxial oxide layer 6250*f* acting as a graded contact layer.

In structure 6206, in some cases, a metal layer can be formed on epitaxial oxide layer 6250*f* to form an ohmic (or low resistance) contact to epitaxial oxide layer 6250*f* and on the substrate 6200*f* (and/or epitaxial oxide layer 6220*f*) using appropriate high or low work function metals (as described above). In some cases, epitaxial oxide layer 6250*f* comprises a polar and piezoelectric material, and the graded composition of epitaxial oxide layer 6250*f* improves the properties (e.g., lowers the resistance) of the contact.

In structure 6207 epitaxial oxide layer 6230*g* has a quantum well or a superlattice (as indicated by the quantum well schematic in epitaxial oxide layer 6230*g*), or a multilayer structure with at least one narrower bandgap material layer that is sandwiched between two adjacent wider bandgap layers. In some cases, epitaxial oxide layer 6230*g* is not intentionally doped, epitaxial oxide layer 6220*g* has n-type or p-type conductivity, and epitaxial oxide layer 6240*g* has an opposite conductivity to epitaxial oxide layer 6220*e* to form a p-i-n junction with a graded i-layer. For example, the epitaxial oxide layer 6230*g* can include a superlattice or (a chirp layer with a graded multilayer structure), comprising alternating layers of $Al_{xa}Ga_{1-xa}O_y$ and $Al_{xb}Ga_{1-xb}O_y$, where xa≠xb, 0≤xa≤1 and 0≤xb≤1.

In structure 6207, in some cases, a metal layer can be formed on epitaxial oxide layer 6240*g* to form an ohmic (or low resistance) contact to epitaxial oxide layer 6240*g* and on the substrate 6200*g* (and/or epitaxial oxide layer 6220*g*) using appropriate high or low work function metals (as described above).

In structure 6208 epitaxial oxide layer 6250*h* has a quantum well or a superlattice, or a multilayer structure with at least one narrower bandgap material layer that is sandwiched between two adjacent wider bandgap layers. In some cases, epitaxial oxide layer 6250*h* is a chirp layer with a multilayer structure with alternating narrower bandgap material layers and wider bandgap material layers and a composition variation (e.g., formed by varying the period of the narrower and wider bandgap layers). In some cases, epitaxial oxide layer 6250*h* is doped and has n-type or p-type conductivity, epitaxial oxide layer 6240*h* is doped and has the same conductivity type as epitaxial oxide layer 6250*h*, epitaxial oxide layer 6230*h* is not intentionally doped, and epitaxial oxide layer 6240*h* has an opposite conductivity to epitaxial oxide layer 6220*h* to form a p-i-n junction with epitaxial oxide layer 6250*h* acting as a graded contact layer. For example, the epitaxial oxide layer 6250*h* can include a superlattice or (a chirp layer with a graded multilayer structure), comprising alternating layers of $Al_{xa}Ga_{1-xa}O_y$ and $Al_{xb}Ga_{1-xb}O_y$, where xa≠xb, 0≤xa≤1 and 0≤xb≤1.

In structure 6208, in some cases, a metal layer can be formed on epitaxial oxide layer 6250*h* to form an ohmic (or low resistance) contact to epitaxial oxide layer 6250*h* and on the substrate 6200*h* (and/or epitaxial oxide layer 6220*h*) using appropriate high or low work function metals (as described above). In some cases, epitaxial oxide layer 6250*h* comprises a polar and piezoelectric material, and the graded composition of epitaxial oxide layer 6250*h* improves the properties (e.g., lowers the resistance) of the contact.

In structure 6209 epitaxial oxide layer 6220*i* has a quantum well or a superlattice, or a multilayer structure with at least one narrower bandgap material layer that is sandwiched between two adjacent wider bandgap layers. For example, epitaxial oxide layer 6220*i* can comprise a digital alloy with alternating layers of epitaxial materials with different properties. Such an epitaxial oxide layer 6220*i* can have optical and/or electrical properties that would otherwise not be compatible with a given substrate, for example. Digital alloy materials and structures are discussed further herein. For example, the epitaxial oxide layer 6220*i* can include a superlattice or (a chirp layer with a graded multilayer structure), comprising alternating layers of $Al_{xa}Ga_{1-xa}O_y$ and $Al_{xb}Ga_{1-xb}O_y$, where xa≠xb, 0≤xa≤1 and 0≤xb<3.

Figure 81G:
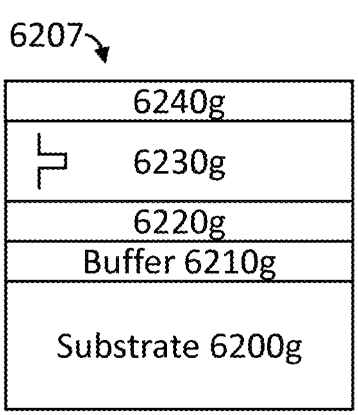
Figure 81H:
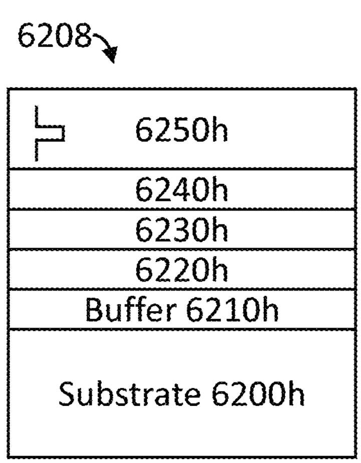
Figure 81I:
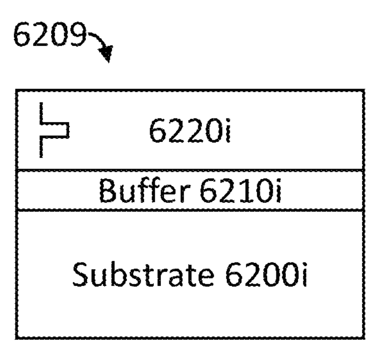
Figure 81J:
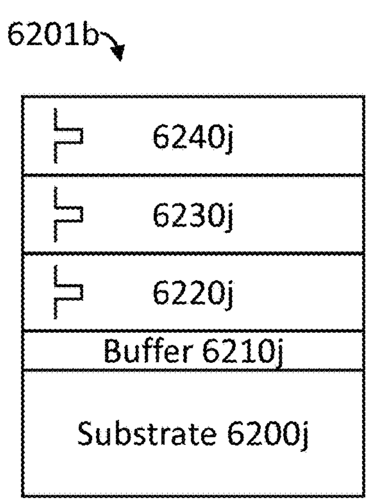
FIGS. 81J-81L show additional examples of semiconductor structures comprising epitaxial oxide materials in layers or regions.
Figure 81K:
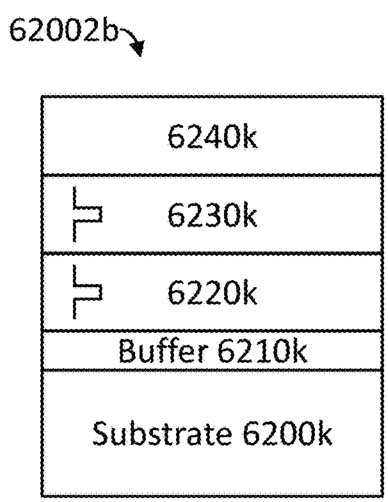
Figure 81L:
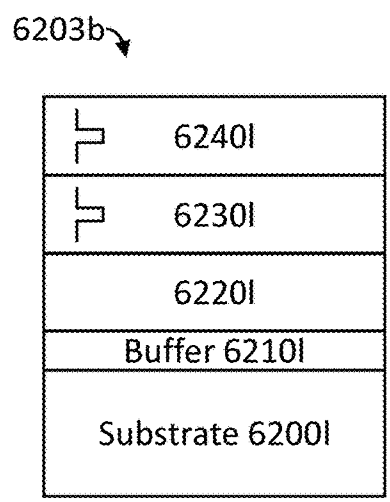

FIGS. 81J-81L show examples of semiconductor structures 6201*b*-6203*b* comprising epitaxial oxide materials in layers or regions. Similarly, numbered layers in structures 6201*b*-6203*b* are the same as, or similar to, layers in structures 6201-6209.

Semiconductor structure 6201*b* shows an example where there are three adjacent superlattices and/or chirp layers 6220*j*, 6230*j*, and 6240*j* (which are similar to layers 6220*i*, 6230*g* and 6250*h*, respectively, in FIGS. 81G-81I) comprising epitaxial oxide materials and forming different possible doping profiles, such as p-i-n, p-n-p, or n-p-n. For example, epitaxial oxide layer(s) 6220*j*, 6230*j* and/or 6250*j* can comprise digital alloy(s) with alternating layers of epitaxial materials with different properties. Such epitaxial oxide layer(s) 6220*j*, 6230*j* and/or 6250*j* comprising digital alloys can have optical and/or electrical properties that would otherwise not be compatible with a given substrate.

Semiconductor structure 6202*b* shows an example where there are two adjacent superlattices and/or chirp layers 6220*k* and 6230*k* (which are similar to layers 6220*i* and 6230*g*, respectively, in FIGS. 81I and 81G) and a layer 6240*k* all comprising epitaxial oxide materials and forming different possible doping profiles, such as p-i-n, p-n-p, or n-p-n. For example, epitaxial oxide layer(s) 6220*k* and/or 6230*k* can comprise digital alloy(s) with alternating layers of epitaxial materials with different properties.

Semiconductor structure 6203*b* shows an example where there are two superlattices and/or chirp layers 6230*l* and 6240*l* (which are similar to layers 6230*g* and 6250*h*, respectively, in FIGS. 81G-81H) and a layer 6220*l* all comprising epitaxial oxide materials and forming different possible doping profiles, such as p-i-n, p-n-p, or n-p-n. For example, epitaxial oxide layer(s) 6230*l* and/or 6240*l* can comprise digital alloy(s) with alternating layers of epitaxial materials with different properties.

Furthermore, the buffer layer 6210*j*-*l* can comprise a superlattice or chirp layer, and also be adjacent to the other superlattices in some of the structures.

In some cases, any of structures 6201-6209 in FIGS. 81A-S81I and structures 6201*b*-6203*b* in FIGS. 81J-81L can have a subsequent epitaxial oxide layer, fluoride layer, nitride layer, and/or a metal layer formed on top (i.e., away from the substrate 6200*a*-*l*) of the topmost layer in the structure (e.g., layer 6230*b* for structure 6202).

In some cases, any of structures 6201-6209 in FIGS. 81A-81I and structures 6201*b*-6203*b* in FIGS. 81J-81L can further include one or more reflectors that are configured to reflect wavelengths of light that are generated by the semiconductor structure. For example, a reflector can be positioned between the buffer layer and the epitaxial oxide layer(s). For example, a reflector can be a distributed Bragg reflector, formed using the same epitaxial growth technique as the other epitaxial oxide layers in the semiconductor structure. In another example, a reflector can be formed on top of the semiconductor structure, opposite the substrate. For example, a reflective metal (e.g., Al or Ti/Al) can be used as a top contact and a reflector.

Figure 82A:
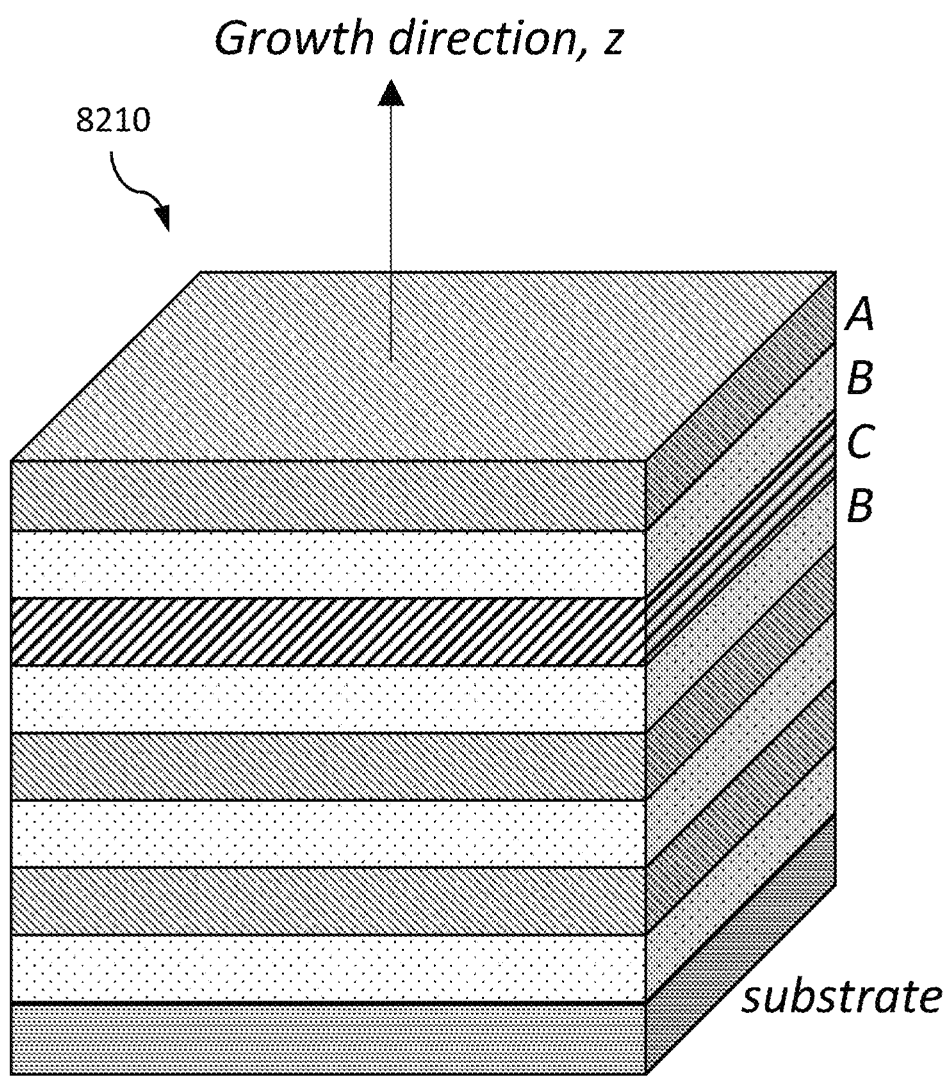

FIG. 82A is a schematic of an example semiconductor structure 8210 comprising epitaxial oxide layers on a suitable substrate. Alternating layers of epitaxial oxide semiconductors A and B are shown on the substrate. Additionally, the semiconductor structure in this example has a different epitaxial oxide layer C substituted for an epitaxial oxide layer A. In one example, the A layer could comprise Mg(Al, $Ga)_2O_4$, the B layer could comprise MgO, and the C layer would be $Mg_2GeO_4$ where the substrate could be MgO or $MgAl_2O_4$.

FIGS. 82B-82I show electron energy (on the y-axis) vs. growth direction (on the x-axis) for embodiments of epitaxial oxide heterostructures comprising layers of dissimilar epitaxial oxide materials.

Figure 82B:
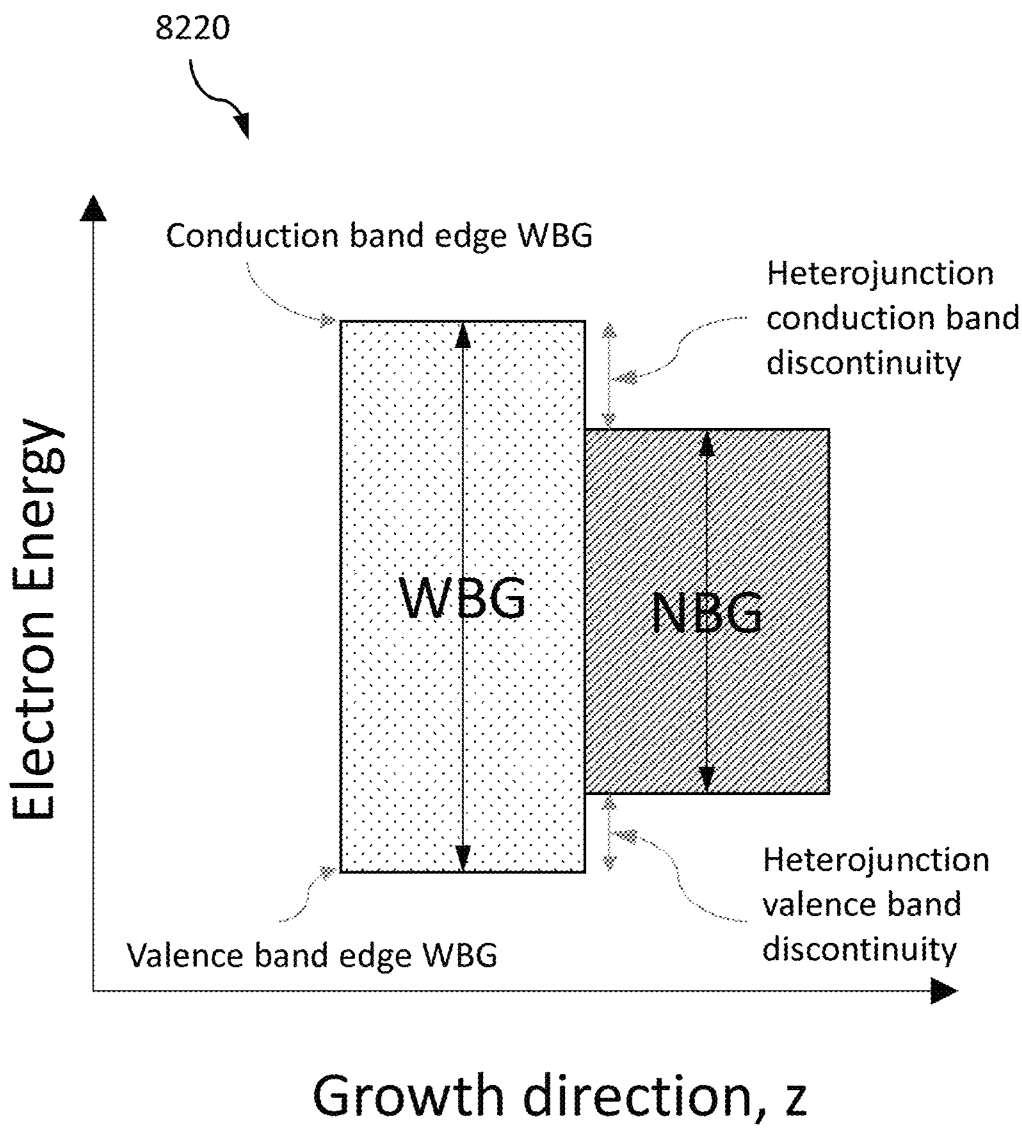

FIG. 82B shows an example of an epitaxial oxide heterostructure 8220. The wider bandgap (WBG) material and the narrower bandgap (NBG) material in this example align such that there are heterojunction conduction band and valence band discontinuities, as shown. The band alignment in this example is a type I band alignment, but type II or type III band alignments are possible in other cases.

Figure 82C:
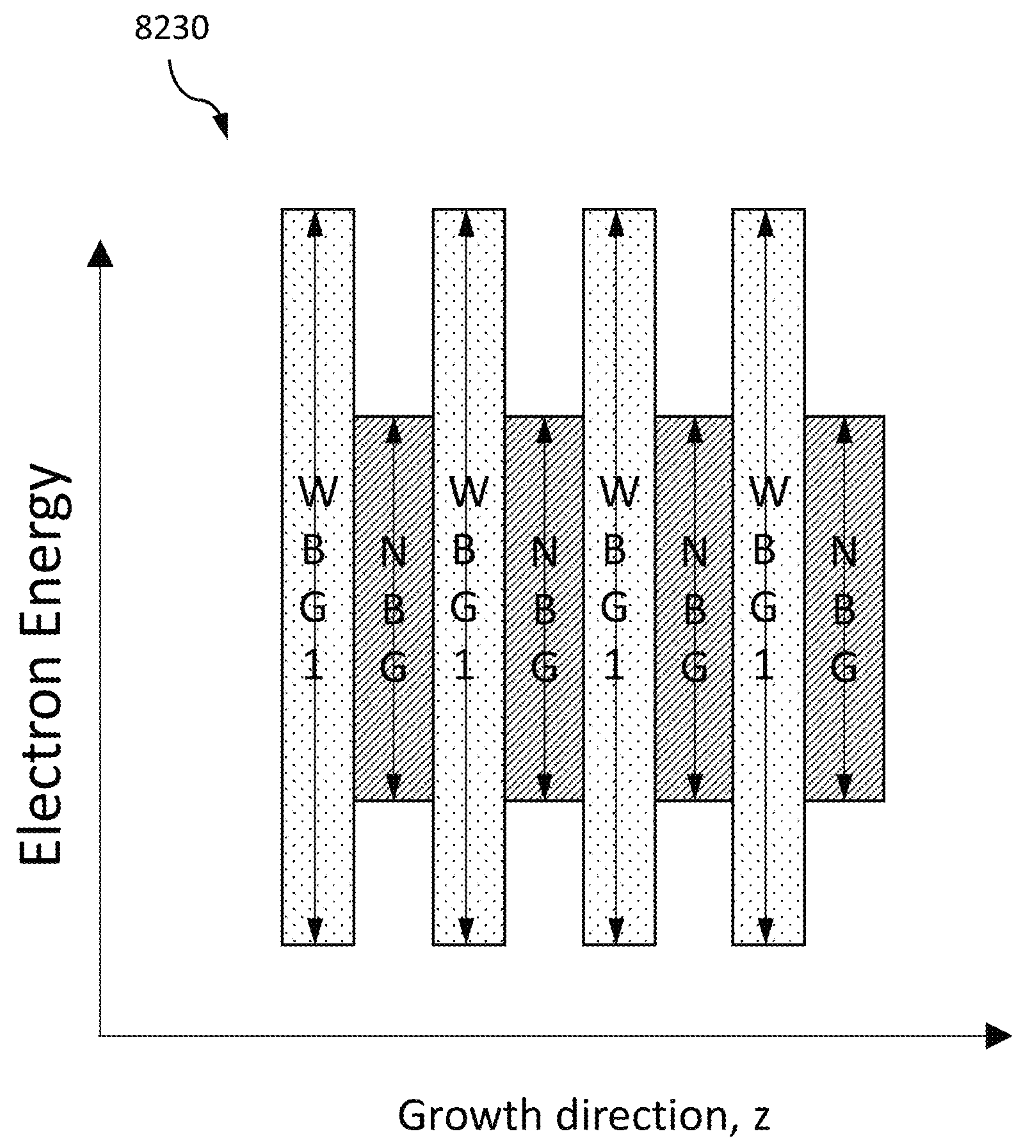

The structure shown in FIG. 82C is an example of an epitaxial oxide superlattice 8230 formed by repeating the structure of FIG. 82B four times along the growth direction "z." Other superlattices can contain fewer or more than 4 unit cells, for example, from 2 to 1000, from 10 to 1000, from 2 to 100, or from 10 to 100 unit cells. The structure of FIG. 82B is the unit cell of the epitaxial oxide superlattice shown in FIG. 82C. In some cases, a short period superlattice (or SPSL) can be formed if the layers of the unit cell of the superlattice are sufficiently thin (e.g., thinner than 10 nm, or 5 nm, or 1 nm).

Figure 82D:
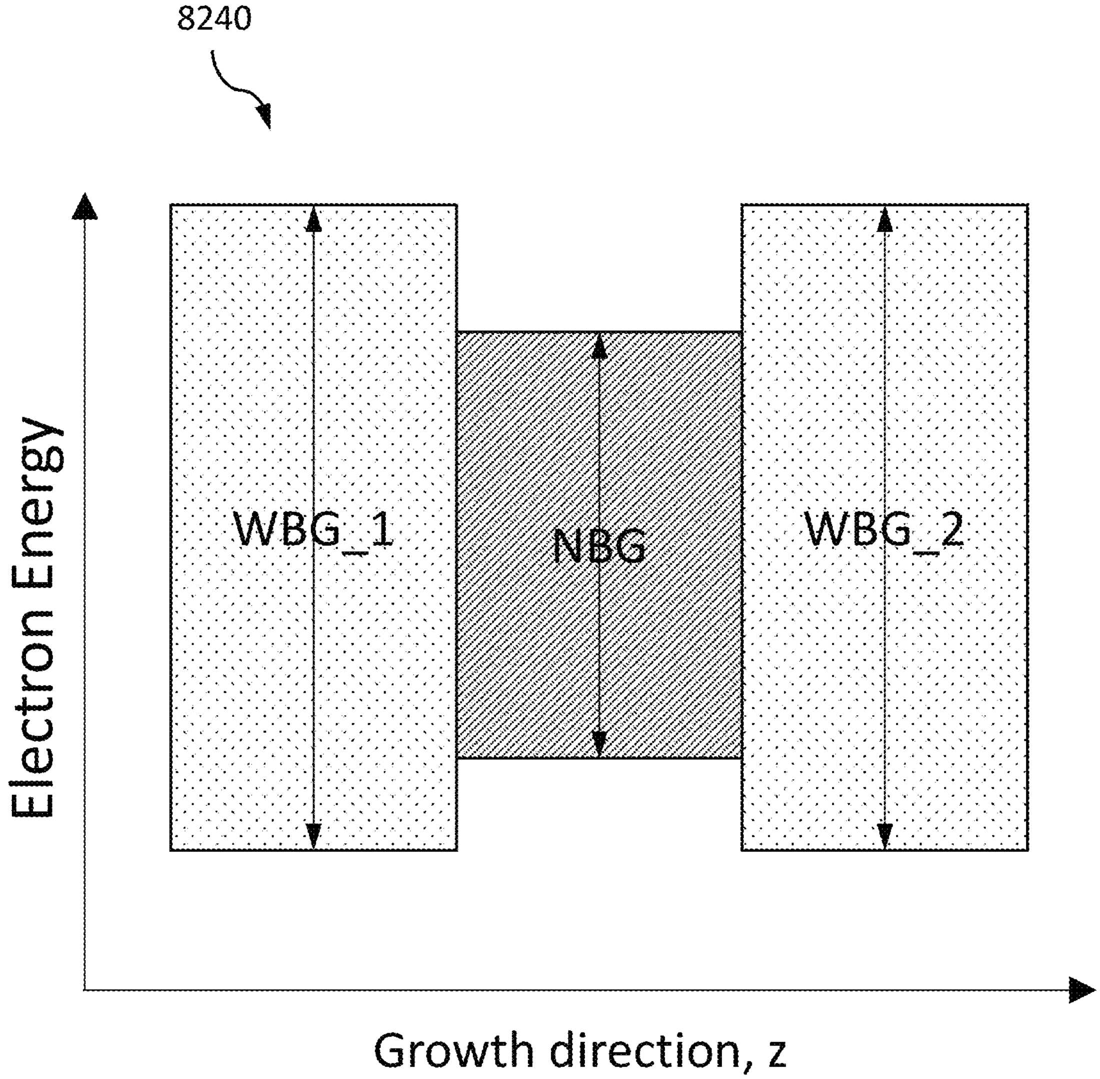

FIG. 82D shows an example of an epitaxial oxide double heterostructure 8240 with layers of a WBG material surrounding an NBG material, with type I band alignments. If the NBG material layer in this example were made sufficiently thin (e.g., below 10 nm, or below 5 nm, or below 1 nm) then the structure in FIG. 82D would comprise a single quantum well.

Figure 82E:
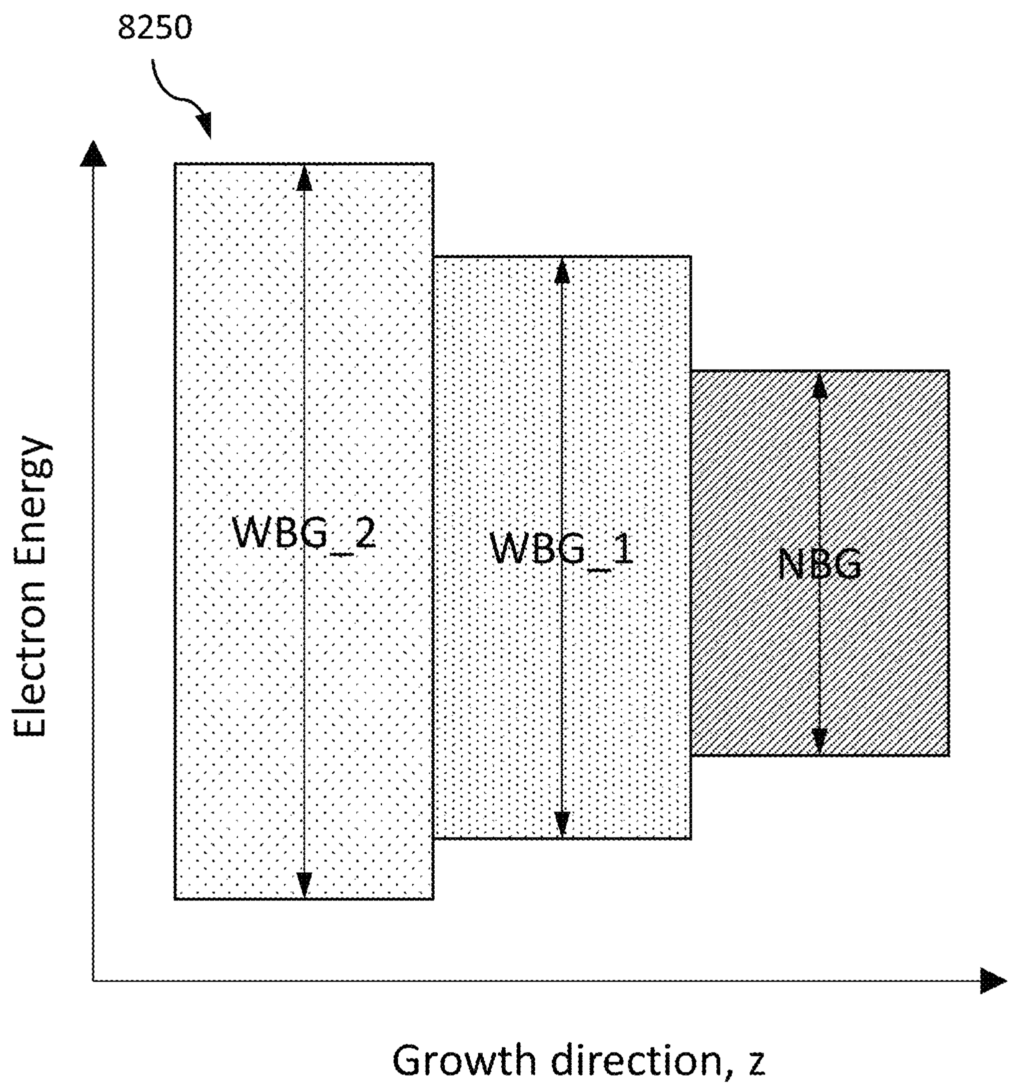

FIG. 82E shows an example of an epitaxial oxide heterostructure 8250 with three different materials, an NBG material and two wider bandgap materials WBG_1 and WBG_2. In this example, at both the interface between the NBG material and the WBG_material and at the interface between the WBG_1 material and the WBG_2 material, the epitaxial oxide layers align in a type I band alignment.

Figure 82F:
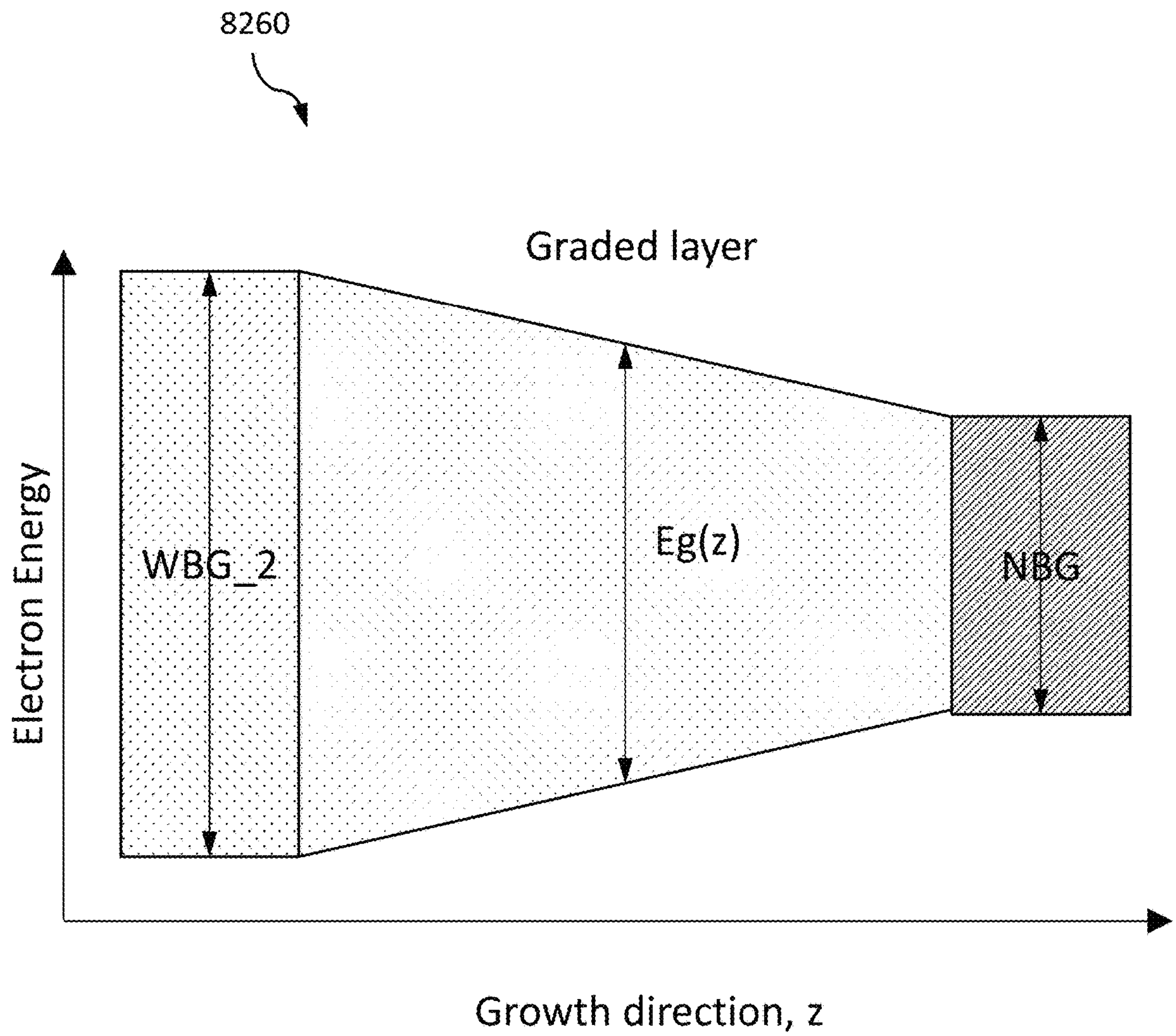

FIG. 82F shows an example semiconductor structure 8260 of a WBG material WBG_2 and an NBG material coupled with a graded layer. The graded layer in this example has a changing bandgap Eg(z) formed by a changing average composition throughout the graded layer. The composition and bandgap of the graded layer in this example changes monotonically from those of the WBG_material to those of the NBG material, such that there are no (or small) bandgap discontinuities at the interfaces.

Figure 82G:
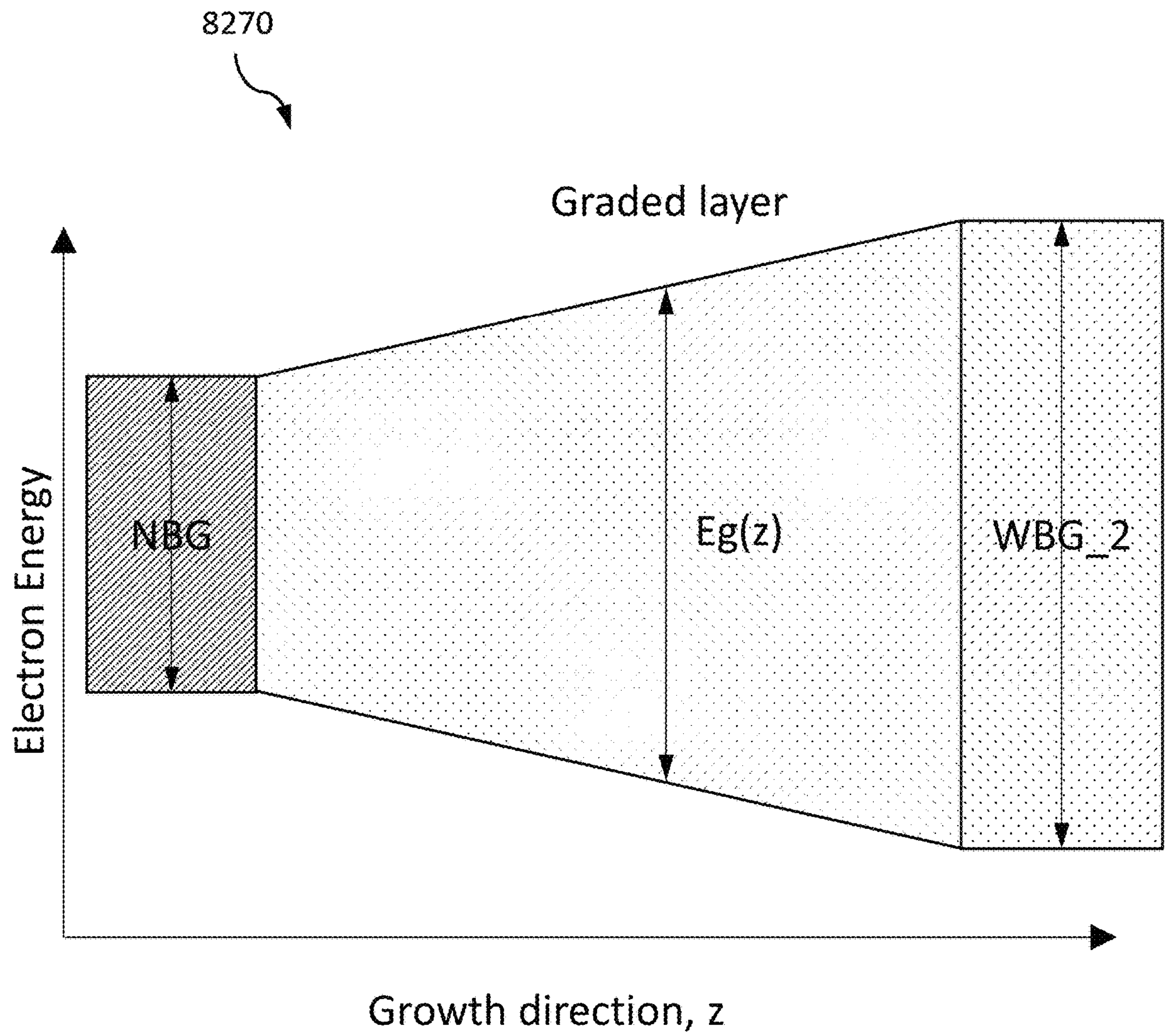

FIG. 82G shows an example semiconductor structure 8270 of an NBG material and a WBG material WBG_2 coupled with a graded layer that is similar to the example shown in FIG. 82G except that the NBG material occurs before the WBG material (i.e., closer to the substrate) along the growth direction.

Figure 82H:
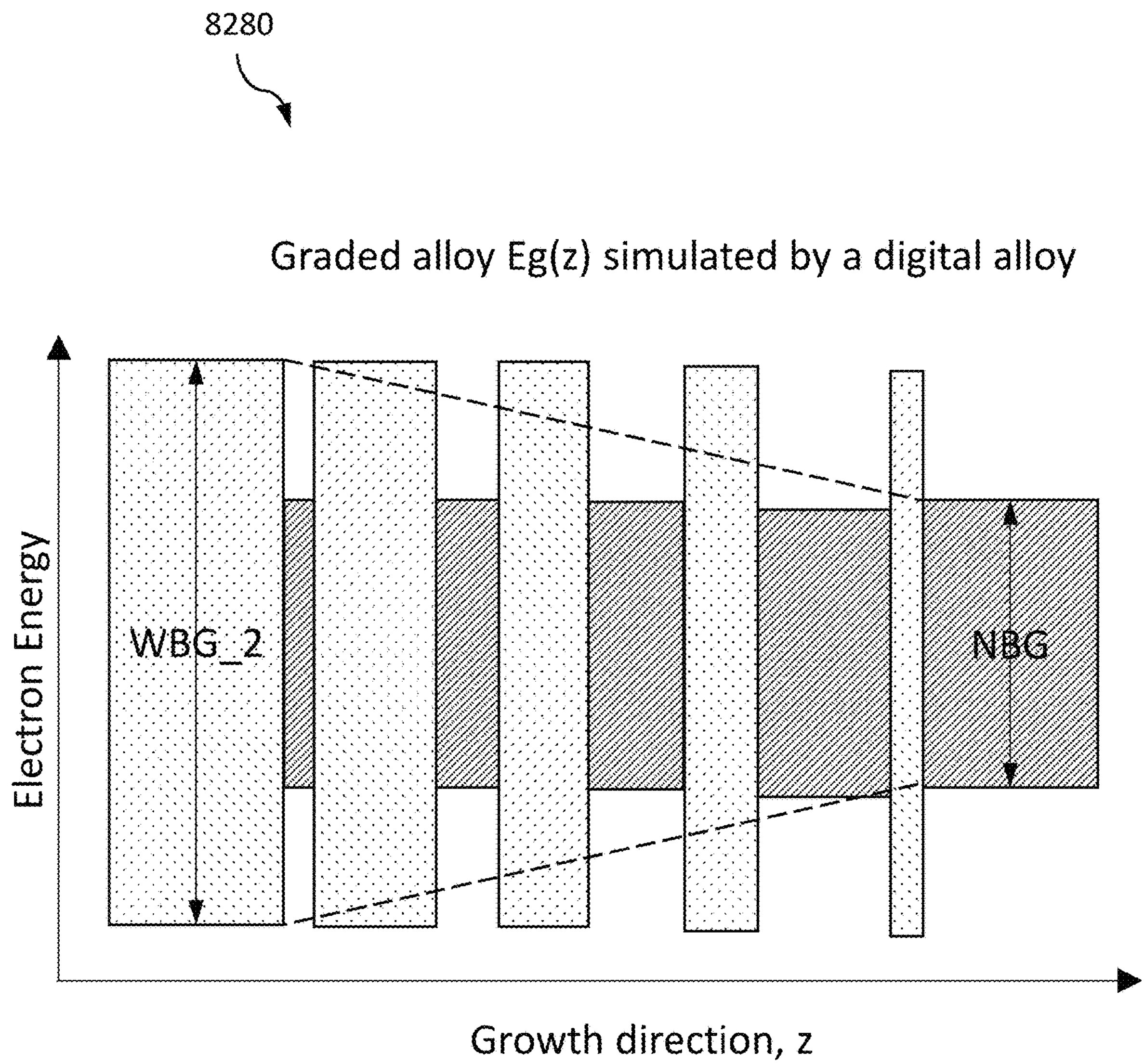

FIG. 82H shows an example semiconductor structure 8280 of a WBG material WBG_2 and an NBG material coupled with a chirp layer. The chirp layer in this example comprises a multilayer structure of epitaxial oxide materials with alternating layers of a WBG epitaxial oxide material layer and an NBG epitaxial oxide material layer, where the thicknesses of the NBG layers and the WBG layers change throughout the chirp layer. In other examples, the WBG layers could have changing thicknesses and the NBG layers could have the same thickness, or the NBG layers could have changing thicknesses and the WBG layers could have the same thickness throughout the chirp layer.

Figure 82I:
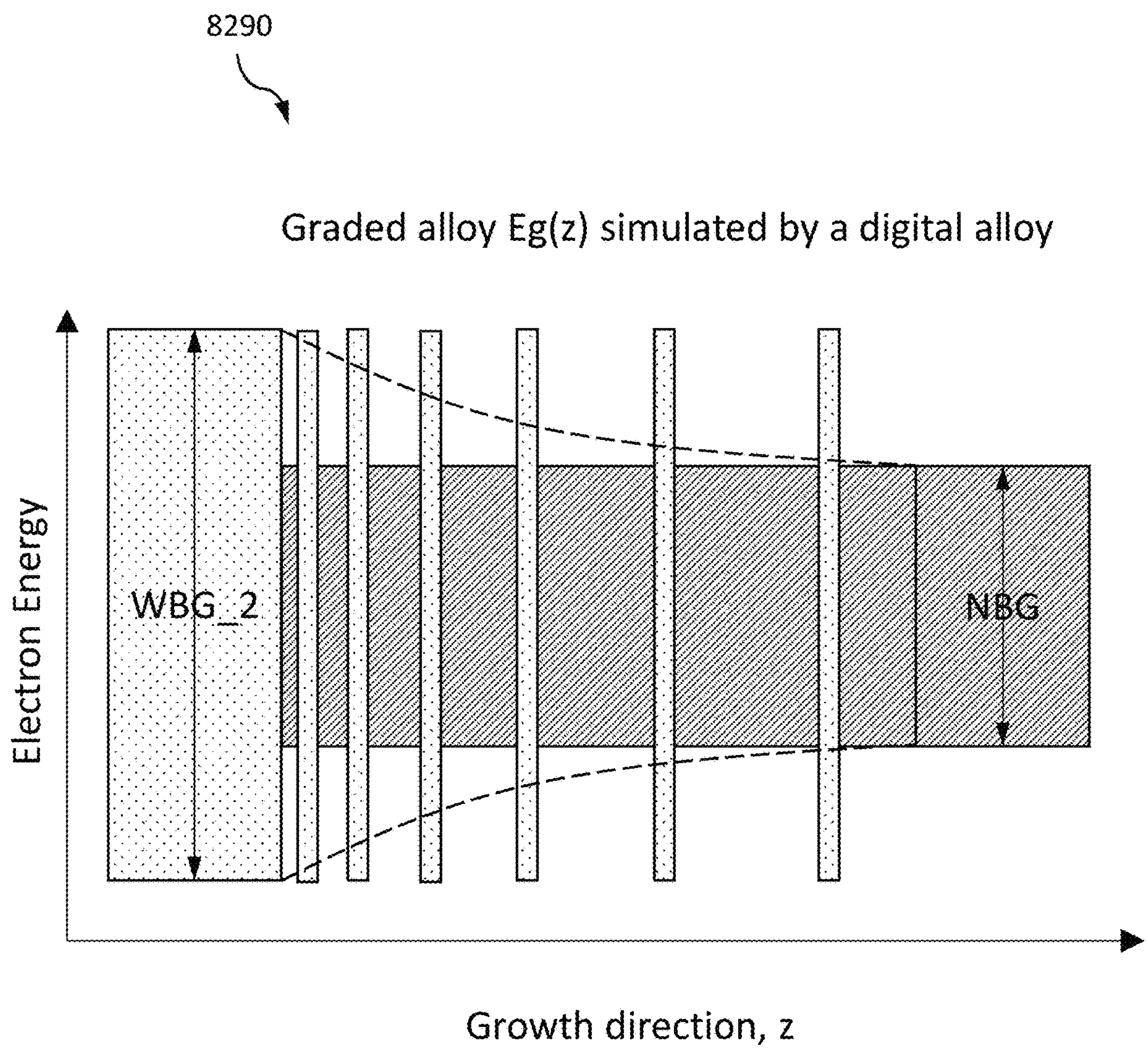

FIG. 82I shows an example semiconductor structure 8290 of a WBG material WBG_2 and an NBG material coupled with a chirp layer, where the chirp layer comprises a multilayer structure of epitaxial oxide materials where the NBG layers have changing thicknesses and the WBG layers have the same thickness throughout the chirp layer.

Chirp layers like those shown in FIGS. 82H-82I can be used to change the average composition of a region of a semiconductor structure while only depositing two different materials compositions. This can be useful, for example, to grade the composition between a pair of materials that prefer particular stoichiometries (e.g., when the materials can be formed with higher quality at certain stoichiometric phases). It can also be advantageous for manufacturing process control of a graded layer, since the thickness of a layer is often controlled by fast and easy to control mechanisms such as a mechanical shutter, while changing composition can require changing temperatures which can be slower and more difficult to control.

Digital alloys are multilayer structures that comprise alternating layers of at least two epitaxial materials (e.g., the structure 8230 in FIG. 82C). Digital alloys can advantageously be a used to form a layer with properties that are a blend of the properties of the constituent epitaxial materials layers. This can be particularly useful to form a composition of a pair of materials that prefer particular stoichiometries (e.g., when the materials can be formed with higher quality at certain stoichiometric phases). It can also be advantageous for manufacturing process control, since the thickness of a layer is often controlled by fast and easy to control mechanisms such as a mechanical shutter, while changing composition can require changing temperatures which can be slower and more difficult to control.

Figure 83A:
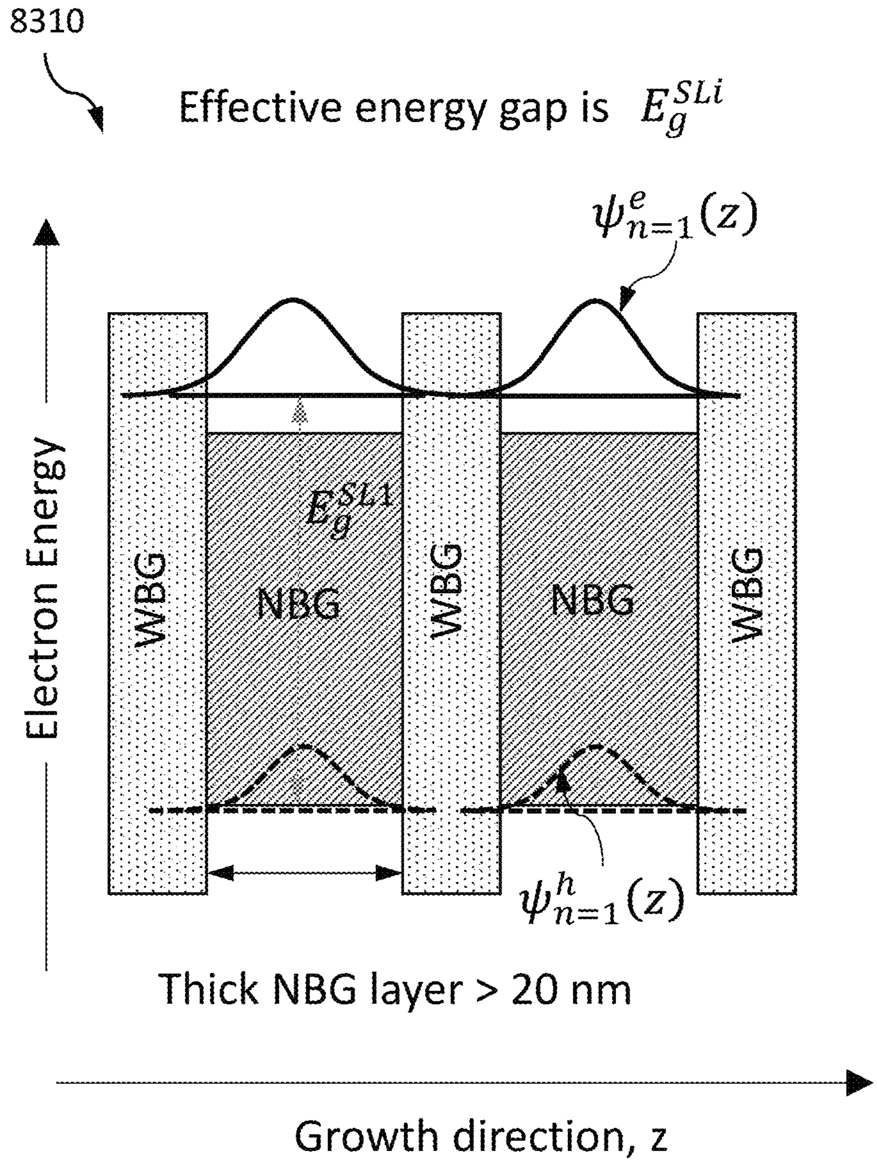
Figure 83B:
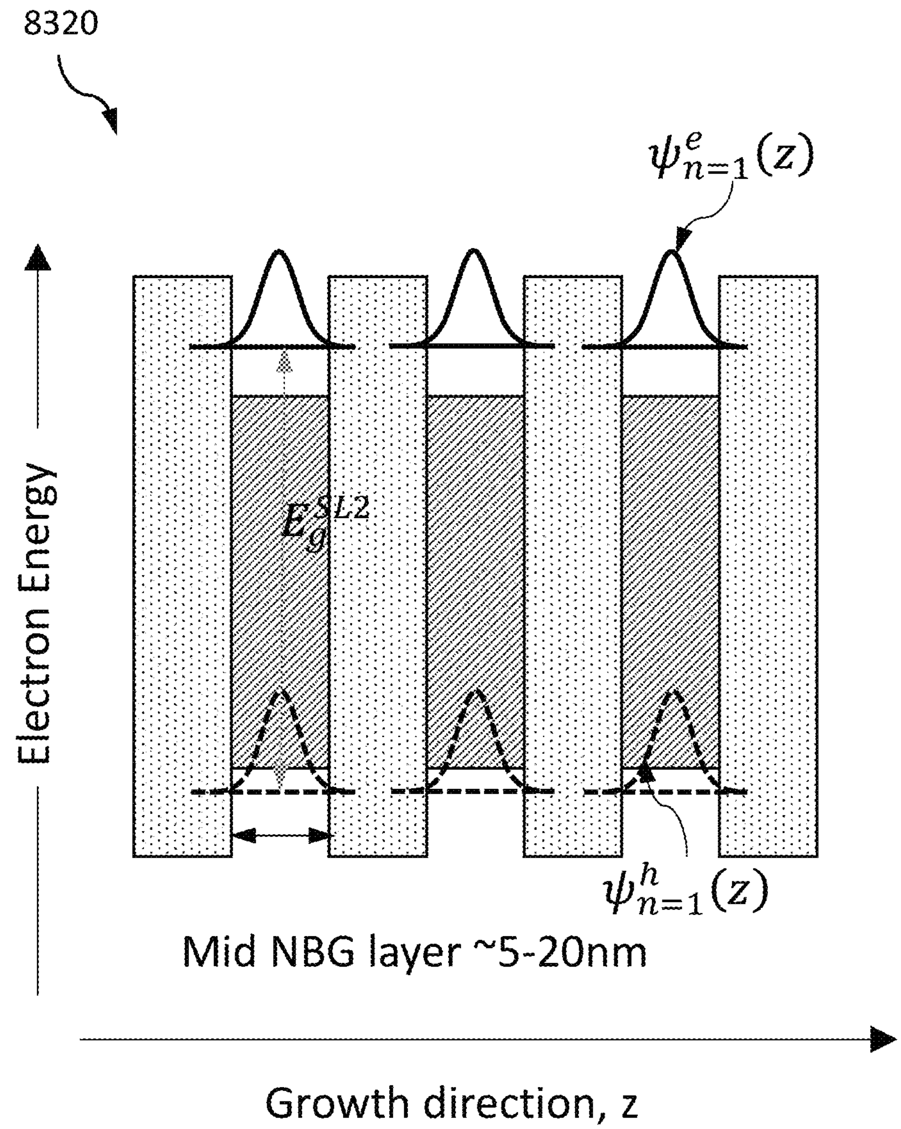
Figure 83C:
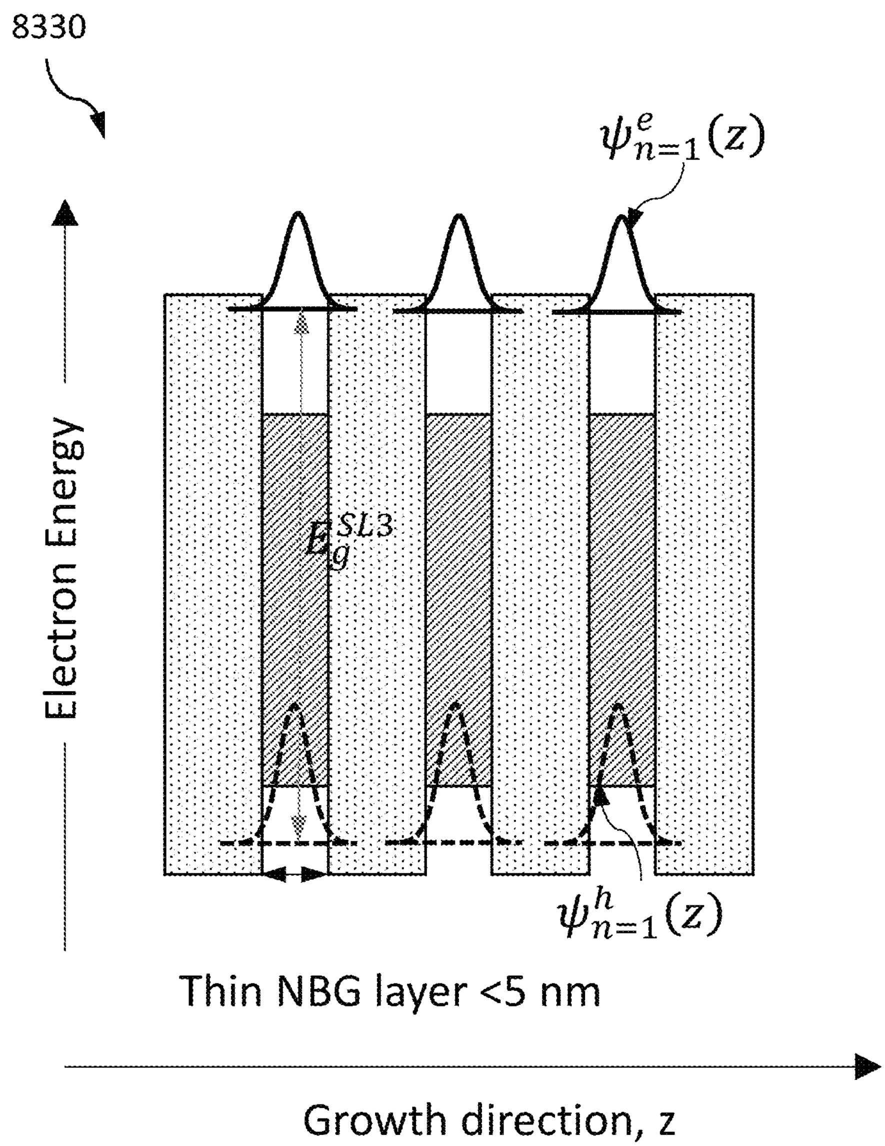

FIGS. 83A-83C show plots 8310, 8320, 8330 of electron energy versus growth direction (distance, z) for three examples of different digital alloys, and example wavefunctions for the confined electrons and holes in each. The three digital alloys are made from alternating layers of the same two materials (an NBG material and a WBG material), but with different thicknesses of the NBG layers. The "Thick NBG layer >20 nm" digital alloy of plot 8310 has thick NBG layers (i.e., greater than about 20 nm in thickness) and the least confinement, which leads to a smallest effective bandgap $E_g^{SL1}$ for the digital alloy. The "Thin NBG layer <5 nm" digital alloy of plot 8330 has thin NBG layers (i.e., less than about 5 nm in thickness) and the most confinement, which leads to a largest effective bandgap $E_g^{SL3}$ for the digital alloy. The "Mid NBG layer ~5-20 nm" digital alloy of plot 8320 has NBG layers with intermediate thicknesses (i.e., from about 5 nm to about 20 nm in thickness) and an intermediate amount of confinement, which leads to an effective bandgap $E_g^{SL2}$ for the digital alloy that is between that of $E_g^{SL1}$ and $E_g^{SL3}$.

Figure 84:
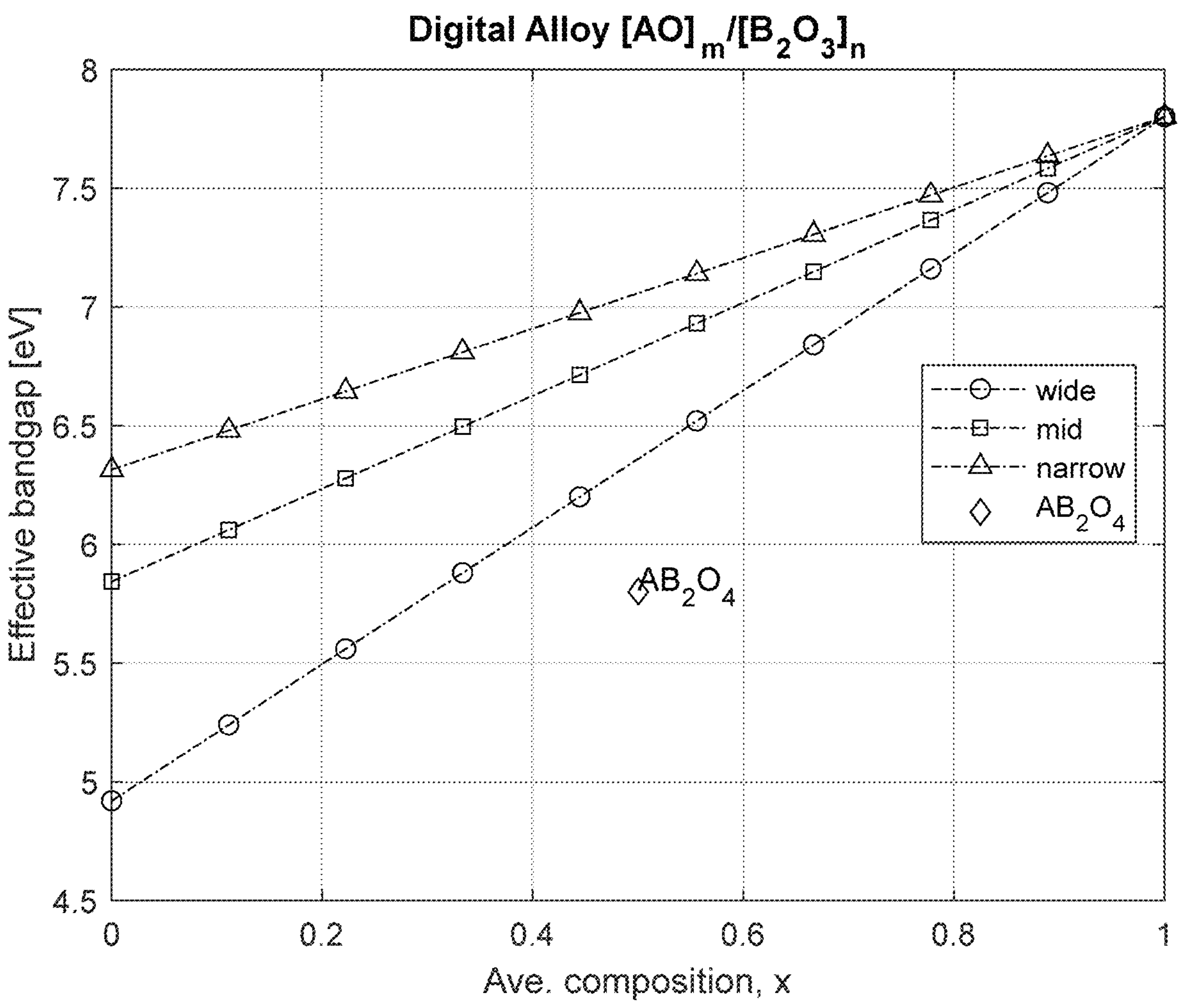

FIG. 84 shows a plot 8400 of effective bandgap versus an average composition (x) of the digital alloys shown in FIGS. 83A-83C. The two epitaxial oxide constituent layers of the digital alloy in this example are AO and $B_2O_3$, where A and B are metals (or non-metallic elements) and O is oxygen. In this example, material AO corresponds to the NBG material and $B_2O_3$ corresponds to the WBG material in the charts shown in FIGS. 83A-83C. In some cases, it may be difficult or not possible to form a high quality epitaxial material with the composition $A_xB_{2(1-x)}O_{3-2x}$. However, a digital alloy with alternating layers of AO and $B_2O_3$ can have properties (e.g., bandgap, and optical absorption coefficients) that are between those of the constituent materials AO and $B_2O_3$. In some cases, one or both layers of a digital alloy can be strained, which can further alter the properties of the materials and provide a different set of materials properties for incorporation into the semiconductor structures described herein. Some examples of AO and $B_2O_3$ combinations for digital alloys are MgO/β-($AlGaO_3$) and MgO/γ-($AlGaO_3$). Other combinations of epitaxial oxides materials can also be used in digital alloys, such as MgO/$Mg_2GeO_4$, $MgGa_2O_4$/$Mg_2GeO_4$. An example of not being able to form a continuous alloy composition would be a bulk random alloy comprising $Mg_xGa_{2(1-x)}O_{(3-2x)}$ where 0<x<1 but an equivalent pseudo-alloy using a SL[MgO/$Ga_2O_3$] or SL[MgO/$MgGa_2O_4$] or SL[$MgGa_2O_4$/$Ga_2O_3$] digital superlattice.

Plot 8400 in FIG. 84 shows how the effective bandgap will change in the three scenarios, which correspond to the digital alloys with different thicknesses of quantum wells shown in FIGS. 83A-83C. In this example, the layers of the NBG and WBG materials in the digital alloy are sufficiently thin to cause quantum confinement of carriers, which adjusts (increases) the effective bandgap of the material, as described above. Such a plot illustrates that a digital alloy can be designed with a desired effective bandgap by choosing appropriate thickness of certain epitaxial oxide constituent layers.

The bandgaps and lattice constants of the materials shown in FIGS. 85-89B were obtained using computer modeling. Geometrical structures were configured into point and space groups with various constituent elements and the structure was energy minimized. Where possible, crystal structures were based on available experimental data. The computer models used DFT and the TBMBJ exchange potential.

Figure 85:
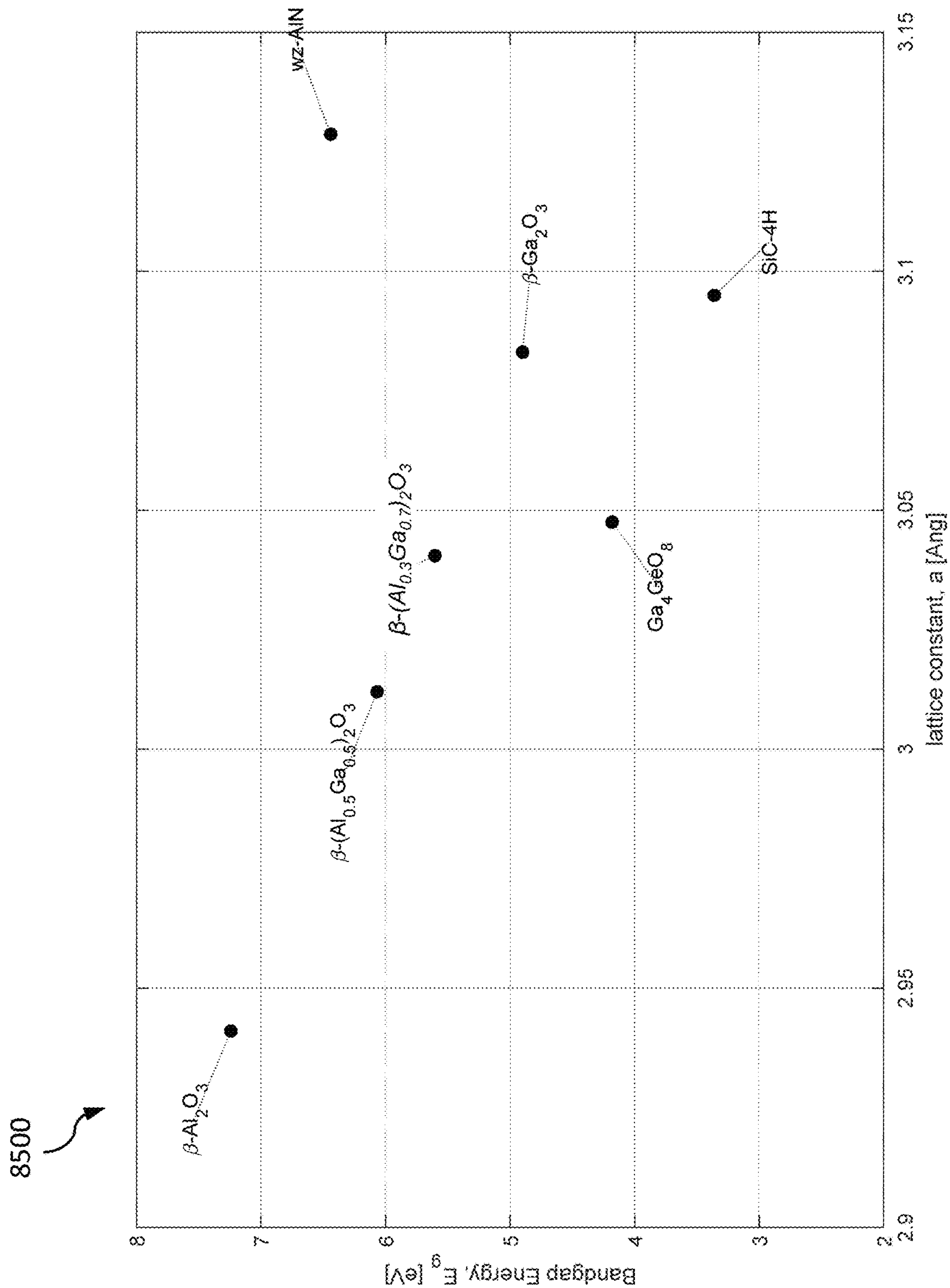

FIG. 85 shows a chart 8500 of some DFT calculated epitaxial oxide material bandgaps (minimum bandgap energies in eV) and in some cases crystal symmetry versus a lattice constant of the epitaxial oxide material. Each of the epitaxial oxide materials shown in chart 8500 is compatible with the other materials in the chart. The lattice constants of the materials in chart 8500 vary from about 2.9 Angstroms to about 3.15 Angstroms, and therefore have less than a 10% lattice constant mismatch with each other.

Some materials in the chart 8500, such as β-$(Al_{0.3}Ga_{0.7})_2O_3$ and $Ga_4GeO_8$, have lattice constant mismatch of less than 1%. $Ga_4GeO_8$ can be advantageously used in active regions of optoelectronic devices (e.g., as an absorber or emitter material), since it has a direct bandgap.

Another example of a set of compatible materials from chart 8500 are wz-AlN (i.e., AlN with a wurtzite crystal symmetry), β-$(Al_xGa_{1-x})_2O_3$, and β-$Ga_2O_3$. For example, a heterostructure comprising wz-AlN (i.e., AlN with a wurtzite crystal symmetry) and β-$(Al_xGa_{1-x})_2O_3$ could be formed on a β-$Ga_2O_3$ substrate. In some cases, such a structure could comprise a superlattice of alternating layers of wider bandgap wz-AlN and narrower bandgap β-$(Al_xGa_{1-x})_2O_3$ (e.g., with a low Al content of x less than about 0.3, or less than about 0.5). Such superlattices could be beneficial because the wz-AlN would be in compressive strain (compared to the β-$Ga_2O_3$ substrate) and the β-$(Al_xGa_{1-x})_2O_3$ layer would be in tensile strain, and therefore the superlattice could be designed to be strain balanced.

Additionally, some epitaxial oxide materials that are not shown in the chart 8500 are compatible with some of the materials shown in in FIG. 85. In other words, the chart 8500 only shows an example subset of compatible materials. For example, MgO(100) (i.e., MgO oriented in the (100) direction) is compatible with β-$(Al_xGa_{1-x})_2O_3$.

Figure 86:
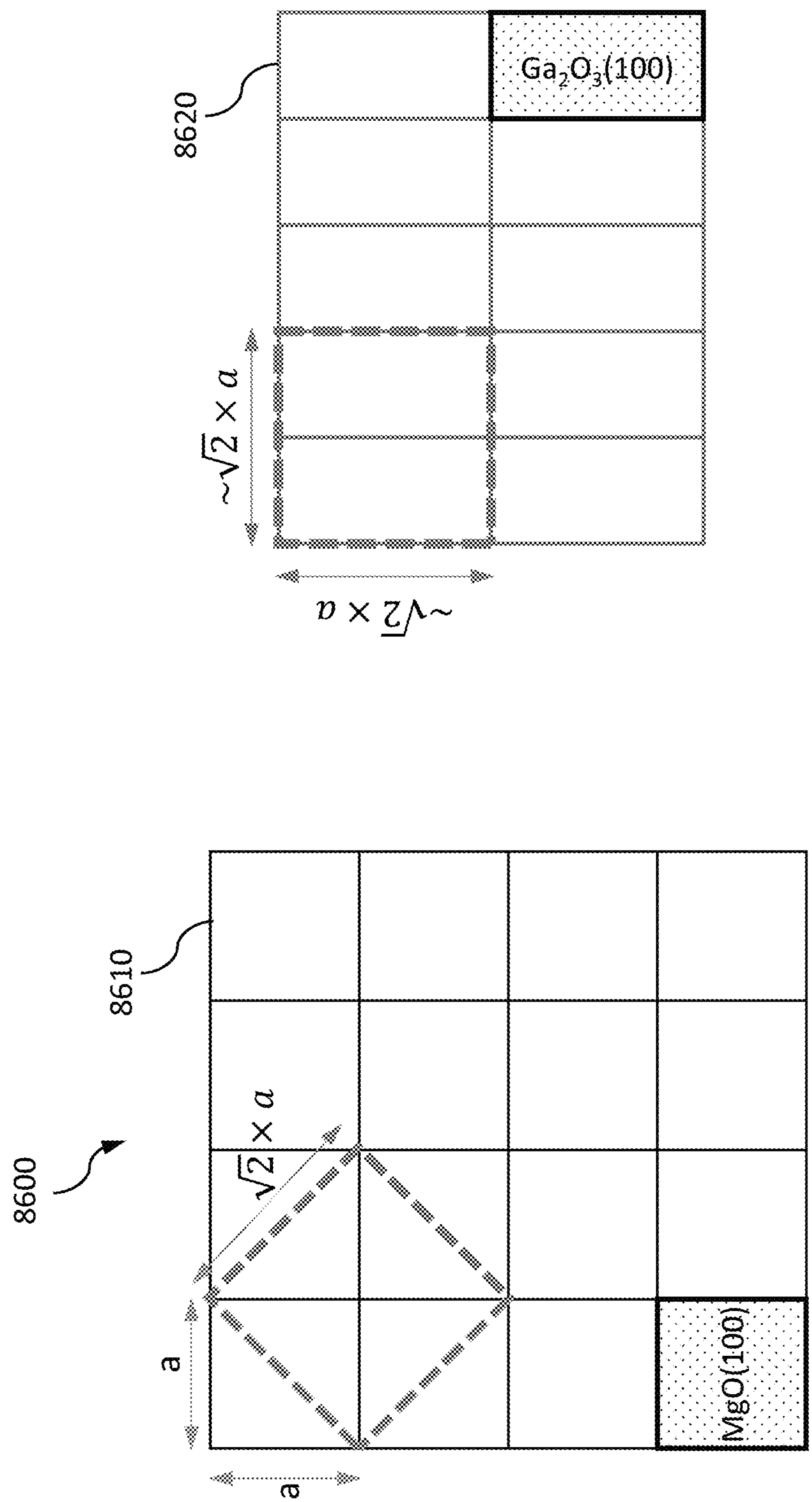

FIG. 86 shows a schematic 8600 explaining how an epitaxial oxide material 8620 with a monoclinic unit cell can be compatible with an epitaxial oxide material 8610 with a cubic unit cell. In schematic 8600 shown in FIG. 86, in one example MgO(100) is the material 8610 with the cubic crystal symmetry and β-$Ga_2O_3$(100) is the material 8620 with the monoclinic crystal symmetry. Two adjacent unit cells of β-$Ga_2O_3$(100) have in-plane lattice constants that are approximately square, and approximately match the in-plane lattice constants of MgO(100) when there is a 45° rotation between the two materials.

Figure 87:
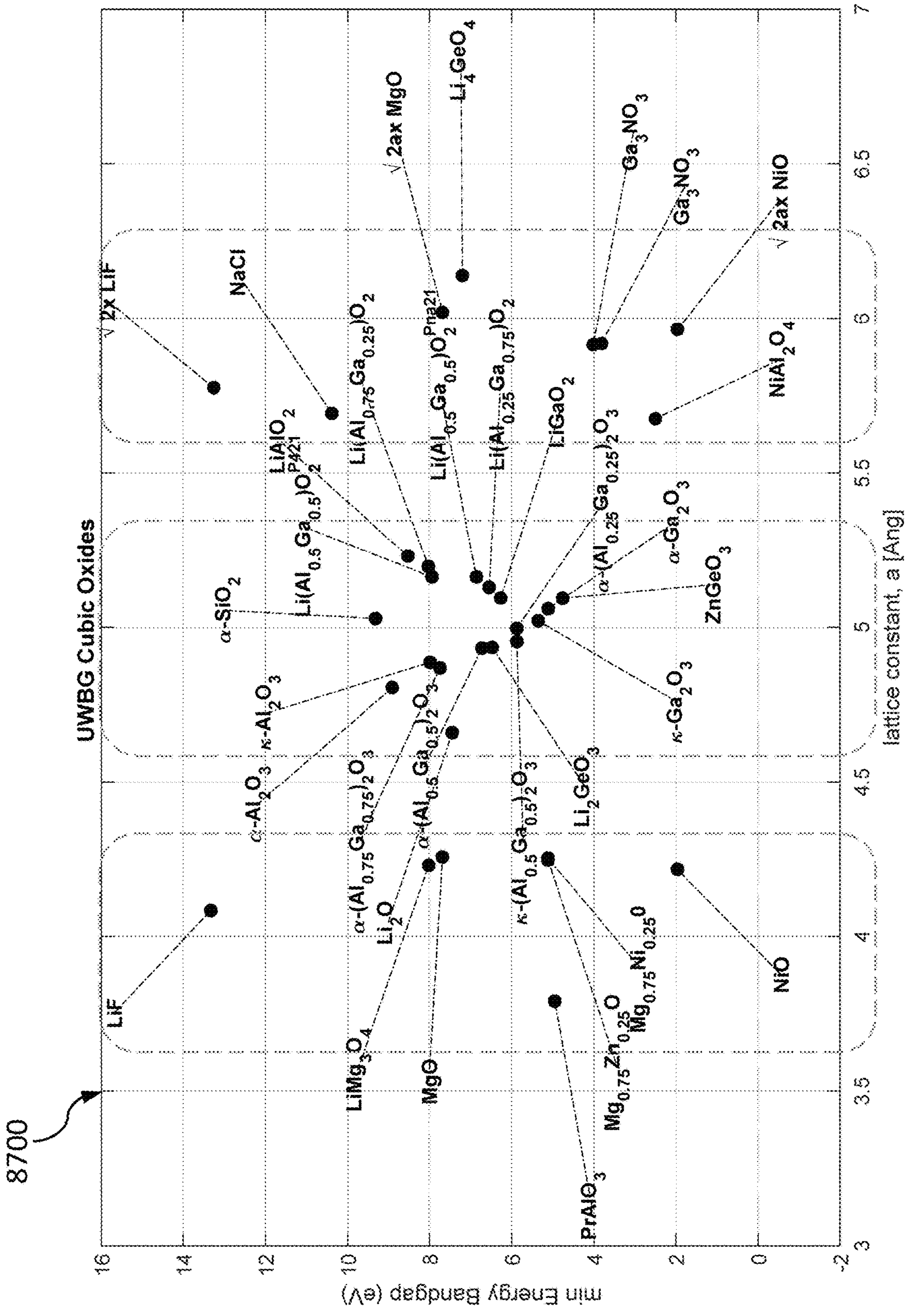

FIG. 87 shows a chart 8700 of some DFT calculated epitaxial oxide material bandgaps (minimum bandgap energies in eV) and in some cases crystal symmetry versus a lattice constant of the epitaxial oxide material. There are three groups (shown by dotted boxes) of epitaxial oxide materials shown in the chart in FIG. 87, where the materials within each group are compatible with the other materials in the group.

For example, some materials in the chart 8700 that can be used as substrates and/or epitaxial oxide layers in semiconductor structures include MgO, $LiAlO_2$, $LiGaO_2$, $Al_2O_3$ (C-, A-, R-, or M-plane oriented), and β-$Ga_2O_3$(100), β-$Ga_2O_3$(−201). Chart 8700 also shows that epitaxial LiF has a lattice constant that is compatible with those of different epitaxial oxide materials in the chart.

Another example of materials in chart 8700 that are compatible is κ-$(Al_xGa_{1-x})_2O_3$ with 0≤x≤1 and $LiGaO_2$ substrates. κ-$(Al_xGa_{1-x})_2O_3$ with 0≤x≤1 can be advantageously used in active regions of optoelectronic devices (e.g., as an absorber or emitter material), since it has a direct bandgap.

FIG. 88A shows a chart 8805 of some DFT calculated epitaxial oxide material bandgaps (minimum bandgap energies in eV) versus a lattice constant where the epitaxial oxide materials all have cubic crystal symmetry with a Fd3m or Fm3m space group. Each of the epitaxial oxide materials shown in the chart in FIG. 88A is compatible with the other materials in the chart. The lattice constants of the materials in the chart vary from about 7.9 Angstroms to about 8.5 Angstroms, and therefore have less than an 8% lattice constant mismatch with each other. The cubic epitaxial oxide materials shown in the chart in FIG. 88A have large unit cells (e.g., with lattice constants about 8.2+/−0.3 Angstroms, as shown in the figure) and have the peculiar attribute of being able to accommodate large amounts of elastic strain, such as less than or equal to about 10%, or less than or equal to about 8%, or less than or equal to 5%. For example, some of the epitaxial oxide materials shown in FIG. 88A are $(Mg_xZn_{1-x})(Al_yGa_{1-y})_2O_4$ where 0≤x≤1 and 0≤y≤1.

Examples of epitaxial layers comprising large lattice mismatches while still attaining coherent growth include the digital alloy shown in FIG. 139B comprising α-$Ga_2O_3$ and α-$Al_2O_3$. Another example is shown in FIGS. 134A and 134B where a superlattice comprising γ-$Ga_2O_3$ and MgO is disclosed.

Semiconductor structures can be grown with any combination of epitaxial oxide materials in the chart 8805 shown in FIG. 88A. Additionally, two (or more) of these compounds can be combined to form ternary, quaternary, quinary, or compounds with six or more elements, with lattice constants, bandgaps and atomic compositions between those of the compounds shown in the chart. Additionally, digital alloys can be formed (as described herein) using two or more of the materials shown in the chart to form layers with effective lattice constants, effective bandgaps and effective (or average) compositions between those of the compounds shown in the chart. A semiconductor structure comprising one or more of the epitaxial oxide materials in chart 8805 of FIG. 88A can be formed on a substrate such as MgO, $MgAl_2O_4$, $MgGa_2O_4$, LiF and β-$Ga_2O_3$(100). Any of the semiconductor structures described herein, such as structures 6201-6209 in FIGS. 81A-81I and structures 6201*b*-6203*b* in FIGS. 81J-81L, can be formed from the epitaxial oxide material in chart 8805 shown in FIG. 88A.

In some cases, the semiconductor structures with a combination of epitaxial oxide materials in chart 8805 can be incorporated into an optoelectronic device (e.g., a photodetector, an LED or a laser) configured to detect or emit UV light. Some of the materials in the chart have bandgaps from about 4.5 eV to about 8 eV, which corresponds to a wavelength range of UV light from about 150 nm to about 280 nm, and therefore materials with bandgaps in that range can be used as absorber or emitter materials in UV optoelectronic devices.

Example direct band gap bulk oxide materials include $LiAlO_2$, $Li(Al_{0.5}Ga_{0.5})O_2$, $LiGaO_2$, $ZnAl_2O_4$, $MgGa_2O_4$, $GeMg_2O_4$, MgO, $NiAl_2O_4$, $\alpha Al_2O_3$, $\kappa Ga_2O_3$, $\kappa(Al_{0.5}Ga_{0.5})_2O_3$, $\kappa Al_2O_3$, $NiAl_2O_4$, $MgNi_2O_4$, $GeNi_2O_4$, $Li_2O$, $Al_2Ge_2O_7$, $Ga_4Ge_1O_8$, $NiGa_2O_4$, $Ga_3N_1O_3$, $Ga_3N_1O_3$, $MgF_2$, NaCl, $ErAlO_3$, $Zn_2Ge_1O_4$, $GeLi_4O_4$, $Zn(Al_{0.5}Ga_{0.5})_2O_4$, $Mg(Al_{0.5}Ga_{0.5})_2O_4$, $GeO_2$, $Ge(Mg_{0.5}Zn_{0.5})_2O_4$ and LiF. Example superlattice structures exhibiting direct band gap transitions include SL[$MgAl_2O_4$|$MgGa_2O_4$], SL[$MgAl_2O_4$|$Mg(Al_xGa_{1-x})_2O_4$], SL[$MgAl_2O_4$|$ZnAl_2O_4$], SL[$MgGa_2O_4$|$(Mg_{0.5}Zn_{0.5})O$], SL[$GeMg_2O_4$|$MgGa_2O_4$], SL[$GeMg_2O_4$|$MgAl_2O_4$], and SL[$GeMg_2O_4$|MgO].

Additionally, some materials in chart 8805 have higher bandgaps and can be used as low absorption (or transparent, or semi-transparent) layers in a UV optoelectronic device. The epitaxial oxide materials in chart 8805 can also be combined in superlattices and/or digital alloys with effective bandgaps that can be tuned due to quantum confinement (as described herein).

FIGS. 88C-88O include charts with the same DFT calculated data points shown in the chart 8805 in FIG. 88A, and additionally with different sets of materials connected using lines bounding a shaded area that are a convex hull of a set of the materials shown on the plot. The sets of materials connected using lines or in the shaded region enclosed by the lines are all compatible with one another. Additionally, two (or more) of the compounds connected using lines or in the shaded region enclosed by the lines can be combined to form other alloy compositions with lattice constants and bandgaps approximately on the lines (or in the region bounded by the lines) shown in each chart, either using a blended alloy, or using a digital alloy (as described herein). The materials in the charts in FIGS. 88C-88O that are compatible with one another can be used to form a semiconductor structure which can then be incorporated into a device, such as an optoelectronic device (e.g., a photodetector, LED or laser) detecting or emitting UV light.

For example, a semiconductor structure comprising the epitaxial oxide materials connected by lines or in the shaded region enclosed by the lines in the charts in FIGS. 88C-88O can be formed on a substrate such as MgO, $MgAl_2O_4$, and $MgGa_2O_4$. In other embodiments, they can be formed on LiF or β-$Ga_2O_3$(100) substrates. Any of the semiconductor structures described herein, such as structures 6201-6209 in FIGS. 81A-81I and structures 6201*b*-6203*b* in FIGS. 81J-81L, can be formed from the epitaxial oxide materials in the sets of connected lines in the charts in FIGS. 88C-88O.

The sets of materials connected by lines or in the shaded region enclosed by the lines in the charts in FIGS. 88C-88O can be grown using any epitaxial growth technique. In some cases, they are grown using MBE with elemental sources. In some cases, the FIGS. 88C-88O also include a list of elemental MBE sources that can be used to grow structures comprising the sets of materials connected by lines or in the shaded region enclosed by the lines.

FIG. 88B-1 is a schematic 8810 showing how an epitaxial oxide material with cubic crystal symmetry with a relatively small lattice constant (e.g., approximately equal to 4 Angstroms) can lattice match (or have a small lattice mismatch) with an epitaxial oxide material that has a relatively large lattice constant (e.g., approximately equal to 8 Angstroms). The epitaxial oxide material with a relatively small lattice constant in the example shown in FIG. 88B-1 is MgO with a lattice constant "a," and the epitaxial oxide material with a relatively large lattice constant in the example shown in FIG. 88B-1 is a spinel material with a composition $AB_2O_4$, where A and B are metals (e.g., Ni, Mg, Zn, Al, and Ga) or semiconductors (e.g., Ge) with a lattice constant about "2a." Therefore, at the interface between MgO and $AB_2O_4$, four unit cells of MgO and one unit cell of $AB_2O_4$ can lattice match (or have a small lattice mismatch) with one another.

FIG. 88B-2 shows the crystal structure of $NiAl_2O_4$ with an Fd3m space group, which is an example of an $AB_2O_4$ material. $NiAl_2O_4$ with an Fd3m space group is compatible with the materials shown in the chart in FIG. 88A, such as MgO (with four unit cells of MgO as shown in FIG. 88B-1). In some embodiments, $NiAl_2O_4$ with an Fd3m space group can be used as a p-type epitaxial oxide material in a semiconductor structure.

FIG. 88C shows the chart 8805 in FIG. 88A, with lines connecting a sub-set of epitaxial oxide materials, where the shaded area 8811 is a convex hull of the materials shown on the plot. For example, the chart shows epitaxial oxide films having compositions $(Ni_xMg_yZn_{1-x-y})(Al_qGa_{1-q})_2O_4$ where $0 \le x \le 1$, $0 \le y \le 1$, $0 \le z \le 1$ and $0 \le q \le 1$, or $(Ni_xMg_yZn_{1-x-y})GeO_4$ where $0 \le x \le 1$, $0 \le y \le 1$, and $0 \le z \le 1$ connected by lines. For example, $MgAl_2O_4$, $Ni_2GeO_4$, γ-$Al_2O_3$, "2ax NiO" (which is NiO, where the lattice constant plotted is twice the lattice constant of the NiO unit cell), and "2ax MgO" (which is MgO, where the lattice constant plotted is twice the lattice constant of the MgO unit cell), are shown in the chart connected by lines. Other alloys and digital alloys can be formed that are compatible with one another and comprise the elements of the alloys shown in the figure, as described above. The set of MBE sources that can be used to grow the subset of materials bounded by the lines in this figure are those that provide elemental beams of the set of materials {Al, Ga, Mg, Zn, Ni, Ge and O*}, where, Al, Ga, Mg, Zn, Ni, and Ge can be provided by solid effusion sources (e.g., from Knudsen cells) and "O*" represents oxygen from an oxygen plasma source.

FIG. 88D shows the chart 8805 in FIG. 88A, with lines connecting a subset of epitaxial oxide materials including $MgAl_2O_4$, $ZnAl_2O_4$, $NiAl_2O_4$, and some alloys thereof. Other alloys and digital alloys can be formed that are compatible with one another and comprise the elements of the alloys shown in the figure, as described above. The set of MBE sources that can be used to grow the subset of materials bounded by the lines and forming the shaded area 8815 in this figure are {Al, Mg, Zn, Ni and O*}.

FIG. 88E shows the chart 8805 in FIG. 88A, with lines connecting a sub-set of epitaxial oxide materials including "2ax MgO," γ-$Ga_2O_3$, $MgAl_2O_4$, $ZnAl_2O_4$, $NiAl_2O_4$, and some alloys thereof. Other alloys and digital alloys can be formed that are compatible with one another and comprise the elements of the alloys shown in the figure, as described above. The set of MBE sources that can be used to grow the sub-set of materials bounded by the lines and forming the shaded area 8820 in this figure are those that provide elemental beams of the set of materials {Mg, Zn, Ni, Al and O*}.

FIG. 88F shows the chart 8805 in FIG. 88A, with lines connecting a subset of epitaxial oxide materials including $MgAl_2O_4$, $MgGa_2O_4$, $ZnGa_2O_4$, and some alloys thereof. Other alloys and digital alloys can be formed that are compatible with one another and comprise the elements of the alloys shown in the figure, as described above. The set of MBE sources that can be used to grow the subset of materials bounded by the lines and forming the shaded area 8825 in this figure are those that provide elemental beams of the set of materials {Al, Ga, Mg, Zn and O}.

FIG. 88G shows the chart 8805 in FIG. 88A, with lines connecting a subset of epitaxial oxide materials including "2ax NiO," "2ax MgO," $\gamma$-$Al_2O_3$, $\gamma$-$Ga_2O_3$, $MgAl_2O_4$, and some alloys thereof. Other alloys and digital alloys can be formed that are compatible with one another and comprise the elements of the alloys shown in the figure, as described above. The set of MBE sources that can be used to grow the subset of materials bounded by the lines and forming the shaded area 8830 in this figure are those that provide elemental beams of the set of materials {Al, Ga, Mg, Zn and O}.

FIG. 88H shows the chart 8805 in FIG. 88A, with lines connecting a subset of epitaxial oxide materials including $\gamma$-$Ga_2O_3$, $MgGa_2O_4$, $Mg_2GeO_4$, and some alloys thereof. Other alloys and digital alloys can be formed that are compatible with one another and comprise the elements of the alloys shown in the figure, as described above. The set of MBE sources that can be used to grow the subset of materials bounded by the lines and forming the shaded area 8835 in this figure are those that provide elemental beams of the set of materials {Ga, Mg, Ge and O}.

FIG. 88I shows the chart 8805 in FIG. 88A, with lines connecting a subset of epitaxial oxide materials including $\gamma$-$Ga_2O_3$, $MgGa_2O_4$, "2ax MgO," and some alloys thereof. Other alloys and digital alloys can be formed that are compatible with one another and comprise the elements of the alloys shown in the figure, as described above. The set of MBE sources that can be used to grow the subset of materials bounded by the lines and forming the shaded area 8840 in this figure are those that provide elemental beams of the set of materials {Ga, Mg, Ge and O}.

FIG. 88J shows the chart 8805 in FIG. 88A, with lines connecting a subset of epitaxial oxide materials including $\gamma$-$Ga_2O_3$, $Mg_2GeO_4$, "2ax MgO," and some alloys thereof. Other alloys and digital alloys can be formed that are compatible with one another and comprise the elements of the alloys shown in the figure, as described above. The set of MBE sources that can be used to grow the subset of materials bounded by the lines and forming the shaded area 8845 in this figure are those that provide elemental beams of the set of materials {Ga, Mg, Ge and O}.

FIG. 88K shows the chart 8805 in FIG. 88A, with lines connecting a subset of epitaxial oxide materials including $Ni_2GeO_4$, $Mg_2GeO_4$, $(Mg_{0.5}Zn_{0.5})_2GeO_4$, $Zn(Al_{0.5}Ga_{0.5})_2O_4$, $Mg(Al_{0.5}Ga_{0.5})_2O_4$, "2ax MgO," and some alloys thereof. Other alloys and digital alloys can be formed that are compatible with one another and comprise the elements of the alloys shown in the figure, as described above. The set of MBE sources that can be used to grow the subset of materials bounded by the lines and forming the shaded area 8850 in this figure are those that provide elemental beams of the set of materials {Ga, Al, Mg, Zn, Ni, Ge and O}.

FIG. 88L shows the chart 8805 in FIG. 88A, with lines connecting a subset of epitaxial oxide materials including $\gamma$-$Ga_2O_3$, $\gamma$-$Al_2O_3$, $MgAl_2O_4$, $ZnAl_2O_4$, and some alloys thereof. Other alloys and digital alloys can be formed that are compatible with one another and comprise the elements of the alloys shown in the figure, as described above. The set of MBE sources that can be used to grow the subset of materials bounded by the lines and forming the shaded area 8855 in this figure are those that provide elemental beams of the set of materials {Ga, Al, Mg and O}.

FIGS. 88M and 88N show the chart 8805 in FIG. 88A, with lines connecting a subset of epitaxial oxide materials including $\gamma$-$Ga_2O_3$, $\gamma$-$Al_2O_3$, $MgAl_2O_4$, $ZnAl_2O_4$, "2ax MgO," and some alloys thereof. The bulk alloy $\gamma$-$(Al_xGa_{1-x})_2O_3$ is shown along one of the lines in FIG. 88M. The digital alloy compositions comprising layers of $(MgO)_z((Al_xGa_{1-x})_2O_3)_{1-z}$ materials is shown in the shaded area 8860 bounded by the lines in FIG. 88N. Other alloys and digital alloys can be formed that are compatible with one another and comprise the elements of the alloys shown in the figure, as described above. The set of MBE sources that can be used to grow the subset of materials bounded by the lines in this figure are those that provide elemental beams of the set of materials {Ga, Al, Mg, Zn and O}.

FIG. 880 shows the chart 8805 in FIG. 88A, with lines connecting a subset of epitaxial oxide materials including $MgGa_2O_4$, $ZnGa_2O_4$, $(Mg_{0.5}Zn_{0.5})Ga_2O_4$, $(Mg_{0.5}Ni_{0.5})Ga_2O_4$, $(Zn_{0.5}Ni_{0.5})Ga_2O_4$, "2ax NiO," "2ax MgO," and some alloys thereof. Other alloys and digital alloys can be formed that are compatible with one another and comprise the elements of the alloys shown in the figure, as described above. The set of MBE sources that can be used to grow the subset of materials bounded by the lines and forming the shaded area 8865 in this figure are those that provide elemental beams of the set of materials {Mg, Ga, Zn., Ni and O}.

FIG. 89A shows a chart 8900 of some DFT calculated epitaxial oxide material bandgaps (minimum bandgap energies in eV) versus lattice constant, with lattice constants from approximately 4.5 Angstroms to 5.3 Angstroms. The epitaxial oxide materials in the chart have non-cubic crystal symmetries, such as hexagonal and orthorhombic crystal symmetries. For example, the epitaxial oxide materials in the chart in FIG. 89A include $\alpha$-$(Al_xGa_{1-x})_2O_3$ where $0 \leq x \leq 1$; and $\kappa$-$(Al_xGa_{1-x})_2O_3$ where $0 \leq x \leq 1$, $Li_2O$, and $Li(Al_xGa_{1-x})O_2$.

Each epitaxial oxide material in the chart on FIG. 89A is compatible with one another. For example, the set of materials connected with lines in FIG. 89A is compatible with one another, and includes $LiAlO_2$ and $LiGaO_2$, and $Li(Al_xGa_{1-x})O_2$ with Pna21 space groups. Additionally, two (or more) of these compounds can be combined to form ternary, quaternary, or quinary compounds, or compounds with six or more elements, having lattice constants, bandgaps and atomic compositions between those of the compounds shown in the chart. Additionally, digital alloys can be formed (as described herein) using two or more of the materials shown in the chart to form layers with in-plane lattice constants, effective bandgaps and effective (or average) compositions between those of the compounds shown in the chart. These materials that are compatible with one another can be used to form a semiconductor structure which can then be incorporated into a device, such as an optoelectronic device (e.g., a photodetector, LED or laser) detecting or emitting UV light.

In some embodiments, a semiconductor structure comprising epitaxial oxide materials shown in FIG. 89A can be formed on a substrate such as $LiGaO_2(001)$, $LiAlO_2(001)$, $AlN(110)$, $SiO_2(100)$ and crystalline metallic $Al(111)$.

FIG. 89B shows a table 8950 of DFT calculated $Li(Al_xGa_{1-x})O_2$ film properties (space group ("SG"), lattice constants ("a" and "b") in Angstroms, and percentage lattice mismatch ("% Δa" and "% Δb") between a $LiGaO_2$ film and the possible substrates ("sub") listed. Any of the semiconductor structures described herein, such as structures 6201-6209 in FIGS. 81A-81I and structures 6201*b*-6203*b* in FIGS. 81J-81L, can be formed from the epitaxial oxide material in the chart shown in FIG. 89A.

$LiAlO_2$ has a tetragonal crystal symmetry (and a P42121 space group), while $LiGaO_2$ has an orthorhombic crystal symmetry (and a Pna21 space group). Surprisingly, an alloy $Li(Al_xGa_{1-x})O_2$ can also be formed that has a direct bandgap. Such an alloy has a phase change from a P42121 to a Pna21 space group at Al fraction x above about 0.5. This phase change can lead to less desirable mixed crystal growth when x is about 0.5. Compositions of $Li(Al_xGa_{1-x})O_2$ starting from x=1 down to about x=0.5 will remain single phase P42121 whereas compositions of $Li(Al_xGa_{1-x})O_2$ starting from x=0 up to about x=0.5 will remain Pna21. At around 0.5 there will be mixed phases. At the extreme values of x=0 or 1, the bandgap of $LiGaO_2$ is approximately 6.2 eV and the bandgap of $LiAlO_2$ is approximately 8.02 eV. The $LiGaO_2$ bandgap of 6.2 eV corresponds to a wavelength of light of about 200 nm, which is in the UVC band, and the wider bandgap of $LiAlO_2$ can have a low absorption coefficient for light with a wavelength of about 200 nm. Therefore, $LiGaO_2$, $LiAlO_2$, and/or some compositions of $Li(Al_xGa_{1-x})O_2$ can be used to form optoelectronic devices that absorb or emit UV light, as described herein.

$Li(Al_xGa_{1-x})O_2$ epitaxial oxide films can be formed by an epitaxial growth technique such as molecular beam epitaxy, where a solid source of $Li_2O$ is sublimed. The Ga and Al sources can be solid elemental sources and the O source can be a plasma source using gaseous oxygen, as described herein.

In some cases, $LiGaO_2$ (with a Pna21 space group) and low Al content $Li(Al_xGa_{1-x})O_2$ can be doped via polarization doping and can be used in chirp layers adjacent to metal contacts.

FIGS. 90A-90ZZ show DFT calculated energy-crystal momentum (E-k) dispersion plots in the vicinity of the Brillouin-zone center for some of the epitaxial oxide materials described herein, e.g., those shown in the bandgap energy versus lattice constant charts in FIGS. 88A and 88C-88N. The plots in FIGS. 90A-90ZZ were created using DFT modeling with a TBMBJ exchange potential. The name, composition, and space group ("SG") of the oxide material that was modeled is shown in each of the FIGS. 90A-90ZZ. The minimum bandgap is also shown. In cases where the minimum bandgap is a vertical line, the bandgap is a direct bandgap.

FIG. 90A shows a calculated energy-crystal momentum (E-k) dispersion plots in the vicinity of the Brillouin-zone center for $LiAlO_2$ with a P41212 space group.

FIG. 90B shows a calculated energy-crystal momentum (E-k) dispersion plots in the vicinity of the Brillouin-zone center for $Li(Al_{0.5}Ga_{0.5})O_2$ with a Pna21 space group.

FIG. 90C shows a calculated energy-crystal momentum (E-k) dispersion plots in the vicinity of the Brillouin-zone center for $LiGaO_2$ with a Pna21 space group.

FIG. 90D shows a calculated energy-crystal momentum (E-k) dispersion plots in the vicinity of the Brillouin-zone center for $ZnAl_2O_4$ with a Fd3m space group.

FIG. 90E shows a calculated energy-crystal momentum (E-k) dispersion plots in the vicinity of the Brillouin-zone center for $ZnGa_2O_4$with a Fd3m space group.

FIG. 90F shows a calculated energy-crystal momentum (E-k) dispersion plots in the vicinity of the Brillouin-zone center for $MgGa_2O_4$ with a Fd3m space group.

FIG. 90G shows a calculated energy-crystal momentum (E-k) dispersion plots in the vicinity of the Brillouin-zone center for $GeMg_2O_4$ with a Fd3m space group.

FIG. 90H shows a calculated energy-crystal momentum (E-k) dispersion plots in the vicinity of the Brillouin-zone center for NiO with a Fm3m space group.

FIG. 90I shows a calculated energy-crystal momentum (E-k) dispersion plots in the vicinity of the Brillouin-zone center for MgO with a Fm3m space group.

FIG. 90J shows a calculated energy-crystal momentum (E-k) dispersion plots in the vicinity of the Brillouin-zone center for $SiO_2$ with a P3221 space group.

FIG. 90K shows a calculated energy-crystal momentum (E-k) dispersion plots in the vicinity of the Brillouin-zone center for $NiAl_2O_4$ with a Imma space group.

FIG. 90L shows a calculated energy-crystal momentum (E-k) dispersion plots in the vicinity of the Brillouin-zone center for $\alpha Al_2O_3$ with a R3c space group.

FIG. 90M shows a calculated energy-crystal momentum (E-k) dispersion plots in the vicinity of the Brillouin-zone center for $\alpha(Al_{0.75}Ga_{0.25})_2O_3$ with a R3c space group.

FIG. 90N shows a calculated energy-crystal momentum (E-k) dispersion plots in the vicinity of the Brillouin-zone center for $\alpha(Al_{0.5}Ga_{0.5})_2O_3$ with a R3c space group.

FIG. 90O shows a calculated energy-crystal momentum (E-k) dispersion plots in the vicinity of the Brillouin-zone center for $\alpha(Al_{0.25}Ga_{0.75})_2O_3$ with a R3c space group.

FIG. 90P shows a calculated energy-crystal momentum (E-k) dispersion plots in the vicinity of the Brillouin-zone center for $\alpha Ga_2O_3$ with a R3c space group.

FIG. 90Q shows a calculated energy-crystal momentum (E-k) dispersion plots in the vicinity of the Brillouin-zone center for $\kappa Ga_2O_3$ with a Pna21 space group.

FIG. 90R shows a calculated energy-crystal momentum (E-k) dispersion plots in the vicinity of the Brillouin-zone center for $\kappa(Al_{0.5}Ga_{0.5})_2O_3$ with a Pna21 space group.

FIG. 90S shows a calculated energy-crystal momentum (E-k) dispersion plots in the vicinity of the Brillouin-zone center for $\kappa Al_2O_3$ with a Pna21 space group.

FIG. 90T shows a calculated energy-crystal momentum (E-k) dispersion plots in the vicinity of the Brillouin-zone center for $\gamma Ga_2O_3$ with a Fd3m space group.

FIG. 90U shows a calculated energy-crystal momentum (E-k) dispersion plots in the vicinity of the Brillouin-zone center for $MgAl_2O_4$ with a Fd3m space group.

FIG. 90V shows a calculated energy-crystal momentum (E-k) dispersion plots in the vicinity of the Brillouin-zone center for $NiAl_2O_4$ with a Fd3m space group.

FIG. 90W shows a calculated energy-crystal momentum (E-k) dispersion plots in the vicinity of the Brillouin-zone center for $MgNi_2O_4$ with a Fd3m space group.

FIG. 90X shows a calculated energy-crystal momentum (E-k) dispersion plot in the vicinity of the Brillouin-zone center for $GeNi_2O_4$ with a Fd3m space group.

FIG. 90Y shows a calculated energy-crystal momentum (E-k) dispersion plot in the vicinity of the Brillouin-zone center for $Li_2O$ with a Fm3m space group.

FIG. 90Z shows a calculated energy-crystal momentum (E-k) dispersion plot in the vicinity of the Brillouin-zone center for $Al_2Ge_2O_7$ with a C2c space group.

FIG. 90AA shows a calculated energy-crystal momentum (E-k) dispersion plot in the vicinity of the Brillouin-zone center for $Ga_4Ge_1O_8$ with a C2m space group.

FIG. 90BB shows a calculated energy-crystal momentum (E-k) dispersion plot in the vicinity of the Brillouin-zone center for $NiGa_2O_4$ with a Fd3m space group.

FIG. 90CC shows a calculated energy-crystal momentum (E-k) dispersion plot in the vicinity of the Brillouin-zone center for $Ga_3N_1O_3$ with a R3m space group.

FIG. 90DD shows a calculated energy-crystal momentum (E-k) dispersion plot in the vicinity of the Brillouin-zone center for $Ga_3N_1O_3$ with a C2m space group.

FIG. 90EE shows a calculated energy-crystal momentum (E-k) dispersion plot in the vicinity of the Brillouin-zone center for $MgF_2$ with a P42mnm space group.

FIG. 90FF shows a calculated energy-crystal momentum (E-k) dispersion plot in the vicinity of the Brillouin-zone center for NaCl with a Fm3m space group.

FIG. 90GG shows a calculated energy-crystal momentum (E-k) dispersion plot in the vicinity of the Brillouin-zone center for $Mg_{0.75}Zn_{0.25}O$ with a Fd3m space group.

FIG. 90HH shows a calculated energy-crystal momentum (E-k) dispersion plot in the vicinity of the Brillouin-zone center for $ErAlO_3$ with a P63mcm space group.

FIG. 90II shows a calculated energy-crystal momentum (E-k) dispersion plot in the vicinity of the Brillouin-zone center for $Zn_2Ge_1O_4$ with a R3 space group.

FIG. 90JJ shows a calculated energy-crystal momentum (E-k) dispersion plot in the vicinity of the Brillouin-zone center for $LiNi_2O_4$ with a P4332 space group.

FIG. 90KK shows a calculated energy-crystal momentum (E-k) dispersion plot in the vicinity of the Brillouin-zone center for $GeLi_4O_4$ with a Cmcm space group.

FIG. 90LL shows a calculated energy-crystal momentum (E-k) dispersion plot in the vicinity of the Brillouin-zone center for $GeLi_2O_3$ with a Cmc21 space group.

FIG. 90MM shows a calculated energy-crystal momentum (E-k) dispersion plot in the vicinity of the Brillouin-zone center for $Zn(Al_{0.5}Ga_{0.5})_2O_4$ with a Fd3m space group.

FIG. 90NN shows a calculated energy-crystal momentum (E-k) dispersion plot in the vicinity of the Brillouin-zone center for $Mg(Al_{0.5}Ga_{0.5})_2O_4$ with a Fd3m space group.

FIG. 90OO shows a calculated energy-crystal momentum (E-k) dispersion plot in the vicinity of the Brillouin-zone center for $(Mg_{0.5}Zn_{0.5})Al_2O_4$ with a Fd3m space group.

FIG. 90PP shows a calculated energy-crystal momentum (E-k) dispersion plot in the vicinity of the Brillouin-zone center for $(Mg_{0.5}Ni_{0.5})Al_2O_4$ with a Fd3m space group.

FIG. 90QQ shows a calculated energy-crystal momentum (E-k) dispersion plot in the vicinity of the Brillouin-zone center for $\beta(Al_0Ga_{1.0})_2O_3$ (i.e., $\beta Ga_2O_3$) with a C2m space group.

FIG. 90RR shows a calculated energy-crystal momentum (E-k) dispersion plot in the vicinity of the Brillouin-zone center for $\beta(Al_{0.125}Ga_{0.875})_2O_3$ with a C2m space group.

FIG. 90SS shows a calculated energy-crystal momentum (E-k) dispersion plot in the vicinity of the Brillouin-zone center for $\beta(Al_{0.25}Ga_{0.75})_2O_3$ with a C2m space group.

FIG. 90TT shows a calculated energy-crystal momentum (E-k) dispersion plot in the vicinity of the Brillouin-zone center for $\beta(Al_{0.375}Ga_{0.625})_2O_3$ with a C2m space group.

FIG. 90UU shows a calculated energy-crystal momentum (E-k) dispersion plot in the vicinity of the Brillouin-zone center for $\beta(Al_{0.5}Ga_{0.5})_2O_3$ with a C2m space group.

FIG. 90VV shows a calculated energy-crystal momentum (E-k) dispersion plot in the vicinity of the Brillouin-zone center for $\beta(Al_{1.0}Ga_{0.0})_2O_3$ (i.e., θ-Aluminum Oxide) with a C2m space group.

FIG. 90WW shows a calculated energy-crystal momentum (E-k) dispersion plot in the vicinity of the Brillouin-zone center for $GeO_2$ with a P42mnm space group.

FIG. 90XX shows a calculated energy-crystal momentum (E-k) dispersion plot in the vicinity of the Brillouin-zone center for $Ge(Mg_{0.5}Zn_{0.5})_2O_4$ with a Fd3m space group.

FIG. 90YY shows a calculated energy-crystal momentum (E-k) dispersion plot in the vicinity of the Brillouin-zone center for $(Ni_{0.5}Zn_{0.5})Al_2O_4$ with a Fd3m space group.

FIG. 90ZZ shows a calculated energy-crystal momentum (E-k) dispersion plot in the vicinity of the Brillouin-zone center for LiF with a Fm3m space group.

FIG. 91 shows an atomic crystal structure 9100 of a heterojunction between $MgGa_2O_4$ and $MgAl_2O_4$ epitaxial oxide material. The interface between the two materials is coherent, and the atoms line up at the interface such that there are no dislocations (i.e., missing planes of atoms) in the crystal structures of the materials on both sides of the interface. The two unit cells shown in the figure can be repeated in the "c" direction to form a superlattice.

FIGS. 92A-92G show DFT calculated energy-crystal momentum (E-k) dispersion plots in the vicinity of the Brillouin-zone center for superlattice structures. The constituent compounds forming the unit cells of the superlattice are shown on each chart, along with the space group ("SG"), and the minimum effective bandgap of the superlattice.

FIG. 92A shows a calculated energy-crystal momentum (E-k) dispersion plot in the vicinity of the Brillouin-zone center for a superlattice comprising $[MgAl_2O_4]_1|[MgGa_2O_4]_1$ with a Fd3m space group for the unit cells.

FIG. 92B shows a calculated energy-crystal momentum (E-k) dispersion plot in the vicinity of the Brillouin-zone center for a superlattice comprising $[MgAl_2O_4]_1|[Mg(Al_{0.5}Ga_{0.5})_2O_4]_1$ with a Fd3m space group for the unit cells.

FIG. 92C shows a calculated energy-crystal momentum (E-k) dispersion plot in the vicinity of the Brillouin-zone center for a superlattice comprising $[MgAl_2O_4]_1|[ZnAl_2O_4]_1$ with a Fd3m space group for the unit cells.

FIG. 92D shows a calculated energy-crystal momentum (E-k) dispersion plot in the vicinity of the Brillouin-zone center for a superlattice comprising $[MgGa_2O_4]_1|[(Mg_{0.5}Zn_{0.5})O]_1$ with a Fd3m space group for the unit cells.

FIG. 92E shows a calculated energy-crystal momentum (E-k) dispersion plot in the vicinity of the Brillouin-zone center for a superlattice comprising $[\alpha Al_2O_3]_2|[\alpha Ga_2O_3]_2$ with a R3c space group for the unit cells and a growth direction in the A-plane.

FIG. 92F shows a calculated energy-crystal momentum (E-k) dispersion plot in the vicinity of the Brillouin-zone center for a superlattice comprising $[\alpha Al_2O_3]_1|[\alpha Ga_2O_3]_1$ with a R3c space group for the unit cells and a growth direction in the A-plane.

FIG. 92G shows a calculated energy-crystal momentum (E-k) dispersion plot in the vicinity of the Brillouin-zone center for a superlattice comprising $[GeMg_2O_4]_1|[MgO]_1$ with Fd3m/Fd3m space groups for the unit cells.

FIG. 93 shows an atomic crystal structure 9300 of $\beta$-$(Al_{0.5}Ga_{0.5})_2O_3$ with a space group C2m. The crystal structure can be calculated using DFT modeling with a TBMBJ exchange potential.

FIG. 94 shows a DFT calculated energy-crystal momentum (E-k) dispersion plot in the vicinity of the Brillouin-zone center for a superlattice with $\beta$-$(Al_{0.5}Ga_{0.5})_2O_3$ and of $\beta$-$Ga_2O_3$. The chart shows that the superlattice enables zone folding of k-vectors in the valence band.

FIGS. 95A and 95B show schematics of a $\beta$-$Ga_2O_3(100)$ film coherently (and pseudomorphically) strained to an MgO(100) substrate. FIG. 95A shows the in-plane unit cell alignment (in plan view, along the "b" and "c" direction), and FIG. 95B shows the unit cell alignment along the growth direction ("a"). The lattice of the film is rotated by 45° with respect to that of the substrate.

FIG. 96 shows a DFT calculated energy-crystal momentum (E-k) dispersion plot in the vicinity of the Brillouin-zone center for $\beta$-$Ga_2O_3$ pseudomorphically strained to the lattice of MgO rotated by 45°. The chart shows that the strain has induced a direct bandgap in the material, where the bandgap of the unstrained materials was indirect (as shown in FIG. 29-31QQ).

FIG. 97 shows a schematic of a superlattice 9700 formed from alternating layers (with one or more unit cells in each layer) of $\beta$-$Ga_2O_3$ and MgO, where the $\beta$-$Ga_2O_3$ layers are pseudomorphically strained to the lattice of MgO rotated by 45°.

FIG. 98A shows a table 9805 of crystal structure properties of example epitaxial film materials 4610 and substrates that are compatible with $Mg_2GeO_4$. It was found experimentally that the misfit in lattice matching between $Mg_2GeO_4$ and the substrate or other listed cubic oxides can be managed to form extremely low defect density structures with high coherence. The smallest lattice mismatch between $Mg_2GeO_4$ and substrate was found to be for the substrate material MgO (column 9820) followed by $Al_2MgO_4$ (column 9822) and LiF (column 9824). These substrates are important because of their high optical transparency in the extreme ultraviolet range. All the compounds listed are cubic, with MgO and LiF having approximately half the lattice constant for the $AB_2O_4$ compounds, where {A,B} are selected from {Al, Ga, Ge, Zn}.

FIG. 98B is a table of compatibility of $\beta$-$Ga_2O_3$ with various heterostructure materials, including degree of mismatch between in-plane lattice parameters.

FIG. 99 is a table 9900 describing a selection of possible oxide material compositions comprising constituent elements (Mg, Zn, Al, Ga, O). The oxide materials can be formed into cubic crystal symmetry structures. Furthermore, the cubic crystal symmetry structures can be formed via epitaxial growth processes to form layered single crystal structures that are advantageously structurally matched enabling low defect density formation at the interfaces.

FIG. 100 shows a schematic of an epitaxial layered structure 10000 formed from at least two distinct materials further selected from categories of Oxide_type_A and Oxide_type_B from table 9900 shown in FIG. 99. Multilayered structures that are substantially lattice matched or coincidence lattice matched enable heterojunction and superlattice bandgap engineered structure to be formed on a substrate. A plurality of oxide material combinations can be formed. The epitaxial structure can be used for application to an electronic or optoelectronic device with reference to the energy band structure specific to each material composition or combination thereof.

FIG. 101 shows the single crystal orientation of an ultrawide bandgap cubic oxide composition 10100 comprising $ZnGa_2O_4$ (ZGO) epitaxially deposited and formed on a smaller bandgap wurtzite type crystal surface of SiC-4H. The $ZnGa_2O_4$(111) film is formed along a growth direction with preferred crystal orientation with respect to the initial growth surface presented by a prepared silicon-face or carbon-face of SiC-4H single crystal substrate. The $ZnGa_2O_4$(111)/SiC(0001) structure demonstrates the ability of a large lattice constant cubic oxide to achieve a stable epilayer on a hexagonal lattice template presented by the Si or C atom sublattice of SiC-4H. The thickness of the ZGO layer can vary from several nanometers to about a micron. This structure represents a heterostructure with a bandgap discontinuity of about SiC(3.2 eV)/ZGO(5.77 eV) which is advantageous for electronic carrier confinement or dielectric layer formation in electronic switch applications.

FIG. 102 shows the atomic configuration of the $ZnGa_2O_4$ (111) surface 10200 represented by the shaded triangular area. The exposed Zn atoms in the selected (111) plane present a Zn—Zn two-dimensional interatomic lattice that is represented by the dashed triangle. The lattice constant shown for the Zn—Zn lattice is $a_{Zn-Zn}(111)=5.981$ Å which is a close lattice match to twice the hexagonal Si—Si or C—C lattice 2x $a_{Si-Si}(001)=6.189$ Å. The growth condition for the ZGO epilayer can be used to stabilize such a structure in preference to other possible forms.

FIGS. 103A and 103B show the experimental XRD and XRF data of a ZGO(111)-oriented film to be formed epitaxially on a prepared SiC-4H(0001) surface. The narrow FWHM of the oriented ZGO peaks in the plot of FIG. 103A show high structural quality phase pure cubic ZGO film. FIG. 103B shows the grazing incidence of the ZGO film having high uniformity thickness attained by the single crystal ZGO structure.

FIG. 104A shows a schematic diagram of a large lattice constant cubic oxide 10400 represented by $ZnGa_2O_4$ formed on a smaller cubic lattice constant oxide represented by MgO. A $ZnGa_2O_4$(100) oriented epitaxial film can be formed along a growth direction on a MgO(100) surface or epilayer. In practice it was found to be advantageous to prepare and terminate an oxide substrate surface with oxygen atoms forming a preferred first bonding lattice comprising O-atoms (O-terminated surface). This can be achieved by a high temperature ultrahigh vacuum impurity desorption step (e.g., 500-800° C.) followed by an active oxygen exposure (beam equivalent O-flux ~1e-7 Torr to 1e-5 Torr) of the growth surface while reducing the substrate temperature to the desired growth temperature (e.g., 400-700° C.).

Epitaxial growth of example $ZnGa_2O_4$(100)-oriented films can achieve exceptionally high structural quality as disclosed herein. The ZGO film thickness can range from $0<L_{ZnGaO}\leq 1000$ nm due to the advantageous lattice matching. In practice using MBE growth process it was found that the incident sticking coefficient for Zn is low, whereas the surface adsorption of Ga is governed by both surface kinematics and suboxide formation. It was also found that the presence of Zn dramatically reduces suboxide formation and stabilizes a new crystal structure form, namely, $ZnGa_2O_4$ (refer to the formation energy 'see-saw' diagram FIG. 78).

FIG. 104B shows the crystal structures 10500 of the epitaxial growth surfaces presented for the structure of FIG. 104A comprising the upper and lower atomic structures of MgO(100) and $ZnGa_2O_4$(100), respectively. The upper crystal structure in the figure shows the atomic arrangement of Mg and O atoms comprising the Fm3m crystal of MgO. The lower crystal structure in the figure represents the atomic arrangement of the Zn, Ga and O atoms forming a Fd3m crystal symmetry group. A property of the ultrawide bandgap (UWBG) cubic oxides, represented by $ZnGa_2O_4$, is the ability for the unit cell $a_{ZGO}$ to match closely to twice the MgO lattice. That is, $\alpha_{ZnGad_2O_4}\cong 2\times\alpha_{MgO}$. This example shows the general observation that large lattice constant cubic oxides can match to smaller cubic oxides and vice versa.

FIGS. 105A and 105B show the experimental XRD data of a high structural quality epilayer of $ZnGa_2O_4$ film deposited on a MgO substrate. FIG. 105A shows the distinct and small FWHM peaks that represent the substrate and ZGO film. The cube-on-cube epitaxy is clearly evident and shows phase pure film formation. The XRD plot in FIG. 105B shows a higher resolution scan of the substrate and ZGO (004) diffracted peak along with high frequency thickness oscillations indicative of coherent and low defect density growth.

FIG. 106 shows the experimental XRD data of a high structural quality epilayer of an NiO film deposited on a MgO substrate. Additionally, $NiAl_2O_4$ with a Fd3m space group (shown in FIG. 88B-2) is compatible with NiO and MgO substrates, and can form heterostructures with these materials as well. In some embodiments, $NiAl_2O_4$ with an Fd3m space group can be used as a p-type epitaxial oxide material in a semiconductor structure.

FIG. 107 shows a schematic diagram of a large lattice constant cubic oxide 10700 represented by $MgGa_2O_4$ formed on a smaller cubic lattice constant oxide represented by MgO. A $MgGa_2O_4$(100) oriented epitaxial film can be formed along a growth direction on a MgO(100) surface or epilayer. In practice, it was found to be advantageous to prepare and terminate an oxide substrate surface with oxygen atoms forming a preferred first bonding surface lattice comprising O-atoms (O-terminated surface). This can be achieved by a high temperature ultrahigh vacuum impurity desorption step (e.g., 500-800° C. limited by the thermal properties of the substrate) followed by an active oxygen exposure (beam equivalent O-flux ~1e-7 Torr to 1e-5 Torr) of the growth surface while reducing the substrate temperature to the desired growth temperature (e.g., 400-700° C.).

Epitaxial growth of example $MgGa_2O_4$(100)-oriented films can achieve exceptionally high structural quality as disclosed herein. The $MgGa_2O_4$ film thickness can range from $0<L_{MgGaO}\leq 1000$ nm due to the advantageous lattice matching. In practice using MBE growth process it was found that the incident sticking coefficient for Mg is substantially higher than Zn, however, the Mg Arrhenius behavior limits the adsorbed surface concentration of Mg and is primarily governed by the growth temperature. The surface adsorption of Ga is governed by both surface kinematics and suboxide formation. It was also found that the presence of Mg dramatically reduces suboxide formation and stabilizes a new crystal structure form, namely, $MgGa_2O_4$ (refer the formation energy 'see-saw' diagram).

FIGS. 108A and 108B show the experimental XRD data for the formation of an ultrawide bandgap cubic $MgGa_2O_4$ (100)-oriented epilayer on a prepared MgO(100) substrate. FIG. 108A shows the high-resolution diffraction reflexes of the cubic substrate and the MgGaO film. The film thickness was $L_{MgGaO}$~50 nm and the growth conditions where such that an incident Mg:Ga flux ratio in excess of 1:3 was used at a growth temperature of $T_g$~450° C. The growth condition may be improved further. The XRD plot of FIG. 108B shows the off-axis (311) diffraction of the $MgGa_2O_4$ epilayer rotated azimuthally to reveal and confirm the cubic 4-fold crystal structure.

FIG. 109 shows a further epilayer structure 10900 comprising two UWBG large lattice constant cubic oxide layers integrated into a dissimilar bandgap oxide structure deposited on a large lattice constant cubic $MgAl_2O_4$(100)-oriented substrate. The $ZnAl_2O_4$ and $ZnGa_2O_4$ epilayers are formed sequentially by switching incident fluxes of elemental Al and Ga in the presence of Zn and active oxygen. The substrate and epilayers are all large lattice constant materials with sufficient lattice matching at the heterointerfaces to enables high crystal quality and complex multilayered structures.

FIGS. 110A and 110B show the experimental XRD data of MgO, $ZnAl_2O_4$ and $ZnGa_2O_4$ cubic oxide films on a $MgAl_2O_4$(100)-oriented substrate. $MgAl_2O_4$ having SG=Fd3m crystal symmetry group is a very large energy bandgap $E_g(MgAl_2O_4)$=8.61 eV material with lattice constant enabling a large selection of cubic epitaxial structures. The XRD plot of FIG. 110A shows the epitaxial structure of FIG. 109 comprising the epilayer sequence of $ZnAl_2O_4$ and $ZnGa_2O_4$ on the $MgAl_2O_4$(100) substrate. The crystal quality of the substrate is presently limited and possesses slightly misoriented mosaic regions within the bulk.

The XRD plot of FIG. 110B shows a thick epitaxial MgO(100) film representing the ability of small cubic oxide to register with a large cubic oxide space group. Small thickness oscillations superimposed upon the $MgAl_2O_4$ peak indicate a coherently strained thin interface film of MgO, followed by a relaxed MgO film which exceeds the elastic critical layer thickness of ~100 nm. This result is advantageous for $AB_2O_4$-type/MgO multilayered structure formation, as disclosed herein, where an epilayer of MgO having approximately half the lattice constant of the $MgAl_2O_4$ substrate can be formed. That is, MgO films on bulk $MgAl_2O_4$ can be formed as well as the reciprocal growth of $MgAl_2O_4$ on bulk MgO.

FIG. 111 shows the surface atom configurations 11100 of a cubic LiF(111)-oriented surface and a cubic $\gamma Ga_2O_3$(111)-oriented surface. Both LiF and $\gamma Ga_2O_3$ possess cubic space groups of Fm3m and a defective Fd3m, respectively. While LiF(100) oriented substrates are ideal and preferable, LiF (111)-oriented substrates are commercially available and can be used to demonstrate the utility of integrating LiF with UWBG oxides. The lattice constants in the respective (111)-planes show excellent matching conditions such that $\alpha_{\gamma Ga_2O_3}(111)\cong 2\times\alpha_{LiF}(111)$. A similar matching condition for $\alpha_{\gamma Ga_2O_3}(100)\cong 2\times\alpha_{LiF}(100)$ is also possible and can be applicable to the UWBG materials disclosed herein. LiF is a unique electron affinity material and can be further epitaxially deposited as a functional layer and utilized to modify the surface potential and electron affinity of UWBG interfaces.

FIGS. 112A and 112B show the experimental XRD data of gallium oxide showing the crystal symmetry group of the epilayer controlled by the underlying substrate or seed surface symmetry. The XRD plot of FIG. 112A shows a cubic $\gamma Ga_2O_3$ epilayer formed on a LiF(111) surface, and the XRD plot of FIG. 112B shows a $\beta Ga_2O_3$ epilayer that is preferentially formed on a $LiAlO_2$(100)-oriented surface. In practice, the deposition temperature and substrate surface symmetry and lattice constant play a fundamental role in selecting the lowest energy formation type and orientation of cubic oxides. For example, deposition temperatures <600° C. enable cubic $Ga_2O_3$ form whereas higher Tg>700° C. selects monoclinic, hexagonal or orthorhombic (Pna21) forms of $Ga_2O_3$. Stabilizing various crystal symmetry types is further enabled by the co-deposition of at least one of Mg, Zn, Ni, Li, Ge and Al, for example.

FIG. 113 shows the epitaxial structure 11300 of $Ga_2O_3$ formed on cubic MgO substrate. The advantageous lattice matching of cubic $\gamma Ga_2O_3$ to the MgO(100) is found to occur for a critical layer thickness $L_{\gamma GaO}$~10-50 nm. Continued growth beyond critical thickness $L_{\beta GaO}>L_{\gamma GaO}$ results in energetically favorable monoclinic $\beta Ga_2O_3$ crystal structure. In practice, it was found that the cubic interlayer can be suppressed by growth at higher temperature Tg>600° C. In all cases, the $\beta Ga_2O_3$ epilayer orients with an advantageous $\beta Ga_2O_3$(100) epilayer, which enables optical polarization coupling to the conduction and valence transitions suitable for optical devices.

FIGS. 114A and 114B show respectively the experimental XRD data of low growth temperature (LT) and high growth temperature (HT) $Ga_2O_3$ film formation on prepared MgO (100)-oriented substrates. The XRD plot of FIG. 114A shows selective growth of cubic $\gamma Ga_2O_3$ at low temperature (<600° C.) and the XRD plot of FIG. 114B shows growth $\beta Ga_2O_3$ at high temperature (600-700° C.). The excellent epilayer FWHM and film thickness fringes are indicative of high structural quality. This attribute is used to form complex heterostructures disclosed herein.

FIG. 115 shows the complex epilayer structure 11500 of dissimilar cubic oxide layers integrated into a superlattice or multi-heterojunction structure. Shown are $MgGa_2O_4$ and $ZnGa_2O_4$ layers forming a superlattice having a repeating period Λ with N repetitions, grown along a growth direction. A MgO(100)-oriented substrate enables the lattice matching as described in FIGS. 105A, 105B and 108A, 108B.

If the layers comprising the SL are thin such that each of $L_{MgGaO}$ and $L_{ZnGaO}$ are less that 10-20× unit cells in thickness (e.g., less than about 150 nm), then a digital pseudo-alloy can be formed having an effective composition $(ZnGa_2O_4)_x(MgGa_2O_4)_{1-x} \equiv (Zn_xMg_{1-x})Ga_2O_4$ where the mole fraction is $x=L_{ZnGaO}/\Lambda$. The electronic bandgap of the SL pseudoalloy can be governed by the quantized energy levels within the lower bandgap material, namely $ZnGa_2O_4$. It is further disclosed that such SL structures can transform the indirect bandgap of bulk $ZnGa_2O_4$ into a SL having direct bandgap E-k response. This is advantageous for optically emissive device active regions.

FIGS. 116A and 116B show the experimental XRD data of SL structures formed using $MgGa_2O_4$ and $ZnGa_2O_4$ layers deposited on MgO(100) substrate but having different periods. The XRD plot of FIG. 116A shows a $SL[MgGa_2O_4/ZnGa_2O_4]//MgO(100)$ with approximately equal $L_{MgOGaO}=L_{ZnGaO}$ or about 2 unit cells in thickness and repeated 10×. The extremely sharp FWHM SL peaks $SL_i$ demonstrate the high structural quality. The SL peak labelled $SL_0$ represent the equivalent digital alloy represented by a bulk layer comprising $(Zn_xMg_{1-x})Ga_2O_4$, where $0 \leq (x=L_{ZnGaO}/\Lambda)$ 23 1.

The XRD plot of FIG. 116B shows the same structure as FIG. 116A but with a period twice as large, $\Lambda_{SL_2}=2\times\Lambda_{SL_1}$ as evidenced by the smaller satellite peak spacing. In both cases the structural quality is exceptionally good as shown by the Pendellosung thickness fringes and narrow FWHM for higher order satellite peaks.

FIGS. 117A and 117B show the experimentally determined grazing incidence XRR data evidencing the extremely high crystal structure quality of the $SL[MgGa_2O_4/ZnGa_2O_4]//MgO(100)$ structures shown in FIGS. 116A and 116B, respectively. The large number of satellite peaks $SL_i$, thickness fringes, and the narrow FWHM are clearly shown. In comparison to the bulk oxide layers deposited on MgO, the SL structures present unique properties for application to electronic devices.

FIG. 118 shows the complex epilayer structure 11800 of dissimilar cubic oxide layers integrated into a superlattice or multi-heterojunction structure in another example. Shown are large lattice constant cubic $MgAl_2O_4$ and small lattice constant MgO layers forming a superlattice having a repeating period Λ with N repetitions, grown along a growth direction. A $MgAl_2O_4$(100)-oriented substrate enables the lattice matching to $MgAl_2O_4$ and '2x' lattice matching for MgO.

If the layers comprising the SL are thin such that each of $L_{MgAlO}$ and $L_{MgO}$ are less than approximately 10-20× their respective unit cells in thickness, e.g., less than about 150 nm, then a digital pseudo-alloy can be formed having an effective composition $(MgO)_x(MgAl_2O_4)_{1-x} \equiv Mg_1Al_{2(1-x)}O_{4-3x}$ where $0 \leq (x=L_{MgO}/\Lambda) \leq 1$. The electronic bandgap of the pseudoalloy can be governed by the quantized energy levels within the lower bandgap material, namely MgO. It is further disclosed that such SL structures can engineer direct quantized energy transitions between the conduction and valence band ranging from about 7.69 eV to 8.61 eV.

FIGS. 119A and 119B show the experimental XRD and XRR data of the epitaxial SL structure described in FIG. 118 forming a $SL[MgAl_2O_4/MgO]//MgAl_2O_4(100)$. The XRD plot of FIG. 119A shows the well resolved superlattice peaks indicative of relatively good crystal structure achieved. Improvement in the crystal quality can be refined by optimized growth conditions. Clearly the $SL_{n=0}$ average alloy peak is well resolved and represents an equivalent pseudo-alloy. The lower grazing incidence XRR data of FIG. 119B shows well resolved satellite peaks indicative of high-quality single crystal films.

FIG. 120 shows the complex epilayer structure 12000 of dissimilar cubic oxide layers integrated into a superlattice or multi-heterojunction structure in a further example. Shown are large lattice constant cubic $GeMg_2O_4$ and small lattice constant MgO layers forming a superlattice having a repeating period Λ with N repetitions, grown along a growth direction. A MgO(100)-oriented substrate enables the lattice '2x' cube-on-cube matching to $GeMg_2O_4$. The direct bandgap E-k of both materials enables unique electronic band structure tuning using quantized energy levels pre-selected from specific layer thicknesses comprising the SL period. If the layers comprising the SL are thin, such that, each of $L_{GeMgO}$ and $L_{MgO}$ are less than approximately 10-20× their respective unit cells in thickness (e.g., layer thicknesses less than about 150 nm), then a digital pseudo-alloy can be formed having an effective composition $(MgO)_x(GeMg_2O_4)_{1-x} \equiv Ge_{1-x}Mg_{2-x}O_{4-3x}$ where $0 \leq (x=L_{MgO}/\Lambda) \leq 1$. An optional MgO cap layer is shown that can be used to protect the final surface of the structure.

FIG. 121 shows the experimental XRD data of a Fd3m crystal structure $GeMg_2O_4$ deposited as a high quality bulk layer on a Fm3m MgO(100) substrate and further comprising a MgO cap.

FIG. 122 shows the experimental XRD data of a Fd3m crystal structure $GeMg_2O_4$ when incorporated as a SL structure comprising 20× period $SL[GeMg_2O_4/MgO]$ on a Fm3m MgO(100) substrate.

As shown in FIG. 121, the extraordinarily high quality $GeMg_2O_4$ is evidenced by the small FWHM epilayer (400) diffraction peak and the high frequency thickness oscillations generated by the X-ray Fabry-Perot effect of the parallel atomic planes of the film and MgO cap layer, which are strained and coherent with the underlying substrate crystal. As shown in FIG. 122, this high degree of lattice matching between $GeMg_2O_4$ and MgO can be further utilized to form complex SL structures. FIG. 122 shows such a SL comprising 20× period $SL[GeMg_2O_4/MgO]//MgO_{sub}(100)$. Again, the large number of sharp SL satellite peaks $SL_i$ is evidence of a coherently strained structure. Both $GeMg_2O_4$ and MgO constituent materials are direct bandgap with $E_g(GeMg_2O_4)<E_g(MgO)$.

For a thin layer of smaller bandgap material ~1-5 crystal unit cells in thickness, the conduction band minimum and valence band maximum can be quantum confined when sandwiched between a larger bandgap material such as MgO. The transition energy between the lowest quantized energy level in the conduction band and the highest quantized energy level in the valence band of $GeMg_2O_4$ can be tuned by varying the thickness via the quantum confined effect. This tuning method enables a transition energy to vary from about 5.81 eV to 7.69 eV. This energy range is ideal for optoelectronic emissive devices operating in the deep ultraviolet (161-213 nm) portion of the electromagnetic spectrum.

FIG. 123 shows the complex epilayer structure 12300 of dissimilar cubic oxide layers integrated into a superlattice or multi-heterojunction structure in another example. Shown are two large lattice constant cubic materials, namely, $GeMg_2O_4$ and $MgGa_2O_4$ layers forming a superlattice having a repeating period Λ with N repetitions, grown along a growth direction. A MgO(100)-oriented substrate enables the lattice '2x' cube-on-cube matching. The direct bandgap E-k of both materials enables unique electronic band structure tuning using quantized energy levels pre-selected from specific layer thicknesses comprising the SL period. If the layers comprising the SL are thin, such that each of $L_{GeMgO}$ and $L_{MgGaO}$ are less than approximately 10-20× their respective unit cells in thickness (e.g., less than about 150 nm), then a digital pseudo-alloy can be formed having an effective composition $(MgGa_2O_4)_x(GeMg_2O_4)_{1-x}\equiv Mg_{2-x}Ga_{2x}Ge_{1-x}O_4$ where $0\leq(x=L_{MgGaO}/\Lambda)\leq 1$.

FIG. 124 shows a representation of the (100) crystal plane of the Fd3m cubic symmetry unit cells 12400 of $GeMg_2O_4$ and $MgGa_2O_4$. The constituent atomic species are labeled, showing the unique character of Mg atoms in each oxide. For the case of $MgGa_2O_4$, the Ga atoms occupy the octahedral bonding sites surrounded by O atoms, whereas the Mg occupies the tetrahedral bonding sites. For the case of $GeMg_2O_4$ the Mg atoms occupy tetrahedral bonding sites and the Ge atoms occupy the octahedral sites. The change in local bonding site of Mg from octahedral to tetrahedral in $GeMg_2O_4$ and $MgGa_2O_4$ preserves the centricity C of the crystal, $C_{GeMg_2O_4}=0.2628$ and $C_{MgGa_2O_4}=0.2611$.The close lattice constants $\alpha_{GeMg_2O_4}=8.350$ Å and $\alpha_{MgGa_2O_4}=8.457$ Å present a lattice mismatch to a MgO(100) substrate of −1.92% and −0.66%, respectively.

For comparison growth on $MgAl_2O_4(100)$ substrate, the lattice mismatch is increased to +2.19% and +3.50% and the therefore the biaxial strain is expected to be higher when lattice matching compared to MgO substrates.

FIG. 125 shows the experimental XRD data of a superlattice structure $SL[GeMg_2O_4/MgGa_2O_4]//MgO_{sub}(100)$ comprising N=20 periods and $\Lambda_{SL1}=15.4$ nm. FIG. 125 shows a high structural quality with extremely sharp FWHM satellite peaks and near perfect N−2=18 oscillations between satellites $SL_{n=0}$ and $SL_{+1}$, with a substrate to $SL_{n=0}$ peak separation of 1019.7 s.

FIG. 126 shows the experimental XRD data of a superlattice structure $SL[GeMg_2O_4/MgGa_2O_4]//MgO_{sub}(100)$ comprising N=10 periods and an increased SL period of $\Lambda_{SL2}=27.5$ nm. FIG. 126 shows that once again the structural quality is high with the SL satellite peak spacing reduced. The N−2=8 oscillation between the $SL_{n=0}$ and $SL_{+/-1}$ peaks further demonstrate the high structural quality with a substrate to $SL_{n=0}$ peak separation of 572.7 s.

FIG. 127 shows the complex epilayer structure 12700 of dissimilar cubic oxide layers integrated into a superlattice or multi-heterojunction structure in a further example. Shown in this example are two large lattice constant cubic materials, namely, $GeMg_2O_4$ and $\gamma Ga_2O_3$ layers forming a superlattice having a repeating period Λ with N repetitions, grown along a growth direction. A MgO(100)-oriented substrate enables the lattice '2x' cube-on-cube matching. If the layers comprising the SL are thin, such that, each of $L_{GeMgO}$ and $L_{\gamma GaO}$ are less than approximately 10-20× their respective unit cells in thickness, e.g., less than about 150 nm, then a digital pseudo-alloy can be formed having an effective composition $(\gamma Ga_2O_3)_x(GeMg_2O_4)_{1-x}\equiv Mg_2(_{1-x})Ga_{2x}Ge_{1-x}O_{4-x}$ where $0\leq(x=L_{\gamma GaO}/\Lambda)\leq 1$. As demonstrated in FIGS. 114A and 114B the formation energy of $\gamma Ga_2O_3$ layers requires a lower growth temperature to stabilize it with respect to forming other non-cubic space group phases. The crystal structure of $\gamma Ga_2O_3$ is a defective Ga-site Fd3m space group and enables further impurity type doping to occur (for example Li can be used as a substitutional species on the defect site).

FIGS. 128A and 128B show experimental XRD data for a superlattice structure comprising $SL[GeMg_2O_4/\gamma Ga_2O_3]//MgO_{sub}(100)$. FIG. 128A shows a phase-pure cubic structure for the substrate and SL (200) and (400) diffraction orders and a peak labelled P indicating the $\gamma Ga_2O_3$ replica diffraction. The high resolution XRD plot shown in FIG. 128B further reveals a high structural quality SL comprising N=10 periods and $\Lambda_{SL}$=Å with extremely sharp FWHM satellite peaks and near perfect N−2=8 oscillations between the $SL_{n=0}$ and $SL_{+/-1}$ peaks. This is yet another example for the possible combinations of oxide materials that can be selected to form high quality heterojunctions and superlattices.

FIG. 129 shows the complex epilayer structure 12900 of dissimilar cubic oxide layers integrated into a superlattice or multi-heterojunction structure in another example. Shown are large lattice constant cubic $ZnGa_2O_4$ and small lattice constant MgO layers forming a superlattice having a repeating period Λ with N repetitions, grown along a growth direction. A MgO(100)-oriented substrate enables the lattice '2x' cube-on-cube matching to $ZnGa_2O_4$. The band structure E-k of both materials enables unique electronic structure tuning using specific layer thicknesses comprising the SL period. If the layers comprising the SL are thin, such that, each of $L_{XnGaO}$ and $L_{MgO}$ are less than approximately 10-20× their respective unit cells in thickness, e.g., less than about 150 nm, then a digital pseudo-alloy can be formed having an effective composition $(MgO)_x(ZnGa_2O_4)_{1-x}\equiv Mg_xZn_{1-x}Ga_{2(1-x)}O_{4-3x}$ where $0\leq(x=L_{MgO}/\Lambda)\leq 1$. An optional MgO cap layer is shown that can be used to protect the final surface of the structure and balance the strain with the substrate.

FIGS. 130A and 130B show experimental XRD and XRR data for a heterostructure and superlattice structure comprising $SL[ZnGa_2O_4/MgO]//MgO_{sub}(100)$. FIG. 130A shows a high resolution XRD for the superlattice. The as-grown epitaxial structure reveals a high structural quality SL comprising N=10 periods and $\Lambda_{SL}=6.91$ nm with extremely sharp FWHM satellite peaks and near perfect N−2=8 oscillations between the $SL_{n=0}$ and $SL_{+1}$ peaks A substrate to $SL_{n=0}$ peak separation of 1481.8 s is measured. The XRR plot shown in FIG. 130B also confirms the exceptionally high atomic heterointerfaces within the SL with near perfect thickness oscillations between satellite reflection orders.

FIG. 131 shows the complex epilayer structure 13100 of dissimilar cubic oxide layers integrated into a superlattice or multi-heterojunction structure in another example. Shown are large lattice constant cubic $MgGa_2O_4$ and small lattice constant MgO layers forming a superlattice having a repeating period Λ with N repetitions, grown along a growth direction. A MgO(100)-oriented substrate enables the lattice '2x' cube-on-cube matching to $MgGa_2O_4$. The band structure E-k of both materials enables unique electronic structure tuning using specific layer thicknesses comprising the SL period. If the layers comprising the SL are thin, such that, each of $L_{MgGaO}$ and $L_{MgO}$ are less than approximately 10-20× their respective unit cells in thickness, e.g., less than about 150 nm, then a digital pseudo-alloy can be formed having an effective composition $(MgO)_x(MgGa_2O_4)_{1-x} \equiv Mg_1Ga_{2(1-x)}O_{4-3x}$ where $0 \leq (x=L_{MgO}/\Lambda) \leq 1$. An optional MgO cap layer is shown that can be used to protect the final surface of the structure and balance the strain with the substrate.

The lattice mismatch between Fd3m $MgGa_2O_4(100)$ and Fm3m MgO(100) is +2.19% and can be accommodated elastically by tetrahedral deformation of the $MgGa_2O_4$ unit cell when biaxially strained to the rigid MgO lattice representing the substrate.

FIGS. 132A and 132B show experimental XRD data for a superlattice structure comprising $SL[MgGa_2O_4/MgO]//MgO_{sub}(100)$. The as-grown epitaxial structure reveals a high structural quality SL comprising N=20 periods and $\Lambda_{SL}$=25.3 nm. The wide angle scan plot shown in FIG. 132A reveals a phase pure cubic structure showing the (200) and (400) diffracted order from both the MgO substrate and the SL. The peak labelled P is a low order replica diffraction order from the Ga-sublattice formed by the SL. The high resolution XRD plot of FIG. 132B reveals the high-quality SL structure generating a large number of satellite reflected orders from the thick $\Lambda_{SL}$=6.44 nm which correlates well with the XRD data FIG. 133 shows the complex epilayer structure 13300 of dissimilar cubic oxide layers integrated to form a heterostructure and SL where the SL comprises $SL[Ga_2O_3/MgO]//MgO_{sub}(100)$. The phase of the $Ga_2O_3$ layer is controlled by the growth temperature, and the thickness and can be preselected from $\gamma Ga_2O_3$ or $\beta Ga_2O_3$. Other phases are also possible.

FIGS. 134A and 134B show experimental XRD data for the SL structure of FIG. 133 where the growth temperature is selected to achieve the cubic-phase $\gamma Ga_2O_3$ during the MBE deposition process. This structure is of particular interest as the control of the critical layer thickness (CLT) of $\gamma Ga_2O_3$ can be used to achieve very high quality structures when $L_{GaO}$<CLT.

FIGS. 134A and 134B show respectively the high resolution XRD scans in the vicinity of the MgO(200) and MgO(400) diffracted orders of the as-grown epitaxial structure. Both (200) and (400) scans reveal a high structural quality SL comprising N=10 periods and $\Lambda_{SL}$=14.02 nm with extremely sharp FWHM satellite peaks and near perfect N−2=8 oscillations between the $SL_{n=0}$ and $SL_{+1}$ peaks and higher orders. FIG. 134B also confirms the exceptionally high atomic heterointerfaces within the SL with near perfect thickness oscillations between satellite reflection orders.

FIG. 135 shows the complex epilayer structure 13500 of dissimilar cubic oxide layers integrated into a superlattice or multi-heterojunction structure in a further example. Shown are two small lattice constant cubic $Mg_xZn_{1-x}$ and MgO layers forming a superlattice having a repeating period Λ with N repetitions, grown along a growth direction.

The cubic phase of $Mg_xZn_{1-x}O$ requires precise control of the Zn % such that the rocksalt (RS) form can be stabilized for x>0.7. Incorporation of Zn into the RS-MgZnO material forms an indirect E-k band structure even up to about x=0.85. Above x>0.85 a direct band structure can be obtained, however biaxial strain can be utilized to modify the valence dispersion favorably to produce a direct bandgap property. For example, RS-MgZnO can be formed into SL with any one of the other oxide materials disclosed herein and furthermore the substrate selection further dictates the strain imparted to the structure.

FIG. 136 shows experimental XRD data of a bulk RS-$Mg_{0.9}Zn_{0.1}O$ epilayer pseudomorphically strained to a cubic Fm3m MgO(100)-oriented substrate. The sticking coefficient of Zn is almost 10× lower than Mg using MBE growth process.

FIG. 137 shows experimental XRD data of the bulk RS-$Mg_{0.9}Zn_{0.1}O$ composition referred to in FIG. 136, incorporated into a digital alloy in the form of SL[RS-$Mg_{0.9}Zn_{0.1}O$ /MgO]/$MgO_{sub}(100)$. Sharp well resolved satellite peaks provide evidence for the high crystalline quality of the structure.

Graded Chirp Example

FIG. 138A shows a plot 13800 of the minimum bandgap energy versus the minor lattice constant of monoclinic $\beta(Al_xGa_{1\times x})_2O_3$. The lattice constants for all 3 independent crystal axes (a, b, c) become smaller as the Al mole fraction x increases. The monoclinic C2m space group has a unit cell comprising 4 distinct octahedral bonding sites and 4 distinct tetrahedral bonding sites. Theoretically the full mole fraction 0≤x≤1 range is possible, however, it was found experimentally that Al atoms prefer exclusively octahedral bonding sites whereas Ga atoms can occupy both symmetry sites. This limits the attainable alloy range to 0≤x≤0.5 and the available minimum bandgap to ~6 eV.

Furthermore, it was found via experiment that Al atoms are particularly difficult to incorporate on the (−201) face, whereas (100), (001), (010)-oriented surfaces can attain 0≤x≤0.35, while (110)-oriented surfaces can accommodate large mole fractions of Al, such that 0≤x≤0.5.

FIG. 138B shows a plot 13850 of the minimum bandgap energy versus the minor lattice constant of hexagonal $\alpha(Al_xGa_{1-x})_2O_3$. The lattice constants for the two independent crystal axes (a, c) become smaller as the Al mole fraction x increases. The hexagonal R3c space group has a unit cell comprising 12 distinct octahedral bonding sites. Theoretically the full mole fraction 0≤x≤1 range is possible and was confirmed experimentally 0≤x≤1.0. The Al and Ga atoms comprising the alloy can in general randomly select any of the 12 distinct bonding sites.

The well-known x=1.0 composition is commonly referred to as sapphire and is commercially available in large wafer diameters and exceptionally high crystalline quality. Common crystal faces for epitaxial wafer growth are C-plane, A-plane, R-plane and M-plane. Intentional small angle misoriented surfaces away from A-, R-, C- and M-planes are also possible for optimizing growth conditions of epitaxial R3c $\alpha(Al_xGa_{1-x})_2O_3$. It was found experimentally that R3c $\alpha(Al_xGa_{1-x})_2O_3$ can be epitaxially formed on A-, R-, and M-plane sapphire. In particular, the A-plane shows exceptionally high crystal quality epilayer growth. Substrates for deposition of $\alpha(Al_xGa_{1-x})_2O_3$ include tetrahedral $LiGaO_2$ and others such as metallic surfaces of Ni(111) and Al(111).

FIG. 138C shows examples of R3c $\alpha(Al_xGa_{1-x})_2O_3$ epitaxial structures 13860, 13870, and 13880 that may be formed. The crystal structures shown describe the atomic positions within a repeating unit cell comprising a bilayer pair of $\alpha Ga_2O_3$ and $\alpha Al_2O_3$. The digital superlattice formation can be utilized to form an equivalent ordered ternary alloy of composition $\alpha(Al_xGa_{1-x})_2O_3$ wherein the equivalent mole fraction of Al is given by:

$$x = \frac{L_{Al_2O_3}}{L_{Al_2O_3} + L_{Ga_2O_3}}$$

Furthermore, if the layer thicknesses are selected to be sufficiently thin (e.g., less than about 10 unit cells of the respective bulk material) then quantization effects along the growth axis occurs and electronic properties will be determined by the quantized energy states in the conduction and valence bands of $\alpha Ga_2O_3$. If the wider bandgap material $\alpha Ga_2O_3$ is also sufficiently thin (namely, less than about 5 unit cells) then quantum mechanical tunnelling of electrons and holes can occur along the quantization axis (in general parallel to the layer formation direction).

A monolayer (ML) is defined as the unit cell thickness along the given crystal axis. For the (110) oriented growth the free standing value for 1 ML $\alpha Al_2O_3$=4.161 Å and 1 ML $\alpha Ga_2O_3$=4.382 Å.

It was found that the A-plane surface of sapphire is exceptionally advantageous for thin film formation of $\alpha(Al_xGa_{1-x})_2O_3$ and multilayered structures thereof. FIG. 138C shows three example cases of a digital SL intentionally formed along the [110] growth axis or deposited on the A-plane of $\alpha(Al_xGa_{1-x})_2O_3$.

The SL comprises for this example a repeating SL period of 4 ML in thickness, however, thicker or thinner periods can be selected. The cross-section of the crystal is equivalent to viewing the C-axis in plan view, and is to be understood that the structure is periodic in the horizontal directions representing an epitaxial film. Clearly if there are no Ga atoms substituted in the crystal, the structure represents bulk $\alpha Al_2O_3$ as shown on the left-hand diagram of the figure. An example case of a Ga atom substitution is shown in the middle diagram, with an SL structure comprising 3 ML $\alpha Al_2O_3$/1 ML $\alpha Ga_2O_3$ being the equivalent bulk ternary alloy of $(Al_{0.75}Ga_{0.25})_2O_3$. An advantage of using a digital alloy compared to co-deposition of simultaneous Al and Ga adatoms to form a random ternary alloy is the ability to bandgap engineer the electronics properties of the material beyond a simple random alloy. In practice, the digital alloy enables much simpler growth methods for MBE as only two elemental fluxes of Al and Ga are required to create a wide range of bandgap compositions. Otherwise, the flux ratio of $Al(\Phi_{Al})$ and $Ga(\Phi_{Ga})$ must be configured and precisely maintained to achieve the required Al mols fraction using:

$$x_{Al}^{random} = \frac{\Phi_{Al}}{\Phi_{Al} + \Phi_{Ga}}$$

FIG. 139A shows an epilayer structure 13900 implementing a stepped increment tuning of the effective alloy composition of each SL region along the growth direction. As an example, four SL regions are shown with varying equivalent mole fractions of Al,—x1, x2, x3 and x4. The period of each SL can be kept constant, such as shown in FIG. 138C, but the bilayer thicknesses can be varied, as shown in FIG. 139. The number of periods can also be kept the same or varied between SLs along the growth direction. The example shows the SL changing from high Al % near the substrate to a higher Ga % near the top. This method of grading the average alloy content as a function of the growth direction is advantageous for managing the misfit strain at the heterojunction interfaces, for example, determined by the lattice constants shown in FIG. 138B. It was found that the critical layer thickness $L_{CLT}$ for $\alpha Ga_2O_3$ on bulk $\alpha Al_2O_3$ (110) is about $L_{CLT} \leq 100$ nm. Therefore, the digital step graded SL method disclosed herein enables creation of high Ga % layers on sapphire substrates.

FIG. 139B shows the experimental XRD data of a step graded SL (SGSL) structure as shown in FIG. 139A using a digital alloy comprising bilayers of $\alpha Ga_2O_3$ and $\alpha Al_2O_3$ deposited on (110)-oriented sapphire (zero miscut). The SGSL had a period of 7.6 nm and each SL had 10 periods. The bilayer pair thickness was varied along the growth direction from low average Ga % to high average Ga %. The resulting equivalent alloy diffraction peak $\alpha(Al_{0.5}Ga_{0.5})_2O_3$ (110) can be compared to the pseudomorphic bulk $\alpha Ga_2O_3$ (110) diffraction peak shown in the figure.

FIG. 140 shows another example and possible application of a step graded SL structure 14000 which in one example may be used to form a pseudo-substrate with a tuned in-plane lattice constant for a subsequent high quality and close lattice matched active layer such as the "bulk" (meaning a single layer rather than an SL) $\alpha(Al_{x5}Ga_{1-x5})_2O_3$. The active layer can, for example, be used for the high mobility region of a transistor.

FIG. 141A shows another step graded SL structure 14100 comprising a high complexity digital alloy grading interleaved by a wide bandgap spacer, in this case a $\alpha Al_2O_3$ interposer layer. The SL regions are varied by the narrow bandgap (NBG) and wide bandgap (WBG) layer thickness $L_m$ and number of periods $N_{pm}$. Such structures are advantageous for creating chirped electronic bandgap structures along the growth direction.

FIG. 141B shows the experimental high-resolution XRD data of the step graded (i.e., chirped) SL structure with interposer shown in FIG. 141A. The XRD pattern shows well defined satellite peaks due to the imposed periodicity of keeping both the spacer and SL region period constant. The width of the satellite peak is testament to the varying effective alloy content as a function of the growth direction. Eight SL regions were utilized in this example with a period of ~8 ML and an estimated duty cycle of the $\alpha Ga_2O_3$ and $\alpha Al_2O_3$ constituent bilayers selected to achieve $0.125 \leq x \leq 0.875$. The thickness of the $\alpha Al_2O_3$ interposer was 4 ML.

FIG. 141C shows the X-ray reflection (XRR) data of the step graded (i.e., chirped) SL structure with interposer shown in FIG. 141A. The XRR plot shows the deep modulation in reflectivity but maintaining sharp and well resolved satellite reflexes indicative of high interfacial flatness between each SL bilayer and between SL and interposer.

FIGS. 142A and 142B show the electronic band diagram as a function of the growth direction for a chirp layer structure like those of FIGS. 140 and 141A, at zero bias conditions and under a bias "$V_{Bias}$." FIG. 142C shows the lowest energy quantized energy wavefunction confined within the $\alpha Ga_2O_3$ layers of the chirp layer. The SL regions have an effective bandgap determined by the quantized energy levels confined within the NBG $\alpha Ga_2O_3$. FIG. 142D is the wavelength spectrum of the oscillator strength for electric dipole transitions between the conduction and valence band of the chirp layer modeled in FIGS. 142A-142C. It is calculated from the spatial overlap integrals between the conduction and valence band quantized wavefunctions. This curve is related to either the absorption coefficient or the emission spectrum of electrons and holes recombining in the structure. FIG. 142D also shows the calculated electron and hole wavefunctions ($\psi_c^{n=1}$, and $\psi_v^{n=1}$, respectively) within a quantum well of the structure under bias.

Devices

The epitaxial oxide materials and semiconductor structures described herein can be used as devices, such as diodes, sensors, LEDs, lasers, switches, transistors, amplifiers, and other semiconductor devices. The semiconductor structures can comprise a single layer of an epitaxial oxide on a substrate, or multiple layers of epitaxial oxide materials.

FIG. 143A shows a full E-k band structure of an epitaxial oxide material, which can be derived from the atomic structure of the crystal. FIG. 143B shows a simplified band structure, which is a representation of the minimum bandgap of the material, and wherein the x-axis is space (z) rather than wavevectors (as in the E-k diagrams). Semiconductor devices can be designed using epitaxial oxide materials using the thickness ($L_z$) of the layer and the minimum bandgap.

For example, FIG. 144A shows a simplified band structure diagram 14400 of bandgap energy (eV) as a function of growth direction Z, representing a homojunction device comprising a p-i-n structure comprising epitaxial oxide layers. The structure is formed along a growth direction Z, using spatial control of the doping regions. Moving from left to right along the growth direction, first an n-type region is formed, followed by a not-intentionally doped region (intrinsic "i" region), and then a p-type region. In various embodiments, the doping transition between the n-, i-, and p-regions may be abrupt or graded over a distance. The height of the bandgaps for each region is the same, showing that the bandgap energies $E_g$ for the n-, i-, and p-regions are equal. The p- and n-regions form a diode. An electric field between the p- and n-regions is applied across the central intrinsic region along the Z-axis, causing electrons and holes to be injected into the i-region.

FIG. 144B is a simplified band structure diagram 14450 representing a homojunction device, such as a diode, with an n-i-n structure comprising epitaxial oxide layers. The n-i-n structure is formed along a growth direction Z, using spatial control of the doping regions. In various examples, the n-i local junctions can be abrupt or graded in doping concentration across a predetermined distance.

FIG. 145A shows a simplified band structure diagram 14500 of a heterojunction p-i-n device comprising epitaxial oxide layers. The structure is sequentially formed along the growth direction Z, using spatial control of the composition and doping of the distinct regions. In various embodiments, the composition and doping can be abrupt or graded across a predetermined distance. The bandgap energies $E_{gp}$ and $E_{gn}$ of the p- and n-regions do not have to be the same, where in this example the bandgap of the n-region is larger than that of the p-region. Heterojunction conduction band offset $\Delta E_c$ and valence band offset $\Delta E_v$ provide energy barriers for controlling carrier flow/confinement. The p-i-n-structure forms a diode, and the built-in electric field applies an electric field along the direction Z across the i-region, as shown. The heterojunction structure is useful for light emitting devices, as light generated from the center region will not absorbed by the p- and n-regions and therefore will escape. The semiconductor structure in FIG. 145A can advantageously be used as a light emitting device (e.g., an LED) because the wider bandgap n- and p-regions have low absorption coefficients of light emitted from the narrower bandgap i-layer.

FIG. 145B is a simplified band structure diagram 14520 representing a double heterojunction device, such as a quantum well, comprising epitaxial oxide layers. The structure is sequentially formed along a growth direction Z, using spatial control of the composition. The structure comprises a wide bandgap $E_{g1}$ layer composition and a narrow bandgap region/layer $E_{g2}$, such that $E_{g2}<E_{g1}$. The narrow bandgap region is between two wide bandgap regions. For sufficiently thin narrow bandgap region, quantization occurs for the allowed energy levels within the quantum well. In various examples, this can be used for optoelectronic and electronic devices.

FIG. 145C shows a simplified band structure 14540 of a multiple heterojunction device, such as a diode, with a p-i-n structure and a single quantum well QW and comprising epitaxial oxide layers. In this example, the bandgaps of the n- and p-regions ($E_{gn}$, $E_{gp}$ respectively) are greater than that of the barriers (bandgap $E_{gi,B}$) and quantum well ($E_{gi,W}$) of the QW region, where $E_{gi,B}>E_{gi,W}$. Electrons and holes are injected into the intrinsic region from their respective reservoir regions. Heterojunction conduction band offset $\Delta E_c$ and valence band offset $\Delta E_v$ provide energy barriers for controlling carrier flow/confinement. The heterojunction structure is useful for light emitting devices, as light generated from the center region will not absorbed by the p- and n-regions and therefore will escape; that is, the wider bandgap n- and p-regions have low absorption coefficients of light emitted from the quantum well in the narrower bandgap i-layer. The quantum well, with bandgap $E_{gi,W}$, is designed such that the thickness $L_{QW}$ can tune the quantized energy levels in the conduction and valence bands confined between the barriers, with bandgaps $E_{gi,B}$. In other embodiments, the structure can have more than one, or multiple quantum wells in the intrinsic region. The energy levels in the multiple quantum well structure influence various properties of the structure, such as the minimum effective bandgap. In some cases, such as in light emitting devices, having more than one quantum well improves optical emission, such as due to increased quantum well capture rates of carriers injected into the i-region from the p- and n-regions.

FIG. 146 shows a band structure diagram 14600 for a metal-insulator-semiconductor (MIS) structure comprising epitaxial oxide layers. The semiconductor region has a bandgap $E_{g1}$, and the insulator region has a bandgap $E_{g2}$. In embodiments, an epitaxial oxide layer as disclosed herein may be used as either the insulator or semiconductor.

FIG. 147A shows a simplified band structure 14700 of another example p-i-n structure with a superlattice (SL) in the i-region. The p-i-n structure has multiple quantum wells, where the barrier layers of the multiple quantum well structure in the i-region have larger bandgaps than the bandgap of the n- and p-layers. In other cases, the bandgaps of the barrier layers in the multiple quantum wells can be narrower than those of the n- and p-layers. FIG. 147B shows a single quantum well of the multiple quantum well structure in 147A. The thickness $L_{QB}$ of the barrier layers can be made thin enough that electrons and holes can tunnel through them (e.g., within the i-region, and/or when being transferred between the n- and/or p-layers into and/or out of the i-region). Such a multiple quantum well structure can behave as a digital alloy, whose properties are dependent on the materials comprising the barriers and the wells, and with the thicknesses of the barriers and the wells.

FIG. 148 shows a simplified band structure 14800 of another example p-i-n structure, with a superlattice in the p-, i-, and n-regions. For this full superlattice structure of p(SL)-i(SL)-n(SL), the p-, i-, and n-regions may be the same or different compositions. The n-region comprises $N_n^{SL}$ pairs of wells (thickness $L_1$ and bandgap $E_{gW1}$) and barriers (thickness $L_2$ and bandgap $E_{gB1}$). The i-region comprises $N_i^{SL}$ pairs of wells (thickness $L_3$ and bandgap $E_{gW2}$) and barriers (thickness $L_4$ and bandgap $E_{gB2}$). The p-region comprises $N_p^{SL}$ pairs of wells (thickness $L_5$ and bandgap $E_{gW3}$) and barriers (thickness $L_6$ and bandgap $E_{gB3}$). The bandgaps of the barriers and wells in the i-region are narrower than those of the barriers and wells in both the n- and p-layers in this example. In other cases of structures with multiple quantum wells, the bandgaps of the barrier layers can be wider than those of the n- and p-layers. Additionally, in some cases, the thicknesses and/or bandgaps of the barriers and/or wells in the n-, i- and/or p-region can change throughout an individual region (e.g., to form a graded structure, or a chirp layer). The thicknesses $L_2$, $L_4$, and/or $L_6$ of the barrier layers can be made thin enough that electrons and holes can tunnel through them (e.g., within the i-region, and/or when being transferred between the n- and/or p-layers into and/or out of the i-region).

Each region in the structure shown in FIG. 148 can behave as a digital alloy, whose properties are dependent on the materials comprising the barriers and the wells, and with the thicknesses of the barriers and the wells. For example, the materials and layer thicknesses can be chosen such that the n- and p-regions have wider bandgaps and are therefore transparent (or have a low absorption coefficient) to the wavelength of light emitted from the i-region superlattice. Any of the compatible materials sets described herein can be incorporated into in such structures.

FIG. 149 shows a simplified band structure 14900 of another example p-i-n structure, similar to the structure in FIG. 148. The bandgap and the thicknesses of the barriers and well in the n-, i- and p-regions are defined the same as in FIG. 148. The superlattices in the n-, and p-regions in this example have the same alternating pairs of materials with different well (or well and barrier) thicknesses in the i-region tuning the optical properties. The structure shown in this figure has a material A and a material B, where the barriers of the superlattice in the n-region comprise material A and the wells in the superlattice in the n-region comprise material B. In this example, the barriers of the i- and p-regions also comprise material A and the wells in the i- and p-regions also comprise material B. The wells in the i-region have been made thicker so that the quantized energy levels in the potential well are lower in energy with respect to the band edge of the host well, thereby making the effective bandgap of the superlattice in the i-region have a narrower bandgap (i.e., closer to that of material A in a bulk form) than that of the superlattices in the n- and p-region. Such a structure could therefore be used in a light emitting device (e.g., and LED), as described herein.

FIG. 150A shows an example of a semiconductor structure 15000 comprising epitaxial oxide layers 3010, 3020, and 3030. The three epitaxial oxide layers 3010, 3020, and 3030 are formed on a buffer layer ("Buffer"), which is formed on a substrate ("SUB"). A contact region ("Contact region #1") (e.g., a metal) is also shown contacting the topmost epitaxial oxide layer in the semiconductor structure. The epitaxial oxide layers 3010, 3020, and 3030 can be many different combinations of compatible sets of materials described herein. For example, the bandgap of layer 3020 can be narrower than that of layers 3010 and/or 3030. The layers 3010, 3020, and 3030 can also be superlattices or graded multilayer structures, in some embodiments.

FIG. 150A includes an active region comprising the layers 3010, 3020, and 3030. In some cases, the active region can comprise more than three layers. The layers 3010, 3020, and 3030 of the active region can be doped and/or not intentionally doped to form p-i-n, n-i-n, p-n-p, n-p-n, and other doping profiles. The compositions of the layers x1, x2 and x3 can be chosen depending on the substrate and buffer layer upon which they are formed, for example, according to the selection criteria for compatible combinations of epitaxial oxide layers and substrates described herein.

In some embodiments, the structure 15000 shown in FIG. 150A is incorporated into an optoelectronic device that emits or detects light. For example, the structure shown in FIG. 150A can be an LED or laser or photodetector configured to emit or detect UV light. For example, layer 3020 can emit light, and the substrate can be opaque to the emitted light. In such devices, the light can primarily be emitted (or detected) through the top of the device or an edge of the device, and the layer 3030 above the emission layer 3020 can have a higher bandgap and not strongly absorb the emitted light (or light to be detected). In another example layer 3020 can emit light, and the substrate and buffer layer are transparent to (or absorb a fraction of) the emitted light. In such devices, the light can primarily be emitted (or detected) through the top of the device or an edge of the device, and the layer 3030 above the emission layer 3020 can have higher bandgaps and not strongly absorb the emitted light (or light to be detected).

In some cases, one or more of the layers 3010, 3020 and/or 3030 in the structure shown in FIG. 150A can include a superlattice or graded layer or multilayer structure, as described herein, comprising different compositions epitaxial oxide materials.

The substrate of the structure shown in FIG. 150A can be any single crystal material that is compatible with the layers 3010, 3020 and/or 3030.

In some cases, the buffer layer of the structure shown in FIG. 150A can be a material compatible with the substrate and the layers 3010, 3020 and/or 3030.

In some cases, the buffer layer of the structure 15000 shown in FIG. 150A can include a graded layer or multilayer structure, as described herein. In some cases, the buffer layer can be a lattice constant matching layer that couples the active region to the substrate. For example, the buffer can include a graded or chirp layer comprising different compositions of epitaxial oxide materials. For example, the buffer layer can include a superlattice or a chirp layer (with a graded multilayer structure), comprising alternating layers of different epitaxial oxide materials. The in-plane (approximately perpendicular to the growth direction) lattice constant of the graded or chirp layer adjacent to the substrate can be approximately equal to (or within 1%, 2%, 3%, 5%, or 10% of) the in-plane lattice constant at a surface of the substrate. The final in-plane (approximately perpendicular to the growth direction) lattice constant of the graded or chirp layer can be approximately equal to (or within 1%, 2%, 3%, 5%, or 10% of) the in-plane lattice constant of layer 3010.

FIG. 150B shows a modified structure 15010 compared to the structure 1500 from FIG. 150A where the layers are etched such that contact can be made to any layer of the semiconductor structure using "Contact region #2," "Contact region #3," and "Contact region #4." The metals for the contact regions can be chosen to be high work function metals or low work functions metals for contacting to different conductivity type (n- type or p-type) epitaxial oxide materials, as described herein. The contact regions can all be patterned to achieve desired electrical resistances and to allow light to enter and/or escape from the semiconductor structures, in some cases.

FIG. 150C shows a modified structure 15020 compared to structure 15010 from FIG. 150B having an additional "Contact region #5," which makes contact to the back side (opposite the epitaxial oxide layers) of the substrate ("SUB"). Such a contact region can be used when the substrate has a sufficient electrical conductivity. The metals for the contact region to the backside of the substrate ("SUB") can be chosen to be high work function metals or low work functions metals for contacting to different conductivity type epitaxial oxide materials, as described herein.

FIG. 151 shows a multilayer structure 15100 used to form an electronic device having distinct regions comprising at least one layer of $Mg_aGe_bO_c$, such as $Mg_2GeO_4$. A substrate "SUB" has epitaxial layers $Epi_n$ (e.g., films or regions) deposited along a growth direction Z. The layers $Epi_n$ comprising the device are selected from at least one $Mg_aGe_bO_c$ form and may be integrated with, for example, compositions of the type selected from (see FIG. 152): $Zn_xGe_yO_z$, $Zn_xGa_yO_z$, $Al_xGe_yO_z$, $Al_xZn_yO_z$, $Al_xMg_yO_z$, $Mg_xGa_yO_z$, $Mg_xZn_yO_z$, and $Ga_xO_z$, where x, y, z represent relative mole fractions.

FIG. 152 is a figurative diagram showing example compositions that may be combined with $Mg_aGe_bO_c$ to form a heterostructure. The combination is schematically drawn, illustrating $Mg_aGe_bO_c$ plus a heterostructure material where in this example the heterostructure material compositions comprise $Mg_xGe_yO_z$, $Zn_xGe_yO_z$, $Zn_xGa_yO_z$, $Al_xGe_yO_z$, $Al_xZn_yO_z$, $Al_xMg_yO_z$, $Mg_xGa_yO_z$, $Mg_xZn_yO_z$ and $Ga_xO_z$.

FIG. 153 is a plot 15300 of minimum energy gap (eV) versus lattice constant (c, in Angstroms) for $Mg_2GeO_4$ and other materials that may be used in heterostructures for semiconductor structures of the present disclosure. The plot may be used to determine compatible crystal structure lattice matching for materials combinations. Embodiments include semiconductor structures and devices (and methods for making the structures and devices) in which an epitaxial layer of $Mg_xGe_{1-x}O_2$, is on a substrate, with x having a value of $0 \leq x < 1$, and a second epitaxial layer forms a heterostructure with the epitaxial layer of $Mg_xGe_{1-x}O_{2-x}$. The second epitaxial layer may comprise $Zn_xGe_yO_z$, $Zn_xGa_yO_z$, $Al_xGe_yO_z$, $Al_xZn_yO_z$, $Al_xMg_yO_z$, $Mg_xGa_yO_z$, $Mg_xZn_yO_z$, or $Ga_xO_z$, where x, y and z are mole fractions.

FIG. 154 shows an in-plane conduction device comprising in this example an insulating substrate and a semiconductor layer region formed on the substrate, with electrical contacts positioned on the top semiconductor layer of the device. In this example, a first electrical contact or electrode (Contact1) is located on the top surface of semiconductor layer, and a second electrical contact (Contact2) is spaced laterally from first electrical contact and embedded into the semiconductor layer to cause in-plane current flow, as indicated by the large arrow.

FIG. 155 shows a vertical conduction device comprising in this example a conducting substrate and a semiconductor layer region formed on the substrate, with the electrical contacts positioned on the top and bottom of the device. In this example, a first electrical contact (Contact1) of the electrical contacts is located on the top of the semiconductor layer region (either embedded in or on the top surface). A second electrical contact (Contact2) is located on the underside of the substrate, vertically spaced from first electrical contact to cause vertical current flow as indicated by the large arrow.

FIG. 156A shows a figurative sectional view of a vertical conduction device for light emission (e.g., a light emitting diode) having the electrical contact configuration illustrated in FIG. 155 configured as a plane parallel waveguide for the emitted light. The device comprises a substrate, a first semiconductor layer (Semi1) having a first conductivity type, a second semiconductor layer having a second conductivity type (Semi2), and a third semiconductor layer having a second conductivity type (Semi3). For example, the first, second and third conductivity types may be, n-, i-, and p- as described throughout in this disclosure. A first electrical contact (Contact1) is on a top surface of the device, and a second electrical contact (Contact2) is on the bottom surface. Electrons and holes are injected into the central semiconductor layer, with light being emitted in a plane parallel to the plane of the layers (i.e., perpendicular to the growth direction).

FIG. 156B shows a figurative sectional view of a vertical conduction device for light emission (e.g., a light emitting diode) having the electrical contact configuration illustrated in FIG. 155, configured as a vertical light emission device. The device comprises a substrate, a first semiconductor layer (Semi1) having a first conductivity type, a second semiconductor layer having a second conductivity type (Semi2), and a third semiconductor layer having a second conductivity type (Semi3). For example, the first, second and third conductivity types may be, n-, i-, and p- as described throughout in this disclosure. A first electrical contact (Contact1) is on a top surface of the device, and a second electrical contact (Contact2) is on the bottom surface. Electrons and holes are injected into the central semiconductor layer. The substrate and other layers of the device can be designed to be transparent to the wavelength of light being emitted, such that light is emitted through one or both of the top and/or bottom surfaces of the device. As can be seen, the first and second electrical contacts are disposed on their respective surfaces to allow the passage of light.

FIG. 157A shows a figurative sectional view of an in-plane conduction device for photo-detection (e.g., a photodetector) having the electrical contact configuration illustrated in FIG. 154, and configured to receive light passing through the semiconductor layer region and/or the substrate. The device includes a substrate and a semiconductor layer region formed on the substrate, with electrical contacts positioned on the top semiconductor layer of the device. In this example, a first electrical contact or electrode (Contact1) is located on the top surface of semiconductor layer, and a second electrical contact (Contact2) is spaced laterally from first electrical contact and embedded into the semiconductor layer. The substrate material is transparent to the wavelength of interest. Light received by the device causes a current to be generated, where the current may be measured at the first and second electrical contacts.

FIG. 157B shows a figurative sectional view of an in-plane conduction device for light emission (e.g., a light emitting diode), having the electrical contact configuration illustrated in FIG. 154, and configured to emit light either vertically or in-plane. The device includes a substrate and a semiconductor layer region formed on the substrate, with electrical contacts positioned on the top semiconductor layer of the device. In this example, a first electrical contact or electrode (Contact1) is located on the top surface of semiconductor layer, and a second electrical contact (Contact2) is spaced laterally from first electrical contact and embedded into the semiconductor layer. In embodiments where the light is emitted vertically, the substrate material is transparent to the wavelength being generated.

FIG. 158A is a semiconductor structure that can be used as a portion of a light emitting device. The semiconductor structure in FIG. 158A is a p-down p-i-n structure with LiF substrate, and a p-type $Li:Mg(Al_xGa_{1-x})_2O_4$ (i.e., Li doped $Mg(Al_xGa_{1-x})_2O_4$) or a superlattice (SL) of $[NiAl_2O_4/MgO]$ layer formed on the substrate. The intrinsic (or not intentionally doped) layer comprises multiple quantum wells (MQW) or a superlattice (SL) of $[GeMg_2O_4/MgO]$ or $[GeMg_2O_4/MgGa_2O_4]$. The n-type layer comprises (Si, Ge): $SL[MgGa_2O_4/MgO]$ (i.e., a Si and/or Ge doped superlattice of [$MgGa_2O_4$/MgO]) or (Si, Ge):Mg $(Al_xGa_{1-x})_2O_4$. FIG. 158B is a figurative sectional view of a light emitting device (e.g., an LED emitting a wavelength λ) that can be formed using the semiconductor structure of FIG. 158A, including low work function (LWF) and high work function (HWF) metal contacts.

FIG. 159A is a semiconductor structure that can be used as a portion of a light emitting device. The semiconductor structure in FIG. 159A is an n-down p-i-n structure with an MgO or $MgAl_2O_4$ substrate. The n-type layer comprises (Si, Ge):S [$MgGa_2O_4$/MgO] or (Si, Ge):Mg $(Al_xGa_{1-x})_2O_4$. The intrinsic (or not intentionally doped) layer comprises multiple quantum wells or a superlattice of [$GeMg_2O_4$/MgO] or [$GeMg_2O_4$/$MgGa_2O_4$]. And the p-type layer comprises Li:Mg $(Al_xGa_{1-x})_2O_4$ or SL[$NiAl_2O_4$/MgO]. FIG. 159B is a figurative sectional view of a light emitting device (e.g., an LED emitting a wavelength λ) that can be formed using the semiconductor structure of FIG. 159A, including low work function (LWF) and high work function (HWF) metal contacts.

FIG. 160 shows a figurative sectional view of an in-plane surface MSM conduction device comprising a substrate and a semiconductor layer region comprising multiple semiconductor layers (Semi1, Semi2, Semi3). The top layer of metal comprises a pair of planar interdigitated electrical contacts (Contact1, Contact2), spaced apart by a distance "a." The width of the repeating portion of the device is shown as $\Lambda_{cell}$. In this example, the in-plane MSM conduction device comprises an optional third electrical contact (Contact3) located on the bottom surface of the substrate. For the case of a conductive substrate, Contact3 can act as a vertical conduction collector or drain. For an insulating substrate, Contact3 may act as a back gate of a field effect device.

FIG. 161A shows a top view of an in-plane dual metal MSM conduction device comprising a first electrical contact (Contact1) formed of a first metallic substance interdigitated with a second electrical contact (Contact2) formed of a second metallic substance. As can be seen in the enlarged view of a portion of the interdigitated contacts, the first electrical contact has a finger width of $w_1$, and second electrical contact has a finger width of $w_2$ with a spacing of g between the contacts. The lateral gap, g, between the respective electrodes governs the in-plane electric field strength. Contact1 and Contact2 may be formed from dissimilar metals, for example a high- and low-work function metal may be used. In other embodiments, the metal-Semi1 heterointerface may form a Schottky barrier.

FIG. 161B shows a figurative sectional view of the in-plane dual metal MSM conduction device illustrated FIG. 161A formed of a substrate and a semiconductor layer region epitaxially formed on the substrate, showing the electrical contact unit cell arrangement.

FIG. 162 shows a figurative sectional view of a multilayered semiconductor device having a first electrical contact (Contact1) formed on a mesa surface and a second electrical contact (Contact2) spaced both horizontally and vertically from the first electrical contact. The device includes a substrate and semiconductor layers (Semi1, Semi2, Semi3, Semi4). In this illustrative embodiment, the first electrical contact is formed on an initial top surface of the semiconductor layer region which is etched to expose a sublayer for locating the second electrical contact. In this example, the multilayered semiconductor device further comprises a third electrical contact (Contact3) located on the underside of substrate. The 3-Terminal device comprising Contact1, Contact2 and Contact3 may act as a vertical heterojunction bipolar transistor or a vertical conduction FET switch.

FIG. 163 shows a figurative sectional view of an in-plane MSM conduction device comprising multiple unit cells $\Lambda_{cell}$ of the mesa structured device illustrated in FIG. 162. The unit cells $\Lambda_{cell}$ are disposed adjacent to each other in a lateral direction. The cells may form elongated fingers in the plane of the figure.

FIG. 164 shows a figurative sectional view of a multi-electrical terminal device having multiple semiconductor layers (Semi1, Semi2, Semi3, Semi4). The device has a first electrical contact (Contact1) formed on a first mesa structure (Mesa1). A second electrical contact (Contact2) is spaced both horizontally and vertically from the first electrical contact and is formed on second mesa structure (Mesa2). A third electrical contact (Contact3) is spaced both horizontally and vertically from the second electrical contact. In this illustrative embodiment, the first electrical contact is formed on an initial top surface of the semiconductor layer region (Semi4) which is etched to expose a first sublayer (Semi3) for locating the second electrical contact. The first sublayer is further etched to expose another second sublayer (Semi2) for locating the third electrical contact. In this example, multi-electrical terminal device further comprises a fourth electrical contact (Contact4) located on the underside of substrate. For an electrically insulating substrate, the fourth electrical contact is optional.

FIG. 165A shows a figurative sectional view of a planar field effect transistor (FET) comprising source (S), gate (G) and drain (D) electrical contacts. The source and drain electrical contacts are formed on a semiconductor layer region (Semi1) that is formed on an insulating substrate. The gate electrical contact is formed on a gate layer formed on the semiconductor layer region. The epitaxial oxide material layer may be used in two different ways. One function of the epitaxial oxide layer is to be the active conduction channel region Semi1 with a wider bandgap material used to form the Gate layer. For example, the Gate layer may be itself epitaxially formed on Semi1 (e.g., cubic gamma-$Al_2O_3$, MgO or $MgAl_2O_4$), or may be substantially amorphous (e.g., amorphous $Al_2O_3$). The composition of the epitaxial oxide material may alternatively be used as the Gate layer, wherein for example, the active channel Semi1 is a smaller bandgap material. The metals forming S and D contacts are ideally ohmic and the gate metal can be selected to control the threshold voltage of the FET.

FIG. 165B shows a top view of the planar FET illustrated in FIG. 165A, depicting the distance D1 between the source to gate electrical contacts and the distance D2 between the drain to gate electrical contacts. Section B-B indicates the cross-section according to FIG. 165A. Distance D2>D1 can be utilized to control the breakdown voltage along the channel Semi1 between the G and D regions.

FIG. 166A shows a figurative sectional view of a planar FET of a similar configuration to that illustrated in FIGS. 165A and 165B. In FIG. 166A, the source electrical contact (S) is implanted (Implant1) through the semiconductor layer region (Semi1) into the substrate, and the drain electrical contact is implanted (Implant2) into the semiconductor layer region only. The use of selective area ion-implantation to spatially alter the electrical conductivity of specific regions, such as the S and D regions, is advantageous to provide improved lateral contact to the channel layer Semi1. It is expected that selection of ion implant species such as Ga, Al, Li and Ge may be used to impart p-type and n-type conductivity regions. Implantation of O may also be used to create locally insulating compositions. An alternative to the ion implantation method is the use of a diffusion process wherein a material can be spatially formed on the surface of Semi1 and then driven into the interior of Semi1 via a thermally activated diffusion process. For example, a Li-based glass can be deposited, and Li driven into the Semi1 via an annealing process in an inert environment. This process of rapid thermal annealing is possible.

FIG. 166B shows a top view of the planar FET illustrated in FIG. 166A. Section B-B indicates the cross-section according to FIG. 166A.

FIG. 167 shows a top view of a planar FET comprising multiple interconnected unit cells of the planar FET illustrated in FIGS. 165A or 166A. The repeating unit cell $\Lambda_{cell}$ is shown, with this embodiment illustrating a 3-terminal device.

FIG. 168 shows a process flow diagram for forming a conduction device comprising a regrown conformal semiconductor layer region on an exposed etched mesa sidewall. Initially, a semiconductor device is formed having a substrate (SUB) and an epitaxially formed semiconductor layer region (EPI). This semiconductor layer region is then etched to leave a remaining mesa structured semiconductor layer region. An additional conformal semiconductor layer region (Semi2) is then grown on the mesa structure which may then be optionally planarized in a subsequent planarization step. For example, the conformal coating Semi1 can be another oxide deposited via atomic layer deposition. Semi2 can be used as a passivation region or may be used as an active region forming a FET.

FIGS. 169A and 169B show a chart showing center frequencies of RF operating bands that can be used in different applications and a schematic of an RF-switch. An RF switch can be used to route high-frequency signals through transmission paths, for example in wireless communication systems (e.g., using 5G and 6G standards for broadband cellular networks). The schematic in FIG. 169B shows that an RF switch ("Tx/Rx switch") is coupled between an antenna and RF-filters. The RF switch ("Tx/Rx switch") can be opened and closed as shown to allow signals to be received and/or transmitted by the antenna. A low noise amplifier ("LNA") can be used to amplify a low-power signal received by the antenna to produce a received amplified signal ("$RF_{in}$"), and an amplifier ("Gain") can be used to amplify a signal ("$RF_{out}$") to be transmitted by the antenna. The RF switch ("Tx/Rx switch") can comprise one or more field-effect transistors (FETs), and the opening and closing of the switches can be controlled by gate signals to FETs. A transceiver module comprising the RF switch ("Tx/Rx switch") can withstand high voltages (e.g., more than 50 V, or more than 100 V), in some cases, and therefore the breakdown voltage of the RF switch ("Tx/Rx switch") is also high (e.g., more than 50 V, or more than 100 V), in some cases.

FIG. 170A shows a schematic and an equivalent circuit diagram of a FET, with source ("S"), drain ("D"), and gate ("G") terminals. "$R_{on}$" is the channel resistance when the FET is in the on state, and "$C_{off}$" is the capacitance between the source and drain terminals when the FET is in the off state.

FIGS. 170B-170D show schematics and an equivalent circuit diagram of an RF switch employing multiple FETs in series to achieve high breakdown voltage. For example, a Si-based FET has a breakdown voltage less than 10 V, and more than ten Si-based FETs connected in series are required to form an RF switch with a breakdown voltage greater than 100 V. When multiple FETs are connected in series, the channel resistance "$R_{on}$" and capacitance "$C_{off}$" are increased and limit the performance (e.g., the maximum operating frequency) of the RF switch. The dotted elements indicate that there may be more than 4 FETs connected in series, such as more than 10, or more than 20, or, in other cases there can be from 2 to 100 FETs connected in series.

FIG. 171 shows a chart of calculated specific ON resistances of an RF switch and the calculated breakdown voltage associated with different semiconductors comprising the RF switch. The breakdown voltage increases with the bandgap of the semiconductor used in the FETs making up the RF switch. Therefore, RF switches with high breakdown voltages comprising a high bandgap material such as α- and $\beta$-$Ga_2O_3$ can achieve lower specific ON resistances than those with a low bandgap material such as Si. For example, an RF switch comprising an epitaxial oxide material (e.g., α- and $\beta$-$Ga_2O_3$) can achieve a breakdown voltage from 100 V to 10,000 V at specific ON resistances from about 10-4 to 1 $m\Omega\text{-}cm^2$.

The chart shown in FIG. 171 assumes a constant cross-section area of the FETs made from different materials. FIG. 172A shows a schematic of multiple (e.g., more than 10) Si-based FETs connected in series to achieve a high breakdown voltage (e.g., greater than 100 V). FIG. 172B shows a schematic of a single $Ga_2O_3$-based FET that can achieve a high breakdown voltage (e.g., greater than 100 V). FIGS. 172A and 172B illustrate that the planar gate area ($A_{oxide}$) of the single $Ga_2O_3$-based FET is smaller than the effective planar gate area ("$A_{Si}$") of the RF switch comprising multiple Si-based FETs. RF switches with high breakdown voltages comprising a high bandgap epitaxial oxide material (e.g., α- and $\beta$-$Ga_2O_3$) can have smaller planar gate areas than those with a low bandgap material such as Si, which can advantageously reduce the size of the RF switch package and/or reduce power consumption requirements. Such small devices can be advantageously used in applications, such as mobile device communications.

FIG. 173 shows a chart of calculated OFF-state FET capacitance (in F) versus calculated specific ON resistance ($R_{ON}$) for Si (a low bandgap material) and an epitaxial oxide material with a high bandgap. The chart shows that for a particular OFF-state FET capacitance (which is mainly determined by the planar gate area) the specific ON resistance is about 3 orders of magnitude lower for the epitaxial oxide FET than for the Si-based FET. The switching time is inversely proportional to the product of the specific ON resistance and the OFF-state FET capacitance, and therefore the chart shows that the switching time for the epitaxial oxide FET is 3 orders of magnitude faster (shorter) than that of the Si-based FET. A figure of merit that is inversely proportional to the switching time for the epitaxial oxide ($FOM^{oxide}$) and Si-based ($FOM^{Si}$) RF switches are related by the expression, $FOM^{Oxide}=R_{ON}^{Oxide}\times C_{OFF}^{G}<FOM^{Si}=R_{ON}^{Si}\times C_{OFF}^{G}$.

FIG. 174 shows a chart of fully depleted thickness ($t_{FD}$) of a channel in an FET comprising α-$Ga_2O_3$ versus the doping density ($N^D_{CH}$) of the α-$Ga_2O_3$ in the channel. A FET comprising an epitaxial oxide material, such as α-$Ga_2O_3$, can have a fully depleted channel, which can reduce the power consumption compared to FETs without fully depleted channels. The chart shows that $t_{FD}$ decreases as the doping density in the channel increases. The schematics show that if the depletion width is shorter than the thickness of the channel ($t_{CH}$) then the channel will be partially depleted $t_{PD}$. For example, at an $N^D_{CH}$ of $10^{17}$ $cm^{-3}$ the thickness of the channel ($t_{CH}$) needs to be below about 4.5 nm for the channel to be fully depleted, and at an $N^D_{CH}$ of $10^{19}$ $cm^{-3}$ the thickness of the channel ($t_{CH}$) needs to be below about 2.5 nm for the channel to be fully depleted.

FIG. 175 shows a schematic of an example of a FET 3101 comprising epitaxial oxide materials. A channel layer 3120 comprising an epitaxial oxide material is formed on a compatible substrate 3110, and a gate layer 3130 comprising an epitaxial oxide material is formed on the channel layer 3120. For example, the channel layer 3120 can be α-$(Al_xGa_{1-x})_2O_3$ which can be formed on a sapphire substrate 3110 (oriented in the A-, M- or R-plane), and the gate layer 3130 can be α-$Al_2O_3$. Examples of experimentally grown α-$(Al_xGa_{1-x})_2O_3$ layers on sapphire substrates are described herein. Sapphire is a good substrate for RF switches because it is a low loss RF material. FET 3101 optionally includes a buffer layer, not shown, between the substrate and the channel layer 3120. The channel layer 3120 and gate layer 3130 can be formed by any epitaxial growth technique, such as MBE or CVD. A fabrication process can include patterning a gate contact 3145, etching the channel layer 3120 and gate layer 3130 into a mesa, and forming source and drain contacts 3140 to the channel layer 3120. In some cases, gate contact 3145 can include an epitaxial oxide layer that is doped n- or p-type to form a low resistance contact to a metal electrode. The source and drain contacts 3140 can be metals or regrown epitaxial oxide with high doping (e.g., n+$Ga_2O_3$). The metal electrodes 3140 and 3145 can be high or low work function metals to make contact to the epitaxial oxide semiconductors, as described herein. The FET 3101 can also be encapsulated with an additional oxide (e.g., α-$Al_2O_3$), in some cases. The gate-drain distance ($L_{G-D}$) influences the breakdown voltage of the FET 3101. The thickness ($t_{CH}$) and doping density of the channel can be tailored to provide a fully-depleted or partially depleted channel. Gate layer 3130 thickness ($t_{GOX}$) is chosen to provide an OFF-state capacitance of the FET meeting the desired requirements.

FIGS. 176A and 176B are E-k diagrams showing calculated band structures for epitaxial oxide materials that can be used in the FETs and RF switches described herein. α-$Al_2O_3$ can be used as the gate layer or the additional oxide encapsulation. α-$Ga_2O_3$ can be used as the channel layer. α-$Ga_2O_3$ and α-$Al_2O_3$ can be doped n-type or p-type (e.g., using Li or N) in some cases, as described herein. α-$Ga_2O_3$ is an indirect bandgap material, which is suitable for a channel layer in a FET.

FIG. 177 shows a chart of calculated minimum bandgap energy (in eV) versus lattice constant (in Angstroms) for α- and κ-$(Al_xGa_{1-x})_2O_3$ materials that are compatible with sapphire (α-$Al_2O_3$) substrates. α-$(Al_xGa_{1-x})_2O_3$ layers are compatible with sapphire (α-$Al_2O_3$) substrates oriented in the A-, M- or R-plane. κ-$(Al_xGa_{1-x})_2O_3$ layers are compatible with sapphire (α-$Al_2O_3$) substrates oriented in the C-plane. The dotted line in the figure shows the change in minimum bandgap energy versus lattice constant for the α-$(Al_xGa_{1-x})_2O_3$ materials. Due to the small lattice constant mismatch, α-$(Al_xGa_{1-x})_2O_3$ layers with $x>0$ grown on sapphire substrates will be in a compressive state.

FIG. 178 shows a schematic of a portion of a FET 3201 and a chart of energy versus distance along the channel (in the "x" direction). In this example, the FET 3201 is a heterojunction n-i-n device with an α-$Ga_2O_3$ layer formed on a substrate a buffer layer, where the α-$Ga_2O_3$ layer has n+ doped α-$Ga_2O_3$ regions on either side of an α-$Ga_2O_3$ channel region with a length $L_{CH}$. The energy versus distance chart shows two cases, a short channel band diagram 3210 and a long channel band diagram 3220. The chart shows that the long channel band diagram 3220 becomes fully depleted and builds up a larger potential barrier than the short channel band diagram 3210.

FIG. 179 shows a schematic of a portion of a FET and a chart of energy versus distance along the channel (in the "z" direction) to illustrate the operation of the FET with epitaxial oxide materials. In this case, a gate layer is formed on the α-$Ga_2O_3$ channel layer, and a gate contact is formed on the gate layer. The chart shows the energy band diagrams in the "z" direction for different biases applied to the gate contact. When a zero bias is applied to the gate contact, the FET has the band diagram 3230, and when a negative bias is applied the FET has the band diagram 3240. The depletion shown in the channel layer indicates that the application of a bias to the gate contact in such a FET can control the flow of carriers through the channel, and the FET can act as a switch.

FIG. 180 shows a schematic of a portion of a FET and a chart of energy versus distance along the channel (in the "z" direction). In this case, the substrate is α-$Al_2O_3$, a superlattice ("SL") of α-$Al_2O_3$/α-$(Al_xGa_{1-x})_2O_3$ is formed on the substrate, and an α-$(Al_xGa_{1-x})_2O_3$ layer is formed on the superlattice. The superlattice can form the channel region, or the superlattice can be a buffer layer and the α-$(Al_xGa_{1-x})_2O_3$ layer on the superlattice can form the channel layer. In some cases, the superlattice can also form a buried ground plane, as described herein. Such structures have been formed experimentally, as described herein.

FIG. 181 shows a schematic of the atomic surface of α-$Al_2O_3$ oriented in the A-plane (i.e., the (110) plane). This surface is the most favorable α-$Al_2O_3$ surface for the epitaxial growth of α-$(Al_xGa_{1-x})_2O_3$ and stabilizes the α-phase, as described herein.

FIG. 182 shows a schematic of an example of a FET 3102 comprising epitaxial oxide materials and an integrated phase shifter. The FET 3102 is similar to the FET 3101 shown in FIG. 175. FET 3102 optionally includes a buffer layer, not shown, between the substrate and the channel layer 3120. The FET 3102 in this example has a split gate (i.e., there are two gate electrodes "G" and "$V_\phi$") offset spatially along the length ($L_{G-D}$) of the channel. The split gate allows for independent control of the phase of a signal routed by the switch. The low ON-state resistance of the channel enables such FETs with phase control.

FIGS. 183A and 183B show schematics of systems including one or more switches with an integrated phase shifter (e.g., containing the FET 3102 in FIG. 182). FIG. 183A shows that switches with an integrated phase shifter can be used in a phase controlled transceiver coupled to an antenna through an RF waveguide. FIG. 183B shows that multiple switches, each with an integrated phase shifter, can be coupled to a phased array antenna. The switches with integrated phase shifters would act as phased array driver modules, to produce a dynamically steered spatial RF beam transmitted from an antenna. Such a system can be useful, for example, to reduce the power required for wireless communication systems.

FIG. 184 shows a schematic of an example of a FET 3103 comprising epitaxial oxide materials and an epitaxial oxide buried ground plane 3150. The FET 3103 is similar to the FET 3101 shown in FIG. 175. The FET 3103 in this example has additional layers formed between the channel layer 3120 and the substrate 3110. A buried ground plane 3150 with thickness $t_{GP}$ is formed on the substrate (optionally including a buffer layer, not shown, between the substrate and the buried ground plane 3150) comprising an epitaxial oxide material (e.g., α-$(Al_xGa_{1-x})_2O_3$). The buried ground plane 3150 can be highly doped (e.g., doping density greater than $10^{17}$ $cm^{-3}$, or greater than $10^{18}$ $cm^{-3}$, or greater than $10^{19}$ $cm^{-3}$) to have high electrical conductivity. A buried oxide layer 3160 comprising an epitaxial oxide material (e.g., α-$Al_2O_3$) is formed on the buried ground plane 3150 with a thickness $t_{ins}$ which is thick enough to act as an effective insulating layer. Such structures with buried ground planes can be used for confining RF waves in RF planar circuits (e.g., comprising FET 3103).

FIGS. 185A and 185B are energy band diagrams along the gate stack direction ("z," as shown in the schematic in FIG. 179) of an example of a FET with a structure like that of FET 3103 in FIG. 184 where the layers are formed of α-$(Al_xGa_{1-x})_2O_3$ and α-$Al_2O_3$. The diagram in FIG. 185A shows the conduction and valence band edges, and the diagram in FIG. 185B shows the band bending in the conduction band edge. Precise control of the epitaxial layer thicknesses of each region enables a fully depleted FET channel bounded by wider bandgap α-$Al_2O_3$ "gate oxide" and "insulator" layers (e.g., layers 3130 and 3160, of FET 3103, respectively). The case in the plot in this figure shows n-type materials, but similar structures with p-type materials are also possible.

FIG. 186 shows a structure 3104 of some RF-waveguides that can be formed using buried ground planes comprising epitaxial oxide materials. The layers in structure 3104 are the same as those described in FET 3103 in FIG. 184. Structure 3104 includes two waveguides, one waveguide comprises the single-stripline signal conductor 3182 and the buried ground plane, and the other waveguide comprises a dual coplanar stripline metal signal conductor 3184 and the buried ground plane. A dielectric encapsulant 3170 is also shown in the structure 3104. Such RF-waveguides can connect portions (e.g., antennas, FETs, and amplifiers) of RF circuits to one another. The sheet resistivity of the buried ground plane (BGP) is determined by the doping density of the layer (e.g., $Ga_2O_3$) layer and the thickness $t_{BGP}$. The coplanar waveguide frequency dependence is determined by the insulator thickness $t_{ins}$.

FIG. 187 shows a schematic of an example of a FET 3105 comprising epitaxial oxide materials and an electric field shield above the gate electrode 3145. The FET 3102 is similar to the FET 3103 shown in FIG. 184. FET 3105 optionally includes a buffer layer, not shown, between the substrate and the buried ground plane 3150. The FET 3102 in this example has an electric field shield (e.g., comprising a metal) embedded in a cladding (or encapsulant). Such a structure can improve the noise immunity and reduce parasitic effects from the gate-to-drain electric field of FET 3105.

FIG. 188 shows a schematic of the epitaxial oxide and dielectric materials forming an integrated FET and coplanar (CP) waveguide structure 3106. As the majority of the layers used to construct the epitaxial oxide FET are of ultrawide bandgap materials, the dielectric constants of the regions will also be low. The lower dielectric constant epitaxial oxide materials of the structure 3106 (e.g., the buried oxide 3160, channel 3120 and substrate 3110) compared to conventional materials dramatically reduces crosstalk between planar components (e.g., between the FET and the waveguide), which leads to improved RF performance.

FIG. 189 shows a schematic of an example of a FET 3107 comprising epitaxial oxide materials and an integrated phase shifter. The FET 3102 is similar to the FET 3101 shown in FIG. 175. FET 3102 optionally includes a buffer layer, not shown, between the substrate and the channel layer 3120. The FET 3102 in this example has a different structure forming source "S" and drain "D" contacts to the channel, which includes tunnel barrier layer 3135 forming tunnel barrier junctions between the source and drain contacts and the gate layer 3130. The metal-tunnel barrier-epitaxial oxide channel then functions by direct tunneling through the thin tunnel barrier. The tunnel barrier layer 3135 can be formed by first passivating the exposed surfaces and then growing an epitaxial oxide (e.g., $Al_2O_3$), after a mesa etch to expose the S and D faces. Then, S and D metal contacts can be formed with low or high work function metals (as described herein). For example, the tunnel barrier layer 3135 can be formed using an atomic layer deposition (ALD) process. Passivating any etched surface states, such as by using a tunnel barrier layer 3135 can greatly improve the switch performance. In some cases, the tunnel barrier layer 3135 thickness can be from 1 Angstrom to 10 Angstroms.

FIGS. 190A-190C show energy band diagrams along the channel direction ("x," as shown in FIG. 178) of the S and D tunnel junctions described with respect to FET 3107 in FIG. 189. FIG. 190A has no source-to-drain (S-D) bias applied, FIG. 190B has a moderate S-D bias applied, and FIG. 190C has a high S-D bias applied. The arrows indicate that more electrons can tunnel through the tunnel barrier layers when a high bias is applied. The tunnel barriers "TB_S" and "TB_D" serve to control the tunneling current threshold voltage, which improves the low voltage leakage and is beneficial for low noise operation.

FIGS. 191A-191G are schematics of an example of a process flow to fabricate a FET comprising epitaxial oxide materials, such as the FET 3107 in FIG. 189. The other FETs described herein can be fabricated using similar processes. The example shown in FIGS. 191A-191G uses $AlGaO_x$ as an example, however, FETs comprising other epitaxial oxide materials can be formed using the same processes.

Figure 191A:
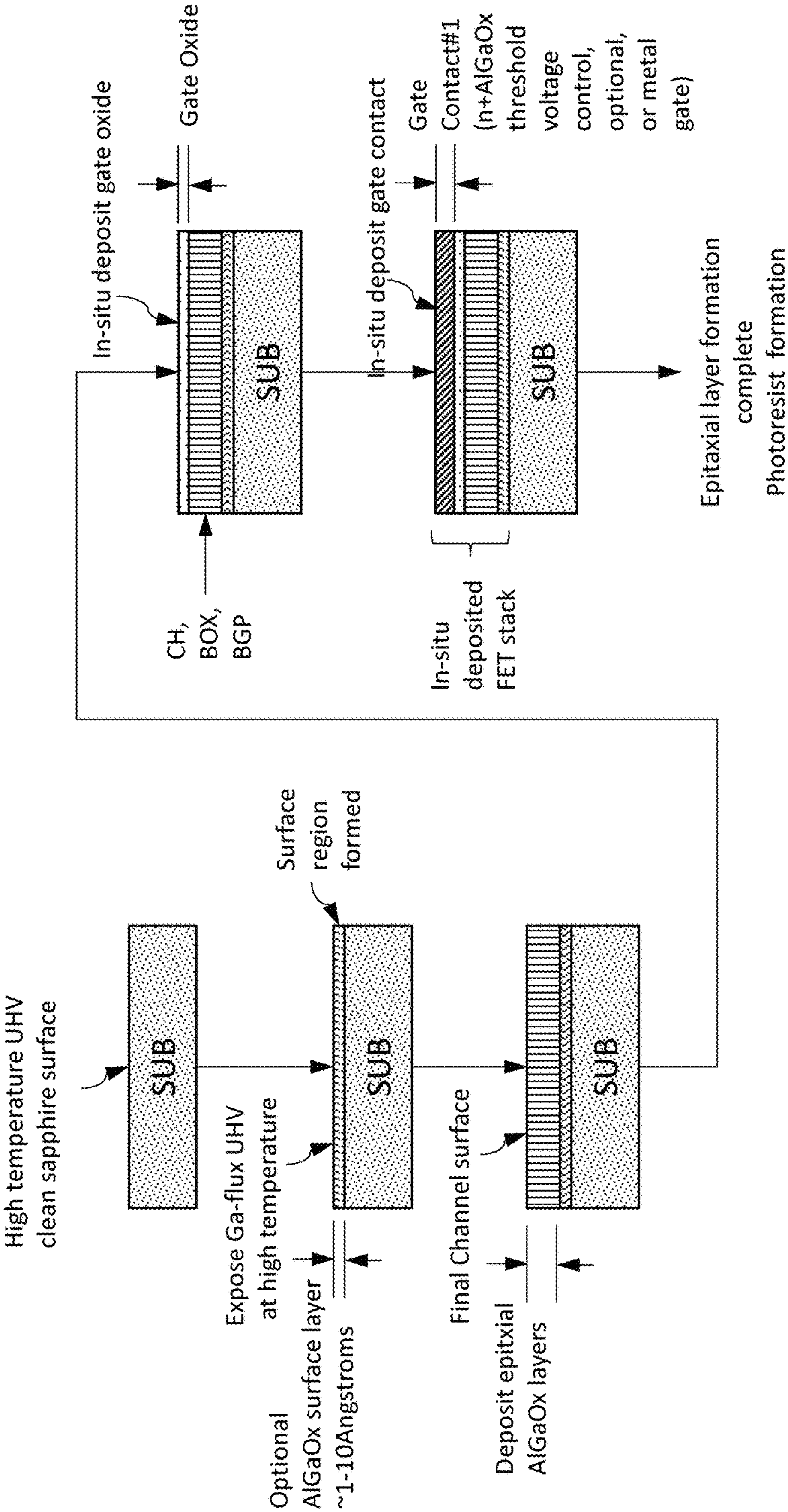

In FIG. 191A an in-situ deposited FET stack is formed. The substrate is prepared, an optional surface layer (i.e., buffer layer) is formed, and the channel, gate layer, and gate contact layer comprising epitaxial oxide materials are formed using an epitaxial growth technique such as MBE. Advantageously, the full epitaxial stack comprising the buffer, buried ground plane, buried oxide layer, channel layer and gate layer, as well as the gate contact layer, can be grown sequentially in-situ via a single epitaxial growth deposition process (e.g., MBE or CVD). This enables improved interface quality between the heterostructure regions, and improved channel mobility and reduces the concentration of trapped charges (scattering centers).

Figure 191B:
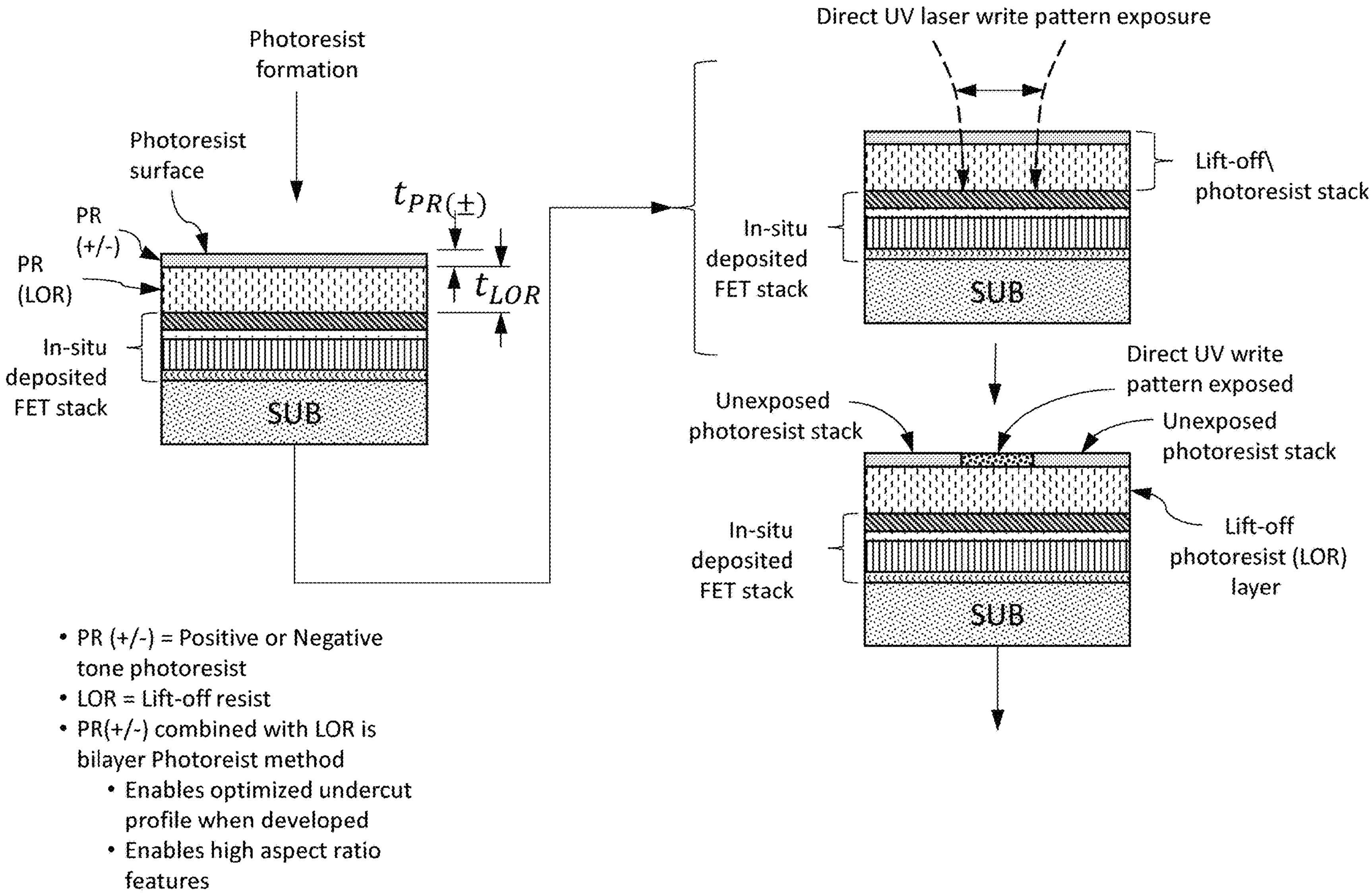

In FIG. 191B, a bilayer of photoresist is deposited and exposed. PR (+/−) indicates Positive or Negative tone photoresist; LOR indicates a Lift-off resist; and PR(+/−) combined with LOR is the bilayer. Such a bilayer photoresist method enables optimized undercut profile when developed, and high aspect ratio features.

Figure 191C:
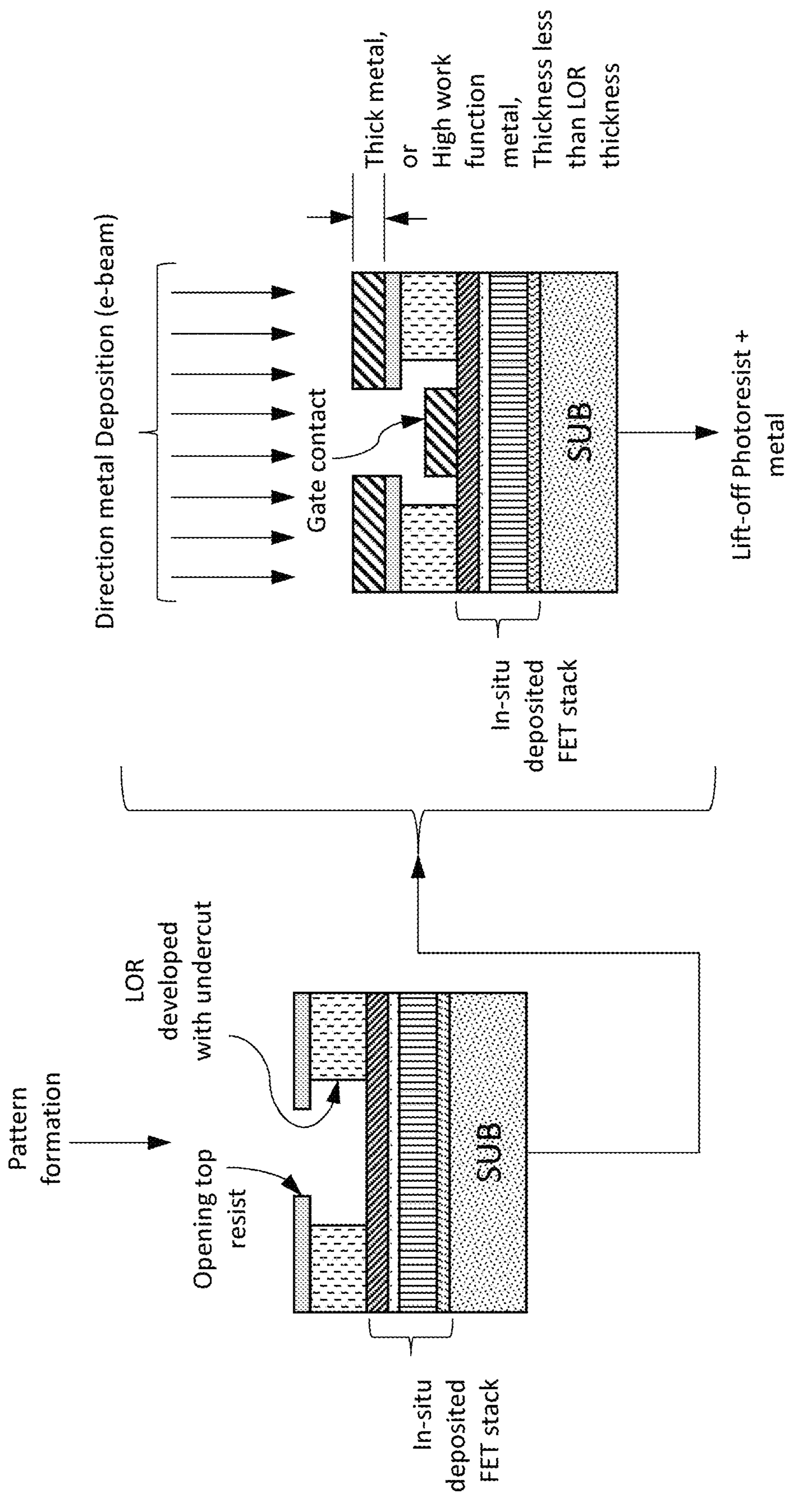

In FIG. 191C, the photoresist is patterned, and a metallic gate contact is formed (e.g., using an evaporation method such as e-beam deposition).

Figure 191D:
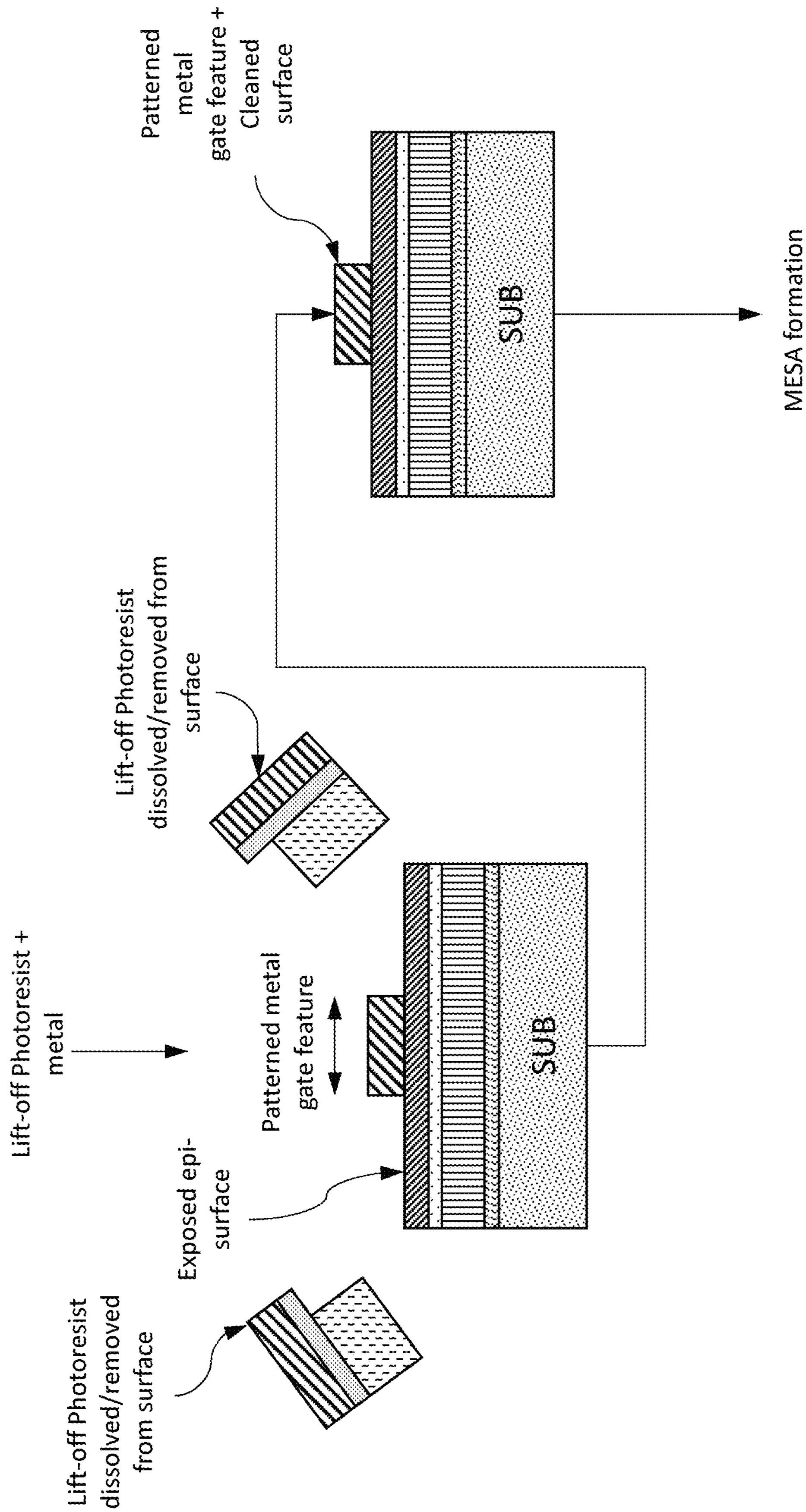

In FIG. 191D, the lift-off is performed to remove the photoresist, and the surface of the gate metal is cleaned.

Figure 191E:
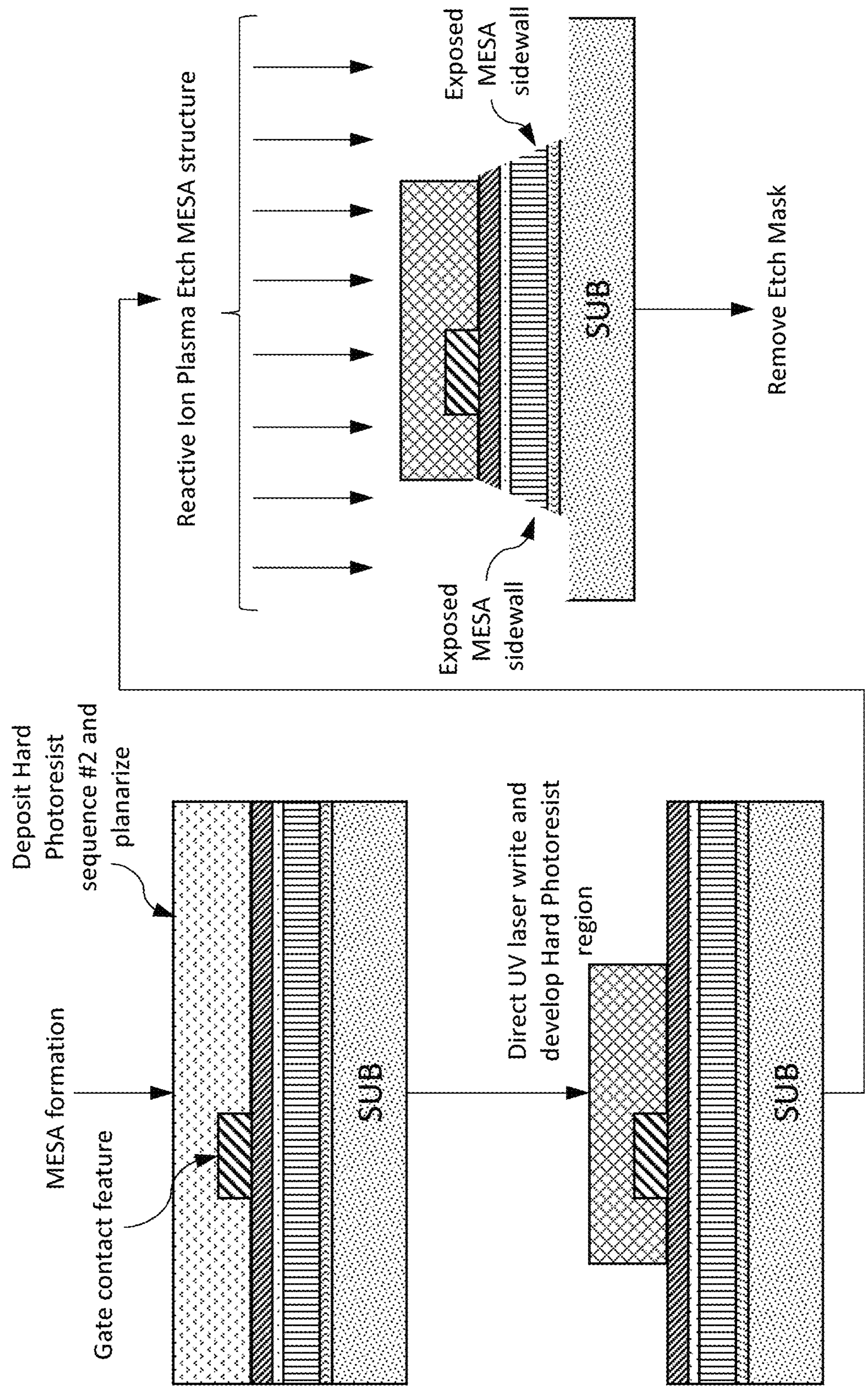

In FIG. 191E, a hard photoresist layer is formed and patterned. Then an etch (e.g., a reactive ion plasma etch) is used to form the mesa structure comprising the epitaxial stack. In the example shown, the mesa also includes a portion of the substrate. In other cases, the mesa does not include a portion of the substrate.

Figure 191F:
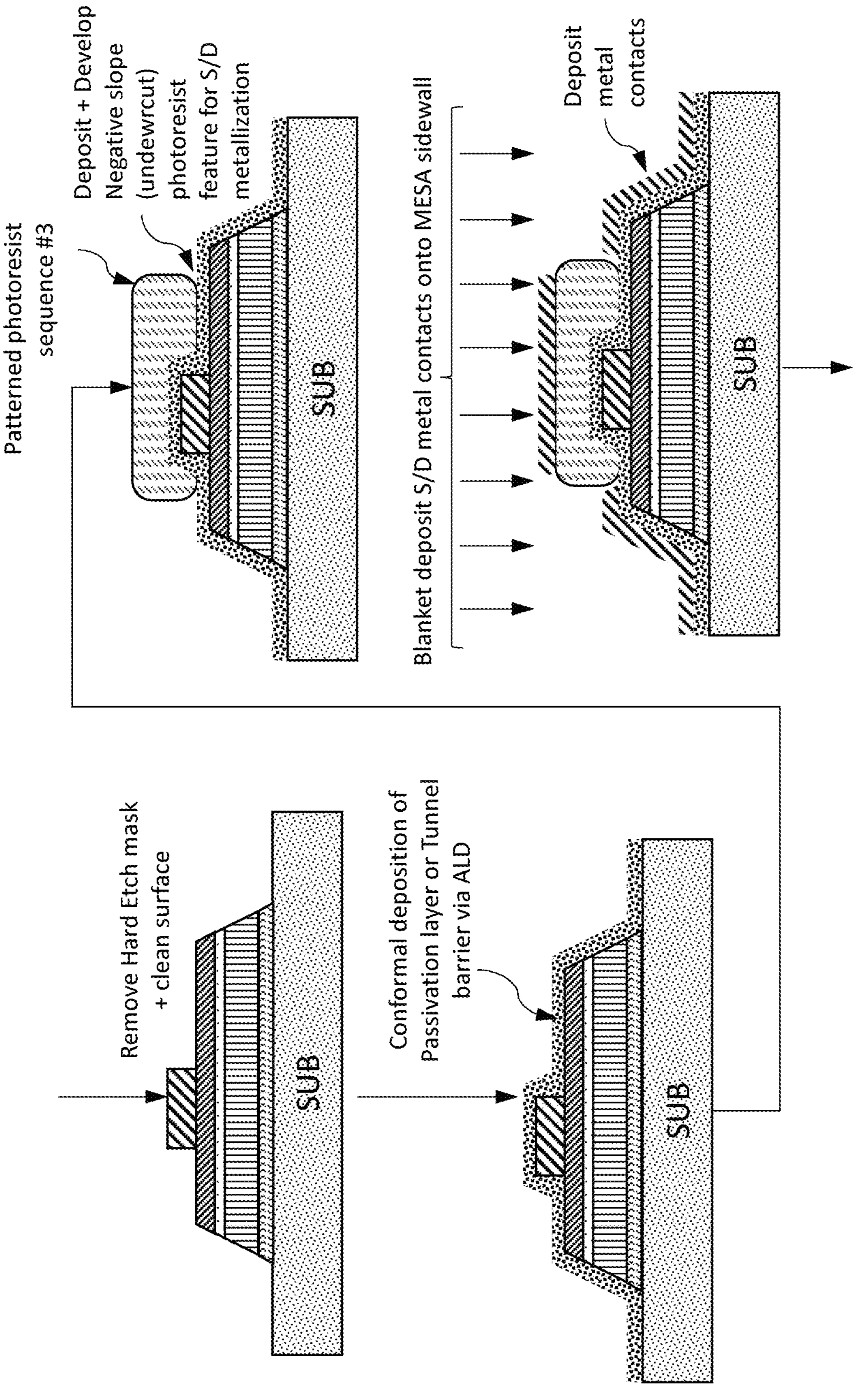

In FIG. 191F, the hard photoresist is removed, and a conformal passivation layer is formed on the exposed surfaces, including the exposed sidewalls of the etched mesa. Then another photoresist layer is formed and patterned, and blanket metal contacts are deposited, as shown.

Figure 191G:
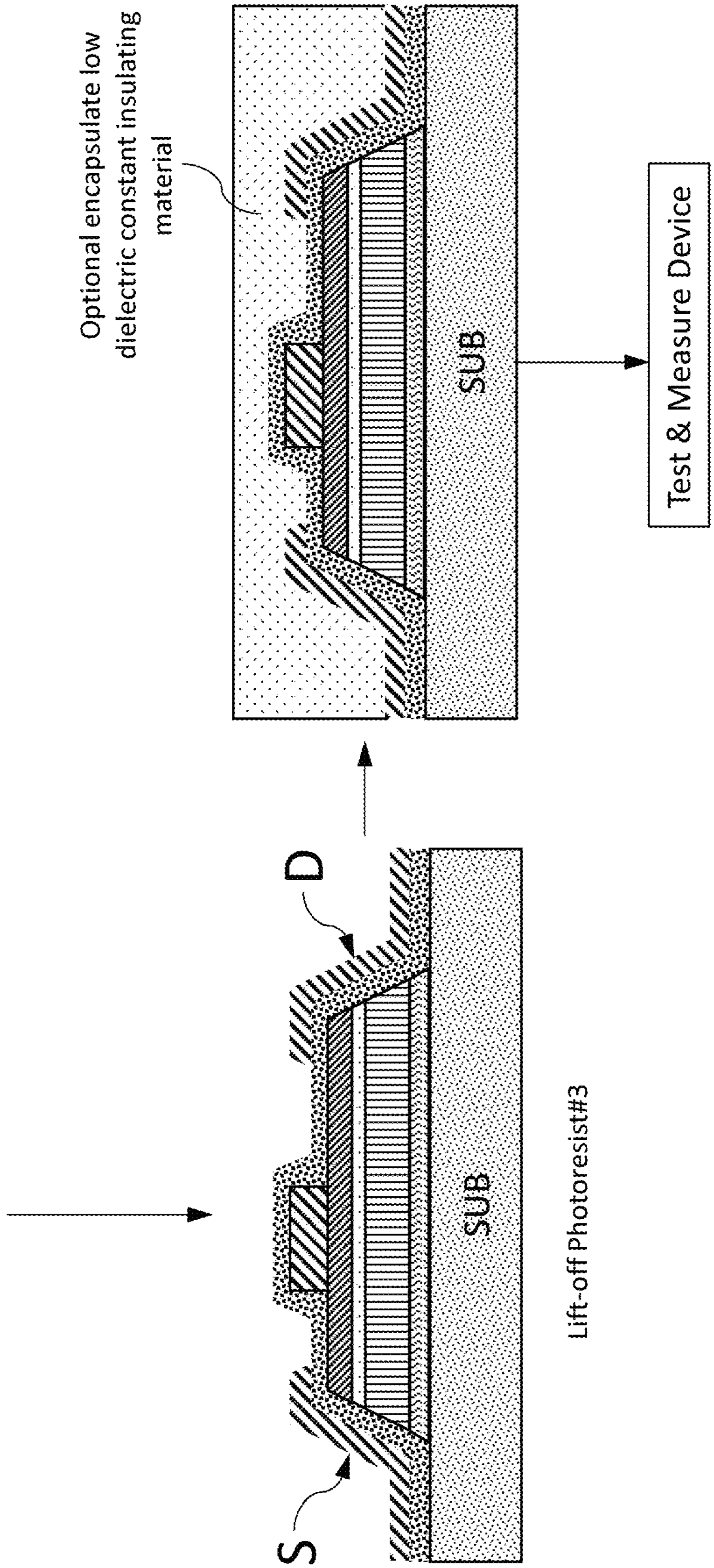

In FIG. 191G, another lift-off is performed to form the patterned metal source and drain contacts. Then an optional conformal encapsulation layer is formed (e.g., of a low dielectric constant material). Then the formed FET can be tested and measured.

Epitaxial oxide materials that are polar can be doped via polarization doping and can therefore be used to form unique epitaxial oxide structures. FIG. 192 shows the DFT calculated atomic structure of κ-$Ga_2O_3$ (i.e., $Ga_2O_3$ with a Pna21 space group). The geometric optimization of the crystal structure of a unit cell of κ-$Ga_2O_3$ was performed using DFT where the exchange functional was the generalized gradient approximation (GGA) variation GGA-PBEsol. κ-$Ga_2O_3$ has an orthorhombic crystal symmetry. κ-$(Al_xGa_{1-x})_yO_z$, where x is from 0 to 1, y is from 1 to 3, and z is from 2 to 4, can be grown on quartz, $LiGaO_2$ and Al(111) substrates. κ-$(Al_xGa_{1-x})_yO_z$, where x is from 0 to 1, y is from 1 to 3, and z is from 2 to 4, can be doped p-type using Li as a dopant. At higher levels of Li incorporation, alloys can be formed such as $Li(Al_xGa_{1-x})O_2$, where x is from 0 to 1, which can be native p-type oxides, and have compatible spaces groups such as Pna21 and P421212.

FIGS. 193A-193C show DFT calculated band structures of κ-$(Al_xGa_{1-x})_2O_3$, where x=1, 0.5 and 0. FIG. 193D shows the DFT calculated minimum bandgap energy of κ-$(Al_xGa_{1-x})_2O_3$, where x=1, 0.5 and 0, which shows the band bowing due to the polar nature of the materials. A high electron mobility transistor (HEMT) can be formed using κ-$(Al_xGa_{1-x})_2O_3$, where x is from 0 to 1 (e.g., in a κ-$(Al_xGa_{1-x})_2O_3$/κ-$(Al_yGa_{1-y})_2O_3$ heterostructure or superlattice, where x≠y). The estimated polarization charges derived from the calculated band structures can be used to design FET and HEMT devices. κ-$(Al_xGa_{1-x})_2O_3$, where x is from 0 to 1, also has a direct bandgap and can therefore be used in optoelectronic devices such as sensors, LEDs and lasers.

FIGS. 194A-194C show schematics and calculated band diagrams (conduction and valence band edges) of energy versus growth direction "z," calculated electron wavefunctions of a first confined state ($\psi_c^{n=1}$) and a second confined state ($\psi_c^{n=2}$), which have energy levels $E^c_{n=1}$, and $E^c_{n=2}$, and calculated electron densities, in κ-$(Al_xGa_{1-x})_2O_3$/κ-$Ga_2O_3$ heterostructures. The heterostructure has a metal contact adjacent to the κ-$(Al_{0.5}Ga_{0.5})_2O_3$ layer, and the epitaxial oxide layers in this example are growth cation-polar, as shown in the schematic in FIG. 194A.

FIG. 194B shows calculated electron wavefunctions of a first confined state ($\psi_c^{n=1}$) and a second confined state ($\psi_c^{n=2}$), which have energy levels $E^c_{n=1}$, and $E^c_{n=2}$, and calculated electron densities, in a κ-$(Al_{0.5}Ga_{0.5})_2O_3$/κ-$Ga_2O_3$ heterostructure.

FIG. 194C shows calculated electron wavefunctions of a first confined state ($\psi_c^{n=1}$) and a second confined state ($\psi_c^{n=2}$), which have energy levels $E^c_{n=1}$, and $E^c_{n=2}$, and calculated electron densities, in a κ-$Al_2O_3$/κ-$Ga_2O_3$ heterostructure, which has more band bending and deeper confined electron energy levels compared to the Fermi level than the example shown in FIG. 194B.

FIGS. 194D-194E show the electron density in the thin layer (e.g., a two-dimensional electron gas (i.e., a 2DEG)) in the confined energy well formed in κ-$(Al_xGa_{1-x})_2O_3$/κ-$Ga_2O_3$ heterostructures where x=0.3, 0.5, and 1. The plots in these figures show that high electron densities between 5e20 $cm^{-3}$ and 3.5e21 $cm^{-3}$ are possible with these heterostructures comprising polar epitaxial oxide materials.

FIG. 195 shows a DFT calculated band structure of Li-doped κ-$Ga_2O_3$. The structure had one Ga atom replaced with a Li atom in each unit cell. The band structure indicates that Li doped the material p-type because the Fermi energy is below the valence band edge (i.e., maximum).

FIG. 196 shows a chart that summarizes the results from DFT calculated band structures of doped $(Al,Ga)_xO_y$ using different dopants. The dopants listed can substitute for the cation (i.e., Al and/or Ga) or the anion (i.e., O), or the dopant can be a vacancy in the crystal, as noted in the figure. The relative efficacy is also shown, which indicates how strongly the dopant will affect the conductivity of the κ-$Ga_2O_3$.

FIG. 197A shows an example of a p-i-n structure, with multiple quantum wells in the n-, i- and p-layers (similar to the structure in FIG. 149). The bandgap and the thicknesses of the barriers and well in the n-, i- and p-regions are defined the same as in FIG. 148.

FIGS. 197B and 197C show calculated band diagrams and confined electron and hole wavefunctions (similar to those in the examples in FIGS. 194B and 194C) for a portion of the superlattice in the n-region in a structure like the one in FIG. 197A. The polarization effects cause carrier confinement, which can be used to dope a region n-type or p-type depending on the nature of the heterojunctions, the orientation of the crystal (i.e., whether it is oriented oxygen-polar, or metal-polar), and any strain or composition gradient in the region.

FIG. 198A shows a structure with a crystalline substrate having a particular orientation (h k l) with respect to the growth direction, and an epitaxial layer ("film epilayer") with an orientation (h' k' l'). FIG. 198B is a table showing some substrates that are compatible with κ-$Al_xGa_{1-x}O_y$ epitaxial layers, the space group ("SG") of the substrates, the orientation of the substrate, the orientation of a κ-$Al_xGa_{1-x}O_y$ film grown on the substrate, and the elastic strain energy due to the mismatch. FIG. 199 shows an example containing a substrate (C-plane α-$Al_2O_3$) and a template (low temperature "LT" grown Al(111)) structure used to match the in-plane lattice constants to κ-$Al_xGa_{1-x}O_y$ ("Pna21 AlGaO"). Multiple atoms of Al(111) can form sub-arrays with acceptable lattice mismatches with a unit cell of some phases $Al_xGa_{1-x}O_y$.

FIG. 200 shows some DFT calculated epitaxial oxide materials with lattice constants from about 4.8 Angstroms to about 5.3 Angstroms, that can be substrates for, and/or form heterostructures with, κ-$Al_xGa_{1-x}O_y$, such as $LiAlO_2$ and $Li_2GeO_3$.

FIG. 201 shows some additional DFT calculated epitaxial oxide materials with lattice constants from about 4.8 Angstroms to about 5.3 Angstroms, that can be substrates for, and/or or form heterostructures with, κ—$Al_xGa_{1-x}O_y$, including α—$SiO_2$, $Al(111)_{2\times3}$ (i.e., six unit cells of Al(111) in a 2×3 array have an acceptable lattice mismatch with one unit cell of κ—$Al_xGa_{1-x}O_y$), and $AlN(100)_{1\times4}$.

FIGS. 202A-202E show atomic structures at surfaces of κ—$Ga_2O_3$ and some compatible substrates. FIG. 202A shows the rectangular array of atoms in the unit cells at the (001) surface of κ—$Ga_2O_3$. FIG. 202B shows the surface of α—$SiO_2$, with the rectangular unit cell of κ-$Ga_2O_3$(001) overlayed. FIG. 202C shows the surface of $LiGaO_2$(011), with the rectangular unit cell of κ—$Ga_2O_3$(001) overlayed. FIG. 202D shows the surface of Al(111), with the rectangular unit cell of κ—$Ga_2O_3$(001) overlayed. FIG. 202E shows the surface of α—$Al_2O_2$(001) (i.e., C-plane sapphire), with the rectangular unit cell of κ—$Ga_2O_3$(001) overlayed.

FIG. 203 shows a flowchart 20300 of an example method for forming a semiconductor structure comprising κ-$Al_xGa_{1-x}O_y$. The substrate is prepared, the surface is terminated in Al (at a temperature above 800° C.), then the temperature is dropped to below 30° C. in an ultra-high vacuum (UHV) environment, and a thin (e.g., 10 nm to 50 nm) layer of Al(111) is formed. The temperature is then increased to the growth temperature of the κ-$Al_xGa_{1-x}O_y$, and layers of different compositions can be grown (e.g., in alternating structures to form superlattices), and then the substrate is cooled.

FIGS. 204A-204C are plots of XRD intensity versus angle (in an Ω-2θ scan) for experimental structures. FIG. 204A shows two overlayed experimental XRD scans, one of κ-$Al_2O_3$ grown on an Al(111) template, and the other of κ-$Al_2O_3$ grown on a Ni(111) template. FIG. 204B shows two overlayed experimental XRD scans (shifted in the y-axis) of the structures shown, one including a κ-$Ga_2O_3$ layer grown on an α-$Al_2O_3$ substrate with an Al(111) template layer, and the other a β-$Ga_2O_3$ layer grown on an α-$Al_2O_3$ substrate without a template layer. FIG. 204C shows the two overlayed scans from FIG. 204B in high resolution where the fringes due to the high quality and flatness of the layers were observed.

FIGS. 205A and 205B show simplified E-k diagrams in the vicinity of the Brillouin-zone center for an epitaxial oxide material, such as those shown in FIGS. 28, 76A-1, 76A-2 and 76B, showing a process of impact ionization. The band structure represents the allowed energy states for electrons in a crystal. A hot electron can be injected into an epitaxial oxide material, as shown in FIG. 205A. If the hot electron has an energy above about half the bandgap of the epitaxial oxide material, then it can relax and form a pair of electrons with energy at the conduction band minimum. As shown in FIG. 205B, the excess energy of the hot electron is transferred to a generated electron hole pair in the epitaxial oxide material. The impact ionization process shown in these figures illustrates that impact ionization leads to a multiplication of free carriers in the epitaxial oxide material.

FIG. 206A shows a plot of energy versus bandgap of an epitaxial oxide material (including the conduction band edge, $E_c$, and the valence band edge, $E_v$), where the dotted line shows the approximate threshold energy required by a hot electron to generate an excess electron-hole pair through an impact ionization process. FIG. 206B shows an example using α-$Ga_2O_3$ with a bandgap of about 5 eV. In this example, the hot electron needs to have an excess energy of about 2.5 eV above the conduction band edge of the α-$Ga_2O_3$.

FIG. 207A shows a schematic of an epitaxial oxide material with two planar contact layers (e.g., metals, or highly doped semiconductor contact materials and metal contacts) coupled to an applied voltage, $V_a$. FIG. 207B shows a band diagram of the structure shown in FIG. 207A along the growth ("z") direction of the epitaxial oxide material. The applied bias $V_a$ forms an electric field in the epitaxial oxide material, which can accelerate electrons injected into the epitaxial oxide material, thereby increasing their energy. $L_{II}$ is minimum distance the hot electron must propagate before an impact ionization event probability becomes high, and an excess electron-hole pair is formed (i.e., carrier multiplication occurs). In such structures, the thickness of the epitaxial oxide material in the growth ("z") direction needs to be thick enough, and the applied bias needs to be high enough to facilitate impact ionization. For example, the oxide material thickness can be about 1 μm, or from 500 nm to 5 μm, or more than 5 μm. The applied bias can also be very high to form a large electric field, such as greater than 10 V, greater than 20 V, greater than 50 V, or greater than 100 V, or from 10 V to 50 V, or from 10 V to 100 V, or from 10 V to 200 V. The high breakdown voltages achievable by epitaxial oxide materials is therefore also beneficial. In some cases, epitaxial oxide materials with wide bandgaps and high breakdown voltages can enable devices (e.g., sensors, LEDs, lasers) with impact ionization that would not be possible in other materials with narrower bandgaps and lower breakdown voltages.

FIG. 207C shows a band diagram of the structure shown in FIG. 207A along the growth ("z") direction of the epitaxial oxide material. In this example, the epitaxial oxide has a gradient in bandgap (i.e., a graded bandgap) in the growth "z" direction, $E_c(z)$. The graded bandgap can be formed, for example by a gradient in composition in the growth "z" direction, as described herein. For example, the epitaxial oxide layer can comprise $(Al_xGa_{1-x})_2O_3$ where x is varies in the growth "z" direction. The graded bandgap further increases the electric field, which further facilitates impact ionization. In the structure in this example, the excess energy of the electrons increases as a function of propagation distance "z." Pair production probability therefore also increases as a function of propagation distance "z." With a graded bandgap any electrons that do not recombine can get accelerated further into the material and gain more excess energy. These structures therefore can also make avalanche diodes (e.g., for sensors, or LEDs).

The example above shows a gradient within a layer, however, in other examples, digital alloys and/or chirp layers can be used to form structures that are favorable for impact ionization. For example, a chirp layer can be used to progressively narrow the effective bandgap of a layer, which would cause the excess energy of injected electrons to increase as a function of propagation distance "z" similar to the graded layer described above.

FIG. 207C also shows that the excess electron-hole pairs generated via impact ionization in epitaxial oxide layers can recombine radiatively to emit photons (with wavelength $\lambda_g$ related to the bandgap of the material). Such radiative recombination is more favorable in epitaxial oxide materials with direct bandgaps, e.g., κ-$(Al_xGa_{1-x})_2O_3$.

The structures described in FIGS. 207A-207C can be used, for example, in electroluminescent devices such as LEDs, or sensors such as avalanche photodiodes.

FIG. 208 shows a schematic of an example of an electroluminescent device including a high work function metal ("metal #1"), an ultra-high bandgap ("UWBG") layer, a wide bandgap ("WBG") epitaxial oxide layer, and a second metal contact ("metal #2"). The bandgap of the WBG epitaxial oxide layer is selected for the desired optical emission wavelength, and is a direct bandgap. The UWBG layer can also be an epitaxial oxide layer. The UWBG layer is thin (e.g., the thickness ($z_b$-$z_1$) is below 10 nm, or below 1 nm) and acts as a tunnel barrier for the injection of hot electrons into the WBG epitaxial oxide layer. The work function of the metal, and the band edges of the UWBG and WBG epitaxial oxide layer are chosen such that the hot electrons have enough excess energy to generate an additional electron-hole pair via impact ionization. The injected and generated electron-hole pairs can then recombine to emit light of the desired wavelength.

FIGS. 209A and 209B show schematics of examples of electroluminescent devices that are p-i-n diodes including a p-type semiconductor layer, an epitaxial oxide layer that is not intentionally doped (NID) and comprises an impact ionization region (IIR), and an n-type semiconductor layer. The p-type and n-type semiconductor layers can be epitaxial oxide layers. The p-type and n-type semiconductor layers can have wider bandgaps than the epitaxial oxide layer, to form heterostructures as shown in the figures. The p-type and n-type semiconductor layers can be coupled to a high work function metal, and a second metal contact, respectively, such that bias can be applied to the structures.

In the example shown in FIG. 209A, the bandgap of the p-type semiconductor layer is $E_{gp}$, the bandgap of the epitaxial oxide layer that is not intentionally doped (NID) and comprises an impact ionization region (IIR) is $Eg_{IIR}$, and the bandgap of the n-type semiconductor layer is $E_{gn}$. In this example, $E_{gp}>E_{gIIR}$ and $E_{gn}>E_{gIIR}$. In the example shown in FIG. 209B, the NID epitaxial oxide layer has a graded bandgap, and the bandgaps of the n-type and p-type layers are different from one another, such that $E_{gp}>E_{gIIR}$ at the interface between the p-type semiconductor layer and the NID epitaxial oxide layer, and $E_{gn}>E_{gIIR}$ at the interface between the n-type semiconductor layer and the NID epitaxial oxide layer. Both of these examples can operate as LEDs, where injected electrons gain excess energy through the NID epitaxial oxide region, generate excess electron-hole pairs via impact ionization, and the generated electron-hole pairs can then recombine to emit photons. Structures with similar band diagrams as those shown in FIGS. 209A and 209B can also be used as avalanche photodiodes, by applying a reverse bias between the n-type and p-type layers.

In a first aspect, the present disclosure provides a semiconductor structure, comprising an epitaxial oxide heterostructure, comprising: a substrate; a first epitaxial oxide layer comprising $(Ni_{x1}Mg_{y1}Zn_{1-x1-y1})(Al_{q1}Ga_{1-q1})_2O_4$ wherein $0\le x1\le 1$, $0\le y1\le 1$ and $0\le q1\le 1$; and a second epitaxial oxide layer comprising $(Ni_{x2}Mg_{y2}Zn_{1-x2-y2})(Al_{q2}Ga_{1-q2})_2O_4$ wherein $0\le x2\le 1$, $0\le y2\le 1$ and $0\le q2\le 1$, wherein at least one condition selected from $x1\ne x2$, $y1\ne y2$, and $q1\ne q2$ is satisfied.

In another form, the substrate comprises MgO, LiF, or $MgAl_2O_4$.

In another form, the first epitaxial oxide layer comprises $MgAl_2O_4$.

In another form, the second epitaxial oxide layer comprises $NiAl_2O_4$. In another form, the first epitaxial oxide layer comprises $(Mg_{y1}Zn_{1-y1})Al_2O_4$ and the second epitaxial oxide layer comprises $(Ni_{x1}Zn_{1-x1})Al_2O_4$.

In another form, at least one of the first and the second epitaxial oxide layer has a cubic crystal symmetry.

In another form, at least one of the first and the second epitaxial oxide layer is strained.

In another form, at least one of the first and the second epitaxial oxide layer is doped n-type or p-type.

In another form, the first and the second epitaxial oxide layer are layers of a unit cell of a superlattice.

In another form, the first and the second epitaxial oxide layer are layers of a chirp layer comprising alternating layers with layer thicknesses that change throughout the chirp layer.

In another form, a light emitting diode (LED) that emits light with a wavelength from 150 nm to 280 nm comprises the semiconductor structure.

In another form, a laser that emits light with a wavelength from 150 nm to 280 nm comprises the semiconductor structure.

In another form, a radiofrequency (RF) switch comprises the semiconductor structure.

In another form, a high electron mobility transistor (HEMT) comprises the semiconductor structure.

In a second aspect, the present disclosure provides a semiconductor structure, comprising an epitaxial oxide heterostructure, comprising: a substrate; a first epitaxial oxide layer comprising $(Ni_{x1}Mg_{y1}Zn_{1-x1-y1})_2GeO_4$ wherein $0\le x1\le 1$ and $0\le y1\le 1$; and a second epitaxial oxide layer comprising $(Ni_{x2}Mg_{y2}Zn_{1-x2-y2})_2GeO_4$ wherein $0\le x2\le 1$ and $0\le y2\le 1$, wherein either: $x1\ne x2$ and $y1=y2$; $x1=x2$ and $y1\ne y2$; or $x1\ne x2$ and $y1\ne y2$.

In another form, the substrate comprises MgO, LiF, or $MgAl_2O_4$.

In another form, the first epitaxial oxide layer comprises $Ni_2GeO_4$.

In another form, the second epitaxial oxide layer comprises $Mg_2GeO_4$.

In another form, the first epitaxial oxide layer comprises $(Ni_{x1}Mg_{y1})_2GeO_4$ and the second epitaxial oxide layer comprises $(Mg_{y1}Zn_{1-x1-y1})_2GeO_4$.

In another form, at least one of the first and the second epitaxial oxide layer has a cubic crystal symmetry.

In another form, at least one of the first and the second epitaxial oxide layer is strained.

In another form, at least one of the first and the second epitaxial oxide layer is doped n-type or p-type.

In another form, first and the second epitaxial oxide layer are layers of a unit cell of a superlattice.

In another form, first and the second epitaxial oxide layer are layers of a chirp layer comprising alternating layers with layer thicknesses that change throughout the chirp layer.

In another form, a light emitting diode (LED) that emits light with a wavelength from 150 nm to 280 nm comprises the semiconductor structure.

In another form, a laser that emits light with a wavelength from 150 nm to 280 nm comprises the semiconductor structure.

In another form, a radiofrequency (RF) switch comprises the semiconductor structure.

In another form, a high electron mobility transistor (HEMT) comprising the semiconductor structure.

In a third aspect, the present disclosure provides a semiconductor structure, comprising an epitaxial oxide heterostructure, comprising: a substrate; a first epitaxial oxide layer comprising $(Mg_{x1}Zn_{1-x1})(Al_{y1}Ga_{1-y1})_2O_4$ wherein $0\le x1\le 1$ and $0\le y1\le 1$; and a second epitaxial oxide layer comprising $(Ni_{x2}Mg_{y2}Zn_{1-x2-y2})_2GeO_4$ wherein $0\le x2\le 1$ and $0\le y2\le 1$.

In another form, the substrate comprises MgO, LiF, or $MgAl_2O_4$.

In another form, the first epitaxial oxide layer comprises $MgGa_2O_4$ or $MgAl_2O_4$.

In another form, the second epitaxial oxide layer comprises $Ni_2GeO_4$ or $Mg_2GeO_4$.

In another form, the first epitaxial oxide layer comprises $(Mg_{x1})(Al_{y1}Ga_{1-y1})_2O_4$ and the second epitaxial oxide layer comprises $(Ni_{x2}Mg_{y2})_2GeO_4$.

In another form, at least one of the first and the second epitaxial oxide layer has a cubic crystal symmetry.

In another form, at least one of the first and the second epitaxial oxide layer is strained.

In another form, at least one of the first and the second epitaxial oxide layer is doped n-type or p-type.

In another form, the first and the second epitaxial oxide layer are layers of a unit cell of a superlattice.

In another form, the first and the second epitaxial oxide layer are layers of a chirp layer comprising alternating layers with layer thicknesses that change throughout the chirp layer.

In another form, a light emitting diode (LED) that emits light with a wavelength from 150 nm to 280 nm comprises the semiconductor structure.

In another form, a laser that emits light with a wavelength from 150 nm to 280 nm comprises the semiconductor structure.

In another form, a radiofrequency (RF) switch comprises the semiconductor structure.

In another form, a high electron mobility transistor (HEMT) comprises the semiconductor structure.

In a fourth aspect, the present disclosure provides a semiconductor structure, comprising an epitaxial oxide heterostructure, comprising: a substrate; a first epitaxial oxide layer comprising MgO; and a second epitaxial oxide layer comprising $(Ni_{x1}Mg_{y1}Zn_{1-x1-y1})(Al_{q1}Ga_{1-q1})_2O_4$ wherein $0 \leq x1 \leq 1$, $0 \leq y1 \leq 1$ and $0 \leq q1 \leq 1$.

In another form, the substrate comprises MgO, LiF, or $MgAl_2O_4$.

In another form, the second epitaxial oxide layer comprises $MgNi_2O_4$ or $NiAl_2O_4$.

In another form, the second epitaxial oxide layer comprises $(Ni_{x1}Mg_{y1})(Al_{q1}Ga_{1-q1})_2O_4$.

In another form, at least one of the first and the second epitaxial oxide layer has a cubic crystal symmetry.

In another form, at least one of the first and the second epitaxial oxide layer is strained.

In another form, at least one of the first and the second epitaxial oxide layer is doped n-type or p-type.

In another form, the first and the second epitaxial oxide layer are layers of a unit cell of a superlattice.

In another form, the first and the second epitaxial oxide layer are layers of a chirp layer comprising alternating layers with layer thicknesses that change throughout the chirp layer.

In another form, a light emitting diode (LED) that emits light with a wavelength from 150 nm to 280 nm comprising the semiconductor structure.

In another form, a laser that emits light with a wavelength from 150 nm to 280 nm comprises the semiconductor structure.

In another form, a radiofrequency (RF) switch comprises the semiconductor structure.

In another form, a high electron mobility transistor (HEMT) comprises the semiconductor structure.

In a fifth aspect, the present disclosure provides a semiconductor structure, comprising an epitaxial oxide heterostructure, comprising: a substrate; a first epitaxial oxide layer comprising MgO; and a second epitaxial oxide layer comprising $(Ni_{x2}Mg_{y2}Zn_{1-x2-y2})_2GeO_4$ wherein $0 \leq x2 \leq 1$ and $0 \leq y2 \leq 1$.

In another form, the substrate comprises MgO, LiF, or $MgAl_2O_4$.

In another form, the second epitaxial oxide layer comprises $Ni_2GeO_4$ or $Mg_2GeO_4$.

In another form, the second epitaxial oxide layer comprises $(Ni_{x2}Mg_{y2})_2GeO_4$.

In another form, at least one of the first and the second epitaxial oxide layer has a cubic crystal symmetry.

In another form, at least one of the first and the second epitaxial oxide layer is strained.

In another form, at least one of the first and the second epitaxial oxide layer is doped n-type or p-type.

In another form, the first and the second epitaxial oxide layer are layers of a unit cell of a superlattice.

In another form, the first and the second epitaxial oxide layer are layers of a chirp layer comprising alternating layers with layer thicknesses that change throughout the chirp layer.

In another form, a light emitting diode (LED) that emits light with a wavelength from 150 nm to 280 nm comprises the semiconductor structure.

In another form, a laser that emits light with a wavelength from 150 nm to 280 nm comprises the semiconductor structure.

In another form, a radiofrequency (RF) switch comprises the semiconductor structure.

In another form, a high electron mobility transistor (HEMT) comprises the semiconductor structure.

In a sixth aspect, the present disclosure provides a semiconductor structure, comprising an epitaxial oxide heterostructure, comprising: a substrate; a first epitaxial oxide layer comprising $Li(Al_{x1}Ga_{1-x1})O_2$ wherein $0 \leq x1 \leq 1$; and a second epitaxial oxide layer comprising $(Al_{x2}Ga_{1-x2})_2O_3$ wherein $0 \leq x2 \leq 1$.

In another form, the substrate comprises $LiGaO_2(001)$, $LiAlO_2(001)$, AlN(110), or $SiO_2(100)$.

In another form, the substrate comprises a crystalline material and a template layer of Al(111).

In another form, the first epitaxial oxide layer comprises $LiGaO_2$.

In another form, the second epitaxial oxide layer comprises $LiAlO_2$.

In another form, at least one of the first and the second epitaxial oxide layer has a cubic crystal symmetry.

In another form, at least one of the first and the second epitaxial oxide layer is strained.

In another form, at least one of the first and the second epitaxial oxide layer is doped n-type or p-type.

In another form, the first and the second epitaxial oxide layer are layers of a unit cell of a superlattice.

In another form, the first and the second epitaxial oxide layer are layers of a chirp layer comprising alternating layers with layer thicknesses that change throughout the chirp layer.

In another form, a light emitting diode (LED) that emits light with a wavelength from 150 nm to 280 nm comprises the semiconductor structure.

In another form, a laser that emits light with a wavelength from 150 nm to 280 nm comprises the semiconductor structure.

In another form, a radiofrequency (RF) switch comprising the semiconductor structure.

In another form, a high electron mobility transistor (HEMT) comprising the semiconductor structure.

Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers.

Unless otherwise defined, all terms used in the present disclosure, including technical and scientific terms, have the meaning as commonly understood by one of ordinary skill in the art. By means of further guidance, term definitions are included to better appreciate the teaching of the present disclosure.

As used herein, the following terms have the following meanings:

"A", "an", and "the" as used herein refers to both singular and plural referents unless the context clearly dictates otherwise. By way of example, "a metal oxide" refers to one or more than one metal oxide.

"About" as used herein referring to a measurable value such as a parameter, an amount, a temporal duration, and the like, is meant to encompass variations of +/−20% or less, preferably +/−10% or less, more preferably +/−5% or less, even more preferably +/−1% or less, and still more preferably +/−0.1% or less of and from the specified value, in so far such variations are appropriate to perform in the disclosed embodiments. However, it is to be understood that the value to which the modifier "about" refers is itself also specifically disclosed.

The expression "% by weight" (weight percent), here and throughout the description unless otherwise defined, refers to the relative weight of the respective component based on the overall weight of the formulation or element referred to.

The recitation of numerical ranges by endpoints includes all numbers and fractions subsumed within that range, as well as the recited endpoints, except where otherwise explicitly stated by disclaimer and the like.

The reference to any prior art in this specification is not, and should not be taken as, an acknowledgement of any form of suggestion that such prior art forms part of the common general knowledge.

Reference has been made to embodiments of the disclosed invention. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A semiconductor device comprising:
- a semiconductor structure, the semiconductor structure comprising an epitaxial oxide heterostructure, the epitaxial oxide heterostructure comprising:
- a substrate;
- a first epitaxial oxide layer comprising $(Ni_{x1}Mg_{y1}Zn_{1-x1-y1})_2GeO_4$ wherein $0 \le x1 \le 1$ and $0 \le y1 \le 1$; and
- a second epitaxial oxide layer comprising $(Ni_{x2}Mg_{y2}Zn_{1-x2-y2})_2GeO_4$ wherein $0 \le x2 \le 1$ and $0 \le y2 \le 1$,
- wherein either: $x1 \ne x2$ and $y1 = y2$; $x1 = x2$ and $y1 \ne y2$; or $x1 \ne x2$ and $y1 \ne y2$, and
- wherein the semiconductor device is:
  - a light emitting diode (LED) that emits light with a wavelength from 150 nm to 280 nm; or
  - a laser that emits light with a wavelength from 150 nm to 280 nm; or
  - a radiofrequency (RF) switch; or
  - a high electron mobility transistor (HEMT).

2. The semiconductor device of claim 1, wherein the substrate comprises MgO, LiF, or $MgAl_2O_4$.

3. The semiconductor device of claim 1, wherein the second epitaxial oxide layer comprises $Mg_2GeO_4$.

4. The semiconductor device of claim 1, wherein at least one of the first and the second epitaxial oxide layer has a cubic crystal symmetry.

5. The semiconductor device of claim 1, wherein at least one of the first and the second epitaxial oxide layer is strained.

6. The semiconductor device of claim 1, wherein at least one of the first and the second epitaxial oxide layer is doped n-type or p-type.

7. A semiconductor structure, comprising an epitaxial oxide heterostructure, comprising:
- a substrate;
- a first epitaxial oxide layer comprising $(Ni_{x1}Mg_{y1}Zn_{1-x1-y1})_2GeO_4$ wherein $0 \le x1 \le 1$ and $0 \le y1 \le 1$; and
- a second epitaxial oxide layer comprising $(Ni_{x2}Mg_{y2}Zn_{1-x2-y2})_2GeO_4$ wherein $0 \le x2 \le 1$ and $0 \le y2 \le 1$,
- wherein either: $x1 \ne x2$ and $y1 = y2$; $x1 = x2$ and $y1 \ne y2$; or $x1 \ne x2$ and $y1 \ne y2$,
- wherein either: $x1 \ne x2$ and $y1 = y2$; $x1 = x2$ and $y1 \ne y2$; or $x1 \ne x2$ and $y1 \ne y2$, and
- wherein the first and the second epitaxial oxide layers are layers of a chirp layer comprising alternating layers with layer thicknesses that change throughout the chirp layer.

8. A semiconductor device comprising:
- a semiconductor structure, the semiconductor structure comprising an epitaxial oxide heterostructure, the epitaxial oxide heterostructure comprising:
  - a substrate;
  - a first epitaxial oxide layer comprising $(Mg_{x1}Zn_{1-x1})(Al_{y1}Ga_{1-y1})_2O_4$ wherein $0 \le x1 \le 1$ and $0 \le y1 \le 1$; and
  - a second epitaxial oxide layer comprising $(Ni_{x2}Mg_{y2}Zn_{1-x2-y2})_2GeO_4$ wherein $0 \le x2 \le 1$ and $0 \le y2 \le 1$, and
  - wherein the semiconductor device is:
    - a light emitting diode (LED) that emits light with a wavelength from 150 nm to 280 nm; or
    - a laser that emits light with a wavelength from 150 nm to 280 nm; or
    - a radiofrequency (RF) switch; or
    - a high electron mobility transistor (HEMT).

9. The semiconductor device of claim 8, wherein the substrate comprises MgO, LiF, or $MgAl_2O_4$.

10. The semiconductor device of claim 8, wherein the first epitaxial oxide layer comprises $MgGa_2O_4$ or $MgAl_2O_4$.

11. The semiconductor device of claim 8, wherein the second epitaxial oxide layer comprises $Ni_2GeO_4$ or $Mg_2GeO_4$.

12. A semiconductor structure, comprising an epitaxial oxide heterostructure, comprising:
- a substrate;
- a first epitaxial oxide layer comprising $(Mg_{x1}Zn_{1-x1})(Al_{y1}Ga_{1-y1})_2O_4$ wherein $0 \le x1 \le 1$ and $0 \le y1 \le 1$; and
- a second epitaxial oxide layer comprising $(Ni_{x2}Mg_{y2}Zn_{1-x2-y2})_2GeO_4$ wherein $0 \le x2 \le 1$ and $0 \le y2 \le 1$,
- wherein the first epitaxial oxide layer comprises $(Mg_{x1})(Al_{y1}Ga_{1-y1})_2O_4$ and the second epitaxial oxide layer comprises $(Ni_{x2}Mg_{y2})_2GeO_4$.

13. The semiconductor device of claim 8, wherein at least one of the first and the second epitaxial oxide layer has a cubic crystal symmetry.

14. The semiconductor device of claim 8, wherein at least one of the first and the second epitaxial oxide layer is strained.

15. The semiconductor device of claim 8, wherein at least one of the first and the second epitaxial oxide layer is doped n-type or p-type.

16. A semiconductor structure, comprising an epitaxial oxide heterostructure, comprising:
- a substrate;
- a first epitaxial oxide layer comprising $(Mg_{x1}Zn_{1-x1})(Al_{y1}Ga_{1-y1})_2O_4$ wherein $0 \le x1 \le 1$ and $0 \le y1 \le 1$; and a second epitaxial oxide layer comprising $(Ni_{x2}Mg_{y2}Zn_{1-x2-y2})_2GeO_4$ wherein 0≤x2≤1 and 0≤y2≤1, wherein the first and the second epitaxial oxide layers are layers of a unit cell of a superlattice.

17. A semiconductor structure, comprising an epitaxial oxide heterostructure, comprising:

a substrate;

a first epitaxial oxide layer comprising $(Mg_{x1}Zn_{1-x1})(Al_{y1}Ga_{1-y1})_2O_4$ wherein 0≤x1≤1 and 0≤y1≤1; and a second epitaxial oxide layer comprising $(Ni_{x2}Mg_{y2}Zn_{1-x2-y2})_2GeO_4$ wherein 0≤x2≤1 and 0≤y2≤1, wherein the first and the second epitaxial oxide layers are layers of a chirp layer comprising alternating layers with layer thicknesses that change throughout the chirp layer.

18. The semiconductor structure of claim 7, wherein the substrate comprises MgO, LiF, or $MgAl_2O_4$.

19. The semiconductor structure of claim 7, wherein the second epitaxial oxide layer comprises $Mg_2GeO_4$.

20. The semiconductor structure of claim 7, wherein at least one of the first and the second epitaxial oxide layer has a cubic crystal symmetry.

21. The semiconductor structure of claim 7, wherein at least one of the first and the second epitaxial oxide layer is strained.

22. The semiconductor structure of claim 7, wherein at least one of the first and the second epitaxial oxide layer is doped n-type or p-type.

23. The semiconductor structure of claim 12, wherein the substrate comprises MgO, LiF, or $MgAl_2O_4$.

24. The semiconductor structure of claim 12, wherein the first epitaxial oxide layer comprises $MgGa_2O_4$ or $MgAl_2O_4$.

25. The semiconductor structure of claim 12, wherein the second epitaxial oxide layer comprises $Ni_2GeO_4$ or $Mg_2GeO_4$.

26. The semiconductor structure of claim 12, wherein at least one of the first and the second epitaxial oxide layer has a cubic crystal symmetry.

27. The semiconductor structure of claim 12, wherein at least one of the first and the second epitaxial oxide layer is strained.

28. The semiconductor structure of claim 12, wherein at least one of the first and the second epitaxial oxide layer is doped n-type or p-type.

29. The semiconductor structure of claim 16, wherein the substrate comprises MgO, LiF, or $MgAl_2O_4$.

30. The semiconductor structure of claim 16, wherein the first epitaxial oxide layer comprises $MgGa_2O_4$ or $MgAl_2O_4$.

31. The semiconductor structure of claim 16, wherein the second epitaxial oxide layer comprises $Ni_2GeO_4$ or $Mg_2GeO_4$.

32. The semiconductor structure of claim 16, wherein at least one of the first and the second epitaxial oxide layer has a cubic crystal symmetry.

33. The semiconductor structure of claim 16, wherein at least one of the first and the second epitaxial oxide layer is strained.

34. The semiconductor structure of claim 16, wherein at least one of the first and the second epitaxial oxide layer is doped n-type or p-type.

35. The semiconductor structure of claim 17, wherein the substrate comprises MgO, LiF, or $MgAl_2O_4$.

36. The semiconductor structure of claim 17, wherein the first epitaxial oxide layer comprises $MgGa_2O_4$ or $MgAl_2O_4$.

37. The semiconductor structure of claim 17, wherein the second epitaxial oxide layer comprises $Ni_2GeO_4$ or $Mg_2GeO_4$.

38. The semiconductor structure of claim 17, wherein at least one of the first and the second epitaxial oxide layer has a cubic crystal symmetry.

39. The semiconductor structure of claim 17, wherein at least one of the first and the second epitaxial oxide layer is strained.

40. The semiconductor structure of claim 17, wherein at least one of the first and the second epitaxial oxide layer is doped n-type or p-type.

* * * * *